US009171585B2

(12) United States Patent
Rajan et al.

(10) Patent No.: US 9,171,585 B2
(45) Date of Patent: Oct. 27, 2015

(54) CONFIGURABLE MEMORY CIRCUIT SYSTEM AND METHOD

(71) Applicant: Google Inc., Mountain View, CA (US)

(72) Inventors: Suresh Natarajan Rajan, San Jose, CA (US); Keith R. Schakel, San Jose, CA (US); Michael John Sebastien Smith, Palo Alto, CA (US); David T. Wang, Thousand Oaks, CA (US); Frederick Daniel Weber, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/090,342

(22) Filed: Nov. 26, 2013

(65) Prior Publication Data

US 2014/0192583 A1 Jul. 10, 2014

Related U.S. Application Data

(60) Continuation-in-part of application No. 13/367,182, filed on Feb. 6, 2012, now Pat. No. 8,868,829, which isa continuation of application No. 11/929,636, filed on Oct. 30, 2007, now Pat. No. 8,244,971, which is a continuation of application No. PCT/US2007/016385, filed on Jul. 18, 2007, which is a continuation-in-partof application No. 11/461,439, filed on Jul. 31, 2006, (Continued)

(51) Int. Cl.

| | |
|---|---|
| ***G06F 12/00*** | (2006.01) |
| ***G06F 13/00*** | (2006.01) |
| ***G06F 13/28*** | (2006.01) |
| ***G11C 5/06*** | (2006.01) |
| ***G11C 7/10*** | (2006.01) |
| ***G11C 11/4063*** | (2006.01) |
| ***G11C 29/44*** | (2006.01) |
| *G11C 29/04* | (2006.01) |
| *G11C 29/00* | (2006.01) |

(52) U.S. Cl.

CPC .. *G11C 5/06* (2013.01); *G11C 7/10* (2013.01); *G11C 11/4063* (2013.01); *G11C 29/44* (2013.01); *G11C 29/808* (2013.01); *G11C 2029/0409* (2013.01)

(58) Field of Classification Search

None

See application file for complete search history.

(56) References Cited

U.S. PATENT DOCUMENTS

| | | | |
|---|---|---|---|
| 3,800,292 | A | 3/1974 | Curley et al. |
| 4,069,452 | A | 1/1978 | Conway et al. |
| 4,323,965 | A | 4/1982 | Johnson et al. |

(Continued)

FOREIGN PATENT DOCUMENTS

| | | |
|---|---|---|
| DE | 102004051345 | 5/2006 |
| DE | 102004053316 | 5/2006 |

(Continued)

OTHER PUBLICATIONS

BIOS and Kernel Developer's Guide (BKDG) Family 10h Processor, Sep. 7, 2007, Published for Processor Family Purchasers, 365 pages.

(Continued)

*Primary Examiner* — Yaima Rigol

(74) *Attorney, Agent, or Firm* — Fish & Richardson P.C.

(57) ABSTRACT

A memory circuit system and method are provided in the context of various embodiments. In one embodiment, an interface circuit remains in communication with a plurality of memory circuits and a system. The interface circuit is operable to interface the memory circuits and the system for performing various functionality (e.g. power management, simulation/emulation, etc.).

20 Claims, 260 Drawing Sheets

Related U.S. Application Data now Pat. No. 7,580,312, and a continuation-in-part of application No. 11/524,811, filed on Sep. 20, 2006, now Pat. No. 7,590,796, and a continuation-in-part of application No. 11/524,730, filed on Sep. 20, 2006, now Pat. No. 7,472,220, and a continuation-in-part of application No. 11/524,812, filed on Sep. 20, 2006, now Pat. No. 7,386,656, and a continuation-in-part of application No. 11/524,716, filed on Sep. 20, 2006, now Pat. No. 7,392,338, and a continuation-in-part of application No. 11/538,041, filed on Oct. 2, 2006, now abandoned, and a continuation-in-part of application No. 11/584,179, filed on Oct. 20, 2006, now Pat. No. 7,581,127, and a continuation-in-part of application No. 11/762,010, filed on Jun. 12, 2007, now Pat. No. 8,041,881, and a continuation-in-part of application No. 11/762,013, filed on Jun. 12, 2007, now Pat. No. 8,090,897, application No. 14/090,342, which is a continuation-in-part of application No. 12/507,682, filed on Jul. 22, 2009, now Pat. No. 8,949,519, which is a continuation of application No. 11/461,427, filed on Jul. 31, 2006, now Pat. No. 7,609,567, which is a continuation-in-part of application No. 11/474,075, filed on Jun. 23, 2006, now Pat. No. 7,515,453, application No. 14/090,342, which is a continuation-in-part of application No. 11/672,921, filed on Feb. 8, 2007, which is a continuation-in-part of application No. 11/461,437, filed on Jul. 31, 2006, now Pat. No. 8,077,535, and a continuation-in-part of application No. 11/702,981, filed on Feb. 5, 2007, now Pat. No. 8,089,795, and a continuation-in-part of application No. 11/702,960, filed on Feb. 5, 2007, now abandoned, application No. 14/090,342, which is a continuation-in-part of application No. 13/620,425, filed on Sep. 14, 2012, now Pat. No. 8,797,779, which is a continuation of application No. 13/341,844, filed on Dec. 30, 2011, now Pat. No. 8,566,556, which is a division of application No. 11/702,981, filed on Feb. 5, 2007, now Pat. No. 8,089,795, which is a continuation-in-part of application No. 11/461,437, filed on Jul. 31, 2006, now Pat. No. 8,077,535, application No. 14/090,342, which is a continuation-in-part of application No. 13/615,008, filed on Sep. 13, 2012, now Pat. No. 8,631,220, which is a continuation of application No. 11/939,440, filed on Nov. 13, 2007, now Pat. No. 8,327,104, which is a continuation-in-part of application No. 11/524,811, filed on Sep. 20, 2006, now Pat. No. 7,590,796, which is a continuation-in-part of application No. 11/461,439, filed on Jul. 31, 2006, now Pat. No. 7,580,312, application No. 14/090,342, which is a continuation-in-part of application No. 13/618,246, filed on Sep. 14, 2012, now Pat. No. 8,615,679, which is a continuation of application No. 13/280,251, filed on Oct. 24, 2011, now Pat. No. 8,386,833, which is a continuation of application No. 11/763,365, filed on Jun. 14, 2007, now Pat. No. 8,060,774, and a continuation-in-part of application No. 11/474,076, filed on Jun. 23, 2006, now abandoned, said application No. 11/763,365 is a continuation-in-part of application No. 11/515,223, filed on Sep. 1, 2006, now Pat. No. 8,619,452, application No. 14/090,342, which is a continuation-in-part of application No. 13/620,565, filed on Sep. 14, 2012, now Pat. No. 8,811,065, which is a continuation of application No. 11/515,223, filed on Sep. 1, 2006, now Pat. No. 8,619,452, said application No. 14/090,342 is a continuation-in-part of application No. 13/620,645, filed on Sep. 14, 2012, now abandoned, which is a continuation of application No. 11/929,655, filed on Oct. 30, 2007, now abandoned, which is a continuation of application No. 11/828,181, filed on Jul. 25, 2007, now abandoned, and a continuation-in-part of application No. 11/584,179, filed on Oct. 20, 2006, now Pat. No. 7,581,127, which is a continuation of application No. 11/524,811, filed on Sep. 20, 2006, now Pat. No. 7,590,796, said application No. 11/524,811 is a continuation-in-part of application No. 11/461,439, filed on Jul. 31, 2006, now Pat. No. 7,580,312, application No. 14/090,342, which is a continuation-in-part of application No. 13/473,827, filed on May 17, 2012, now Pat. No. 8,631,193, which is a division of application No. 12/378,328, filed on Feb. 14, 2009, now Pat. No. 8,438,328, application No. 14/090,342, which is a continuation-in-part of application No. 13/620,793, filed on Sep. 15, 2012, now Pat. No. 8,977,806, which is a continuation of application No. 12/057,306, filed on Mar. 27, 2008, now Pat. No. 8,397,013, which is a continuation-in-part of application No. 11/611,374, filed on Dec. 15, 2006, now Pat. No. 8,055,833, application No. 14/090,342, which is a continuation-in-part of application No. 13/620,424, filed on Sep. 14, 2012, now Pat. No. 8,751,732, which is a continuation of application No. 13/276,212, filed on Oct. 18, 2011, now Pat. No. 8,370,566, which is a continuation of application No. 11/611,374, filed on Dec. 15, 2006, now Pat. No. 8,055,833, application No. 14/090,342, which is a continuation-in-part of application No. 13/597,895, filed on Aug. 29, 2012, now Pat. No. 8,675,429, which is a continuation of application No. 13/367,259, filed on Feb. 6, 2012, now Pat. No. 8,279,690, which is a division of application No. 11/941,589, filed on Nov. 16, 2007, now Pat. No. 8,111,566, application No. 14/090,342, which is a continuation-in-part of application No. 13/455,691, filed on Apr. 25, 2012, now Pat. No. 8,710,862, which is a continuation of application No. 12/797,557, filed on Jun. 9, 2010, now Pat. No. 8,169,233, application No. 14/090,342, which is a continuation-in-part of application No. 13/620,412, filed on Sep. 14, 2012, now Pat. No. 8,705,240, which is a continuation of application No. 13/279,068, filed on Oct. 21, 2011, now Pat. No. 8,730,670, which is a division of application No. 12/203,100, filed on Sep. 2, 2008, now Pat. No. 8,081,474, application No. 14/090,342, which is a continuation-in-part of application No. 13/898,002, filed on May 20, 2013, now Pat. No. 8,760,936, which is a continuation of application No. 13/411,489, filed on Mar. 2, 2012, now Pat. No. 8,446,781, which is a continuation of application No. 11/939,432, filed on Nov. 13, 2007, now Pat. No. 8,130,560, application No. 14/090,432, which is a continuation-in-part of application No. 11/515,167, filed on Sep. 1, 2006, now Pat. No. 8,796,830, and a continuation-in-part of application No. 13/620,199, filed on Sep. 12, 2012, now Pat. No. 8,762,675, which is a continuation of application No. 12/144,396, filed on Jun. 23, 2008, now Pat. No. 8,386,722, application No. 14/090,342, which is a continuation-in-part of application No. 13/620,207, filed on Sep. 14, 2012, now Pat. No. 8,819,356, which is a continuation of application No. 12/508,496, filed on Jul. 23, 2009, now Pat. No. 8,335,894.

(60) Provisional application No. 60/693,631, filed on Jun. 24, 2005, provisional application No. 60/772,414,

Related U.S. Application Data filed on Feb. 9, 2006, provisional application No. 60/865,624, filed on Nov. 13, 2006, provisional application No. 60/865,627, filed on Nov. 13, 2006, provisional application No. 60/814,234, filed on Jun. 16, 2006, provisional application No. 60/713,815, filed on Sep. 2, 2005, provisional application No. 60/823,229, filed on Aug. 22, 2006, provisional application No. 61/030,534, filed on Feb. 21, 2008, provisional application No. 60/849,631, filed on Oct. 5, 2006, provisional application No. 61/185,585, filed on Jun. 9, 2009, provisional application No. 61/014,740, filed on Dec. 18, 2007, provisional application No. 60/865, 623, filed on Nov. 13, 2006, provisional application No. 61/083,878, filed on Jul. 25, 2008.

(56) References Cited

U.S. PATENT DOCUMENTS 4,334,307 A 6/1982 Bourgeois et al.
4,345,319 A 8/1982 Bernardini et al.
4,392,212 A 7/1983 Miyasaka et al.
4,500,958 A 2/1985 Manton et al.
4,525,921 A 7/1985 Carson et al.
4,566,082 A 1/1986 Anderson
4,592,019 A 5/1986 Huang et al.
4,628,407 A 12/1986 August et al.
4,646,128 A 2/1987 Carson et al.
4,698,748 A 10/1987 Juzswik et al.
4,706,166 A 11/1987 Go
4,710,903 A 12/1987 Hereth et al.
4,764,846 A 8/1988 Go
4,780,843 A 10/1988 Tietjen
4,794,597 A 12/1988 Ooba et al.
4,796,232 A 1/1989 House
4,807,191 A 2/1989 Flannagan
4,841,440 A 6/1989 Yonezu et al.
4,862,347 A 8/1989 Rudy
4,884,237 A 11/1989 Mueller et al.
4,887,240 A 12/1989 Garverick et al.
4,888,687 A 12/1989 Allison et al.
4,899,107 A 2/1990 Corbett et al.
4,912,678 A 3/1990 Mashiko
4,916,575 A 4/1990 Van Asten
4,922,451 A 5/1990 Lo et al.
4,935,734 A 6/1990 Austin
4,937,791 A 6/1990 Steele et al.
4,956,694 A 9/1990 Eide
4,982,265 A 1/1991 Watanabe et al.
4,983,533 A 1/1991 Go
5,025,364 A 6/1991 Zellmer
5,072,424 A 12/1991 Brent et al.
5,083,266 A 1/1992 Watanabe
5,104,820 A 4/1992 Go et al.
5,193,072 A 3/1993 Frenkil et al.
5,212,666 A 5/1993 Takeda
5,220,672 A 6/1993 Nakao et al.
5,222,014 A 6/1993 Lin
5,241,266 A 8/1993 Ahmad et al.
5,257,233 A 10/1993 Schaefer
5,278,796 A 1/1994 Tillinghast et al.
5,282,177 A 1/1994 McLaury
5,332,922 A 7/1994 Oguchi et al.
5,347,428 A 9/1994 Carson et al.
5,369,749 A 11/1994 Baker et al.
5,384,745 A 1/1995 Konishi et al.
5,388,265 A 2/1995 Volk
5,390,078 A 2/1995 Taylor
5,390,334 A 2/1995 Harrison
5,392,251 A 2/1995 Manning
5,408,190 A 4/1995 Wood et al.
5,432,729 A 7/1995 Carson et al.
5,448,511 A 9/1995 Paurus et al.
5,467,455 A 11/1995 Gay et al.
5,483,497 A 1/1996 Mochizuki et al.
5,498,886 A 3/1996 Hsu et al.
5,502,333 A 3/1996 Bertin et al.
5,502,667 A 3/1996 Bertin et al.
5,513,135 A 4/1996 Dell et al.
5,513,339 A 4/1996 Agrawal et al.
5,519,832 A 5/1996 Warchol
5,526,320 A 6/1996 Zagar et al.
5,530,836 A 6/1996 Busch et al.
5,550,781 A 8/1996 Sugawara et al.
5,559,990 A 9/1996 Cheng et al.
5,561,622 A 10/1996 Bertin et al.
5,563,086 A 10/1996 Bertin et al.
5,566,344 A 10/1996 Hall et al.
5,581,498 A 12/1996 Ludwig et al.
5,581,779 A 12/1996 Hall et al.
5,590,071 A 12/1996 Kolor et al.
5,598,376 A 1/1997 Merritt et al.
5,604,714 A 2/1997 Manning et al.
5,606,710 A 2/1997 Hall et al.
5,608,262 A 3/1997 Degani et al.
5,610,864 A 3/1997 Manning
5,623,686 A 4/1997 Hall et al.
5,627,791 A 5/1997 Wright et al.
5,640,337 A 6/1997 Huang et al.
5,640,364 A 6/1997 Merritt et al.
5,652,724 A 7/1997 Manning
5,654,204 A 8/1997 Anderson
5,661,677 A 8/1997 Rondeau et al.
5,661,695 A 8/1997 Zagar et al.
5,668,773 A 9/1997 Zagar et al.
5,675,549 A 10/1997 Ong et al.
5,680,342 A 10/1997 Frankeny
5,682,354 A 10/1997 Manning
5,692,121 A 11/1997 Bozso et al.
5,692,202 A 11/1997 Kardach et al.
5,696,732 A 12/1997 Zagar et al.
5,696,929 A 12/1997 Hasbun et al.
5,702,984 A 12/1997 Bertin et al.
5,703,813 A 12/1997 Manning et al.
5,706,247 A 1/1998 Merritt et al.
RE35,733 E 2/1998 Hernandez et al.
5,717,654 A 2/1998 Manning
5,721,859 A 2/1998 Manning
5,724,288 A 3/1998 Cloud et al.
5,729,503 A 3/1998 Manning
5,729,504 A 3/1998 Cowles
5,742,792 A 4/1998 Yanai et al.
5,748,914 A 5/1998 Barth et al.
5,752,045 A 5/1998 Chen
5,757,703 A 5/1998 Merritt et al.
5,760,478 A 6/1998 Bozso et al.
5,761,703 A 6/1998 Bolyn
5,765,203 A 6/1998 Sangha
5,781,766 A 7/1998 Davis
5,787,457 A 7/1998 Miller et al.
5,798,961 A 8/1998 Heyden et al.
5,802,010 A 9/1998 Zagar et al.
5,802,395 A 9/1998 Connolly et al.
5,802,555 A 9/1998 Shigeeda
5,812,488 A 9/1998 Zagar et al.
5,818,788 A 10/1998 Kimura et al.
5,819,065 A 10/1998 Chilton et al.
5,831,833 A 11/1998 Shirakawa et al.
5,831,931 A 11/1998 Manning
5,831,932 A 11/1998 Merritt et al.
5,834,838 A 11/1998 Anderson
5,835,435 A 11/1998 Bogin et al.
5,838,165 A 11/1998 Chatter
5,838,177 A 11/1998 Keeth
5,841,580 A 11/1998 Farmwald et al.
5,843,799 A 12/1998 Hsu et al.
5,843,807 A 12/1998 Burns
5,845,108 A 12/1998 Yoo et al.
5,850,368 A 12/1998 Ong et al.
5,859,792 A 1/1999 Rondeau et al.
5,860,106 A 1/1999 Domen et al.
5,870,347 A 2/1999 Keeth et al.
5,870,350 A 2/1999 Bertin

(56) References Cited

U.S. PATENT DOCUMENTS 5,872,907 A 2/1999 Griess et al.
5,875,142 A 2/1999 Chevallier
5,878,279 A 3/1999 Athenes
5,884,088 A 3/1999 Kardach et al.
5,901,105 A 5/1999 Ong et al.
5,903,500 A 5/1999 Tsang et al.
5,905,688 A 5/1999 Park
5,907,512 A 5/1999 Parkinson et al.
5,910,010 A 6/1999 Nishizawa et al.
5,913,072 A 6/1999 Wieringa
5,915,105 A 6/1999 Farmwald et al.
5,915,167 A 6/1999 Leedy
5,917,758 A 6/1999 Keeth
5,923,611 A 7/1999 Ryan
5,924,111 A 7/1999 Huang et al.
5,929,650 A 7/1999 Pappert et al.
5,943,254 A 8/1999 Bakeman, Jr. et al.
5,946,265 A 8/1999 Cowles
5,949,254 A 9/1999 Keeth
5,953,215 A 9/1999 Karabatsos
5,953,263 A 9/1999 Farmwald et al.
5,954,804 A 9/1999 Farmwald et al.
5,956,233 A 9/1999 Yew et al.
5,959,923 A 9/1999 Matteson et al.
5,960,468 A 9/1999 Paluch
5,962,435 A 10/1999 Mao et al.
5,963,429 A 10/1999 Chen
5,963,463 A 10/1999 Rondeau et al.
5,963,464 A 10/1999 Dell et al.
5,963,504 A 10/1999 Manning
5,966,724 A 10/1999 Ryan
5,966,727 A 10/1999 Nishino
5,969,996 A 10/1999 Muranaka et al.
5,973,392 A 10/1999 Senba et al.
5,978,304 A 11/1999 Crafts
5,995,424 A 11/1999 Lawrence et al.
5,995,443 A 11/1999 Farmwald et al.
6,001,671 A 12/1999 Fjelstad
6,002,613 A 12/1999 Cloud et al.
6,002,627 A 12/1999 Chevallier
6,014,339 A 1/2000 Kobayashi et al.
6,016,282 A 1/2000 Keeth
6,026,027 A 2/2000 Terrell, II et al.
6,026,050 A 2/2000 Baker et al.
6,029,250 A 2/2000 Keeth
6,032,214 A 2/2000 Farmwald et al.
6,032,215 A 2/2000 Farmwald et al.
6,034,916 A 3/2000 Lee
6,034,918 A 3/2000 Farmwald et al.
6,035,365 A 3/2000 Farmwald et al.
6,038,195 A 3/2000 Farmwald et al.
6,038,673 A 3/2000 Benn et al.
6,044,028 A 3/2000 Kumagai et al.
6,044,032 A 3/2000 Li
6,047,073 A 4/2000 Norris et al.
6,047,344 A 4/2000 Kawasumi et al.
6,047,361 A 4/2000 Ingenio et al.
6,053,948 A 4/2000 Vaidyanathan et al.
6,058,451 A 5/2000 Bermingham et al.
6,065,092 A 5/2000 Roy
6,069,504 A 5/2000 Keeth
6,070,217 A 5/2000 Connolly et al.
6,073,223 A 6/2000 McAllister et al.
6,075,730 A 6/2000 Barth et al.
6,075,744 A 6/2000 Tsern et al.
6,078,546 A 6/2000 Lee
6,079,025 A 6/2000 Fung
6,084,434 A 7/2000 Keeth
6,088,290 A 7/2000 Ohtake et al.
6,091,251 A 7/2000 Wood et al.
RE36,839 E 8/2000 Simmons et al.
6,101,152 A 8/2000 Farmwald et al.
6,101,564 A 8/2000 Athenes et al.
6,101,612 A 8/2000 Jeddeloh
6,108,795 A 8/2000 Jeddeloh
6,111,812 A 8/2000 Gans et al.
6,125,072 A 9/2000 Wu
6,134,638 A 10/2000 Olarig et al.
6,154,370 A 11/2000 Degani et al.
6,166,991 A 12/2000 Phelan
6,181,640 B1 1/2001 Kang
6,182,184 B1 1/2001 Farmwald et al.
6,199,151 B1 3/2001 Williams et al.
6,208,168 B1 3/2001 Rhee
6,216,246 B1 4/2001 Shau
6,222,739 B1 4/2001 Bhakta et al.
6,226,709 B1 5/2001 Goodwin et al.
6,226,730 B1 5/2001 Murdoch et al.
6,233,192 B1 5/2001 Tanaka
6,233,650 B1 5/2001 Johnson et al.
6,240,048 B1 5/2001 Matsubara
6,243,282 B1 6/2001 Rondeau et al.
6,252,807 B1 6/2001 Suzuki et al.
6,253,278 B1 6/2001 Ryan
6,260,097 B1 7/2001 Farmwald et al.
6,260,154 B1 7/2001 Jeddeloh
6,262,938 B1 7/2001 Lee et al.
6,266,285 B1 7/2001 Farmwald et al.
6,266,292 B1 7/2001 Tsern et al.
6,274,395 B1 8/2001 Weber
6,279,069 B1 8/2001 Robinson et al.
6,295,572 B1 9/2001 Wu
6,297,966 B1 10/2001 Lee et al.
6,298,426 B1 10/2001 Ajanovic
6,304,511 B1 10/2001 Gans et al.
6,307,769 B1 10/2001 Nuxoll et al.
6,314,051 B1 11/2001 Farmwald et al.
6,317,352 B1 11/2001 Halbert et al.
6,317,381 B1 11/2001 Gans et al.
6,324,120 B2 11/2001 Farmwald et al.
6,326,810 B1 12/2001 Keeth
6,327,664 B1 12/2001 Dell et al.
6,330,683 B1 12/2001 Jeddeloh
6,336,174 B1 1/2002 Li et al.
6,338,108 B1 1/2002 Motomura
6,338,113 B1 1/2002 Kubo et al.
6,341,347 B1 1/2002 Joy et al.
6,343,019 B1 1/2002 Jiang et al.
6,343,042 B1 1/2002 Tsern et al.
6,353,561 B1 3/2002 Funyu et al.
6,356,105 B1 3/2002 Volk
6,356,500 B1 3/2002 Cloud et al.
6,362,656 B2 3/2002 Rhee
6,363,031 B2 3/2002 Phelan
6,378,020 B2 4/2002 Farmwald et al.
6,381,188 B1 4/2002 Choi et al.
6,381,668 B1 4/2002 Lunteren
6,389,514 B1 5/2002 Rokicki
6,392,304 B1 5/2002 Butler
6,414,868 B1 7/2002 Wong et al.
6,418,034 B1 7/2002 Weber et al.
6,421,754 B1 7/2002 Kau et al.
6,424,532 B2 7/2002 Kawamura
6,426,916 B2 7/2002 Farmwald et al.
6,429,029 B1 8/2002 Eldridge et al.
6,430,103 B2 8/2002 Nakayama et al.
6,434,660 B1 8/2002 Lambert et al.
6,437,600 B1 8/2002 Keeth
6,438,057 B1 8/2002 Ruckerbauer
6,442,698 B2 8/2002 Nizar
6,445,591 B1 9/2002 Kwong
6,452,826 B1 9/2002 Kim et al.
6,452,863 B2 9/2002 Farmwald et al.
6,453,400 B1 9/2002 Maesako et al.
6,453,402 B1 9/2002 Jeddeloh
6,453,434 B2 9/2002 Delp et al.
6,455,348 B1 9/2002 Yamaguchi
6,457,095 B1 9/2002 Volk
6,459,651 B1 10/2002 Lee et al.
6,470,417 B1 * 10/2002 Kolor et al. .................. 711/105
6,473,831 B1 10/2002 Schade
6,476,476 B1 11/2002 Glenn
6,480,929 B1 11/2002 Gauthier et al.
6,487,102 B1 11/2002 Halbert et al.

(56) References Cited

U.S. PATENT DOCUMENTS 6,489,669 B2 12/2002 Shimada et al.
6,490,161 B1 12/2002 Johnson
6,492,726 B1 12/2002 Quek et al.
6,493,789 B2 12/2002 Ware et al.
6,496,440 B2 12/2002 Manning
6,496,897 B2 12/2002 Ware et al.
6,498,766 B2 12/2002 Lee et al.
6,510,097 B2 1/2003 Fukuyama
6,510,503 B2 1/2003 Gillingham et al.
6,512,392 B2 1/2003 Fleury et al.
6,521,984 B2 2/2003 Matsuura
6,526,471 B1 2/2003 Shimomura et al.
6,526,473 B1 2/2003 Kim
6,526,484 B1 2/2003 Stacovsky et al.
6,545,895 B1 4/2003 Li et al.
6,546,446 B2 4/2003 Farmwald et al.
6,553,450 B1 4/2003 Dodd et al.
6,560,158 B2 5/2003 Choi et al.
6,563,337 B2 5/2003 Dour
6,563,759 B2 5/2003 Yahata et al.
6,564,281 B2 5/2003 Farmwald et al.
6,564,285 B1 5/2003 Mills et al.
6,574,150 B2 6/2003 Suyama et al.
6,584,036 B2 * 6/2003 Kurjanowicz et al. ... 365/233.11
6,584,037 B2 6/2003 Farmwald et al.
6,587,912 B2 7/2003 Leddige et al.
6,590,822 B2 7/2003 Hwang et al.
6,594,770 B1 7/2003 Sato et al.
6,597,616 B2 7/2003 Tsern et al.
6,597,617 B2 7/2003 Ooishi et al.
6,614,700 B2 9/2003 Dietrich et al.
6,618,267 B1 9/2003 Dalal et al.
6,618,791 B1 9/2003 Dodd et al.
6,621,760 B1 9/2003 Ahmad et al.
6,628,538 B2 9/2003 Funaba et al.
6,629,282 B1 9/2003 Sugamori et al.
6,630,729 B2 10/2003 Huang
6,631,086 B1 10/2003 Bill et al.
6,639,820 B1 10/2003 Khandekar et al.
6,646,939 B2 11/2003 Kwak
6,650,588 B2 11/2003 Yamagata
6,650,594 B1 11/2003 Lee et al.
6,657,634 B1 12/2003 Sinclair et al.
6,657,918 B2 12/2003 Foss et al.
6,657,919 B2 12/2003 Foss et al.
6,658,016 B1 12/2003 Dai et al.
6,658,530 B1 12/2003 Robertson et al.
6,659,512 B1 12/2003 Harper et al.
6,664,625 B2 12/2003 Hiruma
6,665,224 B1 12/2003 Lehmann et al.
6,665,227 B2 12/2003 Fetzer
6,668,242 B1 12/2003 Reynov et al.
6,674,154 B2 1/2004 Minamio et al.
6,683,372 B1 1/2004 Wong et al.
6,684,292 B2 1/2004 Piccirillo et al.
6,690,191 B2 2/2004 Wu et al.
6,697,295 B2 2/2004 Farmwald et al.
6,701,446 B2 3/2004 Tsern et al.
6,705,877 B1 3/2004 Li et al.
6,708,144 B1 3/2004 Merryman et al.
6,710,430 B2 3/2004 Minamio et al.
6,711,043 B2 3/2004 Friedman et al.
6,713,856 B2 3/2004 Tsai et al.
6,714,433 B2 3/2004 Doblar et al.
6,714,891 B2 3/2004 Dendinger
6,724,684 B2 4/2004 Kim
6,730,540 B2 5/2004 Siniaguine
6,731,009 B1 5/2004 Jones et al.
6,731,527 B2 5/2004 Brown
6,742,098 B1 5/2004 Halbert et al.
6,744,687 B2 6/2004 Koo et al.
6,747,887 B2 6/2004 Halbert et al.
6,751,113 B2 6/2004 Bhakta et al.
6,751,696 B2 6/2004 Farmwald et al.
6,754,129 B2 6/2004 Khatri et al.
6,754,132 B2 6/2004 Kyung
6,757,751 B1 6/2004 Gene
6,762,948 B2 7/2004 Kyun et al.
6,765,812 B2 7/2004 Anderson
6,766,469 B2 7/2004 Larson et al.
6,771,526 B2 8/2004 LaBerge
6,772,359 B2 8/2004 Kwak et al.
6,779,097 B2 8/2004 Gillingham et al.
6,785,767 B2 8/2004 Coulson
6,791,877 B2 9/2004 Miura et al.
6,795,899 B2 9/2004 Dodd et al.
6,799,241 B2 9/2004 Kahn et al.
6,801,989 B2 10/2004 Johnson et al.
6,807,598 B2 10/2004 Farmwald et al.
6,807,650 B2 10/2004 Lamb et al.
6,807,655 B1 10/2004 Rehani et al.
6,810,475 B1 10/2004 Tardieux
6,816,991 B2 11/2004 Sanghani
6,819,602 B2 11/2004 Seo et al.
6,819,617 B2 11/2004 Hwang et al.
6,820,163 B1 11/2004 McCall et al.
6,820,169 B2 11/2004 Wilcox et al.
6,826,104 B2 11/2004 Kawaguchi et al.
6,839,290 B2 1/2005 Ahmad et al.
6,844,754 B2 1/2005 Yamagata
6,845,027 B2 1/2005 Mayer et al.
6,845,055 B1 1/2005 Koga et al.
6,847,582 B2 1/2005 Pan
6,850,449 B2 2/2005 Takahashi
6,854,043 B2 2/2005 Hargis et al.
6,862,202 B2 3/2005 Schaefer
6,862,249 B2 3/2005 Kyung
6,862,653 B1 3/2005 Dodd et al.
6,873,534 B2 3/2005 Bhakta et al.
6,878,570 B2 4/2005 Lyu et al.
6,894,933 B2 5/2005 Kuzmenka et al.
6,898,683 B2 5/2005 Nakamura
6,906,407 B2 6/2005 Byers et al.
6,908,314 B2 6/2005 Brown
6,912,778 B2 7/2005 Ahn et al.
6,914,786 B1 7/2005 Paulsen et al.
6,917,219 B2 7/2005 New
6,922,371 B2 7/2005 Takahashi et al.
6,930,900 B2 8/2005 Bhakta et al.
6,930,903 B2 8/2005 Bhakta et al.
6,938,119 B2 8/2005 Kohn et al.
6,943,450 B2 9/2005 Fee et al.
6,944,748 B2 9/2005 Sanches et al.
6,947,341 B2 9/2005 Stubbs et al.
6,951,982 B2 10/2005 Chye et al.
6,952,794 B2 10/2005 Lu
6,961,281 B2 11/2005 Wong et al.
6,968,416 B2 11/2005 Moy
6,968,419 B1 11/2005 Holman
6,970,968 B1 11/2005 Holman
6,980,021 B1 12/2005 Srivastava et al.
6,986,118 B2 1/2006 Dickman
6,992,501 B2 1/2006 Rapport
6,992,950 B2 1/2006 Foss et al.
7,000,062 B2 2/2006 Perego et al.
7,003,618 B2 2/2006 Perego et al.
7,003,639 B2 2/2006 Tsern et al.
7,007,095 B2 2/2006 Chen et al.
7,007,175 B2 2/2006 Chang et al.
7,010,642 B2 3/2006 Perego et al.
7,010,736 B1 3/2006 Teh et al.
7,024,518 B2 4/2006 Halbert et al.
7,026,708 B2 4/2006 Cady et al.
7,028,215 B2 4/2006 Depew et al.
7,028,234 B2 4/2006 Huckaby et al.
7,033,861 B1 4/2006 Partridge et al.
7,035,150 B2 4/2006 Streif et al.
7,043,599 B1 5/2006 Ware et al.
7,043,611 B2 5/2006 McClannahan et al.
7,045,396 B2 5/2006 Crowley et al.
7,045,901 B2 5/2006 Lin et al.
7,046,538 B2 5/2006 Kinsley et al.
7,053,470 B1 5/2006 Sellers et al.
7,053,478 B2 5/2006 Roper et al.

(56) References Cited

U.S. PATENT DOCUMENTS

| | | | |
|---|---|---|---|
| 7,058,776 | B2 | 6/2006 | Lee |
| 7,058,863 | B2 | 6/2006 | Kouchi et al. |
| 7,061,784 | B2 | 6/2006 | Jakobs et al. |
| 7,061,823 | B2 | 6/2006 | Faue et al. |
| 7,062,689 | B2 | 6/2006 | Slobodnik |
| 7,066,741 | B2 | 6/2006 | Burns et al. |
| 7,075,175 | B2 | 7/2006 | Kazi et al. |
| 7,079,396 | B2 | 7/2006 | Gates et al. |
| 7,079,441 | B1 | 7/2006 | Partsch et al. |
| 7,079,446 | B2 | 7/2006 | Murtagh et al. |
| 7,085,152 | B2 | 8/2006 | Ellis et al. |
| 7,085,941 | B2 | 8/2006 | Li |
| 7,089,438 | B2 | 8/2006 | Raad |
| 7,093,101 | B2 | 8/2006 | Aasheim et al. |
| 7,103,730 | B2 | 9/2006 | Saxena et al. |
| 7,110,322 | B2 | 9/2006 | Farmwald et al. |
| 7,111,143 | B2 | 9/2006 | Walker |
| 7,117,309 | B2 | 10/2006 | Bearden |
| 7,119,428 | B2 | 10/2006 | Tanie et al. |
| 7,120,727 | B2 | 10/2006 | Lee et al. |
| 7,126,399 | B1 | 10/2006 | Lee |
| 7,127,567 | B2 | 10/2006 | Ramakrishnan et al. |
| 7,133,960 | B1 | 11/2006 | Thompson et al. |
| 7,136,978 | B2 | 11/2006 | Miura et al. |
| 7,138,823 | B2 | 11/2006 | Janzen et al. |
| 7,149,145 | B2 | 12/2006 | Kim et al. |
| 7,149,824 | B2 | 12/2006 | Johnson |
| 7,173,863 | B2 | 2/2007 | Conley et al. |
| 7,177,206 | B2 | 2/2007 | Lee |
| 7,200,021 | B2 | 4/2007 | Raghuram |
| 7,205,789 | B1 | 4/2007 | Karabatsos |
| 7,210,059 | B2 | 4/2007 | Jeddeloh |
| 7,215,561 | B2 | 5/2007 | Park et al. |
| 7,218,566 | B1 | 5/2007 | Totolos, Jr. et al. |
| 7,224,595 | B2 | 5/2007 | Dreps et al. |
| 7,228,264 | B2 | 6/2007 | Barrenscheen et al. |
| 7,231,562 | B2 | 6/2007 | Ohlhoff et al. |
| 7,233,541 | B2 | 6/2007 | Yamamoto et al. |
| 7,234,081 | B2 | 6/2007 | Nguyen et al. |
| 7,243,185 | B2 | 7/2007 | See et al. |
| 7,245,541 | B2 | 7/2007 | Janzen |
| 7,254,036 | B2 | 8/2007 | Pauley et al. |
| 7,266,639 | B2 | 9/2007 | Raghuram |
| 7,269,042 | B2 | 9/2007 | Kinsley et al. |
| 7,269,708 | B2 | 9/2007 | Ware |
| 7,274,583 | B2 | 9/2007 | Park et al. |
| 7,277,333 | B2 | 10/2007 | Schaefer |
| 7,286,436 | B2 | 10/2007 | Bhakta et al. |
| 7,289,386 | B2 | 10/2007 | Bhakta et al. |
| 7,296,754 | B2 | 11/2007 | Nishizawa et al. |
| 7,299,330 | B2 | 11/2007 | Gillingham et al. |
| 7,302,598 | B2 | 11/2007 | Suzuki et al. |
| 7,307,863 | B2 | 12/2007 | Yen et al. |
| 7,317,250 | B2 | 1/2008 | Koh et al. |
| 7,327,613 | B2 | 2/2008 | Lee |
| 7,336,490 | B2 | 2/2008 | Harris et al. |
| 7,337,293 | B2 | 2/2008 | Brittain et al. |
| 7,363,422 | B2 | 4/2008 | Perego et al. |
| 7,366,947 | B2 | 4/2008 | Gower et al. |
| 7,379,316 | B2 | 5/2008 | Rajan |
| 7,386,656 | B2 | 6/2008 | Rajan et al. |
| 7,392,338 | B2 | 6/2008 | Rajan et al. |
| 7,408,393 | B1 | 8/2008 | Jain et al. |
| 7,409,492 | B2 | 8/2008 | Tanaka et al. |
| 7,414,917 | B2 | 8/2008 | Ruckerbauer et al. |
| 7,428,644 | B2 | 9/2008 | Jeddeloh et al. |
| 7,437,579 | B2 | 10/2008 | Jeddeloh et al. |
| 7,441,064 | B2 | 10/2008 | Gaskins |
| 7,457,122 | B2 | 11/2008 | Lai et al. |
| 7,464,225 | B2 | 12/2008 | Tsern |
| 7,472,220 | B2 | 12/2008 | Rajan et al. |
| 7,474,576 | B2 | 1/2009 | Co et al. |
| 7,480,147 | B2 | 1/2009 | Hoss et al. |
| 7,480,774 | B2 | 1/2009 | Ellis et al. |
| 7,496,777 | B2 | 2/2009 | Kapil |
| 7,499,281 | B2 | 3/2009 | Harris et al. |
| 7,515,453 | B2 | 4/2009 | Rajan |
| 7,532,537 | B2 | 5/2009 | Solomon et al. |
| 7,539,800 | B2 | 5/2009 | Dell et al. |
| 7,573,136 | B2 | 8/2009 | Jiang et al. |
| 7,580,312 | B2 | 8/2009 | Rajan et al. |
| 7,581,121 | B2 | 8/2009 | Barth et al. |
| 7,581,127 | B2 | 8/2009 | Rajan et al. |
| 7,590,796 | B2 | 9/2009 | Rajan et al. |
| 7,599,205 | B2 | 10/2009 | Rajan |
| 7,606,245 | B2 | 10/2009 | Ma et al. |
| 7,609,567 | B2 | 10/2009 | Rajan et al. |
| 7,613,880 | B2 | 11/2009 | Miura et al. |
| 7,619,912 | B2 | 11/2009 | Bhakta et al. |
| 7,724,589 | B2 | 5/2010 | Rajan et al. |
| 7,730,338 | B2 | 6/2010 | Rajan et al. |
| 7,738,252 | B2 | 6/2010 | Schuette et al. |
| 7,761,724 | B2 | 7/2010 | Rajan et al. |
| 7,791,889 | B2 | 9/2010 | Belady et al. |
| 7,911,798 | B2 | 3/2011 | Chang et al. |
| 7,934,070 | B2 | 4/2011 | Brittain et al. |
| 7,990,797 | B2 | 8/2011 | Moshayedi et al. |
| 8,019,589 | B2 | 9/2011 | Rajan et al. |
| 8,041,881 | B2 | 10/2011 | Rajan et al. |
| 8,080,874 | B1 | 12/2011 | Werner et al. |
| 8,081,474 | B1 | 12/2011 | Zohni et al. |
| 8,111,566 | B1 | 2/2012 | Wang et al. |
| 8,116,144 | B2 | 2/2012 | Shaw et al. |
| 8,130,560 | B1 | 3/2012 | Rajan et al. |
| 8,154,935 | B2 | 4/2012 | Rajan |
| 8,169,233 | B2 | 5/2012 | Ferolito et al. |
| 8,181,048 | B2 | 5/2012 | Rajan et al. |
| 8,335,894 | B1 | 12/2012 | Rajan et al. |
| 8,340,953 | B2 | 12/2012 | Rajan et al. |
| 8,386,722 | B1 | 2/2013 | Wang et al. |
| 8,397,013 | B1 | 3/2013 | Rosenband et al. |
| 8,796,830 | B1 | 8/2014 | Fjelstad |
| 2001/0000822 | A1 | 5/2001 | Dell et al. |
| 2001/0003198 | A1 | 6/2001 | Wu |
| 2001/0011322 | A1 | 8/2001 | Stolt et al. |
| 2001/0019509 | A1 | 9/2001 | Aho et al. |
| 2001/0021106 | A1 | 9/2001 | Weber et al. |
| 2001/0021137 | A1 | 9/2001 | Kai et al. |
| 2001/0046129 | A1 | 11/2001 | Broglia et al. |
| 2001/0046163 | A1 | 11/2001 | Yanagawa |
| 2001/0052062 | A1 | 12/2001 | Lipovski |
| 2002/0002662 | A1 | 1/2002 | Olarig et al. |
| 2002/0004897 | A1 | 1/2002 | Kao et al. |
| 2002/0015340 | A1 | 2/2002 | Batinovich |
| 2002/0019961 | A1 | 2/2002 | Blodgett |
| 2002/0034068 | A1 | 3/2002 | Weber et al. |
| 2002/0038405 | A1 | 3/2002 | Leddige et al. |
| 2002/0040416 | A1 | 4/2002 | Tsern et al. |
| 2002/0041507 | A1 | 4/2002 | Woo et al. |
| 2002/0051398 | A1 | 5/2002 | Mizugaki |
| 2002/0060945 | A1 | 5/2002 | Ikeda |
| 2002/0060948 | A1 | 5/2002 | Chang et al. |
| 2002/0064073 | A1 | 5/2002 | Chien |
| 2002/0064083 | A1 | 5/2002 | Ryu et al. |
| 2002/0089831 | A1 | 7/2002 | Forthun |
| 2002/0089970 | A1 | 7/2002 | Asada et al. |
| 2002/0094671 | A1 | 7/2002 | Distefano et al. |
| 2002/0121650 | A1 | 9/2002 | Minamio et al. |
| 2002/0121670 | A1 | 9/2002 | Minamio et al. |
| 2002/0124195 | A1 | 9/2002 | Nizar |
| 2002/0129204 | A1 | 9/2002 | Leighnor et al. |
| 2002/0145900 | A1 | 10/2002 | Schaefer |
| 2002/0165706 | A1 | 11/2002 | Raynham |
| 2002/0167092 | A1 | 11/2002 | Fee et al. |
| 2002/0172024 | A1 | 11/2002 | Hui et al. |
| 2002/0174274 | A1 | 11/2002 | Wu et al. |
| 2002/0184438 | A1 | 12/2002 | Usui |
| 2003/0002262 | A1 | 1/2003 | Benisek et al. |
| 2003/0011993 | A1 | 1/2003 | Summers et al. |
| 2003/0021175 | A1 | 1/2003 | Tae Kwak |
| 2003/0026155 | A1 | 2/2003 | Yamagata |
| 2003/0026159 | A1 | 2/2003 | Frankowsky et al. |
| 2003/0035312 | A1 | 2/2003 | Halbert et al. |
| 2003/0039158 | A1 | 2/2003 | Horiguchi et al. |

(56) References Cited

U.S. PATENT DOCUMENTS

2003/0041295 A1 2/2003 Hou et al.
2003/0061458 A1 3/2003 Wilcox et al.
2003/0061459 A1 3/2003 Aboulenein et al.
2003/0083855 A1 5/2003 Fukuyama
2003/0088743 A1 5/2003 Rader
2003/0093614 A1 5/2003 Kohn et al.
2003/0101392 A1 5/2003 Lee
2003/0105932 A1 6/2003 David et al.
2003/0110339 A1 6/2003 Calvignac et al.
2003/0117875 A1 6/2003 Lee et al.
2003/0123389 A1 7/2003 Russell et al.
2003/0126338 A1 7/2003 Dodd et al.
2003/0127737 A1 7/2003 Takahashi
2003/0131160 A1 7/2003 Hampel et al.
2003/0145163 A1 7/2003 Seo et al.
2003/0158995 A1 8/2003 Lee et al.
2003/0164539 A1 9/2003 Yau
2003/0164543 A1 9/2003 Kheng Lee
2003/0174569 A1 9/2003 Amidi
2003/0182513 A1 9/2003 Dodd et al.
2003/0183934 A1 10/2003 Barrett
2003/0189868 A1 10/2003 Riesenman et al.
2003/0189870 A1 10/2003 Wilcox
2003/0191888 A1 10/2003 Klein
2003/0191915 A1 10/2003 Saxena et al.
2003/0200382 A1 10/2003 Wells et al.
2003/0200474 A1 10/2003 Li
2003/0205802 A1 11/2003 Segaram et al.
2003/0206476 A1 11/2003 Joo
2003/0217303 A1 11/2003 Chua-Eoan et al.
2003/0223290 A1 12/2003 Park et al.
2003/0227798 A1 12/2003 Pax
2003/0229821 A1 12/2003 Ma
2003/0230801 A1 12/2003 Jiang et al.
2003/0231540 A1 12/2003 Lazar et al.
2003/0231542 A1 12/2003 Zaharinova-Papazova et al.
2004/0000708 A1 1/2004 Rapport et al.
2004/0016994 A1 1/2004 Huang
2004/0027902 A1 2/2004 Ooishi et al.
2004/0034732 A1 2/2004 Valin et al.
2004/0034755 A1 2/2004 LaBerge et al.
2004/0037133 A1 2/2004 Park et al.
2004/0042503 A1 3/2004 Shaeffer et al.
2004/0044808 A1 3/2004 Salmon et al.
2004/0047228 A1 3/2004 Chen
2004/0049624 A1 3/2004 Salmonsen
2004/0057317 A1 3/2004 Schaefer
2004/0064647 A1 4/2004 DeWhitt et al.
2004/0064767 A1 4/2004 Huckaby et al.
2004/0083324 A1 4/2004 Rabinovitz et al.
2004/0088475 A1 5/2004 Streif et al.
2004/0117723 A1 6/2004 Foss
2004/0123173 A1 6/2004 Emberling et al.
2004/0125635 A1 7/2004 Kuzmenka
2004/0133374 A1 7/2004 Kattan
2004/0133736 A1 7/2004 Kyung
2004/0139359 A1 7/2004 Samson et al.
2004/0145963 A1 7/2004 Byon
2004/0151038 A1 8/2004 Ruckerbauer et al.
2004/0174765 A1 9/2004 Seo et al.
2004/0177079 A1 9/2004 Gluhovsky et al.
2004/0178824 A1 9/2004 Pan
2004/0184324 A1 9/2004 Pax
2004/0186956 A1 9/2004 Perego et al.
2004/0188704 A1 9/2004 Halbert et al.
2004/0195682 A1 10/2004 Kimura
2004/0196732 A1 10/2004 Lee
2004/0205433 A1 10/2004 Gower et al.
2004/0208173 A1 10/2004 Di Gregorio
2004/0225858 A1 11/2004 Brueggen
2004/0228166 A1 11/2004 Braun et al.
2004/0228203 A1 11/2004 Koo
2004/0230932 A1 11/2004 Dickmann
2004/0236877 A1 11/2004 Burton
2004/0250989 A1 12/2004 Im et al.
2004/0256638 A1 12/2004 Perego et al.
2004/0257847 A1 12/2004 Matsui et al.
2004/0257857 A1 12/2004 Yamamoto et al.
2004/0260957 A1 12/2004 Jeddeloh et al.
2004/0264255 A1 12/2004 Royer
2004/0268161 A1 12/2004 Ross
2005/0018495 A1 1/2005 Bhakta et al.
2005/0021874 A1 1/2005 Georgiou et al.
2005/0024963 A1 2/2005 Jakobs et al.
2005/0027928 A1 2/2005 Avraham et al.
2005/0028038 A1 2/2005 Pomaranski et al.
2005/0034004 A1 2/2005 Bunker et al.
2005/0036350 A1 2/2005 So et al.
2005/0041504 A1 2/2005 Perego et al.
2005/0044302 A1 2/2005 Pauley et al.
2005/0044303 A1 2/2005 Perego et al.
2005/0044305 A1 2/2005 Jakobs et al.
2005/0047192 A1 3/2005 Matsui et al.
2005/0071543 A1 3/2005 Ellis et al.
2005/0078532 A1 4/2005 Ruckerbauer et al.
2005/0081085 A1 4/2005 Ellis et al.
2005/0086548 A1 4/2005 Haid et al.
2005/0099834 A1 5/2005 Funaba et al.
2005/0102590 A1 5/2005 Norris et al.
2005/0105318 A1 5/2005 Funaba et al.
2005/0108460 A1 5/2005 David
2005/0127531 A1 6/2005 Tay et al.
2005/0132158 A1 6/2005 Hampel et al.
2005/0135176 A1 6/2005 Ramakrishnan et al.
2005/0138267 A1 6/2005 Bains et al.
2005/0138304 A1 6/2005 Ramakrishnan et al.
2005/0139977 A1 6/2005 Nishio et al.
2005/0141199 A1 6/2005 Chiou et al.
2005/0149662 A1 7/2005 Perego et al.
2005/0152212 A1 7/2005 Yang et al.
2005/0156934 A1 7/2005 Perego et al.
2005/0166026 A1 7/2005 Ware et al.
2005/0193163 A1 9/2005 Perego et al.
2005/0193183 A1 9/2005 Barth et al.
2005/0194676 A1 9/2005 Fukuda et al.
2005/0194991 A1 9/2005 Dour et al.
2005/0195629 A1 9/2005 Leddige et al.
2005/0201063 A1 9/2005 Lee et al.
2005/0204111 A1 9/2005 Natarajan
2005/0207255 A1 9/2005 Perego et al.
2005/0210196 A1 9/2005 Perego et al.
2005/0223179 A1 10/2005 Perego et al.
2005/0224948 A1 10/2005 Lee et al.
2005/0232049 A1 10/2005 Park
2005/0235119 A1 10/2005 Sechrest et al.
2005/0235131 A1 10/2005 Ware
2005/0237838 A1 10/2005 Kwak et al.
2005/0243635 A1 11/2005 Schaefer
2005/0246558 A1 11/2005 Ku
2005/0249011 A1 11/2005 Maeda
2005/0259504 A1 11/2005 Murtugh et al.
2005/0263312 A1 12/2005 Bolken et al.
2005/0265506 A1 12/2005 Foss et al.
2005/0269715 A1 12/2005 Yoo
2005/0278474 A1 12/2005 Perersen et al.
2005/0281096 A1 12/2005 Bhakta et al.
2005/0281123 A1 12/2005 Bell et al.
2005/0283572 A1 12/2005 Ishihara
2005/0285174 A1 12/2005 Saito et al.
2005/0286334 A1 12/2005 Saito et al.
2005/0289292 A1 12/2005 Morrow et al.
2005/0289317 A1 12/2005 Liou et al.
2006/0002201 A1 1/2006 Janzen
2006/0010339 A1 1/2006 Klein
2006/0026484 A1 2/2006 Hollums
2006/0038597 A1 2/2006 Becker et al.
2006/0039204 A1 2/2006 Cornelius
2006/0039205 A1 2/2006 Cornelius
2006/0041711 A1 2/2006 Miura et al.
2006/0041730 A1 2/2006 Larson
2006/0044909 A1 3/2006 Kinsley et al.
2006/0044913 A1 3/2006 Klein et al.
2006/0049502 A1 3/2006 Goodwin et al.
2006/0050574 A1 3/2006 Streif et al.

(56) References Cited

U.S. PATENT DOCUMENTS

2006/0056244 A1 3/2006 Ware
2006/0062047 A1 3/2006 Bhakta et al.
2006/0067141 A1 3/2006 Perego et al.
2006/0085616 A1 4/2006 Zeighami et al.
2006/0087900 A1 4/2006 Bucksch et al.
2006/0090031 A1 4/2006 Kirshenbaum et al.
2006/0090054 A1 4/2006 Choi et al.
2006/0106951 A1 5/2006 Bains
2006/0112214 A1 5/2006 Yeh
2006/0112219 A1 5/2006 Chawla et al.
2006/0117152 A1 6/2006 Amidi et al.
2006/0117160 A1 6/2006 Jackson et al.
2006/0118933 A1 6/2006 Haba
2006/0120193 A1 6/2006 Casper
2006/0123265 A1 6/2006 Ruckerbauer et al.
2006/0126369 A1 6/2006 Raghuram
2006/0129712 A1 6/2006 Raghuram
2006/0129740 A1 6/2006 Ruckerbauer et al.
2006/0129755 A1 6/2006 Raghuram
2006/0133173 A1 6/2006 Jain et al.
2006/0136791 A1 6/2006 Nierle
2006/0149857 A1 7/2006 Holman
2006/0149982 A1 7/2006 Vogt
2006/0174082 A1 8/2006 Bellows et al.
2006/0176744 A1 8/2006 Stave
2006/0179262 A1 8/2006 Brittain et al.
2006/0179333 A1 8/2006 Brittain et al.
2006/0179334 A1 8/2006 Brittain et al.
2006/0180926 A1 8/2006 Mullen et al.
2006/0181953 A1 8/2006 Rotenberg et al.
2006/0195631 A1 8/2006 Rajamani
2006/0198178 A1 9/2006 Kinsley et al.
2006/0203590 A1 9/2006 Mori et al.
2006/0206738 A1 9/2006 Jeddeloh et al.
2006/0233012 A1 10/2006 Sekiguchi et al.
2006/0236165 A1 10/2006 Cepulis et al.
2006/0236201 A1 10/2006 Gower et al.
2006/0248261 A1 11/2006 Jacob et al.
2006/0248387 A1 11/2006 Nicholson et al.
2006/0262586 A1* 11/2006 Solomon et al. ................ 365/63
2006/0262587 A1 11/2006 Matsui et al.
2006/0277355 A1 12/2006 Ellsberry et al.
2006/0294295 A1 12/2006 Fukuzo
2007/0005998 A1 1/2007 Jain et al.
2007/0011421 A1 1/2007 Keller et al.
2007/0050530 A1 3/2007 Rajan
2007/0058471 A1 3/2007 Rajan et al.
2007/0070669 A1 3/2007 Tsern
2007/0088995 A1 4/2007 Tsern et al.
2007/0091696 A1 4/2007 Niggemeier et al.
2007/0106860 A1 5/2007 Foster, Sr. et al.
2007/0136537 A1 6/2007 Doblar et al.
2007/0152313 A1 7/2007 Periaman et al.
2007/0162700 A1 7/2007 Fortin et al.
2007/0188997 A1 8/2007 Hockanson et al.
2007/0192563 A1 8/2007 Rajan et al.
2007/0195613 A1 8/2007 Rajan et al.
2007/0204075 A1 8/2007 Rajan et al.
2007/0216445 A1 9/2007 Raghavan et al.
2007/0247194 A1 10/2007 Jain
2007/0279084 A1 12/2007 Oh et al.
2007/0285895 A1 12/2007 Gruendler et al.
2007/0288683 A1 12/2007 Panabaker et al.
2007/0288686 A1 12/2007 Arcedera et al.
2007/0288687 A1 12/2007 Panabaker
2007/0290333 A1 12/2007 Saini et al.
2008/0002447 A1 1/2008 Gulachenski et al.
2008/0010435 A1 1/2008 Smith et al.
2008/0025108 A1 1/2008 Rajan et al.
2008/0025122 A1 1/2008 Schakel et al.
2008/0025136 A1 1/2008 Rajan et al.
2008/0025137 A1 1/2008 Rajan et al.
2008/0027697 A1 1/2008 Rajan et al.
2008/0027702 A1 1/2008 Rajan et al.
2008/0027703 A1 1/2008 Rajan et al.
2008/0028135 A1 1/2008 Rajan et al.
2008/0028136 A1 1/2008 Schakel et al.
2008/0028137 A1 1/2008 Schakel et al.
2008/0031030 A1 2/2008 Rajan et al.
2008/0031072 A1 2/2008 Rajan et al.
2008/0034130 A1 2/2008 Perego et al.
2008/0037353 A1 2/2008 Rajan et al.
2008/0056014 A1 3/2008 Rajan et al.
2008/0062773 A1 3/2008 Rajan et al.
2008/0065820 A1 3/2008 Gillingham et al.
2008/0082763 A1 4/2008 Rajan et al.
2008/0086588 A1 4/2008 Danilak et al.
2008/0089034 A1 4/2008 Hoss et al.
2008/0098277 A1 4/2008 Hazelzet
2008/0103753 A1 5/2008 Rajan et al.
2008/0104314 A1 5/2008 Rajan et al.
2008/0109206 A1 5/2008 Rajan et al.
2008/0109595 A1 5/2008 Rajan et al.
2008/0109597 A1 5/2008 Schakel et al.
2008/0109598 A1 5/2008 Schakel et al.
2008/0115006 A1 5/2008 Smith et al.
2008/0120443 A1 5/2008 Rajan et al.
2008/0120458 A1 5/2008 Gillingham et al.
2008/0123459 A1 5/2008 Rajan et al.
2008/0126624 A1 5/2008 Prete et al.
2008/0126687 A1 5/2008 Rajan et al.
2008/0126688 A1 5/2008 Rajan et al.
2008/0126689 A1 5/2008 Rajan et al.
2008/0126690 A1 5/2008 Rajan et al.
2008/0126692 A1 5/2008 Rajan et al.
2008/0130364 A1 6/2008 Guterman et al.
2008/0133825 A1 6/2008 Rajan et al.
2008/0155136 A1 6/2008 Hishino
2008/0159027 A1 7/2008 Kim
2008/0170425 A1 7/2008 Rajan
2008/0195894 A1 8/2008 Schreck et al.
2008/0215832 A1 9/2008 Allen et al.
2008/0239857 A1 10/2008 Rajan et al.
2008/0239858 A1 10/2008 Rajan et al.
2008/0256282 A1 10/2008 Guo et al.
2008/0282084 A1 11/2008 Hatakeyama
2008/0282341 A1 11/2008 Hatakeyama
2009/0024789 A1 1/2009 Rajan et al.
2009/0024790 A1 1/2009 Rajan et al.
2009/0049266 A1 2/2009 Kuhne
2009/0063865 A1 3/2009 Berenbaum et al.
2009/0063896 A1 3/2009 Lastras-Montano et al.
2009/0070520 A1 3/2009 Mizushima
2009/0089480 A1 4/2009 Wah et al.
2009/0109613 A1 4/2009 Legen et al.
2009/0180926 A1 7/2009 Petruno et al.
2009/0216939 A1 8/2009 Smith et al.
2009/0285031 A1 11/2009 Rajan et al.
2009/0290442 A1 11/2009 Rajan
2010/0005218 A1 1/2010 Gower et al.
2010/0020585 A1 1/2010 Rajan
2010/0257304 A1 10/2010 Rajan et al.
2010/0271888 A1 10/2010 Rajan et al.
2010/0281280 A1 11/2010 Rajan et al.

FOREIGN PATENT DOCUMENTS

DE 102005036528 2/2007
EP 0132129 1/1985
EP 0644547 3/1995
JP 62121978 6/1987
JP 01-171047 7/1989
JP 03-29357 2/1991
JP 03-276487 12/1991
JP 03-286234 12/1991
JP 05-298192 11/1993
JP 07-141870 6/1995
JP 08-77097 3/1996
JP 2008-179994 7/1996
JP 09-231127 9/1997
JP 10-233091 9/1998
JP 10-260895 9/1998
JP 11-073773 3/1999
JP 11-149775 6/1999

(56) References Cited

FOREIGN PATENT DOCUMENTS

| | | |
|---|---|---|
| JP | 11-224221 | 8/1999 |
| JP | 2002-025255 | 1/2002 |
| JP | 3304893 | 5/2002 |
| JP | 2002-288037 | 10/2002 |
| JP | 04-327474 | 11/2004 |
| JP | 2005-062914 | 3/2005 |
| JP | 2005-108224 | 4/2005 |
| JP | 2006-236388 | 9/2006 |
| KR | 1999-0076659 | 10/1999 |
| KR | 2004-0062717 | 7/2004 |
| KR | 2005-120344 | 12/2005 |
| WO | 95/05676 | 2/1995 |
| WO | 97/25674 | 7/1997 |
| WO | 99/00734 | 1/1999 |
| WO | 00/45270 | 8/2000 |
| WO | 01/37090 | 5/2001 |
| WO | 01/90900 | 11/2001 |
| WO | 01/97160 | 12/2001 |
| WO | 2004/044754 | 5/2004 |
| WO | 2004/051645 | 6/2004 |
| WO | 2006/072040 | 7/2006 |
| WO | 2007/002324 | 1/2007 |
| WO | 2007/028109 | 3/2007 |
| WO | 2007/038225 | 4/2007 |
| WO | 2007/095080 | 8/2007 |
| WO | 2008/063251 | 5/2008 |

OTHER PUBLICATIONS

"Using Two Chip Selects to Enable Quad Rank," ip.com, Feb. 26, 2008, retrieved from the Internet: intp://www.priorartdatabase.com/IPCOM/000132468/, 2 pages.
Wu et al., "eNVy: A Non-Volatile, Main Memory Storage System", ASPLOS-VI Proceedings, Oct. 4-7, 1994. SIGARCH Computer Architecture News 22 (Special Issue Oct. 1994), pp. 86-97.
International Search Report and Written Opinion in International Application No. PCT/US07/03460, mailed Feb. 14, 2008, 27 pages.
International Preliminary Report on Patentability in International Application No. PCT/US2007/016385, mailed Feb. 3, 2009, 4 pages.
Kellerbauer, R. "Die Schnelle Million," with translation, "The Quick Million: Memory Expansion for 1040 ST and Mega ST 1," Dec. 1991, 4 pages.
Skerlj et al., "Buffer Device for memory modules (DIMM)," Qimonda, 1 page, 2006.
International Preliminary Report on Patentability in International Application No. PCT/US2006/024360, mailed Jan. 10, 2008, 5 pages.
International Search Report and Written Opinion in International Application No. PCT/US06/34390, mailed Nov. 21, 2007, 10 pages.
Office Action issued in U.S. Appl. No. 11/461,430 on Sep. 8, 2008, 9 pages.
Notice of Allowance issued in U.S. Appl. No. 11/474,075 on Nov. 26, 2008, 36 pages.
Restriction Requirement issued in U.S. Appl. No. 11/474,076 on Nov. 3, 2008, 6 pages.
Office Action issued in U.S. Appl. No. 11/524,811 on Sep. 17, 2008, 26 pages.
Office Action issued in U.S. Appl. No. 11/461,430 on Feb. 19, 2009, 10 pages.
Office Action issued in U.S. Appl. No. 11/461,437 on Jan. 26, 2009, 8 pages.
Office Action issued in U.S. Appl. No. 11/461,435 on Jan. 28, 2009, 16 pages.
Office Action issued in U.S. Appl. No. 11/461,427 on Sep. 5, 2008, 12 pages.
Office Action issued in U.S. Appl. No. 11/461,441 on Apr. 2, 2009, 14 pages.
Office Action issued in U.S. Appl. No. 11/611,374 on Mar. 23, 2009, 14 pages.
Restriction Requirement issued in U.S. Appl. No. 11/702,981 on Mar. 11, 2009, 6 pages.
Office Action issued in U.S. Appl. No. 11/762,010 on Mar. 20, 2009, 9 pages.
Office Action issued in DE Application No. 112006001810.8-55 on Feb. 18, 2009, 14 pages (with English translation).
Office Action issued in DE Application No. 112006002300.4-55 on May 11, 2009, 5 pages (with English translation).
Office Action issued in U.S. Appl. No. 12/111,828 on Apr. 17, 2009, 9 pages.
Office Action issued in U.S. Appl. No. 12/111,819 on Apr. 27, 2009, 10 pages.
Carstens, "Buffer Device for memory modules (DIMM)," ip.com, Feb. 10, 2007, 1 page.
Office Action issued in U.S. Appl. No. 11/939,432 on Feb. 6, 2009, 54 pages.
Supplemental European Search Report and Search Opinion Issued Sep. 21, 2009 in corresponding European Application No. 07870726.2, 8 pages.
Form AO-120 as filed in U.S. Pat. No. 7,472,220 on Jun. 17, 2009, 1 page.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
Office Action issued in U.S. Appl. No. 11/538,041 on Jun. 10, 2009, 15 pages.
Office Action issued in U.S. Appl. No. 11/553,372 on Jun. 25, 2009, 9 pages.
Office Action issued in U.S. Appl. No. 11/553,399 on Jul. 7, 2009, 10 pages.
Office Action issued in U.S. Appl. No. 11/461,420 on Jul. 23, 2009, 12 pages.
Office Action issued in U.S. Appl. No. 11/461,435 on Aug. 5, 2009, 14 pages.
Office Action issued in U.S. Appl. No. 11/762,013 on Jun. 5, 2009, 12 pages.
Office Action issued in U.S. Appl. No. 11/858,518 on Aug. 14, 2009, 14 pages.
Office Action issued in U.S. Appl. No. 11/702,981 on Aug. 19, 2009, 9 pages.
Office Action issued in U.S. Appl. No. 11/553,390 on Sep. 9, 2009, 10 pages.
Office Action issued in U.S. Appl. No. 11/929,500 on Oct. 13, 2009, 16 pages.
Notice of Allowance issued in U.S. Appl. No. 11/553,399 on Oct. 13, 2009, 8 pages.
Office Action issued in U.S. Appl. No. 1/941,589 on Oct. 1, 2009, 5 pages.
Notice of Allowance issued in U.S. Appl. No. 11/553,372 on Sep. 30, 2009, 11 pages.
Office Action issued in U.S. Appl. No. 11/702,960 on Sep. 25, 2009, 17 pages.
Office Action issued in U.S. Appl. No. 11/515,167 on Sep. 25, 2009, 11 pages.
Notice of Allowance issued in U.S. Appl. No. 11/929,432 on Sep. 24, 2009, 7 pages.
Office Action issued in U.S. Appl. No. 11/515,223 on Sep. 22, 2009, 9 pages.
Notice of Allowance issued in U.S. Appl. No. 11/461,430 on Sep. 10, 2009, 4 pages.
Notice of Allowance issued in U.S. Appl. No. 11/611,374 on Sep. 15, 2009, 9 pages.
Office Action issued in U.S. Appl. No. 11/763,365 on Oct. 28, 2009, 33 pages.
Office Action issued in U.S. Appl. No. 11/461,437 on Nov. 10, 2009, 8 pages.
Notice of Allowance issued in U.S. Appl. No. 11/611,374 on Nov. 30, 2009, 6 pages.
Office Action issued in U.S. Appl. No. 11/672,921 on Dec. 8, 2009, 15 pages.
Office Action issued in U.S. Appl. No. 11/672,924 on Dec. 14, 2009, 11 pages.

(56) References Cited

OTHER PUBLICATIONS

Office Action issued in U.S. Appl. No. 11/762,010 on Dec. 4, 2009, 10 pages.
Office Action issued in U.S. Appl. No. 11/929,225 on Dec. 14, 2009, 14 pages.
Office Action issued in U.S. Appl. No. 11/929,261 on Dec. 14, 2009, 14 pages.
Notice of Allowance issued in U.S. Appl. No. 12/111,819 on Nov. 20, 2009, 4 pages.
Notice of Allowance issued in U.S. Appl. No. 12/111,828 on Dec. 15, 2009, 4 pages.
Notice of Allowance issued in U.S. Appl. No. 11/929,432 on Dec. 1, 2009, 7 pages.
Notice of Allowance issued in U.S. Appl. No. 12/111,819 on Mar. 10, 2010, 4 pages.
Notice of Allowance issued in U.S. Appl. No. 11/553,372 on Mar. 12, 2010, 10 pages.
Notice of Allowance issued in U.S. Appl. No. 11/553,399 on Mar. 22, 2010, 9 pages.
Notice of Allowance issued in U.S. Appl. No. 11/611,374 on Apr. 5, 2010, 6 pages.
Office Action issued in U.S. Appl. No. 11/858,518 on Apr. 21, 2010, 12 pages.
Office Action issued in U.S. Appl. No. 11/929,571 on Mar. 3, 2010, 40 pages.
Office Action issued in U.S. Appl. No. 11/929,655 on Mar. 3, 2010, 21 pages.
Office Action issued in U.S. Appl. No. 11/929,631 on Mar. 3, 2010, 21 pages.
Office Action issued in U.S. Appl. No. 12/507,682 on Mar. 8, 2010, 32 pages.
Office Action issued in U.S. Appl. No. 11/929,636 on Mar. 9, 2010, 40 pages.
Office Action issued in U.S. Appl. No. 11/828,182 on Mar. 29, 2010, 26 pages.
Office Action issued in U.S. Appl. No. 11/939,432 on Apr. 12, 2010, 4 pages.
Office Action issued in U.S. Appl. No. 11/939,432 on Dec. 1, 2009.
Office Action issued in U.S. Appl. No. 11/939,432 on Jan. 14, 2010, 11 pages.
Office Action issued in GB Application No. GB0800734.6 on Mar. 1, 2010, 2 pages.
Office Action issued in U.S. Appl. No. 11/461,420 on Apr. 28, 2010, 21 pages.
Office Action issued in U.S. Appl. No. 11/828,181 on Mar. 2, 2010, 24 pages.
Office Action issued in U.S. Appl. No. 11/588,739 on Dec. 29, 2009, 7 pages.
Office Action issued in U.S. Appl. No. 11/929,500 on Jun. 24, 2010, 12 pages.
Office Action issued in U.S. Appl. No. 11/461,435 on May 13, 2010, 14 pages.
Office Action issued in U.S. Appl. No. 11/515,167 on Jun. 3, 2010, 12 pages.
Office Action issued in U.S. Appl. No. 11/702,960 on Jun. 21, 2010, 17 pages.
Office Action issued in U.S. Appl. No. 11/553,390 on Jun. 24, 2010, 13 pages.
Office Action issued in U.S. Appl. No. 12/574,628 on Jun. 10, 2010, 9 pages.
Office Action issued in GB Application No. GB0803913.3 on Mar. 1, 2010, 2 pages.
Notice of Allowance issued in U.S. Appl. No. 11/763,365 on Jun. 29, 2010, 7 pages.
Notice of Allowance issued in U.S. Appl. No. 11/762,010 on Jul. 2, 2010, 6 pages.
Notice of Allowance issued in U.S. Appl. No. 11/611,374 on Jul. 19, 2010, 6 pages.
Office Action issued in U.S. Appl. No. 11/672,921 on Jul. 23, 2010, 18 pages.
Notice of Allowance issued in U.S. Appl. No. 11/515,223 on Jul. 30, 2010, 8 pages.
Notice of Allowance issued in U.S. Appl. No. 11/553,372 on Aug. 4, 2010, 9 pages.
Notice of Allowance issued in U.S. Appl. No. 11/762,013 on Aug. 17, 2010, 4 pages.
Office Action issued in U.S. Appl. No. 11/929,286 on Aug. 20, 2010, 10 pages.
Office Action issued in U.S. Appl. No. 11/929,432 on Aug. 20, 2010, 10 pages.
Office Action issued in U.S. Appl. No. 11/929,450 on Aug. 20, 2010, 9 pages.
Office Action issued in U.S. Appl. No. 12/838,896 on Sep. 3, 2010, 5 pages.
Office Action issued in U.S. Appl. No. 11/672,924 on Sep. 7, 2010, 16 pages.
Office Action issued in U.S. Appl. No. 11/929,261 on Sep. 7, 2010, 20 pages.
Office Action issued in U.S. Appl. No. 11/929,403 on Aug. 31, 2010, 14 pages.
Office Action issued in U.S. Appl. No. 11/929,417 on Aug. 31, 2010, 14 pages.
Office Action issued in U.S. Appl. No. 11/929,225 on Aug. 27, 2010, 17 pages.
Office Action issued in U.S. Appl. No. 11/858,518 on Sep. 8, 2010, 13 pages.
Office Action issued in U.S. Appl. No. 11/855,805 on Sep. 21, 2010, 17 pages.
Office Action issued in U.S. Appl. No. 11/939,440 on Sep. 17, 2010, 7 pages.
Notice of Allowance issued in U.S. Appl. No. 11/929,320 on Sep. 29, 2010, 5 pages.
Office Action issued in U.S. Appl. No. 12/057,306 on Oct. 8, 2010, 8 pages.
Notice of Allowance issued in U.S. Appl. No. 11/762,010 on Oct. 22, 2010, 4 pages.
Notice of Allowance issued in U.S. Appl. No. 11/763,365 on Oct. 20, 2010, 4 pages.
Notice of Allowance issued in U.S. Appl. No. 11/929,483 on Oct. 7, 2010, 4 pages.
Notice of Allowance issued in U.S. Appl. No. 11/941,589 on Oct. 25, 2010, 8 pages.
Notice of Allowance issued in U.S. Appl. No. 11/611,374 on Oct. 29, 2010, 6 pages.
Office Action issued in U.S. Appl. No. 12/769,428 on Nov. 8, 2010, 9 pages.
Office Action issued in U.S. Appl. No. 11/929,631 on Nov. 18, 2010, 21 pages.
Office Action issued in U.S. Appl. No. 11/929,655 on Nov. 22, 2010, 19 pages.
Office Action issued in U.S. Appl. No. 12/203,100 on Dec. 1, 2010, 7 pages.
Notice of Allowance issued in U.S. Appl. No. 11/553,399 on Dec. 3, 2010, 9 pages.
Notice of Allowance issued in U.S. Appl. No. 11/762,013 on Dec. 7, 2010, 4 pages.
Office Action issued in U.S. Appl. No. 11/588,739 on Dec. 15, 2010, 14 pages.
Office Action issued in U.S. Appl. No. 11/828,182 on Dec. 22, 2010, 26 pages.
Office Action issued in U.S. Appl. No. 11/553,372 on Jan. 5, 2011, 12 pages.
Office Action issued in U.S. Appl. No. 11/461,437 on Jan. 4, 2011, 18 pages.
Office Action issued in U.S. Appl. No. 11/855,826 on Jan. 13, 2011, 8 pages.
Notice of Allowance issued in U.S. Appl. No. 11/515,223 on Feb. 4, 2011, 9 pages.
Notice of Allowance issued in U.S. Appl. No. 12/144,396 on Feb. 1, 2011, 8 pages.
Office Action issued in U.S. Appl. No. 12/816,756 on Feb. 7, 2011, 11 pages.

(56) References Cited

OTHER PUBLICATIONS

Notice of Allowance issued in U.S. Appl. No. 11/939,432 on Feb. 18, 2011, 8 pages.
Notice of Allowance issued in U.S. Appl. No. 11/762,010 on Feb. 18, 2011, 5 pages.
Notice of Allowance issued in U.S. Appl. No. 11/762,013 on Feb. 22, 2011, 11 pages.
Notice of Allowance issued in U.S. Appl. No. 11/929,500 on Feb. 24, 2011, 15 pages.
Notice of Allowance from U.S. Appl. No. 11/763,365 Dated Mar. 1, 2011, 19 pages.
Final Office Action from U.S. Appl. No. 12/574,628 Dated Mar. 3, 2011, 17 pages.
Final Office Action from U.S. Appl. No. 11/929,571 Dated Mar. 3, 2011, 27 pages.
Notice of Allowance from U.S. Appl. No. 11/611,374 Dated Mar. 4, 2011, 11 pages.
Notice of Allowance from U.S. Appl. No. 11/929,483 Dated Mar. 4, 2011, 13 pages.
Notice of Allowance from U.S. Appl. No. 11/553,399 Dated Mar. 18, 2011, 14 pages.
Final Office Action from U.S. Appl. No. 12/507,682 Dated Mar. 29, 2011, 28 pages.
Non-Final Office Action from U.S. Appl. No. 11/929,403 Dated Mar. 31, 2011, 20 pages.
Office Action from U.S. Appl. No. 11/929,417 Dated Mar. 31, 2011, 20 pages.
Notice of Allowance from U.S. Appl. No. 12/838,896 Dated Apr. 19, 2011, 19 pages.
Notice of Allowance from U.S. Appl. No. 11/702,981 Dated Apr. 25, 2011, 14 pages.
Notice of Allowance from U.S. Appl. No. 11/929,320 Dated May 5, 2011, 20 pages.
Final Office Action from U.S. Appl. No. 11/939,440 Dated May 19, 2011, 28 pages.
Final Office Action from U.S. Appl. No. 11/855,805, Dated May 26, 2011, 21 pages.
Non-Final Office Action from U.S. Appl. No. 11/672,921 Dated May 27, 2011, 24 pages.
Notice of Allowance issued in U.S. Appl. No. 11/762,010 on Jun. 8, 2011, 8 pages.
Non-Final Office Action from U.S. Appl. No. 11/672,924 Dated Jun. 8, 2011, 24 pages.
Non-Final Office Action from U.S. Appl. No. 11/929,225 Dated Jun. 8, 2011, 39 pages.
Notice of Allowance issued in U.S. Appl. No. 11/929,500 on Jun. 13, 2011, 10 pages.
Notice of Allowance from U.S. Appl. No. 11/941,589 Dated Jun. 15, 2011, 7 pages.
Final Office Action from U.S. Appl. No. 12/057,306 Dated Jun. 15, 2011, 38 pages.
Final Office Action from U.S. Appl. No. 12/769,428 Dated Jun. 16, 2011, 50 pages.
Notice of Allowance from U.S. Appl. No. 12/203,100 Dated Jun. 17, 2011, 36 pages.
Notice of Allowance issued in U.S. Appl. No. 11/762,013 on Jun. 20, 2011, 7 pages.
Non-Final Office Action from U.S. Appl. No. 12/797,557 Dated Jun. 21, 2011, 46 pages.
Notice of Allowance from U.S. Appl. No. 11/515,223 dated Jun. 21, 2011, 14 pages.
Notice of Allowance from U.S. Appl. No. 11/929,483 Dated Jun. 23, 2011, 8 pages.
Non-Final Office Action from U.S. Appl. No. 11/702,960 Dated Jun. 23, 2011, 30 pages.
Non-Final Office Action from U.S. Appl. No. 11/929,655 Dated Jun. 24, 2011, 53 pages.
Notice of Allowance from U.S. Appl. No. 11/763,365 Dated Jun. 24, 2011, 8 pages.
Notice of Allowance from U.S. Appl. No. 11/611,374 Dated Jun. 24, 2011, 10 pages.
Non-Final Office Action from U.S. Appl. No. 11/828,182 Dated Jun. 27, 2011, 54 pages.
Non-Final Office Action from U.S. Appl. No. 11/828,181 Dated Jun. 27, 2011, 55 pages.
Non-Final Office Action from U.S. Appl. No. 12/378,328 Dated Jul. 15, 2011, 60 pages.
Final Office Action from U.S. Appl. No. 11/461,420 Dated Jul. 20, 2011, 37 pages.
Notice of Allowance from U.S. Appl. No. 11/461,437 Dated Jul. 25, 2011, 40 pages.
Notice of Allowance from U.S. Appl. No. 11/702,981 Dated Aug. 5, 2011, 9 pages.
Notice of Allowability from U.S. Appl. No. 11/855,826 Dated Aug. 15, 2011, 20 pages.
Non-Final Office Action from U.S. Appl. No. 12/574,628 Dated Sep. 20, 2011, 8 pages.
Non-Final Office Action from U.S. Appl. No. 11/858,518 Dated Sep. 27, 2011, 19 pages.
Notice of Allowance from U.S. Appl. No. 11/929,571 Dated Sep. 27, 2011, 9 pages.
Notice of Allowance from U.S. Appl. No. 11/929,500 Dated Sep. 27, 2011, 11 pages.
Notice of Allowance from U.S. Appl. No. 11/941,589 Dated Sep. 30, 2011, 10 pages.
Notice of Allowance from U.S. Appl. No. 12/816,756 Dated Oct. 3, 2011, 24 pages.
Non-Final Office Action from U.S. Appl. No. 12/508,496 Dated Oct. 11, 2011, 51 pages.
Non-Final Office Action from U.S. Appl. No. 11/588,739 Dated Oct. 13, 2011, 36 pages.
Notice of Allowance from U.S. Appl. No. 11/939,432 Dated Oct. 24, 2011, 12 pages.
Non-Final Office Action from U.S. Appl. No. 11/929,631 Dated Nov. 1, 2011, 47 pages.
Non-Final Office Action from U.S. Appl. No. 11/553,372 Dated Nov. 14, 2011, 24 pages.
Notice of Allowance from U.S. Appl. No. 11/515,223 Dated Nov. 29, 2011, 38 pages.
Notice of Allowance from U.S. Appl. No. 12/769,428 Dated Nov. 28, 2011, 5 pages.
Final Office Action from U.S. Appl. No. 11/939,440 Dated Dec. 12, 2011, 7 pages.
Notice of Allowance from U.S. Appl. No. 12/797,557 Dated Dec. 28, 2011, 10 pages.
Office Action, including English translation, from co-pending Japanese application No. 2008-529353, Dated Jan. 10, 2012, 8 pages.
Notice of Allowance from U.S. Appl. No. 12/838,896 Dated Jan. 18, 2012, 8 pages.
Final Office Action from U.S. Appl. No. 11/929,655 Dated Jan. 19, 2012, 33 pages.
Final Office Action from U.S. Appl. No. 12/378,328 Dated Feb. 3, 2012, 17 pages.
Final Office Action from U.S. Appl. No. 11/672,921 Dated Feb. 16, 2012, 27 pages.
Final Office Action from U.S. Appl. No. 11/672,924 Dated Feb. 16, 2012, 22 pages.
Final Office Action from U.S. Appl. No. 11/929,225 Dated Feb. 16, 2012, 10 pages.
Partial European Search Report for Application No. EP12150807 Dated Feb. 23, 2012, 6 pages.
Final Office Action from U.S. Appl. No. 11/828,181 Dated Feb. 23, 2012, 38 pages.
Non-Final Office Action from U.S. Appl. No. 11/461,420 Dated Feb. 29, 2012, 37 pages.
Notice of Allowance from U.S. Appl. No. 12/574,628 Dated Mar. 6, 2012, 11 pages.
Non-Final Office Action from U.S. Appl. No. 13/276,212 Dated Mar. 15, 2012, 11 pages.
Non-Final Office Action from U.S. Appl. No. 13/343,612 Dated Mar. 29, 2012, 22 pages.

(56) References Cited

OTHER PUBLICATIONS

Notice of Allowance from U.S. Appl. No. 11/939,440 Dated Mar. 30, 2012, 5 pages.
European Search Report from co-pending European application No. 11194876.6-2212/2450798, Dated Apr. 12, 2012, 5 pages.
European Search Report from co-pending European application No. 11194862.6-2212/2450800, Dated Apr. 12, 2012, 6 pages.
Notice of Allowance from U.S. Appl. No. 11/929,636, Dated Apr. 17, 2012, 15 pages.
Final Office Action from U.S. Appl. No. 11/858,518, Dated Apr. 17, 2012, 28 pages.
European Search Report from co-pending European application No. 11194883.2-2212, Dated Apr. 27, 2012, 6 pages.
Non-Final Office Action from U.S. Appl. No. 11/553,372, Dated May 3, 2012, 10 pages.
Notice of Allowance from U.S. Appl. No. 11/929,631, Dated May 3, 2012, 8 pages.
Non-Final Office Action from U.S. Appl. No. 13/165,713, Dated May 22, 2012, 10 pages.
Non-Final Office Action from U.S. Appl. No. 12/144,396, Dated May 29, 2012, 40 pages.
Non-Final Office Action from U.S. Appl. No. 13/165,713, Dated May 31, 2012, 6 pages.
Non-Final Office Action from U.S. Appl. No. 13/280,251, Dated Jun. 12, 2012, 55 pages.
Final Office Action from U.S. Appl. No. 11/855,805, Dated Jun. 14, 2012, 17 pages.
Office Action, including English translation, from co-pending Japanese application No. 2008-529353, Dated Jul. 31, 2012, 4 pages.
Final Office Action from U.S. Appl. No. 13/315,933, Dated Aug. 24, 2012, 40 pages.
Final Office Action from U.S. Appl. No. 13/276,212, Dated Aug. 30, 2012, 79 pages.
Non-Final Office Action from U.S. Appl. No. 13/367,182, Dated Aug. 31, 2012, 101 pages.
Notice of Allowance from U.S. Appl. No. 11/461,420, Dated Sep. 5, 2012, 18 pages.
Final Office Action from U.S. Appl. No. 13/280,251, Dated Sep. 12, 2012, 11 pages.
Non-Final Office Action from U.S. Appl. No. 11/929,225, Dated Sep. 17, 2012, 17 pages.
Notice of Allowance from U.S. Appl. No. 12/508,496, Dated Sep. 17, 2012, 10 pages.
Non-Final Office Action from U.S. Appl. No. 11/672,921, Dated Oct. 1, 2012, 20 pages.
Notice of Allowance from U.S. Appl. No. 12/057,306, Dated Oct. 10, 2012, 15 pages.
Notice of Allowance from U.S. Appl. No. 12/144,396, Dated Oct. 11, 2012, 9 pages.
Non-Final Office Action from U.S. Appl. No. 13/411,489, Dated Oct. 17, 2012, 82 pages.
Notice of Allowance from U.S. Appl. No. 13/280,251, Dated Oct. 22, 2012, 5 pages.
Non-Final Office Action from U.S. Appl. No. 13/471,283, Dated Dec. 7, 2012, 32 pages.
English translation of Office Action from co-pending Korean patent application No. KR1020087005172, dated Dec. 20, 2012, 6 pages.
Office Action, including English translation, from co-pending Japanese application No. 2008-529353, Dated Dec. 27, 2012, 5 pages.
Office Action from co-pending European patent application No. EP12150798, Dated Jan. 3, 2013, 16 pages.
Final Office Action from U.S. Appl. No. 11/672,924, Dated Feb. 1, 2013, 22 pages.
Non-Final Office Action from U.S. Appl. No. 13/620,650, Dated Feb. 1, 2013, 11 pages.
Notice of Allowance from U.S. Appl. No. 13/341,844, Dated Feb. 5, 2013, 10 pages.
Notice of Allowance from U.S. Appl. No. 13/473,827, Dated Feb. 15, 2013, 56 pages.
Notice of Allowance from U.S. Appl. No. 12/378,328, Dated Feb. 27, 2013, 18 pages.
Non-Final Office Action from U.S. Appl. No. 13/536,093, Dated Mar. 1, 2013, 83 pages.
Office Action from co-pending Japanese patent application No. 2012-132119, Dated Feb. 26, 2013, 5 pages.
Notice of Allowance from U.S. Appl. No. 11/461,435, Dated Mar. 6, 2013, 36 pages.
Notice of Allowance from U.S. Appl. No. 11/515,223, Dated Mar. 18, 2013, 46 pages.
Notice of Allowance from U.S. Appl. No. 13/471,283, Dated Mar. 21, 2013, 8 pages.
Extended European Search Report for co-pending European patent application No. EP12150807.1, dated Feb. 1, 2013, mailed Mar. 22, 2013, 12 pages.
Notice of Allowance from U.S. Appl. No. 13/181,716, Dated Apr. 3, 2013, 15 pages.
English translation of Office Action from co-pending Korean patent application No. KR1020087019582, Dated Mar. 13, 2013, 9 pages.
Notice of Allowance from U.S. Appl. No. 13/618,246, Dated Apr. 23, 2013, 84 pages.
Notice of Allowance from U.S. Appl. No. 13/182,234, Dated May 1, 2013, 78 pages.
Final Office Action from U.S. Appl. No. 13/315,933, Dated May 3, 2013, 18 pages.
English Translation of Office Action from co-pending Korean patent application No. 10-2013-7004006, Dated Apr. 12, 2013, 3 pages.
EPO Communication for Co-pending European patent application No. EP11194862.6, dated May 3, 2013, 4 pages.
Non-Final Office Action from U.S. Appl. No. 13/620,793, Dated May 6, 2013, 83 pages.
Non-Final Office Action from U.S. Appl. No. 13/620,565, Dated May 24, 2013, 9 pages.
Final Office Action from U.S. Appl. No. 11/929,225, Dated May 24, 2013, 19 pages.
Final Office Action from U.S. Appl. No. 11/672,921, Dated May 24, 2013, 22 pages.
Notice of Allowance from U.S. Appl. No. 11/929,631, Dated May 28, 2013, 11 pages.
Notice of Allowance from U.S. Appl. No. 13/620,424, Dated May 29, 2013, 9 pages.
Notice of Allowance from U.S. Appl. No. 13/341,844, Dated May 30, 2013, 9 pages.
Non-Final Office Action from U.S. Appl. No. 13/455,691, Dated Jun. 4, 2013, 61 pages.
Non-Final Office Action from U.S. Appl. No. 13/620,199, Dated Jun. 17, 2013, 85 pages.
Non-Final Office Action from U.S. Appl. No. 13/620,207, Dated Jun. 20, 2013, 88 pages.
Non-Final Office Action from U.S. Appl. No. 11/828,182, Dated Jun. 20, 2013, 34 pages.
Final Office Action from U.S. Appl. No. 11/828,181, Dated Jun. 20, 2013, 41 pages.
Non-Final Office Action from U.S. Appl. No. 11/929,655, Dated Jun. 21, 2013, 42 pages.
Notice of Allowance from U.S. Appl. No. 13/597,895, Dated Jun. 25, 2013, 87 pages.
Non-Final Office Action from U.S. Appl. No. 13/620,645, Dated Jun. 26, 2013, 109 pages.
Notice of Allowance from U.S. Appl. No. 13/471,283, Dated Jun. 28, 2013, 8 pages.
Notice of Allowance from U.S. Appl. No. 13/181,747, Dated Jul. 9, 2013, 9 pages.
Notice of Allowance from U.S. Appl. No. 11/515,223, Dated Jul. 18, 2013, 13 pages.
Notice of Allowance from U.S. Appl. No. 13/182,234, Dated Jul. 22, 2013, 9 pages.
Notice of Allowance from U.S. Appl. No. 13/181,716, Dated Jul. 22, 2013, 8 pages.
Non-Final Office Action from U.S. Appl. No. 13/620,233, Dated Aug. 2, 2013, 8 pages.
Final Office Action from U.S. Appl. No. 13/367,182, Dated Aug. 8, 2013, 19 pages.

(56) References Cited

OTHER PUBLICATIONS

Notice of Allowance from U.S. Appl. No. 13/615,008, Dated Aug. 15, 2013, 84 pages.
Notice of Allowance from U.S. Appl. No. 13/620,425, Dated Aug. 20, 2013, 9 pages.
Non-Final Office Action from U.S. Appl. No. 13/620,601, Dated Aug. 23, 2013, 83 pages.
Non-Final Office Action from U.S. Appl. No. 12/507,683, Dated Aug. 27, 2013, 18 pages.
Non-Final Office Action from U.S. Appl. No. 13/315,933, Dated Aug. 27, 2013, 9 pages.
Final Office Action from U.S. Appl. No. 13/620,650, Dated Aug. 30, 2013, 27 pages.
Notice of Allowance from U.S. Appl. No. 13/620,424, Dated Sep. 11, 2013, 9 pages.
Non-Final Office Action from U.S. Appl. No. 13/620,291, Dated Sep. 12, 2013, 6 pages.
Notice of Allowance from U.S. Appl. No. 13/341,844, Dated Sep. 17, 2013, 8 pages.
Notice of Allowance from U.S. Appl. No. 13/620,412, dated Sep. 25, 2013, 9 pages.
Non-Final Office Action from U.S. Appl. No. 13/343,852, dated Sep. 27, 2013, 13 pages.
English Translation of Office Action from co-pending Korean patent application No. 10-2008-7019582, dated Sep. 16, 2013, 4 pages.
Notice of Allowance from U.S. Appl. No. 13/620,565, dated Sep. 27, 2013, 9 pages.
Non-Final Office Action from U.S. Appl. No. 13/279,068, dated Sep. 30, 2013, 8 pages.
Notice of Allowance from U.S. Appl. No. 13/620,207, dated Oct. 9, 2013, 7 pages.
Non-Final Office Action from U.S. Appl. No. 13/898,002, dated Oct. 10, 2013, 8 pages.
Notice of Allowance from U.S. Appl. No. 13/471,283, dated Oct. 15, 2013, 9 pages.
Notice of Allowance from U.S. Appl. No. 11/515,223, dated Oct. 24, 2013, 15 pages.
Notice of Allowance from U.S. Appl. No. 13/181,747, dated Oct. 28, 2013, 9 pages.
Notice of Allowance from U.S. Appl. No. 13/597,895, dated Oct. 29, 2013, 12 pages.
Notice of Allowance from U.S. Appl. No. 13/620,199, dated Nov. 13, 2013, 12 pages.
Final Office Action from U.S. Appl. No. 13/620,793, dated Nov. 13, 2013, 17 pages.
Notice of Allowance from U.S. Appl. No. 13/618,246, dated Nov. 14, 2013, 9 pages.
Notice of Allowance from U.S. Appl. No. 13/473,827, dated Nov. 20, 2013, 9 pages.
Notice of Allowance from U.S. Appl. No. 13/615,008, dated Dec. 3, 2013, 9 pages.
Notice of Allowance from U.S. Appl. No. 13/620,425, dated Dec. 11, 2013, 7 pages.
English Translation of Office Action from co-pending Japanese patent application No. JP2012-197675, Dec. 3, 2013, 3 pages.
English Translation of Office Action from co-pending Japanese patent application No. JP2012-197678, Dec. 3, 2013, 4 pages.
Notice of Allowance from U.S. Appl. No. 13/455,691, dated Dec. 31, 2013, 19 pages.
Non-Final Office Action from U.S. Appl. No. 11/553,390, dated Dec. 31, 2013, 43 pages.
English Translation of Office Action from co-pending Korean patent application No. 10-2013-7004006, dated Dec. 26, 2013, 5 pages.
Search Report from co-pending European Patent Application No. 13191794, dated Dec. 12, 2013, 6 pages.
English Translation of Office Action from co-pending Japanese patent application No. 2012-132119, dated Jan. 7, 2014, 4 pages.
Notice of Allowance from U.S. Appl. No. 13/620,425, dated Jan. 13, 2014, 3 pages.
Office Action from co-pending Korean patent application No. 10-2013-7029741, dated Dec. 20, 2013, 4 pages.
Notice of Allowance from U.S. Appl. No. 13/279,068, dated Jan. 21, 2014, 10 pages.
Notice of Allowance from U.S. Appl. No. 13/620,412, dated Jan. 21, 2014, 11 pages.
Non-Final Office Action from U.S. Appl. No. 13/367,182, dated Jan. 29, 2014, 20 pages.
Notice of Allowance from U.S. Appl. No. 13/898,002, dated Feb. 3, 2014, 59 pages.
Search Report from co-pending European Patent Application No. 13191796, dated Feb. 10, 2014, 7 pages.
"JEDEC Standard, DDR2 SDRAM Specification", Jan. 31, 2005, pp. 1-113, XP055099338, Retrieved from the Internet: URL:http://cs.ecs.baylor.edu/maurer/CS15338/JESD79-2B.pdf [retrieved on Jan. 30, 2014].
Notice of Allowance from U.S. Appl. No. 13/620,424, dated Feb. 11, 2014, 11 pages.
Notice of Allowance from U.S. Appl. No. 13/620,565, dated Feb. 24, 2014, 10 pages.
Notice of Allowance from U.S. Appl. No. 13/315,933, dated Feb. 26, 2014, 15 pages.
Final Office Action from U.S. Appl. No. 13/620,601, dated Mar. 3, 2014, 14 pages.
Notice of Allowance from U.S. Appl. No. 13/620,207, dated Mar. 6, 2014, 8 pages.
Notice of Allowance from U.S. Appl. No. 13/455,691, dated Mar. 10, 2014, 3 pages.
Notice of Allowance from U.S. Appl. No. 13/620,199, dated Mar. 11, 2014, 7 pages.
Notice of Allowance from U.S. Appl. No. 13/620,425, dated Mar. 31, 2014, 7 pages.
Final Office Action from U.S. Appl. No. 13/367,182, dated Apr. 1, 2014, 16 pages.
Final Office Action from U.S. Appl. No. 12/507,682, dated Apr. 2, 2014, 19 pages.
Notice of Allowance from U.S. Appl. No. 11/515,167, dated Apr. 2, 2014, 10 pages.
Non-Final Office Action from U.S. Appl. No. 13/620,793, dated Apr. 9, 2014, 14 pages.
Woo et al. ("An Optimized 3D,Stacked Memory Architecture by Exploiting Excessive, High Density TSV Bandwidth, by Dong Hyuk Woo," 987-1-4244-5659-8/09/02009, IEEE, 2009 doi:10.1109/HPCA.2010.5416628), 12 pages.
Final Office Action from U.S. Appl. No. 13/343,852, dated Apr. 18, 2014, 17 pages.
Final Office Action from U.S. Appl. No. 11/672,924, dated May 8, 2014, 28 pages.
Office Action from co-pending Korean patent application No. 10-2014-7005128, dated Apr. 10, 2014, 4 pages.
Notice of Allowance from U.S. Appl. No. 13/620,565, dated Jun. 4, 2014, 12 pages.
Non-Final Office Action from U.S. Appl. No. 11/553,390, dated Jul. 8, 2014, 15 pages.
Notice of Allowance from U.S. Appl. No. 13/367,182, dated Jul. 18, 2014, 9 pages.
Notice of Allowance from U.S. Appl. No. 13/620,601, dated Aug. 13, 2014, 11 pages.
Office Action from Japanese Application No. P2012-197678, dated Jul. 29, 2014, 6 pages.
Office Action from Japanese Application No. P2012-197675, dated Jul. 29, 2014, 6 pages.
Notice of Allowance from U.S. Appl. No. 12/507,682, dated Sep. 26, 2014.
Notice of Allowance from U.S. Appl. No. 13/620,793, dated Oct. 9, 2014.

* cited by examiner

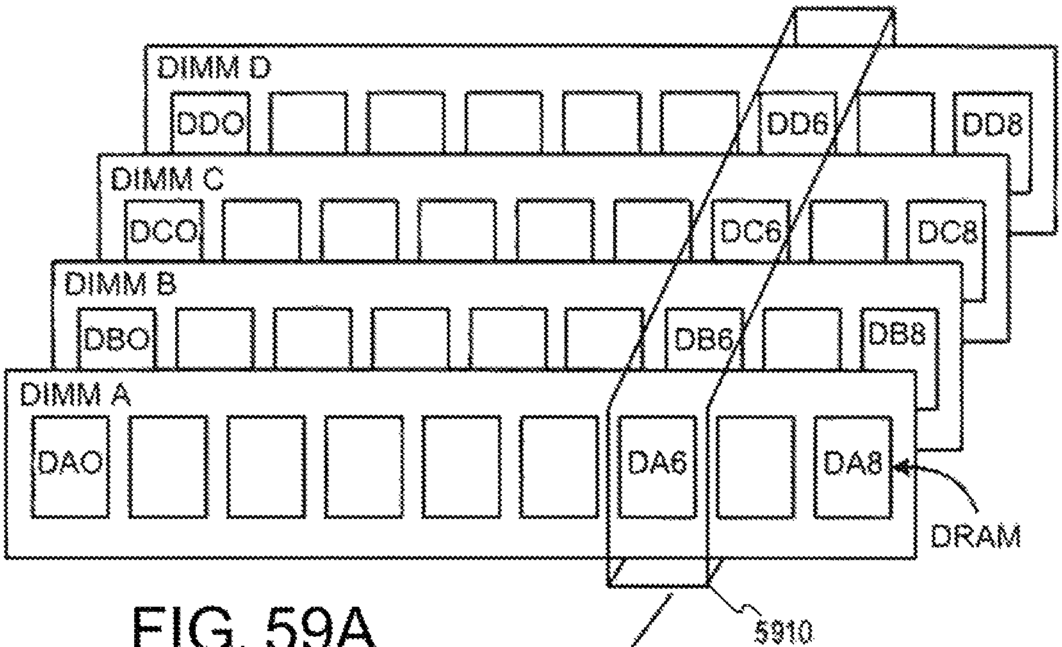
FIG. 59A
FIG. 59B
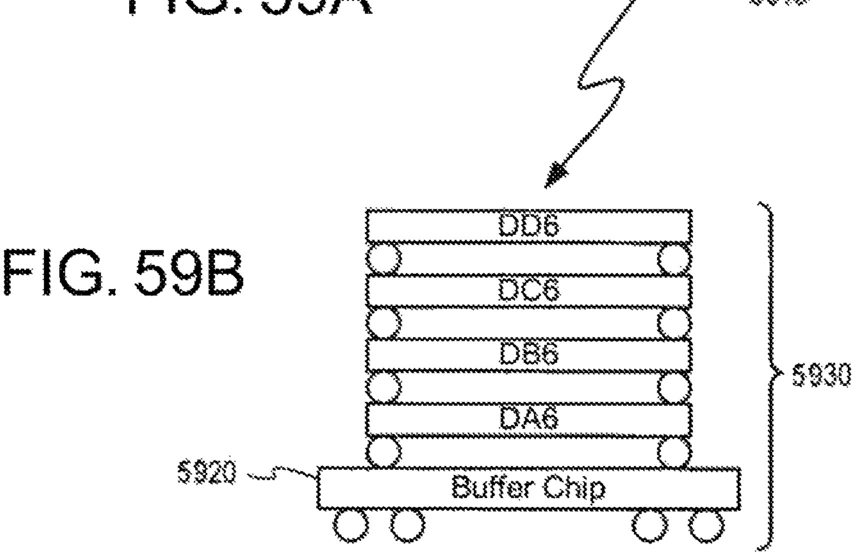
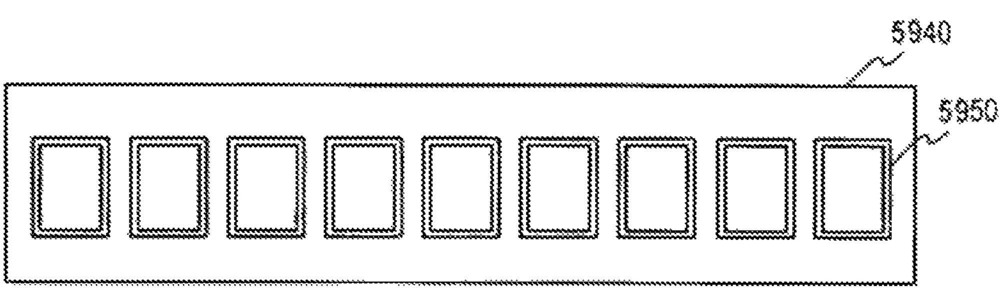
FIG. 59C

13900

| Byte | Bits | Mnemonic | Description |
|---|---|---|---|
| 0 | 0 | AUTO | Auto discovery (No, Auto) |
| | 1 | ONFI | ONFI standard support (No, Yes) |
| | 3:2 | CHIPS | How many chip selects exposed (Auto, 1, 2, 4) |
| | 7:4 | – | Reserved |
| 1 | 8 | MKR | External maker code reported by flash interface circuit to host. |
| 2 | 8 | DEV | External device code reported by flash interface circuit to host. |
| 3 | 1:0 | CIPN | Internal chip number (1, 2, 4, 8) |
| | 3:2 | CELL | Cell type (2, 4, 8, 16 levels) |
| | 5:4 | SIMP | # of simultaneously programmed pages (1, 2, 4, 8) |
| | 6 | INTRL | Interleave between multiple chips (No, Yes) |
| | 7 | CACHE | Cache program (No, Yes) |
| 4 | 1:0 | PAGE | Page size (1, 2, 4, 8 KB) |
| | 2 | RSIZE | Redundant area size (8, 16 bytes / 512 bytes) |
| | 7&3 | SMIN | Serial access minimum (50/30, 25 ns) |
| | 5:4 | BSIZE | Block size (64, 128, 256, 512 KB) |
| | 6 | ORG | Organization (x8, x16) |
| 5 | 1:0 | – | Reserved |
| | 3:2 | PLANE | Plane number |
| | 6:4 | PLSIZE | Plane size (64, 128, 256, 512, 1Gb, 2Gb, 4Gb, 8Gb) |
| | 7 | – | Reserved |
| 6 | 7:0 | – | Reserved |
| 7 | 7:0 | – | Reserved |

| Byte | Bits | Mnemonic | Description |
|---|---|---|---|
| 1 | 8 | MKR | External maker code reported by flash interface circuit to host. |
| 2 | 8 | DEV | External device code reported by flash interface circuit to host. |
| 3 | 1:0 | CIPN | Internal chip number (1, 2, 4, 8) |
| | 3:2 | CELL | Cell type (2, 4, 8, 16 levels) |
| | 5:4 | SIMP | # of simultaneously programmed pages (1, 2, 4, 8) |
| | 6 | INTRL | Interleave between multiple chips (No, Yes) |
| | 7 | CACHE | Cache program (No, Yes) |
| 4 | 1:0 | PAGE | Page size (1, 2, 4, 8 KB) |
| | 2 | RSIZE | Redundant area size (8, 16 bytes / 512 bytes) |
| | 7&3 | SMIN | Serial access minimum (50/30, 25 ns) |
| | 5:4 | BSIZE | Block size (64, 128, 256, 512 KB) |
| | 6 | ORG | Organization (x8, x16) |
| 5 | 1:0 | -- | Reserved |
| | 3:2 | PLANE | Plane number |
| | 6:4 | PLSIZE | Plane size (64, 128, 256, 512, 1Gb, 2Gb, 4Gb, 8Gb) |
| | 7 | -- | Reserved |
| -- | 7:0 | -- | Reserved |

| Byte | Bits | Mnemonic | Description |
|---|---|---|---|
| 0 | 0 | -- | Reserved |
| | 1 | ONFI | ONFI standard support (No, Yes) |
| | 3:2 | CHIPS | Number of stacked chips (1, 2, 4, 8) |
| | 7:4 | -- | Reserved |
| 1 | 8 | MKR | External maker code reported by flash interface circuit to host. |
| 2 | 8 | DEV | External device code reported by flash interface circuit to host. |
| 3 | 1:0 | CIPN | Internal chip number (1, 2, 4, 8) |
| | 3:2 | CELL | Cell type (2, 4, 8, 16 levels) |
| | 5:4 | SIMP | # of simultaneously programmed pages (1, 2, 4, 8) |
| | 6 | INTRL | Interleave between multiple chips (No, Yes) |
| | 7 | CACHE | Cache program (No, Yes) |
| 4 | 1:0 | PAGE | Page size (1, 2, 4, 8 KB) |
| | 2 | RSIZE | Redundant area size (8, 16 bytes / 512 bytes) |
| | 7&3 | SMIN | Serial access minimum (50/30, 25 ns) |
| | 5:4 | BSIZE | Block size (64, 128, 256, 512 KB) |
| | 6 | ORG | Organization (x8, x16) |
| 5 | 1:0 | -- | Reserved |
| | 3:2 | PLANE | Plane number |
| | 6:4 | PLSIZE | Plane size (64, 128, 256, 512, 1Gb, 2Gb, 4Gb, 8Gb) |
| | 7 | -- | Reserved |
| 6 | 7:0 | -- | Reserved |

FIG. 141

Normal Command Flow

CONFIGURABLE MEMORY CIRCUIT SYSTEM AND METHOD

CROSS-REFERENCE TO RELATED APPLICATIONS

The present application is a continuation-in-part of U.S. application Ser. No. 13/367,182, filed Feb. 6, 2012, which is a continuation of U.S. application Ser. No. 11/929,636 filed Oct. 30, 2007, now U.S. Pat. No. 8,244,971, which is a continuation of PCT application serial no. PCT/US2007/016385 filed Jul. 18, 2007, which is a continuation-in-part of each of U.S. application Ser. No. 11/461,439, filed Jul. 31, 2006, now U.S. Pat. No. 7,580,312, U.S. application Ser. No. 11/524,811, filed Sep. 20, 2006, now U.S. Pat. No. 7,590,796, U.S. application Ser. No. 11/524,730, filed Sep. 20, 2006, now U.S. Pat. No. 7,472,220, U.S. application Ser. No. 11/524,812 filed Sep. 20, 2006, now U.S. Pat. No. 7,386,656, U.S. application Ser. No. 11/524,716, filed Sep. 20, 2006, now U.S. Pat. No. 7,392,338, U.S. application Ser. No. 11/538,041, filed Oct. 2, 2006, now abandoned, U.S. application Ser. No. 11/584,179, filed Oct. 20, 2006, now U.S. Pat. No. 7,581,127, U.S. application Ser. No. 11/762,010, filed Jun. 12, 2007, now U.S. Pat. No. 8,041,881, and U.S. application Ser. No. 11/762,013, filed Jun. 12, 2007, now U.S. Pat. No. 8,090,897, each of which is incorporated herein by reference.

The present application is also a continuation-in-part of U.S. application Ser. No. 12/507,682 filed on Jul. 22, 2009, which is a continuation of U.S. application Ser. No. 11/461,427, filed Jul. 31, 2006, now U.S. Pat. No. 7,609,567, which is a continuation-in-part of U.S. application Ser. No. 11/474,075 filed Jun. 23, 2006 now U.S. Pat. No. 7,515,453 which claims benefit of U.S. provisional application 60/693,631 filed Jun. 24, 2005, each of which is incorporated herein by reference.

The present application is also a continuation-in-part of U.S. application Ser. No. 11/672,921 filed on Feb. 8, 2007, which claims the benefit of U.S. provisional application 60/722,414, filed Feb. 9, 2006 and U.S. provisional application 60/865,624 filed Nov. 13, 2006 and which is a continuation-in-part of each of: U.S. application Ser. No. 11/461,437 filed Jul. 31, 2006 now U.S. Pat. No. 8,077,535; U.S. application Ser. No. 11/702,981 filed Feb. 5, 2007 now U.S. Pat. No. 8,089,795; and U.S. application Ser. No. 11/702,960 filed Feb. 5, 2007, each of which is incorporated herein by reference.

The present application is also a continuation-in-part of U.S. application Ser. No. 13/620,425, filed on Sep. 14, 2012, which is a continuation of U.S. application Ser. No. 13/341,844, filed on Dec. 30, 2011, now U.S. Pat. No. 8,566,556, which is a divisional of U.S. application Ser. No. 11/702,981, filed on Feb. 5, 2007 now U.S. Pat. No. 8,089,795, which claims the benefit of U.S. provisional application 60/865,624, filed Nov. 13, 2006, and claims the benefit of U.S. provisional application 60/772,414, filed on Feb. 9, 2006. U.S. application Ser. No. 11/702,981 is also a continuation-in-part of U.S. application Ser. No. 11/461,437, filed Jul. 31, 2006 now U.S. Pat. No. 8,077,535, each of which is incorporated herein by reference.

The present application is also a continuation-in-part of U.S. application Ser. No. 13/615,008, filed on Sep. 13, 2012, which is a continuation application of U.S. application Ser. No. 11/939,440, filed Nov. 13, 2007, now U.S. Pat. No. 8,327,104, which is continuation-in-part of U.S. application Ser. No. 11/524,811, filed Sep. 20, 2006, now U.S. Pat. No. 7,590,796, which is a continuation-in-part of U.S. application Ser. No. 11/461,439, filed Jul. 31, 2006, now U.S. Pat. No. 7,580,312. U.S. application Ser. No. 11/939,440, also claims the benefit of priority to U.S. provisional application 60/865,627, filed Nov. 13, 2006, each of which is incorporated herein by reference.

The present application is also a continuation-in-part of U.S. application Ser. No. 13/618,246 filed on Sep. 14, 2012, which is a continuation of U.S. patent application Ser. No. 13/280,251, filed Oct. 24, 2011, now U.S. Pat. No. 8,386,833, which is continuation of U.S. patent application Ser. No. 11/763,365, filed Jun. 14, 2007, now U.S. Pat. No. 8,060,774, which is a continuation-in part of U.S. patent application Ser. No. 11/474,076, filed on Jun. 23, 2006, which claims the benefit of U.S. provisional patent application 60/693,631, filed on Jun. 24, 2005. U.S. patent application Ser. No. 11/763,365 is also a continuation-in-part of U.S. patent application Ser. No. 11/515,223, filed on Sep. 1, 2006, which claims the benefit of U.S. provisional patent application 60/713,815, filed on Sep. 2, 2005. U.S. patent application Ser. No. 11/763,365 also claimed the benefit of U.S. provisional patent application 60/814,234, filed on Jun. 16, 2006, each of which is incorporated herein by reference.

The present application is also a continuation-in-part of U.S. application Ser. No. 13/620,565, filed on Sep. 14, 2012, which is a continuation of U.S. application Ser. No. 11/515,223, filed on Sep. 1, 2006, which claims the benefit of U.S. provisional patent application 60/713,815, filed Sep. 2, 2005, each of which is incorporated herein by reference.

The present application is also a continuation-in-part of U.S. application Ser. No. 13/620,645, filed on Sep. 14, 2012, which is a continuation of U.S. application Ser. No. 11/929,655, filed on Oct. 30, 2007, which is a continuation of U.S. application Ser. No. 11/828,181, filed on Jul. 25, 2007, which claims the benefit of U.S. provisional application 60/823,229, filed Aug. 22, 2006, and which is a continuation-in-part of U.S. application Ser. No. 11/584,179, filed on Oct. 20, 2006, now U.S. Pat. No. 7,581,127, which is a continuation of U.S. application Ser. No. 11/524,811, filed on Sep. 20, 2006, now U.S. Pat. No. 7,590,796, and is a continuation-in-part of U.S. application Ser. No. 11/461,439, filed on Jul. 31, 2006, now U.S. Pat. No. 7,580,312, each of which is incorporated herein by reference.

The present application is also a continuation-in-part of U.S. application Ser. No. 13/473,827, filed May 17, 2012, which is a divisional of U.S. application Ser. No. 12/378,328, filed Feb. 14, 2009, now U.S. Pat. No. 8,438,328, which claims the benefit of U.S. provisional application 61/030,534, filed on Feb. 21, 2008, each of which is incorporated herein by reference.

The present application is also a continuation-in-part of U.S. application Ser. No. 13/620,793, field on Sep. 15, 2012, which is a continuation of U.S. application Ser. No. 12/057,306, filed Mar. 27, 2008, now U.S. Pat. No. 8,397,013, which is a continuation-in-part of U.S. application Ser. No. 11/611,374, filed on Dec. 15, 2006, now U.S. Pat. No. 8,055,833, which claims the benefit of U.S. provisional application 60/849,631, filed Oct. 5, 2006, each of which is incorporated herein by reference.

The present application is also a continuation-in-part of U.S. application Ser. No. 13/620,424, filed on Sep. 14, 2012, which is a continuation of U.S. application Ser. No. 13/276,212, filed Oct. 18, 2011, now U.S. Pat. No. 8,370,566, which is a continuation of U.S. application Ser. No. 11/611,374, filed Dec. 15, 2006, now U.S. Pat. No. 8,055,833, which claims the benefit of U.S. provisional application 60/849,631, filed Oct. 5, 2006, each of which is incorporated herein by reference.

The present application is also a continuation-in-part of U.S. application Ser. No. 13/597,895, field Aug. 29, 2012, which is a continuation of U.S. application Ser. No. 13/367,259, filed Feb. 6, 2012, now U.S. Pat. No. 8,279,690, which is a divisional of U.S. application Ser. No. 11/941,589, filed Nov. 16, 2007, now U.S. Pat. No. 8,111,566, each of which is incorporated herein by reference.

The present application is also a continuation-in-part of U.S. application Ser. No. 13/455,691, filed Apr. 25, 2012, which is a continuation of U.S. patent application Ser. No. 12/797,557 filed Jun. 9, 2010, now U.S. Pat. No. 8,169,233, which claims the benefit of U.S. provisional application 61/185,585, filed on Jun. 9, 2009, each of which is incorporated herein by reference.

The present application is also a continuation-in-part of U.S. application Ser. No. 13/620,412, filed Sep. 14, 2012, which is a continuation of U.S. patent application Ser. No. 13/279,068, filed Oct. 21, 2011, which is a divisional of U.S. patent application Ser. No. 12/203,100, filed Sep. 2, 2008, now U.S. Pat. No. 8,081,474, which claims the benefit of U.S. provisional application 61/014,740, filed Dec. 18, 2007, each of which is incorporated herein by reference.

The present application is also a continuation-in-part of U.S. application Ser. No. 13/898,002, filed May 20, 2013, which is a continuation of U.S. application Ser. No. 13/411,489, filed Mar. 2, 2012, now U.S. Pat. No. 8,446,781, which is a continuation of U.S. application Ser. No. 11/939,432, filed Nov. 13, 2007, now U.S. Pat. No. 8,130,560, which claims the benefit of U.S. provisional application 60/865,623, filed Nov. 13, 2006, each of which is incorporated herein by reference.

The present application is also a continuation-in-part of U.S. application Ser. No. 11/515,167, filed Sep. 1, 2006, each of which is incorporated herein by reference.

The present application is also a continuation-in-part of U.S. application Ser. No. 13/620,199, filed Sep. 14, 2012, which is a continuation of U.S. application serial no. 12/144,396, filed Jun. 23, 2008, now U.S. Pat. No. 8,386,722, each of which is incorporated herein by reference.

The present application is also a continuation-in-part of U.S. application Ser. No. 13/620,207, filed Sep. 14, 2012, which is a continuation of U.S. application Ser. No. 12/508,496, filed Jul. 23, 2009, now U.S. Pat. No. 8,335,894, which claims the benefit of U.S. provisional application 61/083,878, filed Jul. 25, 2008, each of which is incorporated herein by reference.

BACKGROUND AND FIELD OF THE INVENTION

This invention relates generally to memory.

SUMMARY

In one embodiment, a memory subsystem is provided including an interface circuit adapted for coupling with a plurality of memory circuits and a system. The interface circuit is operable to interface the memory circuits and the system for emulating at least one memory circuit with at least one aspect that is different from at least one aspect of at least one of the plurality of memory circuits. Such aspect includes a signal, a capacity, a timing, and/or a logical interface.

In another embodiment, a memory subsystem is provided including an interface circuit adapted for communication with a system and a majority of address or control signals of a first number of memory circuits. The interface circuit includes emulation logic for emulating at least one memory circuit of a second number.

In yet another embodiment, a memory circuit power management system and method are provided. In use, an interface circuit is in communication with a plurality of physical memory circuits and a system. The interface circuit is operable to interface the physical memory circuits and the system for simulating at least one virtual memory circuit with a first power behavior that is different from a second power behavior of the physical memory circuits.

In still yet another embodiment, a memory circuit power management system and method are provided. In use, an interface circuit is in communication with a plurality of memory circuits and a system. The interface circuit is operable to interface the memory circuits and the system for performing a power management operation in association with at least a portion of the memory circuits. Such power management operation is performed during a latency associated with one or more commands directed to at least a portion of the memory circuits.

In even another embodiment, an apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

In another embodiment, an power saving system and method are provided. In use, at least one of a plurality of memory circuits is identified that is not currently being accessed. In response to the identification of the at least one memory circuit, a power saving operation is initiated in association with the at least one memory circuit.

BRIEF DESCRIPTION OF THE DRAWINGS

FIGS. 59A-59C illustrate one embodiment of a DIMM with a plurality of DRAM stacks.

FIG. 94 illustrates conventional impedance loading as a result of adding DRAMs to a high-speed memory bus.

FIG. 95 illustrates impedance loading as a result of adding DRAMs to a high-speed memory bus in accordance with one embodiment.

FIG. 96 is a block diagram illustrating one embodiment for adding low-speed memory chips using a socket.

FIG. 97 illustrates a PCB with a socket located on top of a stack.

FIG. 98 illustrates a PCB with a socket located on the opposite side from the stack.

FIG. 99 illustrates an upgrade PCB that contains one or more memory chips.

FIG. 100 is a block diagram illustrating one embodiment for stacking memory chips.

FIG. 101 is a timing diagram for implementing memory RAID using a datamask ("DM") signal in a three chip stack composed of 8 bit wide DDR2 SDRAMS.

FIG. 102A illustrates a multiple memory device system, according to one embodiment.

FIG. 102B illustrates a memory stack, according to one embodiment.

FIG. 102C illustrates a multiple memory device system, according to one embodiment that includes both an intelligent register and an intelligent buffer.

FIG. 103 illustrates a multiple memory device system, according to another embodiment.

Figure 104:
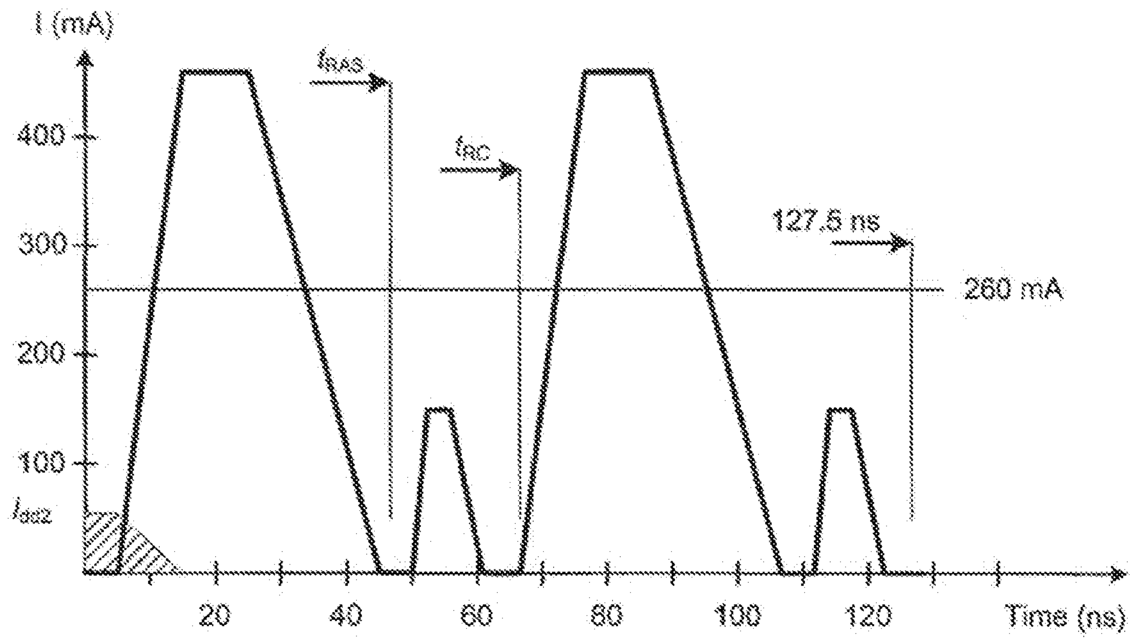

FIG. 104 illustrates an idealized current draw as a function of time for a refresh cycle of a single memory device that executes two internal refresh cycles for each external refresh command, according to one embodiment.

Figure 105A:
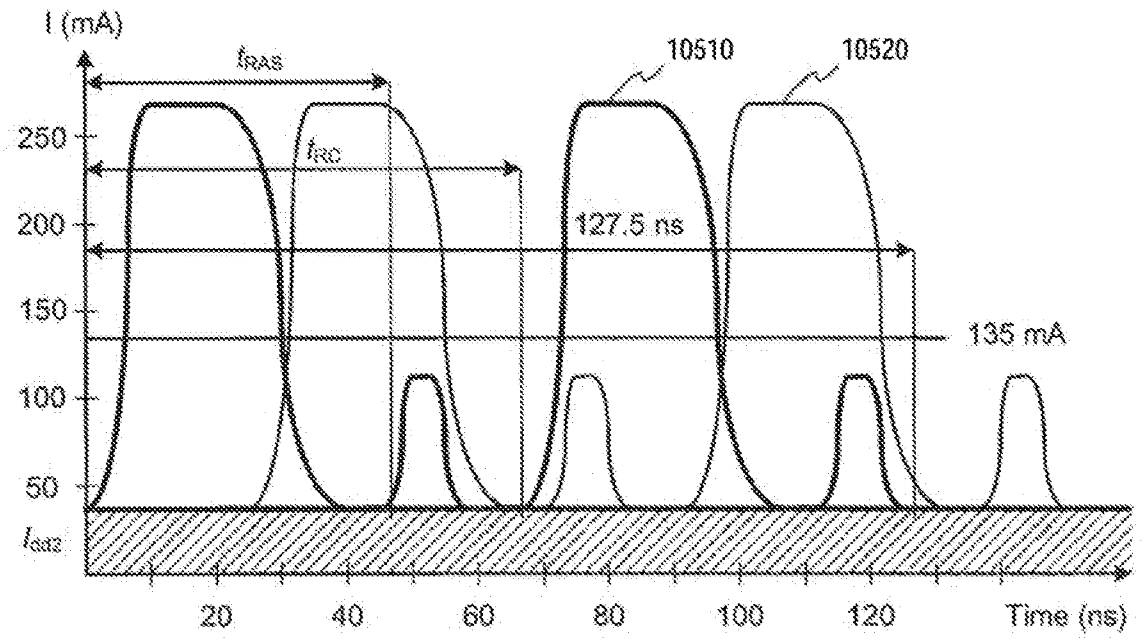

FIG. 105A illustrates current draw as a function of time for two refresh cycles, started independently and staggered by a time period of half of the period of a single refresh cycle, according to another embodiment.

Figure 105B:
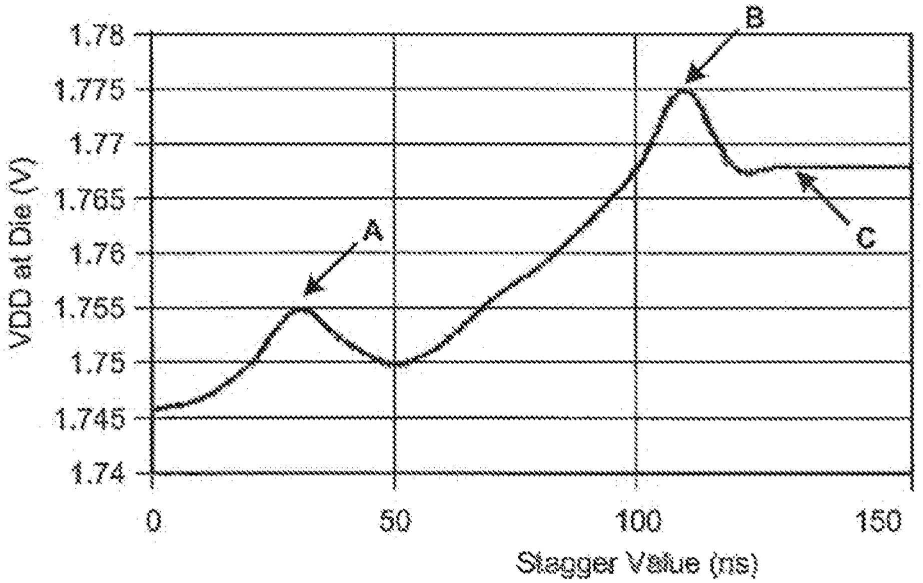

FIG. 105B illustrates voltage droop as a function of a stagger offset for two refresh cycles, according to one embodiment.

Figure 106:
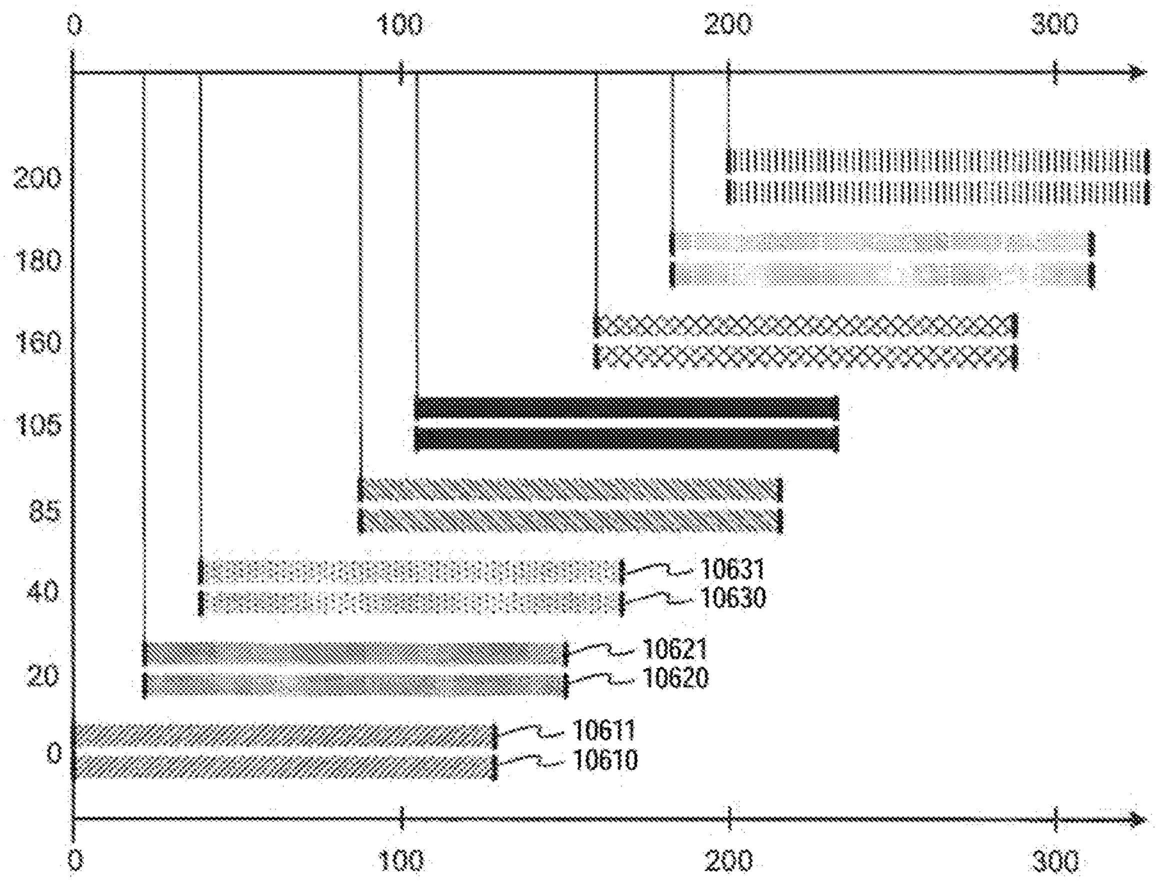

FIG. 106 illustrates the start and finish times of eight independent refresh cycles, according to one embodiment.

Figure 107:
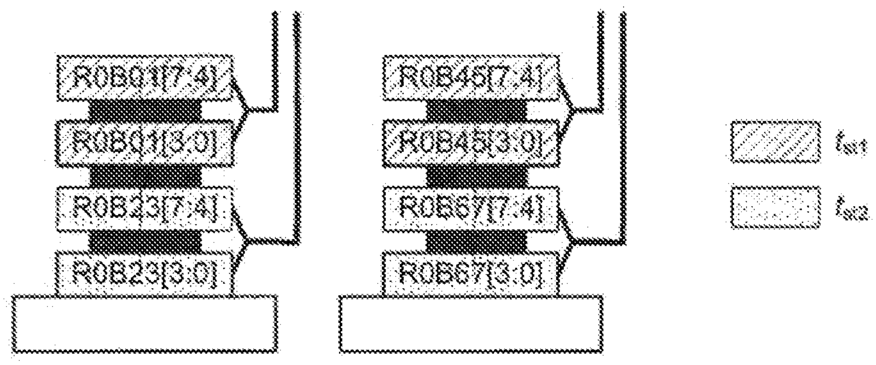

FIG. 107 illustrates a configuration of eight memory devices refreshed by two independently controlled refresh cycles starting at times tST1 and tST2, respectively, according to one embodiment.

Figure 108:
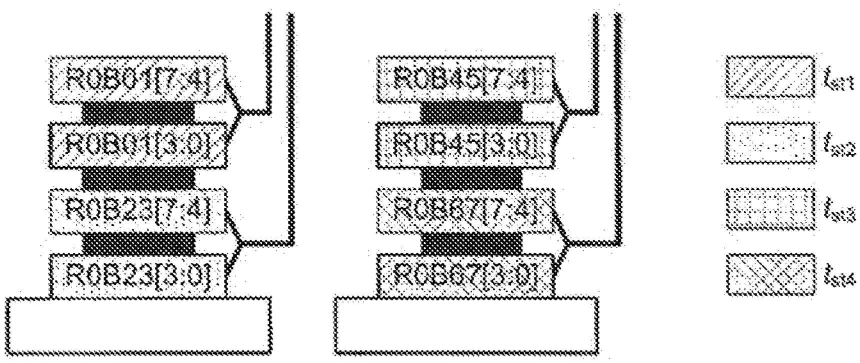

FIG. 108 illustrates a configuration of eight memory devices refreshed by four independently controlled refresh cycles starting at times tST1, tST2, tST3 and tST4, respectively, according to another embodiment.

Figure 109:
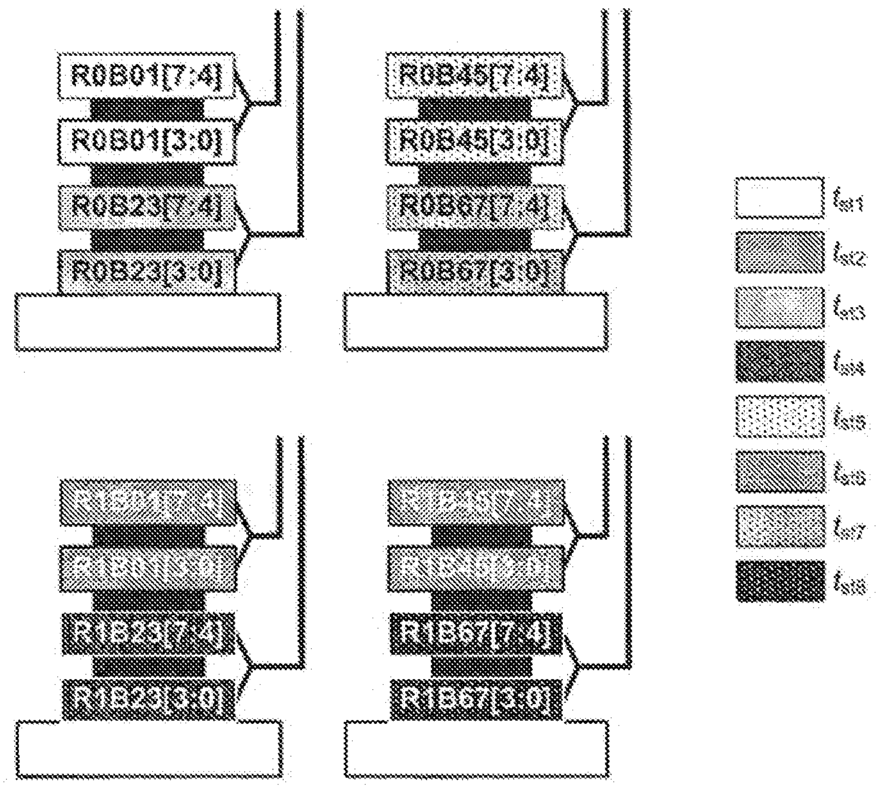

FIG. 109 illustrates a configuration of sixteen memory devices refreshed by eight independently controlled refresh cycles tST1, tST2, tST3 and tST4, tST5, tST6, tST7 and tST8, respectively, according to one embodiment.

Figure 102A:
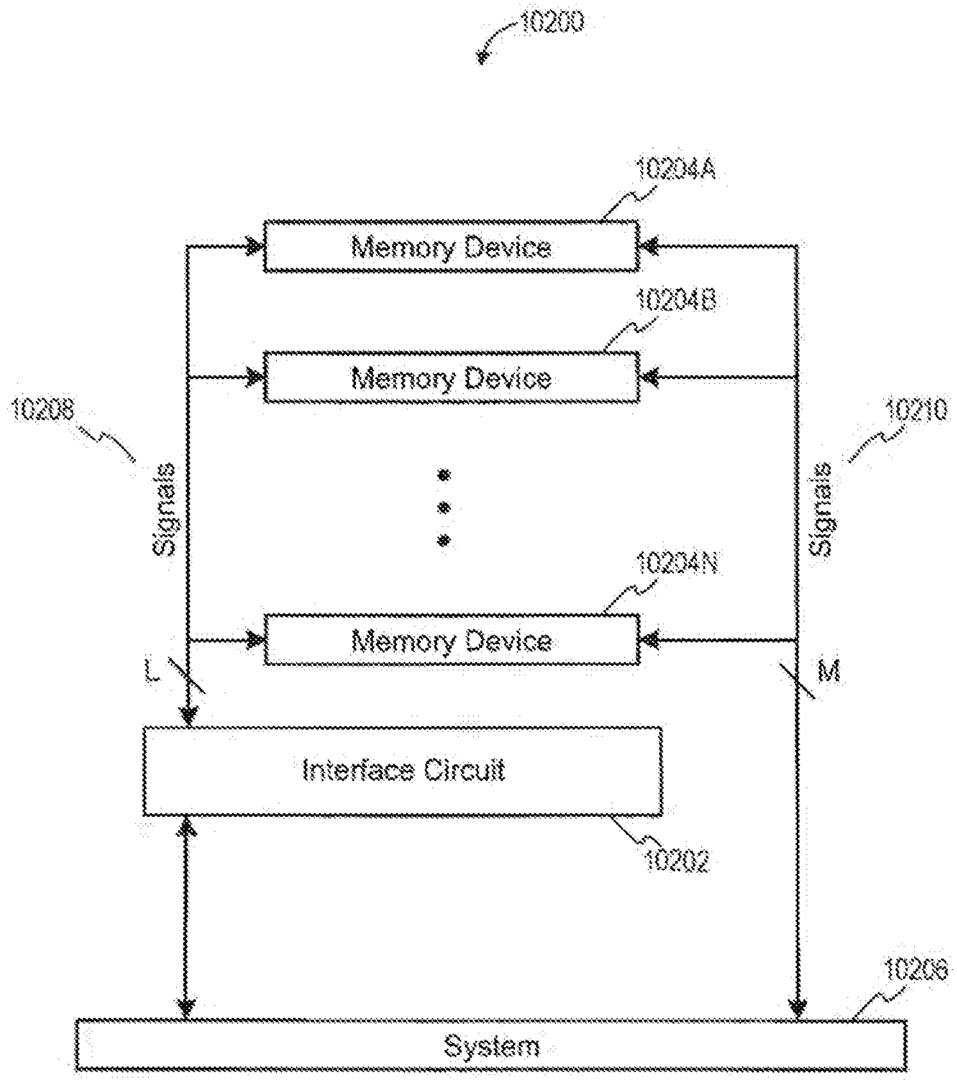
Figure 110:
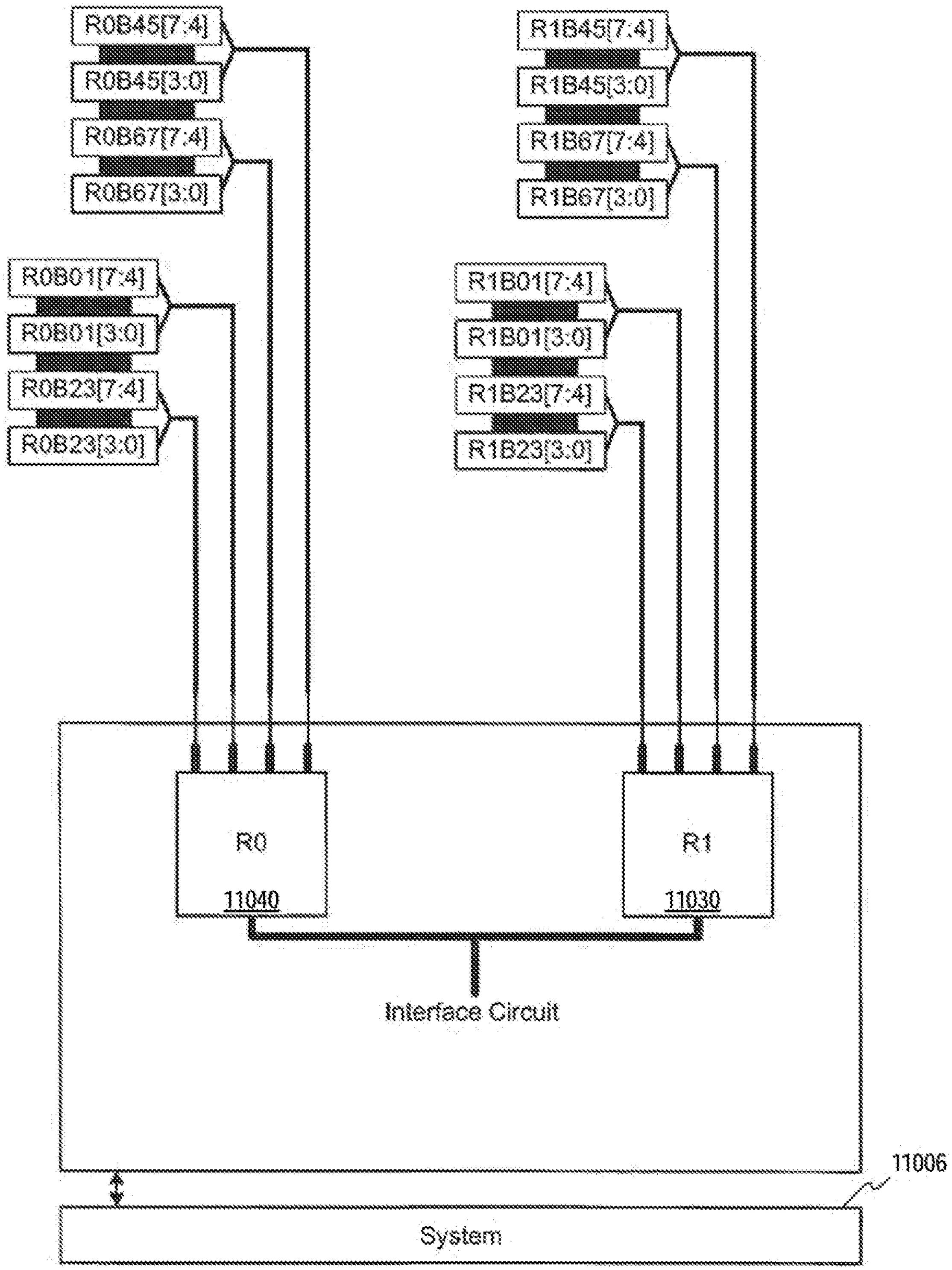

FIG. 110 illustrates the octal configuration of the memory devices of FIG. 109 implemented within the multiple memory device system of FIG. 102A, according to one embodiment.

Figure 111A:
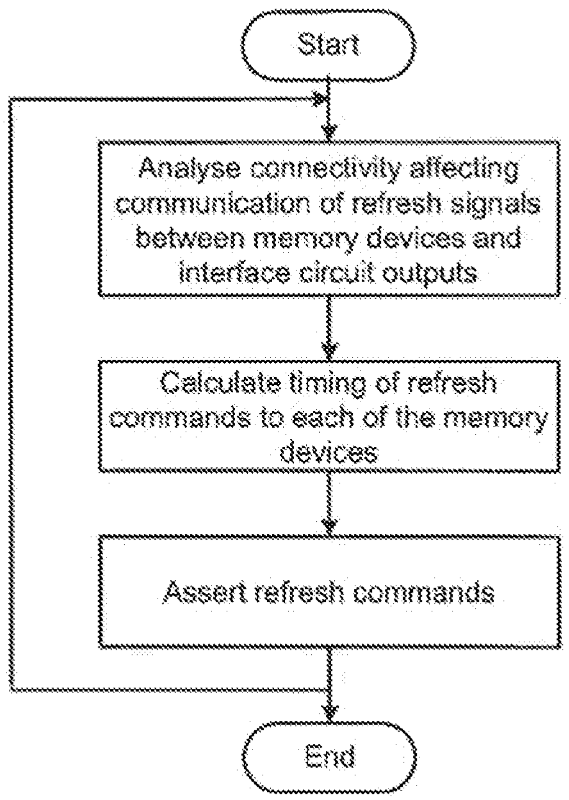

FIG. 111A is a flowchart of method steps for configuring, calculating, and generating the timing and assertion of two or more refresh commands, according to one embodiment.

Figure 111B:
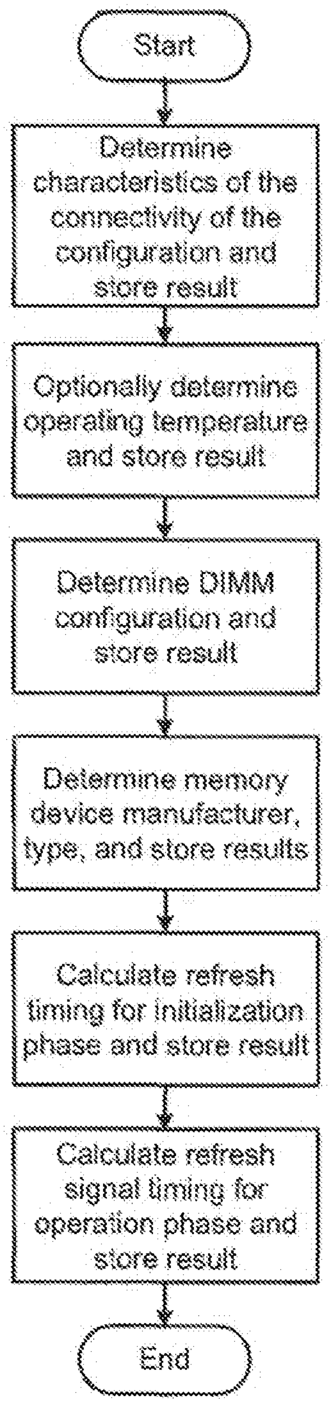

FIG. 111B depicts a series of operations for calculating refresh stagger times for a given configuration.

Figure 112:
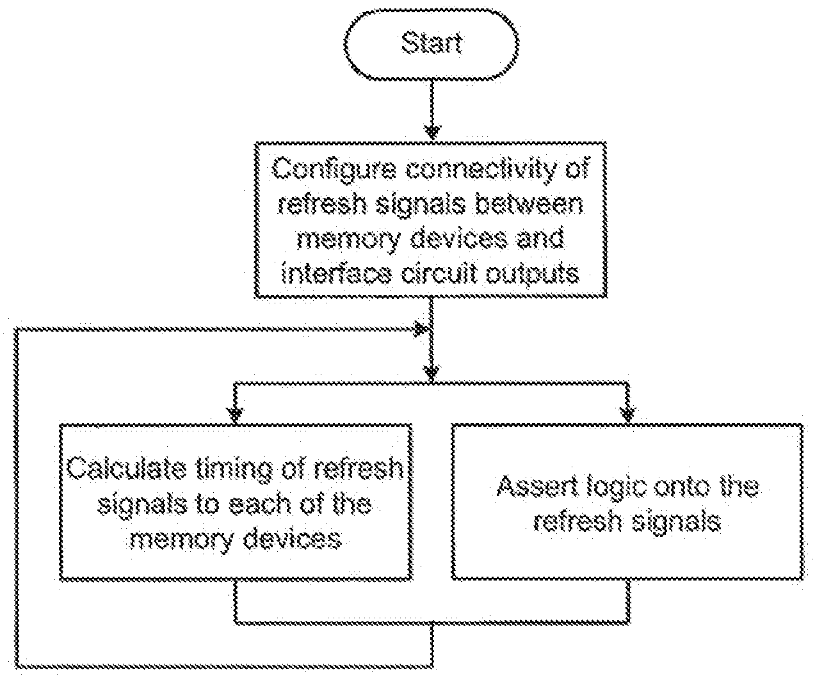

FIG. 112 is a flowchart of method steps for configuring, calculating, and generating the timing and assertion of two or more refresh commands continuously and asynchronously, according to one embodiment.

Figure 113:
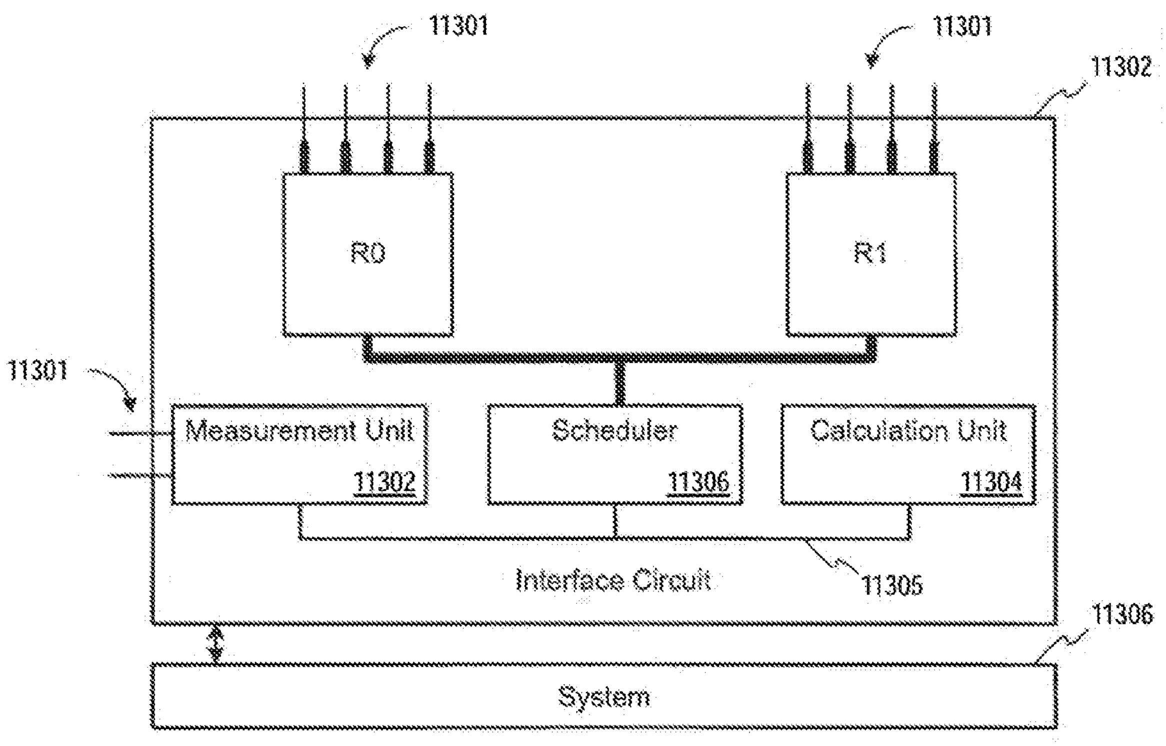

FIG. 113 illustrates the interface circuit of FIG. 102A with refresh command outputs adapted to connect to a plurality of memory devices, such as the memory devices of FIG. 102A, according to one embodiment.

Figure 114:
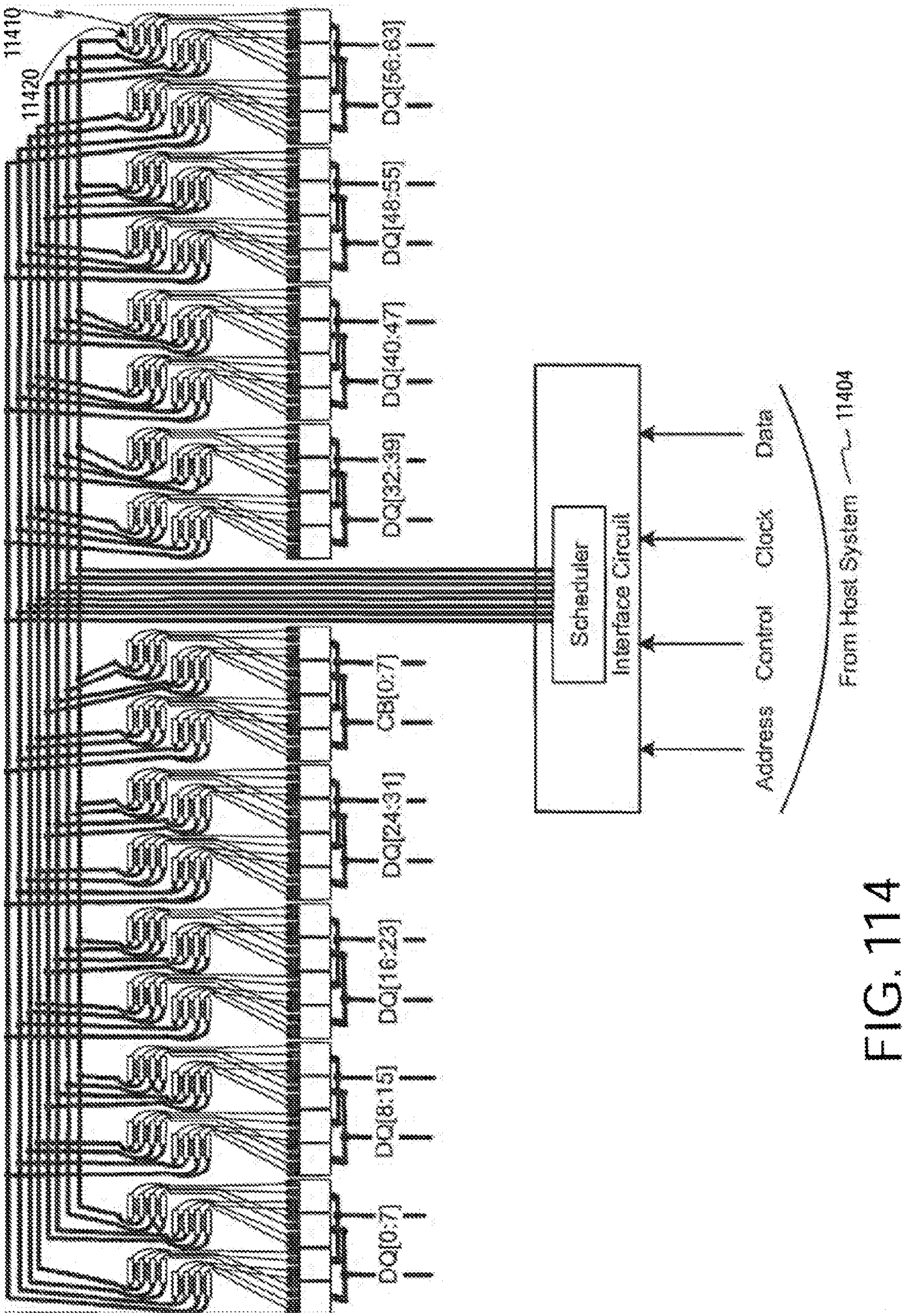

FIG. 114 is an exemplary illustration of a 72-bit ECC DIMM based upon industry-standard DRAM devices arranged vertically into stacks and horizontally into an array of stacks, according to one embodiment.

Figure 115:
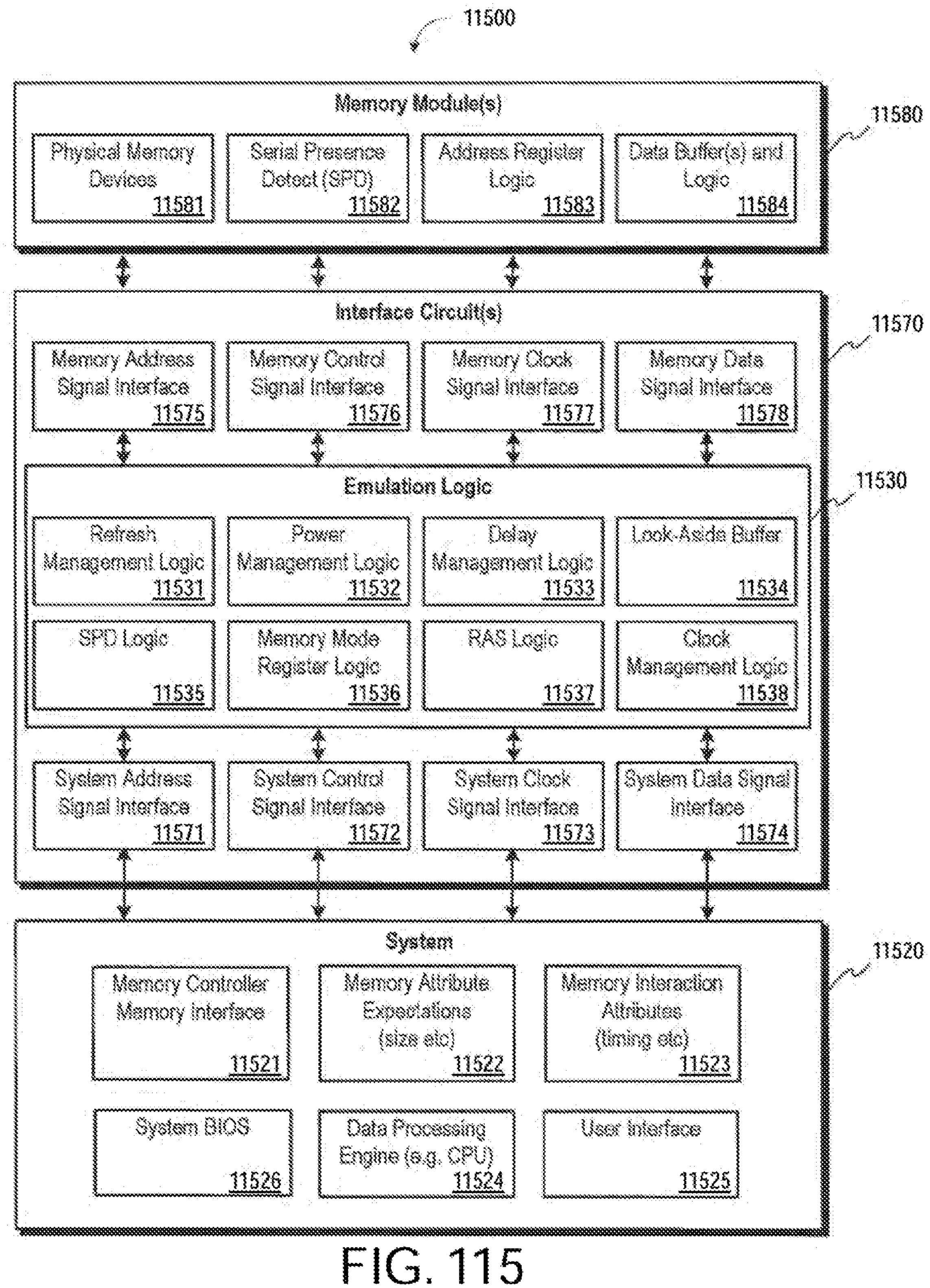

FIG. 115 is a conceptual illustration of a computer platform including an interface circuit.

Figure 116A:
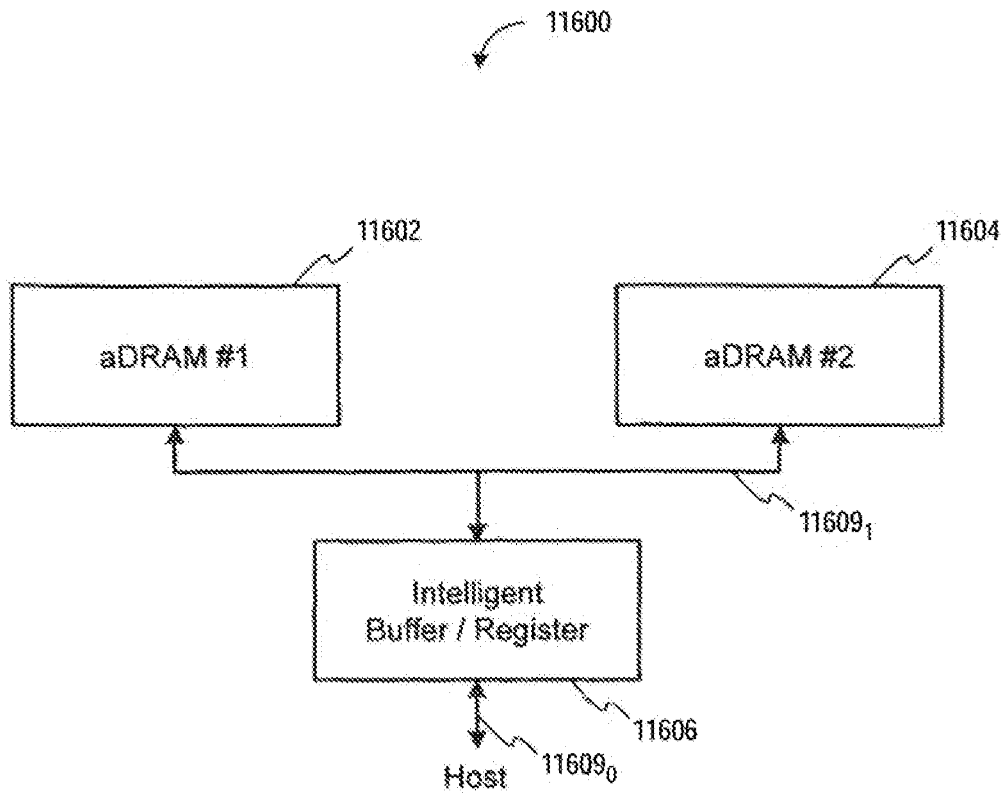

FIG. 116A depicts an embodiment of the invention showing multiple abstracted memories behind an intelligent register/buffer.

Figure 116B:
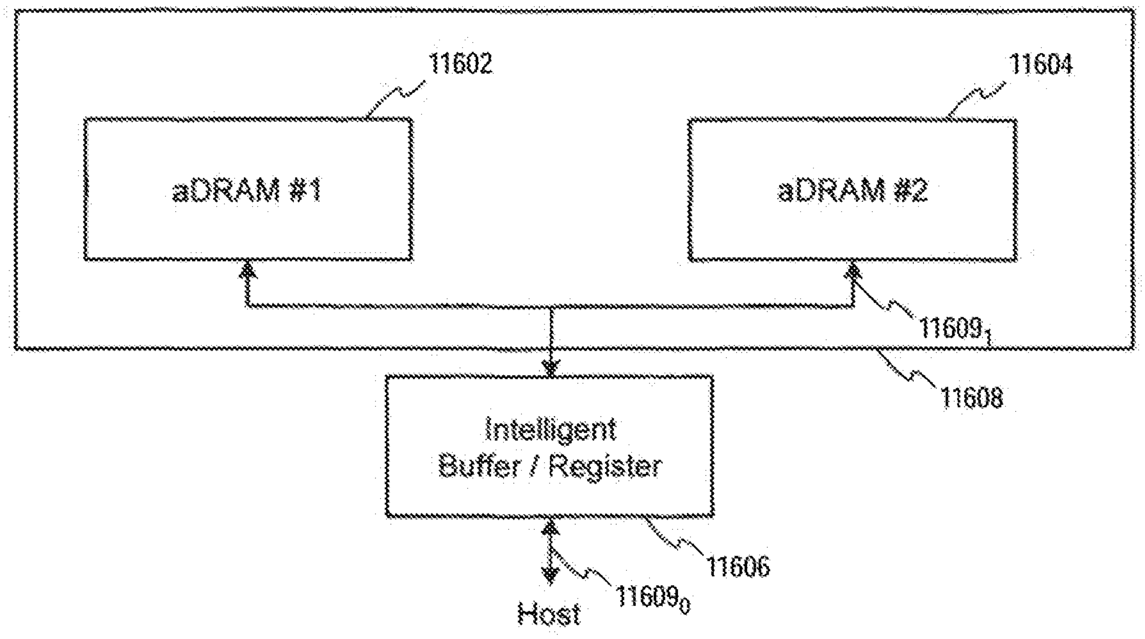

FIG. 116B depicts an embodiment of the invention showing multiple abstracted memories on a single PCB behind an intelligent register/buffer.

Figure 116C:
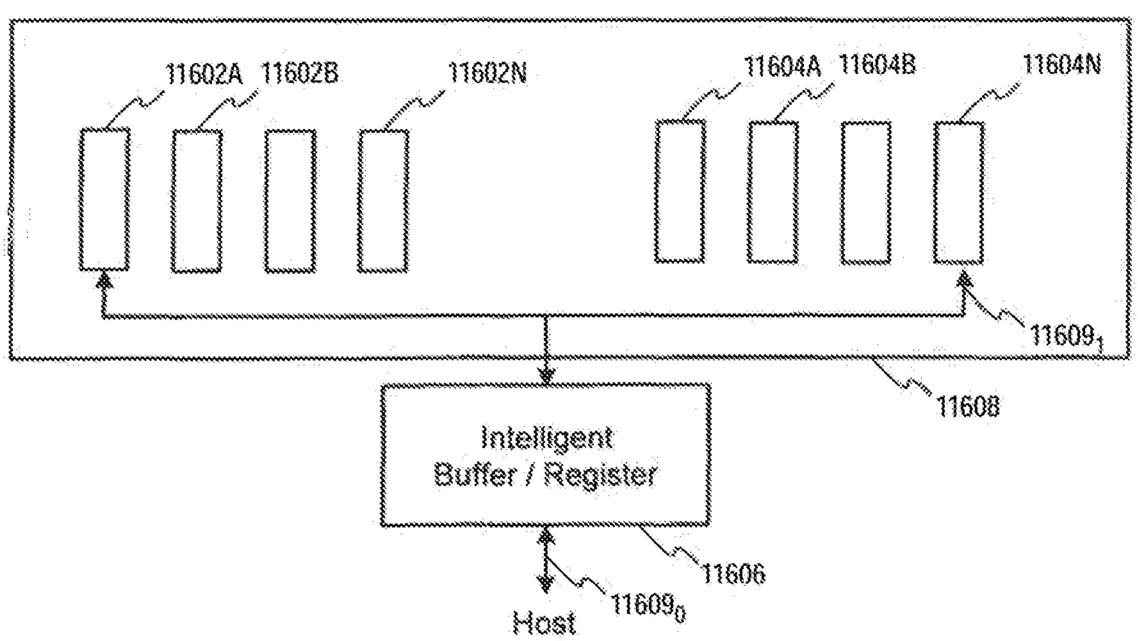

FIG. 116C depicts an embodiment of the invention showing multiple abstracted memories on a DIMM behind an intelligent register/buffer.

Figure 117:
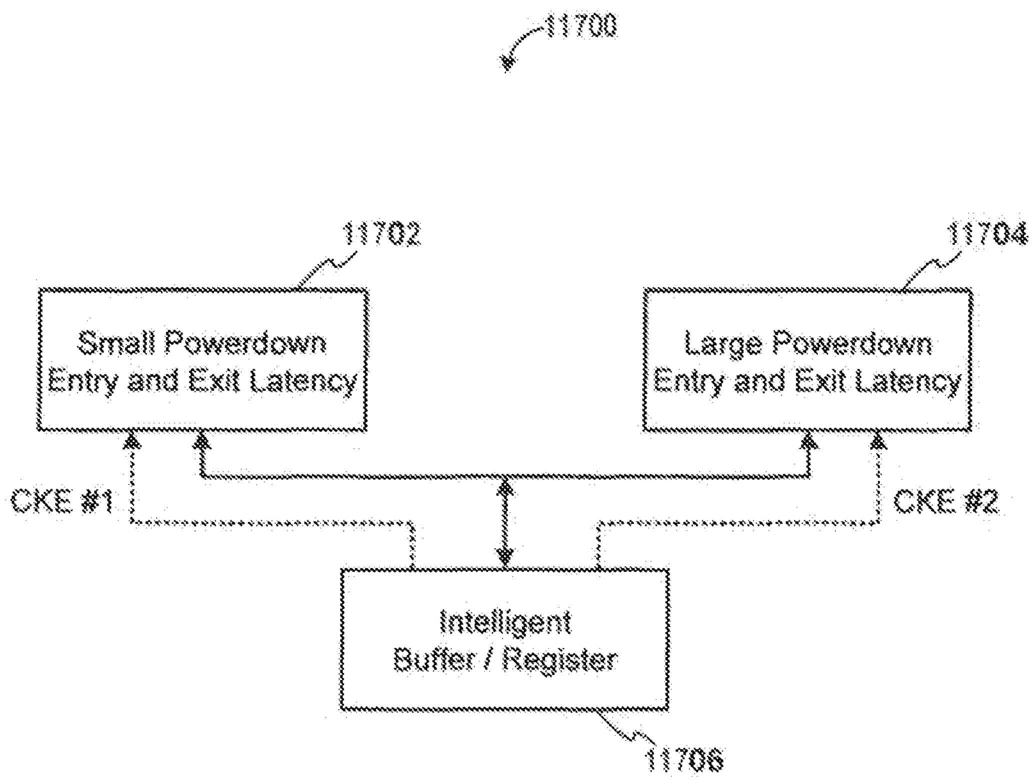

FIG. 117 depicts an embodiment of the invention using multiple CKEs to multiple abstracted memories on a DIMM behind an intelligent register/buffer.

Figure 118A:
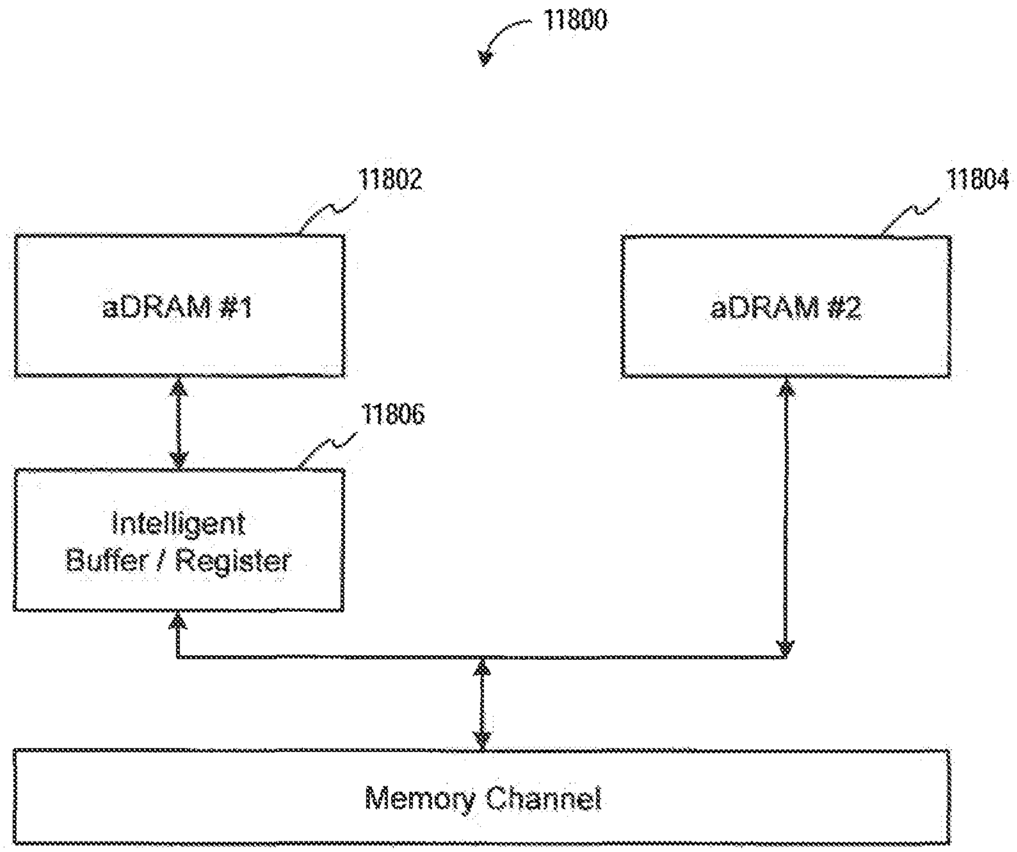

FIG. 118A depicts an embodiment showing two abstracted DRAMS with one DRAM situated behind an intelligent buffer/register, and a different abstracted DRAM connected directly to the memory channel.

Figure 118B:
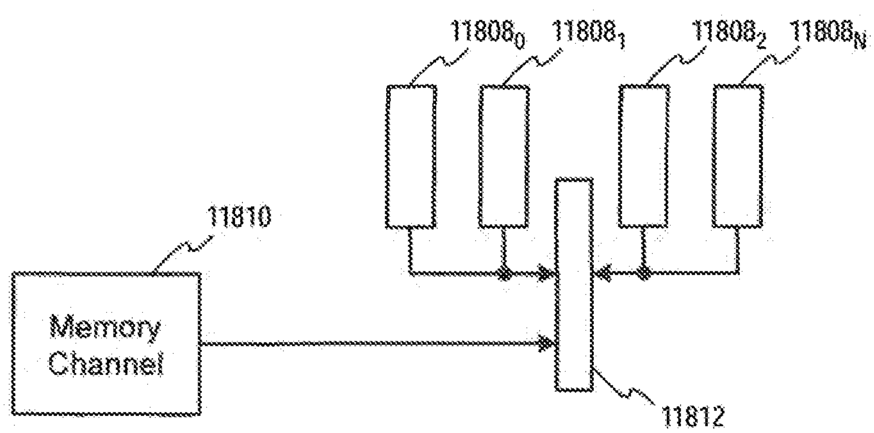

FIG. 118B depicts a memory channel in communication with an intelligent buffer, and plural DRAMs disposed symmetrically about the intelligent buffer, according to one embodiment.

Figure 119A:
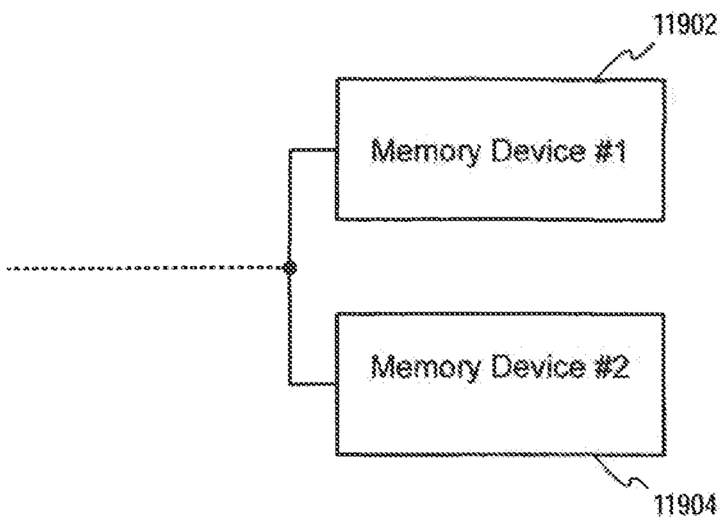

FIG. 119A depicts an embodiment showing the use of dotted DQs on a memory data bus.

Figure 119B:
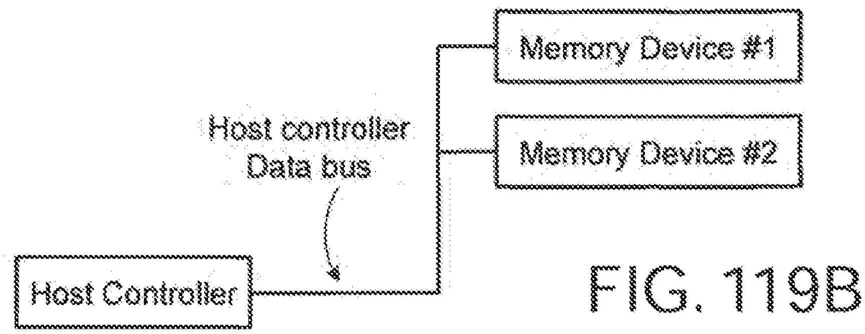

FIG. 119B depicts an embodiment showing the use of dotted DQs on a host-controller memory data bus.

Figure 119C:
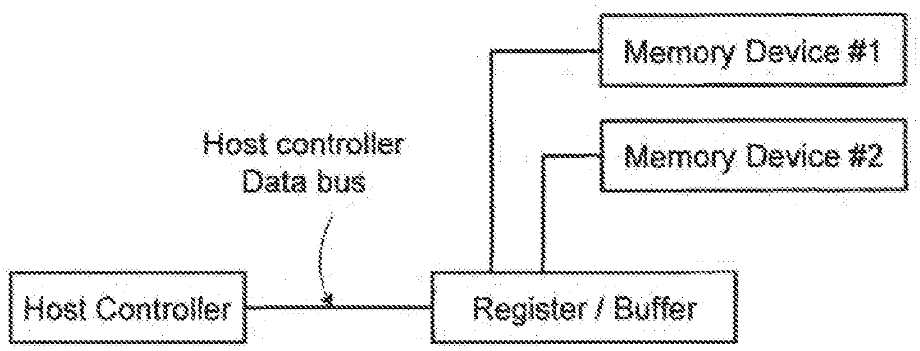

FIG. 119C depicts the use of separate DQs on a memory data bus behind an intelligent register/buffer.

Figure 119D:
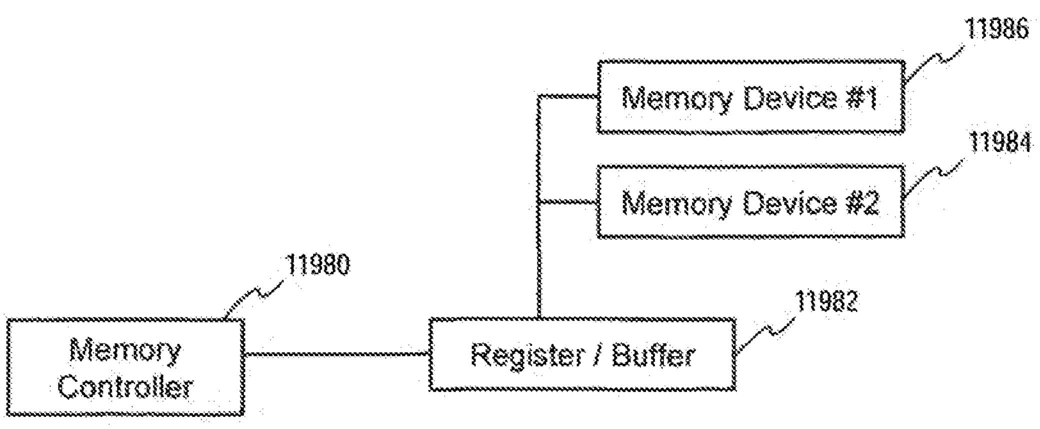

FIG. 119D depicts an embodiment showing the use of dotted DQs on a memory data bus behind an intelligent register/buffer.

Figure 119E:
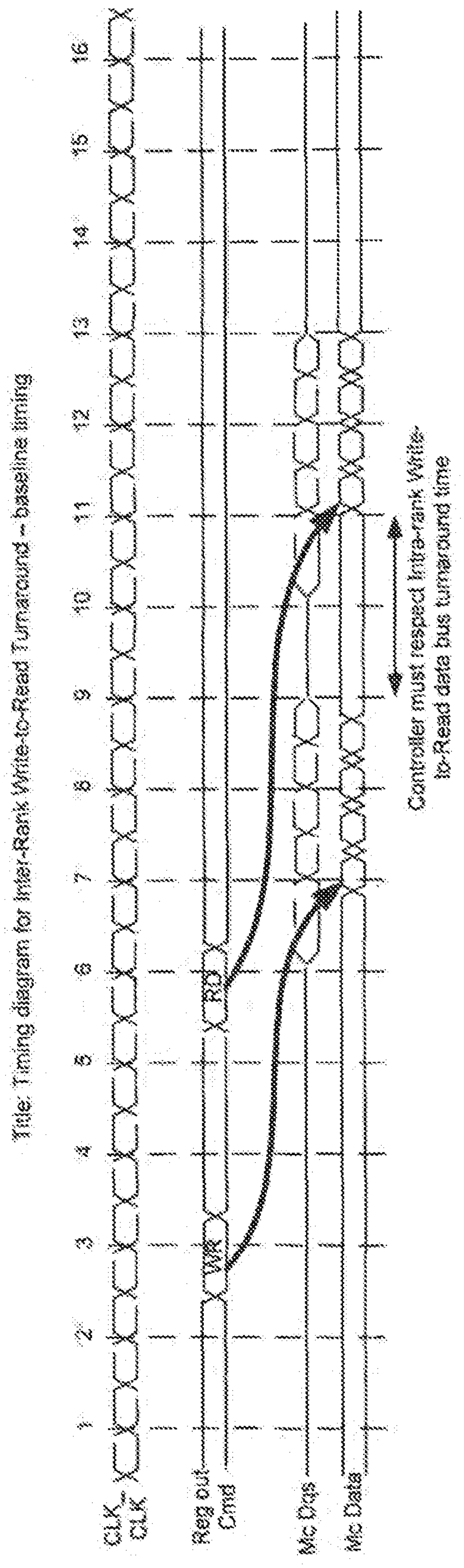

FIG. 119E depicts a timing diagram showing normal inter-rank write-to-read turnaround timing.

Figure 119F:
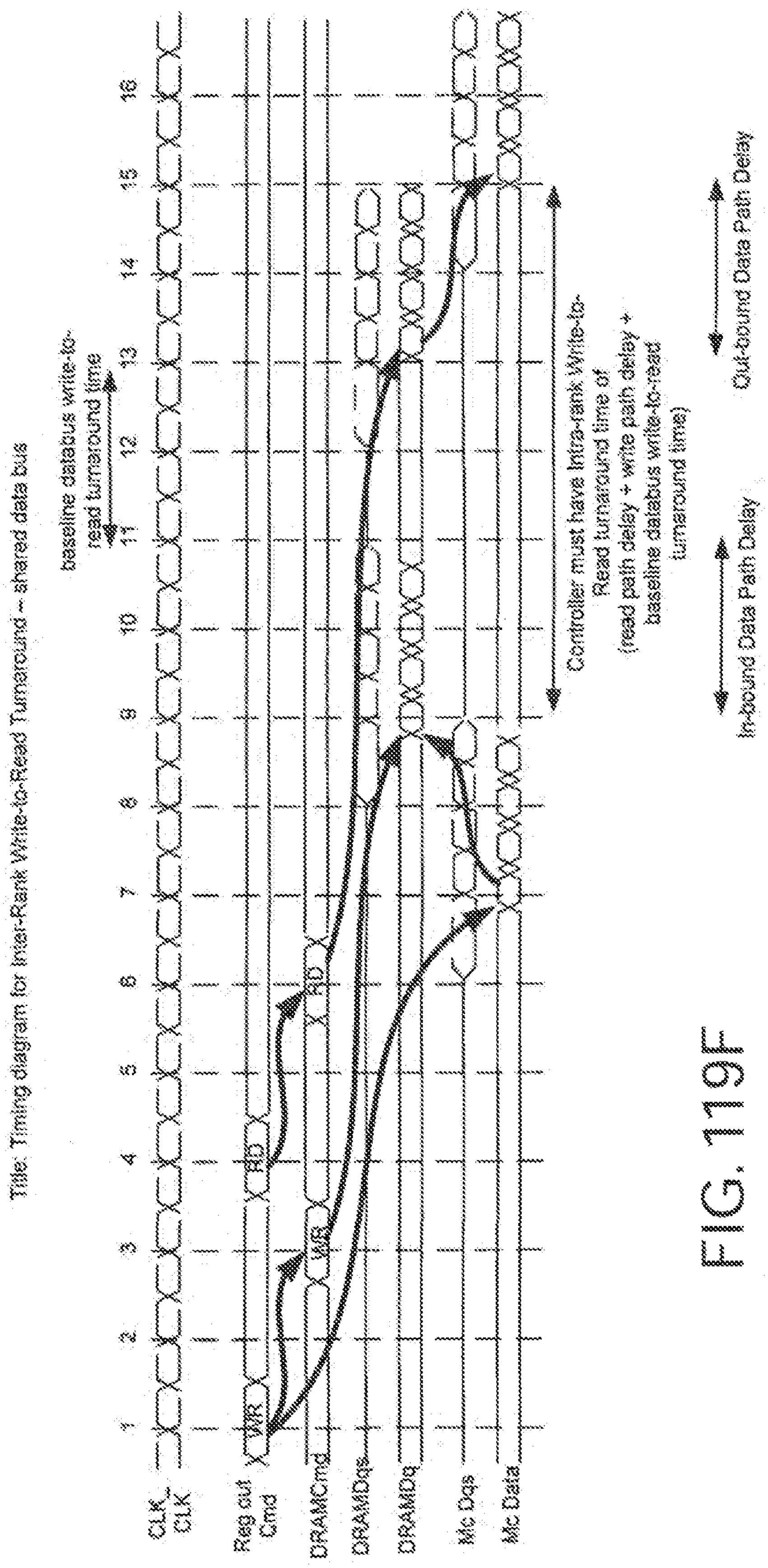

FIG. 119F depicts a timing diagram showing inter-rank write-to-read turnaround timing for a shared data bus behind an intelligent register/buffer.

Figure 120:
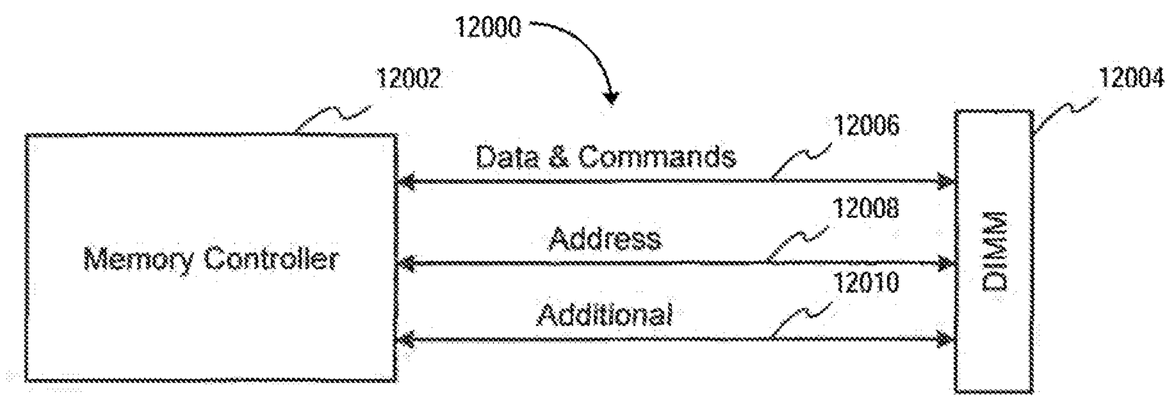

FIG. 120 depicts an embodiment showing communication of signals in addition to data, commands, address, and control.

Figure 121A:
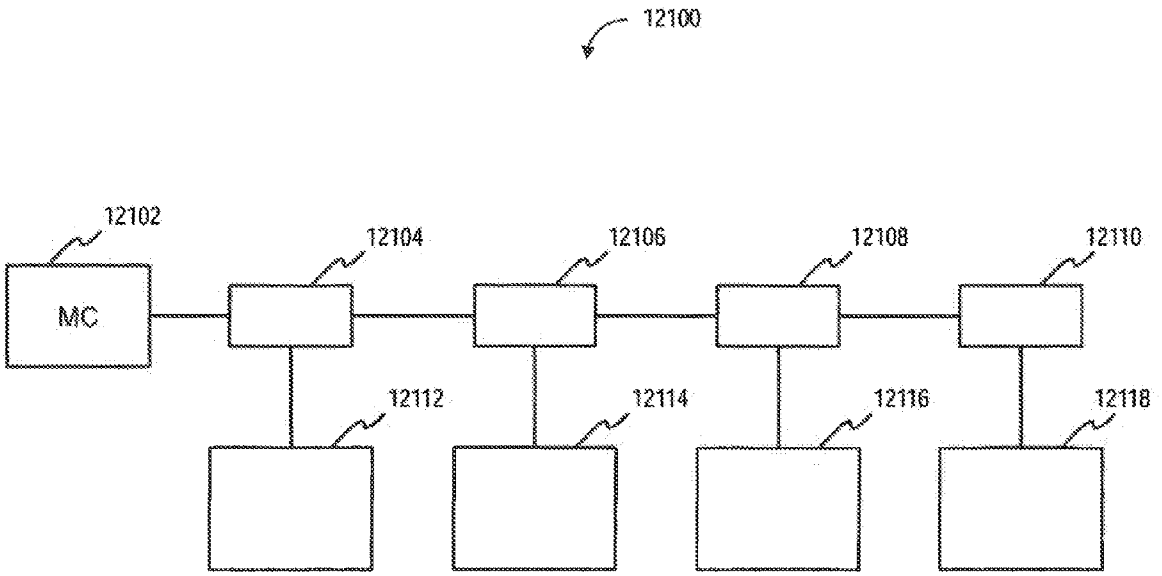

FIG. 121A depicts a number of DIMMs on a memory system bus.

Figure 121B:
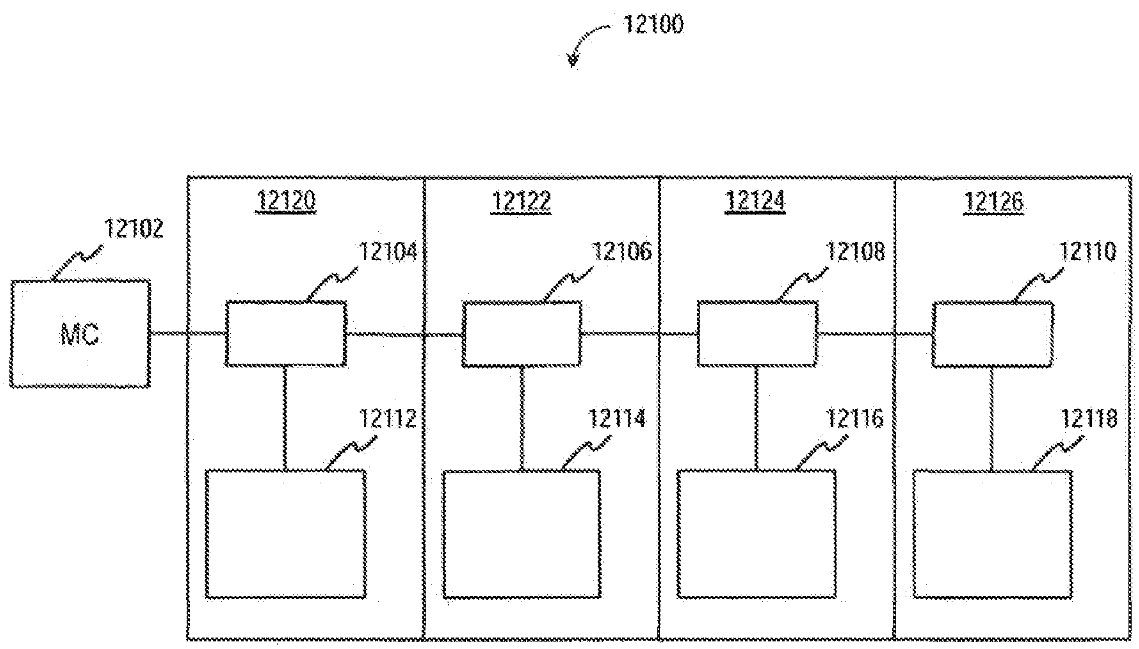

FIG. 121B depicts an embodiment showing a possible abstracted partitioning of a number of DIMMs behind intelligent register/buffer chips on a memory system bus.

Figure 121C:
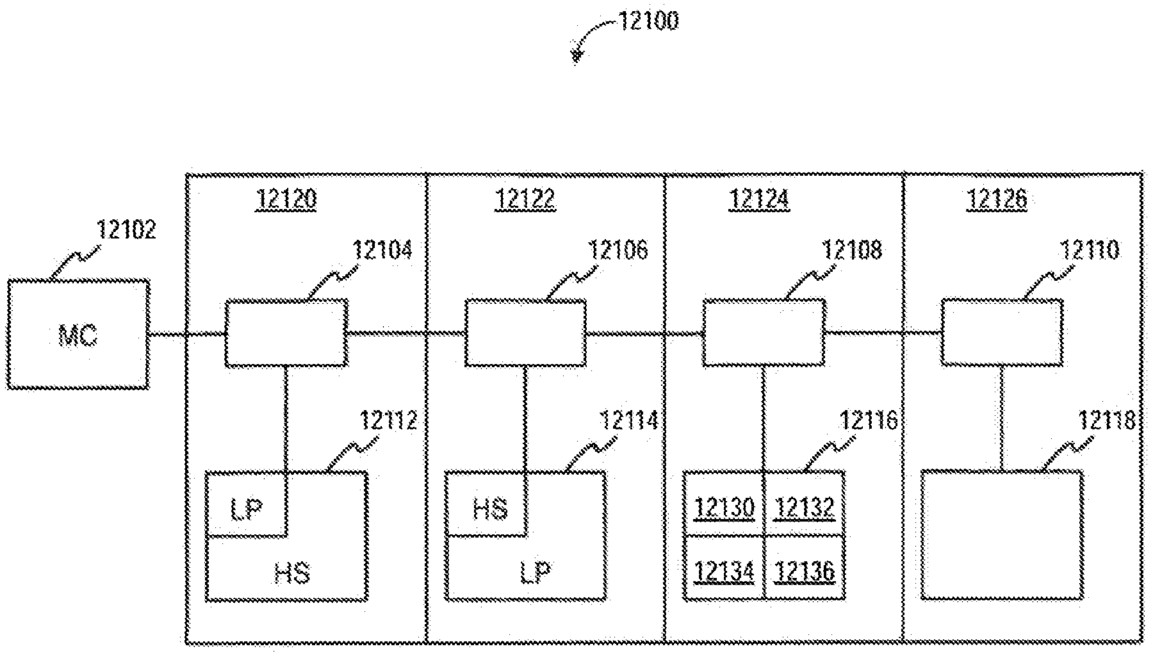

FIG. 121C depicts an embodiment showing a number of partitioned abstracted DIMMs behind intelligent register/buffer chips on a memory system bus.

Figure 122A:
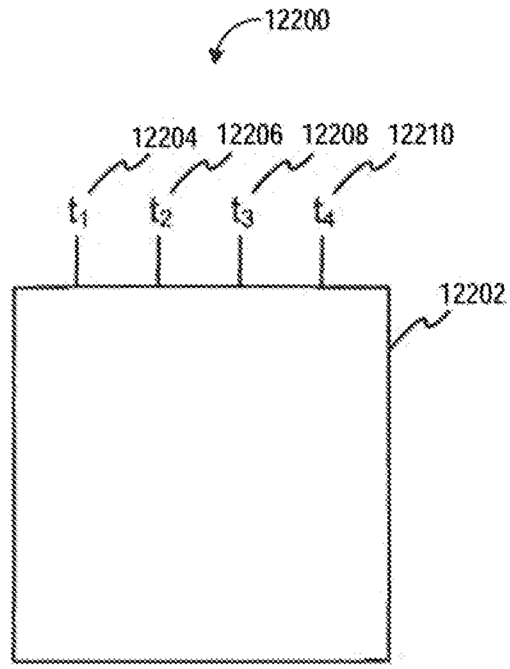
Figure 122B:
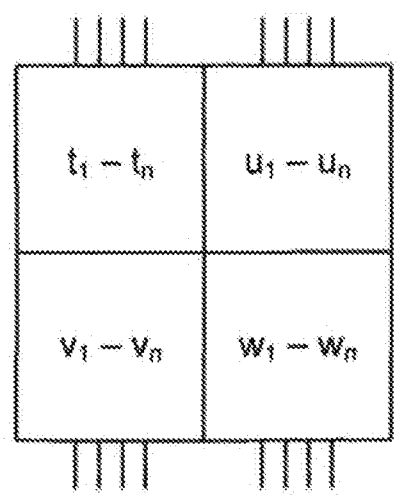

FIGS. 122A and 122B: Depict embodiments showing a number of partitioned abstracted memories using parameters for controlling the characteristics of the abstracted memories.

FIGS. 123A through 123F illustrate a computer platform that includes at least one processing element and at least one abstracted memory module, according to various embodiments of the present invention.

Figure 124A:
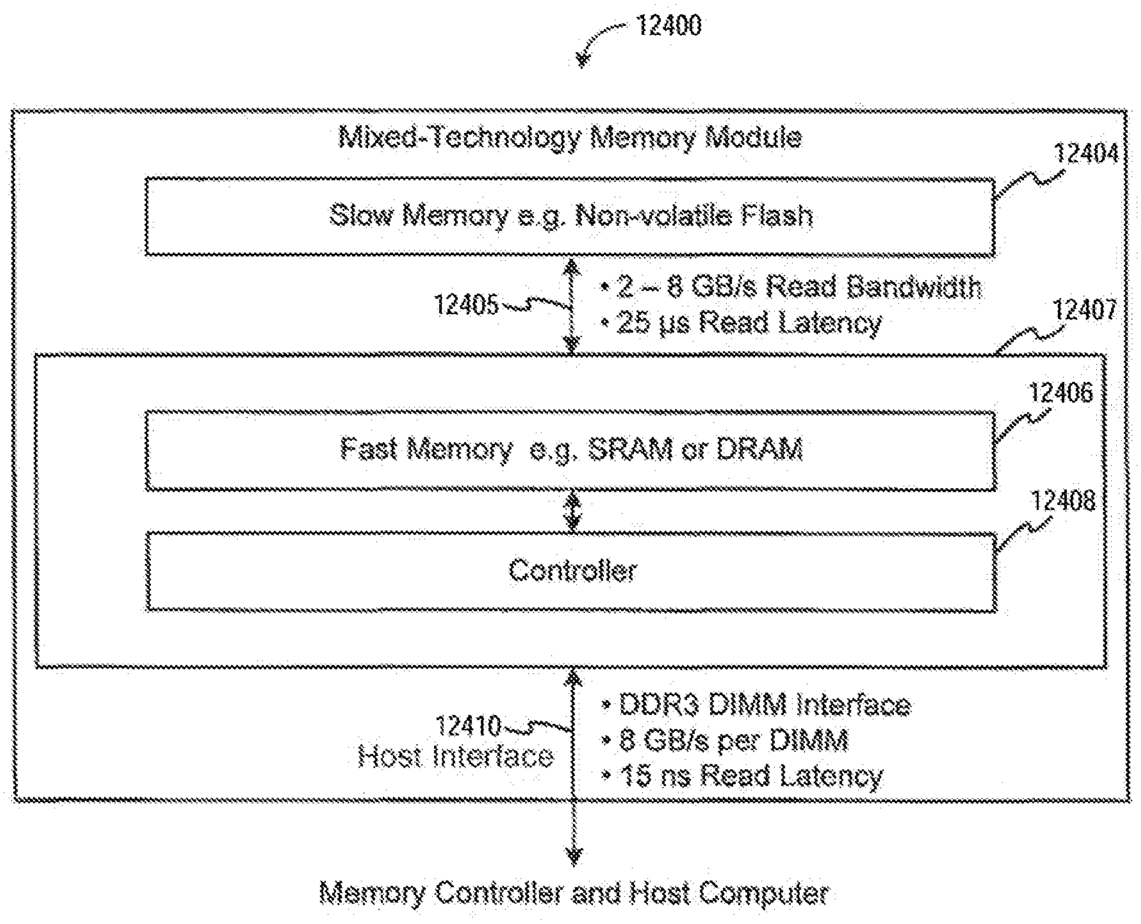

FIG. 124A shows an abstract and conceptual model of a mixed-technology memory module, according to one embodiment.

Figure 124B:
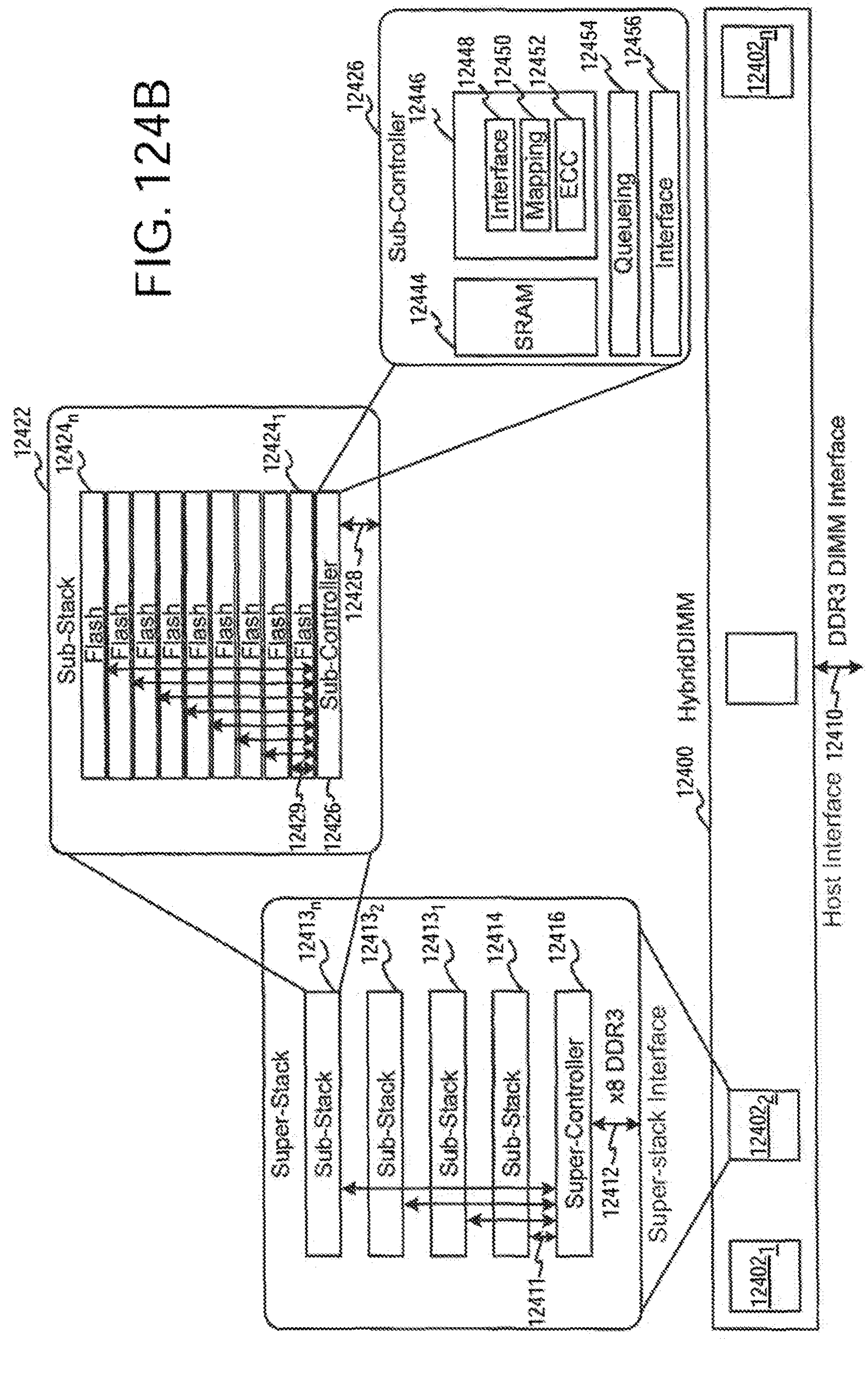

FIG. 124B is an exploded hierarchical view of a logical model of a HybridDIMM, according to one embodiment.

Figure 125:
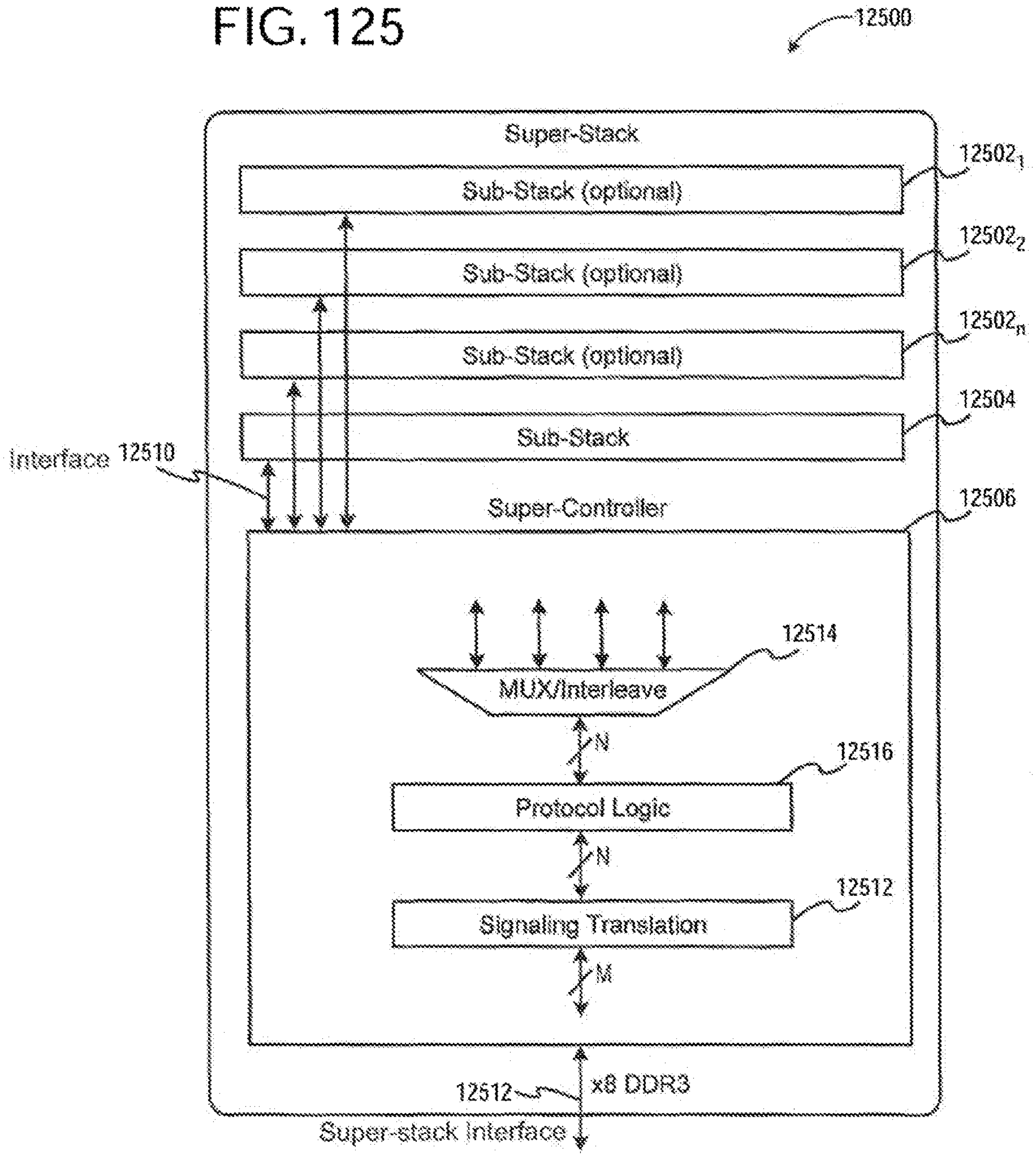

FIG. 125 shows a HybridDIMM Super-Stack with multiple Sub-stacks, according to one embodiment.

Figure 126:
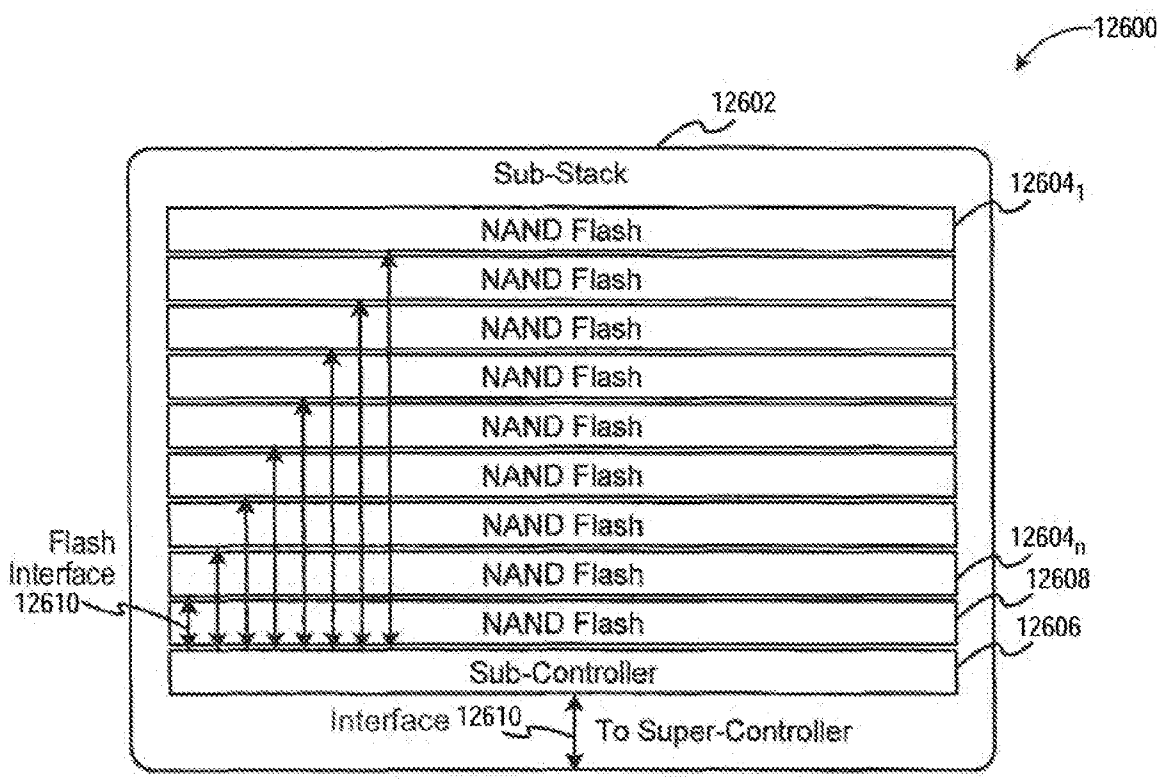

FIG. 126 shows a Sub-Stack showing a Sub-Controller, according to one embodiment.

Figure 127:
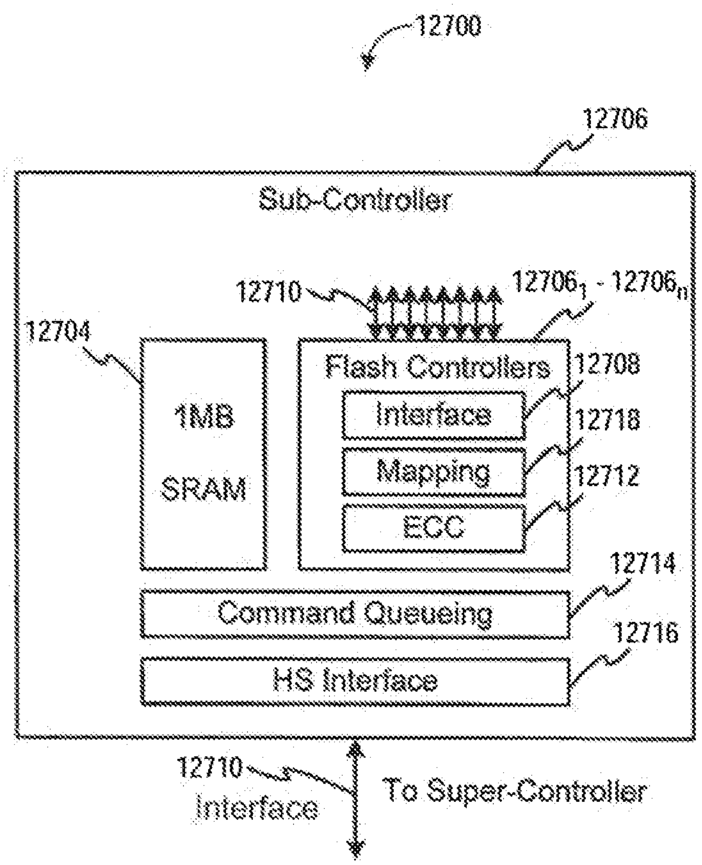

FIG. 127 shows the Sub-Controller, according to one embodiment.

Figure 128:
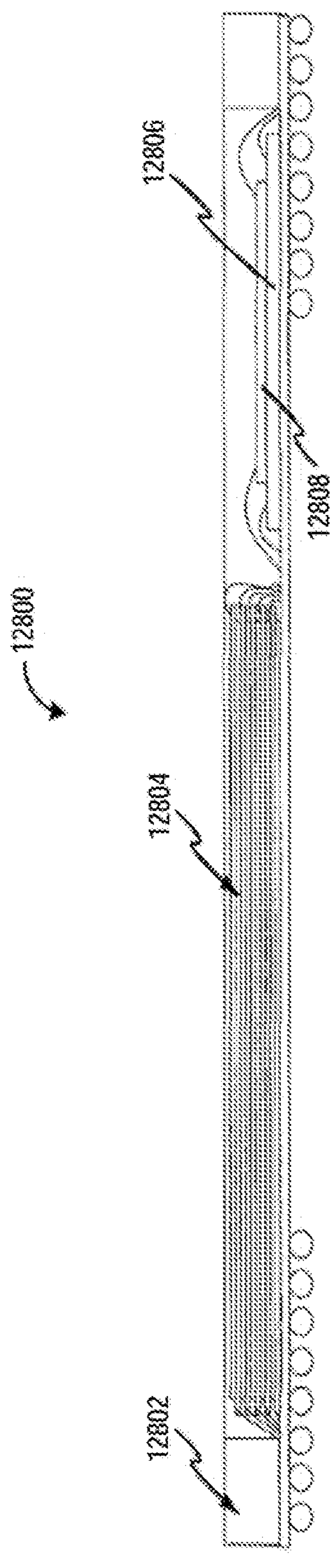

FIG. 128 depicts a physical implementation of a 1-high Super Stack, according to one embodiment.

Figure 129A:
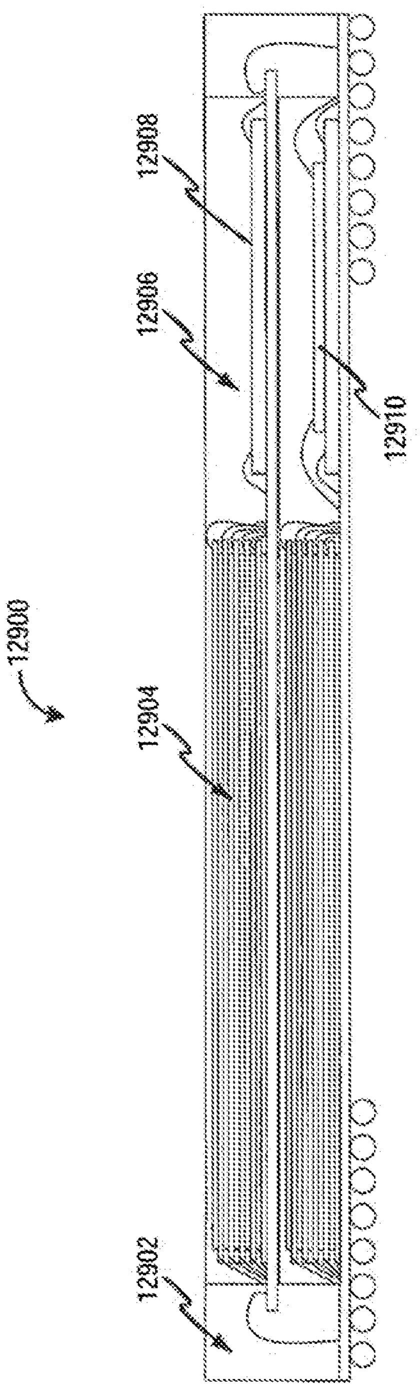

FIG. 129A depicts a physical implementation of 2-high Super-Stacks, according to one embodiment.

Figure 129B:
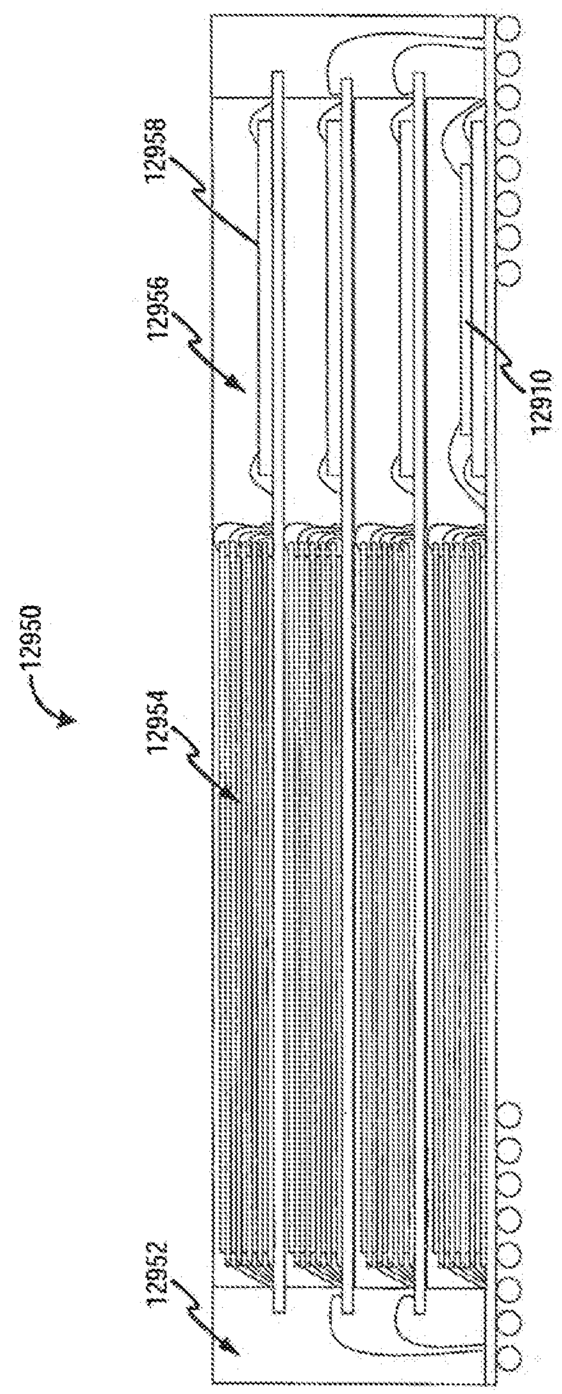

FIG. 129B depicts a physical implementation of a 4-high Super-Stack, according to one embodiment.

Figure 130:
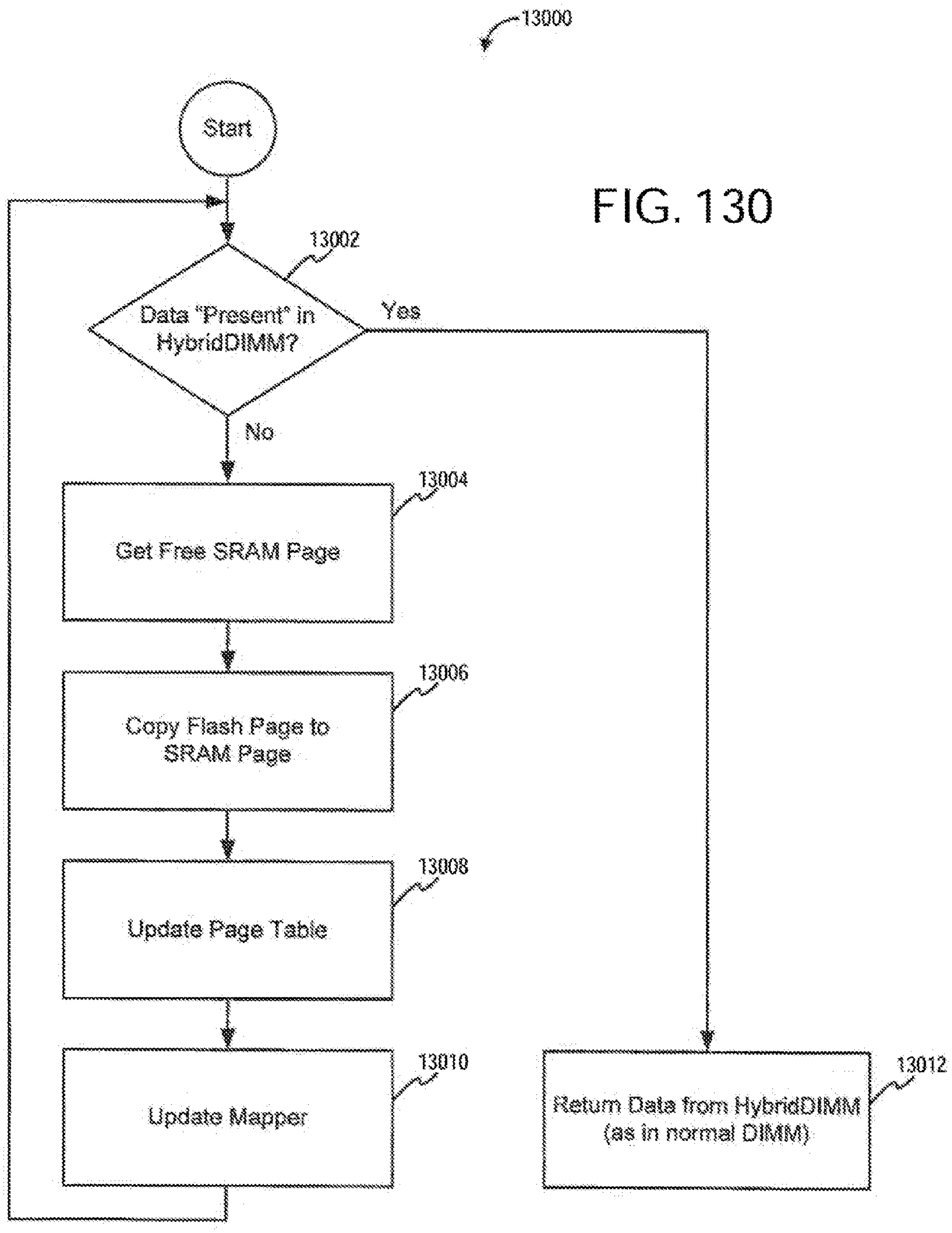

FIG. 130 shows a method of retrieving data from a HybridDIMM, according to one embodiment.

Figure 131A:
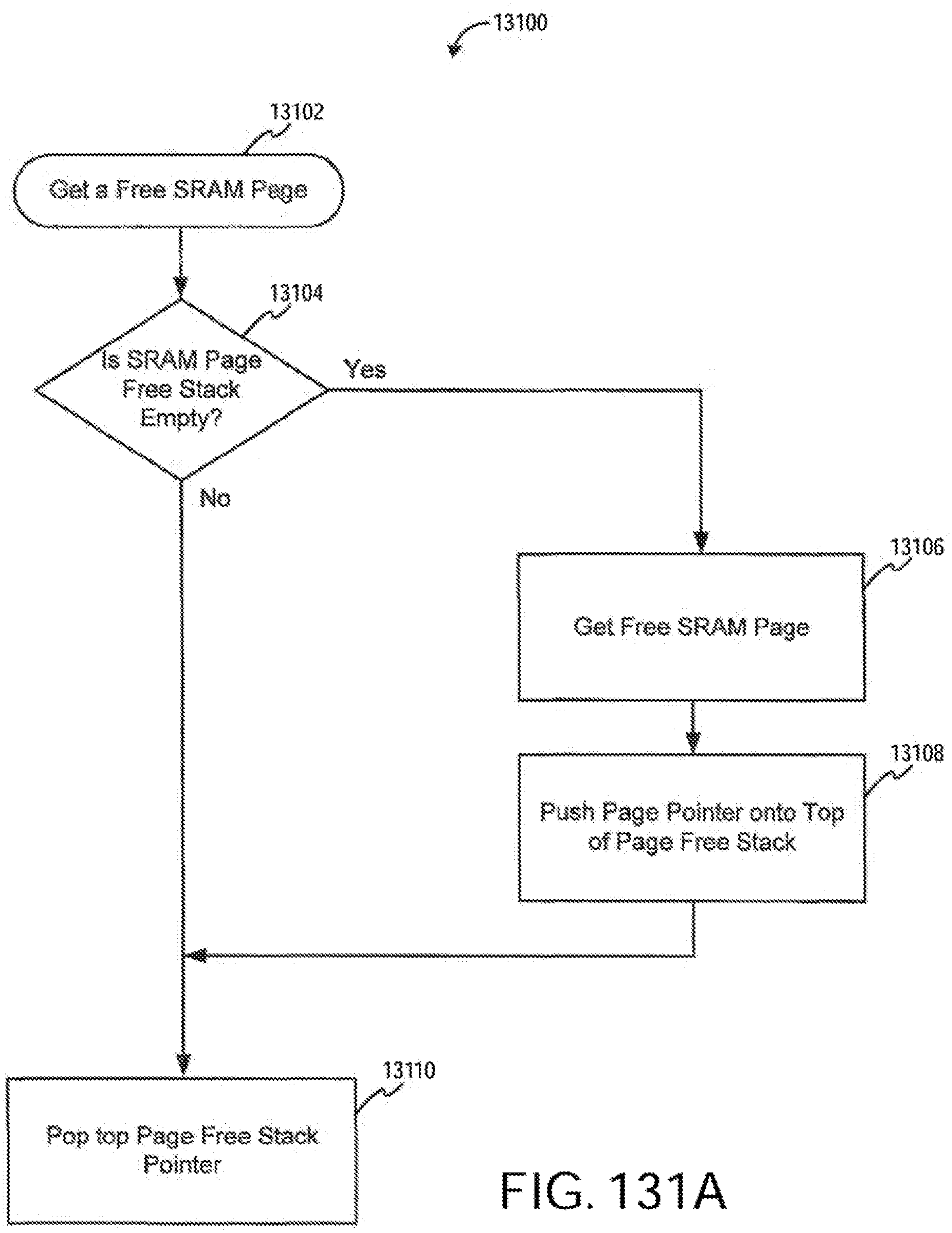

FIG. 131A shows a method of managing SRAM pages on a HybridDIMM, according to one embodiment.

Figure 131B:
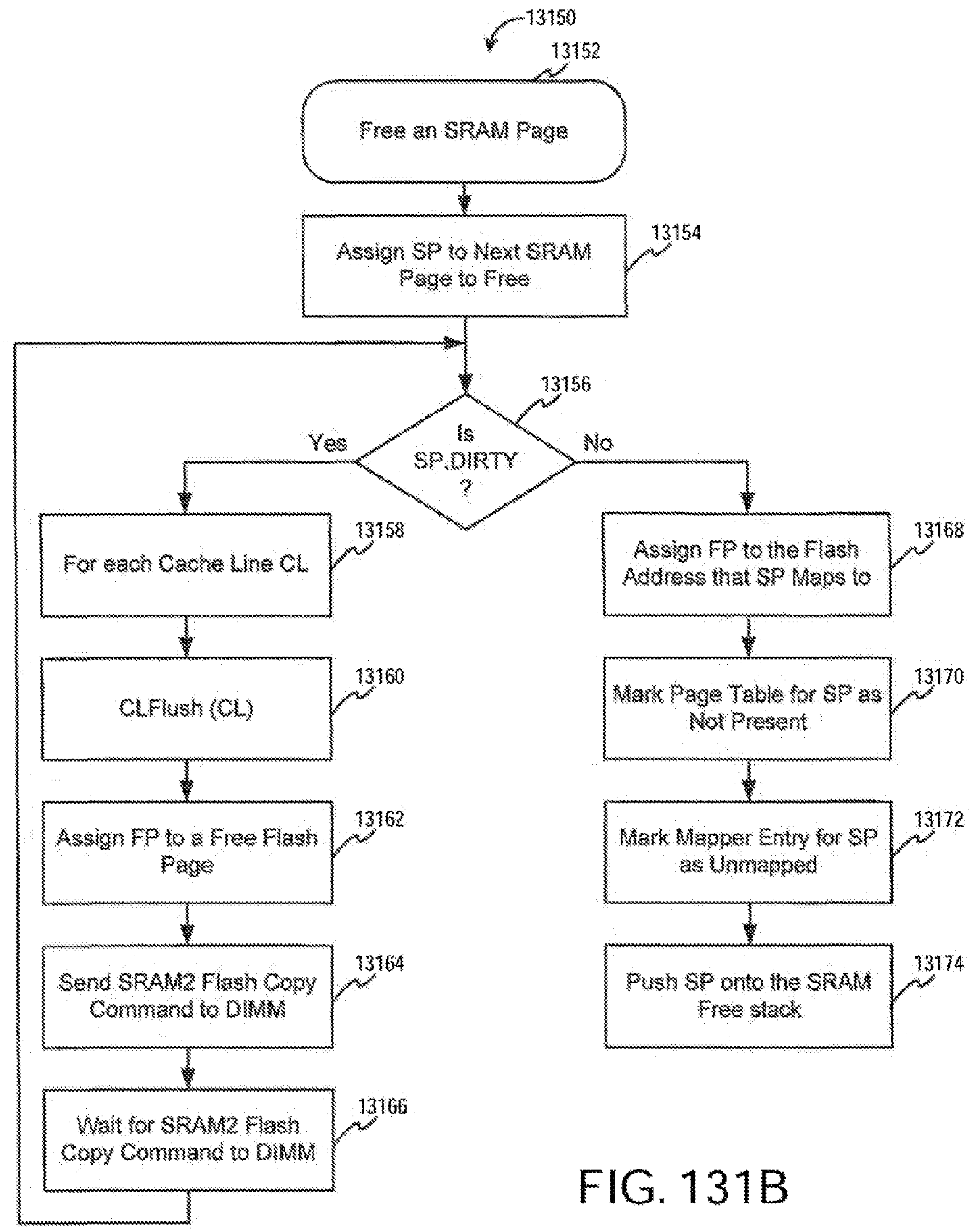

FIG. 131B shows a method of freeing SRAM pages on a HybridDIMM, according to one embodiment.

Figure 132:
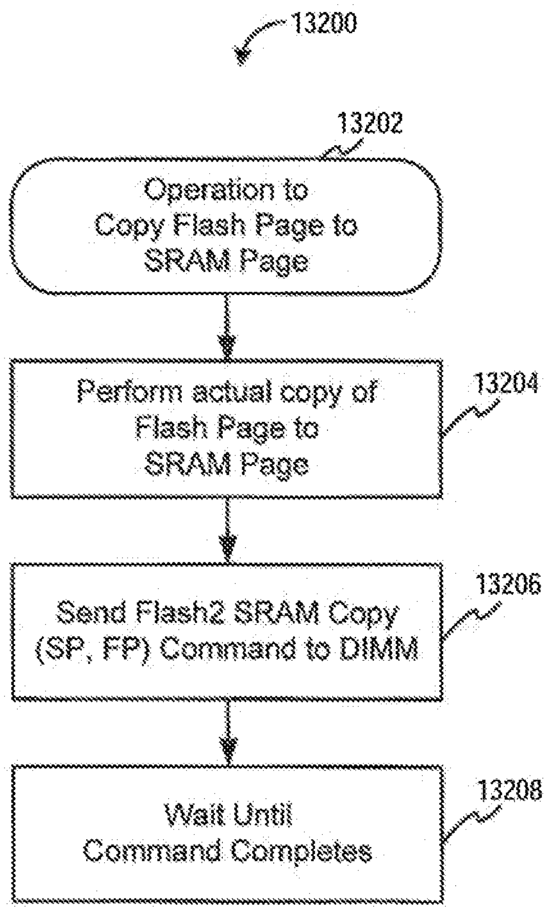

FIG. 132 shows a method of copying a flash page to an SRAM page on a HybridDIMM, according to one embodiment.

Figure 133:
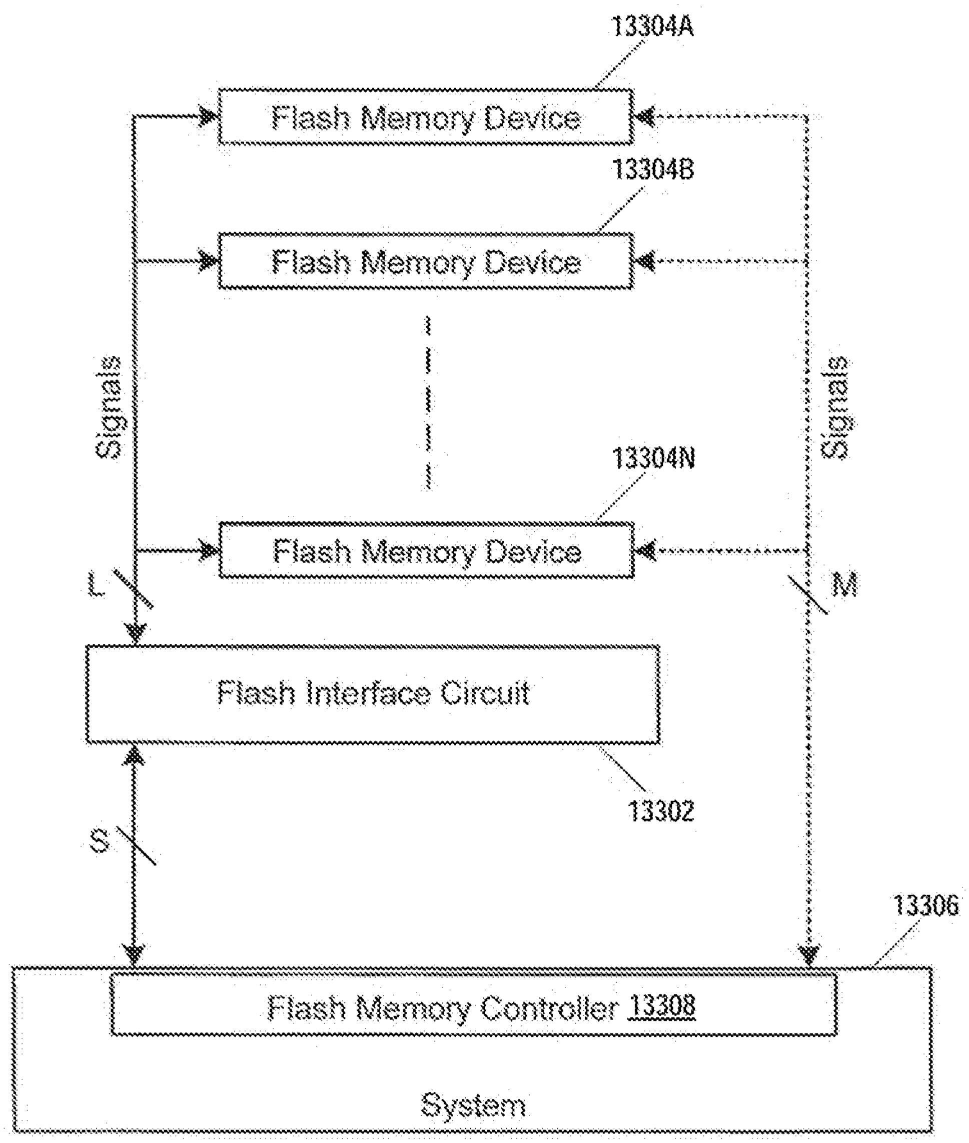

FIG. 133 illustrates a block diagram of one embodiment of multiple flash memory devices connected to a flash interface circuit.

Figure 134:
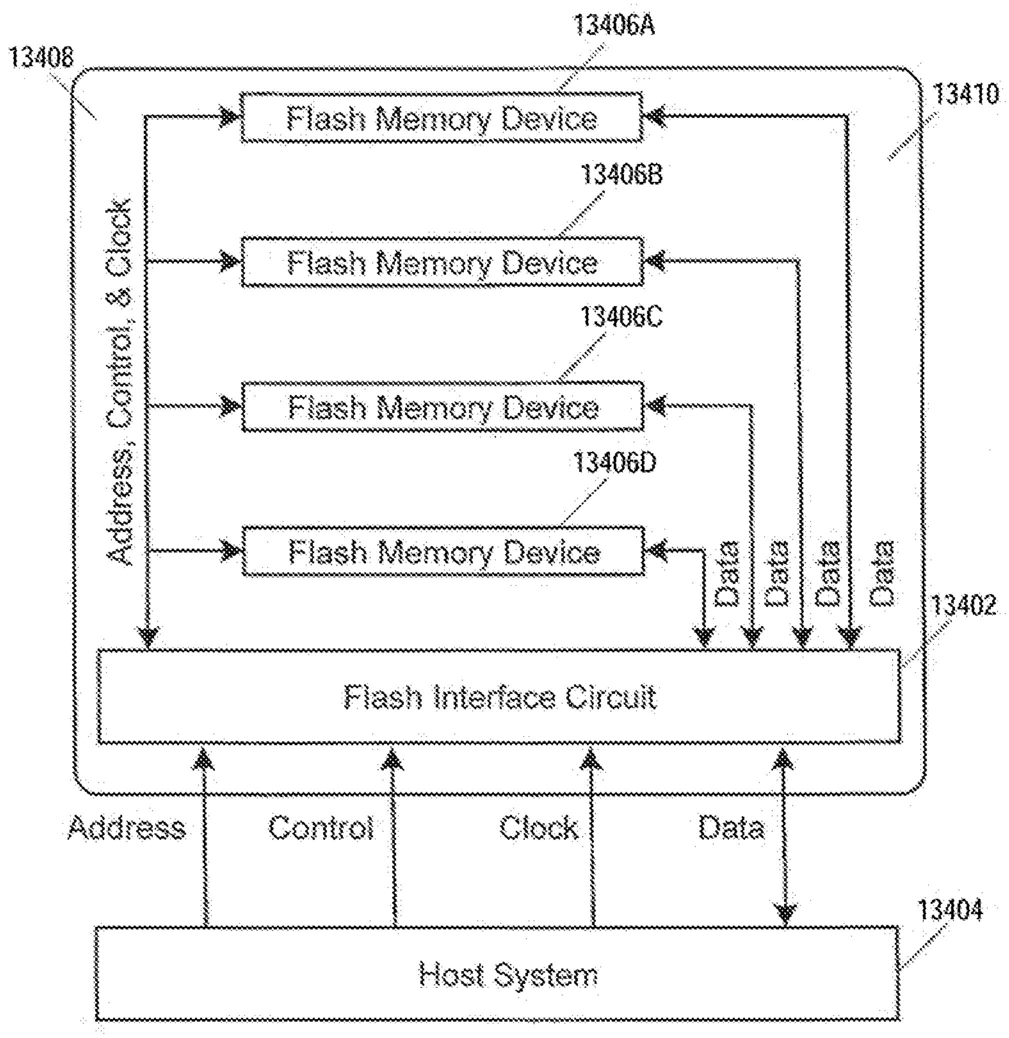

FIG. 134 illustrates the detailed connections between a flash interface circuit and flash memory devices for one embodiment.

Figure 135:
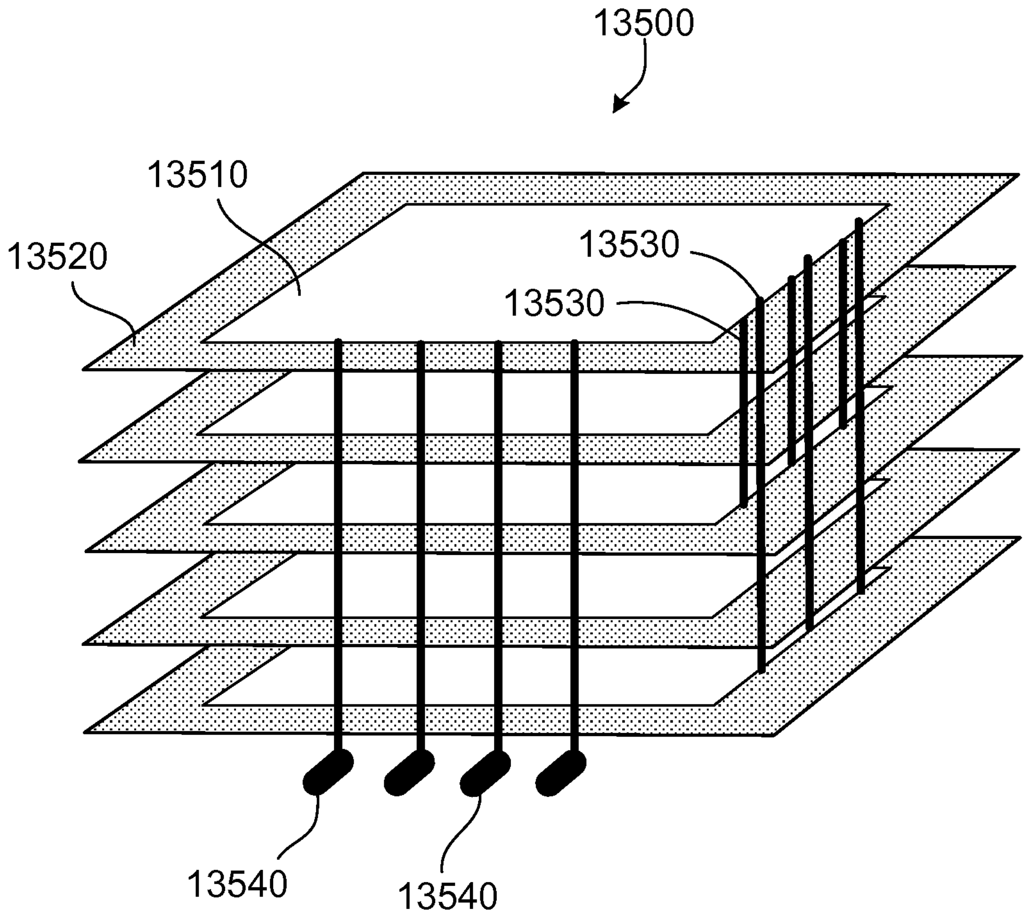

FIG. 135 illustrates stacked assemblies having edge connections for one embodiment.

Figure 136:
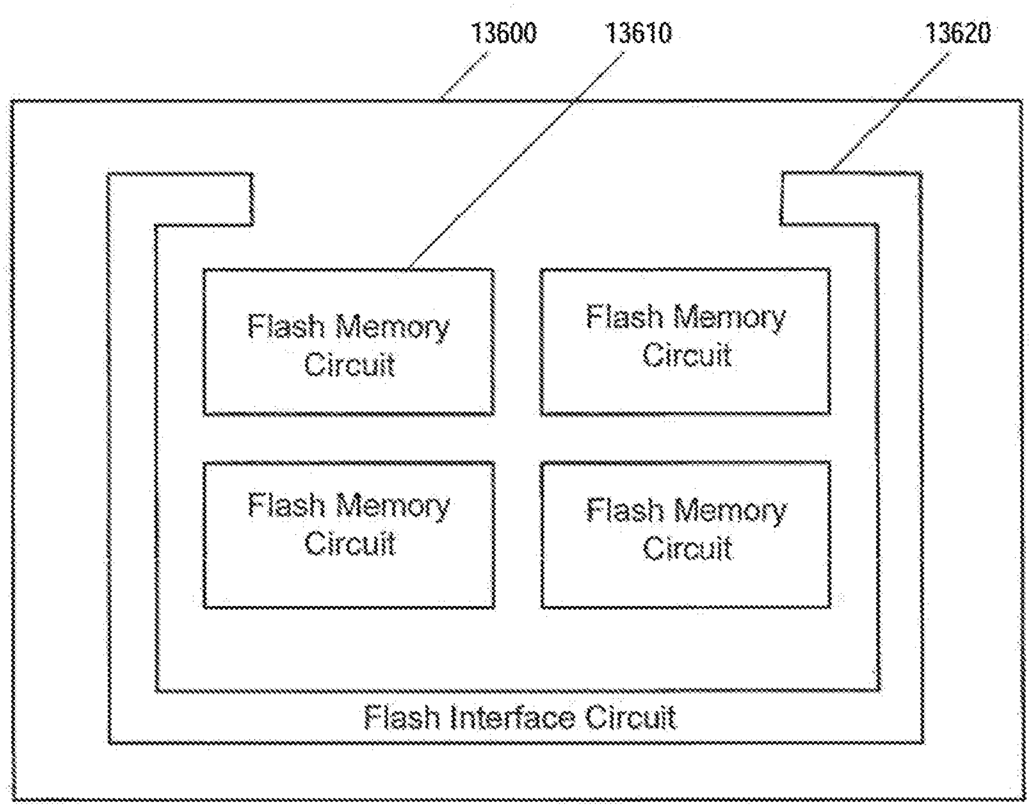

FIG. 136 illustrates one embodiment of a single die having a flash interface circuit and one or more flash memory circuits.

Figure 137:
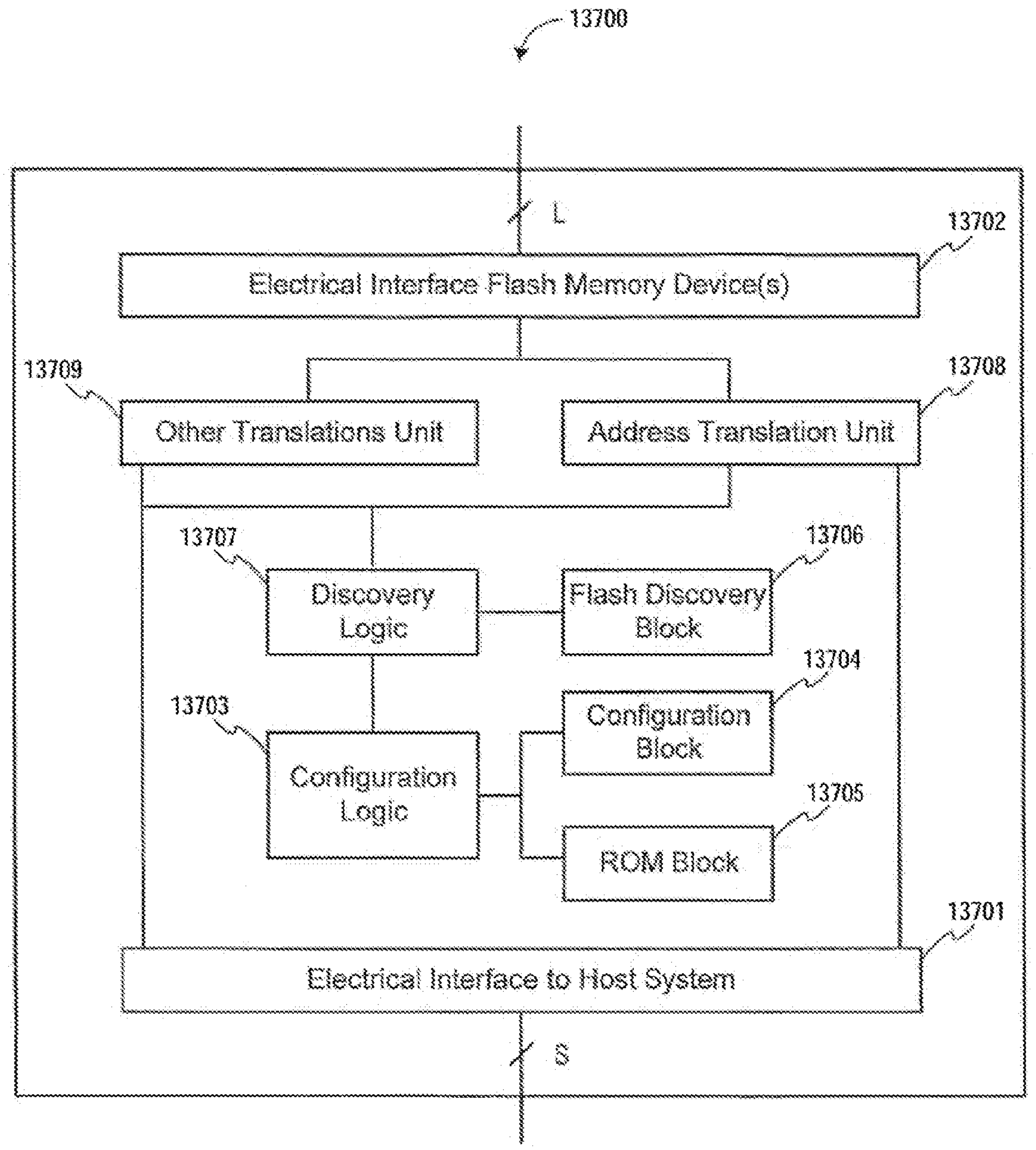

FIG. 137 illustrates an exploded view of one embodiment of a flash interface circuit.

Figure 138:
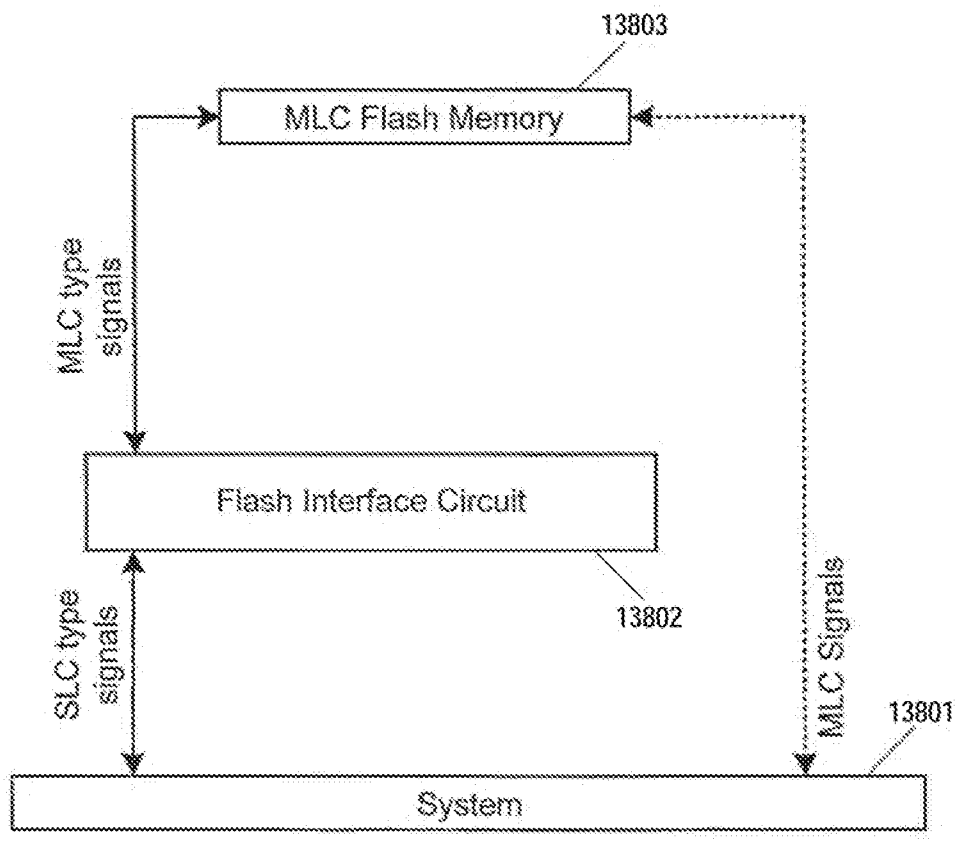

FIG. 138 illustrates a block diagram of one embodiment of one or more MLC-type flash memory devices presented to the system as an SLC-type flash memory device through a flash interface circuit.

FIG. 139 illustrates one embodiment of a configuration block.

FIG. 140 illustrates one embodiment of a ROM block.

FIG. 141 illustrates one embodiment of a flash discovery block.

Figure 142:
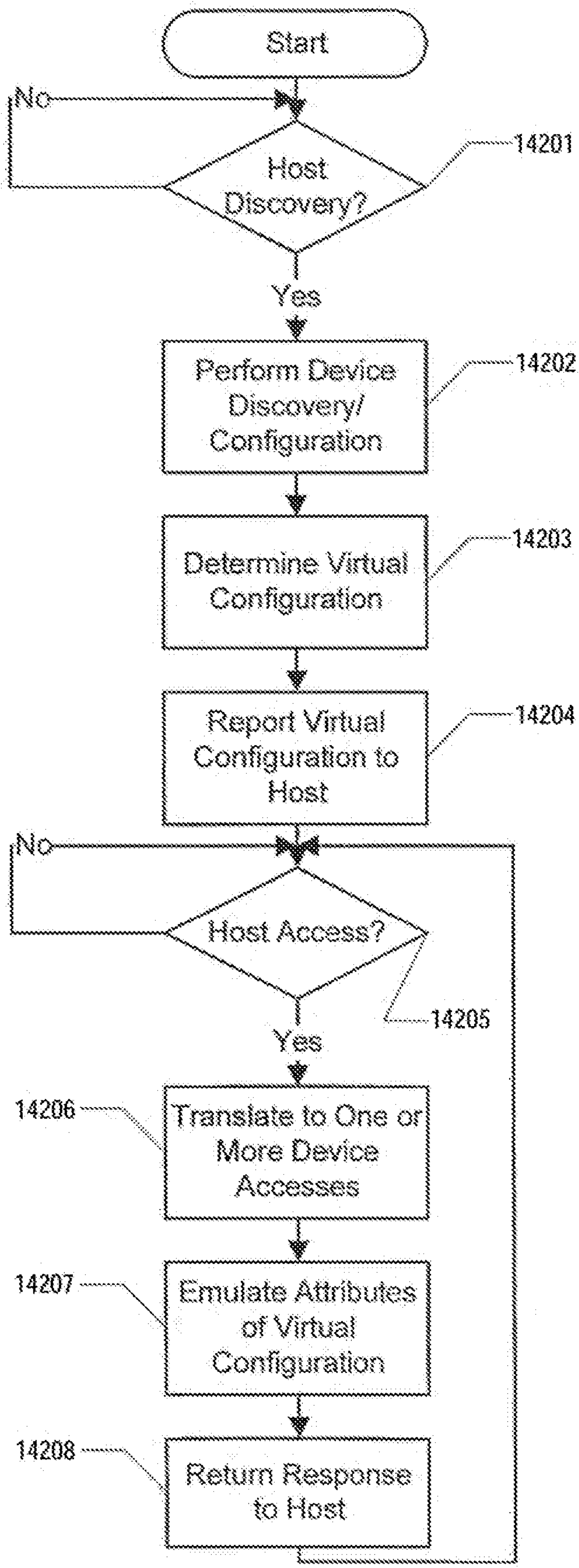

FIG. 142 is a flowchart illustrating one embodiment of a method of emulating one or more virtual flash memory devices using one or more physical flash memory devices having at least one differing attribute.

Figure 143A:
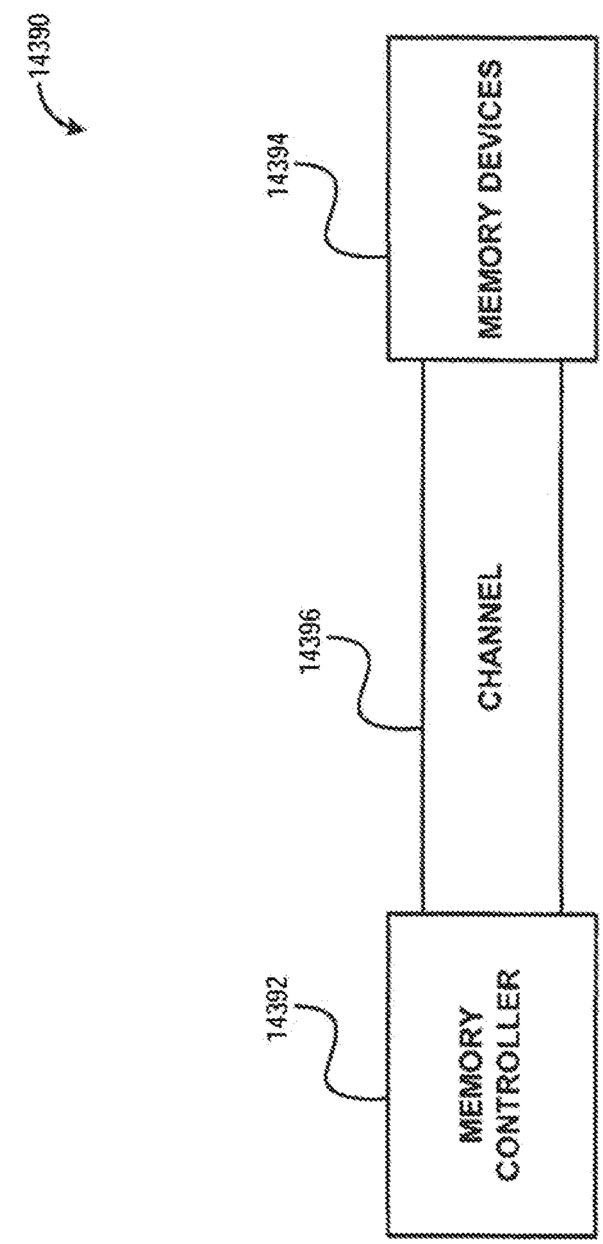

FIG. 143A shows a system for providing electrical communication between a memory controller and a plurality of memory devices, in accordance with one embodiment.

Figure 143B:
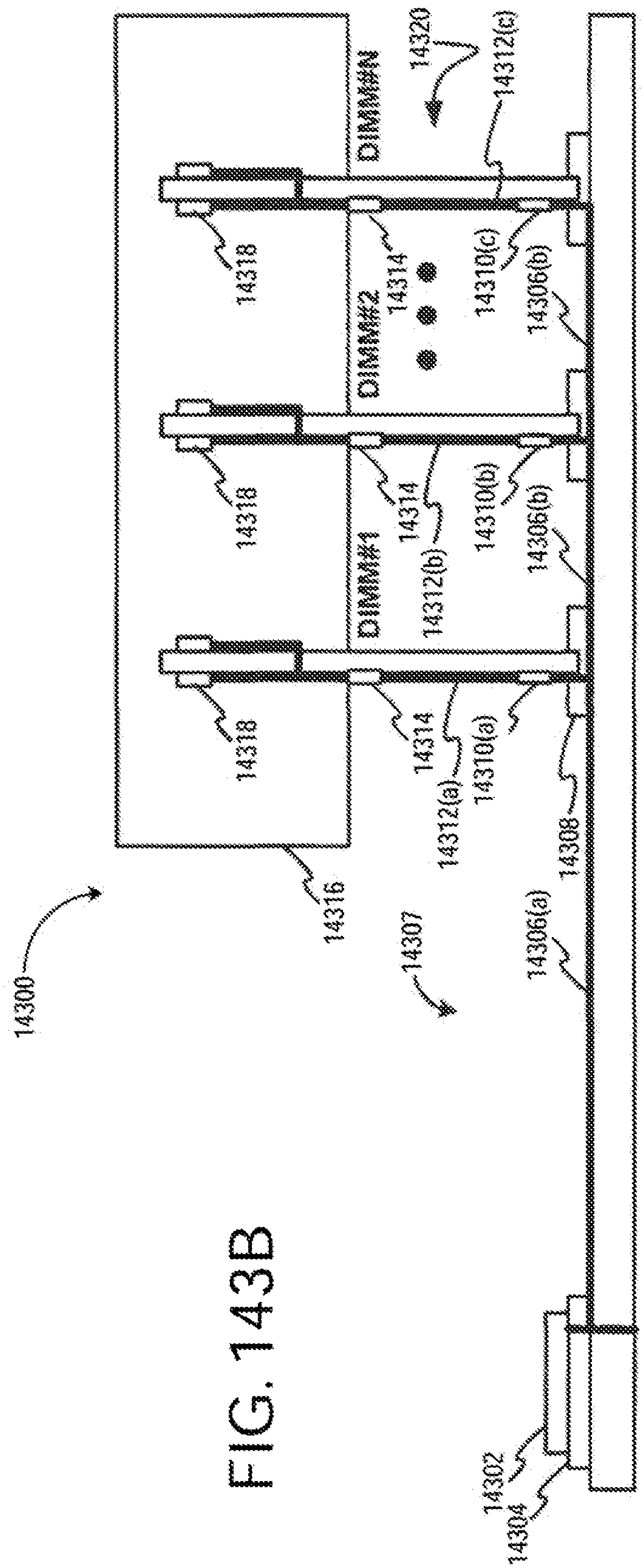

FIG. 143B shows a system for providing electrical communication between a host controller chip package and one or more memory devices.

Figure 143C:
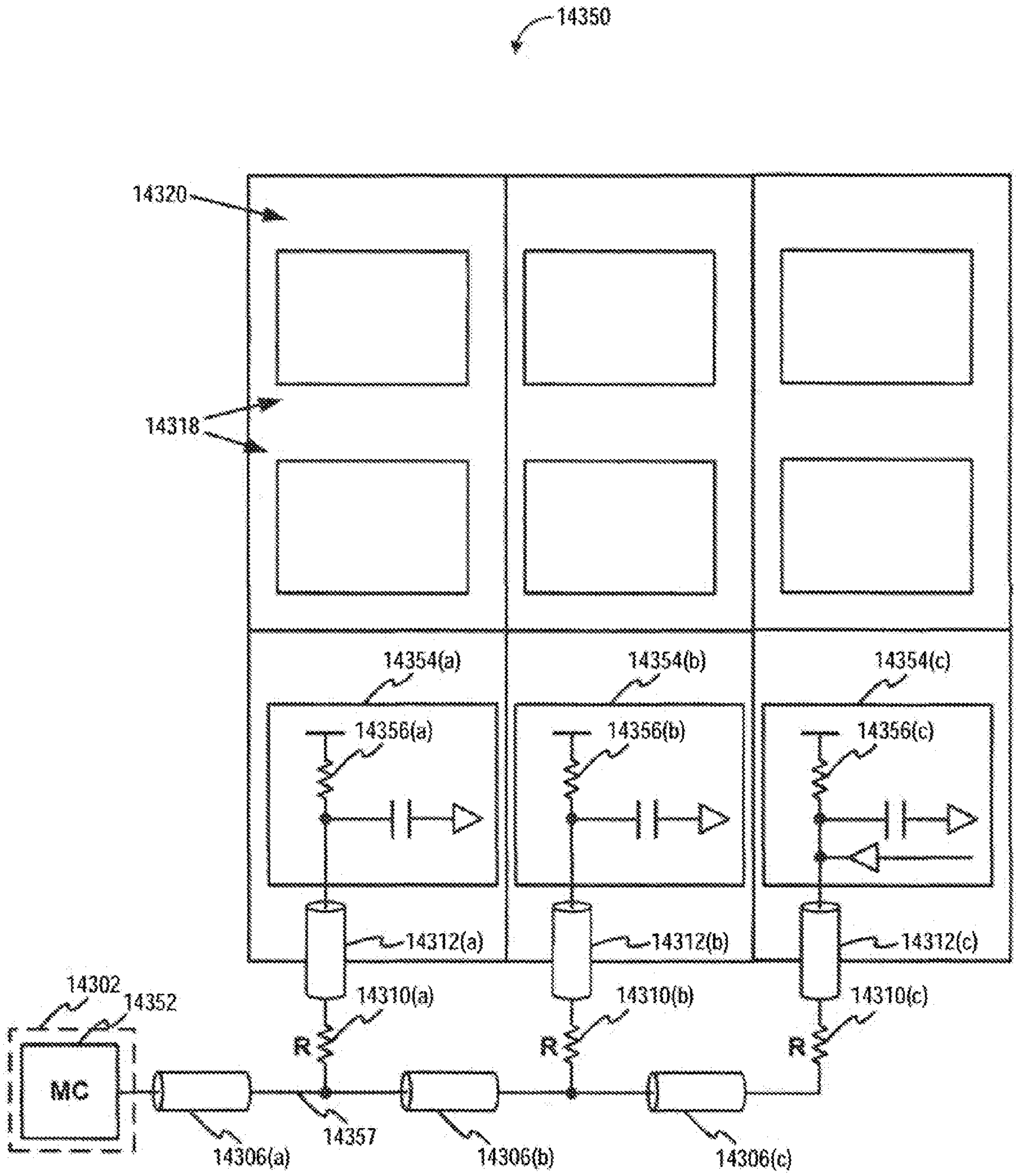

FIG. 143C illustrates a system corresponding to a schematic representation of the topology and interconnects for FIG. 143B.

Figure 144A:
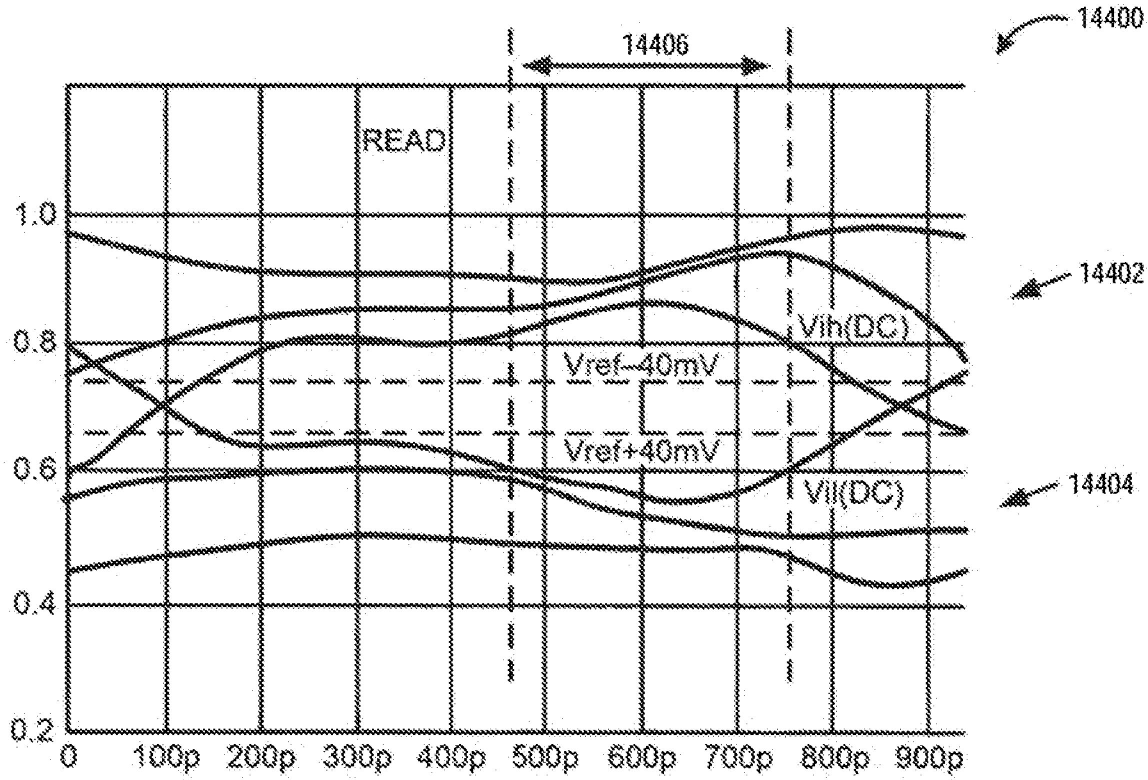

FIG. 144A shows an eye diagram of a data read cycle associated with the prior art.

Figure 144B:
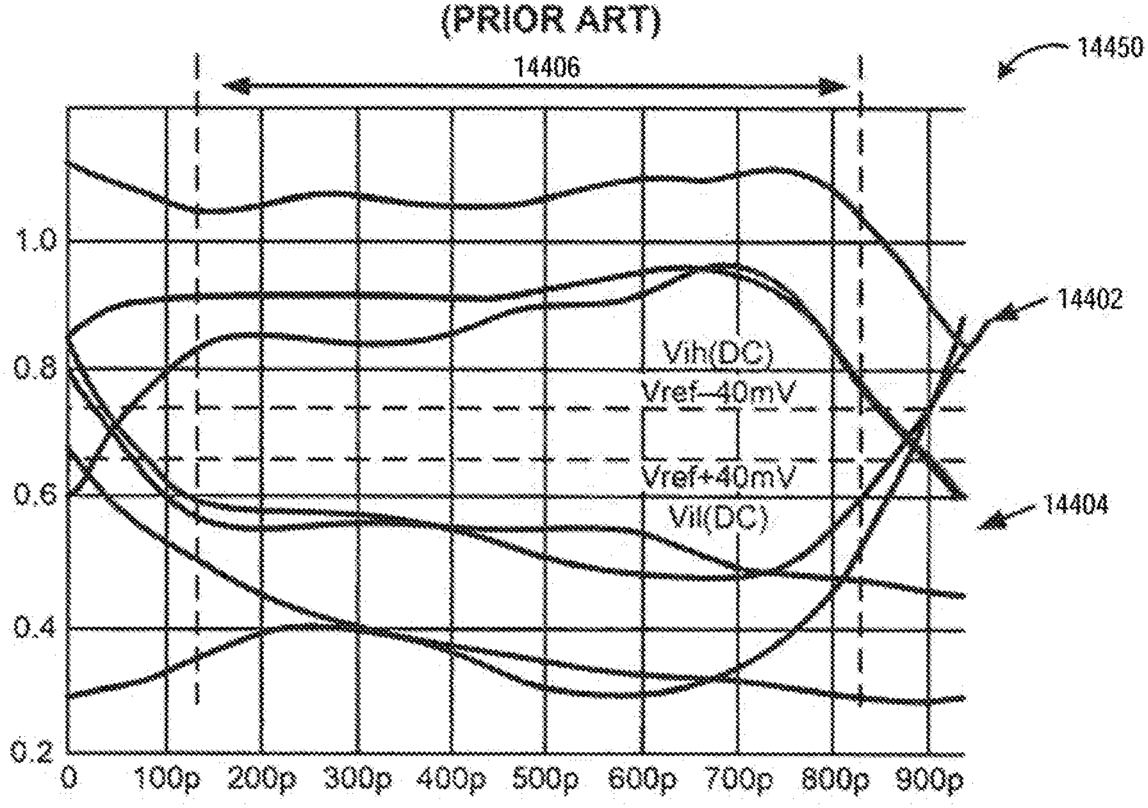

FIG. 144B shows an eye diagram of a data read cycle, in accordance with one embodiment.

Figure 145A:
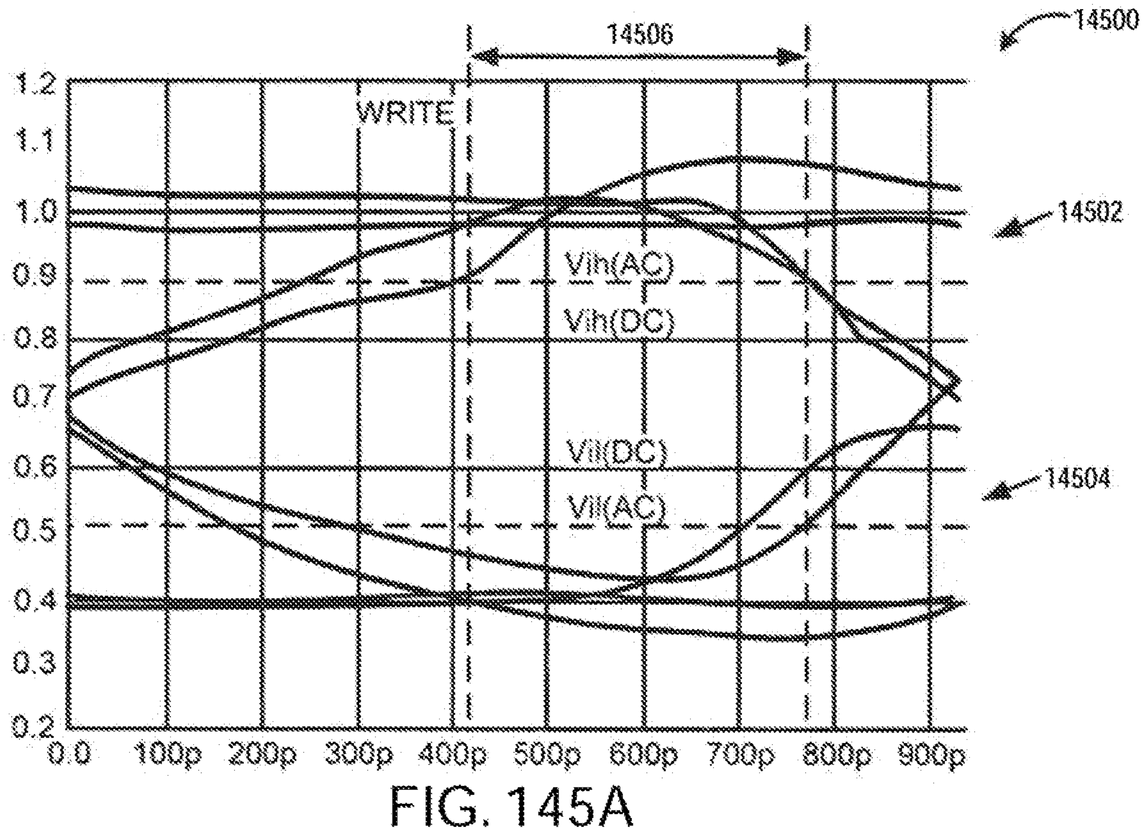

FIG. 145A shows an eye diagram of a data write cycle associated with the prior art.

Figure 145B:
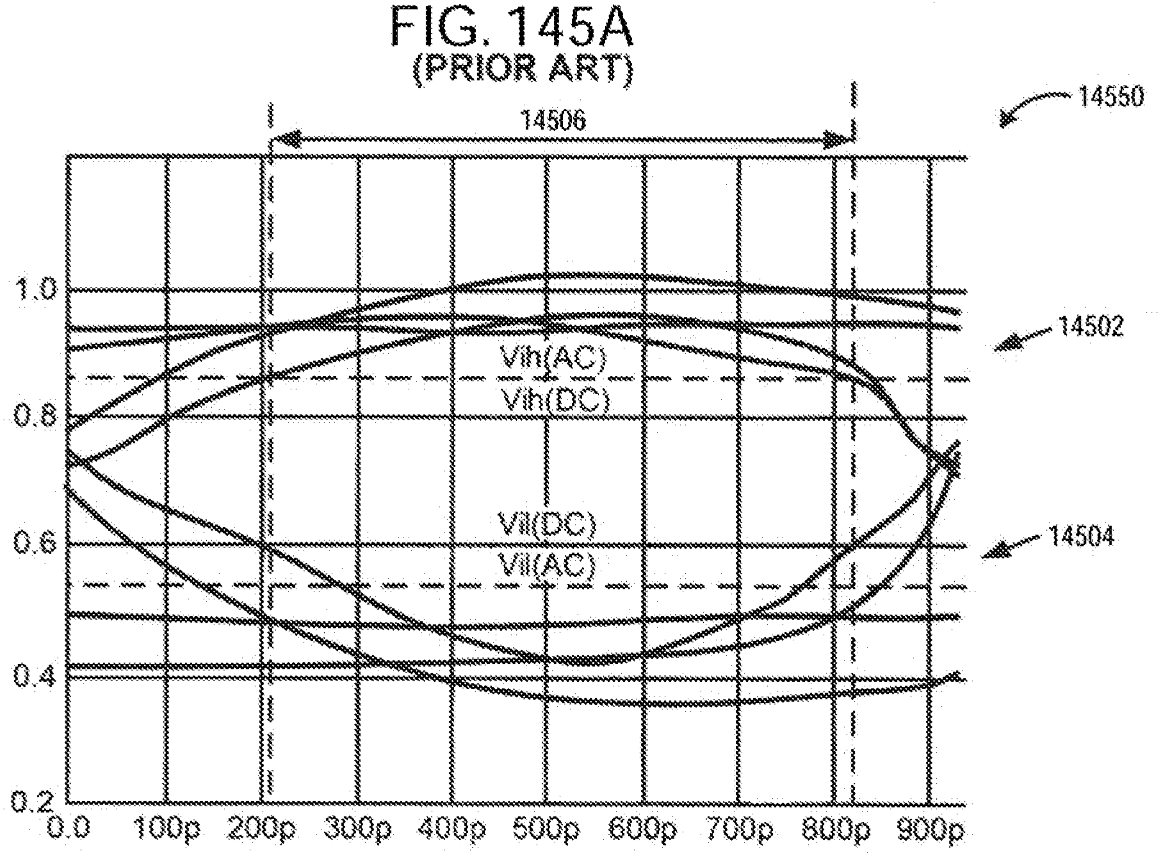

FIG. 145B shows an eye diagram of a data write cycle, in accordance with one embodiment.

Figure 146A:
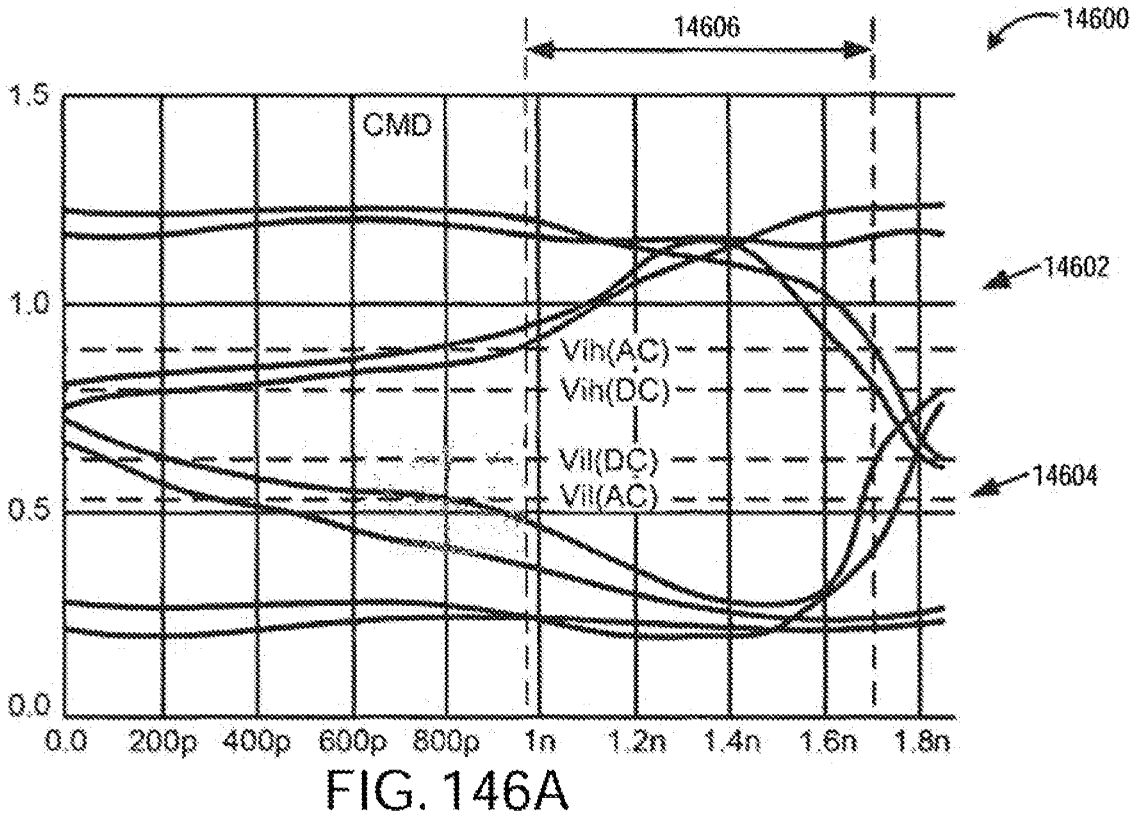

FIG. 146A shows an eye diagram of a command/address (CMD/ADDR) cycle associated with the prior art.

Figure 146B:
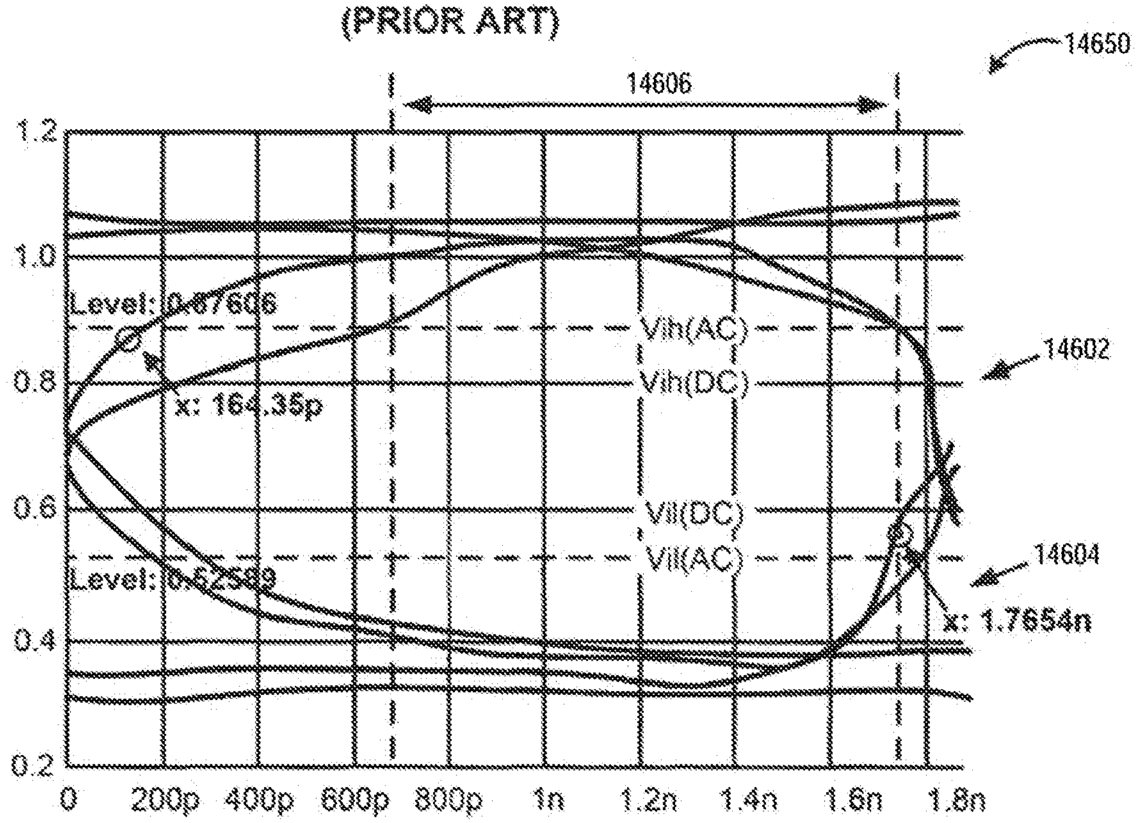

FIG. 146B shows an eye diagram of a CMD/ADDR cycle, in accordance with one embodiment.

Figure 147A:
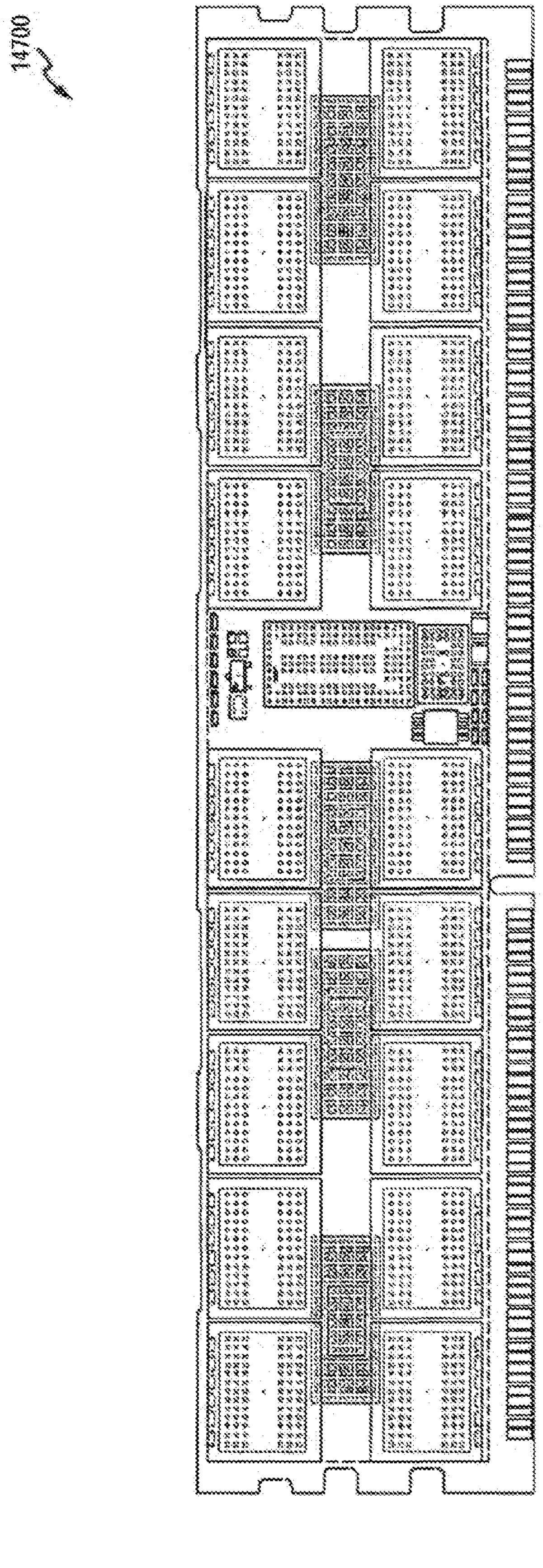
Figure 147B:
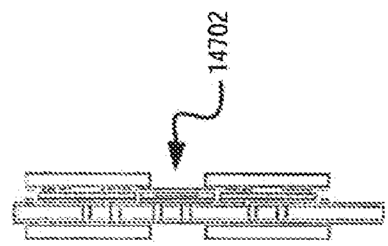

FIGS. 147A and 147B depict a memory module (e.g. a DIMM) and a corresponding buffer chip, in accordance with one embodiment.

Figure 148:
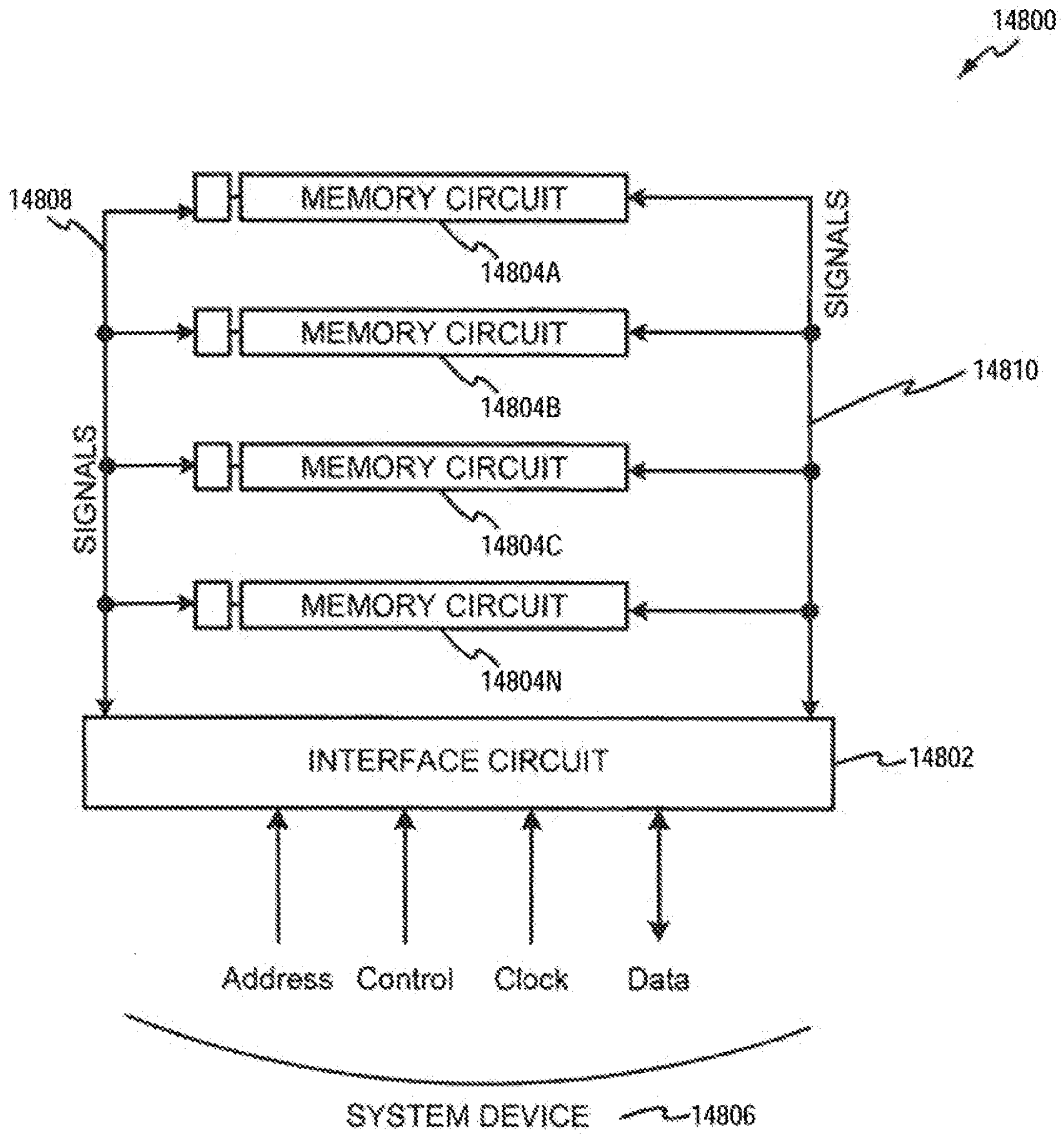

FIG. 148 shows a system including a system device coupled to an interface circuit and a plurality of memory circuits, in accordance with one embodiment.

Figure 149:
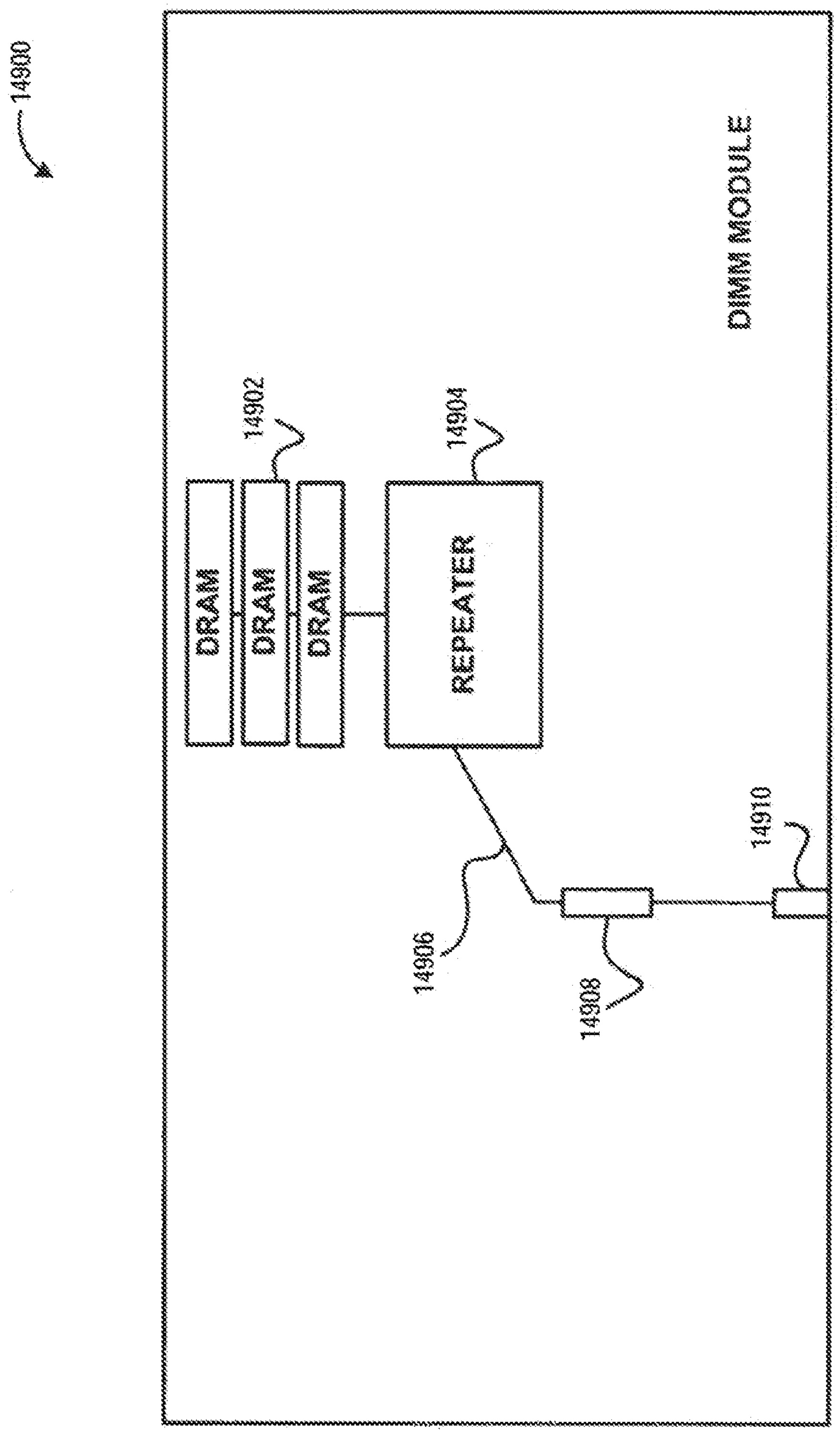

FIG. 149 shows a DIMM, in accordance with one embodiment.

Figure 150:
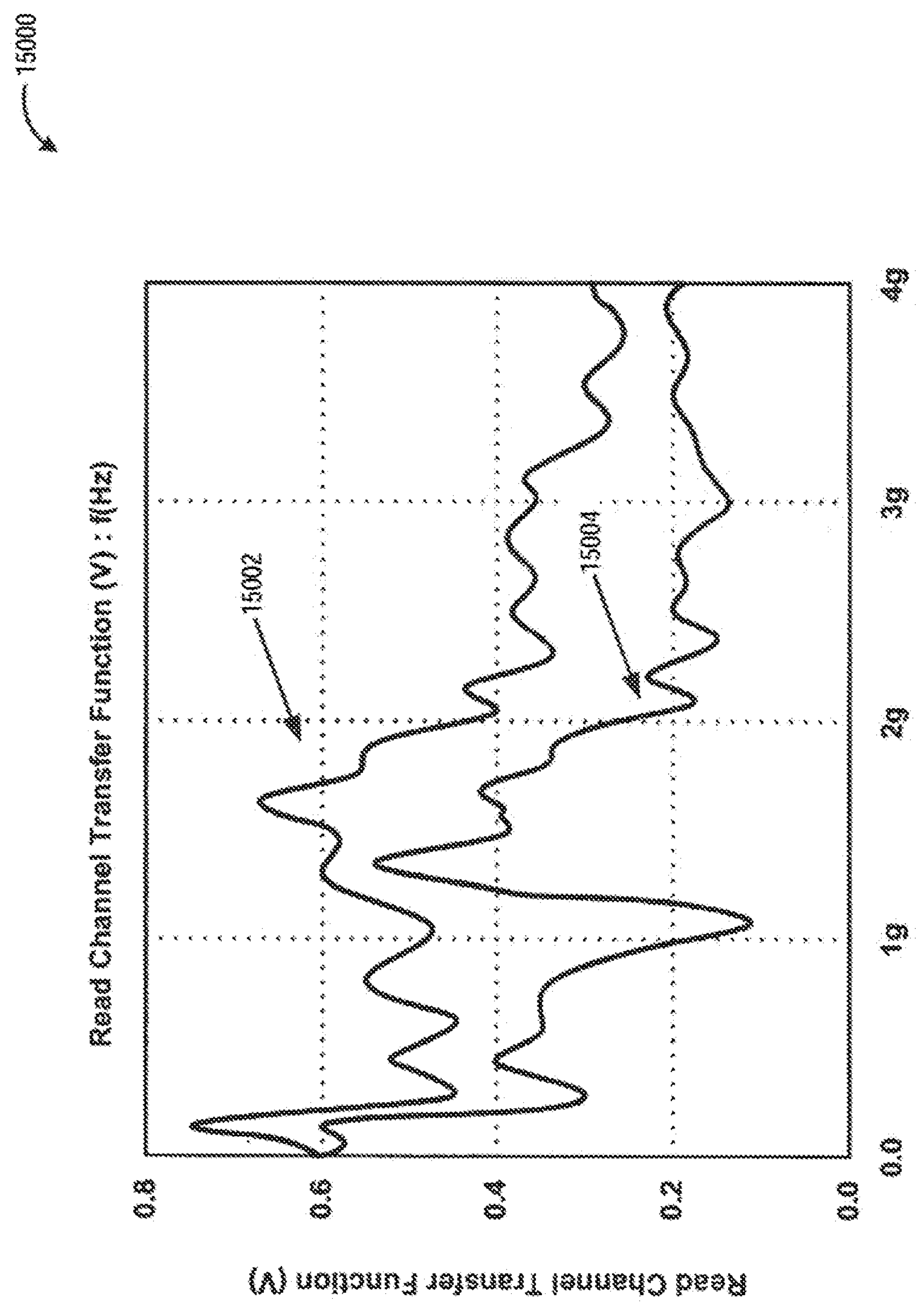

FIG. 150 shows a graph of a transfer function of a read channel, in accordance with one embodiment.

FIGS. 151A-F are block diagrams of example computer systems.

Figure 152:
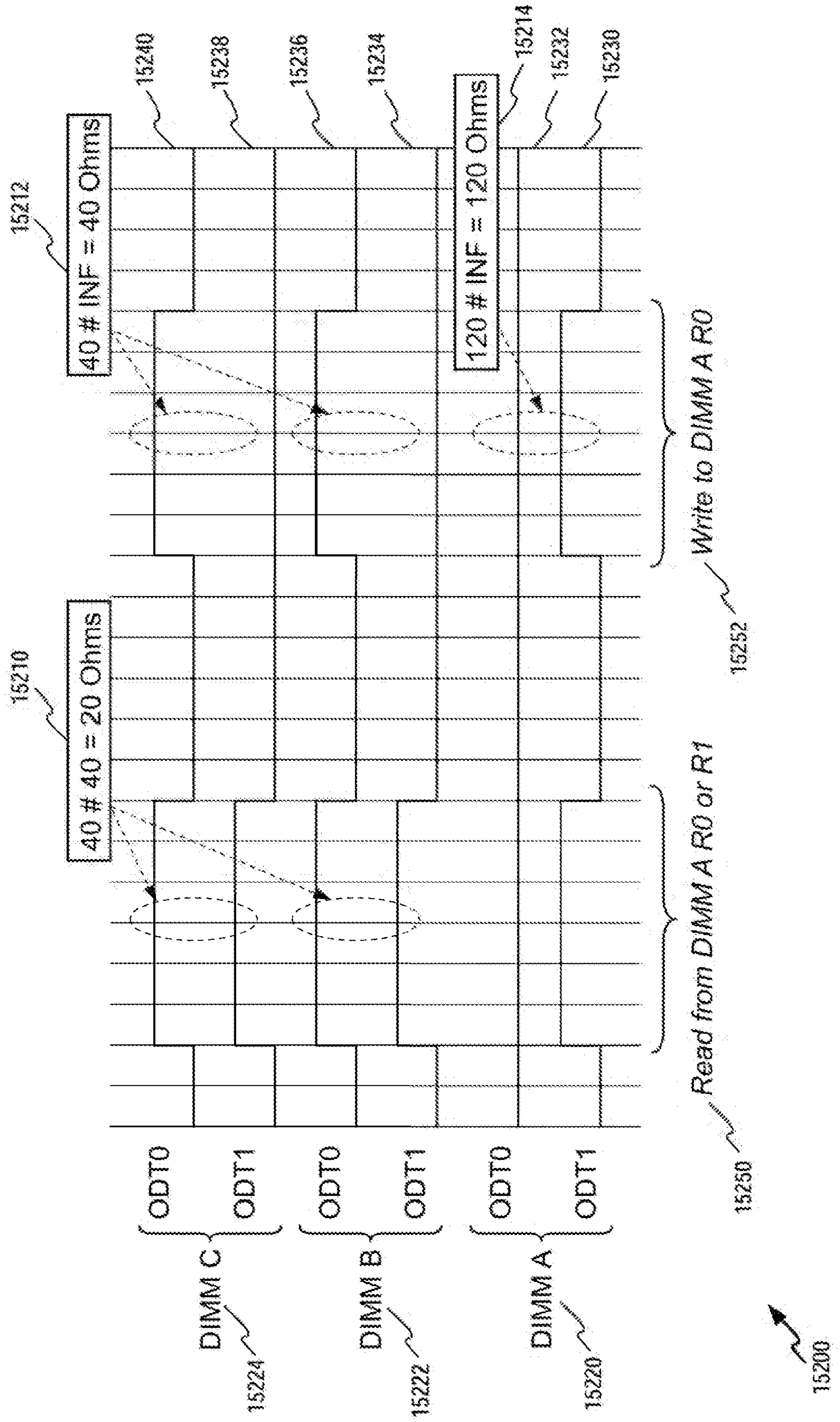

FIG. 152 is an example timing diagram for a 3-DIMMs per channel (3DPC) configuration.

Figure 153A:
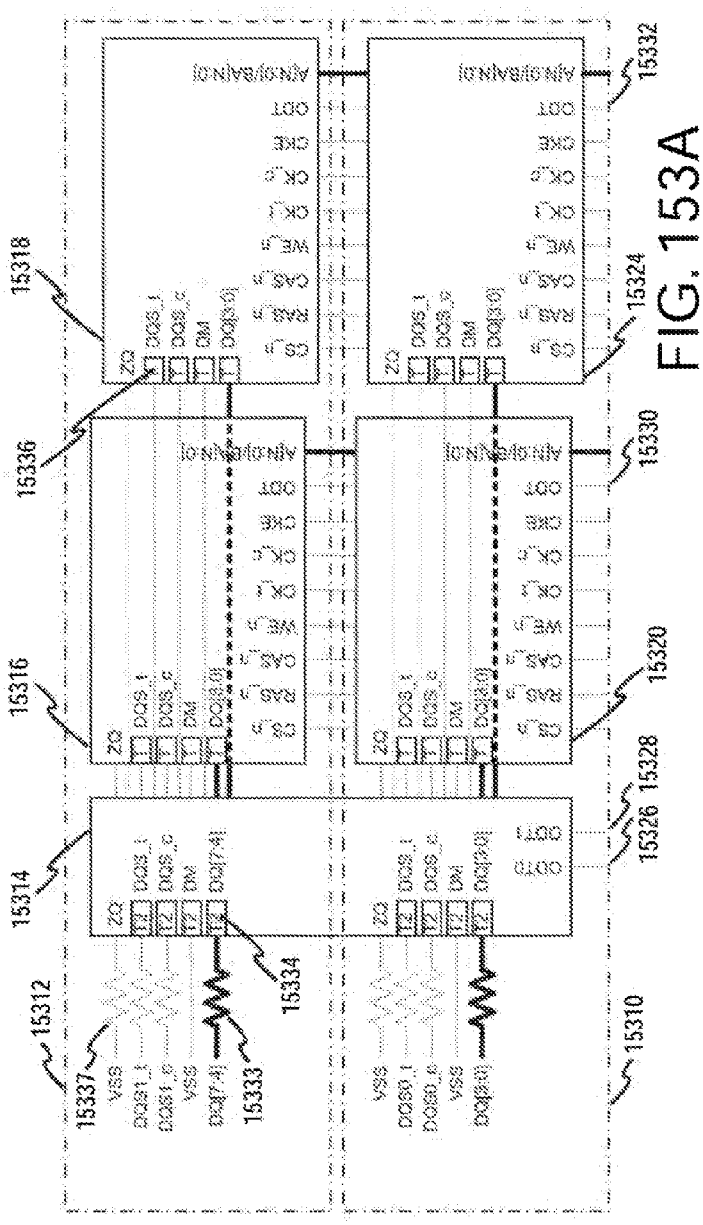
Figure 153B:
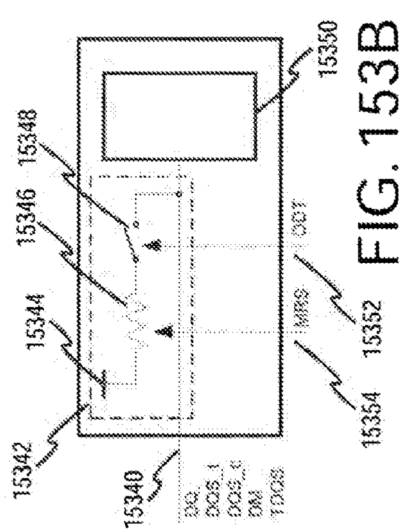
Figure 153C:
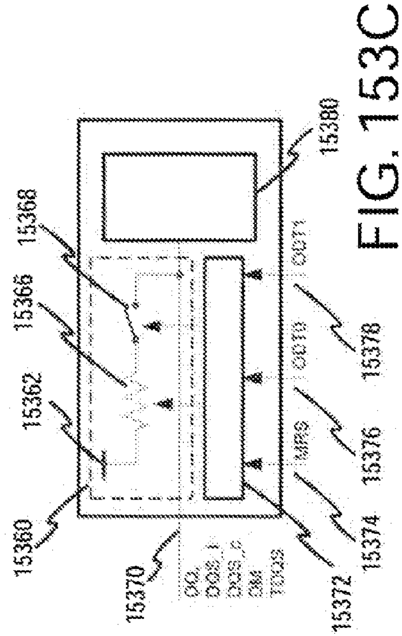

FIGS. 153A-C are block diagrams of an example memory module using an interface circuit to provide DIMM termination.

Figure 154:
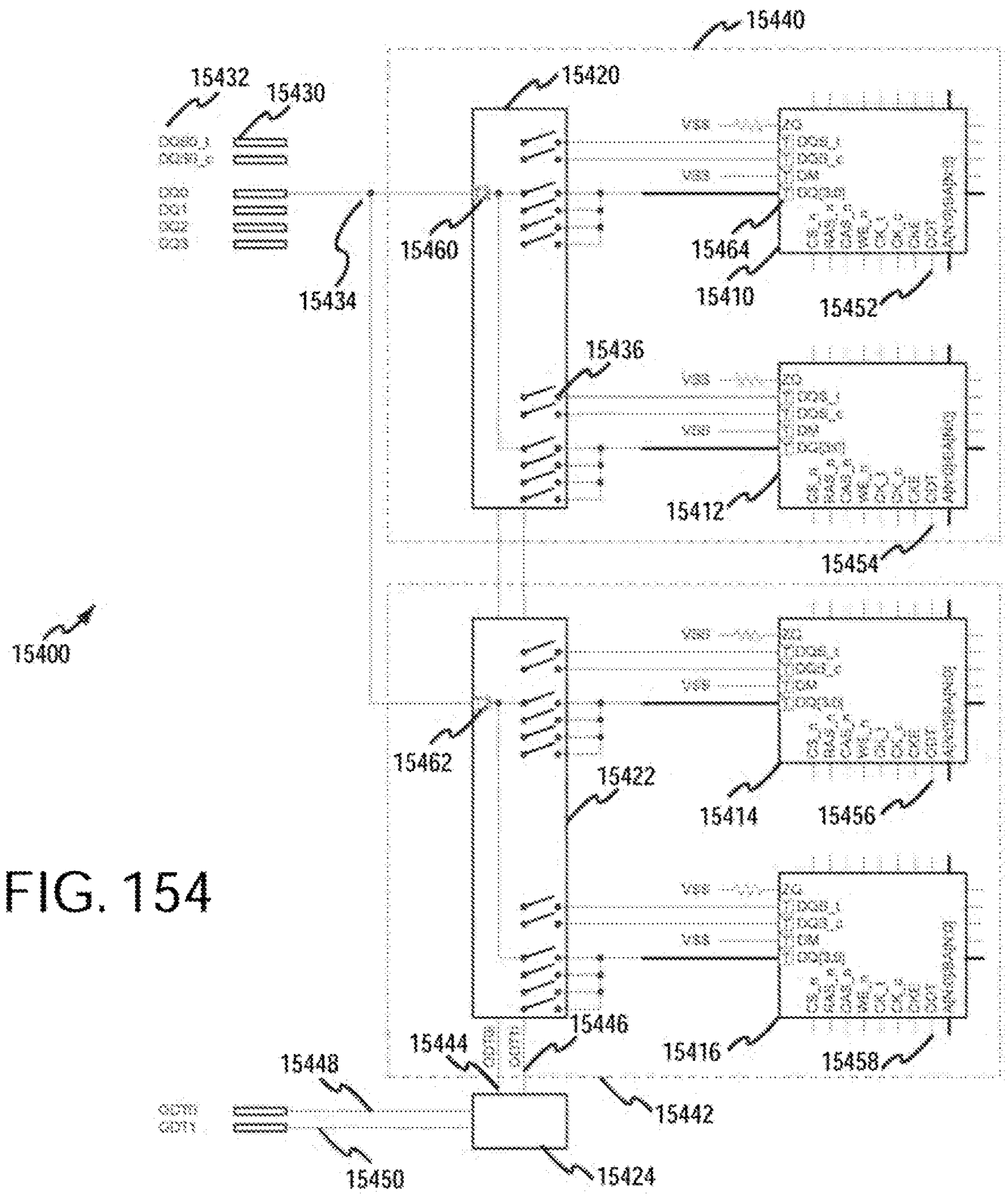

FIG. 154 is a block diagram illustrating a slice of an example 2-rank DIMM using two interface circuits for DIMM termination per slice.

Figure 155:
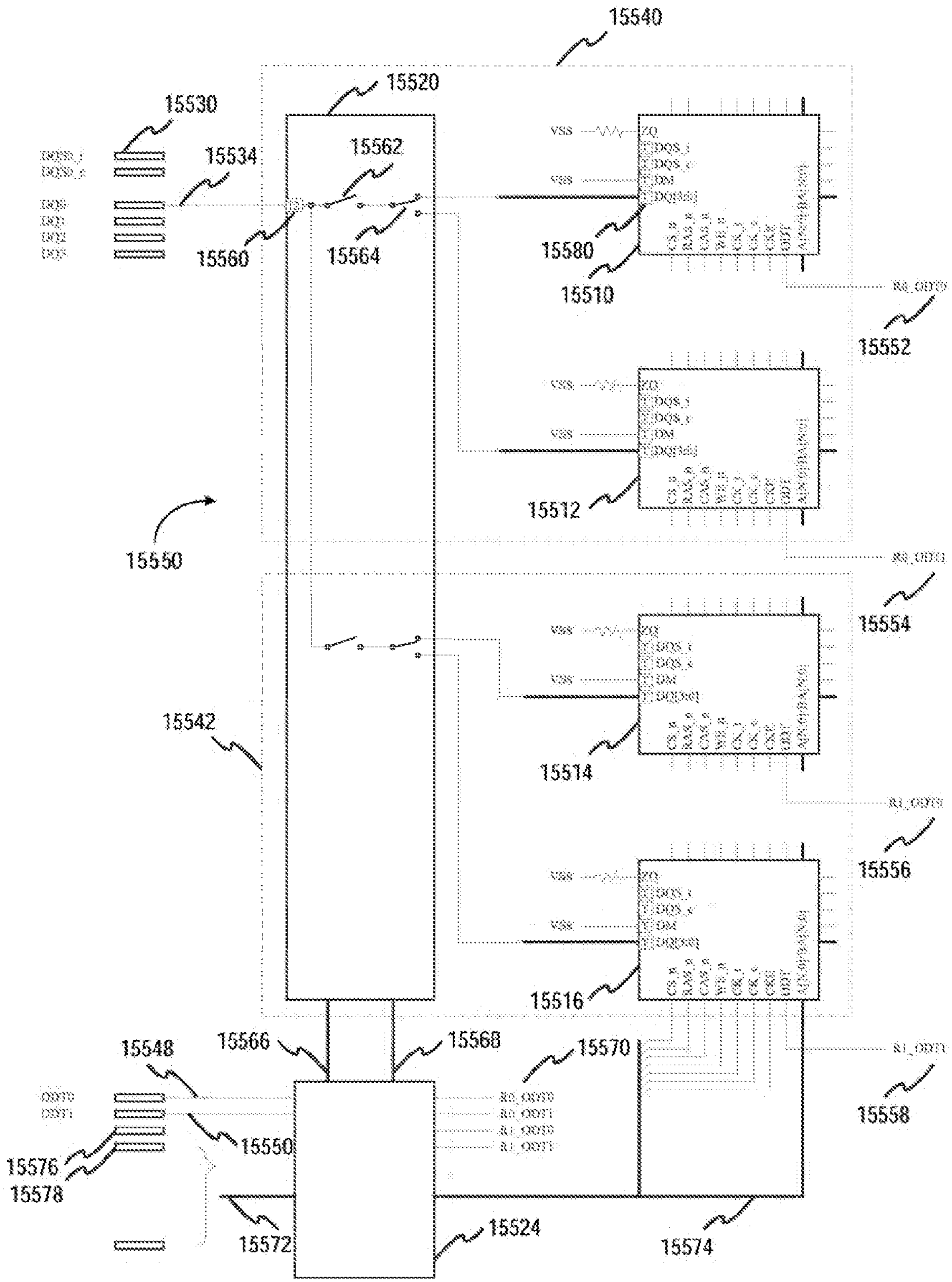

FIG. 155 is a block diagram illustrating a slice of an example 2-rank DIMM with one interface circuit per slice.

Figure 156:
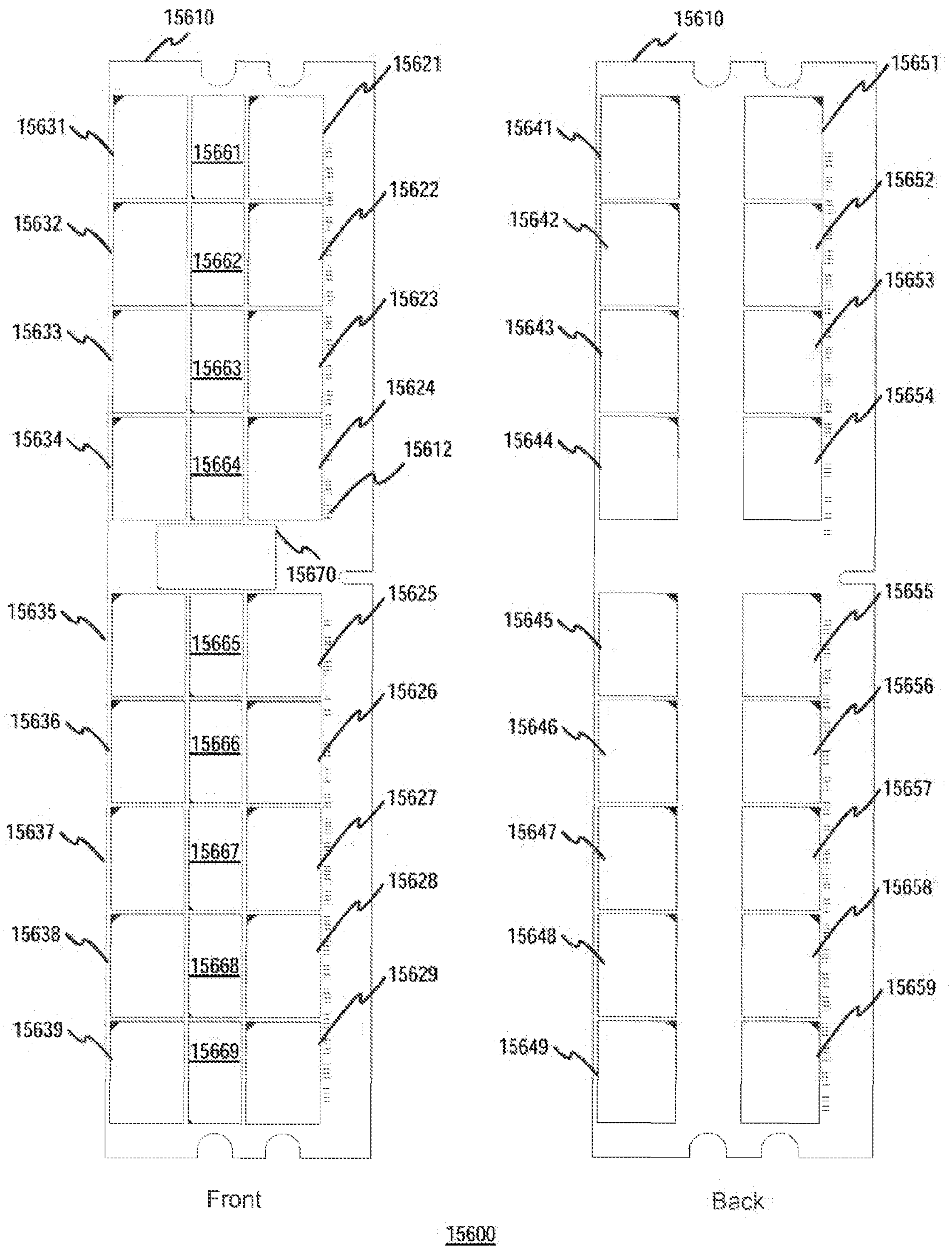

FIG. 156 illustrates a physical layout of an example printed circuit board (PCB) of a DIMM with an interface circuit.

Figure 157:
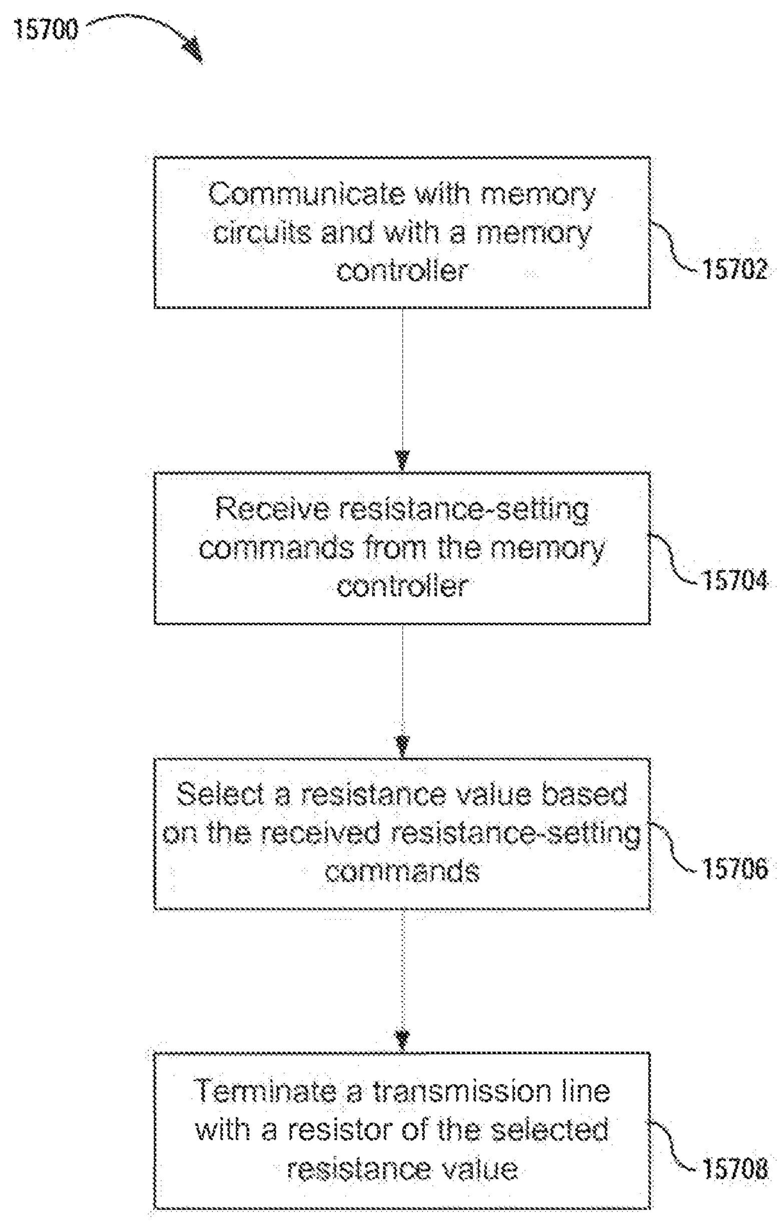

FIG. 157 is a flowchart illustrating an example method for providing termination resistance in a memory module.

Figure 158:
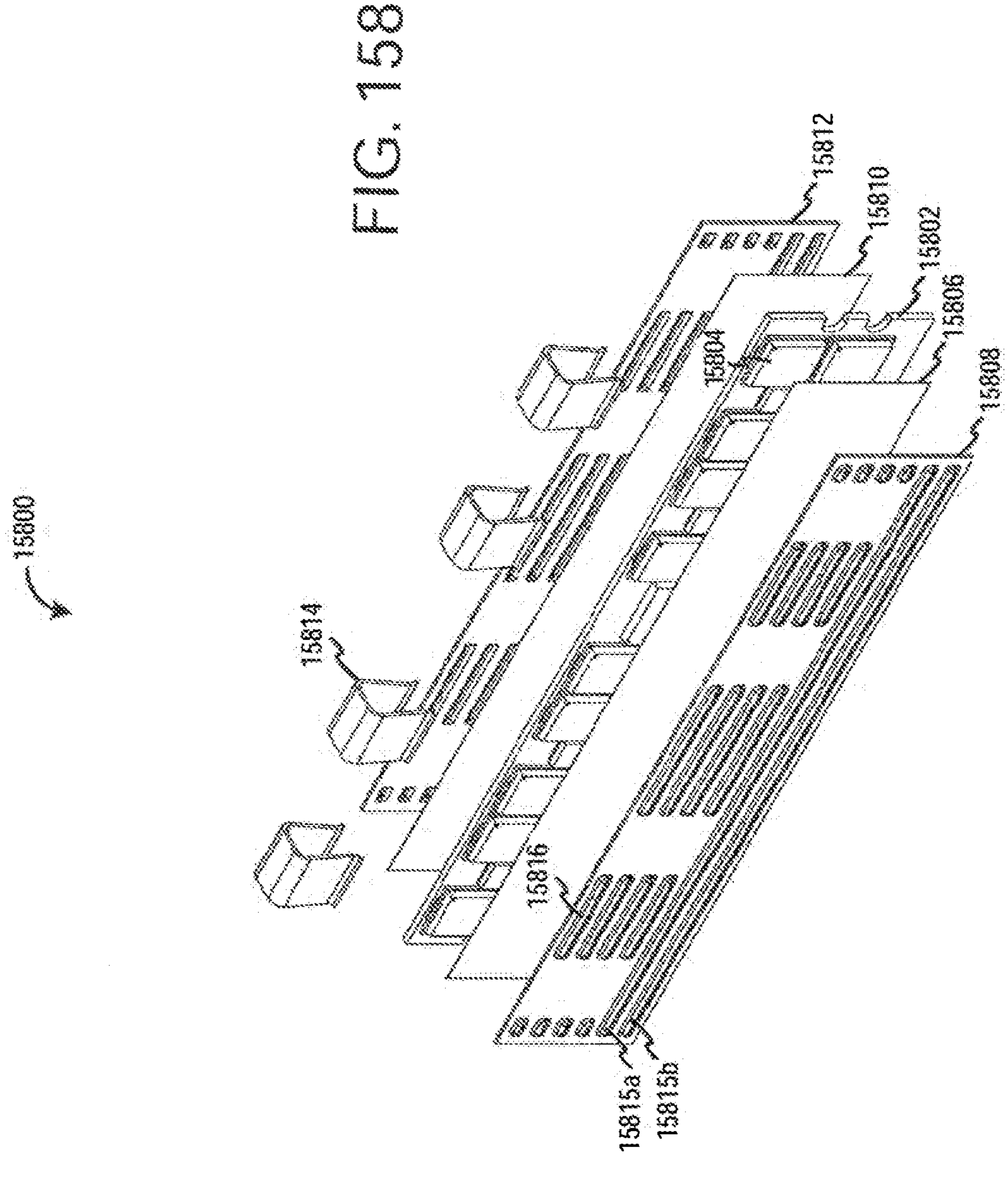

FIG. 158 illustrates an exploded view of a heat spreader module, according to one embodiment of the present invention.

Figure 159:
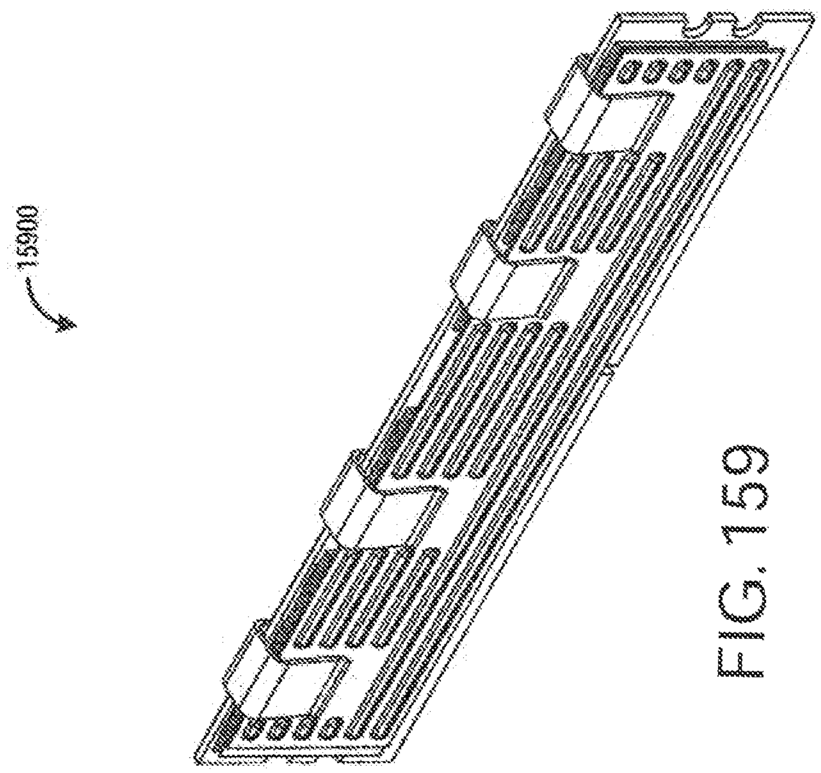

FIG. 159 illustrates an assembled view of a heat spreader module, according to one embodiment of the present invention.

Figure 160A:
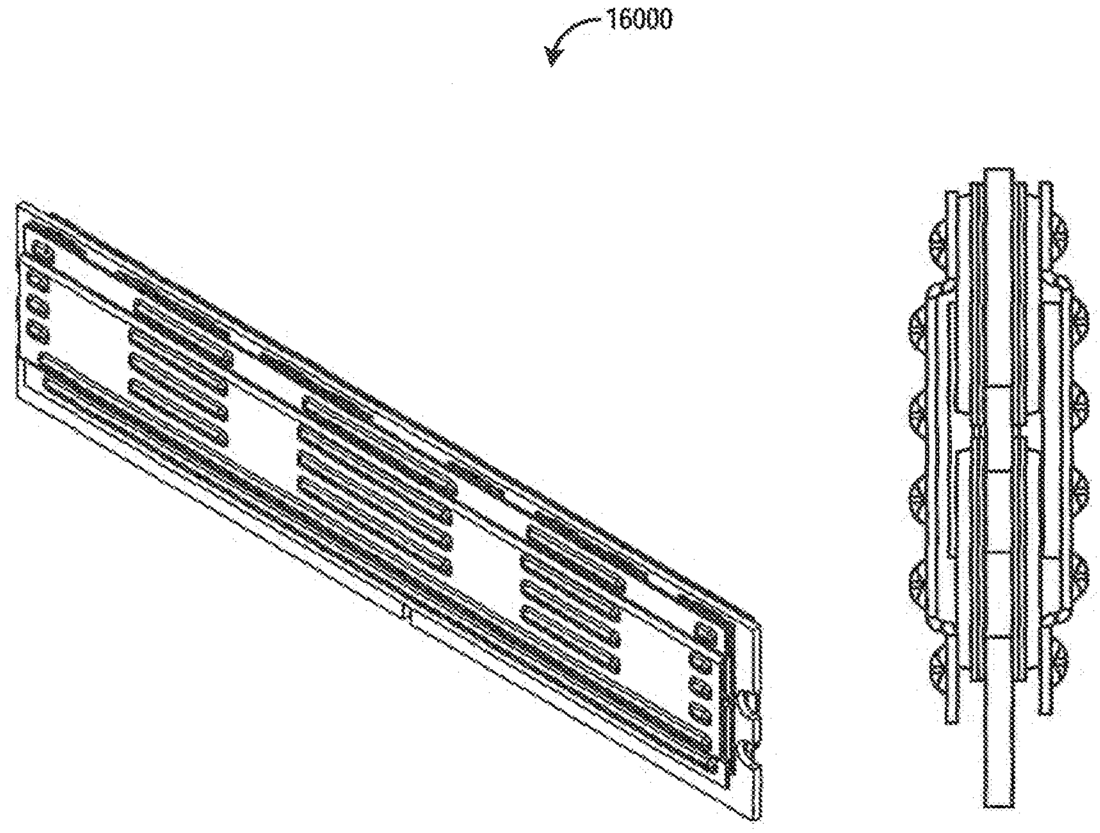
Figure 160B:
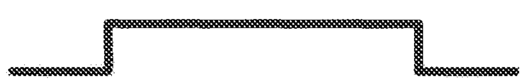
Figure 160C:
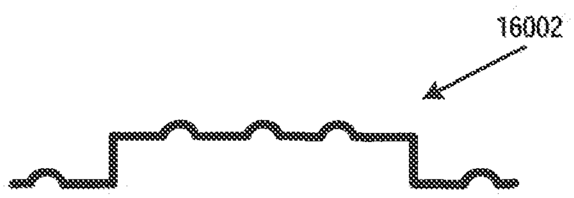

FIGS. 160A through 160C illustrate shapes of a heat spreader plate, according to different embodiments of the present invention.

Figure 161:
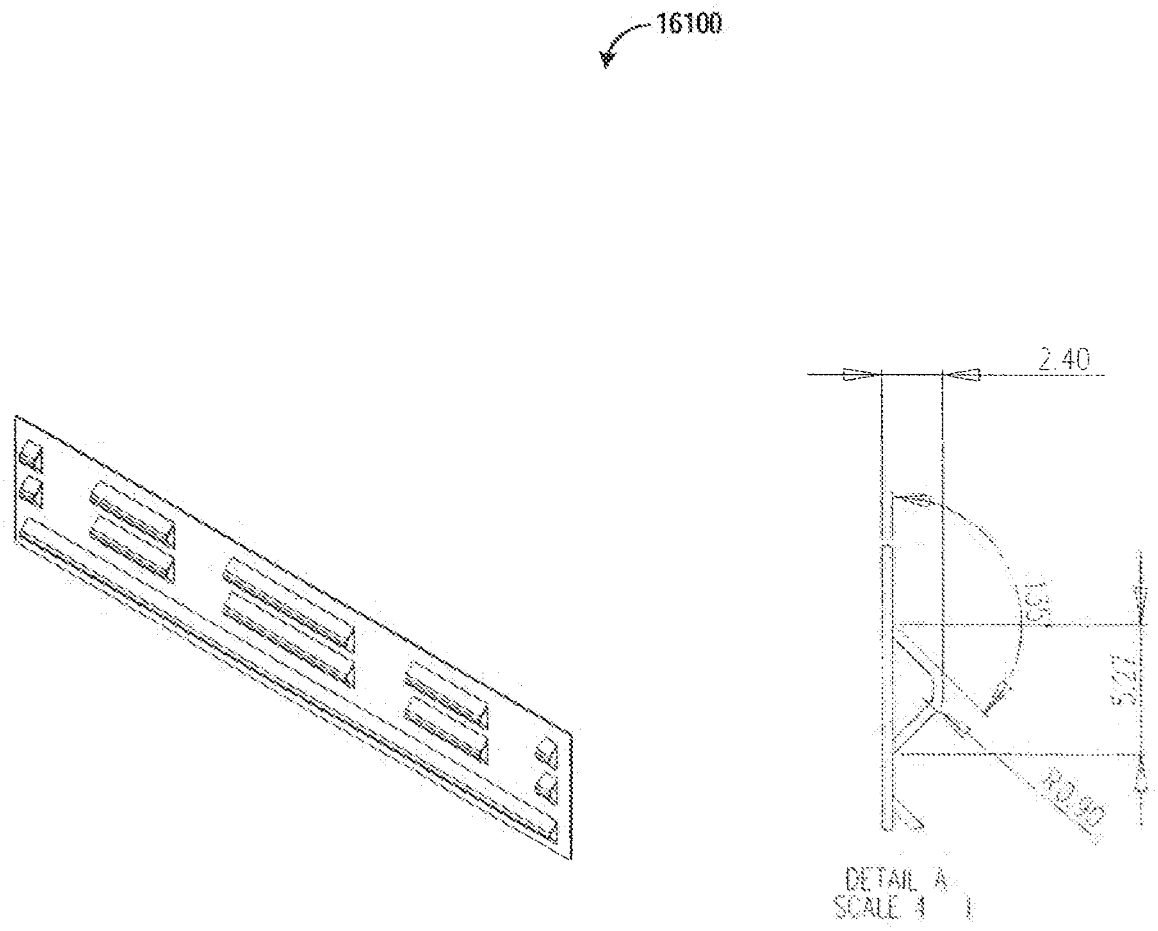

FIG. 161 illustrates a heat spreader module with open-face embossment areas, according to one embodiment of the present invention.

Figure 162:
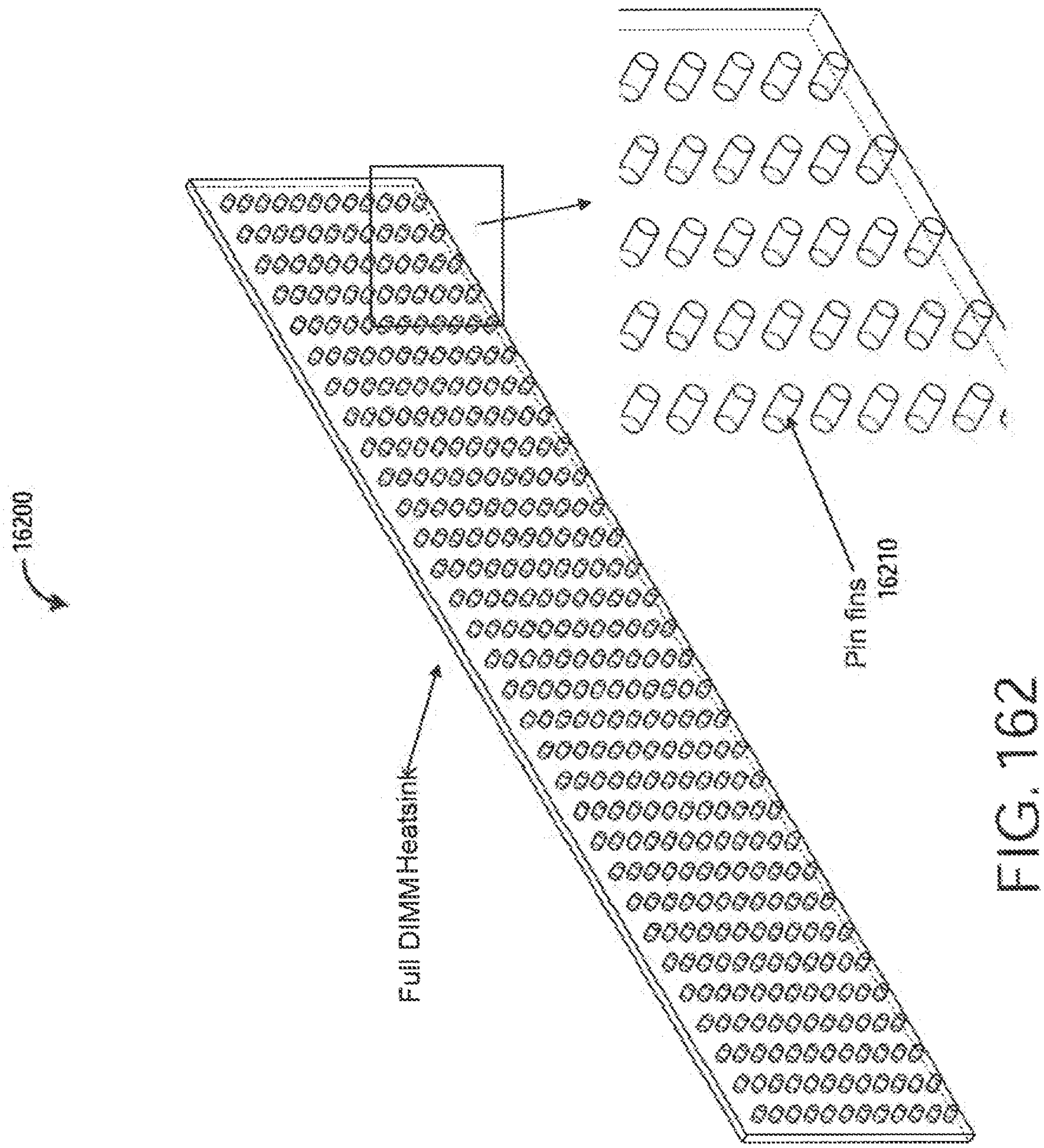

FIG. 162 illustrates a heat spreader module with patterned cylindrical pin array, according to one embodiment of the present invention.

Figure 163:
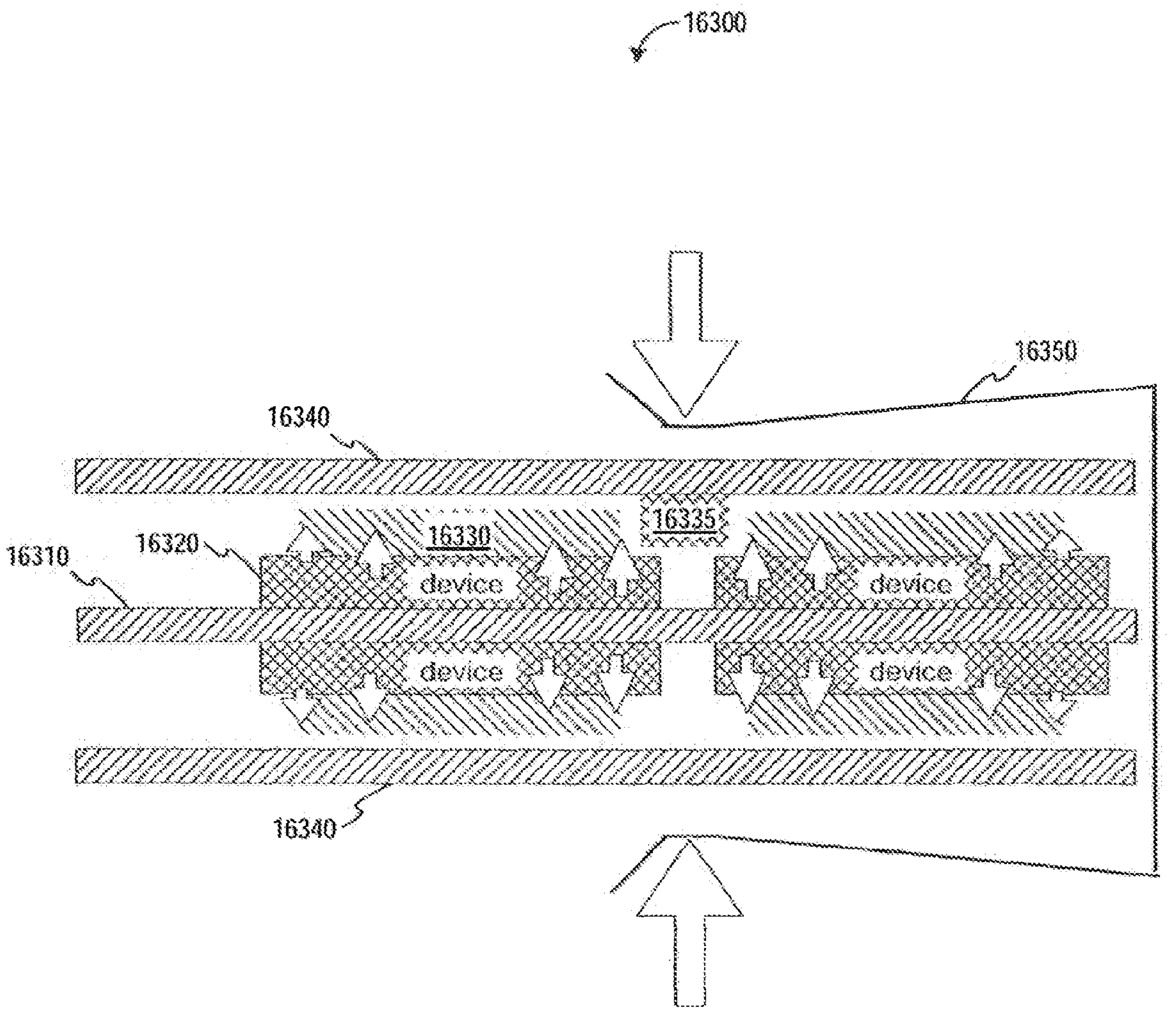

FIG. 163 illustrates an exploded view of a module using PCB heat spreader plates on each face, according to one embodiment of the present invention.

Figure 164:
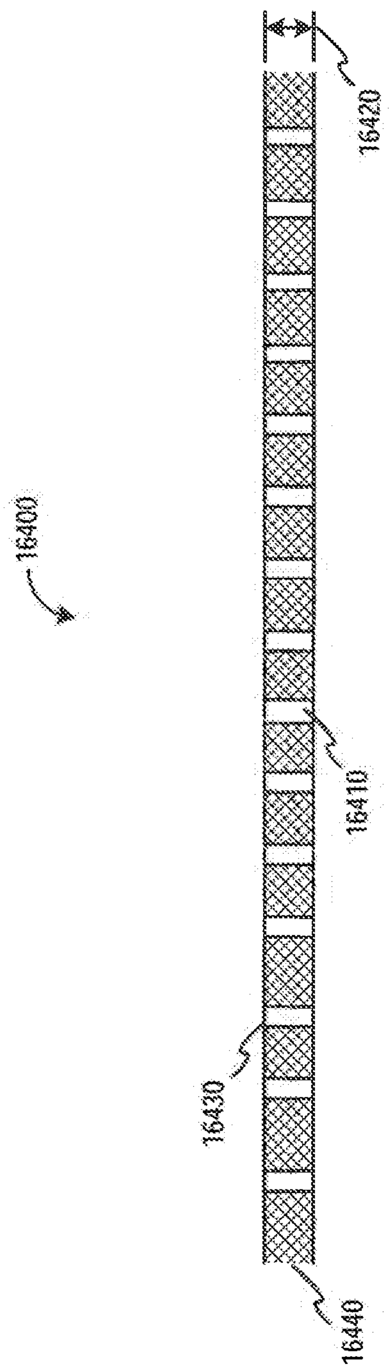

FIG. 164 illustrates a PCB stiffener with a pattern of through-holes, according to one embodiment of the present invention.

Figure 165A:
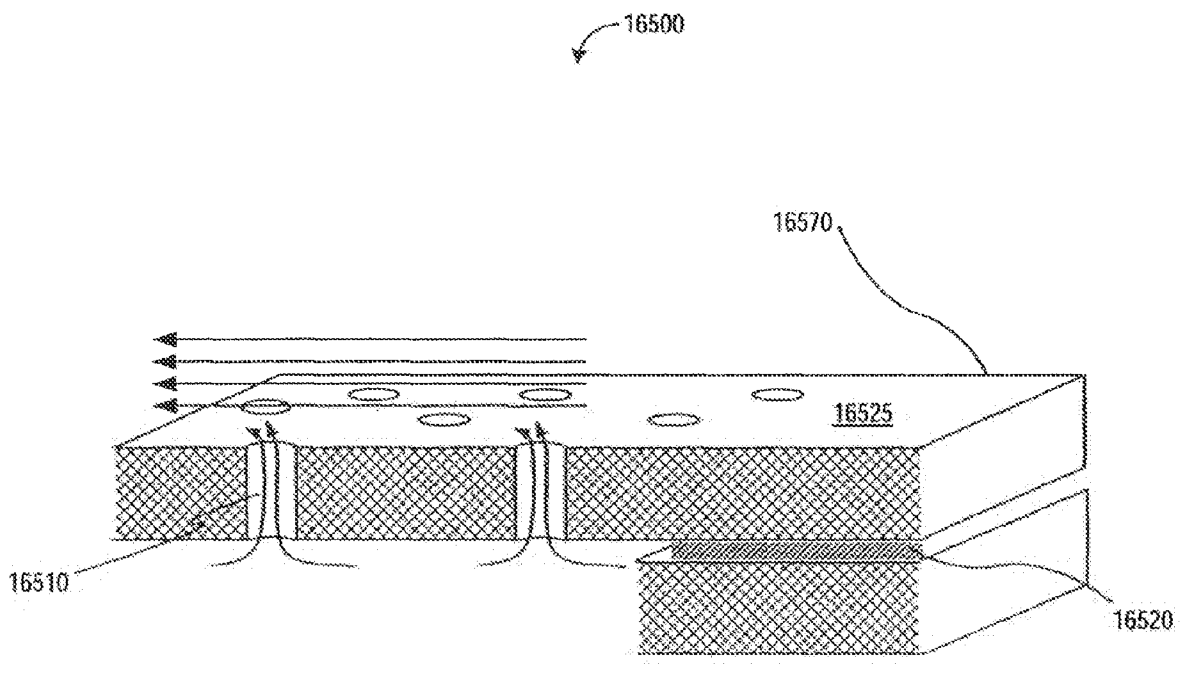

FIG. 165A illustrates a PCB stiffener with a pattern of through holes allowing air flow from inner to outer surfaces, according to one embodiment of the present invention.

Figure 165B:
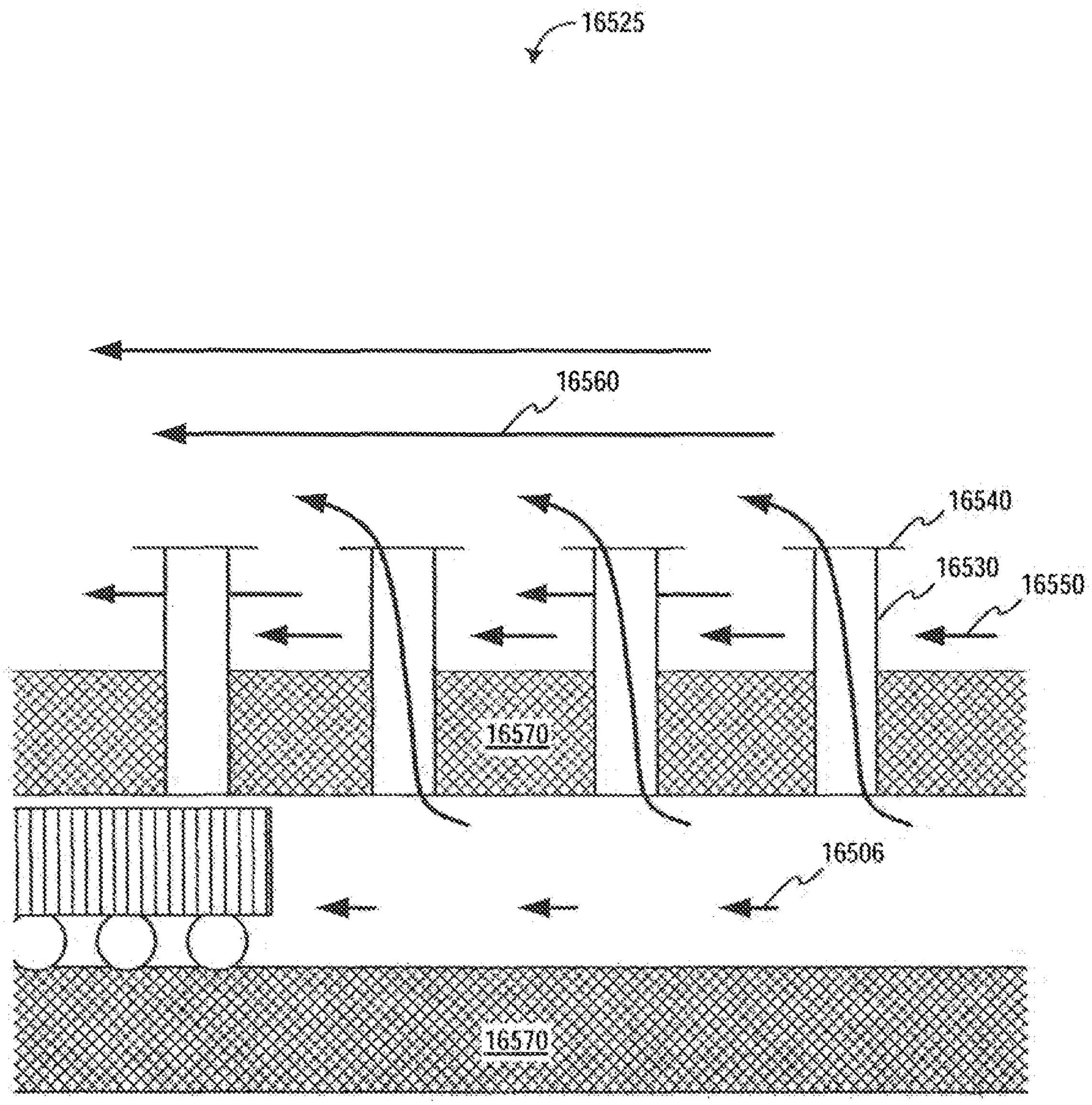

FIG. 165B illustrates a PCB stiffener with a pattern of through holes with a chimney, according to one embodiment of the present invention.

Figure 166:
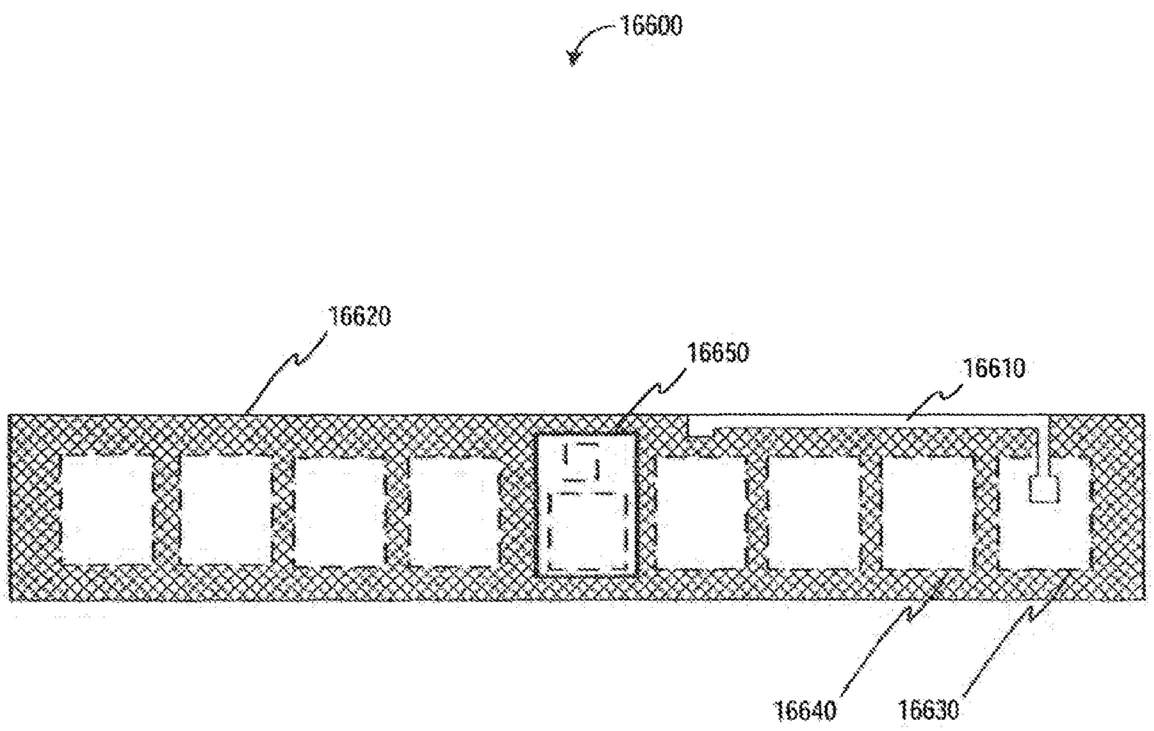

FIG. 166 illustrates a PCB type heat spreader for combining or isolating areas, according to one embodiment of the present invention.

FIGS. 167A-167D illustrate heat spreader assemblies showing air flow dynamics, according to various embodiments of the present invention.

FIGS. 168A-168D illustrate heat spreaders for memory modules, according to various embodiments of the present invention.

Figure 169A:
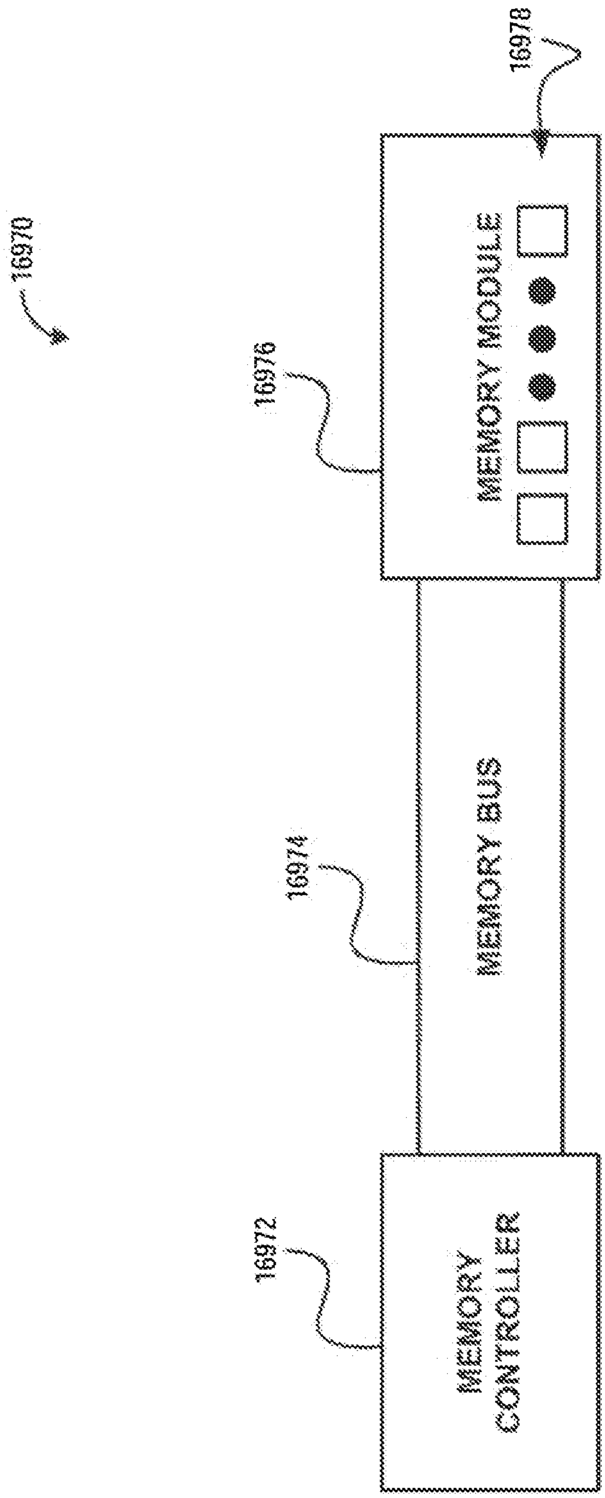

FIG. 169A shows a system for multi-rank, partial width memory modules, in accordance with one embodiment.

Figure 169B:
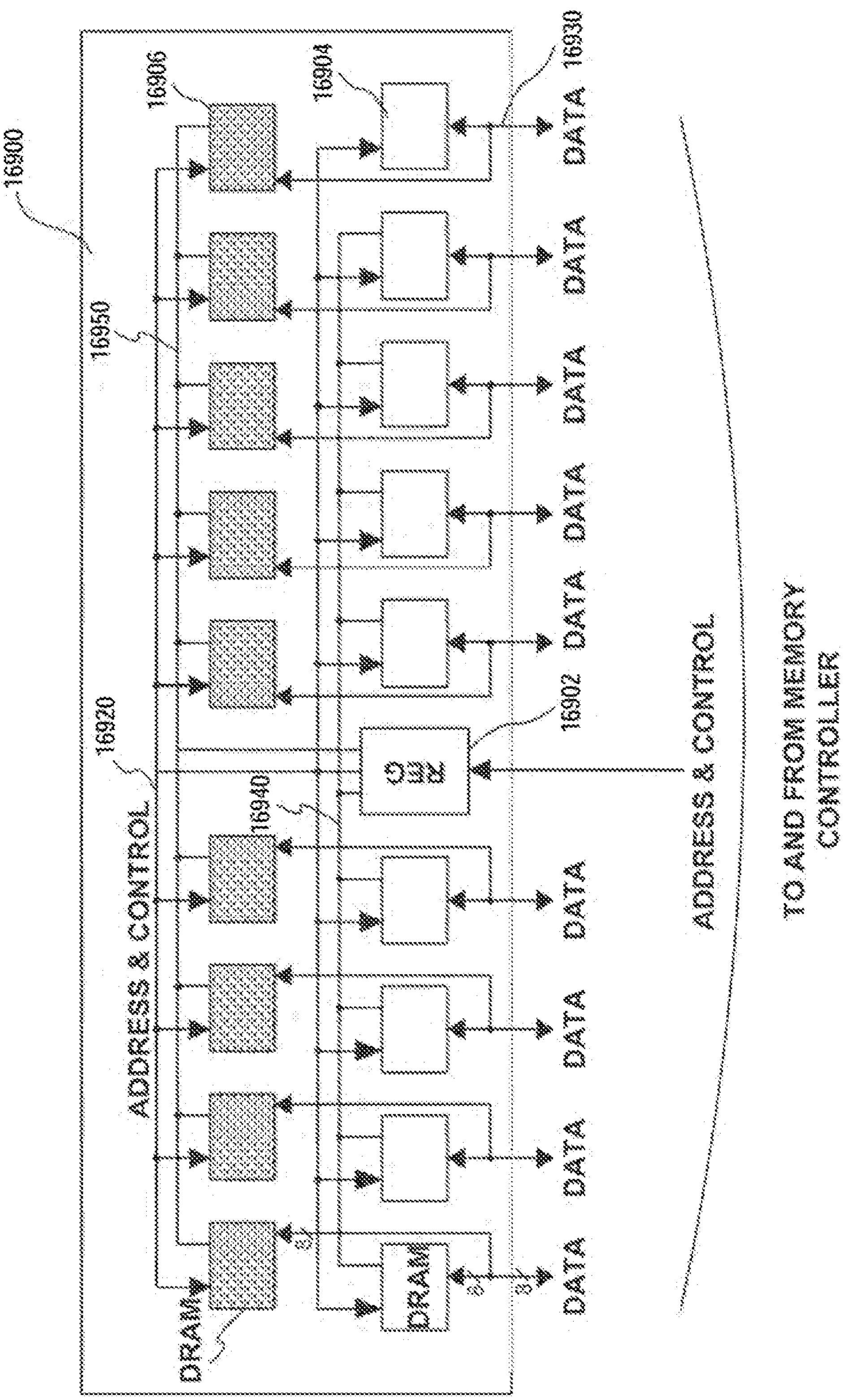

FIG. 169B illustrates a two-rank registered dual inline memory module (R-DIMM) built with 8-bit wide (×8) memory circuits, in accordance with Joint Electron Device Engineering Council (JEDEC) specifications.

Figure 170:
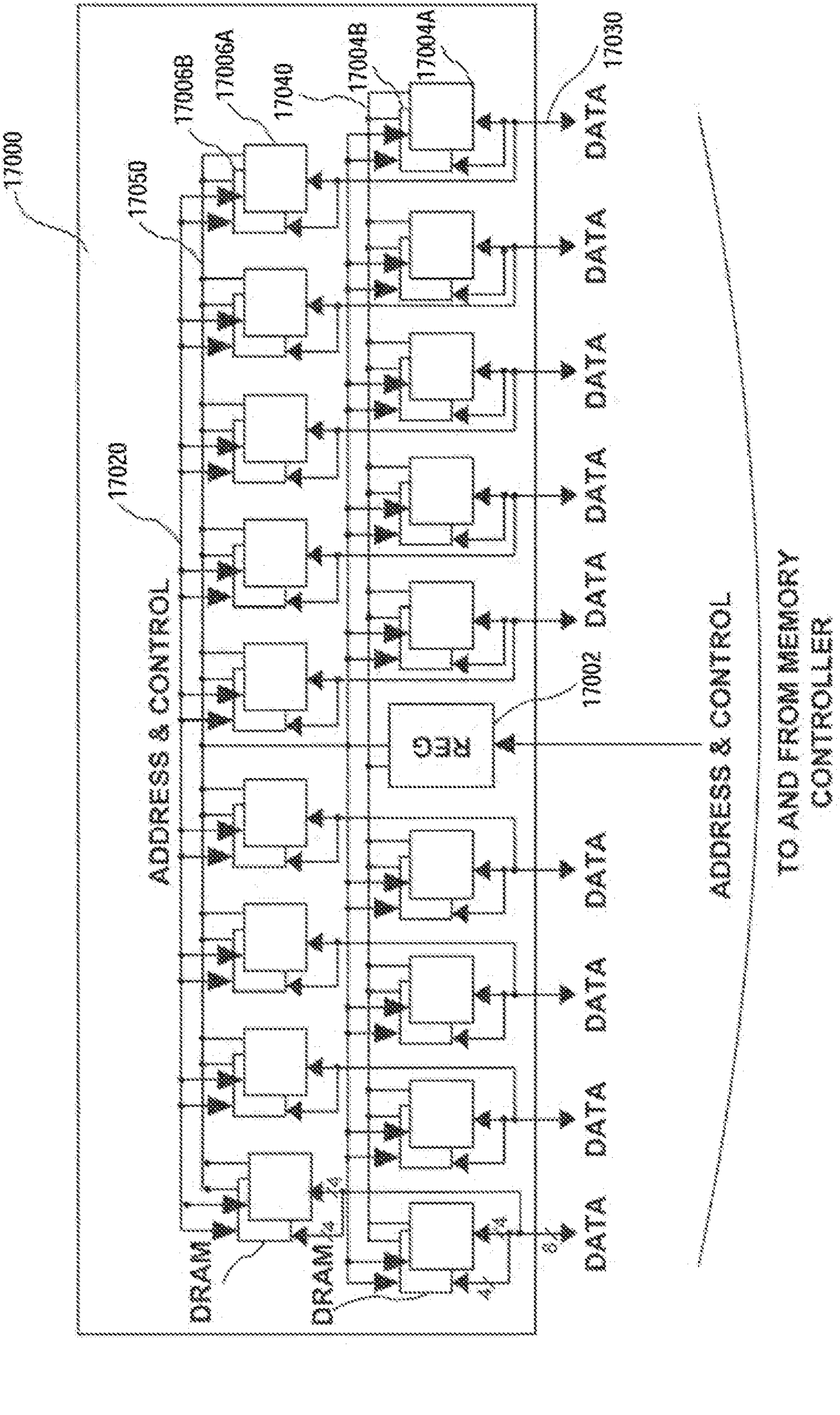

FIG. 170 illustrates a two-rank R-DIMM built with 4-bit wide (×4) dynamic random access memory (DRAM) circuits, in accordance with JEDEC specifications.

Figure 171:
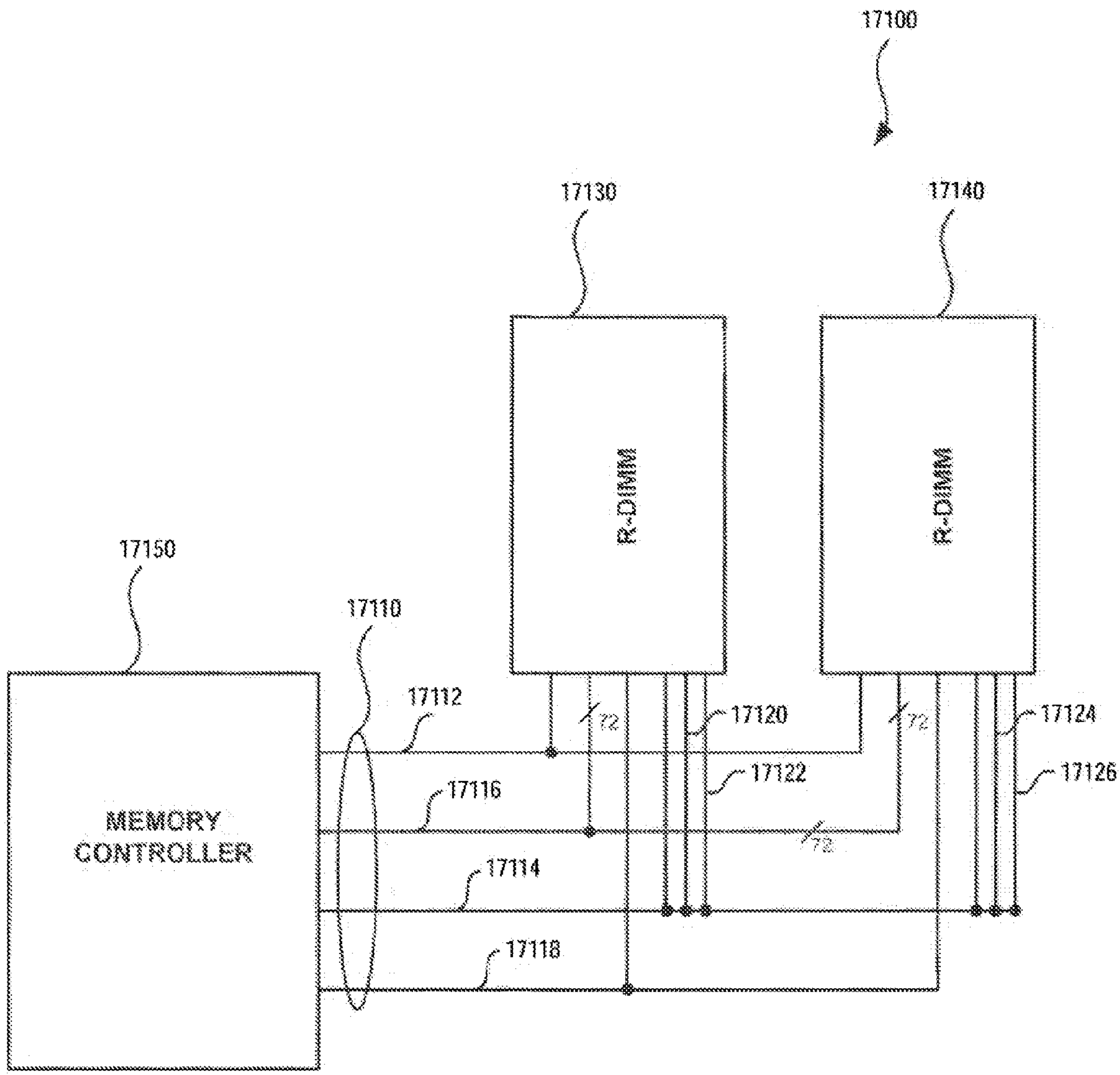

FIG. 171 illustrates an electronic host system that includes a memory controller, and two standard R-DIMMs.

Figure 172:
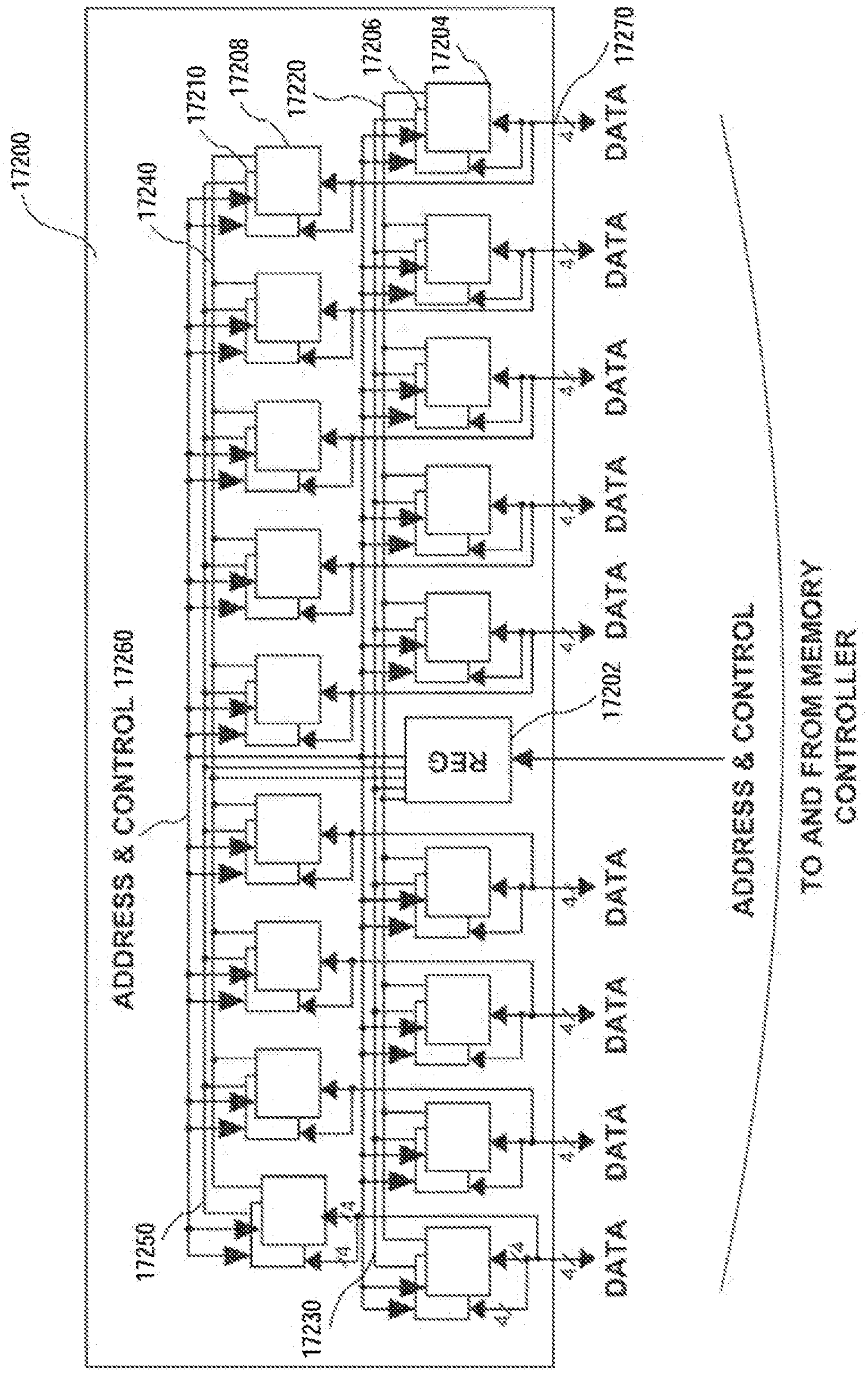

FIG. 172 illustrates a four-rank, half-width R-DIMM built using ×4 DRAM circuits, in accordance with one embodiment.

Figure 173:
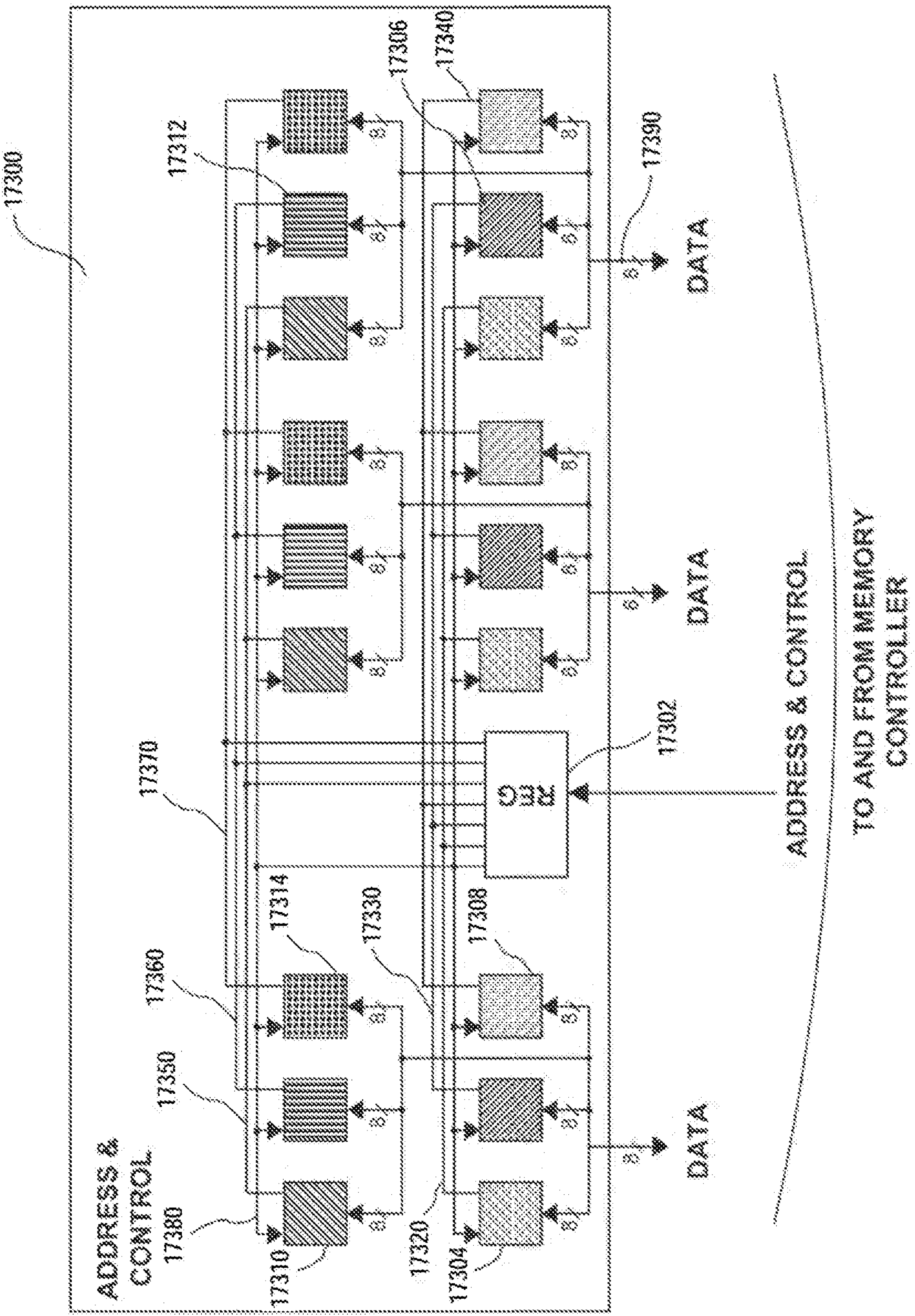

FIG. 173 illustrates a six-rank, one-third width R-DIMM built using ×8 DRAM circuits, in accordance with another embodiment.

Figure 174:
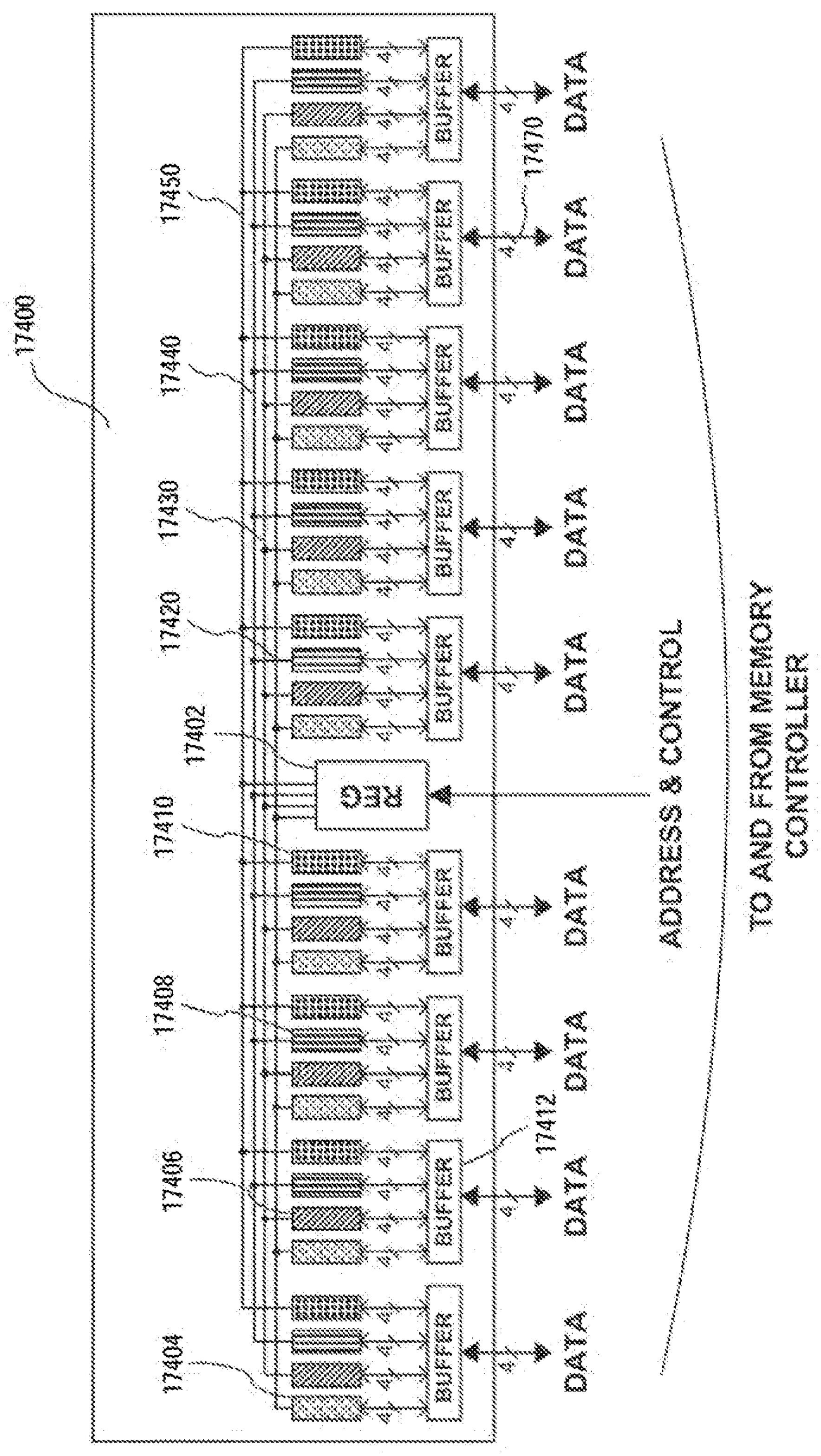

FIG. 174 illustrates a four-rank, half-width R-DIMM built using ×4 DRAM circuits and buffer circuits, in accordance with yet another embodiment.

Figure 175:
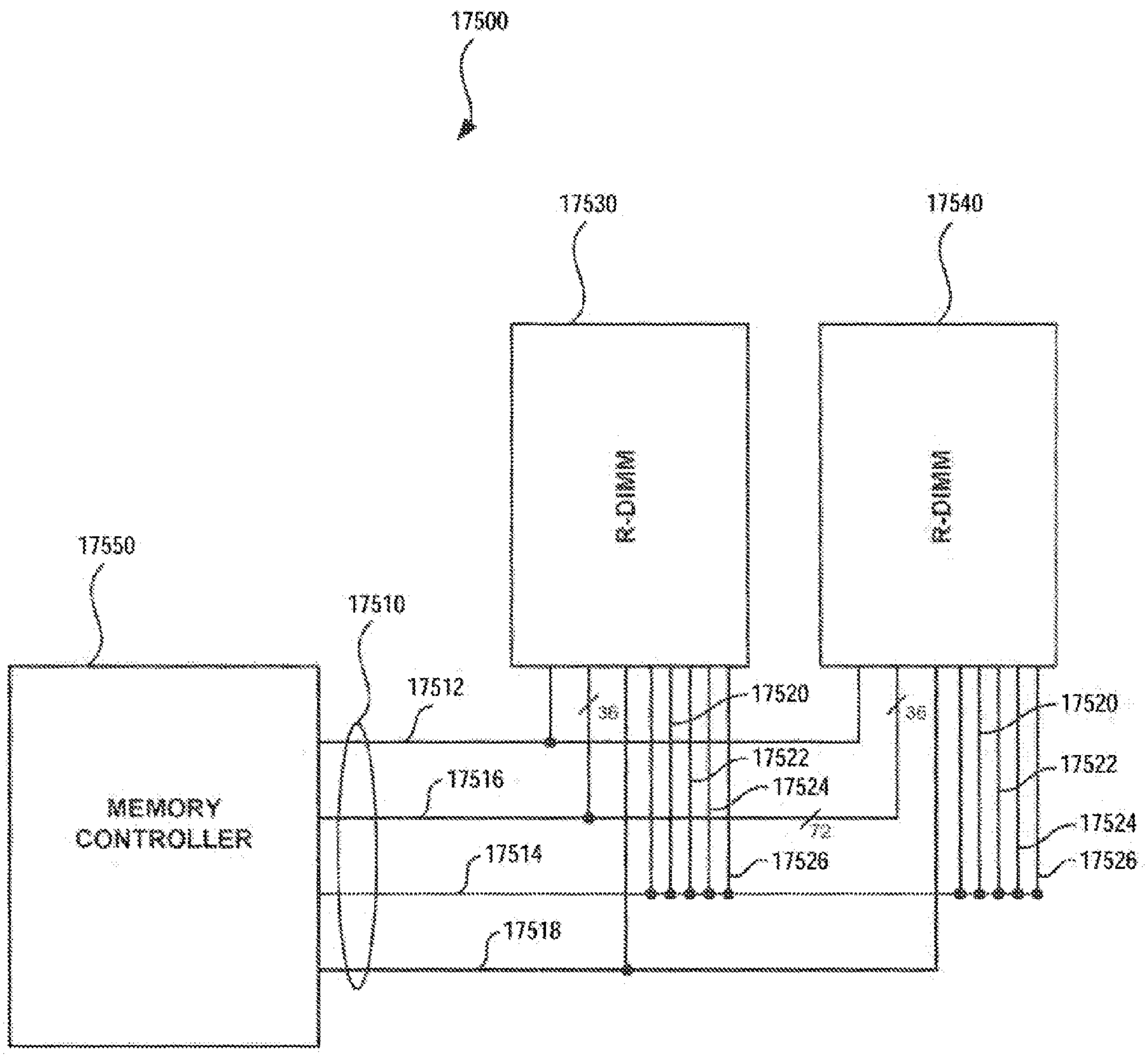

FIG. 175 illustrates an electronic host system that includes a memory controller, and two half width R-DIMMs, in accordance with another embodiment.

Figure 176:
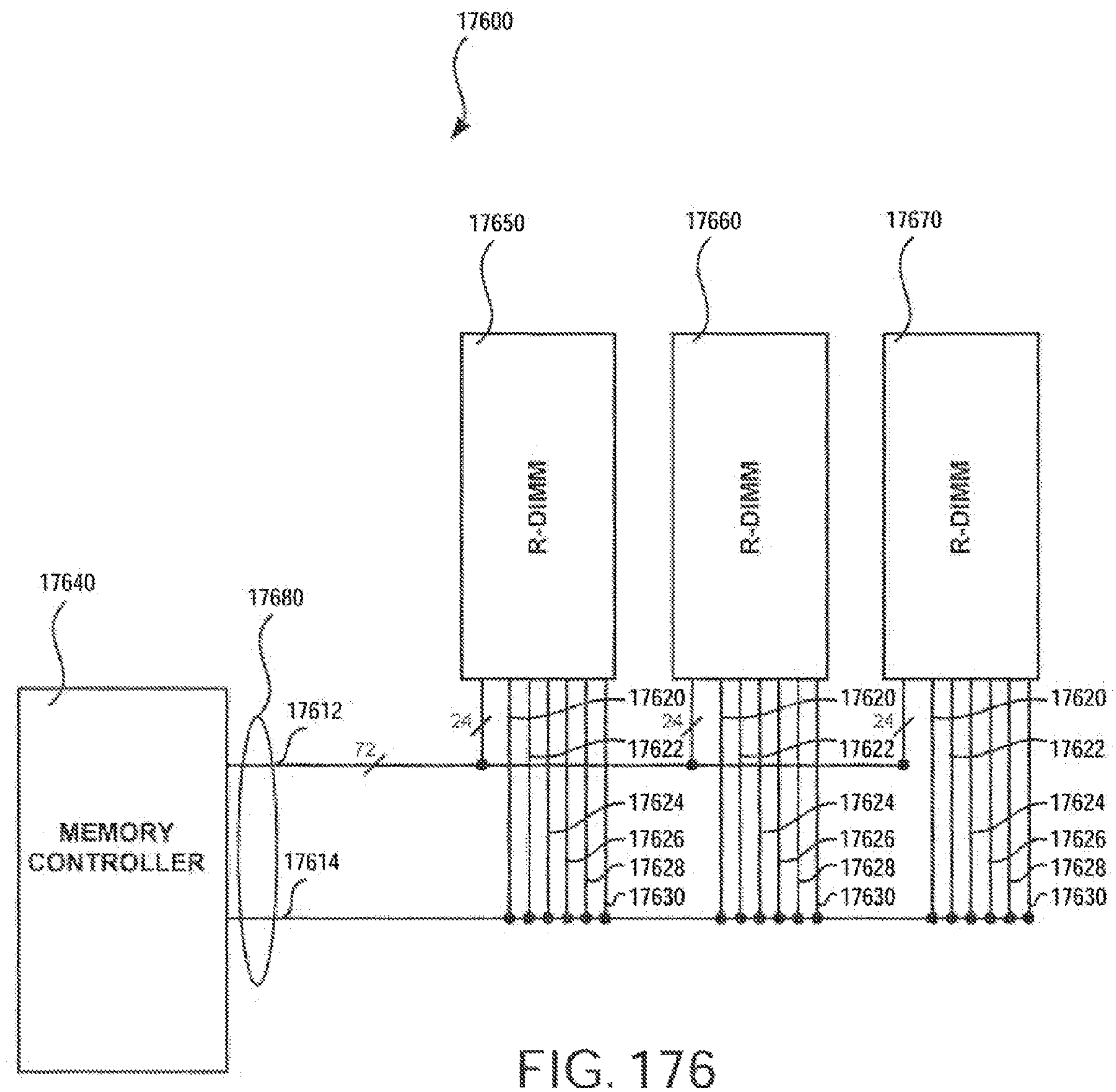

FIG. 176 illustrates an electronic host system that includes a memory controller, and three one-third width R-DIMMs, in accordance with another embodiment.

Figure 177:
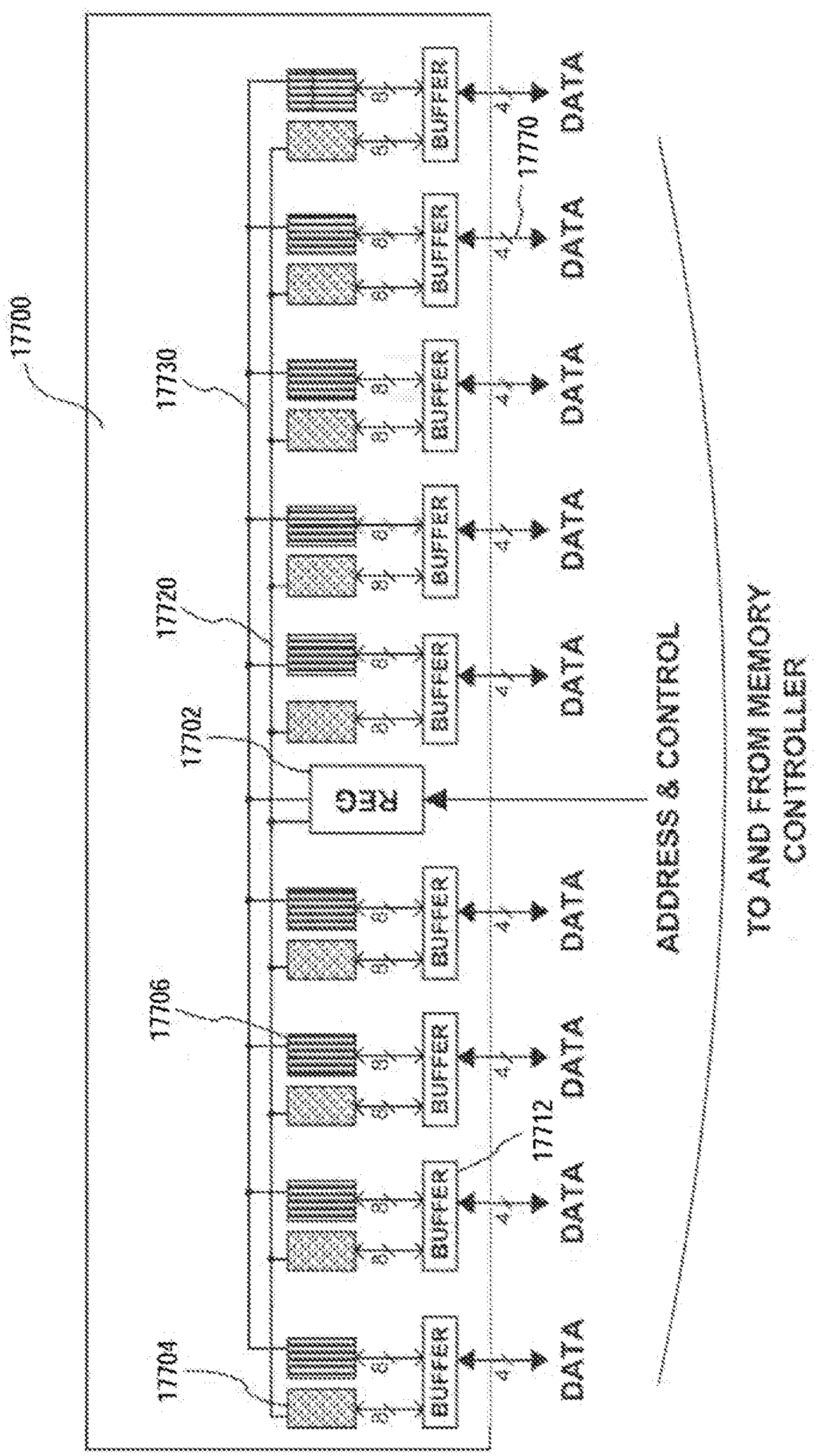

FIG. 177 illustrates a two-full-rank, half-width R-DIMM built using ×8 DRAM circuits and buffer circuits, in accordance with one embodiment.

Figure 178:
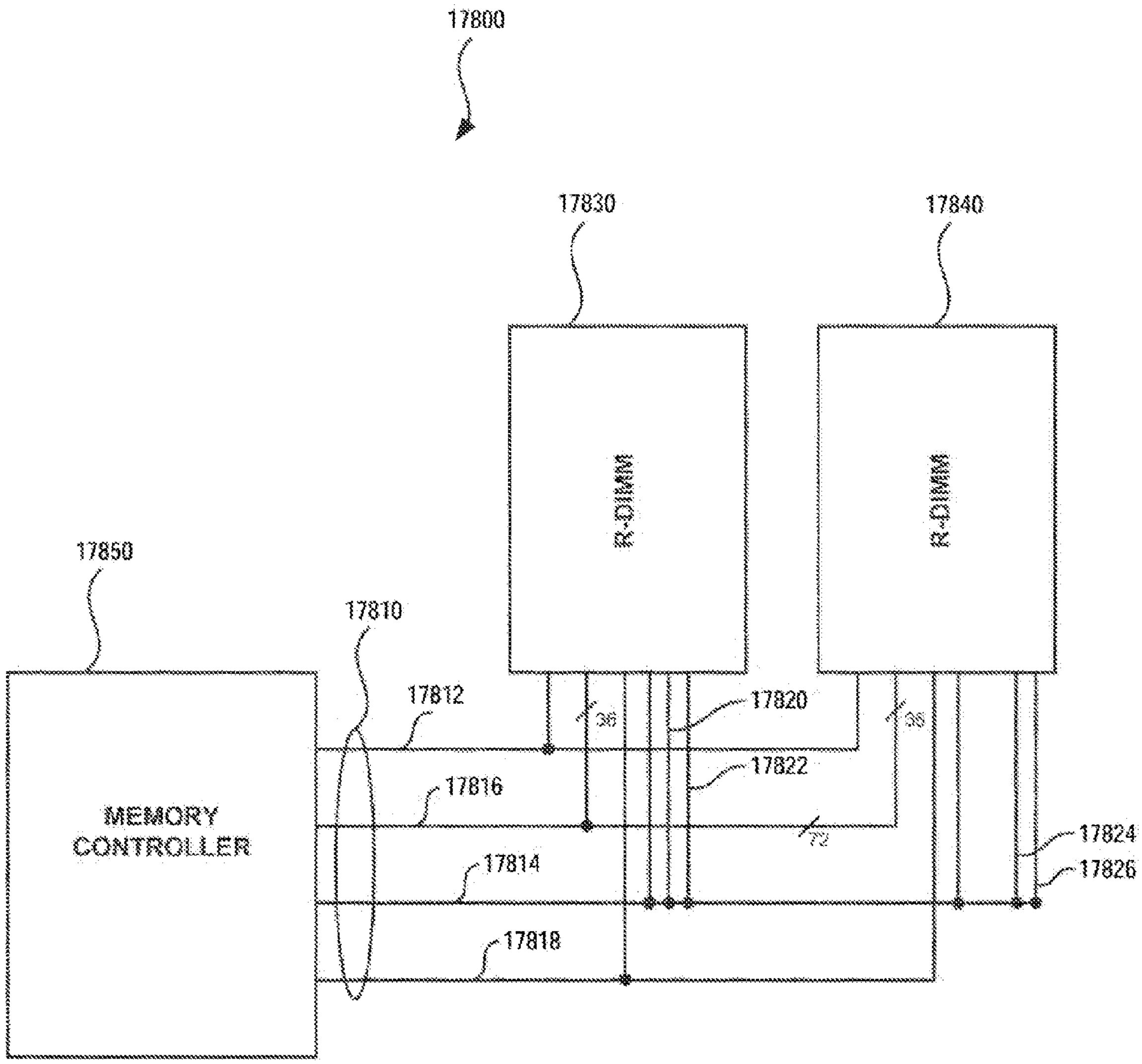

FIG. 178 illustrates an electronic host system that includes a memory controller, and two half width R-DIMMs, in accordance with one embodiment.

Figure 179:
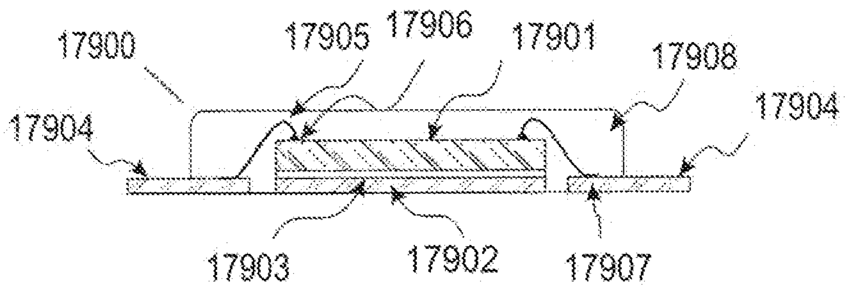

FIG. 179 illustrates in cross section a lead frame package for surface mounting.

FIGS. 180A-180D illustrate in general cross section lead frame packages designed for stacking.

Figure 181A:
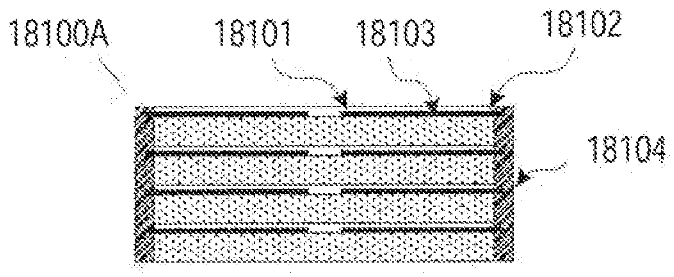
Figure 181B:
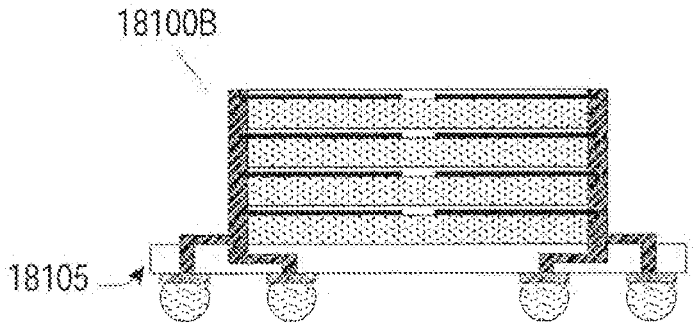
Figure 181C:
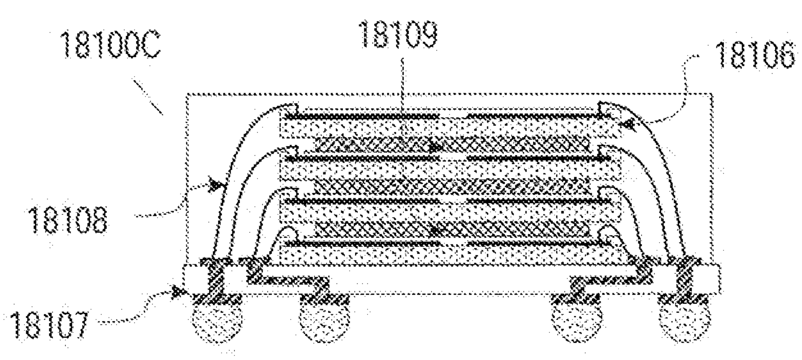

FIGS. 181A-181C illustrate in general cross section stacked semiconductor die assemblies having edge of die connections.

Figure 182A:
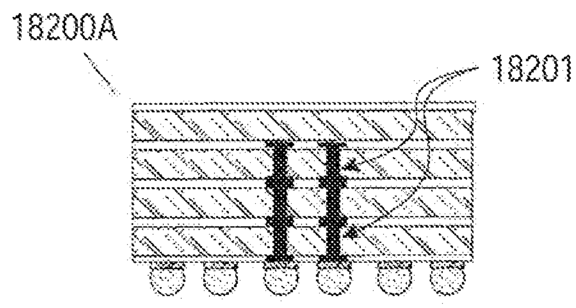
Figure 182B:
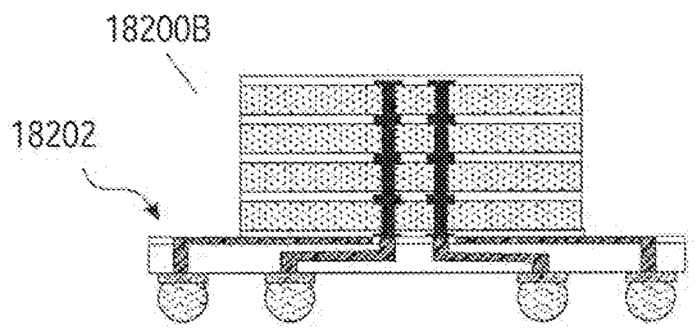

FIGS. 182A and 182B illustrate in general cross section stacked semiconductor die assemblies having interconnections made through the semiconductor by means of holes filled with a conductive material.

Figure 183A:
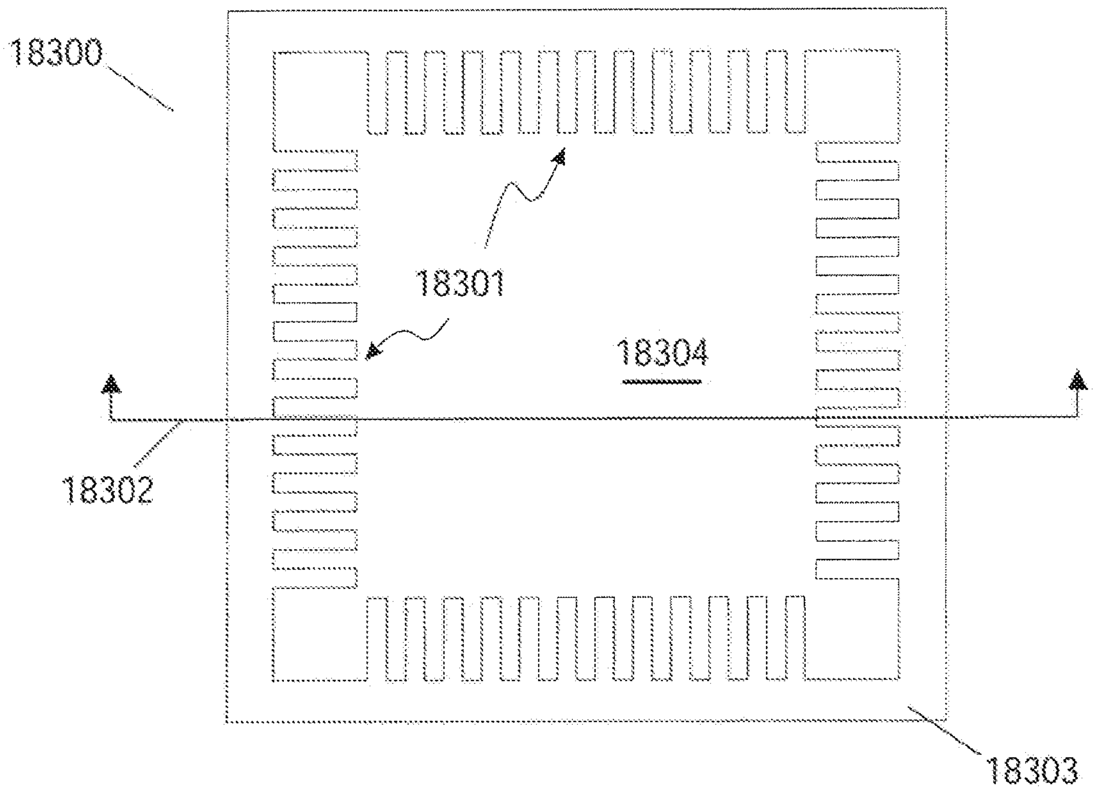
Figure 183B:

FIGS. 183A and 183B illustrate in top and cross section views a first process step for manufacturing an embodiment of a lead frame package.

Figure 184A:
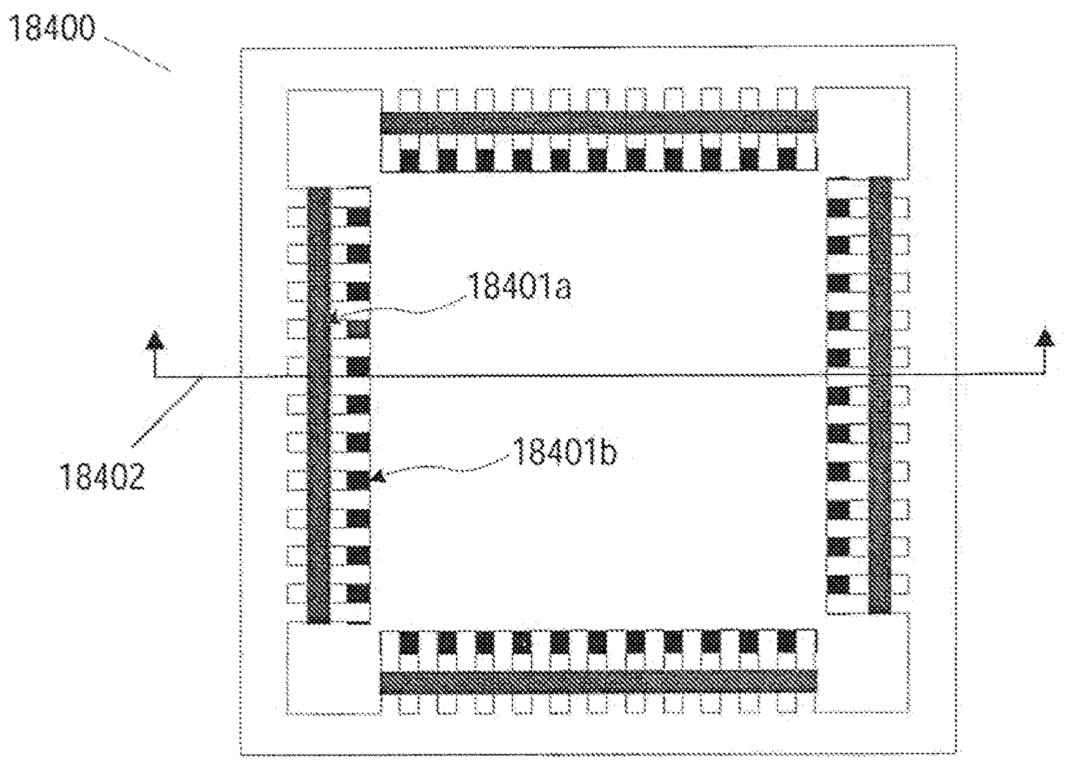
Figure 184B:

FIGS. 184A and 184B illustrate in top and cross section views a second process step for manufacturing an embodiment of the lead frame package.

Figure 185A:
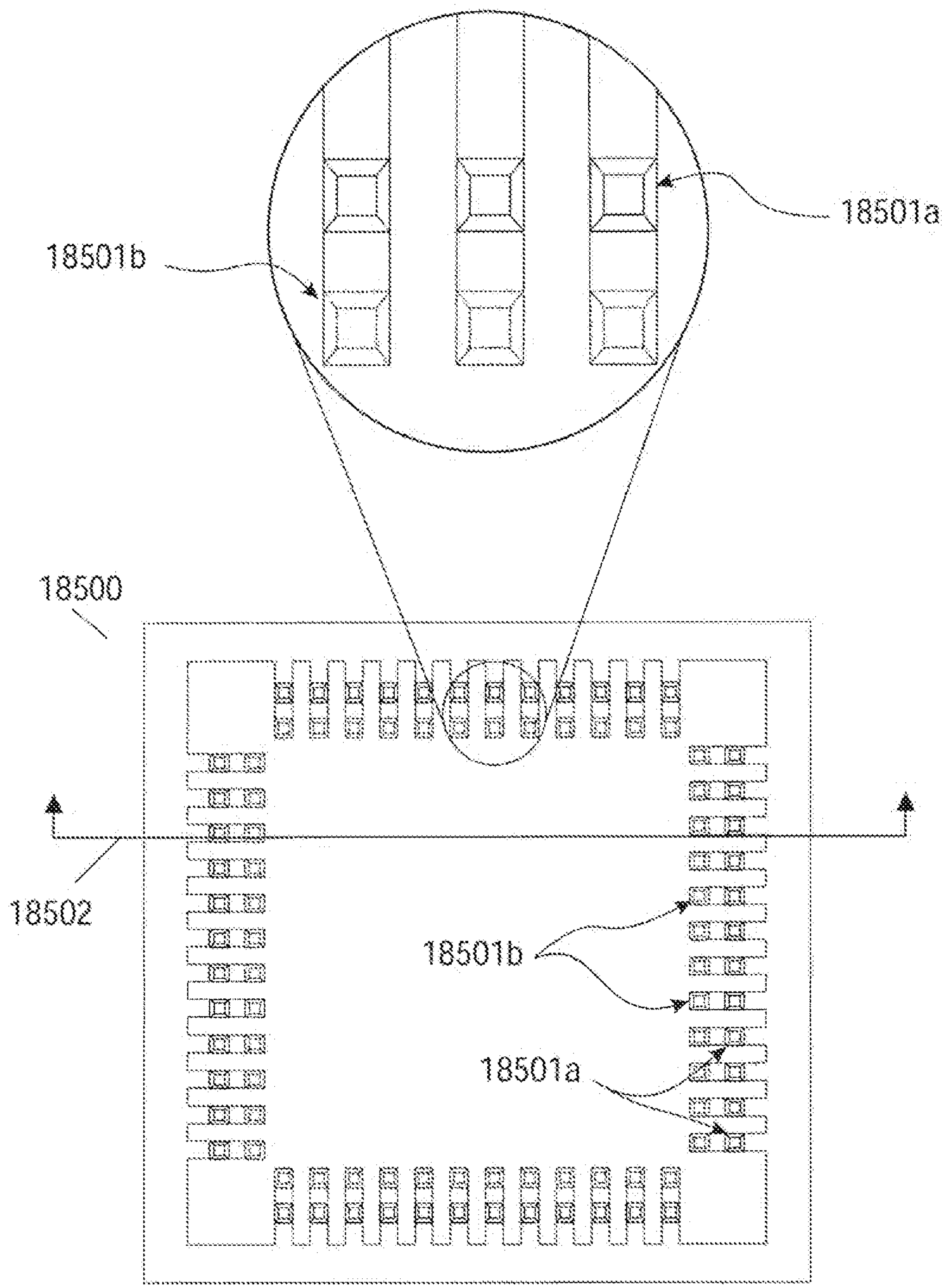
Figure 185B:
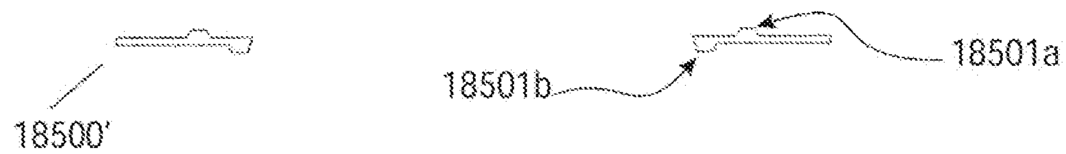

FIGS. 185 A and 185B illustrate in top and cross section views a third process step for manufacturing an embodiment of the lead frame package.

Figure 186A:
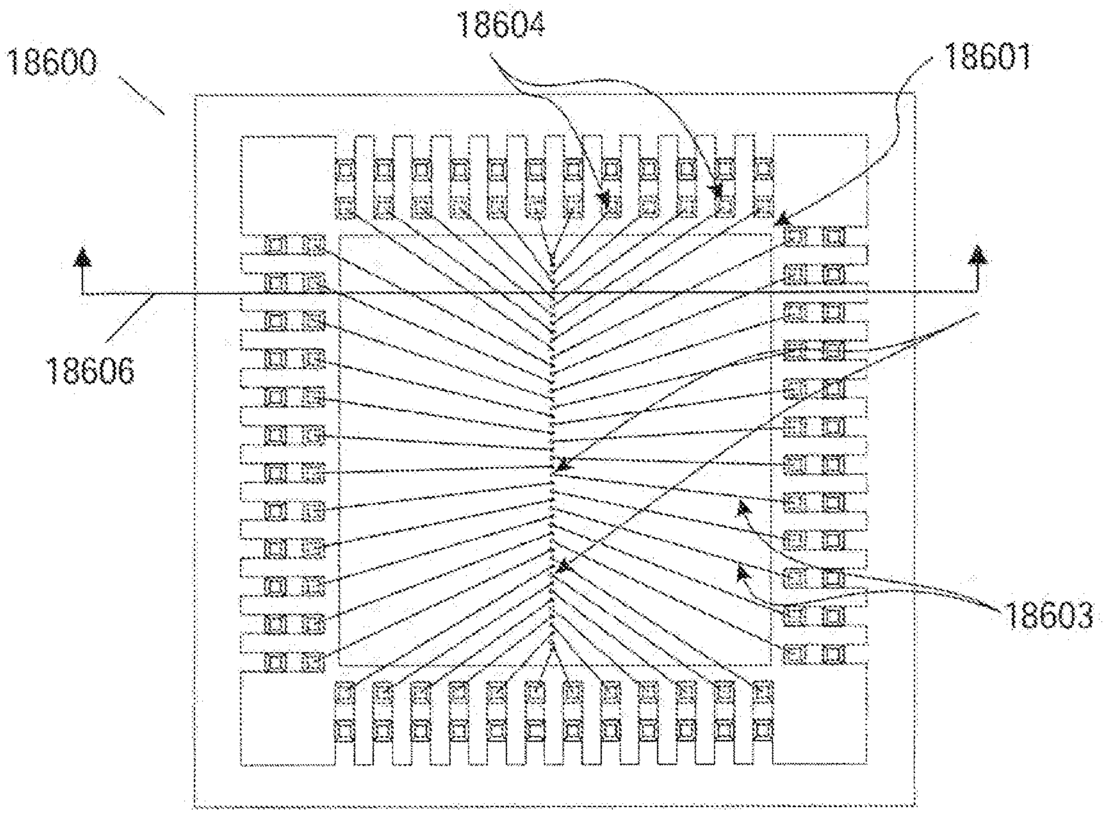
Figure 186B:
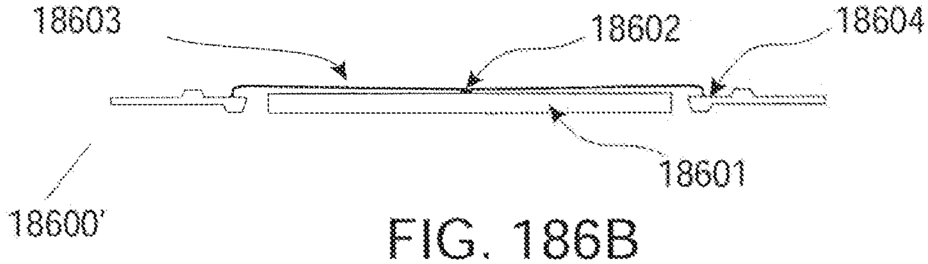

FIGS. 186A and 186B illustrate in top and cross section views a fourth process step for manufacturing an embodiment of the lead frame package.

Figure 187A:
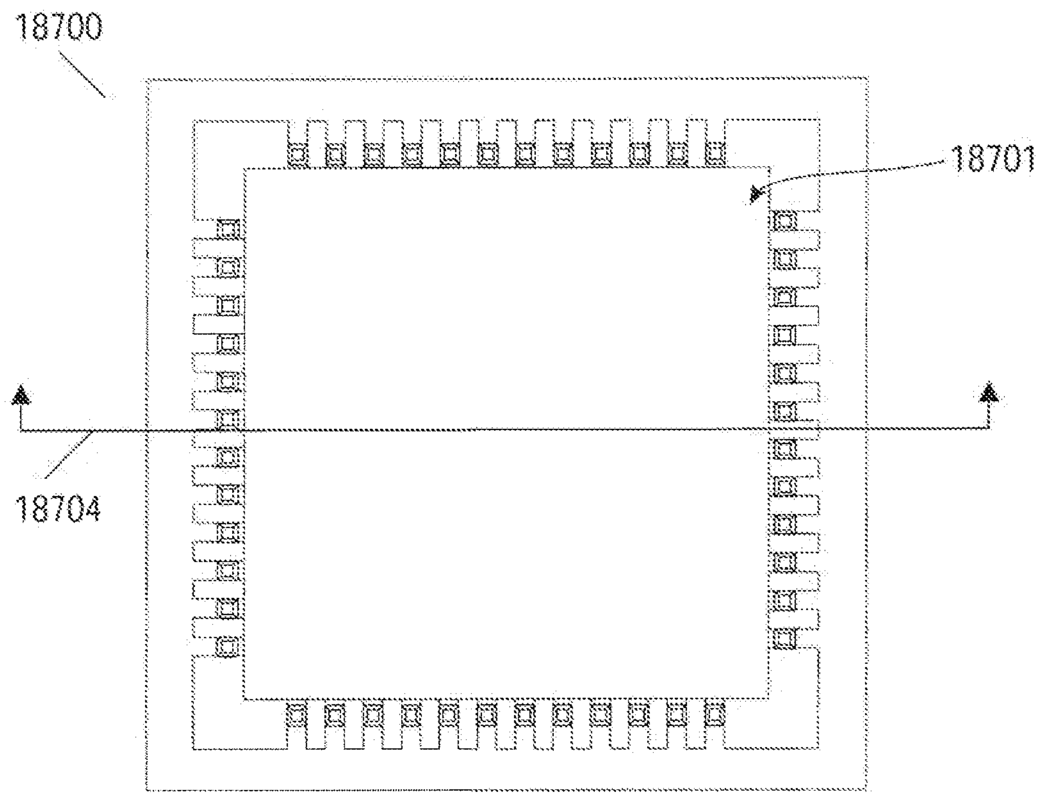
Figure 187B:
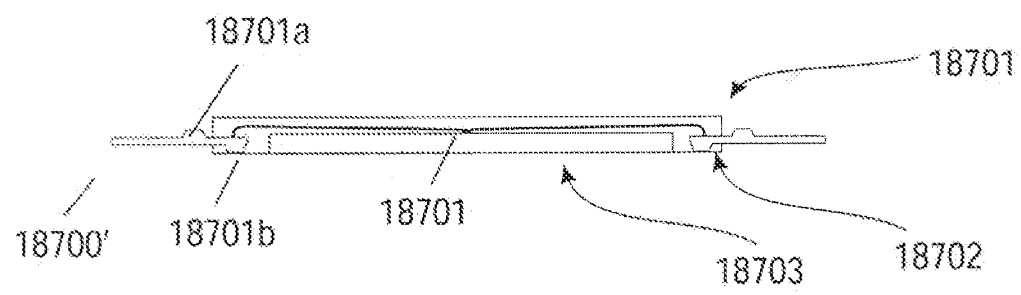

FIGS. 187A and 187B illustrate in top and cross section views a fifth process step for manufacturing an embodiment of the lead frame package.

Figure 188:
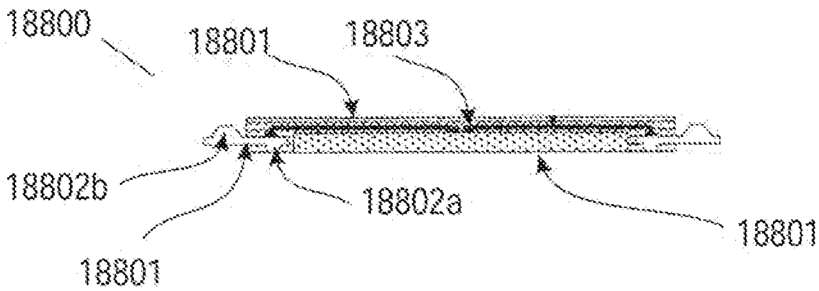

FIG. 188 illustrates in cross section view an embodiment of the lead frame package.

Figure 189:
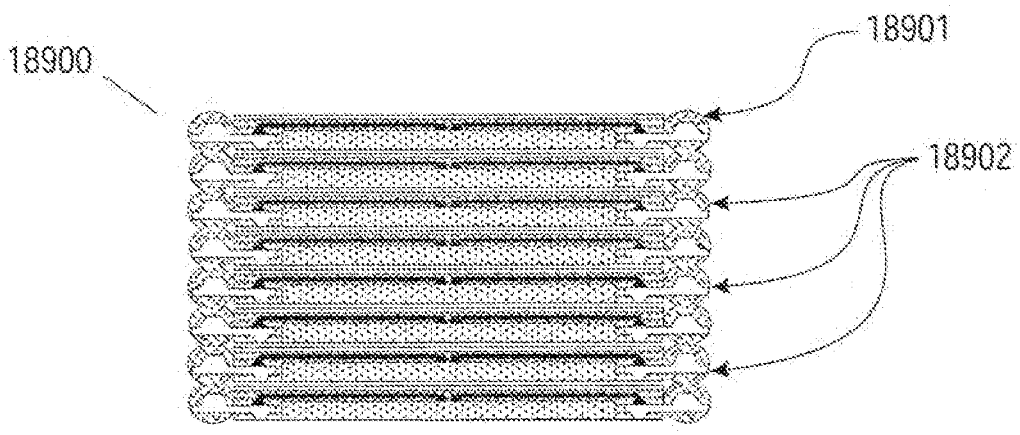

FIG. 189 illustrates in cross section view an assembled embodiment of several of the lead frame packages stacked together.

Figure 190:
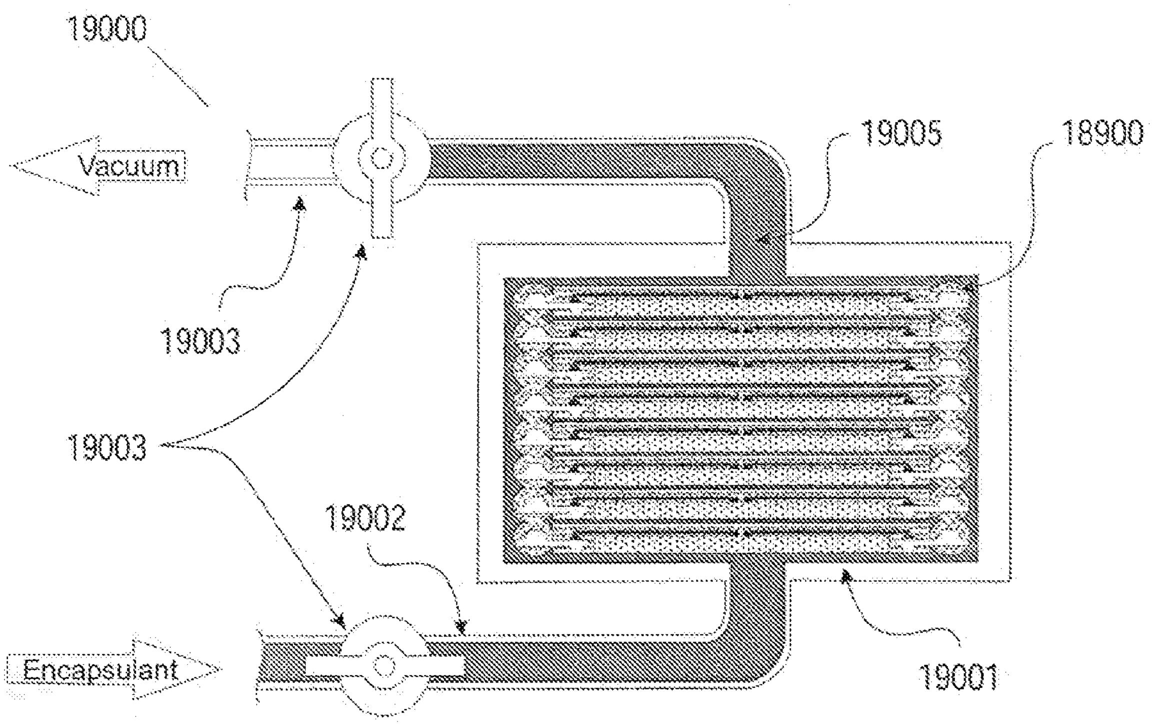

FIG. 190 illustrates in cross section view a process step for manufacturing a stacked embodiment.

Figure 191:
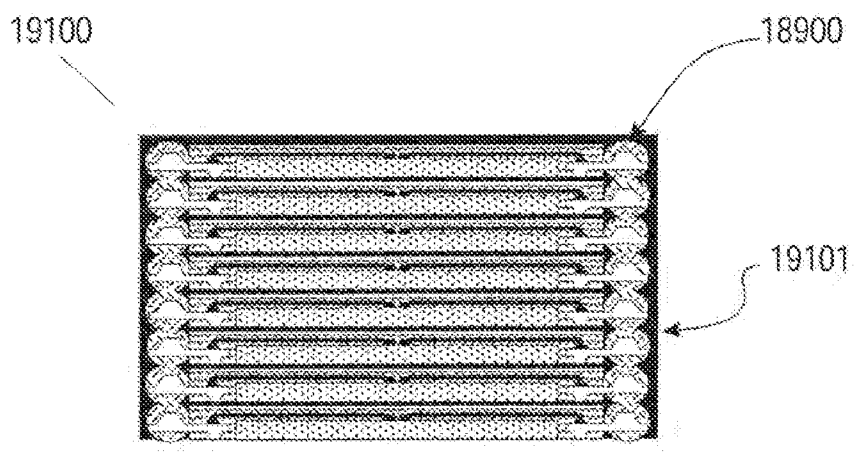

FIG. 191 illustrates in cross section view a completed assembled stacked embodiment.

Figure 192:
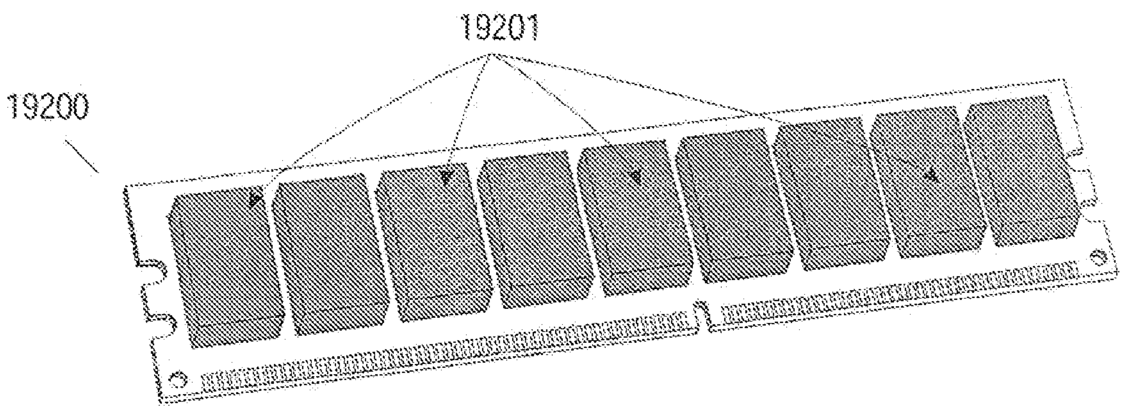

FIG. 192 illustrated one embodiment of several stacked packages assembled on a dual inline memory module (DIMM).

Figure 193A:
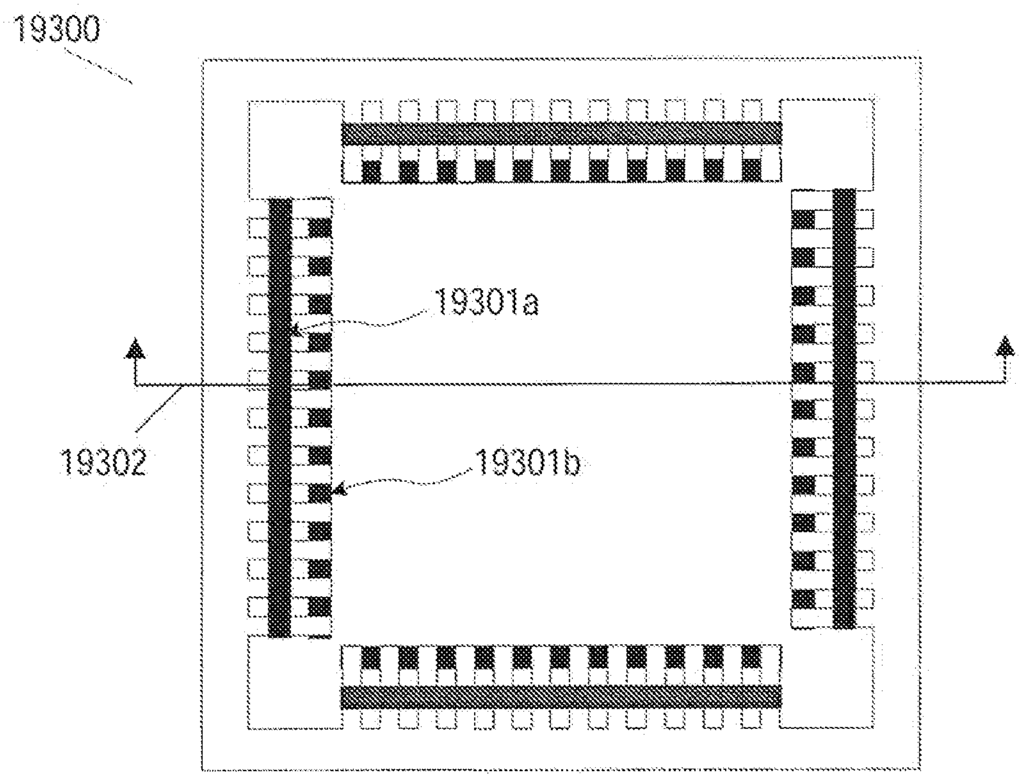
Figure 193B:
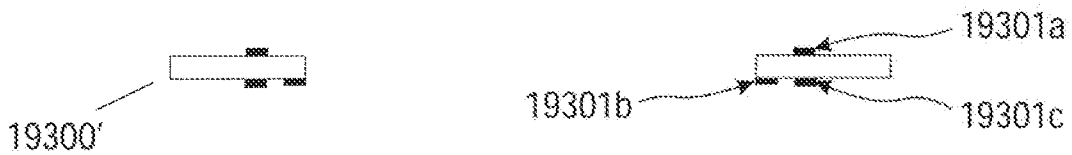

FIGS. 193A-193B illustrate top and cross section views of another embodiment with etch resist applied.

Figure 194A:
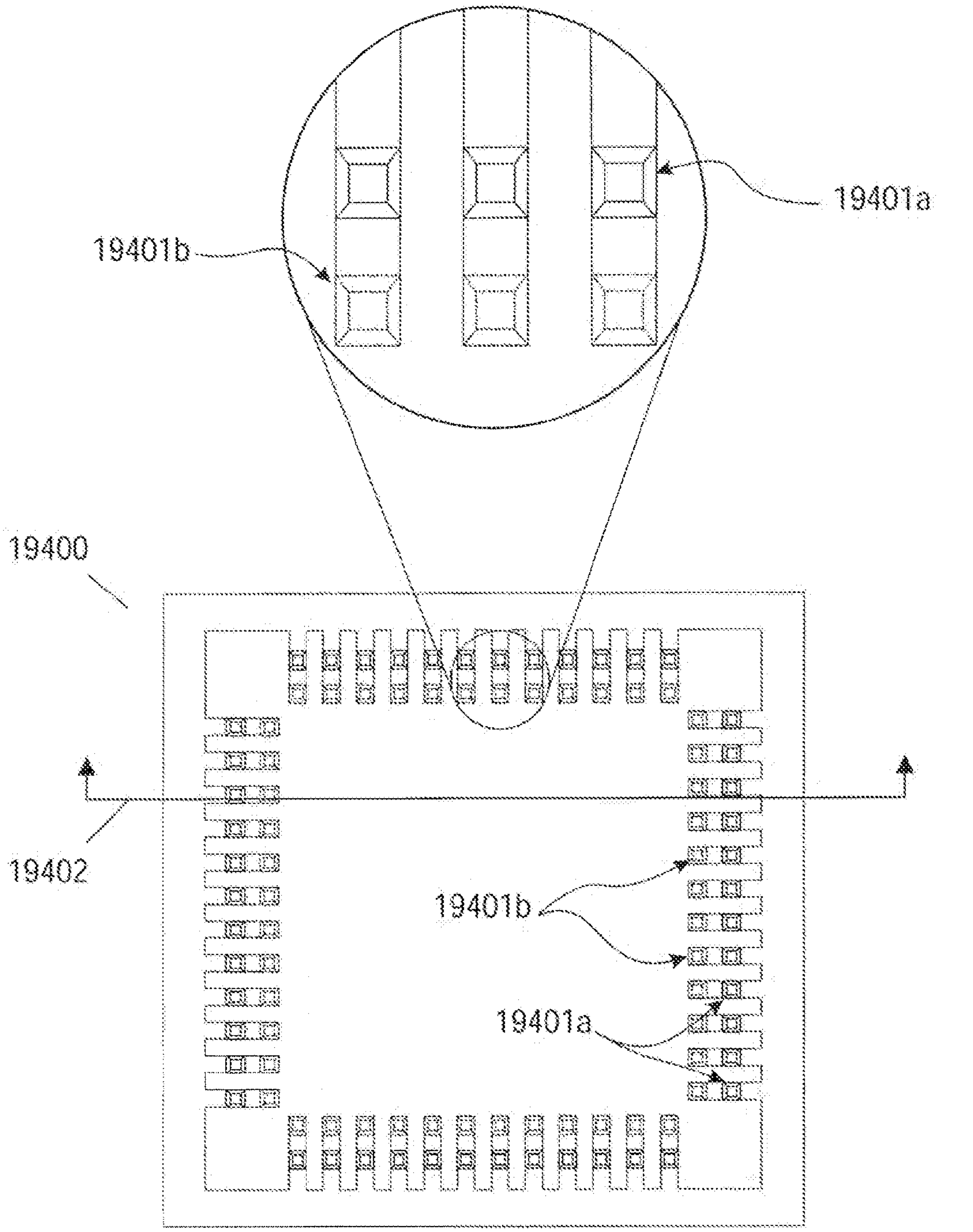
Figure 194B:
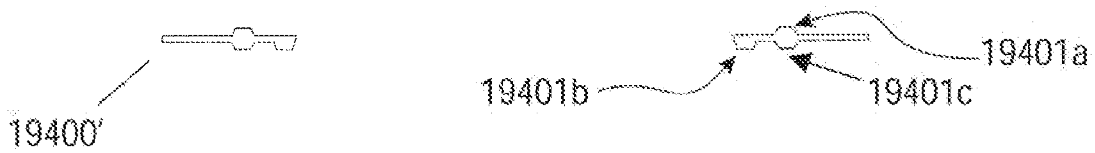

FIGS. 194A-194B illustrate top and cross section views of another embodiment after etching.

Figure 195:
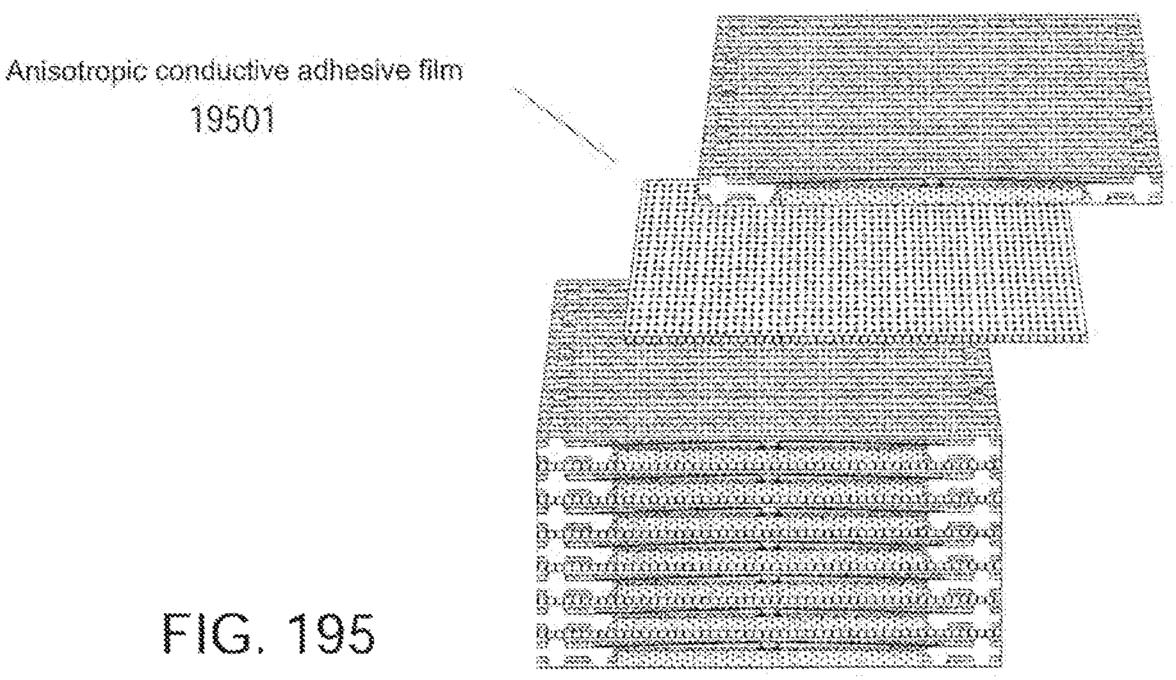

FIG. 195 is a cross section view of another stacked embodiment.

Figure 196:
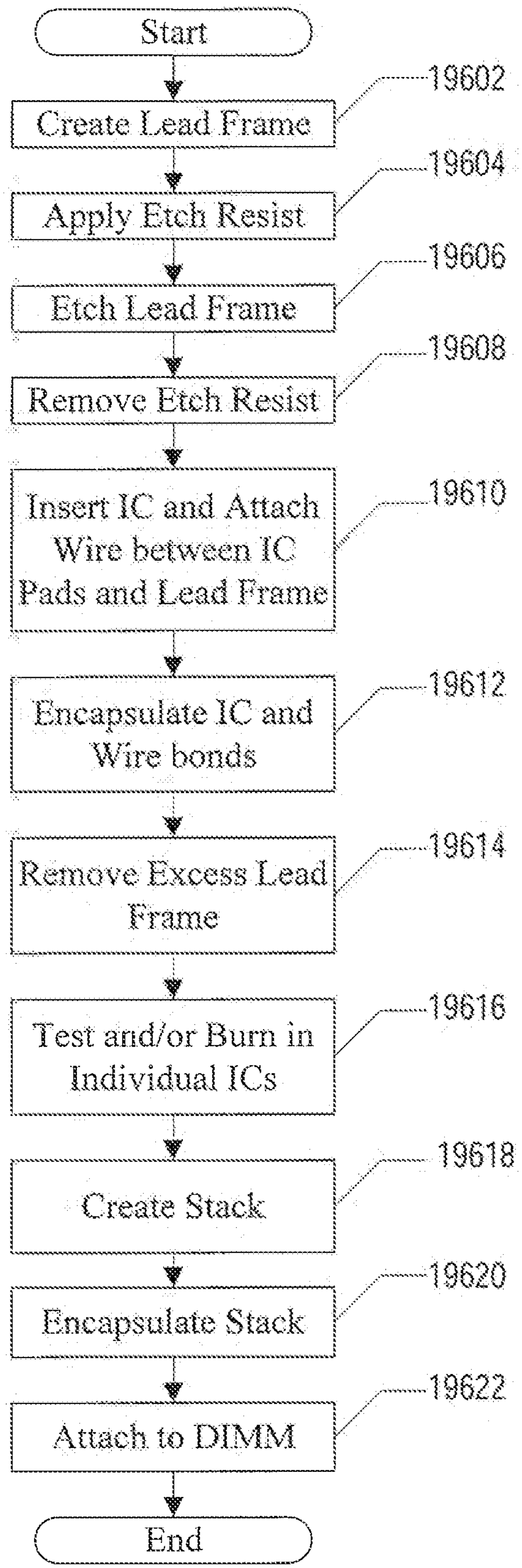

FIG. 196 is a flowchart illustrating one embodiment of a manufacturing process.

Figure 197:
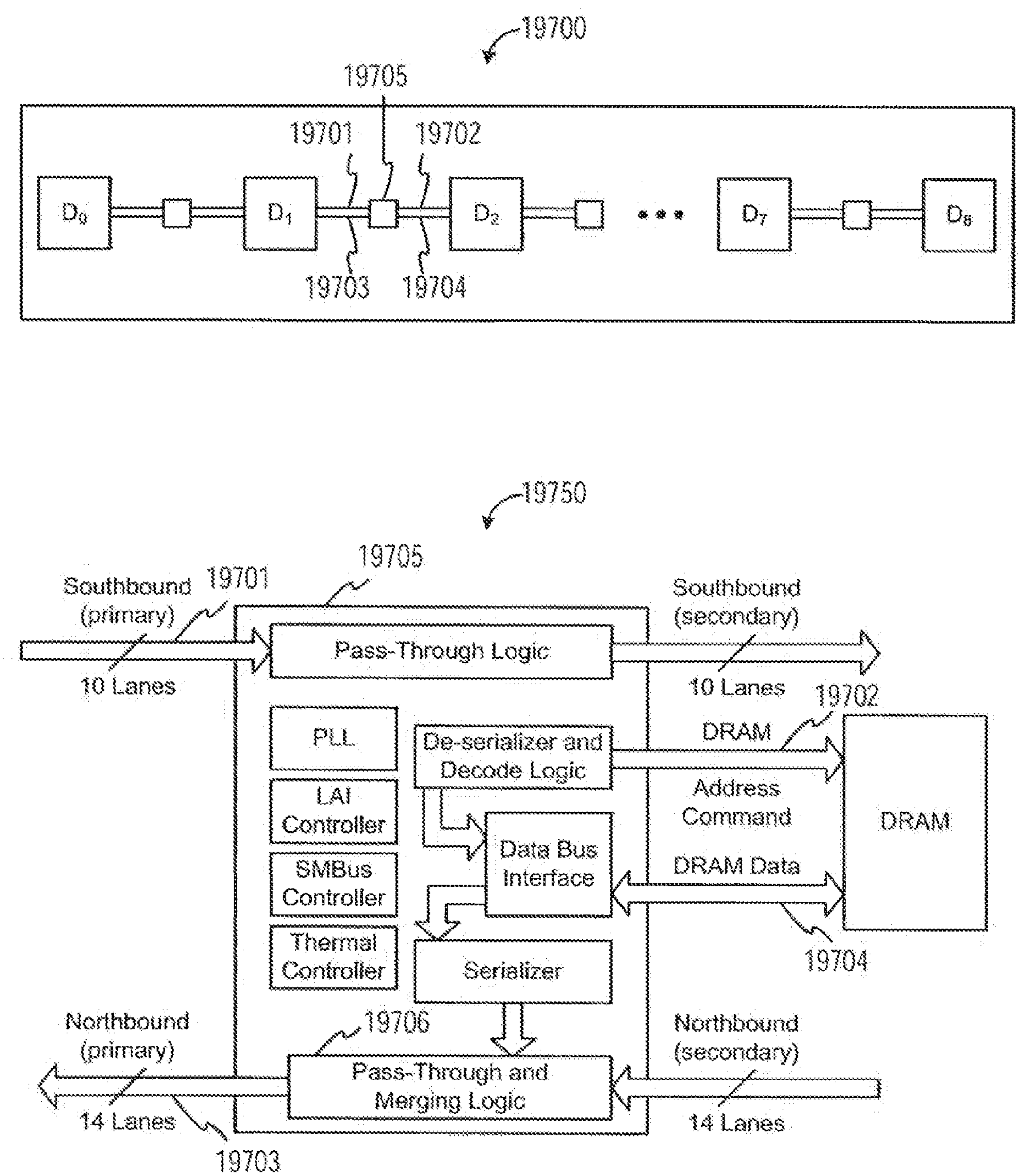

FIG. 197 illustrates an FBDIMM-type memory system, according to prior art.

Figure 198A:
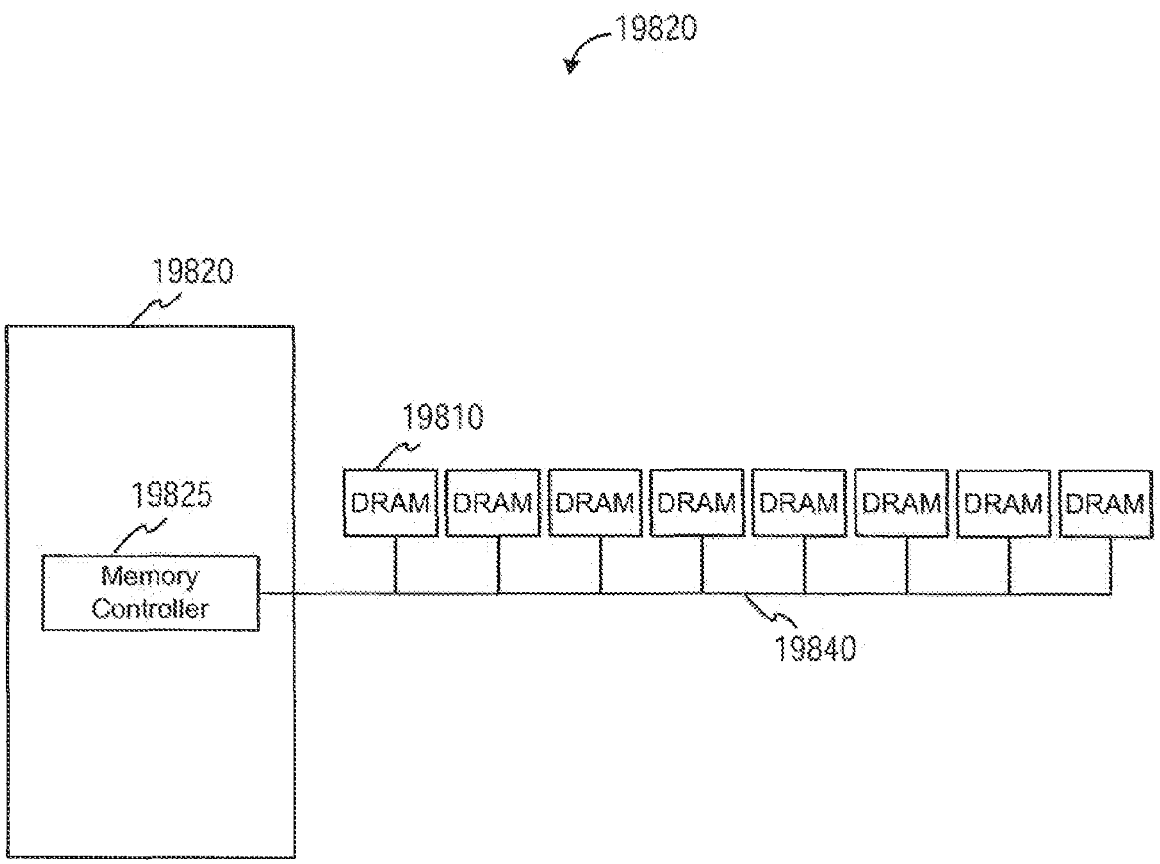

FIG. 198A illustrates major logical components of a computer platform, according to prior art.

Figure 198B:
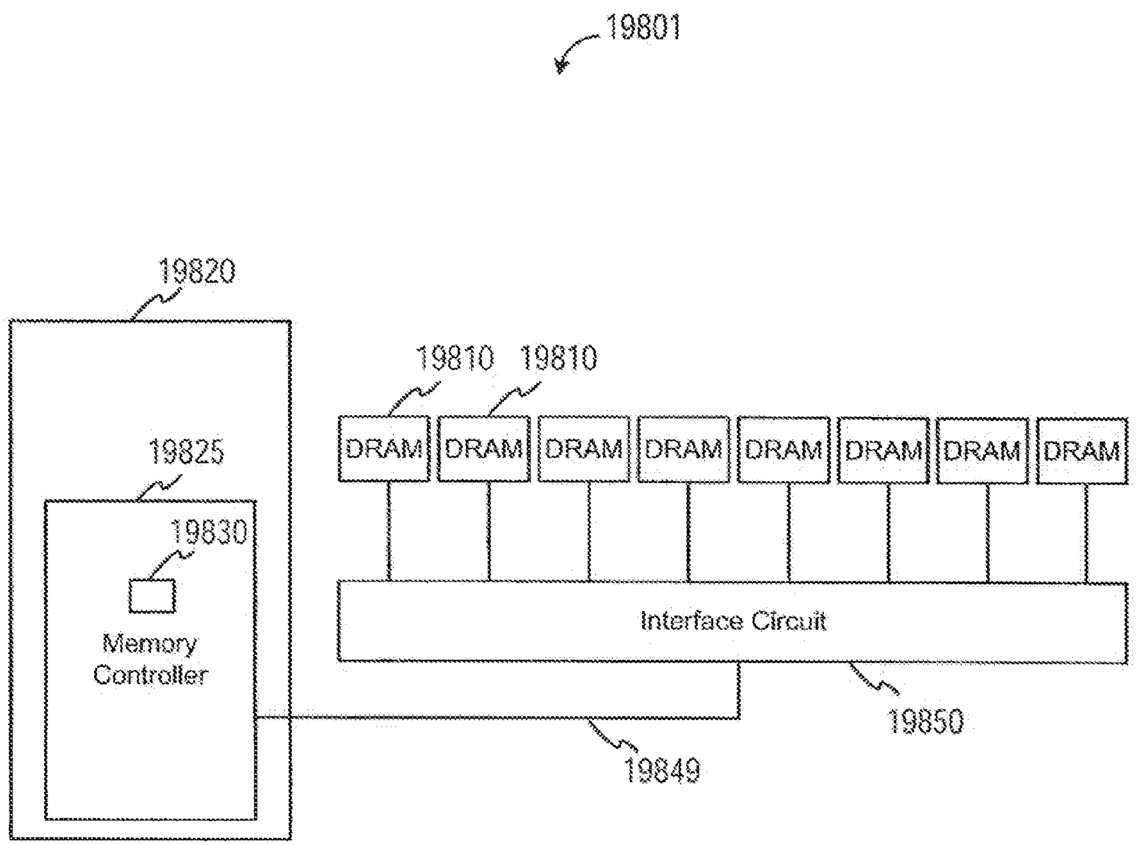

FIG. 198B illustrates major logical components of a computer platform, according to one embodiment of the present invention.

Figure 198C:
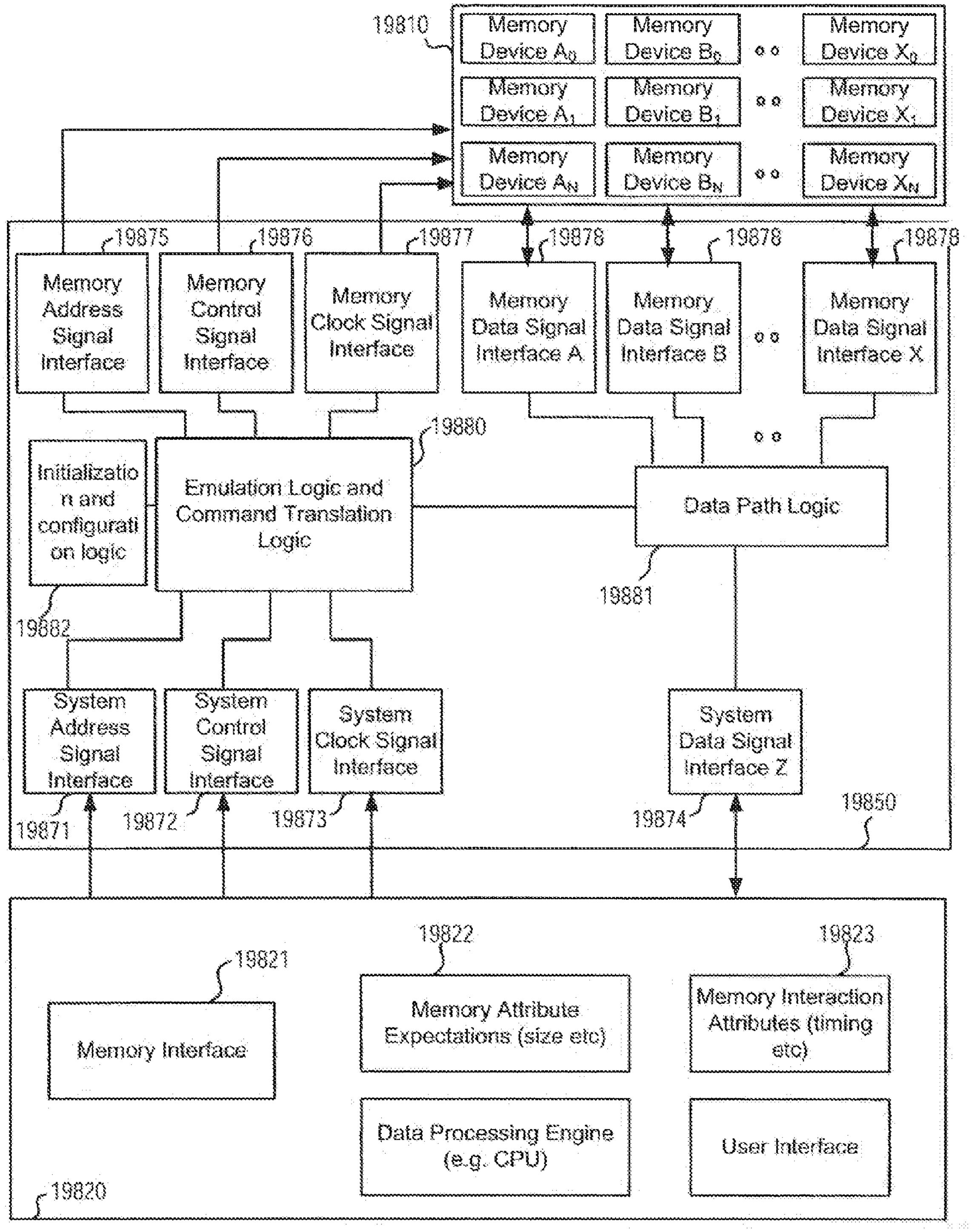

FIG. 198C illustrates a hierarchical view of the major logical components of a computer platform shown in FIG. 198B, according to one embodiment of the present invention.

Figure 199A:
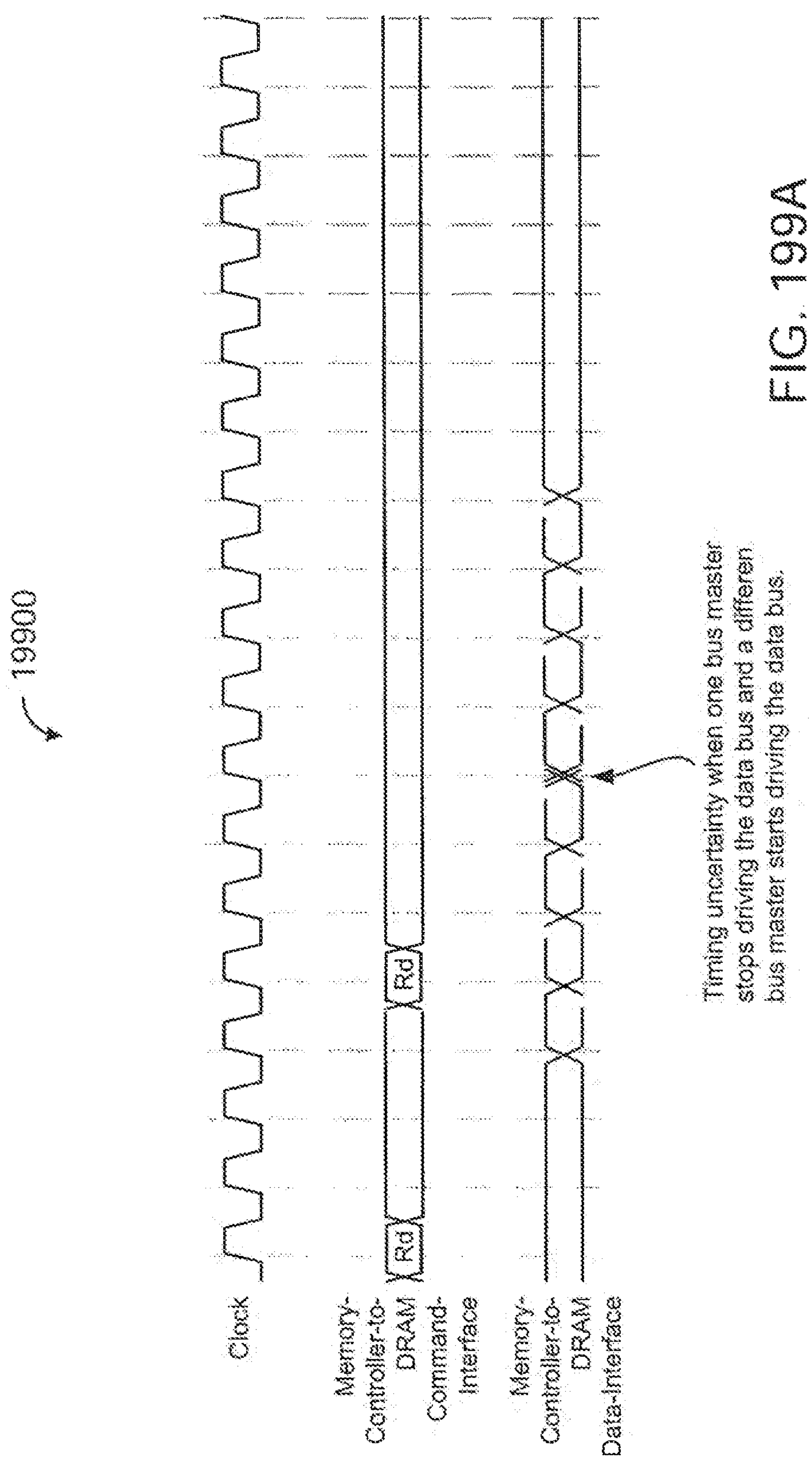

FIG. 199A illustrates a timing diagram for multiple memory devices in a low data rate memory system, according to prior art.

Figure 199B:
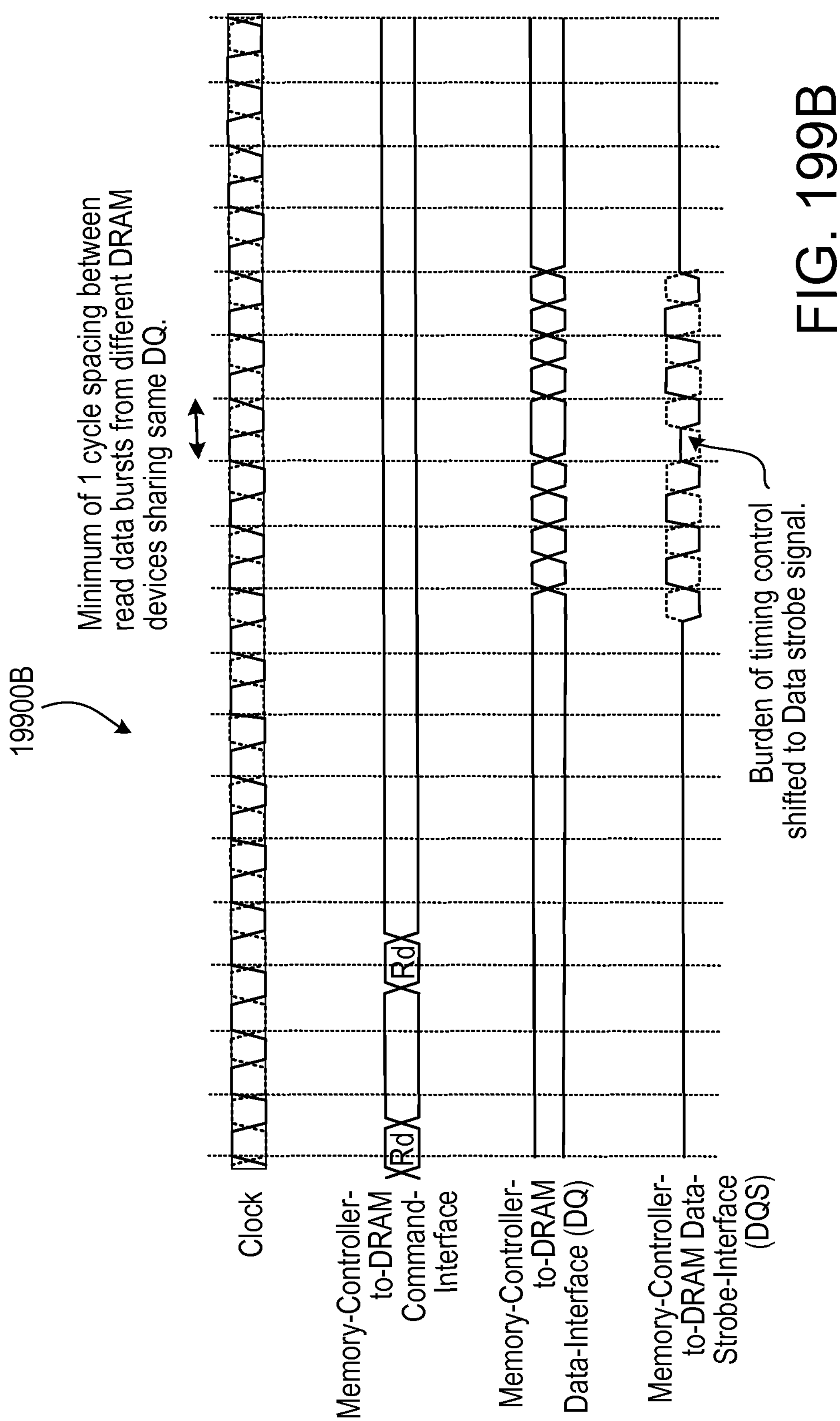

FIG. 199B illustrates a timing diagram for multiple memory devices in a higher data rate memory system, according to prior art.

Figure 199C:
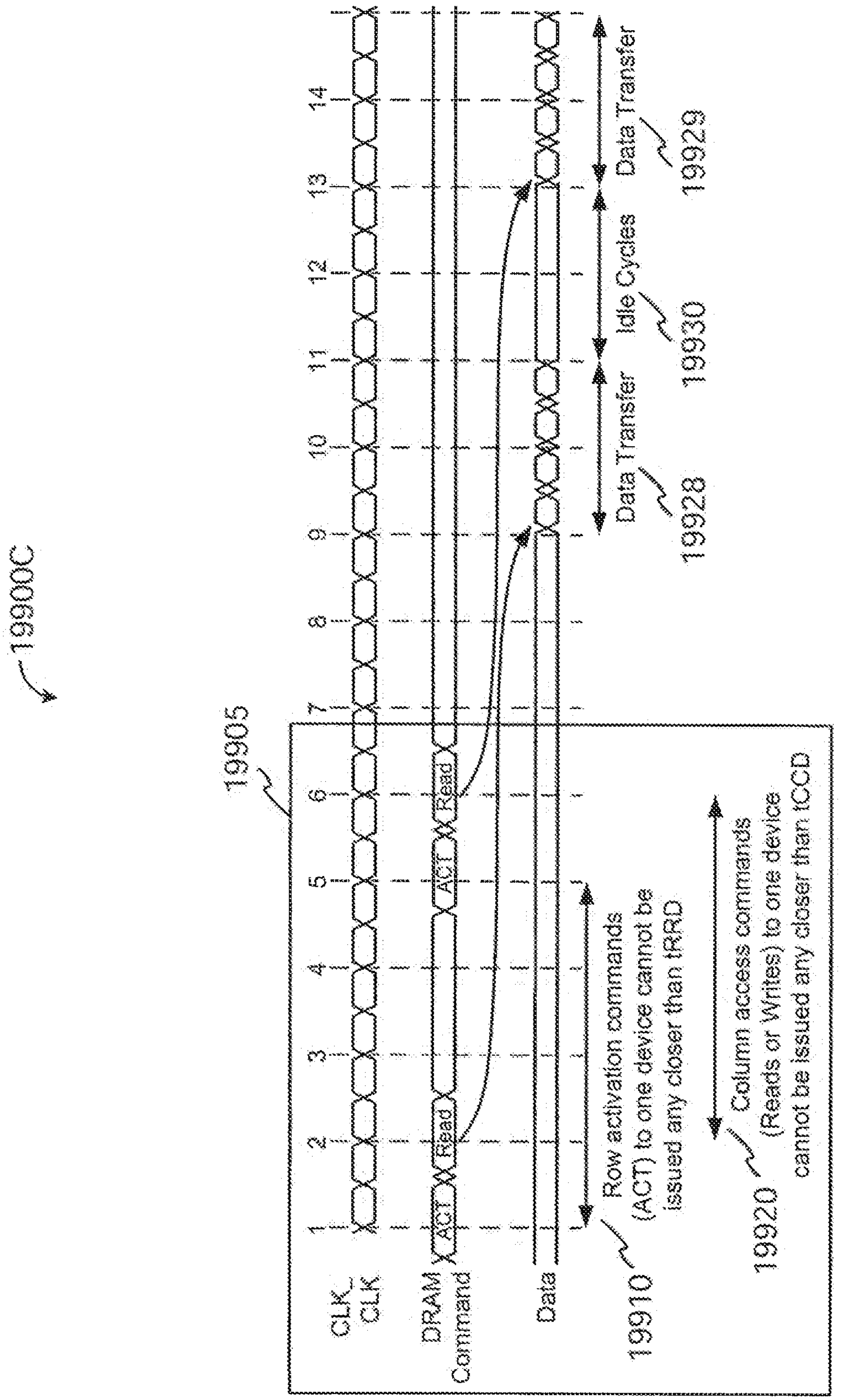

FIG. 199C illustrates a timing diagram for multiple memory devices in a high data rate memory system, according to prior art.

Figure 200A:
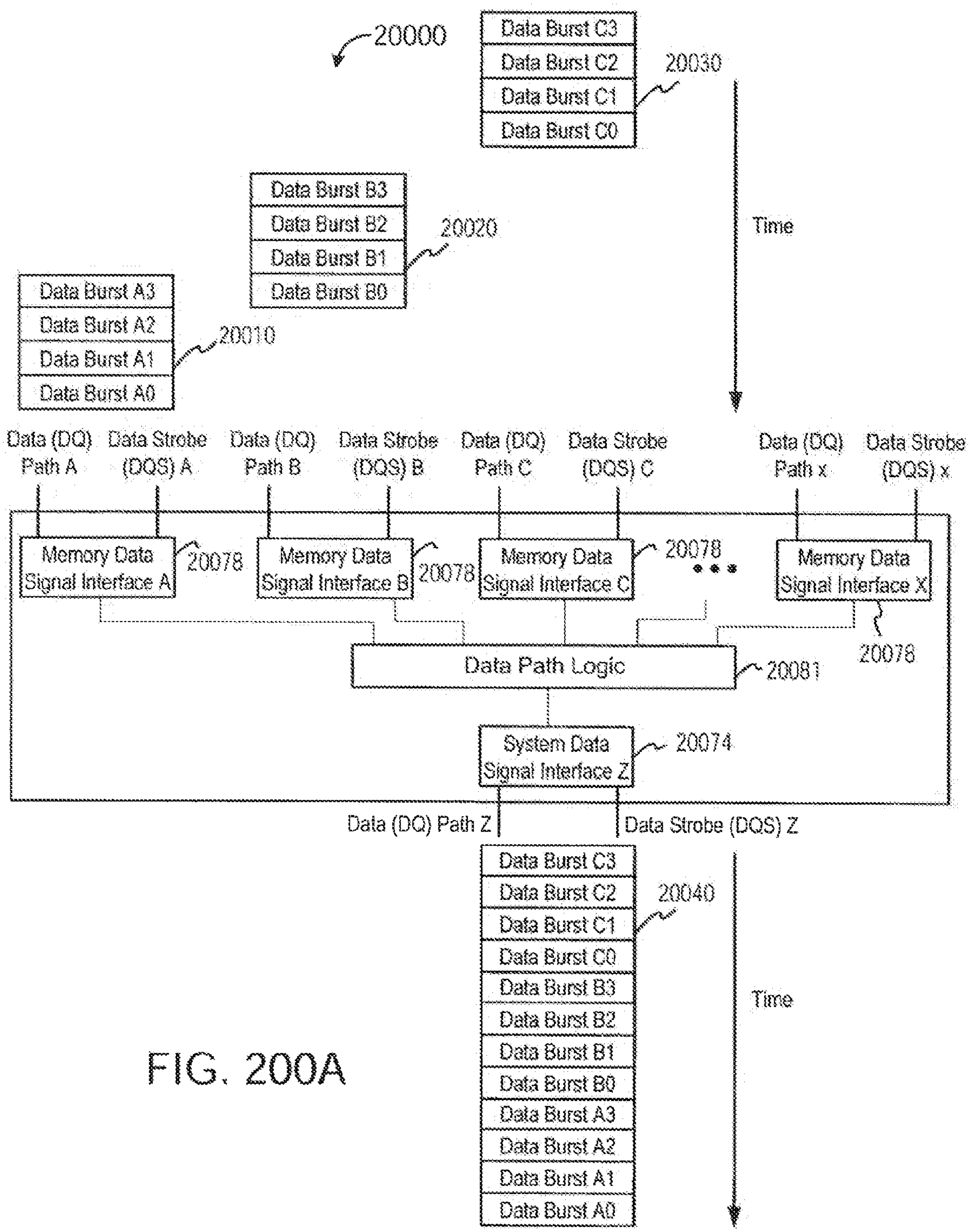

FIG. 200A illustrates a data flow diagram showing how time separated bursts are combined into a larger contiguous burst, according to one embodiment of the present invention.

Figure 200B:
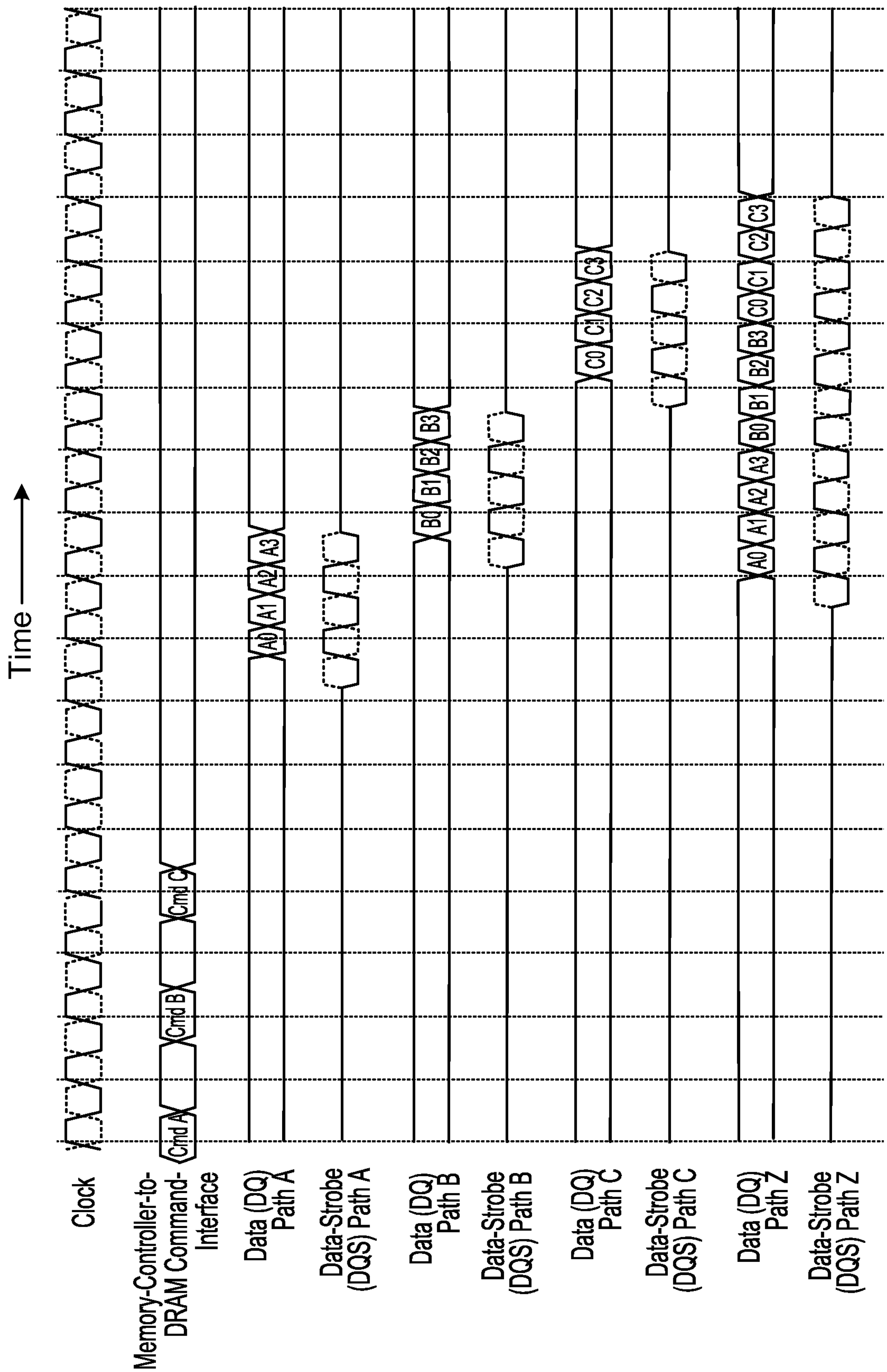

FIG. 200B illustrates a waveform corresponding to FIG. 200A showing how time separated bursts are combined into a larger contiguous burst, according to one embodiment of the present invention.

Figure 200C:
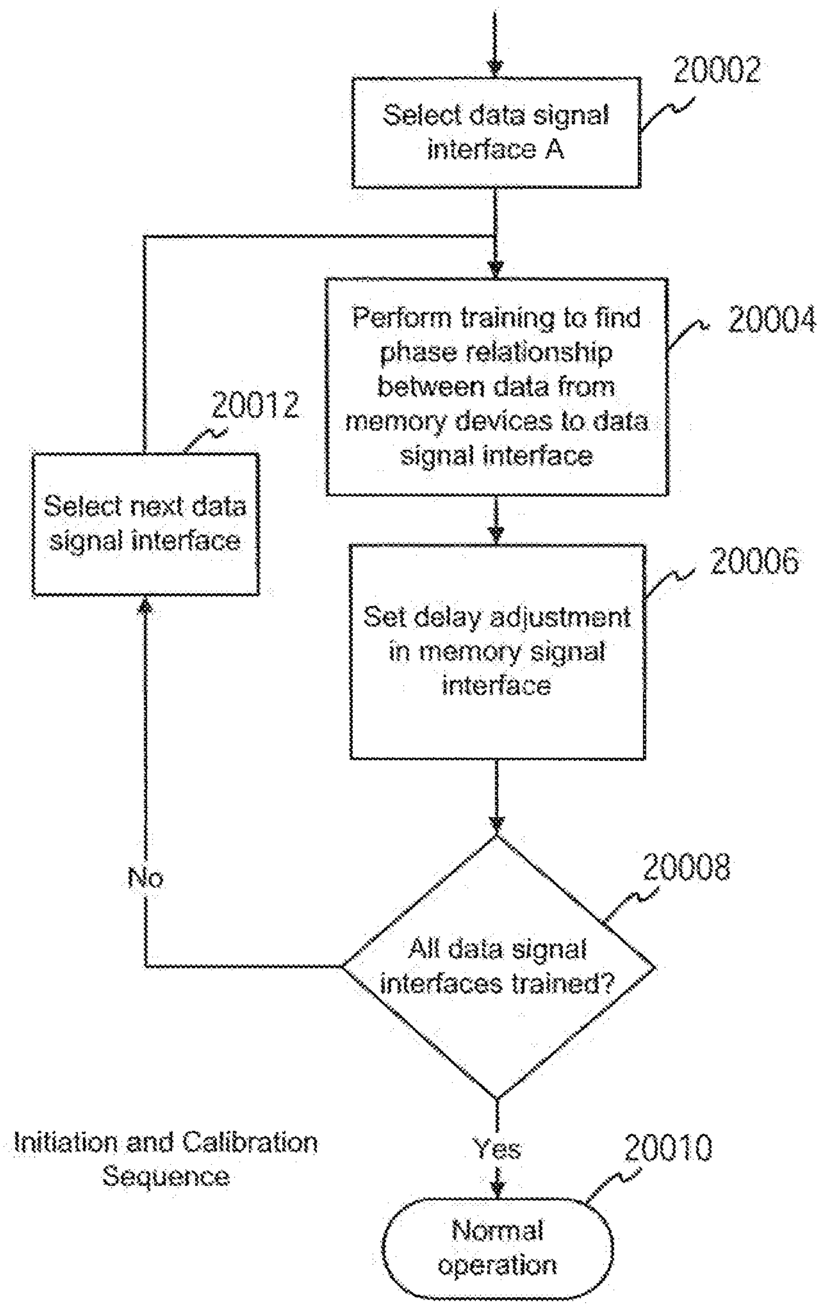

FIG. 200C illustrates a flow diagram of method steps showing how the interface circuit can optionally make use of a training or clock-to-data phase calibration sequence to independently track the clock-to-data phase relationship between the memory components and the interface circuit, according to one embodiment of the present invention.

Figure 200D:
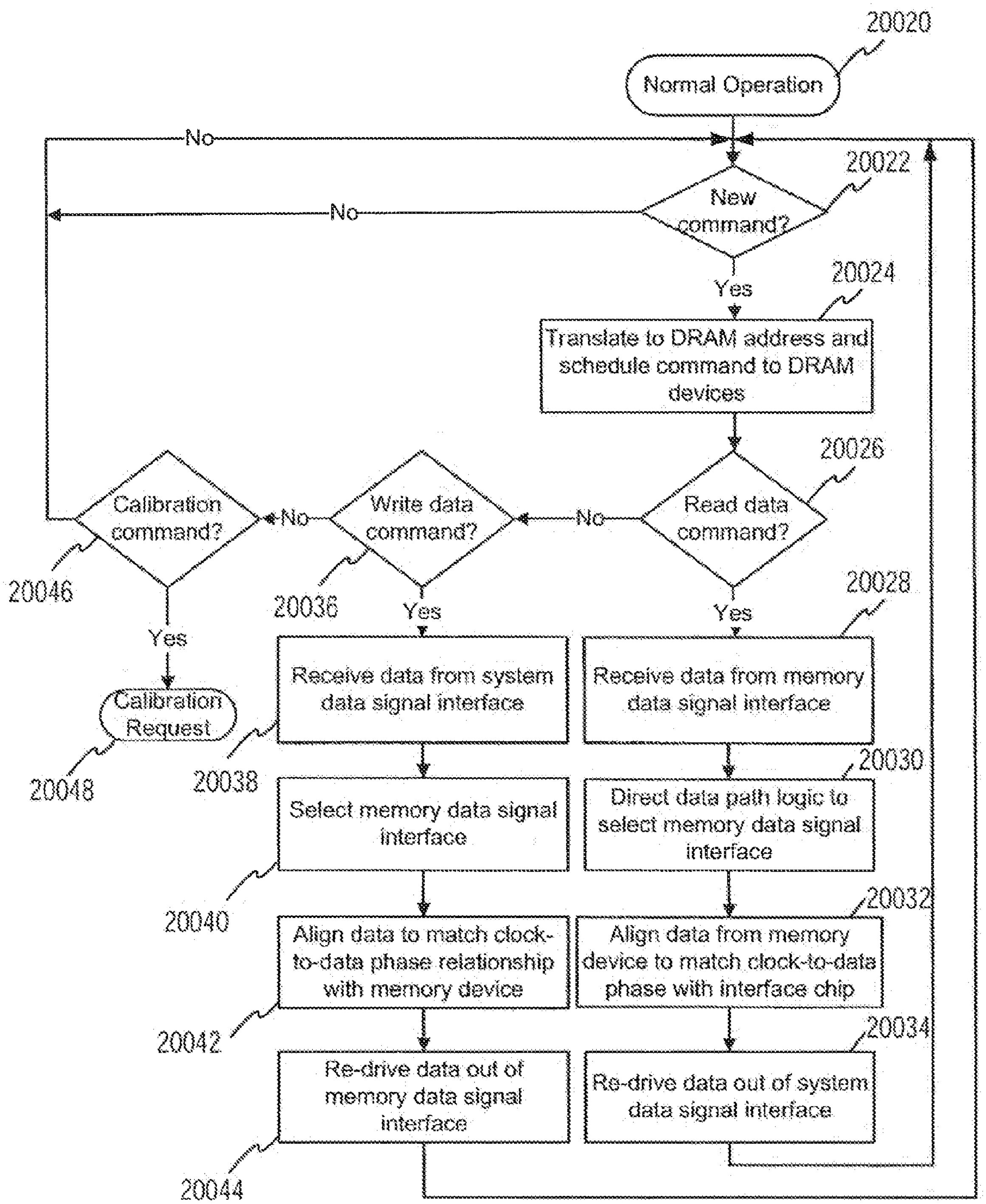

FIG. 200D illustrates a flow diagram showing the operations of the interface circuit in response to the various commands, according to one embodiment of the present invention.

FIGS. 201A through 201F illustrates a computer platform that includes at least one processing element and at least one memory module, according to various embodiments of the present invention.

Figure 202:
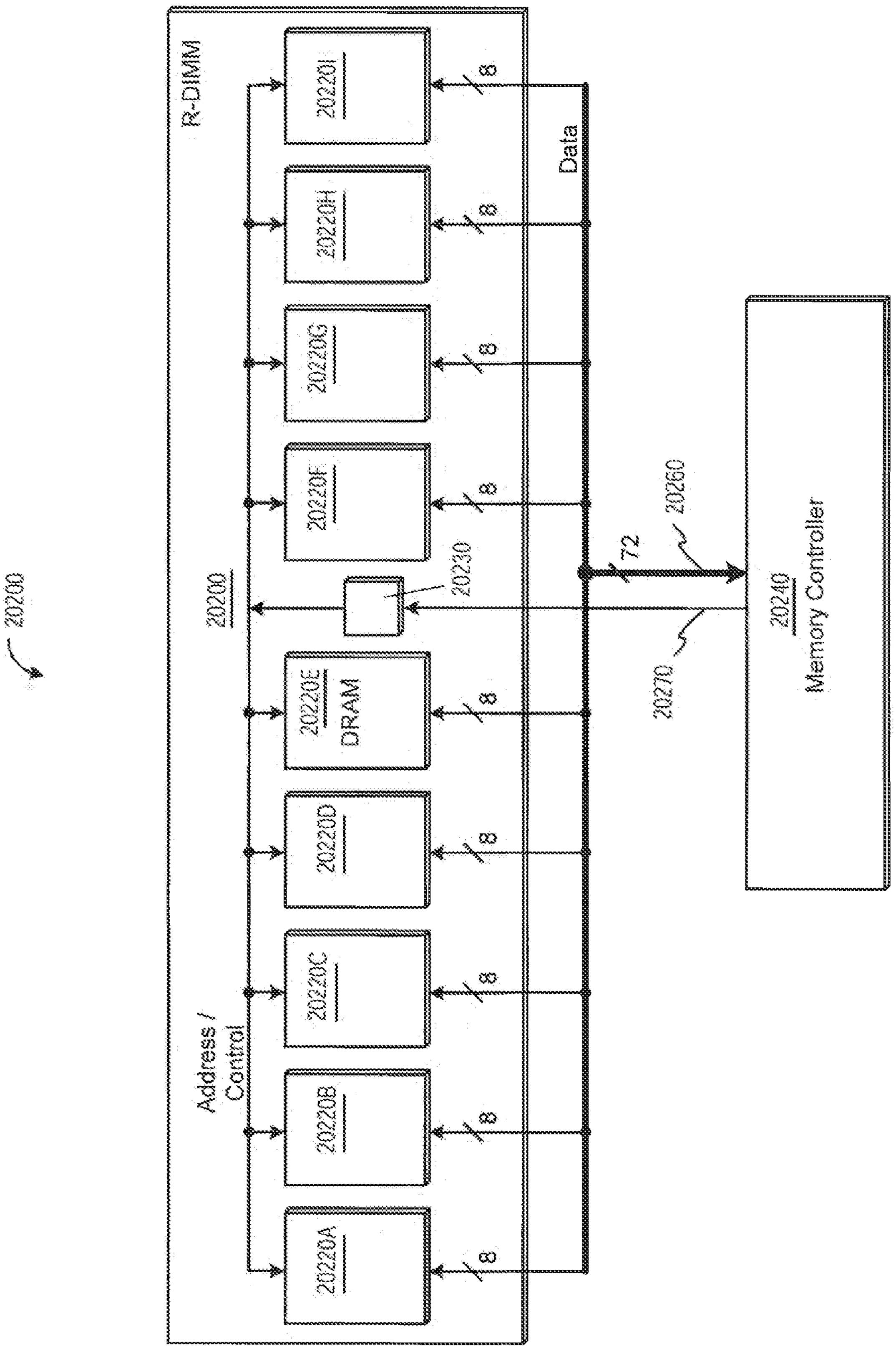

FIG. 202 illustrates a memory subsystem, one component of which is a single-rank memory module (e.g. registered DIMM or R-DIMM) that uses ×8 memory circuits (e.g. DRAMs), according to prior art.

Figure 203:
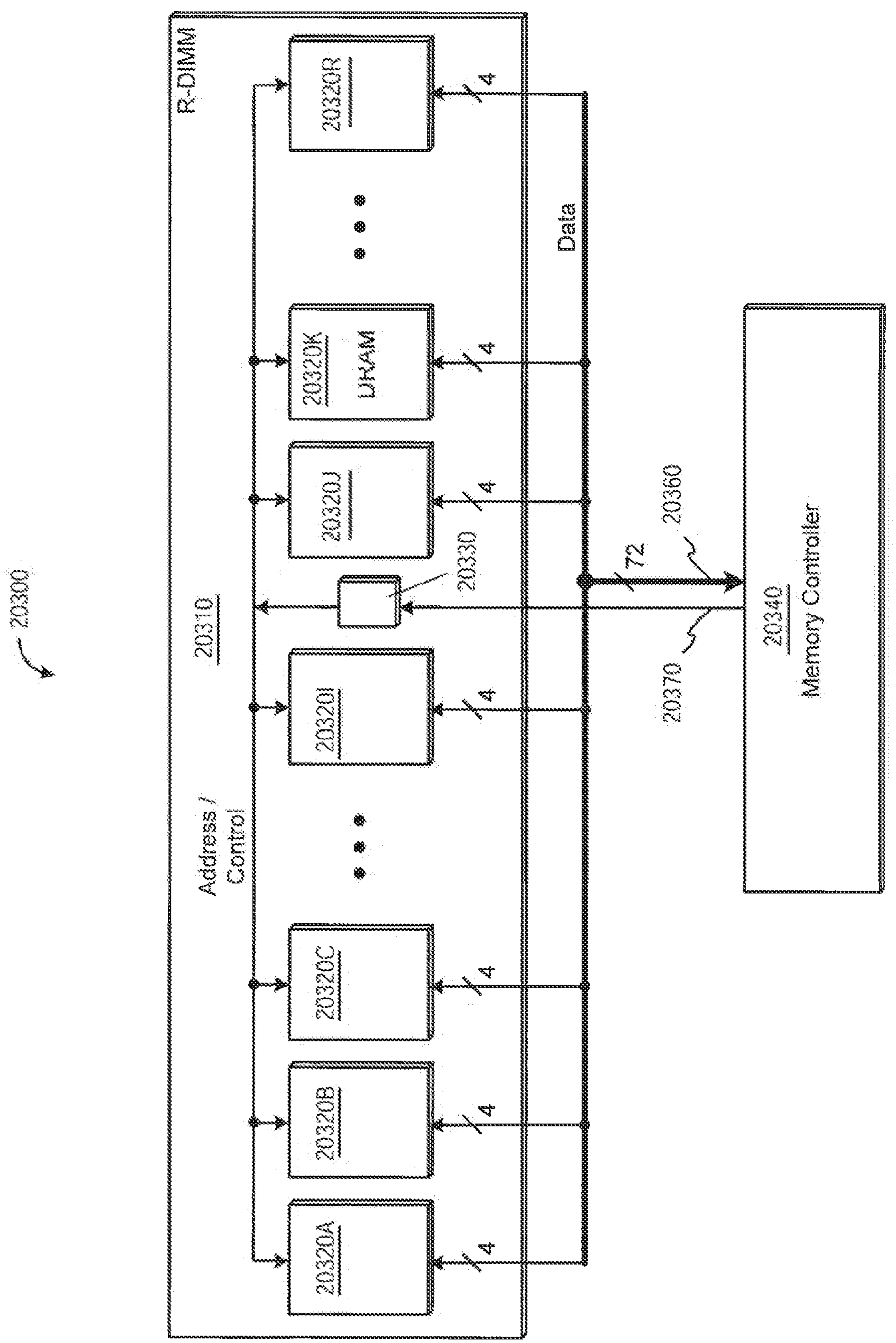

FIG. 203 illustrates a memory subsystem, one component of which is a single-rank memory module that uses ×4 memory circuits, according to prior art.

Figure 204:
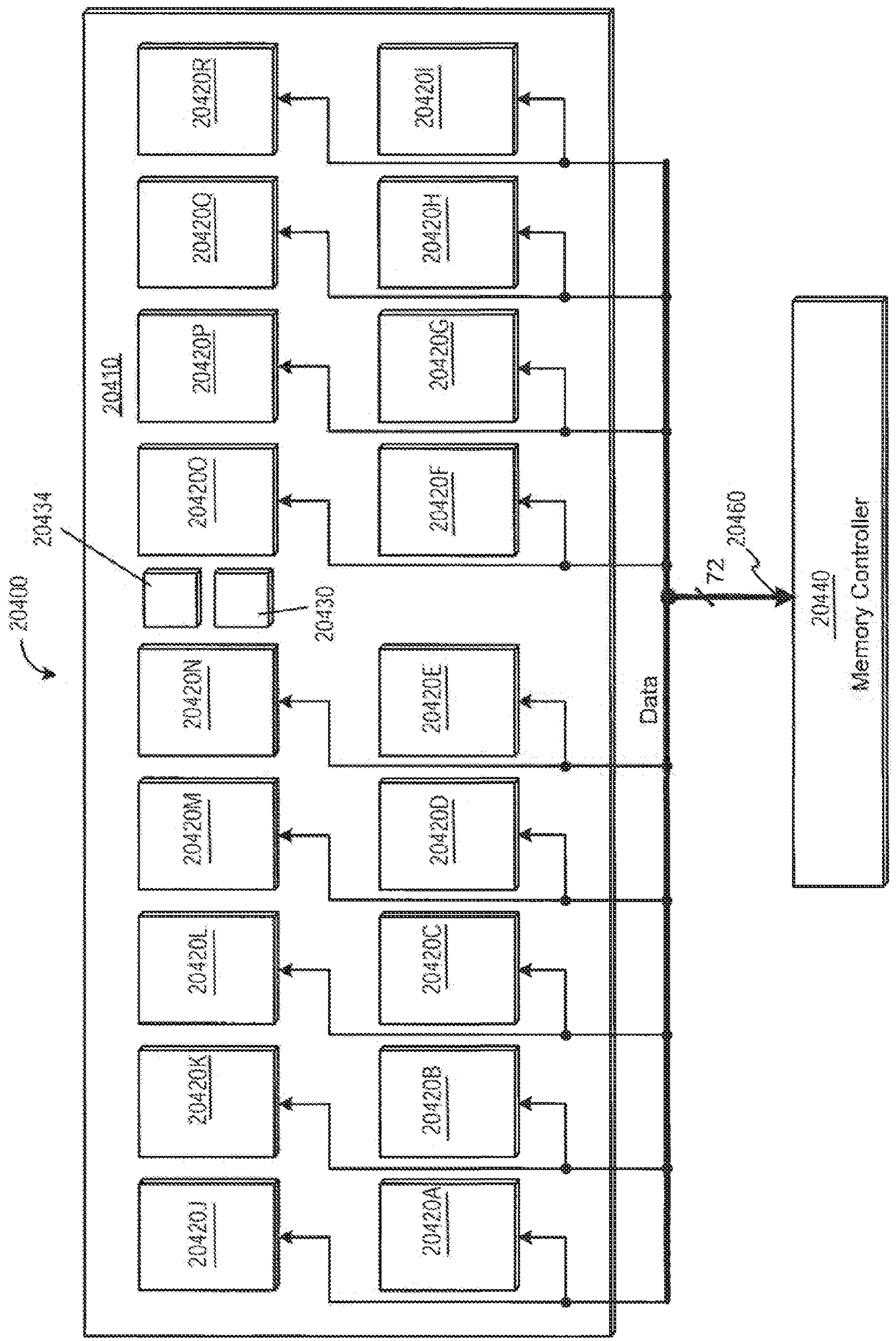

FIG. 204 illustrates a memory subsystem, one component of which is a dual-rank registered memory module that uses ×8 memory circuits, according to prior art.

Figure 205:
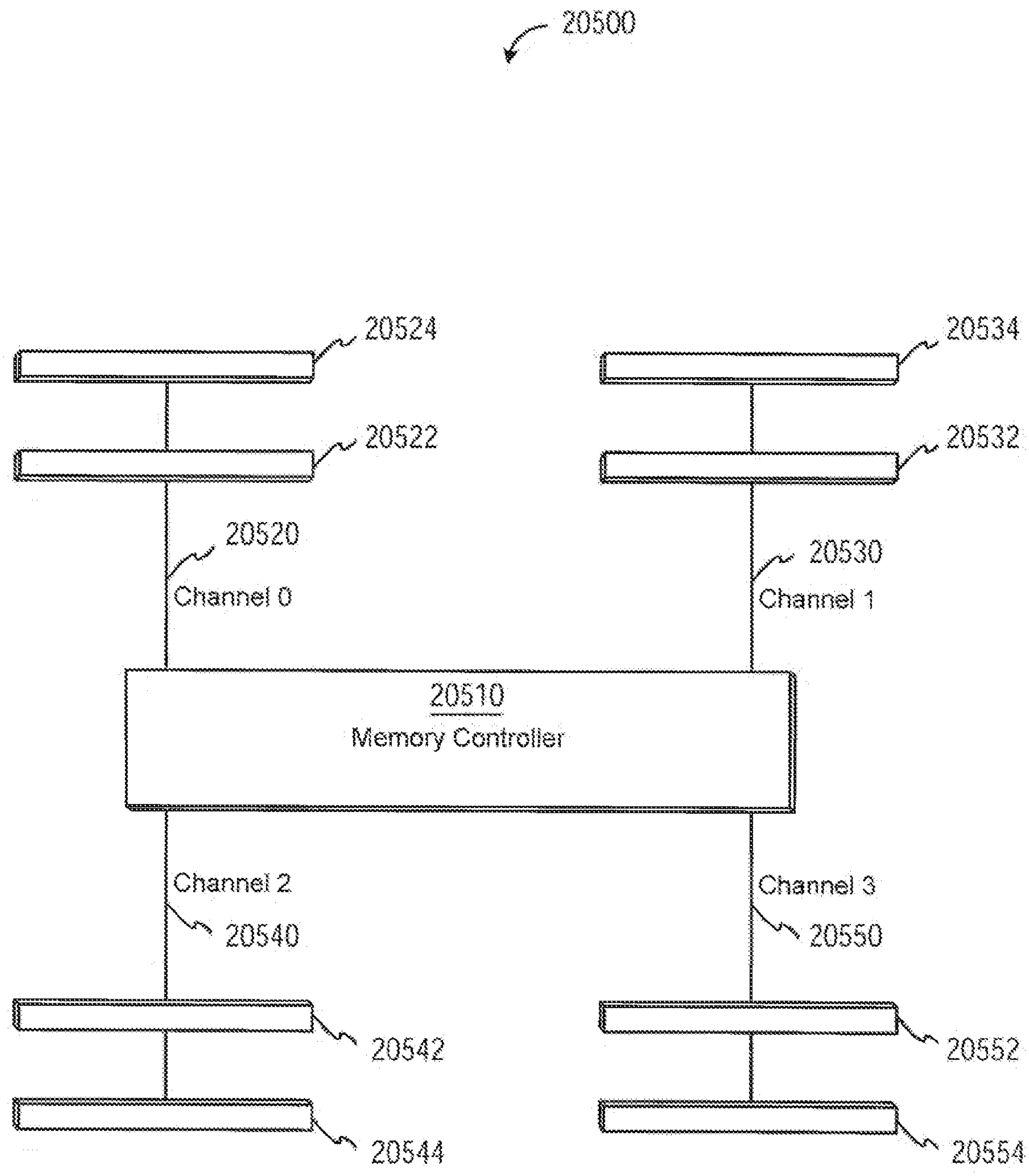

FIG. 205 illustrates a memory subsystem that includes a memory controller with four memory channels and two memory modules per channel, according to prior art.

Figure 206:
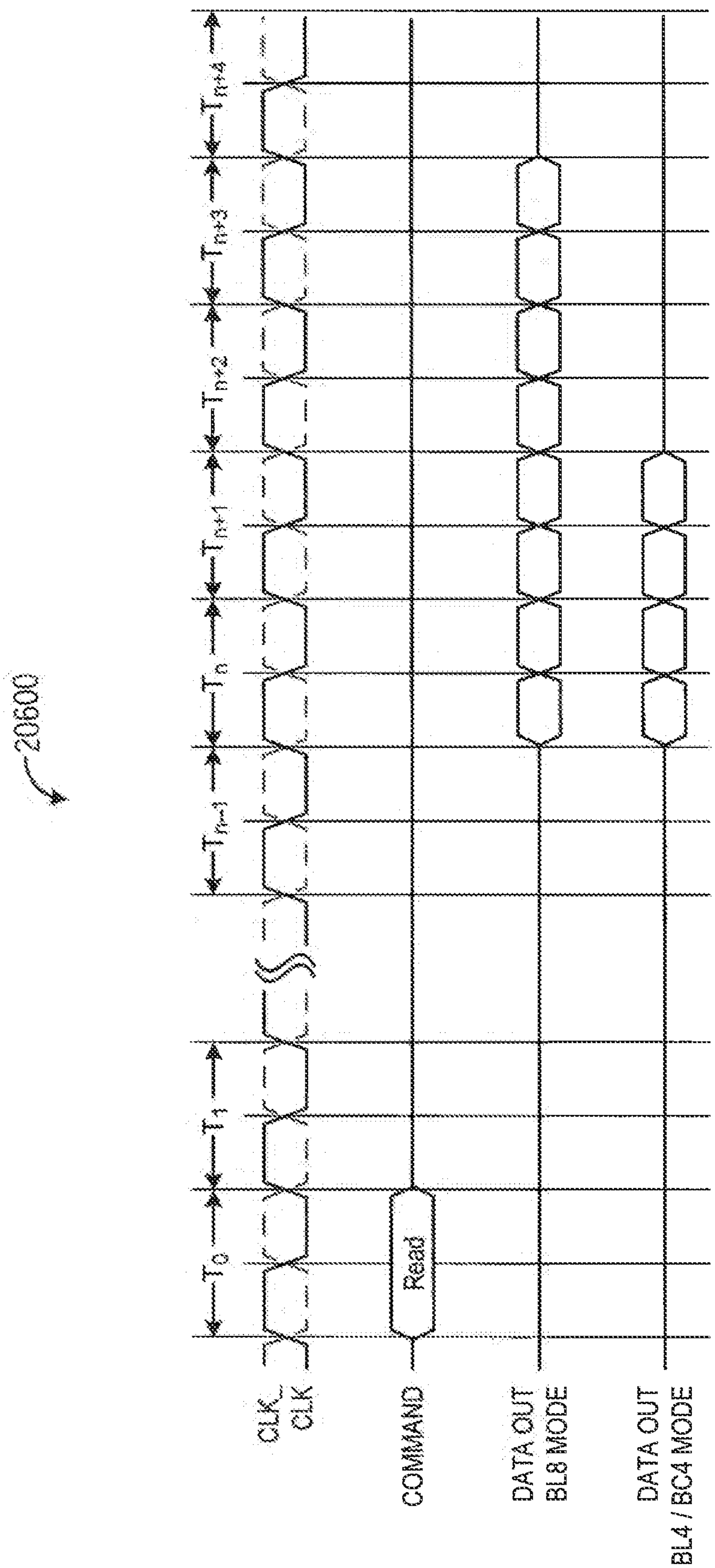

FIG. 206 illustrates a timing diagram of a burst length of 8 (BL8) read to a rank of memory circuits on a memory module and that of a burst length or burst chop of 4 (BL4 or BC4) read to a rank of memory circuits on a memory module.

Figure 207:
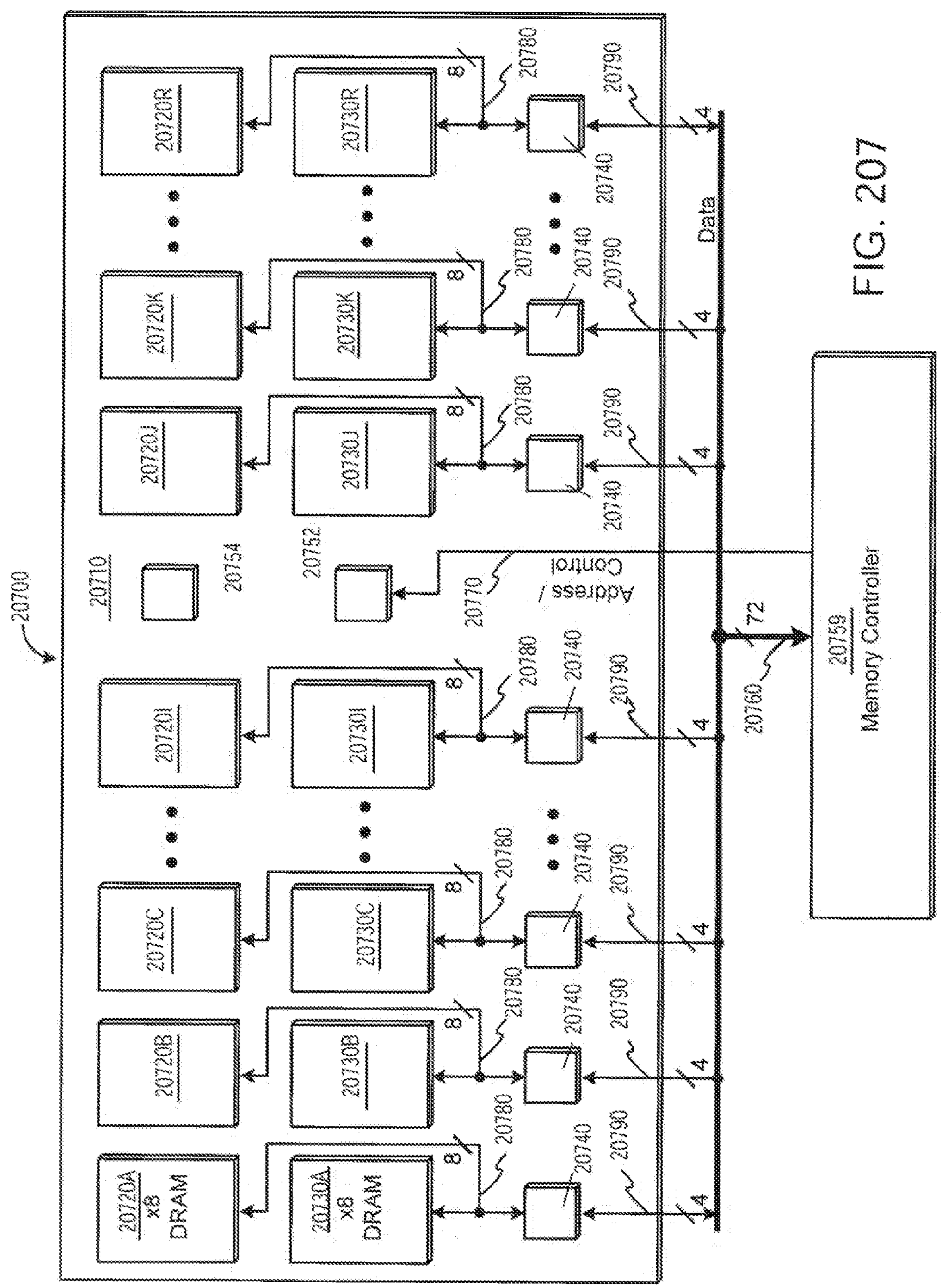

FIG. 207 illustrates a memory subsystem, one component of which is a memory module with a plurality of memory circuits and one or more interface circuits, according to one embodiment of the present invention.

Figure 208:
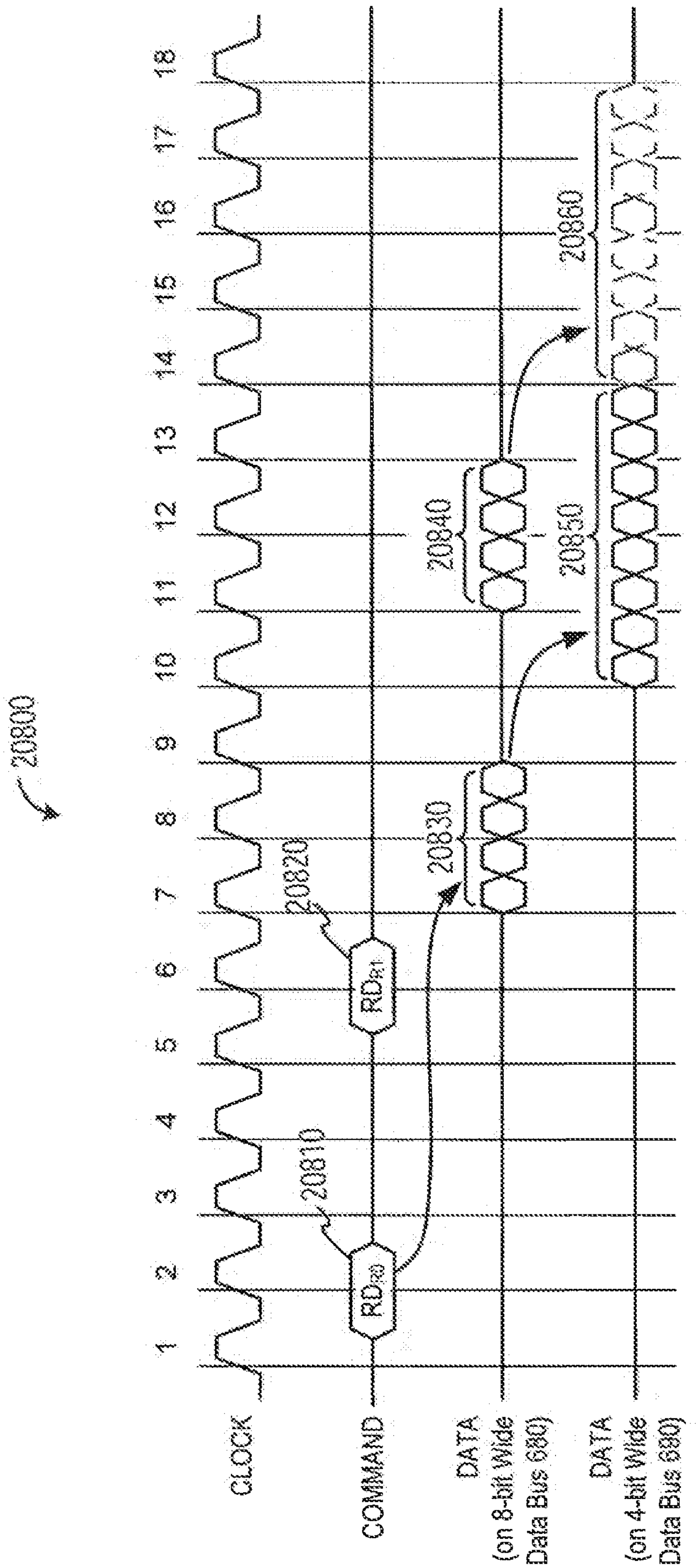

FIG. 208 illustrates a timing diagram of a read to a first rank on a memory module followed by a read to a second rank on the same memory module, according to an embodiment of the present invention.

Figure 209:
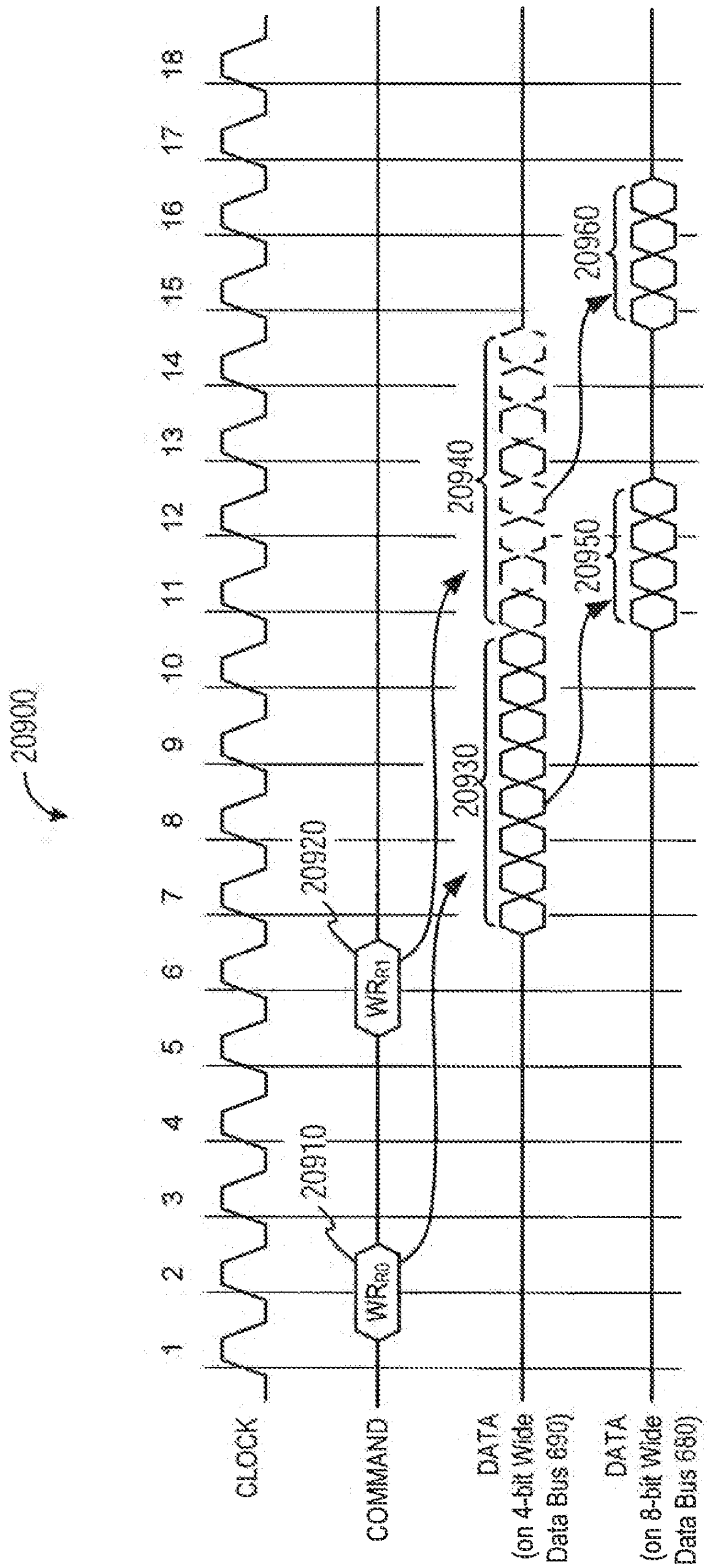

FIG. 209 illustrates a timing diagram of a write to a first rank on a memory module followed by a write to a second rank on the same module, according to an embodiment of the present invention.

Figure 210:
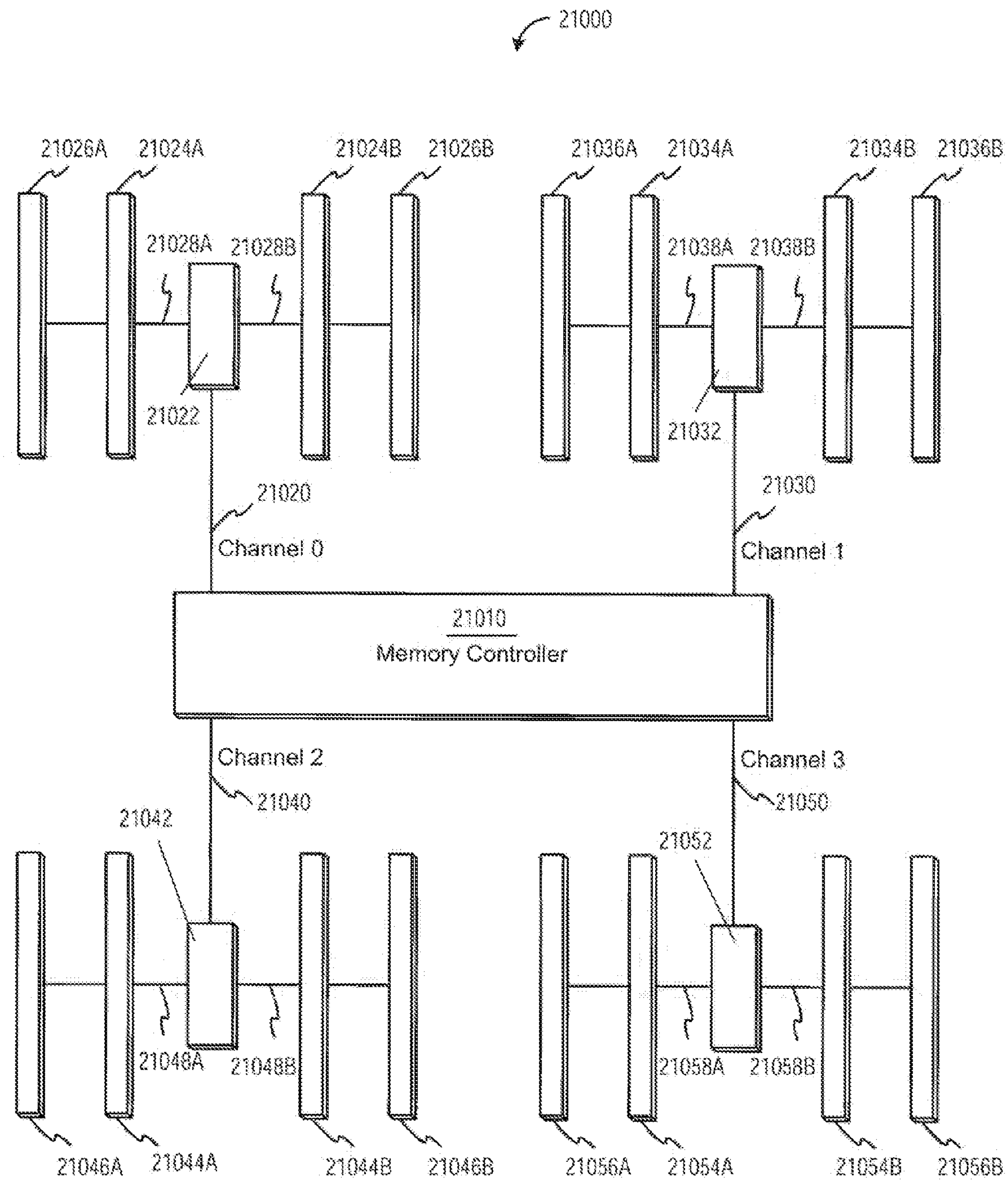

FIG. 210 illustrates a memory subsystem that includes a memory controller with four memory channels, where each channel includes one or more interface circuits and four memory modules, according to another embodiment of the present invention.

Figure 211:
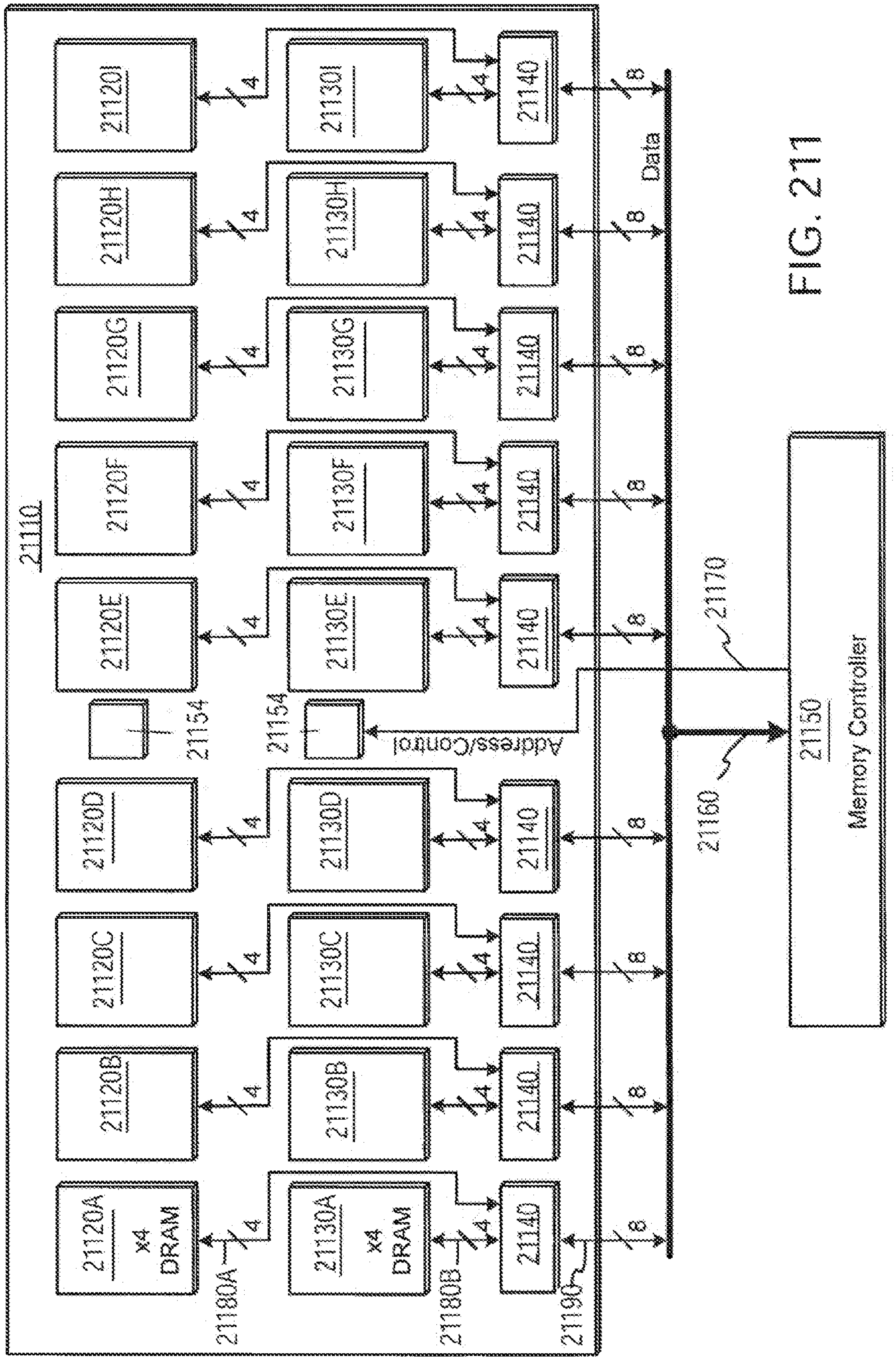

FIG. 211 illustrates a memory subsystem, one component of which is a memory module with a plurality of memory circuits and one or more interface circuits, according to yet another embodiment of the present invention.

Figure 212:
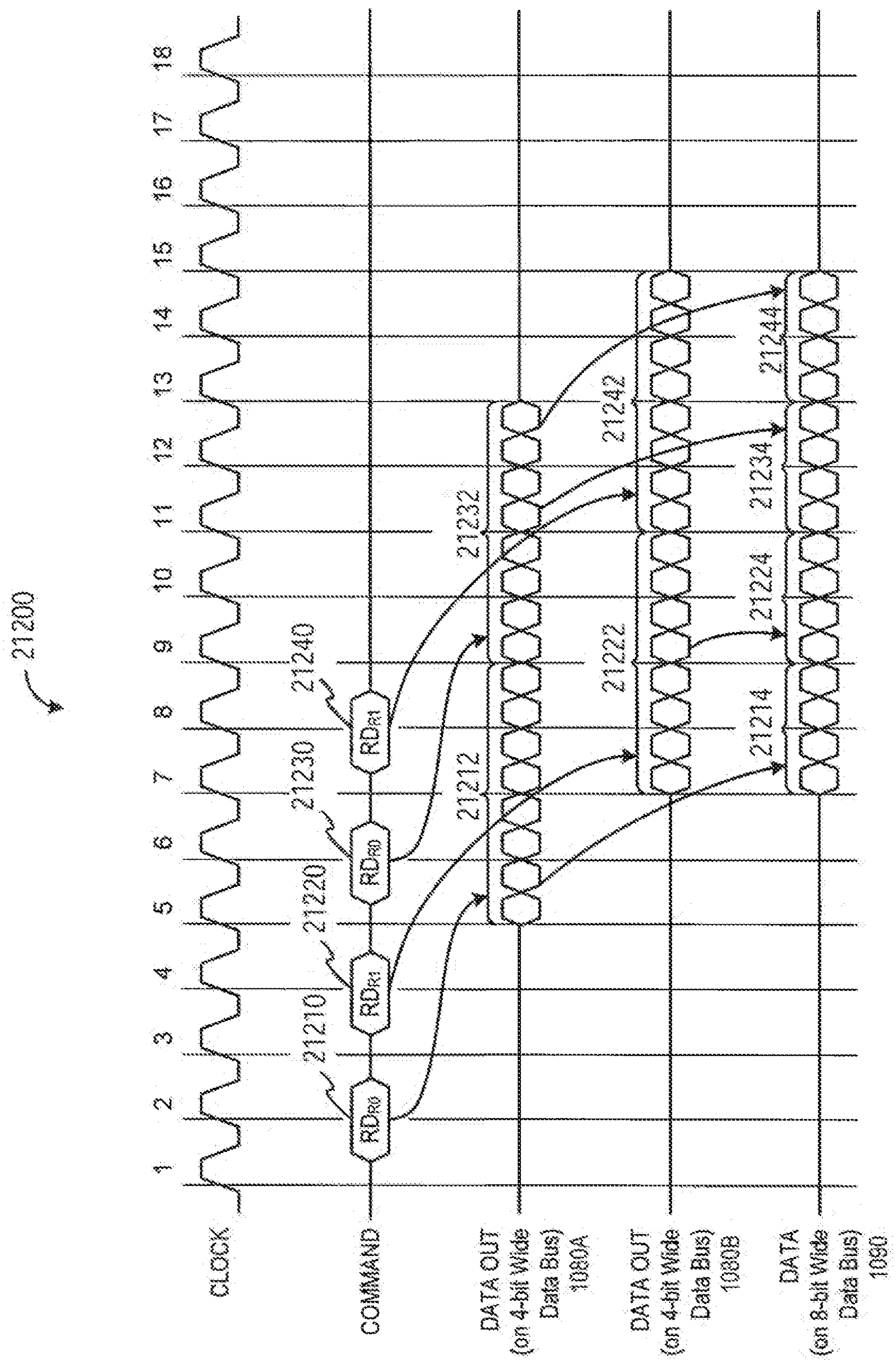

FIG. 212 shows an example timing diagram of reads to a first rank of memory circuits alternating with reads to a second rank of memory circuits, according to an embodiment of this invention.

Figure 213:
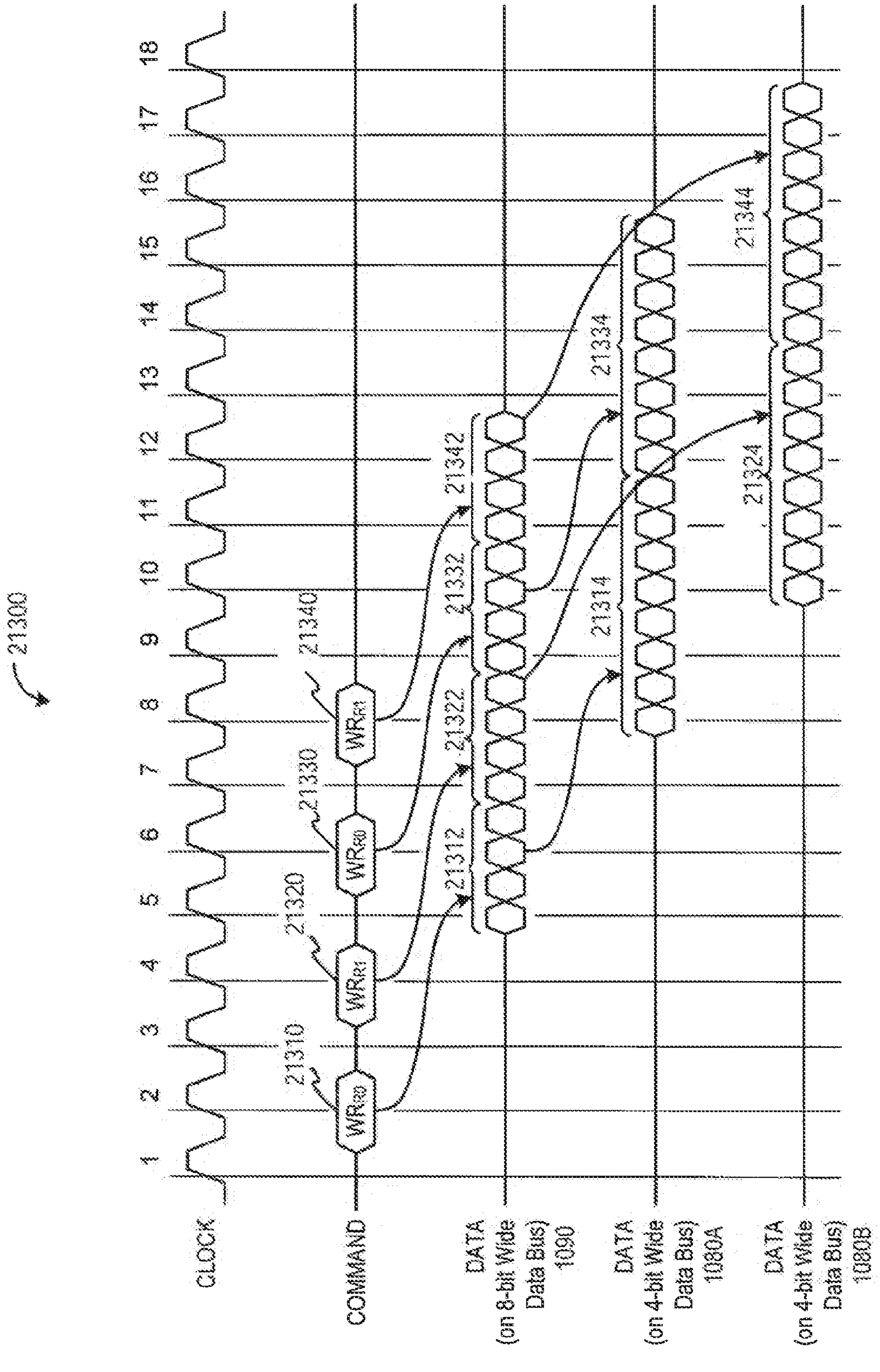

FIG. 213 shows an example timing diagram of writes to a first rank of memory circuits alternating with writes to a second rank of memory circuits, according to an embodiment of this invention.

Figure 214:
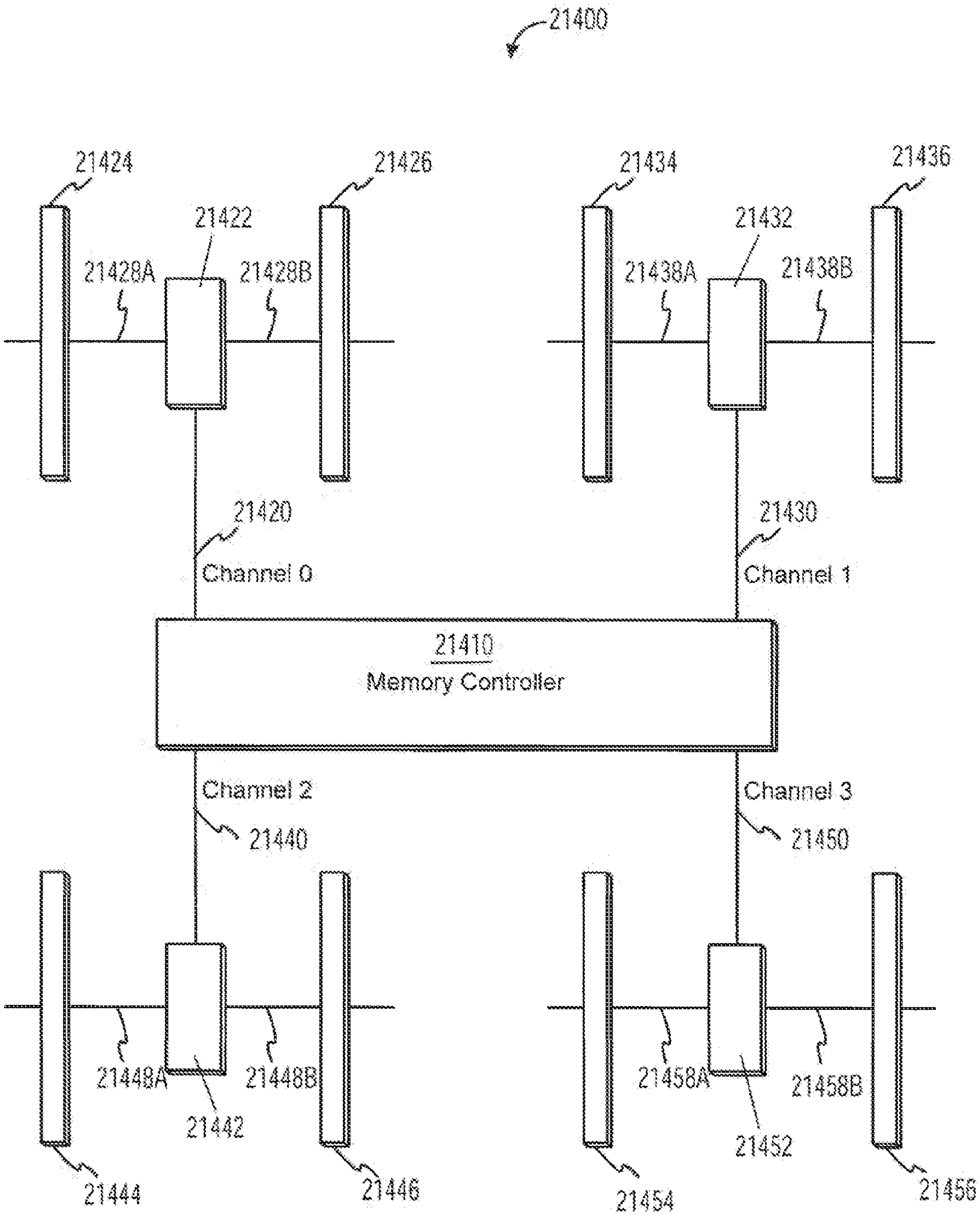

FIG. 214 illustrates a memory subsystem that includes a memory controller with four memory channels, where each channel includes one or more interface circuits and two memory modules per channel, according to still yet another embodiment of the invention.

FIGS. 215A-215F illustrate various configurations of memory sections, processor sections, and interface circuits, according to various embodiments of the invention.

DETAILED DESCRIPTION

Various embodiments are set forth below. It should be noted that the claims corresponding to each of such embodiments should be construed in terms of the relevant description set forth herein. If any definitions, etc. set forth herein are contradictory with respect to terminology of certain claims, such terminology should be construed in terms of the relevant description.

Figure 1:
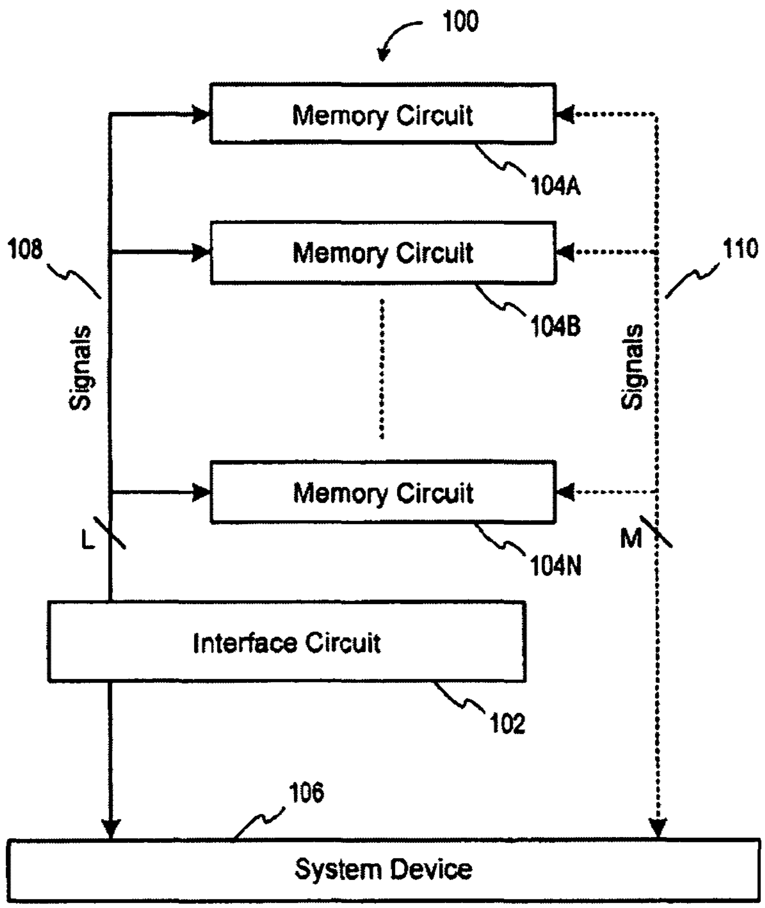
FIG. 1 shows a system coupled to multiple memory circuits and an interface circuit according to one embodiment of this invention.

FIG. 1 illustrates a system 100 including a system device 106 coupled to an interface circuit 102, which is in turn coupled to a plurality of physical memory circuits 104A-N. The physical memory circuits may be any type of memory circuits. In some embodiments, each physical memory circuit is a separate memory chip. For example, each may be a DDR2 DRAM. In some embodiments, the memory circuits may be symmetrical, meaning each has the same capacity, type, speed, etc., while in other embodiments they may be asymmetrical. For ease of illustration only, three such memory circuits are shown, but actual embodiments may use any plural number of memory circuits. As will be discussed below, the memory chips may optionally be coupled to a memory module (not shown), such as a DIMM.

The system device may be any type of system capable of requesting and/or initiating a process that results in an access of the memory circuits. The system may include a memory controller (not shown) through which it accesses the memory circuits.

The interface circuit may include any circuit or logic capable of directly or indirectly communicating with the memory circuits, such as a buffer chip, advanced memory buffer (AMB) chip, etc. The interface circuit interfaces a plurality of signals 108 between the system device and the memory circuits. Such signals may include, for example, data signals, address signals, control signals, clock signals, and so forth. In some embodiments, all of the signals communicated between the system device and the memory circuits are communicated via the interface circuit. In other embodiments, some other signals 110 are communicated directly between the system device (or some component thereof, such as a memory controller, an AMB, or a register) and the memory circuits, without passing through the interface circuit. In some such embodiments, the majority of signals are communicated via the interface circuit, such that L>M.

As will be explained in greater detail below, the interface circuit presents to the system device an interface to emulated memory devices which differ in some aspect from the physical memory circuits which are actually present. For example, the interface circuit may tell the system device that the number of emulated memory circuits is different than the actual number of physical memory circuits. The terms "emulating", "emulated", "emulation", and the like will be used in this disclosure to signify emulation, simulation, disguising, transforming, converting, and the like, which results in at least one characteristic of the memory circuits appearing to the system device to be different than the actual, physical characteristic. In some embodiments, the emulated characteristic may be electrical in nature, physical in nature, logical in nature (e.g. a logical interface, etc.), pertaining to a protocol, etc. An example of an emulated electrical characteristic might be a signal, or a voltage level. An example of an emulated physical characteristic might be a number of pins or wires, a number of signals, or a memory capacity. An example of an emulated protocol characteristic might be a timing, or a specific protocol such as DDR3.

In the case of an emulated signal, such signal may be a control signal such as an address signal, a data signal, or a control signal associated with an activate operation, precharge operation, write operation, mode register read operation, refresh operation, etc. The interface circuit may emulate the number of signals, type of signals, duration of signal assertion, and so forth. It may combine multiple signals to emulate another signal.

The interface circuit may present to the system device an emulated interface to e.g. DDR3 memory, while the physical memory chips are, in fact, DDR2 memory. The interface circuit may emulate an interface to one version of a protocol such as DDR2 with 5-5-5 latency timing, while the physical memory chips are built to another version of the protocol such as DDR2 with 3-3-3 latency timing. The interface circuit may emulate an interface to a memory having a first capacity that is different than the actual combined capacity of the physical memory chips.

An emulated timing may relate to latency of e.g. a column address strobe (CAS) latency, a row address to column address latency (tRCD), a row precharge latency (tRP), an activate to precharge latency (tRAS), and so forth. CAS latency is related to the timing of accessing a column of data. tRCD is the latency required between the row address strobe (RAS) and CAS. tRP is the latency required to terminate an open row and open access to the next row. tRAS is the latency required to access a certain row of data between an activate operation and a precharge operation.

The interface circuit may be operable to receive a signal from the system device and communicate the signal to one or more of the memory circuits after a delay (which may be hidden from the system device). Such delay may be fixed, or in some embodiments it may be variable. If variable, the delay may depend on e.g. a function of the current signal or a previous signal, a combination of signals, or the like. The delay may include a cumulative delay associated with any one or more of the signals. The delay may result in a time shift of the signal forward or backward in time with respect to other signals. Different delays may be applied to different signals. The interface circuit may similarly be operable to receive a signal from a memory circuit and communicate the signal to the system device after a delay.

The interface circuit may take the form of, or incorporate, or be incorporated into, a register, an AMB, a buffer, or the like, and may comply with Joint Electron Device Engineering Council (JEDEC) standards, and may have forwarding, storing, and/or buffering capabilities.

In some embodiments, the interface circuit may perform operations without the system device's knowledge. One particularly useful such operation is a power-saving operation. The interface circuit may identify one or more of the memory circuits which are not currently being accessed by the system device, and perform the power saving operation on those. In one such embodiment, the identification may involve determining whether any page (or other portion) of memory is being accessed. The power saving operation may be a power down operation, such as a precharge power down operation.

The interface circuit may include one or more devices which together perform the emulation and related operations. The interface circuit may be coupled or packaged with the memory devices, or with the system device or a component thereof, or separately. In one embodiment, the memory circuits and the interface circuit are coupled to a DIMM.

Figure 2:
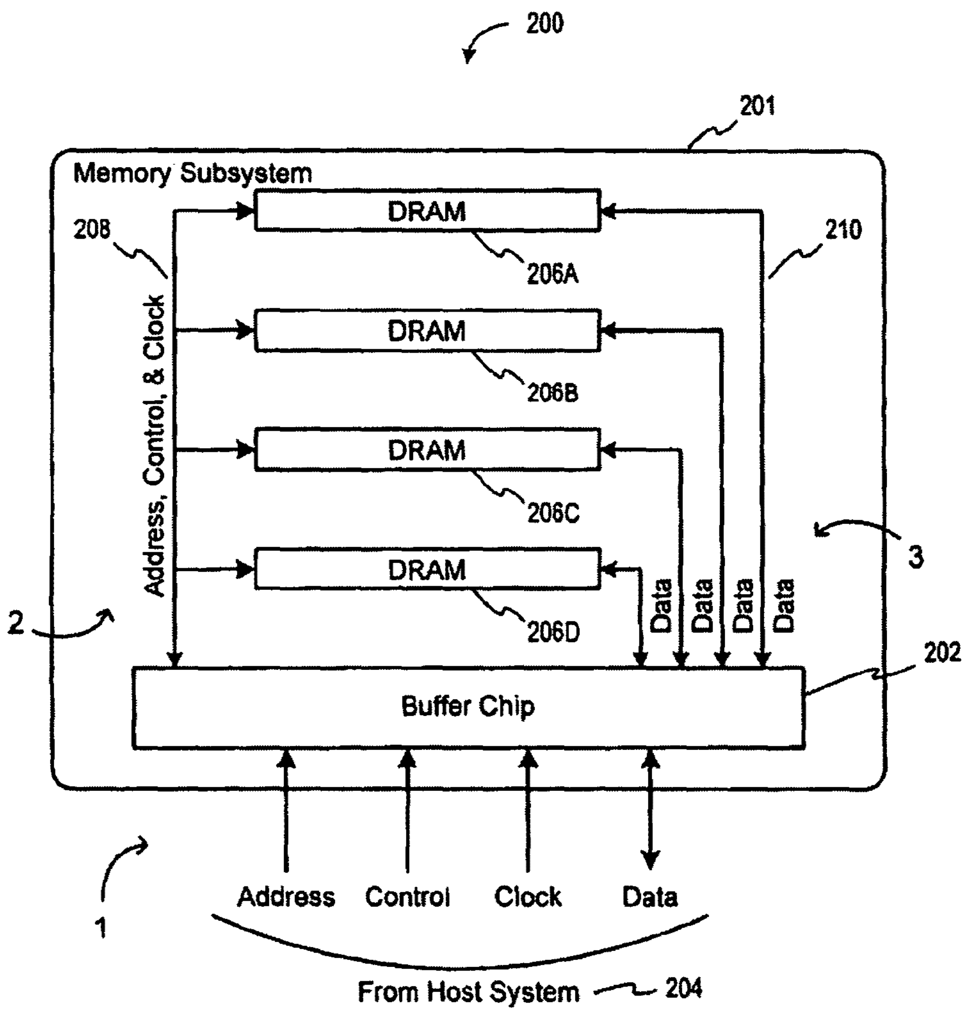
FIG. 2 shows a buffered stack of DRAM circuits each having a dedicated data path from the buffer chip and sharing a single address, control, and clock bus.

FIG. 2 illustrates one embodiment of a system 200 including a system device (e.g. host system 204, etc.) which communicates address, control, clock, and data signals with a memory subsystem 201 via an interface.

The memory subsystem includes a buffer chip 202 which presents the host system with emulated interface to emulated memory, and a plurality of physical memory circuits which, in the example shown, are DRAM chips 206A-D. In one embodiment, the DRAM chips are stacked, and the buffer chip is placed electrically between them and the host system. Although the embodiments described here show the stack consisting of multiple DRAM circuits, a stack may refer to any collection of memory circuits (e.g. DRAM circuits, flash memory circuits, or combinations of memory circuit technologies, etc.).

The buffer chip buffers communicates signals between the host system and the DRAM chips, and presents to the host system an emulated interface to present the memory as though it were a smaller number of larger capacity DRAM chips, although in actuality there is a larger number of smaller capacity DRAM chips in the memory subsystem. For example, there may be eight 512 Mb physical DRAM chips, but the buffer chip buffers and emulates them to appear as a single 4 Gb DRAM chip, or as two 2 Gb DRAM chips. Although the drawing shows four DRAM chips, this is for ease of illustration only; the invention is, of course, not limited to using four DRAM chips.

In the example shown, the buffer chip is coupled to send address, control, and clock signals 208 to the DRAM chips via a single, shared address, control, and clock bus, but each DRAM chip has its own, dedicated data path for sending and receiving data signals 210 to/from the buffer chip.

Throughout this disclosure, the reference number 1 will be used to denote the interface between the host system and the buffer chip, the reference number 2 will be used to denote the address, control, and clock interface between the buffer chip and the physical memory circuits, and the reference number 3 will be used to denote the data interface between the buffer chip and the physical memory circuits, regardless of the specifics of how any of those interfaces is implemented in the various embodiments and configurations described below. In the configuration shown in FIG. 2, there is a single address, control, and clock interface channel 2 and four data interface channels 3; this implementation may thus be said to have a "1A4D" configuration (wherein "1A" means one address, control, and clock channel in interface 2, and "4D" means four data channels in interface 3).

In the example shown, the DRAM chips are physically arranged on a single side of the buffer chip. The buffer chip may, optionally, be a part of the stack of DRAM chips, and may optionally be the bottommost chip in the stack. Or, it may be separate from the stack.

Figure 3:
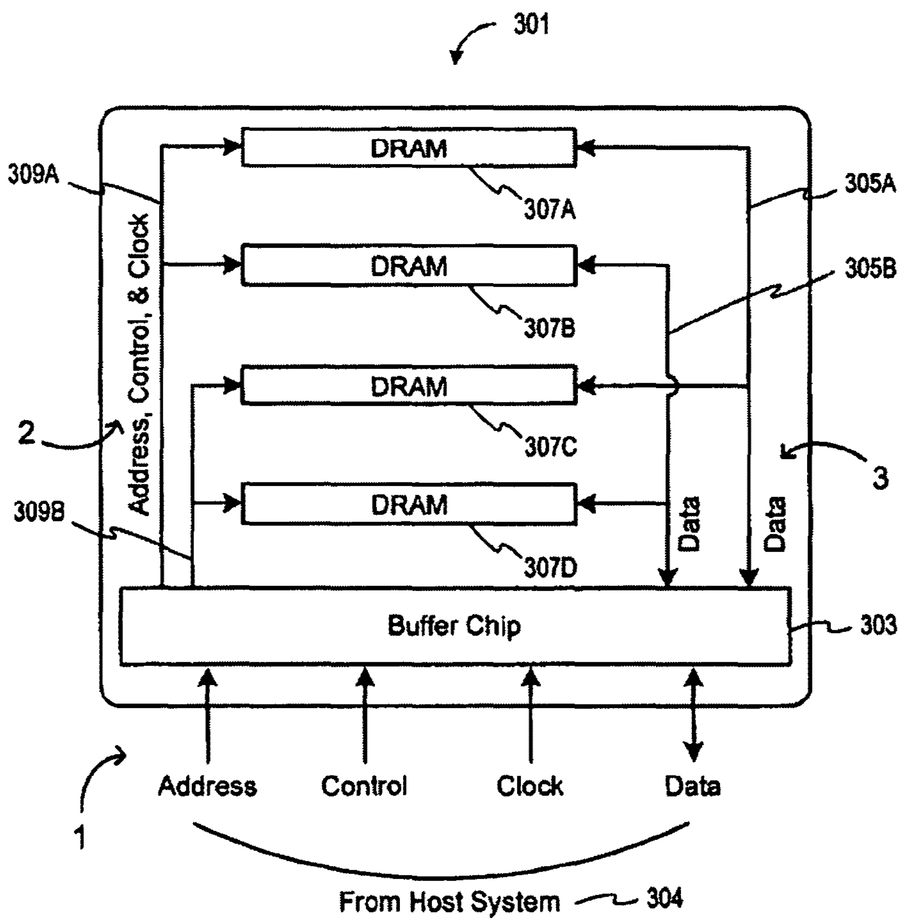
FIG. 3 shows a buffered stack of DRAM circuits having two address, control, and clock busses and two data busses.

FIG. 3 illustrates another embodiment of a system 301 in which the buffer chip 303 is interfaced to a host system 304 and is coupled to the DRAM chips 307A-307D somewhat differently than in the system of FIG. 2. There are a plurality of shared address, control, and clock busses 309A and 309B, and a plurality of shared data busses 305A and 305B. Each shared bus has two or more DRAM chips coupled to it. As shown, the sharing need not necessarily be the same in the data busses as it is in the address, control, and clock busses. This embodiment has a "2A2D" configuration.

Figure 4:
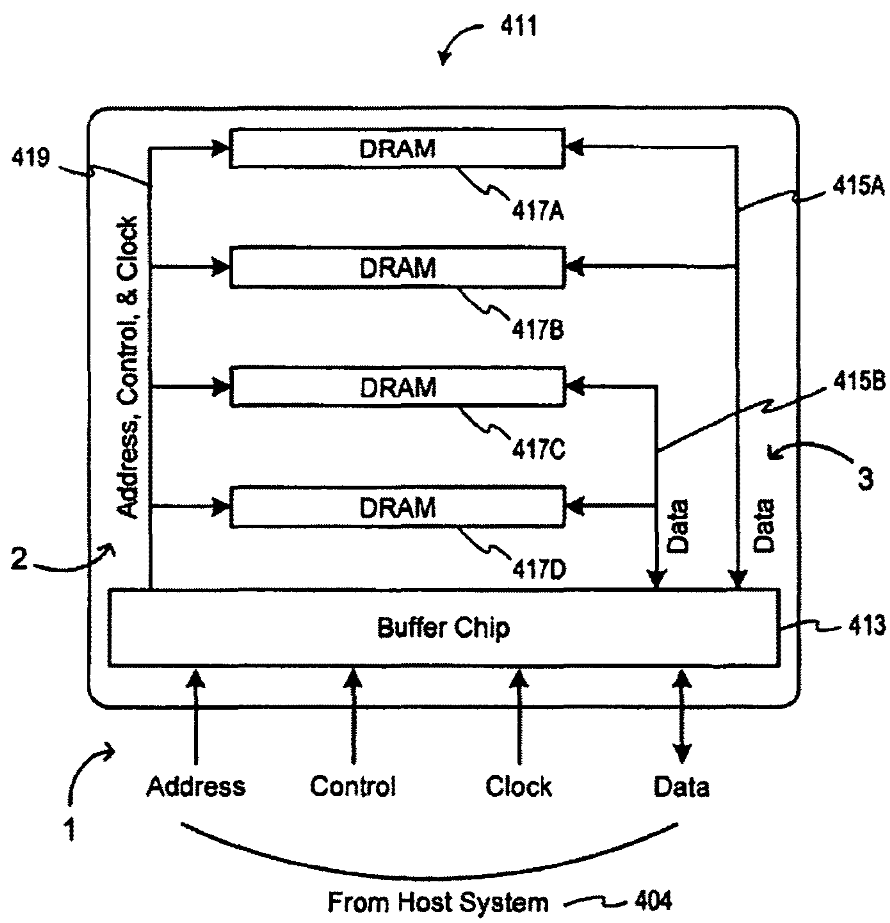
FIG. 4 shows a buffered stack of DRAM circuits having one address, control, and clock bus and two data busses.

FIG. 4 illustrates another embodiment of a system 411 in which the buffer chip 413 is interfaced to a host system 404 and is coupled to the DRAM chips 417A-417D somewhat differently than in the system of FIG. 2 or 3. There is a shared address, control, and clock bus 419, and a plurality of shared data busses 415A and 415B. Each shared bus has two or more DRAM chips coupled to it. This implementation has a "1A2D" configuration.

Figure 5:
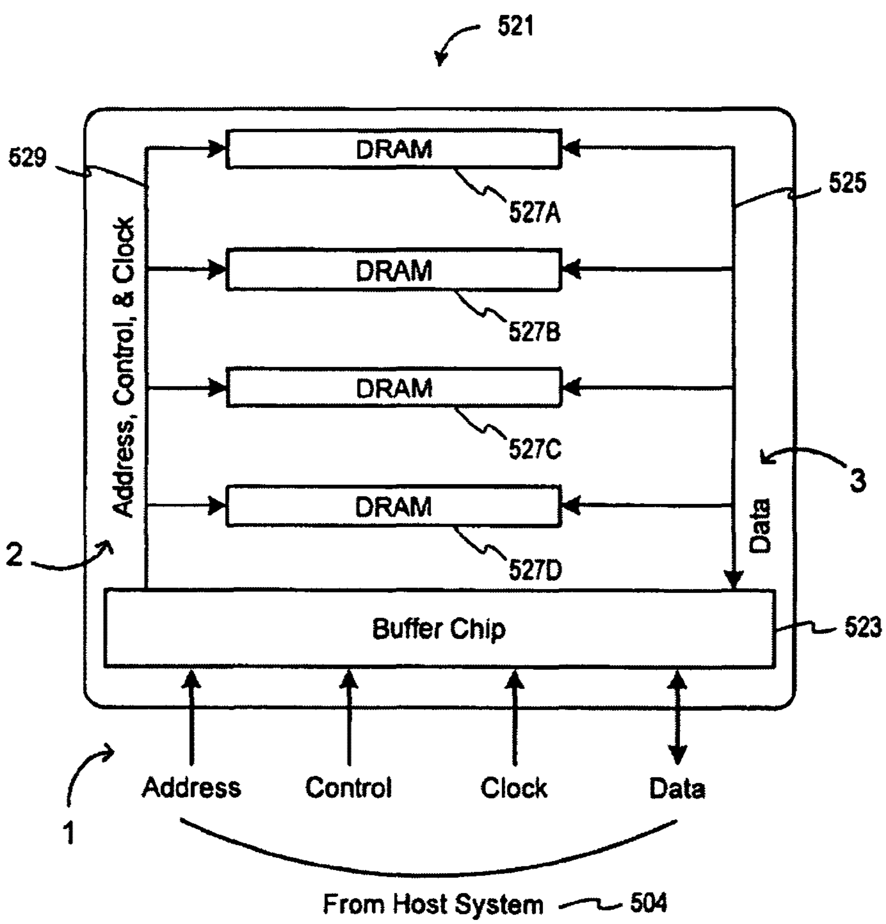
FIG. 5 shows a buffered stack of DRAM circuits having one address, control, and clock bus and one data bus.

FIG. 5 illustrates another embodiment of a system 521 in which the buffer chip 523 is interfaced to a host system 504 and is coupled to the DRAM chips 527A-527D somewhat differently than in the system of FIGS. 2 through 4. There is a shared address, control, and clock bus 529, and a shared data bus 525. This implementation has a "1A1D" configuration.

Figure 6:
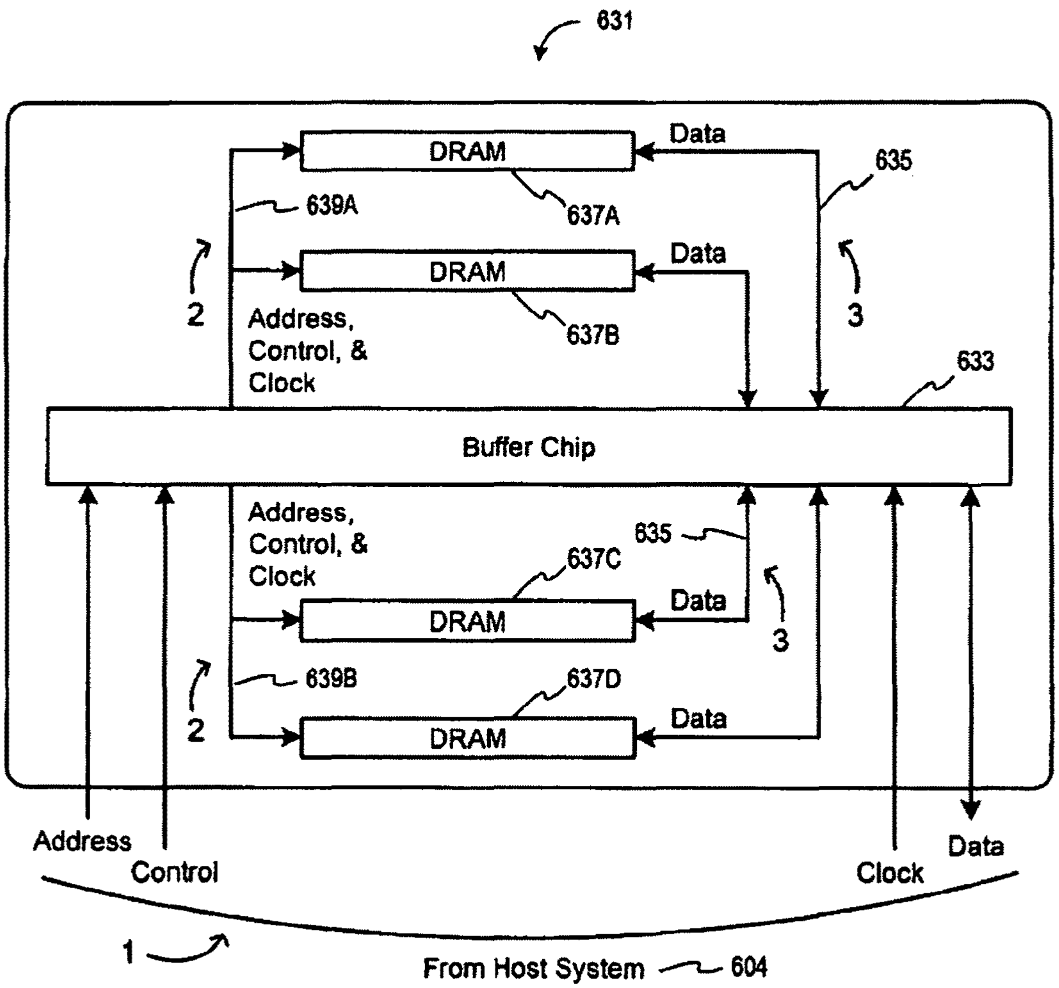
FIG. 6 shows a buffered stack of DRAM circuits in which the buffer chip is located in the middle of the stack of DRAM chips.

FIG. 6 illustrates another embodiment of a system 631 in which the buffer chip 633 is interfaced to a host system 604 and is coupled to the DRAM chips 637A-637D somewhat differently than in the system of FIGS. 2 through 5. There is a plurality of shared address, control, and clock busses 639A and 639B, and a plurality of dedicated data paths 635. Each shared bus has two or more DRAM chips coupled to it. Further, in the example shown, the DRAM chips are physically arranged on both sides of the buffer chip. There may be, for example, sixteen DRAM chips, with the eight DRAM chips on each side of the buffer chip arranged in two stacks of four chips each. This implementation has a "2A4D" configuration.

FIGS. 2 through 6 are not intended to be an exhaustive listing of all possible permutations of data paths, busses, and buffer chip configurations, and are only illustrative of some ways in which the host system device can be in electrical contact only with the load of the buffer chip and thereby be isolated from whatever physical memory circuits, data paths, busses, etc. exist on the (logical) other side of the buffer chip.

Figure 7:
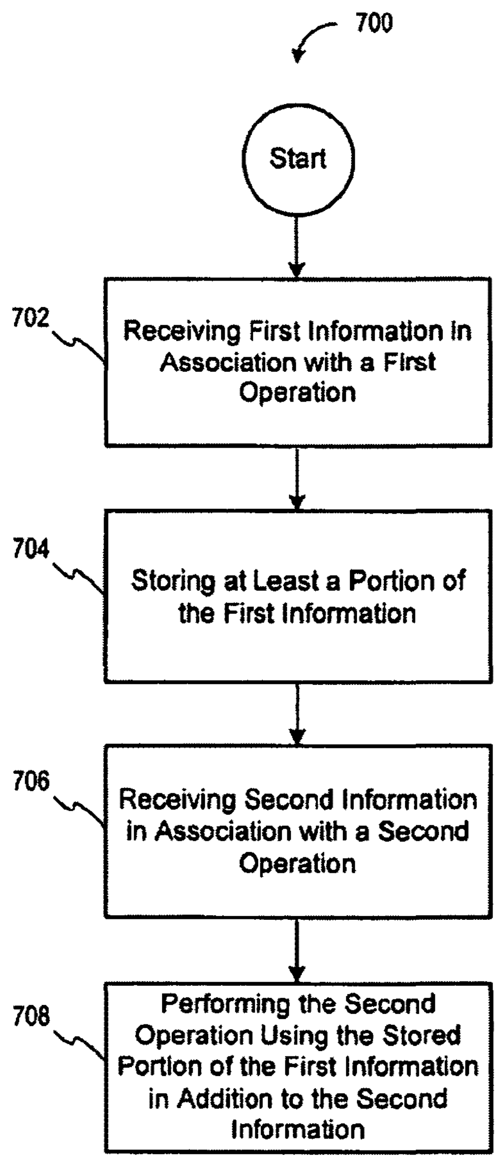
FIG. 7 is a flow chart showing one method of storing information.

FIG. 7 illustrates one embodiment of a method 700 for storing at least a portion of information received in association with a first operation, for use in performing a second operation. Such a method may be practiced in a variety of systems, such as, but not limited to, those of FIGS. 1-6. For example, the method may be performed by the interface circuit of FIG. 1 or the buffer chip of FIG. 2.

Initially, first information is received (702) in association with a first operation to be performed on at least one of the memory circuits (DRAM chips). Depending on the particular implementation, the first information may be received prior to, simultaneously with, or subsequent to the instigation of the first operation. The first operation may be, for example, a row operation, in which case the first information may include e.g. address values received by the buffer chip via the address bus from the host system. At least a portion of the first information is then stored (704).

The buffer chip also receives (706) second information associated with a second operation. For convenience, this receipt is shown as being after the storing of the first information, but it could also happen prior to or simultaneously with the storing. The second operation may be, for example, a column operation.

Then, the buffer chip performs (708) the second operation, utilizing the stored portion of the first information, and the second information.

If the buffer chip is emulating a memory device which has a larger capacity than each of the physical DRAM chips in the stack, the buffer chip may receive from the host system's memory controller more address bits than are required to address any given one of the DRAM chips. In this instance, the extra address bits may be decoded by the buffer chip to individually select the DRAM chips, utilizing separate chip select signals (not shown) to each of the DRAM chips in the stack.

For example, a stack of four ×4 1 Gb DRAM chips behind the buffer chip may appear to the host system as a single ×4 4 Gb DRAM circuit, in which case the memory controller may provide sixteen row address bits and three bank address bits during a row operation (e.g. an activate operation), and provide eleven column address bits and three bank address bits during a column operation (e.g. a read or write operation). However, the individual DRAM chips in the stack may require only fourteen row address bits and three bank address bits for a row operation, and eleven column address bits and three bank address bits during a column operation. As a result, during a row operation (the first operation in the method 702), the buffer chip may receive two address bits more than are needed by any of the DRAM chips. The buffer chip stores (704) these two extra bits during the row operation (in addition to using them to select the correct one of the DRAM chips), then uses them later, during the column operation, to select the correct one of the DRAM chips.

The mapping between a system address (from the host system to the buffer chip) and a device address (from the buffer chip to a DRAM chip) may be performed in various manners. In one embodiment, lower order system row address and bank address bits may be mapped directly to the device row address and bank address bits, with the most significant system row address bits (and, optionally, the most significant bank address bits) being stored for use in the subsequent column operation. In one such embodiment, what is stored is the decoded version of those bits; in other words, the extra bits may be stored either prior to or after decoding. The stored bits may be stored, for example, in an internal lookup table (not shown) in the buffer chip, for one or more clock cycles.

As another example, the buffer chip may have four 512 Mb DRAM chips with which it emulates a single 2 Gb DRAM chip. The system will present fifteen row address bits, from which the buffer chip may use the fourteen low order bits (or, optionally, some other set of fourteen bits) to directly address the DRAM chips. The system will present three bank address bits, from which the buffer chip may use the two low order bits (or, optionally, some other set of two bits) to directly address the DRAM chips. During a row operation, the most significant bank address bit (or other unused bit) and the most significant row address bit (or other unused bit) are used to generate the four DRAM chip select signals, and are stored for later reuse. And during a subsequent column operation, the stored bits are again used to generate the four DRAM chip select signals. Optionally, the unused bank address is not stored during the row operation, as it will be re-presented during the subsequent column operation.

As yet another example, addresses may be mapped between four 1 Gb DRAM circuits to emulate a single 4 Gb DRAM circuit. Sixteen row address bits and three bank address bits come from the host system, of which the low order fourteen address bits and all three bank address bits are mapped directly to the DRAM circuits. During a row operation, the two most significant row address bits are decoded to generate four chip select signals, and are stored using the bank address bits as the index. During the subsequent column operation, the stored row address bits are again used to generate the four chip select signals.

A particular mapping technique may be chosen, to ensure that there are no unnecessary combinational logic circuits in the critical timing path between the address input pins and address output pins of the buffer chip. Corresponding combinational logic circuits may instead be used to generate the individual chip select signals. This may allow the capacitive loading on the address outputs of the buffer chip to be much higher than the loading on the individual chip select signal outputs of the buffer chip.

In another embodiment, the address mapping may be performed by the buffer chip using some of the bank address signals from the host system to generate the chip select signals. The buffer chip may store the higher order row address bits during a row operation, using the bank address as the index, and then use the stored address bits as part of the DRAM circuit bank address during a column operation.

For example, four 512 Mb DRAM chips may be used in emulating a single 2 Gb DRAM. Fifteen row address bits come from the host system, of which the low order fourteen are mapped directly to the DRAM chips. Three bank address bits come from the host system, of which the least significant bit is used as a DRAM circuit bank address bit for the DRAM chips. The most significant row address bit may be used as an additional DRAM circuit bank address bit. During a row operation, the two most significant bank address bits are decoded to generate the four chip select signals. The most significant row address bit may be stored during the row operation, and reused during the column operation with the least significant bank address bit, to form the DRAM circuit bank address.

The column address from the host system memory controller may be mapped directly as the column address to the DRAM chips in the stack, since each of the DRAM chips may have the same page size, regardless any differences in the capacities of the (asymmetrical) DRAM chips.

Optionally, address bit A[10] may be used by the memory controller to enable or disable auto-precharge during a column operation, in which case the buffer chip may forward that bit to the DRAM circuits without any modification during a column operation.

In various embodiments, it may be desirable to determine whether the simulated DRAM circuit behaves according to a desired DRAM standard or other design specification. Behavior of many DRAM circuits is specified by the JEDEC standards, and it may be desirable to exactly emulate a particular JEDEC standard DRAM. The JEDEC standard defines control signals that a DRAM circuit must accept and the behavior of the DRAM circuit as a result of such control signals. For example, the JEDEC specification for DDR2 DRAM is known as JESD79-2B. If it is desired to determine whether a standard is met, the following algorithm may be used. Using a set of software verification tools, it checks for formal verification of logic, that protocol behavior of the simulated DRAM circuit is the same as the desired standard or other design specification. Examples of suitable verification tools include: Magellan, supplied by Synopsys, Inc. of 700 E. Middlefield Rd., Mt. View, Calif. 94043; Incisive, supplied by Cadence Design Systems, Inc., of 2655 Sealy Ave., San Jose, Calif. 95134; tools supplied by Jasper Design Automation, Inc. of 100 View St. #100, Mt. View, Calif. 94041; Verix, supplied by Real Intent, Inc., of 505 N. Mathilda Ave. #210, Sunnyvale, Calif. 94085; 0-In, supplied by Mentor Graphics Corp. of 8005 SW Boeckman Rd., Wilsonville, Oreg. 97070; and others. These software verification tools use written assertions that correspond to the rules established by the particular DRAM protocol and specification. These written assertions are further included in the code that forms the logic description for the buffer chip. By writing assertions that correspond to the desired behavior of the emulated DRAM circuit, a proof may be constructed that determines whether the desired design requirements are met.

For instance, an assertion may be written that no two DRAM control signals are allowed to be issued to an address, control, and clock bus at the same time. Although one may know which of the various buffer chip/DRAM stack configurations and address mappings (such as those described above) are suitable, the verification process allows a designer to prove that the emulated DRAM circuit exactly meets the required standard etc. If, for example, an address mapping that uses a common bus for data and a common bus for address, results in a control and clock bus that does not meet a required specification, alternative designs for buffer chips with other bus arrangements or alternative designs for the sideband signal interconnect between two or more buffer chips may be used and tested for compliance. Such sideband signals convey the power management signals, for example.

Figure 8:
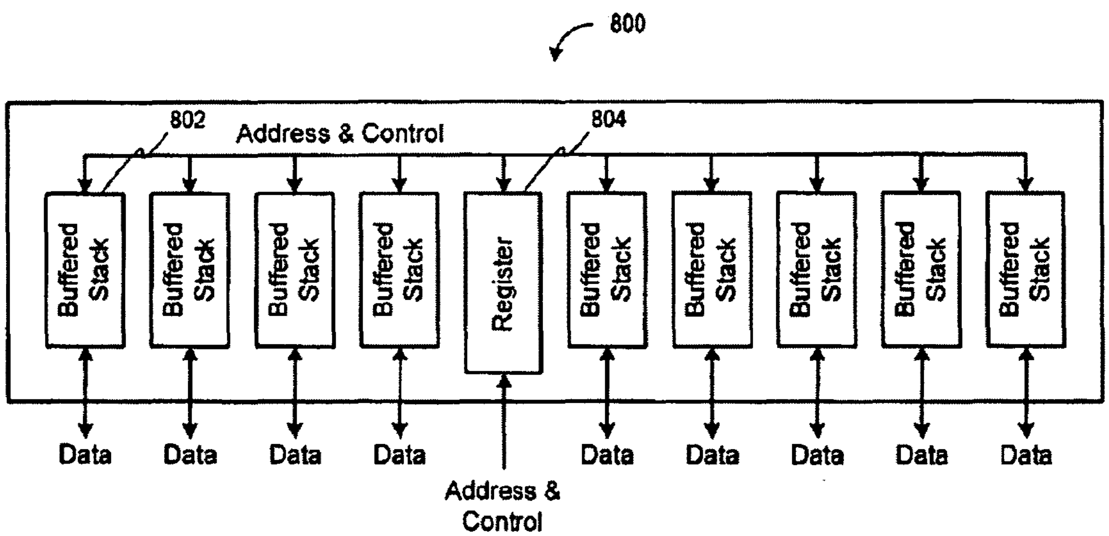
FIG. 8 shows a high capacity DIMM using buffered stacks of DRAM chips according to one embodiment of this invention.

FIG. 8 illustrates a high capacity DIMM 800 using a plurality of buffered stacks of DRAM circuits 802 and a register device 804, according to one embodiment of this invention. The register performs the addressing and control of the buffered stacks. In some embodiments, the DIMM may be an FB-DIMM, in which case the register is an AMB. In one embodiment the emulation is performed at the DIMM level.

Figure 9:
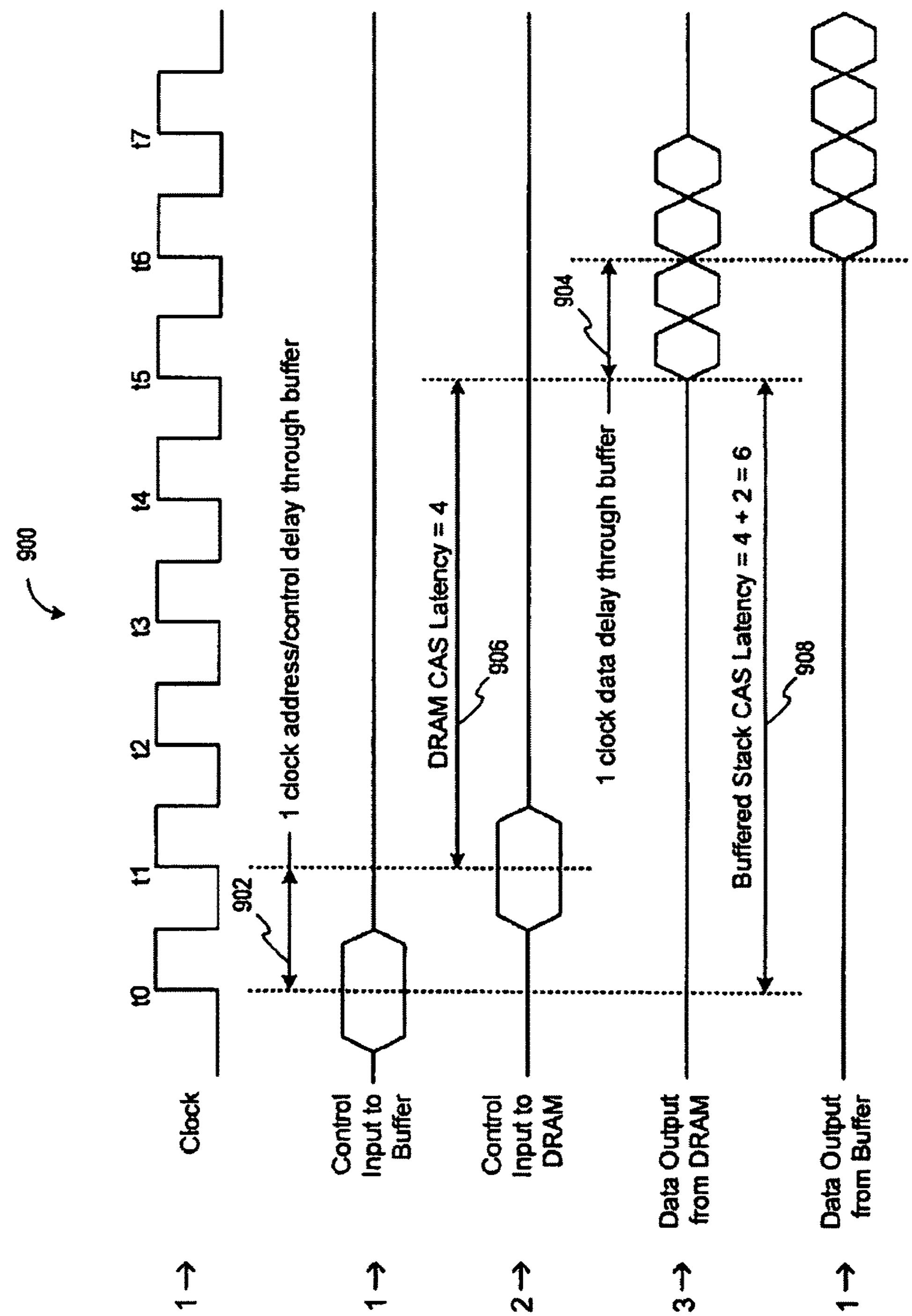
FIG. 9 is a timing diagram showing one embodiment of how the buffer chip makes a buffered stack of DRAM circuits appear to the system or memory controller to use longer column address strobe (CAS) latency DRAM chips than is actually used by the physical DRAM chips.

FIG. 9 is a timing diagram illustrating a timing design 900 of a buffer chip which makes a buffered stack of DRAM chips mimic a larger DRAM circuit having longer CAS latency, in accordance with another embodiment of this invention. Any delay through a buffer chip may be made transparent to the host system's memory controller, by using such a method. Such a delay may be a result of the buffer chip being located electrically between the memory bus of the host system and the stacked DRAM circuits, since some or all of the signals that connect the memory bus to the DRAM circuits pass through the buffer chip. A finite amount of time may be needed for these signals to traverse through the buffer chip. With the exception of register chips and AMBs, industry standard memory protocols may not comprehend the buffer chip that sits between the memory bus and the DRAM chips. Industry standards narrowly define the properties of a register chip and an AMB, but not the properties of the buffer chip of this embodiment. Thus, any signal delay caused by the buffer chip may cause a violation of the industry standard protocols.

In one embodiment, the buffer chip may cause a one-half clock cycle delay between the buffer chip receiving address and control signals from the host system memory controller (or, optionally, from a register chip or an AMB), and the address and control signals being valid at the inputs of the stacked DRAM circuits. Data signals may also have a one-half clock cycle delay in either direction to/from the host system. Other amounts of delay are, of course, possible, and the half-clock cycle example is for illustration only.

The cumulative delay through the buffer chip is the sum of a delay of the address and control signals and a delay of the data signals. FIG. 9 illustrates an example where the buffer chip is using DRAM chips having a native CAS latency of i clocks, and the buffer chip delay is j clocks, thus the buffer chip emulates a DRAM having a CAS latency of i+j clocks. In the example shown, the DRAM chips have a native CAS latency 906 of four clocks (from t1 to t5), and the total latency through the buffer chip is two clocks (one clock delay 902 from t0 to t1 for address and control signals, plus one clock delay 904 from t5 to t6 for data signals), and the buffer chip emulates a DRAM having a six clock CAS latency 908.

In FIG. 9 (and other timing diagrams), the reference numbers 1, 2, and/or 3 at the left margin indicate which of the interfaces correspond to the signals or values illustrated on the associated waveforms. For example, in FIG. 9: the "Clock" signal shown as a square wave on the uppermost waveform is indicated as belonging to the interface 1 between the host system and the buffer chip; the "Control Input to Buffer" signal is also part of the interface 1; the "Control Input to DRAM" waveform is part of the interface 2 from the buffer chip to the physical memory circuits; the "Data Output from DRAM" waveform is part of the interface 3 from the physical memory circuits to the buffer chip; and the "Data Output from Buffer" shown in the lowermost waveform is part of the interface 1 from the buffer chip to the host system.

Figure 10:
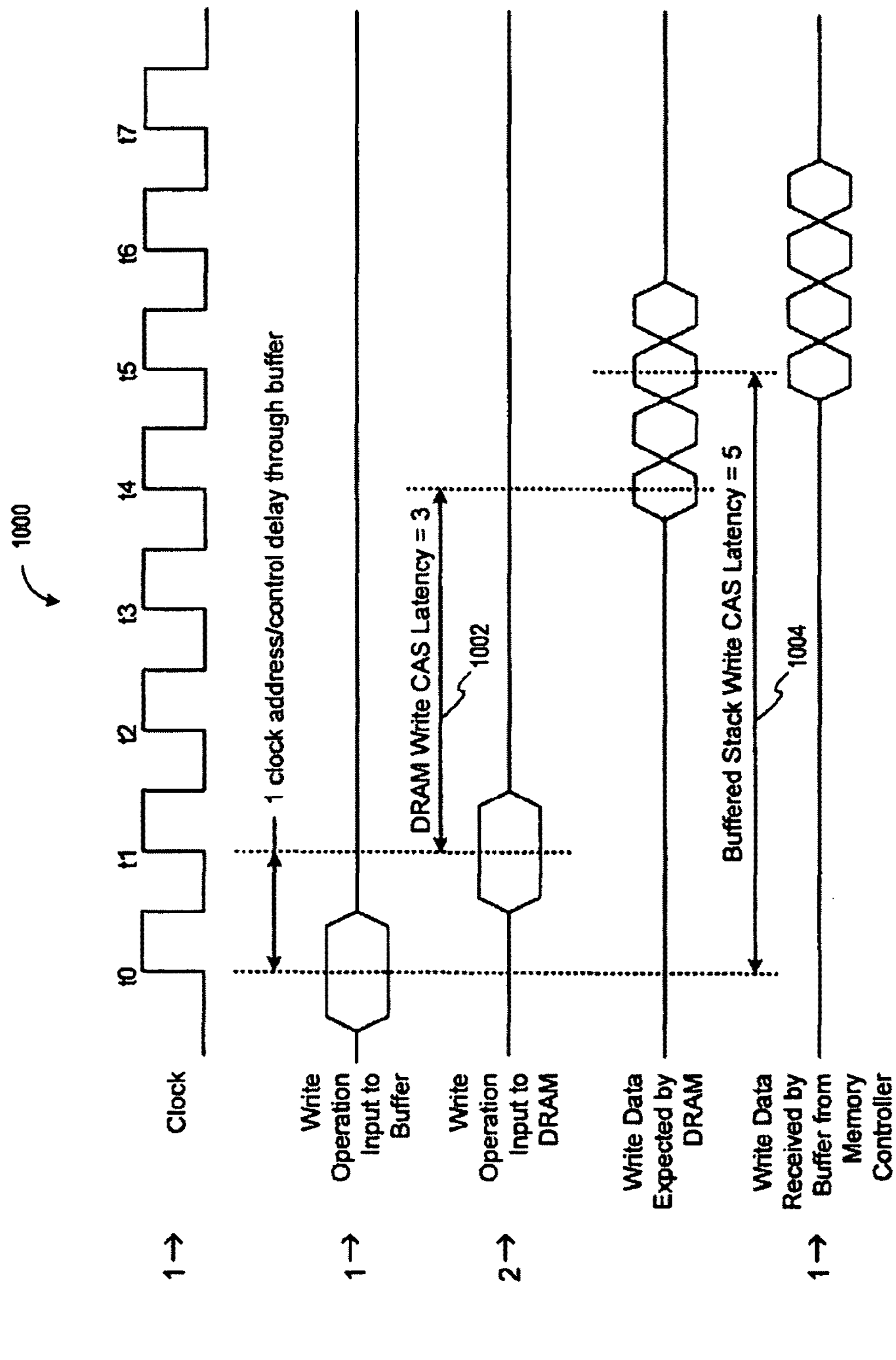
FIG. 10 shows a timing diagram showing the write data timing expected by DRAM in a buffered stack, in accordance with another embodiment of this invention.

FIG. 10 is a timing diagram illustrating a timing design 1000 of write data timing expected by a DRAM circuit in a buffered stack. Emulation of a larger capacity DRAM circuit having higher CAS latency (as in FIG. 9) may, in some implementations, create a problem with the timing of write operations. For example, with respect to a buffered stack of DDR2 SDRAM chips with a read CAS latency of four clocks which are used in emulating a single larger DDR2 SDRAM with a read CAS latency of six clocks, the DDR2 SDRAM protocol may specify that the write CAS latency 1002 is one less than the read CAS latency. Therefore, since the buffered stack appears as a DDR2 SDRAM with a read CAS latency of six clocks, the memory controller may use a buffered stack write CAS latency of five clocks 1004 when scheduling a write operation to the memory.

In the specific example shown, the memory controller issues the write operation at t0. After a one clock cycle delay through the buffer chip, the write operation is issued to the DRAM chips at t1. Because the memory controller believes it is connected to memory having a read CAS latency of six clocks and thus a write CAS latency of five clocks, it issues the write data at time t0+5=t5. But because the physical DRAM chips have a read CAS latency of four clocks and thus a write CAS latency of three clocks, they expect to receive the write data at time t1+3=t4. Hence the problem, which the buffer chip may alleviate by delaying write operations.

The waveform "Write Data Expected by DRAM" is not shown as belonging to interface 1, interface 2, or interface 3, for the simple reason that there is no such signal present in any of those interfaces. That waveform represents only what is expected by the DRAM, not what is actually provided to the DRAM.

Figure 11:
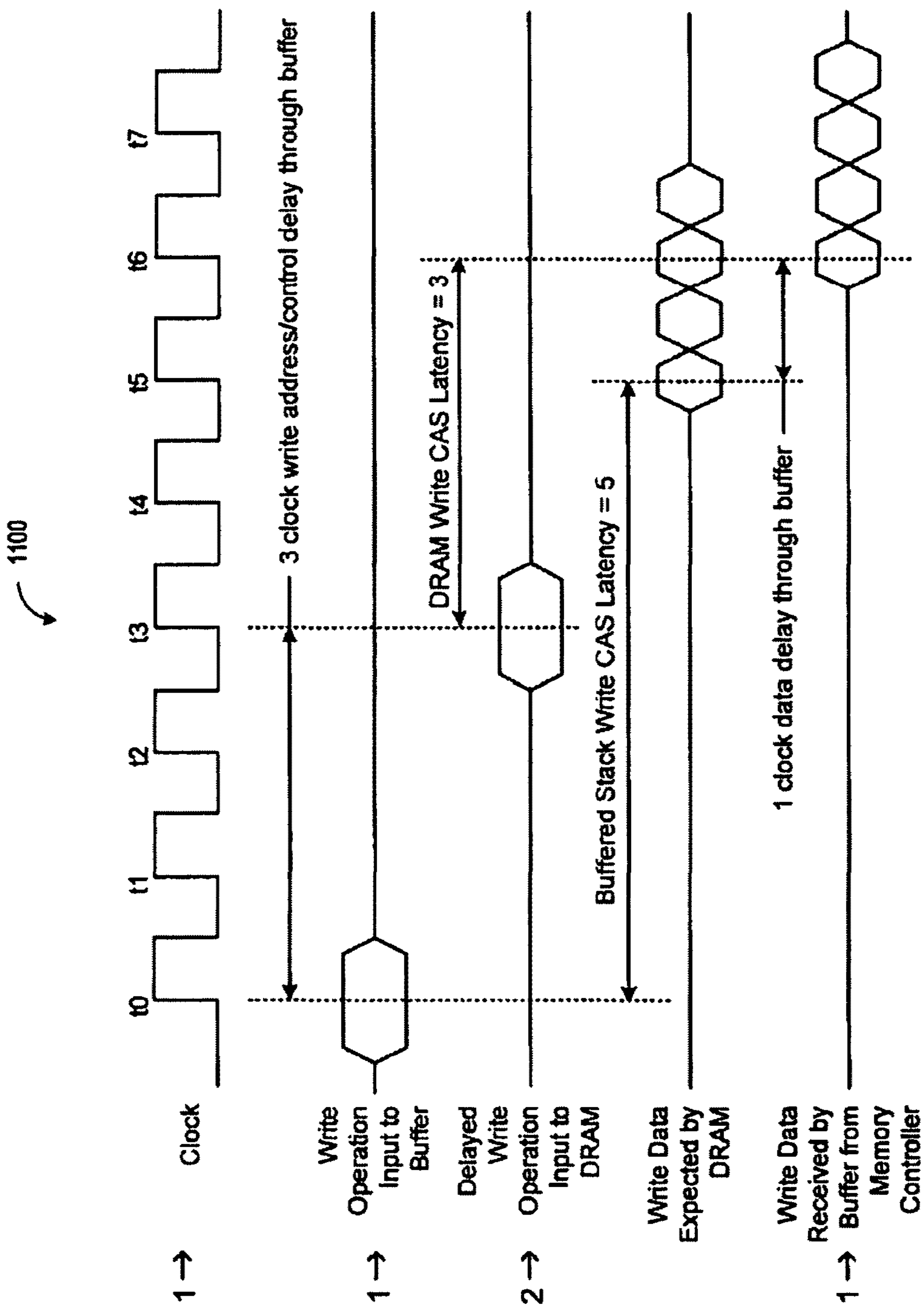
FIG. 11 is a timing diagram showing how write control signals are delayed by a buffer chip in accordance with another embodiment of this invention.

FIG. 11 is a timing illustrating a timing design 1100 showing how the buffer chip does this. The memory controller issues the write operation at t0. In FIG. 10, the write operation appeared at the DRAM circuits one clock later at t1, due to the inherent delay through the buffer chip. But in FIG. 11, in addition to the inherent one clock delay, the buffer chip has added an extra two clocks of delay to the write operation, which is not issued to the DRAM chips until t0+1+2=t3. Because the DRAM chips receive the write operation at t3 and have a write CAS latency of three clocks, they expect to receive the write data at t3+3=t6. Because the memory controller issued the write operation at t0, and it expects a write CAS latency of five clocks, it issues the write data at time t0+5=t5. After a one clock delay through the buffer chip, the write data arrives at the DRAM chips at t5+1=t6, and the timing problem is solved.

It should be noted that extra delay of j clocks (beyond the inherent delay) which the buffer chip deliberately adds before issuing the write operation to the DRAM is the sum j clocks of the inherent delay of the address and control signals and the inherent delay of the data signals. In the example shown, both those inherent delays are one clock, so j=2.

Figure 12:
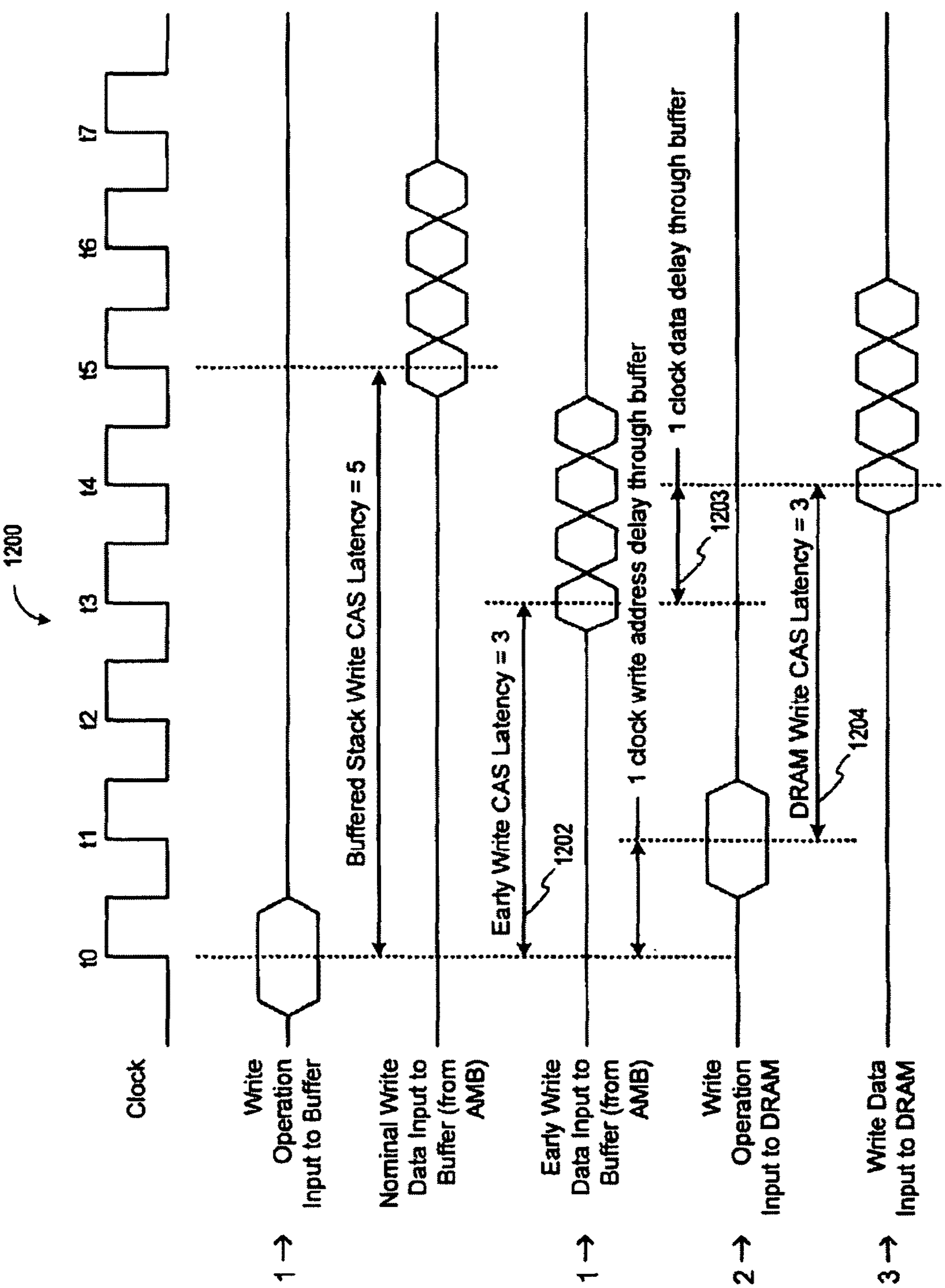
FIG. 12 is a timing diagram showing early write data from a memory controller or an advanced memory buffer (AMB) according to yet another embodiment of this invention.

FIG. 12 is a timing diagram illustrating operation of an FB-DIMM's AMB, which may be designed to send write data earlier to buffered stacks instead of delaying the write address and operation (as in FIG. 11). Specifically, it may use an early write CAS latency 1202 to compensate the timing of the buffer chip write operation. If the buffer chip has a cumulative (address and data) inherent delay of two clocks, the AMB may send the write data to the buffered stack two clocks early. This may not be possible in the case of registered DIMMs, in which the memory controller sends the write data directly to the buffered stacks (rather than via the AMB). In another embodiment, the memory controller itself could be designed to send write data early, to compensate for the j clocks of cumulative inherent delay caused by the buffer chip.

In the example shown, the memory controller issues the write operation at t0. After a one clock inherent delay through the buffer chip, the write operation arrives at the DRAM at t1. The DRAM expects the write data at t1+3=t4. The industry specification would suggest a nominal write data time of t0+5=t5, but the AMB (or memory controller), which already has the write data (which are provided with the write operation), is configured to perform an early write at t5−2=t3. After the inherent delay 1203 through the buffer chip, the write data arrive at the DRAM at t3+1=t4, exactly when the DRAM expects it—specifically, with a three-cycle DRAM Write CAS latency 1204 which is equal to the three-cycle Early Write CAS Latency 1202.

Figure 13:
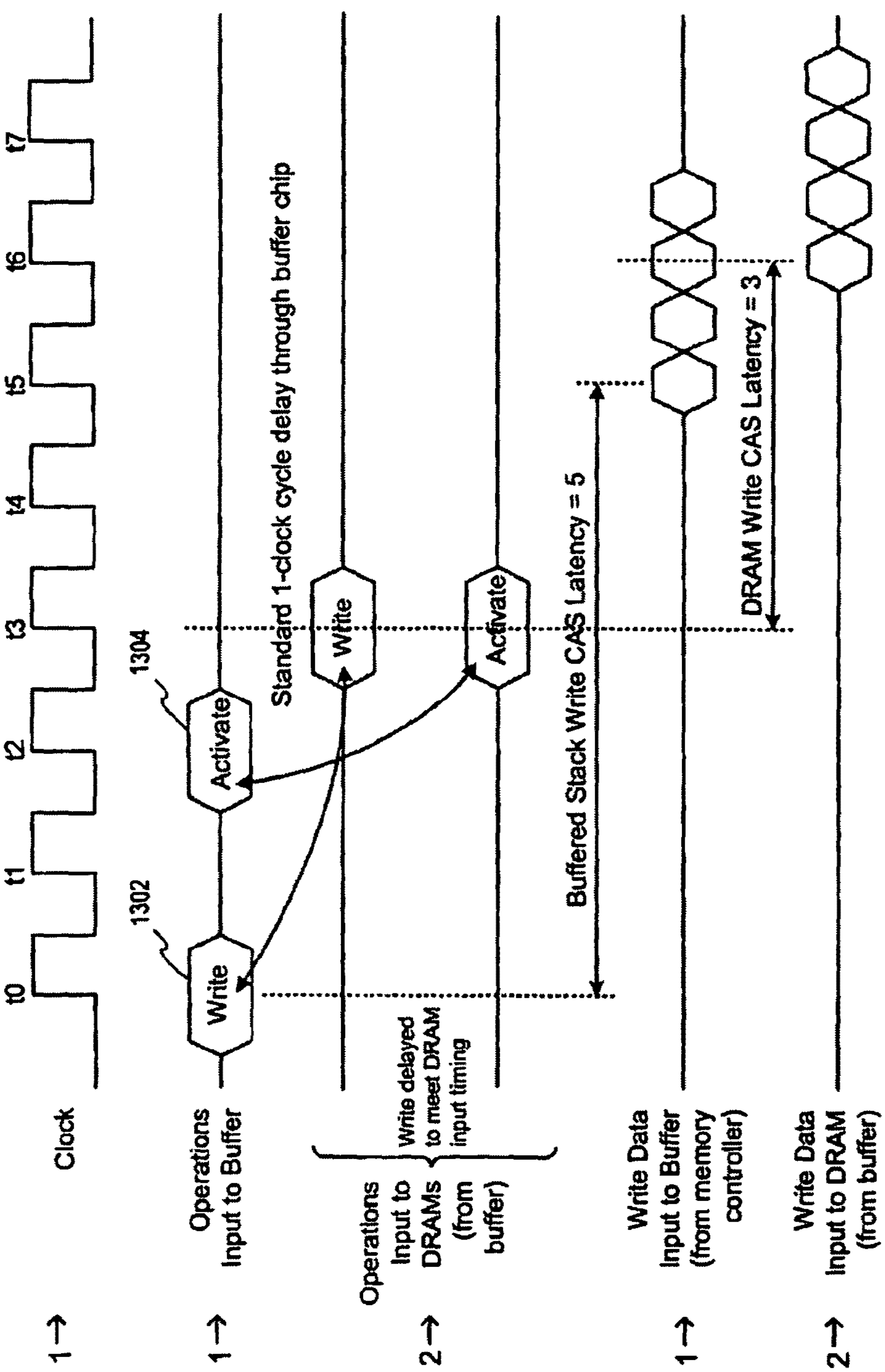
FIG. 13 is a timing diagram showing address bus conflicts caused by delayed write operations.

FIG. 13 is a timing diagram 1300 illustrating bus conflicts which can be caused by delayed write operations. The delaying of write addresses and write operations may be performed by a buffer chip, a register, an AMB, etc. in a manner that is completely transparent to the memory controller of the host system. And, because the memory controller is unaware of this delay, it may schedule subsequent operations such as activate or precharge operations, which may collide with the delayed writes on the address bus to the DRAM chips in the stack.

An example is shown, in which the memory controller issues a write operation 1302 at time t0. The buffer chip or AMB delays the write operation, such that it appears on the bus to the DRAM chips at time t3. Unfortunately, at time t2 the memory controller issued an activate operation (control signal) 1304 which, after a one-clock inherent delay through the buffer chip, appears on the bus to the DRAM chips at time t3, colliding with the delayed write.

Figure 14:
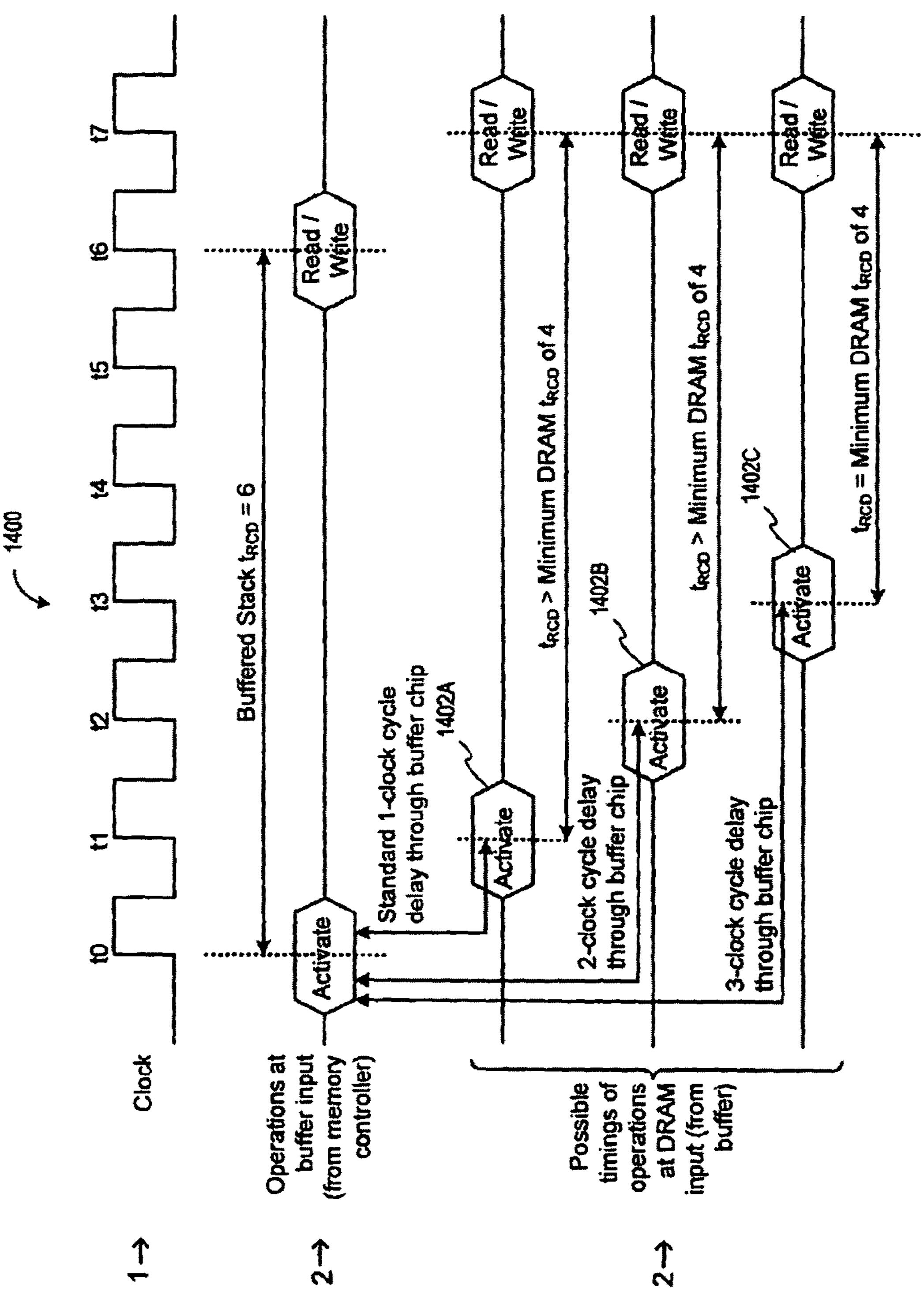
FIG. 14 is a timing diagram showing variable delay of an activate operation through a buffer chip.
Figure 15:
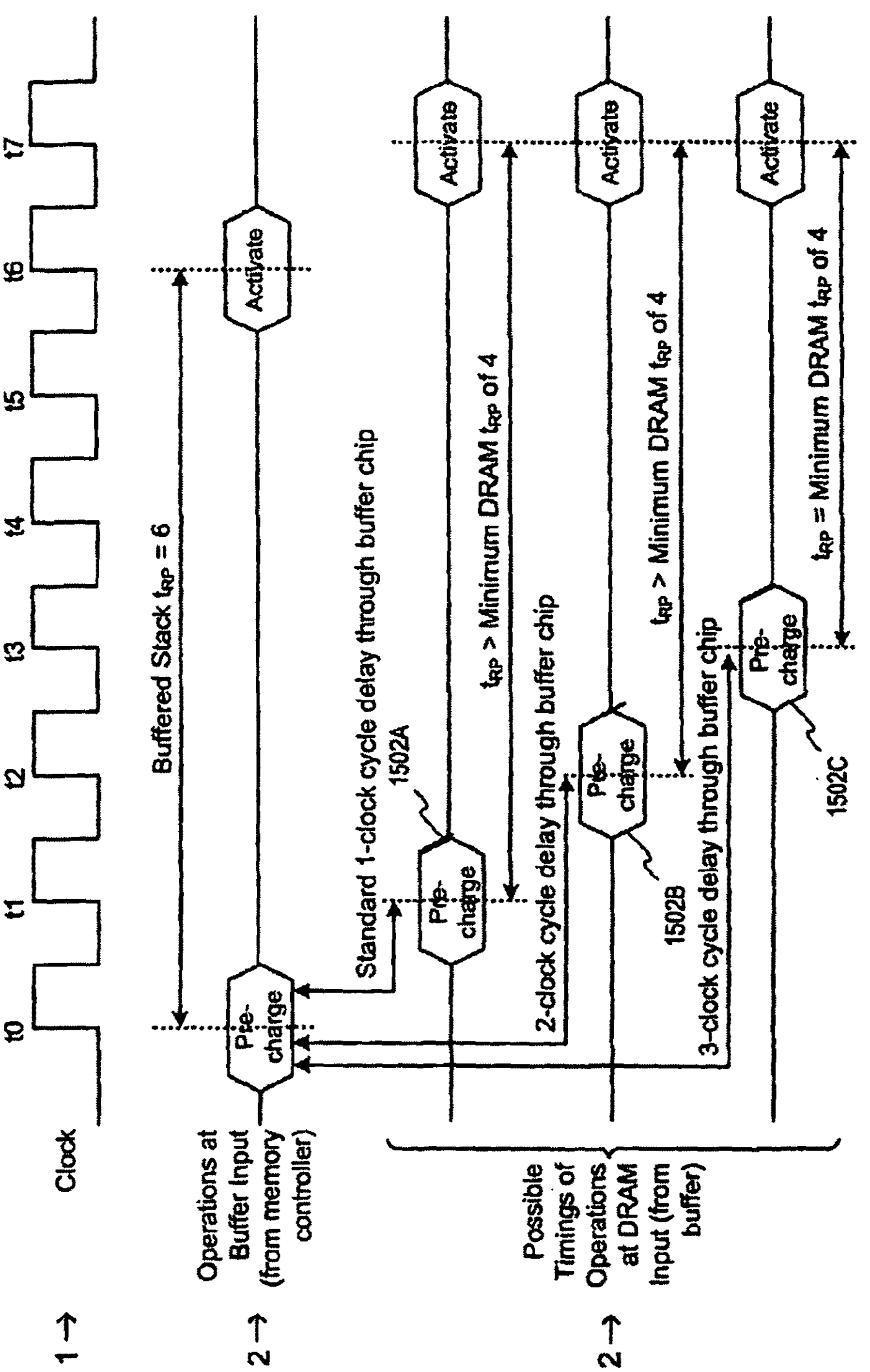
FIG. 15 is a timing diagram showing variable delay of a precharge operation through a buffer chip.

FIGS. 14 and 15 are a timing diagram 1400 and a timing diagram 1500 illustrating methods of avoiding such collisions. If the cumulative latency through the buffer chip is two clock cycles, and the native read CAS latency of the DRAM chips is four clock cycles, then in order to hide the delay of the address and control signals and the data signals through the buffer chip, the buffer chip presents the host system with an interface to an emulated memory having a read CAS latency of six clock cycles. And if the tRCD and tRP of the DRAM chips are four clock cycles each, the buffer chip tells the host system that they are six clock cycles each in order to allow the buffer chip to delay the activate and precharge operations to avoid collisions in a manner that is transparent to the host system.

For example, a buffered stack that uses 4-4-4 DRAM chips (that is, CAS latency=4, tRCD=4, and tRP=4) may appear to the host system as one larger DRAM that uses 6-6-6 timing.

Since the buffered stack appears to the host system's memory controller as having a tRCD of six clock cycles, the memory controller may schedule a column operation to a bank six clock cycles (at time t6) after an activate (row) operation (at time t0) to the same bank. However, the DRAM chips in the stack actually have a tRCD of four clock cycles. This gives the buffer chip time to delay the activate operation by up to two clock cycles, avoiding any conflicts on the address bus between the buffer chip and the DRAM chips, while ensuring correct read and write timing on the channel between the memory controller and the buffered stack.

As shown, the buffer chip may issue the activate operation to the DRAM chips one, two, or three clock cycles after it receives the activate operation from the memory controller, register, or AMB. The actual delay selected may depend on the presence or absence of other DRAM operations that may conflict with the activate operation, and may optionally change from one activate operation to another. In other words, the delay may be dynamic. A one-clock delay (1402A, 1502A) may be accomplished simply by the inherent delay through the buffer chip. A two-clock delay (1402B, 1502B) may be accomplished by adding one clock of additional delay to the one-clock inherent delay, and a three-clock delay (1402C, 1502C) may be accomplished by adding two clocks of additional delay to the one-clock inherent delay. A read, write, or activate operation issued by the memory controller at time t6 will, after a one-clock inherent delay through the buffer chip, be issued to the DRAM chips at time t7. A preceding activate or precharge operation issued by the memory controller at time t0 will, depending upon the delay, be issued to the DRAM chips at time t1, t2, or t3, each of which is at least the tRCD or tRP of four clocks earlier than the t7 issuance of the read, write, or activate operation.

Since the buffered stack appears to the memory controller to have a tRP of six clock cycles, the memory controller may schedule a subsequent activate (row) operation to a bank a minimum of six clock cycles after issuing a precharge operation to that bank. However, since the DRAM circuits in the stack actually have a tRP of four clock cycles, the buffer chip may have the ability to delay issuing the precharge operation to the DRAM chips by up to two clock cycles, in order to avoid any conflicts on the address bus, or in order to satisfy the tRAS requirements of the DRAM chips.

In particular, if the activate operation to a bank was delayed to avoid an address bus conflict, then the precharge operation to the same bank may be delayed by the buffer chip to satisfy the tRAS requirements of the DRAM. The buffer chip may issue the precharge operation to the DRAM chips one, two, or three clock cycles after it is received. The delay selected may depend on the presence or absence of address bus conflicts or tRAS violations, and may change from one precharge operation to another.

Figure 16:
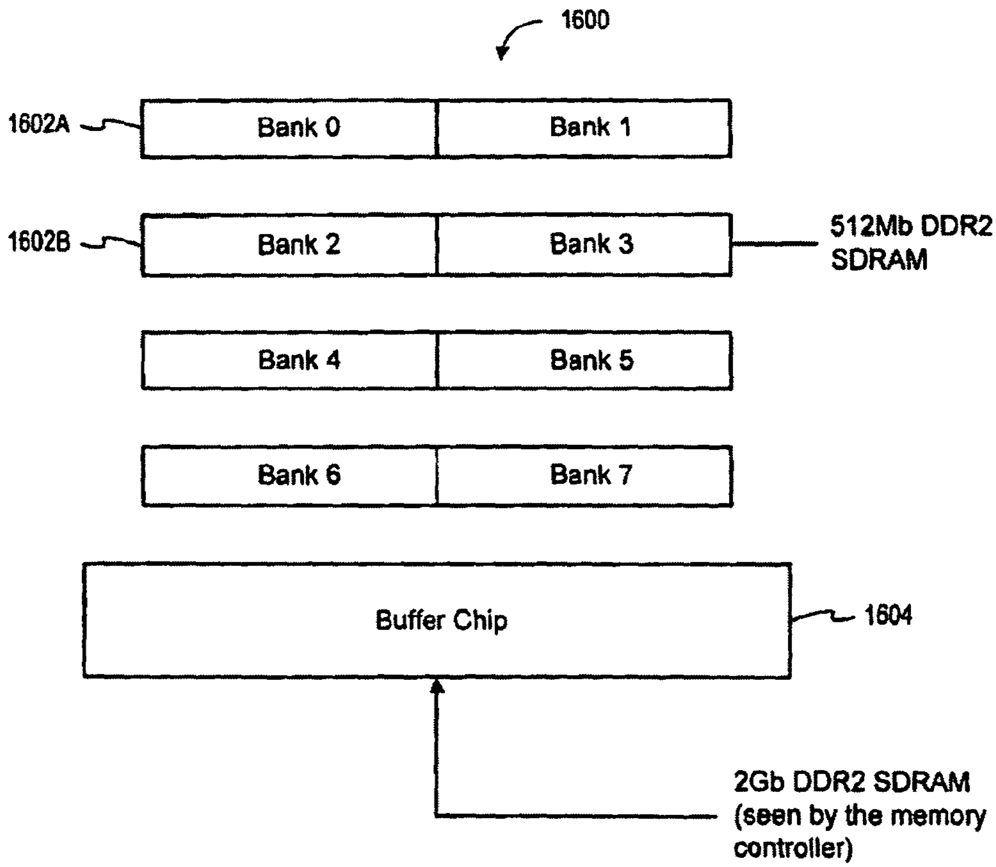
FIG. 16 shows a buffered stack of DRAM circuits and the buffer chip which presents them to the system as if they were a single, larger DRAM circuit, in accordance with one embodiment of this invention.

FIG. 16 illustrates a buffered stack 1600 according to one embodiment of this invention. The buffered stack includes four 512 Mb DDR2 DRAM circuits (chips) 1602 which a buffer chip 1604 maps to a single 2 Gb DDR2 DRAM.

Although the multiple DRAM chips appear to the memory controller as though they were a single, larger DRAM, the combined power dissipation of the actual DRAM chips may be much higher than the power dissipation of a monolithic DRAM of the same capacity. In other words, the physical DRAM may consume significantly more power than would be consumed by the emulated DRAM.

As a result, a DIMM containing multiple buffered stacks may dissipate much more power than a standard DIMM of the same actual capacity using monolithic DRAM circuits. This increased power dissipation may limit the widespread adoption of DIMMs that use buffered stacks. Thus, it is desirable to have a power management technique which reduces the power dissipation of DIMMs that use buffered stacks.

In one such technique, the DRAM circuits may be opportunistically placed in low power states or modes. For example, the DRAM circuits may be placed in a precharge power down mode using the clock enable (CKE) pin of the DRAM circuits.

A single rank registered DIMM (R-DIMM) may contain a plurality of buffered stacks, each including four ×4 512 Mb DDR2 SDRAM chips and appear (to the memory controller via emulation by the buffer chip) as a single ×4 2 Gb DDR2 SDRAM. The JEDEC standard indicates that a 2 Gb DDR2 SDRAM may generally have eight banks, shown in FIG. 16 as Bank 0 to Bank 7. Therefore, the buffer chip may map each 512 Mb DRAM chip in the stack to two banks of the equivalent 2 Gb DRAM, as shown; the first DRAM chip 1602A is treated as containing banks 0 and 1, 1602B is treated as containing banks 2 and 4, and so forth.

The memory controller may open and close pages in the DRAM banks based on memory requests it receives from the rest of the host system. In some embodiments, no more than one page may be able to be open in a bank at any given time. In the embodiment shown in FIG. 16, each DRAM chip may therefore have up to two pages open at a time. When a DRAM chip has no open pages, the power management scheme may place it in the precharge power down mode.

The clock enable inputs of the DRAM chips may be controlled by the buffer chip, or by another chip (not shown) on the R-DIMM, or by an AMB (not shown) in the case of an FB-DIMM, or by the memory controller, to implement the power management technique. The power management technique may be particularly effective if it implements a closed page policy.

Another optional power management technique may include mapping a plurality of DRAM circuits to a single bank of the larger capacity emulated DRAM. For example, a buffered stack (not shown) of sixteen ×4 256 Mb DDR2 SDRAM chips may be used in emulating a single ×4 4 Gb DDR2 SDRAM. The 4 Gb DRAM is specified by JEDEC as having eight banks of 512 Mbs each, so two of the 256 Mb DRAM chips may be mapped by the buffer chip to emulate each bank (whereas in FIG. 16 one DRAM was used to emulate two banks).

However, since only one page can be open in a bank at any given time, only one of the two DRAM chips emulating that bank can be in the active state at any given time. If the memory controller opens a page in one of the two DRAM chips, the other may be placed in the precharge power down mode. Thus, if a number p of DRAM chips are used to emulate one bank, at least p−1 of them may be in a power down mode at any given time; in other words, at least p−1 of the p chips are always in power down mode, although the particular powered down chips will tend to change over time, as the memory controller opens and closes various pages of memory.

As a caveat on the term “always” in the preceding paragraph, the power saving operation may comprise operating in precharge power down mode except when refresh is required.

Figure 17:
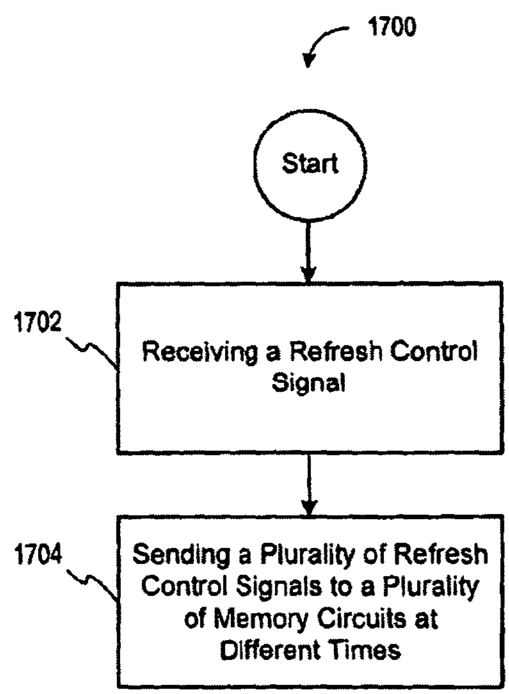
FIG. 17 is a flow chart showing a method of refreshing a plurality of memory circuits, in accordance with one embodiment of this invention.

FIG. 17 is a flow chart 1700 illustrating one embodiment of a method of refreshing a plurality of memory circuits. A refresh control signal is received (1702) e.g. from a memory controller which intends to refresh an emulated memory circuit. In response to receipt of the refresh control signal, a plurality of refresh control signals are sent (1704) e.g. by a buffer chip to a plurality of physical memory circuits at different times. These refresh control signals may optionally include the received refresh control signal or an instantiation or copy thereof. They may also, or instead, include refresh control signals that are different in at least one aspect (format, content, etc.) from the received signal.

In some embodiments, at least one first refresh control signal may be sent to a first subset of the physical memory circuits at a first time, and at least one second refresh control signal may be sent to a second subset of the physical memory circuits at a second time. Each refresh signal may be sent to one physical memory circuit, or to a plurality of physical memory circuits, depending upon the particular implementation.

The refresh control signals may be sent to the physical memory circuits after a delay in accordance with a particular timing. For example, the timing in which they are sent to the physical memory circuits may be selected to minimize an electrical current drawn by the memory, or to minimize a power consumption of the memory. This may be accomplished by staggering a plurality of refresh control signals. Or, the timing may be selected to comply with e.g. a tRFC parameter associated with the memory circuits.

To this end, physical DRAM circuits may receive periodic refresh operations to maintain integrity of data stored therein. A memory controller may initiate refresh operations by issuing refresh control signals to the DRAM circuits with sufficient frequency to prevent any loss of data in the DRAM circuits. After a refresh control signal is issued, a minimum time tRFC may be required to elapse before another control signal may be issued to that DRAM circuit. The tRFC parameter value may increase as the size of the DRAM circuit increases.

When the buffer chip receives a refresh control signal from the memory controller, it may refresh the smaller DRAM circuits within the span of time specified by the tRFC of the emulated DRAM circuit. Since the tRFC of the larger, emulated DRAM is longer than the tRFC of the smaller, physical DRAM circuits, it may not be necessary to issue any or all of the refresh control signals to the physical DRAM circuits simultaneously. Refresh control signals may be issued separately to individual DRAM circuits or to groups of DRAM circuits, provided that the tRFC requirements of all physical DRAMs has been met by the time the emulated DRAM's tRFC has elapsed. In use, the refreshes may be spaced in time to minimize the peak current draw of the combination buffer chip and DRAM circuit set during a refresh operation.

Figure 18:
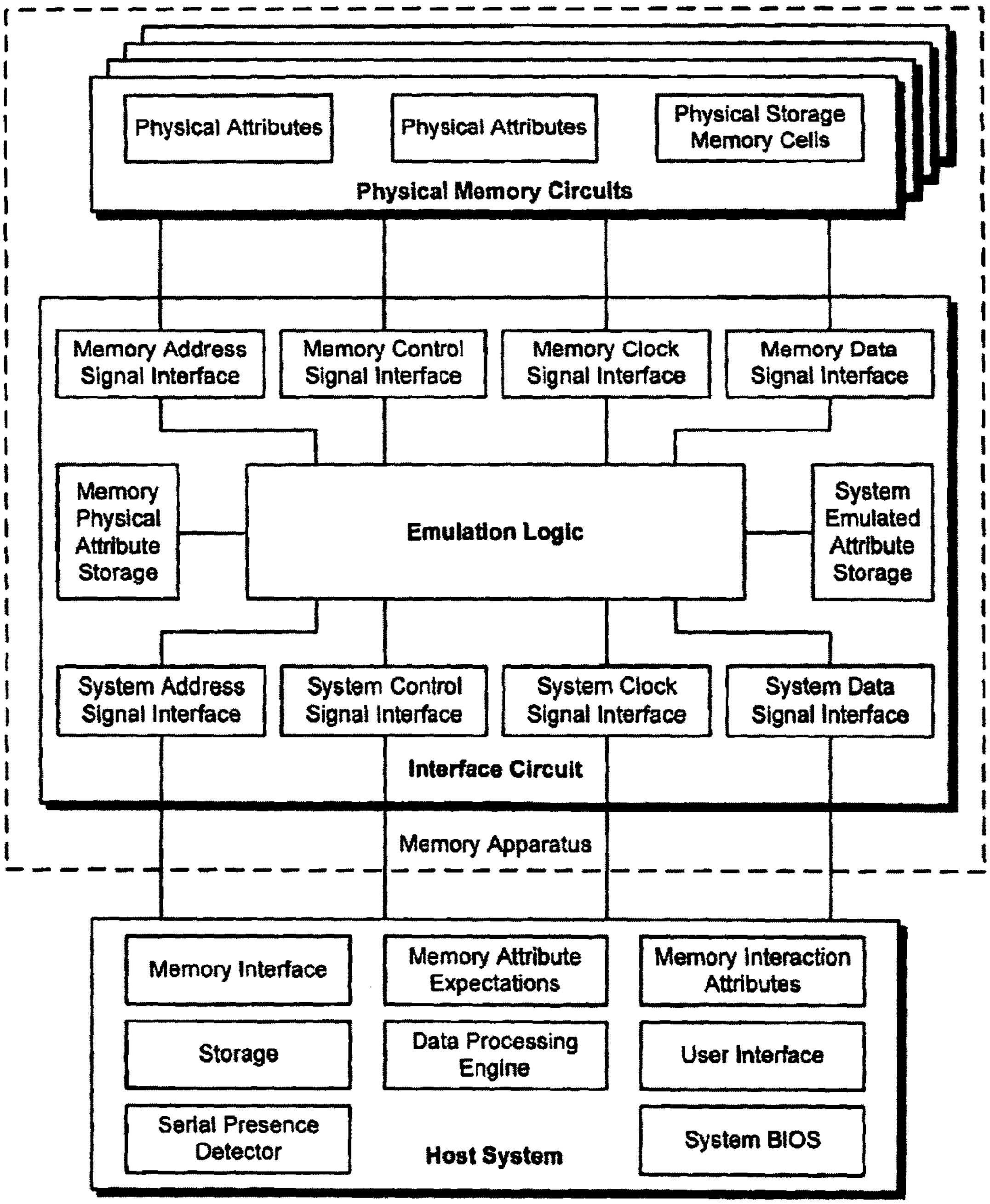
FIG. 18 shows a block diagram of another embodiment of the invention.

FIG. 18 illustrates one embodiment of an interface circuit such as may be utilized in any of the above-described memory systems, for interfacing between a system and memory circuits. The interface circuit may be included in the buffer chip, for example.

The interface circuit includes a system address signal interface for sending/receiving address signals to/from the host system, a system control signal interface for sending/receiving control signals to/from the host system, a system clock signal interface for sending/receiving clock signals to/from the host system, and a system data signal interface for sending/receiving data signals to/from the host system. The interface circuit further includes a memory address signal interface for sending/receiving address signals to/from the physical memory, a memory control signal interface for sending/receiving control signals to/from the physical memory, a memory clock signal interface for sending/receiving clock signals to/from the physical memory, and a memory data signal interface for sending/receiving data signals to/from the physical memory.

The host system includes a set of memory attribute expectations, or built-in parameters of the physical memory with which it has been designed to work (or with which it has been told, e.g. by the buffer circuit, it is working). Accordingly, the host system includes a set of memory interaction attributes, or built-in parameters according to which the host system has been designed to operate in its interactions with the memory. These memory interaction attributes and expectations will typically, but not necessarily, be embodied in the host system's memory controller.

In addition to physical storage circuits or devices, the physical memory itself has a set of physical attributes.

These expectations and attributes may include, by way of example only, memory timing, memory capacity, memory latency, memory functionality, memory type, memory protocol, memory power consumption, memory current requirements, and so forth.

The interface circuit includes memory physical attribute storage for storing values or parameters of various physical attributes of the physical memory circuits. The interface circuit further includes system emulated attribute storage. These storage systems may be read/write capable stores, or they may simply be a set of hard-wired logic or values, or they may simply be inherent in the operation of the interface circuit.

The interface circuit includes emulation logic which operates according to the stored memory physical attributes and the stored system emulation attributes, to present to the system an interface to an emulated memory which differs in at least one attribute from the actual physical memory. The emulation logic may, in various embodiments, alter a timing, value, latency, etc. of any of the address, control, clock, and/or data signals it sends to or receives from the system and/or the physical memory. Some such signals may pass through unaltered, while others may be altered. The emulation logic may be embodied as, for example, hard wired logic, a state machine, software executing on a processor, and so forth.

When one component is said to be "adjacent" another component, it should not be interpreted to mean that there is absolutely nothing between the two components, only that they are in the order indicated.

The physical memory circuits employed in practicing this invention may be any type of memory whatsoever, such as: DRAM, DDR DRAM, DDR2 DRAM, DDR3 DRAM, SDRAM, QDR DRAM, DRDRAM, FPM DRAM, VDRAM, EDO DRAM, BEDO DRAM, MDRAM, SGRAM, MRAM, IRAM, NAND flash, NOR flash, PSRAM, wetware memory, etc.

The physical memory circuits may be coupled to any type of memory module, such as: DIMM, R-DIMM, SO-DIMM, FB-DIMM, unbuffered DIMM, etc.

The system device which accesses the memory may be any type of system device, such as: desktop computer, laptop computer, workstation, server, consumer electronic device, television, personal digital assistant (PDA), mobile phone, printer or other peripheral device, etc.

Power-Related Embodiments

Figure 19:
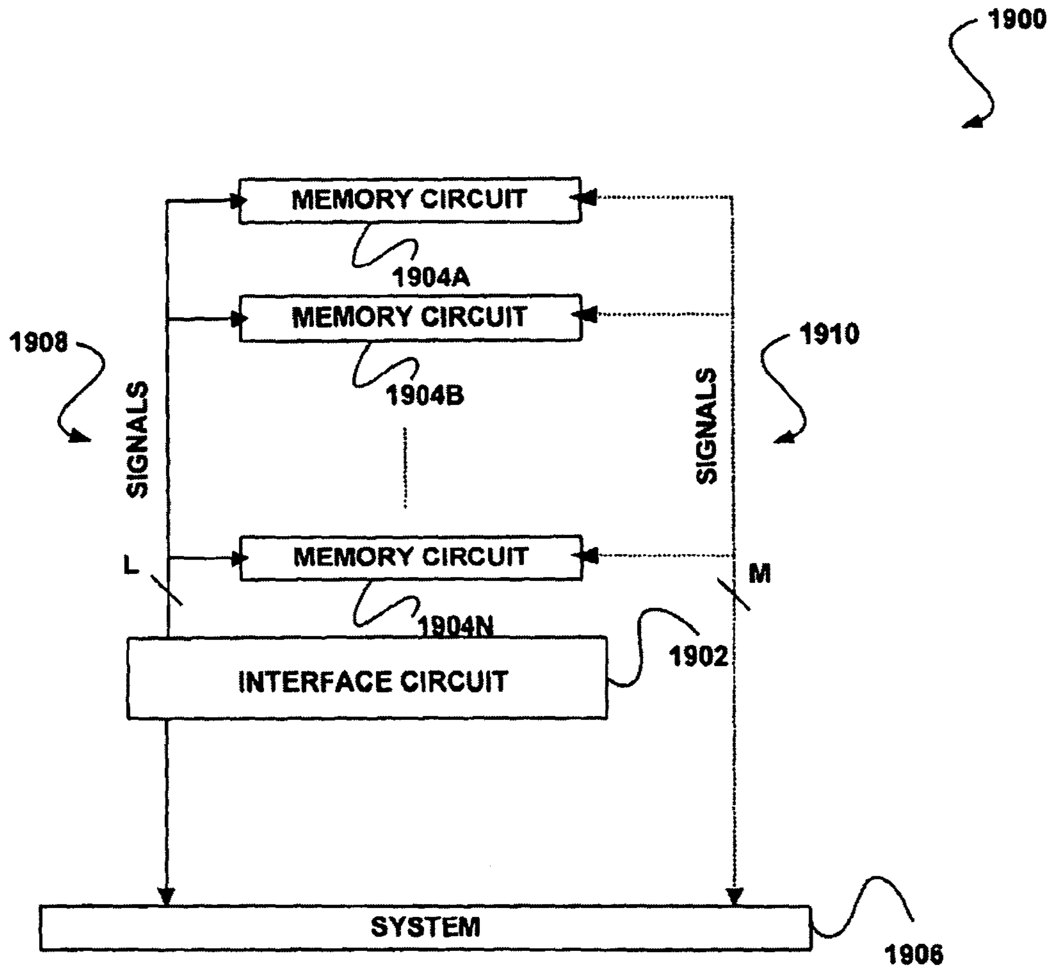
FIG. 19 illustrates a multiple memory circuit framework, in accordance with one embodiment.

FIG. 19 illustrates a multiple memory circuit framework 1900, in accordance with one embodiment. As shown, included are an interface circuit 1902, a plurality of memory circuits 1904A, 1904B, 1904N, and a system 1906. In the context of the present description, such memory circuits 1904A, 1904B, 1904N may include any circuit capable of serving as memory.

For example, in various embodiments, at least one of the memory circuits 1904A, 1904B, 1904N may include a monolithic memory circuit, a semiconductor die, a chip, a packaged memory circuit, or any other type of tangible memory circuit. In one embodiment, the memory circuits 1904A, 1904B, 1904N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 1904A, 1904B, 1904N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 1904A, 1904B, 1904N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 1904A, 1904B, 1904N may or may not be positioned on any type of material forming a substrate, card, module, sheet, fabric, board, carrier or other any other type of solid or flexible entity, form, or object. Of course, in other embodiments, the memory circuits 1904A, 1904B, 1904N may or may not be positioned in or on any desired entity, form, or object for packaging purposes. Still yet, the memory circuits 1904A, 1904B, 1904N may or may not be organized into ranks. Such ranks may refer to any arrangement of such memory circuits 1904A, 1904B, 1904N on any of the foregoing entities, forms, objects, etc.

Further, in the context of the present description, the system 1906 may include any system capable of requesting and/or initiating a process that results in an access of the memory circuits 1904A, 1904B, 1904N. As an option, the system 1906 may accomplish this utilizing a memory controller (not shown), or any other desired mechanism. In one embodiment, such system 1906 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 1902 may, in the context of the present description, refer to any circuit capable of interfacing (e.g. communicating, buffering, etc.) with the memory circuits 1904A, 1904B, 1904N and the system 1906. For example, the interface circuit 1902 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 1904A, 1904B, 1904N and the system 1906. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 1902 may include one or more circuits, such as a buffer (e.g. buffer chip, etc.), register (e.g. register chip, etc.), advanced memory buffer (AMB) (e.g. AMB chip, etc.), a component positioned on at least one DIMM, etc. Moreover, the register may, in various embodiments, include a JEDEC Solid State Technology Association (known as JEDEC) standard register (a JEDEC register), a register with forwarding, storing, and/or buffering capabilities, etc. In various embodiments, the register chips, buffer chips, and/or any other interface circuit(s) 1902 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 1902 may optionally be manufactured in monolithic form, packaged form, printed form, and/or any other manufactured form of circuit, for that matter.

In still yet another embodiment, a plurality of the aforementioned interface circuits 1902 may serve, in combination, to interface the memory circuits 1904A, 1904B, 1904N and the system 1906. Thus, in various embodiments, one, two, three, four, or more interface circuits 1902 may be utilized for such interfacing purposes. In addition, multiple interface circuits 1902 may be relatively configured or connected in any desired manner. For example, the interface circuits 1902 may be configured or connected in parallel, serially, or in various combinations thereof. The multiple interface circuits 1902 may use direct connections to each other, indirect connections to each other, or even a combination thereof. Furthermore, any number of the interface circuits 1902 may be allocated to any number of the memory circuits 1904A, 1904B, 1904N. In various other embodiments, each of the plurality of interface circuits 1902 may be the same or different. Even still, the interface circuits 1902 may share the same or similar interface tasks and/or perform different interface tasks.

While the memory circuits 1904A, 1904B, 1904N, interface circuit 1902, and system 1906 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 1902 (or portion(s) thereof) may be packaged with at least one of the memory circuits 1904A, 1904B, 1904N. Thus, a DRAM stack may or may not include at least one interface circuit (or portion(s) thereof). In other embodiments, different numbers of the interface circuit 1902 (or portion(s) thereof) may be packaged together. Such different packaging arrangements, when employed, may optionally improve the utilization of a monolithic silicon implementation, for example.

The interface circuit 1902 may be capable of various functionality, in the context of different embodiments. For example, in one optional embodiment, the interface circuit 1902 may interface a plurality of signals 1908 that are connected between the memory circuits 1904A, 1904B, 1904N and the system 1906. The signals may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 1908 may represent all of the signals that are connected between the memory circuits 1904A, 1904B, 1904N and the system 1906. In other aspects, at least a portion of signals 1910 may use direct connections between the memory circuits 1904A, 1904B, 1904N and the system 1906. Moreover, the number of interfaced signals 1908 (e.g. vs. a number of the signals that use direct connections 1910, etc.) may vary such that the interfaced signals 1908 may include at least a majority of the total number of signal connections between the memory circuits 1904A, 1904B, 1904N and the system 1906 (e.g. L>M, with L and M as shown in FIG. 19). In other embodiments, L may be less than or equal to M. In still other embodiments L and/or M may be zero.

In yet another embodiment, the interface circuit 1902 may or may not be operable to interface a first number of memory circuits 1904A, 1904B, 1904N and the system 1906 for simulating a second number of memory circuits to the system

1906. The first number of memory circuits 1904A, 1904B, 1904N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit seen by the system 1906 shall hereafter be referred to, where appropriate for clarification purposes, as the at least one "virtual" memory circuit.

In still additional aspects of the present embodiment, the second number of virtual memory circuits may be more than, equal to, or less than the first number of physical memory circuits 1904A, 1904B, 1904N. Just by way of example, the second number of virtual memory circuits may include a single memory circuit. Of course, however, any number of memory circuits may be simulated.

In the context of the present description, the term simulated may refer to any simulating, emulating, disguising, transforming, modifying, changing, altering, shaping, converting, etc., that results in at least one aspect of the memory circuits 1904A, 1904B, 1904N appearing different to the system 1906. In different embodiments, such aspect may include, for example, a number, a signal, a memory capacity, a timing, a latency, a design parameter, a logical interface, a control system, a property, a behavior (e.g. power behavior including, but not limited to a power consumption, current consumption, current waveform, power parameters, power metrics, any other aspect of power management or behavior, etc.), and/or any other aspect, for that matter.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

During use, in accordance with one optional power management embodiment, the interface circuit 1902 may or may not be operable to interface the memory circuits 1904A, 1904B, 1904N and the system 1906 for simulating at least one virtual memory circuit, where the virtual memory circuit includes at least one aspect that is different from at least one aspect of one or more of the physical memory circuits 1904A, 1904B, 1904N. Such aspect may, in one embodiment, include power behavior (e.g. a power consumption, current consumption, current waveform, any other aspect of power management or behavior, etc.). Specifically, in such embodiment, the interface circuit 1902 is operable to interface the physical memory circuits 1904A, 1904B, 1904N and the system 1906 for simulating at least one virtual memory circuit with a first power behavior that is different from a second power behavior of the physical memory circuits 1904A, 1904B, 1904N. Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.). In one embodiment, such power behavior simulation may be provided by the interface circuit 1902 performing various power management.

In another power management embodiment, the interface circuit 1902 may perform a power management operation in association with only a portion of the memory circuits. In the context of the present description, a portion of memory circuits may refer to any row, column, page, bank, rank, sub-row, sub-column, sub-page, sub-bank, sub-rank, any other subdivision thereof, and/or any other portion or portions of one or more memory circuits. Thus, in an embodiment where multiple memory circuits exist, such portion may even refer to an entire one or more memory circuits (which may be deemed a portion of such multiple memory circuits, etc.). Of course, again, the portion of memory circuits may refer to any portion or portions of one or more memory circuits. This applies to both physical and virtual memory circuits.

In various additional power management embodiments, the power management operation may be performed by the interface circuit 1902 during a latency associated with one or more commands directed to at least a portion of the plurality of memory circuits 1904A, 1904B, 1904N. In the context of the present description, such command(s) may refer to any control signal (e.g. one or more address signals; one or more data signals; a combination of one or more control signals; a sequence of one or more control signals; a signal associated with an activate (or active) operation, precharge operation, write operation, read operation, a mode register write operation, a mode register read operation, a refresh operation, or other encoded or direct operation, command or control signal; etc.). In one optional embodiment where the interface circuit 1902 is further operable for simulating at least one virtual memory circuit, such virtual memory circuit(s) may include a first latency that is different than a second latency associated with at least one of the plurality of memory circuits 1904A, 1904B, 1904N. In use, such first latency may be used to accommodate the power management operation.

Yet another embodiment is contemplated where the interface circuit 1902 performs the power management operation in association with at least a portion of the memory circuits, in an autonomous manner. Such autonomous performance refers to the ability of the interface circuit 1902 to perform the power management operation without necessarily requiring the receipt of an associated power management command from the system 1906.

In still additional embodiments, interface circuit 1902 may receive a first number of power management signals from the system 1906 and may communicate a second number of power management signals that is the same or different from the first number of power management signals to at least a portion of the memory circuits 1904A, 1904B, 1904N. In the context of the present description, such power management signals may refer to any signal associated with power management, examples of which will be set forth hereinafter during the description of other embodiments. In still another embodiment, the second number of power management signals may be utilized to perform power management of the portion(s) of memory circuits in a manner that is independent from each other and/or independent from the first number of power management signals received from the system 1906 (which may or may not also be utilized in a manner that is independent from each other). In even still yet another embodiment where the interface circuit 1902 is further operable for simulating at least one virtual memory circuit, a number of the aforementioned ranks (seen by the system 1906) may be less than the first number of power management signals.

In other power management embodiments, the interface circuit 1902 may be capable of a power management operation that takes the form of a power saving operation. In the context of the present description, the term power saving operation may refer to any operation that results in at least some power savings.

It should be noted that various power management operation embodiments, power management signal embodiments, simulation embodiments (and any other embodiments, for that matter) may or may not be used in conjunction with each other, as well as the various different embodiments that will hereinafter be described. To this end, more illustrative information will now be set forth regarding optional functionality/architecture of different embodiments which may or may not be implemented in the context of such interface circuit 1902 and the related components of FIG. 19, per the desires of the user. It should be strongly noted that the following information is set forth for illustrative purposes and should not be construed as limiting in any manner. For example, any of the following features may be optionally incorporated with or without the other features described.

Additional Power Management Embodiments

In one exemplary power management embodiment, the aforementioned simulation of a different power behavior may be achieved utilizing a power saving operation.

In one such embodiment, the power management, power behavior simulation, and thus the power saving operation may optionally include applying a power saving command to one or more memory circuits based on at least one state of one or more memory circuits. Such power saving command may include, for example, initiating a power down operation applied to one or more memory circuits. Further, such state may depend on identification of the current, past or predictable future status of one or more memory circuits, a predetermined combination of commands issued to the one or more memory circuits, a predetermined pattern of commands issued to the one or more memory circuits, a predetermined absence of commands issued to the one or more memory circuits, any command(s) issued to the one or more memory circuits, and/or any command(s) issued to one or more memory circuits other than the one or more memory circuits. In the context of the present description, such status may refer to any property of the memory circuit that may be monitored, stored, and/or predicted.

For example, at least one of a plurality of memory circuits may be identified that is not currently being accessed by the system. Such status identification may involve determining whether a portion(s) is being accessed in at least one of the plurality of memory circuits. Of course, any other technique may be used that results in the identification of at least one of the memory circuits (or portion(s) thereof) that is not being accessed, e.g. in a non-accessed state. In other embodiments, other such states may be detected or identified and used for power management.

In response to the identification of a memory circuit in a non-accessed state, a power saving operation may be initiated in association with the non-accessed memory circuit (or portion thereof). In one optional embodiment, such power saving operation may involve a power down operation (e.g. entry into a precharge power down mode, as opposed to an exit therefrom, etc.). As an option, such power saving operation may be initiated utilizing (e.g. in response to, etc.) a power management signal including, but not limited to a clock enable signal (CKE), chip select signal, in combination with other signals and optionally commands. In other embodiments, use of a non-power management signal (e.g. control signal, etc.) is similarly contemplated for initiating the power saving operation. Of course, however, it should be noted that anything that results in modification of the power behavior may be employed in the context of the present embodiment.

As mentioned earlier, the interface circuit may be operable to interface the memory circuits and the system for simulating at least one virtual memory circuit, where the virtual memory circuit includes at least one aspect that is different from at least one aspect of one or more of the physical memory circuits. In different embodiments, such aspect may include, for example, a signal, a memory capacity, a timing, a logical interface, etc. As an option, one or more of such aspects may be simulated for supporting a power management operation.

For example, the simulated timing, as described above, may include a simulated latency (e.g. time delay, etc.). In particular, such simulated latency may include a column address strobe (CAS) latency (e.g. a latency associated with accessing a column of data). Still yet, the simulated latency may include a row address to column address latency (tRCD). Thus, the latency may be that between the row address strobe (RAS) and CAS.

In addition, the simulated latency may include a row precharge latency (tRP). The tRP may include the latency to terminate access to an open row. Further, the simulated latency may include an activate to precharge latency (tRAS). The tRAS may include the latency between an activate operation and a precharge operation. Furthermore, the simulated latency may include a row cycle time (tRC). The tRC may include the latency between consecutive activate operations to the same bank of a DRAM circuit. In some embodiments, the simulated latency may include a read latency, write latency, or latency associated with any other operation(s), command(s), or combination or sequence of operations or commands. In other embodiments, the simulated latency may include simulation of any latency parameter that corresponds to the time between two events.

For example, in one exemplary embodiment using simulated latency, a first interface circuit may delay address and control signals for certain operations or commands by a clock cycles. In various embodiments where the first interface circuit is operating as a register or may include a register, a may not necessarily include the register delay (which is typically a one clock cycle delay through a JEDEC register). Also in the present exemplary embodiment, a second interface circuit may delay data signals by d clock cycles. It should be noted that the first and second interface circuits may be the same or different circuits or components in various embodiments. Further, the delays a and d may or may not be different for different memory circuits. In other embodiments, the delays a and d may apply to address and/or control and/or data signals. In alternative embodiments, the delays a and d may not be integer or even constant multiples of the clock cycle and may be less than one clock cycle or zero.

The cumulative delay through the interface circuits (e.g. the sum of the first delay a of the address and control signals through the first interface circuit and the second delay d of the data signals through the second interface circuit) may be j clock cycles (e.g. j=a+d). Thus, in a DRAM-specific embodiment, in order to make the delays a and d transparent to the memory controller, the interface circuits may make the stack of DRAM circuits appear to a memory controller (or any other component, system, or part(s) of a system) as one (or more) larger capacity virtual DRAM circuits with a read latency of i+j clocks, where i is the inherent read latency of the physical DRAM circuits.

To this end, the interface circuits may be operable for simulating at least one virtual memory circuit with a first latency that may be different (e.g. equal, longer, shorter, etc.) than a second latency of at least one of the physical memory circuits. The interface circuits may thus have the ability to simulate virtual DRAM circuits with a possibly different (e.g. increased, decreased, equal, etc.) read or other latency to the system, thus making transparent the delay of some or all of the address, control, clock, enable, and data signals through the interface circuits. This simulated aspect, in turn, may be used to accommodate power management of the DRAM circuits. More information regarding such use will be set forth hereinafter in greater detail during reference to different embodiments outlined in subsequent figures.

In still another embodiment, the interface circuit may be operable to receive a signal from the system and communicate the signal to at least one of the memory circuits after a delay. The signal may refer to one of more of a control signal, a data signal, a clock signal, an enable signal, a reset signal, a logical or physical signal, a combination or pattern of such signals, or a sequence of such signals, and/or any other signal for that matter. In various embodiments, such delay may be fixed or variable (e.g. a function of a current signal, and/or a previous signal, and/or a signal that will be communicated, after a delay, at a future time, etc.). In still other embodiments, the interface circuit may be operable to receive one or more signals from at least one of the memory circuits and communicate the signal(s) to the system after a delay.

As an option, the signal delay may include a cumulative delay associated with one or more of the aforementioned signals. Even still, the signal delay may result in a time shift of the signal (e.g. forward and/or back in time) with respect to other signals. Of course, such forward and backward time shift may or may not be equal in magnitude.

In one embodiment, the time shifting may be accomplished utilizing a plurality of delay functions which each apply a different delay to a different signal. In still additional embodiments, the aforementioned time shifting may be coordinated among multiple signals such that different signals are subject to shifts with different relative directions/magnitudes. For example, such time shifting may be performed in an organized manner. Yet again, more information regarding such use of delay in the context of power management will be set forth hereinafter in greater detail during reference to subsequent figures.

Embodiments with Varying Physical Stack Arrangements

FIGS. 20A-E show a stack of DRAM circuits 2000 that utilize one or more interface circuits, in accordance with various embodiments. As an option, the stack of DRAM circuits 2000 may be implemented in the context of the architecture of FIG. 19. Of course, however, the stack of DRAM circuits 2000 may be implemented in any other desired environment (e.g. using other memory types, using different memory types within a stack, etc.). It should also be noted that the aforementioned definitions may apply during the present description.

As shown in FIGS. 20A-E, one or more interface circuits 2002 may be placed electrically between an electronic system 2004 and a stack of DRAM circuits 2006A-D. Thus the interface circuits 2002 electrically sit between the electronic system 2004 and the stack of DRAM circuits 2006A-D. In the context of the present description, the interface circuit(s) 2002 may include any interface circuit that meets the definition set forth during reference to FIG. 19.

In the present embodiment, the interface circuit(s) 2002 may be capable of interfacing (e.g. buffering, etc.) the stack of DRAM circuits 2006A-D to electrically and/or logically resemble at least one larger capacity virtual DRAM circuit to the system 2004. Thus, a stack or buffered stack may be utilized. In this way, the stack of DRAM circuits 2006A-D may appear as a smaller quantity of larger capacity virtual DRAM circuits to the system 2004.

Just by way of example, the stack of DRAM circuits 2006A-D may include eight 512 Mb DRAM circuits. Thus, the interface circuit(s) 2002 may buffer the stack of eight 512 Mb DRAM circuits to resemble a single 4 Gb virtual DRAM circuit to a memory controller (not shown) of the associated system 2004. In another example, the interface circuit(s) 2002 may buffer the stack of eight 512 Mb DRAM circuits to resemble two 2 Gb virtual DRAM circuits to a memory controller of an associated system 2004.

Furthermore, the stack of DRAM circuits 2006A-D may include any number of DRAM circuits. Just by way of example, the interface circuit(s) 2002 may be connected to 1, 2, 4, 8 or more DRAM circuits 2006A-D. In alternate embodiments, to permit data integrity storage or for other reasons, the interface circuit(s) 2002 may be connected to an odd number of DRAM circuits 2006A-D. Additionally, the DRAM circuits 2006A-D may be arranged in a single stack. Of course, however, the DRAM circuits 2006A-D may also be arranged in a plurality of stacks The DRAM circuits 2006A-D may be arranged on, located on, or connected to a single side of the interface circuit(s) 2002, as shown in FIGS. 20A-D. As another option, the DRAM circuits 2006A-D may be arranged on, located on, or connected to both sides of the interface circuit(s) 2002 shown in FIG. 20E. Just by way of example, the interface circuit(s) 2002 may be connected to 16 DRAM circuits with 8 DRAM circuits on either side of the interface circuit(s) 2002, where the 8 DRAM circuits on each side of the interface circuit(s) 2002 are arranged in two stacks of four DRAM circuits. In other embodiments, other arrangements and numbers of DRAM circuits are possible (e.g. to implement error-correction coding, ECC, etc.)

The interface circuit(s) 2002 may optionally be a part of the stack of DRAM circuits 2006A-D. Of course, however, interface circuit(s) 2002 may also be separate from the stack of DRAM circuits 2006A-D. In addition, interface circuit(s) 2002 may be physically located anywhere in the stack of DRAM circuits 2006A-D, where such interface circuit(s) 2002 electrically sits between the electronic system 2004 and the stack of DRAM circuits 2006A-D.

Figure 20A:
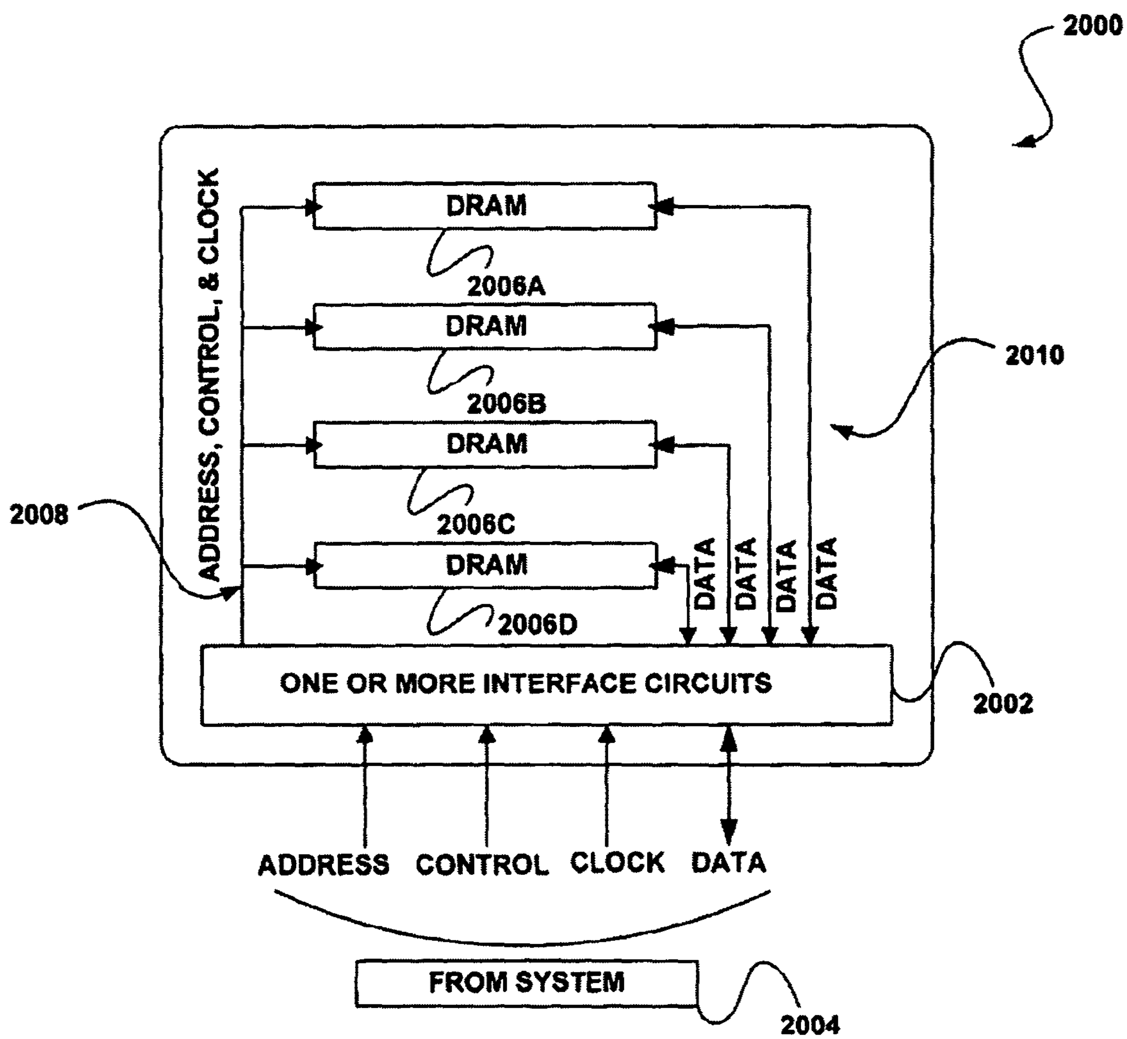
FIGS. 20A-E show a stack of dynamic random access memory (DRAM) circuits that utilize one or more interface circuits, in accordance with various embodiments.

In one embodiment, the interface circuit(s) 2002 may be located at the bottom of the stack of DRAM circuits 2006A-D (e.g. the bottom-most circuit in the stack) as shown in FIGS. 20A-2D. As another option, and as shown in FIG. 200E, the interface circuit(s) 2002 may be located in the middle of the stack of DRAM circuits 2006A-D. As still yet another option, the interface circuit(s) 2002 may be located at the top of the stack of DRAM circuits 2006A-D (e.g. the top-most circuit in the stack). Of course, however, the interface circuit(s) 2002 may also be located anywhere between the two extremities of the stack of DRAM circuits 2006A-D. In alternate embodiments, the interface circuit(s) 2002 may not be in the stack of DRAM circuits 2006A-D and may be located in a separate package(s).

The electrical connections between the interface circuit(s) 2002 and the stack of DRAM circuits 2006A-D may be configured in any desired manner. In one optional embodiment, address, control (e.g. command, etc.), and clock signals may be common to all DRAM circuits 2006A-D in the stack (e.g. using one common bus). As another option, there may be multiple address, control and clock busses.

As yet another option, there may be individual address, control and clock busses to each DRAM circuit 2006A-D.

Similarly, data signals may be wired as one common bus, several busses, or as an individual bus to each DRAM circuit 2006A-D. Of course, it should be noted that any combinations of such configurations may also be utilized.

Figure 20B:
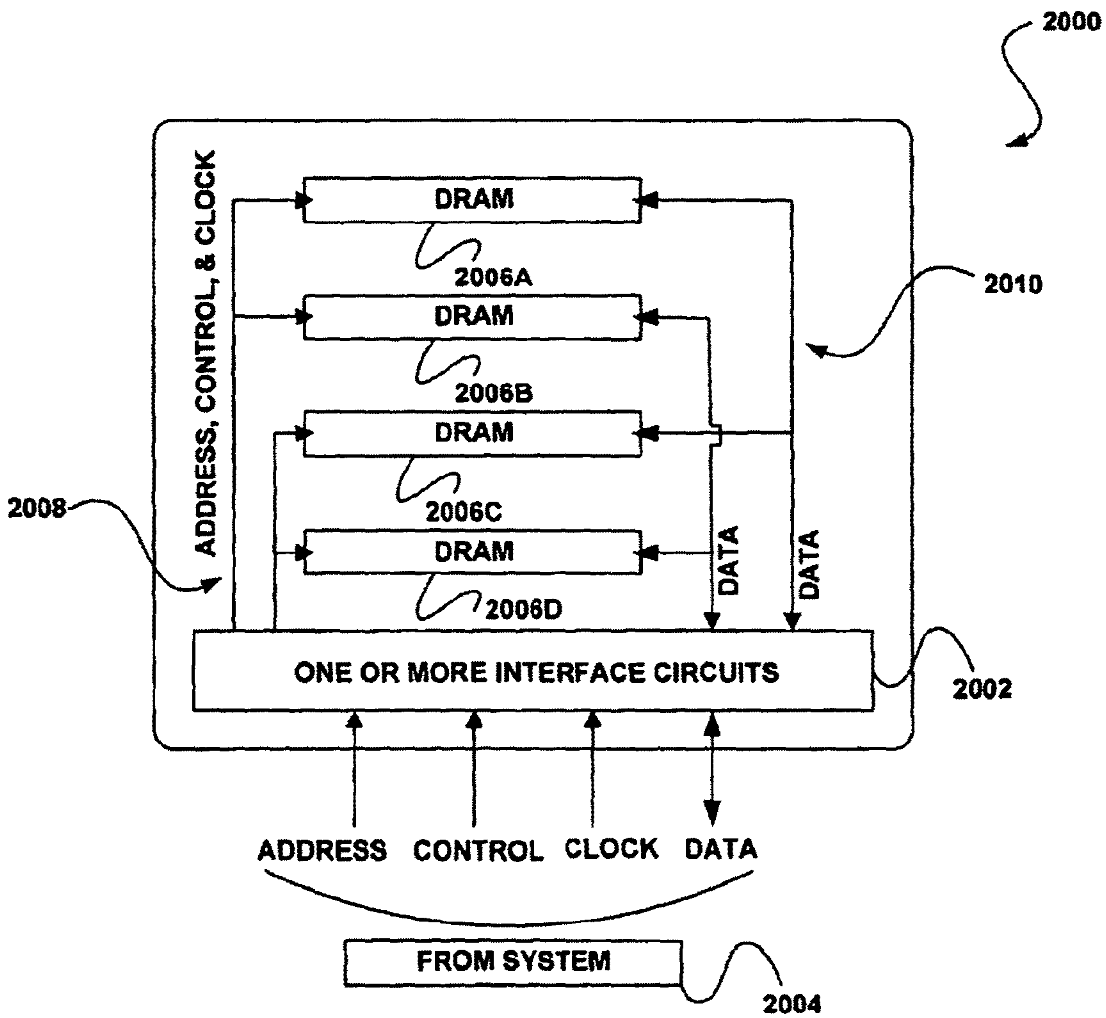
Figure 20C:
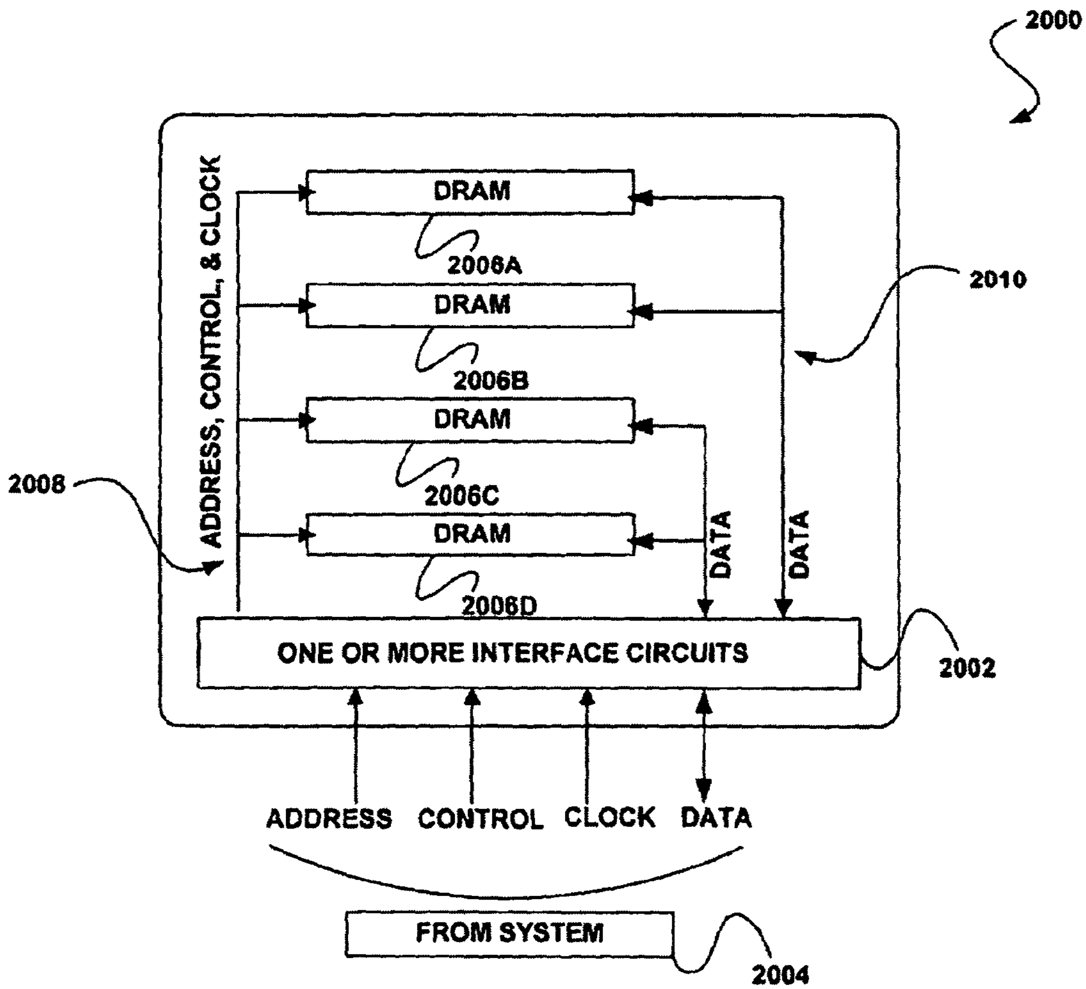
Figure 20D:
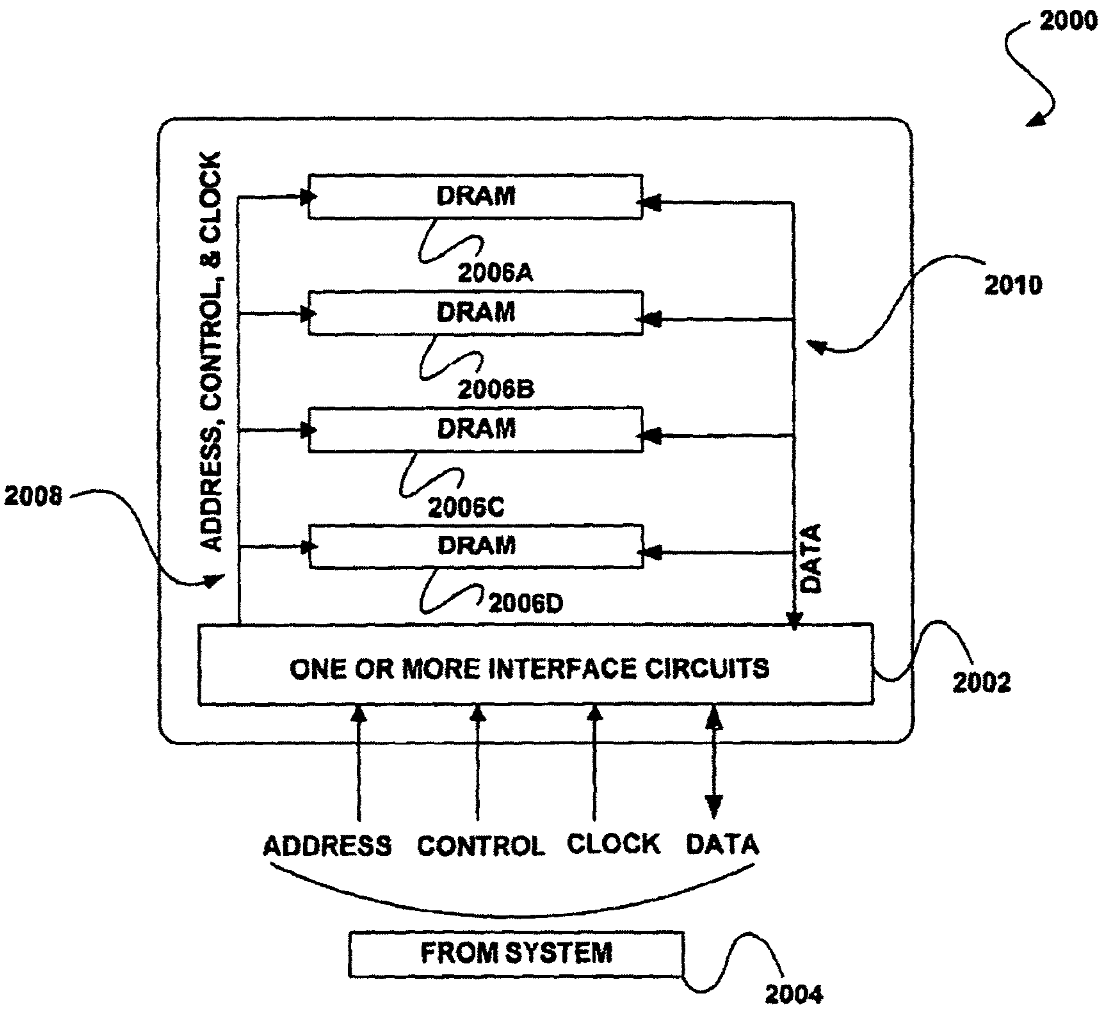
Figure 20E:
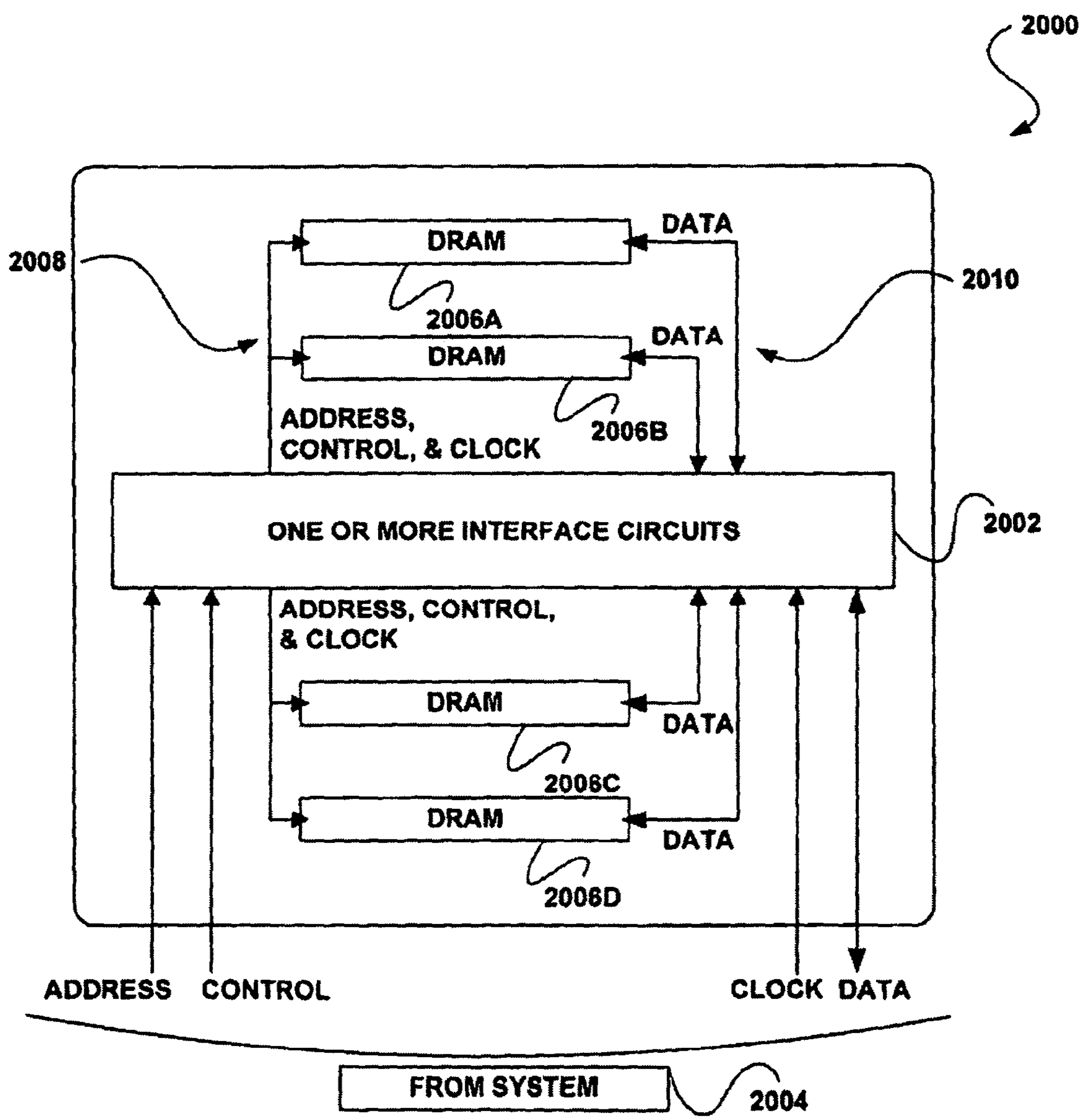

For example, as shown in FIG. 20A, the DRAM circuits 2006A-D may have one common address, control and clock bus 2008 with individual data busses 2010. In another example, as shown in FIG. 20B, the DRAM circuits 2006A-D may have two address, control and clock busses 2008 along with two data busses 2010. In still yet another example, as shown in FIG. 20C, the DRAM circuits 2006A-D may have one address, control and clock bus 2008 together with two data busses 2010. In addition, as shown in FIG. 20D, the DRAM circuits 2006A-D may have one common address, control and clock bus 2008 and one common data bus 2010. It should be noted that any other permutations and combinations of such address, control, clock and data buses may be utilized.

In one embodiment, the interface circuit(s) 2002 may be split into several chips that, in combination, perform power management functions. Such power management functions may optionally introduce a delay in various signals.

For example, there may be a single register chip that electrically sits between a memory controller and a number of stacks of DRAM circuits. The register chip may, for example, perform the signaling to the DRAM circuits. Such register chip may be connected electrically to a number of other interface circuits that sit electrically between the register chip and the stacks of DRAM circuits. Such interface circuits in the stacks of DRAM circuits may then perform the aforementioned delay, as needed.

In another embodiment, there may be no need for an interface circuit in each DRAM stack. In particular, the register chip may perform the signaling to the DRAM circuits directly. In yet another embodiment, there may be no need for a stack of DRAM circuits. Thus each stack may be a single memory (e.g. DRAM) circuit. In other implementations, combinations of the above implementations may be used. Just by way of example, register chips may be used in combination with other interface circuits, or registers may be utilized alone.

More information regarding the verification that a simulated DRAM circuit including any address, data, control and clock configurations behaves according to a desired DRAM standard or other design specification will be set forth hereinafter in greater detail.

Additional Embodiments with Different Physical Memory Module Arrangements

FIGS. 21A-D show a memory module 2100 which uses DRAM circuits or stacks of DRAM circuits (e.g. DRAM stacks) with various interface circuits, in accordance with different embodiments. As an option, the memory module 2100 may be implemented in the context of the architecture and environment of FIGS. 19 and/or 20. Of course, however, the memory module 2100 may be implemented in any desired environment. It should also be noted that the aforementioned definitions may apply during the present description.

Figure 21A:
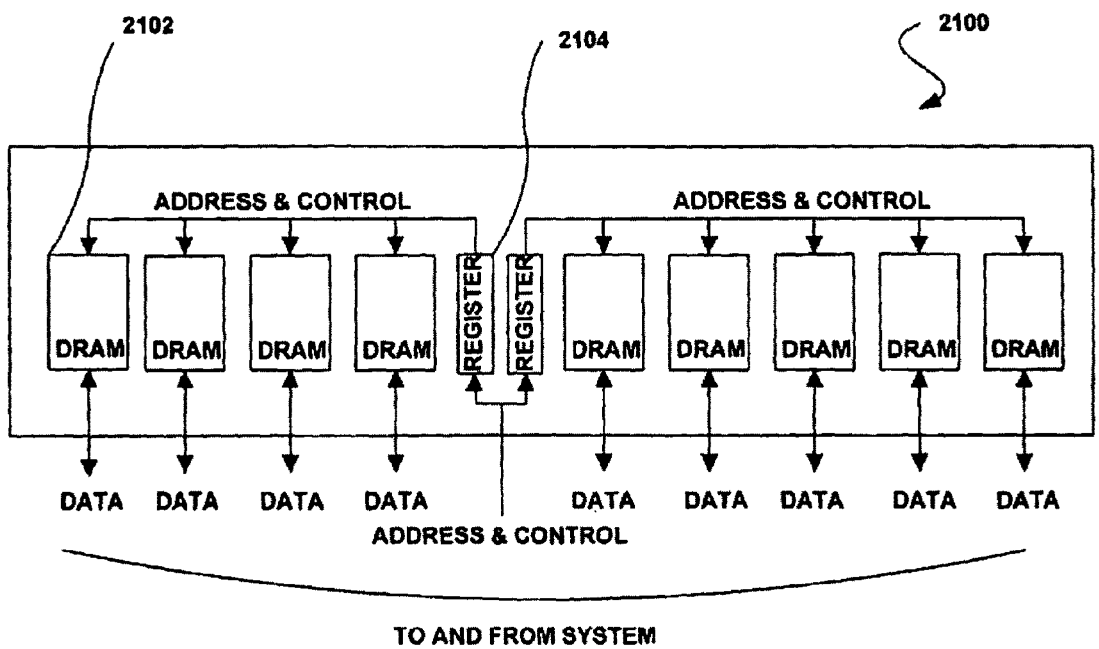
FIGS. 21A-D show a memory module which uses dynamic random access memory (DRAM) circuits with various interface circuits, in accordance with different embodiments.

FIG. 21A shows two register chips 2104 driving address and control signals to DRAM circuits 2102. The DRAM circuits 2102 may send/receive data signals to and/or from a system (e.g. memory controller) using the DRAM data bus, as shown.

Figure 21B:
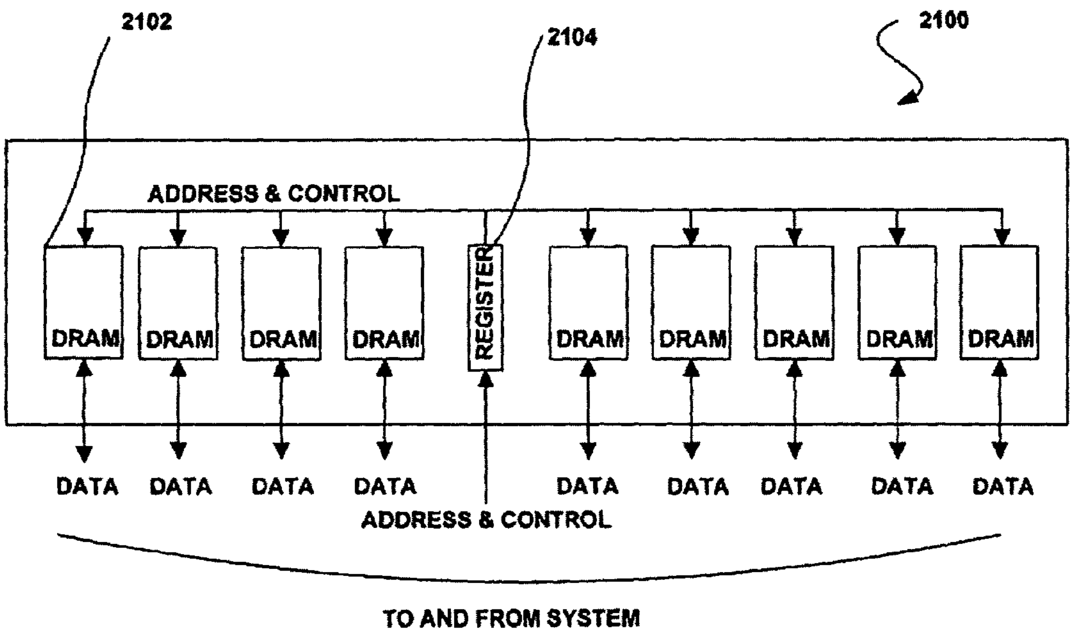

FIG. 21B shows one register chip 2104 driving address and control signals to DRAM circuits 2102. Thus, one, two, three, or more register chips 2104 may be utilized, in various embodiments.

Figure 21C:
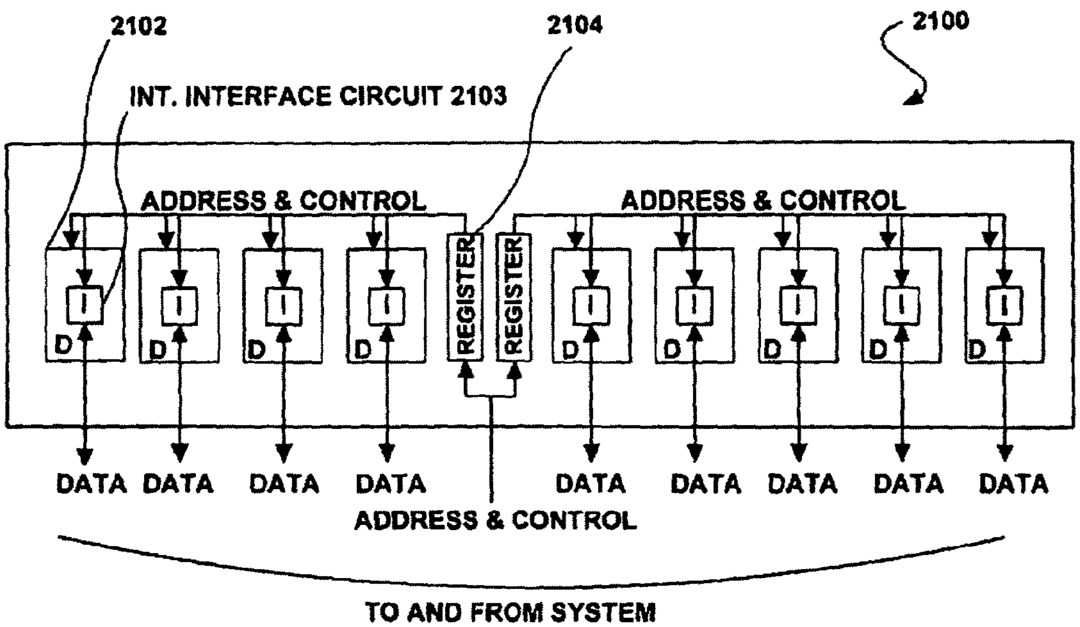

FIG. 21C shows register chips 2104 driving address and control signals to DRAM circuits 2102 and/or intelligent interface circuits 2103. In addition, the DRAM data bus is connected to the intelligent interface circuits 2103 (not shown explicitly). Of course, as described herein, and illustrated in FIGS. 21A and 21B, one, two, three or more register chips 2104 may be used. Furthermore, this FIG. illustrates that the register chip(s) 2104 may drive some, all, or none of the control and/or address signals to intelligent interface circuits 2103.

Figure 21D:
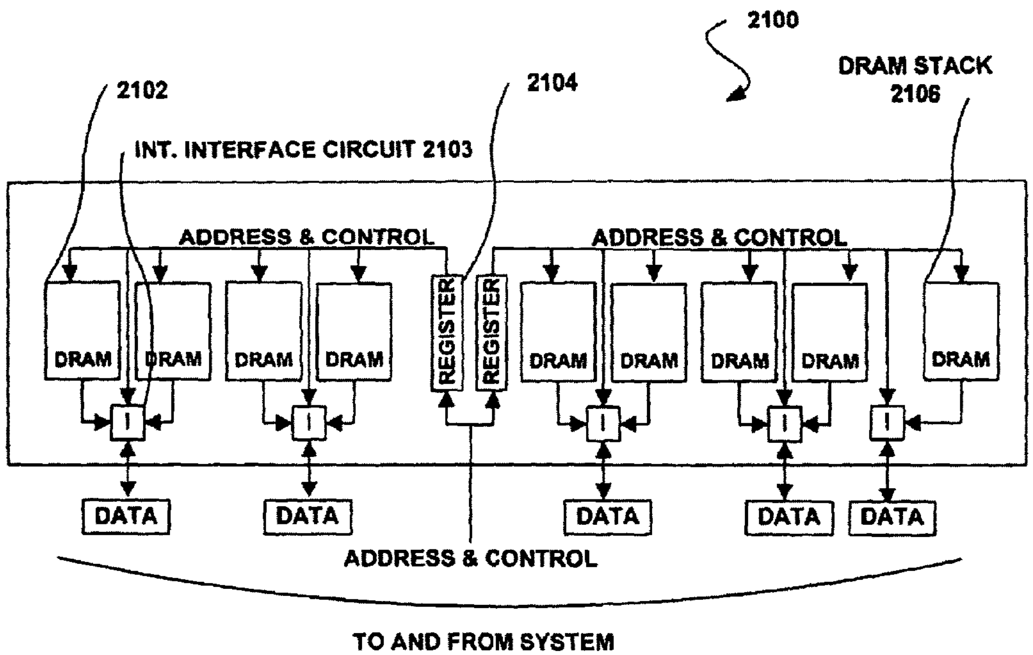

FIG. 21D shows register chips 2104 driving address and control signals to the DRAM circuits 2102 and/or intelligent interface circuits 2103. Furthermore, this FIG. illustrates that the register chip(s) 2104 may drive some, all, or none of the control and/or address signals to intelligent interface circuits 2103. Again, the DRAM data bus is connected to the intelligent interface circuits 2103. Additionally, this FIG. illustrates that either one (in the case of DRAM stack 2106) or two (in the case of the other DRAM stacks 2102) stacks of DRAM circuits 2102 may be associated with a single intelligent interface circuit 2103.

Of course, however, any number of stacks of DRAM circuits 2102 may be associated with each intelligent interface circuit 2103. As another option, an AMB chip may be utilized with an FB-DIMM, as will be described in more detail with respect to FIGS. 22A-E.

FIGS. 22A-E show a memory module 2200 which uses DRAM circuits or stacks of DRAM circuits (e.g. DRAM stacks) 2202 with an AMB chip 2204, in accordance with various embodiments. As an option, the memory module 2200 may be implemented in the context of the architecture and environment of FIGS. 19-21. Of course, however, the memory module 2200 may be implemented in any desired environment. It should also be noted that the aforementioned definitions may apply during the present description.

Figure 22A:
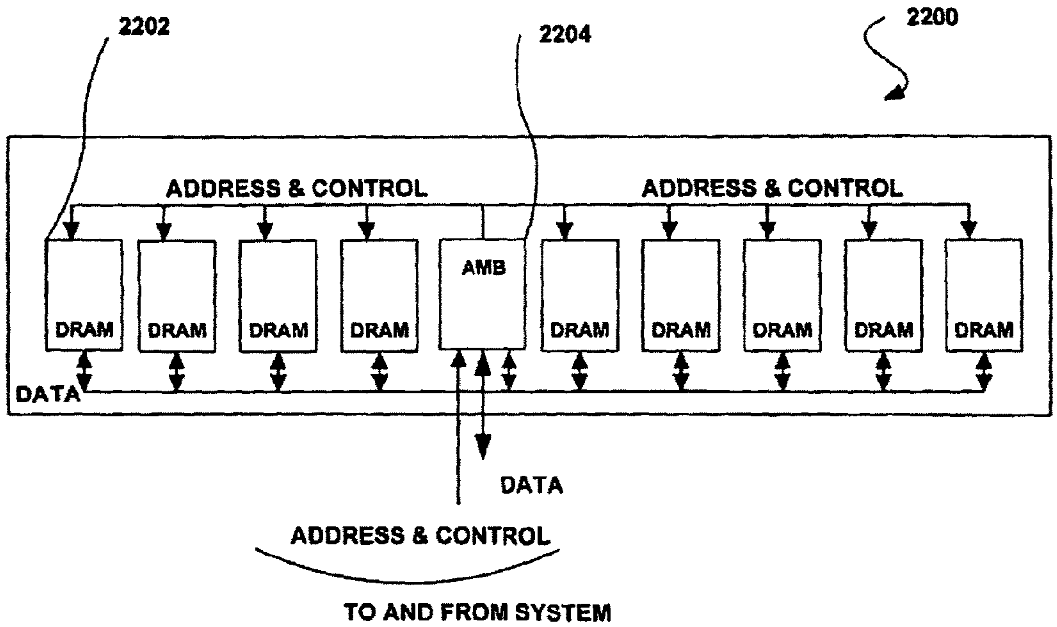
FIGS. 22A-E show a memory module which uses DRAM circuits with an advanced memory buffer (AMB) chip and various other interface circuits, in accordance with various embodiments.

FIG. 22A shows the AMB chip 2204 driving address and control signals to the DRAM circuits 2202. In addition, the AMB chip 2204 sends/receives data to/from the DRAM circuits 2202.

Figure 22B:
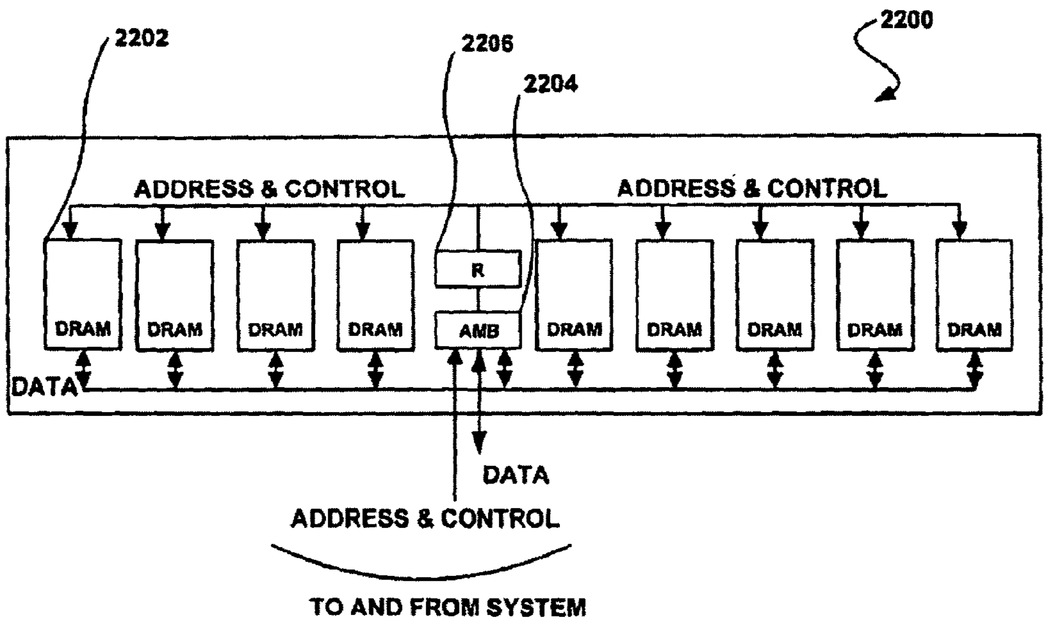

FIG. 22B shows the AMB chip 2204 driving address and control signals to a register 2206. In turn, the register 2206 may drive address and control signals to the DRAM circuits 2202. The DRAM circuits send/receive data to/from the AMB. Moreover, a DRAM data bus may be connected to the AMB chip 2204.

Figure 22C:
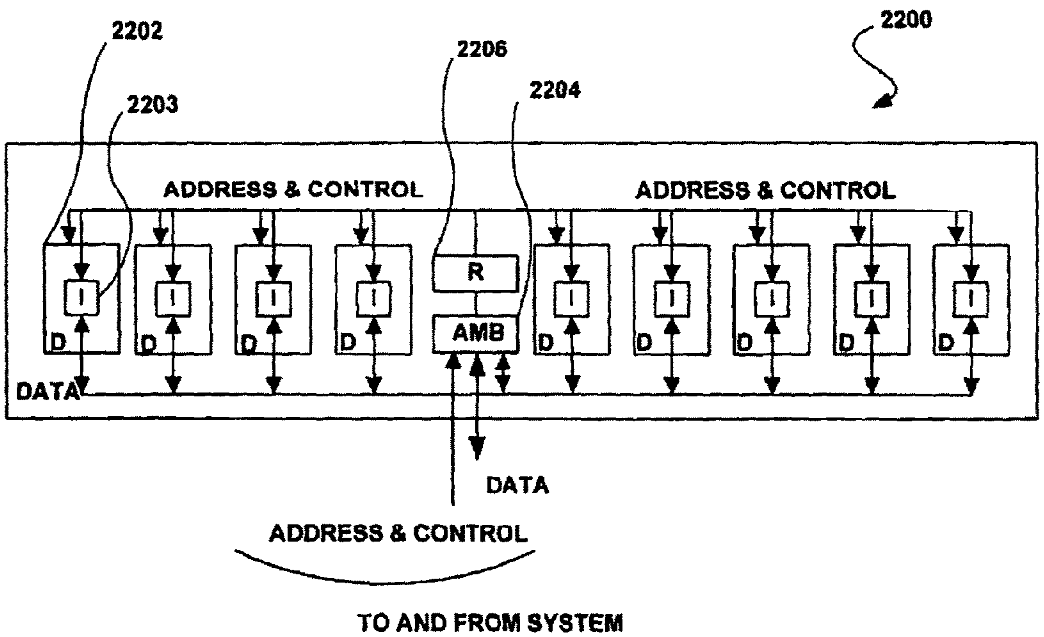

FIG. 22C shows the AMB chip 2204 driving address and control to the register 2206. In turn, the register 2206 may drive address and control signals to the DRAM circuits 2202 and/or the intelligent interface circuits 2203. This FIG. illustrates that the register 2206 may drive zero, one, or more address and/or control signals to one or more intelligent interface circuits 2203. Further, each DRAM data bus is connected to the interface circuit 2203 (not shown explicitly). The intelligent interface circuit data bus is connected to the AMB chip 2204. The AMB data bus is connected to the system.

Figure 22D:
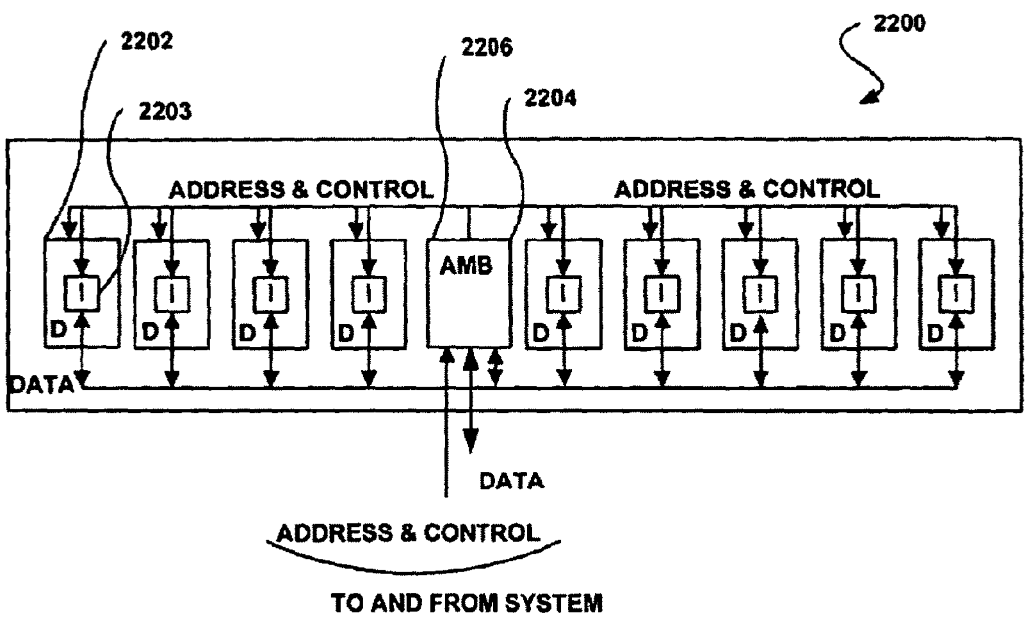

FIG. 22D shows the AMB chip 2204 driving address and/or control signals to the DRAM circuits 2202 and/or the intelligent interface circuits 2203. This FIG. illustrates that the AMB chip 2204 may drive zero, one, or more address and/or control signals to one or more intelligent interface circuits 2203. Moreover, each DRAM data bus is connected to the intelligent interface circuits 2203 (not shown explicitly). The intelligent interface circuit data bus is connected to the AMB chip 2204. The AMB data bus is connected to the system.

Figure 22E:
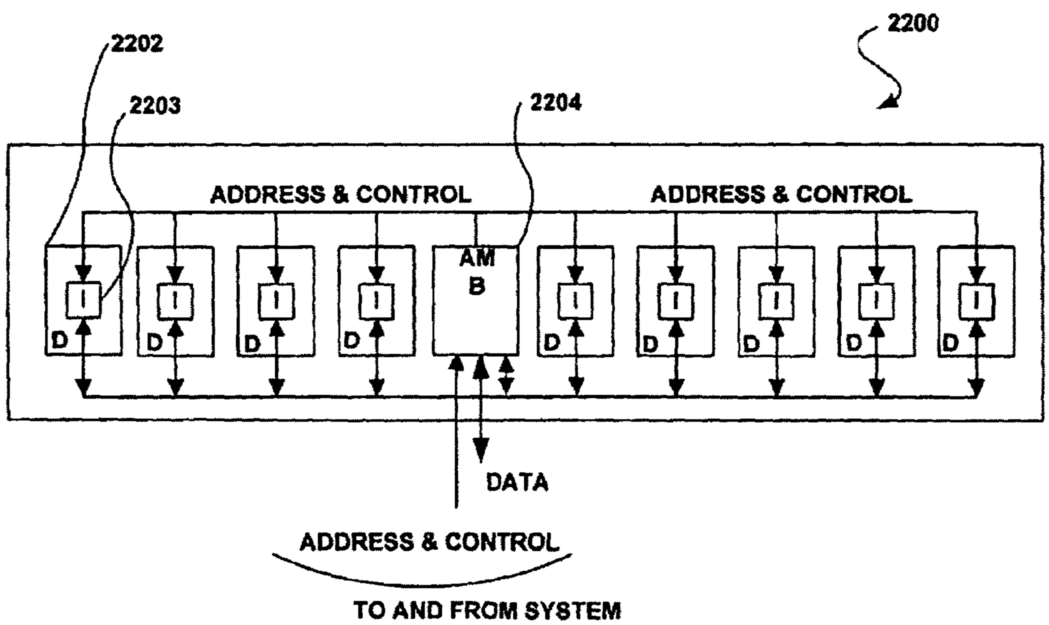

FIG. 22E shows the AMB chip 2204 driving address and control to one or more intelligent interface circuits 2203. The intelligent interface circuits 2203 then drive address and control to each DRAM circuit 2202 (not shown explicitly). Moreover, each DRAM data bus is connected to the intelligent interface circuits 2203 (also not shown explicitly). The intelligent interface circuit data bus is connected to the AMB chip 2204. The AMB data bus is connected to the system.

In other embodiments, combinations of the above implementations as shown in FIGS. 22A-E may be utilized. Just by way of example, one or more register chips may be utilized in conjunction with the intelligent interface circuits. In other embodiments, register chips may be utilized alone and/or with or without stacks of DRAM circuits.

Figure 23:
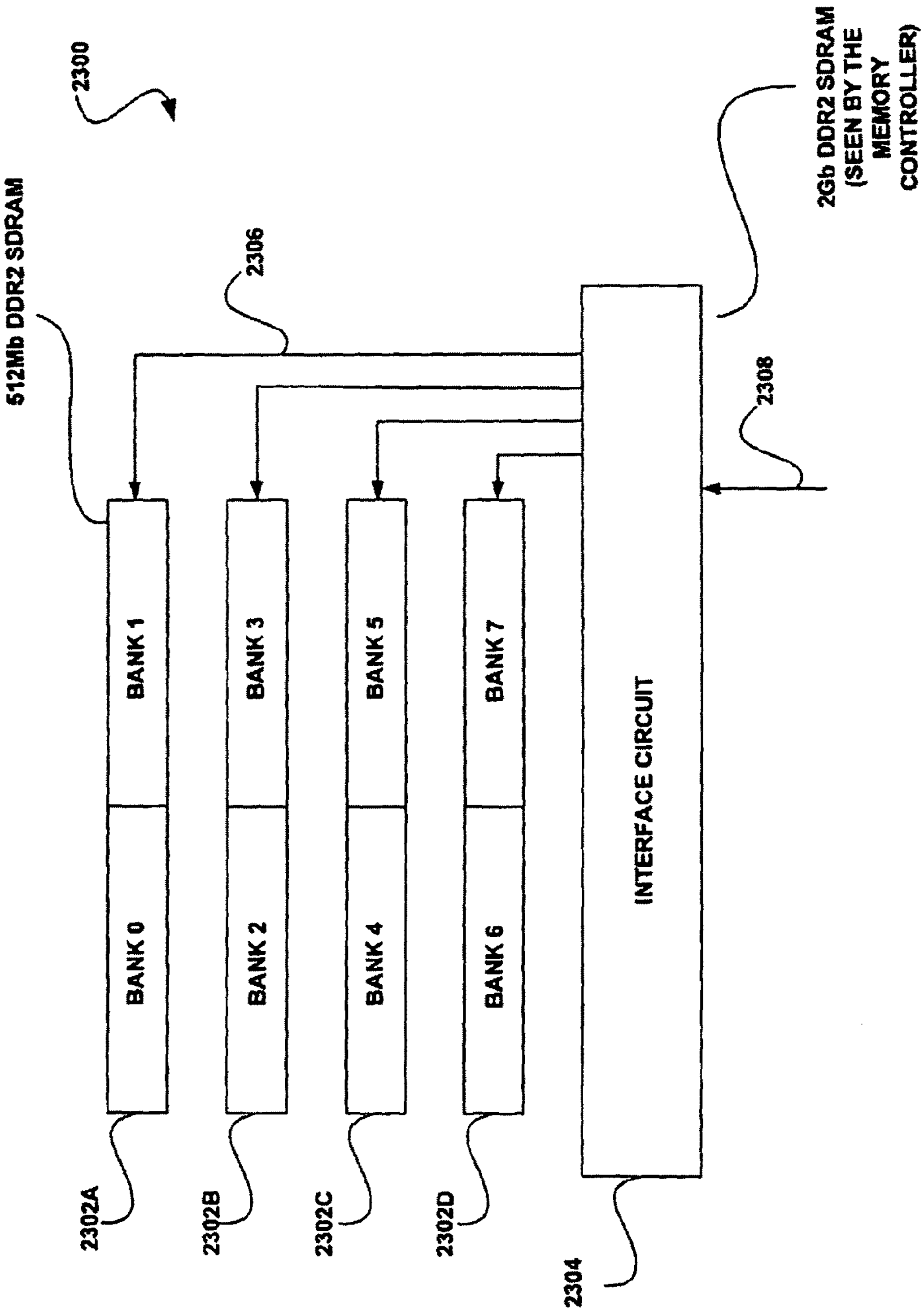
FIG. 23 shows a system in which four 512 Mb DRAM circuits are mapped to a single 2 Gb DRAM circuit, in accordance with yet another embodiment.

FIG. 23 shows a system 2300 in which four 512 Mb DRAM circuits appear, through simulation, as (e.g. mapped to) a single 2 Gb virtual DRAM circuit, in accordance with yet another embodiment. As an option, the system 2300 may be implemented in the context of the architecture and environment of FIGS. 19-22. Of course, however, the system 2300 may be implemented in any desired environment. It should also be noted that the aforementioned definitions may apply during the present description.

As shown in FIG. 23, a stack of memory circuits that is interfaced by the interface circuit for the purpose of simulation (e.g. a buffered stack) may include four 512 Mb physical DRAM circuits 2302A-D that appear to a memory controller as a single 2 Gb virtual DRAM circuit. In different embodiments, the buffered stack may include various numbers of physical DRAM circuits including two, four, eight, sixteen or even more physical DRAM circuits that appear to the memory controller as a single larger capacity virtual DRAM circuit or multiple larger capacity virtual DRAM circuits. In addition, the number of physical DRAM circuits in the buffered stack may be an odd number. For example, an odd number of circuits may be used to provide data redundancy or data checking or other features.

Also, one or more control signals (e.g. power management signals) 2306 may be connected between the interface circuit 2304 and the DRAM circuits 2302A-D in the stack. The interface circuit 2304 may be connected to a control signal (e.g. power management signal) 2308 from the system, where the system uses the control signal 2308 to control one aspect (e.g. power behavior) of the 2 Gb virtual DRAM circuit in the stack. The interface circuit 2304 may control the one aspect (e.g. power behavior) of all the DRAM circuits 2302A-D in response to a control signal 2308 from the system to the 2 Gb virtual DRAM circuit. The interface circuit 2304 may also, using control signals 2306, control the one aspect (e.g. power behavior) of one or more of the DRAM circuits 2302A-D in the stack in the absence of a control signal 2308 from the system to the 2 Gb virtual DRAM circuit.

The buffered stacks 2300 may also be used in combination together on a DIMM such that the DIMM appears to the memory controller as a larger capacity DIMM. The buffered stacks may be arranged in one or more ranks on the DIMM. All the virtual DRAM circuits on the DIMM that respond in parallel to a control signal 2308 (e.g. chip select signal, clock enable signal, etc.) from the memory controller belong to a single rank. However, the interface circuit 2304 may use a plurality of control signals 2306 instead of control signal 2308 to control DRAM circuits 2302A-D. The interface circuit 2304 may use all the control signals 2306 in parallel in response to the control signal 2308 to do power management of the DRAM circuits 2302A-D in one example. In another example, the interface circuit 2304 may use at least one but not all the control signals 2306 in response to the control signal 2308 to do power management of the DRAM circuits 2302A-D. In yet another example, the interface circuit 2304 may use at least one control signal 2306 in the absence of the control signal 2308 to do power management of the DRAM circuits 2302A-D.

More information regarding the verification that a memory module including DRAM circuits with various interface circuits behave according to a desired DRAM standard or other design specification will be set forth hereinafter in greater detail.

DRAM Bank Configuration Embodiments

The number of banks per DRAM circuit may be defined by JEDEC standards for many DRAM circuit technologies. In various embodiments, there may be different configurations that use different mappings between the physical DRAM circuits in a stack and the banks in each virtual DRAM circuit seen by the memory controller. In each configuration, multiple physical DRAM circuits 2302A-D may be stacked and interfaced by an interface circuit 2304 and may appear as at least one larger capacity virtual DRAM circuit to the memory controller. Just by way of example, the stack may include four 512 Mb DDR2 physical SDRAM circuits that appear to the memory controller as a single 2 Gb virtual DDR2 SDRAM circuit.

In one optional embodiment, each bank of a virtual DRAM circuit seen by the memory controller may correspond to a portion of a physical DRAM circuit. That is, each physical DRAM circuit may be mapped to multiple banks of a virtual DRAM circuit. For example, in one embodiment, four 512 Mb DDR2 physical SDRAM circuits through simulation may appear to the memory controller as a single 2 Gb virtual DDR2 SDRAM circuit. A 2 Gb DDR2 SDRAM may have eight banks as specified by the JEDEC standards. Therefore, in this embodiment, the interface circuit 2304 may map each 512 Mb physical DRAM circuit to two banks of the 2 Gb virtual DRAM. Thus, in the context of the present embodiment, a one-circuit-to-many-bank configuration (one physical DRAM circuit to many banks of a virtual DRAM circuit) may be utilized.

In another embodiment, each physical DRAM circuit may be mapped to a single bank of a virtual DRAM circuit. For example, eight 512 Mb DDR2 physical SDRAM circuits may appear to the memory controller, through simulation, as a single 4 Gb virtual DDR2 SDRAM circuit. A 4 Gb DDR2 SDRAM may have eight banks as specified by the JEDEC standards. Therefore, the interface circuit 2304 may map each 512 Mb physical DRAM circuit to a single bank of the 4 Gb virtual DRAM. In this way, a one-circuit-to-one-bank configuration (one physical DRAM circuit to one bank of a virtual DRAM circuit) may be utilized.

In yet another embodiment, a plurality of physical DRAM circuits may be mapped to a single bank of a virtual DRAM circuit. For example, sixteen 256 Mb DDR2 physical SDRAM circuits may appear to the memory controller, through simulation, as a single 4 Gb virtual DDR2 SDRAM circuit. A 4 Gb DDR2 SDRAM circuit may be specified by JEDEC to have eight banks, such that each bank of the 4 Gb DDR2 SDRAM circuit may be 512 Mb. Thus, two of the 256 Mb DDR2 physical SDRAM circuits may be mapped by the interface circuit 2304 to a single bank of the 4 Gb virtual DDR2 SDRAM circuit seen by the memory controller. Accordingly, a many-circuit-to-one-bank configuration (many physical DRAM circuits to one bank of a virtual DRAM circuit) may be utilized.

Thus, in the above described embodiments, multiple physical DRAM circuits 2302A-D in the stack may be buffered by the interface circuit 2304 and may appear as at least one larger capacity virtual DRAM circuit to the memory controller. Just by way of example, the buffered stack may include four 512 Mb DDR2 physical SDRAM circuits that appear to the memory controller as a single 2 Gb DDR2 virtual SDRAM circuit. In normal operation, the combined power dissipation of all four DRAM circuits 2302A-D in the stack when they are active may be higher than the power dissipation of a monolithic (e.g. constructed without stacks) 2 Gb DDR2 SDRAM.

In general, the power dissipation of a DIMM constructed from buffered stacks may be much higher than a DIMM constructed without buffered stacks. Thus, for example, a DIMM containing multiple buffered stacks may dissipate much more power than a standard DIMM built using monolithic DRAM circuits. However, power management may be utilized to reduce the power dissipation of DIMMs that contain buffered stacks of DRAM circuits. Although the examples described herein focus on power management of buffered stacks of DRAM circuits, techniques and methods described apply equally well to DIMMs that are constructed without stacking the DRAM circuits (e.g. a stack of one DRAM circuit) as well as stacks that may not require buffering.

Embodiments Involving DRAM Power Management Latencies

In various embodiments, power management schemes may be utilized for one-circuit-to-many-bank, one-circuit-to-one-bank, and many-circuit-to-one-bank configurations. Memory (e.g. DRAM) circuits may provide external control inputs for power management. In DDR2 SDRAM, for example, power management may be initiated using the CKE and chip select (CS#) inputs and optionally in combination with a command to place the DDR2 SDRAM in various power down modes.

Four power saving modes for DDR2 SDRAM may be utilized, in accordance with various different embodiments (or even in combination, in other embodiments). In particular, two active power down modes, precharge power down mode, and self-refresh mode may be utilized. If CKE is de-asserted while CS# is asserted, the DDR2 SDRAM may enter an active or precharge power down mode. If CKE is de-asserted while CS# is asserted in combination with the refresh command, the DDR2 SDRAM may enter the self refresh mode.

If power down occurs when there are no rows active in any bank, the DDR2 SDRAM may enter precharge power down mode. If power down occurs when there is a row active in any bank, the DDR2 SDRAM may enter one of the two active power down modes. The two active power down modes may include fast exit active power down mode or slow exit active power down mode.

The selection of fast exit mode or slow exit mode may be determined by the configuration of a mode register. The maximum duration for either the active power down mode or the precharge power down mode may be limited by the refresh requirements of the DDR2 SDRAM and may further be equal to tRFC(MAX).

DDR2 SDRAMs may require CKE to remain stable for a minimum time of tCKE(MIN). DDR2 SDRAMs may also require a minimum time of tXP(MIN) between exiting precharge power down mode or active power down mode and a subsequent non-read command. Furthermore, DDR2 SDRAMs may also require a minimum time of tXARD(MIN) between exiting active power down mode (e.g. fast exit) and a subsequent read command. Similarly, DDR2 SDRAMs may require a minimum time of tXARDS(MIN) between exiting active power down mode (e.g. slow exit) and a subsequent read command.

Just by way of example, power management for a DDR2 SDRAM may require that the SDRAM remain in a power down mode for a minimum of three clock cycles [e.g. tCKE (MIN)=3 clocks]. Thus, the SDRAM may require a power down entry latency of three clock cycles.

Also as an example, a DDR2 SDRAM may also require a minimum of two clock cycles between exiting a power down mode and a subsequent command [e.g. tXP(MIN)=2 clock cycles; tXARD(MIN)=2 clock cycles]. Thus, the SDRAM may require a power down exit latency of two clock cycles.

Of course, for other DRAM or memory technologies, the power down entry latency and power down exit latency may be different, but this does not necessarily affect the operation of power management described here.

Accordingly, in the case of DDR2 SDRAM, a minimum total of five clock cycles may be required to enter and then immediately exit a power down mode (e.g. three cycles to satisfy tCKE(min) due to entry latency plus two cycles to satisfy tXP(MIN) or tXARD(MIN) due to exit latency). These five clock cycles may be hidden from the memory controller if power management is not being performed by the controller itself. Of course, it should be noted that other restrictions on the timing of entry and exit from the various power down modes may exist.

In one exemplary embodiment, the minimum power down entry latency for a DRAM circuit may be n clocks. In addition, in the case of DDR2, n=3, three cycles may be required to satisfy tCKE(MIN). Also, the minimum power down exit latency of a DRAM circuit may be x clocks. In the case of DDR2, x=2, two cycles may be required to satisfy tXP(MIN) and tXARD(MIN). Thus, the power management latency of a DRAM circuit in the present exemplary embodiment may require a minimum of k=n+x clocks for the DRAM circuit to enter power down mode and exit from power down mode. (e.g. DDR2, k=3+2=5 clock cycles).

DRAM Command Operation Period Embodiments

DRAM operations such as precharge or activate may require a certain period of time to complete. During this time, the DRAM, or portion(s) thereof (e.g. bank, etc.) to which the operation is directed may be unable to perform another operation. For example, a precharge operation in a bank of a DRAM circuit may require a certain period of time to complete (specified as tRP for DDR2).

During tRP and after a precharge operation has been initiated, the memory controller may not necessarily be allowed to direct another operation (e.g. activate, etc.) to the same bank of the DRAM circuit. The period of time between the initiation of an operation and the completion of that operation may thus be a command operation period. Thus, the memory controller may not necessarily be allowed to direct another operation to a particular DRAM circuit or portion thereof during a command operation period of various commands or operations. For example, the command operation period of a precharge operation or command may be equal to tRP. As another example, the command operation period of an activate command may be equal to tRCD.

In general, the command operation period need not be limited to a single command. A command operation period can also be defined for a sequence, combination, or pattern of commands. The power management schemes described herein thus need not be limited to a single command and associated command operation period; the schemes may equally be applied to sequences, patterns, and combinations of commands. It should also be noted that a command may have a first command operation period in a DRAM circuit to which the command is directed to, and also have a second command operation period in another DRAM circuit to which the command is not directed to. The first and second command operation periods need not be the same. In addition, a command may have different command operation periods in different mappings of physical DRAM circuits to the banks of a virtual DRAM circuit, and also under different conditions.

It should be noted that the command operation periods may be specified in nanoseconds. For example, tRP may be specified in nanoseconds, and may vary according to the speed grade of a DRAM circuit. Furthermore, tRP may be defined in JEDEC standards (e.g. currently JEDEC Standard No. 21-C for DDR2 SDRAM). Thus, tRP may be measured as an integer number of clock cycles. Optionally, the tRP may not necessarily be specified to be an exact number clock cycles. For DDR2 SDRAMs, the minimum value of tRP may be equivalent to three clock cycles or more.

In additional exemplary embodiments, power management schemes may be based on an interface circuit identifying at least one memory (e.g. DRAM, etc.) circuit that is not currently being accessed by the system. In response to the identification of the at least one memory circuit, a power saving operation may be initiated in association with the at least one memory circuit.

In one embodiment, such power saving operation may involve a power down operation, and in particular, a precharge power down operation, using the CKE pin of the DRAM circuits (e.g. a CKE power management scheme). Other similar power management schemes using other power down control methods and power down modes, with different commands and alternative memory circuit technologies, may also be used.

If the CKE power-management scheme does not involve the memory controller, then the presence of the scheme may be transparent to the memory controller. Accordingly, the power down entry latency and the power down exit latency may be hidden from the memory controller. In one embodiment, the power down entry and exit latencies may be hidden from the memory controller by opportunistically placing at least one first DRAM circuit into a power down mode and, if required, bringing at least one second DRAM circuit out of power down mode during a command operation period when the at least one first DRAM circuit is not being accessed by the system.

The identification of the appropriate command operation period during which at least one first DRAM circuit in a stack may be placed in power down mode or brought out of power down mode may be based on commands directed to the first DRAM circuit (e.g. based on commands directed to itself) or on commands directed to a second DRAM circuit (e.g. based on commands directed to other DRAM circuits).

In another embodiment, the command operation period of the DRAM circuit may be used to hide the power down entry and/or exit latencies. For example, the existing command operation periods of the physical DRAM circuits may be used to the hide the power down entry and/or exit latencies if the delays associated with one or more operations are long enough to hide the power down entry and/or exit latencies. In yet another embodiment, the command operation period of a virtual DRAM circuit may be used to hide the power down entry and/or exit latencies by making the command operation period of the virtual DRAM circuit longer than the command operation period of the physical DRAM circuits.

Thus, the interface circuit may simulate a plurality of physical DRAM circuits to appear as at least one virtual DRAM circuit with at least one command operation period that is different from that of the physical DRAM circuits. This embodiment may be used if the existing command operation periods of the physical DRAM circuits are not long enough to hide the power down entry and/or exit latencies, thus necessitating the interface circuit to increase the command operation periods by simulating a virtual DRAM circuit with at least one different (e.g. longer, etc.) command operation period from that of the physical DRAM circuits.

Specific examples of different power management schemes in various embodiments are described below for illustrative purposes. It should again be strongly noted that the following information is set forth for illustrative purposes and should not be construed as limiting in any manner.

Row Cycle Time Based Power Management Embodiments

Row cycle time based power management is an example of a power management scheme that uses the command operation period of DRAM circuits to hide power down entry and exit latencies. In one embodiment, the interface circuit may place at least one first physical DRAM circuit into power down mode based on the commands directed to a second physical DRAM circuit. Power management schemes such as a row cycle time based scheme may be best suited for a many-circuit-to-one-bank configuration of DRAM circuits.

As explained previously, in a many-circuit-to-one-bank configuration, a plurality of physical DRAM circuits may be mapped to a single bank of a larger capacity virtual DRAM circuit seen by the memory controller. For example, sixteen 256 Mb DDR2 physical SDRAM circuits may appear to the memory controller as a single 4 Gb virtual DDR2 SDRAM circuit. Since a 4 Gb DDR2 SDRAM circuit is specified by the JEDEC standards to have eight physical banks, two of the 256 Mb DDR2 physical SDRAM circuits may be mapped by the interface circuit to a single bank of the virtual 4 Gb DDR2 SDRAM circuit.

In one embodiment, bank 0 of the virtual 4 Gb DDR2 SDRAM circuit may be mapped by the interface circuit to two 256 Mb DDR2 physical SDRAM circuits (e.g. DRAM A and DRAM B). However, since only one page may be open in a bank of a DRAM circuit (either physical or virtual) at any given time, only one of DRAM A or DRAM B may be in the active state at any given time. If the memory controller issues a first activate (e.g. page open, etc.) command to bank 0 of the 4 Gb virtual DRAM, that command may be directed by the interface circuit to either DRAM A or DRAM B, but not to both.

In addition, the memory controller may be unable to issue a second activate command to bank 0 of the 4 Gb virtual DRAM until a period tRC has elapsed from the time the first activate command was issued by the memory controller. In this instance, the command operation period of an activate command may be tRC. The parameter tRC may be much longer than the power down entry and exit latencies.

Therefore, if the first activate command is directed by the interface circuit to DRAM A, then the interface circuit may place DRAM B in the precharge power down mode during the activate command operation period (e.g. for period tRC). As another option, if the first activate command is directed by the interface circuit to DRAM B, then it may place DRAM A in the precharge power down mode during the command operation period of the first activate command. Thus, if p physical DRAM circuits (where p is greater than 1) are mapped to a single bank of a virtual DRAM circuit, then at least p−1 of the p physical DRAM circuits may be subjected to a power saving operation. The power saving operation may, for example, comprise operating in precharge power down mode except when refresh is required. Of course, power savings may also occur in other embodiments without such continuity.

Row Precharge Time Based Power Management Embodiments

Row precharge time based power management is an example of a power management scheme that, in one embodiment, uses the precharge command operation period (that is the command operation period of precharge commands, tRP) of physical DRAM circuits to hide power down entry and exit latencies. In another embodiment, a row precharge time based power management scheme may be implemented that uses the precharge command operation period of virtual DRAM circuits to hide power down entry and exit latencies. In these schemes, the interface circuit may place at least one DRAM circuit into power down mode based on commands directed to the same at least one DRAM circuit. Power management schemes such as the row precharge time based scheme may be best suited for many-circuit-to-one-bank and one-circuit-to-one-bank configurations of physical DRAM circuits. A row precharge time based power management scheme may be particularly efficient when the memory controller implements a closed page policy.

A row precharge time based power management scheme may power down a physical DRAM circuit after a precharge or autoprecharge command closes an open bank. This power management scheme allows each physical DRAM circuit to enter power down mode when not in use. While the specific memory circuit technology used in this example is DDR2 and the command used here is the precharge or autoprecharge command, the scheme may be utilized in any desired context. This power management scheme uses an algorithm to determine if there is any required delay as well as the timing of the power management in terms of the command operation period.

In one embodiment, if the tRP of a physical DRAM circuit [tRP(physical)] is larger than k (where k is the power management latency), then the interface circuit may place that DRAM circuit into precharge power down mode during the command operation period of the precharge or autoprecharge command. In this embodiment, the precharge power down mode may be initiated following the precharge or autoprecharge command to the open bank in that physical DRAM circuit. Additionally, the physical DRAM circuit may be brought out of precharge power down mode before the earliest time a subsequent activate command may arrive at the inputs of the physical DRAM circuit. Thus, the power down entry and power down exit latencies may be hidden from the memory controller.

In another embodiment, a plurality of physical DRAM circuits may appear to the memory controller as at least one larger capacity virtual DRAM circuit with a tRP(virtual) that is larger than that of the physical DRAM circuits [e.g. larger than tRP(physical)]. For example, the physical DRAM circuits may, through simulation, appear to the memory controller as a larger capacity virtual DRAM with tRP(virtual) equal to tRP(physical)+m, where m may be an integer multiple of the clock cycle, or may be a non-integer multiple of the clock cycle, or may be a constant or variable multiple of the clock cycle, or may be less than one clock cycle, or may be zero. Note that m may or may not be equal to j. If tRP(virtual) is larger than k, then the interface circuit may place a physical DRAM circuit into precharge power down mode in a subsequent clock cycle after a precharge or autoprecharge command to the open bank in the physical DRAM circuit has been received by the physical DRAM circuit. Additionally, the physical DRAM circuit may be brought out of precharge power down mode before the earliest time a subsequent activate command may arrive at the inputs of the physical DRAM circuit. Thus, the power down entry and power down exit latency may be hidden from the memory controller.

In yet another embodiment, the interface circuit may make the stack of physical DRAM circuits appear to the memory controller as at least one larger capacity virtual DRAM circuit with tRP(virtual) and tRCD(virtual) that are larger than that of the physical DRAM circuits in the stack [e.g. larger than tRP(physical) and tRCD(physical) respectively, where tRCD (physical) is the tRCD of the physical DRAM circuits]. For example, the stack of physical DRAM circuits may appear to the memory controller as a larger capacity virtual DRAM with tRP(virtual) and tRCD(virtual) equal to [tRP(physical)+m] and tRCD(physical)+1] respectively. Similar to m, 1 may be an integer multiple of the clock cycle, or may be a non-integer multiple of the clock cycle, or may be constant or variable multiple of the clock cycle, or may be less than a clock cycle, or may be zero. Also, 1 may or may not be equal to j and/or m. In this embodiment, if tRP(virtual) is larger than n (where n is the power down entry latency defined earlier), and if 1 is larger than or equal to x (where x is the power down exit latency defined earlier), then the interface circuit may use the following sequence of events to implement a row precharge time based power management scheme and also hide the power down entry and exit latencies from the memory controller.

First, when a precharge or autoprecharge command is issued to an open bank in a physical DRAM circuit, the interface circuit may place that physical DRAM circuit into precharge power down mode in a subsequent clock cycle after the precharge or autoprecharge command has been received by that physical DRAM circuit. The interface circuit may continue to keep the physical DRAM circuit in the precharge power down mode until the interface circuit receives a subsequent activate command to that physical DRAM circuit.

Second, the interface circuit may then bring the physical DRAM circuit out of precharge power down mode by asserting the CKE input of the physical DRAM in a following clock cycle. The interface circuit may also delay the address and control signals associated with the activate command for a minimum of x clock cycles before sending the signals associated with the activate command to the physical DRAM circuit.

The row precharge time based power management scheme described above is suitable for many-circuit-to-one-bank and one-circuit-to-one-bank configurations since there is a guaranteed minimum period of time (e.g. a keep-out period) of at least tRP(physical) after a precharge command to a physical DRAM circuit during which the memory controller will not issue a subsequent activate command to the same physical DRAM circuit. In other words, the command operation period of a precharge command applies to the entire DRAM circuit. In the case of one-circuit-to-many-bank configurations, there is no guarantee that a precharge command to a first portion(s) (e.g. bank) of a physical DRAM circuit will not be immediately followed by an activate command to a second portion(s) (e.g. bank) of the same physical DRAM circuit. In this case, there is no keep-out period to hide the power down entry and exit latencies. In other words, the command operation period of a precharge command applies only to a portion of the physical DRAM circuit.

For example, four 512 Mb physical DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a single 512 Mb physical DRAM circuit (e.g. DRAM C). In addition, bank 0 of the virtual DRAM circuit may have an open page while bank 1 of the virtual DRAM circuit may have no open page.

When the memory controller issues a precharge or autoprecharge command to bank 0 of the 2 Gb virtual DRAM circuit, the interface circuit may signal DRAM C to enter the precharge power down mode after the precharge or autoprecharge command has been received by DRAM C. The interface circuit may accomplish this by de-asserting the CKE input of DRAM C during a clock cycle subsequent to the clock cycle in which DRAM C received the precharge or autoprecharge command. However, the memory controller may issue an activate command to the bank 1 of the 2 Gb virtual DRAM circuit on the next clock cycle after it issued the precharge command to bank 0 of the virtual DRAM circuit.

However, DRAM C may have just entered a power down mode and may need to exit power down immediately. As described above, a DDR2 SDRAM may require a minimum of k=5 clock cycles to enter a power down mode and immediately exit the power down mode. In this example, the command operation period of the precharge command to bank 0 of the 2 Gb virtual DRAM circuit may not be sufficiently long enough to hide the power down entry latency of DRAM C even if the command operation period of the activate command to bank 1 of the 2 Gb virtual DRAM circuit is long enough to hide the power down exit latency of DRAM C, which would then cause the simulated 2 Gb virtual DRAM circuit to not be in compliance with the DDR2 protocol. It is therefore difficult, in a simple fashion, to hide the power management latency during the command operation period of precharge commands in a one-circuit-to-many-bank configuration.

Row Activate Time Based Power Management Embodiments

Row activate time based power management is a power management scheme that, in one embodiment, may use the activate command operation period (that is the command operation period of activate commands) of DRAM circuits to hide power down entry latency and power down exit latency.

In a first embodiment, a row activate time based power management scheme may be used for one-circuit-to-many-bank configurations. In this embodiment, the power down entry latency of a physical DRAM circuit may be hidden behind the command operation period of an activate command directed to a different physical DRAM circuit. Additionally, the power down exit latency of a physical DRAM circuit may be hidden behind the command operation period of an activate command directed to itself. The activate command operation periods that are used to hide power down entry and exit latencies may be tRRD and tRCD respectively.

In a second embodiment, a row activate time based power management scheme may be used for many-circuit-to-one-bank and one-circuit-to-one-bank configurations. In this embodiment, the power down entry and exit latencies of a physical DRAM circuit may be hidden behind the command operation period of an activate command directed to itself. In this embodiment, the command operation period of an activate command may be tRCD.

In the first embodiment, a row activate time based power management scheme may place a first DRAM circuit that has no open banks into a power down mode when an activate command is issued to a second DRAM circuit if the first and second DRAM circuits are part of a plurality of physical DRAM circuits that appear as a single virtual DRAM circuit to the memory controller. This power management scheme may allow each DRAM circuit to enter power down mode when not in use. This embodiment may be used in one-circuit-to-many-bank configurations of DRAM circuits. While the specific memory circuit technology used in this example is DDR2 and the command used here is the activate command, the scheme may be utilized in any desired context. The scheme uses an algorithm to determine if there is any required delay as well as the timing of the power management in terms of the command operation period.

In a one-circuit-to-many-bank configuration, a plurality of banks of a virtual DRAM circuit may be mapped to a single physical DRAM circuit. For example, four 512 Mb DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a first 512 Mb physical DRAM circuit (e.g. DRAM P). Similarly, banks 2 and 3 of the 2 Gb virtual DRAM circuit may be mapped to a second 512 Mb physical DRAM circuit (e.g. DRAM Q), banks 4 and 5 of the 2 Gb virtual DRAM circuit may be mapped to a third 512 Mb physical DRAM circuit (e.g. DRAM R), and banks 6 and 7 of the 2 Gb virtual DRAM circuit may be mapped to a fourth 512 Mb physical DRAM circuit (e.g. DRAM S).

In addition, bank 0 of the virtual DRAM circuit may have an open page while all the other banks of the virtual DRAM circuit may have no open pages. When the memory controller issues a precharge or autoprecharge command to bank 0 of the 2 Gb virtual DRAM circuit, the interface circuit may not be able to place DRAM P in precharge power down mode after the precharge or autoprecharge command has been received by DRAM P. This may be because the memory controller may issue an activate command to bank 1 of the 2 Gb virtual DRAM circuit in the very next cycle. As described previously, a row precharge time based power management scheme may not be used in a one-circuit-to-many-bank configuration since there is no guaranteed keep-out period after a precharge or autoprecharge command to a physical DRAM circuit.

However, since physical DRAM circuits DRAM P, DRAM Q, DRAM R, and DRAM S all appear to the memory controller as a single 2 Gb virtual DRAM circuit, the memory controller may ensure a minimum period of time, tRRD (MIN), between activate commands to the single 2 Gb virtual DRAM circuit. For DDR2 SDRAMs, the active bank N to active bank M command period tRRD may be variable with a minimum value of tRRD(MIN) (e.g. 2 clock cycles, etc.).

The parameter tRRD may be specified in nanoseconds and may be defined in JEDEC Standard No. 21-C. For example, tRRD may be measured as an integer number of clock cycles. Optionally, tRRD may not be specified to be an exact number of clock cycles. The tRRD parameter may mean an activate command to a second bank B of a DRAM circuit (either physical DRAM circuit or virtual DRAM circuit) may not be able to follow an activate command to a first bank A of the same DRAM circuit in less than tRRD clock cycles.

If tRRD(MIN)=n (where n is the power down entry latency), a first number of physical DRAM circuits that have no open pages may be placed in power down mode when an activate command is issued to another physical DRAM circuit that through simulation is part of the same virtual DRAM circuit. In the above example, after a precharge or autoprecharge command has closed the last open page in DRAM P, the interface circuit may keep DRAM P in precharge standby mode until the memory controller issues an activate command to one of DRAM Q, DRAM R, and DRAM S. When the interface circuit receives the abovementioned activate command, it may then immediately place DRAM P into precharge power down mode if tRRD(MIN)≥n.

Optionally, when one of the interface circuits is a register, the above power management scheme may be used even if tRRD(MIN)<n as long as tRRD(MIN)=n−1. In this optional embodiment, the additional typical one clock cycle delay through a JEDEC register helps to hide the power down entry latency if tRRD(MIN) by itself is not sufficiently long to hide the power down entry latency.

The above embodiments of a row activate time power management scheme require 1 to be larger than or equal to x (where x is the power down exit latency) so that when the memory controller issues an activate command to a bank of the virtual DRAM circuit, and if the corresponding physical DRAM circuit is in precharge power down mode, the interface circuit can hide the power down exit latency of the physical DRAM circuit behind the row activate time tRCD of the virtual DRAM circuit. The power down exit latency may be hidden because the interface circuit may simulate a plurality of physical DRAM circuits as a larger capacity virtual DRAM circuit with tRCD(virtual)=tRCD(physical)+1, where tRCD(physical) is the tRCD of the physical DRAM circuits.

Therefore, when the interface circuit receives an activate command that is directed to a DRAM circuit that is in precharge power down mode, it will delay the activate command by at least x clock cycles while simultaneously bringing the DRAM circuit out of power down mode. Since 1≥x, the command operation period of the activate command may overlap the power down exit latency, thus allowing the interface circuit to hide the power down exit latency behind the row activate time.

Using the same example as above, DRAM P may be placed into precharge power down mode after the memory controller issued a precharge or autoprecharge command to the last open page in DRAM P and then issued an activate command to one of DRAM Q, DRAM R, and DRAM S. At a later time, when the memory controller issues an activate command to DRAM P, the interface circuit may immediately bring DRAM P out of precharge power down mode while delaying the activate command to DRAM P by at least x clock cycles. Since 1≥x, DRAM P may be ready to receive the delayed activate command when the interface circuit sends the activate command to DRAM P.

For many-circuit-to-one-bank and one-circuit-to-one-bank configurations, another embodiment of the row activate time based power management scheme may be used. For both many-circuit-to-one-bank and one-circuit-to-one-bank configurations, an activate command to a physical DRAM circuit may have a keep-out or command operation period of at least tRCD(virtual) clock cycles [tRCD(virtual)=tRCD(physical)+1]. Since each physical DRAM circuit is mapped to one bank (or portion(s) thereof) of a larger capacity virtual DRAM circuit, it may be certain that no command may be issued to a physical DRAM circuit for a minimum of tRCD (virtual) clock cycles after an activate command has been issued to the physical DRAM circuit.

If tRCD(physical) or tRCD(virtual) is larger than k (where k is the power management latency), then the interface circuit may place the physical DRAM circuit into active power down mode on the clock cycle after the activate command has been received by the physical DRAM circuit and bring the physical DRAM circuit out of active power down mode before the earliest time a subsequent read or write command may arrive at the inputs of the physical DRAM circuit. Thus, the power down entry and power down exit latencies may be hidden from the memory controller.

The command and power down mode used for the activate command based power-management scheme may be the activate command and precharge or active power down modes, but other similar power down schemes may use different power down modes, with different commands, and indeed even alternative DRAM circuit technologies may be used.

Refresh Cycle Time Based Power Management Embodiments

Refresh cycle time based power management is a power management scheme that uses the refresh command operation period (that is the command operation period of refresh commands) of virtual DRAM circuits to hide power down entry and exit latencies. In this scheme, the interface circuit places at least one physical DRAM circuit into power down mode based on commands directed to a different physical DRAM circuit. A refresh cycle time based power management scheme that uses the command operation period of virtual DRAM circuits may be used for many-circuit-to-one-bank, one-circuit-to-one-bank, and one-circuit-to-many-bank configurations.

Refresh commands to a DRAM circuit may have a command operation period that is specified by the refresh cycle time, tRFC. The minimum and maximum values of the refresh cycle time, tRFC, may be specified in nanoseconds and may further be defined in the JEDEC standards (e.g. JEDEC Standard No. 21-C for DDR2 SDRAM, etc.). In one embodiment, the minimum value of tRFC [e.g. tRFC(MIN)] may vary as a function of the capacity of the DRAM circuit. Larger capacity DRAM circuits may have larger values of tRFC(MIN) than smaller capacity DRAM circuits. The parameter tRFC may be measured as an integer number of clock cycles, although optionally the tRFC may not be specified to be an exact number clock cycles.

A memory controller may initiate refresh operations by issuing refresh control signals to the DRAM circuits with sufficient frequency to prevent any loss of data in the DRAM circuits. After a refresh command is issued to a DRAM circuit, a minimum time (e.g. denoted by tRFC) may be required to elapse before another command may be issued to that DRAM circuit. In the case where a plurality of physical DRAM circuits through simulation by an interface circuit may appear to the memory controller as at least one larger capacity virtual DRAM circuit, the command operation period of the refresh commands (e.g. the refresh cycle time, tRFC) from the memory controller may be larger than that required by the DRAM circuits. In other words, tRFC(virtual)>tRFC(physical), where tRFC(physical) is the refresh cycle time of the smaller capacity physical DRAM circuits.

When the interface circuit receives a refresh command from the memory controller, it may refresh the smaller capacity physical DRAM circuits within the span of time specified by the tRFC associated with the larger capacity virtual DRAM circuit. Since the tRFC of the virtual DRAM circuit may be larger than that of the associated physical DRAM circuits, it may not be necessary to issue refresh commands to all of the physical DRAM circuits simultaneously. Refresh commands may be issued separately to individual physical DRAM circuits or may be issued to groups of physical DRAM circuits, provided that the tRFC requirement of the physical DRAM circuits is satisfied by the time the tRFC of the virtual DRAM circuit has elapsed.

In one exemplary embodiment, the interface circuit may place a physical DRAM circuit into power down mode for some period of the tRFC of the virtual DRAM circuit when other physical DRAM circuits are being refreshed. For example, four 512 Mb physical DRAM circuits (e.g. DRAM W, DRAM X, DRAM Y, DRAM Z) through simulation by an interface circuit may appear to the memory controller as a 2 Gb virtual DRAM circuit. When the memory controller issues a refresh command to the 2 Gb virtual DRAM circuit, it may not issue another command to the 2 Gb virtual DRAM circuit at least until a period of time, tRFC(MIN)(virtual), has elapsed.

Since the tRFC(MIN)(physical) of the 512 Mb physical DRAM circuits (DRAM W, DRAM X, DRAM Y, and DRAM Z) may be smaller than the tRFC(MIN)(virtual) of the 2 Gb virtual DRAM circuit, the interface circuit may stagger the refresh commands to DRAM W, DRAM X, DRAM Y, DRAM Z such that that total time needed to refresh all the four physical DRAM circuits is less than or equal to the tRFC(MIN)(virtual) of the virtual DRAM circuit. In addition, the interface circuit may place each of the physical DRAM circuits into precharge power down mode either before or after the respective refresh operations.

For example, the interface circuit may place DRAM Y and DRAM Z into power down mode while issuing refresh commands to DRAM W and DRAM X. At some later time, the interface circuit may bring DRAM Y and DRAM Z out of power down mode and issue refresh commands to both of them. At a still later time, when DRAM W and DRAM X have finished their refresh operation, the interface circuit may place both of them in a power down mode. At a still later time, the interface circuit may optionally bring DRAM W and DRAM X out of power down mode such that when DRAM Y and DRAM Z have finished their refresh operations, all four DRAM circuits are in the precharge standby state and ready to receive the next command from the memory controller. In another example, the memory controller may place DRAM W, DRAM X, DRAM Y, and DRAM Z into precharge power down mode after the respective refresh operations if the power down exit latency of the DRAM circuits may be hidden behind the command operation period of the activate command of the virtual 2 Gb DRAM circuit.

FB-DIMM Power Management Embodiments

Figure 24:
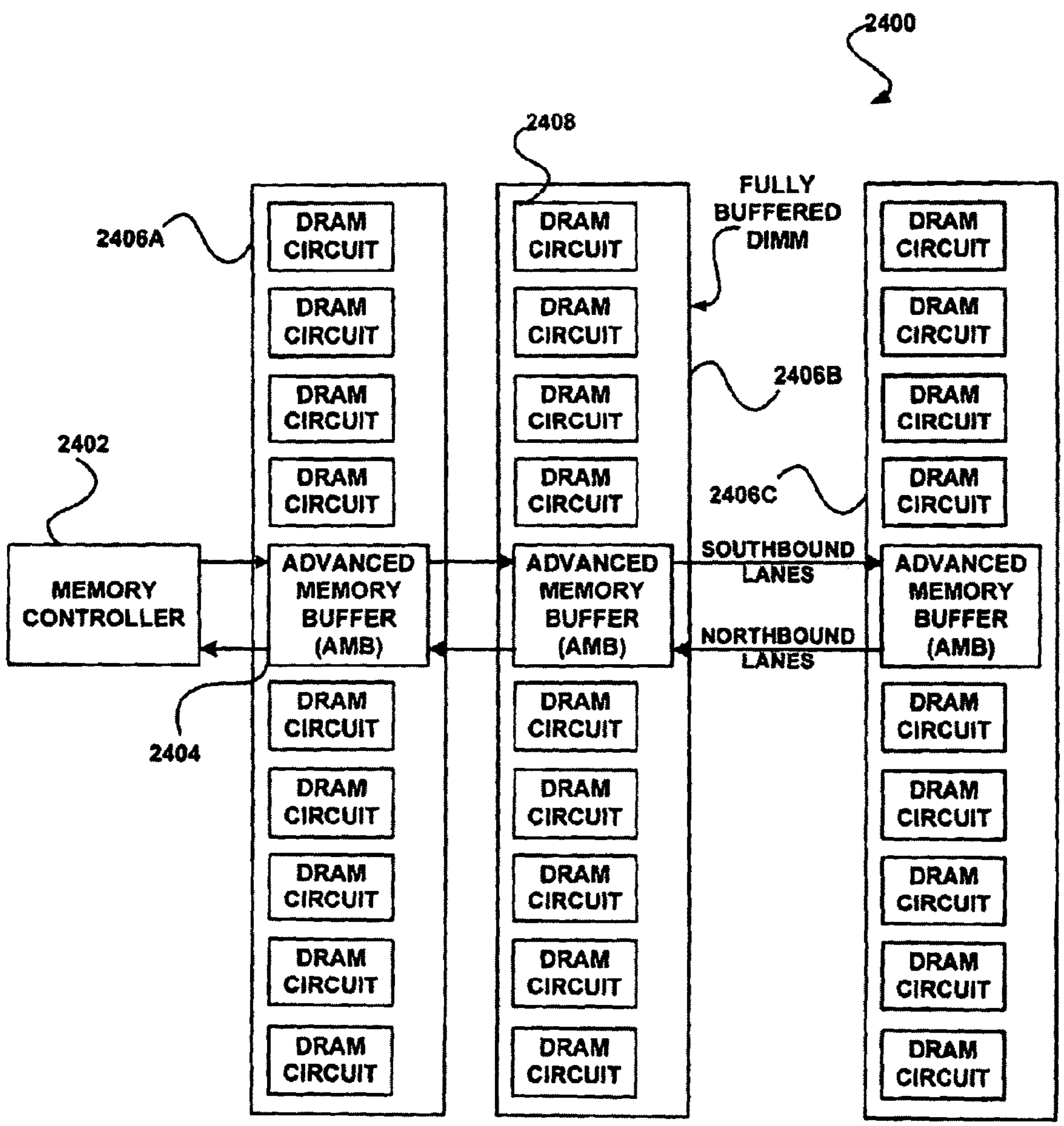
FIG. 24 shows a memory system comprising FB-DIMM modules using DRAM circuits with AMB chips, in accordance with another embodiment.

FIG. 24 shows a memory system 2400 comprising FB-DIMM modules using DRAM circuits with AMB chips, in accordance with another embodiment. As an option, the memory system 2400 may be implemented in the context of the architecture and environment of FIGS. 19-23. Of course, however, the memory system 2400 may be implemented in any desired environment. It should also be noted that the aforementioned definitions may apply during the present description.

As described herein, the memory circuit power management scheme may be associated with an FB-DIMM memory system that uses DDR2 SDRAM circuits. However, other memory circuit technologies such as DDR3 SDRAM, Mobile DDR SDRAM, etc. may provide similar control inputs and modes for power management and the example described in this section can be used with other types of buffering schemes and other memory circuit technologies. Therefore, the description of the specific example should not be construed as limiting in any manner.

In an FB-DIMM memory system 2400, a memory controller 2402 may place commands and write data into frames and send the frames to interface circuits (e.g. AMB chip 2404, etc.). Further, in the FB-DIMM memory system 2400, there may be one AMB chip 2404 on each of a plurality of DIMMs 2406A-C. For the memory controller 2402 to address and control DRAM circuits, it may issue commands that are placed into frames.

The command frames or command and data frames may then be sent by the memory controller 2402 to the nearest AMB chip 2404 through a dedicated outbound path, which may be denoted as a southbound lane. The AMB chip 2404 closest to the memory controller 2402 may then relay the frames to the next AMB chip 2404 via its own southbound lane. In this manner, the frames may be relayed to each AMB chip 2404 in the FB-DIMM memory channel.

In the process of relaying the frames, each AMB chip 2404 may partially decode the frames to determine if a given frame contains commands targeted to the DRAM circuits on that the associated DIMM 2406A-C. If a frame contains a read command addressed to a set of DRAM circuits on a given DIMM 2406A-C, the AMB chip 2404 on the associated DIMM 2406A-C accesses DRAM circuits 2408 to retrieve the requested data. The data may be placed into frames and returned to the memory controller 2402 through a similar frame relay process on the northbound lanes as that described for the southbound lanes.

Two classes of scheduling algorithms may be utilized for AMB chips 2404 to return data frames to the memory controller 2402, including variable-latency scheduling and fixed-latency scheduling. With respect to variable latency scheduling, after a read command is issued to the DRAM circuits 2408, the DRAM circuits 2408 return data to the AMB chip 2404. The AMB chip 2404 then constructs a data frame, and as soon as it can, places the data frame onto the northbound lanes to return the data to the memory controller 2402. The variable latency scheduling algorithm may ensure the shortest latency for any given request in the FB-DIMM channel.

However, in the variable latency scheduling algorithm, DRAM circuits 2408 located on the DIMM (e.g. the DIMM 2406A, etc.) that is closest to the memory controller 2402 may have the shortest access latency, while DRAM circuits 2408 located on the DIMM (e.g. the DIMM 2406C, etc.) that is at the end of the channel may have the longest access latency. As a result, the memory controller 2402 may be sophisticated, such that command frames may be scheduled appropriately to ensure that data return frames do not collide on the northbound lanes.

In a FB-DIMM memory system 2400 with only one or two DIMMs 2406A-C, variable latency scheduling may be easily performed since there may be limited situations where data frames may collide on the northbound lanes. However, variable latency scheduling may be far more difficult if the memory controller 2402 has to be designed to account for situations where the FB-DIMM channel can be configured with one DIMM, eight DIMMs, or any other number of DIMMs. Consequently, the fixed latency scheduling algorithm may be utilized in an FB-DIMM memory system 2400 to simplify memory controller design.

In the fixed latency scheduling algorithm, every DIMM 2406A-C is configured to provide equal access latency from the perspective of the memory controller 2402. In such a case, the access latency of every DIMM 2406A-C may be equalized to the access latency of the slowest-responding DIMM (e.g. the DIMM 2406C, etc.). As a result, the AMB chips 2404 that are not the slowest responding AMB chip 2404 (e.g. the AMB chip 2404 of the DIMM 2406C, etc.) may be configured with additional delay before it can upload the data frames into the northbound lanes.

From the perspective of the AMB chips 2404 that are not the slowest responding AMB chip 2404 in the system, data access occurs as soon as the DRAM command is decoded and sent to the DRAM circuits 2408. However, the AMB chips 2404 may then hold the data for a number of cycles before this data is returned to the memory controller 2402 via the northbound lanes. The data return delay may be different for each AMB chip 2404 in the FB-DIMM channel.

Since the role of the data return delay is to equalize the memory access latency for each DIMM 2406A-C, the data return delay value may depend on the distance of the DIMM 2406A-C from the memory controller 2402 as well as the access latency of the DRAM circuits 2408 (e.g. the respective delay values may be computed for each AMB chip 2404 in a given FB-DIMM channel, and programmed into the appropriate AMB chip 2404.

In the context of the memory circuit power management scheme, the AMB chips 2404 may use the programmed delay values to perform differing classes of memory circuit power management algorithms. In cases where the programmed data delay value is larger than k=n+x, where n is the minimum power down entry latency, x is the minimum power down exit latency, and k is the cumulative sum of the two, the AMB chip 2404 can provide aggressive power management before and after every command. In particular, the large delay value ensures that the AMB chip 2404 can place DRAM circuits 2408 into power down modes and move them to active modes as needed.

In the cases where the programmed data delay value is smaller than k, but larger than x, the AMB chip 2404 can place DRAM circuits 2408 into power down modes selectively after certain commands, as long as these commands provide the required command operation periods to hide the minimum power down entry latency. For example, the AMB chip 2404 can choose to place the DRAM circuits 2408 into a power down mode after a refresh command, and the DRAM circuits 2408 can be kept in the power down mode until a command is issued by the memory controller 2402 to access the specific set of DRAM circuits 2408. Finally, in cases where the programmed data delay is smaller than x, the AMB chip 2404 may choose to implement power management algorithms to a selected subset of DRAM circuits 2408.

There are various optional characteristics and benefits available when using CKE power management in FB-DIMMs. First, there is not necessarily a need for explicit CKE commands, and therefore there is not necessarily a need to use command bandwidth.

Second, granularity is provided, such that CKE power management will power down DRAM circuits as needed in each DIMM. Third, the CKE power management can be most aggressive in the DIMM that is closest to the controller (e.g. the DIMM closest to the memory controller which contains the AMB chip that consumes the highest power because of the highest activity rates).

Other Embodiments

While many examples of power management schemes for memory circuits have been described above, other implementations are possible. For DDR2, for example, there may be approximately 15 different commands that could be used with a power management scheme. The above descriptions allow each command to be evaluated for suitability and then appropriate delays and timing may be calculated. For other memory circuit technologies, similar power saving schemes and classes of schemes may be derived from the above descriptions.

The schemes described are not limited to be used by themselves. For example, it is possible to use a trigger that is more complex than a single command in order to initiate power management. In particular, power management schemes may be initiated by the detection of combinations of commands, or patterns of commands, or by the detection of an absence of commands for a certain period of time, or by any other mechanism.

Power management schemes may also use multiple triggers including forming a class of power management schemes using multiple commands or multiple combinations of commands. Power management schemes may also be used in combination. Thus, for example, a row precharge time based power management scheme may be used in combination with a row activate time command based power management scheme.

The description of the power management schemes in the above sections has referred to an interface circuit in order to perform the act of signaling the DRAM circuits and for introducing delay if necessary. An interface circuit may optionally be a part of the stack of DRAM circuits. Of course, however, the interface circuit may also be separate from the stack of DRAM circuits. In addition, the interface circuit may be physically located anywhere in the stack of DRAM circuits, where such interface circuit electrically sits between the electronic system and the stack of DRAM circuits.

In one implementation, for example, the interface circuit may be split into several chips that in combination perform the power management functions described. Thus, for example, there may be a single register chip that electrically sits between the memory controller and a number of stacks of DRAM circuits. The register chip may optionally perform the signaling to the DRAM circuits.

The register chip may further be connected electrically to a number of interface circuits that sit electrically between the register chip and a stack of DRAM circuits. The interface circuits in the stacks of DRAM circuits may then perform the required delay if it is needed. In another implementation there may be no need for an interface circuit in each DRAM stack. In that case, the register chip can perform the signaling to the DRAM circuits directly. In yet another implementation, a plurality of register chips and buffer chips may sit electrically between the stacks of DRAM circuits and the system, where both the register chips and the buffer chips perform the signaling to the DRAM circuits as well as delaying the address, control, and data signals to the DRAM circuits. In another implementation there may be no need for a stack of DRAM circuits. Thus each stack may be a single memory circuit.

Further, the power management schemes described for the DRAM circuits may also be extended to the interface circuits. For example, the interface circuits have information that a signal, bus, or other connection will not be used for a period of time. During this period of time, the interface circuits may perform power management on themselves, on other interface circuits, or cooperatively. Such power management may, for example, use an intelligent signaling mechanism (e.g. encoded signals, sideband signals, etc.) between interface circuits (e.g. register chips, buffer chips, AMB chips, etc.).

It should thus be clear that the power management schemes described here are by way of specific examples for a particular technology, but that the methods and techniques are very general and may be applied to any memory circuit technology to achieve control over power behavior including, for example, the realization of power consumption savings and management of current consumption behavior.

DRAM Circuit Configuration Verification Embodiments

In the various embodiments described above, it may be desirable to verify that the simulated DRAM circuit including any power management scheme or CAS latency simulation or any other simulation behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard may define control signals that a DRAM circuit must accept and the behavior of the DRAM circuit as a result of such control signals. For example, the JEDEC specification for a DDR2 SDRAM may include JESD79-2B (and any associated revisions).

If it is desired, for example, to determine whether a JEDEC standard is met, an algorithm may be used. Such algorithm may check, using a set of software verification tools for formal verification of logic, that protocol behavior of the simulated DRAM circuit is the same as a desired standard or other design specification. This formal verification may be feasible because the DRAM protocol described in a DRAM standard may, in various embodiments, be limited to a few protocol commands (e.g. approximately 15 protocol commands in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, etc. These software verification tools may use written assertions that correspond to the rules established by the DRAM protocol and specification.

The written assertions may be further included in code that forms the logic description for the interface circuit. By writing assertions that correspond to the desired behavior of the simulated DRAM circuit, a proof may be constructed that determines whether the desired design requirements are met. In this way, one may test various embodiments for compliance with a standard, multiple standards, or other design specification.

For example, assertions may be written that there are no conflicts on the address bus, command bus or between any clock, control, enable, reset or other signals necessary to operate or associated with the interface circuits and/or DRAM circuits. Although one may know which of the various interface circuit and DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for the interface circuit with other bus arrangements or alternative designs for the interconnect between the components of the interface circuit may be used and tested for compliance with the desired standard or other design specification.

Additional Embodiments

Figure 25:
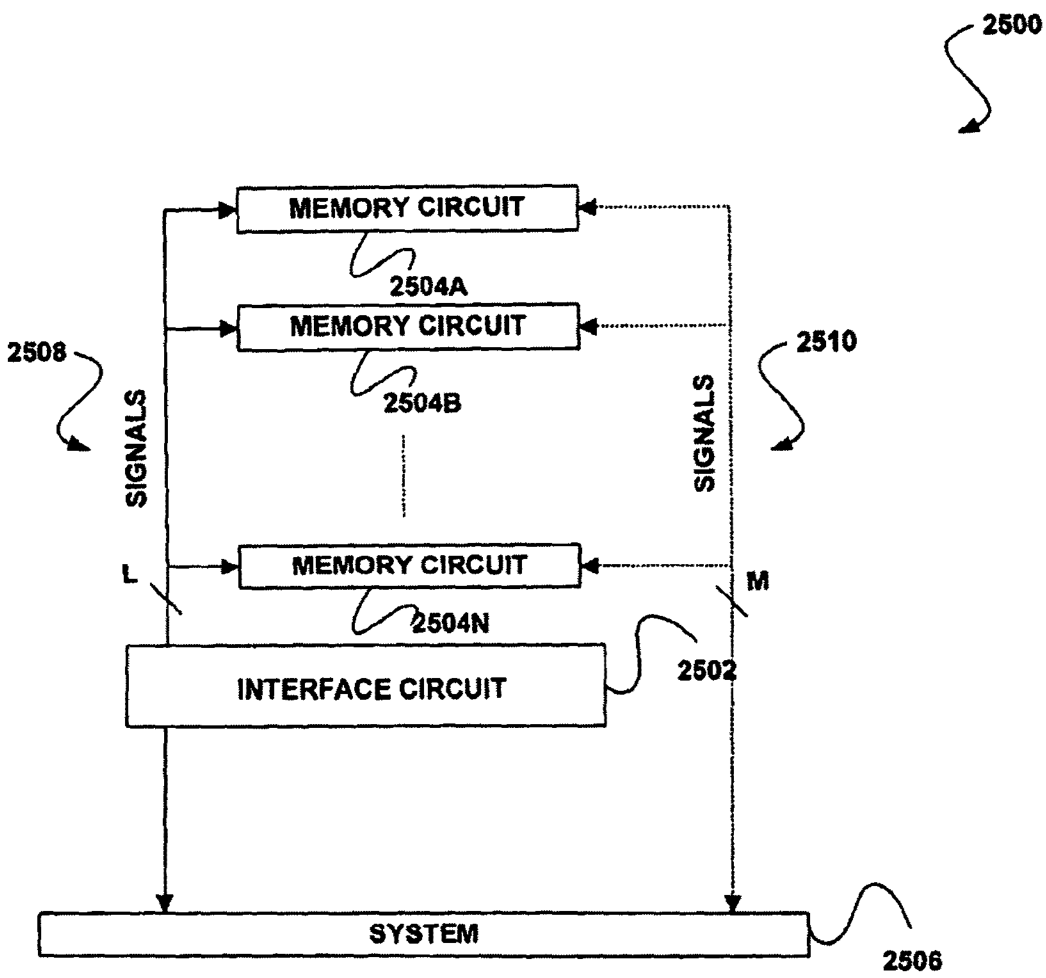
FIG. 25 illustrates a multiple memory circuit framework, in accordance with one embodiment.

FIG. 25 illustrates a multiple memory circuit framework 2500, in accordance with one embodiment. As shown, included are an interface circuit 2502, a plurality of memory circuits 2504A, 2504B, 2504N, and a system 2506. In the context of the present description, such memory circuits 2504A, 2504B, 2504N may include any circuit capable of serving as memory.

For example, in various embodiments, at least one of the memory circuits 2504A, 2504B, 2504N may include a monolithic memory circuit, a semiconductor die, a chip, a packaged memory circuit, or any other type of tangible memory circuit. In one embodiment, the memory circuits 2504A, 2504B, 2504N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 2504A, 2504B, 2504N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), Low-Power Synchronous Dynamic Random Access Memory (LP-SDRAM), Polymer Ferroelectric RAM (PFRAM), OVONICS Unified Memory (OUM) or other chalcogenide memory, Phase-change Memory (PCM), Phase-change Random Access Memory (PRAM), Ferroelectric RAM (FeRAM), Resistance RAM (R-RAM or RRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 2504A, 2504B, 2504N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 2504A, 2504B, 2504N may or may not be positioned on any type of material forming a substrate, card, module, sheet, fabric, board, carrier or other any other type of solid or flexible entity, form, or object. Of course, in other embodiments, the memory circuits 2504A, 2504B, 2504N may or may not be positioned in or on any desired entity, form, or object for packaging purposes. Still yet, the memory circuits 2504A, 2504B, 2504N may or may not be organized, either as a group (or as groups) collectively, or individually, into one or more portion(s). In the context of the present description, the term portion(s) (e.g. of a memory circuit(s))

shall refer to any physical, logical or electrical arrangement(s), partition(s), subdivision(s) (e.g. banks, sub-banks, ranks, sub-ranks, rows, columns, pages, etc.), or any other portion(s), for that matter.

Further, in the context of the present description, the system 2506 may include any system capable of requesting and/or initiating a process that results in an access of the memory circuits 2504A, 2504B, 2504N. As an option, the system 2506 may accomplish this utilizing a memory controller (not shown), or any other desired mechanism. In one embodiment, such system 2506 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 2502 may, in the context of the present description, refer to any circuit capable of communicating (e.g. interfacing, buffering, etc.) with the memory circuits 2504A, 2504B, 2504N and the system 2506. For example, the interface circuit 2502 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 2504A, 2504B, 2504N and the system 2506. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 2502 may include one or more circuits, such as a buffer (e.g. buffer chip, multiplexer/de-multiplexer chip, synchronous multiplexer/de-multiplexer chip, etc.), register (e.g. register chip, data register chip, address/control register chip, etc.), advanced memory buffer (AMB) (e.g. AMB chip, etc.), a component positioned on at least one DIMM, etc.

In various embodiments and in the context of the present description, a buffer chip may be used to interface bidirectional data signals, and may or may not use a clock to re-time or re-synchronize signals in a well known manner. A bidirectional signal is a well known use of a single connection to transmit data in two directions. A data register chip may be a register chip that also interfaces bidirectional data signals. A multiplexer/de-multiplexer chip is a well known circuit that may interface a first number of bidirectional signals to a second number of bidirectional signals. A synchronous multiplexer/de-multiplexer chip may additionally use a clock to re-time or re-synchronize the first or second number of signals. In the context of the present description, a register chip may be used to interface and optionally re-time or re-synchronize address and control signals. The term address/control register chip may be used to distinguish a register chip that only interfaces address and control signals from a data register chip, which may also interface data signals.

Moreover, the register may, in various embodiments, include a JEDEC Solid State Technology Association (known as JEDEC) standard register (a JEDEC register), a register with forwarding, storing, and/or buffering capabilities, etc. In various embodiments, the registers, buffers, and/or any other interface circuit(s) 2502 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 2502 may optionally be manufactured in monolithic form, packaged form, printed form, and/or any other manufactured form of circuit, for that matter.

In still yet another embodiment, a plurality of the aforementioned interface circuits 2502 may serve, in combination, to interface the memory circuits 2504A, 2504B, 2504N and the system 2506. Thus, in various embodiments, one, two, three, four, or more interface circuits 2502 may be utilized for such interfacing purposes. In addition, multiple interface circuits 2502 may be relatively configured or connected in any desired manner. For example, the interface circuits 2502 may be configured or connected in parallel, serially, or in various combinations thereof. The multiple interface circuits 2502 may use direct connections to each other, indirect connections to each other, or even a combination thereof. Furthermore, any number of the interface circuits 2502 may be allocated to any number of the memory circuits 2504A, 2504B, 2504N. In various other embodiments, each of the plurality of interface circuits 2502 may be the same or different. Even still, the interface circuits 2502 may share the same or similar interface tasks and/or perform different interface tasks.

While the memory circuits 2504A, 2504B, 2504N, interface circuit 2502, and system 2506 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 2502 (or portion(s) thereof) may be packaged with at least one of the memory circuits 2504A, 2504B, 2504N. Thus, a DRAM stack may or may not include at least one interface circuit (or portion(s) thereof). In other embodiments, different numbers of the interface circuit 2502 (or portion(s) thereof) may be packaged together. Such different packaging arrangements, when employed, may optionally improve the utilization of a monolithic silicon implementation, for example.

The interface circuit 2502 may be capable of various functionality, in the context of different embodiments. For example, in one optional embodiment, the interface circuit 2502 may interface a plurality of signals 2508 that are connected between the memory circuits 2504A, 2504B, 2504N and the system 2506. The signals 2508 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 2508 may represent all of the signals that are connected between the memory circuits 2504A, 2504B, 2504N and the system 2506. In other aspects, at least a portion of signals 2510 may use direct connections between the memory circuits 2504A, 2504B, 2504N and the system 2506. The signals 2510 may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections. Moreover, the number of interfaced signals 2508 (e.g. vs. a number of the signals that use direct connections 2510, etc.) may vary such that the interfaced signals 2508 may include at least a majority of the total number of signal connections between the memory circuits 2504A, 2504B, 2504N and the system 2506 (e.g. L>M, with L and M as shown in FIG. 25). In other embodiments, L may be less than or equal to M. In still other embodiments L and/or M may be zero.

In yet another embodiment, the interface circuit 2502 and/or any component of the system 2506 may or may not be operable to communicate with the memory circuits 2504A, 2504B, 2504N for simulating at least one memory circuit. The memory circuits 2504A, 2504B, 2504N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit shall hereafter be referred to, where appropriate for clarification purposes, as the at least one "virtual" memory circuit. In a similar fashion any property or aspect of such a physical memory circuit shall be referred to, where appropriate for clarification purposes, as a physical aspect (e.g. physical bank, physical portion, physical timing parameter, etc.). Further, any property or aspect of such a virtual memory circuit shall be referred to, where appropriate for clarification purposes, as a virtual aspect (e.g. virtual bank, virtual portion, virtual timing parameter, etc.).

In the context of the present description, the term simulate or simulation may refer to any simulating, emulating, transforming, disguising modifying, changing, altering, shaping, converting, etc., of at least one aspect of the memory circuits. In different embodiments, such aspect may include, for example, a number, a signal, a capacity, a portion (e.g. bank, partition, etc.), an organization (e.g. bank organization, etc.), a mapping (e.g. address mapping, etc.), a timing, a latency, a design parameter, a logical interface, a control system, a property, a behavior, and/or any other aspect, for that matter. Still yet, in various embodiments, any of the previous aspects or any other aspect, for that matter, may be power-related, meaning that such power-related aspect, at least in part, directly or indirectly affects power.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

In still additional exemplary embodiments, the aforementioned virtual aspect may be simulated (e.g. simulate a virtual aspect, the simulation of a virtual aspect, a simulated virtual aspect etc.). Further, in the context of the present description, the terms map, mapping, mapped, etc. refer to the link or connection from the physical aspects to the virtual aspects (e.g. map a physical aspect to a virtual aspect, mapping a physical aspect to a virtual aspect, a physical aspect mapped to a virtual aspect etc.). It should be noted that any use of such mapping or anything equivalent thereto is deemed to fall within the scope of the previously defined simulate or simulation term.

More illustrative information will now be set forth regarding optional functionality/architecture of different embodiments which may or may not be implemented in the context of FIG. 25, per the desires of the user. It should be strongly noted that the following information is set forth for illustrative purposes and should not be construed as limiting in any manner. For example, any of the following features may be optionally incorporated with or without the other features described.

Figure 26:
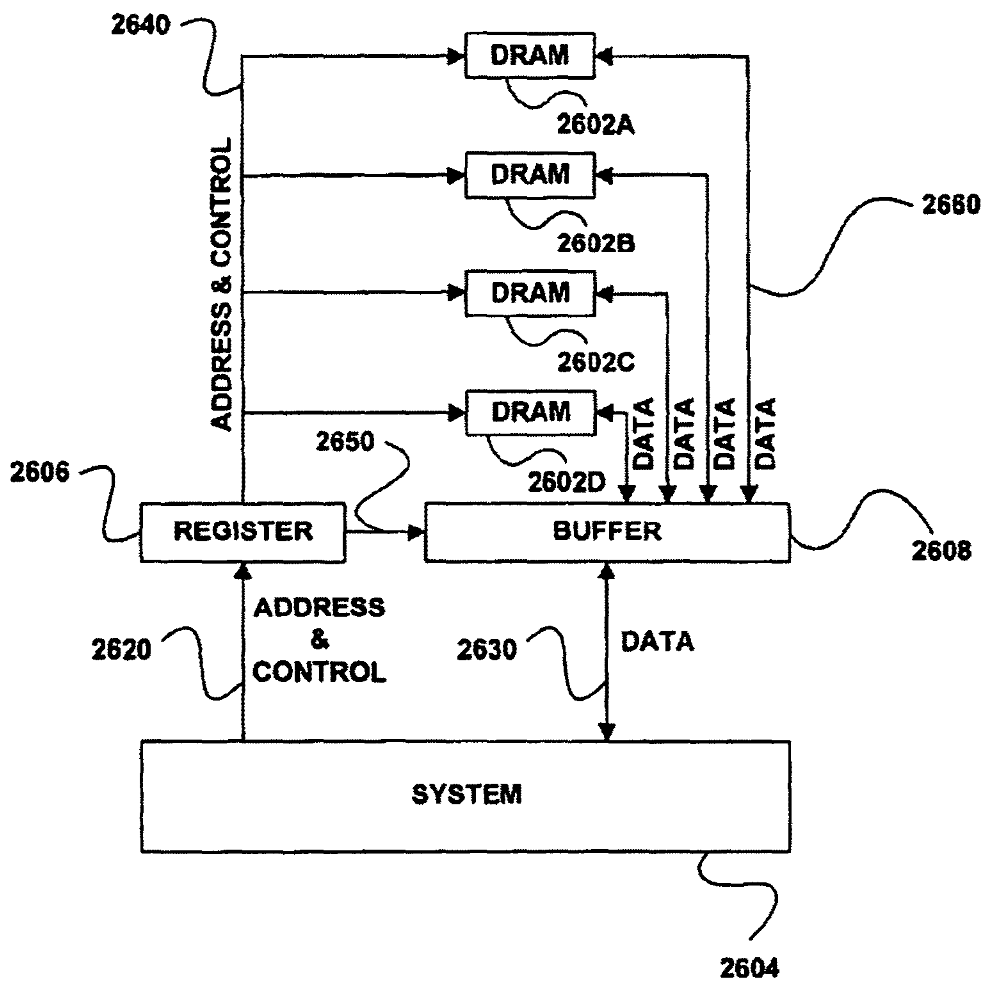
FIG. 26 shows an exemplary embodiment of an interface circuit including a register and a buffer that is operable to interface memory circuits and a system.

FIG. 26 shows an exemplary embodiment of an interface circuit that is operable to interface memory circuits 2602A-D and a system 2604. In this embodiment, the interface circuit includes a register 2606 and a buffer 2608. Address and control signals 2620 from the system 2604 are connected to the register 2606, while data signals 2630 from the system 2604 are connected to the buffer 2608. The register 2606 drives address and control signals 2640 to the memory circuits 2602A-D and optionally drives address and control signals 2650 to the buffer 2608. Data signals 2660 of the memory circuits 2602A-D are connected to the buffer 2608.

Figure 27:
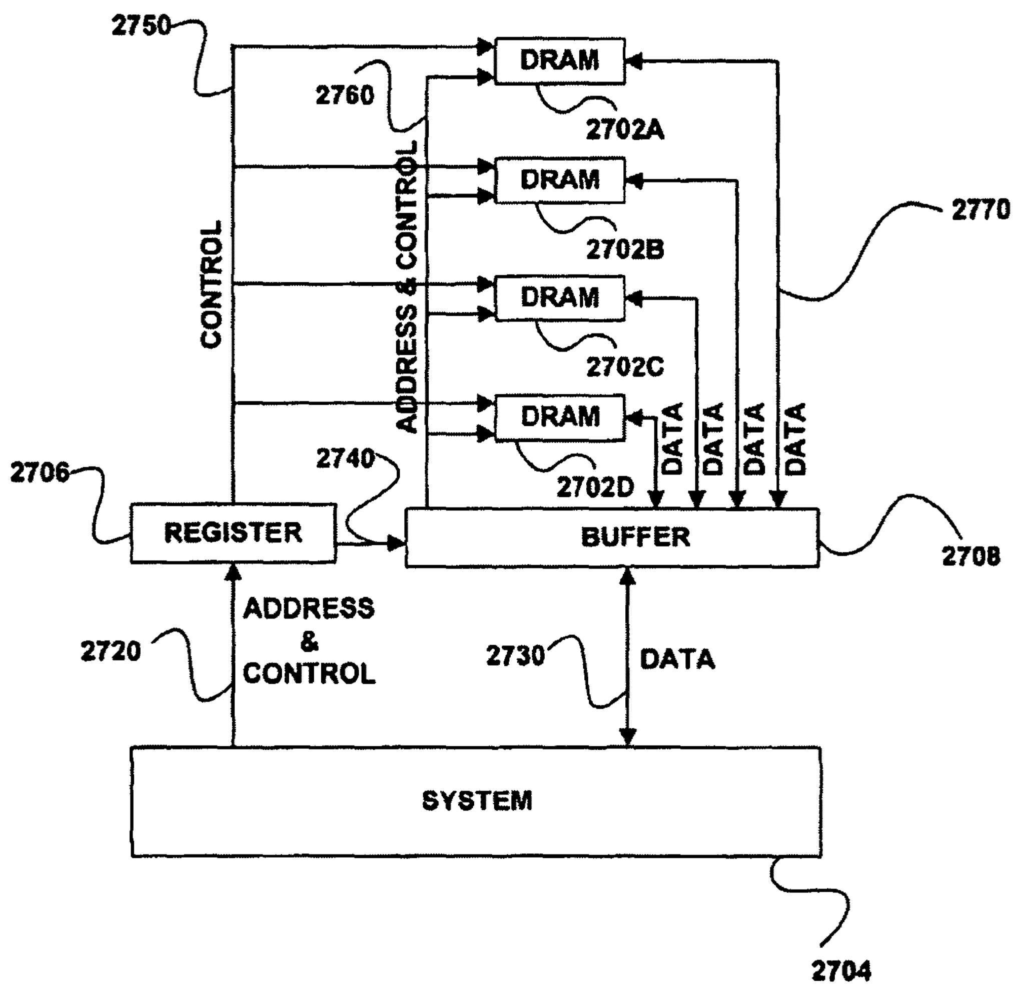
FIG. 27 shows an alternative exemplary embodiment of an interface circuit including a register and a buffer that is operable to interface memory circuits and a system.

FIG. 27 shows an exemplary embodiment of an interface circuit that is operable to interface memory circuits 2702A-D and a system 2704. In this embodiment, the interface circuit includes a register 2706 and a buffer 2708. Address and control signals 2720 from the system 2704 are connected to the register 2706, while data signals 2730 from the system 2704 are connected to the buffer 2708. The register 2706 drives address and control signals 2740 to the buffer 2708, and optionally drives control signals 2750 to the memory circuits 2702A-D. The buffer 2708 drives address and control signals 2760. Data signals 2770 of the memory circuits 2704A-D are connected to the buffer 2708.

Figure 28:
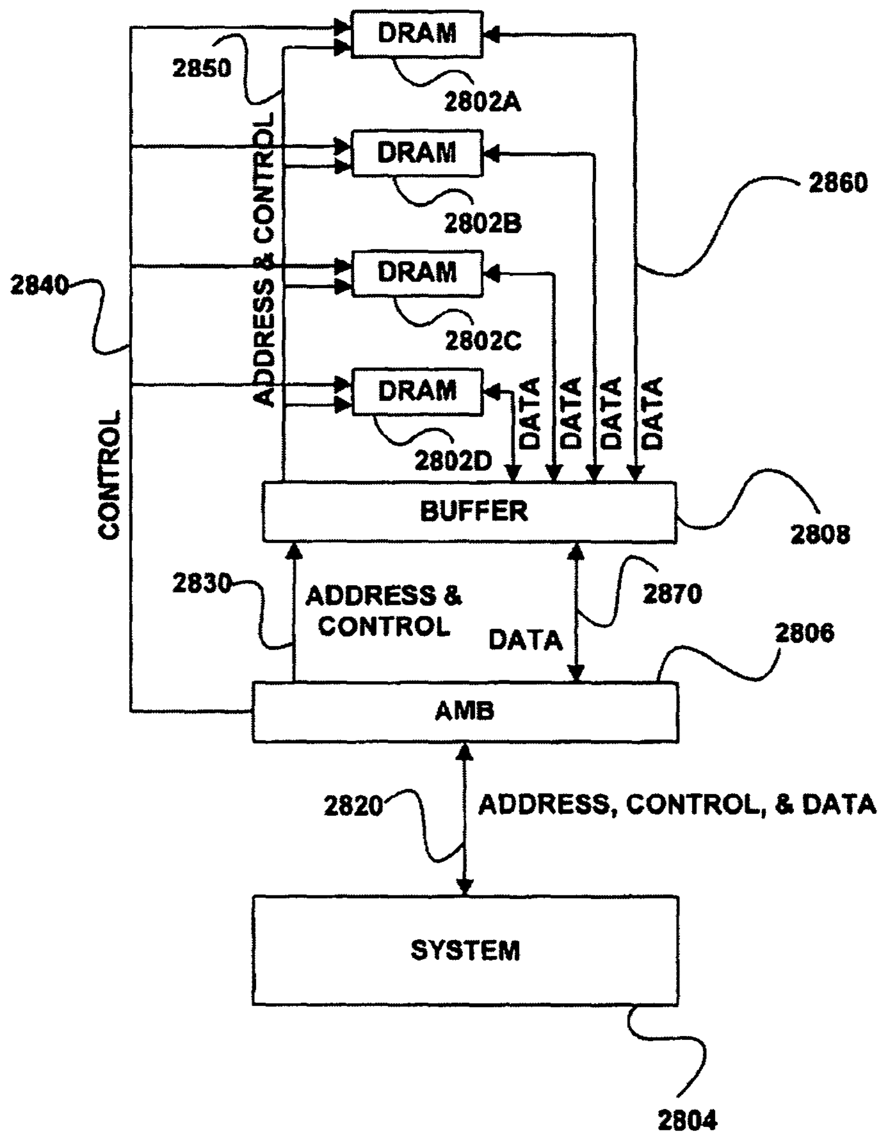
FIG. 28 shows an exemplary embodiment of an interface circuit including an advanced memory buffer (AMB) and a buffer that is operable to interface memory circuits and a system.

FIG. 28 shows an exemplary embodiment of an interface circuit that is operable to interface memory circuits 2802A-D and a system 2804. In this embodiment, the interface circuit includes an advanced memory buffer (AMB) 2806 and a buffer 2808. Address, control, and data signals 2820 from the system 2804 are connected to the AMB 2806. The AMB 2806 drives address and control signals 2830 to the buffer 2808 and optionally drives control signals 2840 to the memory circuits 2802A-D. The buffer 2808 drives address and control signals 2850. Data signals 2860 of the memory circuits 2802A-D are connected to the buffer 2808. Data signals 2870 of the buffer 2808 are connected to the AMB 2806.

Figure 29:
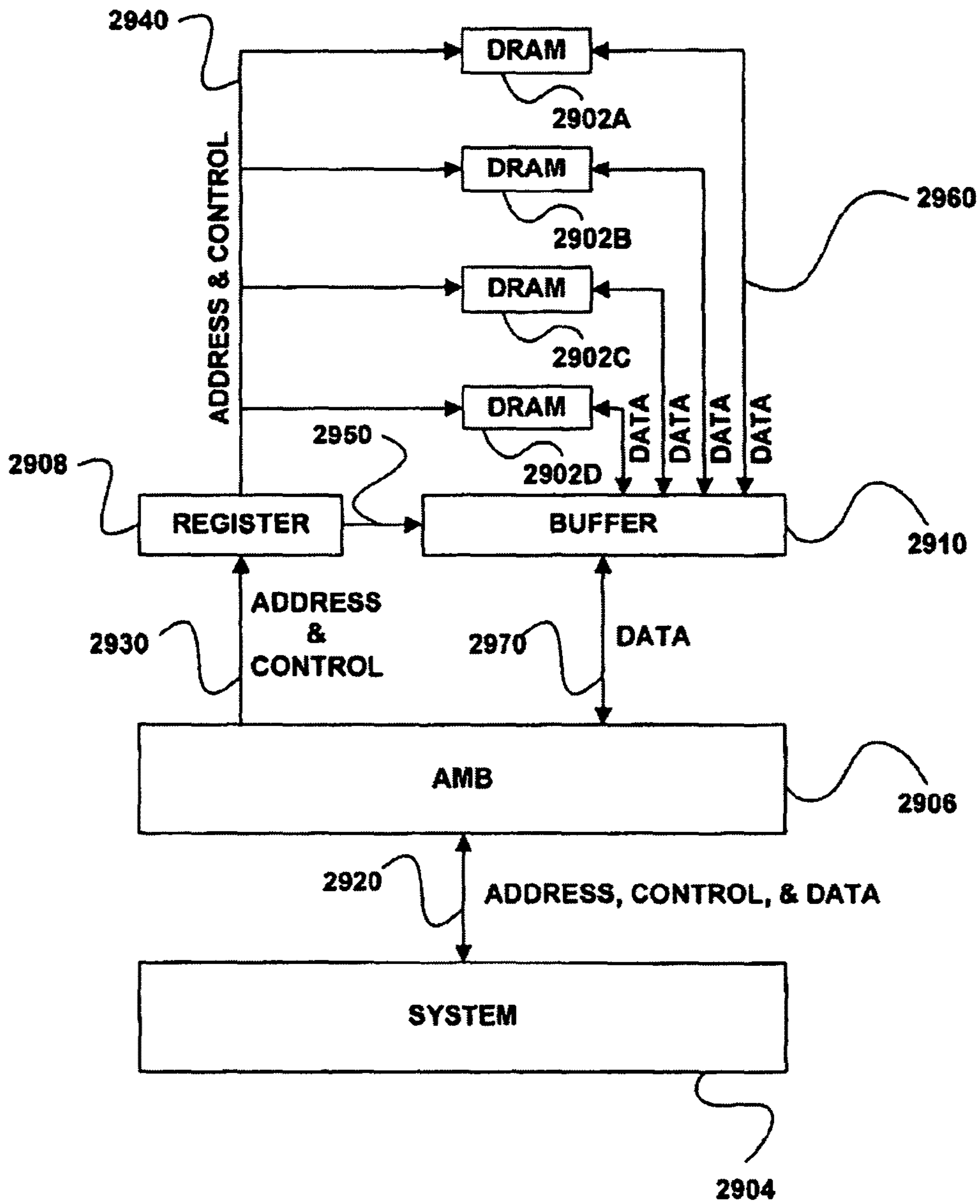
FIG. 29 shows an exemplary embodiment of an interface circuit including an AMB, a register, and a buffer that is operable to interface memory circuits and a system.

FIG. 29 shows an exemplary embodiment of an interface circuit that is operable to interface memory circuits 2902A-D and a system 2904. In this embodiment, the interface circuit includes an AMB 2906, a register 2908, and a buffer 2910. Address, control, and data signals 2920 from the system 2904 are connected to the AMB 2906. The AMB 2906 drives address and control signals 2930 to the register 2908. The register, in turn, drives address and control signals 2940 to the memory circuits 2902A-D. It also optionally drives control signals 2950 to the buffer 510. Data signals 2960 from the memory circuits 2902A-D are connected to the buffer 2910. Data signals 2970 of the buffer 2910 are connected to the AMB 2906.

Figure 30:
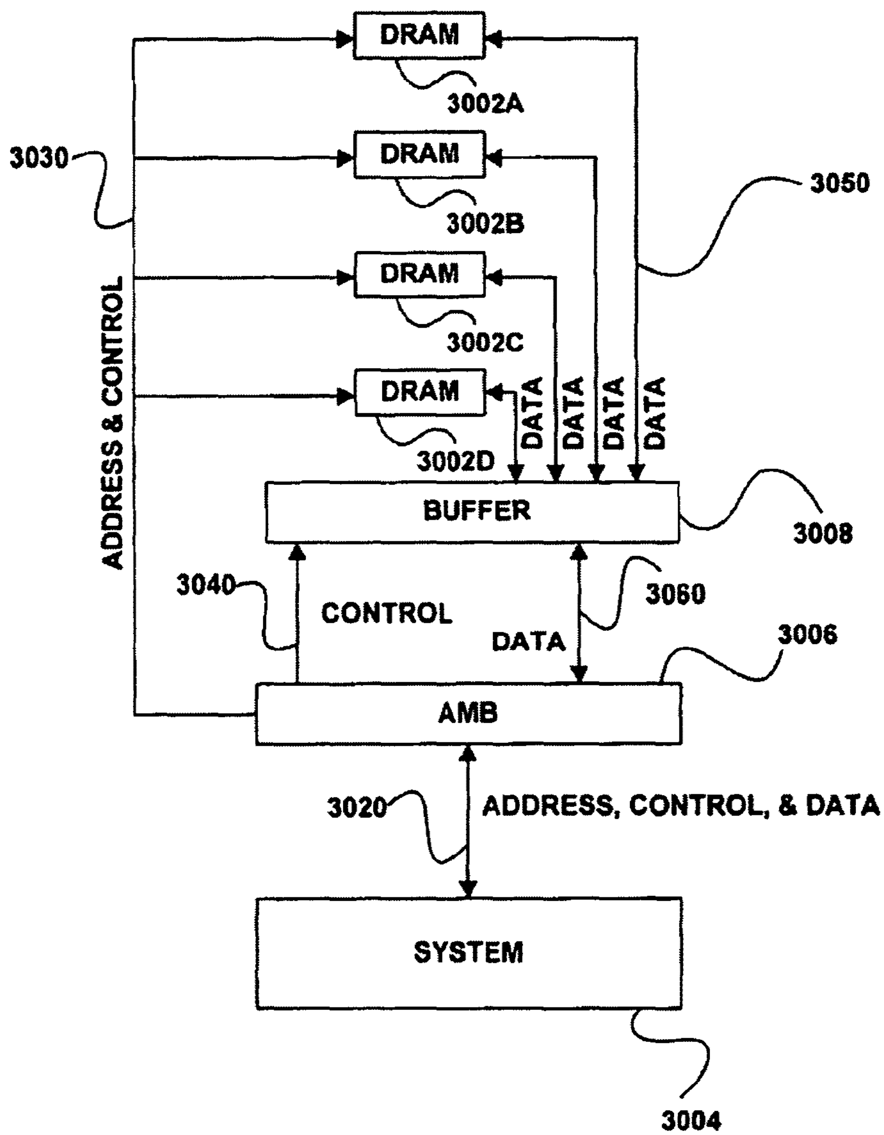
FIG. 30 shows an alternative exemplary embodiment of an interface circuit including an AMB and a buffer that is operable to interface memory circuits and a system.

FIG. 30 shows an exemplary embodiment of an interface circuit that is operable to interface memory circuits 3002A-D and a system 3004. In this embodiment, the interface circuit includes an AMB 3006 and a buffer 3008. Address, control, and data signals 3020 from the system 3004 are connected to the AMB 3006. The AMB 3006 drives address and control signals 3030 to the memory circuits 3002A-D as well as control signals 3040 to the buffer 3008. Data signals 3050 from the memory circuits 3002A-D are connected to the buffer 3008. Data signals 3060 are connected between the buffer 3008 and the AMB 3006.

In other embodiments, combinations of the above implementations shown in FIGS. 26-30 may be utilized. Just by way of example, one or more registers (register chip, address/control register chip, data register chip, JEDEC register, etc.) may be utilized in conjunction with one or more buffers (e.g. buffer chip, multiplexer/de-multiplexer chip, synchronous multiplexer/de-multiplexer chip and/or other intelligent interface circuits) with one or more AMBs (e.g. AMB chip, etc.). In other embodiments, these register(s), buffer(s), AMB(s) may be utilized alone and/or integrated in groups and/or integrated with or without the memory circuits.

The electrical connections between the buffer(s), the register(s), the AMB(s) and the memory circuits may be configured in any desired manner. In one optional embodiment; address, control (e.g. command, etc.), and clock signals may be common to all memory circuits (e.g. using one common bus). As another option, there may be multiple address, control and clock busses. As yet another option, there may be individual address, control and clock busses to each memory circuit. Similarly, data signals may be wired as one common bus, several busses or as an individual bus to each memory circuit. Of course, it should be noted that any combinations of such configurations may also be utilized. For example, the memory circuits may have one common address, control and clock bus with individual data busses. In another example, memory circuits may have one, two (or more) address, control and clock busses along with one, two (or more) data busses. In still yet another example, the memory circuits may have one address, control and clock bus together with two data busses (e.g. the number of address, control, clock and data busses may be different, etc.). In addition, the memory circuits may have one common address, control and clock bus and one common data bus. It should be noted that any other permutations and combinations of such address, control, clock and data buses may be utilized.

These configurations may therefore allow for the host system to only be in contact with a load of the buffer(s), or register(s), or AMB(s) on the memory bus. In this way, any electrical loading problems (e.g. bad signal integrity, improper signal timing, etc.) associated with the memory circuits may (but not necessarily) be prevented, in the context of various optional embodiments.

Furthermore, there may be any number of memory circuits. Just by way of example, the interface circuit(s) may be connected to 1, 2, 4, 8 or more memory circuits. In alternate embodiments, to permit data integrity storage or for other reasons, the interface circuit(s) may be connected to an odd number of memory circuits. Additionally, the memory circuits may be arranged in a single stack. Of course, however, the memory circuits may also be arranged in a plurality of stacks or in any other fashion.

In various embodiments where DRAM circuits are employed, such DRAM (e.g. DDR2 SDRAM) circuits may be composed of a plurality of portions (e g ranks, sub-ranks, banks, sub-banks, etc.) that may be capable of performing operations (e.g. precharge, activate, read, write, refresh, etc.) in parallel (e.g. simultaneously, concurrently, overlapping, etc.). The JEDEC standards and specifications describe how DRAM (e.g. DDR2 SDRAM) circuits are composed and perform operations in response to commands. Purely as an example, a 512 Mb DDR2 SDRAM circuit that meets JEDEC specifications may be composed of four portions (e.g. banks, etc.) (each of which has 128 Mb of capacity) that are capable of performing operations in parallel in response to commands. As another example, a 2 Gb DDR2 SDRAM circuit that is compliant with JEDEC specifications may be composed of eight banks (each of which has 256 Mb of capacity). A portion (e.g. bank, etc.) of the DRAM circuit is said to be in the active state after an activate command is issued to that portion. A portion (e.g. bank, etc.) of the DRAM circuit is said to be in the precharge state after a precharge command is issued to that portion. When at least one portion (e.g. bank, etc.) of the DRAM circuit is in the active state, the entire DRAM circuit is said to be in the active state. When all portions (e.g. banks, etc.) of the DRAM circuit are in precharge state, the entire DRAM circuit is said to be in the precharge state. A relative time period spent by the entire DRAM circuit in precharge state with respect to the time period spent by the entire DRAM circuit in active state during normal operation may be defined as the precharge-to-active ratio.

DRAM circuits may also support a plurality of power management modes. Some of these modes may represent power saving modes. As an example, DDR2 SDRAMs may support four power saving modes. In particular, two active power down modes, precharge power down mode, and self-refresh mode may be supported, in one embodiment. A DRAM circuit may enter an active power down mode if the DRAM circuit is in the active state when it receives a power down command. A DRAM circuit may enter the precharge power down mode if the DRAM circuit is in the precharge state when it receives a power down command. A higher precharge-to-active ratio may increase the likelihood that a DRAM circuit may enter the precharge power down mode rather than an active power down mode when the DRAM circuit is the target of a power saving operation. In some types of DRAM circuits, the precharge power down mode and the self refresh mode may provide greater power savings than the active power down modes.

In one embodiment, the system may be operable to perform a power management operation on at least one of the memory circuits, and optionally on the interface circuit, based on the state of the at least one memory circuit. Such a power management operation may include, among others, a power saving operation. In the context of the present description, the term power saving operation may refer to any operation that results in at least some power savings.

In one such embodiment, the power saving operation may include applying a power saving command to one or more memory circuits, and optionally to the interface circuit, based on at least one state of one or more memory circuits. Such power saving command may include, for example, initiating a power down operation applied to one or more memory circuits, and optionally to the interface circuit. Further, such state may depend on identification of the current, past or predictable future status of one or more memory circuits, a predetermined combination of commands to the one or more memory circuits, a predetermined pattern of commands to the one or more memory circuits, a predetermined absence of commands to the one or more memory circuits, any command(s) to the one or more memory circuits, and/or any command(s) to one or more memory circuits other than the one or more memory circuits. Such commands may have occurred in the past, might be occurring in the present, or may be predicted to occur in the future. Future commands may be predicted since the system (e.g. memory controller, etc.) may be aware of future accesses to the memory circuits in advance of the execution of the commands by the memory circuits. In the context of the present description, such current, past, or predictable future status may refer to any property of the memory circuit that may be monitored, stored, and/or predicted.

For example, the system may identify at least one of a plurality of memory circuits that may not be accessed for some period of time. Such status identification may involve determining whether a portion(s) (e.g. bank(s), etc.) is being accessed in at least one of the plurality of memory circuits. Of course, any other technique may be used that results in the identification of at least one of the memory circuits (or portion(s) thereof) that is not being accessed (e.g. in a non-accessed state, etc.). In other embodiments, other such states may be detected or identified and used for power management.

In response to the identification of a memory circuit that is in a non-accessed state, a power saving operation may be initiated in association with the memory circuit (or portion(s) thereof) that is in the non-accessed state. In one optional embodiment, such power saving operation may involve a power down operation (e.g. entry into an active power down mode, entry into a precharge power down mode, etc.). As an option, such power saving operation may be initiated utilizing (e.g. in response to, etc.) a power management signal including, but not limited to a clock enable (CKE) signal, chip select (CS) signal, row address strobe (RAS), column address strobe (CAS), write enable (WE), and optionally in combination with other signals and/or commands. In other embodiments, use of a non-power management signal (e.g. control signal(s), address signal(s), data signal(s), command(s), etc.) is similarly contemplated for initiating the power saving operation. Of course, however, it should be noted that anything that results in modification of the power behavior may be employed in the context of the present embodiment.

Since precharge power down mode may provide greater power savings than active power down mode, the system may, in yet another embodiment, be operable to map the physical memory circuits to appear as at least one virtual memory circuit with at least one aspect that is different from that of the physical memory circuits, resulting in a first behavior of the virtual memory circuits that is different from a second behavior of the physical memory circuits. As an option, the interface circuit may be operable to aid or participate in the mapping of the physical memory circuits such that they appear as at least one virtual memory circuit.

During use, and in accordance with one optional embodiment, the physical memory circuits may be mapped to appear as at least one virtual memory circuit with at least one aspect that is different from that of the physical memory circuits, resulting in a first behavior of the at least one virtual memory circuits that is different from a second behavior of one or more of the physical memory circuits. Such behavior may, in one embodiment, include power behavior (e.g. a power consumption, current consumption, current waveform, any other aspect of power management or behavior, etc.). Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.).

In one exemplary embodiment, the at least one aspect that is altered by the simulation may be the precharge-to-active ratio of the physical memory circuits. In various embodiments, the alteration of such a ratio may be fixed (e.g. constant, etc.) or may be variable (e.g. dynamic, etc.).

In one embodiment, a fixed alteration of this ratio may be accomplished by a simulation that results in physical memory circuits appearing to have fewer portions (e.g. banks, etc.) that may be capable of performing operations in parallel. Purely as an example, a physical 1 Gb DDR2 SDRAM circuit with eight physical banks may be mapped to a virtual 1 Gb DDR2 SDRAM circuit with two virtual banks, by coalescing or combining four physical banks into one virtual bank. Such a simulation may increase the precharge-to-active ratio of the virtual memory circuit since the virtual memory circuit now has fewer portions (e.g. banks, etc.) that may be in use (e.g. in an active state, etc.) at any given time. Thus, there is a higher likelihood that a power saving operation targeted at such a virtual memory circuit may result in that particular virtual memory circuit entering precharge power down mode as opposed to entering an active power down mode. Again as an example, a physical 1 Gb DDR2 SDRAM circuit with eight physical banks may have a probability, g, that all eight physical banks are in the precharge state at any given time. However, when the same physical 1 Gb DDR2 SDRAM circuit is mapped to a virtual 1 Gb DDR2 SDRAM circuit with two virtual banks, the virtual DDR2 SDRAM circuit may have a probability, h, that both the virtual banks are in the precharge state at any given time. Under normal operating conditions of the system, h may be greater than g. Thus, a power saving operation directed at the aforementioned virtual 1 Gb DDR2 SDRAM circuit may have a higher likelihood of placing the DDR2 SDRAM circuit in a precharge power down mode as compared to a similar power saving operation directed at the aforementioned physical 1 Gb DDR2 SDRAM circuit.

A virtual memory circuit with fewer portions (e.g. banks, etc.) than a physical memory circuit with equivalent capacity may not be compatible with certain industry standards (e.g. JEDEC standards). For example, the JEDEC Standard No. JESD 21-C for DDR2 SDRAM specifies a 1 Gb DRAM circuit with eight banks Thus, a 1 Gb virtual DRAM circuit with two virtual banks may not be compliant with the JEDEC standard. So, in another embodiment, a plurality of physical memory circuits, each having a first number of physical portions (e.g. banks, etc.), may be mapped to at least one virtual memory circuit such that the at least one virtual memory circuit complies with an industry standard, and such that each physical memory circuit that is part of the at least one virtual memory circuit has a second number of portions (e.g. banks, etc.) that may be capable of performing operations in parallel, wherein the second number of portions is different from the first number of portions. As an example, four physical 1 Gb DDR2 SDRAM circuits (each with eight physical banks) may be mapped to a single virtual 4 Gb DDR2 SDRAM circuit with eight virtual banks, wherein the eight physical banks in each physical 1 Gb DDR2 SDRAM circuit have been coalesced or combined into two virtual banks. As another example, four physical 1 Gb DDR2 SDRAM circuits (each with eight physical banks) may be mapped to two virtual 2 Gb DDR2 SDRAM circuits, each with eight virtual banks, wherein the eight physical banks in each physical 1 Gb DDR2 SDRAM circuit have been coalesced or combined into four virtual banks. Strictly as an option, the interface circuit may be operable to aid the system in the mapping of the physical memory circuits.

Figure 31:
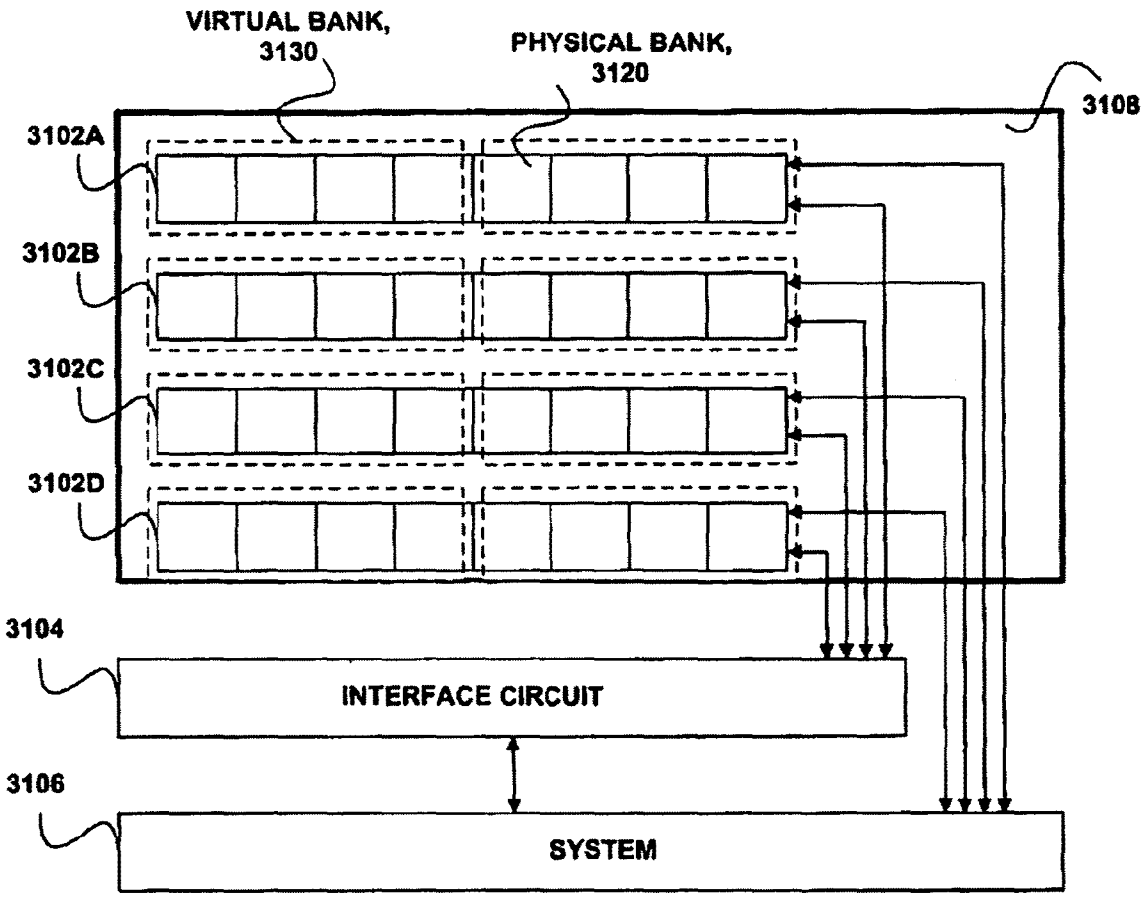
FIG. 31 shows an exemplary embodiment of a plurality of physical memory circuits that are mapped by a system, and optionally an interface circuit, to appear as a virtual memory circuit with one aspect that is different from that of the physical memory circuits.

FIG. 31 shows an example of four physical 1 Gb DDR2 SDRAM circuits 3102A-D that are mapped by the system 3106, and optionally with the aid or participation of interface circuit 3104, to appear as a virtual 4 Gb DDR2 SDRAM circuit 3108. Each physical DRAM circuit 3102A-D containing eight physical banks 3120 has been mapped to two virtual banks 3130 of the virtual 4 Gb DDR2 SDRAM circuit 3108.

In this example, the simulation or mapping results in the memory circuits having fewer portions (e.g. banks etc.) that may be capable of performing operations in parallel. For example, this simulation may be done by mapping (e.g. coalescing or combining) a first number of physical portion(s) (e.g. banks, etc.) into a second number of virtual portion(s). If the second number is less than the first number, a memory circuit may have fewer portions that may be in use at any given time. Thus, there may be a higher likelihood that a power saving operation targeted at such a memory circuit may result in that particular memory circuit consuming less power.

In another embodiment, a variable change in the precharge-to-active ratio may be accomplished by a simulation that results in the at least one virtual memory circuit having at least one latency that is different from that of the physical memory circuits. As an example, a physical 1 Gb DDR2 SDRAM circuit with eight banks may be mapped by the system, and optionally the interface circuit, to appear as a virtual 1 Gb DDR2 SDRAM circuit with eight virtual banks having at least one latency that is different from that of the physical DRAM circuits. The latency may include one or more timing parameters such as tFAW, tRRD, tRP, tRCD, tRFC(MIN), etc.

In the context of various embodiments, tFAW is the 4-Bank activate period; tRRD is the ACTIVE bank a to ACTIVE bank b command timing parameter; tRP is the PRECHARGE command period; tRCD is the ACTIVE-to-READ or WRITE delay; and tRFC(min) is the minimum value of the REFRESH to ACTIVE or REFRESH to REFRESH command interval.

In the context of one specific exemplary embodiment, these and other DRAM timing parameters are defined in the JEDEC specifications (for example JESD 21-C for DDR2 SDRAM and updates, corrections and errata available at the JEDEC website) as well as the DRAM manufacturer datasheets (for example the MICRON datasheet for 1 Gb: ×4, ×8, ×16 DDR2 SDRAM, example part number MT47H256M4, labeled PDF: 09005aef821ae8bf/Source: 09005aef821aed36, 1 GbDDR2TOC.fm-Rev. K 9/06 EN, and available at the MICRON website).

To further illustrate, the virtual DRAM circuit may be simulated to have a tRP(virtual) that is greater than the tRP (physical) of the physical DRAM circuit. Such a simulation may thus increase the minimum latency between a precharge command and a subsequent activate command to a portion (e.g. bank, etc.) of the virtual DRAM circuit. As another example, the virtual DRAM circuit may be simulated to have a tRRD(virtual) that is greater than the tRRD(physical) of the physical DRAM circuit. Such a simulation may thus increase the minimum latency between successive activate commands to various portions (e.g. banks, etc.) of the virtual DRAM circuit. Such simulations may increase the precharge-to-active ratio of the memory circuit. Therefore, there is a higher likelihood that a memory circuit may enter precharge power down mode rather than an active power down mode when it is the target of a power saving operation. The system may optionally change the values of one or more latencies of the at least one virtual memory circuit in response to present, past, or future commands to the memory circuits, the temperature of the memory circuits, etc. That is, the at least one aspect of the virtual memory circuit may be changed dynamically.

Some memory buses (e.g. DDR, DDR2, etc.) may allow the use of 1T or 2T address timing (also known as 1T or 2T address clocking). The MICRON technical note TN-47-01, DDR2 DESIGN GUIDE FOR TWO-DIMM SYSTEMS (available at the MICRON website) explains the meaning and use of 1T and 2T address timing as follows: "Further, the address bus can be clocked using 1T or 2T clocking. With 1T, a new command can be issued on every clock cycle. 2T timing will hold the address and command bus valid for two clock cycles. This reduces the efficiency of the bus to one command per two clocks, but it doubles the amount of setup and hold time. The data bus remains the same for all of the variations in the address bus."

In an alternate embodiment, the system may change the precharge-to-active ratio of the virtual memory circuit by changing from 1T address timing to 2T address timing when sending addresses and control signals to the interface circuit and/or the memory circuits. Since 2T address timing affects the latency between successive commands to the memory circuits, the precharge-to-active ratio of a memory circuit may be changed. Strictly as an option, the system may dynamically change between 1T and 2T address timing.

In one embodiment, the system may communicate a first number of power management signals to the interface circuit to control the power behavior. The interface circuit may communicate a second number of power management signals to at least a portion of the memory circuits. In various embodiments, the second number of power management signals may be the same of different from the first number of power management signals. In still another embodiment, the second number of power management signals may be utilized to perform power management of the portion(s) of the virtual or physical memory circuits in a manner that is independent from each other and/or independent from the first number of power management signals received from the system (which may or may not also be utilized in a manner that is independent from each other). In alternate embodiments, the system may provide power management signals directly to the memory circuits. In the context of the present description, such power management signal(s) may refer to any control signal (e.g. one or more address signals; one or more data signals; a combination of one or more control signals; a sequence of one or more control signals; a signal associated with an activate (or active) operation, precharge operation, write operation, read operation, a mode register write operation, a mode register read operation, a refresh operation, or other encoded or direct operation, command or control signal, etc.). The operation associated with a command may consist of the command itself and optionally, one or more necessary signals and/or behavior.

In one embodiment, the power management signals received from the system may be individual signals supplied to a DIMM. The power management signals may include, for example, CKE and CS signals. These power management signals may also be used in conjunction and/or combination with each other, and optionally, with other signals and commands that are encoded using other signals (e.g. RAS, CAS, WE, address etc.) for example. The JEDEC standards may describe how commands directed to memory circuits are to be encoded. As the number of memory circuits on a DIMM is increased, it is beneficial to increase the number of power management signals so as to increase the flexibility of the system to manage portion(s) of the memory circuits on a DIMM. In order to increase the number of power management signals from the system without increasing space and the difficulty of the motherboard routing, the power management signals may take several forms. In some of these forms, the power management signals may be encoded, located, placed, or multiplexed in various existing fields (e.g. data field, address field, etc.), signals (e.g. CKE signal, CS signal, etc.), and/or busses.

For example a signal may be a single wire; that is a single electrical point-to-point connection. In this case, the signal is un-encoded and not bussed, multiplexed, or encoded. As another example, a command directed to a memory circuit may be encoded, for example, in an address signal, by setting a predefined number of bits in a predefined location (or field) on the address bus to a specific combination that uniquely identifies that command. In this case the command is said to be encoded on the address bus and located or placed in a certain position, location, or field. In another example, multiple bits of information may be placed on multiple wires that form a bus. In yet another example, a signal that requires the transfer of two or more bits of information may be time-multiplexed onto a single wire. For example, the time-multiplexed sequence of 10 (a one followed by a zero) may be made equivalent to two individual signals: a one and a zero. Such examples of time-multiplexing are another form of encoding. Such various well-known methods of signaling, encoding (or lack thereof), bussing, and multiplexing, etc. may be used in isolation or combination.

Thus, in one embodiment, the power management signals from the system may occupy currently unused connection pins on a DIMM (unused pins may be specified by the JEDEC standards). In another embodiment, the power management signals may use existing CKE and CS pins on a DIMM, according to the JEDEC standard, along with additional CKE and CS pins to enable, for example, power management of DIMM capacities that may not yet be currently defined by the JEDEC standards.

In another embodiment the power management signals from the system may be encoded in the CKE and CS signals. Thus, for example, the CKE signal may be a bus, and the power management signals may be encoded on that bus. In one example, a 3-bit wide bus comprising three signals on three separate wires: CKE[0], CKE[1], and CKE[2], may be decoded by the interface circuit to produce eight separate CKE signals that comprise the power management signals for the memory circuits.

In yet another embodiment, the power management signals from the system may be encoded in unused portions of existing fields. Thus, for example, certain commands may have portions of the fields set to X (also known as don't care). In this case, the setting of such bit(s) to either a one or to a zero does not affect the command. The effectively unused bit position in this field may thus be used to carry a power management signal. The power management signal may thus be encoded and located or placed in a field in a bus, for example.

Further, the power management schemes described for the DRAM circuits may also be extended to the interface circuits. For example, the system may have or may infer information that a signal, bus, or other connection will not be used for a period of time. During this period of time, the system may perform power management on the interface circuit or part(s) thereof. Such power management may, for example, use an intelligent signaling mechanism (e.g. encoded signals, sideband signals, etc.) between the system and interface circuits (e.g. register chips, buffer chips, AMB chips, etc.), and/or between interface circuits. These signals may be used to power manage (e.g. power off circuits, turn off or reduce bias currents, switch off or gate clocks, reduce voltage or current, etc) part(s) of the interface circuits (e.g. input receiver circuits, internal logic circuits, clock generation circuits, output driver circuits, termination circuits, etc.)

It should thus be clear that the power management schemes described here are by way of specific examples for a particular technology, but that the methods and techniques are very general and may be applied to any memory circuit technology and any system (e.g. memory controller, etc.) to achieve control over power behavior including, for example, the realization of power consumption savings and management of current consumption behavior.

While various embodiments have been described above, it should be understood that they have been presented by way of example only, and not limitation. For example, any of the elements may employ any of the desired functionality set forth hereinabove. Hence, as an option, a plurality of memory circuits may be mapped using simulation to appear as at least one virtual memory circuit, wherein a first number of portions (e.g. banks, etc.) in each physical memory circuit may be coalesced or combined into a second number of virtual portions (e.g. banks, etc.), and the at least one virtual memory circuit may have at least one latency that is different from the corresponding latency of the physical memory circuits. Of course, in various embodiments, the first and second number of portions may include any one or more portions. Thus, the breadth and scope of a preferred embodiment should not be limited by any of the above-described exemplary embodiments, but should be defined only in accordance with the following claims and their equivalents.

Additional Embodiments

Figure 32:
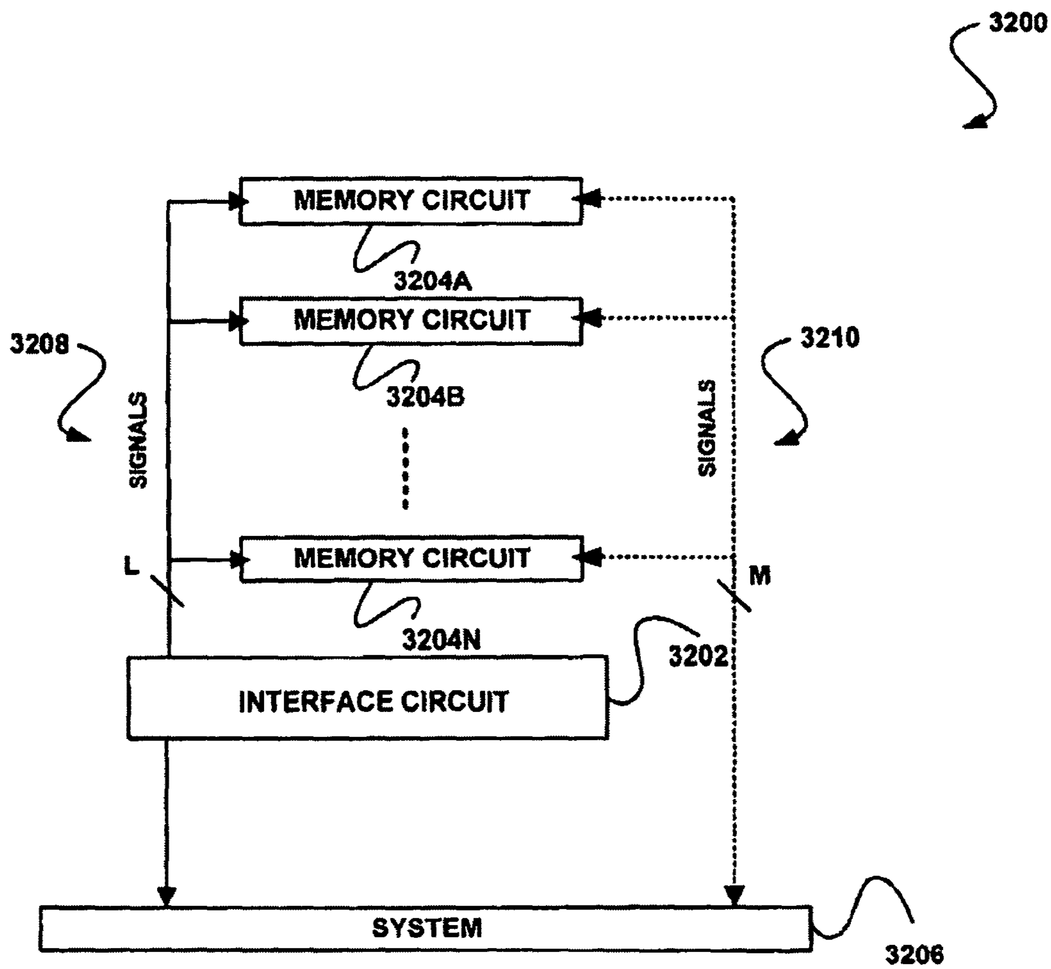
FIG. 32 illustrates a multiple memory circuit framework, in accordance with one embodiment.

FIG. 32 illustrates a multiple memory circuit framework 3200, in accordance with one embodiment. As shown, included are an interface circuit 3202, a plurality of memory circuits 3204A, 3204B, 3204N, and a system 3206. In the context of the present description, such memory circuits 3204A, 3204B, 3204N may include any circuit capable of serving as memory.

For example, in various embodiments, one or more of the memory circuits 3204A, 3204B, 3204N may include a monolithic memory circuit. For instance, such monolithic memory circuit may take the form of dynamic random access memory (DRAM). Such DRAM may take any form including, but not limited to synchronous (SDRAM), double data rate synchronous (DDR DRAM, DDR2 DRAM, DDR3 DRAM, etc.), quad data rate (QDR DRAM), direct RAMBUS (DRDRAM), fast page mode (FPM DRAM), video (VDRAM), extended data out (EDO DRAM), burst EDO (BEDO DRAM), multibank (MDRAM), synchronous graphics (SGRAM), and/or any other type of DRAM. Of course, one or more of the memory circuits 3204A, 3204B, 3204N may include other types of memory such as magnetic random access memory (MRAM), intelligent random access memory (IRAM), distributed network architecture (DNA) memory, window random access memory (WRAM), flash memory (e.g. NAND, NOR, or others, etc.), pseudostatic random access memory (PSRAM), wetware memory, and/or any other type of memory circuit that meets the above definition.

In additional embodiments, the memory circuits 3204A, 3204B, 3204N may be symmetrical or asymmetrical. For example, in one embodiment, the memory circuits 3204A, 3204B, 3204N may be of the same type, brand, and/or size, etc. Of course, in other embodiments, one or more of the memory circuits 3204A, 3204B, 3204N may be of a first type, brand, and/or size; while one or more other memory circuits 3204A, 3204B, 3204N may be of a second type, brand, and/or size, etc. Just by way of example, one or more memory circuits 3204A, 3204B, 3204N may be of a DRAM type, while one or more other memory circuits 3204A, 3204B, 3204N may be of a flash type. While three or more memory circuits 3204A, 3204B, 3204N are shown in FIG. 32 in accordance with one embodiment, it should be noted that any plurality of memory circuits 3204A, 3204B, 3204N may be employed.

Strictly as an option, the memory circuits 3204A, 3204B, 3204N may or may not be positioned on at least one dual in-line memory module (DIMM) (not shown). In various embodiments, the DIMM may include a registered DIMM (R-DIMM), a small outline-DIMM (SO-DIMM), a fully buffered-DIMM (FB-DIMM), an un-buffered DIMM, etc. Of course, in other embodiments, the memory circuits 3204A, 3204B, 3204N may or may not be positioned on any desired entity for packaging purposes.

Further in the context of the present description, the system 3206 may include any system capable of requesting and/or initiating a process that results in an access of the memory circuits 3204A, 3204B, 3204N. As an option, the system 3206 may accomplish this utilizing a memory controller (not shown), or any other desired mechanism. In one embodiment, such system 3206 may include a host system in the form of a desktop computer, lap-top computer, server, workstation, a personal digital assistant (PDA) device, a mobile phone device, a television, a peripheral device (e.g. printer, etc.). Of course, such examples are set forth for illustrative purposes only, as any system meeting the above definition may be employed in the context of the present framework 3200.

Turning now to the interface circuit 3202, such interface circuit 3202 may include any circuit capable of indirectly or directly communicating with the memory circuits 3204A, 3204B, 3204N and the system 3206. In various optional embodiments, the interface circuit 3202 may include one or more interface circuits, a buffer chip, etc. Embodiments involving such a buffer chip will be set forth hereinafter during reference to subsequent figures. In still other embodiments, the interface circuit 3202 may or may not be manufactured in monolithic form.

While the memory circuits 3204A, 3204B, 3204N, interface circuit 3202, and system 3206 are shown to be separate parts, it is contemplated that any of such parts (or portions thereof) may or may not be integrated in any desired manner. In various embodiments, such optional integration may involve simply packaging such parts together (e.g. stacking the parts, etc.) and/or integrating them monolithically. Just by way of example, in various optional embodiments, one or more portions (or all, for that matter) of the interface circuit 3202 may or may not be packaged with one or more of the memory circuits 3204A, 3204B, 3204N (or all, for that matter). Different optional embodiments which may be implemented in accordance with the present multiple memory circuit framework 3200 will be set forth hereinafter during reference to FIGS. 33A-33E, and 34 et al.

In use, the interface circuit 3202 may be capable of various functionality, in the context of different embodiments. More illustrative information will now be set forth regarding such optional functionality which may or may not be implemented in the context of such interface circuit 3202, per the desires of the user. It should be strongly noted that the following information is set forth for illustrative purposes and should not be construed as limiting in any manner. For example, any of the following features may be optionally incorporated with or without the exclusion of other features described.

For instance, in one optional embodiment, the interface circuit 3202 interfaces a plurality of signals 3208 that are communicated between the memory circuits 3204A, 3204B, 3204N and the system 3206. As shown, such signals may, for example, include address/control/clock signals, etc. In one aspect of the present embodiment, the interfaced signals 3208 may represent all of the signals that are communicated between the memory circuits 3204A, 3204B, 3204N and the system 3206. In other aspects, at least a portion of signals 3210 may travel directly between the memory circuits 3204A, 3204B, 3204N and the system 3206 or component thereof [e.g. register, advanced memory buffer (AMB), memory controller, or any other component thereof, where the term component is defined hereinbelow]. In various embodiments, the number of the signals 3208 (vs. a number of the signals 3210, etc.) may vary such that the signals 3208 are a majority or more (L>M), etc.

In yet another embodiment, the interface circuit 3202 may be operable to interface a first number of memory circuits 3204A, 3204B, 3204N and the system 3206 for simulating at least one memory circuit of a second number. In the context of the present description, the simulation may refer to any simulating, emulating, disguising, transforming, converting, and/or the like that results in at least one aspect (e.g. a number in this embodiment, etc.) of the memory circuits 3204A, 3204B, 3204N appearing different to the system 3206. In different embodiments, the simulation may be electrical in nature, logical in nature, protocol in nature, and/or performed in any other desired manner. For instance, in the context of electrical simulation, a number of pins, wires, signals, etc. may be simulated, while, in the context of logical simulation, a particular function may be simulated. In the context of protocol, a particular protocol (e.g. DDR3, etc.) may be simulated.

In still additional aspects of the present embodiment, the second number may be more or less than the first number. Still yet, in the latter case, the second number may be one, such that a single memory circuit is simulated. Different optional embodiments which may employ various aspects of the present embodiment will be set forth hereinafter during reference to FIGS. 33A-33E, and 34 et al.

In still yet another embodiment, the interface circuit 3202 may be operable to interface the memory circuits 3204A, 3204B, 3204N and the system 3206 for simulating at least one memory circuit with at least one aspect that is different from at least one aspect of at least one of the plurality of the memory circuits 3204A, 3204B, 3204N. In accordance with various aspects of such embodiment, such aspect may include a signal, a capacity, a timing, a logical interface, etc. Of course, such examples of aspects are set forth for illustrative purposes only and thus should not be construed as limiting, since any aspect associated with one or more of the memory circuits 3204A, 3204B, 3204N may be simulated differently in the foregoing manner.

In the case of the signal, such signal may refer to a control signal (e.g. an address signal; a signal associated with an activate operation, precharge operation, write operation, read operation, a mode register write operation, a mode register read operation, a refresh operation; etc.), a data signal, a logical or physical signal, or any other signal for that matter. For instance, a number of the aforementioned signals may be simulated to appear as fewer or more signals, or even simulated to correspond to a different type. In still other embodiments, multiple signals may be combined to simulate another signal. Even still, a length of time in which a signal is asserted may be simulated to be different.

In the case of protocol, such may, in one exemplary embodiment, refer to a particular standard protocol. For example, a number of memory circuits 3204A, 3204B, 3204N that obey a standard protocol (e.g. DDR2, etc.) may be used to simulate one or more memory circuits that obey a different protocol (e.g. DDR3, etc.). Also, a number of memory circuits 3204A, 3204B, 3204N that obey a version of protocol (e.g. DDR2 with 3-3-3 latency timing, etc.) may be used to simulate one or more memory circuits that obey a different version of the same protocol (e.g. DDR2 with 5-5-5 latency timing, etc.).

In the case of capacity, such may refer to a memory capacity (which may or may not be a function of a number of the memory circuits 3204A, 3204B, 3204N; see previous embodiment). For example, the interface circuit 3202 may be operable for simulating at least one memory circuit with a first memory capacity that is greater than (or less than) a second memory capacity of at least one of the memory circuits 3204A, 3204B, 3204N.

In the case where the aspect is timing-related, the timing may possibly relate to a latency (e.g. time delay, etc.). In one aspect of the present embodiment, such latency may include a column address strobe (CAS) latency, which refers to a latency associated with accessing a column of data. Still yet, the latency may include a row address to column address latency (tRCD), which refers to a latency required between the row address strobe (RAS) and CAS. Even still, the latency may include a row precharge latency (tRP), which refers a latency required to terminate access to an open row, and open access to a next row. Further, the latency may include an activate to precharge latency (tRAS), which refers to a latency required to access a certain row of data between an activate operation and a precharge operation. In any case, the interface circuit 3202 may be operable for simulating at least one memory circuit with a first latency that is longer (or shorter) than a second latency of at least one of the memory circuits 3204A, 3204B, 3204N. Different optional embodiments which employ various features of the present embodiment will be set forth hereinafter during reference to FIGS. 33A-33E, and 34 et al.

In still another embodiment, a component may be operable to receive a signal from the system 3206 and communicate the signal to at least one of the memory circuits 3204A, 3204B, 3204N after a delay. Again, the signal may refer to a control signal (e.g. an address signal; a signal associated with an activate operation, precharge operation, write operation, read operation; etc.), a data signal, a logical or physical signal, or any other signal for that matter. In various embodiments, such delay may be fixed or variable (e.g. a function of the current signal, the previous signal, etc.). In still other embodiments, the component may be operable to receive a signal from at least one of the memory circuits 3204A, 3204B, 3204N and communicate the signal to the system 3206 after a delay.

As an option, the delay may include a cumulative delay associated with any one or more of the aforementioned signals. Even still, the delay may result in a time shift of the signal forward and/or back in time (with respect to other signals). Of course, such forward and backward time shift may or may not be equal in magnitude. In one embodiment, this time shifting may be accomplished by utilizing a plurality of delay functions which each apply a different delay to a different signal. In still additional embodiments, the aforementioned shifting may be coordinated among multiple signals such that different signals are subject to shifts with different relative directions/magnitudes, in an organized fashion.

Further, it should be noted that the aforementioned component may, but need not necessarily take the form of the interface circuit 3202 of FIG. 32. For example, the component may include a register, an AMB, a component positioned on at least one DIMM, a memory controller, etc. Such register may, in various embodiments, include a Joint Electron Device Engineering Council (JEDEC) register, a JEDEC register including one or more functions set forth herein, a register with forwarding, storing, and/or buffering capabilities, etc. Different optional embodiments which employ various features of the present embodiment will be set forth hereinafter during reference to FIGS. 35-38, and 40A-B et al.

In a power-saving embodiment, at least one of a plurality of memory circuits 3204A, 3204B, 3204N may be identified that is not currently being accessed by the system 3206. In one embodiment, such identification may involve determining whether a page [i.e. any portion of any memory(s), etc.] is being accessed in at least one of the plurality of memory circuits 3204A, 3204B, 3204N. Of course, any other technique may be used that results in the identification of at least one of the memory circuits 3204A, 3204B, 3204N that is not being accessed.

In response to the identification of the at least one memory circuit 3204A, 3204B, 3204N, a power saving operation is initiated in association with the at least one memory circuit 3204A, 3204B, 3204N. In one optional embodiment, such power saving operation may involve a power down operation and, in particular, a precharge power down operation. Of course, however, it should be noted that any operation that results in at least some power savings may be employed in the context of the present embodiment.

Similar to one or more of the previous embodiments, the present functionality or a portion thereof may be carried out utilizing any desired component. For example, such component may, but need not necessarily take the form of the interface circuit 3202 of FIG. 32. In other embodiments, the component may include a register, an AMB, a component positioned on at least one DIMM, a memory controller, etc. One optional embodiment which employs various features of the present embodiment will be set forth hereinafter during reference to FIG. 41.

In still yet another embodiment, a plurality of the aforementioned components may serve, in combination, to interface the memory circuits 3204A, 3204B, 3204N and the system 3206. In various embodiments, two, three, four, or more components may accomplish this. Also, the different components may be relatively configured in any desired manner. For example, the components may be configured in parallel, serially, or a combination thereof. In addition, any number of the components may be allocated to any number of the memory circuits 3204A, 3204B, 3204N.

Further, in the present embodiment, each of the plurality of components may be the same or different. Still yet, the components may share the same or similar interface tasks and/or perform different interface tasks. Such interface tasks may include, but are not limited to simulating one or more aspects of a memory circuit, performing a power savings/refresh operation, carrying out any one or more of the various functionalities set forth herein, and/or any other task relevant to the aforementioned interfacing. One optional embodiment which employs various features of the present embodiment will be set forth hereinafter during reference to FIG. 34.

Additional illustrative information will now be set forth regarding various optional embodiments in which the foregoing techniques may or may not be implemented, per the desires of the user. For example, an embodiment is set forth for storing at least a portion of information received in association with a first operation for use in performing a second operation. See FIG. 33F. Further, a technique is provided for refreshing a plurality of memory circuits, in accordance with still yet another embodiment. See FIG. 42.

It should again be strongly noted that the following information is set forth for illustrative purposes and should not be construed as limiting in any manner. Any of the following features may be optionally incorporated with or without the exclusion of other features described.

FIGS. 33A-33E show various configurations of a buffered stack of DRAM circuits 3306A-D with a buffer chip 3302, in accordance with various embodiments. As an option, the various configurations to be described in the following embodiments may be implemented in the context of the architecture and/or environment of FIG. 32. Of course, however, they may also be carried out in any other desired environment (e.g. using other memory types, etc.). It should also be noted that the aforementioned definitions may apply during the present description.

As shown in each of such figures, the buffer chip 3302 is placed electrically between an electronic host system 3304 and a stack of DRAM circuits 3306A-D. In the context of the present description, a stack may refer to any collection of memory circuits. Further, the buffer chip 3302 may include any device capable of buffering a stack of circuits (e.g. DRAM circuits 3306A-D, etc.). Specifically, the buffer chip 3302 may be capable of buffering the stack of DRAM circuits 3306A-D to electrically and/or logically resemble at least one larger capacity DRAM circuit to the host system 3304. In this way, the stack of DRAM circuits 3306A-D may appear as a smaller quantity of larger capacity DRAM circuits to the host system 3304.

For example, the stack of DRAM circuits 3306A-D may include eight 512 Mb DRAM circuits. Thus, the buffer chip 3302 may buffer the stack of eight 512 Mb DRAM circuits to resemble a single 4 Gb DRAM circuit to a memory controller (not shown) of the associated host system 3304. In another example, the buffer chip 3302 may buffer the fstack of eight 512 Mb DRAM circuits to resemble two 2 Gb DRAM circuits to a memory controller of an associated host system 3304.

Further, the stack of DRAM circuits 3306A-D may include any number of DRAM circuits. Just by way of example, a buffer chip 3302 may be connected to 2, 4, 8 or more DRAM circuits 3306A-D. Also, the DRAM circuits 3306A-D may be arranged in a single stack, as shown in FIGS. 33A-33D.

The DRAM circuits 3306A-D may be arranged on a single side of the buffer chip 3302, as shown in FIGS. 33A-33D. Of course, however, the DRAM circuits 3306A-D may be located on both sides of the buffer chip 3302 shown in FIG. 33E. Thus, for example, a buffer chip 3302 may be connected to 16 DRAM circuits with 8 DRAM circuits on either side of the buffer chip 3302, where the 8 DRAM circuits on each side of the buffer chip 3302 are arranged in two stacks of four DRAM circuits.

The buffer chip 3302 may optionally be a part of the stack of DRAM circuits 3306A-D. Of course, however, the buffer chip 3302 may also be separate from the stack of DRAM circuits 3306A-D. In addition, the buffer chip 3302 may be physically located anywhere in the stack of DRAM circuits 3306A-D, where such buffer chip 3302 electrically sits between the electronic host system 3304 and the stack of DRAM circuits 3306A-D.

In one embodiment, a memory bus (not shown) may connect to the buffer chip 3302, and the buffer chip 3302 may connect to each of the DRAM circuits 3306A-D in the stack. As shown in FIGS. 33A-33D, the buffer chip 3302 may be located at the bottom of the stack of DRAM circuits 3306A-D (e.g. the bottom-most device in the stack). As another option, and as shown in FIG. 33E, the buffer chip 3302 may be located in the middle of the stack of DRAM circuits 3306A-D. As still yet another option, the buffer chip 3302 may be located at the top of the stack of DRAM circuits 3306A-D (e.g. the top-most device in the stack). Of course, however, the buffer chip 3302 may be located anywhere between the two extremities of the stack of DRAM circuits 3306A-D.

The electrical connections between the buffer chip 3302 and the stack of DRAM circuits 3306A-D may be configured in any desired manner. In one optional embodiment; address, control (e.g. command, etc.), and clock signals may be common to all DRAM circuits 3306A-D in the stack (e.g. using one common bus). As another option, there may be multiple address, control and clock busses. As yet another option, there may be individual address, control and clock busses to each DRAM circuit 3306A-D. Similarly, data signals may be wired as one common bus, several busses or as an individual bus to each DRAM circuit 3306A-D. Of course, it should be noted that any combinations of such configurations may also be utilized.

Figure 33A:
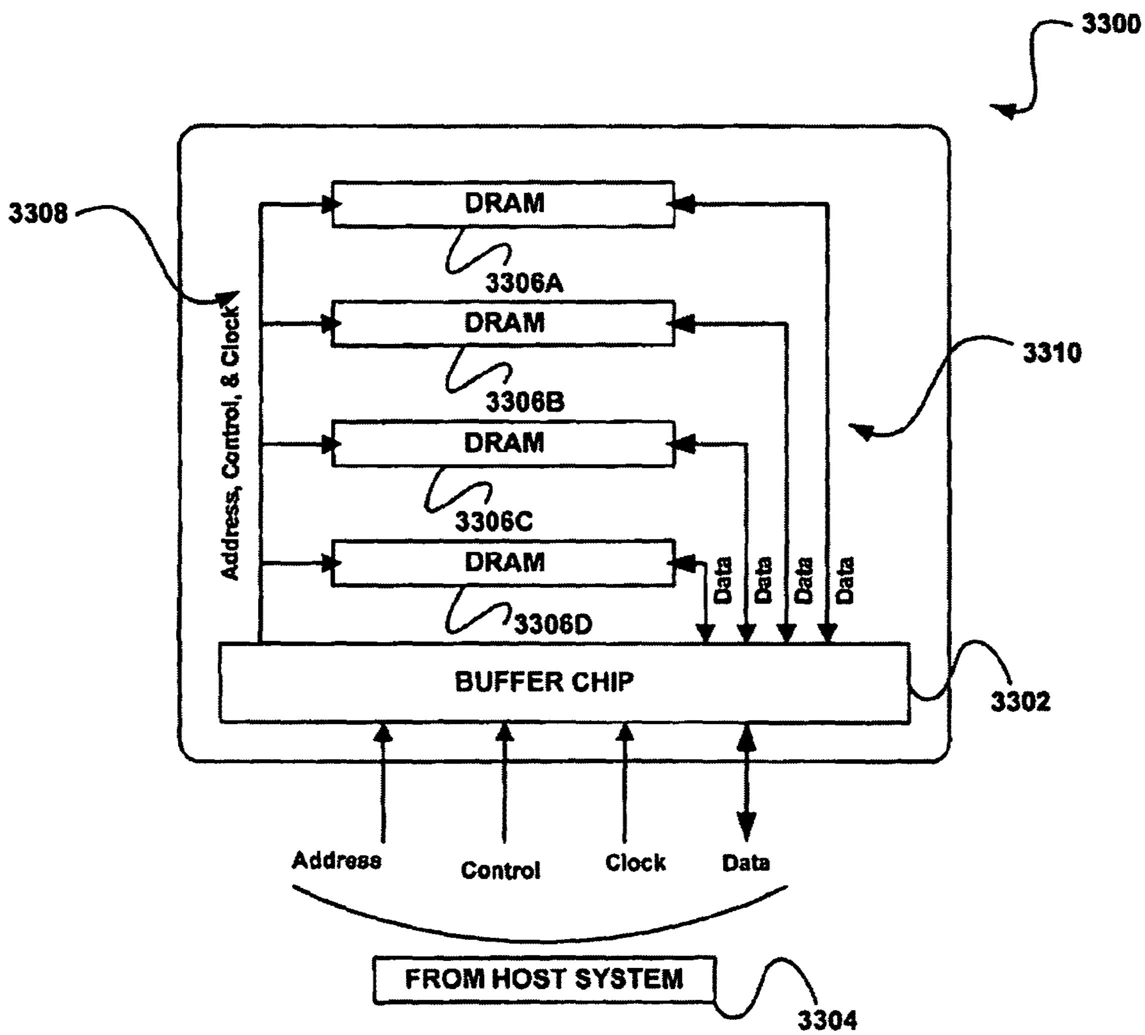
FIGS. 33A-33E show various configurations of a buffered stack of dynamic random access memory (DRAM) circuits with a buffer chip, in accordance with various embodiments.
Figure 33B:
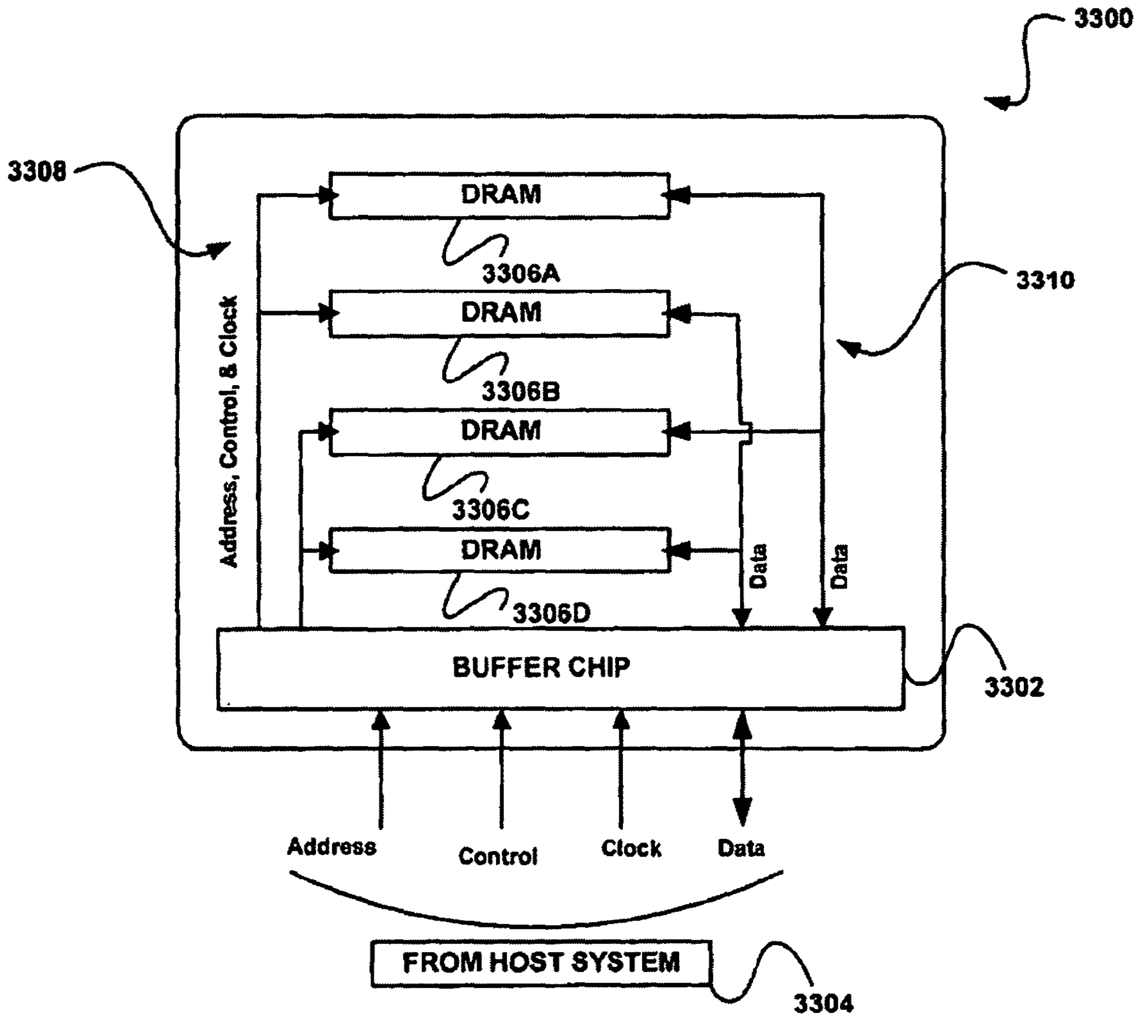
Figure 33C:
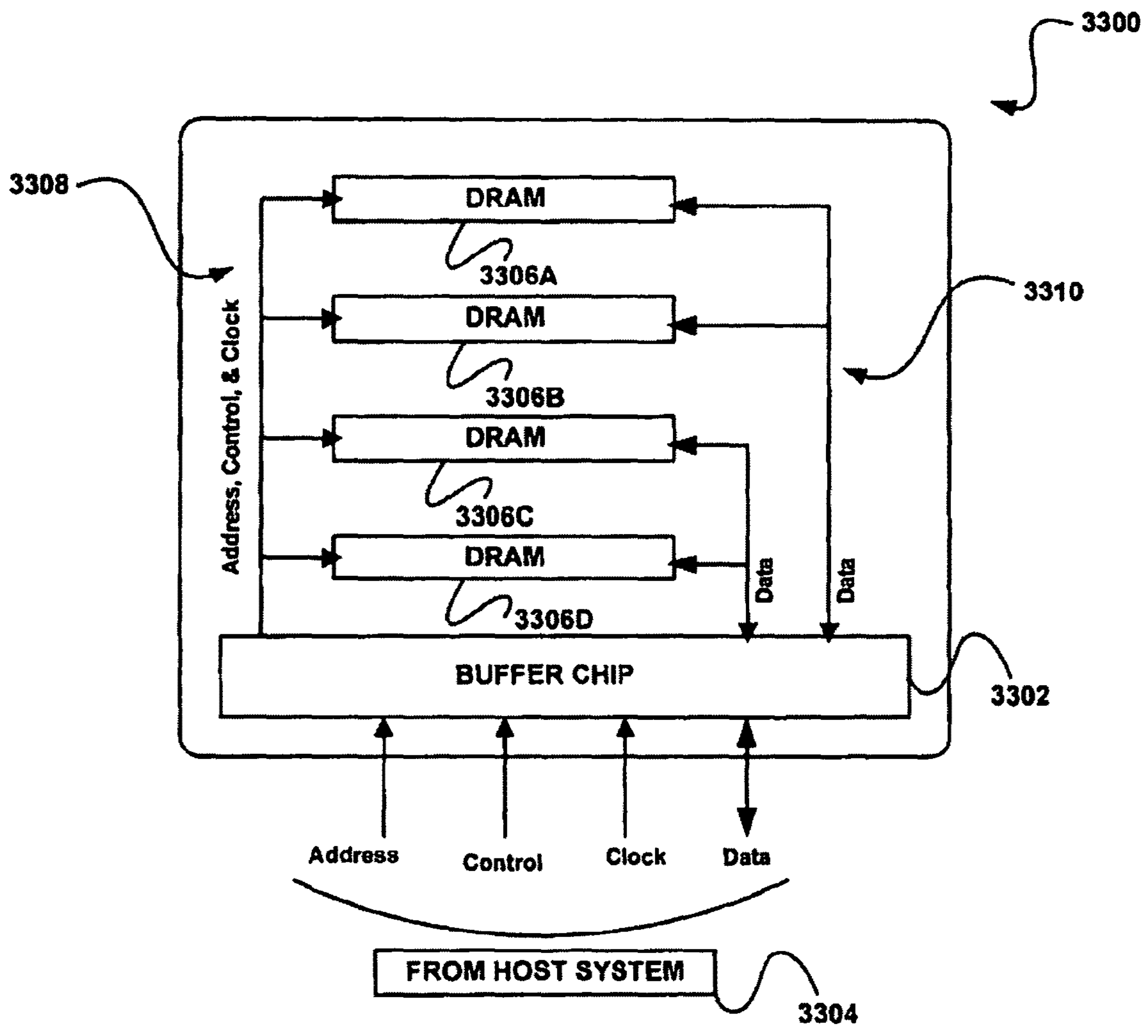
Figure 33D:
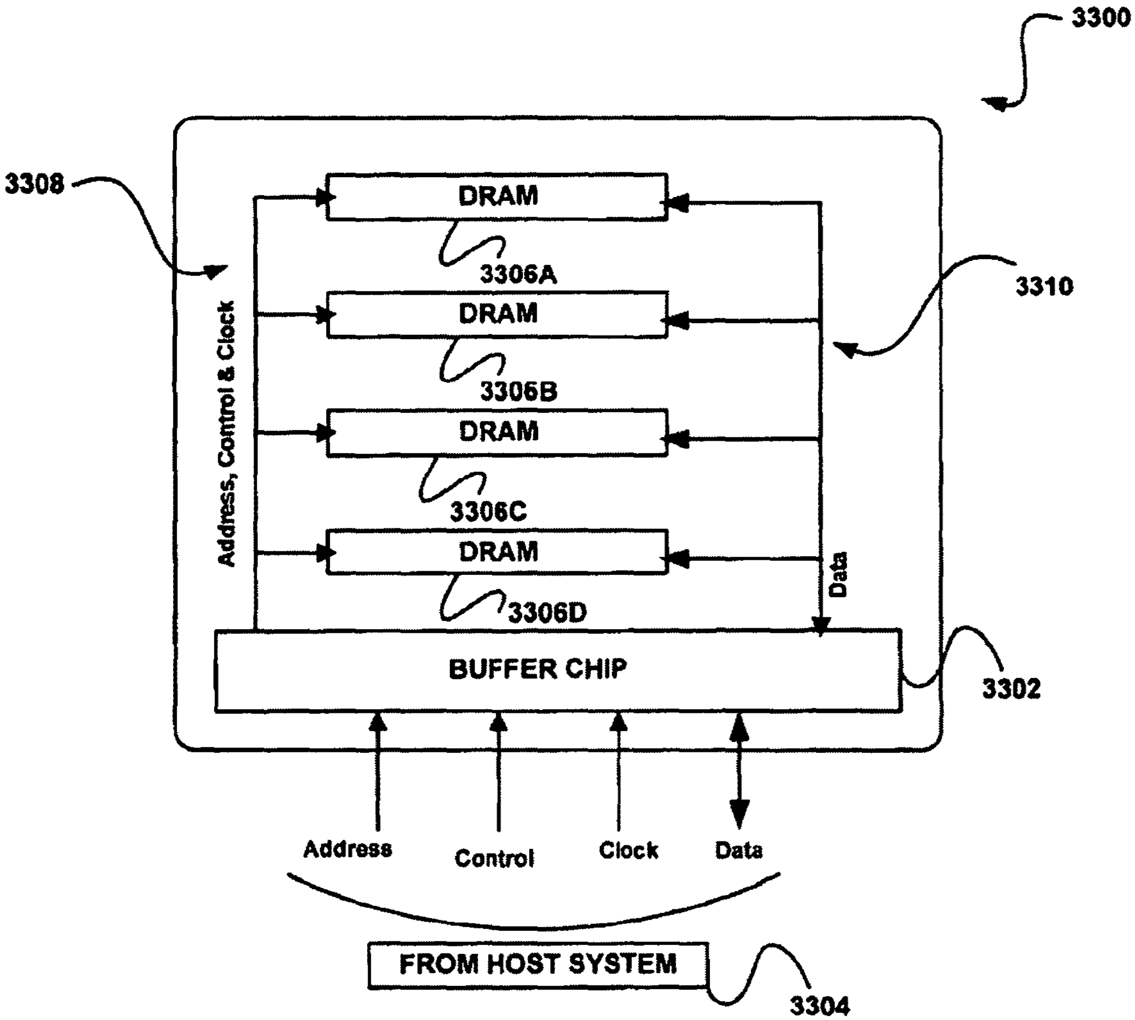
Figure 33E:
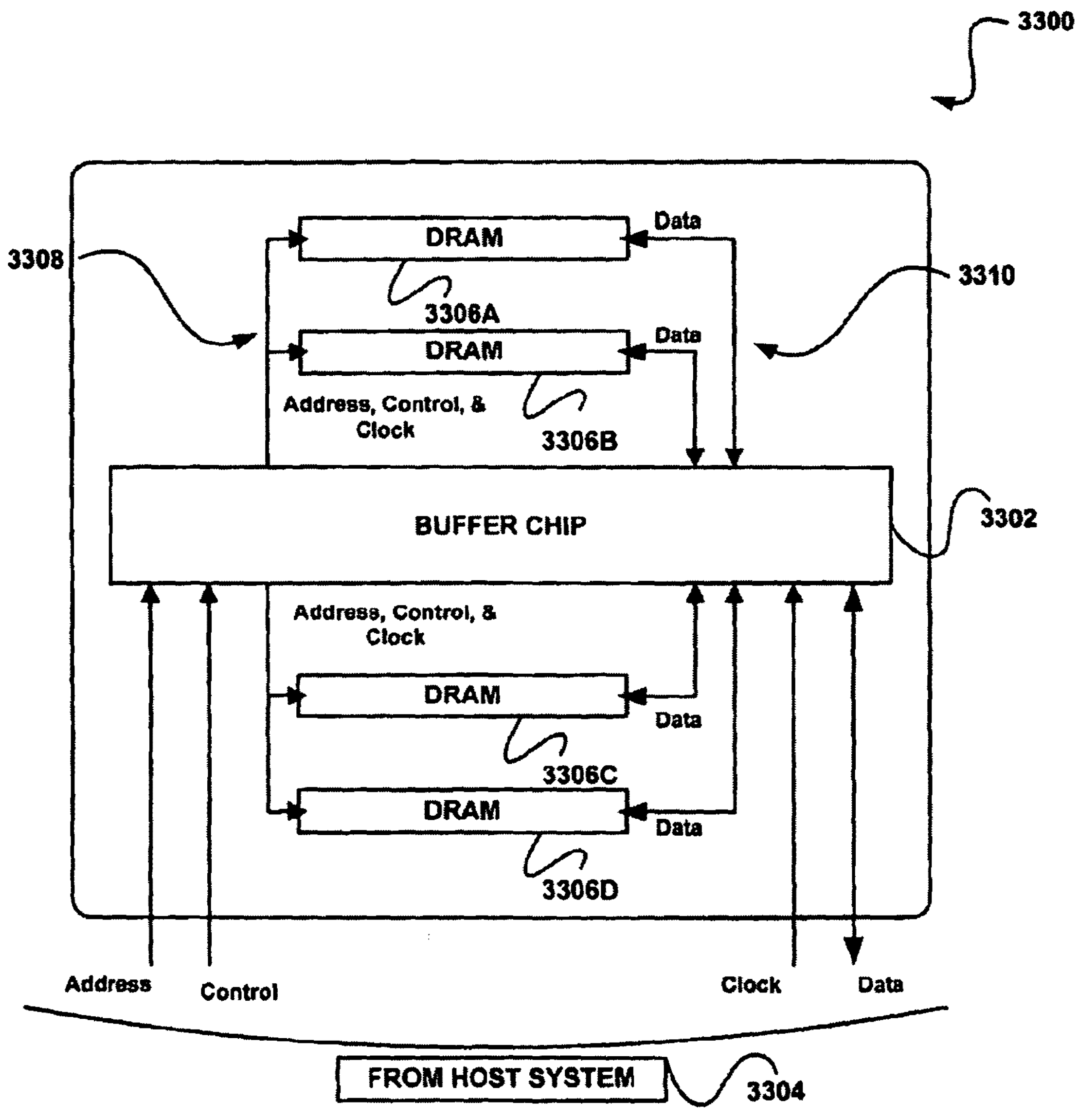

For example, as shown in FIG. 33A, the stack of DRAM circuits 3306A-D may have one common address, control and clock bus 3308 with individual data busses 3310. In another example, as shown in FIG. 33B, the stack of DRAM circuits 3306A-D may have two address, control and clock busses 3308 along with two data busses 3310. In still yet another example, as shown in FIG. 33C, the stack of DRAM circuits 3306A-D may have one address, control and clock bus 3308 together with two data busses 3310. In addition, as shown in FIG. 33D, the stack of DRAM circuits 3306A-D may have one common address, control and clock bus 3308 and one common data bus 3310. It should be noted that any other permutations and combinations of such address, control, clock and data buses may be utilized.

These configurations may therefore allow for the host system 3304 to only be in contact with a load of the buffer chip 3302 on the memory bus. In this way, any electrical loading problems (e.g. bad signal integrity, improper signal timing, etc.) associated with the stacked DRAM circuits 3306A-D may (but not necessarily) be prevented, in the context of various optional embodiments.

Figure 33F:
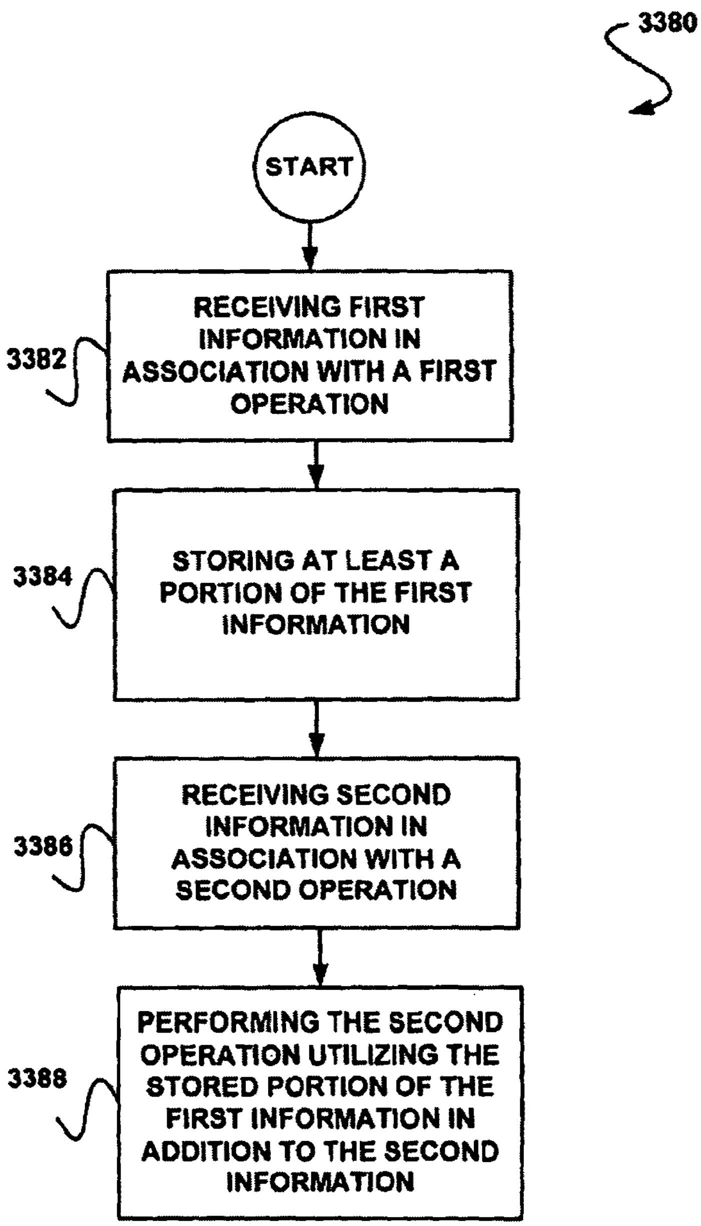
FIG. 33F illustrates a method for storing at least a portion of information received in association with a first operation for use in performing a second operation, in accordance with still another embodiment.

FIG. 33F illustrates a method 3380 for storing at least a portion of information received in association with a first operation for use in performing a second operation, in accordance with still yet another embodiment. As an option, the method 3380 may be implemented in the context of the architecture and/or environment of any one or more of FIGS. 32-33E. For example, the method 3380 may be carried out by the interface circuit 3202 of FIG. 32. Of course, however, the method 3380 may be carried out in any desired environment. It should also be noted that the aforementioned definitions may apply during the present description.

In operation 3382, first information is received in association with a first operation to be performed on at least one of a plurality of memory circuits (e.g. see the memory circuits 3204A, 3204B, 3204N of FIG. 32, etc.). In various embodiments, such first information may or may not be received coincidentally with the first operation, as long as it is associated in some capacity. Further, the first operation may, in one embodiment, include a row operation. In such embodiment, the first information may include address information (e.g. a set of address bits, etc.).

For reasons that will soon become apparent, at least a portion of the first information is stored. Note operation 3384. Still yet, in operation 3386, second information is received in association with a second operation. Similar to the first information, the second information may or may not be received coincidentally with the second operation, and may include address information. Such second operation, however, may, in one embodiment, include a column operation.

To this end, the second operation may be performed utilizing the stored portion of the first information in addition to the second information. See operation 3388. More illustrative information will now be set forth regarding various optional features with which the foregoing method 3380 may or may not be implemented, per the desires of the user. Specifically, an example will be set for illustrating the manner in which the method 3380 may be employed for accommodating a buffer chip that is simulating at least one aspect of a plurality of memory circuits.

In particular, the present example of the method 3380 of FIG. 33F will be set forth in the context of the various components (e.g. buffer chip 3302, etc.) shown in the embodiments of FIGS. 33A-33E. It should be noted that, since the buffered stack of DRAM circuits 3306A-D may appear to the memory controller of the host system 3304 as one or more larger capacity DRAM circuits, the buffer chip 3302 may receive more address bits from the memory controller than are required by the DRAM circuits 3306A-D in the stack. These extra address bits may be decoded by the buffer chip 3302 to individually select the DRAM circuits 3306A-D in the stack, utilizing separate chip select signals to each of the DRAM circuits 3306A-D in the stack.

For example, a stack of four ×4 1 Gb DRAM circuits 3306A-D behind a buffer chip 3302 may appear as a single ×4 4 Gb DRAM circuit to the memory controller. Thus, the memory controller may provide sixteen row address bits and three bank address bits during a row (e.g. activate) operation, and provide eleven column address bits and three bank address bits during a column (e.g. read or write) operation. However, the individual DRAM circuits 3306A-D in the stack may require only fourteen row address bits and three bank address bits for a row operation, and eleven column address bits and three bank address bits during a column operation.

As a result, during a row operation in the above example, the buffer chip 3302 may receive two address bits more than are needed by each DRAM circuit 3306A-D in the stack. The buffer chip 3302 may therefore use the two extra address bits from the memory controller to select one of the four DRAM circuits 3306A-D in the stack. In addition, the buffer chip 3302 may receive the same number of address bits from the memory controller during a column operation as are needed by each DRAM circuit 3306A-D in the stack.

Thus, in order to select the correct DRAM circuit 3306A-D in the stack during a column operation, the buffer chip 3302 may be designed to store the two extra address bits provided during a row operation and use the two stored address bits to select the correct DRAM circuit 3306A-D during the column operation. The mapping between a system address (e.g. address from the memory controller, including the chip select signal(s)) and a device address (e.g. the address, including the chip select signals, presented to the DRAM circuits 3306A-D in the stack) may be performed by the buffer chip 3302 in various manners.

In one embodiment, a lower order system row address and bank address bits may be mapped directly to the device row address and bank address inputs. In addition, the most significant row address bit(s) and, optionally, the most significant bank address bit(s), may be decoded to generate the chip select signals for the DRAM circuits 3306A-D in the stack during a row operation. The address bits used to generate the chip select signals during the row operation may also be stored in an internal lookup table by the buffer chip 3302 for one or more clock cycles. During a column operation, the system column address and bank address bits may be mapped directly to the device column address and bank address inputs, while the stored address bits may be decoded to generate the chip select signals.

For example, addresses may be mapped between four 512 Mb DRAM circuits 3306A-D that simulate a single 2 Gb DRAM circuits utilizing the buffer chip 3302. There may be 15 row address bits from the system 3304, such that row address bits 0 through 13 are mapped directly to the DRAM circuits 3306A-D. There may also be 3 bank address bits from the system 3304, such that bank address bits 0 through 1 are mapped directly to the DRAM circuits 3306A-D.

During a row operation, the bank address bit 2 and the row address bit 14 may be decoded to generate the 4 chip select signals for each of the four DRAM circuits 3306A-D. Row address bit 14 may be stored during the row operation using the bank address as the index. In addition, during the column operation, the stored row address bit 14 may again be used with bank address bit 2 to form the four DRAM chip select signals.

As another example, addresses may be mapped between four 1 Gb DRAM circuits 3306A-D that simulate a single 4 Gb DRAM circuits utilizing the buffer chip 3302. There may be 16 row address bits from the system 3304, such that row address bits 0 through 14 are mapped directly to the DRAM circuits 3306A-D. There may also be 3 bank address bits from the system 3304, such that bank address bits 0 through 3 are mapped directly to the DRAM circuits 3306A-D.

During a row operation, row address bits 14 and 15 may be decoded to generate the 4 chip select signals for each of the four DRAM circuits 3306A-D. Row address bits 14 and 15 may also be stored during the row operation using the bank address as the index. During the column operation, the stored row address bits 14 and 15 may again be used to form the four DRAM chip select signals.

In various embodiments, this mapping technique may optionally be used to ensure that there are no unnecessary combinational logic circuits in the critical timing path between the address input pins and address output pins of the buffer chip 3302. Such combinational logic circuits may instead be used to generate the individual chip select signals. This may therefore allow the capacitive loading on the address outputs of the buffer chip 3302 to be much higher than the loading on the individual chip select signal outputs of the buffer chip 3302.

In another embodiment, the address mapping may be performed by the buffer chip 3302 using some of the bank address signals from the memory controller to generate the individual chip select signals. The buffer chip 3302 may store the higher order row address bits during a row operation using the bank address as the index, and then may use the stored address bits as part of the DRAM circuit bank address during a column operation. This address mapping technique may require an optional lookup table to be positioned in the critical timing path between the address inputs from the memory controller and the address outputs, to the DRAM circuits 3306A-D in the stack.

For example, addresses may be mapped between four 512 Mb DRAM circuits 3306A-D that simulate a single 2 Gb DRAM utilizing the buffer chip 3302. There may be 15 row address bits from the system 3304, where row address bits 0 through 13 are mapped directly to the DRAM circuits 3306A-D. There may also be 3 bank address bits from the system 3304, such that bank address bit 0 is used as a DRAM circuit bank address bit for the DRAM circuits 3306A-D.

In addition, row address bit 14 may be used as an additional DRAM circuit bank address bit. During a row operation, the bank address bits 1 and 2 from the system may be decoded to generate the 4 chip select signals for each of the four DRAM circuits 3306A-D. Further, row address bit 14 may be stored during the row operation. During the column operation, the stored row address bit 14 may again be used along with the bank address bit 0 from the system to form the DRAM circuit bank address.

In both of the above described address mapping techniques, the column address from the memory controller may be mapped directly as the column address to the DRAM circuits 3306A-D in the stack. Specifically, this direct mapping may be performed since each of the DRAM circuits 3306A-D in the stack, even if of the same width but different capacities (e.g. from 512 Mb to 4 Gb), may have the same page sizes. In an optional embodiment, address A[10] may be used by the memory controller to enable or disable auto-precharge during a column operation. Therefore, the buffer chip 3302 may forward A[10] from the memory controller to the DRAM circuits 3306A-D in the stack without any modifications during a column operation.

In various embodiments, it may be desirable to determine whether the simulated DRAM circuit behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard defines control signals that a DRAM circuit must accept and the behavior of the DRAM circuit as a result of such control signals. For example, the JEDEC specification for a DDR2 DRAM is known as JESD79-2B.

If it is desired, for example, to determine whether a JEDEC standard is met, the following algorithm may be used. Such algorithm checks, using a set of software verification tools for formal verification of logic, that protocol behavior of the simulated DRAM circuit is the same as a desired standard or other design specification. This formal verification is quite feasible because the DRAM protocol described in a DRAM standard is typically limited to a few control signals (e.g. approximately 15 control signals in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, and others. These software verification tools use written assertions that correspond to the rules established by the DRAM protocol and specification. These written assertions are further included in the code that forms the logic description for the buffer chip. By writing assertions that correspond to the desired behavior of the simulated DRAM circuit, a proof may be constructed that determines whether the desired design requirements are met. In this way, one may test various embodiments for compliance with a standard, multiple standards, or other design specification.

For instance, an assertion may be written that no two DRAM control signals are allowed to be issued to an address, control and clock bus at the same time. Although one may know which of the various buffer chip/DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for buffer chips with other bus arrangements or alternative designs for the interconnect between the buffer chips may be used and tested for compliance with the desired standard or other design specification.

Figure 34:
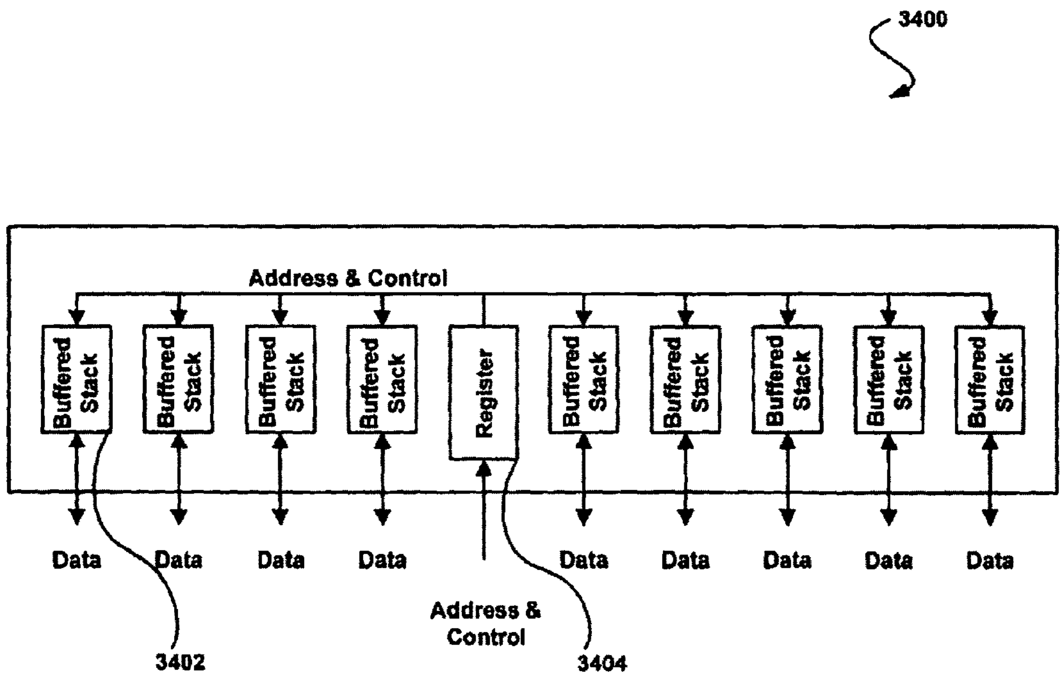
FIG. 34 shows a high capacity dual in-line memory module (DIMM) using buffered stacks, in accordance with still yet another embodiment.

FIG. 34 shows a high capacity DIMM 3400 using buffered stacks of DRAM circuits 3402, in accordance with still yet another embodiment. As an option, the high capacity DIMM 3400 may be implemented in the context of the architecture and environment of FIGS. 32 and/or 33A-F. Of course, however, the high capacity DIMM 3400 may be used in any desired environment. It should also be noted that the aforementioned definitions may apply during the present description.

As shown, a high capacity DIMM 3400 may be created utilizing buffered stacks of DRAM circuits 3402. Thus, a DIMM 3400 may utilize a plurality of buffered stacks of DRAM circuits 3402 instead of individual DRAM circuits, thus increasing the capacity of the DIMM. In addition, the DIMM 3400 may include a register 3404 for address and operation control of each of the buffered stacks of DRAM circuits 3402. It should be noted that any desired number of buffered stacks of DRAM circuits 3402 may be utilized in conjunction with the DIMM 3400. Therefore, the configuration of the DIMM 3400, as shown, should not be construed as limiting in any way.

In an additional unillustrated embodiment, the register 3404 may be substituted with an AMB (not shown), in the context of an FB-DIMM.

Figure 35:
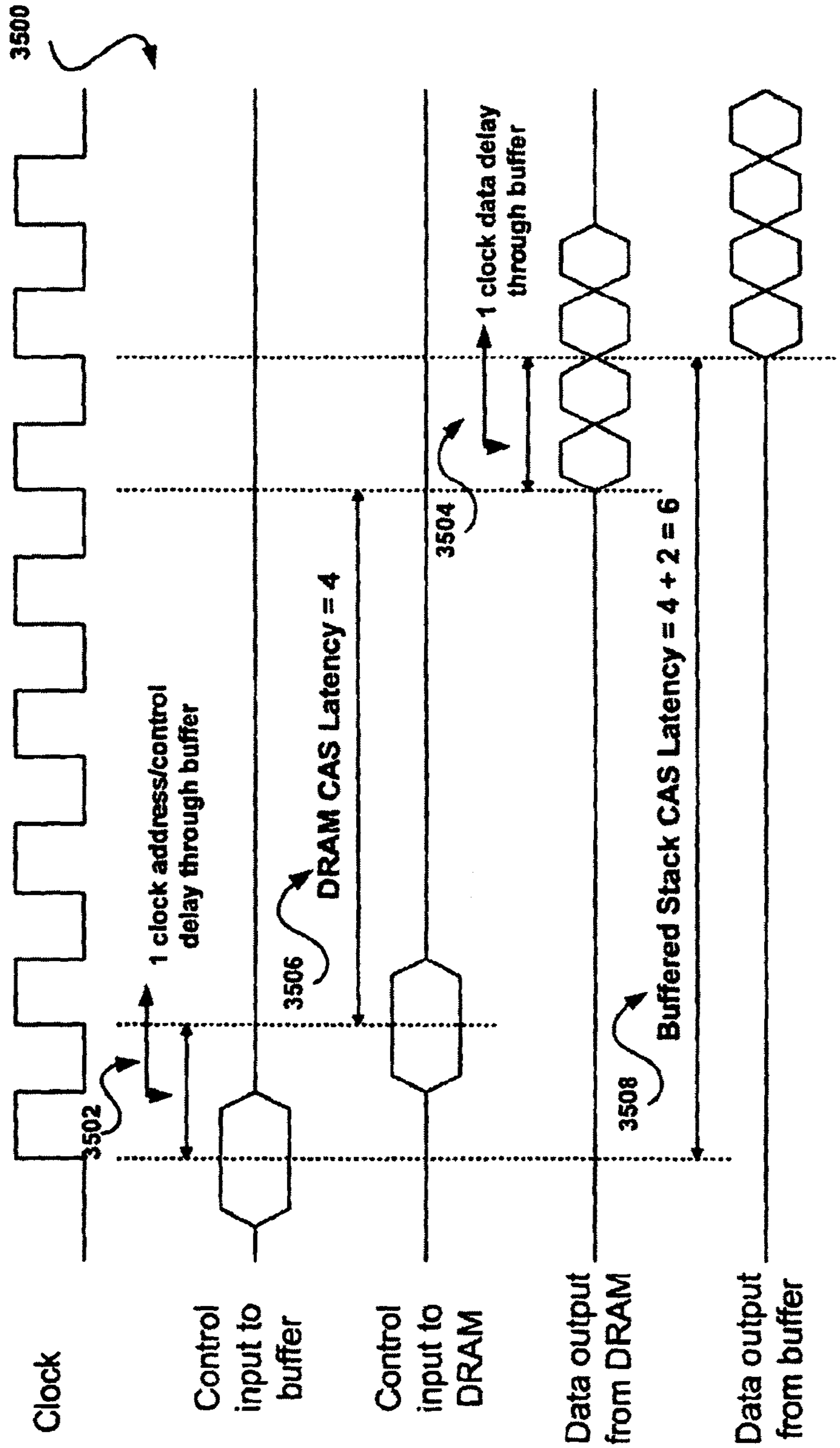
FIG. 35 shows a timing design of a buffer chip that makes a buffered stack of DRAM circuits mimic longer column address strobe (CAS) latency DRAM to a memory controller, in accordance with another embodiment.

FIG. 35 shows a timing design 3500 of a buffer chip that makes a buffered stack of DRAM circuits mimic longer CAS latency DRAM to a memory controller, in accordance with another embodiment. As an option, the design of the buffer chip may be implemented in the context of the architecture and environment of FIGS. 32-34. Of course, however, the design of the buffer chip may be used in any desired environment. It should also be noted that the aforementioned definitions may apply during the present description.

In use, any delay through a buffer chip (e.g. see the buffer chip 3302 of FIGS. 33A-E, etc.) may be made transparent to a memory controller of a host system (e.g. see the host system 3304 of FIGS. 33A-E, etc.) utilizing the buffer chip. In particular, the buffer chip may buffer a stack of DRAM circuits such that the buffered stack of DRAM circuits appears as at least one larger capacity DRAM circuit with higher CAS latency.

Such delay may be a result of the buffer chip being located electrically between the memory bus of the host system and the stacked DRAM circuits, since most or all of the signals that connect the memory bus to the DRAM circuits pass through the buffer chip. A finite amount of time may therefore be needed for these signals to traverse through the buffer chip. With the exception of register chips and advanced memory buffers (AMB), industry standard protocols for memory [e.g. (DDR SDRAM), DDR2 SDRAM, etc.] may not comprehend the buffer chip that sits between the memory bus and the DRAM. Industry standard protocols for memory [e.g. (DDR SDRAM), DDR2 SDRAM, etc.] narrowly define the properties of chips that sit between host and memory circuits. Such industry standard protocols define the properties of a register chip and AMB but not the properties of the buffer chip 3302, etc. Thus, the signal delay through the buffer chip may violate the specifications of industry standard protocols.

In one embodiment, the buffer chip may provide a one-half clock cycle delay between the buffer chip receiving address and control signals from the memory controller (or optionally from a register chip, an AMB, etc.) and the address and control signals being valid at the inputs of the stacked DRAM circuits. Similarly, the data signals may also have a one-half clock cycle delay in traversing the buffer chip, either from the memory controller to the DRAM circuits or from the DRAM circuits to the memory controller. Of course, the one-half clock cycle delay set forth above is set forth for illustrative purposes only and thus should not be construed as limiting in any manner whatsoever. For example, other embodiments are contemplated where a one clock cycle delay, a multiple clock cycle delay (or fraction thereof), and/or any other delay amount is incorporated, for that matter. As mentioned earlier, in other embodiments, the aforementioned delay may be coordinated among multiple signals such that different signals are subject to time-shifting with different relative directions/magnitudes, in an organized fashion.

As shown in FIG. 35, the cumulative delay through the buffer chip (e.g. the sum of a first delay 3502 of the address and control signals through the buffer chip and a second delay 3504 of the data signals through the buffer chip) is j clock cycles. Thus, the buffer chip may make the buffered stack appear to the memory controller as one or more larger DRAM circuits with a CAS latency 3508 of i+j clocks, where i is the native CAS latency of the DRAM circuits.

In one example, if the DRAM circuits in the stack have a native CAS latency of 4 and the address and control signals along with the data signals experience a one-half clock cycle delay through the buffer chip, then the buffer chip may make the buffered stack appear to the memory controller as one or more larger DRAM circuits with a CAS latency of 5 (i.e. 4+1). In another example, if the address and control signals along with the data signals experience a 1 clock cycle delay through the buffer chip, then the buffer chip may make the buffered stack appear as one or more larger DRAM circuits with a CAS latency of 6 (i.e. 4+2).

Figure 36:
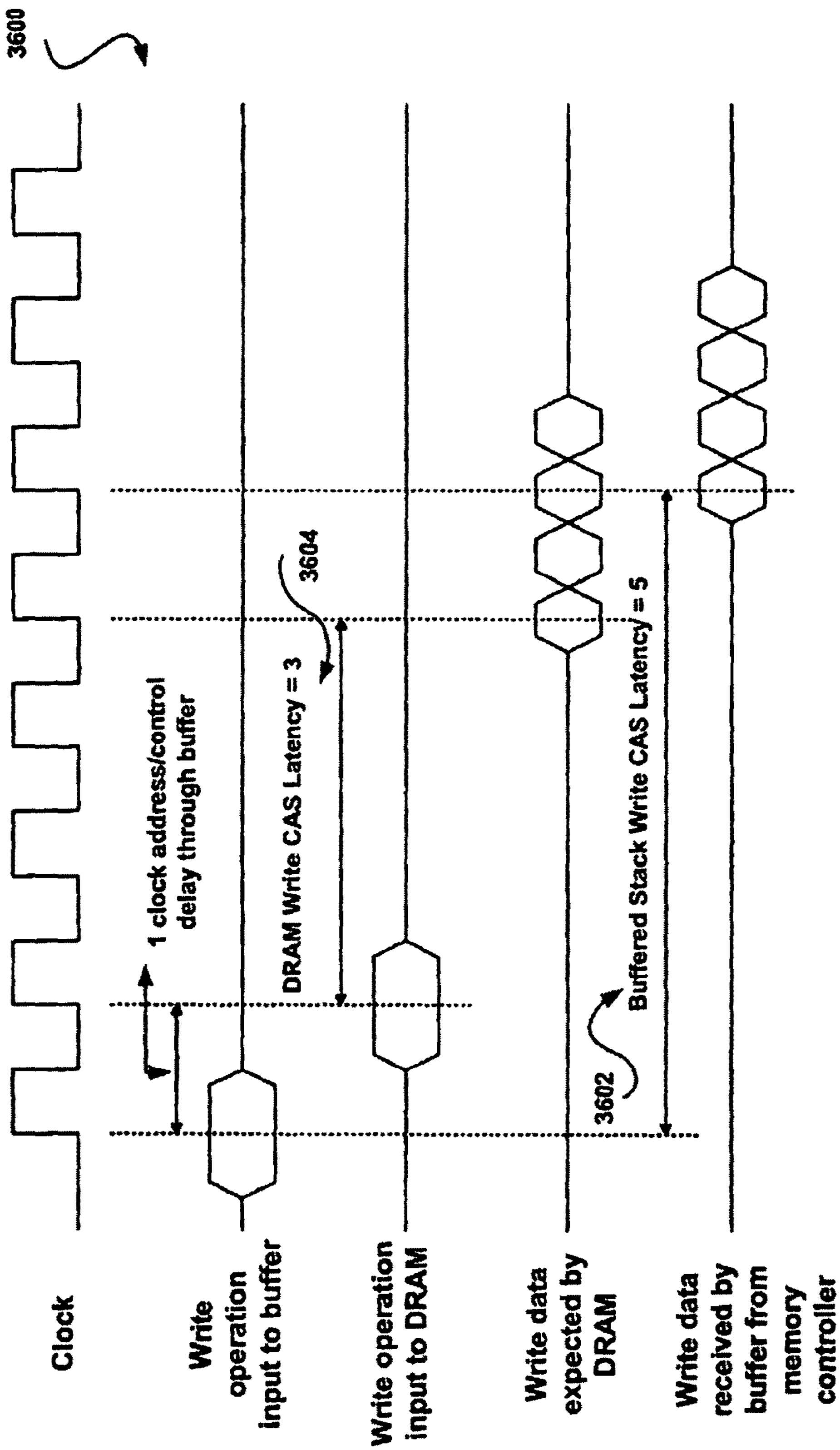
FIG. 36 shows the write data timing expected by DRAM in a buffered stack, in accordance with yet another embodiment.

FIG. 36 shows the write data timing 3600 expected by a DRAM circuit in a buffered stack, in accordance with yet another embodiment. As an option, the write data timing 3600 may be implemented in the context of the architecture and environment of FIGS. 32-35. Of course, however, the write data timing 3600 may be carried out in any desired environment. It should also be noted that the aforementioned definitions may apply during the present description.

Designing a buffer chip (e.g. see the buffer chip 3302 of FIGS. 33A-E, etc.) so that a buffered stack appears as at least one larger capacity DRAM circuit with higher CAS latency may, in some embodiments, create a problem with the timing of write operations. For example, with respect to a buffered stack of DDR2 SDRAM circuits with a CAS latency of 4 that appear as a single larger DDR2 SDRAM with a CAS latency of 6 to the memory controller, the DDR2 SDRAM protocol may specify that the write CAS latency is one less than the read CAS latency. Therefore, since the buffered stack appears as a DDR2 SDRAM with a read CAS latency of 6, the memory controller may use a write CAS latency of 5 (see 3602) when scheduling a write operation to the buffered stack.

However, since the native read CAS latency of the DRAM circuits is 4, the DRAM circuits may require a write CAS latency of 3 (see 3604). As a result, the write data from the memory controller may arrive at the buffer chip later than when the DRAM circuits require the data. Thus, the buffer chip may delay such write operations to alleviate any of such timing problems. Such delay in write operations will be described in more detail with respect to FIG. 37 below.

Figure 37:
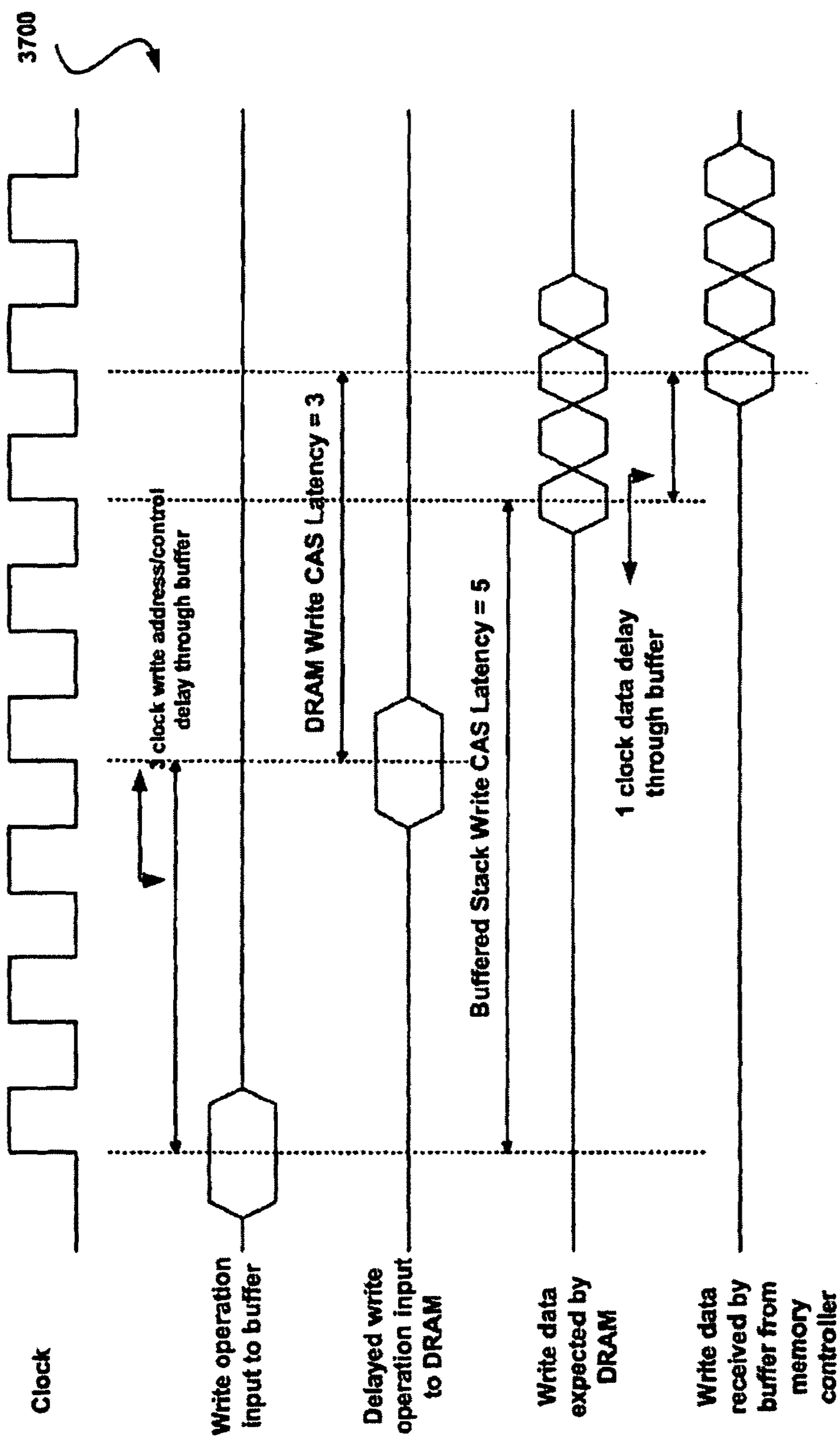
FIG. 37 shows write control signals delayed by a buffer chip, in accordance with still yet another embodiment.

FIG. 37 shows write operations 3700 delayed by a buffer chip, in accordance with still yet another embodiment. As an option, the write operations 3700 may be implemented in the context of the architecture and environment of FIGS. 32-36. Of course, however, the write operations 3700 may be used in any desired environment. Again, it should also be noted that the aforementioned definitions may apply during the present description.

In order to be compliant with the protocol utilized by the DRAM circuits in the stack, a buffer chip (e.g. see the buffer chip 3302 of FIGS. 33A-E, etc.) may provide an additional delay, over and beyond the delay of the address and control signals through the buffer chip, between receiving the write operation and address from the memory controller (and/or optionally from a register and/or AMB, etc.), and sending it to the DRAM circuits in the stack. The additional delay may be equal to j clocks, where j is the cumulative delay of the address and control signals through the buffer chip and the delay of the data signals through the buffer chip. As another option, the write address and operation may be delayed by a register chip on a DIMM, by an AMB, or by the memory controller.

Figure 38:
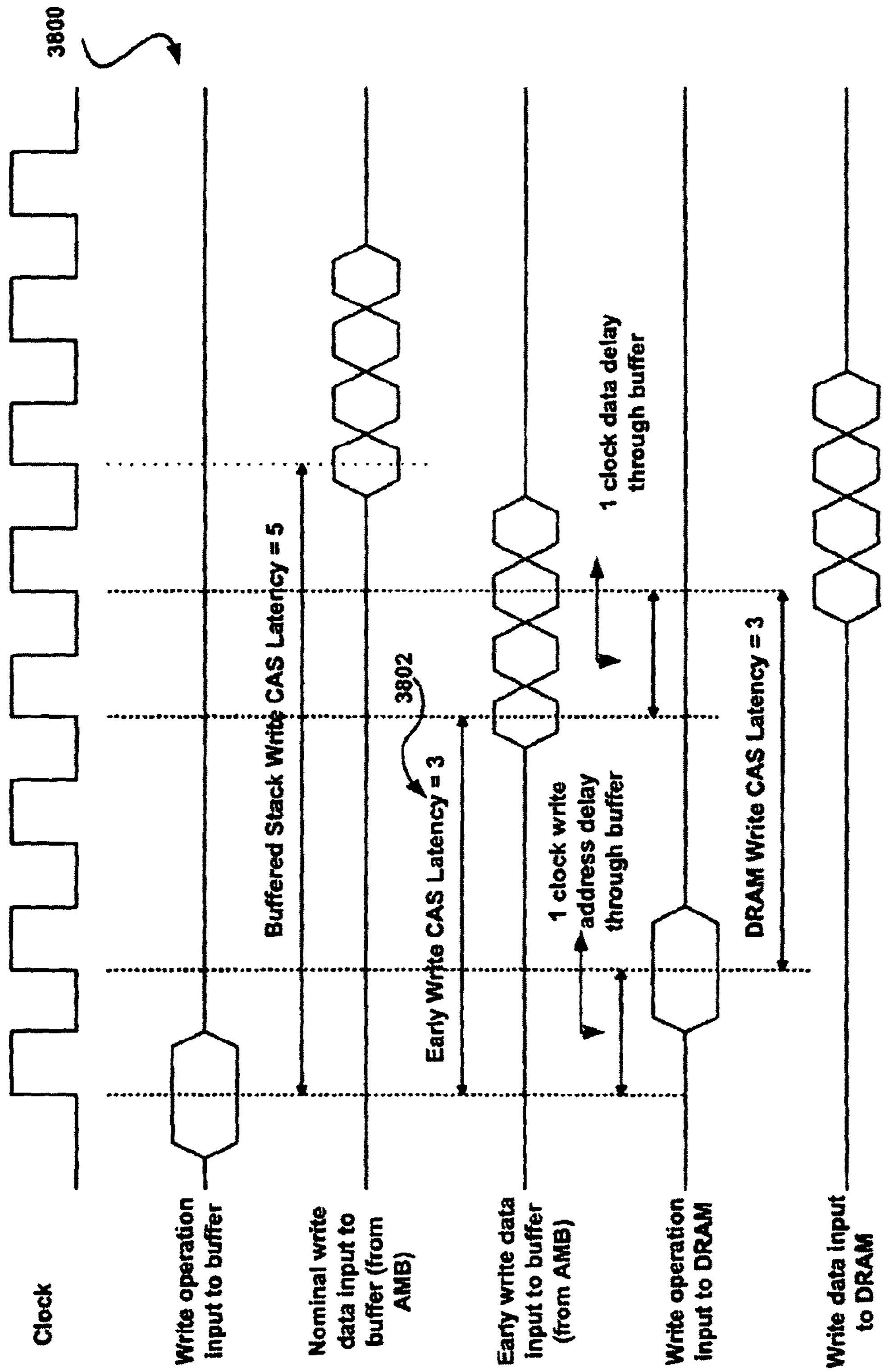
FIG. 38 shows early write data from an advanced memory buffer (AMB), in accordance with another embodiment.

FIG. 38 shows early write data 3800 from an AMB, in accordance with another embodiment. As an option, the early write data 3800 may be implemented in the context of the architecture and environment of FIGS. 32-36. Of course, however, the early write data 3800 may be used in any desired environment. It should also be noted that the aforementioned definitions may apply during the present description.

As shown, an AMB on an FB-DIMM may be designed to send write data earlier to buffered stacks instead of delaying the write address and operation, as described in reference to FIG. 37. Specifically, an early write latency 3802 may be utilized to send the write data to the buffered stack. Thus, correct timing of the write operation at the inputs of the DRAM circuits in the stack may be ensured.

For example, a buffer chip (e.g. see the buffer chip 3302 of FIGS. 33A-E, etc.) may have a cumulative latency of 2, in which case, the AMB may send the write data 2 clock cycles earlier to the buffered stack. It should be noted that this scheme may not be possible in the case of registered DIMMs since the memory controller sends the write data directly to the buffered stacks. As an option, a memory controller may be designed to send write data earlier so that write operations have the correct timing at the input of the DRAM circuits in the stack without requiring the buffer chip to delay the write address and operation.

Figure 39:
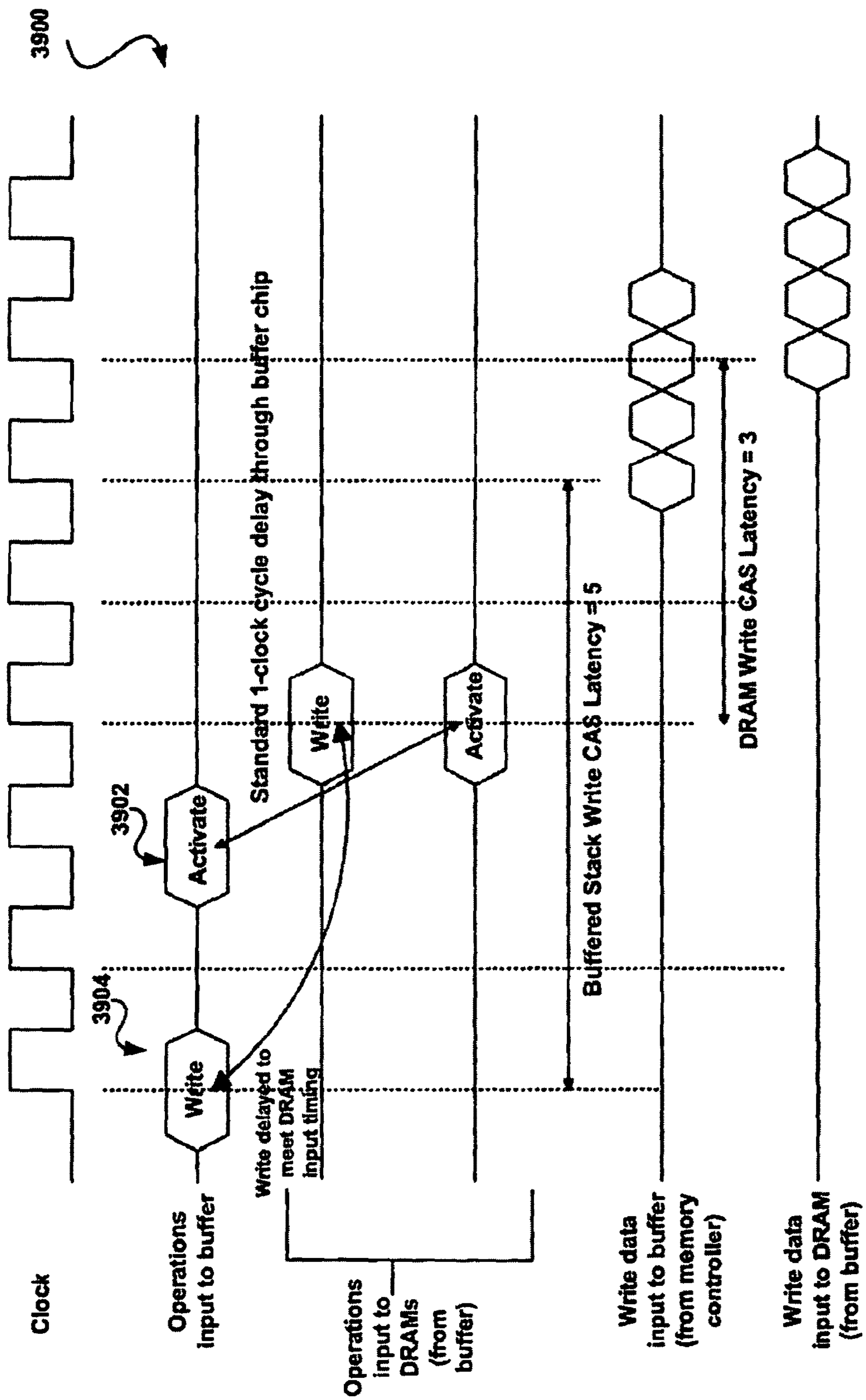
FIG. 39 shows address bus conflicts caused by delayed write operations, in accordance with yet another embodiment.

FIG. 39 shows address bus conflicts 3900 caused by delayed write operations, in accordance with yet another embodiment. As mentioned earlier, the delaying of the write addresses and operations may be performed by a buffer chip, or optionally a register, AMB, etc., in a manner that is completely transparent to the memory controller of a host system. However, since the memory controller is unaware of this delay, it may schedule subsequent operations, such as for example activate or precharge operations, which may collide with the delayed writes on the address bus from the buffer chip to the DRAM circuits in the stack. As shown, an activate operation 3902 may interfere with a write operation 3904 that has been delayed. Thus, a delay of activate operations may be employed, as will be described in further detail with respect to FIG. 40.

Figure 40A:
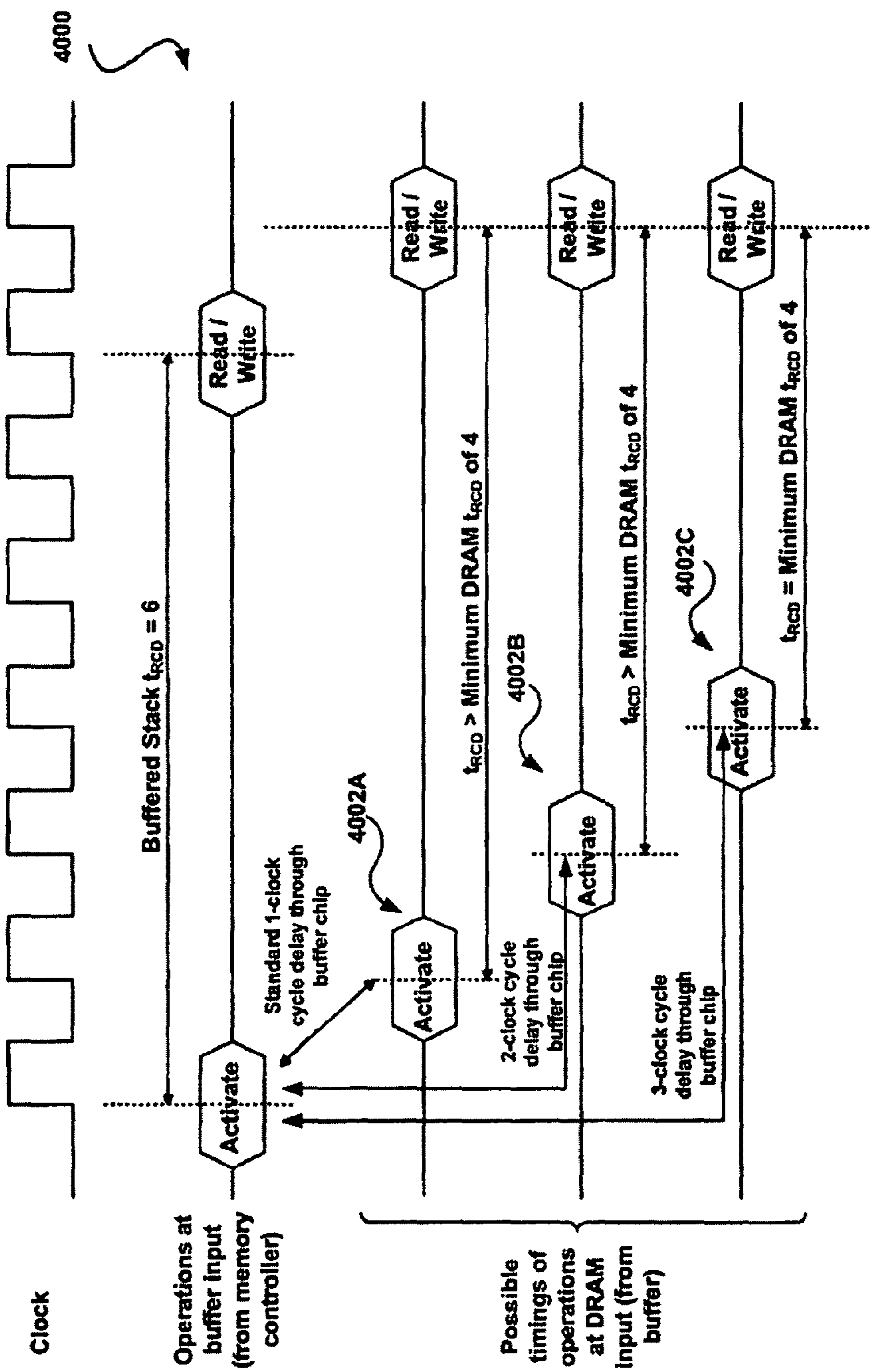
FIGS. 40A-B show variable delays of operations through a buffer chip, in accordance with another embodiment.
Figure 40B:
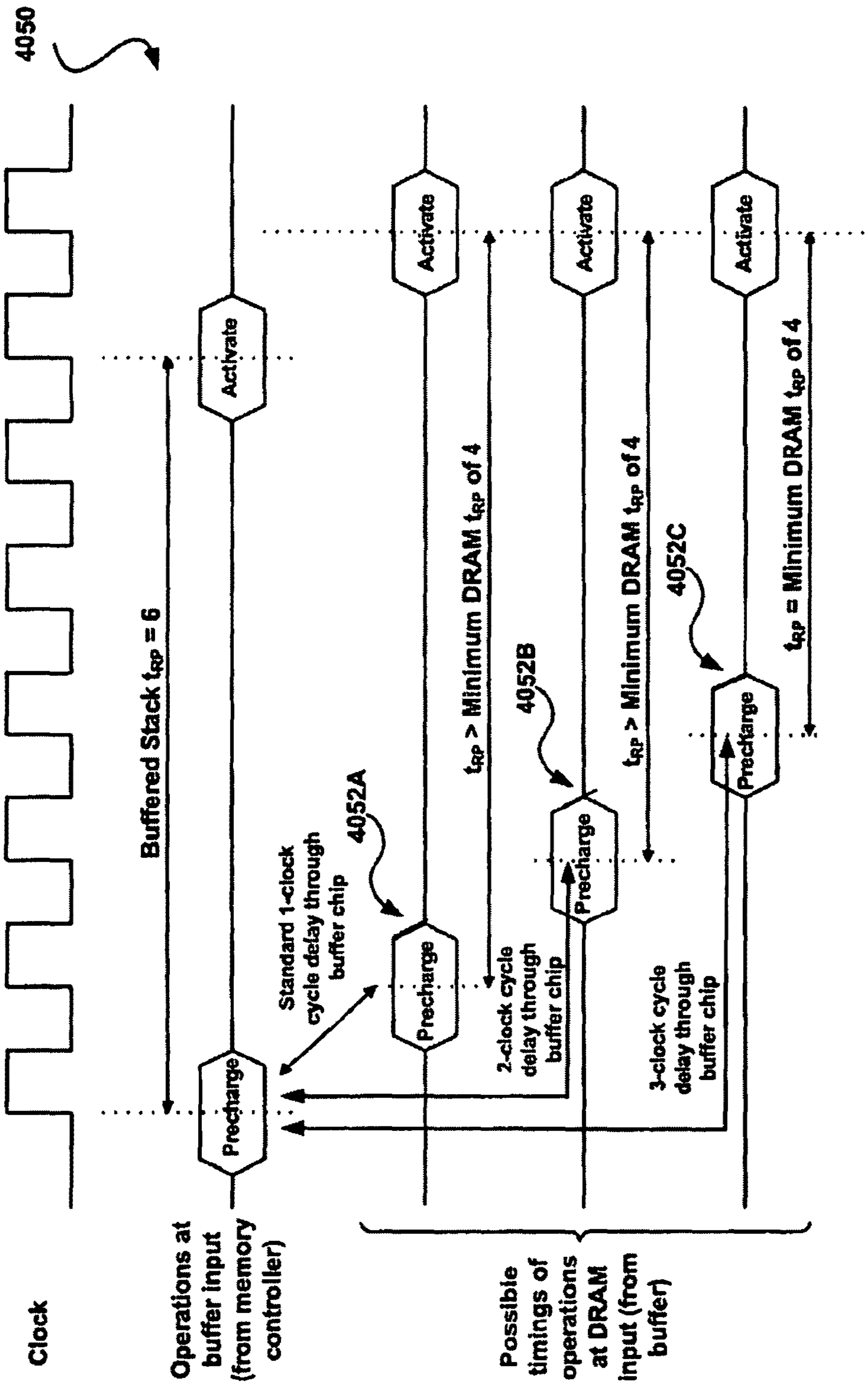

FIGS. 40A-B show variable delays 4000 and 4050 of operations through a buffer chip, in accordance with another embodiment. As an option, the variable delays 4000 and 4050 may be implemented in the context of the architecture and environment of FIGS. 32-39. Of course, however, the variable delays 4000 and 4050 may be carried out in any desired environment. It should also be noted that the aforementioned definitions may apply during the present description.

In order to prevent conflicts on an address bus between the buffer chip and its associated stack(s), either the write operation or the precharge/activate operation may be delayed. As shown, a buffer chip (e.g. see the buffer chip 3302 of FIGS. 33A-E, etc.) may delay the precharge/activate operations 4052A-C/4002A-C. In particular, the buffer chip may make the buffered stack appear as one or more larger capacity DRAM circuits that have longer tRCD (RAS to CAS delay) and tRP (i.e. precharge time) parameters.

For example, if the cumulative latency through a buffer chip is 2 clock cycles while the native read CAS latency of the DRAM circuits is 4 clock cycles, then in order to hide the delay of the address/control signals and the data signals through the buffer chip, the buffered stack may appear as one or more larger capacity DRAM circuits with a read CAS latency of 6 clock cycles to the memory controller. In addition, if the tRCD and tRP of the DRAM circuits is 4 clock cycles each, the buffered stack may appear as one or more larger capacity DRAM circuits with tRCD of 6 clock cycles and tRP of 6 clock cycles in order to allow a buffer chip (e.g., see the buffer chip 3302 of FIGS. 33A-E, etc.) to delay the activate and precharge operations in a manner that is transparent to the memory controller. Specifically, a buffered stack that uses 4-4-4 DRAM circuits (i.e. CAS latency=4, tRCD=4, tRP=4) may appear as one or at least one larger capacity DRAM circuits with 6-6-6 timing (i.e. CAS latency=6, tRCD=6, tRP=6).

Since the buffered stack appears to the memory controller as having a tRCD of 6 clock cycles, the memory controller may schedule a column operation to a bank 6 clock cycles after an activate (e.g. row) operation to the same bank. However, the DRAM circuits in the stack may actually have a tRCD of 4 clock cycles. Thus, the buffer chip may have the ability to delay the activate operation by up to 2 clock cycles in order to avoid any conflicts on the address bus between the buffer chip and the DRAM circuits in the stack while still ensuring correct read and write timing on the channel between the memory controller and the buffered stack.

As shown, the buffer chip may issue the activate operation to the DRAM circuits one, two, or three clock cycles after it receives the activate operation from the memory controller, register, or AMB. The actual delay of the activate operation through the buffer chip may depend on the presence or absence of other DRAM operations that may conflict with the activate operation, and may optionally change from one activate operation to another.

Similarly, since the buffered stack may appear to the memory controller as at least one larger capacity DRAM circuit with a tRP of 6 clock cycles, the memory controller may schedule a subsequent activate (e.g. row) operation to a bank a minimum of 6 clock cycles after issuing a precharge operation to that bank. However, since the DRAM circuits in the stack actually have a tRP of 4 clock cycles, the buffer chip may have the ability to delay issuing the precharge operation to the DRAM circuits in the stack by up to 2 clock cycles in order to avoid any conflicts on the address bus between the buffer chip and the DRAM circuits in the stack. In addition, even if there are no conflicts on the address bus, the buffer chip may still delay issuing a precharge operation in order to satisfy the tRAS requirement of the DRAM circuits.

In particular, if the activate operation to a bank was delayed to avoid an address bus conflict, then the precharge operation to the same bank may be delayed by the buffer chip to satisfy the tRAS requirement of the DRAM circuits. The buffer chip may issue the precharge operation to the DRAM circuits one, two, or three clock cycles after it receives the precharge operation from the memory controller, register, or AMB. The actual delay of the precharge operation through the buffer chip may depend on the presence or absence of address bus conflicts or tRAS violations, and may change from one precharge operation to another.

Figure 41:
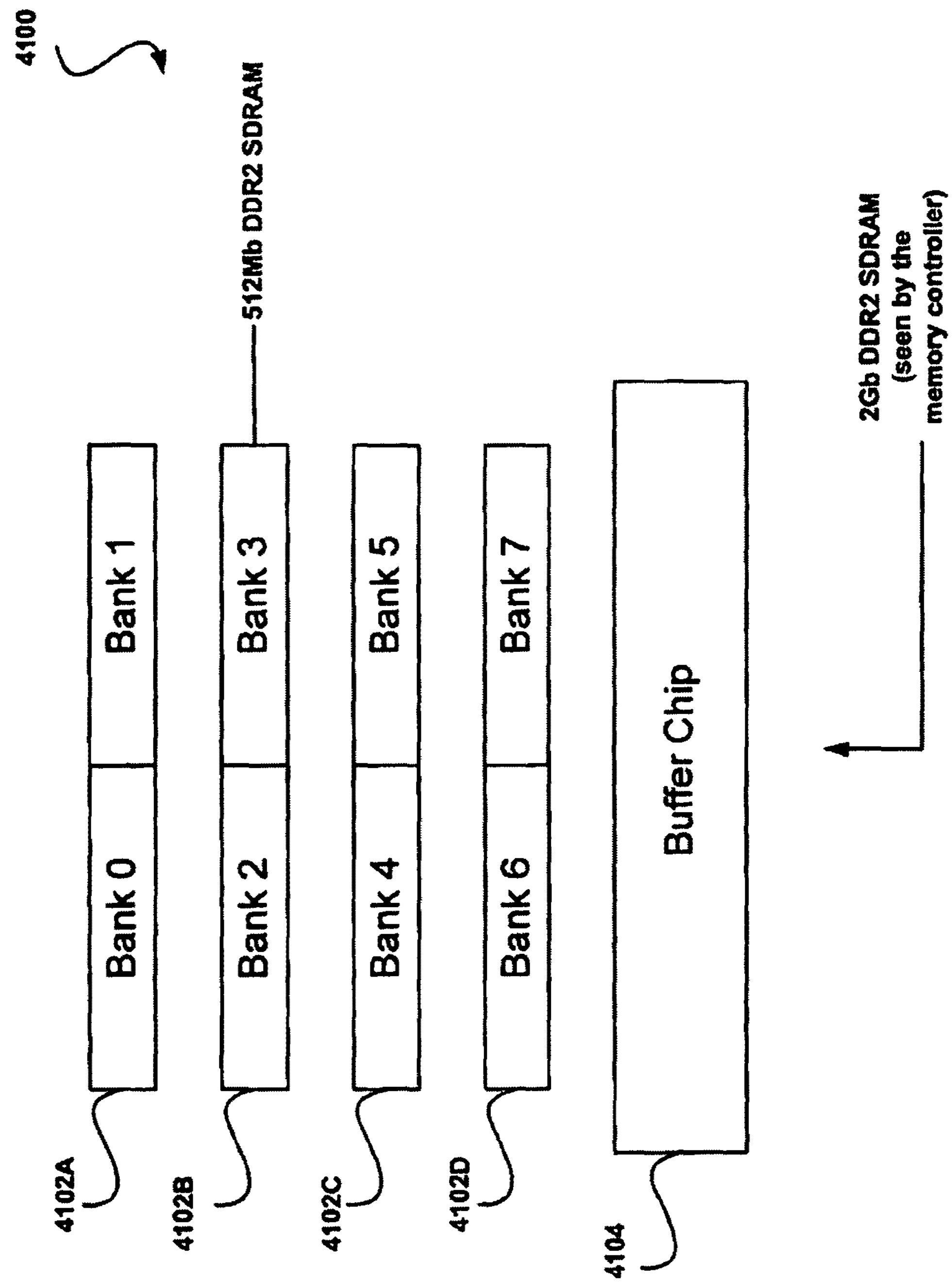
FIG. 41 shows a buffered stack of four 512 Mb DRAM circuits mapped to a single 2 Gb DRAM circuit, in accordance with yet another embodiment.

FIG. 41 shows a buffered stack 4100 of four 512 Mb DRAM circuits mapped to a single 2 Gb DRAM circuit, in accordance with yet another embodiment. As an option, the buffered stack 4100 may be implemented in the context of the architecture and environment of FIGS. 32-40. Of course, however, the buffered stack 4100 may be carried out in any desired environment. It should also be noted that the aforementioned definitions may apply during the present description.

The multiple DRAM circuits 4102A-D buffered in the stack by the buffer chip 4104 may appear as at least one larger capacity DRAM circuit to the memory controller. However, the combined power dissipation of such DRAM circuits 4102A-D may be much higher than the power dissipation of a monolithic DRAM of the same capacity. For example, the buffered stack may consist of four 512 Mb DDR2 SDRAM circuits that appear to the memory controller as a single 2 Gb DDR2 SDRAM circuit.

The power dissipation of all four DRAM circuits 4102A-D in the stack may be much higher than the power dissipation of a monolithic 2 Gb DDR2 SDRAM. As a result, a DIMM containing multiple buffered stacks may dissipate much more power than a standard DIMM built using monolithic DRAM circuits. This increased power dissipation may limit the widespread adoption of DIMMs that use buffered stacks.

Thus, a power management technique that reduces the power dissipation of DIMMs that contain buffered stacks of DRAM circuits may be utilized. Specifically, the DRAM circuits 4102A-D may be opportunistically placed in a precharge power down mode using the clock enable (CKE) pin of the DRAM circuits 4102A-D. For example, a single rank registered DIMM (R-DIMM) may contain a plurality of buffered stacks of DRAM circuits 4102A-D, where each stack consists of four ×4 512 Mb DDR2 SDRAM circuits 4102A-D and appears as a single ×4 2 Gb DDR2 SDRAM circuit to the memory controller. A 2 Gb DDR2 SDRAM may generally have eight banks as specified by JEDEC. Therefore, the buffer chip 4104 may map each 512 Mb DRAM circuit in the stack to two banks of the equivalent 2 Gb DRAM, as shown.

The memory controller of the host system may open and close pages in the banks of the DRAM circuits 4102A-D based on the memory requests it receives from the rest of the system. In various embodiments, no more than one page may be able to be open in a bank at any given time. For example, with respect to FIG. 41, since each DRAM circuit 4102A-D in the stack is mapped to two banks of the equivalent larger DRAM, at any given time a DRAM circuit 4102A-D may have two open pages, one open page, or no open pages. When a DRAM circuit 4102A-D has no open pages, the power management scheme may place that DRAM circuit 4102A-D in the precharge power down mode by de-asserting its CKE input.

The CKE inputs of the DRAM circuits 4102A-D in a stack may be controlled by the buffer chip 4104, by a chip on an R-DIMM, by an AMB on a FB-DIMM, or by the memory controller in order to implement the power management scheme described hereinabove. In one embodiment, this power management scheme may be particularly efficient when the memory controller implements a closed page policy.

Another optional power management scheme may include mapping a plurality of DRAM circuits to a single bank of the larger capacity DRAM seen by the memory controller. For example, a buffered stack of sixteen ×4 256 Mb DDR2 SDRAM circuits may appear to the memory controller as a single ×4 4 Gb DDR2 SDRAM circuit. Since a 4 Gb DDR2 SDRAM circuit is specified by JEDEC to have eight banks, each bank of the 4 Gb DDR2 SDRAM circuit may be 512 Mb. Thus, two of the 256 Mb DDR2 SDRAM circuits may be mapped by the buffer chip 4104 to a single bank of the equivalent 4 Gb DDR2 SDRAM circuit seen by the memory controller.

In this way, bank 0 of the 4 Gb DDR2 SDRAM circuit may be mapped by the buffer chip to two 256 Mb DDR2 SDRAM circuits (e.g. DRAM A and DRAM B) in the stack. However, since only one page can be open in a bank at any given time, only one of DRAM A or DRAM B may be in the active state at any given time. If the memory controller opens a page in DRAM A, then DRAM B may be placed in the precharge power down mode by de-asserting its CKE input. As another option, if the memory controller opens a page in DRAM B, DRAM A may be placed in the precharge power down mode by de-asserting its CKE input. This technique may ensure that if p DRAM circuits are mapped to a bank of the larger capacity DRAM circuit seen by the memory controller, then p−1 of the p DRAM circuits may continuously (e.g. always, etc.) be subjected to a power saving operation. The power saving operation may, for example, comprise operating in precharge power down mode except when refresh is required. Of course, power-savings may also occur in other embodiments without such continuity.

Figure 42:
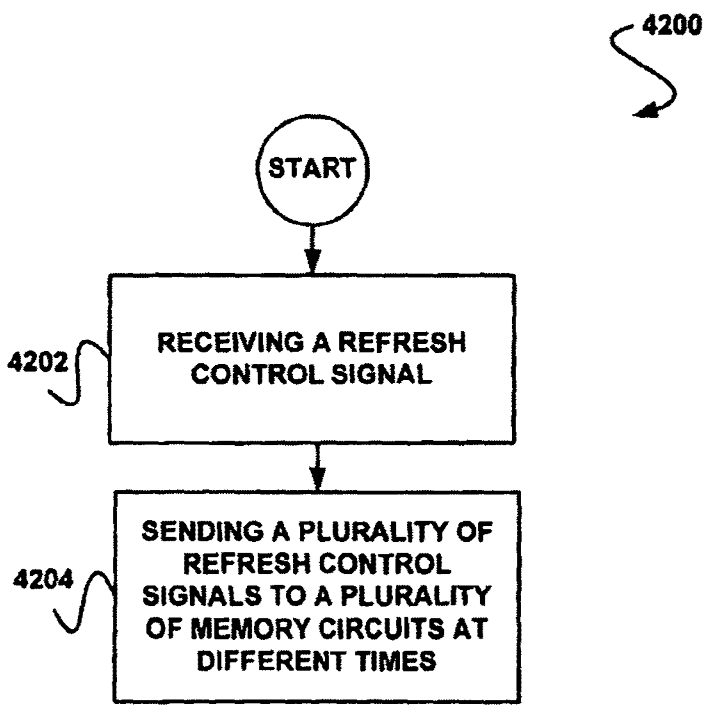
FIG. 42 illustrates a method for refreshing a plurality of memory circuits, in accordance with still yet another embodiment.

FIG. 42 illustrates a method 4200 for refreshing a plurality of memory circuits, in accordance with still yet another embodiment. As an option, the method 4200 may be implemented in the context of the architecture and environment of any one or more of FIGS. 32-41. For example, the method 4200 may be carried out by the interface circuit 3202 of FIG. 32. Of course, however, the method 4200 may be carried out in any desired environment. It should also be noted that the aforementioned definitions may apply during the present description.

As shown, a refresh control signal is received in operation 4202. In one optional embodiment, such refresh control signal may, for example, be received from a memory controller, where such memory controller intends to refresh a simulated memory circuit(s).

In response to the receipt of such refresh control signal, a plurality of refresh control signals are sent to a plurality of the memory circuits (e.g. see the memory circuits 3204A, 3204B, 3204N of FIG. 32, etc.), at different times. See operation 4204. Such refresh control signals may or may not each include the refresh control signal of operation 4202 or an instantiation/copy thereof. Of course, in other embodiments, the refresh control signals may each include refresh control signals that are different in at least one aspect (e.g. format, content, etc.).

During use of still additional embodiments, at least one first refresh control signal may be sent to a first subset (e.g. of one or more) of the memory circuits at a first time and at least one second refresh control signal may be sent to a second subset (e.g. of one or more) of the memory circuits at a second time. Thus, in some embodiments, a single refresh control signal may be sent to a plurality of the memory circuits (e.g. a group of memory circuits, etc.). Further, a plurality of the refresh control signals may be sent to a plurality of the memory circuits. To this end, refresh control signals may be sent individually or to groups of memory circuits, as desired.

Thus, in still yet additional embodiments, the refresh control signals may be sent after a delay in accordance with a particular timing. In one embodiment, for example, the timing in which the refresh control signals are sent to the memory circuits may be selected to minimize a current draw. This may be accomplished in various embodiments by staggering a plurality of refresh control signals. In still other embodiments, the timing in which the refresh control signals are sent to the memory circuits may be selected to comply with a tRFC parameter associated with each of the memory circuits.

To this end, in the context of an example involving a plurality of DRAM circuits (e.g. see the embodiments of FIGS. 32-33E, etc.), DRAM circuits of any desired size may receive periodic refresh operations to maintain the integrity of data therein. A memory controller may initiate refresh operations by issuing refresh control signals to the DRAM circuits with sufficient frequency to prevent any loss of data in the DRAM circuits. After a refresh control signal is issued to a DRAM circuit, a minimum time (e.g. denoted by tRFC) may be required to elapse before another control signal may be issued to that DRAM circuit. The tRFC parameter may therefore increase as the size of the DRAM circuit increases.

When the buffer chip receives a refresh control signal from the memory controller, it may refresh the smaller DRAM circuits within the span of time specified by the tRFC associated with the emulated DRAM circuit. Since the tRFC of the emulated DRAM circuits is larger than that of the smaller DRAM circuits, it may not be necessary to issue refresh control signals to all of the smaller DRAM circuits simultaneously. Refresh control signals may be issued separately to individual DRAM circuits or may be issued to groups of DRAM circuits, provided that the tRFC requirement of the smaller DRAM circuits is satisfied by the time the tRFC of the emulated DRAM circuits has elapsed. In use, the refreshes may be spaced to minimize the peak current draw of the combination buffer chip and DRAM circuit set during a refresh operation.

While various embodiments have been described above, it should be understood that they have been presented by way of example only, and not limitation. For example, any of the network elements may employ any of the desired functionality set forth hereinabove. Thus, the breadth and scope of a preferred embodiment should not be limited by any of the above-described exemplary embodiments, but should be defined only in accordance with the following claims and their equivalents.

Latency Management

Figure 43:
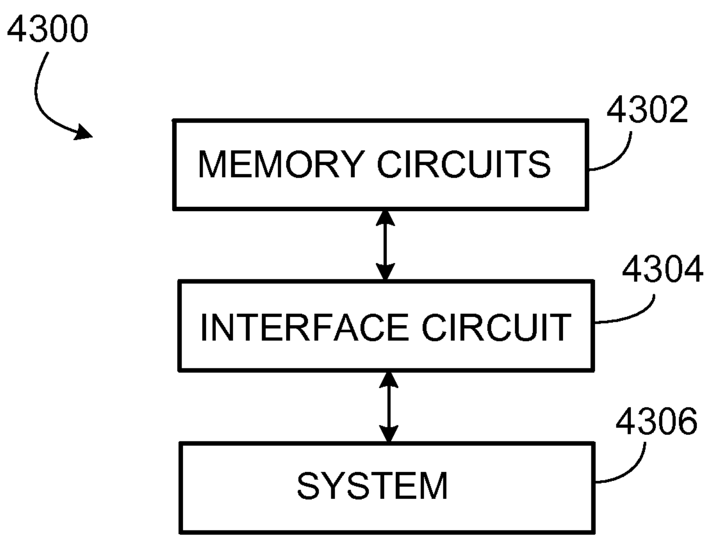
FIG. 43 illustrates a system for interfacing memory circuits, in accordance with one embodiment.

FIG. 43 illustrates a system 4300 for interfacing memory circuits, in accordance with one embodiment. As shown, the system 4300 includes an interface circuit 4304 in communication with a plurality of memory circuits 4302 and a system 4306. In the context of the present description, such memory circuits 4302 may include any circuits capable of serving as memory.

For example, in various embodiments, at least one of the memory circuits 4302 may include a monolithic memory circuit, a semiconductor die, a chip, a packaged memory circuit, or any other type of tangible memory circuit. In one embodiment, the memory circuits 4302 may take the form of dynamic random access memory (DRAM) circuits. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 4302 may include magnetic random access memory (MRAM), intelligent random access memory (IRAM), distributed network architecture (DNA) memory, window random access memory (WRAM), flash memory (e.g. NAND, NOR, etc.) pseutostatic random access memory (PSRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 4302 may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a MiniDIMM, a very low profile (VLP) R-DIMM, etc. In other embodiments, the memory circuits 4302 may or may not be positioned on any type of material forming a substrate, card, module, sheet, fabric, board, carrier or any other type of solid or flexible entity, form, or object. Of course, in yet other embodiments, the memory circuits 4302 may or may not be positioned in or on any desired entity, form, or object for packaging purposes. Still yet, the memory circuits 4302 may or may not be organized into ranks. Such ranks may refer to any arrangement of such memory circuits 4302 on any of the foregoing entities, forms, objects, etc.

Further, in the context of the present description, the system 4306 may include any system capable of requesting and/or initiating a process that results in an access of the memory circuits 4302. As an option, the system 4306 may accomplish this utilizing a memory controller (not shown), or any other desired mechanism. In one embodiment, such system 4306 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 4304 may, in the context of the present description, refer to any circuit capable of interfacing (e.g. communicating, buffering, etc.) with the memory circuits 4302 and the system 4306. For example, the interface circuit 4304 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 4302 and the system 4306. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 4304 may include one or more circuits, such as a buffer (e.g. buffer chip, etc.), a register (e.g. register chip, etc.), an advanced memory buffer (AMB) (e.g. AMB chip, etc.), a component positioned on at least one DIMM, a memory controller, etc. Moreover, the register may, in various embodiments, include a JEDEC Solid State Technology Association (known as JEDEC) standard register (a JEDEC register), a register with forwarding, storing, and/or buffering capabilities, etc. In various embodiments, the register chips, buffer chips, and/or any other interface circuit 4304 may be intelligent, that is, include logic that is capable of one or more functions such as gathering and/or storing information, inferring, predicting, and/or storing state and/or status; performing logical decisions; and/or performing operations on input signals, etc. In still other embodiments, the interface circuit 4304 may optionally be manufactured in monolithic form, packaged form, printed form, and/or any other manufactured form of circuit, for that matter. Furthermore, in another embodiment, the interface circuit 4304 may be positioned on a DIMM.

In still yet another embodiment, a plurality of the aforementioned interface circuit 4304 may serve, in combination, to interface the memory circuits 4302 and the system 4306. Thus, in various embodiments, one, two, three, four, or more interface circuits 4304 may be utilized for such interfacing purposes. In addition, multiple interface circuits 4304 may be relatively configured or connected in any desired manner. For example, the interface circuits 4304 may be configured or connected in parallel, serially, or in various combinations thereof. The multiple interface circuits 4304 may use direct connections to each other, indirect connections to each other, or even a combination thereof. Furthermore, any number of the interface circuits 4304 may be allocated to any number of the memory circuits 4302. In various other embodiments, each of the plurality of interface circuits 4304 may be the same or different. Even still, the interface circuits 4304 may share the same or similar interface tasks and/or perform different interface tasks.

While the memory circuits 4302, interface circuit 4304, and system 4306 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 4304 (or portion(s) thereof) may be packaged with at least one of the memory circuits 4302. In this way, the interface circuit 4304 and the memory circuits 4302 may take the form of a stack, in one embodiment.

For example, a DRAM stack may or may not include at least one interface circuit 4304 (or portion(s) thereof). In other embodiments, different numbers of the interface circuit 4304 (or portion(s) thereof) may be packaged together. Such different packaging arrangements, when employed, may optionally improve the utilization of a monolithic silicon implementation, for example.

The interface circuit 4304 may be capable of various functionality, in the context of different optional embodiments. Just by way of example, the interface circuit 4304 may or may not be operable to interface a first number of memory circuits 4302 and the system 4306 for simulating a second number of memory circuits to the system 4306. The first number of memory circuits 4302 shall hereafter be referred to, where appropriate for clarification purposes, as the "physical" memory circuits 4302 or memory circuits, but are not limited to be so. Just by way of example, the physical memory circuits 4302 may include a single physical memory circuit. Further, the at least one simulated memory circuit seen by the system 4306 shall hereafter be referred to, where appropriate for clarification purposes, as the at least one "virtual" memory circuit.

In still additional aspects of the present embodiment, the second number of virtual memory circuits may be more than, equal to, or less than the first number of physical memory circuits 4302. Just by way of example, the second number of virtual memory circuits may include a single memory circuit. Of course, however, any number of memory circuits may be simulated.

In the context of the present description, the term simulated may refer to any simulating, emulating, disguising, transforming, modifying, changing, altering, shaping, converting, etc., which results in at least one aspect of the memory circuits 4302 appearing different to the system 4306. In different embodiments, such aspect may include, for example, a number, a signal, a memory capacity, a timing, a latency, a design parameter, a logical interface, a control system, a property, a behavior, and/or any other aspect, for that matter.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

More illustrative information will now be set forth regarding various optional architectures and uses in which the foregoing system may or may not be implemented, per the desires of the user. It should be strongly noted that the following information is set forth for illustrative purposes and should not be construed as limiting in any manner. Any of the following features may be optionally incorporated with or without the exclusion of other features described.

Figure 44:
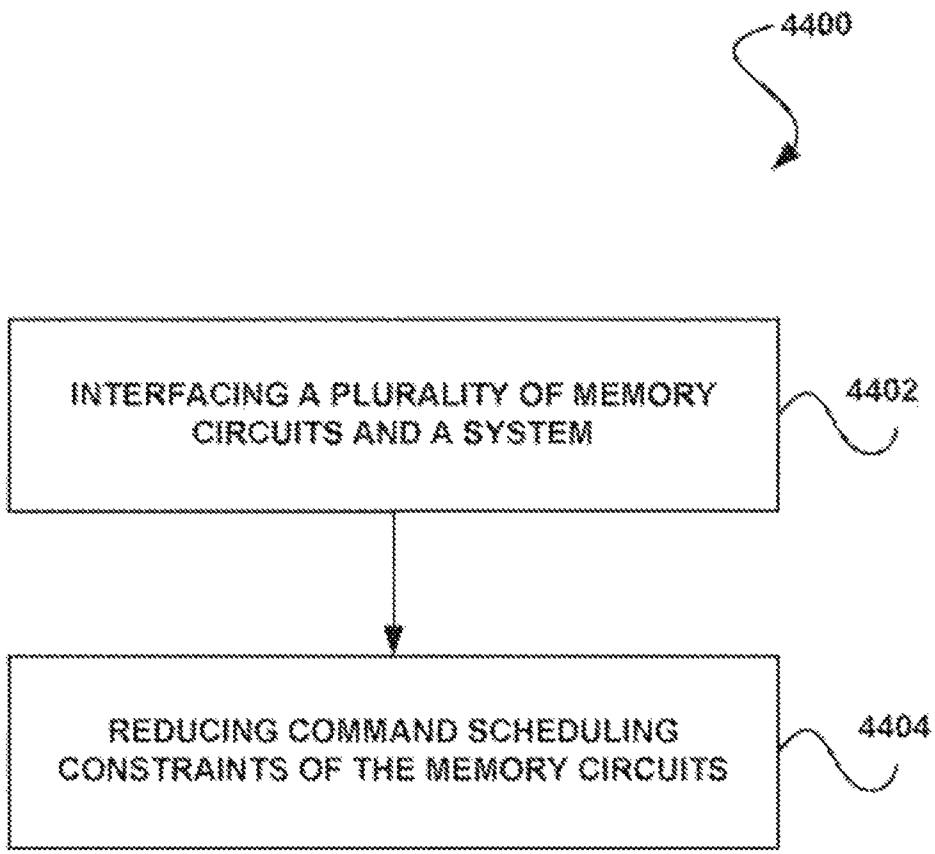
FIG. 44 illustrates a method for reducing command scheduling constraints of memory circuits, in accordance with another embodiment.

FIG. 44 illustrates a method 4400 for reducing command scheduling constraints of memory circuits, in accordance with another embodiment. As an option, the method 4400 may be implemented in the context of the system 4300 of FIG. 43. Of course, however, the method 4400 may be implemented in any desired environment. Further, the aforementioned definitions may equally apply to the description below.

As shown in operation 4402, a plurality of memory circuits and a system are interfaced. In one embodiment, the memory circuits and system may be interfaced utilizing an interface circuit. The interface circuit may include, for example, the interface circuit described above with respect to FIG. 43. In addition, in one embodiment, the interfacing may include facilitating communication between the memory circuits and the system. Of course, however, the memory circuits and system may be interfaced in any desired manner.

Further, command scheduling constraints of the memory circuits are reduced, as shown in operation 4404. In the context of the present description, the command scheduling constraints include any limitations associated with scheduling (and/or issuing) commands with respect to the memory circuits. Optionally, the command scheduling constraints may be defined by manufacturers in their memory device data sheets, by standards organizations such as the JEDEC, etc.

In one embodiment, the command scheduling constraints may include intra-device command scheduling constraints. Such intra-device command scheduling constraints may include scheduling constraints within a device. For example, the intra-device command scheduling constraints may include a column-to-column delay time (tCCD), row-to-row activation delay time (tRRD), four-bank activation window time (tFAW), write-to-read turn-around time (tWTR), etc. As an option, the intra-device command-scheduling constraints may be associated with parts (e.g. column, row, bank, etc.) of a device (e.g. memory circuit) that share a resource within the memory circuit. One example of such intra-device command scheduling constraints will be described in more detail below with respect to FIG. 47 during the description of a different embodiment.

In another embodiment, the command scheduling constraints may include inter-device command scheduling constraints. Such inter-device scheduling constraints may include scheduling constraints between memory circuits. Just by way of example, the inter-device command scheduling constraints may include rank-to-rank data bus turnaround times, on-die-termination (ODT) control switching times, etc. Optionally, the inter-device command scheduling constraints may be associated with memory circuits that share a resource (e.g. a data bus, etc.) which provides a connection therebetween (e.g. for communicating, etc.). One example of such inter-device command scheduling constraints will be described in more detail below with respect to FIG. 48 during the description of a different embodiment.

Further, reduction of the command scheduling restraints may include complete elimination and/or any decrease thereof. Still yet, in one optional embodiment, the command scheduling constraints may be reduced by controlling the manner in which commands are issued to the memory circuits. Such commands may include, for example, row-access commands, column-access commands, etc. Moreover, in additional embodiments, the commands may optionally be issued to the memory circuits utilizing separate buses associated therewith. One example of memory circuits associated with separate buses will be described in more detail below with respect to FIG. 50 during the description of a different embodiment.

In one possible embodiment, the command scheduling constraints may be reduced by issuing commands to the memory circuits based on simulation of a virtual memory circuit. For example, the plurality of physical memory circuits and the system may be interfaced such that the memory circuits appear to the system as a virtual memory circuit. Such simulated virtual memory circuit may optionally include the virtual memory circuit described above with respect to FIG. 43.

In addition, the virtual memory circuit may have less command scheduling constraints than the physical memory circuits. For example, in one exemplary embodiment, the physical memory circuits may appear as a group of one or more virtual memory circuits that are free from command scheduling constraints. Thus, as an option, the command scheduling constraints may be reduced by issuing commands directed to a single virtual memory circuit, to a plurality of different physical memory circuits. In this way, idle data-bus cycles may optionally be eliminated and memory system bandwidth may be increased.

Of course, it should be noted that the command scheduling constraints may be reduced in any desired manner. Accordingly, in one embodiment, the interface circuit may be utilized to eliminate, at least in part, inter-device and/or intra-device command scheduling constraints of memory circuits. Furthermore, reduction of the command scheduling constraints of the memory circuits may result in increased command issue rates. For example, a greater amount of commands may be issued to the memory circuits by reducing limitations associated with the command scheduling constraints. More information regarding increasing command issue rates by reducing command scheduling constraints will be described with respect to FIG. 53 during the description of a different embodiment.

Figure 45:
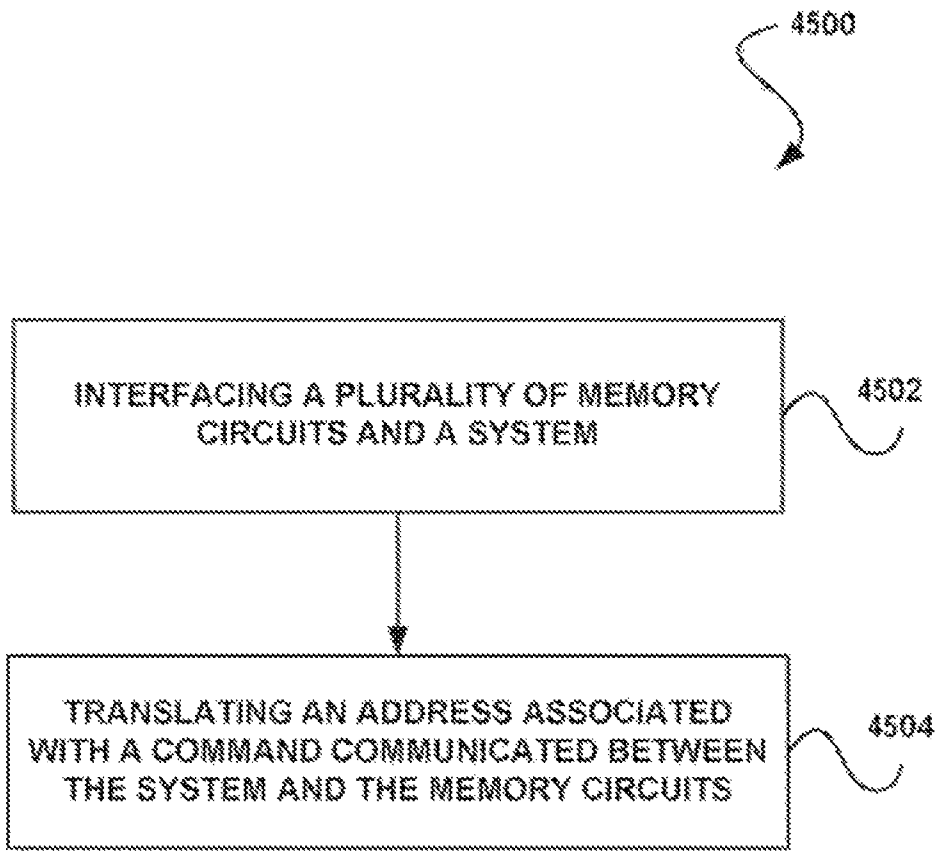
FIG. 45 illustrates a method for translating an address associated with a command communicated between a system and memory circuits, in accordance with yet another embodiment.

FIG. 45 illustrates a method 4500 for translating an address associated with a command communicated between a system and memory circuits, in accordance with yet another embodiment. As an option, the method 4500 may be carried out in context of the architecture and environment of FIGS. 43 and/or 44. Of course, the method 4500 may be carried out in any desired environment. Further, the aforementioned definitions may equally apply to the description below.

As shown in operation 4502, a plurality of memory circuits and a system are interfaced. In one embodiment, the memory circuits and system may be interfaced utilizing an interface circuit, such as that described above with respect to FIG. 43, for example. In one embodiment, the interfacing may include facilitating communication between the memory circuits and the system. Of course, however, the memory circuits and system may be interfaced in any desired manner.

Additionally, an address associated with a command communicated between the system and the memory circuits is translated, as shown in operation 4504. Such command may include, for example, a row-access command, a column-access command, and/or any other command capable of being communicated between the system and the memory circuits. As an option, the translation may be transparent to the system. In this way, the system may issue a command to the memory circuits, and such command may be translated without knowledge and/or input by the system. Of course, embodiments are contemplated where such transparency is non-existent, at least in part.

Further, the address may be translated in any desired manner. In one embodiment, the translation of the address may include shifting the address. In another embodiment, the address may be translated by mapping the address. Optionally, as described above with respect to FIGS. 43 and/or 44, the memory circuits may include physical memory circuits and the interface circuit may simulate at least one virtual memory circuit. To this end, the virtual memory circuit may optionally have a different (e.g. greater, etc.) number of row addresses associated therewith than the physical memory circuits.

Thus, in one possible embodiment, the translation may be performed as a function of the difference in the number of row addresses. For example, the translation may translate the address to reflect the number of row addresses of the virtual memory circuit. In still yet another embodiment, the translation may optionally translate the address as a function of a column address and a row address.

Thus, in one exemplary embodiment where the command includes a row-access command, the translation may be performed as a function of an expected arrival time of a column-access command. In another exemplary embodiment, where the command includes a row-access command, the translation may ensure that a column-access command addresses an open bank. Optionally, the interface circuit may be operable to delay the command communicated between the system and the memory circuits. To this end, the translation may result in sub-row activation of the memory circuits. Various examples of address translation will be described in more detail below with respect to FIGS. 50 and 12 during the description of different embodiments.

Accordingly, in one embodiment, address mapping may use shifting of an address from one command to another to allow the use of memory circuits with smaller rows to emulate a larger memory circuit with larger rows. Thus, sub-row activation may be provided. Such sub-row activation may also reduce power consumption and may optionally further improve performance, in various embodiments.

One exemplary embodiment will now be set forth. It should be strongly noted that the following example is set forth for illustrative purposes only and should not be construed as limiting in any manner whatsoever. Specifically, memory storage cells of DRAM devices may be arranged into multiple banks, each bank having multiple rows, and each row having multiple columns. The memory storage capacity of the DRAM device may be equal to the number of banks times the number of rows per bank times the number of column per row times the number of storage bits per column. In commodity DRAM devices (e.g. SDRAM, DDR, DDR2, DDR3, DDR4, GDDR2, GDDR3 and GDDR4 and SDRAM, etc.), the number of banks per device, the number of rows per bank, the number of columns per row, and the column sizes may be determined by a standards-forming committee, such as the Joint Electron Device Engineering Council (JEDEC).

For example, JEDEC standards require that a 1 gigabyte (Gb) DDR2 or DDR3 SDRAM device with a four-bit wide data bus have eight banks per device, 8192 rows per bank, 2048 columns per row, and four bits per column. Similarly, a 2 Gb device with a four-bit wide data bus has eight banks per device, 16384 rows per bank, 2048 columns per row, and four bits per column. A 4 Gb device with a four-bit wide data bus has eight banks per device, 32768 rows per bank, 2048 columns per row, and four bits per column. In the 1 Gb, 2 Gb and 4 Gb devices, the row size is constant, and the number of rows doubles with each doubling of device capacity. Thus, a 2 Gb or a 4 Gb device may be simulated, as described above, by using multiple 1 Gb and 2 Gb devices, and by directly translating row-activation commands to row-activation commands and column-access commands to column-access commands. In one embodiment, this emulation may be possible because the 1 Gb, 2 Gb, and 4 Gb devices have the same row size.

Figure 46:
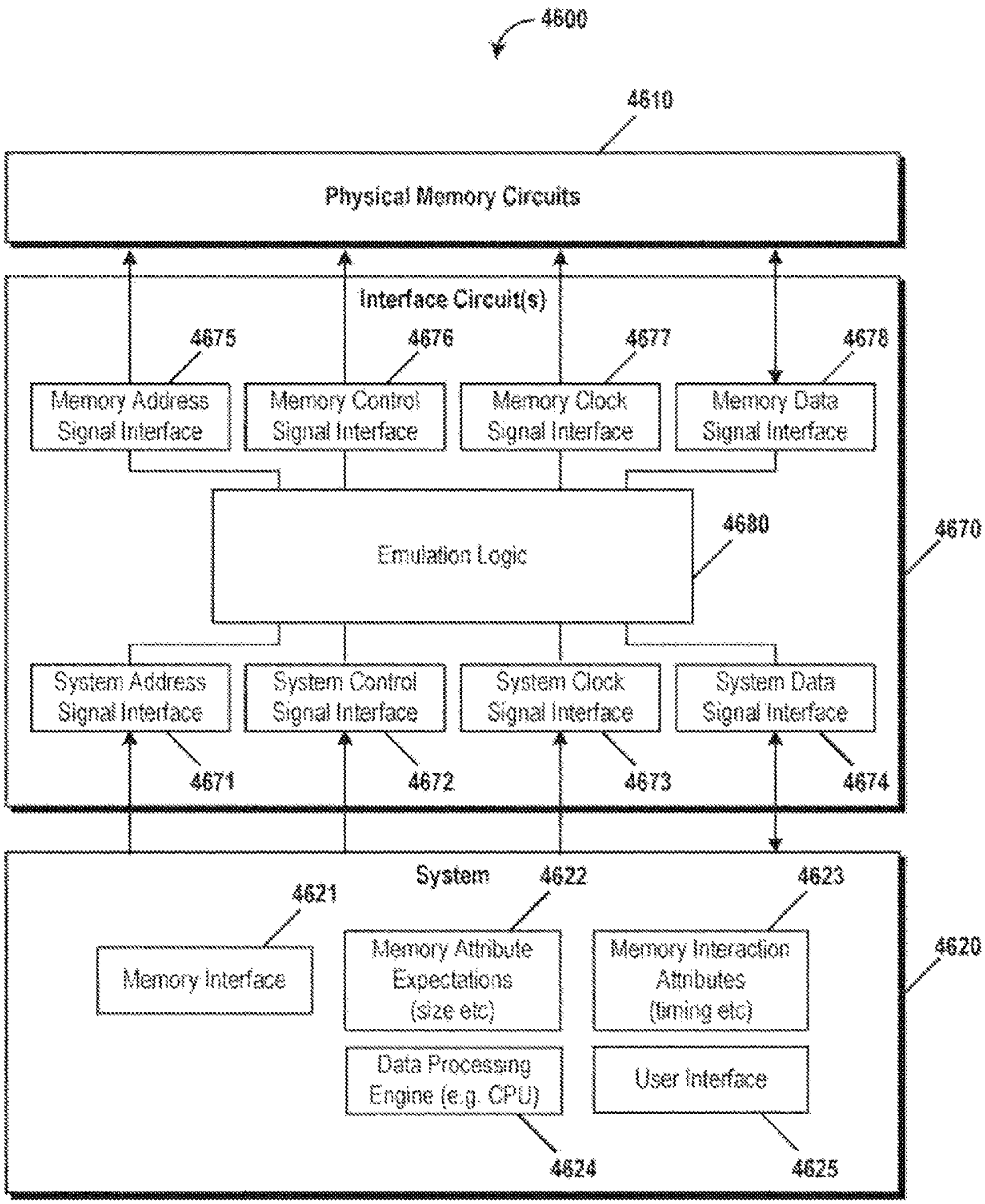
FIG. 46 illustrates a block diagram including logical components of a computer platform, in accordance with another embodiment.

FIG. 46 illustrates a block diagram including logical components of a computer platform 400, in accordance with another embodiment. As an option, the computer platform 4600 may be implemented in context of the architecture and environment of FIGS. 43-45. Of course, the computer platform 4600 may be implemented in any desired environment. Further, the aforementioned definitions may equally apply to the description below.

As shown, the computer platform 4600 includes a system 4620. The system 4620 includes a memory interface 4621, logic for retrieval and storage of external memory attribute expectations 4622, memory interaction attributes 4623, a data processing engine 4624, and various mechanisms to facilitate a user interface 4625. The computer platform 4600 may be comprised of wholly separate components, namely a system 4620 (e.g. a motherboard, etc.), and memory circuits 4610 (e.g. physical memory circuits, etc.). In addition, the computer platform 4600 may optionally include memory circuits 4610 connected directly to the system 4620 by way of one or more sockets.

In one embodiment, the memory circuits 4610 may be designed to the specifics of various standards, including for example, a standard defining the memory circuits 4610 to be JEDEC-compliant semiconductor memory (e.g. DRAM, SDRAM, DDR2, DDR3, etc.). The specifics of such standards may address physical interconnection and logical capabilities of the memory circuits 4610.

In another embodiment, the system 4620 may include a system BIOS program (not shown) capable of interrogating the physical memory circuits 4610 (e.g. DIMMs) to retrieve and store memory attributes 4622, 4623. Further, various types of external memory circuits 4610, including for example JEDEC-compliant DIMMs, may include an EEPROM device known as a serial presence detect (SPD) where the DIMM memory attributes are stored. The interaction of the BIOS with the SPD and the interaction of the BIOS with the memory circuit physical attributes may allow the system memory attribute expectations 4622 and memory interaction attributes 4623 become known to the system 4620.

In various embodiments, the computer platform 4600 may include one or more interface circuits 4670 electrically disposed between the system 4620 and the physical memory circuits 4610. The interface circuit 4670 may include several system-facing interfaces (e.g. a system address signal interface 4671, a system control signal interface 4672, a system clock signal interface 4673, a system data signal interface 4674, etc.). Similarly, the interface circuit 4670 may include several memory-facing interfaces (e.g. a memory address signal interface 4675, a memory control signal interface 4676, a memory clock signal interface 4677, a memory data signal interface 4678, etc.).

Still yet, the interface circuit 4670 may include emulation logic 4680. The emulation logic 4680 may be operable to receive and optionally store electrical signals (e.g. logic levels, commands, signals, protocol sequences, communications, etc.) from or through the system-facing interfaces, and may further be operable to process such electrical signals. The emulation logic 4680 may respond to signals from system-facing interfaces by responding back to the system 4620 and presenting signals to the system 4620, and may also process the signals with other information previously stored. As another option, the emulation logic 4680 may present signals to the physical memory circuits 4610. Of course, however, the emulation logic 4680 may perform any of the aforementioned functions in any order.

Moreover, the emulation logic 4680 may be operable to adopt a personality, where such personality is capable of defining the physical memory circuit attributes. In various embodiments, the personality may be affected via any combination of bonding options, strapping, programmable strapping, the wiring between the interface circuit 4670 and the physical memory circuits 4610. Further, the personality may be effected via actual physical attributes (e.g. value of mode register, value of extended mode register) of the physical memory circuits 4610 connected to the interface circuit 4670 as determined when the interface circuit 4670 and physical memory circuits 4610 are powered up.

Figure 47:
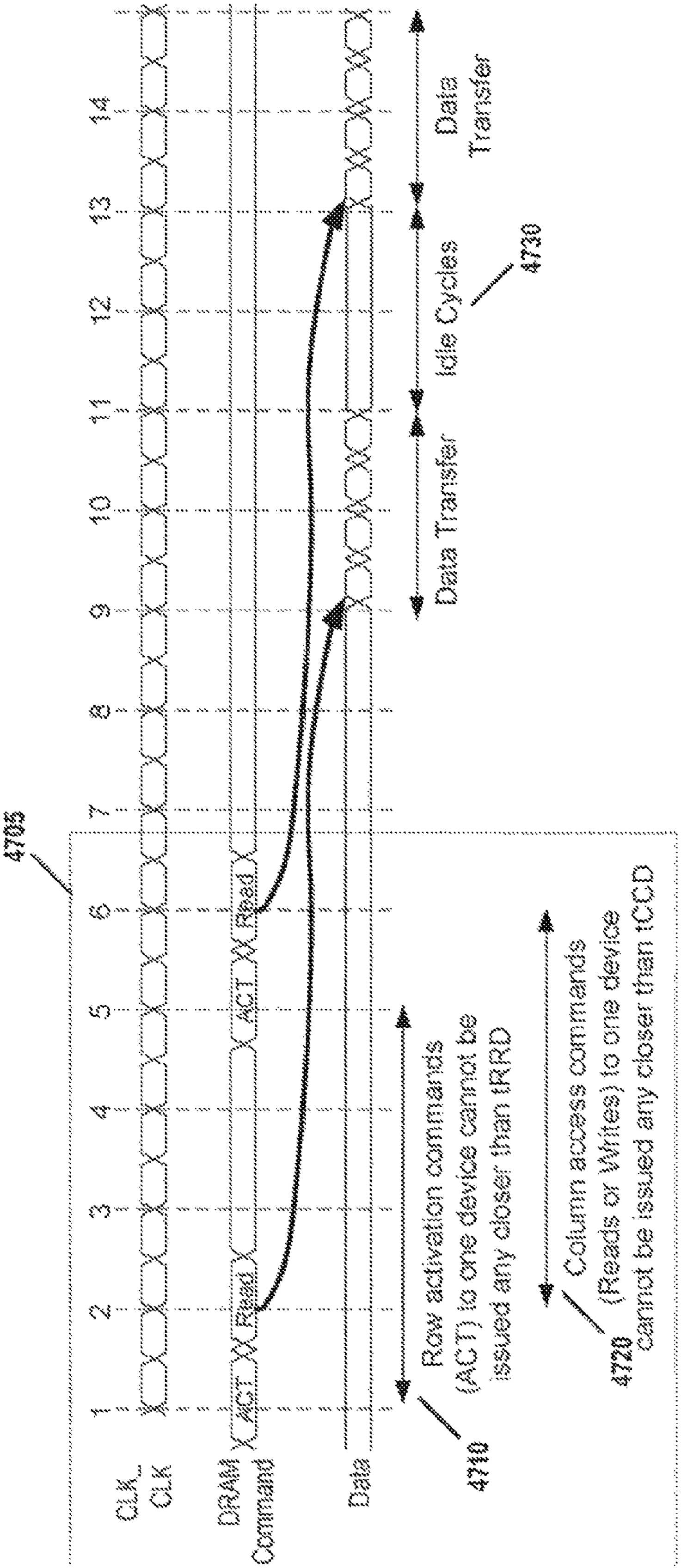
FIG. 47 illustrates a timing diagram showing an intra-device command sequence, intra-device timing constraints, and resulting idle cycles that prevent full use of bandwidth utilization in a DDR3 SDRAM memory system, in accordance with yet another embodiment.

FIG. 47 illustrates a timing diagram 4700 showing an intra-device command sequence, intra-device timing constraints, and resulting idle cycles that prevent full use of bandwidth utilization in a DDR3 SDRAM memory system, in accordance with yet another embodiment. As an option, the timing diagram 4700 may be associated with the architecture and environment of FIGS. 43-46. Of course, the timing diagram 4700 may be associated with any desired environment. Further, the aforementioned definitions may equally apply to the description below.

As shown, the timing diagram 4700 illustrates command cycles, timing constraints and idle cycles of memory. For example, in an embodiment involving DDR3 SDRAM memory systems, any two row-access commands directed to a single DRAM device may not necessarily be scheduled closer than tRRD. As another example, at most four row-access commands may be scheduled within tFAW to a single DRAM device. Moreover, consecutive column-read access commands and consecutive column-write access commands may not necessarily be scheduled to a given DRAM device any closer than tCCD, where tCCD equals four cycles (eight half-cycles of data) in DDR3 DRAM devices.

In the context of the present embodiment, row-access and/or row-activation commands are shown as ACT. In addition, column-access commands are shown as READ or WRITE. Thus, for example, in memory systems that require a data access in a data burst of four half-cycles, as shown in FIG. 44, the tCCD constraint may prevent column accesses from being scheduled consecutively. Further, the constraints 4710, 4720 imposed on the DRAM commands sent to a given DRAM device may restrict the command rate, resulting in idle cycles or bubbles 4730 on the data bus, therefore reducing the bandwidth.

In another optional embodiment involving DDR3 SDRAM memory systems, consecutive column-access commands sent to different DRAM devices on the same data bus may not necessarily be scheduled any closer than a period that is the sum of the data burst duration plus additional idle cycles due to rank-to-rank data bus turn-around times. In the case of column-read access commands, two DRAM devices on the same data bus may represent two bus masters. Optionally, at least one idle cycle on the bus may be needed for one bus master to complete delivery of data to the memory controller and release control of the shared data bus, such that another bus master may gain control of the data bus and begin to send data.

Figure 48:
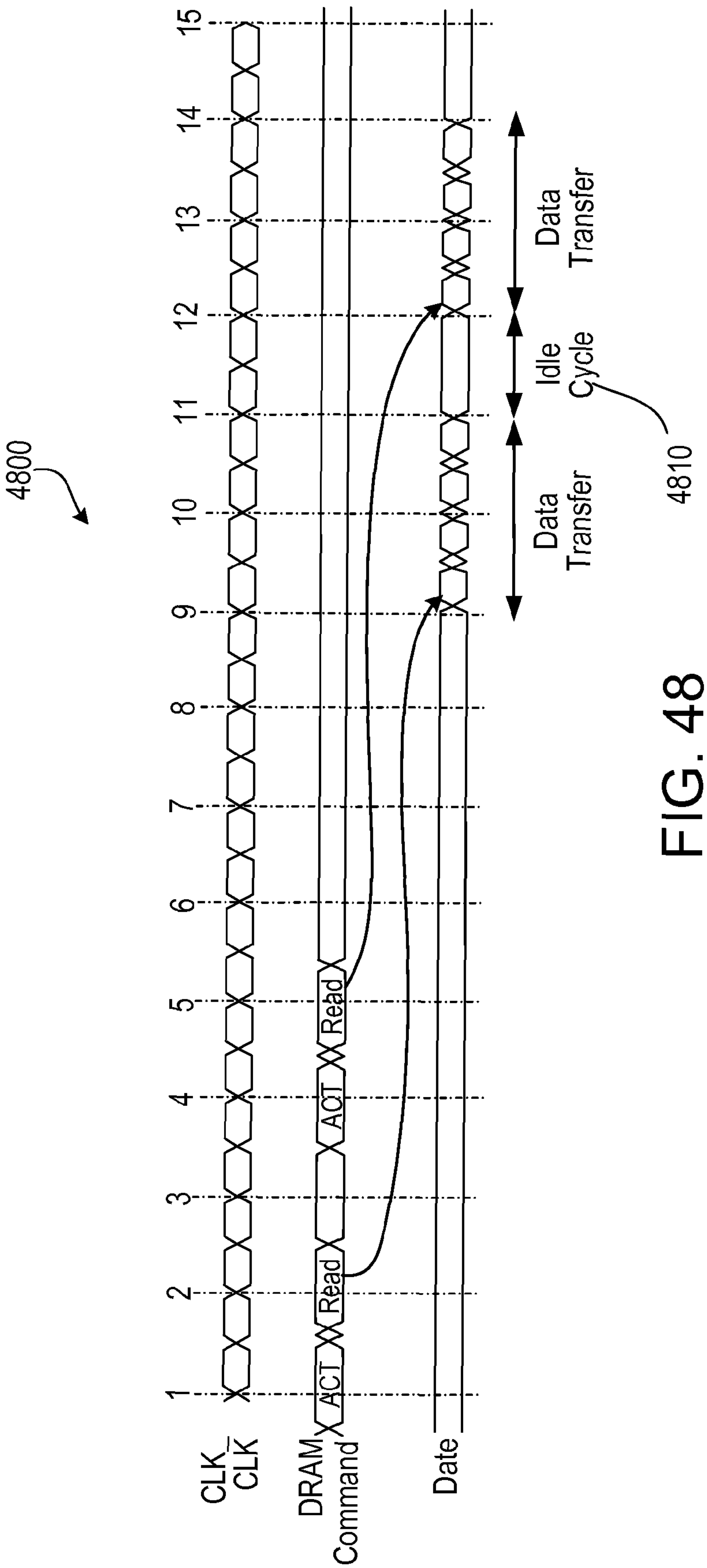
FIG. 48 illustrates a timing diagram showing an inter-device command sequence, inter-device timing constraints, and resulting idle cycles that prevent full use of bandwidth utilization in a DDR SDRAM, DDR2 SDRAM, or DDR3 SDRAM memory system, in accordance with still yet another embodiment.

FIG. 48 illustrates a timing diagram 4800 showing inter-device command sequence, inter-device timing constraints, and resulting idle cycles that prevent full use of bandwidth utilization in a DDR SDRAM, DDR2 SDRAM, or DDR3 SDRAM memory system, in accordance with still yet another embodiment. As an option, the timing diagram 4800 may be associated with the architecture and environment of FIGS. 43-46. Of course, the timing diagram 4800 may be associated with any desired environment. Further, the aforementioned definitions may equally apply to the description below.

As shown, the timing diagram 4800 illustrates commands issued to different devices that are free from constraints such as tRRD and tCCD which would otherwise be imposed on commands issue to the same device. However, as also shown, the data bus hand-off from one device to another device requires at least one idle data-bus cycle 4810 on the data bus. Thus, the timing diagram 4800 illustrates a limitation preventing full use of bandwidth utilization in a DDR3 SDRAM memory system. As a consequence of the command-scheduling constraints, there may be no available command sequence that allows full bandwidth utilization in a DDR3 SDRAM memory system, which also uses bursts shorter than tCCD.

Figure 49:
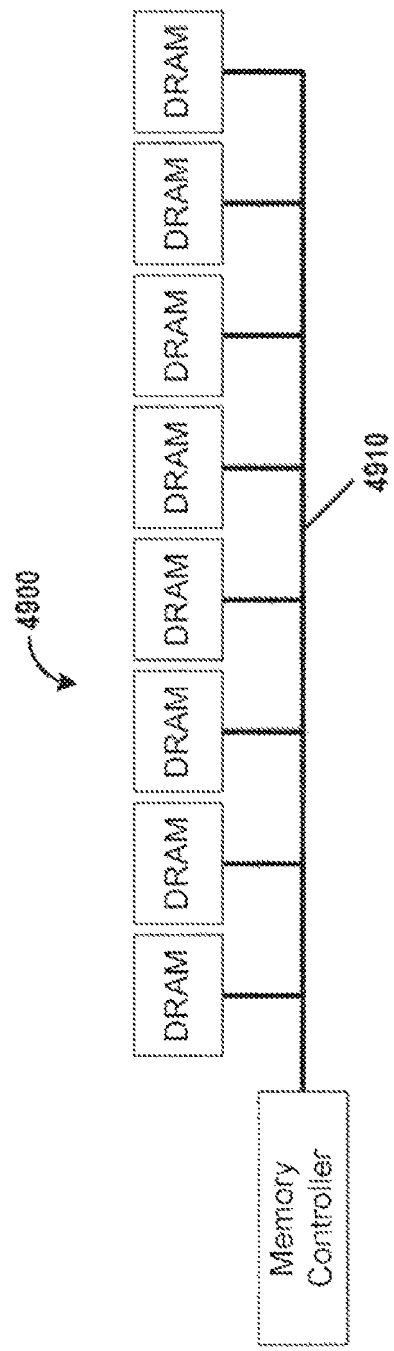
FIG. 49 illustrates a block diagram showing an array of DRAM devices connected to a memory controller, in accordance with another embodiment.

FIG. 49 illustrates a block diagram 4900 showing an array of DRAM devices connected to a memory controller, in accordance with another embodiment. As an option, the block diagram 4900 may be associated with the architecture and environment of FIGS. 43-48. Of course, the block diagram 4900 may be associated with any desired environment. Further, the aforementioned definitions may equally apply to the description below.

As shown, eight DRAM devices are connected directly to a memory controller through a shared data bus 4910. Accordingly, commands from the memory controller that are directed to the DRAM devices may be issued with respect to command scheduling constraints (e.g. tRRD, tCCD, tFAW, tWTR, etc.). Thus, the issuance of commands may be delayed based on such command scheduling constraints.

Figure 50:
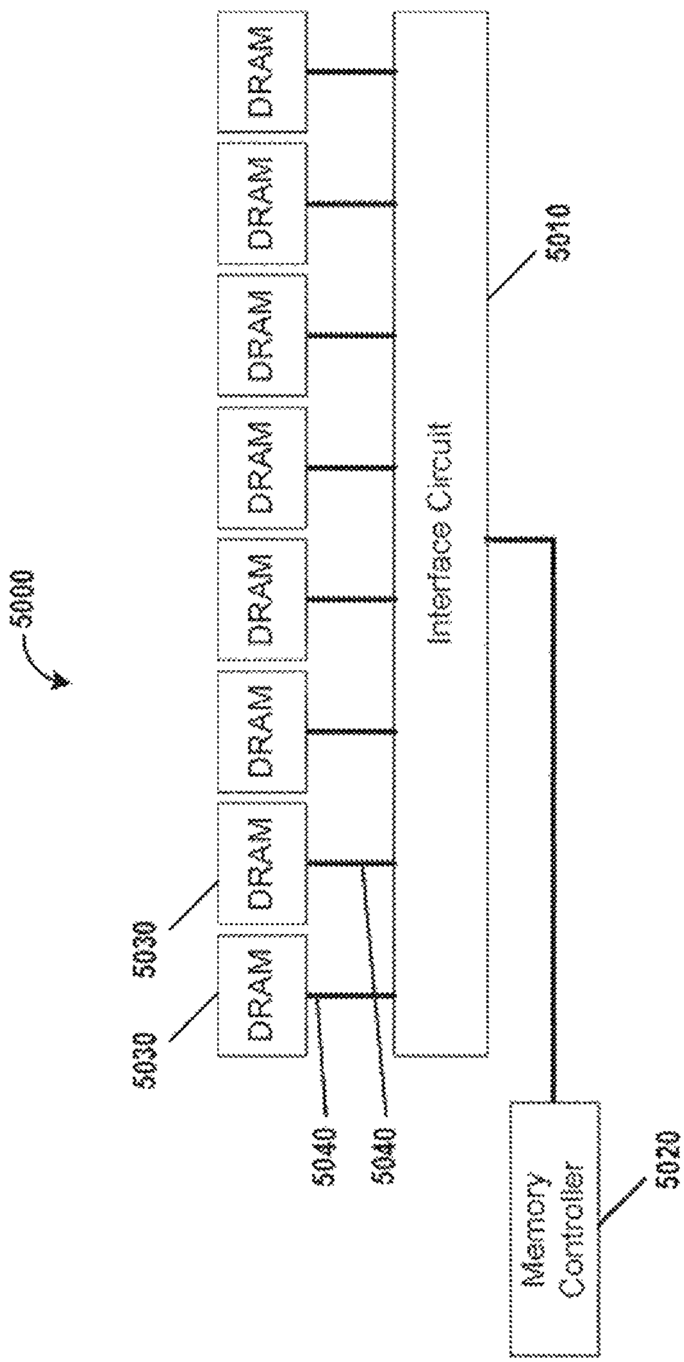
FIG. 50 illustrates a block diagram showing an interface circuit disposed between an array of DRAM devices and a memory controller, in accordance with yet another embodiment.

FIG. 50 illustrates a block diagram 5000 showing an interface circuit disposed between an array of DRAM devices and a memory controller, in accordance with yet another embodiment. As an option, the block diagram 5000 may be associated with the architecture and environment of FIGS. 43-48. Of course, the block diagram 5000 may be associated with any desired environment. Further, the aforementioned definitions may equally apply to the description below.

As shown, an interface circuit 5010 provides a DRAM interface to the memory controller 5020, and directs commands to independent DRAM devices 5030. The memory devices 5030 may each be associated with a different data bus 4740, thus preventing inter-device constraints. In addition, individual and independent memory devices 5030 may be used to emulate part of a virtual memory device (e.g. column, row, bank, etc.). Accordingly, intra-device constraints may also be prevented. To this end, the memory devices 5030 connected to the interface circuit 4710 may appear to the memory controller 5020 as a group of one or more memory devices 4730 that are free from command-scheduling constraints.

In one exemplary embodiment, N physical DRAM devices may be used to emulate M logical DRAM devices through the use of the interface circuit. The interface circuit may accept a command stream from a memory controller directed toward the M logical devices. The interface circuit may also translate the commands to the N physical devices that are connected to the interface circuit via P independent data paths. The command translation may include, for example, routing the correct command directed to one of the M logical devices to the correct device (e.g. one of the N physical devices). Collectively, the P data paths connected to the N physical devices may optionally allow the interface circuit to guarantee that commands may be executed in parallel and independently, thus preventing command-scheduling constraints associated with the N physical devices. In this way the interface circuit may eliminate idle data-bus cycles or bubbles that would otherwise be present due to inter-device and intra-device command-scheduling constraints.

Figure 51:
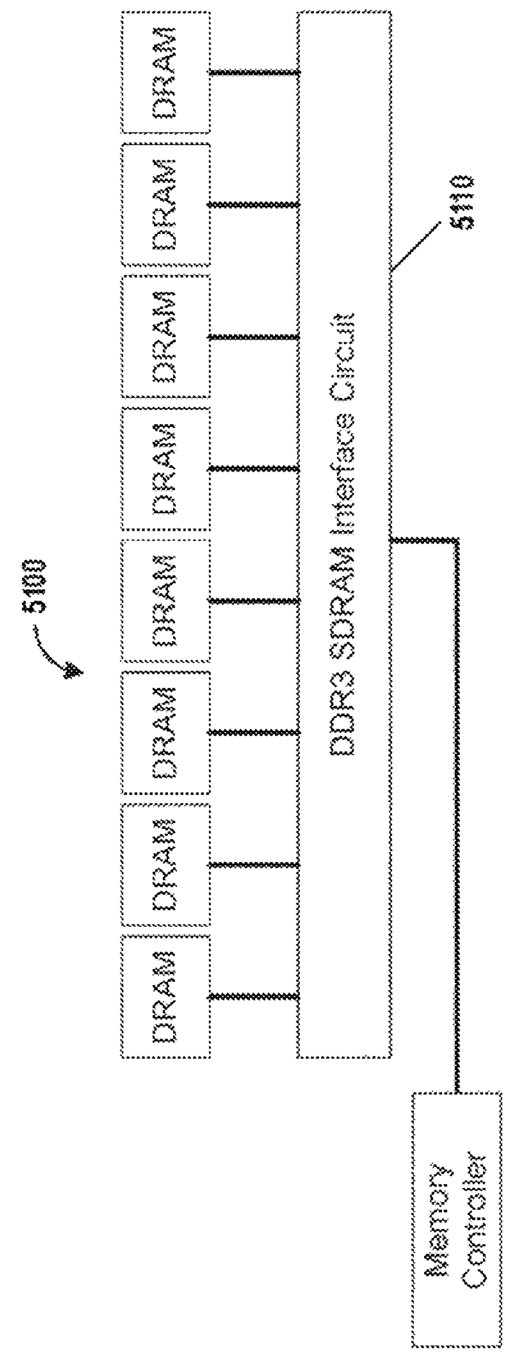
FIG. 51 illustrates a block diagram showing a DDR3 SDRAM interface circuit disposed between an array of DRAM devices and a memory controller, in accordance with another embodiment.

FIG. 51 illustrates a block diagram 5100 showing a DDR3 SDRAM interface circuit disposed between an array of DRAM devices and a memory controller, in accordance with another embodiment. As an option, the block diagram 5100 may be associated with the architecture and environment of FIGS. 43-50. Of course, the block diagram 5100 may be associated with any desired environment. Further, the aforementioned definitions may equally apply to the description below.

As shown, a DDR3 SDRAM interface circuit 5110 eliminates idle data-bus cycles due to inter-device and intra-device scheduling constraints. In the context of the present embodiment, the DDR3 SDRAM interface circuit 5110 may include a command translation circuit of an interface circuit that connects multiple DDR3 SDRAM device with multiple independent data buses. For example, the DDR3 SDRAM interface circuit 5110 may include command-and-control and address components capable of intercepting signals between the physical memory circuits and the system. Moreover, the command-and-control and address components may allow for burst merging, as described below with respect to FIG. 52.

Figure 52:
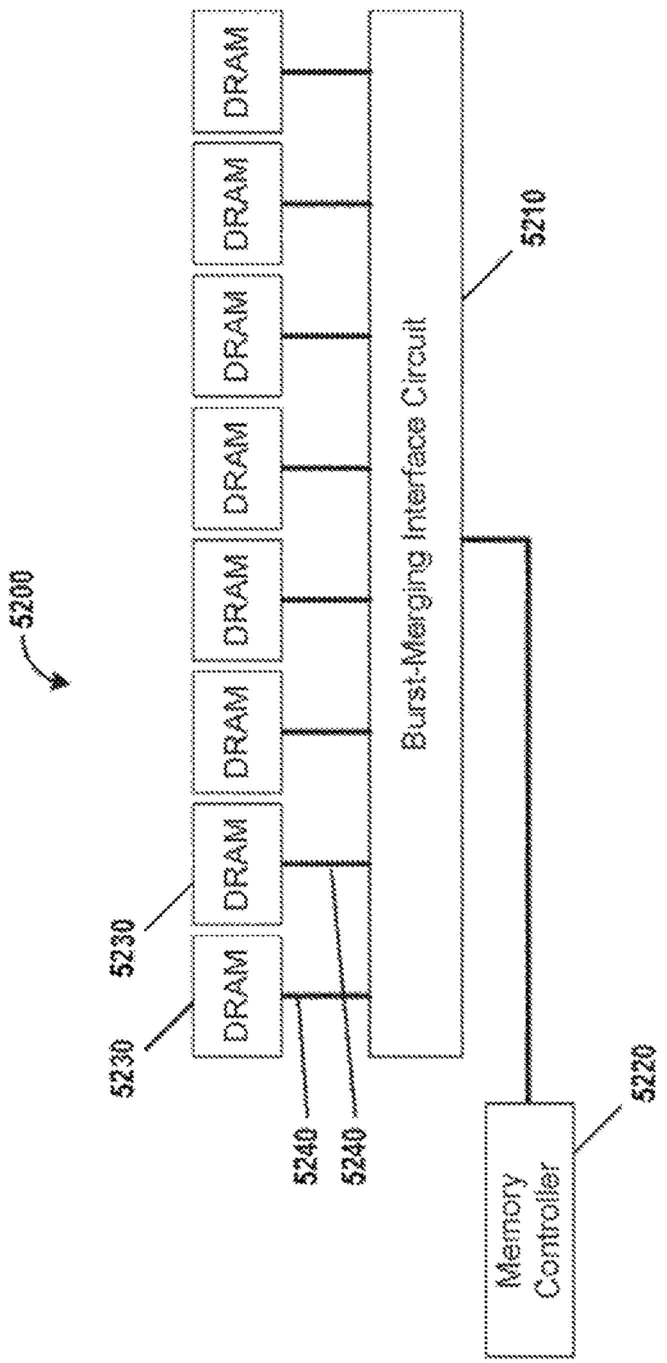
FIG. 52 illustrates a block diagram showing a burst-merging interface circuit connected to multiple DRAM devices with multiple independent data buses, in accordance with still yet another embodiment.

FIG. 52 illustrates a block diagram 5200 showing a burst-merging interface circuit connected to multiple DRAM devices with multiple independent data buses, in accordance with still yet another embodiment. As an option, the block diagram 5200 may be associated with the architecture and environment of FIGS. 43-51. Of course, the block diagram 5200 may be associated with any desired environment. Further, the aforementioned definitions may equally apply to the description below.

A burst-merging interface circuit 5210 may include a data component of an interface circuit that connects multiple DRAM devices 5230 with multiple independent data buses 5240. In addition, the burst-merging interface circuit 5210 may merge multiple burst commands received within a time period. As shown, eight DRAM devices 5230 may be connected via eight independent data paths to the burst-merging interface circuit 5210. Further, the burst-merging interface circuit 5210 may utilize a single data path to the memory controller 5020. It should be noted that while eight DRAM devices 5230 are shown herein, in other embodiments, 16, 24, 32, etc. devices may be connected to the eight independent data paths. In yet another embodiment, there may be two, four, eight, 16 or more independent data paths associated with the DRAM devices 5230.

The burst-merging interface circuit 5210 may provide a single electrical interface to the memory controller 5220, therefore eliminating inter-device constraints (e.g. rank-to-rank turnaround time, etc.). In one embodiment, the memory controller 5220 may be aware that it is indirectly controlling the DRAM devices 5230 through the burst-merging interface circuit 5210, and that no bus turnaround time is needed. In another embodiment, the burst-merging interface circuit 5210 may use the DRAM devices 5230 to emulate M logical devices. The burst-merging interface circuit 5210 may further translate row-activation commands and column-access commands to one of the DRAM devices 5230 in order to ensure that inter-device constraints (e.g. tRRD, tCCD, tFAW and tWTR etc.) are met by each individual DRAM device 5230, while allowing the burst-merging interface circuit 5210 to present itself as M logical devices that are free from inter-device constraints.

Figure 53:
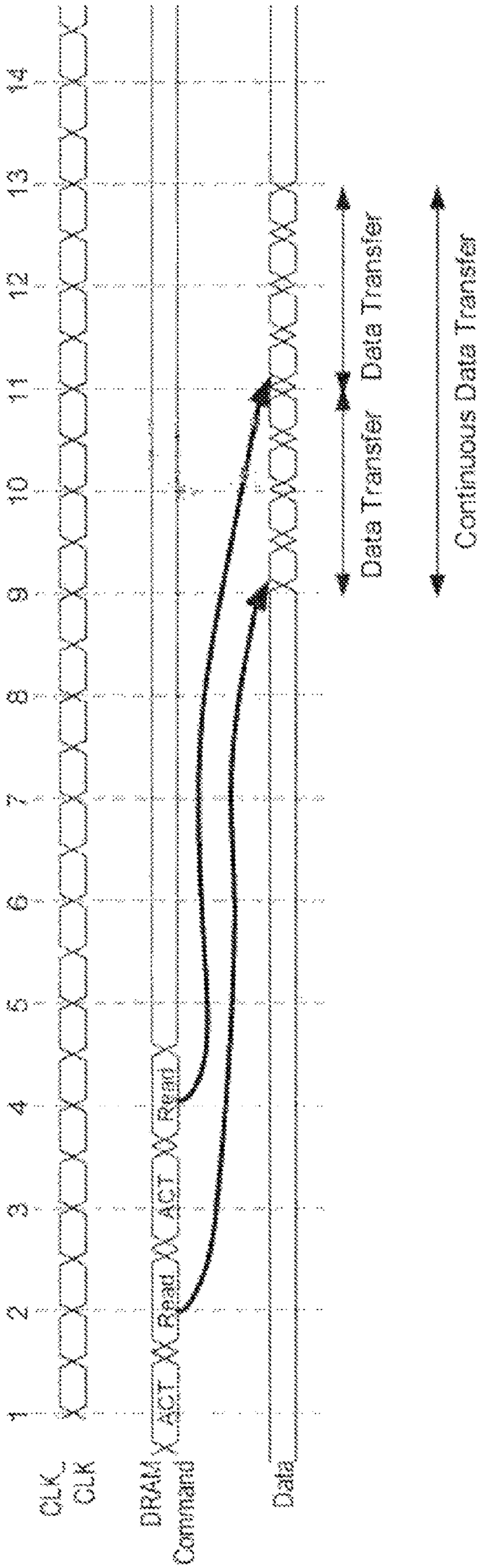
FIG. 53 illustrates a timing diagram showing continuous data transfer over multiple commands in a command sequence, in accordance with another embodiment.

FIG. 53 illustrates a timing diagram 5300 showing continuous data transfer over multiple commands in a command sequence, in accordance with another embodiment. As an option, the timing diagram 5300 may be associated with the architecture and environment of FIGS. 43-52. Of course, the timing diagram 5300 may be associated with any desired environment. Further, the aforementioned definitions may equally apply to the description below.

As shown, inter-device and intra-device constraints are eliminated, such that the burst-merging interface circuit may permit continuous burst data transfers on the data bus, therefore increasing data bandwidth. For example, an interface circuit associated with the burst-merging interface circuit may present an industry-standard DRAM interface to a memory controller as one or more DRAM devices that are free of command-scheduling constraints. Further, the interface circuits may allow the DRAM devices to be emulated as being free from command-scheduling constraints without necessarily changing the electrical interface or the command set of the DRAM memory system. It should be noted that the interface circuits described herein may include any type of memory system (e.g. DDR2, DDR3, etc.).

Figure 54:
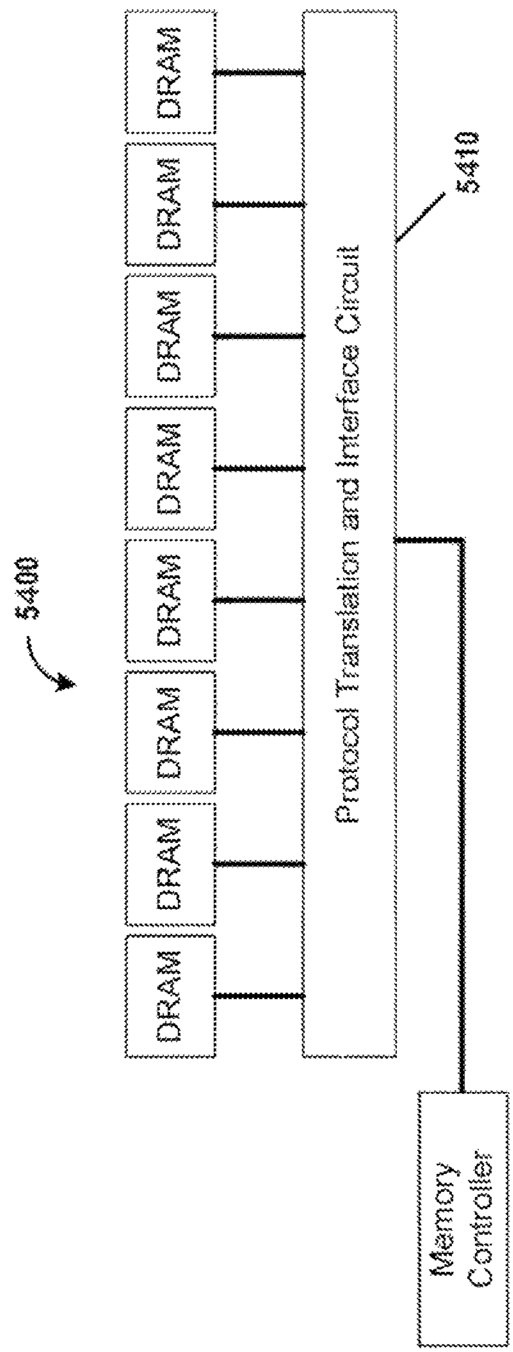
FIG. 54 illustrates a block diagram showing a protocol translation and interface circuit connected to multiple DRAM devices with multiple independent data buses, in accordance with yet another embodiment.

FIG. 54 illustrates a block diagram 5400 showing a protocol translation and interface circuit connected to multiple DRAM devices with multiple independent data buses, in accordance with yet another embodiment. As an option, the block diagram 5400 may be associated with the architecture and environment of FIGS. 43-53. Of course, the block diagram 5400 may be associated with any desired environment. Further, the aforementioned definitions may equally apply to the description below.

As shown, a protocol translation and interface circuit 5410 may perform protocol translation and/or manipulation functions, and may also act as an interface circuit. For example, the protocol translation and interface circuit 5410 may be included within an interface circuit connecting a memory controller with multiple memory devices.

In one embodiment, the protocol translation and interface circuit 5410 may delay row-activation commands and/or column-access commands. The protocol translation and interface circuit 5410 may also transparently perform different kinds of address mapping schemes that depend on the expected arrival time of the column-access command. In one scheme, the column-access command may be sent by the memory controller at the normal time (i.e. late arrival, as compared to a scheme where the column-access command is early).

In a second scheme, the column-access command may be sent by the memory controller before the row-access command is required (i.e. early arrival) at the DRAM device interface. In DDR2 and DDR3 SDRAM memory systems, the early arriving column-access command may be referred to as the Posted-CAS command. Thus, part of a row may be activated as needed, therefore providing sub-row activation. In addition, lower power may also be provided.

It should be noted that the embodiments of the above-described schemes may not necessarily require additional pins or new commands to be sent by the memory controller to the protocol translation and interface circuit. In this way, a high bandwidth DRAM device may be provided.

As shown, the protocol translation and interface circuit 5410 may include eight DRAM devices to be connected thereto via eight independent data paths to. For example, the protocol translation and interface circuit 5410 may emulate a single 8 Gb DRAM device with eight 1 Gb DRAM devices. The memory controller may therefore expect to see eight banks, 32768 rows per bank, 4096 columns per row, and four bits per column. When the memory controller issues a row-activation command, it may expect that 4096 columns are ready for a column-access command that follows, whereas the 1 Gb devices may only have 2048 columns per row. Similarly, the same issue of differing row sizes may arise when 2 Gb devices are used to emulate a 16 Gb DRAM device or 4 Gb devices are used to emulate a 32 Gb device, etc.

To accommodate for the difference between the row sizes of the 1 Gb and 8 Gb DRAM devices, 2 Gb and 16 Gb DRAM devices, 4 Gb and 32 Gb DRAM devices, etc., the protocol translation and interface circuit 5410 may calculate and issue the appropriate number of row-activation commands to prepare for a subsequent column-access command that may access any portion of the larger row. The protocol translation and interface circuit 5410 may be configured with different behaviors, depending on the specific condition.

In one exemplary embodiment, the memory controller may not issue early column-access commands. The protocol translation and interface circuit 5410 may activate multiple, smaller rows to match the size of the larger row in the higher capacity logical DRAM device.

Furthermore, the protocol translation and interface circuit 5410 may present a single data path to the memory controller, as shown. Thus, the protocol translation and interface circuit 5410 may present itself as a single DRAM device with a single electrical interface to the memory controller. For example, if eight 1 Gb DRAM devices are used by the protocol translation and interface circuit 5410 to emulate a single, standard 8 Gb DRAM device, the memory controller may expect that the logical 8 Gb DRAM device will take over 300 ns to perform a refresh command. The protocol translation and interface circuit 5410 may also intelligently schedule the refresh commands. Thus, for example, the protocol translation and interface circuit 5410 may separately schedule refresh commands to the 1 Gb DRAM devices, with each refresh command taking 100 ns.

To this end, where multiple physical DRAM devices are used by the protocol translation and interface circuit 5410 to emulate a single larger DRAM device, the memory controller may expect that the logical device may take a relatively long period to perform a refresh command. The protocol translation and interface circuit 5410 may separately schedule refresh commands to each of the physical DRAM devices. Thus, the refresh of the larger logical DRAM device may take a relatively smaller period of time as compared with a refresh of a physical DRAM device of the same size. DDR3 memory systems may potentially require calibration sequences to ensure that the high speed data I/O circuits are periodically calibrated against thermal-variances induced timing drifts. The staggered refresh commands may also optionally guarantee I/O quiet time required to separately calibrate each of the independent physical DRAM devices.

Thus, in one embodiment, a protocol translation and interface circuit 5410 may allow for the staggering of refresh times of logical DRAM devices. DDR3 devices may optionally require different levels of zero quotient (ZQ) calibration sequences, and the calibration sequences may require guaranteed system quiet time, but may be power intensive, and may require that other I/O in the system are not also switching at the same time. Thus, refresh commands in a higher capacity logical DRAM device may be emulated by staggering refresh commands to different lower capacity physical DRAM devices. The staggering of the refresh commands may optionally provide a guaranteed I/O quiet time that may be required to separately calibrate each of the independent physical DRAM devices.

Figure 55:
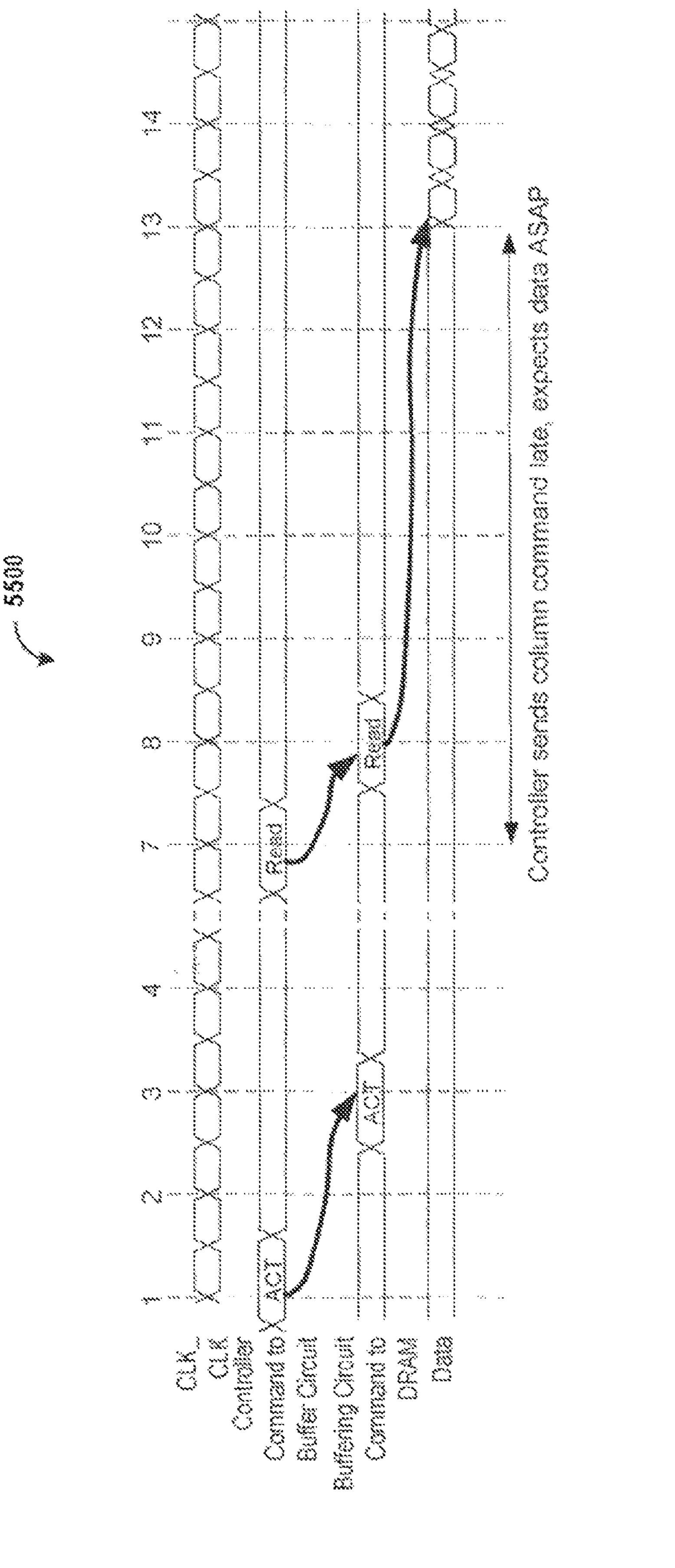
FIG. 55 illustrates a timing diagram showing the effect when a memory controller issues a column-access command late, in accordance with another embodiment.

FIG. 55 illustrates a timing diagram 5500 showing the effect when a memory controller issues a column-access command late, in accordance with another embodiment. As an option, the timing diagram 5500 may be associated with the architecture and environment of FIGS. 43-54. Of course, the timing diagram 5500 may be associated with any desired environment. Further, the aforementioned definitions may equally apply to the description below.

As shown, in a memory system where the memory controller issues the column-access command without enough latency to cover both the DRAM device row-access latency and column-access latency, the interface circuit may send multiple row-access commands to multiple DRAM devices to guarantee that the subsequent column access will hit an open bank. In one exemplary embodiment, the physical device may have a 1 kilobyte (kb) row size and the logical device may have a 2 kb row size. In this case, the interface circuit may activate two 1 kb rows in two different physical devices (since two rows may not be activated in the same device within a span of tRRD). In another exemplary embodiment, the physical device may have a 1 kb row size and the logical device may have a 4 kb row size. In this case, four 1 kb rows may be opened to prepare for the arrival of a column-access command that may be targeted to any part of the 4 kb row.

In one embodiment, the memory controller may issue column-access commands early. The interface circuit may do this in any desired manner, including for example, using the additive latency property of DDR2 and DDR3 devices. The interface circuit may also activate one specific row in one specific DRAM device. This may allow sub-row activation for the higher capacity logical DRAM device.

Figure 56:
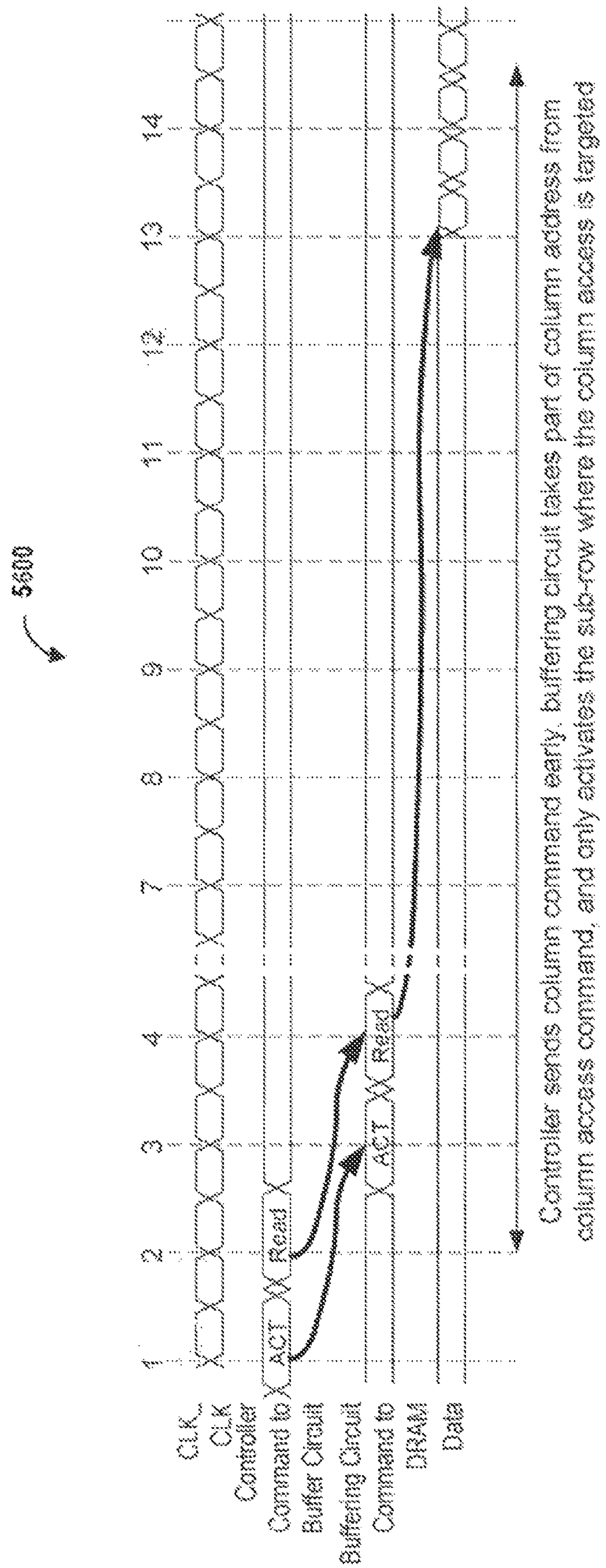
FIG. 56 illustrates a timing diagram showing the effect when a memory controller issues a column-access command early, in accordance with still yet another embodiment.

FIG. 56 illustrates a timing diagram 5600 showing the effect when a memory controller issues a column-access command early, in accordance with still yet another embodiment. As an option, the timing diagram 5600 may be associated with the architecture and environment of FIGS. 43-55. Of course, the timing diagram 5600 may be associated with any desired environment. Further, the aforementioned definitions may equally appear to the description below.

In the context of the present embodiment, a memory controller may issue a column-access command early, i.e. before the row-activation command is to be issued to a DRAM device. Accordingly, an interface circuit may take a portion of the column address, combine it with the row address and form a sub-row address. To this end, the interface circuit may activate the row that is targeted by the column-access command. Just by way of example, if the physical device has a 1 kg row size and the logical device has a 2 kb row size, the early column-access command may allow the interface circuit to activate a single 1 kb row. The interface circuit can thus implement sub-row activation for a logical device with a larger row size than the physical devices without necessarily the use of additional pins or special commands.

Figure 57:
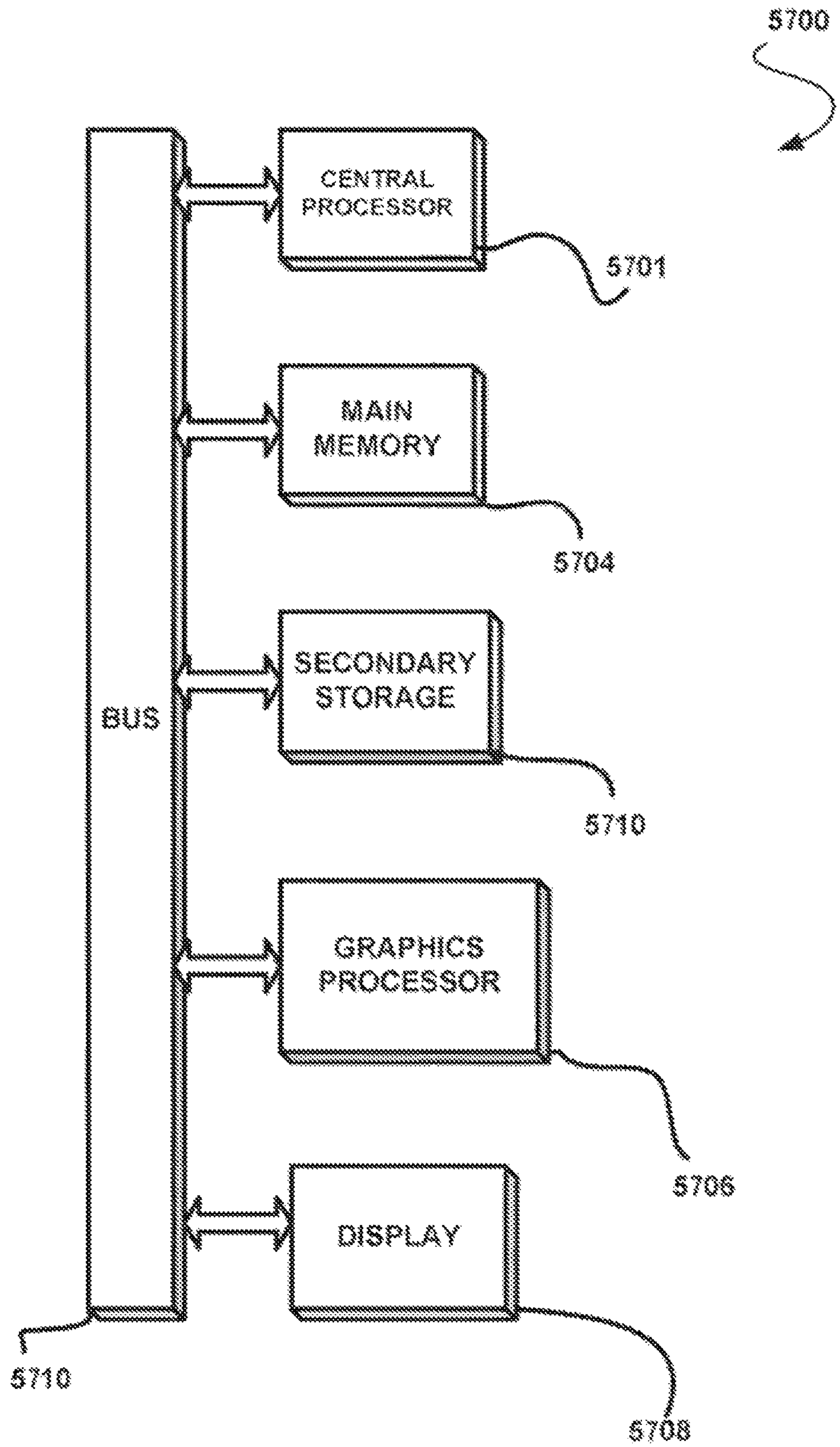
FIG. 57 illustrates a representative hardware environment, in accordance with one embodiment.

FIG. 57 illustrates a representative hardware environment 5700, in accordance with one embodiment. As an option, the hardware environment 5700 may be implemented in the context of FIGS. 43-56. For example, the hardware environment 5700 may constitute an exemplary system.

In one exemplary embodiment, the hardware environment 5700 may include a computer system. As shown, the hardware environment 5700 includes at least one central processor 5701 which is connected to a communication bus 5702. The hardware environment 5700 also includes main memory 5704. The main memory 5704 may include, for example random access memory (RAM) and/or any other desired type of memory. Further, in various embodiments, the main memory 5704 may include memory circuits, interface circuits, etc.

The hardware environment 5700 also includes a graphics processor 5706 and a display 5708. The hardware environment 5700 may also include a secondary storage 5710. The secondary storage 5710 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 5704 and/or the secondary storage 5710. Such computer programs, when executed, enable the computer system 5700 to perform various functions. Memory 5704, storage 5710 and/or any other storage are possible examples of computer-readable media.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Memory Stack Implementations

The memory capacity requirements of computers in general, and servers in particular, are increasing at a very rapid pace due to several key trends in the computing industry. The first trend is 64-bit computing, which enables processors to address more than 4 GB of physical memory. The second trend is multi-core CPUs, where each core runs an independent software thread. The third trend is server virtualization or consolidation, which allows multiple operating systems and software applications to run simultaneously on a common hardware platform. The fourth trend is web services, hosted applications, and on-demand software, where complex software applications are centrally run on servers instead of individual copies running on desktop and mobile computers. The intersection of all these trends has created a step function in the memory capacity requirements of servers.

However, the trends in the DRAM industry are not aligned with this step function. As the DRAM interface speeds increase, the number of loads (or ranks) on the traditional multi-drop memory bus decreases in order to facilitate high speed operation of the bus. In addition, the DRAM industry has historically had an exponential relationship between price and DRAM density, such that the highest density ICs or integrated circuits have a higher $/Mb ratio than the mainstream density integrated circuits. These two factors usually place an upper limit on the amount of memory (i.e. the memory capacity) that can be economically put into a server.

Figure 58A:
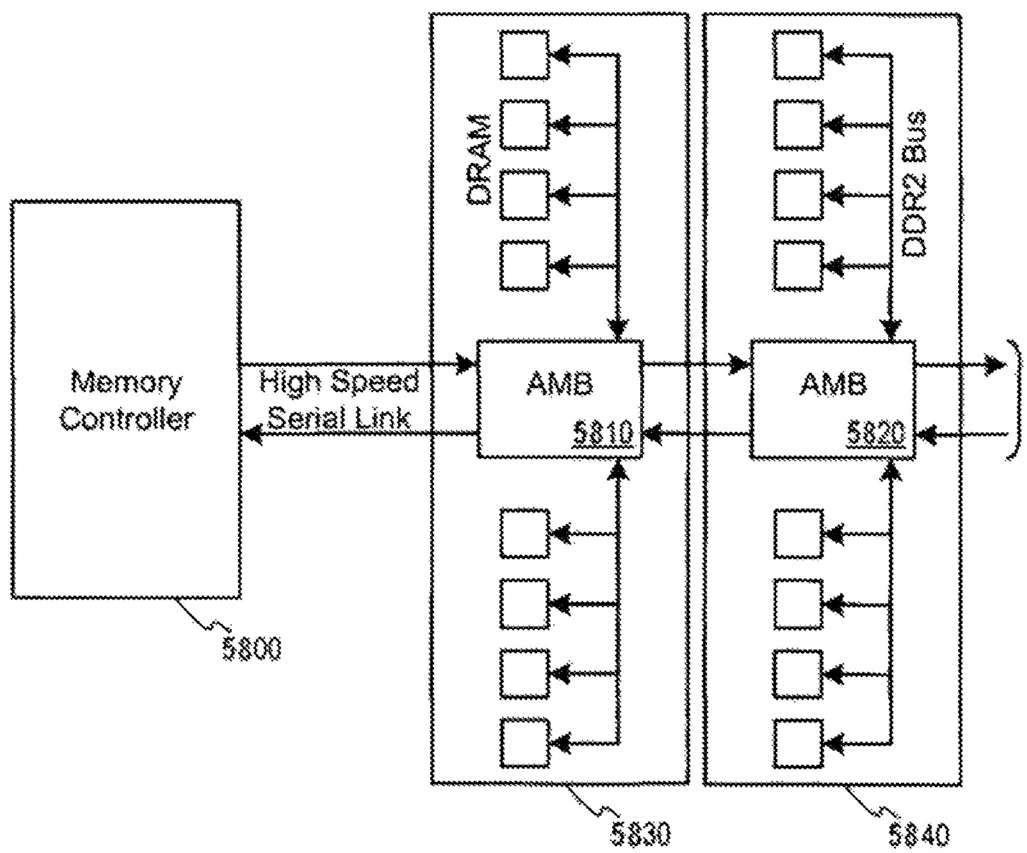
FIGS. 58A-58B illustrate a memory sub-system that uses fully buffered DIMMs.
Figure 58B:
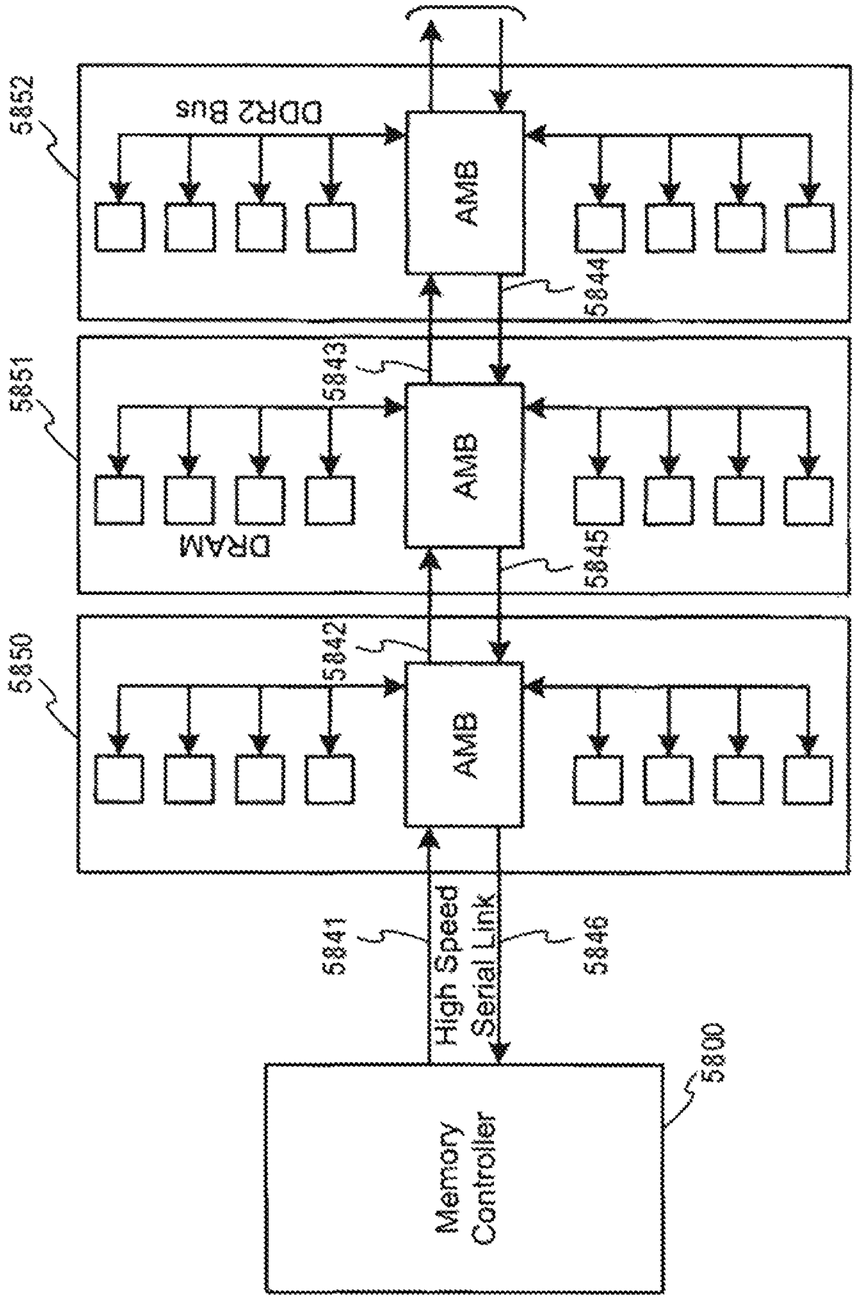

One solution to this memory capacity gap is to use a fully buffered DIMM (FB-DIMM), and this is currently being standardized by JEDEC. FIG. 58A illustrates a fully buffered DIMM. As shown in FIG. 58A, memory controller 5800 communicates with FB-DIMMs (5830 and 5840) via advanced memory buffers (AMB) 5810 and 5820 to operate a plurality of DRAMs. As shown in FIG. 58B, the FB-DIMM approach uses a point-to-point, serial protocol link between the memory controller 5800 and FB-DIMMs 5850, 5851, and 5852. In order to read the DRAM devices on, say, the third FB-DIMM 5852, the command has to travel through the AMBs on the first FB-DIMM 5850 and second FB-DIMM 5851 over the serial link segments 5841, 5842, and 5843, and the data from the DRAM devices on the third FB-DIMM 5852 must travel back to the memory controller 5800 through the AMBs on the first and second FB-DIMMs over serial link segments 5844, 5845, and 5846.

The FB-DIMM approach creates a direct correlation between maximum memory capacity and the printed circuit board (PCB) area. In other words, a larger PCB area is required to provide larger memory capacity. Since most of the growth in the server industry is in the smaller form factor servers like 1 U/2 U rack servers and blade servers, the FB-DIMM solution does not solve the memory capacity gap for small form factor servers. So, clearly there exists a need for dense memory technology that fits into the mechanical and thermal envelopes of current memory systems.

In one embodiment of this invention, multiple buffer integrated circuits are used to buffer the DRAM integrated circuits or devices on a DIMM as opposed to the FB-DIMM approach, where a single buffer integrated circuit is used to buffer all the DRAM integrated circuits on a DIMM. That is, a bit slice approach is used to buffer the DRAM integrated circuits. As an option, multiple DRAMs may be connected to each buffer integrated circuit. In other words, the DRAMs in a slice of multiple DIMMs may be collapsed or coalesced or stacked behind each buffer integrated circuit, such that the buffer integrated circuit is between the stack of DRAMs and the electronic host system.

FIGS. 59A-59C illustrate one embodiment of a DIMM with multiple DRAM stacks, where each DRAM stack comprises a bit slice across multiple DIMMs. As an example, FIG. 59A shows four DIMMs (e.g., DIMM A, DIMM B, DIMM C and DIMM D). Also, in this example, there are 9 bit slices labeled DA0, . . . , DA6, . . . DA8 across the four DIMMs. Bit slice "6" is shown encapsulated in block 5910. FIG. 59B illustrates a buffered DRAM stack. The buffered DRAM stack 5930 comprises a buffer integrated circuit (5920) and DRAM devices DA6, DB6, DC6 and DD6. Thus, bit slice 6 is generated from devices DA6, DB6, DC6 and DD6. FIG. 59C is a top view of a high density DIMM with a plurality of buffered DRAM stacks. A high density DIMM (5940) comprises buffered DRAM stacks (5950) in place of individual DRAMs.

Some exemplary embodiments include:

(a) a configuration with increased DIMM density, that allows the total memory capacity of the system to increase without requiring a larger PCB area. Thus, higher density DIMMs fit within the mechanical and space constraints of current DIMMs.

(b) a configuration with distributed power dissipation, which allows the higher density DIMM to fit within the thermal envelope of existing DIMMs. In an embodiment with multiple buffers on a single DIMM, the power dissipation of the buffering function is spread out across the DIMM.

(c) a configuration with non-cumulative latency to improve system performance. In a configuration with non-cumulative latency, the latency through the buffer integrated circuits on a DIMM is incurred only when that particular DIMM is being accessed.

In a buffered DRAM stack embodiment, the plurality of DRAM devices in a stack are electrically behind the buffer integrated circuit. In other words, the buffer integrated circuit sits electrically between the plurality of DRAM devices in the stack and the host electronic system and buffers some or all of the signals that pass between the stacked DRAM devices and the host system. Since the DRAM devices are standard, off-the-shelf, high speed devices (like DDR SDRAMs or DDR2SDRAMs), the buffer integrated circuit may have to re-generate some of the signals (e.g. the clocks) while other signals (e.g. data signals) may have to be re-synchronized to the clocks or data strobes to minimize the jitter of these signals. Other signals (e.g. address signals) may be manipulated by logic circuits such as decoders. Some embodiments of the buffer integrated circuit may not re-generate or re-synchronize or logically manipulate some or all of the signals between the DRAM devices and host electronic system.

The buffer integrated circuit and the DRAM devices may be physically arranged in many different ways. In one embodiment, the buffer integrated circuit and the DRAM devices may all be in the same stack. In another embodiment, the buffer integrated circuit may be separate from the stack of DRAM integrated circuits (i.e. buffer integrated circuit may be outside the stack). In yet another embodiment, the DRAM integrated circuits that are electrically behind a buffer integrated circuit may be in multiple stacks (i.e. a buffer integrated circuit may interface with a plurality of stacks of DRAM integrated circuits).

In one embodiment, the buffer integrated circuit can be designed such that the DRAM devices that are electrically behind the buffer integrated circuit appear as a single DRAM integrated circuit to the host system, whose capacity is equal to the combined capacities of all the DRAM devices in the stack. So, for example, if the stack contains eight 512 Mb DRAM integrated circuits, the buffer integrated circuit of this embodiment is designed to make the stack appear as a single 4 Gb DRAM integrated circuit to the host system. An un-buffered DIMM, registered DIMM, S0-DIMM, or FB-DIMM can now be built using buffered stacks of DRAMs instead of individual DRAM devices. For example, a double rank registered DIMM that uses buffered DRAM stacks may have eighteen stacks, nine of which may be on one side of the DIMM PCB and controlled by a first integrated circuit select signal from the host electronic system, and nine may be on the other side of the DIMM PCB and controlled by a second integrated circuit select signal from the host electronic system. Each of these stacks may contain a plurality of DRAM devices and a buffer integrated circuit.

Figure 60A:
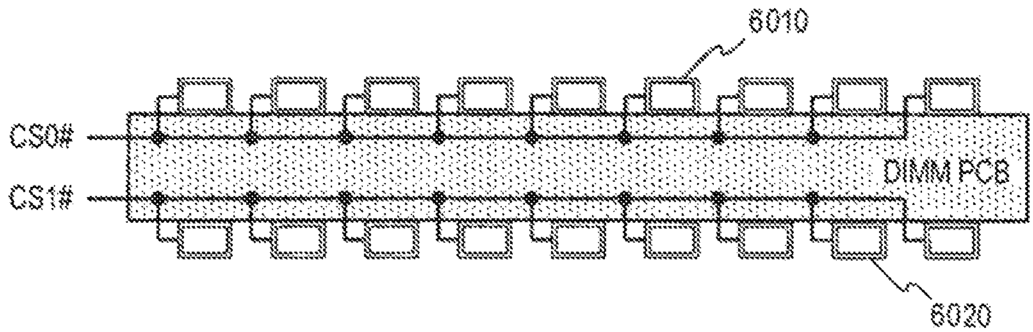
FIG. 60A illustrates a DIMM PCB with buffered DRAM stacks.
Figure 60B:
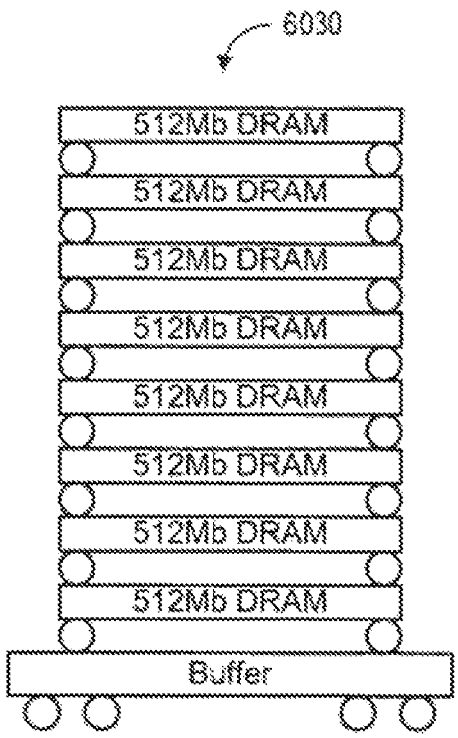
FIG. 60B illustrates a buffered DRAM stack that emulates a 4 Gbyte DRAM.

FIG. 60A illustrates a DIMM PCB with buffered DRAM stacks. As shown in FIG. 60A, both the top and bottom sides of the DIMM PCB comprise a plurality of buffered DRAM stacks (e.g., 6010 and 6020). Note that the register and clock PLL integrated circuits of a registered DIMM are not shown in this figure for simplicity's sake. FIG. 60B illustrates a buffered DRAM stack that emulates a 4 Gb DRAM.

In one embodiment, a buffered stack of DRAM devices may appear as or emulate a single DRAM device to the host system. In such a case, the number of memory banks that are exposed to the host system may be less than the number of banks that are available in the stack. To illustrate, if the stack contained eight 512 Mb DRAM integrated circuits, the buffer integrated circuit of this embodiment will make the stack look like a single 4 Gb DRAM integrated circuit to the host system. So, even though there are thirty two banks (four banks per 512 Mb integrated circuit*eight integrated circuits) in the stack, the buffer integrated circuit of this embodiment might only expose eight banks to the host system because a 4 Gb DRAM will nominally have only eight banks. The eight 512 Mb DRAM integrated circuits in this example may be referred to as physical DRAM devices while the single 4 Gb DRAM integrated circuit may be referred to as a virtual DRAM device. Similarly, the banks of a physical DRAM device may be referred to as a physical bank whereas the bank of a virtual DRAM device may be referred to as a virtual bank.

In another embodiment of this invention, the buffer integrated circuit is designed such that a stack of n DRAM devices appears to the host system as m ranks of DRAM devices (where n>m, and m≥2). To illustrate, if the stack contained eight 512 Mb DRAM integrated circuits, the buffer integrated circuit of this embodiment may make the stack appear as two ranks of 2 Gb DRAM devices (for the case of m=2), or appear as four ranks of 1 Gb DRAM devices (for the case of m=4), or appear as eight ranks of 512 Mb DRAM devices (for the case of m=8). Consequently, the stack of eight 512 Mb DRAM devices may feature sixteen virtual banks (m=2; eight banks per 2 Gb virtual DRAM*two ranks), or thirty two virtual banks (m=4; eight banks per 1 Gb DRAM*four ranks), or thirty two banks (m=8; four banks per 512 Mb DRAM*eight ranks).

In one embodiment, the number of ranks may be determined by the number of integrated circuit select signals from the host system that are connected to the buffer integrated circuit. For example, the most widely used JEDEC approved pin out of a DIMM connector has two integrated circuit select signals. So, in this embodiment, each stack may be made to appear as two DRAM devices (where each integrated circuit belongs to a different rank) by routing the two integrated circuit select signals from the DIMM connector to each buffer integrated circuit on the DIMM. For the purpose of illustration, let us assume that each stack of DRAM devices has a dedicated buffer integrated circuit, and that the two integrated circuit select signals that are connected on the motherboard to a DIMM connector are labeled CS0# and CS1#. Let us also assume that each stack is 8 -bits wide (i.e. has eight data pins), and that the stack contains a buffer integrated circuit and eight 8-bit wide 512 Mb DRAM integrated circuits. In this example, both CS0# and CS1# are connected to all the stacks on the DIMM. So, a single-sided registered DIMM with nine stacks (with CS0# and CS1# connected to all nine stacks) effectively features two 2 GB ranks, where each rank has eight banks.

In another embodiment, a double-sided registered DIMM may be built using eighteen stacks (nine on each side of the PCB), where each stack is 4-bits wide and contains a buffer integrated circuit and eight 4-bit wide 512 Mb DRAM devices. As above, if the two integrated circuit select signals CS0# and CS1# are connected to all the stacks, then this DIMM will effectively feature two 4 GB ranks, where each rank has eight banks. However, half of a rank's capacity is on one side of the DIMM PCB and the other half is on the other side. For example, let us number the stacks on the DIMM as S0 through S17, such that stacks S0 through S8 are on one side of the DIMM PCB while stacks S9 through S17 are on the other side of the PCB. Stack S0 may be connected to the host system's data lines DQ[3:0], stack S9 connected to the host system's data lines DQ[7:4], stack 51 to data lines DQ[11:8], stack S10 to data lines DQ[15:12], and so on. The eight 512 Mb DRAM devices in stack S0 may be labeled as S0_M0 through S0_M7 and the eight 512 Mb DRAM devices in stack S9 may be labeled as S9_M0 through S9_M7. In one example, integrated circuits S0_M0 through S0_M3 may be used by the buffer integrated circuit associated with stack S0 to emulate a 2 Gb DRAM integrated circuit that belongs to the first rank (i.e. controlled by integrated circuit select CS0#). Similarly, integrated circuits S0_M4 through S0_M7 may be used by the buffer integrated circuit associated with stack S0 to emulate a 2 Gb DRAM integrated circuit that belongs to the second rank (i.e. controlled by integrated circuit select CS1#). So, in general, integrated circuits Sn_M0 through Sn_M3 may be used to emulate a 2 Gb DRAM integrated circuit that belongs to the first rank while integrated circuits Sn_M4 through Sn_M7 may be used to emulate a 2 Gb DRAM integrated circuit that belongs to the second rank, where n represents the stack number (i.e. 0≤n≤17). It should be noted that the configuration described above is just for illustration. Other configurations may be used to achieve the same result without deviating from the spirit or scope of the claims. For example, integrated circuits S0_M0, S0_M2, S0_M4, and S0_M6 may be grouped together by the associated buffer integrated circuit to emulate a 2 Gb DRAM integrated circuit in the first rank while integrated circuits S0_M1, S0_M3, S0_M5, and S0_M7 may be grouped together by the associated buffer integrated circuit to emulate a 2 Gb DRAM integrated circuit in the second rank of the DIMM.

Figure 61A:
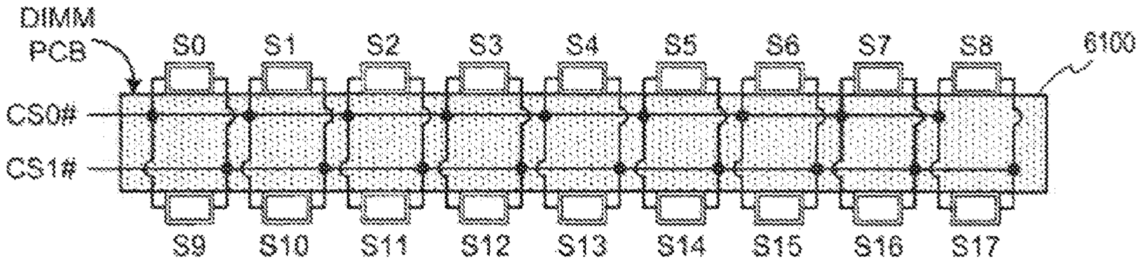
FIG. 61A illustrates an example of a DIMM that uses the buffer integrated circuit and DRAM stack.
Figure 61B:
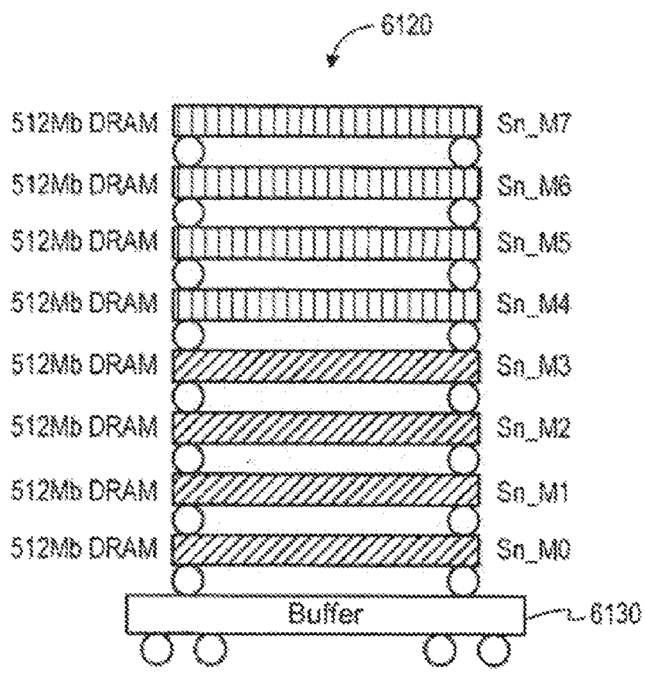
FIG. 61B illustrates a physical stack of DRAMs in accordance with one embodiment.

FIG. 61A illustrates an example of a registered DIMM that uses buffer integrated circuits and DRAM stacks. For simplicity sake, note that the register and clock PLL integrated circuits of a registered DIMM are not shown. The DIMM PCB 6100 includes buffered DRAM stacks on the top side of DIMM PCB 6100 (e.g., S5) as well as the bottom side of DIMM PCB 6100 (e.g., S15). Each buffered stack emulates two DRAMs. FIG. 61B illustrates a physical stack of DRAM devices in this embodiment. For example, stack 6120 comprises eight 4-bit wide, 512 Mb DRAM devices and a buffer integrated circuit 6130. As shown in FIG. 61B, a first group of devices, consisting of Sn_M0, Sn_M1, Sn_M2 and Sn_M3, is controlled by CS0#. A second group of devices, which consists of Sn_M4, Sn_M5, Sn_M6 and Sn_M7, is controlled by CS1#. It should be noted that the eight DRAM devices and the buffer integrated circuit are shown as belonging to one stack in FIG. 61B strictly as an example. Other implementations are possible. For example, the buffer integrated circuit 6130 may be outside the stack of DRAM devices. Also, the eight DRAM devices may be arranged in multiple stacks.

In an optional variation of the multi-rank embodiment, a single buffer integrated circuit may be associated with a plurality of stacks of DRAM integrated circuits. In the embodiment exemplified in FIGS. 62A and 62B, a buffer integrated circuit is dedicated to two stacks of DRAM integrated circuits. FIG. 62B shows two stacks, one on each side of the DIMM PCB, and one buffer integrated circuit B0 situated on one side of the DIMM PCB. However, this is strictly for the purpose of illustration. The stacks that are associated with a buffer integrated circuit may be on the same side of the DIMM PCB or may be on both sides of the PCB.

Figure 62A:
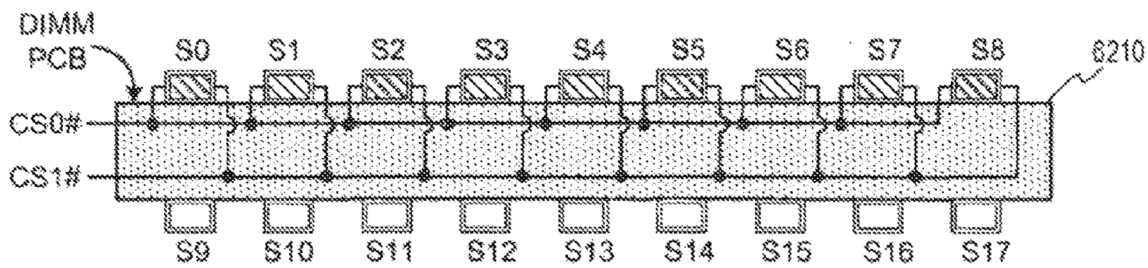
FIGS. 62A and 62B illustrate another embodiment of a multi-rank buffer integrated circuit and DIMM.
Figure 62B:
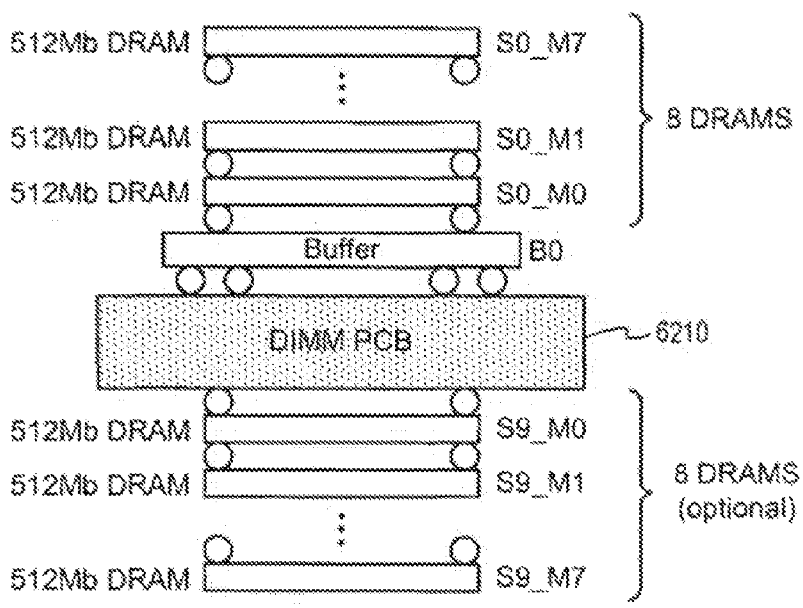

In the embodiment exemplified in FIGS. 62A and 62B, each stack of DRAM devices contains eight 512 Mb integrated circuits, the stacks are numbered S0 through S17, and within each stack, the integrated circuits are labeled Sn_M0 through Sn_M7 (where n is 0 through 17). Also, for this example, the buffer integrated circuit is 8-bits wide, and the buffer integrated circuits are numbered B0 through B8. The two integrated circuit select signals, CS0# and CS1#, are connected to buffer B0 as are the data lines DQ[7:0]. As shown, stacks S0 through S8 are the primary stacks and stacks S9 through S17 are optional stacks. The stack S9 is placed on the other side of the DIMM PCB, directly opposite stack S0 (and buffer B0). The integrated circuits in stack S9 are connected to buffer B0. In other words, the DRAM devices in stacks S0 and S9 are connected to buffer B0, which in turn, is connected to the host system. In the case where the DIMM contains only the primary stacks S0 through S8, the eight DRAM devices in stack S0 are emulated by the buffer integrated circuit B0 to appear to the host system as two 2 Gb devices, one of which is controlled by CS0# and the other is controlled by CS1#. In the case where the DIMM contains both the primary stacks S0 through S8 and the optional stacks S9 through S17, the sixteen 512 Mb DRAM devices in stacks S0 and S9 are together emulated by buffer integrated circuit B0 to appear to the host system as two 4 Gb DRAM devices, one of which is controlled by CS0# and the other is controlled by CS1#.

It should be clear from the above description that this architecture decouples the electrical loading on the memory bus from the number of ranks So, a lower density DIMM can be built with nine stacks (S0 through S8) and nine buffer integrated circuits (B0 through B8), and a higher density DIMM can be built with eighteen stacks (S0 through S17) and nine buffer integrated circuits (B0 through B8). It should be noted that it is not necessary to connect both integrated circuit select signals CS0# and CS1# to each buffer integrated circuit on the DIMM. A single rank lower density DIMM may be built with nine stacks (S0 through S8) and nine buffer integrated circuits (B0 through B8), wherein CS0# is connected to each buffer integrated circuit on the DIMM. Similarly, a single rank higher density DIMM may be built with seventeen stacks (S0 through S17) and nine buffer integrated circuits, wherein CS0# is connected to each buffer integrated circuit on the DIMM.

A DIMM implementing a multi-rank embodiment using a multi-rank buffer is an optional feature for small form factor systems that have a limited number of DIMM slots. For example, consider a processor that has eight integrated circuit select signals, and thus supports up to eight ranks. Such a processor may be capable of supporting four dual-rank DIMMs or eight single-rank DIMMs or any other combination that provides eight ranks Assuming that each rank has y banks and that all the ranks are identical, this processor may keep up to 8*y memory pages open at any given time. In some cases, a small form factor server like a blade or 1U server may have physical space for only two DIMM slots per processor. This means that the processor in such a small form factor server may have open a maximum of 4*y memory pages even though the processor is capable of maintaining 8*y pages open. For such systems, a DIMM that contains stacks of DRAM devices and multi-rank buffer integrated circuits may be designed such that the processor maintains 8*y memory pages open even though the number of DIMM slots in the system are fewer than the maximum number of slots that the processor may support. One way to accomplish this, is to apportion all the integrated circuit select signals of the host system across all the DIMM slots on the motherboard. For example, if the processor has only two dedicated DIMM slots, then four integrated circuit select signals may be connected to each DIMM connector. However, if the processor has four dedicated DIMM slots, then two integrated circuit select signals may be connected to each DIMM connector.

To illustrate the buffer and DIMM design, say that a buffer integrated circuit is designed to have up to eight integrated circuit select inputs that are accessible to the host system. Each of these integrated circuit select inputs may have a weak pull-up to a voltage between the logic high and logic low voltage levels of the integrated circuit select signals of the host system. For example, the pull-up resistors may be connected to a voltage (VTT) midway between VDDQ and GND (Ground). These pull-up resistors may be on the DIMM PCB. Depending on the design of the motherboard, two or more integrated circuit select signals from the host system may be connected to the DIMM connector, and hence to the integrated circuit select inputs of the buffer integrated circuit. On power up, the buffer integrated circuit may detect a valid low or high logic level on some of its integrated circuit select inputs and may detect VTT on some other integrated circuit select inputs. The buffer integrated circuit may now configure the DRAMs in the stacks such that the number of ranks in the stacks matches the number of valid integrated circuit select inputs.

Figure 63A:
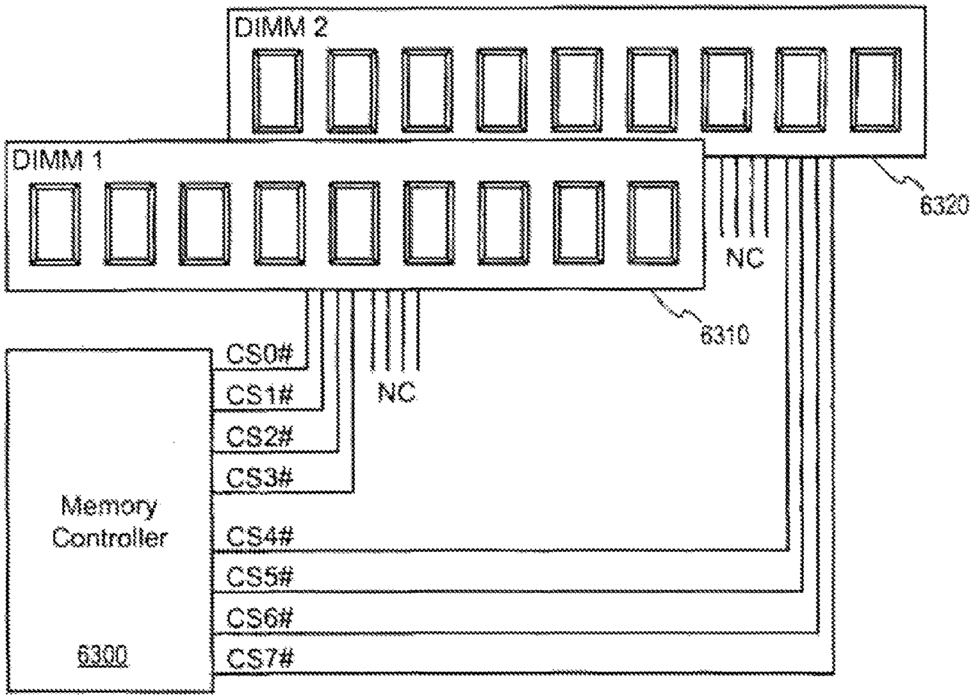
FIGS. 63A and 63B illustrates one embodiment of a buffer that provides a number of ranks on a DIMM equal to the number of valid integrated circuit selects from a host system.
Figure 63B:
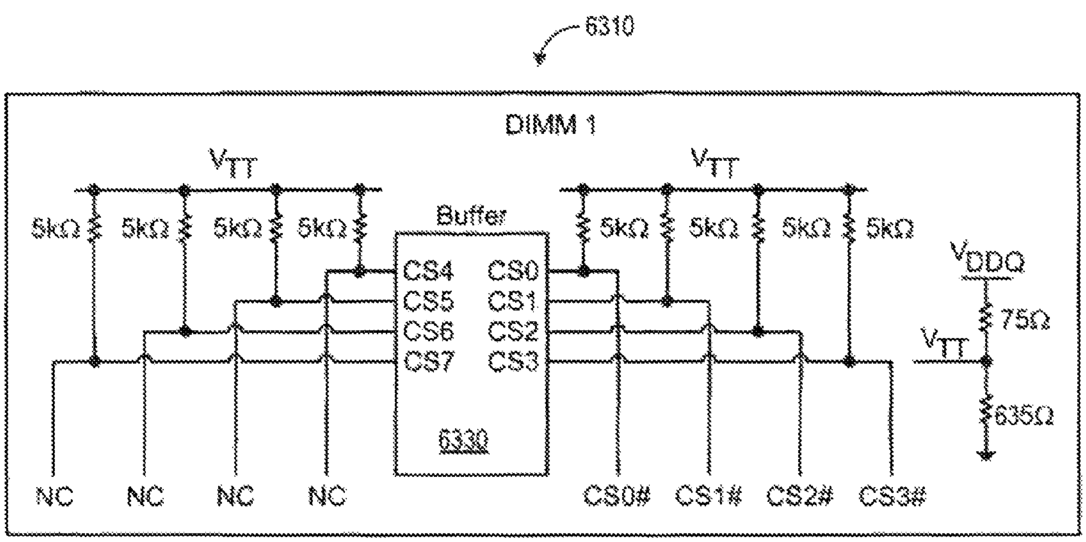

FIG. 63A illustrates a memory controller that connects to two DIMMS. Memory controller (600) from the host system drives 8 integrated circuit select (CS) lines: CS0# through CS7#. The first four lines (CS0#-CS3#) are used to select memory ranks on a first DIMM (610), and the second four lines (CS4#-CS7#) are used to select memory ranks on a second DIMM (620). FIG. 63B illustrates a buffer and pull-up circuitry on a DIMM used to configure the number of ranks on a DIMM. For this example, buffer 6330 includes eight (8) integrated circuits select inputs (CS0#-CS7#). A pull-up circuit on DIMM 6310 pulls the voltage on the connected integrated circuit select lines to a midway voltage value (i.e., midway between VDDQ and GND, VTT). CS0#-CS3# are coupled to buffer 6330 via the pull-up circuit. CS4#-CS7# are not connected to DIMM 6310. Thus, for this example, DIMM 6310 configures ranks based on the CS0#-CS3# lines.

Traditional motherboard designs hard wire a subset of the integrated circuit select signals to each DIMM connector. For example, if there are four DIMM connectors per processor, two integrated circuit select signals may be hard wired to each DIMM connector. However, for the case where only two of the four DIMM connectors are populated, only 4*y memory banks are available even though the processor supports 8*y banks because only two of the four DIMM connectors are populated with DIMMs. One method to provide dynamic memory bank availability is to configure a motherboard where all the integrated circuit select signals from the host system are connected to all the DIMM connectors on the motherboard. On power up, the host system queries the number of populated DIMM connectors in the system, and then apportions the integrated circuit selects across the populated connectors.

In one embodiment, the buffer integrated circuits may be programmed on each DIMM to respond only to certain integrated circuit select signals. Again, using the example above of a processor with four dedicated DIMM connectors, consider the case where only two of the four DIMM connectors are populated. The processor may be programmed to allocate the first four integrated circuit selects (e.g., CS0# through CS3#) to the first DIMM connector and allocate the remaining four integrated circuit selects (say, CS4# through CS7#) to the second DIMM connector. Then, the processor may instruct the buffer integrated circuits on the first DIMM to respond only to signals CS0# through CS3# and to ignore signals CS4# through CS7#. The processor may also instruct the buffer integrated circuits on the second DIMM to respond only to signals CS4# through CS7# and to ignore signals CS0# through CS3#. At a later time, if the remaining two DIMM connectors are populated, the processor may then re-program the buffer integrated circuits on the first DIMM to respond only to signals CS0# and CS1#, re-program the buffer integrated circuits on the second DIMM to respond only to signals CS2# and CS3#, program the buffer integrated circuits on the third DIMM to respond to signals CS4# and CS5#, and program the buffer integrated circuits on the fourth DIMM to respond to signals CS6# and CS7#. This approach ensures that the processor of this example is capable of maintaining 8*y pages open irrespective of the number of DIMM connectors that are populated (assuming that each DIMM has the ability to support up to 8 memory ranks). In essence, this approach de-couples the number of open memory pages from the number of DIMMs in the system.

Figure 64A:
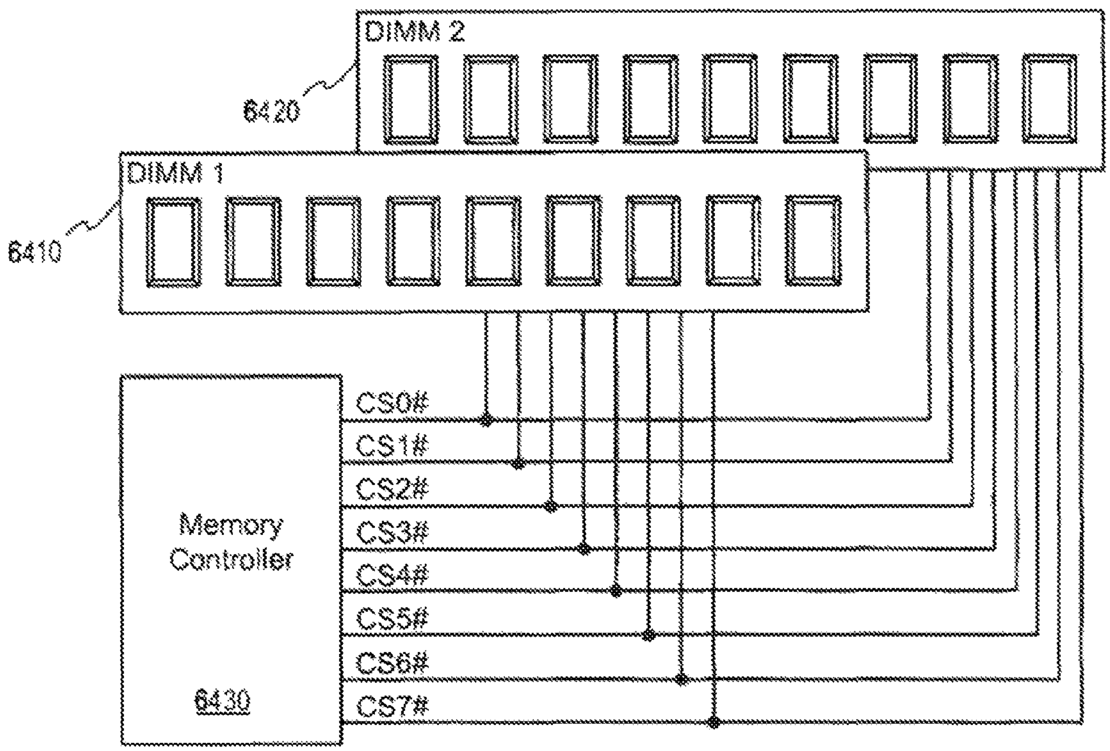
FIG. 64A illustrates a configuration between a memory controller and DIMMs.
Figure 64B:
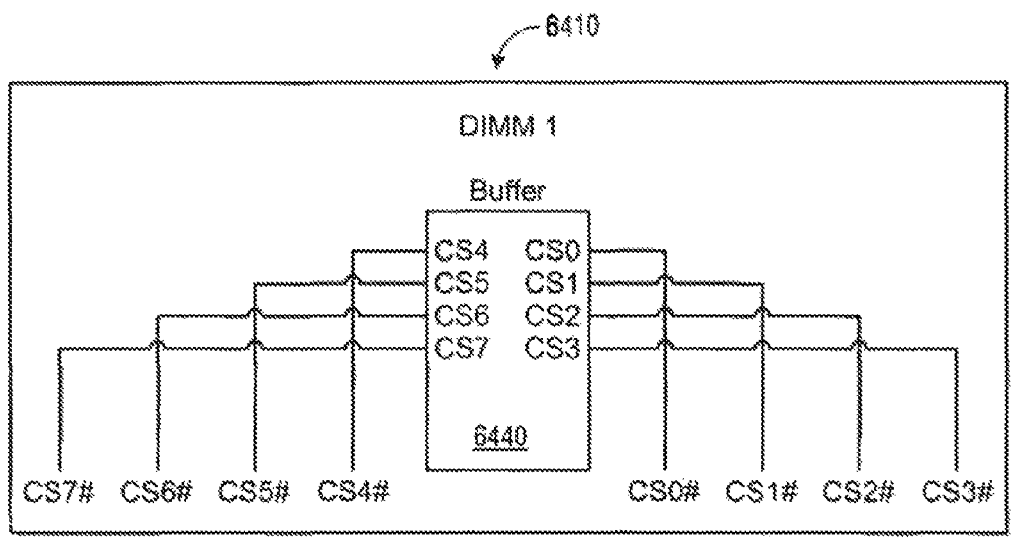
FIG. 64B illustrates the coupling of integrated circuit select lines to a buffer on a DIMM for configuring the number of ranks based on commands from the host system.

FIGS. 64A and 64B illustrate a memory system that configures the number of ranks in a DIMM based on commands from a host system. FIG. 64A illustrates a configuration between a memory controller and DIMMs. For this embodiment, all the integrated circuit select lines (e.g., CS0#-CS7#) are coupled between memory controller 6430 and DIMMs 6410 and 6420. FIG. 64B illustrates the coupling of integrated circuit select lines to a buffer on a DIMM for configuring the number of ranks based on commands from the host system. For this embodiment, all integrated circuit select lines (CS0#-CS7#) are coupled to buffer 6440 on DIMM 6410.

Virtualization and multi-core processors are enabling multiple operating systems and software threads to run concurrently on a common hardware platform. This means that multiple operating systems and threads must share the memory in the server, and the resultant context switches could result in increased transfers between the hard disk and memory.

Figure 63C:
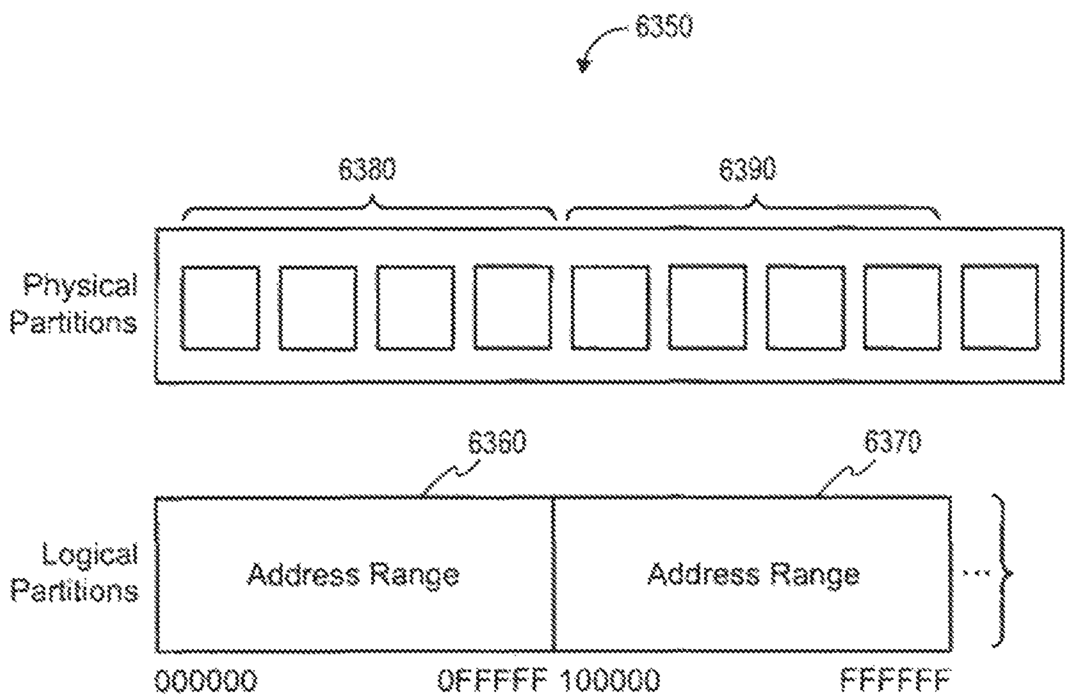
FIG. 63C illustrates one embodiment that provides a mapping between logical partitions of memory and physical partitions of memory.

In an embodiment enabling multiple operating systems and software threads to run concurrently on a common hardware platform, the buffer integrated circuit may allocate a set of one or more memory devices in a stack to a particular operating system or software thread, while another set of memory devices may be allocated to other operating systems or threads. In the example of FIG. 63C, the host system (not shown) may operate such that a first operating system is partitioned to a first logical address range 6360, corresponding to physical partition 6380, and all other operating systems are partitioned to a second logical address range 6370, corresponding to a physical partition 6390. On a context switch toward the first operating system or thread from another operating system or thread, the host system may notify the buffers on a DIMM or on multiple DIMMs of the nature of the context switch. This may be accomplished, for example, by the host system sending a command or control signal to the buffer integrated circuits either on the signal lines of the memory bus (i.e. in-band signaling) or on separate lines (i.e. side band signaling). An example of side band signaling would be to send a command to the buffer integrated circuits over an SMBus. The buffer integrated circuits may then place the memory integrated circuits allocated to the first operating system or thread 6380 in an active state while placing all the other memory integrated circuits allocated to other operating systems or threads 6390 (that are not currently being executed) in a low power or power down mode. This optional approach not only reduces the power dissipation in the memory stacks but also reduces accesses to the disk. For example, when the host system temporarily stops execution of an operating system or thread, the memory associated with the operating system or thread is placed in a low power mode but the contents are preserved. When the host system switches back to the operating system or thread at a later time, the buffer integrated circuits bring the associated memory out of the low power mode and into the active state and the operating system or thread may resume the execution from where it left off without having to access the disk for the relevant data. That is, each operating system or thread has a private main memory that is not accessible by other operating systems or threads. Note that this embodiment is applicable for both the single rank and the multi-rank buffer integrated circuits.

When users desire to increase the memory capacity of the host system, the normal method is to populate unused DIMM connectors with memory modules. However, when there are no more unpopulated connectors, users have traditionally removed the smaller capacity memory modules and replaced them with new, larger capacity memory modules. The smaller modules that were removed might be used on other host systems but typical practice is to discard them. It could be advantageous and cost-effective if users could increase the memory capacity of a system that has no unpopulated DIMM connectors without having to discard the modules being currently used.

In one embodiment employing a buffer integrated circuit, a connector or some other interposer is placed on the DIMM, either on the same side of the DIMM PCB as the buffer integrated circuits or on the opposite side of the DIMM PCB from the buffer integrated circuits. When a larger memory capacity is desired, the user may mechanically and electrically couple a PCB containing additional memory stacks to the DIMM PCB by means of the connector or interposer. To illustrate, an example multi-rank registered DIMM may have nine 8-bit wide stacks, where each stack contains a plurality of DRAM devices and a multi-rank buffer. For this example, the nine stacks may reside on one side of the DIMM PCB, and one or more connectors or interposers may reside on the other side of the DIMM PCB. The capacity of the DIMM may now be increased by mechanically and electrically coupling an additional PCB containing stacks of DRAM devices to the DIMM PCB using the connector(s) or interposer(s) on the DIMM PCB. For this embodiment, the multi-rank buffer integrated circuits on the DIMM PCB may detect the presence of the additional stacks and configure themselves to use the additional stacks in one or more configurations employing the additional stacks. It should be noted that it is not necessary for the stacks on the additional PCB to have the same memory capacity as the stacks on the DIMM PCB. In addition, if the stacks on the DIMM PCB may be connected to one integrated circuit select signal while the stacks on the additional PCB may be connected to another integrated circuit select signal. Alternately, the stacks on the DIMM PCB and the stacks on the additional PCB may be connected to the same set of integrated circuit select signals.

Figure 65:
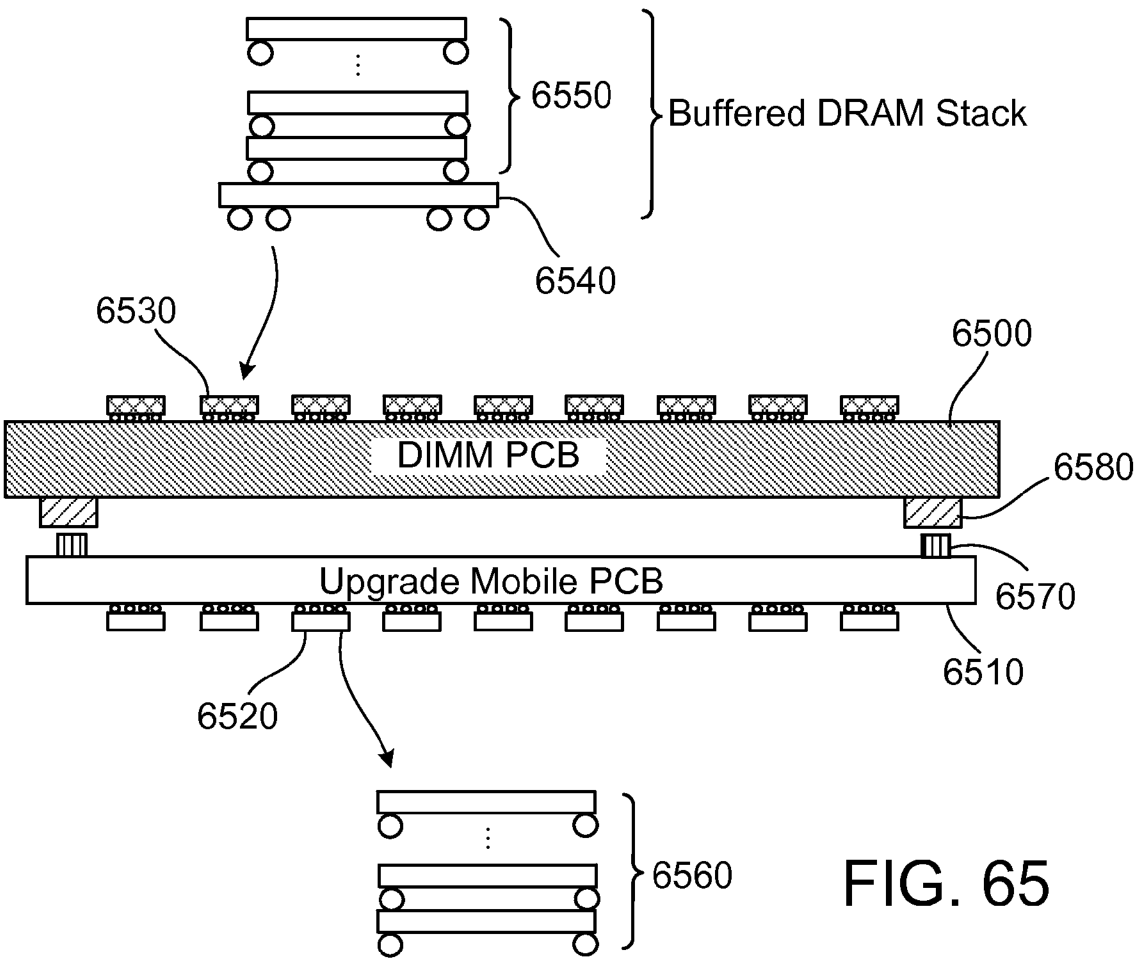
FIG. 65 illustrates one embodiment for a DIMM PCB with a connector or interposer with upgrade capability.

FIG. 65 illustrates one embodiment for a DIMM PCB with a connector or interposer with upgrade capability. A DIMM PCB 6500 comprises a plurality of buffered stacks, such as buffered stack 6530. As shown, buffered stack 6530 includes buffer integrated circuit 6540 and DRAM devices 6550. An upgrade module PCB 6510, which connects to DIMM PCB 6500 via connector or interposer 6580 and 6570, includes stacks of DRAMs, such as DRAM stack 6520. In this example and as shown in FIG. 65, the upgrade module PCB 6510 contains nine 8-bit wide stacks, wherein each stack contains only DRAM integrated circuits 6560. Each multi-rank buffer integrated circuit 6540 on DIMM PCB 6500, upon detection of the additional stack, re-configures itself such that it sits electrically between the host system and the two stacks of DRAM integrated circuits. That is, the buffer integrated circuit is now electrically between the host system and the stack on the DIMM PCB 6500 as well as the corresponding stack on the upgrade module PCB 6510. However, it should be noted that other embodiments of the buffer integrated circuit (6540), the DRAM stacks (6520), the DIMM PCB 6500, and the upgrade module PCB 6510 may be configured in various manners to achieve the same result, without deviating from the spirit or scope of the claims. For example, the stack 6520 on the additional PCB may also contain a buffer integrated circuit. So, in this example, the upgrade module 6510 may contain one or more buffer integrated circuits.

The buffer integrated circuits may map the addresses from the host system to the DRAM devices in the stacks in several ways. In one embodiment, the addresses may be mapped in a linear fashion, such that a bank of the virtual (or emulated) DRAM is mapped to a set of physical banks, and wherein each physical bank in the set is part of a different physical DRAM device. To illustrate, let us consider a stack containing eight 512 Mb DRAM integrated circuits (i.e. physical DRAM devices), each of which has four memory banks Let us also assume that the buffer integrated circuit is the multi-rank embodiment such that the host system sees two 2 Gb DRAM devices (i.e. virtual DRAM devices), each of which has eight banks. If we label the physical DRAM devices M0 through M7, then a linear address map may be implemented as shown below.

| Host System Address (Virtual Bank) | DRAM Device (Physical Bank) |
|---|---|
| Rank 0, Bank [0] | {(M4, Bank [0]), (M0, Bank [0])} |
| Rank 0, Bank [1] | {(M4, Bank [1]), (M0, Bank [1])} |
| Rank 0, Bank [2] | {(M4, Bank [2]), (M0, Bank [2])} |
| Rank 0, Bank [3] | {(M4, Bank [3]), (M0, Bank [3])} |
| Rank 0, Bank [4] | {(M6, Bank [0]), (M2, Bank [0])} |
| Rank 0, Bank [5] | {(M6, Bank [1]), (M2, Bank [1])} |
| Rank 0, Bank [6] | {(M6, Bank [2]), (M2, Bank [2])} |
| Rank 0, Bank [7] | {(M6, Bank [3]), (M2, Bank [3])} |
| Rank 1, Bank [0] | {(M5, Bank [0]), (M1, Bank [0])} |
| Rank 1, Bank [1] | {(M5, Bank [1]), (M1, Bank [1])} |
| Rank 1, Bank [2] | {(M5, Bank [2]), (M1, Bank [2])} |
| Rank 1, Bank [3] | {(M5, Bank [3]), (M1, Bank [3])} |
| Rank 1, Bank [4] | {(M7, Bank [0]), (M3, Bank [0])} |
| Rank 1, Bank [5] | {(M7, Bank [1]), (M3, Bank [1])} |
| Rank 1, Bank [6] | {(M7, Bank [2]), (M3, Bank [2])} |
| Rank 1, Bank [7] | {(M7, Bank [3]), (M3, Bank [3])} |

Figure 66:
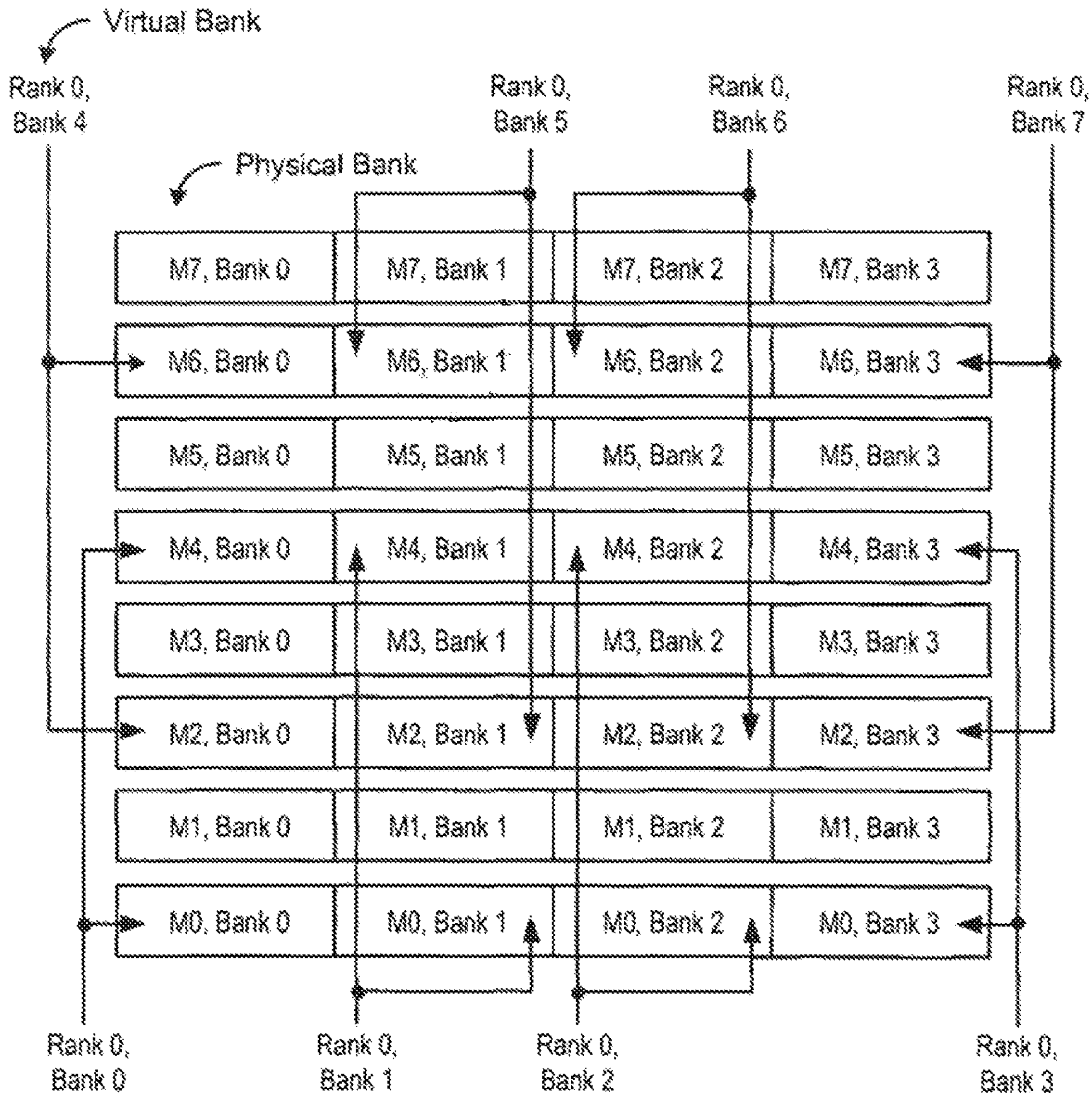
FIG. 66 illustrates an example of linear address mapping for use with a multi-rank buffer integrated circuit.

FIG. 66 illustrates an example of linear address mapping for use with a multi-rank buffer integrated circuit.

An example of a linear address mapping with a single-rank buffer integrated circuit is shown below.

| Host System Address (Virtual Bank) | DRAM Device (Physical Banks) |
|---|---|
| Rank 0, Bank [0] | {(M6, Bank [0]), (M4, Bank[0]), (M2, Bank [0]), (M0, Bank [0])} |
| Rank 0, Bank [1] | {(M6, Bank [1]), (M4, Bank[1]), (M2, Bank [1]), (M0, Bank [1])} |
| Rank 0, Bank [2] | {(M6, Bank [2]), (M4, Bank[2]), (M2, Bank [2]), (M0, Bank [2])} |

-continued

| Host System Address (Virtual Bank) | DRAM Device (Physical Banks) |
|---|---|
| Rank 0, Bank [3] | {(M6, Bank [3]), (M4, Bank[3]), (M2, Bank [3]), (M0, Bank [3])} |
| Rank 0, Bank [4] | {(M7, Bank [0]), (M5, Bank[0]), (M3, Bank [0]), (M1, Bank [0])} |
| Rank 0, Bank [5] | {(M7, Bank [1]), (M5, Bank[1]), (M3, Bank [1]), (M1, Bank [1])} |
| Rank 0, Bank [6] | {(M7, Bank [2]), (M5, Bank[2]), (M3, Bank [2]), (M1, Bank [2])} |
| Rank 0, Bank [7] | {(M7, Bank [3]), (M5, Bank[3]), (M3, Bank [3]), (M1, Bank [3])} |

Figure 67:
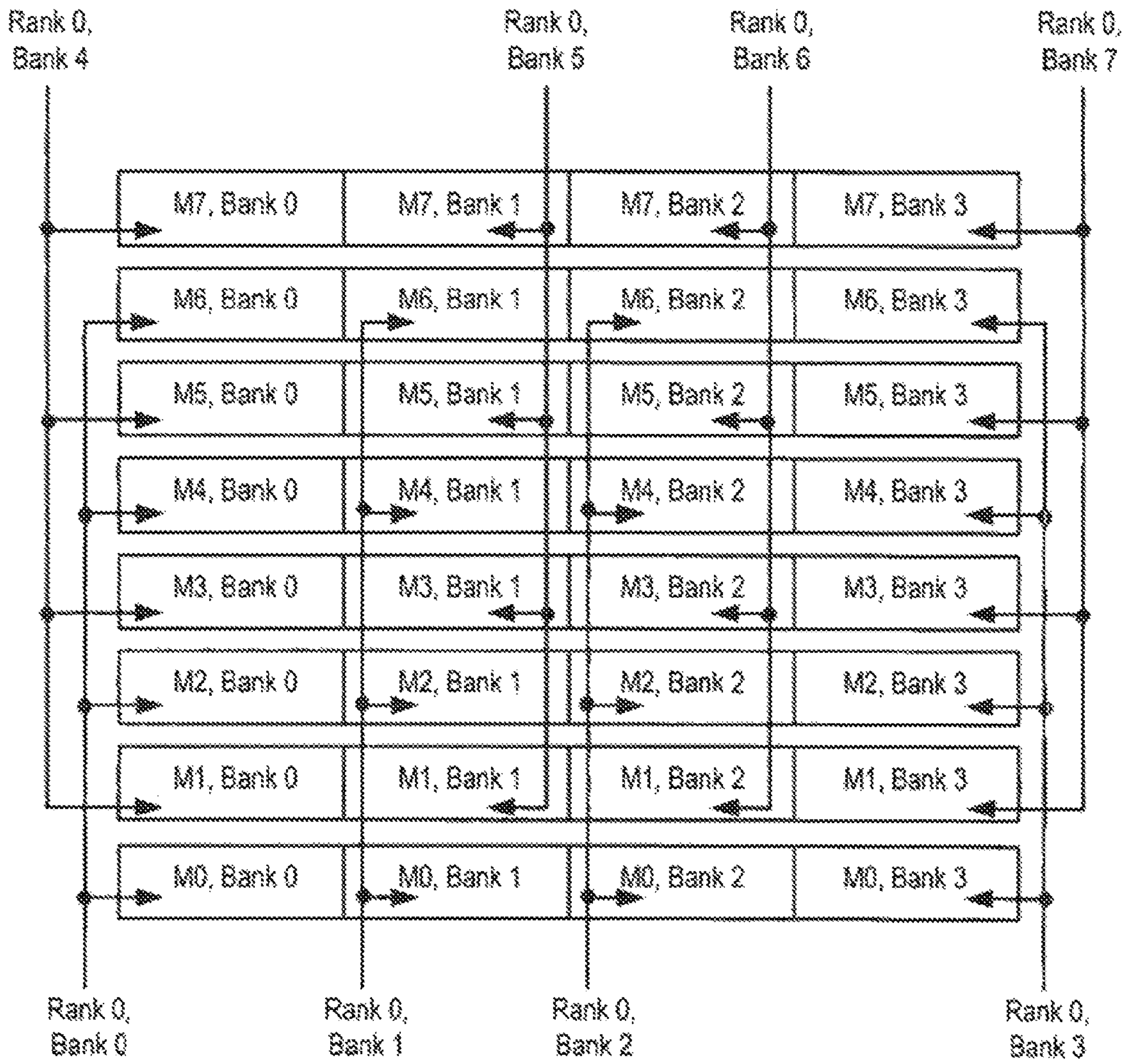
FIG. 67 illustrates an example of linear address mapping with a single rank buffer integrated circuit.

FIG. 67 illustrates an example of linear address mapping with a single rank buffer integrated circuit. Using this configuration, the stack of DRAM devices appears as a single 4 Gb integrated circuit with eight memory banks.

In another embodiment, the addresses from the host system may be mapped by the buffer integrated circuit such that one or more banks of the host system address (i.e. virtual banks) are mapped to a single physical DRAM integrated circuit in the stack ("bank slice" mapping).

Figure 68:
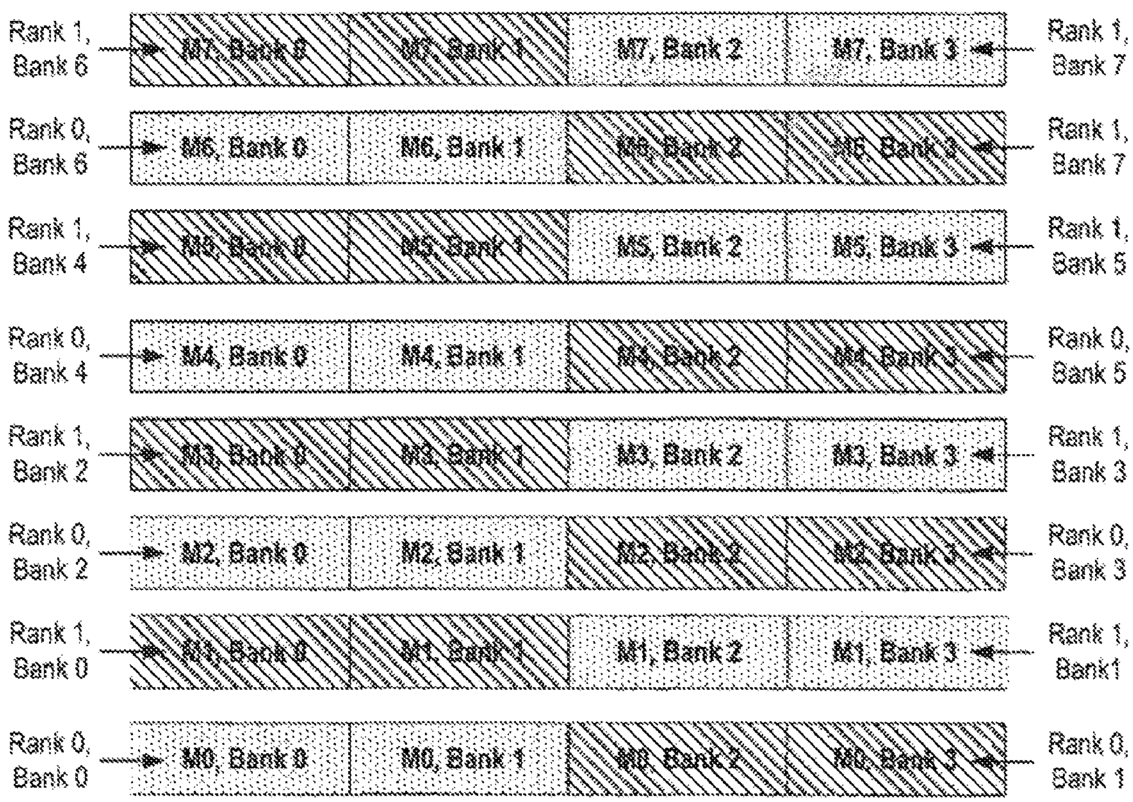
FIG. 68 illustrates an example of "bit slice" address mapping with a multi-rank buffer integrated circuit.

FIG. 68 illustrates an example of bank slice address mapping with a multi-rank buffer integrated circuit. Also, an example of a bank slice address mapping is shown below.

| Host System Address (Virtual Bank) | DRAM Device (Physical Bank) |
|---|---|
| Rank 0, Bank [0] | M0, Bank [1:0] |
| Rank 0, Bank [1] | M0, Bank [3:2] |
| Rank 0, Bank [2] | M2, Bank [1:0] |
| Rank 0, Bank [3] | M2, Bank [3:2] |
| Rank 0, Bank [4] | M4, Bank [1:0] |
| Rank 0, Bank [5] | M4, Bank [3:2] |
| Rank 0, Bank [6] | M6, Bank [1:0] |
| Rank 0, Bank [7] | M6, Bank [3:2] |
| Rank 1, Bank [0] | M1, Bank [1:0] |
| Rank 1, Bank [1] | M1, Bank [3:2] |
| Rank 1, Bank [2] | M3, Bank [1:0] |
| Rank 1, Bank [3] | M3, Bank [3:2] |
| Rank 1, Bank [4] | M5, Bank [1:0] |
| Rank 1, Bank [5] | M5, Bank [3:2] |
| Rank 1, Bank [6] | M7, Bank [1:0] |
| Rank 1, Bank [7] | M7, Bank [3:2] |

The stack of this example contains eight 512 Mb DRAM integrated circuits, each with four memory banks. In this example, a multi-rank buffer integrated circuit is assumed, which means that the host system sees the stack as two 2 Gb DRAM devices, each having eight banks.

Figure 69:
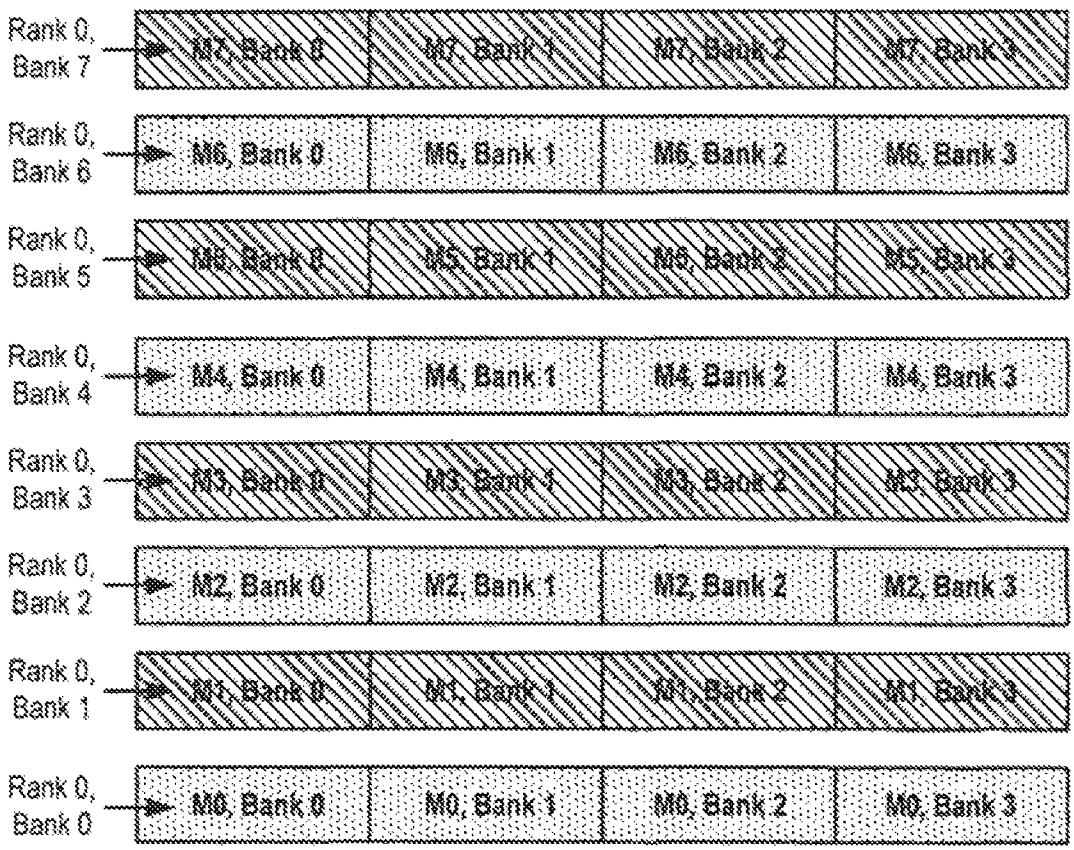
FIG. 69 illustrates an example of "bit slice" address mapping with a single rank buffer integrated circuit.

FIG. 69 illustrates an example of bank slice address mapping with a single rank buffer integrated circuit. The bank slice mapping with a single-rank buffer integrated circuit is shown below.

| Host System Address (Virtual Bank) | DRAM Device (Physical Device) |
|---|---|
| Rank 0, Bank [0] | M0 |
| Rank 0, Bank [1] | M1 |
| Rank 0, Bank [2] | M2 |
| Rank 0, Bank [3] | M3 |
| Rank 0, Bank [4] | M4 |
| Rank 0, Bank [5] | M5 |
| Rank 0, Bank [6] | M6 |
| Rank 0, Bank [7] | M7 |

The stack of this example contains eight 512 Mb DRAM devices so that the host system sees the stack as a single 4 Gb device with eight banks. The address mappings shown above are for illustrative purposes only. Other mappings may be implemented without deviating from the spirit and scope of the claims.

Bank slice address mapping enables the virtual DRAM to reduce or eliminate some timing constraints that are inherent in the underlying physical DRAM devices. For instance, the physical DRAM devices may have a tFAW (4 bank activate window) constraint that limits how frequently an activate operation may be targeted to a physical DRAM device. However, a virtual DRAM circuit that uses bank slice address mapping may not have this constraint. As an example, the address mapping in FIG. 68 maps two banks of the virtual DRAM device to a single physical DRAM device. So, the tFAW constraint is eliminated because the tRC timing parameter prevents the host system from issuing more than two consecutive activate commands to any given physical DRAM device within a tRC window (and tRC>tFAW). Similarly, a virtual DRAM device that uses the address mapping in FIG. 69 eliminates the tRRD constraint of the underlying physical DRAM devices.

In addition, a bank slice address mapping scheme enables the buffer integrated circuit or the host system to power manage the DRAM devices on a DIMM on a more granular level. To illustrate this, consider a virtual DRAM device that uses the address mapping shown in FIG. 69, where each bank of the virtual DRAM device corresponds to a single physical DRAM device. So, when bank 0 of the virtual DRAM device (i.e. virtual bank 0) is accessed, the corresponding physical DRAM device M0 may be in the active mode. However, when there is no outstanding access to virtual bank 0, the buffer integrated circuit or the host system (or any other entity in the system) may place DRAM device M0 in a low power (e.g. power down) mode. While it is possible to place a physical DRAM device in a low power mode, it is not possible to place a bank (or portion) of a physical DRAM device in a low power mode while the remaining banks (or portions) of the DRAM device are in the active mode. However, a bank or set of banks of a virtual DRAM circuit may be placed in a low power mode while other banks of the virtual DRAM circuit are in the active mode since a plurality of physical DRAM devices are used to emulate a virtual DRAM device. It can be seen from FIG. 69 and FIG. 67, for example, that fewer virtual banks are mapped to a physical DRAM device with bank slice mapping (FIG. 69) than with linear mapping (FIG. 67). Thus, the likelihood that all the (physical) banks in a physical DRAM device are in the precharge state at any given time is higher with bank slice mapping than with linear mapping. Therefore, the buffer integrated circuit or the host system (or some other entity in the system) has more opportunities to place various physical DRAM devices in a low power mode when bank slide mapping is used.

In several market segments, it may be desirable to preserve the contents of main memory (usually, DRAM) either periodically or when certain events occur. For example, in the supercomputer market, it is common for the host system to periodically write the contents of main memory to the hard drive. That is, the host system creates periodic checkpoints. This method of checkpointing enables the system to re-start program execution from the last checkpoint instead of from the beginning in the event of a system crash. In other markets, it may be desirable for the contents of one or more address ranges to be periodically stored in non-volatile memory to protect against power failures or system crashes. All these features may be optionally implemented in a buffer integrated circuit disclosed herein by integrating one or more non-volatile memory integrated circuits (e.g. flash memory) into the stack. In some embodiments, the buffer integrated circuit is designed to interface with one or more stacks containing DRAM devices and non-volatile memory integrated circuits. Note that each of these stacks may contain only DRAM devices or contain only non-volatile memory integrated circuits or contain a mixture of DRAM and non-volatile memory integrated circuits.

Figure 70A:
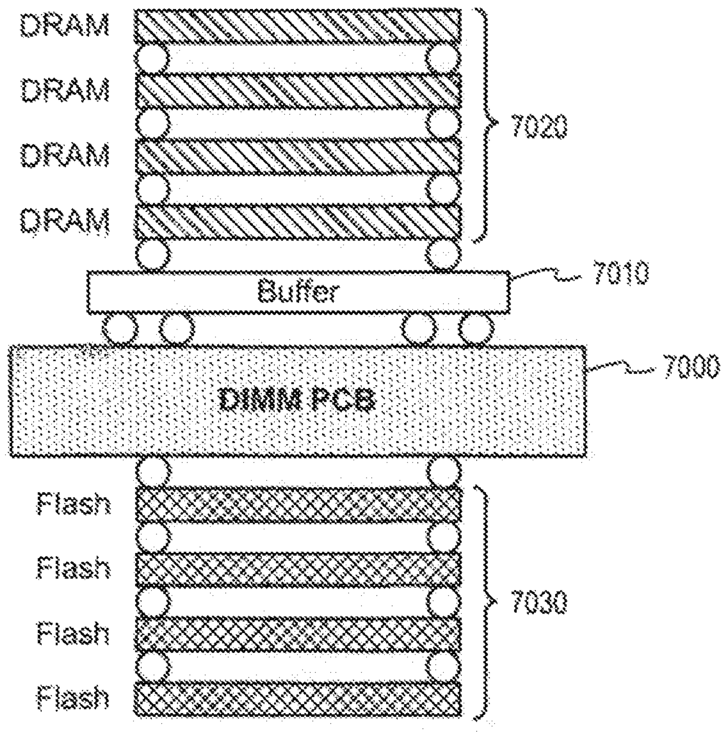
FIGS. 70A and 70B illustrate examples of buffered stacks that contain DRAM and non-volatile memory integrated circuits.
Figure 70B:
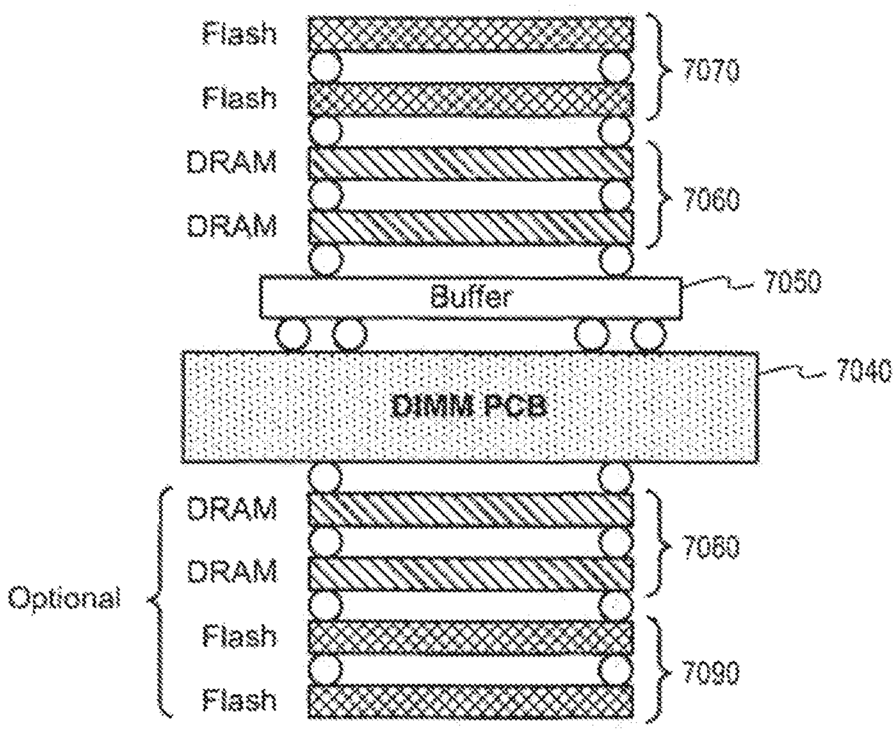

FIGS. 70A and 70B illustrate examples of buffered stacks that contain both DRAM and non-volatile memory integrated circuits. A DIMM PCB 7000 includes a buffered stack (buffer 7010 and DRAMs 7020) and flash 7030. In another embodiment shown in FIG. 70B, DIMM PCB 7040 includes a buffered stack (buffer 7050, DRAMs 7060 and flash 7070). An optional non-buffered stack includes at least one non-volatile memory device (e.g., flash 7090) or DRAM device 7080. All the stacks that connect to a buffer integrated circuit may be on the same PCB as the buffer integrated circuit or some of the stacks may be on the same PCB while other stacks may be on another PCB that is electrically and mechanically coupled by means of a connector or an interposer to the PCB containing the buffer integrated circuit.

In some embodiments, the buffer integrated circuit copies some or all of the contents of the DRAM devices in the stacks that it interfaces with to the non-volatile memory integrated circuits in the stacks that it interfaces with. This event may be triggered, for example, by a command or signal from the host system to the buffer integrated circuit, by an external signal to the buffer integrated circuit, or upon the detection (by the buffer integrated circuit) of an event or a catastrophic condition like a power failure. As an example, let us assume that a buffer integrated circuit interfaces with a plurality of stacks that contain 4 Gb of DRAM memory and 4 Gb of non-volatile memory. The host system may periodically issue a command to the buffer integrated circuit to copy the contents of the DRAM memory to the non-volatile memory. That is, the host system periodically checkpoints the contents of the DRAM memory. In the event of a system crash, the contents of the DRAM may be restored upon re-boot by copying the contents of the non-volatile memory back to the DRAM memory. This provides the host system with the ability to periodically check point the memory.

In another embodiment, the buffer integrated circuit may monitor the power supply rails (i.e. voltage rails or voltage planes) and detect a catastrophic event, for example, a power supply failure. Upon detection of this event, the buffer integrated circuit may copy some or all the contents of the DRAM memory to the non-volatile memory. The host system may also provide a non-interruptible source of power to the buffer integrated circuit and the memory stacks for at least some period of time after the power supply failure to allow the buffer integrated circuit to copy some or all the contents of the DRAM memory to the non-volatile memory. In other embodiments, the memory module may have a built-in backup source of power for the buffer integrated circuits and the memory stacks in the event of a host system power supply failure. For example, the memory module may have a battery or a large capacitor and an isolation switch on the module itself to provide backup power to the buffer integrated circuits and the memory stacks in the event of a host system power supply failure.

A memory module, as described above, with a plurality of buffers, each of which interfaces to one or more stacks containing DRAM and non-volatile memory integrated circuits, may also be configured to provide instant-on capability. This may be accomplished by storing the operating system, other key software, and frequently used data in the non-volatile memory.

In the event of a system crash, the memory controller of the host system may not be able to supply all the necessary signals needed to maintain the contents of main memory. For example, the memory controller may not send periodic refresh commands to the main memory, thus causing the loss of data in the memory. The buffer integrated circuit may be designed to prevent such loss of data in the event of a system crash. In one embodiment, the buffer integrated circuit may monitor the state of the signals from the memory controller of the host system to detect a system crash. As an example, the buffer integrated circuit may be designed to detect a system crash if there has been no activity on the memory bus for a pre-determined or programmable amount of time or if the buffer integrated circuit receives an illegal or invalid command from the memory controller.

Alternately, the buffer integrated circuit may monitor one or more signals that are asserted when a system error or system halt or system crash has occurred. For example, the buffer integrated circuit may monitor the HT_SyncFlood signal in an Opteron processor based system to detect a system error. When the buffer integrated circuit detects this event, it may de-couple the memory bus of the host system from the memory integrated circuits in the stack and internally generate the signals needed to preserve the contents of the memory integrated circuits until such time as the host system is operational. So, for example, upon detection of a system crash, the buffer integrated circuit may ignore the signals from the memory controller of the host system and instead generate legal combinations of signals like CKE, CS#, RAS#, CAS#, and WE# to maintain the data stored in the DRAM devices in the stack, and also generate periodic refresh signals for the DRAM integrated circuits. Note that there are many ways for the buffer integrated circuit to detect a system crash, and all these variations fall within the scope of the claims.

Placing a buffer integrated circuit between one or more stacks of memory integrated circuits and the host system allows the buffer integrated circuit to compensate for any skews or timing variations in the signals from the host system to the memory integrated circuits and from the memory integrated circuits to the host system. For example, at higher speeds of operation of the memory bus, the trace lengths of signals between the memory controller of the host system and the memory integrated circuits are often matched. Trace length matching is challenging especially in small form factor systems. Also, DRAM processes do not readily lend themselves to the design of high speed I/O circuits. Consequently, it is often difficult to align the I/O signals of the DRAM integrated circuits with each other and with the associated data strobe and clock signals.

In one embodiment of a buffer integrated circuit, circuitry that adjusts the timing of the I/O signals may be incorporated. In other words, the buffer integrated circuit may have the ability to do per-pin timing calibration to compensate for skews or timing variations in the I/O signals. For example, say that the DQ[0] data signal between the buffer integrated circuit and the memory controller has a shorter trace length or has a smaller capacitive load than the other data signals, DQ[7:1]. This results in a skew in the data signals since not all the signals arrive at the buffer integrated circuit (during a memory write) or at the memory controller (during a memory read) at the same time. When left uncompensated, such skews tend to limit the maximum frequency of operation of the memory sub-system of the host system. By incorporating per-pin timing calibration and compensation circuits into the I/O circuits of the buffer integrated circuit, the DQ[0] signal may be driven later than the other data signals by the buffer integrated circuit (during a memory read) to compensate for the shorter trace length of the DQ[0] signal. Similarly, the per-pin timing calibration and compensation circuits allow the buffer integrated circuit to delay the DQ[0] data signal such that all the data signals, DQ[7:0], are aligned for sampling during a memory write operation. The per-pin timing calibration and compensation circuits also allow the buffer integrated circuit to compensate for timing variations in the I/O pins of the DRAM devices. A specific pattern or sequence may be used by the buffer integrated circuit to perform the per-pin timing calibration of the signals that connect to the memory controller of the host system and the per-pin timing calibration of the signals that connect to the memory devices in the stack.

Incorporating per-pin timing calibration and compensation circuits into the buffer integrated circuit also enables the buffer integrated circuit to gang a plurality of slower DRAM devices to emulate a higher speed DRAM integrated circuit to the host system. That is, incorporating per-pin timing calibration and compensation circuits into the buffer integrated circuit also enables the buffer integrated circuit to gang a plurality of DRAM devices operating at a first clock speed and emulate to the host system one or more DRAM integrated circuits operating at a second clock speed, wherein the first clock speed is slower than the second clock speed.

For example, the buffer integrated circuit may operate two 8-bit wide DDR2 SDRAM devices in parallel at a 533 MHz data rate such that the host system sees a single 8-bit wide DDR2 SDRAM integrated circuit that operates at a 1066 MHz data rate. Since, in this example, the two DRAM devices are DDR2 devices, they are designed to transmit or receive four data bits on each data pin for a memory read or write respectively (for a burst length of 4). So, the two DRAM devices operating in parallel may transmit or receive sixty four bits per data pin per memory read or write respectively in this example. Since the host system sees a single DDR2 integrated circuit behind the buffer, it will only receive or transmit thirty-two data bits per pin per memory read or write respectively. In order to accommodate for the different data widths, the buffer integrated circuit may make use of the DM signal (Data Mask). Say that the host system sends DA[7:0], DB[7:0], DC[7:0], and DD[7:0] to the buffer integrated circuit at a 1066 MHz data rate. The buffer integrated circuit may send DA[7:0], DC[7:0], XX, and XX to the first DDR2 SDRAM integrated circuit and send DB[7:0], DD[7:0], XX, and XX to the second DDR2 SDRAM integrated circuit, where XX denotes data that is masked by the assertion (by the buffer integrated circuit) of the DM inputs to the DDR2 SDRAM integrated circuits.

In another embodiment, the buffer integrated circuit operates two slower DRAM devices as a single, higher-speed, wider DRAM. To illustrate, the buffer integrated circuit may operate two 8-bit wide DDR2 SDRAM devices running at 533 MHz data rate such that the host system sees a single 16-bit wide DDR2 SDRAM integrated circuit operating at a 1066 MHz data rate. In this embodiment, the buffer integrated circuit may not use the DM signals. In another embodiment, the buffer integrated circuit may be designed to operate two DDR2 SDRAM devices (in this example, 8-bit wide, 533 MHz data rate integrated circuits) in parallel, such that the host system sees a single DDR3 SDRAM integrated circuit (in this example, an 8-bit wide, 1066 MHz data rate, DDR3 device). In another embodiment, the buffer integrated circuit may provide an interface to the host system that is narrower and faster than the interface to the DRAM integrated circuit. For example, the buffer integrated circuit may have a 16-bit wide, 533 MHz data rate interface to one or more DRAM devices but have an 8-bit wide, 1066 MHz data rate interface to the host system.

In addition to per-pin timing calibration and compensation capability, circuitry to control the slew rate (i.e. the rise and fall times), pull-up capability or strength, and pull-down capability or strength may be added to each I/O pin of the buffer integrated circuit or optionally, in common to a group of I/O pins of the buffer integrated circuit. The output drivers and the input receivers of the buffer integrated circuit may have the ability to do pre-emphasis in order to compensate for non-uniformities in the traces connecting the buffer integrated circuit to the host system and to the memory integrated circuits in the stack, as well as to compensate for the characteristics of the I/O pins of the host system and the memory integrated circuits in the stack.

Stacking a plurality of memory integrated circuits (both volatile and non-volatile) has associated thermal and power delivery characteristics. Since it is quite possible that all the memory integrated circuits in a stack may be in the active mode for extended periods of time, the power dissipated by all these integrated circuits may cause an increase in the ambient, case, and junction temperatures of the memory integrated circuits. Higher junction temperatures typically have negative impact on the operation of ICs in general and DRAMs in particular. Also, when a plurality of DRAM devices are stacked on top of each other such that they share voltage and ground rails (i.e. power and ground traces or planes), any simultaneous operation of the integrated circuits may cause large spikes in the voltage and ground rails. For example, a large current may be drawn from the voltage rail when all the DRAM devices in a stack are refreshed simultaneously, thus causing a significant disturbance (or spike) in the voltage and ground rails. Noisy voltage and ground rails affect the operation of the DRAM devices especially at high speeds. In order to address both these phenomena, several inventive techniques are disclosed below.

One embodiment uses a stacking technique wherein one or more layers of the stack have decoupling capacitors rather than memory integrated circuits. For example, every fifth layer in the stack may be a power supply decoupling layer (with the other four layers containing memory integrated circuits). The layers that contain memory integrated circuits are designed with more power and ground balls or pins than are present in the pin out of the memory integrated circuits. These extra power and ground balls are preferably disposed along all the edges of the layers of the stack.

Figures 71A, 71B, 71C:
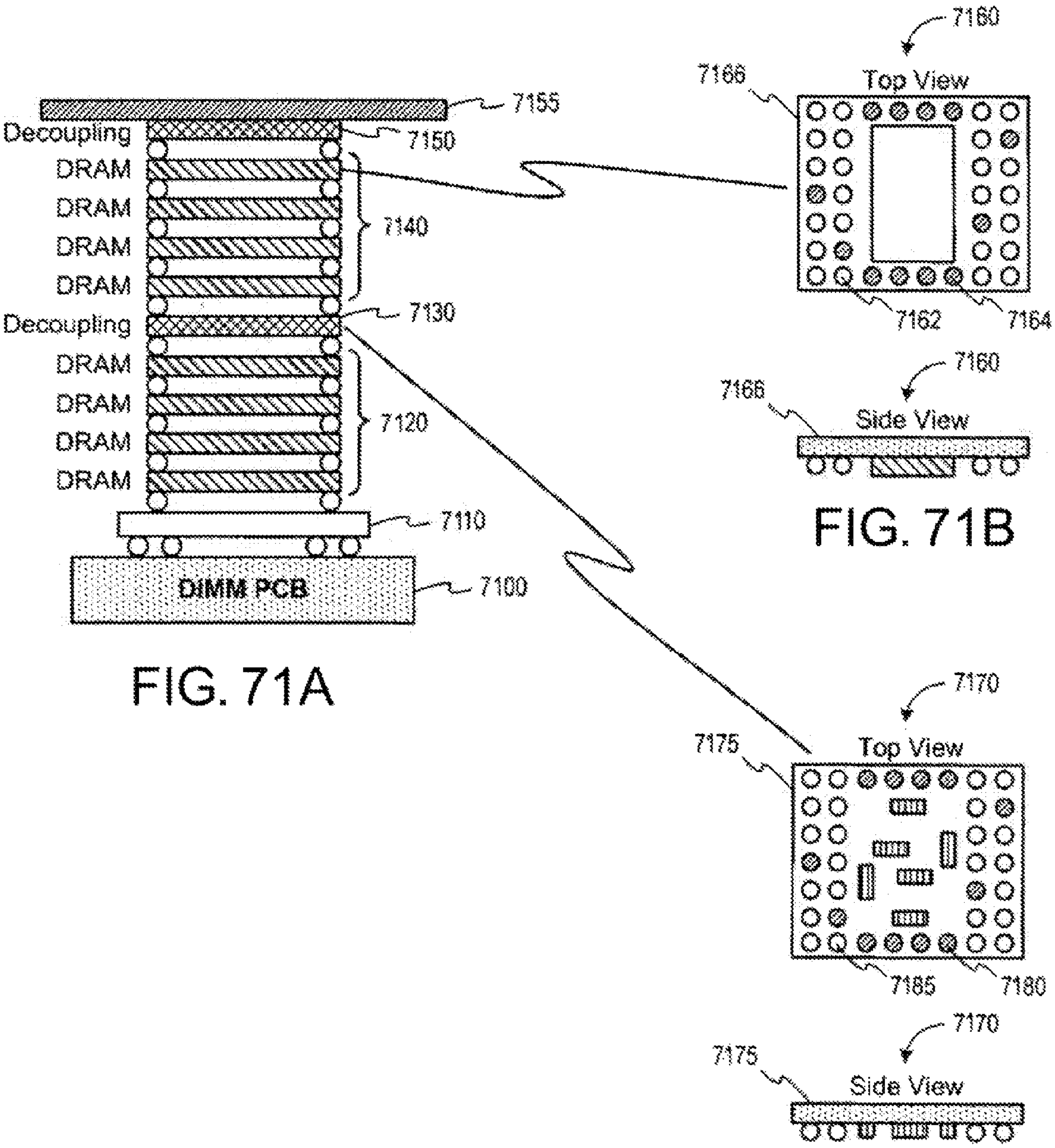
FIGS. 71A, 71B and 71C illustrate one embodiment of a buffered stack with power decoupling layers.

FIGS. 71A, 71B and 71C illustrate one embodiment of a buffered stack with power decoupling layers. As shown in FIG. 71A, DIMM PCB 7100 includes a buffered stack of DRAMs including decoupling layers. Specifically, for this embodiment, the buffered stack includes buffer 7110, a first set of DRAM devices 7120, a first decoupling layer 7130, a second set of DRAM devices 7140, and an optional second decoupling layer 7150. The stack also has an optional heat sink or spreader 7155.

FIG. 71B illustrates top and side views of one embodiment for a DRAM die. A DRAM die 7160 includes a package (stack layer) 7166 with signal/power/GND balls 7162 and one or more extra power/GND balls 7164. The extra power/GND balls 7164 increase thermal conductivity.

FIG. 71C illustrates top and side views of one embodiment of a decoupling layer. A decoupling layer 7175 includes one or more decoupling capacitors 7170, signal/power/GND balls 7185, and one or more extra power/GND balls 7180. The extra power/GND balls 7180 increases thermal conductivity.

The extra power and ground balls, shown in FIGS. 71B and 71C, form thermal conductive paths between the memory integrated circuits and the PCB containing the stacks, and between the memory integrated circuits and optional heat sinks or heat spreaders. The decoupling capacitors in the power supply decoupling layer connect to the relevant power and ground pins in order to provide quiet voltage and ground rails to the memory devices in the stack. The stacking technique described above is one method of providing quiet power and ground rails to the memory integrated circuits of the stack and also to conduct heat away from the memory integrated circuits.

In another embodiment, the noise on the power and ground rails may be reduced by preventing the DRAM integrated circuits in the stack from performing an operation simultaneously. As mentioned previously, a large amount of current will be drawn from the power rails if all the DRAM integrated circuits in a stack perform a refresh operation simultaneously. The buffer integrated circuit may be designed to stagger or spread out the refresh commands to the DRAM integrated circuits in the stack such that the peak current drawn from the power rails is reduced. For example, consider a stack with four 1 Gb DDR2 SDRAM integrated circuits that are emulated by the buffer integrated circuit to appear as a single 4 Gb DDR2 SDRAM integrated circuit to the host system. The JEDEC specification provides for a refresh cycle time (i.e. tRFC) of 400 ns for a 4 Gb DRAM integrated circuit while a 1 Gb DRAM integrated circuit has a tRFC specification of 110 ns. So, when the host system issues a refresh command to the emulated 4 Gb DRAM integrated circuit, it expects the refresh to be done in 400 ns. However, since the stack contains four 1 Gb DRAM integrated circuits, the buffer integrated circuit may issue separate refresh commands to each of the 1 Gb DRAM integrated circuit in the stack at staggered intervals. As an example, upon receipt of the refresh command from the host system, the buffer integrated circuit may issue a refresh command to two of the four 1 Gb DRAM integrated circuits, and 200 ns later, issue a separate refresh command to the remaining two 1 Gb DRAM integrated circuits. Since the 1 Gb DRAM integrated circuits require 110 ns to perform the refresh operation, all four 1 Gb DRAM integrated circuits in the stack will have performed the refresh operation before the 400 ns refresh cycle time (of the 4 Gb DRAM integrated circuit) expires. This staggered refresh operation limits the maximum current that may be drawn from the power rails. It should be noted that other implementations that provide the same benefits are also possible, and are covered by the scope of the claims.

In one embodiment, a device for measuring the ambient, case, or junction temperature of the memory integrated circuits (e.g. a thermal diode) can be embedded into the stack. Optionally, the buffer integrated circuit associated with a given stack may monitor the temperature of the memory integrated circuits. When the temperature exceeds a limit, the buffer integrated circuit may take suitable action to prevent the over-heating of and possible damage to the memory integrated circuits. The measured temperature may optionally be made available to the host system.

Other features may be added to the buffer integrated circuit so as to provide optional features. For example, the buffer integrated circuit may be designed to check for memory errors or faults either on power up or when the host system instructs it do so. During the memory check, the buffer integrated circuit may write one or more patterns to the memory integrated circuits in the stack, read the contents back, and compare the data read back with the written data to check for stuck-at faults or other memory faults.

Power Management

Figure 72A:
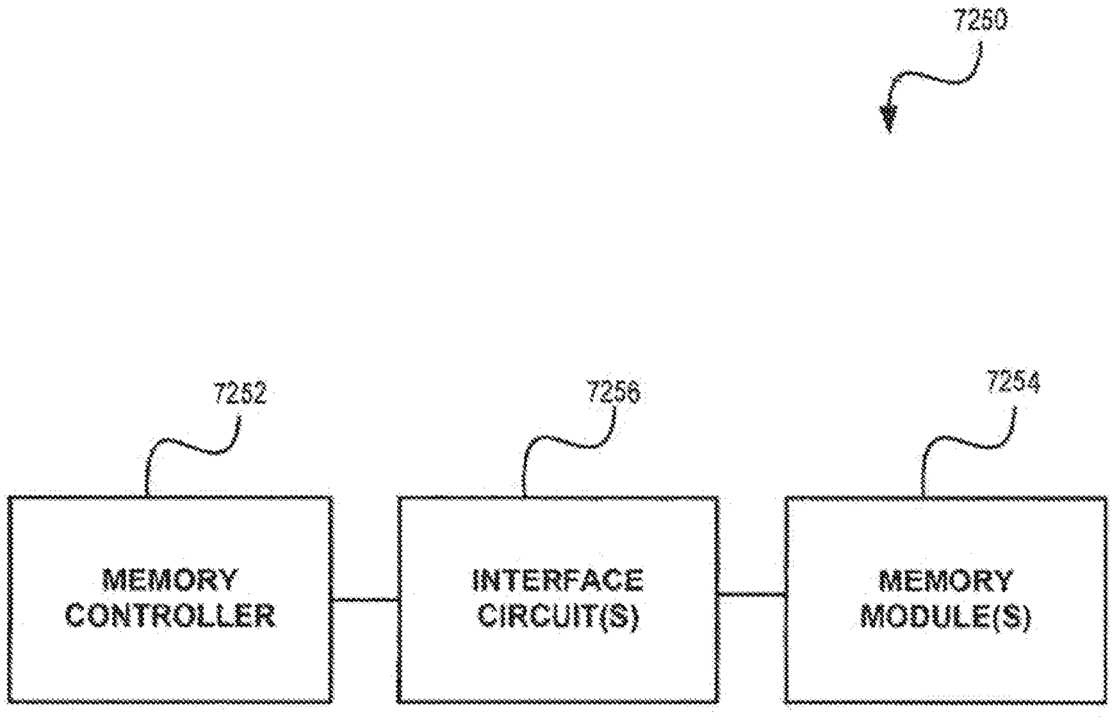
FIG. 72A depicts a memory system for adjusting the timing of signals associated with the memory system, in accordance with one embodiment.

FIG. 72A depicts a memory system 7250 for adjusting the timing of signals associated with the memory system 7250, in accordance with one embodiment. As shown, a memory controller 7252 is provided. In the context of the present description, a memory controller refers to any device capable of sending instructions or commands, or otherwise controlling memory circuits. Additionally, at least one memory module 7254 is provided. Further, at least one interface circuit 7256 is provided, the interface circuit capable of adjusting timing of signals associated with one or more of the memory controller 7252 and the at least one memory module 7254.

The signals may be any signals associated with the memory system 7250. For example, in various embodiments, the signals may include address signals, control signals, data signals, commands, etc. As an option, the timing may be adjusted based on a type of the signal (e.g. a command, etc.). As another option, the timing may be adjusted based on a sequence of commands.

In one embodiment, the adjustment of the timing of the signals may allow for the insertion of additional logic for use in the memory system 7250. In this case, the additional logic may be utilized to improve performance of one or more aspects of the memory system 7250. For example, in various embodiments the additional logic may be utilized to improve and/or implement reliability, accessibility and serviceability (RAS) functions, power management functions, mirroring of memory, and other various functions. As an option, the performance of the one or more aspects of the memory system may be improved without physical changes to the memory system 7250.

Additionally, in one embodiment, the timing may be adjusted based on at least one timing requirement. In this case, the at least one timing requirement may be specified by at least one timing parameter at one or more interfaces included in the memory system 7250. For example, in one case, the adjustment may include modifying one or more delays. Strictly as an option, the timing parameters may be modified to allow the adjusting of the timing.

More illustrative information will now be set forth regarding various optional architectures and features of different embodiments with which the foregoing framework may or may not be implemented, per the specification of a user. It should be strongly noted that the following information is set forth for illustrative purposes and should not be construed as limiting in any manner. Any of the following features may be optionally incorporated with or without the other features described.

Figure 72B:
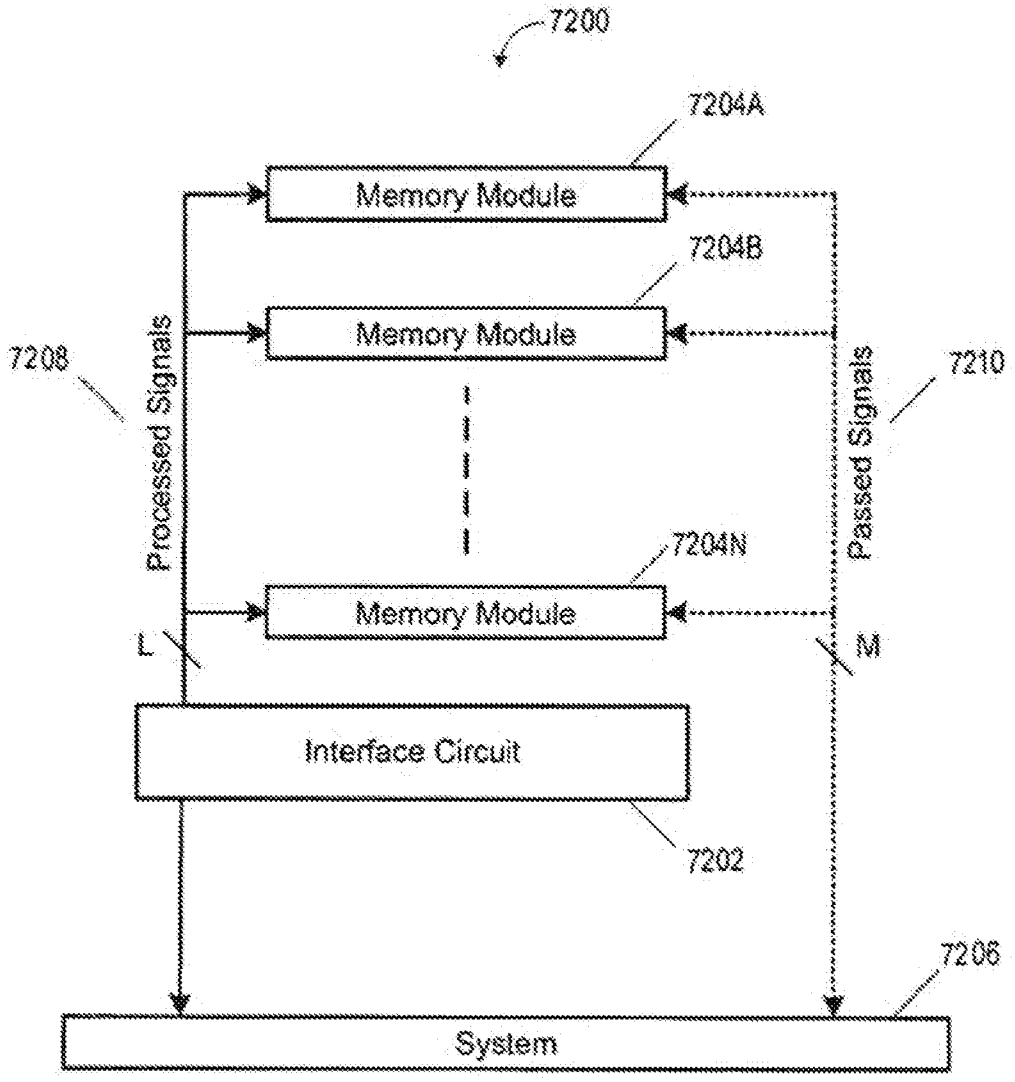
FIG. 72B depicts a memory system for adjusting the timing of signals associated with the memory system, in accordance with another embodiment.

FIG. 72B depicts a memory system 7200 for adjusting the timing of signals associated with the memory system 7200, in accordance with another embodiment. As an option, the present system 7200 may be implemented in the context of the functionality and architecture of FIG. 72A. Of course, however, the system 7200 may be implemented in any desired environment. It should also be noted that the aforementioned definitions may apply during the present description.

As shown, the memory system 7200 includes an interface circuit 7202 disposed electrically between a system 7206 and one or more memory modules 7204A-7204N. Processed signals 7208 between the system 7206 and the memory modules 7204A-7204N pass through an interface circuit 7202. Passed signals 7210 may be routed directly between the system 7206 and the memory modules 7204A-7204N without being routed through the interface circuit 7202. The processed signals 7208 are inputs or outputs to the interface circuit 7202, and may be processed by the interface circuit logic to adjust the timing of address, control and/or data signals in order to that improve performance of a memory system. In one embodiment, the interface circuit 7202 may adjust timing of address, control and/or data signals in order to allow insertion of additional logic that improves performance of a memory system.

Figure 72C:
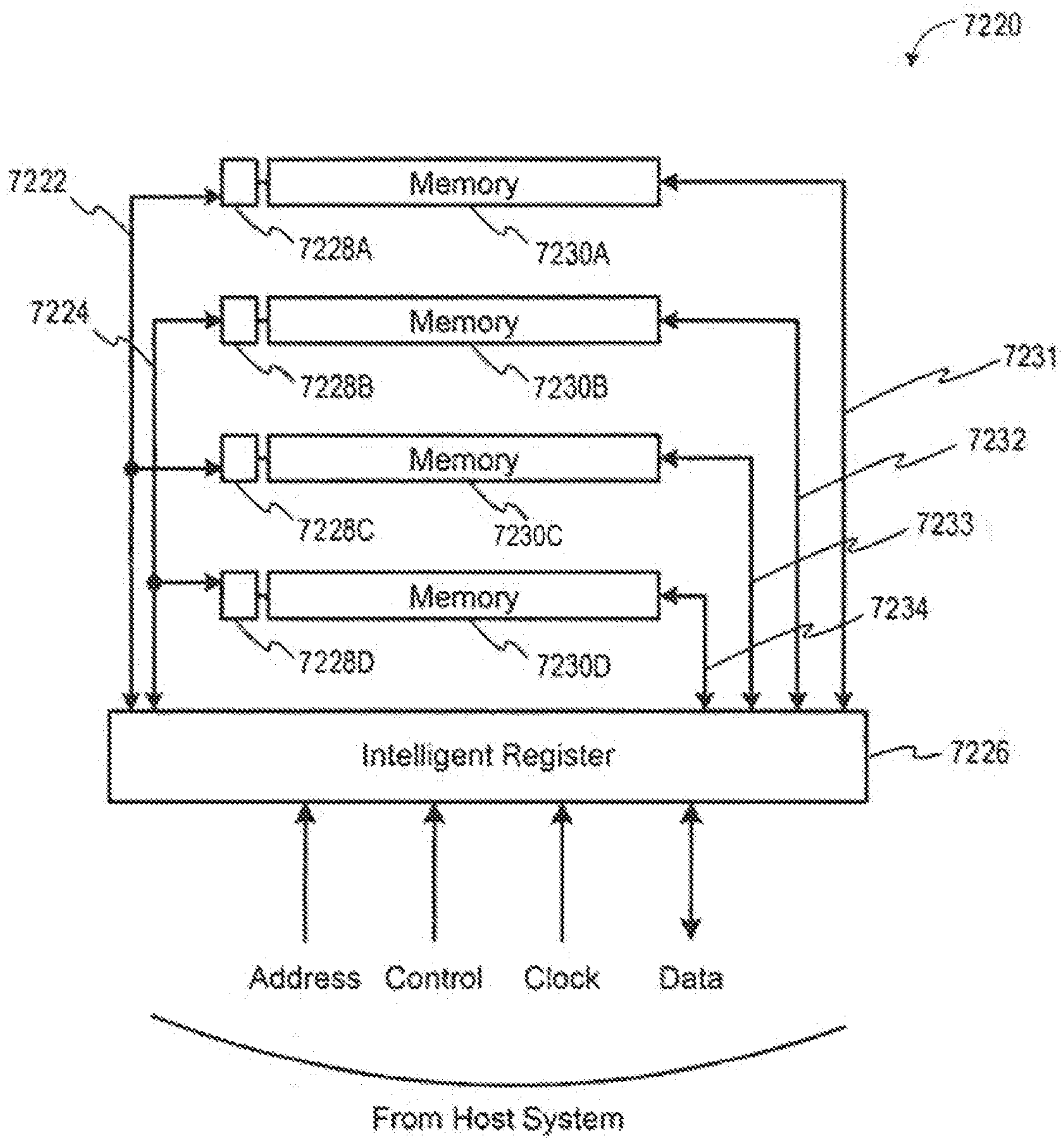
FIG. 72C depicts a memory system for adjusting the timing of signals associated with the memory system, in accordance with another embodiment.

FIG. 72C depicts a memory system 7220 for adjusting the timing of signals associated with the memory system 7220, in accordance with another embodiment. As an option, the present system 7220 may be implemented in the context of the functionality and architecture of FIGS. 72A-72B. Of course, however, the system 7200 may be implemented in any desired environment. Again, the aforementioned definitions may apply during the present description.

In operation, processed signals 7222 and 7224 may be processed by an intelligent register circuit 7226, or by intelligent buffer circuits 7228A-7228D, or in some combination thereof. FIG. 72C also shows an interconnect scheme wherein signals passing between the intelligent register 7226 and memory 7230A-7230D, whether directly or indirectly, may be routed as independent groups of signals 7231-7234 or a shared signal (e.g. the processed signals 7222 and 7224).

Figure 73:
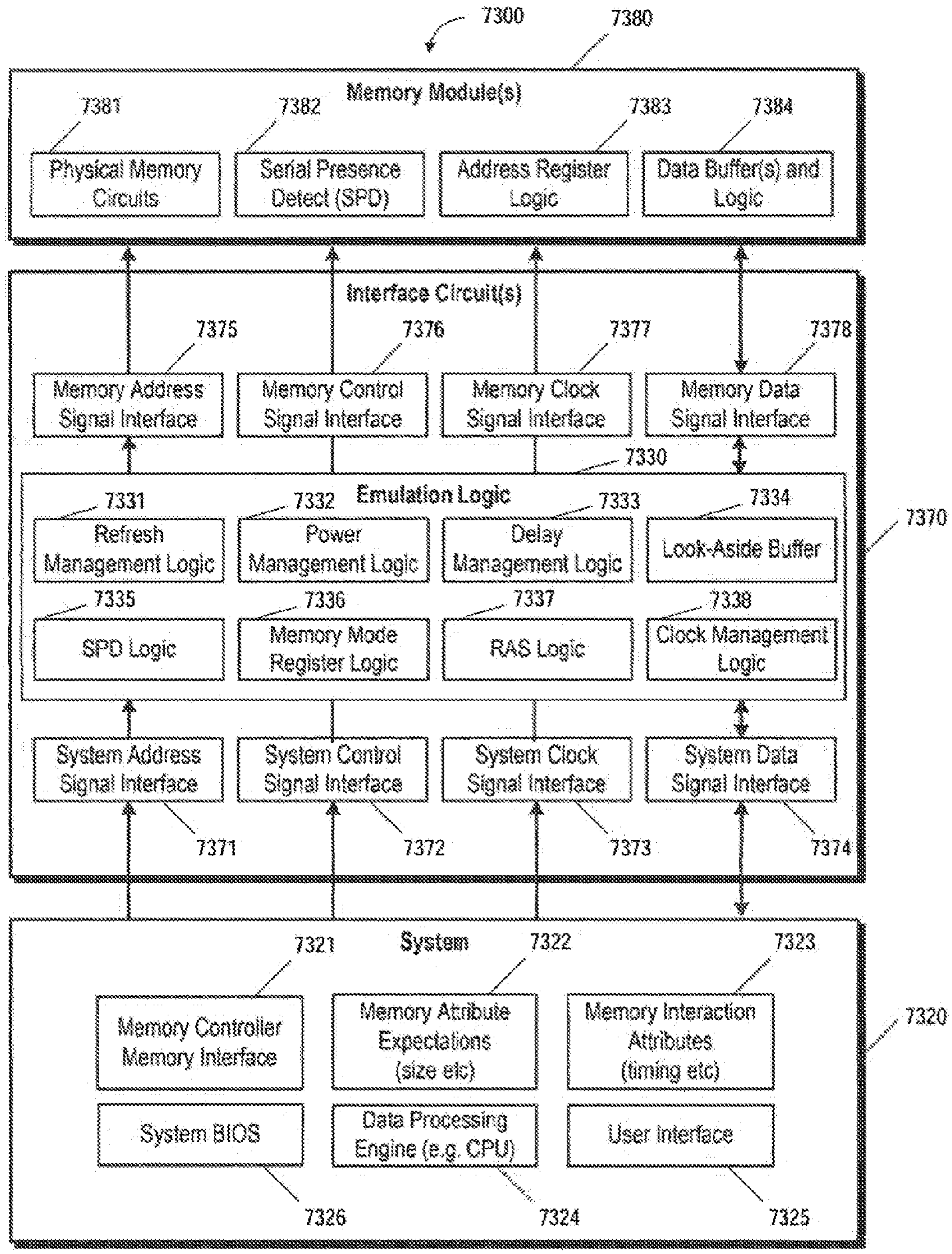
FIG. 73 depicts a system platform, in accordance with one embodiment.

FIG. 73 depicts a system platform 7300, in accordance with one embodiment. As an option, the system platform 7300 may be implemented in the context of the details of FIGS. 72A-1C. Of course, however, the system platform 7300 may be implemented in any desired environment. Additionally, the aforementioned definitions may apply during the present description.

As shown, the system platform 7300 is provided including separate components such as a system 7320 (e.g. a motherboard), and memory module(s) 7380 which contain memory circuits 7381 [e.g. physical memory circuits, dynamic random access memory (DRAM), synchronous DRAM (SDRAM), double-data-rate (DDR) memory, DDR2, DDR3, graphics DDR (GDDR), etc.]. In one embodiment, the memory modules 7380 may include dual-in-line memory modules (DIMMs). As an option, the computer platform 7300 may be configured to include the physical memory circuits 7381 connected to the system 7320 by way of one or more sockets.

In one embodiment, a memory controller 7321 may be designed to the specifics of various standards. For example, the standard defining the interfaces may be based on Joint Electron Device Engineering Council (JEDEC) specifications compliant to semiconductor memory (e.g. DRAM, SDRAM, DDR2, DDR3, GDDR etc.). The specifics of these standards address physical interconnection and logical capabilities.

As shown further, the system 7320 may include logic for retrieval and storage of external memory attribute expectations 7322, memory interaction attributes 7323, a data processing unit 7324, various mechanisms to facilitate a user interface 7325, and a system basic Input/Output System (BIOS) 7326.

In various embodiments, the system 7320 may include a system BIOS program capable of interrogating the physical memory circuits 7381 to retrieve and store memory attributes. Further, in external memory embodiments, JEDEC-compliant DIMMs may include an electrically erasable programmable read-only memory (EEPROM) device known as a Serial Presence Detect (SPD) 7382 where the DIMM memory attributes are stored. It is through the interaction of the system BIOS 7326 with the SPD 7382 and the interaction of the system BIOS 7326 with physical attributes of the physical memory circuits 7381 that memory attribute expectations of the system 7320 and memory interaction attributes become known to the system 7320. Also optionally included on the memory module 7380 are address register logic 7383 (i.e. JEDEC standard register, register, etc.) and data buffer(s) and logic 7384. The functions of the registers 7383 and the data buffers 7384 may be utilized to isolate and buffer the physical memory circuits 7381, reducing the electrical load that must be driven.

In various embodiments, the computer platform 7300 may include one or more interface circuits 7370 electrically disposed between the system 7320 and the physical memory circuits 7381. The interface circuits 7370 may be physically separate from the memory module 7380 (e.g. as discrete components placed on a motherboard, etc.), may be placed on the memory module 7380 (e.g. integrated into the address register logic 7383, or data buffer logic 7384, etc.), or may be part of the system 7320 (e.g. integrated into the memory controller 7321, etc.).

In various embodiments, some characteristics of the interface circuit 7370 may include several system-facing interfaces. For example, a system address signal interface 7371, a system control signal interface 7372, a system clock signal interface 7373, and a system data signal interface 7374 may be included. The system-facing interfaces 7371-7374 may be capable of interrogating the system 7320 and receiving information from the system 7320. In various embodiments, such information may include information available from the memory controller 7321, the memory attribute expectations 7322, the memory interaction attributes 7323, the data processing engine 7324, the user interface 7325 or the system BIOS 7326.

Similarly, the interface circuit 7370 may include several memory-facing interfaces. For example a memory address signal interface 7375, a memory control signal interface 7376, a memory clock signal interface 7377, and a memory data signal interface 7378 may be included. In another embodiment, an additional characteristic of the interface circuit 7370 may be the optional presence of emulation logic 7330. The emulation logic 7330 may be operable to receive and optionally store electrical signals (e.g. logic levels, commands, signals, protocol sequences, communications, etc.) from or through the system-facing interfaces 7371-7374, and process those signals.

The emulation logic 7330 may respond to signals from the system-facing interfaces 7371-7374 by responding back to the system 7320 by presenting signals to the system 7320, processing those signals with other information previously stored, or may present signals to the physical memory circuits 7381. Further, the emulation logic 7330 may perform any of the aforementioned operations in any order.

In one embodiment, the emulation logic 7330 may be capable of adopting a personality, wherein such personality defines the attributes of the physical memory circuit 7381. In various embodiments, the personality may be effected via any combination of bonding options, strapping, programmable strapping, the wiring between the interface circuit 7370 and the physical memory circuits 7381, and actual physical attributes (e.g. value of a mode register, value of an extended mode register, etc.) of the physical memory circuits 7381 connected to the interface circuit 7370 as determined at some moment when the interface circuit 7370 and physical memory circuits 7381 are powered up.

Physical attributes of the memory circuits 7381 or of the system 7320 may be determined by the emulation logic 7330 through emulation logic interrogation of the system 7320, the memory modules 7380, or both. In some embodiments, the emulation logic 7330 may interrogate the memory controller 7321, the memory attribute expectations 7322, the memory interaction attributes 7323, the data processing engine 7324, the user interface 7325, or the system BIOS 7326, and thereby adopt a personality. Additionally, in various embodiments, the functions of the emulation logic 7330 may include refresh management logic 7331, power management logic 7332, delay management logic 7333, one or more look-aside buffers 7334, SPD logic 7335, memory mode register logic 7336, as well as RAS logic 7337, and clock management logic 7338.

The optional delay management logic 7333 may operate to emulate a delay or delay sequence different from the delay or delay sequence presented to the emulation logic 7330 from either the system 7320 or from the physical memory circuits 7381. For example, the delay management logic 7333 may present staggered refresh signals to a series of memory circuits, thus permitting stacks of physical memory circuits to be used instead of discrete devices. In another case, the delay management logic 7333 may introduce delays to integrate well-known memory system RAS functions such a hot-swap, sparing, and mirroring.

Figure 74:
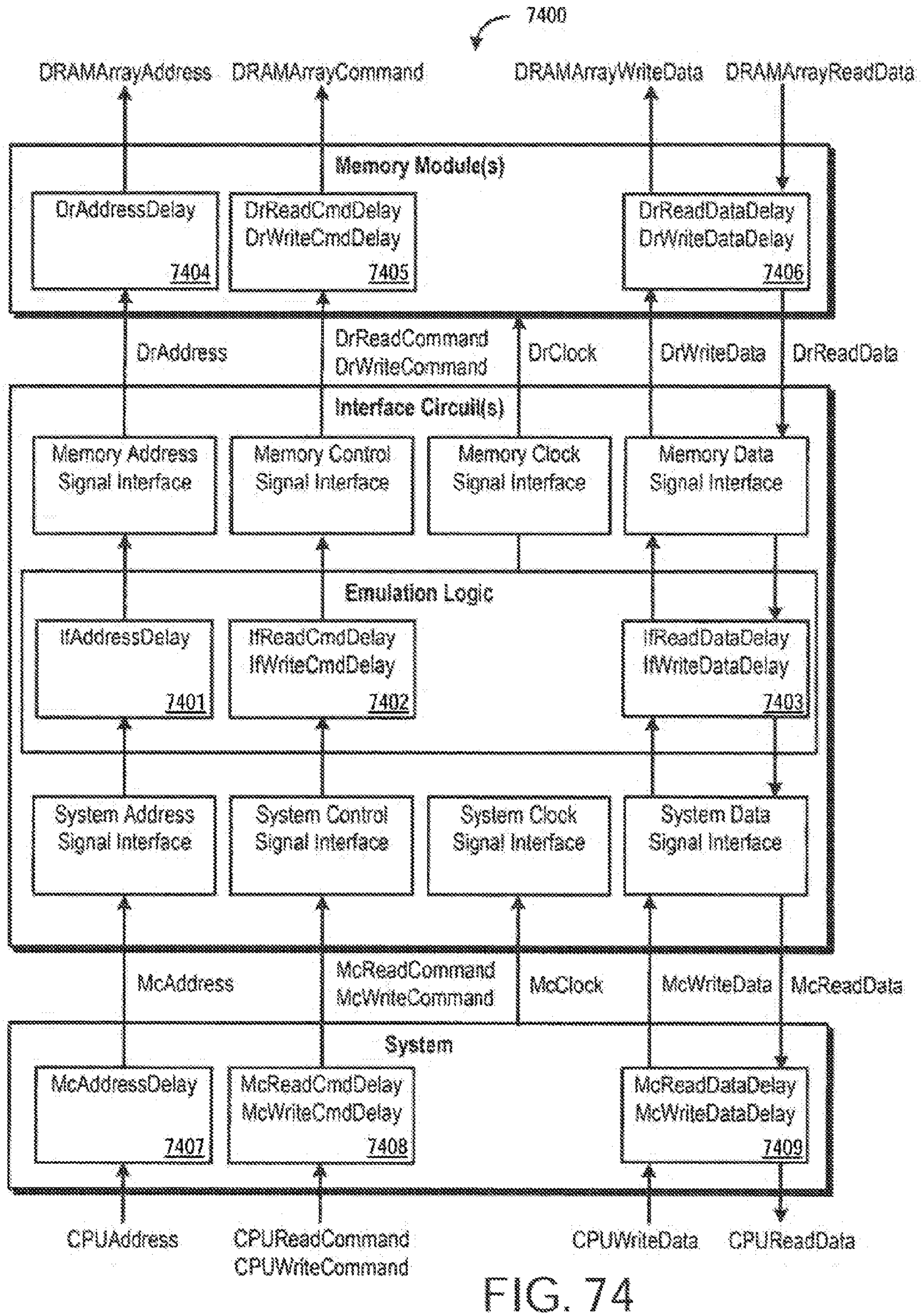
FIG. 74 shows the system platform of FIG. 73 including signals and delays, in accordance with one embodiment.

FIG. 74 shows the system platform 7300 of FIG. 73 including signals and delays, in accordance with one embodiment. As an option, the signals and delays of FIG. 74 may be implemented in the context of the details of FIGS. 72-2. Of course, however, the signals and delays of FIG. 74 may be implemented in any desired environment. Further, the aforementioned definitions may apply during the present description.

It should be noted that the signals and other names in FIG. 74 use the abbreviation "Dr" for DRAM and "Mc" for memory controller. For example, "DrAddress" are the address signals at the DRAM, "DrControl" are the control signals defined by JEDEC standards (e.g. ODT, CK, CK#, CKE, CS#, RAS#, CAS#, WE#, DQS, DQS#, etc.) at the DRAM, and "DrReadData" and "DrWriteData" are the bidirectional data signals at the DRAM. Similarly, "McAddress," "McCmd," "McReadData," and "McWriteData" are the corresponding signals at the memory controller interface.

Each of the memory module(s), interface circuits(s) and system may add delay to signals in a memory system. In the case of memory modules, the delays may be due to the physical memory circuits (e.g. DRAM, etc.), and/or the address register logic, and/or data buffers and logic. In the case of the interface circuits, the delays may be due to the emulation logic under control of the delay management logic. In the case of the system, the delays may be due to the memory controller.

All of these delays may be modified to allow improvements in one or more aspects of system performance. For example, adding delays in the emulation logic allows the interface circuit(s) to perform power management by manipulating the CKE (i.e. a clock enable) control signals to the DRAM in order to place the DRAM in low-power states. As another example, adding delays in the emulation logic allows the interface circuit(s) to perform staggered refresh operations on the DRAM to reduce instantaneous power and allow other operations, such as I/O calibration, to be performed.

Adding delays to the emulation logic may also allow control and manipulation of the address, data, and control signals connected to the DRAM to permit stacks of physical memory circuits to be used instead of discrete DRAM devices. Additionally, adding delays to the emulation logic may allow the interface circuit(s) to perform RAS functions such as hot-swap, sparing and mirroring of memory. Still yet, adding delays to the emulation logic may allow logic to be added that performs translation between different protocols (e.g. translation between DDR and GDDR protocols, etc.). In summary, the controlled addition and manipulation of delays in the path between memory controller and physical memory circuits allows logic operations to be performed that may potentially enhance the features and performance of a memory system.

Two examples of adjusting timing of a memory system are set forth below. It should be noted that such examples are illustrative and should not be construed as limiting in any manner. Table 1 sets forth definitions of timing parameters and symbols used in the examples, where time and delay are measured in units of clock cycles.

In the context of the two examples, the first example illustrates the normal mode of operation of a DDR2 Registered DIMM (RDIMM). The second example illustrates the use of the interface circuit(s) to adjust timing in a memory system in order to add or implement improvements to the memory system.

TABLE 1

| |
|---|
| CAS (column address strobe) Latency (CL) is the time between READ command (DrReadCmd) and READ data (DrReadData). |
| Posted CAS Additive Latency (AL) delays the READ/WRITE command to the internal device (the DRAM array) by AL clock cycles. |
| READ Latency (RL) = AL + CL. |
| WRITE Latency (WL) = AL + CL − 1 (where 1 represents one clock cycle). |

The above latency values and parameters are all defined by JEDEC standards. The timing examples used here will use the DDR2 JEDEC standard. Timing parameters for the DRAM devices are also defined in manufacturer datasheets (e.g. see Micron datasheet for 1 Gbit DDR2 SDRAM part MT47H256M4). The configuration and timing parameters for DIMMs may also be obtained from manufacturer datasheets [e.g. see Micron datasheet for 2 Gbyte DDR2 SDRAM Registered DIMM part MT36H2TF25672 (P)].

Additionally, the above latency values and parameters are as seen and measured at the DRAM and not necessarily equal to the values seen by the memory controller. The parameters illustrated in Table 2 will be used to describe the latency values and parameters seen at the DRAM.

TABLE 2

| |
|---|
| DrCL is the CL of the DRAM. |
| DrWL is the WL of the DRAM. |
| DrRL is the RL of the DRAM. |

It should be noted that the latency values and parameters programmed into the memory controller are not necessarily the same as the latency of the signals seen at the memory controller. The parameters shown in Table 3 may be used to make the distinction between DRAM and memory controller timing and the programmed parameter values clear.

TABLE 3

| |
|---|
| McCL is the CL as seen at the memory controller interface. |
| McWL is the WL as seen at the memory controller interface. |
| McRL is the RL as seen at the memory controller interface. |

In this case, when the memory controller is set to operate with DRAM devices that have CL=4 on an R-DIMM, the extra clock cycle delay due to the register on the R-DIMM may be hidden to a user. For an R-DIMM using CL=4 DRAM, the memory controller McCL=5. It is still common to refer to the memory controller latency as being set for CL=4 in this situation. In this situation, the first and second examples will refer to McCL=5, however, noting that the register is present and adding delay in an R-DIMM. The symbols in Table 4 are used to represent the delays in various parts of the memory system (again in clock cycles).

TABLE 4

| |
|---|
| IfAddressDelay 7401 is additional delay of Address signals by the interface circuit(s). |
| IfReadCmdDelay and IfWriteCmdDelay 7402 is additional delay of READ and WRITE commands by the interface circuit(s). |
| IfReadDataDelay and IfWriteDataDelay 7403 is additional delay of READ and WRITE Data signals by the interface circuit(s). |
| DrAddressDelay 7404, DrReadCmdDelay and DrWriteCmdDelay 7405, DrReadDataDelay and DrWriteDataDelay 7406 for the DRAM. |
| McAddressDelay 7407, McReadCmdDelay 7408, McWriteCmdDelay 7408, McReadDataDelay and McWriteDataDelay 7409 is delay for the memory controller. |

In the first example, it is assumed that DRAM parameters DrCL=4, DrAL=0, all memory controller delays are 0 (McAddressDelay, McReadDelay, McWriteDelay, and McDataDelay), and that all DRAM delays are 0 (DrAddressDelay, DrReadDelay, DrWriteDelay, and DrDataDelay). Furthermore, assumptions for the emulation logic delays are shown in Table 5.

TABLE 5

| |
|---|
| IfAddressDelay = 1 |
| IfReadCmdDelay = 1 |
| IfWriteCmdDelay = 1 |
| IfReadDataDelay = 0 |
| IfWriteDataDelay = 0 |

In the first example, the emulation logic is acting as a normal JEDEC register and delaying the Address and Command signals by one clock cycle (corresponding to IfAddressDelay=1, if WriteCmdDely=1, IfReadCmdDelay=1). In this case, the equations shown in Table 6 describe the timing of the signals at the DRAM. Table 7 shows the timing of the signals at the memory controller.

TABLE 6

| |
|---|
| READ: DrReadData − DrReadCmd = DrCL = 4 |
| WRITE: DrWriteData − DrWriteCmd = DrWL = DrCL − 1 = 3 |

TABLE 7

| |
|---|
| Since IfReadCmdDelay = 1, DrReadCmd = McReadCmd + 1 (commands are delayed by one cycle), and DrReadData = MCReadData (no delay), READ is McReadData − McReadCmd = McCL = 4 + 1 = 5. Since IfWriteCmdDelay = 1, DrWriteCmd = McWriteCmd + 1 (delayed by one cycle), and DrWriteData = McWriteData (no delay), WRITE is McWriteData − McWriteCmd = McWL = 3 + 1 = 4 = McCL − 1. |

This example with McCL=5 corresponds to the normal mode of operation for a DDR2 RDIMM using CL=4 DRAM.

In one case, it may be desirable for the emulation logic to perform logic functions that will improve one or more aspects of the performance of a memory system as described above. To do this, extra logic may be inserted in the emulation logic data paths. In this case, the addition of the emulation logic may add some delay. In one embodiment, a technique may be utilized to account for the delay and allow the memory controller and DRAM to continue to work together in a memory system in the presence of the added delay. In the second example, it is assumed that the DRAM timing parameters are the same as noted above in the first example, however the emulation logic delays are as shown in Table 8 below.

TABLE 8

| |
|---|
| IfAddressDelay = 2 |
| IfReadCmdDelay = 2 |
| IfReadDataDelay = 1 |
| IfWriteDataDelay = 1 |

The CAS latency requirement must be met at the DRAM for READs, thus READ is DrReadData−DrReadCmd=DrCL=4.

In order to meet this DRAM requirement, McCL, the CAS Latency as seen at the memory controller, may be set higher than in the first example to allow for the interface circuit READ data delay (IfDataDelay=1), since now McReadData=DrReadData+1, and to allow for the increased interface READ command delay, since now DrReadCmd=McReadCmd+2. Thus, in this case, the READ timing is as illustrated in Table 9.

TABLE 9

| |
|---|
| READ: McCL = McReadData − McReadCmd = 7 |

By setting the CAS latency, as viewed and interpreted by the memory controller, to a higher value than required by the DRAM CAS latency, the memory controller may be tricked into believing that the additional delays of the interface circuit(s) are due to a lower speed (i.e. higher CAS latency) DRAM. In this case, the memory controller may be set to McCL=7 and may view the DRAM on the RDIMM as having a CAS latency of CL=6 (whereas the real DRAM CAS latency is CL=4).

In certain embodiments, however, introducing the emulation logic delay may create a problem for the WRITE commands in this example. For instance, the memory system should meet the WRITE latency requirement at the DRAM, which is the same as the first example, and is shown in Table 10.

TABLE 10

| |
|---|
| WRITE: DrWriteData − DrWriteCmd = DrWL = 3 |

Since the WRITE latency WL=CL−1, the memory controller is programmed such that McWL=McCL−1=6. Thus, the memory controller is placing the WRITE data on the bus later than in the first example. In this case, the memory controller "thinks" that it needs to do this to meet the DRAM requirements. Unfortunately, the interface circuit(s) further delay the WRITE data over the first example (since now IfWriteDataDelay=1 instead of 0). Now, the WRITE latency requirement may not be met at the DRAM if IfWriteCmdDelay=IfReadCmdDelay as in the first example.

In one embodiment, the WRITE commands may be delayed by adjusting IfWriteCmdDelay in order to meet the WRITE latency requirement at the DRAM. In this case, the WRITE timing may be expressed around the "loop" formed by IfWriteCmdDelay, McWL, DrWL and IfWriteCmdDelay as shown in Table 11.

TABLE 11

| |
|---|
| WRITE: IfWriteCmdDelay = McWL + IfWriteDataDelay − DrWL = 6 + 1 − 3 = 4 |

Since IfWriteCmdDelay=4, and IfReadCmdDelay=2, the WRITE timing requirement corresponds to delaying the WRITE commands by an additional two clock cycles over the READ commands. This additional two-cycle delay may easily be performed by the emulation logic, for example. Note that no changes have to be made to the DRAM and no changes, other than programmed values, have been made to the memory controller. It should be noted that such memory system improvements may be made with minimal or no changes to the memory system itself.

It should be noted that any combination of DRAM, interface circuit, or system logic delays may be used that result in the system meeting the timing requirements at the DRAM interface in the above examples. For example, instead of introducing a delay of two cycles for the WRITE commands in the second example noted above, the timing of the memory controller may be altered to place the WRITE data on the bus two cycles earlier than normal operation. In another case, the delays may be partitioned between interface logic and the memory controller or partitioned between any two elements in the WRITE data paths.

Timing adjustments in above examples were described in terms of integer multiples of clock cycles to simplify the descriptions. However, the timing adjustments need not be exact integer multiples of clock cycles. In other embodiments, the adjustments may be made as fractions of clock cycles (e.g. 0.5 cycles, etc.) or any other number (1.5 clock cycles, etc.).

Additionally, timing adjustments in the above examples were made using constant delays. However, in other embodiments, the timing adjustments need not be constant. For example, different timing adjustments may be made for different commands. Additionally, different timing adjustments may also be made depending on other factors, such as a specific sequence of commands, etc.

Furthermore, different timing adjustments may be made depending on a user-specified or otherwise specified control, such as power or interface speed requirements, for example. Any timing adjustment may be made at any time such that the timing specifications continue to be met at the memory system interface(s) (e.g. the memory controller and/or DRAM interface). In various embodiments, one or more techniques may be implemented to alter one or more timing parameters and make timing adjustments so that timing requirements are still met.

The second example noted above was presented for altering timing parameters and adjusting timing in order to add logic which may improve memory system performance. Additionally, the CAS latency timing parameter, CL or tCL, was altered at the memory controller and the timing adjusted using the emulation logic. A non-exhaustive list of examples of other various timing parameters that may be similarly altered are shown in Table 12 (from DDR2 and DDR3 DRAM device data sheets).

TABLE 12

| |
|---|
| tAL, Posted CAS Additive Latency |
| tFAW, 4-Bank Activate Period |
| tRAS, Active-to-Precharge Command Period |
| tRC, Active-to-Active (same bank) Period |
| tRCD, Active-to-Read or Write Delay |
| tRFC, Refresh-to-Active or Refresh-to-Refresh Period |
| tRP, Precharge Command Period |
| tRRD, Active Bank A to Active Bank B Command Period |
| tRTP, Internal Read-to-Precharge Period |
| tWR, Write Recovery Time |
| tWTR, Internal Write-to-Read Command Delay |

Of course, any timing parameter or parameters that impose a timing requirement at the memory system interface(s) (e.g. memory controller and/or DRAM interface) may be altered using the timing adjustment methods described here. Alterations to timing parameters may be performed for other similar memory system protocols (e.g. GDDR) using techniques the same or similar to the techniques described herein.

Reliability, Availability, and Serviceability (RAS) Features

In order to build cost-effective memory modules it can be advantageous to build register and buffer chips that do have the ability to perform logical operations on data, dynamic storage of information, manipulation of data, sensing and reporting or other intelligent functions. Such chips are referred to in this specification as intelligent register chips and intelligent buffer chips. The generic term, "intelligent chip," is used herein to refer to either of these chips. Intelligent register chips in this specification are generally connected between the memory controller and the intelligent buffer chips. The intelligent buffer chips in this specification are generally connected between the intelligent register chips and one or more memory chips. One or more RAS features may be implemented locally to the memory module using one or more intelligent register chips, one or more intelligent buffer chips, or some combination thereof.

Figure 75A:
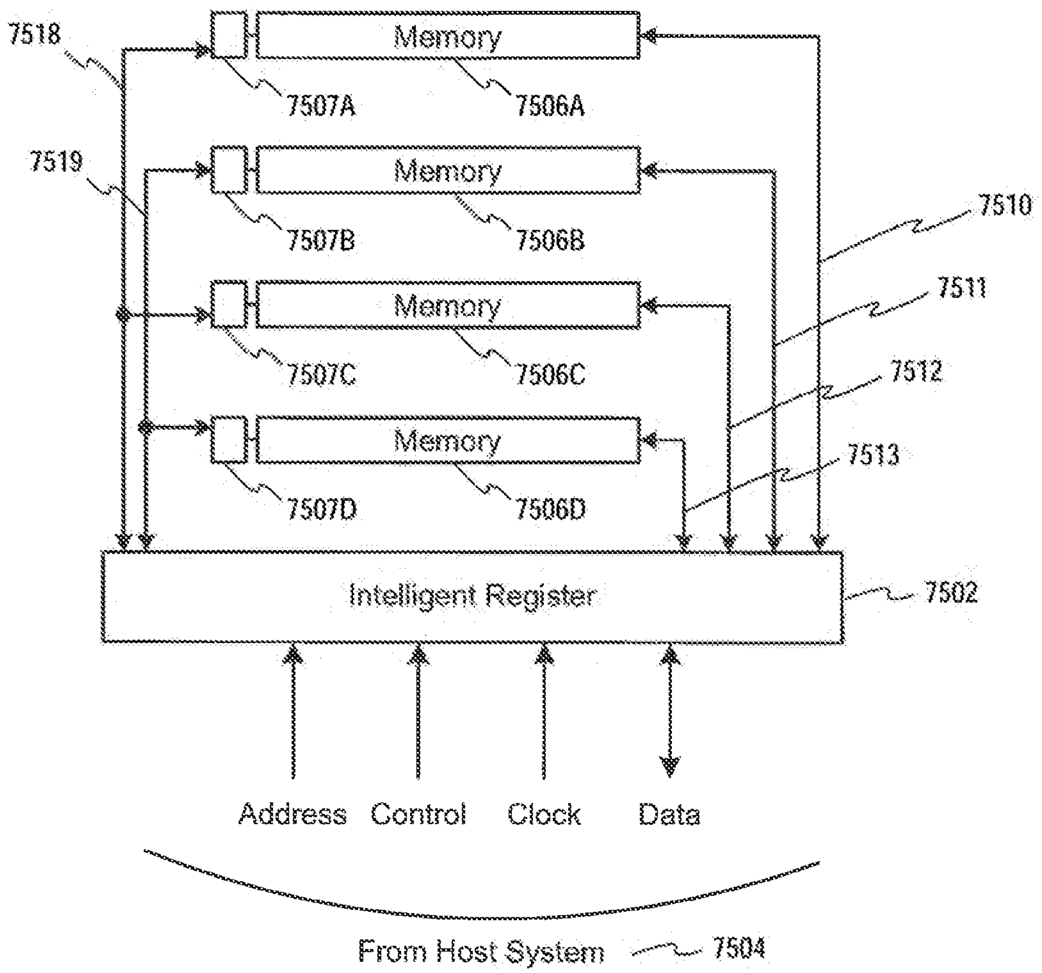
FIG. 75A depicts connectivity in an embodiment that includes an intelligent register and multiple buffer chips.

In the arrangement shown in FIG. 75A, one or more intelligent register chips 7502 are in direct communication with the host system 7504 via the address, control, clock and data signals to/from the host system. One or more intelligent buffer chips 7507A-7507D are disposed between the intelligent register chips and the memory chips 7506A-7506D. The signals 7510, 7511, 7512, 7513, 7518 and 7519 between an intelligent register chip and one or more intelligent buffer chips may be shared by the one or more intelligent buffer chips. In the embodiment depicted, the signals from the plural intelligent register chips to the intelligent buffer chips and, by connectivity, to the plural memory chips, may be independently controllable by separate instances of intelligent register chips. In another arrangement the intelligent buffer chips are connected to a stack of memory chips.

The intelligent buffer chips may buffer data signals and/or address signals, and/or control signals. The buffer chips 7507A-7507D may be separate chips or integrated into a single chip. The intelligent register chip may or may not buffer the data signals as is shown in FIG. 75A.

The embodiments described here are a series of RAS features that may be used in memory systems. The embodiments are particularly applicable to memory systems and memory modules that use intelligent register and buffer chips.

Indication of Failed Memory

Figure 75B:
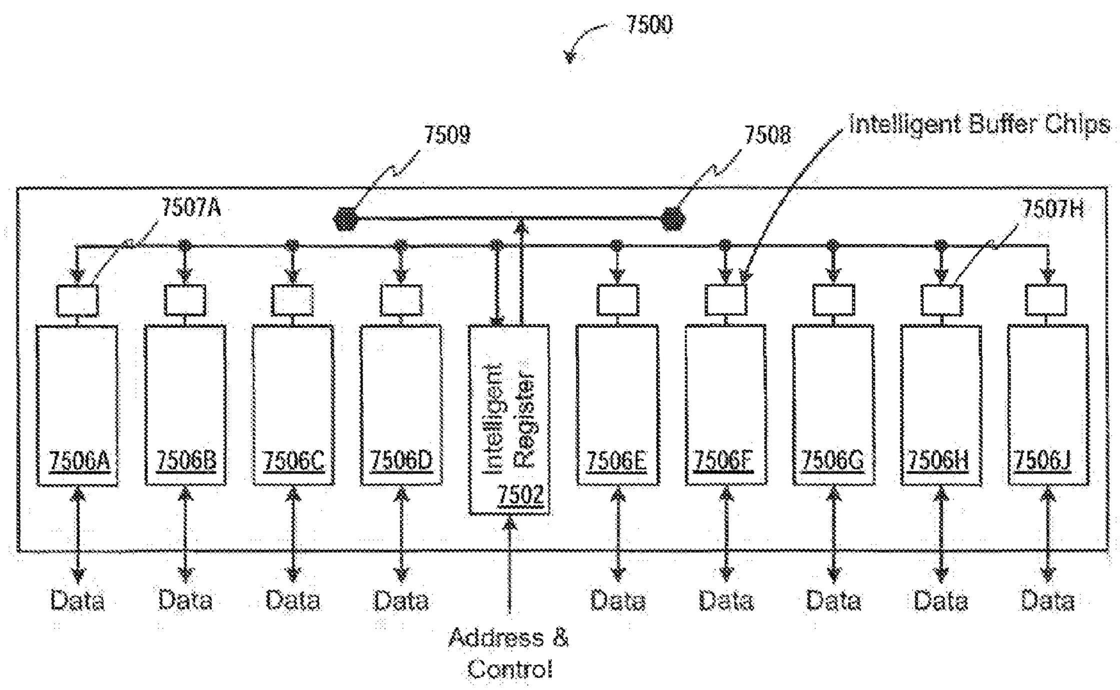
FIG. 75B depicts a generalized layout of components on a DIMM, including LEDs.

As shown in FIG. 75B, light-emitting diodes (LEDs) 7508, 7509 can be mounted on a memory module 7500. The CPU or host or memory controller, or an intelligent register can recognize or determine if a memory chip 7506A-7506J on a memory module has failed and illuminate one or more of the LEDs 7508, 7509. If the memory module contains one or more intelligent buffer chips 7507A, 7507H or intelligent register chips 7502, these chips may be used to control the LEDs directly. As an alternative to the LEDs and in combination with the intelligent buffer and/or register chips, the standard non-volatile memory that is normally included on memory modules to record memory parameters may be used to store information on whether the memory module has failed.

In FIG. 75B, the data signals are not buffered (by an intelligent register chip or by an intelligent buffer chip). Although the intelligent buffer chips 7507A-7507H are shown in FIG.

75B as connected directly to the intelligent register chip and act to buffer signals from the intelligent register chip, the same or other intelligent buffer chips may also be connected to buffer the data signals.

Currently indication of a failed memory module is done indirectly if it is done at all. One method is to display information on the failed memory module on a computer screen. Often only the failing logical memory location is shown on a screen, perhaps just the logical address of the failing memory cell in a DRAM, which means it is very difficult for the computer operator or repair technician to quickly and easily determine which physical memory module to replace. Often the computer screen is also remote from the physical location of the memory module and this also means it is difficult for an operator to quickly and easily find the memory module that has failed. Another current method uses a complicated and expensive combination of buttons, panels, switches and LEDs on the motherboard to indicate that a component on or attached to the motherboard has failed. None of these methods place the LED directly on the failing memory module allowing the operator to easily and quickly identify the memory module to be replaced. This embodiment adds just one low-cost part to the memory module.

This embodiment is part of the memory module and thus can be used in any computer. The memory module can be moved between computers of different types and manufacturer.

Further, the intelligent register chip 7502 and/or buffer chip 7507A-7507J on a memory module can self-test the memory and indicate failure by illuminating an LED. Such a self-test may use writing and reading of a simple pattern or more complicated patterns such as, for example, "walking-1's" or "checkerboard" patterns that are known to exercise the memory more thoroughly. Thus the failure of a memory module can be indicated via the memory module LED even if the operating system or control mechanism of the computer is incapable of working.

Further, the intelligent buffer chip and/or register chip on a memory module can self-test the memory and indicate correct operation via illumination of a second LED 7509. Thus a failed memory module can be easily identified using the first LED 7508 that indicates failure and switched by the operator with a replacement. The first LED might be red for example to indicate failure. The memory module then performs a self-test and illuminates the second LED 7509. The second LED might be green for example to indicate successful self-test. In this manner the operator or service technician can not only quickly and easily identify a failing memory module, even if the operating system is not working, but can effect a replacement and check the replacement, all without the intervention of an operating system.

Memory Sparing

One memory reliability feature is known as memory sparing.

Under one definition, the failure of a memory module occurs when the number of correctable errors caused by a memory module reaches a fixed or programmable threshold. If a memory module or part of a memory module fails in such a manner in a memory system that supports memory sparing, another memory module can be assigned to take the place of the failed memory module.

In the normal mode of operation, the computer reads and writes data to active memory modules. In some cases, the computer may also contain spare memory modules that are not active. In the normal mode of operation the computer does not read or write data to the spare memory module or modules, and generally the spare memory module or modules do not store data before memory sparing begins. The memory sparing function moves data from the memory module that is showing errors to the spare memory modules if the correctable error count exceeds the threshold value. After moving the data, the system inactivates the failed memory module and may report or record the event.

In a memory module that includes intelligent register and/or intelligent buffer chips, powerful memory sparing capabilities may be implemented.

Figure 76A:
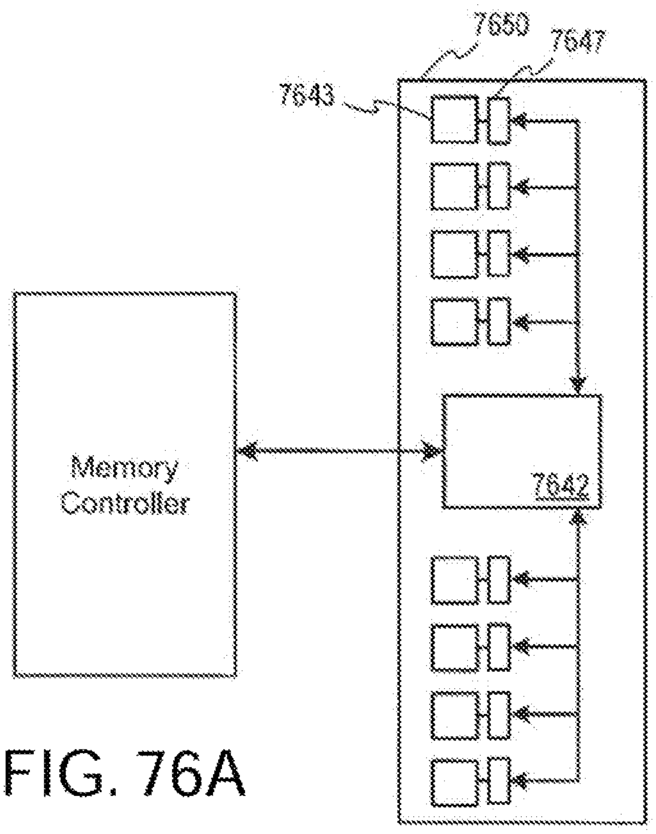
FIG. 76A depicts a memory subsystem with a memory controller in communication with multiple DIMMs.

For example, and as illustrated in FIG. 76A the intelligent register chip 7642 that is connected indirectly or directly to all DRAM chips 7643 on a memory module 7650 may monitor temperature of the DIMM, the buffer chips and DRAM, the frequency of use of the DRAM and other parameters that may affect failure. The intelligent register chip can also gather data about all DRAM chip failures on the memory module and can make intelligent decisions about sparing memory within the memory module instead of having to spare an entire memory module.

Figure 76B:
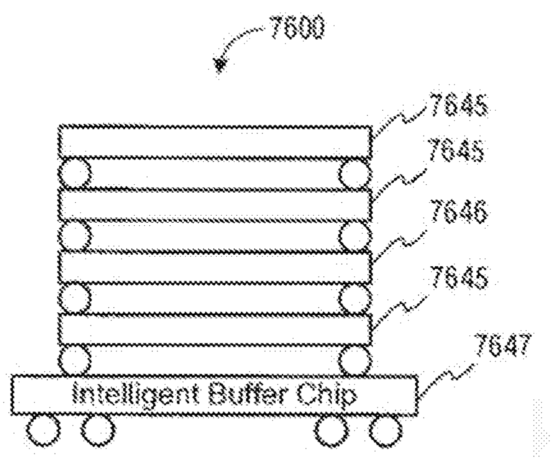
FIG. 76B depicts a side view of a stack of memory including an intelligent buffer chip.

Further, as shown in FIG. 76A and FIG. 76B, an intelligent buffer chip 7647 that may be connected to one or more DRAMs 7645 in a stack 7600 is able to monitor each DRAM 7645 in the stack and if necessary spare a DRAM 7646 in the stack. In the exemplary embodiment, the spared DRAM 7646 is shown as an inner component of the stack. In other possible embodiments the spared DRAM may be any one of the components of the stack including either or both of the top and bottom DRAMs.

Although the intelligent buffer chips 7647 are shown in FIG. 76B as connected directly to the intelligent register chip 7642 and to buffer signals from the intelligent register chip, the same or other intelligent buffer chips may also be connected to buffer the data signals. Thus, by including intelligent register and buffer chips in a memory module, it is possible to build memory modules that can implement memory sparing at the level of being able to use a spare individual memory, a spare stack of memory, or a spare memory module.

Figure 77:
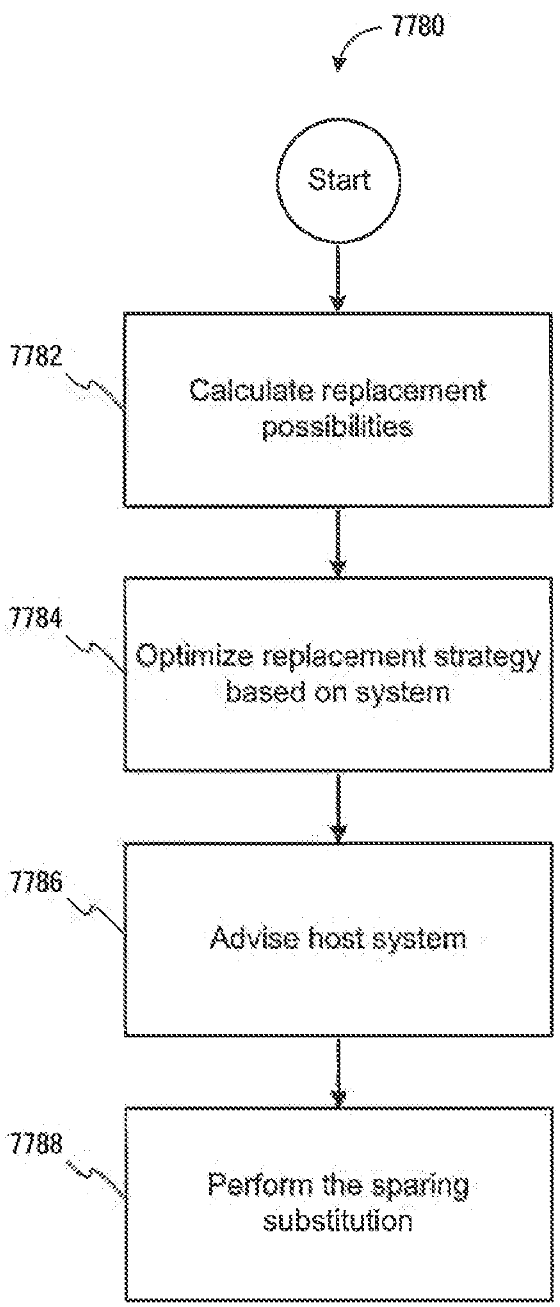
FIG. 77 depicts steps for performing a sparing substitution.

In some embodiments, and as shown in FIG. 77, a sparing method 7780 may be implemented in conjunction with a sparing strategy. In such a case, the intelligent buffer chip may calculate replacement possibilities 7782, optimize the replacement based on the system 7784 or a given strategy and known characteristics of the system, advise the host system of the sparing operation to be performed 7786, and perform the sparing substitution or replacement 7788.

Memory Mirroring

Another memory reliability feature is known as memory mirroring.

In normal operation of a memory mirroring mode, the computer writes data to two memory modules at the same time: a primary memory module (the mirrored memory module) and the mirror memory module.

If the computer detects an uncorrectable error in a memory module, the computer will re-read data from the mirror memory module. If the computer still detects an uncorrectable error, the computer system may attempt other means of recovery beyond the scope of simple memory mirroring. If the computer does not detect an error, or detects a correctable error, from the mirror module, the computer will accept that data as the correct data. The system may then report or record this event and proceed in a number of ways (including returning to check the original failure, for example).

In a memory module that includes intelligent register and/or intelligent buffer chips, powerful memory mirroring capabilities may be implemented.

Figure 78:
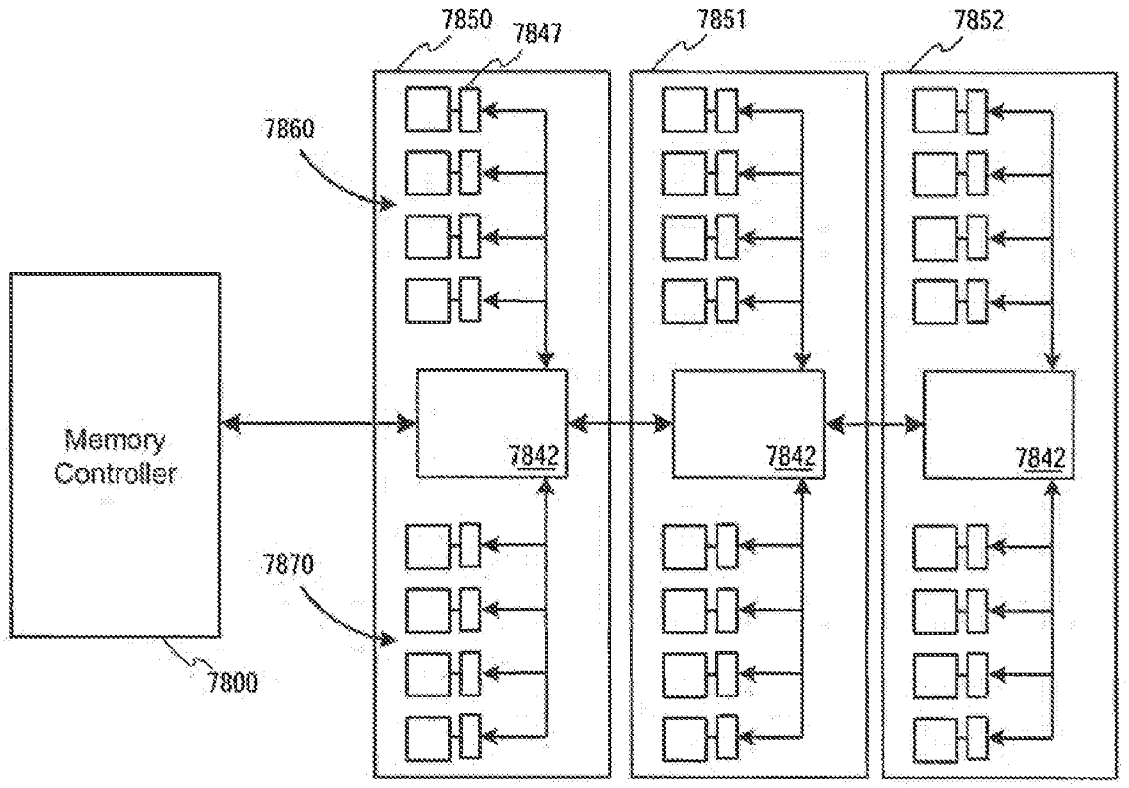
FIG. 78 depicts a memory subsystem where a portion of the memory on a DIMM is spared.

For example, as shown in FIG. 78, the intelligent register chip 7842 allows a memory module to perform the function of both mirrored and mirror modules by dividing the DRAM on the module into two sections 7860 and 7870. The intelligent buffer chips may allow DRAM stacks to perform both mirror and mirrored functions. In the embodiment shown in FIG. 78, the computer or the memory controller 7800 on the computer motherboard may still be in control of performing the mirror functions by reading and writing data to as if there were two memory modules.

In another embodiment, a memory module with intelligent register chips 7842 and/or intelligent buffer chips 7847 that can perform mirroring functions may be made to look like a normal memory module to the memory controller. Thus, in the embodiment of FIG. 78, the computer is unaware that the module is itself performing memory mirroring. In this case, the computer may perform memory sparing. In this manner both memory sparing and memory mirroring may be performed on a computer that is normally not capable of providing mirroring and sparing at the same time.

Other combinations are possible. For example a memory module with intelligent buffer and/or control chips can be made to perform sparing with or without the knowledge and/or support of the computer. Thus the computer may, for example, perform mirroring operations while the memory module simultaneously provides sparing function.

Although the intelligent buffer chips 7847 are shown in FIG. 78 as connected directly to the intelligent register chip 7842 and to buffer signals from the intelligent register chip, the same or other intelligent buffer chips may also be connected to buffer the data signals.

Memory RAID

Another memory reliability feature is known as memory RAID.

To improve the reliability of a computer disk system it is usual to provide a degree of redundancy using spare disks or parts of disks in a disk system known as Redundant Array of Inexpensive Disks (RAID). There are different levels of RAID that are well-known and correspond to different ways of using redundant disks or parts of disks. In many cases, redundant data, often parity data, is written to portions of a disk to allow data recovery in case of failure. Memory RAID improves the reliability of a memory system in the same way that disk RAID improves the reliability of a disk system.

Memory mirroring is equivalent to memory RAID level 1, which is equivalent to disk RAID level 1.

In a memory module that includes intelligent register and/or intelligent buffer chips, powerful memory RAID capabilities may be implemented.

For example, as shown in FIG. 78, the intelligent register chip 7842 on a memory module allows portions of the memory module to be allocated for RAID operations. The intelligent register chip may also include the computation necessary to read and write the redundant RAID data to a DRAM or DRAM stack allocated for that purpose. Often the parity data is calculated using a simple exclusive-OR (XOR) function that may simply be inserted into the logic of an intelligent register or buffer chip without compromising performance of the memory module or memory system.

In some embodiments, portions 7860 and 7870 of the total memory on a memory module 7850 are allocated for RAID operations. In other embodiments, the portion of the total memory on the memory module that is allocated for RAID operations may be a memory device on a DIMM 7643 or a memory device in a stack 7645.

In some embodiments, physically separate memory modules 7851, and 7852 of the total memory in a memory subsystem are allocated for RAID operations.

Memory Defect Re-Mapping

One of the most common failure mechanisms for a memory system is for a DRAM on a memory module to fail. The most common DRAM failure mechanism is for one or more individual memory cells in a DRAM to fail or degrade. A typical mechanism for this type of failure is for a defect to be introduced during the semiconductor manufacturing process. Such a defect may not prevent the memory cell from working but renders it subject to premature failure or marginal operation. Such memory cells are often called weak memory cells. Typically this type of failure may be limited to only a few memory cells in array of a million (in a 1 Mb DRAM) or more memory cells on a single DRAM. Currently the only way to prevent or protect against this failure mechanism is to stop using an entire memory module, which may consist of dozens of DRAM chips and contain a billion (in a 1 Gb DIMM) or more individual memory cells. Obviously the current state of the art is wasteful and inefficient in protecting against memory module failure.

In a memory module that uses intelligent buffer or intelligent register chips, it is possible to locate and/or store the locations of weak memory cells. A weak memory cell will often manifest its presence by consistently producing read errors. Such read errors can be detected by the memory controller, for example using a well-known Error Correction Code (ECC).

In computers that have sophisticated memory controllers, certain types of read errors can be detected and some of them can be corrected. In detecting such an error the memory controller may be designed to notify the DIMM of both the fact that a failure has occurred and/or the location of the weak memory cell. One method to perform this notification, for example, would be for the memory controller to write information to the non-volatile memory or SPD on a memory module. This information can then be passed to the intelligent register and/or buffer chips on the memory module for further analysis and action. For example, the intelligent register chip can decode the weak cell location information and pass the correct weak cell information to the correct intelligent buffer chip attached to a DRAM stack.

Alternatively the intelligent buffer and/or register chips on the memory module can test the DRAM and detect weak cells in an autonomous fashion. The location of the weak cells can then be stored in the intelligent buffer chip connected to the DRAM.

Using any of the methods that provide information on weak cell location, it is possible to check to see if the desired address is a weak memory cell by using the address location provided to the intelligent buffer and/or register chips. The logical implementation of this type of look-up function using a tabular method is well-known and the table used is often called a Table Lookaside Buffer (TLB), Translation Lookaside Buffer or just Lookaside Buffer. If the address is found to correspond to a weak memory cell location, the address can be re-mapped using a TLB to a different known good memory cell. In this fashion the TLB has been used to map-out or re-map the weak memory cell in a DRAM. In practice it may be more effective or efficient to map out a row or column of memory cells in a DRAM, or in general a region of memory cells that include the weak cell. In another embodiment, memory cells in the intelligent chip can be distributed for the weak cells in the DRAM.

Figure 79:
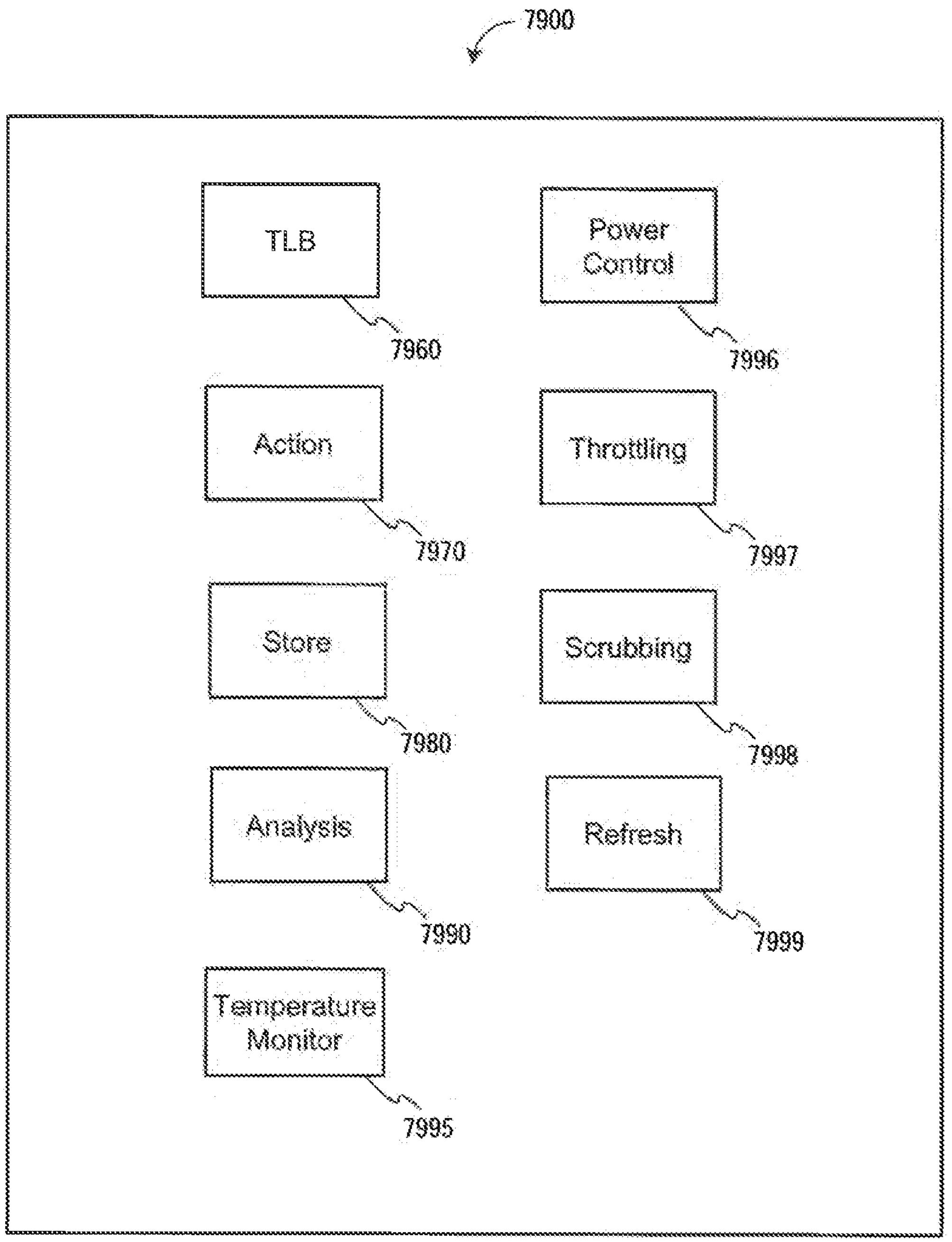
FIG. 79 depicts a selection of functions optionally implemented in an intelligent register chip or an intelligent buffer chip.

FIG. 79 shows an embodiment of an intelligent buffer chip or intelligent register chip which contains a TLB 7960 and a store 7980 for a mapping from weak cells to known good memory cells.

Memory Status and Information Reporting

There are many mechanisms that computers can use to increase their own reliability if they are aware of status and can gather information about the operation and performance of their constituent components. As an example, many computer disk drives have Self Monitoring Analysis and Reporting Technology (SMART) capability. This SMART capability gathers information about the disk drive and reports it back to the computer. The information gathered often indicates to the computer when a failure is about to occur, for example by monitoring the number of errors that occur when reading a particular area of the disk.

In a memory module that includes intelligent register and/or intelligent buffer chips, powerful self-monitoring and reporting capabilities may be implemented.

Information such as errors, number and location of weak memory cells, and results from analysis of the nature of the errors can be stored in a store 7980 and can be analyzed by an analysis function 7990 and/or reported to the computer. In various embodiments, the store 7980 and the analysis function 7990 can be in the intelligent buffer and/or register chips. Such information can be used either by the intelligent buffer and/or register chips, by an action function 7970 included in the intelligent buffer chip, or by the computer itself to take action such as to modify the memory system configuration (e.g. sparing) or alert the operator or to use any other mechanism that improves the reliability or serviceability of a computer once it is known that a part of the memory system is failing or likely to fail.

Memory Temperature Monitoring and Thermal Control

Current memory system trends are towards increased physical density and increased power dissipation per unit volume. Such density and power increases place a stress on the thermal design of computers. Memory systems can cause a computer to become too hot to operate reliably. If the computer becomes too hot, parts of the computer may be regulated or performance throttled to reduce power dissipation.

In some cases a computer may be designed with the ability to monitor the temperature of the processor or CPU and in some cases the temperature of a chip on-board a DIMM. In one example, a Fully-Buffered DIMM or FB-DIMM, may contain a chip called an Advanced Memory Buffer or AMB that has the capability to report the AMB temperature to the memory controller. Based on the temperature of the AMB the computer may decide to throttle the memory system to regulate temperature. The computer attempts to regulate the temperature of the memory system by reducing memory activity or reducing the number of memory reads and/or writes performed per unit time. Of course by measuring the temperature of just one chip, the AMB, on a memory module the computer is regulating the temperature of the AMB not the memory module or DRAM itself.

In a memory module that includes intelligent register and/or intelligent buffer chips, more powerful temperature monitoring and thermal control capabilities may be implemented.

For example if a temperature monitoring device 7995 is included into an intelligent buffer or intelligent register chip, measured temperature can be reported. This temperature information provides the intelligent register chips and/or the intelligent buffer chips and the computer much more detailed and accurate thermal information than is possible in absence of such a temperature monitoring capability. With more detailed and accurate thermal information, the computer is able to make better decisions about how to regulate power or throttle performance, and this translates to better and improved overall memory system performance for a fixed power budget.

Figure 80A:
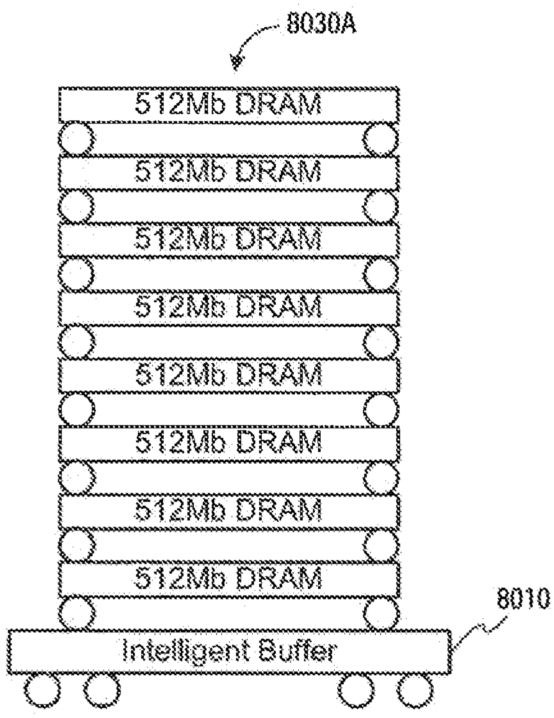
FIG. 80A depicts a memory stack in one embodiment with eight memory chips and one intelligent buffer.

As in the example of FIG. 80A, the intelligent buffer chip 8010 may be placed at the bottom of a stack of DRAM chips 8030A. By placing the intelligent buffer chip in close physical proximity and also close thermal proximity to the DRAM chip or chips, the temperature of the intelligent buffer chip will accurately reflect the temperature of the DRAM chip or chips. It is the temperature of the DRAM that is the most important temperature data that the computer needs to make better decisions about how to throttle memory performance. Thus, the use of a temperature sensor in an intelligent buffer chip greatly improves the memory system performance for a fixed power budget Further the intelligent buffer chip or chips may also report thermal data to an intelligent register chip on the memory module. The intelligent buffer chip is able to make its own thermal decisions and steer, throttle, re-direct data or otherwise regulate memory behavior on the memory module at a finer level of control than is possible by using the memory controller alone.

Memory Failure Reporting

In a memory module that includes intelligent register and/or intelligent buffer chips, powerful memory failure reporting may be implemented.

For example, memory failure can be reported, even in computers that use memory controllers that do not support such a mechanism, by using the Error Correction Coding (ECC) signaling as described in this specification.

ECC signaling may be implemented by deliberately altering one or more data bits such that the ECC check in the memory controller fails.

Memory Access Pattern Reporting and Performance Control

The patterns of operations that occur in a memory system, such as reads, writes and so forth, their frequency distribution with time, the distribution of operations across memory modules, and the memory locations that are addressed, are known as memory system access patterns. In the current state of the art, it is usual for a computer designer to perform experiments across a broad range of applications to determine memory system access patterns and then design the memory controller of a computer in such a way as to optimize memory system performance. Typically, a few parameters that are empirically found to most affect the behavior and performance of the memory controller may be left as programmable so that the user may choose to alter these parameters to optimize the computer performance when using a particular computer application. In general, there is a very wide range of memory access patterns generated by different applications, and, thus, a very wide range of performance points across which the memory controller and memory system performance must be optimized. It is therefore impossible to optimize performance for all applications. The result is that the performance of the memory controller and the memory system may be far from optimum when using any particular application. There is currently no easy way to discover this fact, no way to easily collect detailed memory access patterns while running an application, no way to measure or infer memory system performance, and no way to alter, tune or in any way modify those aspects of the memory controller or memory system configuration that are programmable.

Typically a memory system that comprises one or more memory modules is further subdivided into ranks (typically a rank is thought of as a set of DRAM that are selected by a single chip select or CS signal), the DRAM themselves, and DRAM banks (typically a bank is a sub-array of memory cells inside a DRAM). The memory access patterns determine how the memory modules, ranks, DRAM chips and DRAM banks are accessed for reading and writing, for example. Access to the ranks, DRAM chips and DRAM banks involves turning on and off either one or more DRAM chips or portions of DRAM chips, which in turn dissipates power. This dissipation of power caused by accessing DRAM chips and portions of DRAM chips largely determines the total power dissipation in a memory system. Power dissipation depends on the number of times a DRAM chip has to be turned on or off or the number of times a portion of a DRAM chip has to be accessed followed by another portion of the same DRAM chip or another DRAM chip. The memory access patterns also affect and determine performance. In addition, access to the ranks, DRAM chips and DRAM banks involves turning on and off either whole DRAM chips or portions of DRAM chips, which consumes time that cannot be used to read or write data, thereby negatively impacting performance.

In the compute platforms used in many current embodiments, the memory controller is largely ignorant of the effect on power dissipation or performance for any given memory access or pattern of access.

In a memory module that includes intelligent register and/or intelligent buffer chips, however, powerful memory access pattern reporting and performance control capabilities may be implemented.

For example an intelligent buffer chip with an analysis block 7990 that is connected directly to an array of DRAMs is able to collect and analyze information on DRAM address access patterns, the ratio of reads to writes, the access patterns to the ranks, DRAM chips and DRAM banks. This information may be used to control temperature as well as performance. Temperature and performance may be controlled by altering timing, power-down modes of the DRAM, and access to the different ranks and banks of the DRAM. Of course, the memory system or memory module may be subdivided in other ways.

Check Coding at the Byte Level

Typically, data protection and checking is provided by adding redundant information to a data word in a number of ways. In one well-known method, called parity protection, a simple code is created by adding one or more extra bits, known as parity bits, to the data word. This simple parity code is capable of detecting a single bit error. In another well-known method, called ECC protection, a more complex code is created by adding ECC bits to the data word. ECC protection is typically capable of detecting and correcting single-bit errors and detecting, but not correcting, double-bit errors. In another well-known method called ChipKill, it is possible to use ECC methods to correctly read a data word even if an entire chip is defective. Typically, these correction mechanisms apply across the entire data word, usually 64 or 128 bits (if ECC is included, for example, the data word may be 72 or 144 bits, respectively).

DRAM chips are commonly organized into one of a very few configurations or organizations. Typically, DRAMs are organized as ×4, ×8, or ×16; thus, four, eight, or 16 bits are read and written simultaneously to a single DRAM chip.

In the current state of the art, it is difficult to provide protection against defective chips for all configurations or organizations of DRAM.

In a memory module that includes intelligent register and/or intelligent buffer, chips powerful check coding capabilities may be implemented.

Figure 80B:
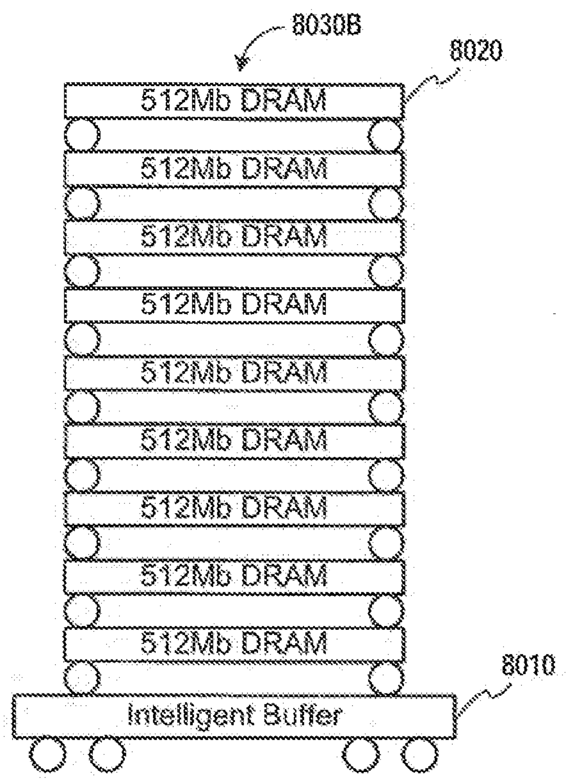
FIG. 80B depicts a memory stack in one embodiment with nine memory chips and one intelligent buffer.

For example, as shown in FIG. 80B, using an intelligent buffer chip 8010 connected to a stack of ×8 DRAMs 8030B checking may be performed at the byte level (across 8 bits), rather than at the data word level. One possibility, for example, is to include a ninth DRAM 8020, rather than eight DRAMs, in a stack and use the ninth DRAM for check coding purposes.

Other schemes can be used that give great flexibility to the type and form of the error checking. Error checking may not be limited to simple parity and ECC schemes, other more effective schemes may be used and implemented on the intelligent register and/or intelligent buffer chips of the memory module. Such effective schemes may include block and convolutional encoding or other well-known data coding schemes. Errors that are found using these integrated coding schemes may be reported by a number of techniques that are described elsewhere in this specification. Examples include the use of ECC Signaling.

Checkpointing

In High-Performance Computing (HPC), it is typical to connect large numbers of computers in a network, also sometimes referred to as a cluster, and run applications continuously for a very long time using all of the computers (possibly days or weeks) to solve very large numerical problems. It is therefore a disaster if even a single computer fails during computation.

One solution to this problem is to stop the computation periodically and save the contents of memory to disk. If a computer fails, the computation can resume from the last saved point in time. Such a procedure is known as checkpointing. One problem with checkpointing is the long period of time that it takes to transfer the entire memory contents of a large computer cluster to disk.

In a memory module that includes intelligent register and/or intelligent buffer chips, powerful checkpointing capabilities may be implemented.

For example, an intelligent buffer chip attached to stack of DRAM can incorporate flash or other non-volatile memory. The intelligent register and/or buffer chip can under external or autonomous command instigate and control the checkpointing of the DRAM stack to flash memory. Alternatively, one or more of the chips in the stack may be flash chips and the intelligent register and/or buffer chips can instigate and control checkpointing one or more DRAMs in the stack to one or more flash chips in the stack.

Figure 81A:
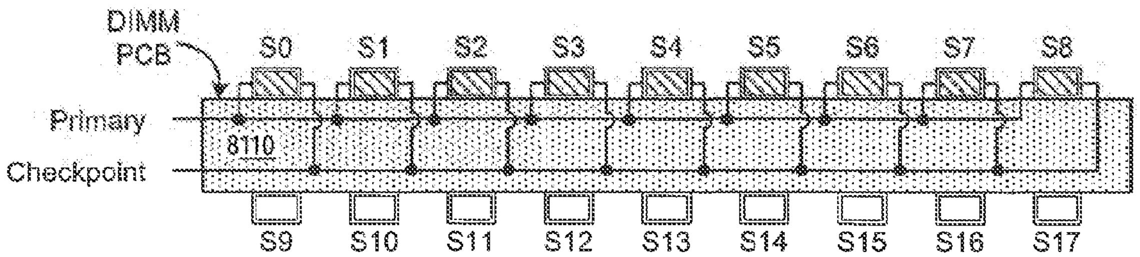
FIG. 81A depicts an embodiment of a DIMM implementing checkpointing.
Figure 81B:
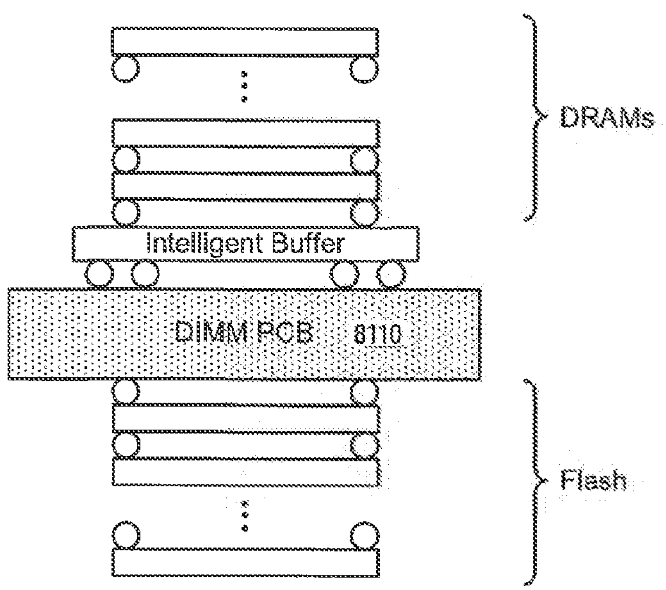
FIG. 81B depicts an depicts an exploded view of an embodiment of a DIMM implementing checkpointing.

In the embodiment shown in the views of FIG. 81A and FIG. 81B, the DIMM PCB 8110 is populated with a stacks of DRAM S0-S8 on one side and stacks of flash S9-S17, on the other side, where each flash memory in a flash stack corresponds with one of the DRAM in the opposing DRAM stack. Under normal operation, the DIMM uses only the DRAM circuits—the flash devices may be unused, simply in a ready state. However, upon a checkpoint event, memory contents from the DRAMs are copied by the intelligent register and/or buffer chips to their corresponding Flash memories. In other implementations, the flash chips do not have to be in a stack orientation.

Read Retry Detection

In high reliability computers, the memory controller may supports error detection and error correction capabilities. The memory controller may be capable of correcting single-bit errors and detecting, but typically not correcting, double-bit errors in data read from the memory system. When such a memory controller detects a read data error, it may also be programmed to retry the read to see if an error still occurs. If the read data error does occur again, there is likely to be a permanent fault, in which case a prescribed path for either service or amelioration of the problem can be followed. If the error does not occur again, the fault may be transient and an alternative path may be taken, which might consist solely of logging the error and proceeding as normal. More sophisticated retry mechanisms can be used if memory mirroring is enabled, but the principles described here remain the same.

In a memory module that includes intelligent register and/or intelligent buffer chips, powerful read retry detection capabilities may be implemented. Such a memory module is also able to provide read retry detection capabilities for any computer, not just those that have a special-purpose and expensive memory controllers.

For example, the intelligent register and/or buffer chips can be programmed to look for successive reads to memory locations without an intervening write to that same location. In systems with a cache between the processor and memory system, this is an indication that the memory controller is retrying the reads as a result of seeing an error. In this fashion, the intelligent buffer and/or register chips can monitor the errors occurring in the memory module to a specific memory location, to a specific region of a DRAM chip, to a specific bank of a DRAM or any such subdivision of the memory module. With this information, the intelligent buffer and/or register chip can make autonomous decisions to improve reliability (such as making use of spares) or report the details of the error information back to the computer, which can also make decisions to improve reliability and serviceability of the memory system.

In some embodiments, a form of retry mechanism may be employed in a data communication channel. Such a retry mechanism is used to catch errors that occur in transmission and ask for an incomplete or incorrect transmission to be retried. The intelligent buffer and/or register chip may use this retry mechanism to signal and communicate to the host computer.

Hot-Swap and Hot-Plug

In computers used as servers, it is often desired to be able to add or remove memory while the computer is still operating. Such is the case if the computer is being used to run an application, such as a web server, that must be continuously operational. The ability to add or remove memory in this fashion is called memory hot-plug or hot-swap. Computers that provide the ability to hot-plug or hot-swap memory use very expensive and complicated memory controllers and ancillary hardware, such as latches, programmable control circuits, microcontrollers, as well as additional components such as latches, indicators, switches, and relays.

In a memory module that includes intelligent register and/or intelligent buffer chips, powerful hot-swap and hot plug capabilities may be implemented.

For example, using intelligent buffer and/or register chips on a memory module, it is possible to incorporate some or all of the control circuits that enable memory hot-swap in these chips.

Figure 82A:
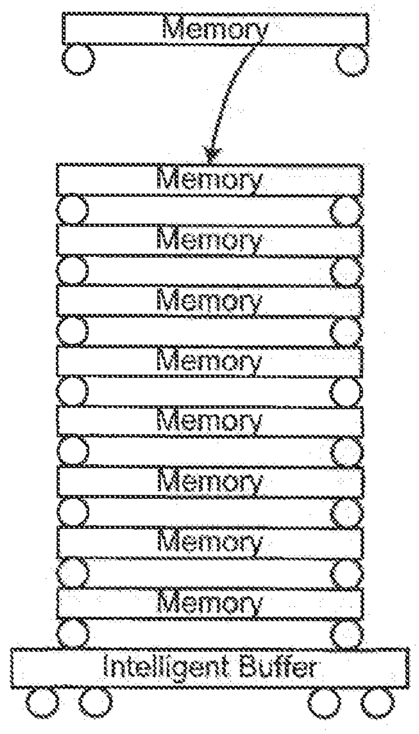
FIG. 82A depicts adding a memory chip to a memory stack.
Figure 82B:
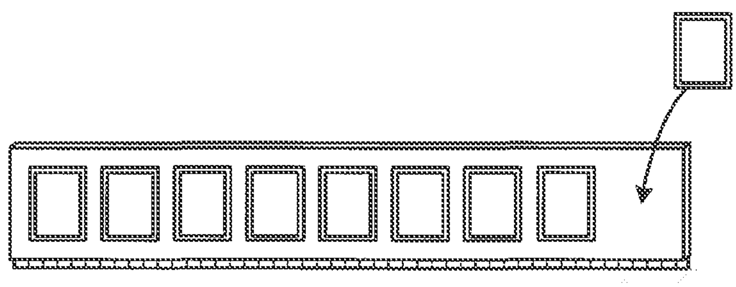
FIG. 82B depicts adding a memory stack to a DIMM.
Figure 82C:
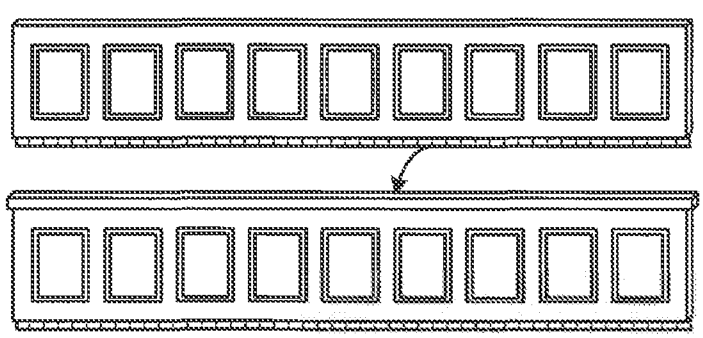
FIG. 82C depicts adding a DIMM to another DIMM.

In conventional memory systems, hot-swap is possible by adding additional memory modules. Using modules with intelligent buffer and/or intelligent register chips, hot-swap may be achieved by adding DRAM to the memory module directly without the use of expensive chips and circuits on the motherboard. In the embodiment shown in FIG. 82A, it is possible to implement hot-swap by adding further DRAMs to the memory stack. In another implementation as shown in FIG. 82B, hot-swap can be implemented by providing sockets on the memory module that can accept DRAM chips or stacks of DRAM chips (with or without intelligent buffer chips). In still another implementation as shown in FIG. 82C, hot-swap can be implemented by providing a socket on the memory module that can accept another memory module, thus allowing the memory module to be expanded in a hot-swap manner.

Redundant Paths

In computers that are used as servers, it is essential that all components have high reliability. Increased reliability may be achieved by a number of methods. One method to increase reliability is to use redundancy. If a failure occurs, a redundant component, path or function can take the place of a failure.

In a memory module that includes intelligent register and/or intelligent buffer chips, extensive datapath redundancy capabilities may be implemented.

For example, intelligent register and/or intelligent buffer chips can contain multiple paths that act as redundant paths in the face of failure. An intelligent buffer or register chip can perform a logical function that improves some metric of performance or implements some RAS feature on a memory module, for example. Examples of such features would include the Intelligent Scrubbing or Autonomous Refresh features, described elsewhere in this specification. If the logic on the intelligent register and/or intelligent buffer chips that implements these features should fail, an alternative or bypass path may be switched in that replaces the failed logic.

Autonomous Refresh

Most computers use DRAM as the memory technology in their memory system. The memory cells used in DRAM are volatile. A volatile memory cell will lose the data that it stores unless it is periodically refreshed. This periodic refresh is typically performed through the command of an external memory controller. If the computer fails in such a way that the memory controller cannot or does not institute refresh commands, then data will be lost.

In a memory module that includes intelligent register and/or intelligent buffer chips, powerful autonomous refresh capabilities may be implemented.

For example, the intelligent buffer chip attached to a stack of DRAM chips can detect that a required refresh operation has not been performed within a certain time due to the failure of the memory controller or for other reasons. The time intervals in which refresh should be performed are known and specific to each type of DRAM. In this event, the intelligent buffer chip can take over the refresh function. The memory module is thus capable of performing autonomous refresh.

Intelligent Scrubbing

In computers used as servers, the memory controller may have the ability to scrub the memory system to improve reliability. Such a memory controller includes a scrub engine that performs reads, traversing across the memory system deliberately seeking out errors. This process is called "patrol scrubbing" or just "scrubbing." In the case of a single-bit correctable error, this scrub engine detects, logs, and corrects the data. For any uncorrectable errors detected, the scrub engine logs the failure, and the computer may take further actions. Both types of errors are reported using mechanisms that are under configuration control. The scrub engine can also perform writes known as "demand scrub" writes or "demand scrubbing" when correctable errors are found during normal operation. Enabling demand scrubbing allows the memory controller to write back the corrected data after a memory read, if a correctable memory error is detected. Otherwise, if a subsequent read to the same memory location were performed without demand scrubbing, the memory controller would continue to detect the same correctable error. Depending on how the computer tracks errors in the memory system, this might result in the computer believing that the memory module is failing or has failed. For transient errors, demand scrubbing will thus prevent any subsequent correctable errors after the first error. Demand scrubbing provides protection against and permits detection of the deterioration of memory errors from correctable to uncorrectable.

In a memory module that includes intelligent register and/or intelligent buffer chips, more powerful and more intelligent scrubbing capabilities may be implemented.

For example, an intelligent register chip or intelligent buffer chip may perform patrol scrubbing and demand scrubbing autonomously without the help, support or direction of an external memory controller. The functions that control scrubbing may be integrated into intelligent register and/or buffer chips on the memory module. The computer can control and configure such autonomous scrubbing operations on a memory module either through inline or out-of-band communications that are described elsewhere in this specification.

Parity Protected Paths

In computers used as servers, it is often required to increase the reliability of the memory system by providing data protection throughout the memory system. Typically, data protection is provided by adding redundant information to a data word in a number of ways. As previously described herein, in one well-known method, called parity protection, a simple code is created by adding one or more extra bits, known as parity bits, to the data word. This simple parity code is capable of detecting a single bit error. In another well-known method, called ECC protection, a more complex code is created by adding ECC bits to the data word. ECC protection is typically capable of detecting and correcting single-bit errors and detecting, but not correcting, double-bit errors.

These protection schemes may be applied to computation data. Computation data is data that is being written to and read from the memory system. The protection schemes may also be applied to the control information, memory addresses for example, that are used to control the behavior of the memory system.

In some computers, parity or ECC protection is used for computation data. In some computers, parity protection is also used to protect control information as it flows between the memory controller and the memory module. The parity protection on the control information only extends as far as the bus between the memory controller and the memory module, however, as current register and buffer chips are not intelligent enough to extend the protection any further.

In a memory module that includes intelligent register and/or intelligent buffer chips, advanced parity protection coverage may be implemented.

Figure 83A:
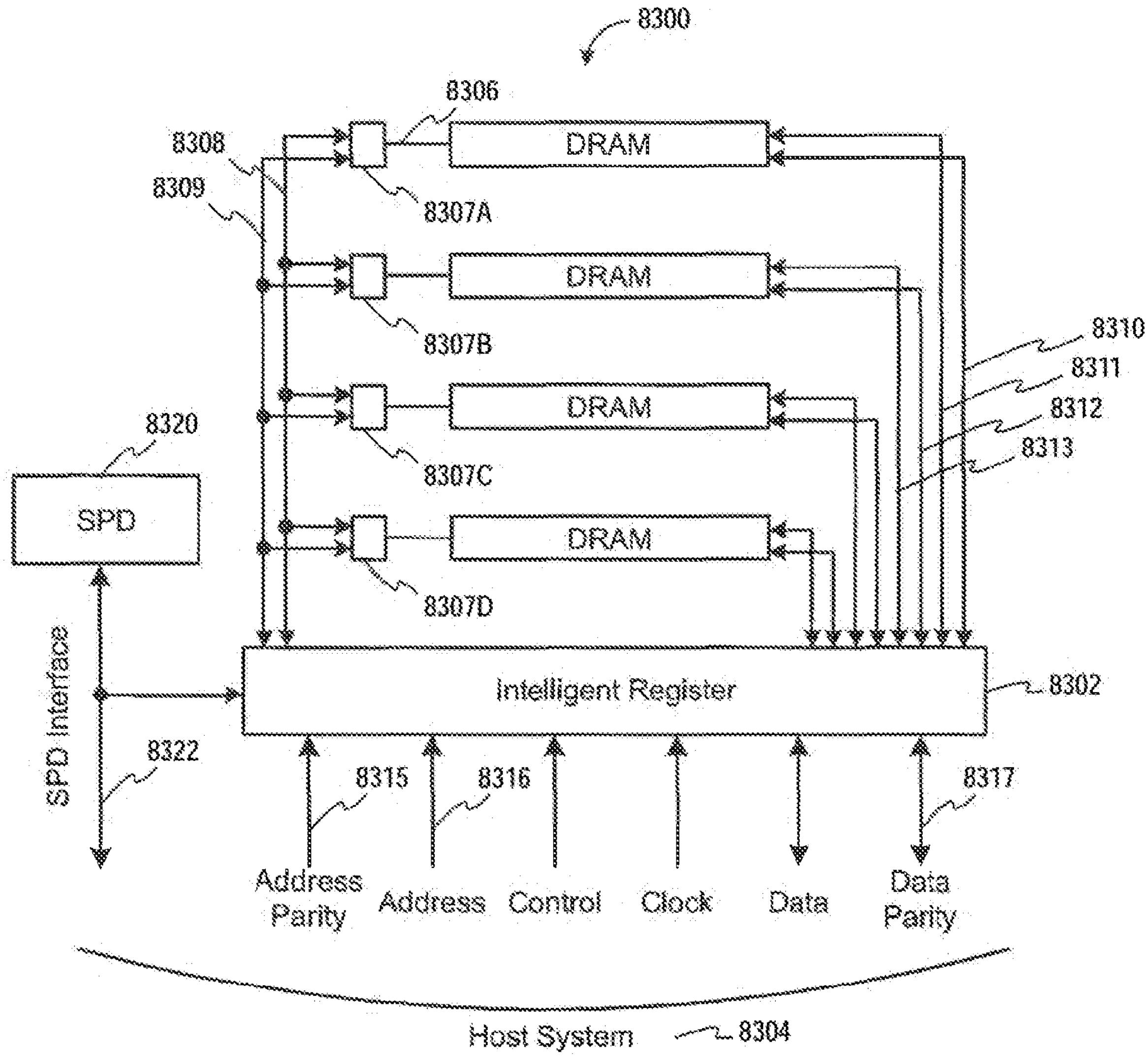
FIG. 83A depicts a memory subsystem that uses redundant signal paths.
Figure 83B:
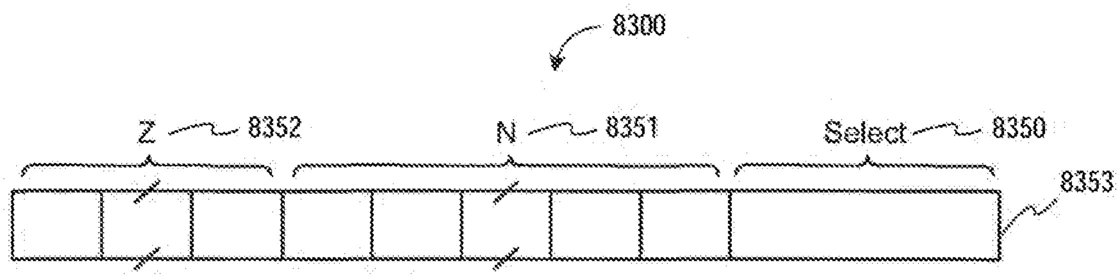
FIG. 83B a generalized bit field for communicating data.
Figure 83C:
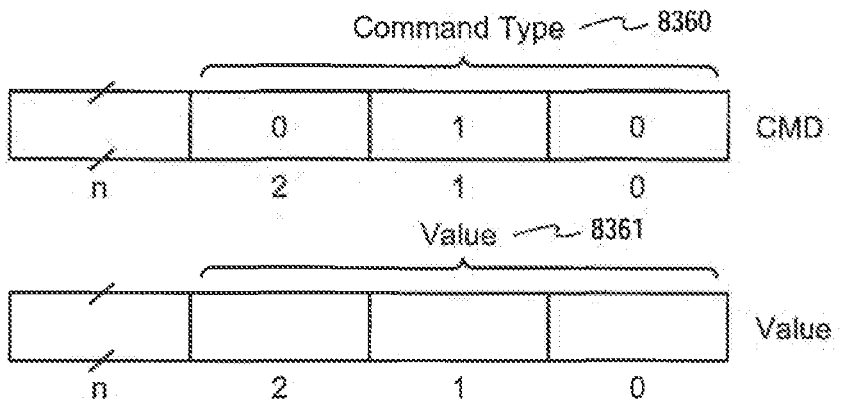
FIG. 83C depicts the bit field layout of a multi-cycle packet.

For example, as shown in FIG. 83A, a memory module that includes intelligent buffer and/or register chips, the control paths (those paths that involve control information, such as memory address, clocks and control signals and so forth) may be protected using additional parity signals to ECC protect any group of control path signals in part or in its entirety. Address parity signals 8315 computed from the signals of the address bus 8316, for example, may be carried all the way through the combination of any intelligent register 8302 and/or intelligent buffer chips 8307A-8307D, including any logic functions or manipulations that are applied to the address or other control information.

Although the intelligent buffer chips 8307A-8307D are shown in FIG. 83A as connected directly to the intelligent register chip 8302 and to buffer signals from the intelligent register chip, the same or other intelligent buffer chips may also be connected to buffer the data signals. The data signals may or may not be buffered by the intelligent register chip.

ECC Signaling

The vast majority of computers currently use an electrical bus to communicate with their memory system. This bus typically uses one of a very few standard protocols. For example, currently computers use either Double-Data Rate (DDR) or Double-Date Rate 2 (DDR2) protocols to communicate between the computer's memory controller and the DRAM on the memory modules that comprise the computer's memory system. Common memory bus protocols, such as DDR, have limited signaling capabilities. The main purpose of these protocols is to communicate or transfer data between computer and the memory system. The protocols are not designed to provide and are not capable of providing a path for other information, such as information on different types of errors that may occur in the memory module, to flow between memory system and the computer.

It is common in computers used as servers to provide a memory controller that is capable of detecting and correcting certain types of errors. The most common type of detection and correction uses a well-known type of Error Correcting Code (ECC). The most common type of ECC allows a single bit error to be detected and corrected and a double-bit error to be detected, but not corrected. Again, the ECC adds a certain number of extra bits, the ECC bits, to a data word when it is written to the memory system. By examining these extra bits when the data word is read, the memory controller can determine if an error has occurred.

In a memory module that includes intelligent register and/or intelligent buffer chips, a flexible error signaling capability may be implemented.

For example, as shown in FIG. 83, if an error occurs in the memory module, an intelligent register and/or buffer chip may deliberately create an ECC error on the data parity signals 8317 in order to signal this event to the computer. This deliberate ECC error may be created by using a known fixed, hard-wired or stored bad data word plus ECC bits, or a bad data word plus ECC bits can be constructed by the intelligent register and/or buffer chip. Carrying this concept to a memory subsystem that includes one or more intelligent register chips and or one or more intelligent buffer chips, the parity signals 8309, 8311, and 8313 are shown implemented for signals 8308, 8310, and 8312. Such parity signals can be implemented optionally for all or some, or none of the signals of a memory module.

This signaling scheme using deliberate ECC errors can be used for other purposes. It is very often required to have the ability to request a pause in a bus protocol scheme. The DDR and other common memory bus protocols used today do not contain such a desirable mechanism. If the intelligent buffer chips and/or register chips wish to instruct the memory controller to wait or pause, then an ECC error can be deliberately generated. This will cause the computer to pause and then typically retry the failing read. If the memory module is then able to proceed, the retried read can be allowed to proceed normally and the computer will then, in turn, resume normal operation.

Sideband and Inline Signaling

Also, as shown in FIG. 83, a memory module that includes intelligent buffer and/or register chips, may communicate with an optional Serial Presence Detect (SPD) 8320. The SPD may be in communication with the host through the SPD interface 8322 and may be connected to any combination of any intelligent register 8302 and/or any intelligent buffer chips 8307A-8307D. The aforementioned combination implements one or more data sources that can program and/or read the SPD in addition to the host. Such connectivity with the SPD provides the mechanism to perform communication between the host and memory module in order to transfer information about memory module errors (to improve Reliability and Serviceability features, for example). Another use of the SPD is to program the intelligent features of the buffer and/or register chips, such as latency, timing or other emulation features. One advantage of using the SPD as an intermediary to perform communication between intelligent buffer and/or register chips with the host is that a standard mechanism already exists to use the SPD and host to exchange information about standard memory module timing parameters.

The SPD is a small, typically 256-byte, 8-pin EEPROM chip mounted on a memory module. The SPD typically contains information on the speed, size, addressing mode and various timing parameters of the memory module and its component DRAMs. The SPD information is used by the computer's memory controller to access the memory module.

The SPD is divided into locked and unlocked areas. The memory controller (or other chips connected to the SPD) can write SPD data only on unlocked (write-enabled) DIMM EEPROMs. The SPD can be locked via software (using a BIOS write protect) or using hardware write protection. The SPD can thus also be used as a form of sideband signaling mechanism between the memory module and the memory controller.

In a memory module that includes intelligent register and/or intelligent buffer chips, extensive sideband as well as in-band or inline signaling capabilities may be implemented and used for various RAS functions, for example.

More specifically, the memory controller can write into the unlocked area of the SPD and the intelligent buffer and/or register chips on the memory module can read this information. It is also possible for the intelligent buffer and/or register chips on the memory module to write into the SPD and the memory controller can read this information. In a similar fashion, the intelligent buffer and/or register chips on the memory module can use the SPD to read and write between themselves. The information may be data on weak or failed memory cells, error, status information, temperature or other information.

An exemplary use of a communication channel (or sideband bus) between buffers or between buffers and register chips is to communicate information from one (or more) intelligent register chip(s) to one (or more) intelligent buffer chip(s).

In exemplary embodiments, control information communicated using the sideband bus 8308 between intelligent register 8302 and intelligent buffer chip(s) 8307A-8307D may include information such as the direction of data flow (to or from the buffer chips), and the configuration of the on-die termination resistance value (set by a mode register write command). As shown in the generalized example 8300 of FIG. 83B, the data flow direction on the intelligent buffer chip(s) may be set by a "select port N, byte lane Z" command sent by the intelligent register via the sideband bus, where select 8350 indicates the direction of data flow (for a read or a write), N 8351 is the Port ID for one of the multiple data ports belonging to the intelligent buffer chip(s), and Z 8352 would be either 0 or 1 for a buffer chip with two byte lanes per port. The bit field 8353 is generalized for illustration only, and any of the fields 8350, 8351, 8352 may be used to carry different information, and may be shorter or longer as required by the characteristics of the data.

The intelligent register chip(s) use(s) the sideband signal to propagate control information to the multiple intelligent buffer chip(s). However, there may be a limited numbers of pins and encodings used to deliver the needed control information. In this case, the sideband control signals may be transmitted by intelligent register(s) to intelligent buffer chip(s) in the form of a fixed-format command packet. Such a command packet be may two cycles long, for example. In the first cycle, a command type 8360 may be transmitted. In the second cycle, the value 8361 associated with the specific command may be transmitted. In one embodiment, the sideband command types and encodings to direct data flow or to direct Mode Register Write settings to multiple intelligent buffer chip(s) can be defined as follows (as an example, the command encoding for the command type 8360 for presentation on the sideband bus in the first cycle is shown in parenthesis):

Null operation, NOP (000)
Read byte-lane 0 (001)
Write byte-lane 0 (010)
Update Mode Register Zero MR0 (011)
Write to both byte lanes 0 and 1(100)
Read byte-lane 1 (101)
Write byte-lane 1 (110)
Update Extended Mode Register One EMR1 (111)

The second cycle contains values associated with the command in the first cycle.

Figure 83D:
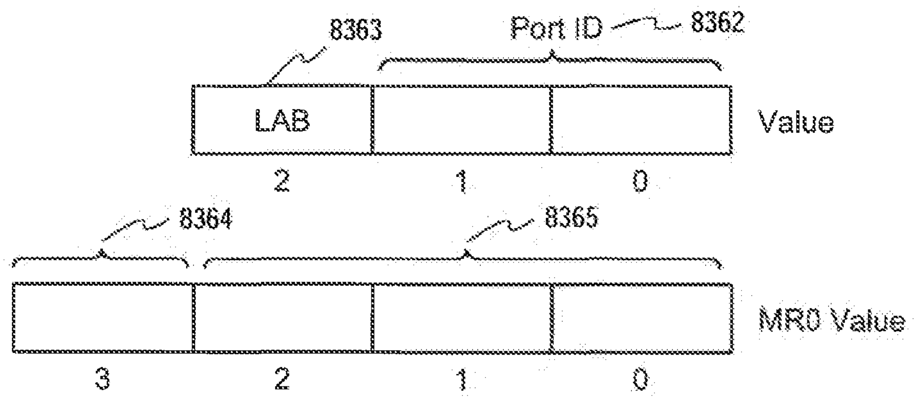
FIG. 83D depicts examples of bit fields for communicating data.

There may be many uses for such signaling. Thus, for example, as shown in FIG. 83D if the bi-directional multiplexer/de-multiplexer on intelligent buffer chip(s) is a four-port-to-one-port structure, the Port IDs would range from 0 to 3 to indicate the path of data flow for read operations or write operations. The Port IDs may be encoded as binary values on the sideband bus as Cmd[1:0] 8362 in the second cycle of the sideband bus protocol (for read and write commands).

Other uses of these signals may perform additional features. Thus, for example, a look-aside buffer (or LAB) may used to allow the substitution of data from known-good memory bits in the buffer chips for data from known-bad memory cells in the DRAM. In this case the intelligent buffer chip may have to be informed to substitute data from a LAB. This action may be performed using a command and data on the sideband bus as follows. The highest order bit of the sideband bus Cmd[2] 8363 may used to indicate a LAB. In the case that the sideband bus Cmd[2] may indicate a LAB hit on a read command, Intelligent buffer chip(s) may then take data from a LAB and drive it back to the memory controller. In the case that the sideband bus Cmd[2] indicates a LAB hit on a write command, Intelligent buffer chip(s) may take the data from the memory controller and write it into the LAB. In the case that the sideband bus Cmd[2] does not indicate a LAB hit, reads and writes may be performed to DRAM devices on the indicated Port IDs.

Still another use as depicted in FIG. 83D of the sideband signal may be to transfer Mode Register commands sent by the memory controller to the proper destination, possibly with (programmable) modifications. In the above example command set, two commands have been set aside to update Mode Registers.

One example of such a register mode command is to propagate an MR0 command, such as burst ordering, to the intelligent buffer chip(s). For example, Mode Register MR0 bit A[3] 8364 sets the Burst Type. In this case the intelligent register(s) may use the sideband bus to instruct the intelligent buffer chip(s) to pass the burst type (through the signal group 8306) to the DRAM as specified by the memory controller. As another example, Mode Register MR0 bit A[2:0] sets the Burst Length 8365. In this case, in one configuration of memory module, the intelligent register(s) may use the sideband bus to instruct the intelligent buffer chip(s) to always write '010 (corresponding to a setting of burst length equal to four or BL4) to the DRAM. In another configuration of memory module, if the memory controller had asserted '011, then the intelligent register(s) must emulate the BL8 column access with two BL4 column accesses.

In yet another example of this type sideband bus use, the sideband bus may be used to modify (possibly under programmable control) the values to be written to Mode Registers. For example, one Extended Mode Register EMR1 command controls termination resistor values. This command sets the Rtt (termination resistor) values for ODT (on-die termination), and in one embodiment the intelligent register chip(s) may override existing values in the A[6] A[2] bits in EMR1 with '00 to disable ODT on the DRAM devices, and propagate the expected ODT value to the intelligent buffer chip(s) via the sideband bus.

In another example, the sideband signal may be used to modify the behavior of the intelligent buffer chip(s). For example, the sideband signal may be used to reduce the power consumption of the intelligent buffer chip(s) in certain modes of operation. For example, another Extended Mode Register EMR1 command controls the behavior of the DRAM output buffers using the Qoff command. In one embodiment, the intelligent register chip(s) may respect the Qoff request meaning the DRAM output buffers should be disabled. The intelligent register chip(s) may then pass through this EMR1 Qoff request to the DRAM devices and may also send a sideband bus signal to one or more of the intelligent buffer chip(s) to turn off their output buffers also—in order to enable IDD measurement or to reduce power for example. When the Qoff bit it set, the intelligent register chip(s) may also disable all intelligent buffer chip(s) in the system.

Additional uses envisioned for the communication between intelligent registers and intelligent buffers through side-band or inline signaling include:

a. All conceivable translation and mapping functions performed on the Data coming into the Intelligent Register 8302. A 'function' in this case should go beyond merely repeating input signals at the outputs.
b. All conceivable translation and mapping functions performed on the Address and Control signals coming into the Intelligent Register 8302. A 'function' in this case should go beyond merely repeating input signals at the outputs.
c. Uses of any and every signal originating from the DRAM going to the Intelligent Register or intelligent buffer.
d. Use of any first signal that is the result of the combination of a second signal and any data stored in non-volatile storage (e.g. SPD) where such first signal is communicated to one or more intelligent buffers 8307.
e. Clock and delay circuits inside the Intelligent Register or intelligent buffer. For example, one or more intelligent buffers can be used to de-skew data output from the DRAM.

Still more uses envisioned for the communication between intelligent registers and intelligent buffers through sideband or inline signaling include using the sideband as a time-domain multiplexed address bus. That is, rather than routing multiple physical address busses from the intelligent register to each of the DRAMs (through an intelligent buffer), a single physical sideband shared between a group of intelligent buffers can be implemented. Using a multi-cycle command & value technique or other intelligent register to intelligent buffer communication techniques described elsewhere in this specification, a different address can be communicated to each intelligent buffer, and then temporally aligned by the intelligent buffer such that the data resulting from (or presented to) the DRAMs is temporally aligned as a group.

Bypass and Data Recovery

In a computer that contains a memory system, information that is currently being used for computation is stored in the memory modules that comprise a memory system. If there is a failure anywhere in the computer, the data stored in the memory system is at risk to be lost. In particular, if there is a failure in the memory controller, the connections between memory controller and the memory modules, or in any chips that are between the memory controller and the DRAM chips on the memory modules, it may be impossible to retain and retrieve data in the memory system. This mode of failure occurs because there is no redundancy or failover in the datapath between the memory controller and DRAM. A particularly weak point of failure in a typical DIMM lies in the register and buffer chips that pass information to and from the DRAM chips. For example, in an FB-DIMM, there is an AMB chip. If the AMB chip on an FB-DIMM fails, it is not possible to retrieve data from the DRAM on that FB-DIMM.

In a memory module that includes intelligent register and/or intelligent buffer chips, more powerful memory buffer bypass and data recovery capabilities may be implemented.

As an example, in a memory module that uses an intelligent buffer or intelligent register chip, it is possible to provide an alternative memory datapath or read mechanism that will allow the computer to recover data despite a failure. For example, the alternative datapath can be provided using the SMBus or I2C bus that is typically used to read and write to the SPD on the memory module. In this case the SMBus or I2C bus is also connected to the intelligent buffer and/or register chips that are connected to the DRAM on the memory module. Such an alternative datapath is slower than the normal memory datapath, but is more robust and provides a mechanism to retrieve data in an emergency should a failure occur.

In addition, if the memory module is also capable of autonomous refresh, which is described elsewhere in this specification, the data may still be retrieved from a failed or failing memory module or entire memory system, even under conditions where the computer has essentially ceased to function, due to perhaps multiple failures. Provided that power is still being applied to the memory module (possibly by an emergency supply in the event of several failures in the computer), the autonomous refresh will keep the data in each memory module. If the normal memory datapath has also failed, the alternative memory datapath through the intelligent register and/or buffer chips can still be used to retrieve data. Even if the computer has failed to the extent that the computer cannot or is not capable of reading the data, an external device can be connect to a shared bus such as the SMBus or I2C bus used as the alternative memory datapath.

Control at Sub-DIMM Level

In a memory module that includes intelligent register and/or intelligent buffer chips, powerful temperature monitoring and control capabilities may be implemented, as described elsewhere in this specification. In addition, in a memory module that includes intelligent register and/or intelligent buffer chips, extensive control capabilities, including thermal and power control at the sub-DIMM level, that improve reliability, for example, may be implemented.

As an example, one particular DRAM on a memory module may be subjected to increased access relative to all the other DRAM components on the memory module. This increased access may lead to excessive thermal dissipation in the DRAM and require access to be reduced by throttling performance. In a memory module that includes intelligent register and/or intelligent buffer chips, this increased access pattern may be detected and the throttling performed at a finer level of granularity. Using the intelligent register and/or intelligent buffer chips, throttling at the level of the DIMM, a rank, a stack of DRAMs, or even an individual DRAM may be performed.

In addition, by using intelligent buffer and/or register chips, the throttling or thermal control or regulation may be performed. For example the intelligent buffer and/or register chips can use the Chip Select, Clock Enable, or other control signals to regulate and control the operation of the DIMM, a rank, a stack of DRAMs, or individual DRAM chips. Self-Test Memory modules used in a memory system may form the most expensive component of the computer. The largest current size of memory module is 4 GB (a GB or gigabyte is 1 billion bytes or 8 billion bits) and such a memory module costs several thousands of dollars. In a computer that uses several of these memory modules (it is not uncommon to have 64 GB of memory in a computer), the total cost of the memory may far exceed the cost of the computer.

In memory systems, it is thus exceedingly important to be able to thoroughly test the memory modules and not discard memory modules because of failures that can be circumvented or repaired.

In a memory module that includes intelligent register and/or intelligent buffer chips, extensive DRAM advanced self-test capabilities may be implemented.

For example, an intelligent register chip on a memory module may perform self-test functions by reading and writing to the DRAM chips on the memory module, either directly or through attached intelligent buffer chips. The self-test functions can include writing and reading fixed patterns, as is commonly done using an external memory controller. As a result of the self-test, the intelligent register chip may indicate success or failure using an LED, as described elsewhere in this specification. As a result of the self-test, the intelligent register or intelligent buffer chips may store information about the failures. This stored information may then be used to re-map or map out the defective memory cells, as described elsewhere in this specification.

Redundancy Features

There are market segments such as servers and workstations that require very large memory capacities. One way to provide large memory capacity is to use Fully Buffered DIMMs (FB-DIMMs), wherein the DRAMs are electrically isolated from the memory channel by an Advanced Memory Buffer (AMB). The FB-DIMM solution is expected to be used in the server and workstation market segments. An AMB acts as a bridge between the memory channel and the DRAMs, and also acts as a repeater. This ensures that the memory channel is always a point-to-point connection.

Figure 84:
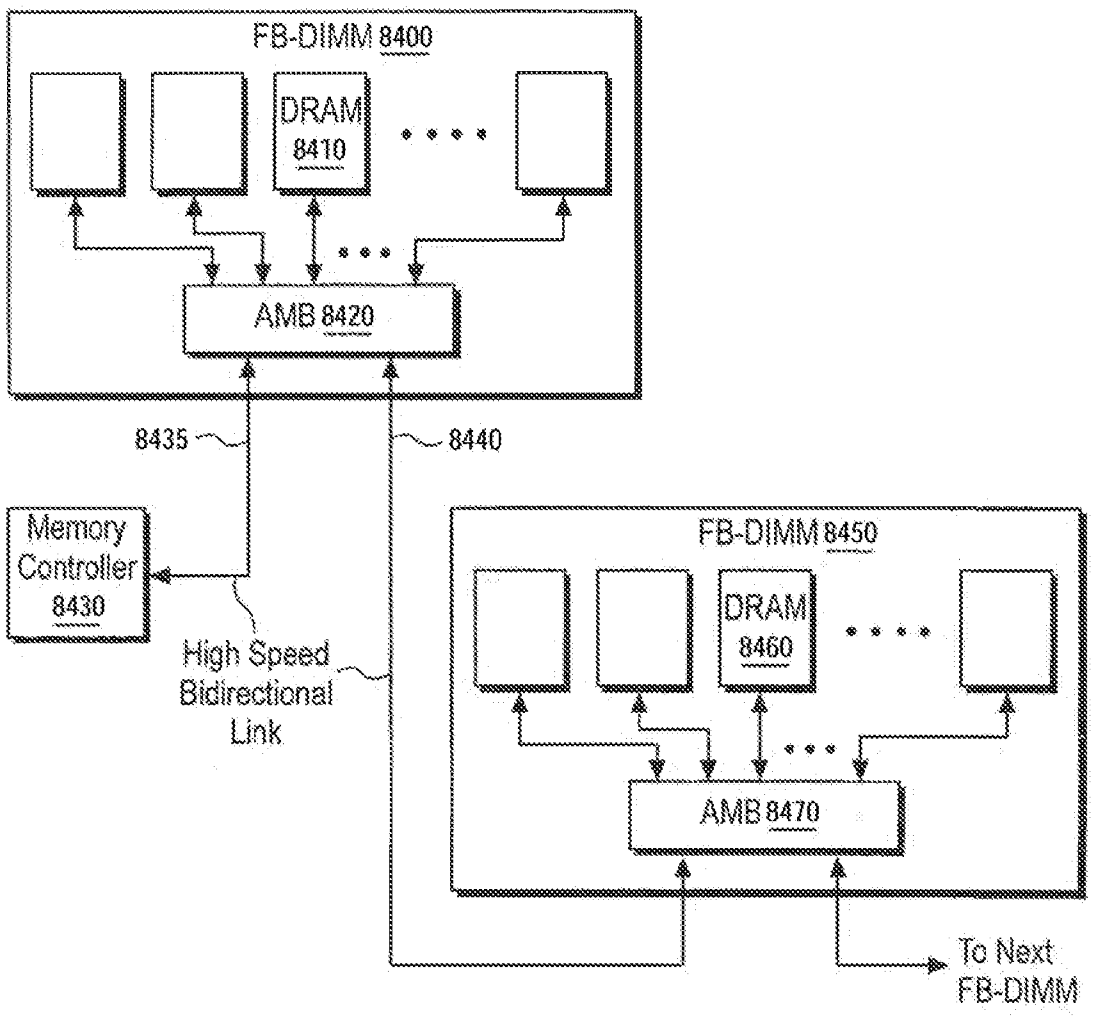
FIG. 84 illustrates one embodiment for a FB-DIMM.

FIG. 84 illustrates one embodiment of a memory channel with FB-DIMMs. FB-DIMMs 8400 and 8450 include DRAM chips (8410 and 8460) and AMBs 8420 and 8470. A high-speed bi-directional link 8435 couples a memory controller 8430 to FB-DIMM 8400. Similarly, FB-DIMM 8400 is coupled to FB-DIMM 8450 via high-speed bi-directional link 8440. Additional FB-DIMMs may be added in a similar manner.

The FB-DIMM solution has some drawbacks, the two main ones being higher cost and higher latency (i.e. lower performance). Each AMB is expected to cost $10-$15 in volume, a substantial additional fraction of the memory module cost. In addition, each AMB introduces a substantial amount of latency (5 ns). Therefore, as the memory capacity of the system increases by adding more FB-DIMMs, the performance of the system degrades due to the latencies of successive AMBs.

Figure 85A:
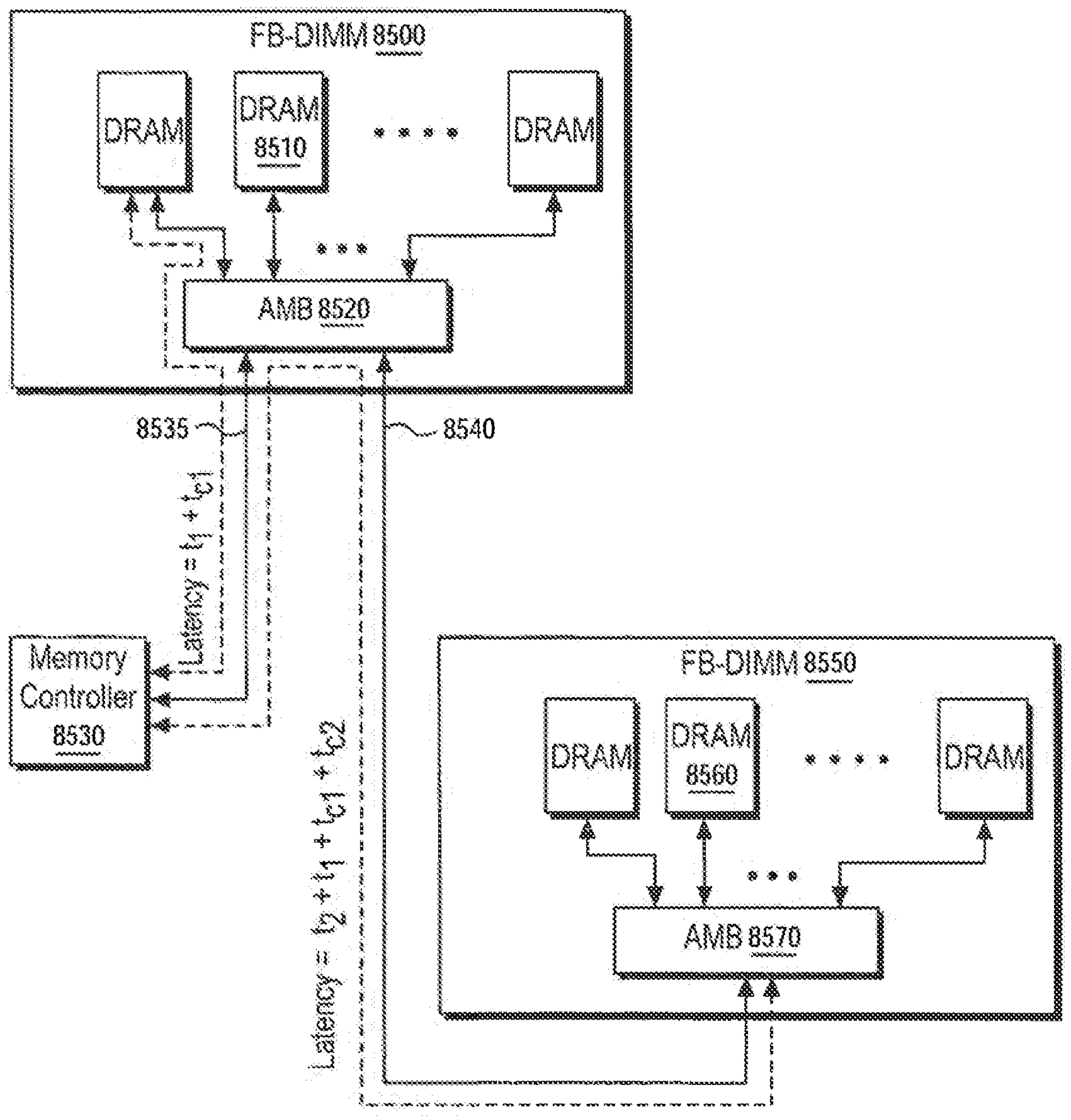
FIG. 85A includes the FB-DIMMs of FIG. 84 with annotations to illustrate latencies between a memory controller and two FB-DIMMs.

An alternate method of increasing memory capacity is to stack DRAMs on top of each other. This increases the total memory capacity of the system without adding additional distributed loads (instead, the electrical load is added at almost a single point). In addition, stacking DRAMs on top of each other reduces the performance impact of AMBs since multiple FB-DIMMs may be replaced by a single FB-DIMM that contains stacked DRAMs. FIG. 85A includes the FB-DIMMs of FIG. 84 with annotations to illustrate latencies between a memory controller and two FB-DIMMs. The latency between memory controller 8430 and FB-DIMM 8400 is the sum of t1 and tc1, wherein t1 is the delay between memory channel interface of the AMB 8420 and the DRAM interface of AMB 8420 (i.e., the delay through AMB 8420 when acting as a bridge), and tc1 is the signal propagation delay between memory controller 8430 and FB-DIMM 8400. Note that t1 includes the delay of the address/control signals through AMB 8420 and optionally that of the data signals through AMB 8420. Also, tc1 includes the propagation delay of signals from the memory controller 8430 to FB-DIMM 8400 and optionally, that of the signals from FB-DIMM 8400 to the memory controller 8430.

As shown in FIG. 85A, the latency between memory controller 8430 and FB-DIMM 8450 is the sum of t2+t1+tc1+tc2, wherein t2 is the delay between input and output memory channel interfaces of AMB 8420 (i.e. when AMB 8420 is operating as a repeater) and tc2 is a signal propagation delay between FB-DIMM 8400 and FB-DIMM 8450. t2 includes the delay of the signals from the memory controller 8430 to FB-DIMM 8450 through AMB 8420, and optionally that of the signals from FB-DIMM 8450 to memory controller 8430 through AMB 8420. Similarly, tc2 represents the propagation delay of signals from FB-DIMM 8400 to FB-DIMM 8450 and optionally that of signals from FB-DIMM 8450 and FB-DIMM 8400. t1 represents the delay of the signals through an AMB chip that is operating as a bridge, which in this instance, is AMB 8470.

Figure 85B:
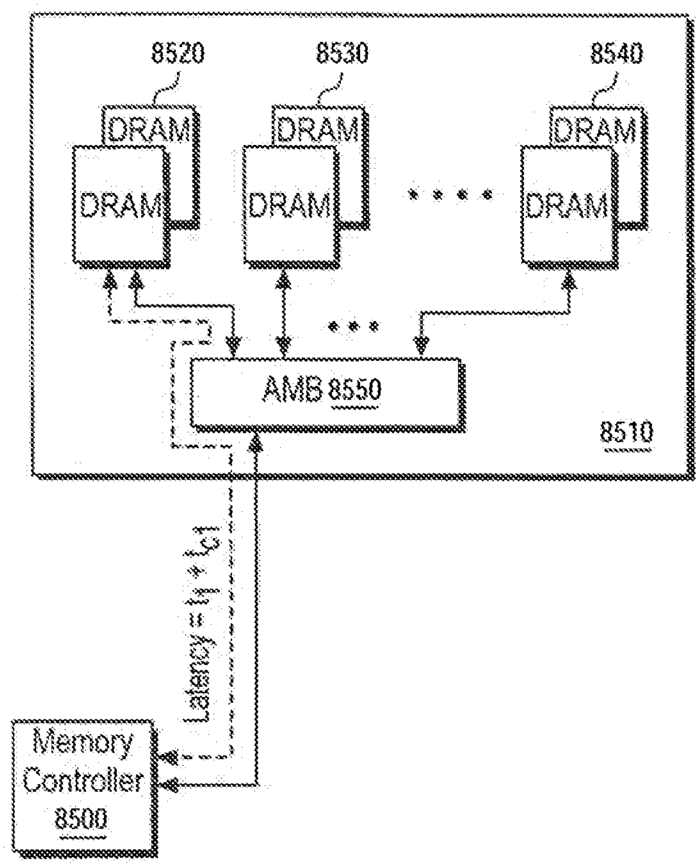
FIG. 85B illustrates latency in accessing an FB-DIMM with DRAM stacks, where each stack contains two DRAMs.

FIG. 85B illustrates latency in accessing an FB-DIMM with DRAM stacks, where each stack contains two DRAMs. In some embodiments, a "stack" comprises at least one DRAM chip. In other embodiments, a "stack" comprises an interface or buffer chip with at least one DRAM chip. FB-DIMM 8510 includes three stacks of DRAMs (8520, 8530 and 8540) and AMB 8550 accessed by memory controller 8500. As shown in FIG. 85B, the latency for accessing the stacks of DRAMs is the sum of t1 and tc1. It can be seen from FIGS. 85A and 85B that the latency is less in a memory channel with an FB-DIMM that contains 2-DRAM stacks than in a memory channel with two standard FB-DIMMs (i.e. FB-DIMMs with individual DRAMs). Note that FIG. 85B shows the case of 2 standard FB-DIMMs vs. an FB-DIMM that uses 2-DRAM stacks as an example. However, this may be extended to n standard FB-DIMMs vs. an FB-DIMM that uses n-DRAM stacks.

Stacking high speed DRAMs on top of each other has its own challenges. As high speed DRAMs are stacked, their respective electrical loads or input parasitics (input capacitance, input inductance, etc.) add up, causing signal integrity and electrical loading problems and thus limiting the maximum interface speed at which a stack may operate. In addition, the use of source synchronous strobe signals introduces an added level of complexity when stacking high speed DRAMs.

Stacking low speed DRAMs on top of each other is easier than stacking high speed DRAMs on top of each other. Careful study of a high speed DRAM will show that it consists of a low speed memory core and a high speed interface. So, if we may separate a high speed DRAM into two chips—a low speed memory chip and a high speed interface chip, we may stack multiple low speed memory chips behind a single high speed interface chip.

Figure 86:
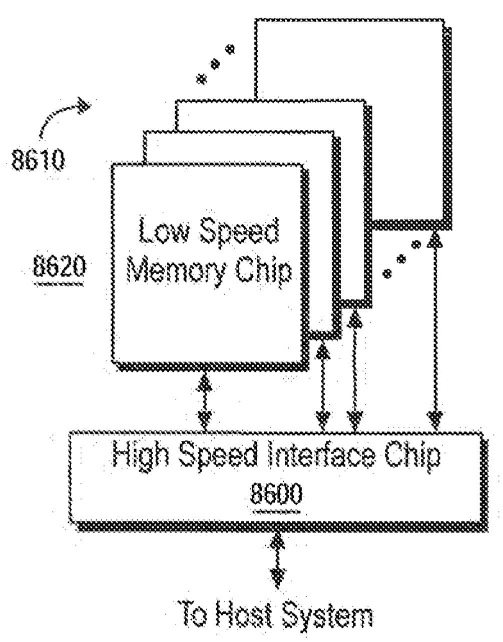
FIG. 86 is a block diagram illustrating one embodiment of a memory device that includes multiple memory core chips.

FIG. 86 is a block diagram illustrating one embodiment of a memory device that includes multiple memory core chips. Memory device 8620 includes a high speed interface chip 8600 and a plurality of low speed memory chips 8610 stacked behind high speed interface chip 8600. One way of partitioning is to separate a high speed DRAM into a low speed, wide, asynchronous memory core and a high speed interface chip.

Figure 87:
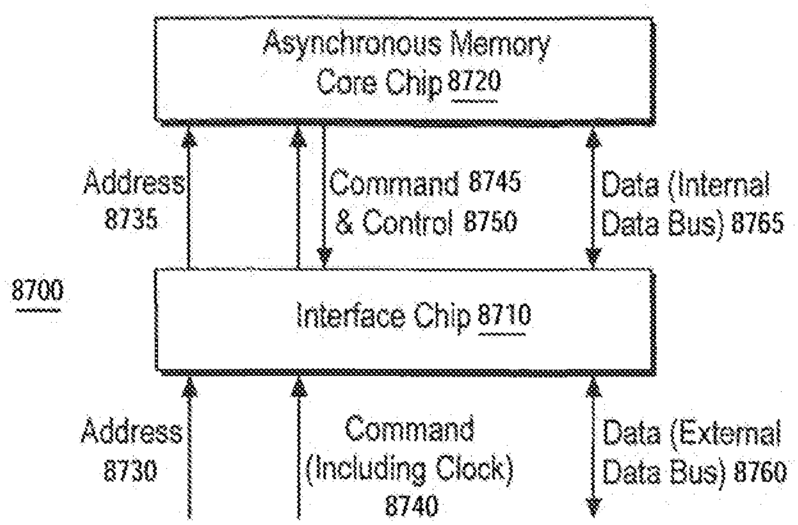
FIG. 87 is a block diagram illustrating one embodiment for partitioning a high speed DRAM device into asynchronous memory core chip and an interface chip.

FIG. 87 is a block diagram illustrating one embodiment for partitioning a high speed DRAM device into asynchronous memory core and an interface chip. Memory device 8700 includes asynchronous memory core chip 8720 interfaced to a memory channel via interface chip 8710. As shown in FIG. 87, interface chip 8710 receives address (8730), command (8740) and data (8760) from an external data bus, and uses address (8735), command & control (8745 and 8750) and data (8765) over an internal data bus to communicate with asynchronous memory core chip 8720.

However, it must be noted that several other partitions are also possible. For example, the address bus of a high speed DRAM typically runs at a lower speed than the data bus. For a DDR400 DDR SDRAM, the address bus runs at a 200 MHz speed while the data bus runs at a 400 MHz speed, whereas for a DDR2-800 DDR2 SDRAM, the address bus runs at a 400 MHz speed while the data bus runs at an 800 MHz speed. High-speed DRAMs use pre-fetching in order to support high data rates. So, a DDR2-800 device runs internally at a rate equivalent to 200 MHz rate except that 4n data bits are accessed from the memory core for each read or write operation, where n is the width of the external data bus. The 4n internal data bits are multiplexed/de-multiplexed onto the n external data pins, which enables the external data pins to run at 4 times the internal data rate of 200 MHz.

Thus another way to partition, for example, a high speed n-bit wide DDR2 SDRAM could be to split it into a slower, 4n-bit wide, synchronous DRAM chip and a high speed data interface chip that does the 4n to n data multiplexing/de-multiplexing.

Figure 88:
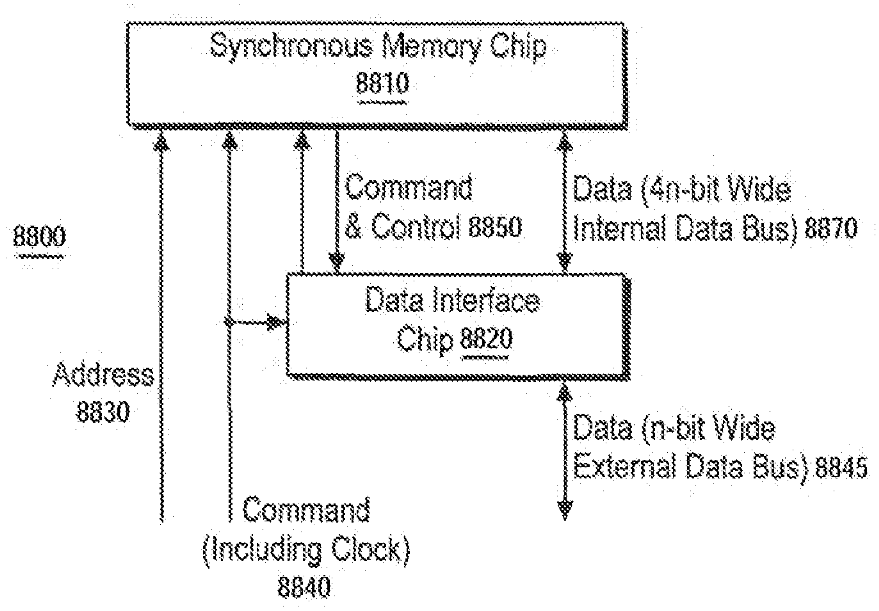
FIG. 88 is a block diagram illustrating one embodiment for partitioning a memory device into a synchronous memory chip and a data interface chip.

FIG. 88 is a block diagram illustrating one embodiment for partitioning a memory device into a synchronous memory chip and a data interface chip. For this embodiment, memory device 8800 includes synchronous memory chip 8810 and a data interface chip 8820. Synchronous memory chip 8810 receives address (8830) and command & clock 8840 from a memory channel. It also connected with data interface chip 8820 through command & control (8850) and data 8870 over a 4n bit wide internal data bus. Data interface chip 8820 connects to an n-bit wide external data bus 8845 and a 4n-bit wide internal data bus 8870. In one embodiment, an n-bit wide high speed DRAM may be partitioned into an m*n-bit wide synchronous DRAM chip and a high-speed data interface chip that does the m*n-to-n data multiplexing/de-multiplexing, where m is the amount of pre-fetching, m>1, and m is typically an even number.

As explained above, while several different partitions are possible, in some embodiments the partitioning should be done in such a way that:

the host system sees only a single load (per DIMM in the embodiments where the memory devices are on a DIMM) on the high speed signals or pins of the memory channel or bus and the memory chips that are to be stacked on top of each other operate at a speed lower than the data rate of the memory channel or bus (i.e. the rate of the external data bus), such that stacking these chips does not affect the signal integrity.

Based on this, multiple memory chips may be stacked behind a single interface chip that interfaces to some or all of the signals of the memory channel. Note that this means that some or all of the I/O signals of a memory chip connect to the interface chip rather than directly to the memory channel or bus of the host system. The I/O signals from the multiple memory chips may be bussed together to the interface chip or may be connected as individual signals to the interface chip. Similarly, the I/O signals from the multiple memory chips that are to be connected directly to the memory channel or bus of the host system may be bussed together or may be connected as individual signals to the external memory bus. One or more buses may be used when the I/O signals are to be bussed to either the interface chip or the memory channel or bus. Similarly, the power for the memory chips may be supplied by the interface chip or may come directly from the host system.

Figure 89:
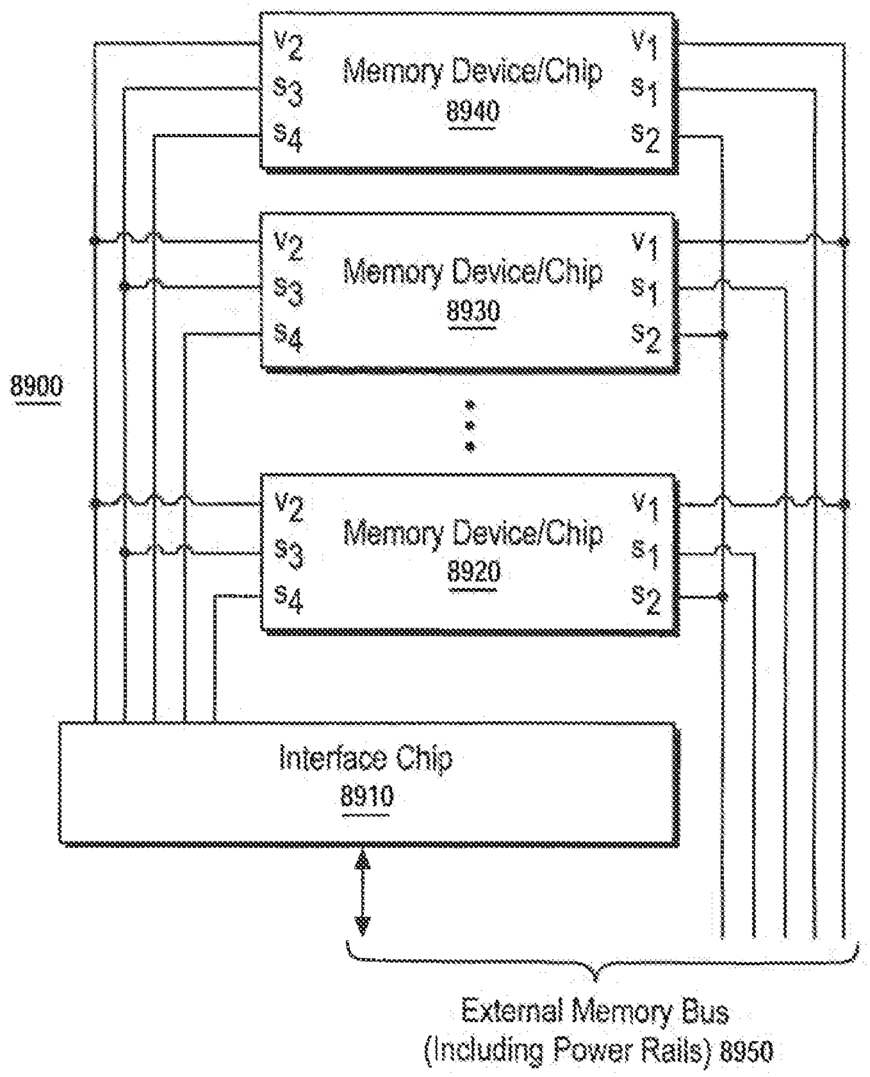
FIG. 89 illustrates one embodiment for stacked memory chips.

FIG. 89 illustrates one embodiment for stacked memory chips. Memory chips (8920, 8930 and 8940) include inputs and/or outputs for s1, s2, s3, s4 as well as v1 and v2. The s1 and s2 inputs and/or outputs are coupled to external memory bus 8950, and s3 and s4 inputs and/or outputs are coupled to interface chip 8910. Memory signals s1 and s4 are examples of signals that are not bussed. Memory signals s2 and s3 are examples of bussed memory signals. Memory power rail v1 is an example of memory power connected directly to external bus 8950, whereas v2 is an example of memory power rail connected to interface 8910. The memory chips that are to be stacked on top of each other may be stacked as dies or as individually packaged parts. One method is to stack individually packaged parts since these parts may be tested and burnt-in before stacking. In addition, since packaged parts may be stacked on top of each other and soldered together, it is quite easy to repair a stack. To illustrate, if a part in the stack were to fail, the stack may be de-soldered and separated into individual packages, the failed chip may be replaced by a new and functional chip, and the stack may be re-assembled. However, it should be clear that repairing a stack as described above is time consuming and labor intensive.

One way to build an effective p-chip memory stack is to use p+q memory chips and an interface chip, where the q extra memory chips ($1 \le q \le p$, typically) are spare chips, wherein p and q comprise integer values. If one or more of the p memory chips becomes damaged during assembly of the stack, they may be replaced with the spare chips. The post-assembly detection of a failed chip may either be done using a tester or using built-in self test (BIST) logic in the interface chip. The interface chip may also be designed to have the ability to replace a failed chip with a spare chip such that the replacement is transparent to the host system.

This idea may be extended further to run-time (i.e. under normal operating conditions) replacement of memory chips in a stack. Electronic memory chips such as DRAMs are prone to hard and soft memory errors. A hard error is typically caused by broken or defective hardware such that the memory chip consistently returns incorrect results. For example, a cell in the memory array might be stuck low so that it always returns a value of "0" even when a "1" is stored in that cell. Hard errors are caused by silicon defects, bad solder joints, broken connector pins, etc. Hard errors may typically be screened by rigorous testing and burn-in of DRAM chips and memory modules. Soft errors are random, temporary errors that are caused when a disturbance near a memory cell alters the content of the cell. The disturbance is usually caused by cosmic particles impinging on the memory chips. Soft errors may be corrected by overwriting the bad content of the memory cell with the correct data. For DRAMs, soft errors are more prevalent than hard errors.

Computer manufacturers use many techniques to deal with soft errors. The simplest way is to use an error correcting code (ECC), where typically 72 bits are used to store 64 bits of data. This type of code allows the detection and correction of a single-bit error, and the detection of two-bit errors. ECC does not protect against a hard failure of a DRAM chip. Computer manufacturers use a technique called Chipkill or Advanced ECC to protect against this type of chip failure. Disk manufacturers use a technique called Redundant Array of Inexpensive Disks (RAID) to deal with similar disk errors.

More advanced techniques such as memory sparing, memory mirroring, and memory RAID are also available to protect against memory errors and provide higher levels of memory availability. These features are typically found on higher-end servers and require special logic in the memory controller. Memory sparing involves the use of a spare or redundant memory bank that replaces a memory bank that exhibits an unacceptable level of soft errors. A memory bank may be composed of a single DIMM or multiple DIMMs. Note that the memory bank in this discussion about advanced memory protection techniques should not be confused with the internal banks of DRAMs.

In memory mirroring, every block of data is written to system or working memory as well as to the same location in mirrored memory but data is read back only from working memory. If a bank in the working memory exhibits an unacceptable level of errors during read back, the working memory will be replaced by the mirrored memory.

RAID is a well-known set of techniques used by the disk industry to protect against disk errors. Similar RAID techniques may be applied to memory technology to protect against memory errors. Memory RAID is similar in concept to RAID 3 or RAID 4 used in disk technology. In memory RAID a block of data (typically some integer number of cachelines) is written to two or more memory banks while the parity for that block is stored in a dedicated parity bank. If any of the banks were to fail, the block of data may be re-created with the data from the remaining banks and the parity data.

These advanced techniques (memory sparing, memory mirroring, and memory RAID) have up to now been implemented using individual DIMMs or groups of DIMMs. This obviously requires dedicated logic in the memory controller. However, in this disclosure, such features may mostly be implemented within a memory stack and requiring only minimal or no additional support from the memory controller.

A DIMM or FB-DIMM may be built using memory stacks instead of individual DRAMs. For example, a standard FB-DIMM might contain nine, 18, or more DDR2 SDRAM chips. An FB-DIMM may contain nine 18, or more DDR2 stacks, wherein each stack contains a DDR2 SDRAM interface chip and one or more low speed memory chips stacked on top of it (i.e. electrically behind the interface chip—the interface chip is electrically between the memory chips and the external memory bus). Similarly, a standard DDR2 DIMM may contain nine 18 or more DDR2 SDRAM chips. A DDR2 DIMM may instead contain nine 18, or more DDR2 stacks, wherein each stack contains a DDR2 SDRAM interface chip and one or more low speed memory chips stacked on top of it. An example of a DDR2 stack built according to one embodiment is shown in FIG. 90.

Figure 90:
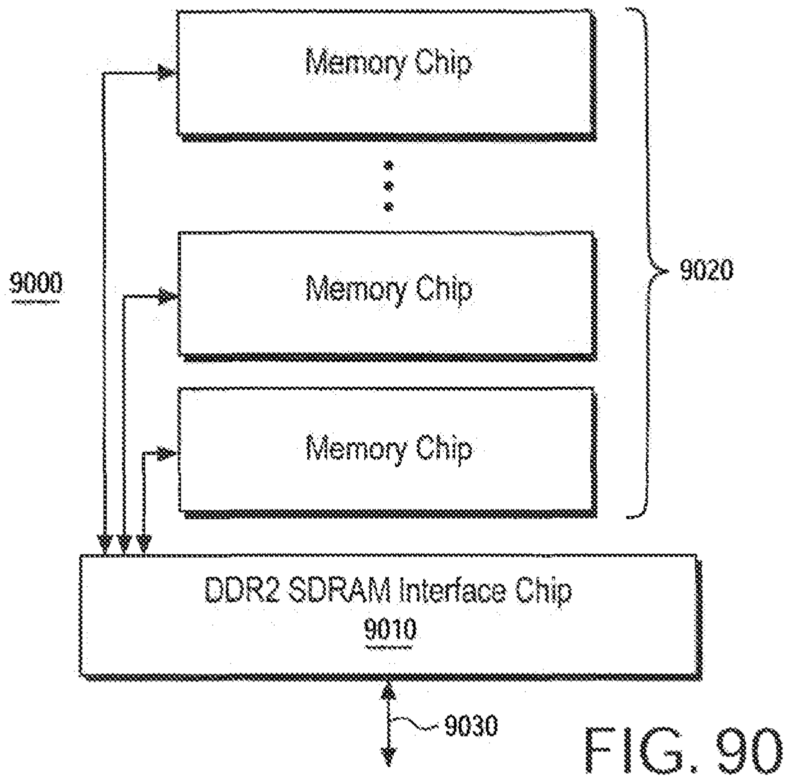
FIG. 90 is a block diagram illustrating one embodiment for interfacing a memory device to a DDR2 memory bus.

FIG. 90 is a block diagram illustrating one embodiment for interfacing a memory device to a DDR2 memory bus. As shown in FIG. 90, memory device 9000 comprises memory chips 9020 coupled to DDR2 SDRAM interface chip 9010. In turn, DDR2 SDRAM interface chip 9010 interfaces memory chips 9020 to external DDR2 memory bus 9030. As described previously, in one embodiment, an effective p-chip memory stack may be built with p+q memory chips and an interface chip, where the q chips may be used as spares, and p and q are integer values. In order to implement memory sparing within the stack, the p+q chips may be separated into two pools of chips: a working pool of p chips and a spare pool of q chips. So, if a chip in the working pool were to fail, it may be replaced by a chip from the spare pool. The replacement of a failed working chip by a spare chip may be triggered, for example, by the detection of a multi-bit failure in a working chip, or when the number of errors in the data read back from a working chip crosses a pre-defined or programmable error threshold.

Since ECC is typically implemented across the entire 64 data bits in the memory channel and optionally, across a plurality of memory channels, the detection of single-bit or multi-bit errors in the data read back is only done by the memory controller (or the AMB in the case of an FB-DIMM). The memory controller (or AMB) may be designed to keep a running count of errors in the data read back from each DIMM. If this running count of errors were to exceed a certain pre-defined or programmed threshold, then the memory controller may communicate to the interface chip to replace the chip in the working pool that is generating the errors with a chip from the spare pool.

For example, consider the case of a DDR2 DIMM. Let us assume that the DIMM contains nine DDR2 stacks (stack 0 through 8, where stack 0 corresponds to the least significant eight data bits of the 72-bit wide memory channel, and stack 8 corresponds to the most significant 8 data bits), and that each DDR2 stack consists of five chips, four of which are assigned to the working pool and the fifth chip is assigned to the spare pool. Let us also assume that the first chip in the working pool corresponds to address range [N-1:0], the second chip in the working pool corresponds to address range [2N-1:N], the third chip in the working pool corresponds to address range [3N-1:2 N], and the fourth chip in the working pool corresponds to address range [4N-1:3 N], where “N” is an integer value.

Under normal operating conditions, the memory controller may be designed to keep track of the errors in the data from the address ranges [4N-1:3 N], [3N-1:2 N], [2N-1:N], and [N-1:0]. If, say, the errors in the data in the address range [3N-1:2 N] exceeded the pre-defined threshold, then the memory controller may instruct the interface chip in the stack to replace the third chip in the working pool with the spare chip in the stack. This replacement may either be done simultaneously in all the nine stacks in the DIMM or may be done on a per-stack basis. Assume that the errors in the data from the address range [3N-1:2 N] are confined to data bits [7:0] from the DIMM. In the former case, the third chip in all the stacks will be replaced by the spare chip in the respective stacks. In the latter case, only the third chip in stack 0 (the LSB stack) will be replaced by the spare chip in that stack. The latter case is more flexible since it compensates for or tolerates one failing chip in each stack (which need not be the same chip in all the stacks), whereas the former case compensates for or tolerates one failing chip over all the stacks in the DIMM. So, in the latter case, for an effective p-chip stack built with p+q memory chips, up to q chips may fail per stack and be replaced with spare chips. The memory controller (or AMB) may trigger the memory sparing operation (i.e. replacing a failing working chip with a spare chip) by communicating with the interface chips either through in-band signaling or through sideband signaling. A System Management Bus (SMBus) is an example of sideband signaling.

Embodiments for memory sparing within a memory stack configured in accordance with some embodiments are shown in FIGS. 91A-91E.

Figure 91A:
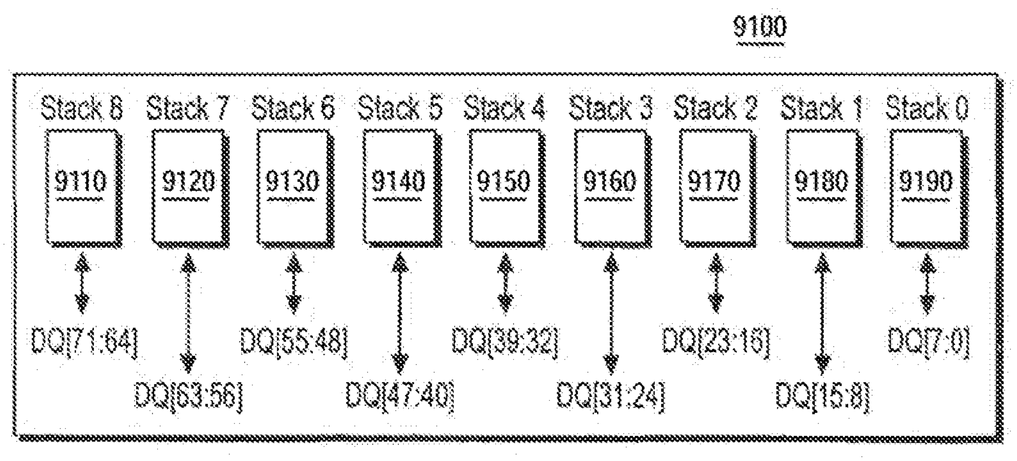
FIG. 91A is a block diagram illustrating one embodiment for stacking memory chips on a DIMM module.

FIG. 91A is a block diagram illustrating one embodiment for stacking memory chips on a DIMM module. For this example, memory module 9100 includes nine stacks (9110, 9120, 9130, 9140, 9150, 9160, 9170, 9180 and 9190). Each stack comprises at least two memory chips. In one embodiment, memory module 9100 is configured to work in accordance with DDR2 specifications.

Figure 91B:
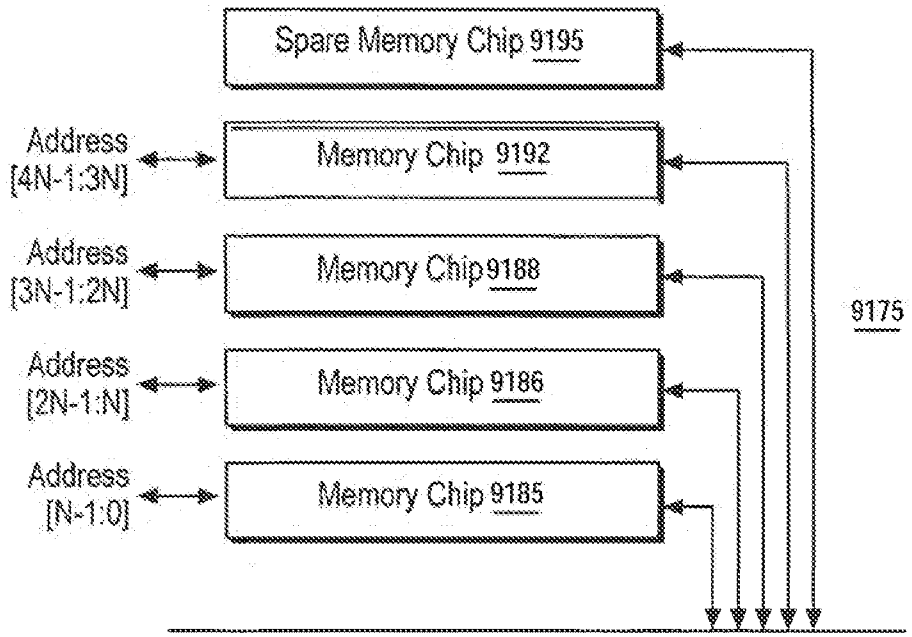
FIG. 91B is a block diagram illustrating one embodiment for stacking memory chips with memory sparing.

FIG. 91B is a block diagram illustrating one embodiment for stacking memory chips with memory sparing. For the example memory stack shown in FIG. 91B, memory device 9175 includes memory chips (9185, 9186, 9188 and 9192) stacked to form the working memory pool. For this embodiment, to access the working memory pool, the memory chips are each assigned a range of addresses as shown in FIG. 91B. Memory device 9175 also includes spare memory chip 9195 that forms the spare memory pool. However, the spare memory pool may comprise any number of memory chips.

Figure 91C:
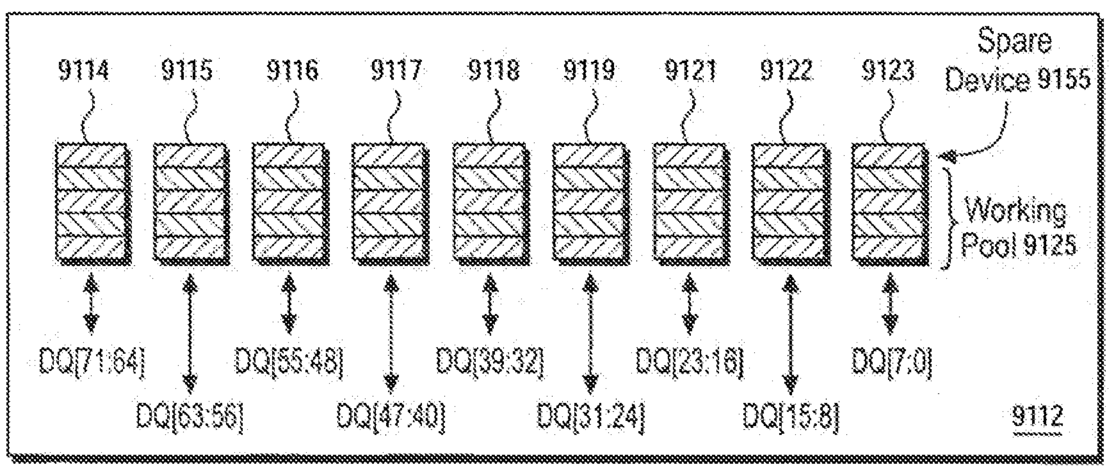
FIG. 91C is a block diagram illustrating operation of a working pool of stack memory.

FIG. 91C is a block diagram illustrating operation of a working memory pool. For this embodiment, memory module 9112 includes a plurality of integrated circuit memory stacks (9114, 9115, 9116, 9117, 9118, 9119, 9121, 9122 and 9123). For this example, each stack contains a working memory pool 9125 and a spare memory chip 9155.

Figure 91D:
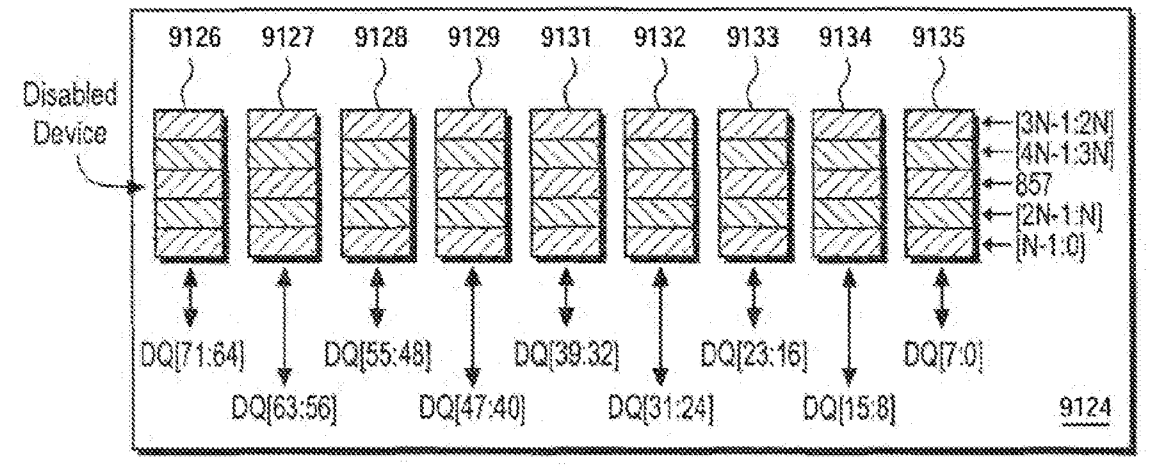
FIG. 91D is a block diagram illustrating one embodiment for implementing memory sparing for stacked memory chips.

FIG. 91D is a block diagram illustrating one embodiment for implementing memory sparing for stacked memory chips. For this example, memory module 9124 also includes a plurality of integrated circuit memory stacks (9126, 9127, 9128, 9129, 9131, 9132, 9133, 9134 and 9135). For this embodiment, memory sparing may be enabled if data errors occur in one or more memory chips (i.e., occur in an address range). For the example illustrated in FIG. 91D, data errors exceeding a predetermined threshold have occurred in DQ[7:0] in the address range [3N-1:2 N]. To implement memory sparing, the failing chip is replaced simultaneously in all of the stacks of the DIMM. Specifically, for this example, failing chip 9157 is replaced by spare chip 9155 in all memory stacks of the DIMM.

Figure 91E:
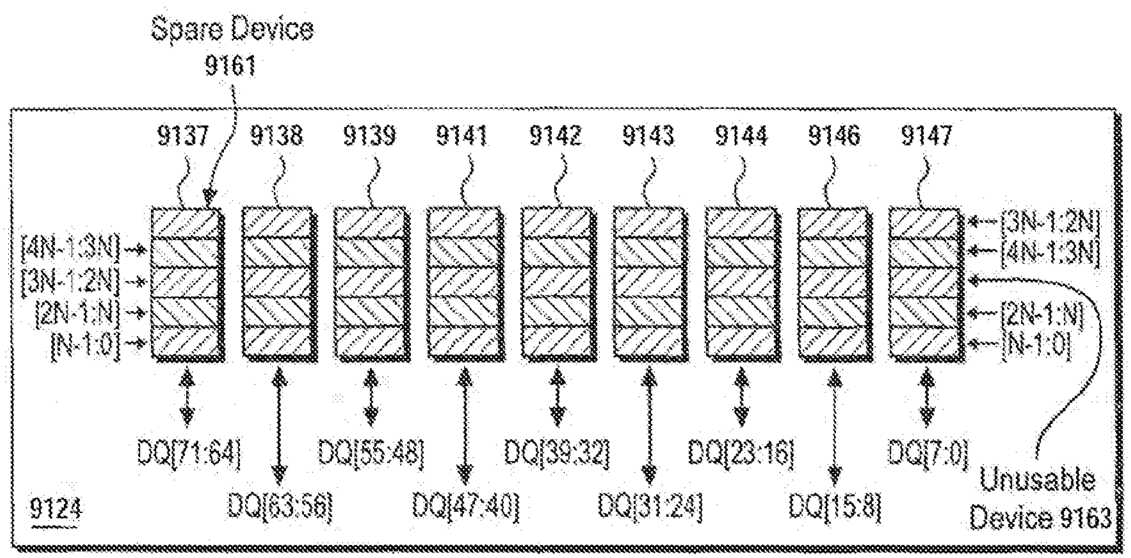
FIG. 91E is a block diagram illustrating one embodiment for implementing memory sparing on a per stack basis.

FIG. 91E is a block diagram illustrating one embodiment for implementing memory sparing on a per stack basis. For this embodiment, memory module 9136 also includes a plurality of integrated circuit memory stacks (9137, 9138, 9139, 9141, 9142, 9143, 9144, 9146 and 9147). Each stack is apportioned into the working memory pool and a spare memory pool (e.g., spare chip 9161). For this example, memory chip chip 9163 failed in stack 9147. To enable memory sparing, only the spare chip in stack 9147 replaces the failing chip, and all other stacks continue to operate using the working pool.

Memory mirroring can be implemented by dividing the p+q chips in each stack into two equally sized sections—the working section and the mirrored section. Each data that is written to memory by the memory controller is stored in the same location in the working section and in the mirrored section. When data is read from the memory by the memory controller, the interface chip reads only the appropriate location in the working section and returns the data to the memory controller. If the memory controller detects that the data returned had a multi-bit error, for example, or if the cumulative errors in the read data exceeded a pre-defined or programmed threshold, the memory controller can be designed to tell the interface chip (by means of in-band or sideband signaling) to stop using the working section and instead treat the mirrored section as the working section. As discussed for the case of memory sparing, this replacement can either be done across all the stacks in the DIMM or can be done on a per-stack basis. The latter case is more flexible since it can compensate for or tolerate one failing chip in each stack whereas the former case can compensate for or tolerate one failing chip over all the stacks in the DIMM.

Embodiments for memory mirroring within a memory stack are shown in FIGS. 92A-92E.

Figure 92A:
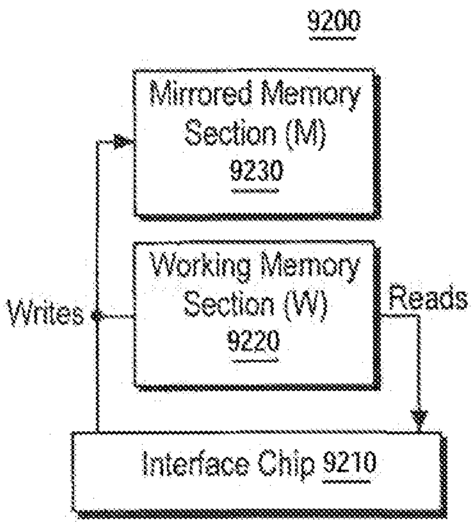
FIG. 92A is a block diagram illustrating memory mirroring in accordance with one embodiment.

FIG. 92A is a block diagram illustrating memory mirroring in accordance with one embodiment. As shown in FIG. 92A, a memory device 9200 includes interface chip 9210 that interfaces memory to an external memory bus. The memory is apportioned into a working memory section 9220 and a mirrored memory section 9230. During normal operation, write operations occur in both the working memory section 9220 and the mirrored memory section 9230. However, read operations are only conducted from the working memory section 9220.

Figure 92B:
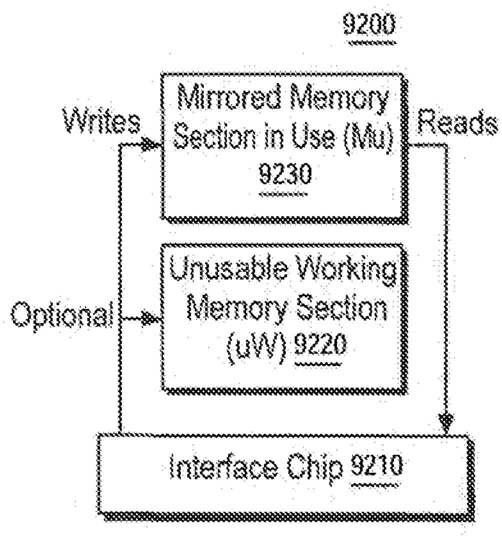
FIG. 92B is a block diagram illustrating one embodiment for a memory device that enables memory mirroring.

FIG. 92B is a block diagram illustrating one embodiment for a memory device that enables memory mirroring. For this example, memory device 9200 uses mirrored memory section 9230 as working memory due to a threshold of errors that occurred in the working memory 9220. As such, working memory section 9220 is labeled as the unusable working memory section. In operation, interface chip 9210 executes write operations to mirrored memory section 9230 and optionally to the unusable working memory section 9220. However, with memory mirroring enabled, reads occur from mirrored memory section 9230.

Figure 92C:
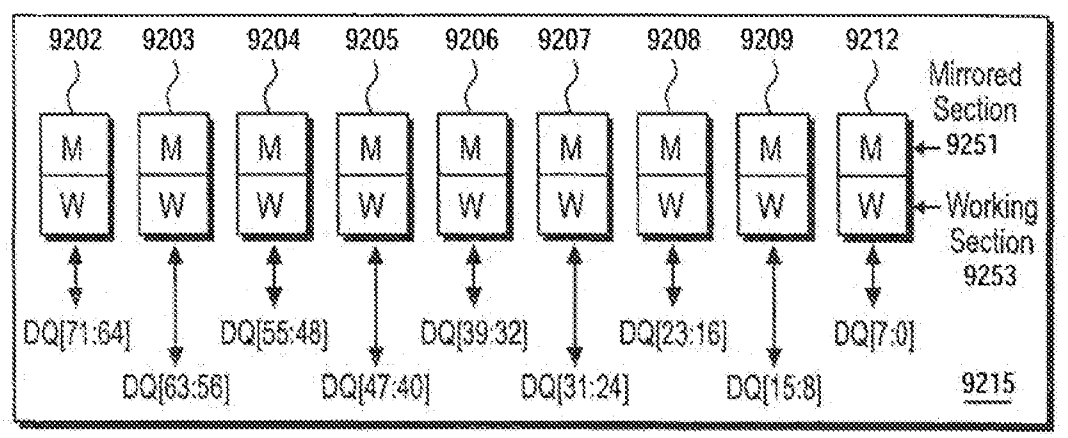
FIG. 92C is a block diagram illustrating one embodiment for a mirrored memory system with stacks of memory.

FIG. 92C is a block diagram illustrating one embodiment for a mirrored memory system with integrated circuit memory stacks. For this embodiment, memory module 9215 includes a plurality of integrated circuit memory stacks (9202, 9203, 9204, 9205, 9206, 9207, 9208, 9209 and 9212). As shown in FIG. 92C, each stack is apportioned into a working memory section 9253, and labeled "W" in FIG. 92C, as well as a mirrored memory section 9251, labeled "M" in FIG. 92C. For this example, the working memory section is accessed (i.e., mirrored memory is not enabled).

Figure 92D:
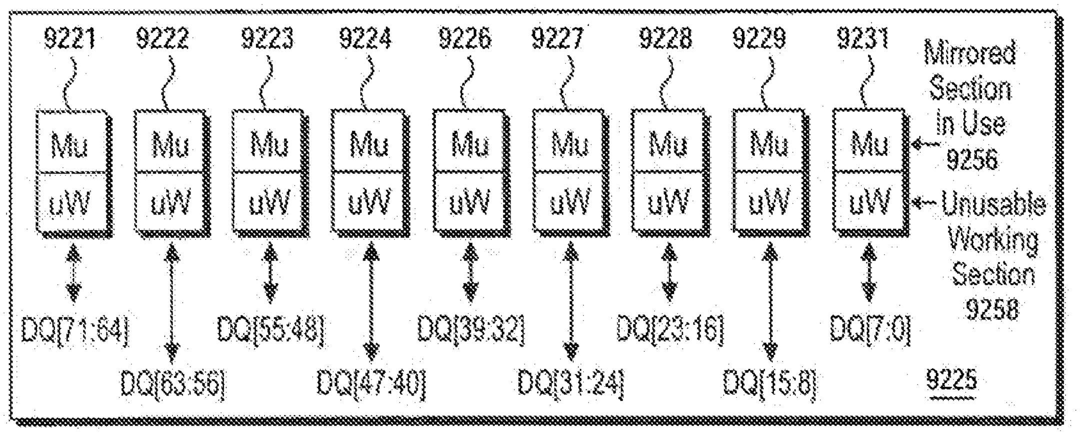
FIG. 92D is a block diagram illustrating one embodiment for enabling memory mirroring simultaneously across all stacks of a DIMM.

FIG. 92D is a block diagram illustrating one embodiment for enabling memory mirroring simultaneously across all stacks of a DIMM. For this embodiment, memory module 9225 also includes a plurality of integrated circuit memory stacks (9221, 9222, 9223, 9224, 9226, 9227, 9228, 9229 and 9231) apportioned into a mirrored memory section 9256 and a working memory section 9258. For this embodiment, when memory mirroring is enabled, all chips in the mirrored memory section for each stack in the DIMM are used as the working memory.

Figure 92E:
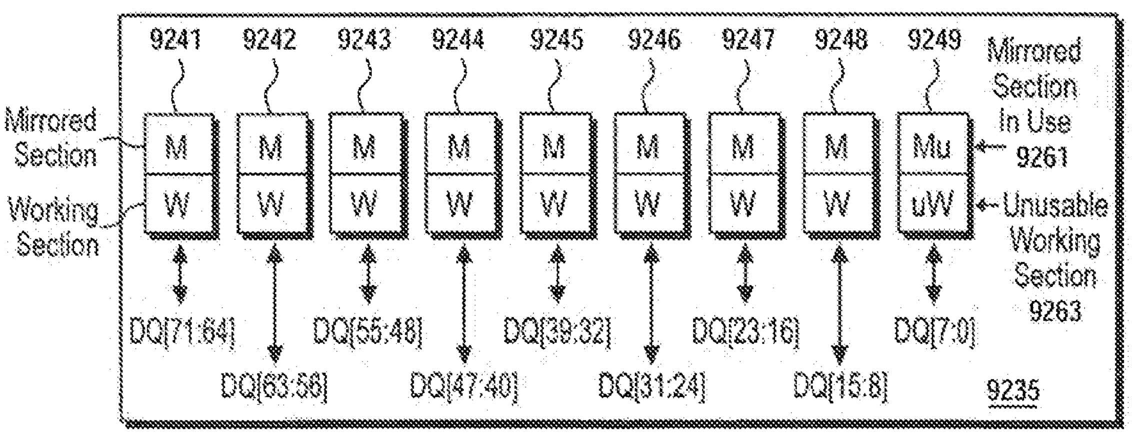
FIG. 92E is a block diagram illustrating one embodiment for enabling memory mirroring on a per stack basis.

FIG. 92E is a block diagram illustrating one embodiment for enabling memory mirroring on a per stack basis. For this embodiment, memory module 9235 includes a plurality of integrated circuit memory stacks (9241, 9242, 9243, 9244, 9245, 9246, 9247, 9248 and 9249) apportioned into a mirrored section 9261 (labeled "M") and a working memory section 9263 (labeled "W"). For this embodiment, when a predetermined threshold of errors occurs from a portion of the working memory, mirrored memory from the corresponding stack is replaced with working memory. For example, if data errors occurred in DQ[7:0] and exceed a threshold, then mirrored memory section 9261 (labeled "Mu") replaces working memory section 9263 (labeled "uW") for stack 9249 only.

In one embodiment, memory RAID within a (p+1)-chip stack may be implemented by storing data across p chips and storing the parity (i.e. the error correction code or information) in a separate chip (i.e. the parity chip). So, when a block of data is written to the stack, the block is broken up into p equal sized portions and each portion of data is written to a separate chip in the stack. That is, the data is "striped" across p chips in the stack.

To illustrate, say that the memory controller writes data block A to the memory stack. The interface chip splits this data block into p equal sized portions (A1, A2, A3, . . . , Ap) and writes A1 to the first chip in the stack, A2 to the second chip, A3 to the third chip, and so on, till Ap is written to the pth chip in the stack. In addition, the parity information for the entire data block A is computed by the interface chip and stored in the parity chip. When the memory controller sends a read request for data block A, the interface chip reads A1, A2, A3, . . . Ap from the first, second, third, . . . , pth chip respectively to form data block A. In addition, it reads the stored parity information for data block A. If the memory controller detects an error in the data read back from any of the chips in the stack, the memory controller may instruct the interface chip to re-create the correct data using the parity information and the correct portions of the data block A.

Figure 93A:
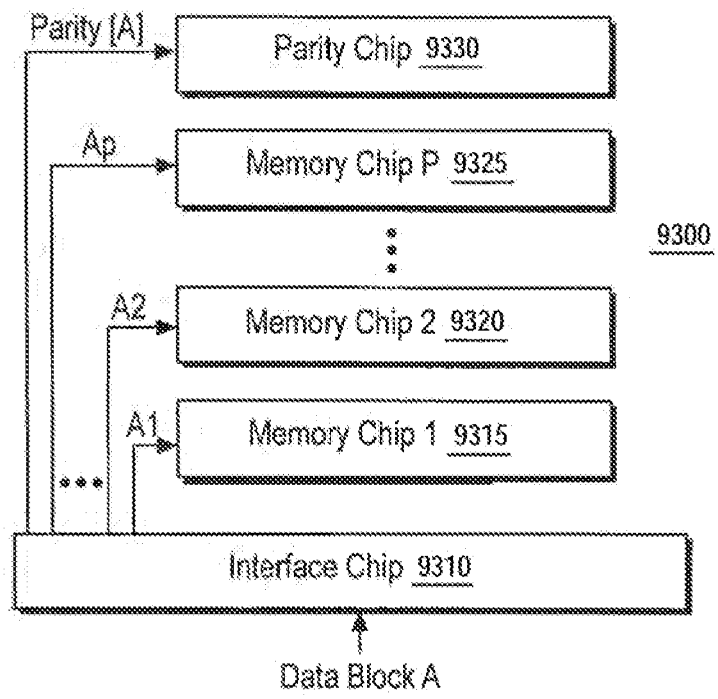
FIG. 93A is a block diagram illustrating a stack of memory chips with memory RAID capability during execution of a write operation.
Figure 93B:
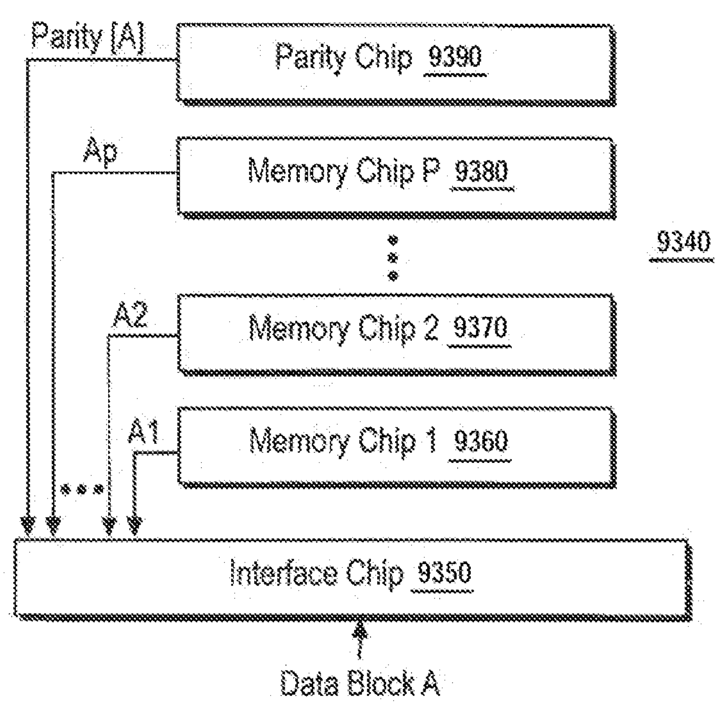
FIG. 93B is a block diagram illustrating a stack of memory chips with memory RAID capability during a read operation.

Embodiments for memory RAID within a memory stack are shown in FIGS. 93A and 93B.

FIG. 93A is a block diagram illustrating a stack of memory chips with memory RAID capability during execution of a write operation. Memory device 9300 includes an interface chip 9310 to interface "p+1" memory chips (9315, 9320, 9325, and 9330) to an external memory bus. FIG. 93A shows a write operation of a data block "A", wherein data for data block "A" is written into memory chips as follows.

A=Ap . . . A2, A1;

Parity[A]=(Ap)n . . . n(A2), n(A1), wherein, "n" is the bitwise exclusive OR operator.

FIG. 93B is a block diagram illustrating a stack of memory chips with memory RAID capability during a read operation. Memory device 9340 includes interface chip 9350, "p" memory chips (9360, 9370 and 9380) and a parity memory chip 9390. For a read operation, data block "A" consists of A1, A2, . . . Ap and Parity[A], and is read from the respective memory chips as shown in FIG. 93B.

Note that this technique ensures that the data stored in each stack can recover from some types of errors. The memory controller may implement error correction across the data from all the memory stacks on a DIMM, and optionally, across multiple DIMMs.

In other embodiments the bits stored in the extra chip may have alternative functions than parity. As an example, the extra storage or hidden bit field may be used to tag a cacheline with the address of associated cachelines. Thus suppose the last time the memory controller fetched cacheline A, it also then fetched cacheline B (where B is a random address). The memory controller can then write back cacheline A with the address of cacheline B in the hidden bit field. Then the next time the memory controller reads cacheline A, it will also read the data in the hidden bit field and pre-fetch cacheline B. In yet other embodiments, metadata or cache tags or prefetch information may be stored in the hidden bit field.

Figure 94:
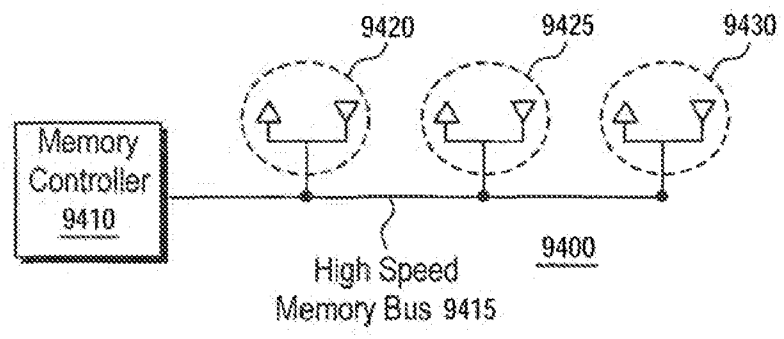

With conventional high speed DRAMs, addition of extra memory involves adding extra electrical loads on the high speed memory bus that connects the memory chips to the memory controller, as shown in FIG. 94.

FIG. 94 illustrates conventional impedance loading as a result of adding DRAMs to a high-speed memory bus. For this embodiment, memory controller 9410 accesses memory on high-speed bus 9415. The load of a conventional DRAM on high-speed memory bus 9415 is illustrated in FIG. 94 (9420). To add additional memory capacity in a conventional manner, memory chips are added to the high-speed bus 9415, and consequently additional loads (9425 and 9430) are also added to the high-speed memory bus 9415.

As the memory bus speed increases, the number of chips that can be connected in parallel to the memory bus decreases. This places a limit on the maximum memory capacity. Alternately stated, as the number of parallel chips on the memory bus increases, the speed of the memory bus must decrease. So, we have to accept lower speed (and lower memory performance) in order to achieve high memory capacity.

Separating a high speed DRAM into a high speed interface chip and a low speed memory chip facilitates easy addition of extra memory capacity without negatively impacting the memory bus speed and memory system performance. A single high speed interface chip can be connected to some or all of the lines of a memory bus, thus providing a known and fixed load on the memory bus. Since the other side of the interface chip runs at a lower speed, multiple low speed memory chips can be connected to (the low speed side of) the interface chip without sacrificing performance, thus providing the ability to upgrade memory. In effect, the electrical loading of additional memory chips has been shifted from a high speed bus (which is the case today with conventional high speed DRAMs) to a low speed bus. Adding additional electrical loads on a low speed bus is always a much easier problem to solve than that of adding additional electrical loads on a high speed bus.

Figure 95:
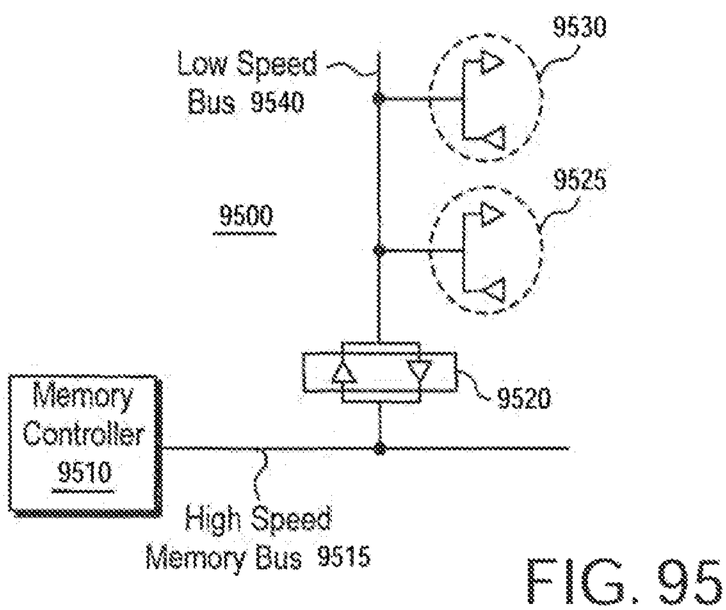

FIG. 95 illustrates impedance loading as a result of adding DRAMs to a high-speed memory bus in accordance with one embodiment. For this embodiment, memory controller 9510 accesses a high-speed interface chip 9500 on high-speed memory bus 9515. The load 9520 from the high-speed interface chip is shown in FIG. 95. A low speed bus 9540 couples to high-speed interface chip 9500. The loads of the memory chips (9530 and 9525) are applied to low speed bus 9540. As a result, additional loads are not added to high-speed memory bus 9515.

The number of low speed memory chips that are connected to the interface chip may either be fixed at the time of the manufacture of the memory stack or may be changed after the manufacture. The ability to upgrade and add extra memory capacity after the manufacture of the memory stack is particularly useful in markets such as desktop PCs where the user may not have a clear understanding of the total system memory capacity that is needed by the intended applications. This ability to add additional memory capacity will become very critical when the PC industry adopts DDR3 memories in several major market segments such as desktops and mobile. The reason is that at DDR3 speeds, it is expected that only one DIMM can be supported per memory channel. This means that there is no easy way for the end user to add additional memory to the system after the system has been built and shipped.

In order to provide the ability to increase the memory capacity of a memory stack, a socket may be used to add at least one low speed memory chip. In one aspect, the socket can be on the same side of the printed circuit board (PCB) as the memory stack but be adjacent to the memory stack, wherein a memory stack may consist of at least one high speed interface chip or at least one high speed interface chip and at least one low speed memory chip.

Figure 96:
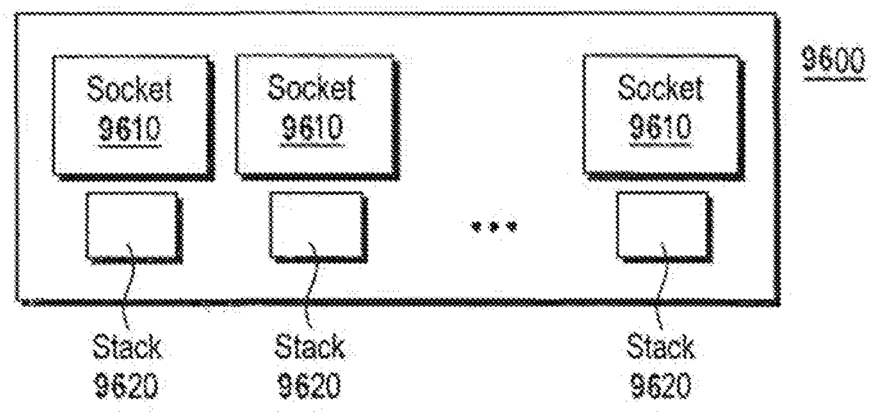

FIG. 96 is a block diagram illustrating one embodiment for adding low speed memory chips using a socket. For this embodiment, a printed circuit board (PCB) 9600, such as a DIMM, includes one or more stacks of high speed interface chips. In other embodiments, the stacks also include low-speed memory chips. As shown in FIG. 96, one or more sockets (9610) are mounted on the PCB 9600 adjacent to the stacks 9620. Low-speed memory chips may be added to the sockets to increase the memory capacity of the PCB 9600. Also, for this embodiment, the sockets 9610 are located on the same side of the PCB 9600 as stacks 9620.

Figure 97:
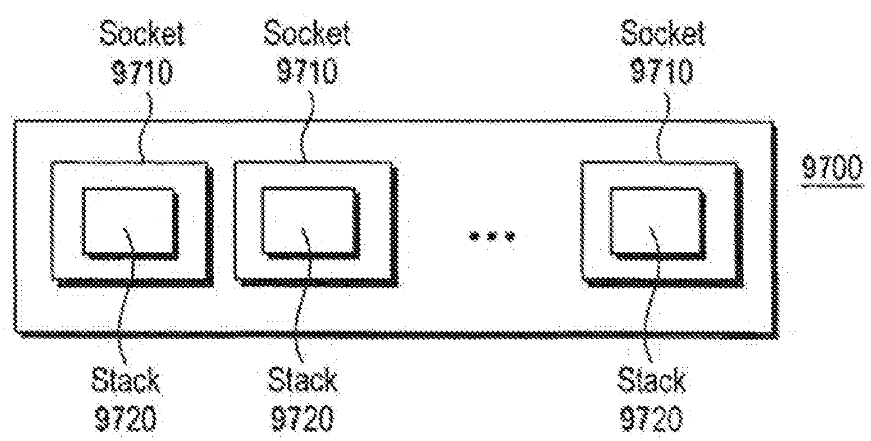

In situations where the PCB space is limited or the PCB dimensions must meet some industry standard or customer requirements, the socket for additional low speed memory chips can be designed to be on the same side of the PCB as the memory stack and sit on top of the memory stack, as shown in FIG. 97.

FIG. 97 illustrates a PCB with a socket located on top of a stack. PCB 9700 includes a plurality of stacks (9720). A stack contains a high speed interface chip and optionally, one or more low speed memory chips. For this embodiment, a socket (9710) sits on top of one or more stacks. Memory chips are placed in the socket(s) (9710) to add memory capacity to the PCB (e.g., DIMM). Alternately, the socket for the additional low speed memory chips can be designed to be on the opposite side of the PCB from the memory stack, as shown in FIG. 98.

Figure 98:
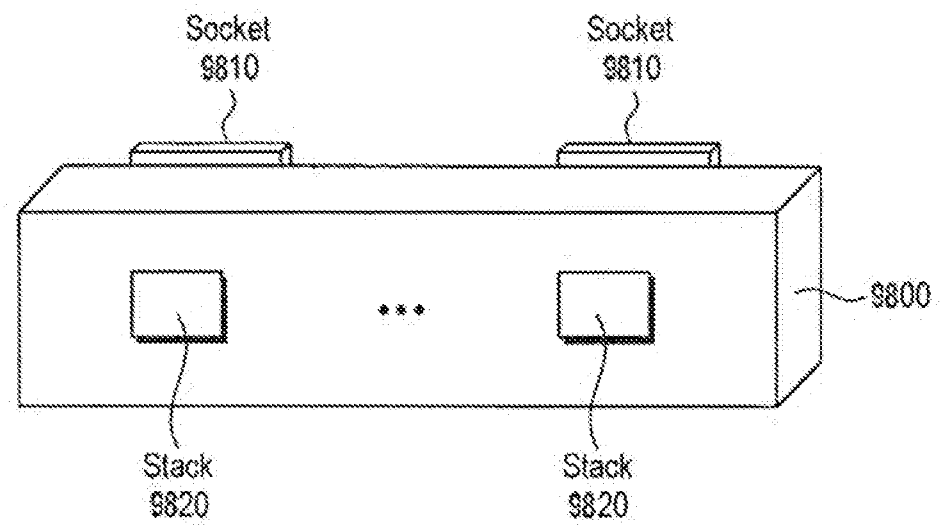

FIG. 98 illustrates a PCB with a socket located on the opposite side from the stack. For this embodiment, PCB 9800, such as a DIMM, comprises one or more stacks (9820) containing high speed interface chips, and optionally, one or more low speed memory chips. For this embodiment, one or more sockets (9810) are mounted on the opposite side of the PCB from the stack as shown in FIG. 98. The low speed memory chips may be added to the memory stacks one at a time. That is, each stack may have an associated socket. In this case, adding additional capacity to the memory system would involve adding one or more low speed memory chips to each stack in a memory rank (a rank denotes all the memory chips or stacks that respond to a memory access; i.e. all the memory chips or stacks that are enabled by a common Chip Select signal). Note that the same number and density of memory chips must be added to each stack in a rank. An alternative method might be to use a common socket for all the stacks in a rank. In this case, adding additional memory capacity might involve inserting a PCB into the socket, wherein the PCB contains multiple memory chips, and there is at least one memory chip for each stack in the rank. As mentioned above, the same number and density of memory chips must be added to each stack in the rank.

Many different types of sockets can be used. For example, the socket may be a female type and the PCB with the upgrade memory chips may have associated male pins.

Figure 99:
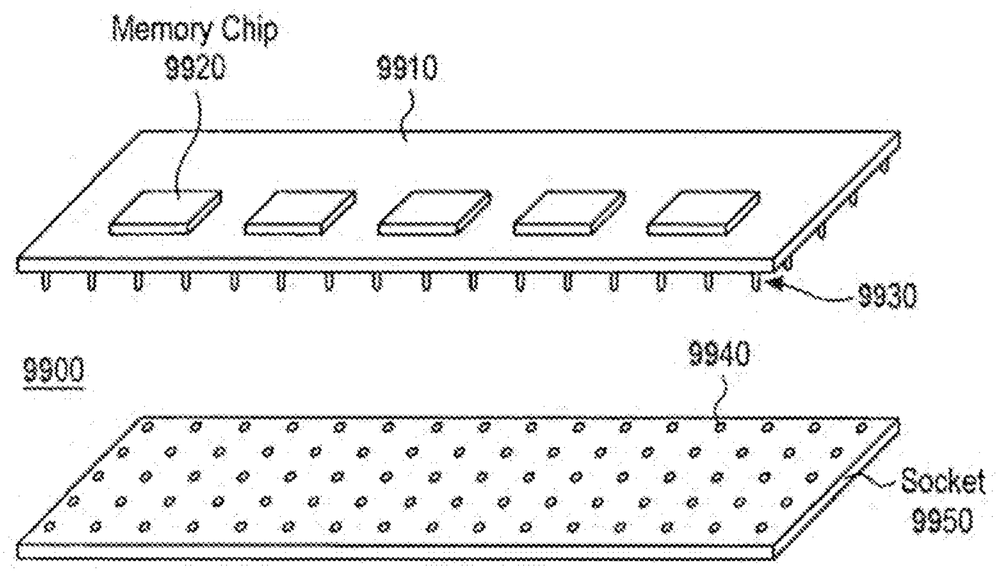

FIG. 99 illustrates an upgrade PCB that contains one or more memory chips. For this embodiment, an upgrade PCB 9910 includes one or more memory chips (9920). As shown in FIG. 99, PCB 9910 includes male socket pins 9930. A female receptacle socket 9950 on a DIMM PCB mates with the male socket pins 9930 to upgrade the memory capacity to include additional memory chips (9920). Another approach would be to use a male type socket and an upgrade PCB with associated female receptacles.

Separating a high speed DRAM into a low speed memory chip and a high speed interface chip and stacking multiple memory chips behind an interface chip ensures that the performance penalty associated with stacking multiple chips is minimized. However, this approach requires changes to the architecture of current DRAMs, which in turn increases the time and cost associated with bringing this technology to the marketplace. A cheaper and quicker approach is to stack multiple off-the-shelf high speed DRAM chips behind a buffer chip but at the cost of higher latency.

Current off-the-shelf high speed DRAMs (such as DDR2 SDRAMs) use source synchronous strobe signals as the timing reference for bi-directional transfer of data. In the case of a 4-bit wide DDR or DDR2 SDRAM, a dedicated strobe signal is associated with the four data signals of the DRAM. In the case of an 8-bit wide chip, a dedicated strobe signal is associated with the eight data signals. For 16-bit and 32-bit chips, a dedicated strobe signal is associated with each set of eight data signals. Most memory controllers are designed to accommodate a dedicated strobe signal for every four or eight data lines in the memory channel or bus. Consequently, due to signal integrity and electrical loading considerations, most memory controllers are capable of connecting to only nine or 18 memory chips (in the case of a 72-bit wide memory channel) per rank. This limitation on connectivity means that two 4-bit wide high speed memory chips may be stacked on top of each other on an industry standard DIMM today, but that stacking greater than two chips is difficult. It should be noted that stacking two 4-bit wide chips on top of each other doubles the density of a DIMM. The signal integrity problems associated with more than two DRAMs in a stack make it difficult to increase the density of a DIMM by more than a factor of two today by using stacking techniques.

Using the stacking technique described below, it is possible to increase the density of a DIMM by four, six or eight times by correspondingly stacking four, six or eight DRAMs on top of each other. In order to do this, a a buffer chip is located between the external memory channel and the DRAM chips and buffers at least one of the address, control, and data signals to and from the DRAM chips. In one implementation, one buffer chip may be used per stack. In other implementations, more than one buffer chip may be used per stack. In yet other implementations, one buffer chip may be used for a plurality of stacks.

Figure 100:
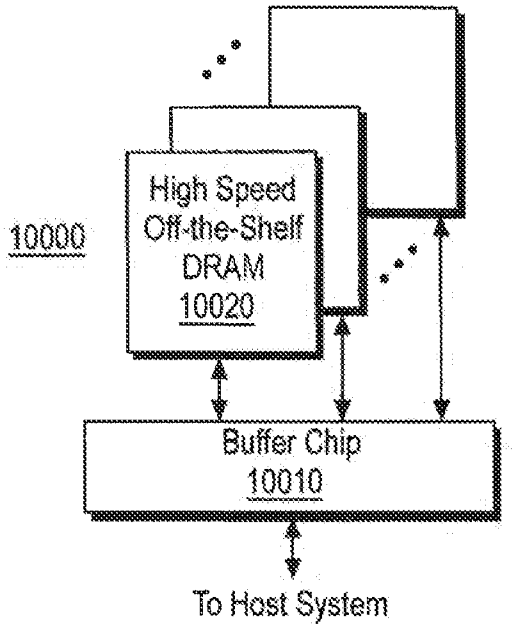

FIG. 100 is a block diagram illustrating one embodiment for stacking memory chips. For this embodiment, buffer chip 10110 is coupled to a host system, typically to the memory controller of the system. Memory device 10100 contains at least two high-speed memory chips 10120 (e.g., DRAMs such as DDR2 SDRAMs) stacked behind the buffer chip 1810 (e.g., the high-speed memory chips 10120 are accessed by buffer chip 10110).

It is clear that the embodiment shown in FIG. 100 is similar to that described previously and illustrated in FIG. 86. The main difference is that in the scheme illustrated in FIG. 3, multiple low speed memory chips were stacked on top of a high speed interface chip. The high speed interface chip presented an industry-standard interface (such as DDR SDRAM or DDR2 SDRAM) to the host system while the interface between the high speed interface chip and the low speed memory chips may be non-standard (i.e. proprietary) or may conform to an industry standard. The scheme illustrated in FIG. 100, on the other hand, stacks multiple high speed, off-the-shelf DRAMs on top of a high speed buffer chip. The buffer chip may or may not perform protocol translation (i.e. the buffer chip may present an industry-standard interface such as DDR2 to both the external memory channel and to the high speed DRAM chips) and may simply isolate the electrical loads represented by the memory chips (i.e. the input parasitics of the memory chips) from the memory channel.

In other implementations the buffer chip may perform protocol translations. For example, the buffer chip may provide translation from DDR3 to DDR2. In this fashion, multiple DDR2 SDRAM chips might appear to the host system as one or more DDR3 SDRAM chips. The buffer chip may also translate from one version of a protocol to another version of the same protocol. As an example of this type of translation, the buffer chip may translate from one set of DDR2 parameters to a different set of DDR2 parameters. In this way the buffer chip might, for example, make one or more DDR2 chips of one type (e.g. 4-4-4 DDR2 SDRAM) appear to the host system as one of more DDR2 chips of a different type (e.g. 6-6-6 DDR2 SDRAM). Note that in other implementations, a buffer chip may be shared by more than one stack. Also, the buffer chip may be external to the stack rather than being part of the stack. More than one buffer chip may also be associated with a stack.

Using a buffer chip to isolate the electrical loads of the high speed DRAMs from the memory channel allows us to stack multiple (typically between two and eight) memory chips on top of a buffer chip. In one embodiment, all the memory chips in a stack may connect to the same address bus. In another embodiment, a plurality of address buses may connect to the memory chips in a stack, wherein each address bus connects to at least one memory chip in the stack. Similarly, the data and strobe signals of all the memory chips in a stack may connect to the same data bus in one embodiment, while in another embodiment, multiple data buses may connect to the data and strobe signals of the memory chips in a stack, wherein each memory chip connects to only one data bus and each data bus connects to at least one memory chip in the stack.

Using a buffer chip in this manner allows a first number of DRAMS to simulate at least one DRAM of a second number. In the context of the present description, the simulation may refer to any simulating, emulating, disguising, and/or the like that results in at least one aspect (e.g. a number in this embodiment, etc.) of the DRAMs appearing different to the system. In different embodiments, the simulation may be electrical in nature, logical in nature, and/or performed in any other desired manner. For instance, in the context of electrical simulation, a number of pins, wires, signals, etc. may be simulated, while, in the context of logical simulation, a particular function may be simulated.

In still additional aspects of the present embodiment, the second number may be more or less than the first number. Still yet, in the latter case, the second number may be one, such that a single DRAM is simulated. Different optional embodiments which may employ various aspects of the present embodiment will be set forth hereinafter.

In still yet other embodiments, the buffer chip may be operable to interface the DRAMs and the system for simulating at least one DRAM with at least one aspect that is different from at least one aspect of at least one of the plurality of the DRAMs. In accordance with various aspects of such embodiment, such aspect may include a signal, a capacity, a timing, a logical interface, etc. Of course, such examples of aspects are set forth for illustrative purposes only and thus should not be construed as limiting, since any aspect associated with one or more of the DRAMs may be simulated differently in the foregoing manner.

In the case of the signal, such signal may include an address signal, control signal, data signal, and/or any other signal, for that matter. For instance, a number of the aforementioned signals may be simulated to appear as fewer or more signals, or even simulated to correspond to a different type. In still other embodiments, multiple signals may be combined to simulate another signal. Even still, a length of time in which a signal is asserted may be simulated to be different.

In the case of capacity, such may refer to a memory capacity (which may or may not be a function of a number of the DRAMs). For example, the buffer chip may be operable for simulating at least one DRAM with a first memory capacity that is greater than (or less than) a second memory capacity of at least one of the DRAMs.

In the case where the aspect is timing-related, the timing may possibly relate to a latency (e.g. time delay, etc.). In one aspect of the present embodiment, such latency may include a column address strobe (CAS) latency (tCAS), which refers to a latency associated with accessing a column of data. Still yet, the latency may include a row address strobe (RAS) to CAS latency (tRCD), which refers to a latency required between RAS and CAS. Even still, the latency may include a row precharge latency (tRP), which refers a latency required to terminate access to an open row. Further, the latency may include an active to precharge latency (tRAS), which refers to a latency required to access a certain row of data between a data request and a precharge command. In any case, the buffer chip may be operable for simulating at least one DRAM with a first latency that is longer (or shorter) than a second latency of at least one of the DRAMs. Different optional embodiments which employ various features of the present embodiment will be set forth hereinafter.

In still another embodiment, a buffer chip may be operable to receive a signal from the system and communicate the signal to at least one of the DRAMs after a delay. Again, the signal may refer to an address signal, a command signal (e.g. activate command signal, precharge command signal, a write signal, etc.) data signal, or any other signal for that matter. In various embodiments, such delay may be fixed or variable.

As an option, the delay may include a cumulative delay associated with any one or more of the aforementioned signals. Even still, the delay may time shift the signal forward and/or back in time (with respect to other signals). Of course, such forward and backward time shift may or may not be equal in magnitude. In one embodiment, this time shifting may be accomplished by utilizing a plurality of delay functions which each apply a different delay to a different signal.

Further, it should be noted that the aforementioned buffer chip may include a register, an advanced memory buffer (AMB), a component positioned on at least one DIMM, a memory controller, etc. Such register may, in various embodiments, include a Joint Electron Device Engineering Council (JEDEC) register, a JEDEC register including one or more functions set forth herein, a register with forwarding, storing, and/or buffering capabilities, etc. Different optional embodiments, which employ various features, will be set forth hereinafter.

In various embodiments, it may be desirable to determine whether the simulated DRAM circuit behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard defines commands that a DRAM circuit must accept and the behavior of the DRAM circuit as a result of such commands. For example, the JEDEC specification for a DDR2 DRAM is known as JESD79-2B.

If it is desired, for example, to determine whether a JEDEC standard is met, the following algorithm may be used. Such algorithm checks, using a set of software verification tools for formal verification of logic, that protocol behavior of the simulated DRAM circuit is the same as a desired standard or other design specification. This formal verification is quite feasible because the DRAM protocol described in a DRAM standard is typically limited to a few protocol commands (e.g. approximately 15 protocol commands in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, and others. These software verification tools use written assertions that correspond to the rules established by the DRAM protocol and specification. These written assertions are further included in the code that forms the logic description for the buffer chip. By writing assertions that correspond to the desired behavior of the simulated DRAM circuit, a proof may be constructed that determines whether the desired design requirements are met. In this way, one may test various embodiments for compliance with a standard, multiple standards, or other design specification.

For instance, an assertion may be written that no two DRAM control signals are allowed to be issued to an address, control and clock bus at the same time. Although one may know which of the various buffer chip and DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for the buffer chip with other bus arrangements or alternative designs for the interconnect between the buffer chip and other components may be used and tested for compliance with the desired standard or other design specification.

The buffer chip may be designed to have the same footprint (or pin out) as an industry-standard DRAM (e.g. a DDR2 SDRAM footprint). The high speed DRAM chips that are stacked on top of the buffer chip may either have an industry-standard pin out or can have a non-standard pin out. This allows us to use a standard DIMM PCB since each stack has the same footprint as a single industry-standard DRAM chip. Several companies have developed proprietary ways to stack multiple DRAMs on top of each other (e.g. μZ Ball Stack from Tessera, Inc., High Performance Stakpak from Staktek Holdings, Inc.). The disclosed techniques of stacking multiple memory chips behind either a buffer chip (FIG. 101) or a high speed interface chip (FIG. 86) is compatible with all the different ways of stacking memory chips. It does not require any particular stacking technique.

A double sided DIMM (i.e. a DIMM that has memory chips on both sides of the PCB) is electrically worse than a single sided DIMM, especially if the high speed data and strobe signals have to be routed to two DRAMs, one on each side of the board. This implies that the data signal might have to split into two branches (i.e. a T topology) on the DIMM, each branch terminating at a DRAM on either side of the board. A T topology is typically worse from a signal integrity perspective than a point-to-point topology. Rambus used mirror packages on double sided Rambus In-line Memory Modules (RIMMs) so that the high speed signals had a point-to-point topology rather than a T topology. This has not been widely adopted by the DRAM makers mainly because of inventory concerns. In this disclosure, the buffer chip may be designed with an industry-standard DRAM pin out and a mirrored pin out. The DRAM chips that are stacked behind the buffer chip may have a common industry-standard pin out, irrespective of whether the buffer chip has an industry-standard pin out or a mirrored pin out. This allows us to build double sided DIMMs that are both high speed and high capacity by using mirrored packages and stacking respectively, while still using off-the-shelf DRAM chips. Of course, this requires the use of a non-standard DIMM PCB since the standard DIMM PCBs are all designed to accommodate standard (i.e. non-mirrored) DRAM packages on both sides of the PCB.

In another aspect, the buffer chip may be designed not only to isolate the electrical loads of the stacked memory chips from the memory channel but also have the ability to provide redundancy features such as memory sparing, memory mirroring, and memory RAID. This allows us to build high density DIMMs that not only have the same footprint (i.e. pin compatible) as industry-standard memory modules but also provide a full suite of redundancy features. This capability is important for key segments of the server market such as the blade server segment and the 1U rack server segment, where the number of DIMM slots (or connectors) is constrained by the small form factor of the server motherboard. Many analysts have predicted that these will be the fastest growing segments in the server market.

Memory sparing may be implemented with one or more stacks of p+q high speed memory chips and a buffer chip. The p memory chips of each stack are assigned to the working pool and are available to system resources such as the operating system (OS) and application software. When the memory controller (or optionally the AMB) detects that one of the memory chips in the stack's working pool has, for example, generated an uncorrectable multi-bit error or has generated correctable errors that exceeded a pre-defined threshold, it may choose to replace the faulty chip with one of the q chips that have been placed in the spare pool. As discussed previously, the memory controller may choose to do the sparing across all the stacks in a rank even though only one working chip in one specific stack triggered the error condition, or may choose to confine the sparing operation to only the specific stack that triggered the error condition. The former method is simpler to implement from the memory controller's perspective while the latter method is more fault-tolerant. Memory sparing was illustrated in FIG. 91 for stacks built with a high speed interface chip and multiple low speed DRAMs. The same method is applicable to stacks built with high speed, off-the-shelf DRAMs and a buffer chip. In other implementations, the buffer chip may not be part of the stack. In yet other implementations, a buffer chip may be used with a plurality of stacks of memory chips or a plurality of buffer chips may be used by a single stack of memory chips.

Memory mirroring can be implemented by dividing the high speed memory chips in a stack into two equal sets—a working set and a mirrored set. When the memory controller writes data to the memory, the buffer chip writes the data to the same location in both the working set and the mirrored set. During reads, the buffer chip returns the data from the working set. If the returned data had an uncorrectable error condition or if the cumulative correctable en ors in the returned data exceeded a pre-defined threshold, the memory controller may instruct the buffer chip to henceforth return data (on memory reads) from the mirrored set until the error condition in the working set has been rectified. The buffer chip may continue to send writes to both the working set and the mirrored set or may confine it to just the mirrored set. As discussed before, the memory mirroring operation may be triggered simultaneously on all the memory stacks in a rank or may be done on a per-stack basis as and when necessary. The former method is easier to implement while the latter method provides more fault tolerance. Memory mirroring was illustrated in FIG. 92 for stacks built with a high speed interface chip and multiple low speed memory chips. The same method is applicable to stacks built with high speed, off-the-shelf DRAMs and a buffer chip. In other implementations, the buffer chip may not be part of the stack. In yet other implementations, a buffer chip may be used with a plurality of stacks of memory chips or a plurality of buffer chips may be used by a single stack of memory chips.

Implementing memory mirroring within a stack has one drawback, namely that it does not protect against the failure of the buffer chip associated with a stack. In this case, the data in the memory is mirrored in two different memory chips in a stack but both these chips have to communicate to the host system through the common associated buffer chip. So, if the buffer chip in a stack were to fail, the mirrored memory capability is of no use. One solution to this problem is to group all the chips in the working set into one stack and group all the chips in the mirrored set into another stack. The working stack may now be on one side of the DIMM PCB while the mirrored stack may be on the other side of the DIMM PCB. So, if the buffer chip in the working stack were to fail now, the memory controller may switch to the mirrored stack on the other side of the PCB.

The switch from the working set to the mirrored set may be triggered by the memory controller (or AMB) sending an in-band or sideband signal to the buffers in the respective stacks. Alternately, logic may be added to the buffers so that the buffers themselves have the ability to switch from the working set to the mirrored set. For example, some of the server memory controller hubs (MCH) from Intel will read a memory location for a second time if the MCH detects an uncorrectable error on the first read of that memory location. The buffer chip may be designed to keep track of the addresses of the last m reads and to compare the address of the current read with the stored m addresses. If it detects a match, the most likely scenario is that the MCH detected an uncorrectable error in the data read back and is attempting a second read to the memory location in question. The buffer chip may now read the contents of the memory location from the mirrored set since it knows that the contents in the corresponding location in the working set had an error. The buffer chip may also be designed to keep track of the number of such events (i.e. a second read to a location due to an uncorrectable error) over some period of time. If the number of these events exceeded a certain threshold within a sliding time window, then the buffer chip may permanently switch to the mirrored set and notify an external device that the working set was being disabled.

Implementing memory RAID within a stack that consists of high speed, off-the-shelf DRAMs is more difficult than implementing it within a stack that consists of non-standard DRAMs. The reason is that current high speed DRAMs have a minimum burst length that require a certain amount of information to be read from or written to the DRAM for each read or write access respectively. For example, an n-bit wide DDR2 SDRAM has a minimum burst length of 4 which means that for every read or write operation, 4n bits must be read from or written to the DRAM. For the purpose of illustration, the following discussion will assume that all the DRAMs that are used to build stacks are 8-bit wide DDR2 SDRAMs, and that each stack has a dedicated buffer chip.

Given that 8-bit wide DDR2 SDRAMs are used to build the stacks, eight stacks will be needed per memory rank (ignoring the ninth stack needed for ECC). Since DDR2 SDRAMs have a minimum burst length of four, a single read or write operation involves transferring four bytes of data between the memory controller and a stack. This means that the memory controller must transfer a minimum of 32 bytes of data to a memory rank (four bytes per stack*eight stacks) for each read or write operation. Modern CPUs typically use a 64-byte cacheline as the basic unit of data transfer to and from the system memory. This implies that eight bytes of data may be transferred between the memory controller and each stack for a read or write operation.

In order to implement memory RAID within a stack, we may build a stack that contains 3 8-bit wide DDR2 SDRAMs and a buffer chip. Let us designate the three DRAMs in a stack as chips A, B, and C. Consider the case of a memory write operation where the memory controller performs a burst write of eight bytes to each stack in the rank (i.e. memory controller sends 64 bytes of data—one cacheline—to the entire rank). The buffer chip may be designed such that it writes the first four bytes (say, bytes Z0, Z1, Z2, and Z3) to the specified memory locations (say, addresses x1, x2, x3, and x4) in chip A and writes the second four bytes (say, bytes Z4, Z5, Z6, and Z7) to the same locations (i.e. addresses x1, x2, x3, and x4) in chip B. The buffer chip may also be designed to store the parity information corresponding to these eight bytes in the same locations in chip C. That is, the buffer chip will store P[0,4]=Z0 ^ Z4 in address x1 in chip C, P[1,5]=Z1 ^ Z5 in address x2 in chip C, P[2,6]=Z2 ^ Z6 in address x3 in chip C, and P[3,7], =Z3 ^ Z7 in address x4 in chip C, where ^ is the bitwise exclusive-OR operator. So, for example, the least significant bit (bit 0) of P[0,4] is the exclusive-OR of the least significant bits of Z0 and Z4, bit 1 of P[0,4] is the exclusive-OR of bit 1 of Z0 and bit 1 of Z4, and so on. Note that other striping methods may also be used. For example, the buffer chip may store bytes Z0, Z2, Z4, and Z6 in chip A and bytes Z1, Z3, Z5, and Z7 in chip B.

Now, when the memory controller reads the same cacheline back, the buffer chip will read locations x1, x2, x3, and x4 in both chips A and B and will return bytes Z0, Z1, Z2, and Z3 from chip A and then bytes Z4, Z5, Z6, and Z7 from chip B. Now let us assume that the memory controller detected a multi-bit error in byte Z1. As mentioned previously, some of the Intel server MCHs will re-read the address location when they detect an uncorrectable error in the data that was returned in response to the initial read command. So, when the memory controller re-reads the address location corresponding to byte Z1, the buffer chip may be designed to detect the second read and return P[1,5]^ Z5 rather than Z1 since it knows that the memory controller detected an uncorrectable error in Z1.

Note that the behavior of the memory controller after the detection of an uncorrectable error will influence the error recovery behavior of the buffer chip. For example, if the memory controller reads the entire cacheline back in the event of an uncorrectable error but requests the burst to start with the bad byte, then the buffer chip may be designed to look at the appropriate column addresses to determine which byte corresponds to the uncorrectable error. For example, say that byte Z1 corresponds to the uncorrectable error and that the memory controller requests that the stack send the eight bytes (Z0 through Z7) back to the controller starting with byte Z1. In other words, the memory controller asks the stack to send the eight bytes back in the following order: Z1, Z2, Z3, Z0, Z5, Z6, Z7, and Z4 (i.e. burst length=8, burst type=sequential, and starting column address A[2:0]=001b). The buffer chip may be designed to recognize that this indicates that byte Z1 corresponds to the uncorrectable error and return P[1,5] ^ Z5, Z2, Z3, Z0, Z5, Z6, Z7, and Z4. Alternately, the buffer chip may be designed to return P[1,5] ^ Z5, P[2,6] ^ Z6, P[3,7] ^ Z7, P[0,4] ^ Z4, Z5, Z6, Z7, and Z4 if it is desired to correct not only an uncorrectable error in any given byte but also the case where an entire chip (in this case, chip A) fails. If, on the other hand, the memory controller reads the entire cacheline in the same order both during a normal read operation and during a second read caused by an uncorrectable error, then the controller has to indicate to the buffer chip which byte or chip corresponds to the uncorrectable error either through an in-band signal or through a sideband signal before or during the time it performs the second read.

However, it may be that the memory controller does a 64-byte cacheline read or write in two separate bursts of length 4 (rather than a single burst of length 8). This may also be the case when an I/O device initiates the memory access. This may also be the case if the 64-byte cacheline is stored in parallel in two DIMMs. In such a case, the memory RAID implementation might require the use of the DM (Data Mask) signal. Again, consider the case of a 3-chip stack that is built with 3 8-bit wide DDR2 SDRAMs and a buffer chip. Memory RAID requires that the 4 bytes of data that are written to a stack be striped across the two memory chips (i.e. 2 bytes be written to each of the memory chips) while the parity is computed and stored in the third memory chip. However, the DDR2 SDRAMs have a minimum burst length of 4, meaning that the minimum amount of data that they are designed to transfer is 4 bytes. In order to satisfy both these requirements, the buffer chip may be designed to use the DM signal to steer two of the four bytes in a burst to chip A and steer the other two bytes in a burst to chip B. This concept is best illustrated by the example below.

Say that the memory controller sends bytes Z0, Z1, Z2, and Z3 to a particular stack when it does a 32-byte write to a memory rank, and that the associated addresses are x1, x2, x3, and x4. The stack in this example is composed of three 8-bit DDR2 SDRAMs (chips A, B, and C) and a buffer chip. The buffer chip may be designed to generate a write command to locations x1, x2, x3, and x4 on all the three chips A, B, and C, and perform the following actions:

Write Z0 and Z2 to chip A and mask the writes of Z1 and Z3 to chip A Write Z1 and Z3 to chip B and mask the writes of Z0 and Z2 to chip B Write (Z0 ^ Z1) and (Z2 ^ Z3) to chip C and mask the other two writes This of course requires that the buffer chip have the capability to do a simple address translation so as to hide the implementation details of the memory RAID from the memory controller.

Figure 101:
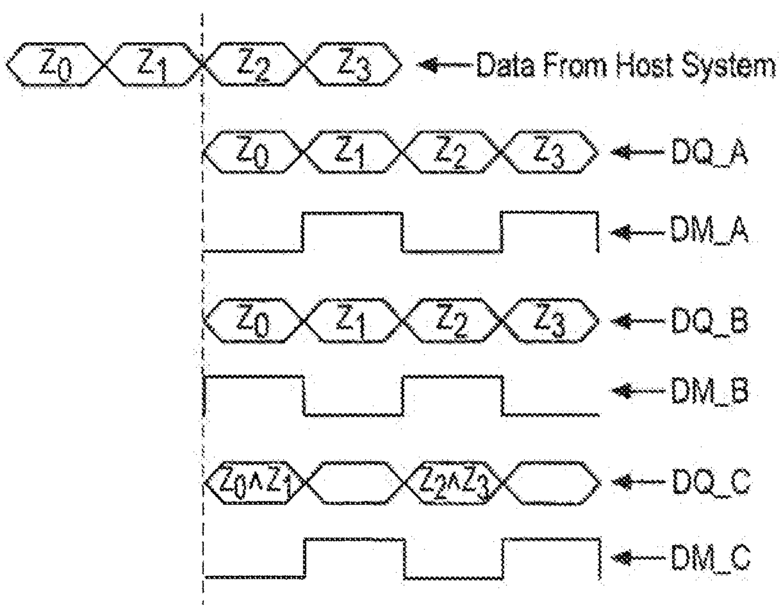

FIG. 101 is a timing diagram for implementing memory RAID using a datamask (DM) signal in a three chip stack composed of 8 bit wide DDR2 SDRAMS. The first signal of the timing diagram of FIG. 101 represents data sent to the stack from the host system. The second and third signals, labeled DQ_A and DM_A, represent the data and data mask signals sent by the buffer chip to chip A during a write operation to chip A. Similarly, signals DQ_B and DM_B represent signals sent by the buffer chip to chip B during a write operation to chip B, and signals DQ_C and DM_C represent signals sent by the buffer chip to chip C during a write operation to chip C.

Now when the memory controller reads back bytes Z0, Z1, Z2, and Z3 from the stack, the buffer chip will read locations x1, x2, x3, and x4 from both chips A and B, select the appropriate two bytes from the four bytes returned by each chip, re-construct the original data, and send it back to the memory controller. It should be noted that the data striping across the two chips may be done in other ways. For example, bytes Z0 and Z1 may be written to chip A and bytes Z2 and Z3 may be written to chip B. Also, this concept may be extended to stacks that are built with a different number of chips. For example, in the case of stack built with five 8-bit wide DDR2 SDRAM chips and a buffer chip, a 4-byte burst to a stack may be striped across four chips by writing one byte to each chip and using the DM signal to mask the remaining three writes in the burst. The parity information may be stored in the fifth chip, again using the associated DM signal.

As described previously, when the memory controller (or AMB) detects an uncorrectable error in the data read back, the buffer chip may be designed to re-construct the bad data using the data in the other chips as well as the parity information. The buffer chip may perform this operation either when explicitly instructed to do so by the memory controller or by monitoring the read requests sent by the memory controller and detecting multiple reads to the same address within some period of time, or by some other means.

Re-constructing bad data using the data from the other memory chips in the memory RAID and the parity data will require some additional amount of time. That is, the memory read latency for the case where the buffer chip has to re-construct the bad data may most likely be higher than the normal read latency. This may be accommodated in multiple ways. Say that the normal read latency is 4 clock cycles while the read latency when the buffer chip has to re-create the bad data is 5 clock cycles. The memory controller may simply choose to use 5 clock cycles as the read latency for all read operations. Alternately, the controller may default to 4 clock cycles for all normal read operations but switch to 5 clock cycles when the buffer chip has to re-create the data. Another option would be for the buffer chip to stall the memory controller when it has to re-create some part of the data. These and other methods fall within the scope of this disclosure.

As discussed above, we can implement memory RAID using a combination of memory chips and a buffer chip in a stack. This provides us with the ability to correct multi-bit errors either within a single memory chip or across multiple memory chips in a rank. However, we can create an additional level of redundancy by adding additional memory chips to the stack. That is, if the memory RAID is implemented across n chips (where the data is striped across n−1 chips and the parity is stored in the nth chip), we can create another level of redundancy by building the stack with at least n+1 memory chips. For the purpose of illustration, assume that we wish to stripe the data across two memory chips (say, chips A and B). We need a third chip (say, chip C) to store the parity information. By adding a fourth chip (chip D) to the stack, we can create an additional level of redundancy. Say that chip B has either failed or is generating an unacceptable level of uncorrectable errors. The buffer chip in the stack may re-construct the data in chip B using the data in chip A and the parity information in chip C in the same manner that is used in well-known disk RAID systems. Obviously, the performance of the memory system may be degraded (due to the possibly higher latency associated with re-creating the data in chip B) until chip B is effectively replaced. However, since we have an unused memory chip in the stack (chip D), we may substitute it for chip B until the next maintenance operation. The buffer chip may be designed to re-create the data in chip B (using the data in chip A and the parity information in chip C) and write it to chip D. Once this is completed, chip B may be discarded (i.e. no longer used by the buffer chip). The re-creation of the data in chip B and the transfer of the re-created data to chip D may be made to run in the background (i.e. during the cycles when the rank containing chips A, B, C, and D are not used) or may be performed during cycles that have been explicitly scheduled by the memory controller for the data recovery operation.

The logic necessary to implement the higher levels of memory protection such as memory sparing, memory mirroring, and memory RAID may be embedded in a buffer chip associated with each stack or may be implemented in a "more global" buffer chip (i.e. a buffer chip that buffers more data bits than is associated with an individual stack). For example, this logic may be embedded in the AMB. This variation is also covered by this disclosure.

The method of adding additional low speed memory chips behind a high speed interface by means of a socket was disclosed. The same concepts (see FIGS. 95, 96, 97, and 98) are applicable to stacking high speed, off-the-shelf DRAM chips behind a buffer chip. This is also covered by this invention.

Refresh Management

FIG. 102A illustrates a multiple memory device system 10200, according to one embodiment. As shown, the multiple memory device system 10200 includes, without limitation, a system device 10206 coupled to an interface circuit 10202, which is, in turn, coupled to a plurality of physical memory devices 10204A-N. The memory devices 10204A-N may be any type of memory devices. For example, in various embodiments, one or more of the memory devices 10204A, 10204B, 10204N may include a monolithic memory device. For instance, such monolithic memory device may take the form of dynamic random access memory (DRAM). Such DRAM may take any form including, but not limited to synchronous (SDRAM), double data rate synchronous (DDR DRAM, DDR2 DRAM, DDR3 DRAM, etc.), quad data rate (QDR DRAM), direct RAMBUS (DRDRAM), fast page mode (FPM DRAM), video (VDRAM), extended data out (EDO DRAM), burst EDO (BEDO DRAM), multibank (MDRAM), synchronous graphics (SGRAM), and/or any other type of DRAM. Of course, one or more of the memory devices 10204A, 10204B, 10204N may include other types of memory such as magnetic random access memory (MRAM), intelligent random access memory (IRAM), distributed network architecture (DNA) memory, window random access memory (WRAM), flash memory (e.g. NAND, NOR, or others, etc.), pseudostatic random access memory (PSRAM), wetware memory, and/or any other type of memory device that meets the above definition. In some embodiments, each of the memory devices 10204A-N is a separate memory chip. For example, each may be a DDR2 DRAM.

Figure 102B:
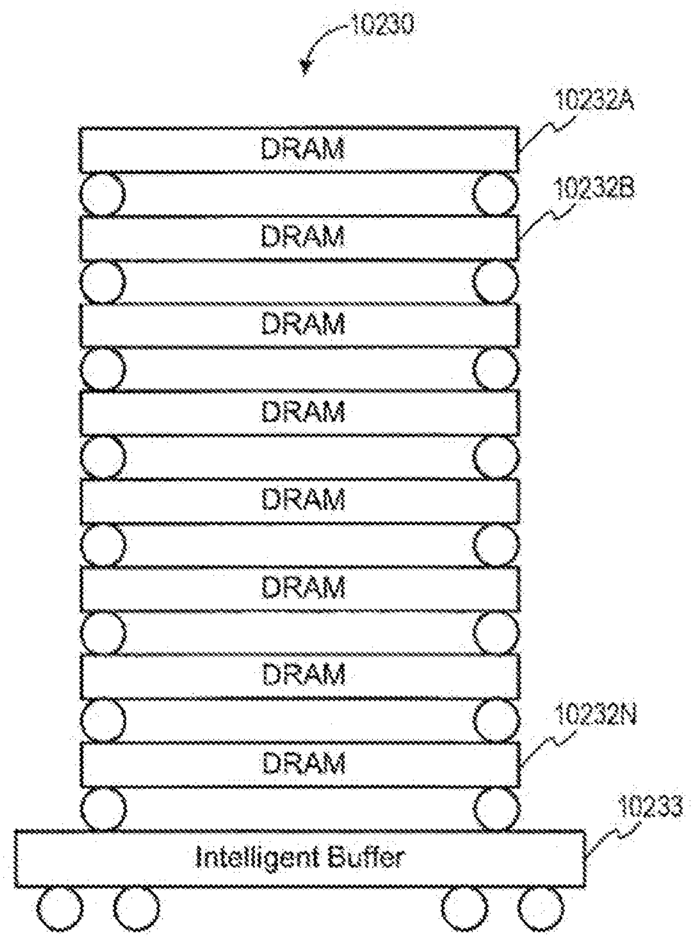

In some embodiments, the any of the memory devices 10204A-N may itself be a group of memory devices, or may be a group in the physical orientation of a stack. For example, FIG. 102B shows a memory device 10230 which is comprised of a group of DRAM memory devices 10232A-10232N all electrically interconnected to each other and an intelligent buffer 10233. In alternative embodiments, the intelligent buffer 10233 may include the functionality of interface circuit 10202. Further, the memory device 10230 may be included in a DIMM (dual in-line memory module) or other type of memory module.

The memory devices 10232A-N may be any type of memory devices. Furthermore, in some embodiments, the memory devices 10204A-N may be symmetrical, meaning each has the same capacity, type, speed, etc., while in other embodiments they may be asymmetrical. For ease of illustration only, three such memory devices are shown, 10204A, 10204B, and 10204N, but actual embodiments may use any plural number of memory devices. As will be discussed below, the memory devices 10204A-N may optionally be coupled to a memory module (not shown), such as a DIMM.

The system device 10206 may be any type of system capable of requesting and/or initiating a process that results in an access of the memory devices 10204A-N. The system device 10206 may include a memory controller (not shown) through which the system device 10206 accesses the memory devices 10204A-N.

The interface circuit 10202 may include any circuit or logic capable of directly or indirectly communicating with the memory devices 10204A-N, such as, for example, an interface circuit advanced memory buffer (AMB) chip or the like. The interface circuit 10202 interfaces a plurality of signals 10208 between the system device 10206 and the memory devices 10204A-N. The signals 10208 may include, for example, data signals, address signals, control signals, clock signals, and the like. In some embodiments, all of the signals 10208 communicated between the system device 10206 and the memory devices 10204A-N are communicated via the interface circuit 10202. In other embodiments, some other signals, shown as signals 10210, are communicated directly between the system device 10206 (or some component thereof, such as a memory controller or an AMB) and the memory devices 10204A-N, without passing through the interface circuit 10202. In some embodiments, the majority of signals are communicated via the interface circuit 10202, such that L>M.

As will be explained in greater detail below, the interface circuit 10202 presents to the system device 10206 an interface to emulate memory devices which differ in some aspect from the physical memory devices 10204A-N that are actually present within system 10200. The terms "emulating," "emulated," "emulation," and the like are used herein to signify any type of emulation, simulation, disguising, transforming, converting, and the like, that results in at least one characteristic of the memory devices 10204A-N appearing to the system device 10206 to be different than the actual, physical characteristic of the memory devices 10204A-N. For example, the interface circuit 10202 may tell the system device 10206 that the number of emulated memory devices is different than the actual number of physical memory devices 10204A-N. In various embodiments, the emulated characteristic may be electrical in nature, physical in nature, logical in nature, pertaining to a protocol, etc. An example of an emulated electrical characteristic might be a signal or a voltage level. An example of an emulated physical characteristic might be a number of pins or wires, a number of signals, or a memory capacity. An example of an emulated protocol characteristic might be timing, or a specific protocol such as DDR3.

In the case of an emulated signal, such signal may be an address signal, a data signal, or a control signal associated with an activate operation, pre-charge operation, write operation, mode register set operation, refresh operation, etc. The interface circuit 10202 may emulate the number of signals, type of signals, duration of signal assertion, and so forth. In addition, the interface circuit 10202 may combine multiple signals to emulate another signal.

The interface circuit 10202 may present to the system device 10206 an emulated interface, for example, a DDR3 memory device, while the physical memory devices 10204A-N are, in fact, DDR2 memory devices. The interface circuit 10202 may emulate an interface to one version of a protocol, such as DDR2 with 3-3-3 latency timing, while the physical memory chips 10204A-N are built to another version of the protocol, such as DDR with 5-5-5 latency timing. The interface circuit 10202 may emulate an interface to a memory having a first capacity that is different than the actual combined capacity of the physical memory devices 10204A-N.

An emulated timing signal may relate to a chip enable or other refresh signal. Alternatively, an emulated timing signal may relate to the latency of, for example, a column address strobe latency (tCAS), a row address to column address latency (tRCD), a row precharge latency (tRP), an activate to precharge latency (tRAS), and so forth.

The interface circuit 10202 may be operable to receive a signal 10207 from the system device 10206 and communicate the signal 10207 to one or more of the memory devices 10204A-N after a delay (which may be hidden from the system device 10206). In one embodiment, such a delay may be fixed, while in other embodiments, the delay may be variable. If variable, the delay may depend on e.g. a function of the current signal or a previous signal, a combination of signals, or the like. The delay may include a cumulative delay associated with any one or more of the signals. The delay may result in a time shift of the signal 10207 forward or backward in time with respect to other signals. Different delays may be applied to different signals. The interface circuit 10202 may similarly be operable to receive the signal 10208 from one of the memory devices 10204A-N and communicate the signal 10208 to the system device 10206 after a delay.

The interface circuit 10202 may take the form of, or incorporate, or be incorporated into, a register, an AMB, a buffer, or the like, and may comply with JEDEC standards, and may have forwarding, storing, and/or buffering capabilities.

In one embodiment, the interface circuit 10202 may perform multiple operations when a single operation is commanded by the system device 10206, where the timing and sequence of the multiple operations are performed by the interface circuit 10202 to the one or more of the memory devices without the knowledge of the system device 10206. One such operation is a refresh operation. In the situation where the refresh operations are issued simultaneously, a large parallel load is presented to the power supply. To alleviate this load, multiple refresh operations could be staggered in time, thus reducing instantaneous load on the power supply. In various embodiments, the multiple memory device system 10200 shown in FIG. 102A may include multiple memory devices 10204A-N capable of being independently refreshed by the interface circuit 10202. The interface circuit 10202 may identify one or more of the memory devices 10204A-N which are capable of being refreshed independently, and perform the refresh operation on those memory devices. In yet another embodiment, the multiple memory device system 10200 shown in FIG. 102A includes the memory devices 10204A-N which may be physically oriented in a stack, with each of the memory devices 10204A-N capable to read/write a single bit. For example, to implement an eight-bit wide memory in a stack, eight one-bit wide memory devices 10204A-N could be arranged in a stack of eight memory devices. In such a case, it may be desirable to control the refresh cycles of each of the memory devices 10204A-N independently.

The interface circuit 10202 may include one or more devices which together perform the emulation and related operations. In various embodiments, the interface circuit may be coupled or packaged with the memory devices 10204A-N, or with the system device 10206 or a component thereof, or separately. In one embodiment, the memory devices and the interface circuit are coupled to a DIMM. In alternative embodiments, the memory devices 10204 and/or the interface circuit 10202 may be coupled to a motherboard or some other circuit board within a computing device.

Figure 102C:
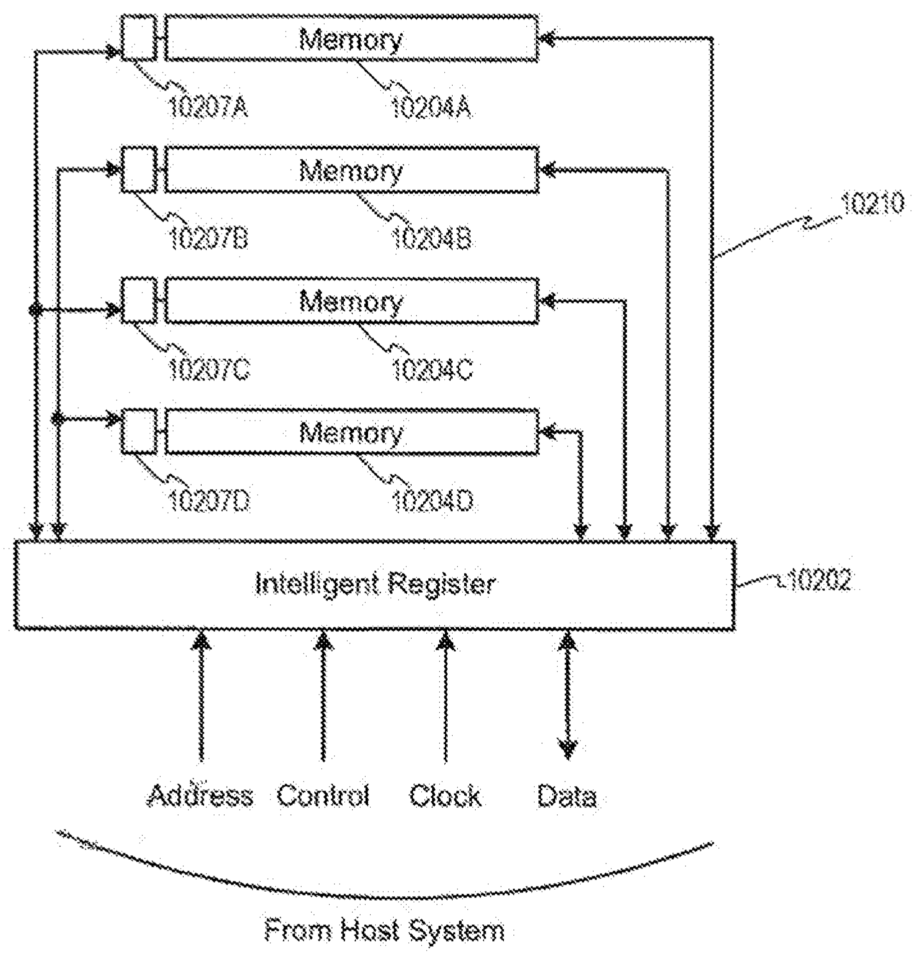

FIG. 102C illustrates a multiple memory device system, according to one embodiment. As shown, the multiple memory device system includes, without limitation, a host system device coupled to an host interface circuit, also known as an intelligent register circuit 10202, which is, in turn, coupled to a plurality of intelligent buffer circuits 10207A-10207D, memory devices which is, in turn, coupled to a plurality of physical memory devices 10204A-N.

Figure 103:
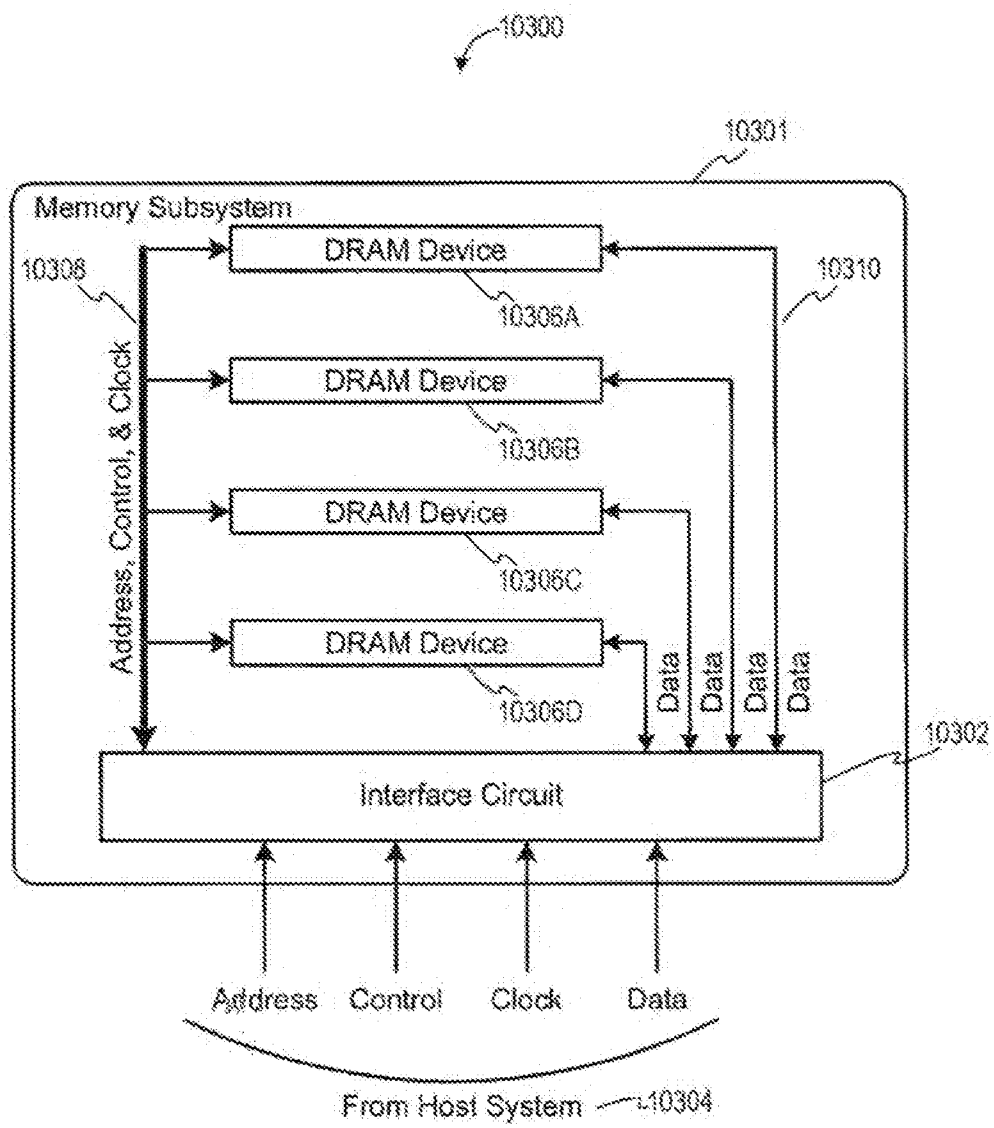

FIG. 103 illustrates a multiple memory device system 10300, according to another embodiment. As shown, the multiple memory device system 10300 includes, without limitation, a system device 10304 which communicates address, control, and clock signals 10308 and data signals 10310 with a memory subsystem 10301. The memory subsystem 10301 includes an interface circuit 10302, which presents the system device 10304 with an emulated interface to emulated memory, and a plurality of physical memory devices, which are shown as DRAM 10306A-D. In one embodiment, the DRAM devices 10306A-D are stacked, and the interface circuit 10302 is electrically disposed between the DRAM devices 10306A-D and the system device 10304. Although the embodiments described here show the stack consisting of multiple DRAM circuits, a stack may refer to any collection of memory devices (e.g., DRAM circuits, flash memory devices, or combinations of memory device technologies, etc.).

The interface circuit 10302 may buffer signals between the system device 10304 and the DRAM devices 10306A-D, both electrically and logically. For example, the interface circuit 10302 may present to the system device 10304 an emulated interface to present the memory as though the memory comprised a smaller number of larger capacity DRAM devices, although, in actuality, the memory subsystem 10301 includes a larger number of smaller capacity DRAM devices 10306A-D. In another embodiment, the interface circuit 10302 presents to the system device 10304 an emulated interface to present the memory as though the memory were a smaller (or larger) number of larger capacity DRAM devices having more configured (or fewer configured) ranks, although, in actuality, the physical memory is configured to present a specified number of ranks. Although the FIG. 103 shows four DRAM devices 10306A-D, this is done for ease of illustration only. In other embodiments, other numbers of DRAM devices may be used.

As also shown in FIG. 103, the interface circuit 10302 is coupled to send address, control, and clock signals 10308 to the DRAM devices 10306A-D via one or more buses. In the embodiment shown, each of the DRAM devices 10306A-D has its own, dedicated data path for sending and receiving data signals 10310 to and from the interface circuit 10302. Also, in the embodiment shown, the DRAM devices 10306A-D are physically arranged on a single side of the interface circuit 10302.

In one embodiment, the interface circuit 10302 may be a part of the stack of the DRAM devices 10306A-D. In other embodiments, the interface circuit 10302 may be the bottom-most chip in the stack or otherwise disposed in or on the stack, or may be separate from the stack.

In some embodiments, the interface circuit 10302 may perform operations whose relative timing and ordering are executed without the knowledge of the system device 10304. One such operation is a refresh operation. The interface circuit 10302 may identify one or more of the DRAM devices 10306A-D that should be refreshed concurrently when a single refresh operation is issued by the system device 10304 and perform the refresh operation on those DRAM devices. The methods and apparatuses capable of performing refresh operations on a plurality of memory devices are described later herein.

In general, it is desirable to manage the application of refresh operations such that the current draw and voltage levels remain within acceptable limits. Such limits may depend on the number and type of the memory devices being refreshed, physical design characteristics, and the characteristics of the system device (e.g., system devices 10206, 10304.)

FIG. 104 illustrates an idealized current draw as a function of time for a refresh cycle of a single memory device that executes two internal refresh cycles for each external refresh command, according to one embodiment. The single memory device may be, for example, one of the memory devices 10204A-N described in FIG. 102A or one of the DRAM devices described in FIG. 103.

FIG. 104 also shows several time periods, in particular, tRAS, and tRC. There is relatively less current draw during the 35 ns period between 40 ns and 75 ns as compared with the 35 ns period between 5 ns and 40 ns. Thus, in the specific case of managing refresh cycles independently for two memory devices (or independently for two banks), the instantaneous current draw can be minimized by staggering the beginning of the refresh cycles of the individual memory devices. In such an embodiment, the peak current draw for two independent, staggered refresh cycles of the two memory devices is reduced by starting the second refresh cycle at about 30 ns. However, in practical (non-idealized) systems, the optimal start time for a second or any subsequent refresh cycle may be a function of time as well as a function of many variables other than time.

FIG. 105A illustrates current draw as a function of time for two refresh cycles 10510 and 10520, started independently and staggered by a time period of half of the period of a single refresh cycle.

FIG. 105B illustrates voltage droop on the VDD voltage supply from the nominal voltage of 1.8 volt as a function of a stagger offset for two refresh cycles, according to one embodiment. "Stagger offset" is defined herein as the difference between the starting times of the first and second refresh cycles.

A curve of the voltage droop on the VDD voltage supply from the nominal voltage of 1.8 volt as a function of the stagger offset as shown in FIG. 105B can be generated from simulation models of the interconnect components and the interconnect itself, or can be dynamically calculated from measurements. Three distinct regions become evident in this curve:

A: A local minimum in the voltage droop on the VDD voltage supply from the nominal voltage of 1.8 volt results when the refreshes are staggered by an offset such that the increasing current transient from one refresh event counters the decreasing current transient from another refresh event. The positive slew rate from one refresh produces destructive interference with the negative slew rate from another refresh, thus reducing the effective load.

B: The best case, namely when the droop is minimum, occurs when the current draw profiles have almost zero overlap.

C: Once the waveforms are separated in time so that the refresh cycles do not overlap additional stagger spacing does not offer significant additional relief to the power delivery system. Consequently, thereafter, the level of voltage droop on the VDD supply voltage remains nearly constant.

As can be seen from a simple inspection, the optimal time to begin the second refresh cycle is at the point of minimum voltage droop (highest voltage), point B, which in this example is at about 110 ns. Persons skilled in the art will understand that the values used in the calculations resulting in the curve of FIG. 105B are for illustrative purposes only, and that a large number of other curves with different points of minimum voltage droop are possible, depending on the characteristics of the memory device, and the electrical characteristics of the physical design of the memory subsystem.

FIG. 106 illustrates the start and finish times of eight independent refresh cycles, according to one embodiment of the present application. The optimization of the start times of successive independent refresh cycles may be accomplished by circuit simulation (e.g., SPICE™ or H-SPICE as sold by Cadence Design Systems) or with logic-oriented timing analysis tools (e.g. Verilog™ as sold by Cadence Design Systems). Alternatively, the start times of the independent refresh cycles may be optimized dynamically through implementation of a dynamic parameter extraction capability. For example, the interface circuit 10302 may contain a clock frequency detection circuit that the interface circuit 10302 can use to determine the optimal timing for the independent refresh cycles. In the example of FIG. 106, the first independently controlled duple of cycles 10610 and 10611 begins at time zero. The next independently controlled duple of cycles, cycles 10620 and 10621, begins approximately at time 25 nS, and the next duple at approximately 37 nSec. In this example, current draw is reduced inasmuch as each next duple of refresh cycles does not begin until such time as the peak current draw of the previous duple has passed. This simplified regime is for illustrative purposes, and one skilled in the art will recognize that other regimes would emerge depending on the characteristic shape of the current draw during a refresh cycle.

In some embodiments, multiple instances of a memory device may be organized to form memory words that are longer than a single instance of the aforementioned memory device. In such a case, it may be convenient to control the independent refresh cycles of the multiple instances of the memory device that form such a memory word with multiple independently controlled memory refresh commands, with a separate refresh command sequence corresponding to each different instance of the memory device.

FIG. 107 illustrates a configuration of eight memory devices refreshed by two independently controlled refresh cycles starting at times tST1 and tST2, respectively, according to one embodiment. The motivation for the refresh schedule is to minimize voltage droop while completing all refresh operations with the allotted time window, as per JEDEC specifications.

As shown, the eight memory devices are organized into two DRAM stacks, and each DRAM stack is driven by two independently controllable refresh command sequences. The memory devices labeled R0B01[7:4], R0B01[3:0], R1B45[7:4], and R1B45[3:0] are refreshed by refresh cycle tST1, while the remaining memory devices are refreshed by the refresh cycle tST2.

FIG. 108 illustrates a configuration of eight memory devices refreshed by four independently controlled refresh cycles starting at tST1, tST2, tST3 and tST4 , respectively, according to another embodiment. Such a configuration is referred to herein as a "quad configuration," and the stagger offsets in this configuration are referred to as "quad-stagger." The quad-stagger allows for four independent stagger times distributed over eight devices, thus spreading out the total current draw and lowering large slews that may result from simultaneous activation of refresh cycles in all eight DRAM devices.

FIG. 109 illustrates a configuration of sixteen memory devices refreshed by eight independently controlled refresh cycles, according to yet another embodiment. Such a configuration is referred to herein as an "octal configuration." The motivation for this stagger schedule is the same as for the previously mentioned dual and quad configurations, however in the octal configuration it is not possible to complete all refresh operation on all eight memories within the window unless the operations are bunched up more closely than in the quad or dual cases.

FIG. 110 illustrates the octal configuration of the memory devices of FIG. 109 implemented within the multiple memory device system 10200 of FIG. 102A, according to one embodiment. As previously described, the system device 10206 is connected to the interface circuit 10202, which, in turn, is connected to the memory devices 10204A-N. As shown in FIG. 110, there are four independently controllable refresh command sequence outputs of block 11030. Outputs of R0 are independently controllable refresh command sequences. Also, outputs of R1 are independently controllable refresh command sequences. The blocks 11030, 11040, implement their respective functionalities using a combination of logic gates, transistors, finite state machines, programmable logic or any technique capable of operating on or delaying logic or analog signals.

The techniques and exemplary embodiments for how to independently control refresh command sequences to a plurality of memory devices using an interface circuit have now been disclosed. The following describes various techniques for calculating the timing of assertions of the refresh command sequences.

FIG. 111A is a flowchart of method steps for configuring, calculating, and generating the timing and assertion of two or more refresh command sequences, according to one embodiment. Although the method is described with respect to the system of FIG. 102A, persons skilled in the art will understand that any system configured to perform the method steps, in any order, is within the scope of the claims. As shown in FIG. 111A, the method includes the steps of analyzing the connectivity of the refresh command sequences between the memory devices 10204 A-N and the interface circuit 10202 outputs, calculating the timing of each of the independently controlled refresh command sequences, and asserting each of the refresh command sequences at the calculated time. In exemplary embodiments, one or more of the steps of FIG. 111A are performed in the logic embedded in the interface circuit 10202. In another embodiment one or more of the steps of FIG. 111A are performed in the logic embedded in the interface circuit 10202 while any remaining steps of FIG. 111A are performed in the intelligent buffer 10233.

In one embodiment, analyzing the connectivity of the refresh command sequences between the memory devices 10204A-N and the interface circuit 10202 outputs is performed statically, prior to applying power to the system device 10206. Any number of characteristics of the system device 10206, motherboard, trace-length, capacitive loading, memory type, interface circuit output buffers, or other physical design characteristics, may be used in an analysis or simulation in order to analyze or optimize the timing of the plurality of independently controllable refresh command sequences.

In another embodiment, analyzing the connectivity of the refresh command sequences between the memory devices 10204A-N and the interface circuit 10202 outputs is performed dynamically, after applying power to the system device 10206. Any number of characteristics of the system device 10206, motherboard, trace-length, capacitive loading, memory type, interface circuit output buffers, or other physical design characteristics, may be used in an analysis or simulation in order to analyze or optimize the timing of the plurality of independently controllable refresh command sequences.

In some embodiments of the multiple memory device system of FIG. 102A, the physical design can have a significant impact on the current draw, voltage droop, and staggering of the multiple independently controlled refresh command sequences. A designer of a DIMM, motherboard, or system would seek to minimize spikes in current draw, the resulting voltage droop on the VDD voltage supply, and still meet the required refresh cycle time. Some rules and guidelines for the physical design of the trace lengths and capacitance for the signals 10208, and for the packaging of the memory circuits 10204A-10204N as related to refresh staggering include:

Reduce the inductance between intelligent buffer 10233 and each memory device 10232A-N, between intelligent buffer 10233 and the intelligent register 10202.

Increase decoupling capacitance between VDD and VSS at all levels of the PDS: PCB, BGA, substrate, wirebond, RDL and die.

Separate the spikes in current draw by staggering the refresh times between multiple memory devices.

In another embodiment, configuring the connectivity of the refresh command sequences between the memory devices 10204A-N and the interface circuit 10202 outputs is performed periodically at times after application of power to the system device 10206. Dynamic configuration uses a measurement unit (e.g., element 11302 of FIG. 113) that is capable of performing a series of analog and logic tests on one or more of various pins of the interface circuit 10202 such that actual characteristics of the pin is measured and stored for use in refresh scheduling calculations. Examples of such characteristics include, but are not limited to timing of response at first detected voltage change, timing of response where detected voltage change crosses the logic—1/logic—0 threshold value, timing of response at peak detected voltage change, duration and amplitude of response ring, operating frequency of the interface circuit and operating frequency of the DRAM devices etc.

FIG. 111B shows steps of a method to be performed periodically at some time after application of power to the system device 10206. The steps include determining the connectivity characteristics of the affecting communication of the refresh commands, determining operating conditions, including one or more temperatures, determining the configuration of the memory (e.g. size, number of ranks, memory word organization, etc.), calculating the refresh timing for initialization, and calculating refresh timing for the operation phase. Similarly to the method of 111A, the method of 111B may be applied repeatedly, beginning at any step, in an autonomous fashion or based on any technically feasible event, such as a power-on reset event or the receipt of a time-multiplexed or other signal, a logical combination of signals, a combination of signals and stored state, a command or a packet from any component of the host system, including the memory controller.

In embodiments where one or more temperatures are measured, the calculation of the refresh timing considers not only the measured temperatures, but also the manufacturer's specifications of the DRAMs FIG. 112 is a flowchart of method steps for analysing, calculating, and generating the timing and assertion of two or more refresh command sequences continuously and asynchronously, according to one embodiment. Although the method is described with respect to the systems of FIGS. 102A, 102B, 102C, and FIG. 113, persons skilled in the art will understand that any system configured to implement the method steps in any order, is within the scope of the claims. As shown in FIG. 112, the method includes the steps of continuously and asynchronously analysing the connectivity affecting the assertion of refresh commands between the memory devices 10204A-N and the interface circuit 10202 outputs, continuously and asynchronously calculating the timing of each of the independently controlled refresh command sequences, and continuously and asynchronously scheduling the assertion of each of the refresh command sequences at the calculated time. In one embodiment, the method steps of FIG. 112 may be implementation in hardware. Those skilled in the art will recognize that physical characteristics such as capacitance, resistance, inductance and temperature may vary slightly with time and during operation, and such variations may affect scheduling of the refresh commands. Moreover, during operation, the assertion of refresh commands is intended to continue on a schedule that is not in violation of any schedule required by the DRAM manufacturer, therefore the step of calculating timing of refresh command sequences and may operate concurrently with the step of asserting refresh command sequences.

FIG. 113 illustrates the interface circuit 10202 of FIG. 102A with refresh command sequence outputs 11301 adapted to connect to a plurality of memory devices, such as the memory devices 10204A-N of FIG. 102A, according to one embodiment. In this embodiment, each of a measurement unit 11302, a calculation unit 11304, and a scheduler 11306 is configured to operate continuously and asynchronously.

The measurement unit 11302 is configured to generate signals 11305 and to sample analog values of inputs 11303 either autonomously at some time after power-on or upon receiving a command from the system device 10206. The measurement unit 11302 also is operable to determine the configuration of the memory devices 10204A-N (not shown). The configuration determination and measurements are communicated to the calculation unit 11304. The calculation unit 11304 analyses the measurements received from the measurement unit 11302 and calculates the optimized timing for staggering the refresh command sequences, as previously described herein.

Understanding the use of the disclosed techniques for managing refresh commands, there are many apparent embodiments based upon industry-standard configurations of DRAM devices.

FIG. 114 is an exemplary illustration of a 72-bit ECC (error-correcting code) DIMM based upon industry-standard DRAM devices 11410 arranged vertically into stacks 11420 and horizontally into an array of stacks, according to one embodiment. As shown, the stacks of DRAM devices 11420 are organized into an array of stacks of sixteen 4-bit wide DRAM devices 11410 resulting in a 72-bit wide DIMM. Persons skilled in the art will understand that many configurations of the ECC DIMM of FIG. 114 may be possible and envisioned. A few of the exemplary configurations are further described in the following paragraphs.

In another embodiment, the configuration contains N DRAM devices, each of capacity M that—in concert with the interface circuit(s) 11570—emulates one DRAM devices, each of capacity N*M. In a system with a system device 11520 designed to interface with a DRAM device of capacity N*M, the system device will allow for a longer refresh cycle time than it would allow to each DRAM device of capacity M. In this configuration, when a refresh command is issued by the system device to the interface circuit, the interface circuit will stagger N numbers of refresh cycles to the N numbers of DRAM devices. In one optional feature, the interface circuit may use a user-programmable setting or a self calibrated frequency detection circuit to compute the optimal stagger spacing between each of the N numbers of refresh cycles to each of the N numbers of DRAM devices. The result of the computation is minimized voltage droop on the power delivery network and functional correctness in that the entire sequence of N staggered refresh events are completed within the refresh cycle time expected by the system device. For example, a configuration may contain 4 DRAM devices, each 1 gigabit in capacity that an interface circuit may use to emulate one DRAM device that is 4 gigabit in capacity. In a JEDEC compliant DDR2 memory system, the defined refresh cycle time for the 4 gigabit device is 327.5 nanoseconds, and the defined refresh cycle time for the 1 gigabit device is 127.5 nanoseconds. In this specific example, the interface circuit may stagger refresh commands to each of the 1 gigabit DRAM devices with spacing that is carefully selected based on the operating characteristics of the system, such as temperature, frequency, and voltage levels, while still ensuring that that the entire sequence is complete within the 327.5 ns expected by the memory controller.

In another embodiment, the configuration contains 2*N DRAM devices, each of capacity M that—in concert with the interface circuit(s) 11570—emulates two DRAM devices, each of capacity N*M. In a system with a system device 11520 designed to interface with a DRAM device of capacity N*M, the system device will allow for a longer refresh cycle time than it would allow to each DRAM device of capacity M. In this configuration, when a refresh command is issued by the system device to the interface circuit to refresh one of the two emulated DRAM devices, the interface circuit will stagger N numbers of refresh cycles to the N numbers of DRAM devices. In one optional feature when the system device issues the refresh command to the interface circuit to refresh both of the emulated DRAM devices, the interface circuit will stagger 2*N numbers of refresh cycles to the 2*N numbers of DRAM devices to minimize voltage droop on the power delivery network, while ensuring that the entire sequence completes within the allowed refresh cycle time of the single emulated DRAM device of capacity N*M.

As can be understood from the above discussion of the several disclosed configurations of the embodiments of FIG. 114, there exist at least as many refresh command sequence spacing possibilities as there are possible configurations of DRAM memory devices on a DIMM.

The response of a memory device to one or more time-domain pulses can be represented in the frequency domain as a spectrograph. Similarly, the power delivery system of a motherboard has a natural frequency domain response. In one embodiment, the frequency domain response of the power delivery system is measured, and the timing of refresh command sequence for a DIMM configuration is optimized to match the natural frequency response of the power delivery subsystem. That is, the frequency domain characteristics between the power delivery system and the memory device on the DIMM are anti-correlated such that the energy of the pulse stream of refresh command sequences spread the energy of the pulse stream out over a broad spectral range. Accordingly one embodiment of a method for optimizing memory refresh command sequences in a DIMM on a motherboard is to measure and plot the frequency domain response of the motherboard power delivery system, measure and plot the frequency domain response of the memory devices, superimpose the two frequency domain plots and define a refresh command sequence pulse train which frequency domain response, when superimposed on the aforementioned plots results in a flatter frequency domain response.

FIG. 115 is a conceptual illustration of a computer platform 11500 configured to implement one or more aspects of the embodiments. As an option, the contents of FIG. 115 may be implemented in the context of the architecture and/or environment of the figures previously described herein. Of course, however, such contents may be implemented in any desired environment.

As shown, the computer platform 11500 includes, without limitation, a system device 11520 (e.g., a motherboard), interface circuit(s) 11570, and memory module(s) 11580 that include physical memory devices 11581 (e.g., physical memory devices, such as the memory devices 10204A-N shown in FIG. 102A). In one embodiment, the memory module(s) 11580 may include DIMMs. The physical memory devices 11581 are connected directly to the system 11520 by way of one or more sockets.

In one embodiment, the system device 11520 includes a memory controller 11521 designed to the specifics of various standards, in particular the standard defining the interfaces to JEDEC-compliant semiconductor memory (e.g., DRAM, SDRAM, DDR2, DDR3, etc.). The specifications of these standards address physical interconnection and logical capabilities. FIG. 115 depicts the system device 11520 further including logic for retrieval and storage of external memory attribute expectations 11522, memory interaction attributes 11523, a data processing engine 11524, various mechanisms to facilitate a user interface 11525, and the system basic Input/Output System (BIOS) 11526.

In various embodiments, the system device 11520 may include a system BIOS program capable of interrogating the physical memory module 11580 (e.g., DIMMs) as a mechanism to retrieve and store memory attributes. Furthermore, in external memory embodiments, JEDEC-compliant DIMMs include an EEPROM device known as a Serial Presence Detect (SPD) 11582 where the DIMM's memory attributes are stored. It is through the interaction of the system BIOS 11526 with the SPD 11582 and the interaction of the system BIOS 11526 with the physical attributes of the physical memory devices 11581 that the various memory attribute expectations and memory interaction attributes become known to the system device 11520. Also optionally included on the memory module(s) 11580 are an address register logic 11583 (e.g. JEDEC standard register, register, etc.) and data buffer(s) and logic 11584.

In various embodiments, the compute platform 11500 includes one or more interface circuits 11570, electrically disposed between the system device 11520 and the physical memory devices 11581. The interface circuits 11570 may be physically separate from the DIMM, may be placed on the memory module(s) 11580, or may be part of the system device 11520 (e.g., integrated into the memory controller 11521, etc.)

Some characteristics of the interface circuit(s) 11570, in accordance with an optional embodiment, includes several system-facing interfaces such as, for example, a system address signal interface 11571, a system control signal interface 11572, a system clock signal interface 11573, and a system data signal interface 11574. Similarly, the interface circuit(s) 11570 may include several memory-facing interfaces such as, for example, a memory address signal interface 11575, a memory control signal interface 11576, a memory clock signal interface 11577, and a memory data signal interface 11578.

In additional embodiments, an additional characteristic of the interface circuit(s) 11570 is the optional presence of one or more sub-functions of emulation logic 11530. The emulation logic 11530 is configured to receive and optionally store electrical signals (e.g., logic levels, commands, signals, protocol sequences, communications) from or through the system-facing interfaces 11571-11574 and to process those signals. In particular, the emulation logic 11530 may contain one or more sub functions (e.g., power management logic 11532 and delay management logic 11533) configured to manage refresh command sequencing with the physical memory devices 11581.

Abstracted DIMM

A conventional memory system is composed of DIMMs that contain DRAMs. Typically modern DIMMs contain synchronous DRAM (SDRAM). DRAMs come in different organizations, thus an ×4 DRAM provides 4 bits of information at a time on a 4-bit data bus. These data bits are called DQ bits. The 1 Gb DRAM has an array of 1 billion bits that are addressed using column and row addresses. A 1 Gb DDR3×4 SDRAM with ×4 organization (4 DQ bits that comprise the data bus) has 14 row address bits and 11 column address bits. A DRAM is divided into areas called banks and pages. For example a 1 Gb DDR3×4 SDRAM has 8 banks and a page size of 1 KB. The 8 banks are addressed using 3 bank address bits.

A DIMM consists of a number of DRAMs. DIMMs may be divided into ranks. Each rank may be thought of as a section of a DIMM controlled by a chip select (CS) signal provided to the DIMM. Thus a single-rank DIMM has a single CS signal from the memory controller. A dual-rank DIMM has two CS signals from the memory controller. Typically DIMMs are available as single-rank, dual-rank, or quad-rank. The CS signal effectively acts as an on/off switch for each rank.

DRAMs also provide signals for power management. In a modern DDR2 and DDR3 SDRAM memory system, the memory controller uses the CKE signal to move DRAM devices into and out of low-power states.

DRAMs provide many other signals for data, control, command, power and so on, but in this description we will focus on the use of the CS and CKE signals described above. We also refer to DRAM timing parameters in this specification. All physical DRAM and physical DIMM signals and timing parameters are used in their well-known sense, described for example in JEDEC specifications for DDR2 SDRAM, DDR3 SDRAM, DDR2 DIMMs, and DDR3 DIMMs and available at www.jedec.org.

A memory system is normally characterized by parameters linked to the physical DRAM components (and the physical page size, number of banks, organization of the DRAM—all of which are fixed), and the physical DIMM components (and the physical number of ranks) as well as the parameters of the memory controller (command spacing, frequency, etc.). Many of these parameters are fixed, with only a limited number of variable parameters. The few parameters that are variable are often only variable within restricted ranges. To change the operation of a memory system you may change parameters associated with memory components, which can be difficult or impossible given protocol constraints or physical component restrictions. An alternative and novel approach is to change the definition of DIMM and DRAM properties, as seen by the memory controller. Changing the definition of DIMM and DRAM properties may be done by using abstraction. The abstraction is performed by emulating one or more physical properties of a component (DIMM or DRAM, for example) using another type of component. At a very simple level, for example, just to illustrate the concept of abstraction, we could define a memory module in order to emulate a 2 Gb DRAM using two 1 Gb DRAMs. In this case the 2 Gb DRAM is not real; it is an abstracted DRAM that is created by emulation.

Continuing with the notion of a memory module, a memory module might include one or more physical DIMMs, and each physical DIMM might contain any number of physical DRAM components. Similarly a memory module might include one or more abstracted DIMMs, and each abstracted DIMM might contain any number of abstracted DRAM components, or a memory module might include one or more abstracted DIMMs, and each abstracted DIMM might contain any number of abstracted memory components constructed from any type or types or combinations of physical or abstracted memory components.

The concepts described in embodiments of this invention go far beyond this simple type of emulation to allow emulation of abstracted DRAMs with abstracted page sizes, abstracted banks, abstracted organization, as well as abstracted DIMMs with abstracted ranks built from abstracted DRAMs. These abstracted DRAMs and abstracted DIMMs may then also have abstracted signals, functions, and behaviors. These advanced types of abstraction allow a far greater set of parameters and other facets of operation to be changed and controlled (timing, power, bus connections). The increased flexibility that is gained by the emulation of abstracted components and parameters allows, for example, improved power management, better connectivity (by using a dotted DQ bus, formed when two or more DQ pins from multiple memory chips are combined to share one bus), dynamic configuration of performance (to high-speed or low-power for example), and many other benefits that were not achievable with prior art designs.

As may be recognized by those skilled in the art, an abstracted memory apparatus for emulation of memory presents any or all of the abovementioned characteristics (e.g. signals, parameters, protocols, etc) onto a memory system interface (e.g. a memory bus, a memory channel, a memory controller bus, a front-side-bus, a memory controller hub bus, etc). Thus, presentation of any characteristic or combination of characteristics is measurable at the memory system interface. In some cases, a measurement may be performed merely by measurement of one or more logic signals at one point in time. In other cases, and in particular in the case of an abstracted memory apparatus in communication over a bus-oriented memory system interface, a characteristic may be presented via adherence to a protocol. Of course, measurement may be performed by measurement of logic signals or combinations or logic signals over several time slices, even in absence of any known protocol.

Using the memory system interface, and using techniques, and as are discussed in further detail herein, an abstracted memory apparatus may present a wide range of characteristics including, an address space, a plurality of address spaces, a protocol, a memory type, a power management rule, a power management mode, a power down operation, a number of pipeline stages, a number of banks, a mapping to physical banks, a number of ranks, a timing characteristic, an address decoding option, an abstracted CS signal, a bus turnaround time parameter, an additional signal assertion, a sub-rank, a plane, a number of planes, or any other memory-related characteristic for that matter.

Abstracted DRAM Behind Buffer Chip

The first part of this disclosure describes the use of a new concept called abstracted DRAM (aDRAM). The specification, with figures, describes how to create aDRAM by decoupling the DRAM (as seen by a host perspective) from the physical DRAM chips. The emulation of aDRAM has many benefits, such as increasing the performance of a memory subsystem.

As a general example, FIGS. 116A-116C depict an emulated subsystem 11600, including a plurality of abstracted DRAM (aDRAM) 11602, 11604, each connected via a memory interface 116091, and each with their own address spaces disposed electrically behind an intelligent buffer chip 11606, which is in communication over a memory interface 116090 with a host subsystem (not shown). In such a configuration, the protocol requirements and limitations imposed by the host architecture and host generation are satisfied by the intelligent buffer chip. In this embodiment, one or more of the aDRAMs may individually use a different and even incompatible protocol or architecture as compared with the host, yet such differences are not detectable by the host as the intelligent buffer chip performs all necessary protocol translation, masking and adjustments to emulate the protocols required by the host.

As shown in FIG. 116A, aDRAM 11602 and aDRAM 11604 are behind the intelligent buffer/register 11606. In various embodiments, the intelligent buffer/register may present to the host the aDRAM 11602 and aDRAM 11604 memories, each with a set of physical or emulated characteristics, (e.g. address space, timing, protocol, power profile, etc). The sets of characteristics presented to the host may differ between the two abstracted memories. For example, each of the aDRAMs may actually be implemented using the same type of physical memory; however, in various embodiments the plurality of address spaces may be presented to the host as having different logical or emulated characteristics. For example, one aDRAM might be optimized for timing and/or latency at the expense of power, while another aDRAM might be optimized for power at the expense of timing and/or latency.

Of course, the embodiments that follow are not limited to two aDRAMs, any number may be used (including using just one aDRAM).

In the embodiment shown in FIG. 116B, the aDRAMs (e.g. 11602 and 11604) may be situated on a single PCB 11608. In such a case, the intelligent buffer/register situated between the memories and the host may present to the host over memory interface 116090 a plurality of address spaces as having different characteristics.

In another embodiment, shown in FIG. 116C, the aDRAMs (e.g. 11602A-11602N) and 11604A-11604N) may include a plurality of memories situated on a single industry-standard DIMM and presenting over memory interface 116091. In such a case, the intelligent buffer/register situated between the aDRAMs and the host may present a plurality of address spaces to the host, where each address space may have different characteristics. Moreover, in some embodiments, including but not limited to the embodiments of FIG. 116A, 116B, or 116C, any of the characteristics whether as a single characteristic or as a grouped set of characteristics may be changed dynamically. That is, in an earlier segment of time, a first address space may be optimized for timing; with a second address space is optimized for power. Then, in a later segment of time, the first address space may be optimized for power, with the second address space optimized for timing. The duration of the aforementioned segment of time is arbitrary, and can be characterized as a boot cycle, or a runtime of a job, runtime of round-robin time slice, or any other time slice, for that matter.

Merely as optional examples of alternative implementations, the aDRAMs may be of the types listed in Table 13, below, while the intelligent buffer chip performs within the specification of each listed protocol. The protocols listed in Table 13 ("DDR2," "DDR3," etc.) are well known industry standards. Importantly, embodiments of the invention are not limited to two aDRAMs.

TABLE 13

| Host Interface Type | aDRAM #1 Type | aDRAM #2 Type |
|---|---|---|
| DDR2 | DDR2 | DDR2 |
| DDR3 | DDR3 | DDR3 |
| DDR3 | DDR2 | DDR2 |
| GDDR5 | DDR3 | DDR3 |
| LPDDR2 | LPDDR2 | NOR Flash |
| DDR3 | LPDDR2 | LPDDR2 |
| GDDR3 | DDR3 | NAND Flash |

Abstracted DRAM Having Adjustable Power Management Characteristics

Use of an intelligent buffer chip permits different memory address spaces to be managed separately without host or host memory controller intervention. FIG. 117 shows two memory spaces corresponding to two aDRAMs, 11702 and 11704, each being managed according to a pre-defined or dynamically tuned set of power management rules or characteristics. In particular, a memory address space managed according to a conservative set of power management rules (e.g. in address space 11702) is managed completely independently from a memory address space managed according to an aggressive set of power management rules (e.g. in address space 11704) by an intelligent buffer 11706.

In embodiment 11700, illustrated in FIG. 117, two independently controlled address spaces may be implemented using an identical type of physical memory. In other embodiments, the two independently controlled address spaces may be implemented with each using a different type of physical memory.

In other embodiments, the size of the address space of the memory under conservative management 11702 is programmable, and applied to the address space at appropriate times, and is controlled by the intelligent register in response to commands from a host (not shown). The address space of the memory at 11704 is similarly controlled to implement a different power management regime.

The intelligent buffer can present to the memory controller a plurality of timing parameter options, and depending on the specific selection of timing parameters, engage more aggressive power management features as described.

Abstracted DRAM Having Adjustable Timing Characteristics

In the embodiment just described, the characteristic of power dissipation differs between the aDRAMs with memory address space 11702 and memory address space 11704. In addition to differing power characteristics, many other characteristics are possible when plural aDRAMs are placed behind an intelligent buffer, namely latency, configuration characteristics, and timing parameters. For example, timing and latency parameters can be emulated and changed by altering the behavior and details of the pipeline in the intelligent buffer interface circuit. For example, a pipeline associated with an interface circuit within a memory device may be altered by changing the number of stages in the pipeline to increase latency. Similarly, the number of pipeline stages may be reduced to decrease latency. The configuration may be altered by presenting more or fewer banks for use by the memory controller.

Abstracted DRAM Having Adjustable tRP, tRCD, and tWL Characteristics

In one such embodiment, which is capable of presenting different aDRAM timing characteristics, the intelligent buffer may present to the controller different options for tRP, a well-known timing parameter that specifies DRAM row-precharge timing. Depending on the amount of latency added to tRP, the intelligent buffer may be able to lower the clock-enable signal to one or more sets of memory devices, (e.g. to deploy clock-enable-after-precharge, or not to deploy it, depending on tRP). A CKE signal may be used to enable and disable clocking circuits within a given integrated circuit. In DRAM devices, an active (“high”) CKE signal enables clocking of internal logic, while an inactive (“low”) CKE signal generally disables clocks to internal circuits. The CKE signal is set active prior to a DRAM device performing reads or writes. The CKE signal is set inactive to establish low-power states within the DRAM device.

In a second such embodiment capable of presenting different aDRAM timing characteristics, the intelligent buffer may present to the controller different options for tRCD, a well-known timing parameter that specifies DRAM row-to-column delay timing. Depending on the amount of latency added to tRCD, the intelligent buffer may place the DRAM devices into a regular power down state, or an ultra-deep power down state that can enable further power savings. For example, a DDR3 SDRAM device may be placed into a regular precharge-powerdown state that consumes a reduced amount of current known as “IDD2P (fast exit),” or a deep precharge-powerdown state that consumes a reduced amount of current known as “IDD2P (slow exit),” where the slow exit option is considerably more power efficient.

In a third embodiment capable of presenting different aDRAM timing characteristics, the intelligent buffer may present to the controller different options for tWL, the write-latency timing parameter. Depending on the amount of latency added to tWL, the intelligent buffer may be able to lower the clock-enable signal to one or more sets of memory devices. (e.g. to deploy CKE-after-write, or not to deploy it, depending on tWL).

Changing Configurations to Enable/Disable Aggressive Power Management

Different memory (e.g. DRAM) circuits using different standards or technologies may provide external control inputs for power management. In DDR2 SDRAM, for example, power management may be initiated using the CKE and CS inputs and optionally in combination with a command to place the DDR2 SDRAM in various powerdown modes. Four power saving modes for DDR2 SDRAM may be utilized, in accordance with various different embodiments (or even in combination, in other embodiments). In particular, two active powerdown modes, precharge powerdown mode, and self refresh mode may be utilized. If CKE is de-asserted while CS is asserted, the DDR2 SDRAM may enter an active or precharge power down mode. If CKE is de-asserted while CS is asserted in combination with the refresh command, the DDR2 SDRAM may enter the self-refresh mode. These various powerdown modes may be used in combination with power-management modes or schemes. Examples of power-management schemes will now be described.

One example of a power-management scheme is the CKE-after-ACT power management mode. In this scheme the CKE signal is used to place the physical DRAM devices into a low-power state after an ACT command is received. Another example of a power-management scheme is the CKE-after-precharge power management mode. In this scheme the CKE signal is used to place the physical DRAM devices into a low-power state after a precharge command is received. Another example of a power-management scheme is the CKE-after-refresh power management mode. In this scheme the CKE signal is used to place the physical DRAM devices into a low-power state after a refresh command is received. Each of these power-management schemes have their own advantages and disadvantages determined largely by the timing restrictions on entering into and exiting from the low-power states. The use of an intelligent buffer to emulate abstracted views of the DRAMs greatly increases the flexibility of these power-management modes and combinations of these modes, as will now be explained.

Some configurations of JEDEC-compliant memories expose fewer than all of the banks comprised within a physical memory device. In the case that not all of the banks of the physical memory devices are exposed, part of the banks that are not exposed can be placed in lower power states than those that are exposed. That is, the intelligent buffer can present to the memory controller a plurality of configuration options, and depending on the specific selection of configuration, engage more aggressive power management features.

In one embodiment, the intelligent buffer may be configured to present to the host controller more banks at the expense of a less aggressive power-management mode. Alternatively, the intelligent buffer can present to the memory controller fewer banks and enable a more aggressive power-management mode. For example, in a configuration where the intelligent buffer presents 16 banks to the memory controller, when 32 banks are available from the memory devices, the CKE-after-ACT power management mode can at best keep half of the memory devices in low power state under normal operating conditions. In contrast, in a different configuration where the intelligent buffer presents 8 banks to the memory controller, when 32 banks are available from the memory devices, the CKE-after-ACT power management mode can keep 3 out of 4 memory devices in low power states.

For all embodiments, the power management modes may be deployed in addition to other modes. For example, the CKE-after-precharge power management mode may be deployed in addition to CKE-after-activate power management mode, and the CKE-after-activate power management mode may itself be deployed in addition to the CKE-after-refresh power management mode.

Changing Abstracted DRAM CKE Timing Behavior to Control Power Management

In another embodiment, at least one aspect of power management is affected by control of the CKE signals. That is, manipulating the CKE control signals may be used in order to place the DRAM circuits in various power states. Specifically, the DRAM circuits may be opportunistically placed in a precharge power down mode using the clock enable (CKE) input of the DRAM circuits. For example, when a DRAM circuit has no open pages, the power management scheme may place that DRAM circuit in the precharge power down mode by de-asserting the CKE input. The CKE inputs of the DRAM circuits, possibly together in a stack, may be controlled by the intelligent buffer chip, by any other chip on a DIMM, or by the memory controller in order to implement the power management scheme described hereinabove. In one embodiment, this power management scheme may be particularly efficient when the memory controller implements a closed-page policy.

In one embodiment, one abstracted bank is mapped to many physical banks, allowing the intelligent buffer to place inactive physical banks in a low power mode. For example, bank 0 of a 4 Gb DDR2 SDRAM, may be mapped (by a buffer chip or other techniques) to two 256 Mb DDR2 SDRAM circuits (e.g. DRAM A and DRAM B). However, since only one page can be open in a bank at any given time, only one of DRAM A or DRAM B may be in the active state at any given time. If the memory controller opens a page in DRAM A, then DRAM B may be placed in the precharge power down mode by de-asserting the CKE input to DRAM B. In another scenario, if the memory controller opens a page in DRAM B, then DRAM A may be placed in the precharge power down mode by de-asserting the CKE input to DRAM A. The power saving operation may, for example, comprise operating in precharge power down mode except when refresh is required. Of course, power-savings may also occur in other embodiments without such continuity.

In other optional embodiments, such power management or power saving operations or features may involve a power down operation (e.g. entry into a precharge power down mode, as opposed to an exit from precharge power down mode, etc.). As an option, such power saving operation may be initiated utilizing (e.g. in response to, etc.) a power management signal including, but not limited to, a clock enable signal (CKE), chip select signal (CS), in possible combination with other signals and optional commands. In other embodiments, use of a non-power management signal (e.g. control signal, etc.) is similarly contemplated for initiating the power management or power saving operation. Persons skilled in the art will recognize that any modification of the power behavior of DRAM circuits may be employed in the context of the present embodiment.

If power down occurs when there are no rows active in any bank, the DDR2 SDRAM may enter precharge power down mode. If power down occurs when there is a row active in any bank, the DDR2 SDRAM may enter one of the two active powerdown modes. The two active powerdown modes may include fast exit active powerdown mode or slow exit active powerdown mode. The selection of fast exit mode or slow exit mode may be determined by the configuration of a mode register. The maximum duration for either the active power down mode or the precharge power down mode may be limited by the refresh requirements of the DDR2 SDRAM and may further be equal to a maximum allowable tRFC value, "tRFC(MAX)." DDR2 SDRAMs may require CKE to remain stable for a minimum time of tCKE(MIN). DDR2 SDRAMs may also require a minimum time of tXP(MIN) between exiting precharge power down mode or active power down mode and a subsequent non-read command. Furthermore, DDR2 SDRAMs may also require a minimum time of tXARD(MIN) between exiting active power down mode (e.g. fast exit) and a subsequent read command. Similarly, DDR2 SDRAMs may require a minimum time of tXARDS(MIN) between exiting active power down mode (e.g. slow exit) and a subsequent read command.

As an example, power management for a DDR2 SDRAM may require that the SDRAM remain in a power down mode for a minimum of three clock cycles [e.g. tCKE(MIN)=3 clocks]. Thus, the SDRAM may require a power down entry latency of three clock cycles.

Also as an example, a DDR2 SDRAM may also require a minimum of two clock cycles between exiting a power down mode and a subsequent command [e.g. tXP(MIN)=2 clock cycles; tXARD(MIN)=2 clock cycles]. Thus, the SDRAM may require a power down exit latency of two clock cycles.

Thus, by altering timing parameters (such as tRFC, tCKE, tXP, tXARD, and tXARDS) within aDRAMs, different power management behaviors may be emulated with great flexibility depending on how the aDRAM is presented to the memory controller. For example by emulating an aDRAM that has greater values of tRFC, tCKE, tXP, tXARD, and tXARDS (or, in general, subsets or super sets of these timing parameters) than a physical DRAM, it is possible to use power-management modes and schemes that could not be otherwise used.

Of course, for other DRAM or memory technologies, the powerdown entry latency and powerdown exit latency may be different, but this does not necessarily affect the operation of power management described herein.

Changing Other Abstracted DRAM Timing Behavior

In the examples described above timing parameters such as tRFC, tCKE, tXP, tXARD, and tXARDS were adjusted to emulate different power management mechanisms in an aDRAM. Other timing parameters that may be adjusted by similar mechanisms to achieve various emulated behaviors in aDRAMs. Such timing parameters include, without limitation, the well-known timing parameters illustrated below in Table 14, which timing parameters may include any timing parameter for commands, or any timing parameter for precharge, or any timing parameter for refresh, or any timing parameter for reads, or any timing parameter for writes or other timing parameter associated with any memory circuit:

TABLE 14

| | |
|---|---|
| tAL | Posted CAS Additive Latency |
| tFAW | 4-Bank Activate Period |
| tRAS | Active-to-Precharge Command Period |
| tRC | Active-to-Active (same bank) Period |
| tRCD | Active-to-Read or Write Delay |
| tRFC | Refresh-to-Active or Refresh-to-Refresh Period |
| tRP | Precharge Command Period |
| tRRD | Active Bank A to Active Bank B Command Period |
| tRTP | Internal Read-to-Precharge Period |
| tWR | Write Recovery Time |
| tWTR | Internal Write-to-Read Command Delay |

DRAMS in Parallel with Buffer Chip

FIG. 118A depicts a configuration 11800 having an aDRAM 11804 comprising a standard rank of DRAM in parallel with an aDRAM 11802 behind an intelligent buffer chip 11806, also known as an "intelligent buffer" 11806. In such an embodiment aDRAM 11802 is situated electrically behind the intelligent register 11806 (which in turn is in communication with a memory channel buffer), while aDRAM 11804 is connected directly to the memory channel buffer. In this configuration the characteristics presented by the aDRAM formed from the combination of intelligent buffer chip 11806 and the memory behind intelligent register 11806 may be made identical or different from the characteristics inherent in the physical memory. The intelligent buffer/register 11806 may operate in any mode, or may operate to emulate any characteristic, or may consume power, or may introduce delay, or may power down any attached memory, all without affecting the operation of aDRAM 11804.

In the embodiment as shown in FIG. 118B, the ranks of DRAM 11808 1-11808 N may be configured and managed by the intelligent buffer chip 11812, either autonomously or under indication by or through the memory controller or memory channel 11810. In certain applications, higher latencies can be tolerated by the compute subsystem, whereas, latency-sensitive applications would configure and use standard ranks using, for example, the signaling schemes described below. Moreover, in the configuration shown in FIG. 118B, a wide range of memory organization schemes are possible.

Autonomous CKE Management

In FIG. 118B the intelligent buffer 11812 can either process the CKE(s) from the memory controller before sending CKEs to the connected memories, or the intelligent buffer 11812 may use CKEs from the host directly. Even still, the intelligent buffer 11812 may be operable to autonomously generate CKEs to the connected memories. In some embodiments where the host does not implement CKE management, or does not implement CKE management having some desired characteristics, 11812 may be operable to autonomously generate CKEs to the connected memories, thus providing CKE management in a system which, if not for the intelligent buffer 11812 could not exhibit CKE management with the desired characteristics.

Improved Signal Integrity of Memory Channel

FIG. 118B depicts a memory channel 11810 in communication with an intelligent buffer, and a plurality of DRAMs 11808 1-11808 N, disposed symmetrically about the intelligent buffer 11812. As shown, 4 memory devices are available for storage, yet only a single load is presented to the memory channel, namely the load presented by the intelligent buffer to the memory channel 11810. Such a reduction (comparatively) of the capacitive loading of the configuration in turn permits higher speeds, and/or higher noise margin or some combination thereto, which improves the signal integrity of the signals to/from the memory channel.

Dotting DQs

FIG. 119A depicts physical DRAMS 11902 and 11904, whose data or DQ bus lines are electrically connected using the technique known as "dotted DQs." Thus DQ pins of multiple devices share the same bus. For example, each bit of the dotted bus (not shown) such as DQ0 from DRAM 11902 is connected to DQ0 from DRAM 11904 and similarly for DQ1, DQ2, and DQ3 (for a DRAM with ×4 organization and 4 DQ bits). Novel use of dotted DQs bring to bear embodiments as are disclosed herein for reducing the number of signals in a stacked package, as well as for eliminating bus contention on a shared DQ bus, as well as for bringing to bear other improvements. Often a bidirectional buffer is needed for each separate DQ line. Sharing a DQ data bus reduces the number of separate DQ lines. Thus, in many important embodiments, the need for bidirectional buffers may be reduced through the use of multi-tapped or "dotted" DQ buses. Furthermore, in a stacked physical DRAM, the ability to dot DQs and share a data bus may greatly reduce the number of connections that should be carried through the stack.

The concept of dotting DQs may be applied, regardless if an interface buffer is employed or not. Interconnections involving a memory controller and a plurality of memory devices, without an interface buffer chip, are shown in FIG. 119B. In many modern memory systems such as SDRAM, DDR SDRAM, DDR2 SDRAM, DDR3 SDRAM, and Flash memory devices (not limited to these of course), multiple memory devices are often connected to the host controller on the same data bus as illustrated in FIG. 119B. Contention on the data bus is avoided by using rules that insert bus turnaround times, which are often lengthy.

An embodiment with interconnections involving a memory controller, and a plurality of memory devices to an interface buffer chip with point-to-point connections is shown in FIG. 119C.

FIG. 119D depicts an embodiment with interconnections involving a memory controller 11980, an interface buffer chip 11982, a plurality of memory devices 11984, 11986 connected to the interface buffer chip using the dotted DQ technique.

FIG. 119E depicts the data spacing on the shared data bus that must exist for a memory system between read and write accesses to different memory devices that shared the same data bus. The timing diagram illustrated in FIG. 119E is broadly applicable to memory systems constructed in the configuration of FIG. 119B as well as FIG. 119C.

FIG. 119F depicts the data spacing that should exist between data on the data bus between the interface circuit and the Host controller so that the required data spacing between the memory devices and the interface circuit is not violated.

An abstracted memory device, by presenting the timing parameters that differ from the timing parameters of a physical DRAM using, for example, the signaling schemes described below (in particular the bus turnaround parameters), as shown in example in FIGS. 119D and 119E, the dotted DQ bus configuration described earlier may be employed while satisfying any associated protocol requirements.

Similarly, by altering the timing parameters of the aDRAM according to the methods described above, the physical DRAM protocol requirements may be satisfied. Thus, by using the concept of aDRAMs and thus gaining the ability and flexibility to control different timing parameters, the vital bus turnaround time parameters can be advantageously controlled. Furthermore, as described herein, the technique known as dotting the DQ bus may be employed.

Control of Abstracted DRAM Using Additional Signals

FIG. 120 depicts a memory controller 12002 in communication with DIMM 12004. DIMM 12004 may include aDRAMs that are capable of emulating multiple behaviors, including different timing, power management and other behaviors described above. FIG. 120 shows both conventional data and command signals 12006, 12008 and additional signals 12010 which are part of the following embodiments. The additional signals may be used to switch between different properties of the aDRAM. Strictly as an example, the additional signals may be of the form "switch to aggressive power management mode" or "switch to a longer timing parameter". In one embodiment, the additional signals might be implemented by extensions to existing protocols now present in industry-standard memory interface architectures, or additional signals might be implemented as actual physical signals not now present in current or prophetic industry-standard memory interface architectures. In the former case, extensions to existing protocols now present in industry-standard memory interface architectures might include new cycles, might use bits that are not used, might re-use bits in any protocol cycle in an overloading fashion (e.g. using the same bits or fields for different purposes at different times), or might use unique and unused combinations of bits or bit fields.

Extensions to Memory Standards for Handling Sub-Ranks

The concept of an aDRAM may be extended further to include the emulation of parts of an aDRAM, called planes.

Conventional physical memories typically impose rules or limitations for handling memory access across the parts of the physical DRAM called ranks. These rules are necessary for intended operation of physical memories. However, the use of aDRAM and aDRAM planes, including memory subsystems created via embodiments of the present invention using intelligent buffer chips, permit such rules to be relaxed, suspended, overridden, augmented, or otherwise altered in order to create sub-ranks and/or planes. Moreover, dividing up the aDRAM into planes enables new rules to be created, which are different from the component physical DRAM rules, which in turn allows for better power, better performance, better reliability, availability and serviceability (known as RAS) features (e.g. sparing, mirroring between planes). In the specific case of the relaxation of timing parameters described above some embodiments are capable to better control CKE for power management than can be controlled for power management using techniques available in the conventional art.

If one thinks of an abstracted DRAM as an XY plane on which the bits are written and stored, then aDRAMs may be thought of as vertically stacked planes. In an aDRAM and an aDIMM built from aDRAMs, there may be different numbers of planes that may or may not correspond to a conventional rank, there may then be different rules for each plane (and this then helps to further increase the options and flexibility of power management for example). In fact characteristics of a plane might describe a partitioning, or might describe one or more portions of a memory, or might describe a sub-rank, or might describe an organization, or might describe virtually any other logical or group of logical characteristics. There might even by a hierarchical arrangement of planes (planes within planes) affording a degree of control that is not present using the conventional structure of physical DRAMs and physical DIMMs using ranks Organization of Abstracted DIMMs The above embodiments of the present invention have described an aDRAM. A conventional DIMM may then be viewed as being constructed from a number of aDRAMs. Using the concepts taught herein regarding aDRAMs, persons skilled in the art will recognize that a number of aDRAMS may be combined to form an abstracted DIMM or aDIMM. A physical DIMM may be viewed as being constructed from one of more aDIMMs. In other instances, an aDIMM may be constructed from one or more physical DIMMs. Furthermore, an aDIMM may be viewed as being constructed from (one or more) aDRAMs as well as being constructed from (one or more) planes. By viewing the memory subsystem as consisting of (one or more) aDIMMs, (one or more) aDRAMs, and (one or more) planes we increase the flexibility of managing and communicating with the physical DRAM circuits of a memory subsystem. These ideas of abstracting (DIMMs, DRAMs, and their sub-components) are novel and extremely powerful concepts that greatly expand the control, use and performance of a memory subsystem.

Augmenting the host view of a DIMM to a view including one of more aDIMMs in this manner has a number of immediate and direct advantages, examples of which are described in the following embodiments.

Construction of Abstracted DIMMs

FIG. 121A shows a memory subsystem 12100 consisting of a memory controller 12102 connected to a number of intelligent buffer chips 12104, 12106, 12108, and 12110. The intelligent buffer chips are connected to DIMMs 12112, 12114, 12116, and 12118.

FIG. 121B shows the memory subsystem 12100 with partitions 12120, 12122, 12124, and 12126 such that the memory array can be viewed by the memory controller 12102 as number of DIMMs 12120, 12122, 12124, and 12126.

FIG. 121C shows that each DIMM may be viewed as a conventional DIMM or as several aDIMMs. For example consider DIMM 12126 that is drawn as a conventional physical DIMM. DIMM 12126 consists of an intelligent buffer chip 12110 and a collection of DRAM 12118.

Now consider DIMM 12124. DIMM 12124 comprises an intelligent buffer chip 12108 and a collection of DRAM circuits that have been divided into four aDIMMs, 12130, 12132, 12134, and 12136.

Continuing with the enumeration of possible embodiments using planes, the DIMM 12114 has been divided into two aDIMMs, one of which is larger than the other. The larger region is designated to be low-power (LP). The smaller region is designated to be high-speed (HS). The LP region may be configured to be low-power by the MC, using techniques (such as CKE timing emulation) previously described to control aDRAM behavior (of the aDRAMs from which the aDIMM is made) or by virtue of the fact that this portion of the DIMM uses physical memory circuits that are by their nature low power (such as low-power DDR SDRAM, or LPDDR, for example). The HS region may be configured to be high-speed by the memory controller, using techniques already described to change timing parameters. Alternatively regions may be configured by virtue of the fact that portions of the DIMM use physical memory circuits that are by their nature high speed (such as high-speed GDDR, for example). Note that because we have used aDRAM to construct an aDIMM, not all DRAM circuits need be the same physical technology. This fact illustrates the very powerful concept of aDRAMs and aDIMMs.

DIMM 12112 has similar LP and HS aDIMMs but in different amounts as compared to vDMM 12114. This may be configured by the memory controller or may be a result of the physical DIMM construction.

In a more generalized depiction, FIG. 122A shows a memory device 12202 that includes use of parameters t1, t2, t3, t4. The memory device shown in FIG. 122B shows an abstracted memory device wherein the parameters t1, t2, t3, . . . to are applied in a region that coexists with other regions using parameters u1-un, v1-vn, and w1-wn.

Embodiments of Abstracted DIMMs

One embodiment uses the emulation of an aDIMM to enable merging, possibly including burst merging, of streaming data from two aDIMMs to provide a continuous stream of data faster than might otherwise be achieved from a single conventional physical DIMM. Such burst-merging may allow much higher performance from the use of aDIMMs and aDRAMs than can otherwise be achieved due to, for example, limitations of the physical DRAM and physical DIMM on bus turnaround, burst length, burst-chop, and other burst data limitations. In some embodiments involving at least two abstracted memories, the turnaround time characteristics can be configured for emulating a plurality of ranks in a seamless rank-to-rank read command scheme. In still other embodiments involving turnaround characteristics, data from a first abstracted DIMM memory might be merged (or concatenated) with the data of a second abstracted DIMM memory in order to form a continuous stream of data, even when two (or more) abstracted DIMM's are involved, and even when two (or more) physical memories are involved Another embodiment using the concept of an aDIMM can double or quadruple the number of ranks per DIMM and thus increases the flexibility to manage power consumption of the DIMM without increasing interface pin count. In order to implement control of an aDIMM, an addressing scheme may be constructed that is compatible with existing memory controller operation. Two alternative implementations of suitable addressing schemes are described below. The first scheme uses existing Row Address bits. The second scheme uses encoding of existing CS signals. Either scheme might be implemented, at least in part, by an intelligent buffer or an intelligent register, or a memory controller, or a memory channel, or any other device connected to memory interface 11609.

Abstracted DIMM Address Decoding Option 1—Use A[15:14]

In the case that the burst-merging (described above) between DDR3 aDIMMs is used, Row Address bits A[15] and A[14] may not be used by the memory controller—depending on the particular physical DDR3 SDRAM device used.

In this case Row Address A[15] may be employed as an abstracted CS signal that can be used to address multiple aDIMMs. Only one abstracted CS may be required if 2 Gb DDR3S DRAM devices are used. Alternatively A[15] and A[14] may be used as two abstracted CS signals if 1 Gb DDR3 SDRAM devices are used.

For example, if 2 Gb DDR3 SDRAM devices are used in an aDIMM, two aDIMMs can be placed behind a single physical CS, and A[15] can be used to distinguish whether the controller is attempting to address aDIMM #0 or aDIMM #1. Thus, to the memory controller, one physical DIMM (with one physical CS) appears to be composed of two aDIMMs or, alternatively, one DIMM with two abstracted ranks. In this way the use of aDIMMs could allow the memory controller to double (from 1 to 2) the number of ranks per physical DIMM.

Abstracted DIMM Address Decoding Option 2—Using Encoded Chip Select Signals

An alternative to the use of Row Address bits to address aDIMMs is to encode one or more of the physical CS signals from the memory controller. This has the effect of increasing the number of CS signals. For example we can encode two CS signals, say CS[3:2], and use them as encoded CS signals that address one of four abstracted ranks on an aDIMM. The four abstracted ranks are addressed using the encoding CS[3:2]=00, CS[3:2]=01, CS[3:2]=10, and CS[3:2]=11. In this case two CS signals, CS[1:0], are retained for use as CS signals for the aDIMMs. Consider a scenario where CS[0] is asserted and commands issued by the memory controller are sent to one of the four abstracted ranks on aDIMM #0. The particular rank on aDIMM #0 may be specified by the encoding of CS[3:2]. Thus, for example, abstracted rank #0 corresponds to CS[3:2]=00. Similarly, when CS[1] is asserted, commands issued by the memory controller are sent to one of the four abstracted ranks on aDIMM #1.

Characteristics of Abstracted DIMMs

In a DIMM composed of two aDIMMs, abstracted rank N in aDIMM #0 may share the same data bus as abstracted rank N of aDIMM #1. Because of the sharing of the data bus, aDIMM-to-aDIMM bus turnaround times are created between accesses to a given rank number on different abstracted-DIMMs. In the case of an aDIMM seamless rank-to-rank turnaround times are possible regardless of the aDIMM number, as long as the accesses are made to different rank numbers. For example a read command to rank #0, aDIMM #0 may be followed immediately by a read command to rank #5 in abstracted DIMM #1 with no bus turnaround needed whatsoever.

Thus, the concept of an aDIMM has created great flexibility in the use of timing parameters. In this case, the use and flexibility of DIMM-to-DIMM and rank-to-rank bus turnaround times are enabled by aDIMMs.

It can be seen that the use of aDRAMs and aDIMMs now allows enormous flexibility in the addressing of a DIMM by a memory controller. Multiple benefits result from this approach including greater flexibility in power management, increased flexibility in the connection and interconnection of DRAMs in stacked devices and many other performance improvements and additional features are made possible.

Figure 123A:
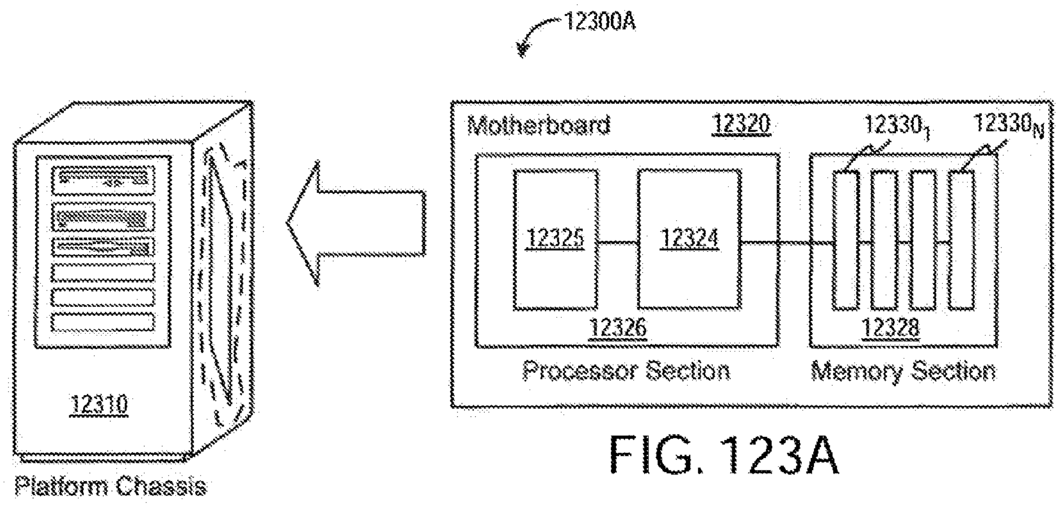

FIG. 123A illustrates a computer platform 12300A that includes a platform chassis 12310, and at least one processing element that consists of or contains one or more boards, including at least one motherboard 12320. Of course the platform 12300A as shown might comprise a single case and a single power supply and a single motherboard. However, it might also be implemented in other combinations where a single enclosure hosts a plurality of power supplies and a plurality of motherboards or blades.

The motherboard 12320 in turn might be organized into several partitions, including one or more processor sections 12326 consisting of one or more processors 12325 and one or more memory controllers 12324, and one or more memory sections 12328. Of course, as is known in the art, the notion of any of the aforementioned sections is purely a logical partitioning, and the physical devices corresponding to any logical function or group of logical functions might be implemented fully within a single logical boundary, or one or more physical devices for implementing a particular logical function might span one or more logical partitions. For example, the function of the memory controller 12324 might be implemented in one or more of the physical devices associated with the processor section 12326, or it might be implemented in one or more of the physical devices associated with the memory section 12328.

Figure 123B:
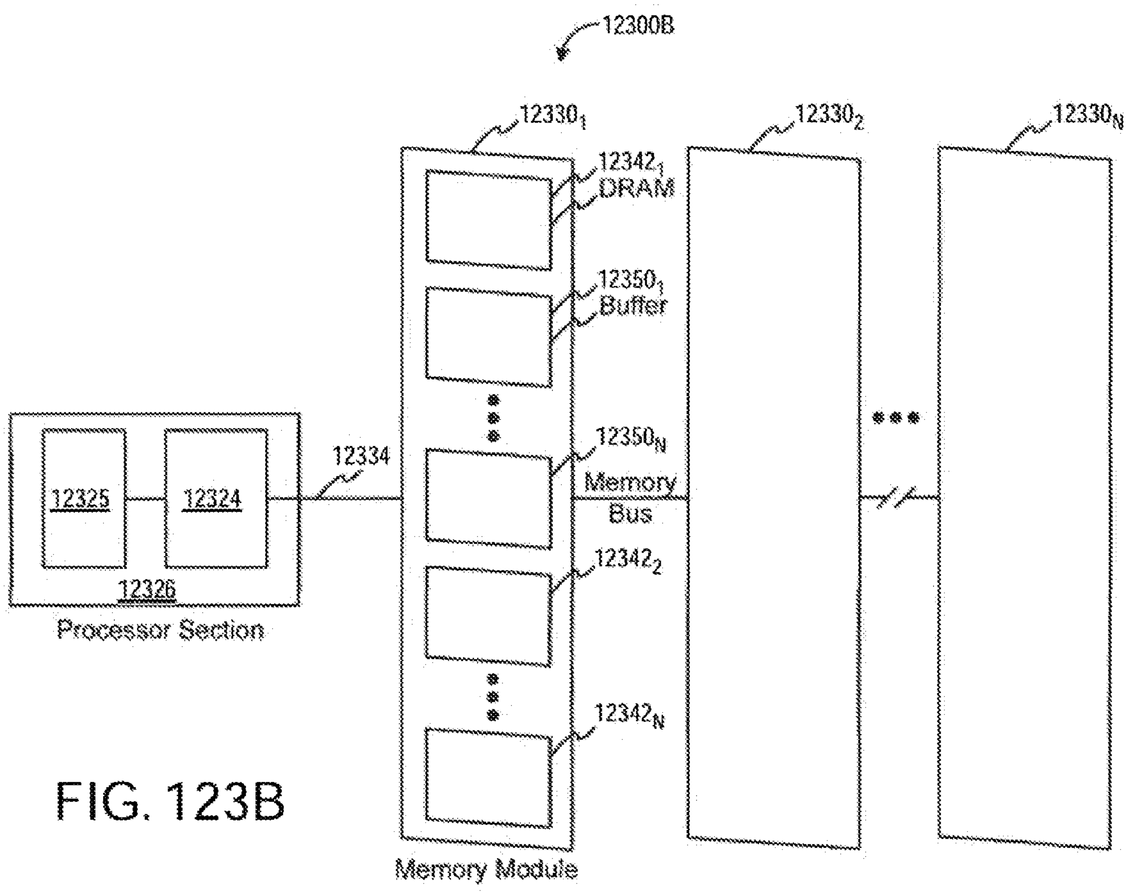
Figure 123C:
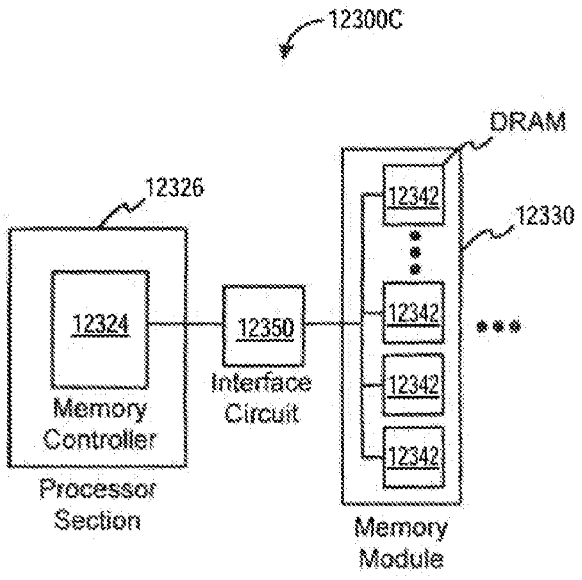
Figure 123D:
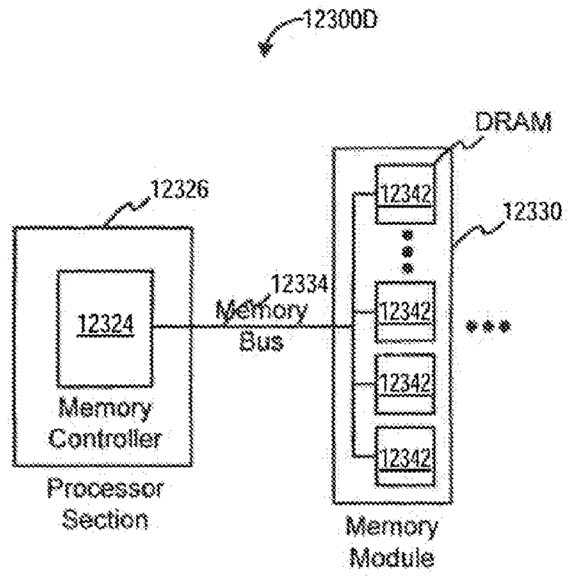
Figure 123E:
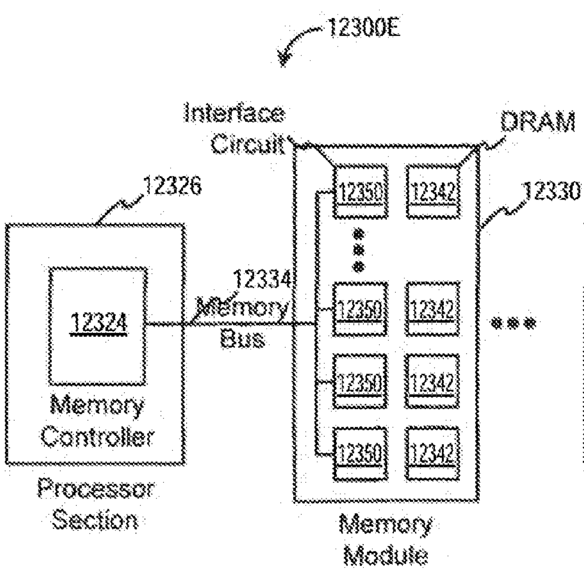

FIG. 123B illustrates one exemplary embodiment of a memory section, such as, for example, the memory section 12328, in communication with a processor section 12326. In particular, FIG. 123B depicts embodiments of the invention as is possible in the context of the various physical partitions on structure 12320. As shown, one or more memory modules 12330 1-12330 N each contain one or more interface circuits 12350 1-12350 N and one or more DRAMs 12342 1-12342 N positioned on (or within) a memory module 12330 1.

It must be emphasized that although the memory is labeled variously in the figures (e.g. memory, memory components, DRAM, etc), the memory may take any form including, but not limited to, DRAM, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory, flash memory, and/or any other type of volatile or non-volatile memory.

Figure 123F:
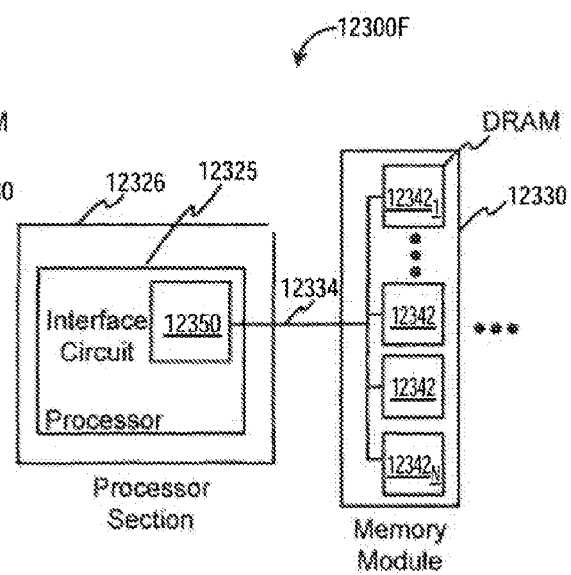

Many other partition boundaries are possible and contemplated, including positioning one or more interface circuits 12350 between a processor section 12326 and a memory module 12330 (see FIG. 123C), or implementing the function of the one or more interface circuits 12350 within the memory controller 12324 (see FIG. 123D), or positioning one or more interface circuits 12350 in a one-to-one relationship with the DRAMs 12342 1-12342 N and a memory module 12330 (see 123E), or implementing the one or more interface circuits 12350 within a processor section 12326 or even within a processor 12325 (see FIG. 123F).

Furthermore, the system 11600 illustrated in FIGS. 116A-116C is analogous to the computer platforms 12300A-12300F as illustrated in FIGS. 123A-123F. The memory controller 11980 illustrated in FIG. 119D is analogous to the memory controller 12324 illustrated in FIGS. 123A-123F, the register/buffer 11982 illustrated in FIG. 119D is analogous to the interface circuits 12350 illustrated in FIGS. 123A-123F, and the memory devices 11984 and 11986 illustrated in FIG. 119D are analogous to the DRAMs 12342 illustrated in FIGS. 123A-123F. Therefore, all discussions of FIGS. 116-4 apply with equal force to the systems illustrated in FIGS. 123A-123F.

Hybrid Memory Module

FIG. 124A shows an abstract and conceptual model of a mixed-technology memory module, according to one embodiment.

The mixed-technology memory module 12400 shown in FIG. 124A has both slow memory and fast memory, with the combination architected so as to appear to a host computer as fast memory using a standard interface. The specific embodiment of the mixed-technology memory module 12400, which will also be referred to as a HybridDIMM 12400, shows both slow, non-volatile memory portion 12404 (e.g. flash memory), and a latency-hiding buffer using fast memory 12406 (e.g. using SRAM, DRAM, or embedded DRAM volatile memory), together with a controller 12408. As shown in FIG. 124A, the combination of the fast and slow memory is presented to a host computer over a host interface 12410 (also referred to herein as a DIMM interface 12410) as a JEDEC-compatible standard DIMM. In one embodiment, the host interface 12410 may communicate data between the mixed-technology memory module 12400 and a memory controller within a host computer. The host interface 12410 may be a standard DDR3 interface, for example. The DDR3 interface provides approximately 8 gigabyte/s read/write bandwidth per DIMM and a 15 nanosecond read latency when a standard DIMM uses standard DDR3 SDRAM. The host interface 12410 may present any other JEDEC-compatible interface, or even, the host interface may present to the host system via a custom interface, and/or using a custom protocol.

The DDR3 host interface is defined by JEDEC as having 12540 pins including data, command, control and clocking pins (as well as power and ground pins). There are two forms of the standard JEDEC DDR3 host interface using compatible 240-pin sockets: one set of pin definitions for registered DIMMs (R-DIMMs) and one set for unbuffered DIMMs (U-DIMMs). There are currently no unused or reserved pins in this JEDEC DDR3 standard. This is a typical situation in high-speed JEDEC standard DDR interfaces and other memory interfaces—that is normally all pins are used for very specific functions with few or no spare pins and very little flexibility in the use of pins. Therefore, it is advantageous and preferable to create a HybridDIMM that does not require any extra pins or signals on the host interface and uses the pins in a standard fashion.

In FIG. 124A, an interface 12405 to the slow memory 12404 may provide read bandwidth of 2-8 gigabyte/s with currently available flash memory chips depending on the exact number and arrangement of the memory chips on the HybridDIMM. Other configurations of the interface 12405 are possible and envisioned by virtue of scaling the width and/or the signaling speed of the interface 12405. However, in general, the slow memory 12404, such as non-volatile memory (e.g. standard NAND flash memory), provides a read latency that is much longer than the read latency of the fast memory 12406, such as DDR3 SDRAM, e.g. 25 microseconds for current flash chips versus 15 nanoseconds for DDR3 SDRAM.

The combination of the fast memory 12406 and the controller 12408, shown as an element 12407 in FIG. 124A, allows the "bad" properties of the slow memory 12404 (e.g. long latency) to be hidden from the memory controller and the host computer. When the memory controller performs an access to the mixed-technology memory module 12400, the memory controller sees the "good" (e.g. low latency) properties of the fast memory 12406. The fast memory 12406 thus acts as a latency-hiding component to buffer the slow memory 12404 and enable the HybridDIMM 12400 to appear as if it were a standard memory module built using only the fast memory 12406 operating on a standard fast memory bus.

FIG. 124B is an exploded hierarchical view of a logical model of the HybridDIMM 12400, according to one embodiment. While FIG. 124A depicts an abstract and conceptual model of the HybridDIMM 12400, FIG. 124B is a specific embodiment of the HybridDIMM 12400. FIG. 124B replaces the simple view of a single block of slow memory (the slow memory 12404 in FIG. 124A) with a number of sub-assemblies or Sub-Stacks 12422 that contain the slow memory (flash memory components 12424). FIG. 124B also replaces the simple view of a single block of fast memory (the fast memory 12406 in FIG. 124A) by SRAM 12444 in a number of Sub-Controllers 12426. Further, the simple view of a single controller (the controller 12408 in FIG. 124A) is replaced now in FIG. 124B by the combination of a Super-Controller 12416 and a number of Sub-Controllers 12426. Of course, the particular HybridDIMM architecture shown in FIG. 124B is just one of many possible implementations of the more general architecture shown in FIG. 124A.

In the embodiment shown in FIG. 124B, the slow memory portion in the Sub-Stack 12422 may use NAND flash, but, in alternative embodiments, could also use NOR flash, or any other relatively slow (relative to DRAM) memory. Also, in the embodiment shown in FIG. 124B, the fast memory in the Sub-Controller 12426 comprises an SRAM 12444, but could be comprised of DRAM, or embedded DRAM, or any other relatively fast (relative to flash) memory etc. Of course it is typical that memory made by use of differing technologies will exhibit different bandwidths and latencies. Accordingly, as a function of the overall architecture of the HybridDIMM 12400, and in particular as a function of the Super-Controller 12416, the differing access properties (including latency and bandwidth) inherent in the use of different memories are managed by logic. In other words, even though there may exist the situation where a one memory word is retrieved from (for example) SRAM, and another memory value retrieved from (for example) flash memory, the memory controller of the host computer (not shown) connected to the interface 12410 is still presented with signaling and protocol as defined for just one of the aforementioned memories. For example, in the case that the memory controller requests a read of two memory words near a page boundary, 8 bits of data may be read from a memory value retrieved from (for example) SRAM 12444, and 8 bits of data may be read from a memory value retrieved from (for example) the flash memory component 12424.

Stated differently, any implementation of the HybridDIMM 12400, may use at least two different memory technologies combined on the same memory module, and, as such, may use the lower latency fast memory as a buffer in order to mask the higher latency slow memory. Of course the foregoing combination is described as occurring on a single memory module, however the combination of a faster memory and a slower memory may be presented on the same bus, regardless of how the two types of memory are situated in the physical implementation.

The abstract model described above uses two types of memory on a single DIMM. Examples of such combinations include using any of DRAM, SRAM, flash, or any volatile or nonvolatile memory in any combination, but such combinations not limited to permutations involving only two memory types. For example, it is also possible to use SRAM, DRAM and flash memory circuits together in combination on a single mixed-technology memory module. In various embodiments, the HybridDIMM 12400 may use on-chip SRAM together with DRAM to form the small but fast memory combined together with slow but large flash memory circuits in combination on a mixed-technology memory module to emulate a large and fast standard memory module.

Continuing into the hierarchy of the HybridDIMM 12400, FIG. 124B shows multiple Super-Stack components 12402 1-12402 *n* (also referred to herein as Super-Stacks 12402). Each Super-Stack 12402 has an interface 12412 that is shown in FIG. 124B as an 8-bit wide interface compatible with DDR3 SDRAMs with ×8 organization, providing 8 bits to the DIMM interface 12410. For example nine 8-bit wide Super-Stacks 12402 may provide the 72 data bits of a DDR3 R-DIMM with ECC. Each Super-Stack 12402 in turn comprises a Super-Controller 12416 and at least one Sub-Stack 12414. Additional Sub-Stacks 12413 1-12413 *n* (also referred to herein as Sub-Stacks 12413) may be optionally disposed within any one or more of the Super-Stack components 12402 1-12402 *n*.

The Sub-Stack 12422 in FIG. 124B, intended to illustrate components of any of the Sub-Stack 12414 or the additional Sub-Stacks 12413, is comprised of a Sub-Controller 12426 and at least one slow memory component, for example a plurality of flash memory components 12424 1-12424 *n* (also referred to herein as flash memory components 12424). Further continuing into the hierarchy of the HybridDIMM 12400, the Sub-Controller 12426 may include fast memory, such as the SRAM 12444, queuing logic 12454, interface logic 12456 and one or more flash controller(s) 12446 which may provide functions such as interface logic 12448, mapping logic 12450, and error-detection and error-correction logic 12452.

In preferred embodiments, the HybridDIMM 12400 contains nine or eighteen Super-Stacks 12402, depending for example, if the HybridDIMM 12400 is populated on one side (using nine Super-Stacks 12402) of the HybridDIMM 12400 or on both sides (using eighteen Super-Stacks 12402). However, depending on the width of the host interface 12410 and the organization of the Super-Stacks 12402 (and, thus, the width of the interface 12412), any number of Super-Stacks 12402 may be used. As mentioned earlier, the Super-Controllers 12416 are in electrical communication with the memory controller of the host computer through the host interface 12410, which is a JEDEC DDR3-compliant interface.

The number and arrangement of Super-Stacks 12402, Super-Controllers 12416, and Sub-Controllers 12426 depends largely on the number of flash memory components 12424. The number of flash memory components 12424 depends largely on the bandwidth and the capacity required of the HybridDIMM 12400. Thus, in order to increase capacity, a larger number and/or larger capacity flash memory components 12424 may be used. In order to increase bandwidth the flash memory components 12424 may be time-interleaved or time-multiplexed, which is one of the functions of the Sub-Controller 12426. If only a small-capacity and low-bandwidth HybridDIMM 12400 is required, then it is possible to reduce the number of Sub-Controllers 12426 to one and merge that function together with the Super-Controller 12416 in a single chip, possibly even merged together with the non-volatile memory. Such a small, low-bandwidth HybridDIMM 12400 may be useful in laptop or desktop computers for example, or in embedded systems. If a large-capacity and high-bandwidth HybridDIMM 12400 is required, then a number of flash memory components 12424 may be connected to one or more of the Sub-Controller 12426 and the Sub-Controllers 12426 connected to the Super-Controller 12416. In order to describe the most general form of HybridDIMM 12400, the descriptions below will focus on the HybridDIMM 12400 with separate Super-Controller 12416 and multiple Sub-Controllers 12426.

FIGS. 125 through 127 illustrate various implementations of the Super-Stack 12402, the Sub-Stack 12422, and the Sub-Controller 12426.

FIG. 125 shows a HybridDIMM Super-Stack 12500 with multiple Sub-Stacks, according to one embodiment. The HybridDIMM Super-Stack 12500 shown in FIG. 125 comprises at least one Sub-Stack 12504 including the slow memory and at least one Super-Controller 12506. The HybridDIMM Super-Stack 12500 shown in FIG. 125 may also comprise optional Sub-Stacks 12502 1-12502 *n* including the slow memory. Interfaces 12510 between the Sub-Stack 12504 (and/or the Sub-Stacks 12502 1-12502 *n*) and the Super-Controller 12506 may be an industry-standard flash-memory interface (e.g. NAND, NOR, etc.) and/or they may be a flash memory interface designed for flash-memory subsystems (e.g. OneNAND, ONFI, etc.). The embodiment shown includes the Super-Controller 12506 that communicates over the interface 12412 (as shown in FIG. 124B) to the memory controller of the host computer, using a standard memory interface (such as DDR3).

The Super-Controller 12506 in FIG. 125 operates to provide error-detection and management of the interfaces 12510 and 12412, as well as management of the Sub-Stack 12504, 12502 1-12502 *n* (also referred to herein as Sub-Stack components 12504, 12502 1-12502 *n*). The Super-Stack interface 12412 appears as if Super-Stack 12500 was a standard memory component. In a preferred embodiment, the interface 12412 conforms to JEDEC ×8 DDR3 standard, however in other embodiments, it could be ×4 or ×16 DDR3, or could be DDR, DDR2, GDDR, GDDR5 etc. In still other embodiments, the interface 12412 could include a serial memory interface such as an FBDIMM interface.

The interfaces 12510 in FIG. 125, between the Super-Controller 12506 and one or more Sub-Stacks 12504, 12502 1-12502 *n*, may be variously configured. Note first that in other embodiments the Super-Controller 12506 may optionally connect directly to one or more flash memory components 12424 illustrated in FIG. 124B (not shown in FIG. 125). In some embodiments that use an optional direct interface to the flash memory components 12424, the protocol of interface 12510 is one of several standard flash protocols (NAND, NOR, OneNAND, ONFI, etc). Additionally, and strictly as an option, in the case that the interface 12510 communicates with Sub-Stacks 12504, 12502 1-12502 *n*, the interface protocol may still be a standard flash protocol, or any other protocol as may be convenient.

With an understanding of the interfaces 12510 and 12412 of the Super-Stack 12500, it follows to disclose some of the various functions of the Super-Stack 12500.

The first internal function of the Super-Controller 12506 is performed by a signaling translation unit 12512 that translates signals (data, clock, command, and control) from a standard (e.g. DDR3) high-speed parallel (or serial in the case of a protocol such as FB-DIMM) memory channel protocol to one or more typically lower speed and possibly different bus-width protocols. The signaling translation unit 12512 may thus also convert between bus widths (FIG. 125 shows a conversion from an m-bit bus to an n-bit bus). The signaling translation unit 12512 converts the command, address, control, clock, and data signals from a standard memory bus to corresponding signals on the sub-stack or flash interface(s). The Super-Controller 12506 may provide some or all (or none) of the logical functions of a standard DRAM interface to the extent it is "pretending" to be a DRAM on the memory bus. Thus in preferred embodiments, the Super-Controller 12506 performs all the required IO characteristics, voltage levels, training, initialization, mode register responses and so on—as described by JEDEC standards. So, for example if the memory interface at 12412 is a standard ×8 DDR3 SDRAM interface then the Super-Controller memory interface as defined by the signaling translation unit 12512 behaves as described by the JEDEC DDR3 DRAM standard.

A second internal function of the Super-Controller 12506 is performed by protocol logic 12516 that converts from one protocol (such as DDR3, corresponding to a fast memory protocol) to another (such as ONFI, corresponding to a slow memory protocol).

A third internal function of the Super-Controller 12506 is performed by MUX/Interleave logic 12514 that provides a MUX/DEMUX and/or memory interleave from a single memory interface to one or more Sub-Stacks 12504, 12502 1-12502 *n*, or alternatively (not shown in FIG. 125) directly to one or more flash memory components 12424. The MUX/Interleave logic 12514 is necessary to match the speed of the slow memory 12404 (flash) to the fast memory 12406 (DRAM).

FIG. 126 shows a Sub-Stack 12602 including a Sub-Controller 12606, according to one embodiment. As shown in FIG. 126, the Sub-Stack 12602 includes the Sub-Controller 12606 and a collection of NAND flash memory components 12608, 12604 1-12604 *n*. The interface 12510 between the Sub-Stack 12602 and the Super-Controller, such as the Super-Controller 12506 or 12416, has already been described in the context of FIG. 125. Interfaces 12610 between the Sub-Controller 12606 and the flash memory components 12608, 12604 1-12604 *n* are standard flash interfaces. The interfaces 12610 are defined by the flash memory components 12608, 12604 1-12604 *n* that are used to build the Sub-Stack 12602.

The flash memory components 12608, 12604 1-12604 *n* are organized into an array or stacked vertically in a package using wire-bonded connections (alternatively through-silicon vias or some other connection technique or technology may be used). The Sub-Stack 12602 shown as an example in FIG. 126 has 8 active flash memory components 12604 1-12604 *n* plus a spare flash memory component 12608, resulting in an array or stack of 9 flash memory components 12608, 12604 1-12604 *n*. The spare flash memory component 12608 is included to increase the yield of the Sub-Stack 12602 during assembly. The capacity of the flash memory in the Sub-Stack 12602 in aggregate (exclusive of any spare capacity) is any arbitrary size (e.g. 8 gigabit, 16 gigabit, 32 gigabit, etc), and prophetic configurations are envisioned to be arbitrarily larger, bounded only by the practical limits of the availability of the flash memory components 12608, 12604 1-12604 *n*. Thus, for example, the total flash capacity on a HybridDIMM with 9 Super-Stacks (eight data and one for ECC) with four Sub-Stacks each containing eight 8-gigabit flash chips would be 32 gigabytes. Of course any known or derivative technology for flash may be used, including SLC, MLC, etc.

FIG. 127 shows the Sub-Controller 12606, according to one embodiment. The Sub-Controller 12606 contains (physically or virtually) as many flash controllers 12706 1-12706 n as there are flash memory components 12608, 12604 1-12604 *n* in the Sub-Stack 12602, the fast memory 12704, plus (optionally) additional components to provide interfacing features and advanced functions. The optional components include Command Queuing logic 12714 and High-Speed Interface logic 12716. The interface 12510 shown in FIG. 127 between the Sub-Controller and Super-Controller has already been described in the context of both FIG. 125 and FIG. 126. The interface 12610 between the flash controllers and the flash chips was described in the context of FIG. 126.

It should be noted that each flash controller 12706 in FIG. 127 may be a single block implementing one or more flash controllers, or it may be a collection of flash controllers, one each dedicated to controlling a corresponding flash memory device.

The High-Speed Interface logic 12716 is configured to convert from a high-speed interface capable of handling the aggregate traffic from all of the flash memory components 12608, 12604 1-12604 *n* in the Sub-Stack 12602 to a lower speed interface used by the flash controllers and each individual flash memory component 12608, 12604 1-12604 *n*.

The Command Queuing logic 12714 is configured to queue, order, interleave and MUX the data from both the fast memory 12704 and array of slow flash memory components 12608, 12604 1-12604 *n*.

Each flash controller 12706 contains an Interface unit 12708, a Mapping unit 12718, as well as ECC (or error correction) unit 12712. The Interface unit 12708 handles the I/O to the flash components in the Sub-Stack 12602, using the correct command, control and data signals with the correct voltage and protocol. The ECC unit 12712 corrects for errors that may occur in the flash memory in addition to other well-known housekeeping functions typically associated with flash memory (such as bad-block management, wear leveling, and so on). It should be noted that one or more of these housekeeping functions associated with the use of various kinds of slow memory such as flash may be performed on the host computer instead of being integrated in the flash controller. The functionality of the Mapping unit 12718 will be described in much more detail shortly and is the key to being able to access, address and handle the slow flash memory and help make it appear to the outside world as fast memory operating on a fast memory bus.

FIG. 128 depicts a cross-sectional view of one possible physical implementation of a 1-high Super-Stack 12802, according to one embodiment. In this embodiment, the Super-Stack 12802 is organized as two vertical stacks of chips. A first vertical stack comprising a Super-Controller 12806 and a Sub-Controller 12808 situated on one end of a multi-chip package (MCP) substrate, and a second vertical Sub-Stack 12804 comprises a plurality of flash memory components. The stacks in FIG. 128 show connections between flash memory components made using wire bonds. This is a typical and well-known assembly technique for stacked chips. Other techniques such as through-silicon vias or other chip-stacking techniques may be used. In addition there is no requirement to stack the Super-Controller 12806 and Sub-Controller 12808 separately from the flash memory components.

FIG. 129A depicts a physical implementation of 2-high Super-Stack 12902, according to one embodiment. This implementation is called “2-high” because it essentially takes the 1-high Super-Stack shown in FIG. 128 and duplicates it. In FIG. 129A, element 12904 comprise the flash chips, element 12908 is a Sub-Controller, and element 12910 is a Super-Controller.

FIG. 129B depicts a physical implementation of 4-high Super-Stack 12952, according to one embodiment. In FIG. 129B, element 12954 comprise the flash chips, element 12958 is a Sub-Controller, and element 12910 is a Super-Controller.

Having described the high-level view and functions of the HybridDIMM 12400 as well as the details of one particular example implementation we can return to FIG. 124A in order to explain the operation of the HybridDIMM 12400. One skilled in the art will recognize that the slow memory 12404 (discussed above in embodiments using non-volatile memory) can be implemented using any type of memory—including SRAM or DRAM or any other type of volatile or nonvolatile memory. In such as case the fast memory 12406 acting as a latency-hiding buffer may emulate a DRAM, in particular a DDR3 SDRAM, and thus present over the host interface 12410 according to any one (or more) standards, such as a JEDEC-compliant (or JEDEC-compatible) DDR3 SDRAM interface.

Now that the concept of emulation as implemented in embodiments of a HybridDIMM has been disclosed, we may now turn to a collection of constituent features, including advanced paging and advanced caching techniques. These techniques are the key to allowing the HybridDIMM 12400 to appear to be a standard DIMM or to emulate a standard DIMM. These techniques use the existing memory management software and hardware of the host computer to enable two important things: first, to allow the computer to address a very large HybridDIMM 12400, and, second, to allow the computer to read and write to the slow memory 12404 indirectly as if the access were to the fast memory 12406. Although the use and programming of the host computer memory management system described here employs one particular technique, the method is general in that any programming and use of the host computer that results in the same behavior is possible. Indeed because the programming of a host computer system is very flexible, one of the most powerful elements of the ideas described here is that it affords a wide range of implementations in both hardware and software. Such flexibility is both useful in itself and allows implementation on a wide range of hardware (different CPUs for example) and a wide range of operating systems (Microsoft Windows, Linux, Solaris, etc.).

In particular, embodiments of this invention include a host-based paging system whereby a paging system allows access to the mixed-technology memory module 12400, a paging system is modified to allow access to the mixed-technology memory module 12400 with different latencies, and modifications to a paging system that permits access to a larger memory space than the paging system would normally allow.

Again considering the fast memory 12406, embodiments of this invention include a caching system whereby the Hybrid DIMM 12400 alters the caching and memory access process.

For example, in one embodiment of the HybridDIMM 12400 the well-known Translation Lookaside Buffer (TLB) and/or Page Table functions can be modified to accommodate a mixed-technology DIMM. In this case an Operating System (OS) of the host computer treats main memory on a module as if it were comprised of two types of memory or two classes of memory (and in general more than one type or class of memory). In our HybridDIMM implementation example, the first memory type corresponds to fast memory or standard DRAM and the second memory type corresponds to slow memory or flash. By including references in the TLB (the references may be variables, pointers or other forms of table entries) to both types of memory different methods (or routines) may be taken according to the reference type. If the TLB reference type shows that the memory access is to fast memory, this indicates that the required data is held in the fast memory (SRAM, DRAM, embedded DRAM, etc.) of the HybridDIMM (the fast memory appears to the host as if it were DRAM). In this case a read command is immediately sent to the HybridDIMM and the data is read from SRAM (as if it were normal DRAM). If the TLB shows that the memory access is to slow memory, this indicates that the required data is held in the slow memory (flash etc.) of the HybridDIMM. In this case a copy command is immediately sent to the HybridDIMM and the data is copied from flash (slow memory) to SRAM (fast memory). The translation between host address and HybridDIMM address is performed by the combination of the normal operation of the host memory management and the mapper logic function on the HybridDIMM using well-known and existing techniques. The host then waits for the copy to complete and issues a read command to the HybridDIMM and the copied data is read from SRAM (again now as if it were normal DRAM).

Having explained the general approach, various embodiments of such techniques, methods (or routines) are presented in further detail below. In order to offer consistency in usage of terms, definitions are provided here, as follows:

va—virtual address that caused the page fault sp—SRAM page selected in Step 1 pa—a physical address

Page Table and Mapper requirements:

PageTable[va]==pa

Mapper[pa]==sp

Hence: Mapper[PageTable[va]]=sp

How do we select a physical address "pa"?

Must not already map to an active SRAM location

Must map to the BigDIMM that contains the "sp"

The caches must not contain stale data with "pa" physical tags

No processor in the coherence domain must contain a stale TLB entry for "va"

FIGS. 130 through 132 illustrate interactions between the OS of the host computer and the mixed-technology memory module 12400 from the perspective of the OS. Although the method steps of FIGS. 130-132 are described with respect to the memory management portion of the computer OS, any elements or combination of elements within the OS and/or computer configured to perform the method steps, in any order, falls within the scope of the present invention.

FIG. 130 shows a method 13000 for returning data resident on the HybridDIMM to the memory controller. As an option, the present method 13000 may be implemented in the context of the architecture and functionality of FIG. 124 through FIG. 129. Of course, however, the method 13000 or any operation therein may be carried out in any desired environment.

The method 13000 as described herein may be entered as a result of a request from the memory controller for some data resident on a HybridDIMM. The operation underlying decision 13002 may find the data is "Present" on the HybridDIMM (it is standard and well-known that an OS uses the terms "Present" and "Not Present" in its page tables). The term "Present" means that the data is being held in the fast memory on a HybridDIMM. To the OS it is as if the data is being held in standard DRAM memory, though the actual fast memory on the HybridDIMM may be SRAM, DRAM, embedded DRAM, etc. as we have already described. In the example here we shall use fast memory and SRAM interchangeably and we shall use slow memory and flash memory interchangeably. If the data is present then the BigDIMM returns the requested data as in a normal read operation (operation 13012) to satisfy the request from the memory controller. Alternatively, if the requested data is "Not Present" in fast memory, the OS must then retrieve the data from slow memory. Of course retrieval from slow memory may include various housekeeping and management (as already has been described for flash memory, for example). More specifically, in the case that the requested data is not present in fast memory, the OS allocates a free page of fast memory (operation 13004) to serve as a repository, and possibly a latency-hiding buffer for the page containing the requested data. Once the OS allocates a page of fast memory, the OS then copies at least one page of memory from slow memory to fast memory (operation 13006). The OS records the success of the operation 13006 in the page table (see operation 13008). The OS then records the range of addresses now present in fast memory in the mapper (see operation 13010). Now that the initially requested data is present in fast memory, the OS restarts the initially memory access operation from the point of decision 13002.

To make the operations required even more clear the following pseudo-code describes the steps to be taken in an alternative but equivalent fashion:

```
A. If Data is "Present" (e.g. present in memory type DRAM) in the
HybridDIMM:
    The HybridDIMM SRAM behaves the same as standard DRAM
B. Data "Not Present" (e.g. present in memory type Flash)-there is a
HybridDIMM Page Fault:
    1. Get free SRAM page
    2. Copy flash page to SRAM page
    3. Update Page Table and/or TLB
    4. Update Mapper
    5. Restart Read/Write (Load/Store)
```

We will describe the steps taken in method or code branch B above in more detail presently. First, we must describe the solution to a problem that arises in addressing or accessing the large HybridDIMM. In order to access the large memory space that is made possible by using a HybridDIMM (which may be as much as several terabytes), the host OS may also modify the use of well-known page-table structures. Thus for example, a 256 terabyte virtual address space (a typical limit for current CPUs because of address-length limitations) may be mapped to pages of a HybridDIMM using the combination of an OS page table and a mapper on the HybridDIMM. The OS page table may map the HybridDIMM pages in groups of 8. Thus entries in the OS page table correspond to HybridDIMM pages (or frames) 0-7, 8-15, 16-23 etc. Each entry in the OS page table points to a 32 kilobyte page (or frame), that is either in SRAM or in flash on the HybridDIMM. The mapping to the HybridDIMM space is then performed through a 32 GB aperture (a typical limit for current memory controllers that may only address 32 GB per DIMM). In this case a 128-megabyte SRAM on the HybridDIMM contains 4096 pages that are each 32 kilobyte in size. A 2-terabyte flash memory (using 8-, 16-, or 32-gigabit flash memory chips) on the HybridDIMM also contains pages that are 32 kilobyte (made up from 8 flash chips with 4 kilobyte per flash chip).

The technique of using an aperture, mapper, and table in combination is well-known and similar to, for example, Accelerated Graphics Port (AGP) graphics applications using an AGP Aperture and a Graphics Address Relocation Table (GART).

Now the first four steps of method or code branch B above will be described in more detail, first using pseudo-code and then using a flow diagram and accompanying descriptions:

```
Step 1 - Get a free SRAM page
Get free SRAM page( )
    if SRAM page free list is empty( ) then
            Free an SRAM page;
    Pop top element from SRAM page free list
Free an SRAM page:
    sp = next SRAM page to free; // depending on
    chosen replacement policy
    if sp is dirty then
    foreach cache line CL in sp do // ensure
    SRAM contains last written data; // could instead also set caches
to write-through
        CLFlush(CL); //<10 µs per 32 KB
    fp = Get free flash page; // wear leveling, etc. is perfomed here
    Send SRAM2flashCpy(sp, fp) command to DIMM;
    Wait until copy completes;
else
    fp = flash address that sp maps to;
```

-continued

```
Page Table [virtual address(sp)] = "not present", fp;
// In MP environment must handle multiple TLBs using additional
code here
Mapper[sp] = "unmapped"
Push sp on SRAM page free list
Step 2 - Copy flash page to SRAM
Copy flash page to SRAM page:
Send flash2SRAMCpy(sp, fp) command to DIMM;
Wait until copy completes;
Step 3 - Update Page Table
Update Page Table:
// Use a bit-vector and rotate through the vector-cycling from 0 GB up to
the 32 GB
aperture and then roll around to 0 GB, re-using
physical addresses
pa = next unused physical page;
if (pa == 0) then
WBINVD; // we have rolled around so flush and invalidate the entire
cache
PageTable[va] = pa;
```

Now we shall describe the key elements of these steps in the pseudo-code above using flow diagrams and accompanying descriptions.

FIG. 131A shows a method 13100 for the OS to obtain a free page of fast memory ("Get free SRAM page" in the above pseudo-code). Remember we are using fast memory and SRAM interchangeably for this particular example implementation. As an option, the present method 13100 may be implemented in the context of the architecture and functionality of FIG. 124 through FIG. 130. Of course, however, the method 13100 or any operation therein may be carried out in any desired environment.

The operation 13004 from FIG. 130 indicates an operation for the OS to get a page of fast memory. Although many embodiments are possible and conceived, one such operation is disclosed here, namely the method 13100. That is, the method 13100 is entered at entry point 13102 whenever a new page of fast memory is needed. The decision 13104 checks for a ready and available page from the page free stack. If there is such an available page, the OS pops that page from the page free stack and returns it in operation 13110. Alternatively, if the free stack is empty then the decision 13104 will proceed to operation 13106. Operation 13106 serves to acquire a free fast memory page, whether acquired from a pool or reused resources or whether from a newly allocated page. Once acquired then, the OS pushes the pointer to that page onto the page free stack and the processing proceeds to operation 13110, returning the free fast memory page as is the intended result to the method 13100.

FIG. 131B shows a method 13150 for the OS to free a page of fast memory ("Free an SRAM page" in the above pseudo-code). As an option, the present method 13150 may be implemented in the context of the architecture and functionality of FIG. 124 through FIG. 131A. Of course, however, the method 13150 or any operation therein may be carried out in any desired environment.

The operation 13106 from FIG. 131A indicates an operation for the OS to free a page of fast memory. Although many embodiments are possible and conceived, one embodiment of such an operation is disclosed here, namely the method 13150. That is, the method 13150 is operable to free a page of fast memory, while maintaining the fidelity of any data that may had previously been written to the page.

As shown, the system is entered when a page of fast memory is required. In general, a free fast memory page could be a page that had previously been allocated, used and subsequently freed, or may be a page that has been allocated and is in use at the moment that the method 13150 is executed. The decision 13156 operates on a pointer pointing to the next fast memory page to free (from operation 13154) to determine if the page is immediately ready to be freed (and re-used) or if the page is in use and contains data that must be retained in slow memory (a "dirty" page). In the latter case, a sequence of operations may be performed in the order shown such that data integrity is maintained. That is, for each cache line CL (operation 13158), the OS flushes the cache line (operation 13160), the OS assigns a working pointer FP to point to a free slow memory page (see operation 13162), the OS writes the 'Dirty' fast memory page to slow memory (operation 13164), and the loop continues once the operation 13164 completes.

In the alternative (see decision 13156), if the page is immediately ready to be freed (and re-used), then the OS assigns the working pointer FP to point to a slow memory address that SP maps to (operation 13168). Of course since the corresponding page will now be reused for cache storage of new data, the page table must be updated accordingly to reflect that the previously cached address range is (or will soon be) no longer available in cache (operation 13170). Similarly, the OS records the status indicating that address range is (or will soon be) not mapped (see operation 13172). Now, the page of fast memory is free, the data previously cached in that page (if any) has been written to slow memory, and the mapping status has been marked; thus the method 13150 pushes the pointer to the page of fast memory onto the page free stack.

FIG. 132 shows a method 13200 copying a page of slow memory to a page of fast memory. As an option, the present method 13200 may be implemented in the context of the architecture and functionality of FIG. 124 through FIG. 131B. Of course, however, the method 13200 or any operation therein may be carried out in any desired environment.

The operation 13006 from FIG. 130 indicates an operation to copy page of slow memory to a page of fast memory. In the embodiment shown, the OS is operable to not only perform the actually copy, but also to perform bookkeeping and synchronization. In particular, after the actual copy is performed (operation 13204) the OS sends the fact that this copy has been performed to the HybridDIMM (operation 13206) and the method 13200 waits (operation 13208) until completion of operation 13206 is signaled.

These methods and steps are described in detail only to illustrate one possible approach to constructing a host OS and memory subsystem that uses mixed-technology memory modules.

Flash Memory Emulation

Flash Interface Circuit

FIG. 133 shows a block diagram of several flash memory devices 13304A-13304N connected to a system 13306 by way of a flash interface circuit 13302. The system 13306 may include a flash memory controller 13308 configured to interface to flash memory devices. The flash interface circuit 13302 is a device which exposes multiple flash memory devices attached to the flash interface circuit 13302 as at least one flash memory device to the rest of the system (e.g. the flash memory controller). The flash memory device(s) exposed to the rest of the system may be referred to as virtual flash memory device(s). One or more attributes of the virtual flash memory device(s) may differ from the attributes of the flash memory devices 13304A-13340N. Thus, the flash memory controller 13308 may interface to the flash interface circuit 13302 as if the flash interface circuit 13302 were the virtual flash device(s). Internally, the flash interface circuit 13302 translates a request from the system 13306 into requests to flash memory devices 13304A-13304N and responses from flash memory devices 13304A-13304N into a response to the system 13306. During discovery of flash configuration by the system 13306, the flash interface circuit 13302 presents modified information to the system 13306. That is, the information presented by the flash interface circuit 13302 during discovery differs in one or more aspects from the information that the flash memory devices 13304A-13304N would present during discovery.

FIG. 133 shows a block diagram of, for example, one or more small flash memory devices 13304A-13304N connected to a flash interface circuit 13302. Also shown are exemplary connections of data bus & control signals between flash memory devices 13304A-13304N and a flash interface circuit 13302. Also shown are exemplary data bus & control signals between the flash interface circuit 13302 and a host system 13306. In general, one more signals of the interface (address, data, and control) to the flash memory devices 13304A-13304N may be coupled to the flash interface circuit 13302 and zero or more signals of the interface to the flash memory devices 13304A-13304N may be coupled to the system 13306. In various embodiments, the flash interface circuit 13302 may be coupled to all of the interface or a subset of the signals forming the interface. In FIG. 133, the flash interface circuit 13302 is coupled to L signals (where L is an integer greater than zero) and the system 13306 is coupled to M signals (where M is an integer greater than or equal to zero). Similarly, the flash interface circuit 13302 is coupled to S signals to the system 13306 in FIG. 133 (where S is an integer greater than zero).

In one embodiment, the flash interface circuit 13302 may expose a number of attached flash memory devices 13304A-13304N as a smaller number of flash memory devices having a larger storage capacity. For example, the flash interface circuit may expose 1, 2, 4, or 8 attached flash memory devices 13304A-13304N to the host system as 1, 2 or 4 flash memory devices. Embodiments are contemplated in which the same number of flash devices are attached and presented to the host system, or in which fewer flash devices are presented to the host system than are actually attached. Any number of devices may be attached and any number of devices may be presented to the host system by presentation to the system in a manner that differs in at least one respect from the presentation to the system that would occur in the absence of the flash interface circuit 13302.

For example, the flash interface circuit 13302 may provide vendor-specific protocol translation between attached flash memory devices and may present itself to host as a different type of flash, or a different configuration, or as a different vendor's flash device. In other embodiments, the flash interface circuit 13302 may present a virtual configuration to the host system emulating one or more of the following attributes: a desired (smaller or larger) page size, a desired (wider or narrower) bus width, a desired (smaller or larger) block size, a desired redundant storage area (e.g. 16 bytes per 512 bytes), a desired plane size (e.g. 2 Gigabytes), a desired (faster) access time with slower attached devices, a desired cache size, a desired interleave configuration, auto configuration, and open NAND flash interface (ONFI).

Throughout this disclosure, the flash interface circuit may alternatively be termed a "flash interface circuit", or a "flash interface device". Throughout this disclosure, the flash memory chips may alternatively be termed "memory circuits", or a "memory device", or as "flash memory device", or as "flash memory".

FIG. 134 shows another embodiment with possible exemplary connections between the host system 13404, the flash interface circuit 13402 and the flash memory devices 13406A-13406D. In this example, all signals from the host system are received by the flash interface circuit before presentation to the flash memory devices. And all signals from the flash memory devices are received by the flash interface circuit before being presented to the host system 13404. For example, address, control, and clock signals 13408 and data signals 13410 are shown in FIG. 134. The control signals may include a variety of controls in different embodiments. For example, the control signals may include chip select signals, status signals, reset signals, busy signals, etc.

For the remainder of this disclosure, the flash interface circuit will be referred to. The flash interface circuit may be, in various embodiments, the flash interface circuit 13302, the flash interface circuit 13402, or other flash interface circuit embodiments (e.g. embodiments shown in FIGS. 135-6). Similarly, references to the system or the host system may be, in various embodiments, the host system 13306, the host system 13404, or other embodiments of the host system. The flash memory devices may be, in various embodiments, the flash memory devices 13304A-13304N, the flash memory devices 13406A-13406D, or other embodiments of flash memory devices.

Relocating Bad Blocks

A flash memory is typically divided into sub-units, portions, or blocks. The flash interface circuit can be used to manage relocation of one or more bad blocks in a flash memory device transparently to the system and applications. Some systems and applications may not be designed to deal with bad blocks since the error rates in single level NAND flash memory devices were typically small. This situation has, however, changed with multi-level NAND devices where error rates are considerably increased. In one embodiment the flash interface circuit may detect the existence of a bad block by means of monitoring the error-correction and error-detection circuits. The error-correction and error-detection circuits may signal the flash interface circuit when errors are detected or corrected. The flash interface circuit may keep a count or counts of these errors. As an example, a threshold for the number of errors detected or corrected may be set. When the threshold is exceeded the flash interface circuit may consider certain region or regions of a flash memory as a bad block. In this case the flash memory may keep a translation table that is capable of translating a logical block location or number to a physical location or number. In some embodiments the flash interface circuit may keep a temporary copy of some or all of the translation tables on the flash memories. When a block is accessed by the system, the combination of the flash interface circuit and flash memory together with the translation tables may act to ensure that the physical memory location that is accessed is not in a bad block.

The error correction and/or error detection circuitry may be located in the host system, for example in a flash memory controller or other hardware. Alternatively, the error correction and/or error detection circuitry may be located in the flash interface circuit or in the flash memory devices themselves.

Increased ECC Protection

A flash memory controller is typically capable of performing error detection and correction by means of error-detection and correction codes. A type of code suitable for this purpose is an error-correcting code (ECC). Implementations of ECC may be found in Multi-Level Cell (MLC) devices, in Single-Level Cell (SLC) devices, or in any other flash memory devices.

In one embodiment, the flash interface circuit can itself generate and check the ECC instead of or in combination with, the flash memory controller. Moving some or all of the ECC functionality into a flash interface circuit enables the use of MLC flash memory devices in applications designed for the lower error rate of a SLC flash memory devices.

Flash Driver

A flash driver is typically a piece of software that resides in host memory and acts as a device driver for flash memory. A flash driver makes the flash memory appear to the host system as a read/write memory array. The flash driver supports basic file system functions (e.g. read, write, file open, file close etc.) and directory operation (e.g. create, open, close, copy etc.). The flash driver may also support a security protocol.

In one embodiment, the flash interface circuit can perform the functions of the flash driver (or a subset of the functions) instead of, or in combination with, the flash memory controller. Moving some or all of the flash driver functionality into a flash interface circuit enables the use of standard flash devices that do not have integrated flash driver capability and/or standard flash memory controllers that do not have integrated flash driver capability. Integrating the flash driver into the flash interface circuit may thus be more cost-effective.

Garbage Collection

Garbage collection is a term used in system design to refer to the process of using and then collecting, reclaiming, and reusing those areas of host memory. Flash file blocks may be marked as garbage so that they can be reclaimed and reused. Garbage collection in flash memory is the process of erasing these garbage blocks so that they may be reused. Garbage collection may be performed, for example, when the system is idle or after a read/write operation. Garbage collection may be, and generally is, performed as a software operation.

In one embodiment, the flash interface circuit can perform garbage collection instead of, or in combination with, the flash memory controller. Moving some or all of the garbage collection functionality into a flash interface circuit enables the use of standard flash devices that do not have integrated garbage collection capability and/or standard flash memory controllers that do not have integrated garbage collection capability. Integrating the garbage collection into the flash interface circuit may thus be more cost-effective.

Wear Leveling

The term leveling, and in particular the term wear leveling, refers to the process to spread read and write operations evenly across a memory system in order to avoid using one or more areas of memory heavily and thus run the risk of wearing out these areas of memory. A NAND flash often implements wear leveling to increase the write lifetime of a flash file system. To perform wear leveling, files may be moved in the flash device in order to ensure that all flash blocks are utilized relatively evenly. Wear leveling may be performed, for example, during garbage collection. Wear leveling may be, and generally is, performed as a software operation.

In one embodiment, the flash interface circuit can perform wear leveling instead of, or in combination with, the flash memory controller. Moving some or all of the wear leveling functionality into a flash interface circuit enables the use of standard flash devices that do not have integrated wear leveling capability and/or standard flash memory controllers that do not have integrated wear leveling capability. Integrating the wear leveling into the flash interface circuit may thus be more cost-effective.

Increasing Erase and Modify Bandwidth

Typically, flash memory has a low bandwidth (e.g. for read, erase and write operations, etc.) and high latency (e.g. for read and write operations) that are limits to system performance. One limitation to performance is the time required to erase the flash memory cells. Prior to writing new data into the flash memory cells, those cells are erased. Thus, writes are often delayed by the time consumed to erase data in the flash memory cells to be written.

In a first embodiment that improves erase performance, logic circuits in the flash interface circuit may perform a pre-erase operation (e.g. advanced scheduling of erase operations, etc.). The pre-erase operation may erase unused data in one or more blocks. Thus when a future write operation is requested the block is already pre-erased and associated time delay is avoided.

In a second embodiment that improves erase performance, data need not be pre-erased. In this case performance may still be improved by accepting transactions to a portion or portion(s) of the flash memory while erase operations of the portion or portion(s) is still in progress or even not yet started. The flash interface circuit may respond to the system that an erase operation of these portion(s) has been completed, despite the fact that it has not. Writes into these portion(s) may be buffered by the flash interface circuit and written to the portion(s) once the erase is completed.

Reducing Read Latency by Prefetching

In an embodiment that reduces read latency, logic circuits in the flash interface circuit may perform a prefetching operation. The flash interface circuit may read data from the flash memory ahead of a request by the system. Various prefetch algorithms may be applied to predict or anticipate system read requests including, but not limited to, sequential, stride based prefetch, or non-sequential prefetch algorithms. The prefetch algorithms may be based on observations of actual requests from the system, for example.

The flash interface circuit may store the prefetched data read from the flash memory devices in response to the prefetch operations. If a subsequent read request from the system is received, and the read request is for the prefetched data, the prefetched data may be returned by the flash interface circuit to the system without accessing the flash memory devices. In one embodiment, if the subsequent read request is received while the prefetch operation is outstanding, the flash interface circuit may provide the read data upon completion of the prefetch operation. In either case, read latency may be decreased.

Increasing Write Bandwidth

In an embodiment that improves write bandwidth, one or more flash memory devices may be connected to a flash interface circuit. The flash interface circuit may hold (e.g. buffer etc.) write requests in internal SRAM and write them into the multiple flash memory chips in an interleaved fashion (e.g. alternating etc.) thus increasing write bandwidth. The flash interface circuit may thus present itself to system as a monolithic flash memory with increased write bandwidth performance.

Increasing Bus Bandwidth

The flash memory interface protocol typically supports either an 8-bit or 16-bit bus. For an identical bus frequency of operation, a flash memory with a 16-bit bus may deliver up to twice as much bus bandwidth as a flash memory with an 8-bit bus. In an embodiment that improves the data bus bandwidth, the flash interface circuit may be connected to one or more flash memory devices. In this embodiment, the flash interface circuit may interleave one or more data busses. For example, the flash interface circuit may interleave two 8-bit busses to create a 16-bit bus using one 8-bit bus from each of two flash memory devices. Data is alternately written or read from each 8-bit bus in a time-interleaved fashion. The interleaving allows the flash interface circuit to present the two flash memories to the system as a 16-bit flash memory with up to twice the bus bandwidth of the flash memory devices connected to the flash interface circuit. In another embodiment, the flash interface circuit may use the data buses of the flash memory devices as a parallel data bus. For example, the address and control interface to the flash memory devices may be shared, and thus the same operation is presented to each flash memory device concurrently. The flash memory device may source or sink data on its portion of the parallel data bus. In either case, the effective data bus width may be N times the width of one flash memory device, where N is a positive integer equal to the number of flash memory devices.

Cross-Vendor Compatibility

The existing flash memory devices from different vendors may use similar, but not identical, interface protocols. These different protocols may or may not be compatible with each other. The protocols may be so different that it is difficult or impossible to design a flash memory controller that is capable of controlling all possible combinations of protocols. Therefore system designers must often design a flash memory controller to support a subset of all possible protocols, and thus a subset of flash memory vendors. The designers may thus lock themselves into a subset of available flash memory vendors, reducing choice and possibly resulting in a higher price that they must pay for flash memory.

In one embodiment that provides cross-vendor compatibility, the flash interface circuit may contain logic circuits that may translate between the different protocols that are in use by various flash memory vendors. In such an embodiment, the flash interface circuit may simulate a flash memory with a first protocol using one or more flash memory chips with a second protocol. The configuration of the type (e.g. version etc.) of protocol may be selected by the vendor or user (e.g. by using a bond-out option, fuses, e-fuses, etc.). Accordingly, the flash memory controller may be designed to support a specific protocol and that protocol may be selected in the flash interface circuit, independent of the protocol(s) implemented by the flash memory devices.

Protocol Translation

NAND flash memory devices use a certain NAND-flash-specific interface protocol. NOR flash memory devices use a different, NOR-flash-specific protocol. These different NAND and NOR protocols may not and generally are not compatible with each other. The protocols may be so different that it is difficult or impossible to design a flash memory controller that is capable of controlling both NAND and NOR protocols.

In one embodiment that provides compatibility with NOR flash, the flash interface circuit may contain logic circuits that may translate between the NAND protocols that are in use by the flash memory and a NOR protocol that interfaces to a host system or CPU.

Similarly, an embodiment that provides compatibility with NAND flash may include a flash interface circuit that contains logic circuits to translate between the NOR protocols used by the flash memory and a NAND protocol that interfaces to a host system or CPU.

Backward Compatibility Using Flash Memory Device Stacking

As new flash memory devices become available, it is often desirable or required to maintain pin interface compatibility with older generations of the flash memory device. For example a product may be designed to accommodate a certain capacity of flash memory that has an associated pin interface. It may then be required to produce a second generation of this product with a larger capacity of flash memory and yet keep as much of the design unchanged as possible. It may thus be desirable to present a common pin interface to a system that is compatible with multiple generations (e.g. successively larger capacity, etc.) of flash memory.

FIG. 135 shows one embodiment that provides such backward compatibility, the flash interface circuit 13510 may be connected by electrical conductors 13530 to multiple flash memory devices 13520 in a package 13500 having an array of pins 13540 with a pin interface (e.g. pinout, array of pins, etc.) that is the same as an existing flash memory chip (e.g. standard pinout, JEDEC pinout, etc.). In this manner the flash interface circuit enables the replacement of flash memory devices in existing designs with a flash memory device that may have higher capacity, higher performance, lower cost, etc. The package 13500 may also optionally include voltage conversion resistors or other voltage conversion circuitry to supply voltages for electrical interfaces of the flash interface circuit, if supply voltages of the flash devices differ from those of the flash interface circuit.

The pin interface implemented by pins 13540, in one exemplary embodiment, may include a ×8 input/output bus, a command latch enable, an address latch enable, one or more chip enables (e.g. 4), read and write enables, a write protect, one or more ready/busy outputs (e.g. 4), and power and ground connections. Other embodiments may have any other interface. The internal interface on conductors 13530 may differ (e.g. a ×16 interface), auto configuration controls, different numbers of chip enables and ready/busy outputs (e.g. 8), etc. Other interface signals may be similar (e.g. command and address latch enables, read and write enables, write protect, and power/ground connections).

In general, the stacked configuration shown in FIG. 135 may be used in any of the embodiments described herein.

Transparently Enabling Higher Capacity

In several of the embodiments that have been described above the flash interface circuit is used to simulate to the system the appearance of a first one (or more) flash memories from a second one (or more) flash memories that are connected to the flash interface circuit. The first one or more flash memories are said to be virtual. The second one or more flash memories are said to be physical. In such embodiments at least one aspect of the virtual flash memory may be different from the physical memory.

Typically, a flash memory controller obtains certain parameters, metrics, and other such similar information from the flash memory. Such information may include, for example, the capacity of the flash memory. Other examples of such parameters may include type of flash memory, vendor identification, model identification, modes of operation, system interface information, flash geometry information, timing parameters, voltage parameters, or other parameters that may be defined, for example, by the Common Flash Interface (CFI), available at the INTEL website, or other standard or non-standard flash interfaces. In several of the embodiments described, the flash interface circuit may translate between parameters of the virtual and physical devices. For example, the flash interface circuit may be connected to one or more physical flash memory devices of a first capacity. The flash interface circuit acts to simulate a virtual flash memory of a second capacity. The flash interface circuit may be capable of querying the attached one or more physical flash memories to obtain parameters, for example their capacities. The flash interface circuit may then compute the sum capacity of the attached flash memories and present a total capacity (which may or may not be the same as the sum capacity) in an appropriate form to the system. The flash interface circuit may contain logic circuits that translate requests from the system to requests and signals that may be directed to the one or more flash memories attached to flash interface circuit.

In another embodiment, the flash interface circuit transparently presents a higher capacity memory to the system. FIG. 135 shows a top view of a portion of one embodiment of a stacked package assembly 13500. In the embodiment shown in FIG. 135, stacking the flash memory devices on top of a flash interface circuit results in a package with a very small volume. Various embodiments may be tested and burned in before assembly. The package may be manufactured using existing assembly infrastructure, tested in advance of stack assembly and require significantly less raw material, in some embodiments. Other embodiments may include a radial configuration, rather than a stack, or any other desired assembly.

In the embodiment shown in FIG. 135, the electrical connections between flash memory devices and the flash interface circuit are generally around the edge of the physical perimeter of the devices. In alternative embodiments the connections may be made through the devices, using through-wafer interconnect (TWI), for example. Other mechanisms for electrical connections are easily envisioned, Integrated Flash Interface Circuit with One or More Flash Devices In another embodiment, the flash interface circuit may be integrated with one or more flash devices onto a single monolithic semiconductor die. FIG. 136 shows a view of a die 13600 including one or more flash memory circuits 13610 and one or more flash interface circuits 13620.

Flash Interface Circuit with Configuration and Translation

In the embodiment shown in FIG. 137, flash interface circuit 13700 includes an electrical interface to the host system 13701, an electrical interface to the flash memory device(s) 13702, configuration logic 13703, a configuration block 13704, a read-only memory (ROM) block 13705, a flash discovery block 13706, discovery logic 13707, an address translation unit 13708, and a unit for translations other than address translations 13709. The electrical interface to the flash memory devices(s) 13702 is coupled to the address translation unit 13708, the other translations unit 13709, and the L signals to the flash memory devices (e.g. as illustrated in FIG. 133). That is, the electrical interface 13702 comprises the circuitry to drive and/or receive signals to/from the flash memory devices. The electrical interface to the host system 13701 is coupled to the other translations unit 13709, the address translation unit 13708, and the signals to the host interface (S in FIG. 137). That is, the electrical interface 13701 comprises the circuitry to drive and/or receive signals to/from the host system. The discovery logic 13707 is coupled to the configuration logic 13703, and one or both of logic 13707 and 13703 is coupled to the other translations unit 13709 and the address translation unit 13708. The flash discovery block 13706 is coupled to the discovery logic 13707, and the configuration block 13704 and the ROM block 13705 are coupled to the configuration logic 13703. Generally, the logic 13703 and 13707 and the translation units 13708 and 13709 may be implemented in any desired fashion (combinatorial logic circuitry, pipelined circuitry, processor-based software, state machines, various other circuitry, and/or any combination of the foregoing). The blocks 13704, 13706, and 13708 may comprise any storage circuitry (e.g. register files, random access memory, etc.).

The translation units 13708 and 13709 may translate host flash memory access and configuration requests into requests to one or more flash memory devices, and may translate flash memory replies to host system replies if needed. That is, the translation units 13708 and 13709 may be configured to modify requests provided from the host system based on differences between the virtual configuration presented by the interface circuit 13700 to the host system and the physical configuration of the flash memory devices, as determined by the discovery logic 13707 and/or the configuration logic 13703 and stored in the configuration block 13704 and/or the discovery block 13706. The configuration block 13704, the ROM block 13705, and/or the flash discovery block 13706 may store data identifying the physical and virtual configurations.

There are many techniques for determining the physical configuration, and various embodiments may implement one or more of the techniques. For example, configuration using a discovery process implemented by the discovery logic 13707 is one technique. In one embodiment, the discovery (or auto configuration) technique may be selected using an auto configuration signal mentioned previously (e.g. strapping the signal to an active level, either high or low). Fixed configuration information may be programmed into the ROM block 13705, in another technique. The selection of this technique may be implemented by strapping the auto configuration signal to an inactive level.

In one implementation, the configuration block (CB) 13704 stores the virtual configuration. The configuration may be set during the discovery process, or may be loaded from ROM block 13705. Thus, the ROM block 13705 may store configuration data for the flash memory devices and/or configuration data for the virtual configuration.

The flash discovery block (FB) 13506 may store configuration data discovered from attached flash memory devices. In one embodiment, if some information is not discoverable from attached flash memory devices, that information may be copied from ROM block 13705.

The configuration block 13704, the ROM block 13705, and the discovery block 13706 may store configuration data in any desired format and may include any desired configuration data, in various embodiments. Exemplary configurations of the configuration block 13704, the ROM block 13705, and the discovery block 13706 are illustrated in FIGS. 139, 140, and 141, respectively.

FIG. 139 is a table 13900 illustrating one embodiment of configuration data stored in one embodiment of a configuration block 13704. The configuration block 13704 may comprise one or more instances of the configuration data in table 13900 for various attached flash devices and for the virtual configuration. In the embodiment of FIG. 139, the configuration data comprises 8 bytes of attributes, labeled 0 to 7 in FIG. 139 and having various bit fields as shown in FIG. 139.

Byte zero includes an auto discover bit (AUTO), indicating whether or not auto discovery is used to identify the configuration data; an ONFI bit indicating if ONFI is supported; and a chips field (CHIPS) indicating how many chip selects are exposed (automatic, 1, 2, or 4 in this embodiment, although other variations are contemplated). Byte one is a code indicate the manufacturer (maker) of the device (or the maker reported to the host); and byte two is a device code identifying the particular device from that manufacturer.

Byte three includes a chip number field (CIPN) indicating the number of chips that are internal to flash memory system (e.g. stacked with the flash interface circuit or integrated on the same substrate as the interface circuit, in some embodiments). Byte three also includes a cell field (CELL) identifying the cell type, for embodiments that support multilevel cells. The simultaneously programmed field (SIMP) indicates the number of simultaneously programmed pages for the flash memory system. The interleave bit (INTRL) indicates whether or not chip interleave is supported, and the cache bit (CACHE) indicates whether or not caching is supported.

Byte four includes a page size field (PAGE), a redundancy size bit (RSIZE) indicating the amount of redundancy supported (e.g. 8 or 16 bytes of redundancy per 512 bytes, in this embodiment), bits (SMIN) indicating minimum timings for serial access, a block size field (BSIZE) indicating the block size, and an organization byte (ORG) indicating the data width organization (e.g. ×8 or ×16, in this embodiment, although other widths are contemplated). Byte five includes plane number and plane size fields (PLANE and PLSIZE). Some fields and bytes are reserved for future expansion.

It is noted that, while various bits are described above, multibit fields may also be used (e.g. to support additional variations for the described attribute). Similarly, a multibit field may be implemented as a single bit if fewer variations are supported for the corresponding attribute.

FIG. 140 is a table 14000 of one embodiment of configuration data stored in the ROM block 13705. The ROM block 13705 may comprise one or more instances of the configuration data in table 14000 for various attached flash devices and for the configuration presented to the host system. The configuration data, this embodiment, is a subset of the data stored in the configuration block. That is, bytes one to five are included. Byte 0 may be determined through discovery, and bytes 6 and 7 are reserved and therefore not needed in the ROM block 13705 for this embodiment.

FIG. 141 is a table 14100 of one embodiment of configuration data that may be stored in the discovery block 13706. The discovery block 13706 may comprise one or more instances of the configuration data in table 14100 for various attached flash devices. The configuration data, this embodiment, is a subset of the data stored in the configuration block. That is, bytes zero to five are included (except for the AUTO bit, which is implied as a one in this case). Bytes 6 and 7 are reserved and therefore not needed in the discovery block 13706 for this embodiment.

In one implementation, the discovery information is discovered using one or more read operations to the attached flash memory devices, initiated by the discovery logic 13707. For example, a read cycle may be used to test if ONFI is enabled for one or more of the attached devices. The test results may be recorded in the ONFI bit of the discovery block. Another read cycle or cycles may test for the number of flash chips; and the result may be recorded in the CHIPS field. Remaining attributes may be discovered by reading the ID definition table in the attached devices. In one embodiment the attached flash chips may have the same attributes. Alternatively, multiple instances of the configuration data may be stored in the discovery block 13706 and various attached flash memory devices may have differing attributes.

As mentioned above, the address translation unit 13708 may translate addresses between the host and the flash memory devices. In one embodiment, the minimum page size is 1 kilobyte (KB). In another embodiment the page size is 8 KB. In yet another embodiment the page size is 2 KB. Generally, the address bits may be transmitted to the flash interface circuit over several transfers (e.g. 5 transfers, in one embodiment). In a five transfer embodiment, the first two transfers comprise the address bits for the column address, low order address bits first (e.g. 11 bits for a 1 KB page up to 14 bits for an 8 KB page). The last three transfers comprise the row address, low order bits first.

In one implementation, an internal address format for the flash interface circuit comprises a valid bit indicating whether or not a request is being transmitted; a device field identifying the addressed flash memory device; a plane field identifying a plane within the device, a block field identifying the block number within the plane; a page number identifying a page within the block; a redundant bit indicating whether or not the redundant area is being addressed, and column address field containing the column address.

In one embodiment, a host address is translated to the internal address format according the following rules (where CB_[label] corresponds to fields in FIG. 139):

```
COL[7:0] = Cycle[1][7:0];
COL[12:8] = Cycle[2][4:0];
R = CB_PAGE == 0 ? Cycle[2][2]
      : CB __PAGE == 1 ?              Cycle[2][3]
      : CB __PAGE == 2 ?              Cycle[2][4]
      : Cycle[2][5];
// block 64,128,256,512K / page 1,2,4,8K
PW[2:0] = CB__BSIZE == 0    //                        0
&& CB__PAGE == 0 ? 6-6
          : CB__BSIZE == 0 && CB__PAGE == 1 ? 5-6     //  -1
          : CB__BSIZE == 0 && CB__PAGE == 2 ? 4-6     //  -2
          : CB__BSIZE == 0 && CB__PAGE == 3 ? 3-6     //  -3
          : CB__BSIZE == 1 && CB__PAGE == 0 ? 7-6     //  1
          : CB__BSIZE == 1 && CB__PAGE == 1 ? 6-6     //  0
          : CB__BSIZE == 1 && CB__PAGE == 2 ? 5-6     //  -1
          : CB__BSIZE == 1 && CB__PAGE == 3 ? 4-6     //  -2
          : CB__BSIZE == 2 && CB__PAGE == 0 ? 8-6     //  2
          : CB__BSIZE == 2 && CB__PAGE == 1 ? 7-6     //  1
          : CB__BSIZE == 2 && CB__PAGE == 2 ? 6-6     //  0
          : CB__BSIZE == 2 && CB__PAGE == 3 ? 5-6     //  -1
          : CB__BSIZE == 3 && CB__PAGE == 0 ? 9-6     //  3
          : CB__BSIZE == 3 && CB__PAGE == 1 ? 8-6     //  2
          : CB__BSIZE == 3 && CB__PAGE == 2 ? 7-6     //  1
                                      :      6-6;     //  0
PW[2:0] = CB__BSIZE - CB__PAGE;                    //  same as above
PAGE = PW == -3 ? (5′b0,         Cycle[3][2:0]}
          : PW == -2 ?            {4′b0,          Cycle[3][3:0]}
          : PW == -1 ?            {3′b0,          Cycle[3][4:0]}
          : PW == 0 ?             {2′b0,          Cycle[3][5:0]}
          : PW == 1 ?             {1′b0,          Cycle[3][6:0]}
          : PW == 2 ?             {               Cycle[3][7:0]}
          :                       {Cycle[4][0], Cycle[3][7:0]};
BLOCK = PW == -3 ? {                 Cycle[5], Cycle[4], Cycle[3][7:3]}
          : PW == -2 ?            {1′b0, Cycle[5], Cycle[4], Cycle[3][7:4]}
```

-continued

```
          : PW == −1 ?          {2 ´ b0, Cycle[5], Cycle[4], Cycle[3][7:5]}
          : PW == 0 ?           {3 ´ b0, Cycle[5], Cycle[4], Cycle[3][7:6]}
          : PW == 1 ?           {4 ´ b0, Cycle[5], Cycle[4], Cycle[3][7:7]}
          : PW == 2 ?           {5 ´ b0, Cycle[5], Cycle[4]}
          :                     {6 ´ b0, Cycle[5], Cycle[4][7:1]};
// CB__PLSIZE 64Mb = 0 .. 8Gb = 7 or 8MB .. 1GB
PB[3:0] = CB__PLSIZE − CB__PAGE; // PLANE__SIZE / PAGE__SIZE
PLANE = PB == −3 ? {10 ´ b0, BLOCK[20:11]}
          : PB == −2 ?          { 9 ´ b0,        BLOCK[20:10]}
          : PB == −1 ?          { 8 ´ b0,        BLOCK[20: 9]}
          : PB == 0 ?           { 7 ´ b0,        BLOCK[20: 8]}
          : PB == 1 ?           { 6 ´ b0,        BLOCK[20: 7]}
          : PB == 2 ?           { 5 ´ b0,        BLOCK[20: 6]}
          : PB == 3 ?           { 4 ´ b0,        BLOCK[20: 5]}
          : PB == 4 ?           { 3 ´ b0,        BLOCK[20: 4]}
          : PB == 5 ?           { 2 ´ b0,        BLOCK[20: 3]}
          : PB == 6 ?           { 1 ´ b0,        BLOCK[20: 2]}
          :                     {     BLOCK[20: 1]};
DEV = CE1__ == 1 ´ b0 ? 2 ´ d 0;
     : CE2__ == 1 ´ b0 ? 2 ´ d 1
     : CE3__ == 1 ´ b0 ? 2 ´ d 2
     : CE4__ == 1 ´ b0 ? 2 ´ d 3
     : 2 ´ d 0;
```

Similarly, the translation from the internal address format to an address to be transmitted to the attached flash devices may be performed according to the following rules (where CB_[label] corresponds to fields in FIG. 141):

```
Cycle[1][7:0] = COL[7:0];
Cycle[2][7:0] = FB__PAGE == 0 ? {5 ´ b0, R, COL[ 9:8]}
      : FB__PAGE == 1 ? {4 ´ b0, R, COL[10:8]}
      : FB__PAGE == 2 ? {3 ´ b0, R, COL[11:8]}
      :          {2 ´ b0, R, COL[12:8]};
Cycle[3][7:0] = PAGE[7:0];
Cycle[3][0] = PAGE[8];
BLOCK[ ] = CB__PAGE == 0 ? Cycle [ ][ ] :
      CB__PAGE == 1 ? Cycle [ ][ ] :
      CB__PAGE == 2 ? Cycle [ ][ ] :
Cycle [ ][ ] : ;
PLANE = TBD
FCE1__ = !(DEV == 0 && VALID);
FCE2__ = !(DEV == 1 && VALID);
FCE3__ = !(DEV == 2 && VALID);
FCE4__ = !(DEV == 3 && VALID);
FCE5__ = !(DEV == 4 && VALID);
FCE6__ = !(DEV == 5 && VALID);
FCE7__ = !(DEV == 6 && VALID);
FCE8__ = !(DEV == 7 && VALID);
```

Other translations that may be performed by the other translations unit 13709 may include a test to ensure that the amount of configured memory reported to the host is the same as or less than the amount of physically-attached memory. Addition, if the configured page size reported to the host is different than the discovered page size in the attached devices, a translation may be performed by the other translations unit 13709. For example, if the configured page size is larger than the discovered page size, the memory request may be performed to multiple flash memory devices to form a page of the configured size. If the configured page size is larger than the discovered page size multiplied by the number of flash memory devices, the request may be performed as multiple operations to multiple pages on each device to form a page of the configured size. Similarly, if the redundant area size differs between the configured size reported to the host and the attached flash devices, the other translation unit 13709 may concatenate two blocks and their redundant areas. If the organization reported to the host is narrower than the organization of the attached devices, the translation unit 13709 may select a byte or bytes from the data provided by the attached devices to be output as the data for the request.

Presentation Translation

In the embodiment of FIG. 138, some or all signals of a multi-level cell (MLC) flash device 13803 pass through a flash interface circuit 13802 disposed between the MLC flash device and the system 13801. In this embodiment, the flash interface circuit presents to the system as a single level cell (SLC)-type flash memory device. Specifically, the values representative of an SLC-type flash memory device appear coded into a configuration block that is presented to the system. In the illustrated embodiment, some MLC signals are presented to the system 13801. In other embodiments, all MLC signals are received by the flash interface circuit 13802 and are converted to SLC signals for interface to the system 13801.

Power Supply

In some of the embodiments described above it is necessary to electrically connect one of more flash memory chips and one of more flash interface circuits to a system. These components may or may not be capable of operating from the same supply voltage. If, for example, the supply voltages of portion(s) the flash memory and portions(s) flash interface circuit are different, there are many techniques for either translating the supply voltage and/or translating the logic levels of the interconnecting signals. For example, since the supply currents required for portion(s) (e.g. core logic circuits, etc.) of the flash memory and/or portion(s) (e.g. core logic circuits, etc.) of the flash interface circuit may be relatively low (e.g. of the order of several milliamperes, etc.), a resistor (used as a voltage conversion resistor) may be used to translate between a higher voltage supply level and a lower logic supply level. Alternatively, a switching voltage regulator may be used to translate supply voltage levels. In other embodiments it may be possible to use different features of the integrated circuit process to enable or eliminate voltage and level translation. Thus for example, in one technique it may be possible to employ the I/O transistors as logic transistors, thus eliminating the need for voltage translation. In a similar fashion because the speed requirement for the flash interface circuit are relatively low (e.g. currently of the order of several tens of megaHertz, etc.) a relatively older process technology (e.g. currently 0.25 micron, 0.35 micron, etc) may be employed for the flash interface circuit compared to the technology of the flash memory (e.g. 70 nm, 110 nm, etc.). Or in another embodiment a process that provides transistors that are capable of operating at multiple supply voltages may be employed.

FIG. 142 is a flowchart illustrating one embodiment of a method of emulating one or more virtual flash memory devices using one or more physical flash memory devices having at least one differing attribute. The method may be implemented, e.g., in the flash interface circuit embodiments described herein.

After power up, the flash interface circuit may wait for the host system to attempt flash discovery (decision block 14201). When flash discovery is requested from the host (decision block 14201, "yes" leg), the flash interface circuit may perform device discovery/configuration for the physical flash memory devices coupled to the flash interface circuit (block 14202). Alternatively, the flash interface circuit may configure the physical flash memory devices before receiving the host discovery request. The flash interface circuit may determine the virtual configuration based on the discovered flash memory devices and/or other data (e.g. ROM data) (block 14203). The flash interface circuit may report the virtual configuration to the host (block 14204), thus exposing the virtual configuration to the host rather than the physical configuration.

For each host access (decision block 14205), the flash interface circuit may translate the request into one or more physical flash memory device accesses (block 14206), emulate attributes of the virtual configuration that differ from the physical flash memory devices (block 14207), and return an appropriate response to the request to the host (block 14208).

The above description, at various points, refers to a flash memory controller. The flash memory controller may be part of the host system, in one embodiment (e.g. the flash memory controller 13308 shown in FIG. 133). That is, the flash interface circuit may be between the flash memory controller and the flash memory devices (although some signals may be directly coupled between the system and the flash memory devices, e.g. as shown in FIG. 133). For example, certain small processors for embedded applications may include a flash memory interface. Alternatively, larger systems may include a flash memory interface in a chipset, such as in a bus bridge or other bridge device.

In various contemplated embodiments, an interface circuit may be configured to couple to one or more flash memory devices and may be further configured to couple to a host system. The interface circuit is configured to present at least one virtual flash memory device to the host system, and the interface circuit is configured to implement the virtual flash memory device using the one or more flash memory devices to which the interface circuit is coupled. In one embodiment, the virtual flash memory device differs from the one or more flash memory devices in at least one aspect (or attribute). In one embodiment, the interface circuit is configured to translate a protocol implemented by the host system to a protocol implemented by the one or more flash memory devices, and the interface circuit may further be configured to translate the protocol implemented by the one or more flash memory devices to the protocol implemented by the host system. Either protocol may be a NAND protocol or a NOR protocol, in some embodiments. In one embodiment, the virtual flash memory device is pin-compatible with a standard pin interface and the one or more flash memories are not pin-compatible with the standard pin interface. In one embodiment, the interface circuit further comprises at least one error detection circuit configured to detect errors in data from the one or more flash memory devices. The interface circuit may still further comprise at least one error correction circuit configured to correct a detected error prior to forwarding the data to the host system. In an embodiment, the interface circuit is configured to implement wear leveling operations in the one or more flash memory devices. In an embodiment, the interface circuit comprises a prefetch circuit configured to generate one or more prefetch operations to read data from the one or more flash memory devices. In one embodiment, the virtual flash memory device comprises a data bus having a width equal to N times a width of a data bus of any one of the one or more flash devices, wherein N is an integer greater than one. In one embodiment, the interface circuit is configured to interleave data on the buses of the one or more flash memory devices to implement the data bus of the virtual flash memory device. In another embodiment, the interface circuit is configured to operate the data buses of the one or more flash memory devices in parallel to implement the data bus of the virtual flash memory device. In an embodiment, the virtual flash memory device has a bandwidth that exceeds a bandwidth of the one or more flash memory devices. In one embodiment, the virtual flash memory device has a latency that is less than the latency of the one or more flash memory devices. In an embodiment, the flash memory device is a multi-level cell (MLC) flash device, and the virtual flash memory device presented to the host system is a single-level cell (SLC) flash device.

Design for High Speed Interface

FIG. 143A shows a system 14390 for providing electrical communication between a memory controller and a plurality of memory devices, in accordance with one embodiment. As shown, a memory controller 14392 is provided. Additionally, a plurality of memory devices 14394 are provided. Still yet, a channel 14396 is included for providing electrical communication between the memory controller 14392 and the plurality of memory devices 14396, an impedance of the channel being at least partially controlled using High Density Interconnect (HDI) technology. In the context of the present description, HDI refers to a technology utilized to condense integrated circuit packaging and printed circuit boards (PCBs) in order to obtain higher electrical performance, higher scale of integration, and more design convenience.

Additionally, in the context of the present description, a channel refers to any component, connection, or group of components and/or connections, used to provide electrical communication between a memory device and a memory controller. For example, in various embodiments, the channel 14396 may include PCB transmission lines, module connectors, component packages, sockets, and/or any other components or connections that fit the above definition. Furthermore, the memory devices 14394 may include any type of memory device. For example, in one embodiment, the memory devices 14394 may include dynamic random access memory (DRAM). Additionally, the memory controller 14392 may be any device capable of sending instructions or commands, or otherwise controlling the memory devices 14394.

In one embodiment, the channel 14396 may be connected to a plurality of DIMMs. In this case, at least one of the DIMMs may include a micro-via. In the context of the present description, a micro-via refers to a via constructed utilizing mico-via technology. A via refers to any pad or strip with a plated hole that connects tracks from one layer of a substrate (e.g. a PCB) to another layer or layers.

In another embodiment, at least one of the DIMMs may include a microstrip trace constructed on a board using HDI technology. In this case, a microstrip refers to any electrical transmission line on the surface layer of a PCB which can be used to convey electrical signals. As an option, the DIMMs may include a read and/or write path. In this case, impedance controlling may be utilized to adjust signal integrity properties of the read and/or write communication path. In one embodiment, the impedance controlling may use HDI technology. In the context of the present description, impedance controlling refers to any altering or configuring of the impedance of a component.

As an option, at least one interface circuit (not shown) may also be provided for allowing electrical communication between the memory controller 14392 and at least one of the memory devices 14394, where the interface circuit may be utilized as an intermediate buffer or repeater chip between the memory controller 14392 and at least one memory device 14394. In this case, the interface circuit may be included as part of a DIMM. In one embodiment, the interface circuit may be electronically positioned between the memory controller 14392 and at least one of the plurality of memory devices 14394. In this case, signals from the memory controller 14392 to the memory devices 14394 will pass though the interface circuit.

As an option, the interface circuit may include at least one programmable I/O driver. In such case, the programmable I/O driver may be utilized to buffer the signals from memory controller 14392, recover the signal waveform quality, and resend them to at least one downstream memory device 14394.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

FIG. 143B shows a system 14300 for providing electrical communication between a host controller chip package 14302 and one or more memory devices 14318. The electrical signals traverse paths from the host controller chip package 14302 through a socket 14304, traces 14306(*a*)-14306(*b*) on the surface of a printed circuit board (PCB) 14307, through a DIMM connector 14308, a resistor stub (Rstub) 14310(*a*)-14310(*c*), traces 14312(*a*)-14312(*b*) on the surface of the DIMMs 14320, any other interface connectors or circuits 14314, and finally to one or more memory devices 14318 (e.g. DRAM, etc.).

As shown further, a plurality of DIMMs 14320 may be provided (e.g. DIMM#1 -DIMM#N). Any number of DIMMs 14320 may be included. In such a configuration, the topology of the communication between the host controller chip package 14302 and the memory devices 14318 is called a multi-drop topology.

FIG. 143C illustrates a system 14350 corresponding to a schematic representation of the topology and interconnects for FIG. 143B. As shown in FIG. 143C, a memory controller 14352 which may be part of the host controller chip package 14302 is connected to a buffer chip 14354(*a*) through traces (e.g. transmission lines) 14306(*a*) and 14312(*a*). Similarly, the memory controller 14352 is connected to a buffer chip 14354(*b*) through traces 14306(*a*), 14306(*b*), and 14312(*b*). As shown further, the memory controller 14352 is connected to a buffer chip 14354(*c*) through traces 14306(*a*)-14306(*c*), and 14312(*c*). Together, the traces form a channel such that the memory controller 14352 may maintain electrical communication with the plurality of memory devices 14318.

It should be noted that, in various embodiments the system 14350 may include a motherboard (e.g. the PCB 14307), multiple connectors, multiple resistor stubs, multiple DIMMs, multiple arrays of memory devices, and multiple interface circuits, etc. Further, each buffer chips 14354(*a*)-14354(*c*) may be situated electrically between the memory controller 14352 and corresponding memory devices 14318, as shown.

It should also be noted that the system 14350 may be constructed from components with various characteristics. In one embodiment, the system 14350 may be constructed such that the traces 14306(*a*)-14306(*c*) may present an impedance (presented at point 14357) of about 50 ohms to about 55 ohms. In one exemplary embodiment, the impedance of the traces 14306(*a*)-14306(*c*) may be 52.5 ohms.

In this case, for the data read/write channel, the resistive stubs 14310(*a*)-14310(*c*) may be configured to have a resistance of about 8 ohms to about 12 ohms. In one exemplary embodiment, the resistive stubs 14310(*a*)-14310(*c*) may have a resistance of 10 ohms. Additionally, the DIMMs 14320 may have an impedance of about 35 ohms to about 45 ohms at a point of the traces 14312(*a*)-14312(*c*). In one exemplary embodiment, the DIMMs 14320 may have an impedance of 40 ohms. In addition, the on-die termination resistors 14356(*a*)-14356(*c*) may be configured have a resistance of 20 Ohm, 20 Ohm, and off respectively, if buffer chip 14354(*c*) is the active memory device in the operation.

In the prior art, for example, the resistive stubs 14310(*a*)-14310(*c*) may be configured as 15 Ohm and the DIMMs 14320 are configured as 68 Ohm.

In this case, for the command/address channel, the resistive stubs 14310(*a*)-14310(*c*) may be configured to have a resistance of about 20 ohms to about 24 ohms, in one exemplary embodiment, the resistive stubs 14310(*a*)-14310(*c*) may have a resistance of 22 ohms. In this case, the impedance of traces 14312(*a*)-14312(*c*) may be about 81 ohms to about 99 ohms. In one exemplary embodiment, the impedance of the traces 14312(*a*)-14312(*b*) may be 90 ohms. In addition, the on-die termination resistors (input bus termination, IBT) 14356(*a*)-14356(*c*) may be configured have a resistance of 100 Ohm, 100 Ohm, 100 Ohm, respectively. In the prior art, for example, the resistive stubs 14310(*a*)-14310(*c*) are configured as 22 Ohm and the DIMMs 14320 are configured as 68 Ohm. It should be noted, that all of the forgoing impedances are specific examples, and should not be construed as limiting in any manner. Such impedances may vary depending on the particular implementation and components used.

In order to realize a physical design with the characteristics as mentioned in the preceding paragraphs, several physical design techniques may be employed. For example, in order to achieve a desired impedance at a point of the traces 14312(*a*)-14312(*b*), a PCB manufacturing technique known as High Density Interconnect (HDI), and Build-Up technology may be employed.

HDI technology is a technique to condense integrated circuit packaging for increased microsystem density and high performance. HDI technology is sometimes used as a generic term to denote a range of technologies that may be added to normal PCB technology to increase the density of interconnect, HDI packaging minimizes the size and weight of the electronics while maximizing performance. HDI allows three-dimensional wafer-scale packaging of integrated circuits. In context of the present description the particular features of HDI technology that are used are the thin layers used as insulating material between conducting layers and micro-via holes that connect conducting layers and are drilled through the thin insulating layers.

One way of constructing the thin insulating layers is using build-up technology, although other methods may equally be employed. One way of creating micro-vias is to use a laser to drill a precision hole through thin build-up layers, although other methods may equally be employed. By using a laser to direct-write patterns of interconnect layouts and drill micro-via holes, individual chips may be connected to each other using standard semiconductor fabrication methods. The thin insulating layers and micro-vias provided by HDI technology allow precise control over the transmission line impedance of the PCB interconnect as well as the unwanted parasitic impedances of the PCB interconnect.

In another embodiment, a micro-via manufacturing technique may be utilized to achieve the desired impedance at a point of the traces 14312(*a*)-14312(*c*). Micro-via technology implements a via between layers of a PCB wherein the via traverses only between the specific two layers of the PCB, resulting in elimination of redundant open via stubs with conventional through-hole vias, a much lower parasitic capacitance, a much smaller impedance discontinuity and accordingly a much lower amplitude of reflections. In the context of the present description, a via refers to any pad or strip with a plated hole that connects tracks from one layer of a substrate (e.g. a PCB) to another layer or layers.

Additionally, in order to achieve better electrical signal performance, a PCB manufacturing technique known as flip-chip may be employed. Flip chip package technology implements signal connectivity between the package and a die that uses much less (and often a shortened run-length of) conductive material than other similarly purposed technologies employed for the stated connectivity such as wire bond, and therefore presents a much lower serial inductance, and accordingly a much lower impedance discontinuity and lower inductive crosstalk.

To further extend the read cycle signal integrity between the memory controller 14352 and the memory devices 14318, a programmable I/O driver may be employed. In this case, the driver may be capable of presenting a range of drive strengths (e.g. drive strengths 1–N, where N is an integer). Each of the drive strength settings normally corresponds to a different value of effective or average driver resistance or impedance, though other factors such as shape, effective resistance, etc. of the drive curve at different voltage levels may also be varied. Such a strength value may be programmed using a variety of well known techniques, including setting the strength of the programmable buffer as a response to a command originating or sent through the memory controller 14352. Due to the nature of the multi-drop topology, the read path desires stronger driver strength than what memory devices on regular Register-DIMM can provide.

The components that contribute to the characteristics of the aforementioned channel are designed to provide an interconnection capable of conveying high-speed signal transitions. Table 15 shows specific memory cycles (namely, READ, WRITE, and CMD) illustrating the performance characteristics of a generic solution of the prior art, representative of commercial standards, versus an implementation of one embodiment discussed in the context of the present description. It should be noted that long valid data times (e.g. valid windows) supporting high frequency memory reads and writes are both highly valued, and exhaustive.

TABLE 15

| | Generic Embodiments | | Presently Discussed Embodiments | |
|---|---|---|---|---|
| Path | Impedance Matching | Valid Window | Impedance Matching | Valid Window |
| READ | ~70 ohm driving into 40 ohm in parallel with 40 ohm | 300 picoseconds | ~40 ohm driving into 40 ohm in parallel with 40 ohm | 700 picoseconds |
| Write | ~40 ohm driving into 80 ohm in parallel with 40 ohm | 280 picoseconds | ~40 ohm driving into 50 ohm in parallel with 40 ohm | 580 picoseconds |
| CMD | | 630 picoseconds | | 1 nanosecond |

As shown in Table 15, impedance matching of the presently discussed embodiments are nearly symmetric. This is in stark contrast to the extreme asymmetric nature of the prior art. In the context of the present description, impedance matching refers to configuring the impedances of different transmission line segments in a channel so that the impedance variation along the channel remains minimal. There are challenges for achieving good impedance match on both read and write directions for a multi-drop channel topology. Additionally, not only the differences in symmetry between the READ and WRITE paths that are evident, but also the related characteristics as depicted in FIGS. 144-146 discussed below.

FIGS. 144A and 144B depict eye diagrams 14400 and 14450 for a data READ cycle for double-data-rate three (DDR3) dual rank synchronous dynamic random access memory (SDRAM) at a speed of 1067 Mbps. FIG. 144A substantially illustrates the data shown for the generic READ memory cycle associated with the prior art. In particular, FIG. 144A shows a time that an eye is almost closed.

More specifically the time that high signals 14402 is above the high DC input threshold Vih(DC) voltage and the time that the low signals 14404 are below the lower DC input threshold Vil(DC) voltage defines a valid window 14406 (i.e. the eye). As can be seen by inspection, the valid window 14406 of FIG. 144A is only about 300 picoseconds, while the valid window 14406 of an implementation of the presently discussed embodiments is about 700 picoseconds, as shown in FIG. 144B, which is more than twice as long as the prior art.

In similar fashion, FIGS. 145A and 145B depict eye diagrams 14500 and 14550 for a data WRITE cycle. Inspection of FIG. 145A illustrates data for the WRITE cycle associated with the prior art. More specifically, the time that high signals 14502 are above the Vih(AC) voltage and the time that low signals 14504 are below the Vil(DC) voltage defines a valid window 14506. As can be seen by inspection, the valid window of FIG. 145A is only about 350 picoseconds, while the valid window 14506 of an implementation of the presently discussed embodiments is about 610 picoseconds, as shown in FIG. 145B.

FIGS. 146A and 146B depict eye diagrams 14600 and 14650 for a CMD cycle. Inspection of FIG. 146A illustrates data for the CMD cycle associated with the prior art. More specifically a time that high signals 14602 is above the Vih (AC) voltage and a time that low signals 14604 are below the Vil(DC) voltage defines the valid window 14606. As can be seen by inspection, the valid window 14606 of FIG. 146A is only about 700 picoseconds, while the valid window 14606 of the presently discussed embodiments as shown in FIG. 146B is about 1.05 nanoseconds.

FIGS. 147A and 147B depict a memory module (e.g. a DIMM) 14700 and a corresponding buffer chip 14702 which may be utilized in the context of the details of the FIGS. 143-4. For example, the memory module 14700 and the buffer chip 14702 may be utilized in the context of the DIMMs 14320 of FIGS. 143B and 143C.

FIG. 148 shows a system 14800 including a system device 14806 coupled to an interface circuit 14802 and a plurality of memory circuits 14804A-14804N, in accordance with one embodiment. Although the interface circuit 14802 is illustrated as an individual circuit, the interface circuit may also be represented by a plurality of interface circuits, each corresponding to one of the plurality of memory circuits 14804A-14804N.

In one embodiment, and as exemplified in FIG. 148, the memory circuits 14804A-14804N may be symmetrical, such that each has the same capacity, type, speed, etc. Of course, in other embodiments, the memory circuits 14804A-14804N may be asymmetrical. For ease of illustration only, four such memory circuits 14804A-14804N are shown, but actual embodiments may use any number of memory circuits. As will be discussed below, the memory chips may optionally be coupled to a memory module (not shown), such as a DIMM.

The system device 14806 may be any type of system capable of requesting and/or initiating a process that results in an access of the memory circuits. The system may include a memory controller (not shown) through which it accesses the memory circuits 14804A-14804N.

The interface circuit 14802 may also include any circuit or logic capable of directly or indirectly communicating with the memory circuits, such as a memory controller, a buffer chip, advanced memory buffer (AMB) chip, etc. The interface circuit 14802 interfaces a plurality of signals 14808 between the system device 14806 and the memory circuits 14804A-14804N. Such signals 14808 may include, for example, data signals, address signals, control signals, clock signals, and so forth.

In some embodiments, all of the signals communicated between the system device 14806 and the memory circuits 14804A-14804N may be communicated via the interface circuit 14802. In other embodiments, some other signals 14810 are communicated directly between the system device 14806 (or some component thereof, such as a memory controller, or a register, etc.) and the memory circuits 14804A-14804N, without passing through the interface circuit 14802.

As pertains to optimum channel design for a memory system, the presence of a buffer chip between the memory controller and the plurality of memory circuits 14804A-14804N may present a single smaller capacitive load on a channel as compared with multiple loads that would be presented by the plurality of memory devices in multiple rank DIMM systems, in absence of any buffer chip.

The presence of an interface circuit 14802 may facilitate use of an input buffer design that has a lower input threshold requirement than normal memory chips. In other words, the interface circuit 14802 is capable of receiving more noisy signals, or higher speed signals from the memory controller side than regular memory chips. Similarly, the presence of the interface circuit 14802 may facilitate use of an output buffer design that is capable of not only driving with wider strength range, but also driving with wider range of edge rates, i.e., rise time. Faster edge rate may also facilitate the signal integrity of the data read path, given voltage margin is the main limiting factor. In addition, such an output buffer can be designed to operate more linearly than regular memory device output drivers.

FIG. 149 shows a DIMM 14900, in accordance with one embodiment. As shown, the DIMM includes memory (e.g. DRAM) 14902, a repeater chip 14904 (e.g. an interface circuit), a DIMM PCB 14906, a stub resister 14908, and a connector finger 14910. The repeater chip 14904, the DIMM PCB 14906, the stub resister 14908, and the connector finger 14910 may be configured, as described in the context of the details of the above embodiments, in order to provide a high-speed interface between the DRAM 14902 and a memory controller (not shown).

FIG. 150 shows a graph 15000 of a transfer function of a read function, in accordance with one embodiment. As shown, a transfer function 15002 for the optimized memory channel design indicates significant improvement of channel bandwidth compared to a transfer function 15004 of the original channel design on a wide range of frequencies. In this case, the graph 15000 represents an experiment with a DDR3, 3 DIMMs per channel topology, using a 1.4 volt power supply voltage on the stimulus source.

While various embodiments have been described above, it should be understood that they have been presented by way of example only, and not limitation. For example, although the foregoing embodiments have been described using a defined number of DIMMs, any number of DIMMs per channel (DPC) or operating frequency of similar memory technologies [Graphics DDR (GDDR), DDR, etc.] may be utilized. Thus, the breadth and scope of a preferred embodiment should not be limited by any of the above-described exemplary embodiments, but should be defined only in accordance with the following claims and their equivalents.

Termination Resistance Control

Electrical termination of a transmission line involves placing a termination resistor at the end of the transmission line to prevent the signal from being reflected back from the end of the line, causing interference. In some memory systems, transmission lines that carry data signals are terminated using on-die termination (ODT). ODT is a technology that places an impedance matched termination resistor in transmission lines inside a semiconductor chip. During system initialization, values of ODT resistors used by DRAMs can be set by the memory controller using mode register set (MRS) commands. In addition, the memory controller can turn a given ODT resistor on or turn off at the DRAM with an ODT control signal. When the ODT resistor is turned on with an ODT control signal, it begins to terminate the associated transmission line. For example, a memory controller in a double-data-rate three (DDR3) system can select two static termination resistor values during initialization for all DRAMs within a DIMM using MRS commands. During system operation, the first ODT value (Rtt_Nom) is applied to non-target ranks when the corresponding rank's ODT signal is asserted for both reads and writes. The second ODT value (Rtt_WR) is applied only to the target rank of a write when that rank's ODT signal is asserted.

Figure 151A:
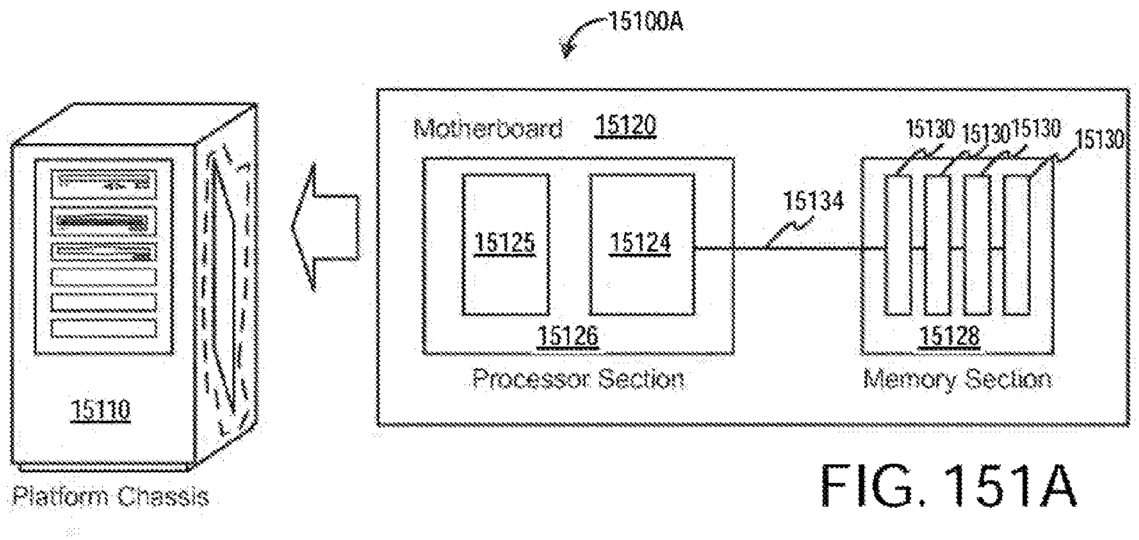

FIGS. 151A-F are block diagrams of example computer systems. FIG. 151A is a block diagram of an example computer system 15100A. Computer system 15100A includes a platform chassis 15110, which includes at least one motherboard 15120. In some implementations, the example computer system 15100A includes a single case, a single power supply, and a single motherboard/blade. In other implementations, computer system 15100A can include multiple cases, power supplies, and motherboards/blades.

The motherboard 15120 includes a processor section 15126 and a memory section 15128. In some implementations, the motherboard 15120 includes multiple processor sections 15126 and/or multiple memory sections 15128. The processor section 15126 includes at least one processor 15125 and at least one memory controller 15124. The memory section 15128 includes one or more memory modules 15130 that can communicate with the processor section 15126 using the memory bus 15134 (e.g., when the memory section 15128 is coupled to the processor section 15126). The memory controller 15124 can be located in a variety of places. For example, the memory controller 15124 can be implemented in one or more of the physical devices associated with the processor section 15126, or it can be implemented in one or more of the physical devices associated with the memory section 15128.

Figure 151B:
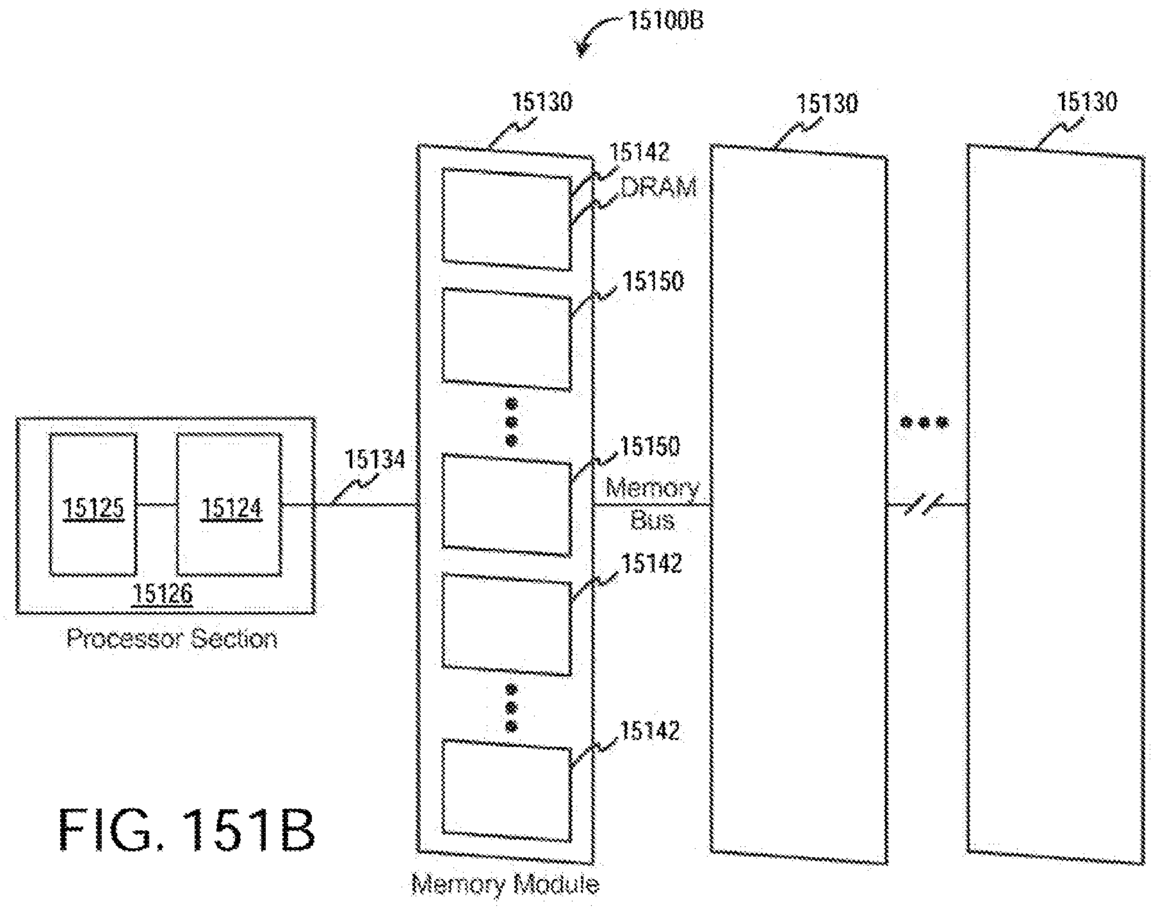

FIG. 151B is a block diagram that illustrates a more detailed view of the processor section 15126 and the memory section 15128, which includes one or more memory modules 15130. Each memory module 15130 communicates with the processor section 15126 over the memory bus 15134. In some implementations, the example memory module 15130 includes one or more interface circuits 15150 and one or more memory chips 15142. While the following discussion generally references a single interface circuit 15150, more than one interface circuit 15150 can be used. In addition, though the computer systems are described with reference to memory chips as DRAMs, the memory chip 15142 can be, but is not limited to, DRAM, synchronous DRAM (SDRAM), double data rate synchronous DRAM (DDR SDRAM, DDR2 SDRAM, DDR3 SDRAM, DDR4 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory, flash memory, and/or any other type of volatile or non-volatile memory.

Figure 151C:
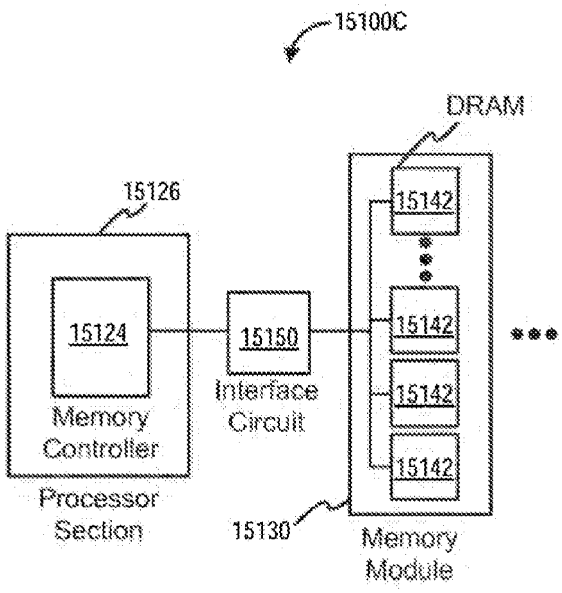
Figure 151D:
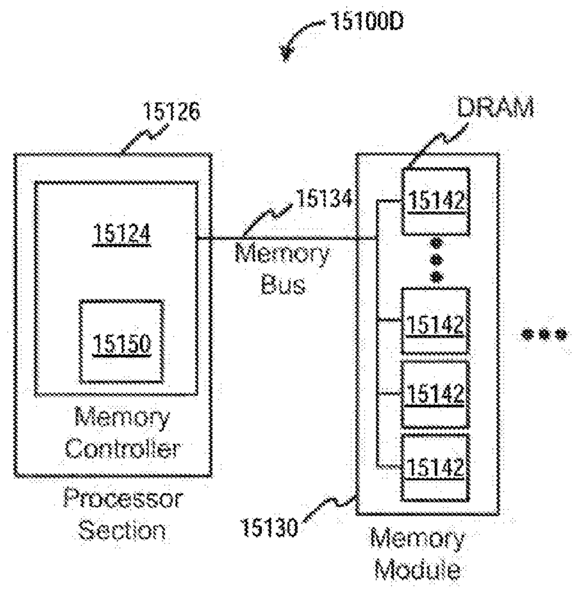
Figure 151E:
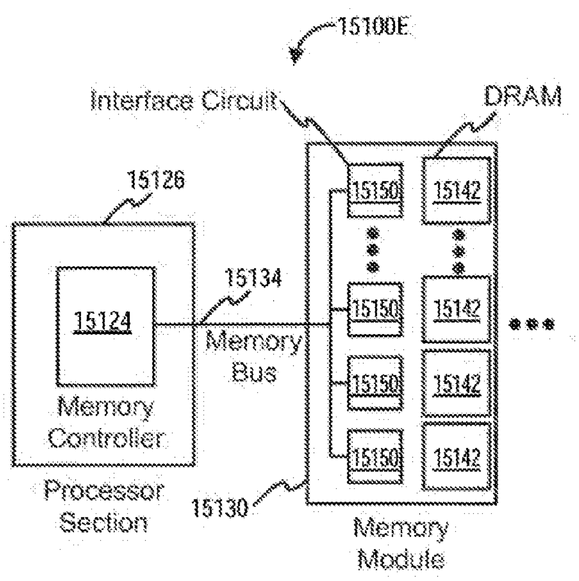
Figure 151F:
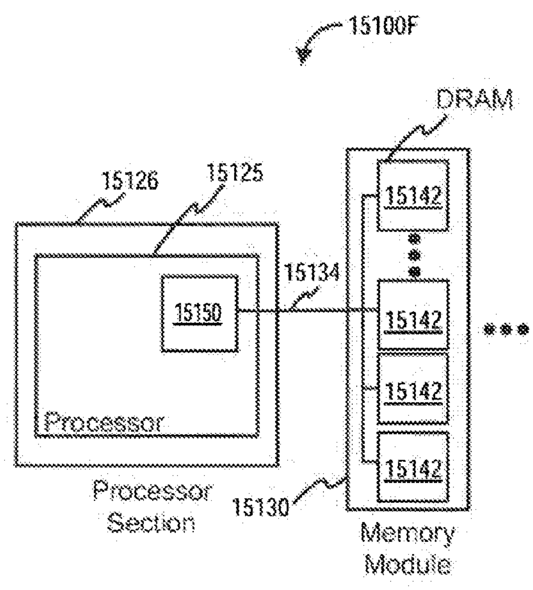

Each of the one or more interface circuits 15150 can be, for example, a data buffer, a data buffer chip, a buffer chip, or an interface chip. The location of the interface circuit 15150 is not fixed to a particular module or section of the computer system. For example, the interface circuit 15150 can be positioned between the processor section 15126 and the memory module 15130 (FIG. 151C). In some implementations, the interface circuit 15150 is located in the memory controller 15124, as shown in FIG. 151D. In yet some other implementations, each memory chip 15142 is coupled to its own interface circuit 15150 within memory module 15130 (FIG. 151E). And in another implementation, the interface circuit 15150 is located in the processor section 15126 or in processor 15125, as shown in FIG. 151F.

The interface circuit 15150 can act as an interface between the memory chips 15142 and the memory controller 15124. In some implementations, the interface circuit 15150 accepts signals and commands from the memory controller 15124 and relays or transmits commands or signals to the memory chips 15142. These could be the same or different signals or commands. Each of the one or more interface circuits 15150 can also emulate a virtual memory module, presenting the memory controller 15124 with an appearance of one or more virtual memory circuits. In the emulation mode, the memory controller 15124 interacts with the interface circuit 15150 as it would with a physical DRAM or multiple physical DRAMs on a memory module, depending on the configuration of the interface circuit 15150. Therefore, in emulation mode, the memory controller 15124 could see a single-rank memory module or a multiple-rank memory module in the place of the interface circuit 15150, depending on the configuration of the interface circuit 15150. In case multiple interface circuits 15150 are used for emulation, each interface circuit 15150 can emulate a portion (i.e., a slice) of the virtual memory module that is presented to the memory controller 15124.

An interface circuit 15150 that is located on a memory module can also act as a data buffer for multiple memory chips 15142. In particular, the interface circuit 15150 can buffer one or more ranks and present a single controllable point of termination for a transmission line. The interface circuit 15150 can be connected to memory chips 15142 or to the memory controller 15124 with one or more transmission lines. The interface circuit 15150 can therefore provide a more flexible memory module (e.g., DIMM) termination instead of, or in addition to, the memory chips (e.g., DRAM) located on the memory module.

The interface circuit 15150 can terminate all transmission lines or just a portion of the transmission lines of the DIMM. In case when multiple interface circuits 15150 are used, each interface circuit 15150 can terminate a portion of the transmission lines of the DIMM. For example, the interface circuit 15150 can be used to terminate 8 bits of data. If there are 72 bits of data provided by a DIMM, then nine interface circuits are needed to terminate the entire DIMM. In another example, the interface circuit 15150 can be used to terminate 72 bits of data, in which case one interface circuit 15150 would be needed to terminate the entire 72-bit DIMM. Additionally, the interface circuit 15150 can terminate various transmission lines. For example, the interface circuit 15150 can terminate a transmission line between the memory controller 15124 and the interface circuit 15150. In addition or alternatively, the interface circuit 15150 can terminate a transmission line between the interface circuit 15150 and one or more of the memory chips 15142.

Each of one or more interface circuits 15150 can respond to a plurality of ODT signals or MRS commands received from the memory controller 15124. In some implementations, the memory controller 15124 sends one ODT signal or MRS command per physical rank. In some other implementations, the memory controller 15124 sends more than one ODT signal or MRS command per physical rank. Regardless, because the interface circuit 15150 is used as a point of termination, the interface circuit 15150 can apply different or asymmetric termination values for non-target ranks during reads and writes. Using different non-target DIMM termination values for reads and writes allows for improved signal quality of the channel and reduced power dissipation due to the inherent asymmetry of a termination line.

Moreover, because the interface circuit 15150 can be aware of the state of other signals/commands to a DIMM, the interface circuit 15150 can choose a single termination value that is optimal for the entire DIMM. For example, the interface circuit 15150 can use a lookup table filled with termination values to select a single termination value based on the MRS commands it receives from the memory controller 15124. The lookup table can be stored within interface circuit 15150 or in other memory locations, e.g., memory controller 15124, processor 15125, or a memory module 15130. In another example, the interface circuit 15150 can compute a single termination based on one or more stored formula. The formula can accept input parameters associated with MRS commands from the memory controller 15124 and output a single termination value. Other techniques of choosing termination values can be used, e.g., applying specific voltages to specific pins of the interface circuit 15150 or programming one or more registers in the interface circuit 15150. The register can be, for example, a flip-flop or a storage element.

Tables 16A and 16B show example lookup tables that can be used by the interface circuit 15150 to select termination values in a memory system with a two-rank DIMM.

TABLE 16A

Termination values expressed in terms of resistance RZQ.

| | | term_b | | | | | | | |
|---|---|---|---|---|---|---|---|---|---|
| | | disabled | RZQ/4 | RZQ/2 | RZQ/6 | RZQ/12 | RZQ/8 | reserved | reserved |
| term_a | disabled | disabled | RZQ/4 | RZQ/2 | RZQ/6 | RZQ/12 | RZQ/8 | TBD | TBD |
| | RZQ/4 | | RZQ/8 | RZQ/6 | RZQ/12 | RZQ/12 | RZQ/12 | TBD | TBD |
| | RZQ/2 | | | RZQ/4 | RZQ/8 | RZQ/12 | RZQ/12 | TBD | TBD |
| | RZQ/6 | | | | RZQ/12 | RZQ/12 | RZQ/12 | TBD | TBD |
| | RZQ/12 | | | | | RZQ/12 | RZQ/12 | TBD | TBD |
| | RZQ/8 | | | | | | RZQ/12 | TBD | TBD |
| | reserved | | | | | | | TBD | TBD |
| | reserved | | | | | | | | TBD |

TABLE 16B

Termination values of Table 16A with RZQ = 240 ohm

| | | term_b | | | | | | | |
|---|---|---|---|---|---|---|---|---|---|
| | | disabled | RZQ/4 | RZQ/2 | RZQ/6 | RZQ/12 | RZQ/8 | reserved | reserved |
| term_a | Inf | inf | 60 | 120 | 40 | 20 | 30 | TBD | TBD |
| | 60 | | 30 | 40 | 20 | 20 | 20 | TBD | TBD |
| | 120 | | | 60 | 30 | 20 | 20 | TBD | TBD |
| | 40 | | | | 20 | 20 | 20 | TBD | TBD |
| | 20 | | | | | 20 | 20 | TBD | TBD |
| | 30 | | | | | | 20 | TBD | TBD |
| | reserved | | | | | | | TBD | TBD |
| | reserved | | | | | | | | TBD |

Because the example memory system has two ranks, it would normally require two MRS commands from the memory controller 15124 to set ODT values in each of the ranks. In particular, memory controller 15124 would issue an MRS0 command that would set the ODT resistor values in DRAMs of the first rank (e.g., as shown by term_a in Tables 16A and 16B) and would also issue an ODT0 command signal that would activate corresponding ODT resistors in the first rank. Memory controller 15124 would also issue an MRS1 command that would set the ODT resistor values in DRAMs of the second rank (e.g., as shown by term_b in Tables 16A and 16B) and would also issue an ODT1 command signal that would enable the corresponding ODT resistors in the second rank.

However, because the interface circuit 15150 is aware of signals/commands transmitted by the memory controller 15124 to both ranks of the DIMM, it can select a single ODT resistor value for both ranks using a lookup table, for example, the resistor value shown in Tables 1A-B. The interface circuit 15150 can then terminate the transmission line with the ODT resistor having the single selected termination value.

In addition or alternatively, the interface circuit 15150 can also issue signals/commands to DRAMs in each rank to set their internal ODTs to the selected termination value. This single termination value may be optimized for multiple ranks to improve electrical performance and signal quality.

For example, if the memory controller 15124 specifies the first rank's ODT value equal to RZQ/6 and the second rank's ODT value equal to RZQ/12, the interface circuit 15150 will signal or apply an ODT resistance value of RZQ/12. The resulting value can be found in the lookup table at the intersection of a row and a column for given resistance values for rank 0 (term_a) and rank 1 (term_b), which are received from the memory controller 15124 in the form of MRS commands. In case the RZQ variable is set to 240 ohm, the single value signaled or applied by the interface circuit 15150 will be 240/12=20 ohm. A similar lookup table approach can be applied to Rtt_Nom values, Rtt_WR values, or termination values for other types of signals.

In some implementations, the size of the lookup table is reduced by 'folding' the lookup table due to symmetry of the entry values (Rtt). In some other implementations, an asymmetric lookup table is used in which the entry values are not diagonally symmetric. In addition, the resulting lookup table entries do not need to correspond to the parallel resistor equivalent of Joint Electron Devices Engineering Council (JEDEC) standard termination values. For example, the table entry corresponding to 40 ohm for the first rank in parallel with 40 ohm for the second rank (40//40) does not have to result in a 20 ohm termination setting. In addition, in some implementations, the lookup table entries are different from Rtt_Nom or Rtt_WR values required by the JEDEC standards.

While the above discussion focused on a scenario with a single interface circuit 15150, the same techniques can be applied to a scenario with multiple interface circuits 15150. For example, in case multiple interface circuits 15150 are used, each interface circuit 15150 can select a termination value for the portion of the DIMM that is being terminated by that interface circuit 15150 using the techniques discussed above.

FIG. 152 is an example timing diagram 15200 for a 3-DIMMs per channel (3DPC) configuration, where each DIMM is a two-rank DIMM. The timing diagram 15200 shows timing waveforms for each of the DIMMs in three slots: DIMM A 15220, DIMM B 15222, and DIMM C 15224. In FIG. 152, each DIMM receives two ODT signal waveforms for ranks 0 and 1 (ODT0, ODT1), thus showing a total of six ODT signals: signals 15230 and 15232 for DIMM A, signals 15234 and 15236 for DIMM B, and signals 15238 and 15240 for DIMM C. In addition, the timing diagram 15200 shows a Read signal 15250 applied to DIMM A either at rank 0 (R0) or rank 1 (R1). The timing diagram 15200 also shows a Write signal 15252 applied to DIMM A at rank 0 (R0).

The values stored in the lookup table can be different from the ODT values mandated by JEDEC. For example, in the 40//40 scenario (R0 Rtt_Nom=ZQ/6=40 ohm, R1 Rtt_Nom=ZQ/6=40 ohm, with ZQ=240 ohm), a traditional two-rank DIMM system relying on JEDEC standard will have its memory controller set DIMM termination values of either INF (infinity or open circuit), 40 ohm (assert either ODT0 or ODT1), or 20 ohm (assert ODT0 and ODT1). On the other hand, the interface circuit 15150 relying on the lookup table can set the ODT resistance value differently from memory controller relying on JEDEC-mandated values. For example, for the same values of R0 $Rtt_{Nom}$ and R1 Rtt_Nom, the interface circuit 15150 can select a resistance value that is equal to ZQ/12 (20 ohm) or ZQ/8 (30 ohm) or some other termination value. Therefore, even though the timing diagram 15200 shows a 20 ohm termination value for the 40//40 scenario, the selected ODT value could correspond to any other value specified in the lookup table for the specified pair of R0 and R1 values.

When the interface circuit 15150 is used with one-rank DIMMs, the memory controller can continue to provide ODT0 and ODT1 signals to distinguish between reads and writes even though ODT1 signal might not have any effect in a traditional memory channel. This allows single and multiple rank DIMMs to have the same electrical performance. In some other implementations, various encodings of the ODT signals are used. For example, the interface circuit 15150 can assert ODT0 signal for non-target DIMMs for reads and ODT1 signal for non-target DIMMs for writes.

In some implementations, termination resistance values in multi-rank DIMM configurations are selected in a similar manner. For example, an interface circuit provides a multi-rank DIMM termination resistance using a look-up table. In another example, an interface circuit can also provide a multi-rank DIMM termination resistance that is different from the JEDEC standard termination value. Additionally, an interface circuit can provide a multi-rank DIMM with a single termination resistance. An interface circuit can also provide a multi-rank DIMM with a termination resistance that optimizes electrical performance. The termination resistance can be different for reads and writes.

In some implementations, a DIMM is configured with a single load on the data lines but receives multiple ODT input signals or commands. This means that while the DIMM can terminate the data line with a single termination resistance, the DIMM will appear to the memory controller as though it has two termination resistances that can be configured by the memory controller with multiple ODT signals and MRS commands. In some other implementations a DIMM has an ODT value that is a programmable function of the of ODT input signals that are asserted by the system or memory controller.

FIGS. 153A-C are block diagrams of an example memory module using an interface circuit to provide DIMM termination. In some implementations, FIGS. 153A-C include an interface circuit similar to interface circuit 15150 described in the context of the computer systems in FIGS. 151A-F. In particular, DRAMs 15316, 15318, 15320, and 15324 can have attributes comparable to those described with respect to memory chips 15142, respectively. Likewise, the interface circuit 15314 can have attributes comparable to, and illustrative of, the interface circuits 15150 shown in FIGS. 151A-F. Similarly, other elements within FIGS. 153A-C have attributes comparable to, and illustrative of, corresponding elements in FIGS. 151A-F.

Referring to FIG. 153A, the interface circuit 15314 is coupled to DRAMs 15316, 15318, 15320, and 15324. The interface circuit 15314 is coupled to the memory controller using memory bus signals DQ[3:0], DQ[7:4], DQS1_t, DQS1_c, DQS0_t, DQS0_c, VSS. Additionally, other bus signals (not shown) can be included. FIG. 153A shows only a partial view of the DIMM, which provides 8 bits of data to the system through DQ[7:4] bus signal. For an ECC DIMM with 72 bits of data, there would be a total of 36 DRAM devices and there would be 9 instances of interface circuit 15314. In FIG. 153A, the interface circuit combines two virtual ranks to present a single physical rank to the system (e.g., to a memory controller). DRAMs 15316 and 15320 belong to a virtual rank 0 and DRAMs 15318 and 15324 are parts of virtual rank 1. As shown, DRAMs devices 15316 and 15318 together with interface circuit 15314 operate to form a single larger virtual DRAM device 15312. In a similar fashion, DRAM devices 15320 and 15324 together with interface circuit 15314 operate to form a virtual DRAM device 15310.

The virtual DRAM device 15310 represents a "slice" of the DIMM, as it provides a "nibble" (e.g., 4 bits) of data to the memory system. DRAM devices 15316 and 15318 also represent a slice that emulates a single virtual DRAM 15312. The interface circuit 15314 thus provides termination for two slices of DIMM comprising virtual DRAM devices 15310 and 15312. Additionally, as a result of emulation, the system sees a single-rank DIMM.

In some implementations, the interface circuit 15314 is used to provide termination of transmission lines coupled to DIMM. FIG. 153A shows resistors 15333, 15334, 15336, 15337 that can be used, either alone or in various combinations with each other, for transmission line termination. First, the interface circuit 15314 can include one or more ODT resistors 15334 (annotated as T2). For example, ODT resistor 15334 may be used to terminate DQ[7:4] channel. It is noted that DQ[7:4] is a bus having four pins: DQ7, DQ6, DQ5, DQ4 and thus may require four different ODT resistors. In addition, DRAMs 15316, 15318, 15320, and 15324 can also include their own ODT resistors 15336 (annotated as T).

In some implementations, the circuit of FIG. 153A also includes one or more resistors 15333 that provide series stub termination of the DQ signals. These resistors are used in addition to any parallel DIMM termination, for example, provided by ODT resistors 15334 and 15336. Other similar value stub resistors can also be used with transmission lines associated with other data signals. For example, in FIG. 153A, resistor 15337 is a calibration resistor connected to pin ZQ.

FIG. 153A also shows that the interface circuit 15314 can receive ODT control signals though pins ODT0 15326 and ODT1 15328. As described above, the ODT signal turns on or turns off a given ODT resistor at the DRAM. As shown in FIG. 153A, the ODT signal to DRAM devices in virtual rank is ODT0 15326 and the ODT signal to the DRAM devices in virtual rank 1 is ODT1 15328.

Because the interface circuit 15314 provides for flexibility pins for signals ODT 15330, ODT 15332, ODT0 15326, and ODT1 15328 may be connected in a number of different configurations.

In one example, ODT0 15326 and ODT1 15328 are connected directly to the system (e.g., memory controller); ODT 15330 and ODT 15332 are hard-wired; and interface circuit 15314 performs the function determine the value of DIMM termination based on the values of ODT0 and ODT1 (e.g., using a lookup table as describe above with respect to Tables 1A-B). In this manner, the DIMM can use the flexibility provided by using two ODT signals, yet provide the appearance of a single physical rank to the system.

For example, if the memory controller instructs rank 0 on the DIMM to terminate to 40 ohm and rank 1 to terminate to 40 ohm, without the interface circuit, a standard DIMM would then set termination of 40 ohm on each of two DRAM devices. The resulting parallel combination of two nets each terminated to 40 ohm would then appear electrically to be terminated to 20 ohm. However, the presence of interface circuit provides for additional flexibility in setting ODT termination values. For example, a system designer may determine, through simulation, that a single termination value of 15 ohm (different from the normal, standard-mandated value of 20 ohm) is electrically better for a DIMM embodiment using interface circuits. The interface circuit 15314, using a lookup table as described, may therefore present a single termination value of 15 ohm to the memory controller.

In another example, ODT0 15326 and ODT1 15328 are connected to a logic circuit (not shown) that can derive values for ODT0 15326 and ODT1 15328 not just from one or more ODT signals received from the system, but also from any of the control, address, or other signals present on the DIMM. The signals ODT 15330 and ODT 15332 can be hard-wired or can be wired to the logic circuit. Additionally, there can be fewer or more than two ODT signals between the logic circuit and interface circuit 15314. The one or more logic circuits can be a CPLD, ASIC, FPGA, or part of an intelligent register (on an R-DIMM or registered-DIMM for example), or a combination of such components.

In some implementations, the function of the logic circuit is performed by a modified JEDEC register with a number of additional pins added. The function of the logic circuit can also be performed by one or more interface circuits and shared between the interface circuits using signals (e.g., ODT 15330 and ODT 15332) as a bus to communicate the termination values that are to be used by each interface circuit.

In some implementations, the logic circuit determines the target rank and non-target ranks for reads or writes and then communicates this information to each of the interface circuits so that termination values can be set appropriately. The lookup table or tables for termination values can be located in the interface circuits, in one or more logic circuit, or shared/partitioned between components. The exact partitioning of the lookup table function to determine termination values between the interface circuits and any logic circuit depends, for example, on the economics of package size, logic function and speed, or number of pins.

In another implementation, signals ODT 15330 and ODT 15332 are used in combination with dynamic termination of the DRAM (i.e., termination that can vary between read and write operations and also between target and non-target ranks) in addition to termination of the DIMM provided by interface circuit 15314. For example, the system can operate as though the DIMM is a single-rank DIMM and send termination commands to the DIMM as though it were a single-rank DIMM. However, in reality, there are two virtual ranks and two DRAM devices (such as DRAM 15316 and DRAM 15318) that each have their own termination in addition to the interface circuit. A system designer has an ability to vary or tune the logical and timing behavior as well as the values of termination in three places: (a) DRAM 15316; (b) DRAM 15318; and (c) interface circuit 15314, to improve signal quality of the channel and reduce power dissipation.

A DIMM with four physical ranks and two logical ranks can be created in a similar fashion to the one described above. A computer system using 2-rank DIMMs would have two ODT signals provided to each DIMM. In some implementations, these two ODT signals are used, with or without an additional logic circuit(s) to adjust the value of DIMM termination at the interface circuits and/or at any or all of the DRAM devices in the four physical ranks behind the interface circuits.

FIG. 153B is a block diagram illustrating the example structure of an ODT block within a DIMM. The structure illustrated in FIG. 153B embodies the ODT resistor 15336 (box T in DRAMs 15316, 15318, 15320, and 15324) described with respect to FIG. 153A. In particular, ODT block 15342 includes an ODT resistor 15346 that is coupled to ground/reference voltage 15344 on one side and a switch 15348 on the other side. The switch 15348 is controlled with ODT signal 15352, which can turn the switch either on or off. When the switch 15348 is turned on, it connects the ODT resistor 15346 to transmission line 15340, permitting ODT resistor 15346 to terminate the transmission line 15340. When the switch 15348 is turned off, it disconnects the ODT resistor 15346 from the transmission line 15340. In addition, transmission line 15340 can be coupled to other circuitry 15350 within DIMM. The value of the ODT resistor 15346 can be selected using MRS command 15354.

FIG. 153C is a block diagram illustrating the exemplary structure of ODT block within an interface circuit. The structure illustrated in FIG. 153B embodies the ODT resistor 15366 (box T2 in DRAMs 15316, 15318, 15320, and 15324) described above with respect to FIG. 153A. In particular, ODT block 15360 includes an ODT resistor 15366 that is coupled to ground/reference voltage 15362 on one side and a switch 15368 on the other side. In addition, the ODT block 15360 can be controlled by circuit 15372, which can receive ODT signals and MRS commands from a memory controller. Circuit 15372 is a part of the interface circuit 15314 in FIG. 153A and is responsible for controlling the ODT. The switch 15368 can be controlled with either ODT0 signal 15376 or ODT1 signal 15378, which are supplied by the circuit 15372.

In some implementations, circuit 15372 transmits the same MRS commands or ODT signals to the ODT resistor 15366 that it receives from the memory controller. In some other implementations, circuit 15372 generates its own commands or signals that are different from the commands/signals it receives from the memory controller. Circuit 15372 can generate these MRS commands or ODT signals based on a lookup table and the input commands/signals from the memory controller. When the switch 15368 receives an ODT signal from the circuit 15372, it can either turn on or turn off. When the switch 15368 is turned on, it connects the ODT resistor 15366 to the transmission line 15370, permitting ODT resistor 15366 to terminate the transmission line 15370. When the switch 15368 is turned off, it disconnects the ODT resistor 15366 from the transmission line 15370. In addition, transmission line 15370 can be coupled to other circuitry 15380 within the interface circuit. The value of the ODT resistor 15366 can be selected using MRS command 15374.

FIG. 154 is a block diagram illustrating one slice of an example 2-rank DIMM using two interface circuits for DIMM termination per slice. In some implementations, FIG. 154 includes an interface circuit similar to those previously described in FIGS. 151A-F and 153A-C. Elements within FIG. 154 can have attributes comparable to and illustrative of corresponding elements in FIGS. 151A-F and 153A-C.

FIG. 154 shows a DIMM 15400 that has two virtual ranks and four physical ranks DRAM 15410 is in physical rank number zero, DRAM 15412 is in the first physical rank, DRAM 15414 is in the second physical rank, DRAM 15416 is in the third physical rank. DRAM 15410 and DRAM 15412 are in virtual rank 0 15440. DRAM 15414 and DRAM 15416 are in virtual rank 115442. In general, DRAMs 15410, 15412, 15414, and 15416 have attributes comparable to and illustrative to DRAMs discussed with respect to FIGS. 151A-F and 153A-C. For example, DRAMs 15410, 15412, 15414, and 15416 can include ODT resistors 15464, which were discussed with respect to FIG. 153B.

In addition, FIG. 154 shows an interface circuit 15420 and an interface circuit 15422. In some implementations, interface circuits 15420 and 15422 have attributes similar to the interface circuits described with respect to FIGS. 151A-F and 153A-C. For example, interface circuits 15420 and 15422 can include ODT resistors 15460 and 15462, which function similarly to ODT resistor 15366 discussed above with respect to FIG. 153C.

FIG. 154 also shows one instance of a logic circuit 15424. DIMM 15400 can include other components, for example, a register, smart (i.e. modified or enhanced) register device or register circuit for R-DIMMs, a discrete PLL and/or DLL, voltage regulators, SPD, other non-volatile memory devices, bypass capacitors, resistors, and other components. In addition or alternatively, some of the above components can be integrated with each other or with other components.

In some implementation, DIMM 15400 is connected to the system (e.g., memory controller) through conducting fingers 15430 of the DIMM PCB. Some, but not all, of these fingers are illustrated in FIG. 154, for example, the finger for DQS0_t, shown as finger 15430. Each finger receives a signal and corresponds to a signal name, e.g., DQS0_15432. DQ0 15434 is an output (or pin) of the interface circuits 15420 and 15422. In some implementations, these two outputs are tied, dotted or connected to an electrical network. Any termination applied to any pin on this electrical network thus applies to the entire electrical network (and the same is true for other similar signals and electrical networks). Furthermore, interface circuits 15420 and 15422 are shown as containing multiple instances of switch 15436. Net DQ0 15434 is connected through switches 15436 to signal pin DQ[0] of DRAM 15410, DRAM 15412, DRAM 15414, and DRAM 15416.

In some implementations, switch 15436 is a single-pole single-throw (SPST) switch. In some other implementations, switch 15436 is mechanical or non-mechanical. Regardless, the switch 15436 can be one of various switch types, for example, SPST, DPDT, or SPDT, a two-way or bidirectional switch or circuit element, a parallel combination of one-way, uni-directional switches or circuit elements, a CMOS switch, a multiplexor (MUX), a de-multiplexer (de-MUX), a CMOS bidirectional buffer; a CMOS pass gate, or any other type of switch.

The function of the switches 15436 is to allow the physical DRAM devices behind the interface circuit to be connected together to emulate a virtual DRAM. These switches prevent such factors as bus contention, logic contention or other factors that may prevent or present unwanted problems from such a connection. Any logic function or switching element that achieves this purpose can be used. Any logical or electrical delay introduced by such a switch or logic can be compensated for. For example, the address and/or command signals can be modified through controlled delay or other logical devices.

Switch 15436 is controlled by signals from logic circuit 15424 coupled to the interface circuits, including interface circuit 15420 and interface circuit 15422. In some implementations, switches 15436 in the interface circuits are controlled so that only one of the DRAM devices is connected to any given signal net at one time. Thus, for example, if the switch connecting net DQ0 5434 to DRAM 15410 is closed, then switches connecting net DQ0 5434 to DRAMs 15412, 15414, 15416 are open.

In some implementations, the termination of nets, such as DQ0 5434, by interface circuits 15420 and 15422 is controlled by inputs ODT0 i 15444 (where "i" stands for internal) and ODT1 i 15446. While the term ODT has been used in the context of DRAM devices, the on-die termination used by an interface circuit can be different from the on-die termination used by a DRAM device. Since ODT0 i 15444 and ODT1 i 15446 are internal signals, the interface circuit termination circuits can be different from standard DRAM devices. Additionally, the signal levels, protocol, and timing can also be different from standard DRAM devices.

The ability to adjust the interface circuit's ODT behavior provides the system designer with an ability to vary or tune the values and timing of ODT, which may improve signal quality of the channel and reduce power dissipation. In one example, as part of the target rank, interface circuit 15420 provides termination when DRAM 15410 is connected to net DQ0 5434. In this example, the interface circuit 15420 can be controlled by ODT0 i 15444 and ODT1 i 15446. As part of the non-target rank, interface circuit 15422 can also provide a different value of termination (including no termination at all) as controlled by signals ODT0 i 15444 and ODT1 i 15446.

In some implementations, the ODT control signals or commands from the system are ODT0 15448 and ODT1 15450. The ODT input signals or commands to the DRAM devices are shown by ODT signals 15452, 15454, 15456, 15458. In some implementations, the ODT signals 15452, 15454, 15456, 15458 are not connected. In some other implementations, ODT signals 15452, 15454, 15456, 15458 are connected, for example, as: (a) hardwired (i.e. to VSS or VDD or other fixed voltage); (b) connected to logic circuit 15424; (c) directly connected to the system; or (d) a combination of (a), (b), and (c).

As shown in FIG. 154, transmission line termination can be placed in a number of locations, for example, (a) at the output of interface circuit 15420; (b) the output of interface circuit 15422; (c) the output of DRAM 15410; (d) the output of DRAM 15412; (e) the output of DRAM 15414; (f) the output of DRAM 15416; or may use any combination of these. By choosing location for termination, the system designer can vary or tune the values and timing of termination to improve signal quality of the channel and reduce power dissipation.

Furthermore, in some implementations, a memory controller in a DDR3 system sets termination values to different values than used in normal operation during different DRAM modes or during other DRAM, DIMM and system modes, phases, or steps of operation. DRAM modes can include initialization, wear-leveling, initial calibration, periodic calibration, DLL off, DLL disabled, DLL frozen, or various power-down modes.

In some implementations, the logic circuit 15424 may also be programmed (by design as part of its logic or caused by control or other signals or means) to operate differently during different modes/phases of operation so that a DIMM with one or more interface circuits can appear, respond to, and communicate with the system as if it were a standard or traditional DIMM without interface circuits. Thus, for example, logic circuit 15424 can use different termination values during different phases of operation (e.g., memory reads and memory writes) either by pre-programmed design or by external command or control, or the logic timing may operate differently. For example, logic circuit 15424 can use a termination value during read operations that is different from a termination value during write operations.

As a result, in some implementations, no changes to a standard computer system (motherboard, CPU, BIOS, chipset, component values, etc.) need to be made to accommodate DIMM 15400 with one or more interface circuits. Therefore, while in some implementations the DIMM 15400 with the interface circuit(s) may operate differently from a standard or traditional DIMM (for example, by using different termination values or different timing than a standard DIMM), the modified DIMM would appear to the computer system/memory controller as if it were operating as a standard DIMM.

In some implementations, there are two ODT signals internal to the DIMM 15400. FIG. 154 shows these internal ODT signals between logic circuit 15424 and the interface circuits 15420 and 15422 as ODT0 i 15444 and ODT1 i 15446. Depending on the flexibility of termination required, the size and complexity of the lookup table, and the type of signaling interface used, there may be any number of signals between logic circuit 15424 and the interface circuits 15420 and 15422. For example, the number of internal ODT signals can be same, fewer, or greater than the number of ODT signals from the system/memory controller.

In some implementations, there are two interface circuits per slice of a DIMM 15400. Consequently, an ECC DIMM with 72 bits would include 2×72/4=36 interface circuits. Similarly, a 64-bit DIMM would include 2×64/4=32 interface circuits.

In some implementations, interface circuit 15420 and interface circuit 15422 are combined into a single interface circuit, resulting in one interface circuit per slice. In these implementations, a DIMM would include 72/4=18 interface circuits. Other number (8, 9, 16, 18, etc.), arrangement, or integration of interface circuits may be used depending on a type of DIMM, cost, power, physical space on the DIMM, layout restrictions and other factors.

In some alternative implementations, logic circuit 15424 is shared by all of the interface circuits on the DIMM 15400. In these implementations, there would be one logic circuit per DIMM 15400. In yet other implementations, a logic circuit or several logic circuits are positioned on each side of a DIMM 15400 (or side of a PCB, board, card, package that is part of a module or DIMM, etc.) to simplify PCB routing. Any number of logic circuits may be used depending on the type of DIMM, the number of PCBs used, or other factors.

Other arrangements and levels of integration are also possible. There arrangements can depend, for example, on silicon die area and cost, package size and cost, board area, layout complexity as well as other engineering and economic factors. For example, all of the interface circuits and logic circuits can be integrated together into a single interface circuit. In another example, an interface circuit and/or logic circuit can be used on each side of a PCB or PCBs to improve board routing. In yet another example, some or all of the interface circuits and/or logic circuits can be integrated with one or more register circuits or any of the other DIMM components on an R-DIMM.

FIG. 155 is a block diagram illustrating a slice of an example 2-rank DIMM 15500 with one interface circuit per slice. In some implementations, DIMM 15500 includes on or more interface circuit as described above in FIGS. 151A-F, 153A-C, and 154. Additionally, elements within DIMM 15500 can have attributes similar to corresponding elements in FIGS. 151A-F, 153A-C, and 154. For example, interface circuit 15520 can include ODT resistor 15560, which can be similar to ODT resister 15366, discussed with respect to FIG. 153C. Likewise, DRAM devices 15510, 15512, 15514, and 15516 can include ODT resistors 15580, which can be similar to ODT resistor 15346 discussed with respect to FIG. 153B.

DIMM 15500 has virtual rank 0 15540, with DRAM devices 15510 and 15512 and virtual rank 115542, with DRAM devices 15514 and 15516. Interface circuit 15520 uses switches 15562 and 15564 to either couple or isolate data signals such as DQ0 5534 to the DRAM devices. Signals, for example, DQ0 5534 are received from the system through connectors e.g., finger 15530. A register circuit 15524 provides ODT control signals on bus 15566 and switch control signals on bus 15568 to interface circuit 15520 and/or other interface circuits. Register circuit 15524 can also provide standard JEDEC register functions. For example, register circuit 15524 can receive inputs 15572 that include command, address, control, and other signals from the system through connectors, e.g., finger 15578. In some implementations, other signals are not directly connected to the register circuit 15524, as shown in FIG. 155 by finger 15576. The register circuit 15524 can transmit command, address, control and other signals (possibly modified in timing and values) through bus 15574 to the DRAM devices, for example, DRAM device 15516. Not all the connections of command, address, control and other signals between DRAM devices are shown in FIG. 155.

The register circuit 15524 can receive inputs ODT0 15548 and ODT1 15550 from a system (e.g., a memory controller of a host system). The register circuit 15524 can also alter timing and behavior of ODT control before passing this information to interface circuit 15520 through bus 15566. The interface circuit 15520 can then provide DIMM termination at DQ pin with ODT resistor 15560. In some implementations, the timing of termination signals (including when and how they are applied, changed, removed) and determination of termination values are split between register circuit 15524 and interface circuit 15520.

Furthermore, in some implementations, the register circuit 15524 also creates ODT control signals 15570: R0_ODT0, R0_ODT1, R1_ODT0, R1_ODT1. These signals can be coupled to DRAM device signals 15552, 15554, 15556 and 15558. In some alternative implementations, (a) some or all of signals 15552, 15554, 15556 and 15558 may be hard-wired (to VSS, VDD or other potential); (b) some or all of signals 15570 are created by interface circuit 15520; (c) some or all of signals 15570 are based on ODT0 15548 and ODT1 15550; (d) some or all of signals 15570 are altered in timing and value from ODT0 15548 and ODT1 15550; or (e) any combination of implementations (a)-(d).

FIG. 156 illustrates an physical layout of an example printed circuit board (PCB) 15600 of a DIMM with an interface circuit. In particular, PCB 15600 includes an ECC R-DIMM with nine interface circuits and thirty six DRAMs 15621. Additionally, FIG. 156 shows the two sides of a single DIMM 15610. The DIMM 15610 includes fingers 15612 that permit the DIMM 15610 to be electrically coupled to a system. Furthermore, as shown in FIG. 156, PCB 15600 includes 36 DRAM (15621-15629, front/bottom; 15631-15639 front/top; 15641-15649 back/top; 15651-15659 back/bottom).

FIG. 156 also shows nine interface circuits 15661-15669, located in the front/middle. In addition, FIG. 156 shows one register circuit 15670 located in front/center of the PCB 15600. The register circuit 15670 can have attributes comparable to those described with respect to interface circuit 15150. DIMMs with a different number of DRAMs, interface circuits, or layouts can be used.

In some implementations, interface circuits can be located at the bottom of the DIMM PCB, so as to place termination electrically close to fingers 15612. In some other implementations, DRAMs can be arranged on the PCB 15600 with different orientations. For example, their longer sides can be arranged parallel to the longer edge of the PCB 15600. DRAMs can also be arranged with their longer sides being perpendicular to the longer edge of the PCB 15600. Alternatively, the DRAMs can be arranged such that some have long sides parallel to the longer edge of the PCB 15600 and others have longer sides perpendicular to the longer edge of the PCB 15600. Such arrangement may be useful to optimize high-speed PCB routing. In some other implementations, PCB 15600 can include more than one register circuit. Additionally, PCB 15600 can include more than one PCB sandwiched to form a DIMM. Furthermore, PCB 15600 can include interface circuits placed on both side of the PCB.

FIG. 157 is a flowchart illustrating an example method 15700 for providing termination resistance in a memory module. For convenience, the method 15700 will be described with reference to an interface circuit that performs the method (e.g., interface circuit 15150). It should be noted, however, that some or all steps of method 15700 can be performed by other components within computer systems 15100A-F.

The interface circuit communicates with memory circuits and with a memory controller (step 15702). The memory circuits are, for example, dynamic random access memory (DRAM) integrated circuits in a dual in-line memory module (DIMM).

The interface circuit receives resistance-setting commands from the memory controller (step 15704). The resistance-setting commands can be mode register set (MRS) commands directed to on-die termination (ODT) resistors within the memory circuits.

The interface circuit selects a resistance value based on the received resistance-setting commands (step 15706). The interface circuit can select a resistance value from a look-up table. In addition, the selected resistance value can depend on the type of operation performed by the system. For example, the selected resistance value during read operations can be different from the selected resistance value during write operations. In some implementations, the selected resistance value is different from the values specified by the resistance-setting commands. For example, the selected resistance value can be different from a value prescribed by JEDEC standard for DDR3 DRAM.

The interface circuit terminates a transmission line with a resistor of the selected resistance value (step 15708). The resistor can be an on-die termination (ODT) resistor. The transmission line can be, for example, a transmission line between the interface circuit and the memory controller.

While the foregoing is directed to embodiments of the present invention, other and further embodiments of the invention may be devised without departing from the basic scope thereof. Therefore, the scope of the present invention is determined by the claims that follow. In the above description, for purposes of explanation, numerous specific details are set forth in order to provide a thorough understanding. It will be apparent, however, to one skilled in the art that implementations can be practiced without these specific details. In other instances, structures and devices are shown in block diagram form in order to avoid obscuring the disclosure.

In particular, one skilled in the art will recognize that other architectures can be used. Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as “processing” or “computing” or “calculating” or “determining” or “displaying” or the like, refer to the action and processes of a computer system, or similar electronic computing device, that manipulates and transforms data represented as physical (electronic) quantities within the computer system’s registers and memories into other data similarly represented as physical quantities within the computer system memories or registers or other such information storage, transmission or display devices.

An apparatus for performing the operations herein can be specially constructed for the required purposes, or it can comprise a general-purpose computer selectively activated or reconfigured by a computer program stored in the computer. Such a computer program can be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and modules presented herein are not inherently related to any particular computer or other apparatus. Various general-purpose systems can be used with programs in accordance with the teachings herein, or it can prove convenient to construct more specialized apparatuses to perform the method steps. The required structure for a variety of these systems will appear from the description. In addition, the present examples are not described with reference to any particular programming language. It will be appreciated that a variety of programming languages can be used to implement the teachings as described herein. Furthermore, as will be apparent to one of ordinary skill in the relevant art, the modules, features, attributes, methodologies, and other aspects can be implemented as software, hardware, firmware or any combination of the three. Of course, wherever a component is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present description is in no way limited to implementation in any specific operating system or environment.

While this specification contains many specifics, these should not be construed as limitations on the scope of what may be claimed, but rather as descriptions of features specific to particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Memory Module Packaging

Embodiments of the present invention relate to design of a heat spreader (also commonly referred to as a "heat sink") for memory modules. They may also be applied more generally to electronic sub-assemblies that are commonly referred to as add-in cards, daughtercards, daughterboards, or blades. These are sub-components that are attached to a larger system by a set of sockets or connectors and mechanical support components collectively referred to as a motherboard, backplane, or card cage. Note that many of these terms are sometimes hyphenated in common usage, i.e. daughter-card instead of daughtercard. The common characteristic linking these different terms is that the part of the system they describe is optional, i.e. may or may not be present in the system when it is operating, and when it is present it may be attached or "populated" in different locations which are functionally identical or nearly so but result in physically different configurations with consequent different flow patterns of the cooling fluid used within the system.

FIG. 158 illustrates an exploded view of a heat spreader module 15800, according to one embodiment of the present invention. As shown, the heat spreader module 15800 includes a printed circuit board (PCB) 15802 to which one or more electronic components 15804 are mounted. As described below, in various embodiments, the electronic components 15804 may be disposed on both sides or only one side of the PCB 15802. As is readily understood, the operation of the electronic components produces thermal energy, and it is understood in the art that some means for dissipating the thermal energy must be considered in any physical design using electronic components.

In the embodiment shown in FIG. 158, the heat generated by the electronic components 15804 is dissipated by virtue of physical contact to the electronic components 15804 by one or more thermally conductive materials. As shown, the electronic components 15804 are in physical contact with a layer of thermally conductive material that serves as a thermal interface material (referred to as "TIM") 15806. The TIM 15806 is, in turn, in contact with a heat spreader plate 15808. Both the TIM 15806 and the heat spreader plate 15808 are thermally conductive materials, although there is no specific value of thermal conductivity coefficients or thermally conductive ratios required for the embodiments to be operable.

The TIM 15806 may come in the form of a lamination layer or sheet made of any from a group of materials including conductive particle filled silicon rubber, foamed thermoset material, and a phase change polymer. Also, in some embodiments, the materials used as gap fillers may also serve as a thermal interface material. In some embodiments, the TIM 15806 is applied as an encasing of the electronic components 15804 and once applied the encasing may provide some rigidity to the PCB assembly when adhesively attached both to the components and the heat spreader. In an embodiment that both adds rigidity to the package and facilitates disassembly for purposes of inspection and re-work, the TIM 15806 may be a thermoplastic material such as the phase change polymer or a compliant material with a non-adhesive layer such as metal foil or plastic film.

The heat spreader plate 15808 can be formed from any of a variety of malleable and thermally conductive materials with a low cost stamping process. In one embodiment, the overall height of the heat spreader plate 15808 may be between 2 mm and 2.5 mm. In various embodiments, the heat spreader plate 15808 may be flat or embossed with a pattern that increases the rigidity of the assembly along the long axis.

In one embodiment, the embossed pattern may include long embossed segments 15815 *a*, 15815 *b* that run substantially the entire length of the longitudinal edge of the heat spreader plate. In another embodiment, in particular to accommodate an assembly involving c-clips 15814, the embossed pattern may include shorter segments 15816. As readily envisioned, and as shown, patterns including both long and short segments are possible. These shorter segments are disposed as to provide location guidance for the retention clips. Furthermore, the ends of the segment of embossing, whether a long embossed segment or a shorter segment, may be closed (as illustrated in FIG. 158) or may be open (as illustrated in FIG. 161).

In designs involving embossed patterns with closed ends, those skilled in the art will readily recognize that the embossing itself increases the surface area available for heat conduction with the surrounding fluid (air or other gases, or in some cases liquid fluid) as compared with a non-embossed (flat) heat spreader plate. The general physical phenomenon exploited by embodiments of this invention is that thermal energy is conducted from one location to another location as a direct function of surface area. Embossing increases the surface area available for such heat conduction, thereby improving heat dissipation. For example, a stamped metal pattern may be used to increase the surface area available for heat conduction.

As a comparison, Table 17 below illustrates the difference in surface area, comparing one side of a flat heat spreader plate to one side of an embossed heat spreader plate having the embossed pattern as shown in FIG. 158.

TABLE 17

| Characteristic | Surface area (flat heat spreader) | Surface area (embossed heat spreader) | Increase in surface area (%) |
|---|---|---|---|
| Embossed | 3175 $mm^2$ | 3175(+331) $mm^2$ | 10.6% |

In some embodiments, the PCB 15802 may have electrical components 15804 disposed on both sides of the PCB 15802. In such a case, the heat spreader module 15800 may further include a second layer of TIM 15810 and a second heat spreader plate 15812. All of the discussions herein with regard to the TIM 15806 apply with equal force to the TIM 15810. Similarly, all of the discussions herein with regard to the heat spreader plate 15808 apply with equal force to the heat spreader plate 15812. Furthermore, the heat spreader plate(s) may be disposed such that the flat side (concave side) is toward the electrical components (or stated conversely, the convex side is away from the electrical components). In various embodiments, a heat spreader may be disposed only on one side of the PCB 15802 or be disposed on both sides.

In one embodiment, the heat spreader plate 15808 may include perforations or openings (not shown in FIG. 158) allowing interchange of the cooling fluid between inner and outer surfaces (where the term "inner surface" refers to the surface that is closest to the electronic components 15804). These openings may be located at specific positions relative to an embossed pattern such that flow over the opening is accelerated relative to the average flow velocity. Alternately, the openings may be located at the top of narrow protrusions from the surface such that they are outside the boundary layer of slower fluid velocity immediately adjacent to the surface. In either case, the TIM 15810 may be designed in coordination with the heat spreader plate 15808 to ensure that the TIM 15810 also allows fluid flow from beneath the heat spreader plate 15808 out through the holes. This can be ensured by applying a liquid TIM to either the heat spreader plate 15808 or the electronic components 15804 using a printing or transfer process which only leaves the TIM 15810 on the high points of the surface and does not block the holes of the heat spreader plate 15808 or the spaces between the electronic components 15804. Alternately a tape or sheet TIM can be used where the TIM material itself allows passage of fluid through it, or the sheet may be perforated such that there are sufficient open passages to ensure there is always an open path for the fluid through the TIM 15810 and then the heat spreader plate 15808.

In another embodiment, the heat spreader plate 15808 may be formed as a unit from sheet or roll material using cutting (shearing/punching) and deformation (embossing/stamping/bending) operations and achieves increased surface area and/or stiffness by the formation of fins or ridges protruding out of the original plane of the material, and/or slots cut into the material (not shown in FIG. 158). The fins may be formed by punching a "U" shaped opening and bending the resulting tab inside the U to protrude from the plane of the original surface around the cut. The formation of the U shaped cut and bending of the resulting tab may be completed as a single operation for maximum economy. The protruding tab may be modified to a non-planar configuration: for example an edge may be folded over (hemmed), the entire tab may be twisted, the free edge opposite the bend line may be bent to a curve, a corner may be bent at an angle, etc.

In another embodiment, the heat spreader plate 15808 may be manufactured by any means which incorporates fins or ridges protruding into the surrounding medium or slots cut into the heat spreader (not shown in FIG. 158), where the fins or slots are designed with a curved shape (i.e. an airfoil) or placed at an angle to the incoming fluid so as to impart a velocity component to the impinging fluid that is in a plane parallel or nearly parallel to the base of the heat spreader (contact surface with the TIM or electronic components) and at right angles to the original fluid flow direction. The sum of this velocity component with the original linear fluid velocity vector creates a helical flow configuration in the fluid flowing over the heat spreader which increases the velocity of the fluid immediately adjacent to the heat spreader and consequently reduces the effective thermal resistance from the heat spreader to the fluid. Heat spreaders which are designed to create helical flow are referred to herein as "angled fin heat spreaders," and the fins positioned at an angle to the original fluid flow direction are referred to herein as "angled fins", without regard to the exact angle or shape of the fins which is used to achieve the desired result. The angled fins may be continuous or appear as segments of any length, and may be grouped together in stripes aligned with the expected air flow or combined with other bent, cut, or embossed features.

In another embodiment, two or more memory modules incorporating angled fin heat spreader plates are placed next to each other with the cooling fluid allowed to flow in the gaps between modules. When angled fin heat spreaders with matching angles (or an least angles in the same quadrant i.e. 0-90, 90-180, etc.) are used on both faces of each module and consequently both sides of a gap, the fins on both heat spreaders contribute to starting the helical flow in the same direction and the angled fins remain substantially parallel to the local flow at the surface of each heat spreader plate down the full length of the module.

An additional benefit which may be achieved with the angled fins is insensitivity to the direction of air flow—cooling air for the modules is commonly supplied in one of three configurations. The first configuration is end-to-end (parallel to the connector). The second configuration is bottom-to-top (through holes in the backplane or motherboard). The third configuration is in both ends and out the bottom or top. The reverse flow direction for any of these configurations may also occur. If the fin angle is near 45 degrees relative to the edges of the module, any of the three cases will give similar cooling performance and take advantage of the full fin area. Typical heat spreader fins designed according to the present art are arranged parallel to the expected air flow for a single configuration and will have much worse performance when the air flow is at 90 degrees to the fins, as it would always be for at least one of the three module airflow cases listed above. The angle of the fins does not have to be any particular value for the benefit to occur, although angles close to 45 degrees will have the most similar performance across all different airflow configurations. Smaller or larger angles will improve the performance of one flow configuration at the expense of the others, but the worst case configuration will always be improved relative to the same case without angled fins. Given this flexibility it may be possible to use a single heat spreader design for systems with widely varying airflow patterns, where previously multiple unique heat spreader designs would have been required.

In yet another embodiment, the heat spreader plate 15808 may be manufactured by any means which includes a mating surface at the edge of the module opposite the connector (element 16808 in FIG. 168A) to allow for heat conduction to an external heat sink or metal structure such as the system chassis. The mating surface will typically be a flat bent tab and/or machined edge designed to lie within a plane parallel to the motherboard or backplane and perpendicular to the module PCB and heat spreader seating plane. Other mating surface features which facilitate good thermal conduction are possible, such as repeating parallel grooves, flexible metal "fingers" to bridge gaps, etc. Thermal interface material or coatings may be applied to the module to improve conductivity through the surface. The heat spreader plate 15808 may include alignment features (not shown in FIG. 158) to ensure that the mating surfaces of the heat spreader plates on both sides of a module lie within the same plane to within an acceptable tolerance. These alignment features may include tabs or pins designed to contact one or more edges or holes of the PCB 15802, or tabs or pins which directly contact the heat spreader plate 15808 on the other face of the module.

In another embodiment, the heat spreader plate 15808 may be applied to the electronic components 15804 (especially DRAM) in the form of a flexible tape or sticker (i.e. the heat spreader has negligible resistance to lengthwise compressive forces). TIM 15810 may be previously applied to the electronic components 15804 or more commonly provided as a backing material on the tape or sticker. In this embodiment the heat spreader plate 15808 is flexible enough to conform to the relative heights of different components and to the thermal expansion and contraction of the PCB 15802. The heat spreader plate 15808 may be embossed, perforated, include bent tabs, etc., to enhance surface area, allow air passage from inner to outer surfaces, and reduce thermal resistance in conducting heat to the fluid.

FIG. 159 illustrates an assembled view of a heat spreader module, according to one embodiment of the present invention. The heat spreader module is accomplished using commonly available electronics manufacturing infrastructure and assembly practices. Fastening mechanisms such as the C-clip shown in this embodiment are employed to provide sufficient clamping force and mechanical integrity while minimizing obstruction to thermal dissipation performance. Often thermal interface materials are pressure sensitive and require controlled force application in order to optimize thermal conduction properties. Fastening mechanisms such as the c-clips shown can be designed to maximize heat spreader performance while complying with industry standards for form factor and mechanical reliability In the discussions above, and as shown in FIG. 158, the heat spreader plate 15808 may be substantially planar. In other embodiments, the heat spreader plate 15808 may be formed into a shape conforming to the contour of the components on the underlying circuit assembly utilizing the stamping or other low cost forming operation.

FIGS. 160A through 160C illustrate shapes of a heat spreader plate, according to different embodiments of the present invention. Following the example shown in FIGS. 160A and 160B, the undulation may form an alternating series of high-planes and low-planes. In a preferred embodiment, the high-plane portions and the low-plane portions follow the terrain of the shapes of the components mounted to the PCB 15802.

In yet another embodiment, the pattern of embossing substantially follows the undulations. That is, for example, each of the high-plane and low-plane regions may be embossed with one or more embossed segments 16002 substantially of the length of the planar region, as shown in FIG. 160C.

FIG. 161 illustrates a heat spreader module 16100 with open face embossment areas, according to one embodiment of the present invention. In designs involving embossed patterns with open faces, the ends of the embossed segments may be sufficiently expanded to facilitate more heat spreader surface area contact with the surrounding fluid (air or other gases, or in some cases liquid fluid) as compared with closed-ended embossed segments. These open face embossments may significantly increase thermal performance by enabling exposure of the concave side of the heat spreader plate in addition to the convex while not significantly blocking the available channel area for air flow.

As a comparison, Table 18 below shows the difference in surface area, comparing one side of a flat heat spreader plate to one side of an embossed heat spreader plate having the embossed pattern shown in FIG. 161.

TABLE 18

| Characteristic | Surface area (embossed segments with closed ends) | Surface area (embossed segments with open ends) | Increase in surface area (%) |
|---|---|---|---|
| Open end Embossed | 3175 $mm^2$ | 3175 + 2118 $mm^2$ | 67% |

FIG. 162 illustrates a heat spreader module 16200 with a patterned cylindrical pin array area, according to one embodiment of the present invention. In designs involving such pin patterns the surface area exposed to air flow can be increased merely by increasing the density of the protrusions. The protrusions may be formed by forging or die-casting.

FIG. 163 illustrates an exploded view of a module 16300 using PCB heat spreader plates 16340 on each face, according to one embodiment of the present invention. This embodiment consists of a heat spreader which is manufactured as an additional separate PCB for each face of the module (or using similar processes to a PCB, i.e. plating metal or thermally conductive material onto the surface of a substantially less conductive substrate). As shown, the module 16300 includes electronic components mounted on a two-sided PCB 16310. It must be noted that, typically, the heat spreader plates 16340 require mechanical stiffness to distribute the clamping forces from localized contact points using fasteners 16350 (also referred to herein as clamps and/or clips) to a TIM 16330 at each heat source (e.g., ASIC, DRAM, FET, etc). Given a layout with a relatively low concentration of heat sources (e.g. on a DIMM), more, and/or thicker heat spreader material (e.g. copper or aluminum) is required to provide mechanical stiffness than would be needed simply to carry the heat away. The PCB heat spreader plates 16340 use a non-metallic core material to provide the required stiffness in place of the usual solid copper or aluminum heat spreader plates. The PCB heat spreader plates 16340 might have devices 16335 mounted on one or both sides. Some examples of the PCB heat spreader plates are described in greater detail in FIGS. 164, 165A, and 165B. The entire assembly 16300 may be squeezed together with the fastener 16350, applying forces on the faces of the assembly. Use of a compressible TIM permits the PCB heat spreader plates 16340 to deform somewhat under the clamping pressures while still maintaining sufficient thermal coupling. In some embodiments, the PCB heat spreader plates 16340 may be formed of a fiberglass or phenolic PCB material and may employ plated through-holes to further distribute heat.

The heat spreader module 16300 may utilize a low cost material to fabricate the PCB heat spreader plates 16340. The low cost material may have low thermal conductivity as a “core” to provide the desired mechanical properties (stiffness, energy absorption when a module is dropped), while a thin metal coating on one or both sides of PCB(s) 16340 provides the required thermal conductivity. Thermal conduction from one face of the core to the other is provided by holes drilled or otherwise formed in the core which are then plated or filled with metal (described in greater detail in FIG. 164). The advantage of this method of construction is that the amount of metal used can be only the minimum that is required to provide the necessary thermal conductivity, while the mechanical properties are controlled independently by adjusting the material properties and dimensions of the core. The use of standard PCB manufacturing processes allows this type of heat spreader to include patterned thermally conductive features that allow some parts of the heat spreader module 16300 to be effectively isolated from others. This allows different parts of the heat spreader module 16300 to be maintained at different temperatures, and allows measurement of the temperature at one location to be taken using a sensor attached elsewhere (described in greater detail in FIG. 166).

FIG. 164 illustrates a PCB stiffener 16400 with a pattern of through-holes 16410, according to one embodiment of the present invention. The PCB stiffener 16400 may be used as the PCB heat spreader plates 16340 illustrated in FIG. 163. As shown, plated through holes 16410 may be purposefully formed through the PCB 16400. In such an embodiment, there may be many variations. For example, a thickness 16420 of the PCB 16400 may be selected according to the mechanical stiffness properties of the PCB material. Furthermore, a size of the through-holes 16410, thickness of the walls between the through-holes 16410, dimensions and composition of the though-hole plating, and surface plating thickness 16430 may affect the thermal spreading resistance. The through-holes 16410 may be plated shut, or be filled with metal (e.g. copper) or non-metal compositions (e.g. epoxy). Given these independently controlled variables, various embodiments support separate tuning of mechanical stiffness (e.g. based on PCB thickness and materials used, such as, for example phenolic, fiberglass, carbon fiber), through-thickness conductivity (e.g. based on number and size of the plated through-holes 16410), and planar conductivity (e.g. based on thickness of copper foil and plating).

Adapting a PCB to be used as the heat spreader minimizes coefficient of thermal expansion (CTE) mismatch between the heat spreader (e.g., the PCB 16340 or the PCB stiffener 16400) and the core PCB (e.g., the PCB 16310) that the devices being served are attached to (e.g., the electronic components 16320). As a result, warpage due to temperature variation may be minimized, and the need to allow for relative movement at the interface between the electronic components and the heat spreader may be reduced.

FIG. 165A illustrates a PCB stiffener 16570 with a pattern of through holes allowing air flow from inner to outer surfaces, according to one embodiment of the present invention. The PCB stiffener 16570 may be used as the PCB heat spreader plates 16340 illustrated in FIG. 163. As shown in FIG. 165A, unfilled plated through-holes 16510 may be used to allow the airflow from the space under the PCB 16570 to pass out through the unfilled holes due to the air pressure differential. Top surface 16525 and bottom surface (not shown in FIG. 165A) are thermally conductive surfaces, and acting together with the TIM 16520 contribute to reducing effective total thermal resistance of the PCB 16570, thus improving the heat spreading effectiveness of the assembly.

In fact, and as shown in FIG. 165B, multiple layers of substrate material used to make the PCB 16570 may be included and then some thickness (e.g. one or more layers) of the substrate material can be removed by acid or melting to leave the via structures as hollow pins 16530 protruding above the surface of the remaining layers. Because the top end 16540 of the hollow pins 16530 is out of the boundary layer of slow air near the surface 16550, there is a “smokestack effect” which increases the air pressure differential between the pressure due to airflow 16506 relative to the pressure due to airflow 16560, leading to increased airflow through the hollow pins 16530, and thus reducing the total thermal resistance of the heat spreader to the air.

FIG. 166 illustrates a heat spreader for combining or isolating areas, according to one embodiment of the present invention. As shown, thermally conductive materials may be shaped into traces 16610 disposed on a substrate 16620 so as to thermally combine certain areas (and/or thermally separate others) so that a “hot” component 16630 does not excessively heat immediately adjacent components 16640. Additionally, any of the traces etched into the board might be used to carry temperature information from one location to another, for example, to measure the temperature of a hot component with a thermal diode that makes contact with the heat spreader at another location on the board. In effect, the board is used as a “thermal circuit board” carrying temperatures instead of voltages. This works especially well in situations where the thermal conductivity of the transmitting material is greater than that of material forming the PCB. In embodiments demanding a separate area for components with different temperature limits or requiring separate temperature measurement, the aforementioned techniques for distributing or transmitting temperatures, or thermally combining or thermally isolating areas might be used.

The embodiments shown in FIGS. 163 through 166 may be employed in any context of heat spreader module designs, including the contexts of FIGS. 158-5.

Figure 167A:
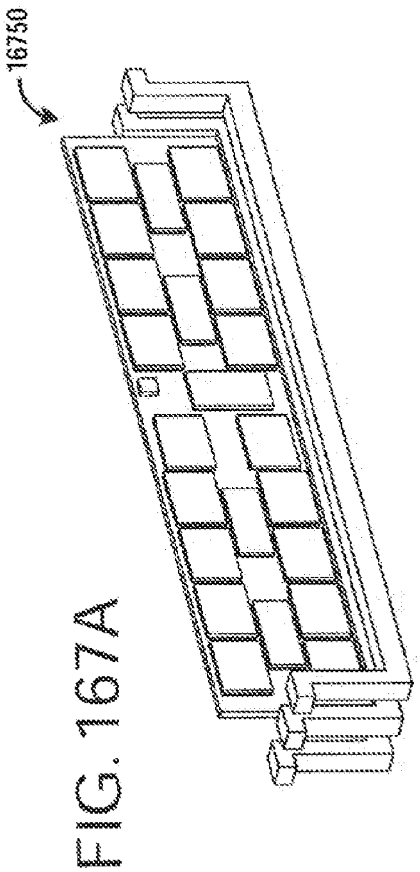
Figure 167B:
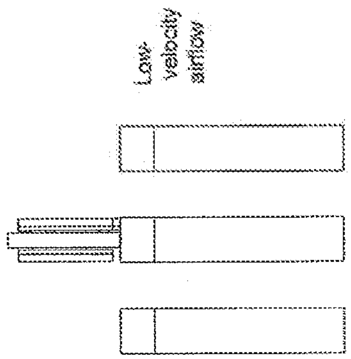
Figure 167C:
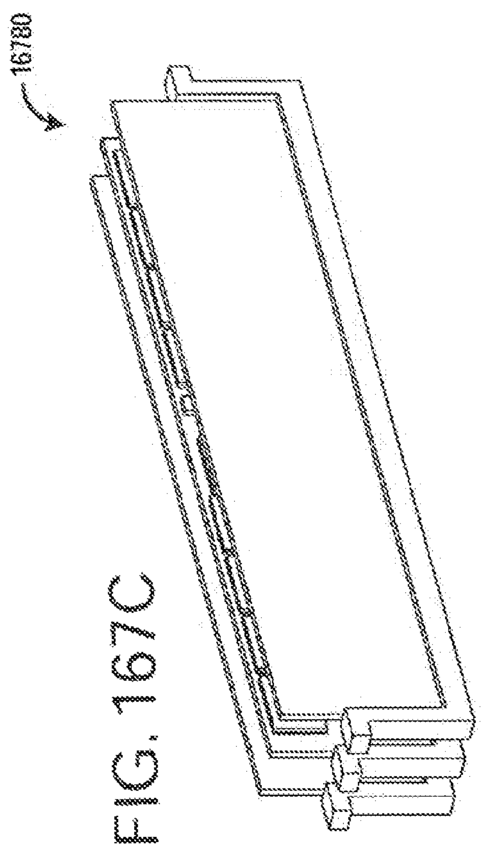
Figure 167D:
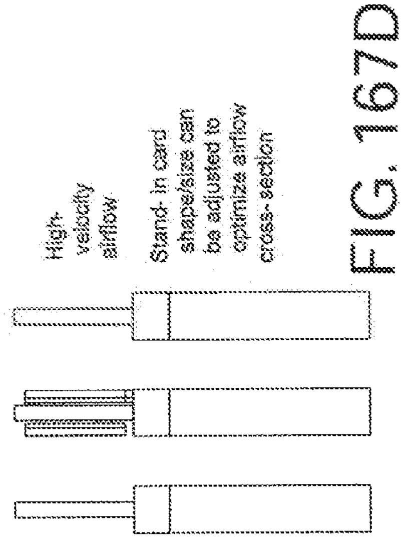

FIGS. 167A-167D illustrate heat spreader assemblies showing air flow dynamics, according to various embodiments of the present invention. As shown in FIGS. 167A and 167C, in some cases functioning modules (e.g. DIMMS on motherboards) may be seated in a socket electrically connected to the motherboard, and in cases where multiple DIMMS are arranged in an array as shown, the one or more DIMMS may be disposed in an interior position, that is, between one or more other sockets. FIG. 167B shows a side view of such a situation. As may be seen, the airflow over the surfaces of the interior functioning module is unshaped. According to one embodiment of the present invention, in such a case, the airflow to the one or more interior DIMMS may be made more laminar in some sections, or made more turbulent in some sections or otherwise enhanced by populating the neighboring sockets with a shaped stand-off card, as shown in FIGS. 167C and 167D. As may be seen, the airflow over the surfaces of the interior functioning module is shaped as a consequence of the shaped stand-off card. Of course, the shaped stand-off card might be as simple as is shown in FIG. 167D, or it might include a funnel shape, or a convex portion or even an airfoil shape.

Figure 168A:
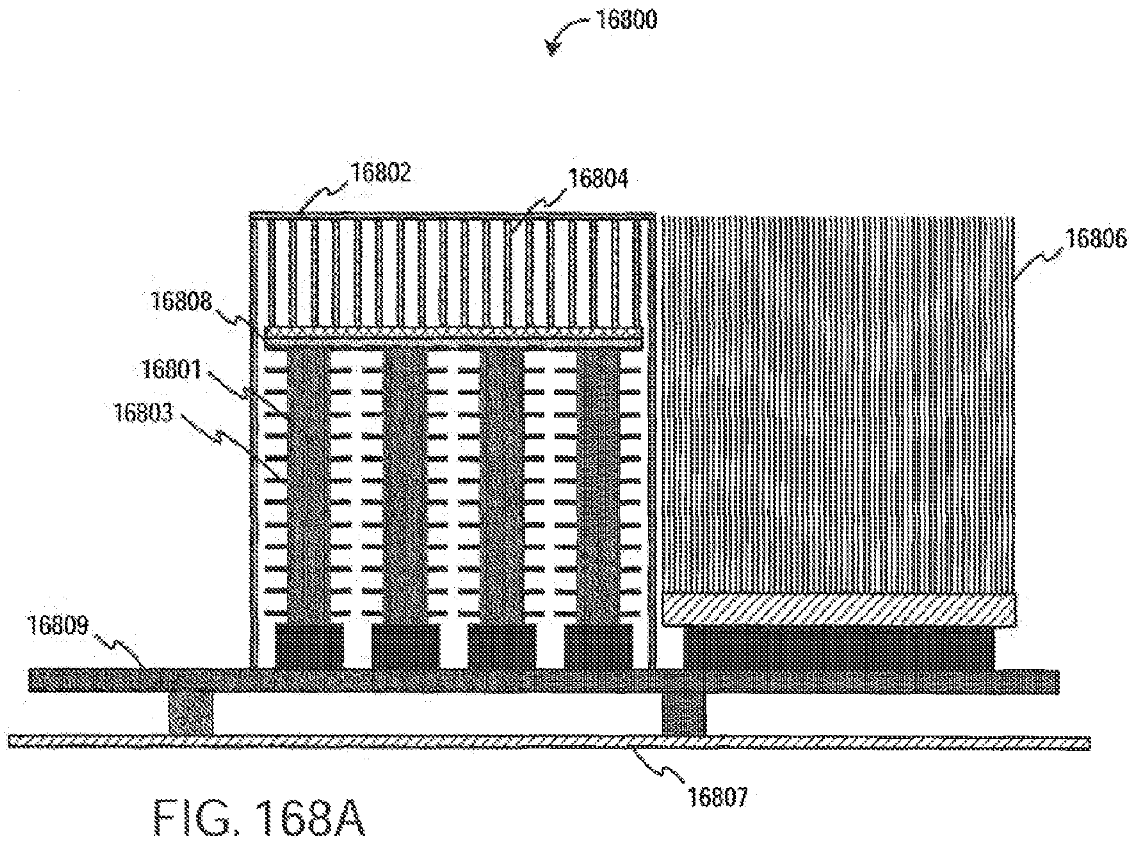
Figure 168B:
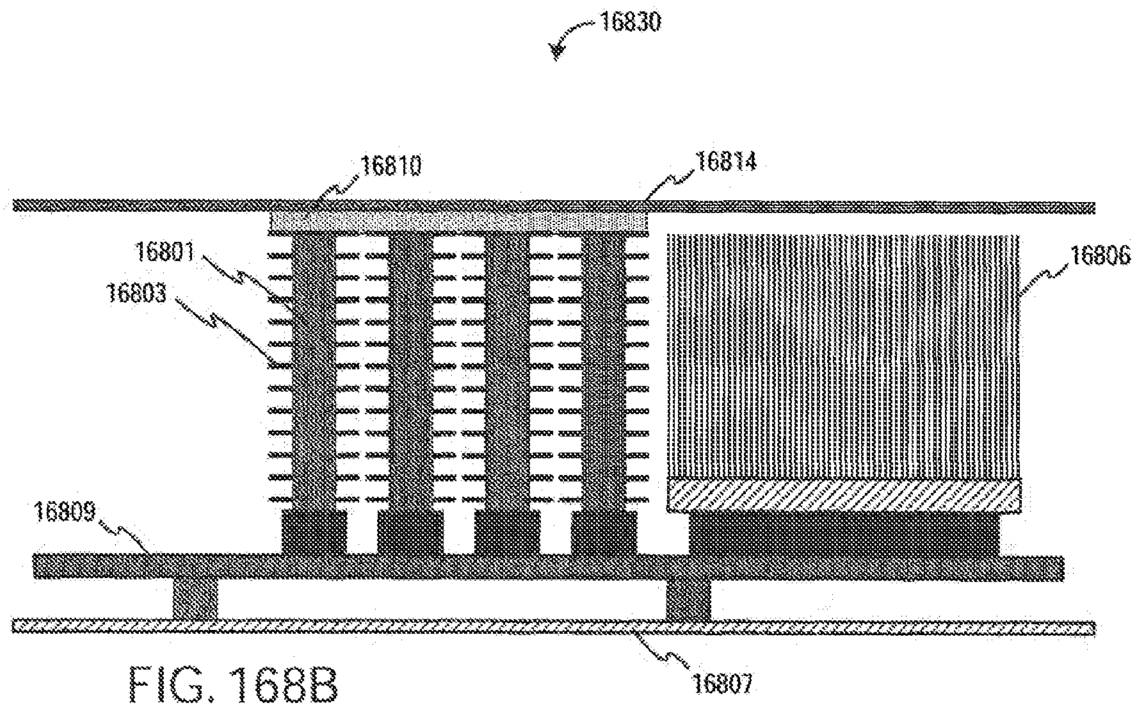
Figure 168C:
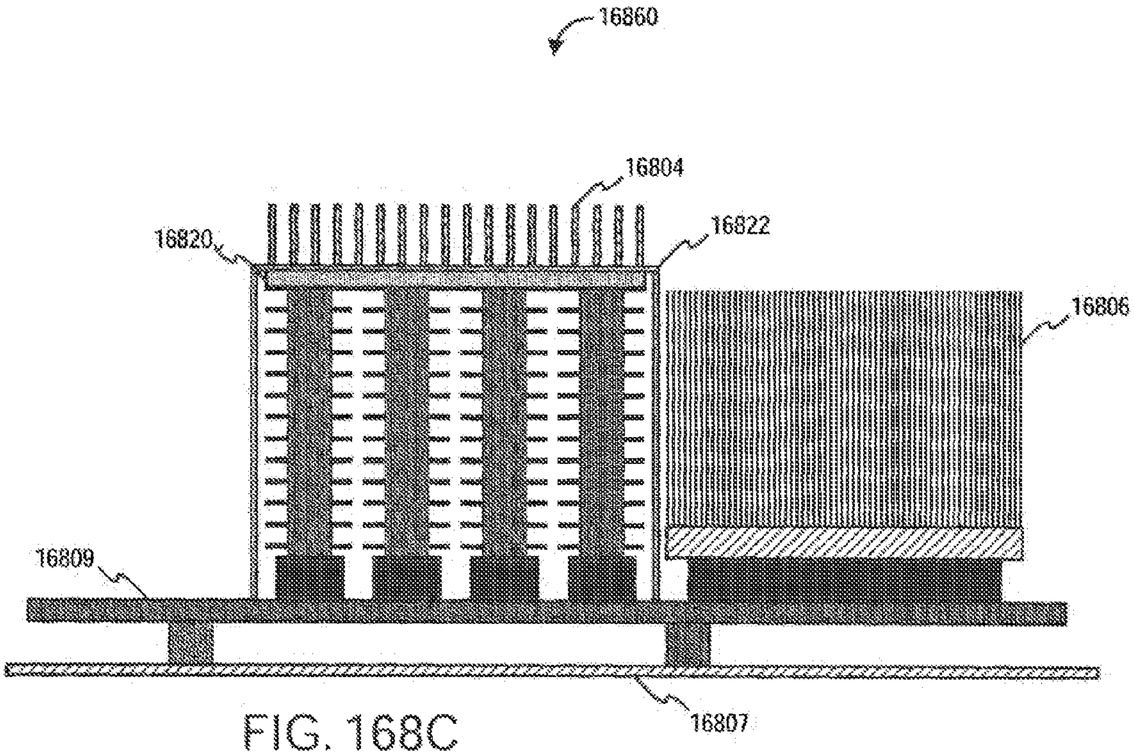
Figure 168D:
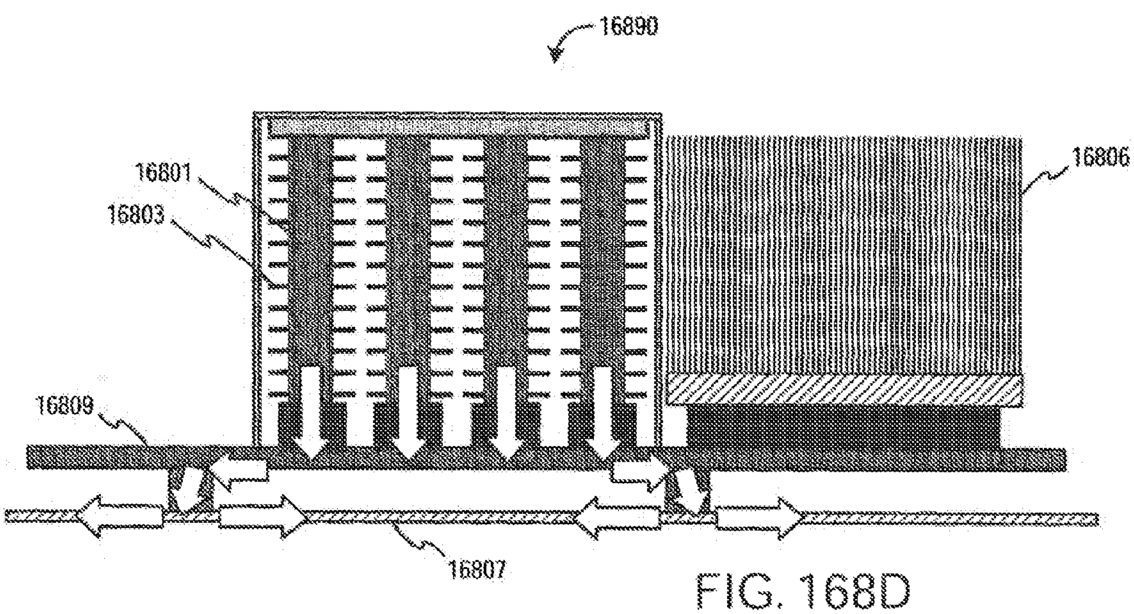

FIGS. 168A-168D illustrate various embodiments of heat spreaders for a memory module. The embodiments shown in FIGS. 168A through 168D may be employed in any context, including the contexts of FIGS. 158-10D. In fact, memory module 16801 depicts a PCB or a heat spreader module assembly in the fashion of assembly 15800, or 15900 or 16200, or 16300, or any other PCB assembly as discussed herein. In one embodiment, the memory module 16801 comprises a DIMM. Moreover the element 16803 depicts an embossing (e.g. 15816) or pin fin (e.g. 16210) or even a hollow pin 16530. In some embodiments, a memory module 16801 may be an assembly or collection of multiple memory devices, or in some embodiments, a memory module 16801 may be embodied as a section on a PCB or motherboard, possibly including one or more sockets. FIG. 168A shows a group of memory modules 16801 enclosed by a duct 16802. In the exemplary embodiments shown in FIG. 168A-168D, the memory modules section might be mounted on a motherboard or other printed circuit board, and relatively co-located next to a processor, which processor might be fitted with a heat sink 16806. This assembly including the memory module(s), processor(s) and corresponding heat sinks might be mounted on a motherboard or backplane 16809, and enclosed with a bottom-side portion 16807 of a housing (e.g., computer chassis or case). The duct 16802 encloses the memory module section, and encloses a heat sink assembly 16804 disposed atop the memory modules 16801, possibly including TIM 16808 between the memory modules 16801 and the heat sink assembly 16804. FIG. 168B shows a side view of a section of a motherboard, and depicting the memory modules 16801 in thermal contact with a top-side portion 16814 of a housing, possibly including TIM 16810. FIG. 168C shows a memory module enclosed by a duct 16802. The duct 16822 encloses the memory module section. The heat sink assembly 16804 may be disposed atop the duct 16822, possibly including TIM 16820 between the memory modules 16801 and the duct 16822. FIG. 168D shows a memory module enclosed by a duct. This embodiment exemplifies how heat is carried from the DIMMS to the bottom-side portion 16807 of the housing through any or all structural members in thermal contact with the bottom-side of the housing.

Multirank Memory Module

FIG. 169A shows a system 16970 for multi-rank, partial width memory modules, in accordance with one embodiment. As shown, a memory controller 16972 is provided. Additionally, a memory bus 16974 is provided. Further, a memory module 16976 with a plurality of ranks of memory circuits 16978 is provided, the memory module 16976 including a first number of data pins that is less than a second number of data pins of the memory bus.

In the context of the present description, a rank refers to at least one circuit that is controlled by a common control signal. The number of ranks of memory circuits 16978 may vary. For example, in one embodiment, the memory module 16976 may include at least four ranks of memory circuits 16978. In another embodiment, the memory module 16976 may include six ranks of memory circuits 16978.

Furthermore, the first number and the second number of data pins may vary. For example, in one embodiment, the first number of data pins may be half of the second number of data pins. In another embodiment, the first number of data pins may be a third of the second number of data pins. Of course, in various embodiments the first number and the second number may be any number of data pins such that the first number of data pins is less than the second number of data pins.

In the context of the present description, a memory controller refers to any device capable of sending instructions or commands, or otherwise controlling the memory circuits 16978. Additionally, in the context of the present description, a memory bus refers to any component, connection, or group of components and/or connections, used to provide electrical communication between a memory module and a memory controller. For example, in various embodiments, the memory bus 16974 may include printed circuit board (PCB) transmission lines, module connectors, component packages, sockets, and/or any other components or connections that fit the above definition.

Furthermore, the memory circuits 16978 may include any type of memory device. For example, in one embodiment, the memory circuits 16978 may include dynamic random access memory (DRAM). Additionally, in one embodiment, the memory module 16976 may include a dual in-line memory module (DIMM).

Strictly as an option, the system 16970 may include at least one buffer chip (not shown) that is in communication with the memory circuits 16978 and the memory bus 16974. In one embodiment, the buffer chip may be utilized to transform data signals associated with the memory bus 16974. For example, the data signals may be transformed from a first data rate to a second data rate which is two times the first data rate.

Additionally, data in the data signals may be transformed from a first data width to a second data width which is half of the first data width. In one embodiment, the data signals may be associated with data transmission lines included in the memory bus 16974. In this case, the memory module 16976 may be connected only some of a plurality of the data transmission lines corresponding to the memory bus. In another embodiment, the memory module 16976 may be configured to connect to all of the data transmission lines corresponding to the memory bus.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

FIG. 169B illustrates a two-rank registered DIMM (R-DIMM) 16900 built with 8-bit wide (×8) memory (e.g. DRAM, etc.) circuits in accordance with Joint Electron Device Engineering Council (JEDEC) specifications. It should be noted that the aforementioned definitions may apply during the present description.

As shown, included are a register chip 16902, and a plurality of DRAM circuits 16904 and 16906. The DRAM circuits 16904 are positioned on one side of the R-DIMM 16900 while the DRAM circuits 16906 are positioned on the opposite side of the R-DIMM 16900. The R-DIMM 16900 may be in communication with a memory controller of an electronic host system as shown. In various embodiments, such system may be in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The DRAM circuits 16904 belong to a first rank and are controlled by a common first chip select signal 16940. The DRAM circuits 16906 belong to a second rank and are controlled by a common second chip select signal 16950. The memory controller may access the first rank by placing an address and command on the address and control lines 16920 and asserting the first chip select signal 16940.

Optionally, data may then be transferred between the memory controller and the DRAM circuits 16904 of the first rank over the data signals 16930. The data signals 16930 represent all the data signals in the memory bus, and the DRAM circuits 16904 connect to all of the data signals 16930. In this case, the DRAM circuits 16904 may provide all the data signals requested by the memory controller during a read operation to the first rank, and accept all the data signals provided by the memory controller during a write operation to the first rank. For example, the memory bus may have 72 data signals, in which case, each rank on a standard R-DIMM may have nine ×8 DRAM circuits.

The memory controller may also access the second rank by placing an address and command on the address and control lines 16920 and asserting the second chip select signal 16950. Optionally, data may then be transferred between the memory controller and the DRAM circuits 16906 of the second rank over the data signals 16930. The data signals 16930 represent all the data signals in the memory bus, and the DRAM circuits 16906 connect to all of the data signals 16930. In this case, the DRAM circuits 16906 may provide all the data signals requested by the memory controller during a read operation to the second rank, and accept all the data signals provided by the memory controller during a write operation to the second rank.

FIG. 170 illustrates a two-rank registered DIMM (R-DIMM) 17000 built with 4-bit wide (×4) DRAM circuits in accordance with JEDEC specifications. Again, the aforementioned definitions may apply during the present description.

As shown, included are a register chip 17002, and a plurality of DRAM circuits 17004A, 17004B, 17006A, and 17006B. The R-DIMM 17000 may be in communication with a memory controller of an electronic host system as shown. The DRAM circuits 17004A and 17004B belong to a first rank and are controlled by a common first chip select signal 17040.

In some embodiments, the DRAM circuits 170044 may be positioned on one side of the R-DIMM 17000 while the DRAM circuits 17004B are positioned on the opposite side of the R-DIMM 17000. The DRAM circuits 17006A and 17006B belong to a second rank and are controlled by a common second chip select signal 17050. In some embodiments, the DRAM circuits 17006A may be positioned on one side of the R-DIMM 17000 while the DRAM circuits 17006B are positioned on the opposite side of the R-DIMM 17000.

In various embodiments, the DRAM circuits 17004A and 17006A may be stacked on top of each other, or placed next to each other on the same side of a DIMM PCB, or placed on opposite sides of the DIMM PCB in a clamshell-type arrangement. Similarly, the DRAM circuits 17004B and 17006B may be stacked on top of each other, or placed next to each other on the same side of the DIMM PCB, or placed on opposite sides of the board in a clamshell-type arrangement.

The memory controller may access the first rank by placing an address and command on address and control lines 17020 and asserting a first chip select signal 17040. Optionally, data may then be transferred between the memory controller and the DRAM circuits 17004A and 17004B of the first rank over the data signals 17030. In this case, the data signals 17030 represent all the data signals in the memory bus, and the DRAM circuits 17004A and 17004B connect to all of the data signals 17030.

The memory controller may also access the second rank by placing an address and command on the address and control lines 17020 and asserting a second chip select signal 17050. Optionally, data may then be transferred between the memory controller and the DRAM circuits 17006A and 17006B of the second rank over the data signals 17030. In this case, the data signals 17030 represent all the data signals in the memory bus, and the DRAM circuits 17006A and 17006B connect to all of the data signals in the memory bus. For example, if the memory bus has 72 data signals, each rank of a standard R-DIMM will have eighteen ×4 DRAM circuits.

FIG. 171 illustrates an electronic host system 17100 that includes a memory controller 17150, and two standard R-DIMMs 17130 and 17140. Additionally, the aforementioned definitions may apply during the present description.

As shown, a parallel memory bus 17110 connects the memory controller 17150 to the two standard R-DIMMs 17130 and 17140, each of which is a two rank DIMM. The memory bus 17110 includes an address bus 17112, a control bus 17114, a data bus 17116, and clock signals 17118. All the signals in the address bus 17112 and the data bus 17116 connect to both of the R-DIMMs 17130 and 17140 while some, but not all, of the signals in the control bus 17114 connect to of the R-DIMMs 17130 and 17140.

The control bus 17114 includes a plurality of chip select signals. The first two of these signals, 17120 and 17122, connect to the first R-DIMM 17130, while the third and fourth chip select signals, 17124 and 17126, connect to the second R-DIMM 17140. Thus, when the memory controller 17150 accesses the first rank of DRAM circuits, it asserts chip select signal 17120 and the corresponding DRAM circuits on the R-DIMM 17130 respond to the access. Similarly, when the memory controller 17150 wishes to access the third rank of DRAM circuits, it asserts chip select signal 17124 and the corresponding DRAM circuits on the R-DIMM 17140 respond to the access. In other words, each memory access involves DRAM circuits on only one R-DIMM.

However, both of the R-DIMMs 17130 and 17140 connect to the data bus 17116 in parallel. Thus, any given access involves one source and two loads. For example, when the memory controller 17150 writes data to a rank of DRAM circuits on the first R-DIMM 17130, both of the R-DIMMs 17130 and 17140 appear as loads to the memory controller 17150. Similarly, when a rank of DRAM circuits on the first R-DIMM 17130 return data (e.g. in a read access) to the memory controller 17150, both the memory controller 17150 and the second R-DIMM 17140 appear as loads to the DRAM circuits on the first R-DIMM 17130 that are driving the data bus 17116. Topologies that involve a source and multiple loads are typically capable of operating at lower speeds than point-to-point topologies that have one source and one load.

FIG. 172 illustrates a four-rank, half-width R-DIMM 17200 built using ×4 DRAM circuits, in accordance with one embodiment. As an option, the R-DIMM 17200 may be implemented in the context of the details of FIGS. 169-171. Of course, however, the R-DIMM 17200 may be implemented in any desired environment. Again, the aforementioned definitions may apply during the present description.

As shown, included are a register chip 17202, and a plurality of DRAM circuits 17204, 17206, 17208, and 17210. The DRAM circuits 17204 belong to the first rank and are controlled by a common chip select signal 17220. Similarly, the DRAM circuits 17206 belong to the second rank and are controlled by a chip select signal 17230. The DRAM circuits 17208 belong to the third rank and are controlled by a chip select signal 17240, while the DRAM circuits 17210 belong to the fourth rank and are controlled by a chip select signal 17250.

In this case, the DRAM circuits 17204, 17206, 17208, and 17210 are all ×4 DRAM circuits, and are grouped into nine sets of DRAM circuits. Each set contains one DRAM circuit from each of the four ranks. The data pins of the DRAM circuits in a set are connected to each other and to four data pins 17270 of the R-DIMM 17200. Since there are nine such sets, the R-DIMM 17200 may connect to 36 data signals of a memory bus. In the case where a typical memory bus has 72 data signals, the R-DIMM 17200 is a halts-width DIMM with four ranks of DRAM circuits.

FIG. 173 illustrates a six-rank, one-third width R-DIMM 17300 built using ×8 DRAM circuits, in accordance with another embodiment. As an option, the R-DIMM 17300 may be implemented in the context of the details of FIGS. 169-172. Of course, however, the R-DIMM 17300 may be implemented in any desired environment. Additionally, the aforementioned definitions may apply during the present description.

As shown, included are a register chip 17302, and a plurality of DRAM circuits 17304, 17306, 17308, 17310, 17312, and 17314. The DRAM circuits 17304 belong to the first rank and are controlled by a common chip select signal 17320. Similarly, the DRAM circuits 17306 belong to the second rank and are controlled by a chip select signal 17330. The DRAM circuits 17308 belong to the third rank and are controlled by a chip select signal 17340, while the DRAM circuits 17310 belong to the fourth rank and are controlled by a chip select signal 17350. The DRAM circuits 17312 belong to the fifth rank and are controlled by a chip select signal 17360. The DRAM circuits 17314 belong to the sixth rank and are controlled by a chip select signal 17370.

In this case, the DRAM circuits 17304, 17306, 17308, 17310, 17312, and 17314 are all ×8 DRAM circuits, and are grouped into three sets of DRAM circuits. Each set contains one DRAM circuit from each of the six ranks. The data pins of the DRAM circuits in a set are connected to each other and to eight data pins 17390 of the R-DIMM 17300. Since there are three such sets, the R-DIMM 17300 may connect to 24 data signals of a memory bus. In the ease where a typical memory bus has 72 data signals, the R-DIMM 17300 is a one-third width DIMM with six ranks of DRAM circuits.

FIG. 174 illustrates a four-rank, half-width R-DIMM 17400 built using ×4 DRAM circuits and buffer circuits, in accordance with yet another embodiment. As an option, the R-DIMM 17400 may be implemented in the context of the details of FIGS. 169-173. Of course, however, the R-DIMM 17400 may be implemented in any desired environment. Again, the aforementioned definitions may apply during the present description.

As shown, included are a register chip 17402, a plurality of DRAM circuits 17404, 17406, 17408, and 17410, and buffer circuits 17412. The DRAM circuits 17404 belong to the first rank and are controlled by a common chip select signal 17420. Similarly, the DRAM circuits 17406 belong to the second rank and are controlled by a chip select signal 17430. The DRAM circuits 17408 belong to the third rank and are controlled by a chip select signal 17440. While the DRAM circuits 17410 belong to the fourth rank and are controlled by a chip select signal 17450.

In this case, the DRAM circuits 17404, 17406, 17408, and 17410 are all ×4 DRAM circuits, and are grouped into nine sets of DRAM circuits. Each set contains one DRAM circuit from each of the four ranks, and in one embodiment, the buffer chip 17412. The data pins of the DRAM circuits 17404, 17406, 17408, and 17410 in a set are connected to a first set of pins of the buffer chip 17412, while a second set of pins of the buffer chip 17412 are connected to four data pins 17470 of the R-DIMM 17400. The buffer chip 17412 reduces the loading of the multiple ranks of DRAM circuits on the data bus since each data pin of the R-DIMM 17400 connects to only one pin of a buffer chip instead of the corresponding data pin of four DRAM circuits.

Since there are nine such sets, the R-DIMM 17400 may connect to 36 data signals of a memory bus. Since a typical memory bus has 72 data signals, the R-DIMM 17400 is thus a half-width DIMM with four ranks of DRAM circuits. In some embodiments, each of the DRAM circuit 17404, 17406, 17408, and 17410 may be a plurality of DRAM circuits that are emulated by the buffer chip to appear as a higher capacity virtual DRAM circuit to the memory controller with at least one aspect that is different from that of the plurality of DRAM circuits.

In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, multi-rank, partial width DIMMs. For the sake of simplicity, the address and control signals on the R-DIMM 17400 are not shown in FIG. 174.

FIG. 175 illustrates an electronic host system 17500 that includes a memory controller 17550, and two half width R-DIMMs 17530 and 17540, in accordance with another embodiment. As an option, the electronic host system 17500 may be implemented in the context of the details of FIGS. 169-174. Of course, however, the electronic host system 17500 may be implemented in any desired environment. Additionally, the aforementioned definitions may apply during the present description.

As shown, a parallel memory bus 17510 connects the memory controller 17550 to the two half width R-DIMMs 17530 and 17540, each of which is a four-rank DIMM. The memory bus includes an address bus 17512, a control bus 17514, a data bus 16916, and clock signals 17518. All the signals in the address bus 17512 connect to both of the R-DIMMs 17530 and 17540 while only half the signals in the data bus 17516 connect to each R-DIMM 17530 and 17540. The control bus 17514 includes a plurality of chip select signals.

The chip select signals corresponding to the four ranks in the system, 17520, 17522, 17524, and 17526, connect to the R-DIMM 17530 and to the R-DIMM 17540. Thus, when the memory controller 17550 accesses the first rank of DRAM circuits, it asserts the chip select signal 17520 and the corresponding DRAM circuits on the R-DIMM 17530 and on the R-DIMM 17540 respond to the access. For example, when the memory controller 17550 performs a read access to the first rank of DRAM circuits, half the data signals are driven by DRAM circuits on the R-DIMM 17530 while the other half of the data signals are driven by DRAM circuits on the R-DIMM 17540.

Similarly, when the memory controller 17550 wishes to access the third rank of DRAM circuits, it asserts the chip select signal 17524 and the corresponding DRAM circuits on the R-DIMM 17530 and the R-DIMM 17540 respond to the access. In other words, each memory access involves DRAM circuits on both the R-DIMM 17530 and the R-DIMM 17540. Such an arrangement transforms each of the data signals in the data bus 17516 into a point-to-point signal between the memory controller 17550 and one R-DIMM.

It should be noted that partial width DIMMs may be compatible with systems that are configured with traditional parallel memory bus topologies. In other words, all the data signals in the data bus 17516 may be connected to the connectors of both DIMMs. However, when partial width DIMMs are used, the memory circuits on each DIMM connect to only half the data signals in the data bus.

In such systems, some of the data signals in the data bus 17516 may be point-to-point nets (i.e. without stubs) while other signals in the data bus 17516 may have stubs. To illustrate, assume that all the signals in data bus 17516 connect to the connectors of R-DIMM 17530 and R-DIMM 17540. When two half-width R-DIMMs are inserted into these connectors, the data signals in the data bus 17516 that are driven by the DRAM circuits on the R-DIMM 17540 are point-to-point nets since the memory controller 17550 and the DRAM circuits on the R-DIMM 17540 are located at either ends of the nets.

However, the data signals that are driven by the DRAM circuits on the R-DIMM 17530 may have stubs since the DRAM circuits on the R-DIMM 17530 are not located at one end of the nets. The stubs correspond to the segments of the nets between the two connectors. In some embodiments, the data signals in the data bus 17516 that are driven by the DRAM circuits on the R-DIMM 17530 may be terminated at the far end of the bus away from the memory controller 17550. These termination resistors may be located on the motherboard, or on the R-DIMM 17540, or in another suitable place.

Moreover, the data signals that are driven by the DRAM circuits on the R-DIMM 17540 may also be similarly terminated in other embodiments. Of course, it is also possible to design a system that works exclusively with partial width DIMMs, in which case, each data signal in the data bus 17516 connects to only one DIMM connector on the memory bus 17510.

FIG. 176 illustrates an electronic host system 17600 that includes a memory controller 17640, and three one-third width R-DIMMs 17650, 17660, and 17670, in accordance with another embodiment. As an option, the electronic host system 17600 may be implemented in the context of the details of FIGS. 169-175. Of course, however, the electronic host system 17600 may be implemented in any desired environment. Still yet, the aforementioned definitions may apply during the present description.

As shown, a parallel memory bus 17680 connects the memory controller 17640 to the three one-third width R-DIMMs 17650, 17660, and 17670, each of which is a six-rank DIMM. The memory bus 17680 includes an address but (not shown), a control bus 17614, a data bus 17612, and clock signals (not shown). All the signals in the address bus connect to all three R-DIMMs while only one-third of the signals in the data bus 17612 connect to each of the R-DIMMs 17650, 17660, and 17670.

The control bus 17614 includes a plurality of chip select signals. The chip select signals corresponding to the six ranks in the system, 17620, 17622, 17624, 17626, 17628, and 17630, connect to all three of the R-DIMMs 17650, 17660, and 17670. Thus, when the memory controller 17640 accesses the first rank of DRAM circuits, it asserts the chip select signal 17620 and the corresponding DRAM circuits on the R-DIMM 17650, on the R-DIMM 17660, and on the R-DIMM 17670 respond to the access.

For example, when the memory controller 17640 performs a read access to the first rank of DRAM circuits, one-third of the data signals are driven by DRAM circuits on the R-DIMM 17650, another one-third of the data signals are driven by DRAM circuits on the R-DIMM 17660, and the remaining one-third of the data signals are driven by DRAM circuits on the R-DIMM 17670. In other words, each memory access involves DRAM circuits on all three of the R-DIMMs 17650, 17660, and 17670. Such an arrangement transforms each of the data signals in the data bus 17612 into a point-to-point signal between the memory controller 17640 and one R-DIMM.

In various embodiments, partial-rank, partial width, memory modules may be provided, wherein each DIMM corresponds to a part of all of the ranks in the memory bus. In other words, each DIMM connects to some but not all of the data signals in a memory bus for all of the ranks in the channel. For example, in a DDR2 memory bus with two R-DIMM slots, each R-DIMM may have two ranks and connect to all 72 data signals in the channel. Therefore, each data signal in the memory bus is connected to the memory controller and the two R-DIMMs.

For the case of the same memory bus with two multi-rank, partial width R-DIMMs, each R-DIMM may have four ranks but the first R-DIMM may connect to 36 data signals in the channel while the second R-DIMM may connect to the other 36 data signals in the channel. Thus, each of the data signal in the memory bus becomes a point-to-point connection between the memory controller and one R-DIMM, which reduces signal integrity issues and increases the maximum frequency of operation of the channel. In other embodiments, full-rank, partial width, memory modules may be built that correspond to one or more complete ranks but connect to some but not all of the data signals in the memory bus.

FIG. 177 illustrates a two-full-rank, half-width R-DIMM 17700 built using ×8 DRAM circuits and buffer circuits, in accordance with one embodiment. As an option, the R-DIMM 17700 may be implemented in the context of the details of FIGS. 169-176. Of course, however, the R-DIMM 17700 may be implemented in any desired environment. Again, the aforementioned definitions may apply during the present description.

As shown, included are a register chip 17702, a plurality of DRAM circuits 17704 and 17706, and buffer circuits 17712. The DRAM circuits 17704 belong to the first rank and are controlled by a common chip select signal 17720. Similarly, the DRAM circuits 17706 belong to the second rank and are controlled by chip select signal 17730.

The DRAM circuits 17704 and 17706 are all illustrated as ×8 DRAM circuits, and are grouped into nine sets of DRAM circuits. Each set contains one DRAM circuit from each of the two ranks, and in one embodiment, the buffer chip 17712. The eight data pins of each of the DRAM circuits in a set are connected to a first set of pins of the buffer chip 17712, while a second set of pins of the buffer chip 17712 are connected to four data pins 17770 of the R-DIMM 17700. The buffer chip 17712 acts to transform the eight data signals from each DRAM circuit operating at a specific data rate to four data signals that operate at twice the data rate and connect to the data pins of the R-DIMM, and vice versa. Since there are nine such sets, the R-DIMM 17700 may connect to 36 data signals of a memory bus.

In the case that a typical memory bus has 72 data signals, the R-DIMM 17700 is a half-width DIMM with two full ranks of DRAM circuits. In some embodiments, each DRAM circuit 17704 and 17706 may be a plurality of DRAM circuits that are emulated by the buffer chip to appear as a higher capacity virtual DRAM circuit to the memory controller with at least one aspect that is different from that of the plurality of DRAM circuits. In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, full-rank, partial width DIMMs. For the sake of simplicity, the address and control signals on the R-DIMM 17700 are not shown in FIG. 177.

FIG. 178 illustrates an electronic host system 17800 that includes a memory controller 17850, and two half width R-DIMMs 17830 and 17840, in accordance with one embodiment. As an option, the electronic, host system 17800 may be implemented in the context of the details of FIGS. 169-177. Of course, however, the electronic host system 17800 may be implemented in any desired environment. Additionally, the aforementioned definitions may apply during the present description.

As shown, a parallel memory bus 17810 connects the memory controller 17850 to the two half width R-DIMMs 17830 and 17840, each of which is a two-rank R-DIMM. The memory bus 17810 includes an address bus 17812, a control bus 17814, and a data bus 17816, and clock signals 17818. All the signals in the address bus 17812 connect to both of the R-DIMMs 17830 and 17840 while only half the signals in the data bus 17816 connect to each R-DIMM. The control bus 17814 includes a plurality of chip select signals.

The chip select signals corresponding to the first two ranks, 17820 and 17822, connect to the R-DIMM 17830 while chip select signals corresponding to the third and fourth ranks, 17824 and 17826, connect to the R-DIMM 17840. Thus, when the memory controller 17850 accesses the first rank of DRAM circuits, it asserts chip select signal 17820 and the corresponding DRAM circuits on the R-DIMM 17830 respond to the access.

For example, when the memory controller 17850 performs a read access to the first rank of DRAM circuits, the R-DIMM 17830 provides the entire read data on half the data signals in the data bus but at twice the operating speed of the DRAM circuits on the R-DIMM 17830. In other words, the DRAM circuits on the R-DIMM 17830 that are controlled by chip select signal 17820 will return n 72-bit wide data words at a speed of f transactions per second.

The buffer circuits on the R-DIMM 17830 will transform the read data in 2n 36-bit wide data words and drive them to the memory controller 17850 at a speed of 2f transactions per second. The memory controller 17850 will then convert the 2n 36-bit wide data words coming in at 2f transactions per second back to n 72-bit wide data words at f transactions per second. It should be noted that the remaining 36 data signal lines in the data bus 17816 that are connected to the R-DIMM 17840 are not driven during this read operation.

Similarly, when the memory controller 17850 wishes to access the third rank of DRAM circuits, it asserts chip select signal 17824 and the corresponding DRAM circuits on the R-DIMM 17840 respond to the access such that the R-DIMM 17840 sends back 2n 36-bit wide data words at a speed of 2f transactions per second. In other words, each memory access involves DRAM circuits on only one R-DIMM. Such an arrangement transforms each of the data signals in the data bus 17816 into a point-to-point signal between the memory controller 17850 and one R-DIMM.

It should be noted that full-rank, partial width DIMMs may be compatible with systems that are configured with traditional parallel memory bus topologies. In other words, all the data signals in the data bus 17816 may be connected to the connectors of both of the R-DIMMs 17830 and 17840. However, when full-rank, partial width DIMMs are used each DIMM connects to only half the data signals in the data bus 17816. In such systems, some of the data signals in the data bus 17816 may be point-to-point nets (i.e. without stubs) while other signals in the data bus 17816 may have stubs.

To illustrate, assume that all the signals in data bus 17816 connect to the connectors of the R-DIMM 17830 and the R-DIMM 17840. When two full-rank, half-width R-DIMMs are inserted into these connectors, the data signals in the data bus that are driven by the R-DIMM 17840 are point-to-point nets since the memory controller 17850 and the buffer circuits on the R-DIMM 17840 are located at either ends of the nets. However, the data signals that are driven by the R-DIMM 17830 may have stubs since the buffer circuits on the R-DIMM 17830 are not located at one end of the nets.

The stubs correspond to the segments of the nets between the two connectors. In some embodiments, the data signals in the data bus that are driven by the R-DIMM 17830 may be terminated at the far end of the bus away from the memory controller 17850. These termination resistors may be located on the motherboard, or on the R-DIMM 17840, or in another suitable place. Moreover, the data signals that are driven by the R-DIMM 17840 may also be similarly terminated in other embodiments. Of course, it is also possible to design a system that works exclusively with full-rank, partial width DIMMs, in which case, each data signal in the data bus connects to only one DIMM connector on the memory bus.

While various embodiments have been described above, it should be understood that they have been presented by way of example only, and not limitation. For example, an tin-buffered DIMM (UDIMM), a small outline DIMM (SO-DIMM), a single inline memory module (SIMM), a MiniDIMM, a very low profile (VLP) R-DIMM, etc. may be built to be multi-rank and partial width memory modules. As another example, three-rank one-third width DIMMs may be built. Further, the memory controller and optional buffer functions may be implemented in several ways. As shown here the buffer function is implemented as part of the memory module. The buffer function could also be implemented on the motherboard beside the memory controller, for example. Thus, the breadth and scope of a preferred embodiment should not be limited by any of the above-described exemplary embodiments, but should be defined only in accordance with the following claims and their equivalents.

Stackable Low-Profile Lead Frame Package

Over the course of the development of the electronics industry, there has been an endless effort to increase both compactness and the performance of electronics products. The semiconductor devices have increased in terms of the numbers of transistors that can be created in a given space and volume, but it is the semiconductor package that has largely established the lower limits of the size of devices. So called chip scale and chip size packages have served well to meet this challenge by creating input/output (I/O) patterns for interconnection to the next level circuits, which are kept within the perimeter of the die. While this is suitable for making interconnection at near chip size, desire for even greater functionality in the same foot print and area has lead in recent years to increased interest in and to the development of stacked integrated circuit (IC) devices and stacked package assemblies. One area of specific interest and need is in the area of stacked chip assemblies for memory die. Particularly, the cost effectiveness of such solutions is of interest.

Beyond the desire to provide for stacking, a feature for lead frame packages having small I/O terminals is that they have a design element such as lead features which allow for reliable capture of the lead in the resin and which will prevent the inadvertent removal of the leads from the encapsulant. An example of such is the rivet like contact is described in U.S. Pat. No. 6,001,671.

Methods used in the fabrication of lead frame packages having small terminals are known by those skilled in the art. For example, typical four sided flat or two sided flat type semiconductor packages, such as bottom lead type (e.g. quad flat no-lead (QFN)) or lead end grid array type semiconductor packages, can be fabricated using a method which may involve, for example, a sawing step for cutting up a semiconductor wafer having a plurality of semiconductor ICs into individual die. This is followed by a semiconductor die mounting step where the semiconductor die is joined to the paddles of lead frame die site and integrally formed on to the lead frame strip by means of a thermally-conductive adhesive resin. This step is followed by a wire bonding step where the innermost ends of the lead frame (i.e. closest to the die) are electrically connected to an associated I/O terminal of the semiconductor die. Next a resin encapsulation or molding step is performed to encapsulate each semiconductor die assembly including bonding wires for the semiconductor die and lead frame assembly. Next is a singulation step where the I/O leads and paddle connections of each lead frame unit are cut proximate to the lead frame to separate the semiconductor package assemblies from one another. These separated devices can be marked, tested and burned in to assure their quality. Depending on the lead frame design, the leads may be formed into a so-called "J-lead" or "gull wing" configuration. However when fabricating a bottom lead type or short peripherally leaded type semiconductor packages, the lead forming step is omitted. Instead, the lower surface or free end of each lead is exposed at the bottom of the encapsulation and the exposed portion of each lead may be used as an external I/O terminal for use with a socket or for attachment to a PCB with joining material such as a tin alloy solder. A semiconductor package structure created by the process just described can be seen in FIG. 179.

FIG. 179 also identifies the most basic elements of such a semiconductor IC package. The semiconductor IC package 17900 includes a semiconductor die 17901 bonded to a paddle 17902 by means of a thermally-conductive epoxy resin 17903 and a plurality of I/O leads 17904 are arranged at each of either two or four sides of the paddle. The arrangement of the leads is laid out such that the leads are spaced apart from the side of the paddle while extending perpendicularly to the associated side of the paddle. The semiconductor package also includes a plurality of conductive wires 17905 for electrically connecting the inner lead bond locations 17907 to the semiconductor die bond sites 17906, respectively, and a resin encapsulate 17908 for encapsulating the semiconductor die and conductive wires. The semiconductor package further includes outer leads extending outwardly from the inner lead bond locations, respectively. The outer leads may have a particular shape such as a "J-lead" shape or a planar bottom lead shape, as shown. These outer leads serve to make interconnection to the next level assembly such as a PCB.

Figure 180A:
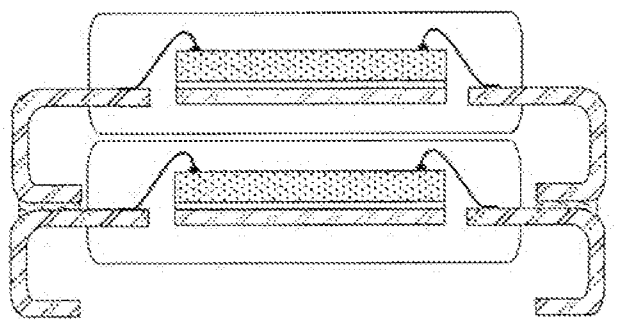
Figure 180B:
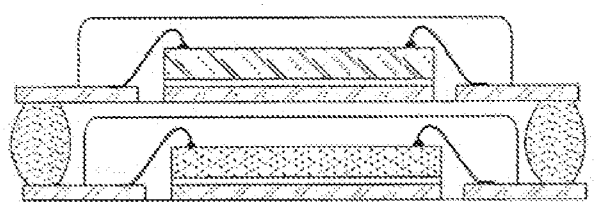
Figure 180C:
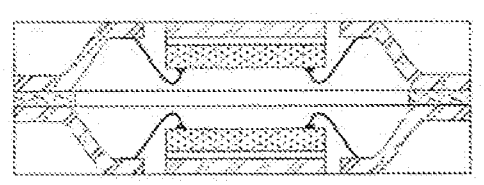
Figure 180D:
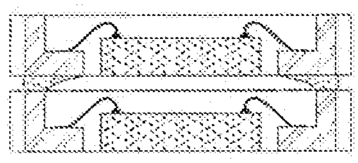

FIGS. 180 A-D shows various lead frame package configurations specifically designed for stacking or slightly modified to allow for stacking FIG. 180A shows an example of a lead frame with a J or C shape allowing soldering from one lead to the other in the same foot print. FIG. 180B shows an example of a straight lead semiconductor package in stacked form. The leads could also be shaped in a "gull wing" form if desired. FIG. 180C shows another example of a lead frame structure where the lead frame is accessed from top and bottom at offset points. This allows for stacking at lower profile, however the foot print is different on the two sides. FIG. 180D shows yet another stacking structure.

FIGS. 181A-181C show example solutions for stacking semiconductor die themselves rather than stacking the assembled packages. Often there is a preparatory step involving the creation of a redistribution circuit layer (RDL), especially in the cases where the die terminations are in the center, such as DRAM die. The RDL is a layer of circuits which interconnect native and primary semiconductor die I/O terminals to secondary I/O terminal locations distal from the original I/O locations.

FIG. 181A shows an example of such a stacked die assembly 18100A construction where the central I/O terminals of the die 18101 have been redistributed to the edge 18102 using a redistribution circuit 18103. A connection to each of the die is made at the edge contact using a conductive material 18104. Such assemblies could be mounted directly on to PCBs, however they would very difficult to standardize.

FIG. 181B shows a stack die assembly construction 18100B designed to overcome this limitation by assembling the stacked die on an interposer 18105 to make possible interconnection to a standard registered outline, such as those published by JEDEC (Joint Electronic Device Council a division of the American Electronics Association).

FIG. 181C shows another example of a stacked die assembly package 18100C where the semiconductor die 18106 are interconnected to a connection base substrate 18107 by means of wire bonds 18108. The semiconductor dice are separated by spacers 18109, which add height to prevent the wires from touching the die above. The stacked semiconductor die are assembled on an interposer having a standard or registered I/O footprint or one that can be easily registered or made standard.

FIGS. 182A and 182B show additional stacked semiconductor die packaging solutions wherein the semiconductor die are stacked into an assembly and interconnected to one another through holes filled with a conductive material. This allows interconnections to be made through the silicon (or other base semiconductor material). For practical reasons, the semiconductor die are commonly stacked in wafer form. This approach, however, increases the probability that there may be a bad die in some quantity of the final stacked die assemblies. Even with high yields, the factorial effect can have a significant impact on overall assembly yield. (E.g., with 98% yield per wafer, the maximum statistical yield is 83% for an 8 high stack).

FIG. 182A shows an example of such an assembly 18200A with metal filled conductive vias 18201 making interconnection from one die to the next through each semiconductor die from top to bottom. On one (or possibly both) surfaces the I/O are redistributed over the surface of the die face to facilitate assembly at the next interconnection level such as a module or PCB.

FIG. 182B shows another example of such a stacked die assembly with interconnections made from die to die using metal filled conductive vias. The stacked semiconductor die assembly is shown mounted onto an interposer 18202 which can have a standard or registered I/O footprint or an I/O footprint that can be easily registered or made standard.

A difficulty for stacked die semiconductor package constructions is that burn in of the bare die is difficult and such die if available can be expensive. Another reason is that semiconductor die of different generations and/or from different suppliers will normally be of slightly different size and shape and often have slightly different I/O layout. Another concern for any stacked die semiconductor package solution, which does not employ known good die, is that the assembly yield is not knowable until the final assembly is tested and burned in. This is a potentially costly proposition.

Stacked IC packages, and especially memory packages, should have as many of the following qualities as possible: 1) It should be not significantly greater in area than the IC; 2) It should allow for the stacking of die of substantially the same size but should also be amenable to stacking of die of nominally different sizes as might be the case when using die from different fabricators; 3) It should be of a height no greater than the IC die including protective coatings over the active surface of the die; 4) It should be easily tested and burned in to allow for sorting for infant failures; 5) It should allow for the creation of a stacked package assembly; 6) It should be easy to inspect for manufacturing defects; 7) It should be reliable and resistant to lead breakage during handling; 8) It should be inexpensive to control costs; 9) It should offer good thermal conductivity to provide efficient heat removal; and 10) It should offer reasonable capability to perform rework and repair if needed.

A low profile IC package is disclosed herein. In some embodiments, the low profile package is suitable for stacking in a very small volume. Various embodiments may be tested and burned in before assembly. The package may be manufactured using existing assembly infrastructure, tested in advance of stack assembly and require significantly less raw material, which may help to control manufactured cost, in some embodiments. FIGS. 183A-183B show in top view 18300 and cross section view 18300' at line 18302 in FIG. 183A, respectively, of a portion of one embodiment of a lead frame. FIGS. 183A-183B illustrate an early manufacturing step of the lead frame. The lead frame may be one site in a lead frame strip containing multiple sites, each of which can be used to package an IC. The lead frame shown in FIGS. 183A-183B has a plurality metal I/O leads 18301 which extend inwardly from an outer connecting portion 18303.

The leads 18301 form an opening 18304 within the leads that is approximately the size of the IC that is to be packaged with the leads 18301. The opening 18304 may be slightly larger than the IC to provide tolerance for manufacturing variations in the size of the IC, to provide an insulating gap between the leads 18301 and the IC, etc. As can be seen in FIGS. 183A-183B together, the lead frame may be generally planar. A top surface, as viewed in FIG. 183A, and a bottom surface opposite the top surface, may be approximately parallel to the plane of the lead frame. The plane may be referred to as the major plane of the lead frame, and the top and bottom surfaces may be referred to as in-plane. The lead frame may be formed of any conductive metal. For example, the lead frame may be stamped from a sheet of the conductive metal (or from a strip of the conductive metal as one lead frame site in the strip), etched into the sheet/strip, etc. Exemplary materials may include copper, iconel, alloy 42, tin, aluminum, etc. Furthermore, metal alloys may be used, or metals may be plated subsequent to the etching steps described below.

While FIG. 183A illustrates a generally square opening 18304, the opening 18304 may have any shape (e.g. rectangular) dependent on the shape of the IC that is to be packaged.

FIGS. 184A-184B show a second step in the manufacturing process in which one embodiment of the lead frame is again shown in top view 18400 and cross section view 18400' at the line 18402 in FIG. 184A. At the point shown in FIGS. 184A-184B, an etch resistant material (more briefly "etch resist") has been applied on a top surface (etch resist 18401*a*) and on a bottom surface (etch resist 18401*b*) of the lead frame to prepare it for etching. The top surface and bottom surface are relative to the top view 18400 shown in FIG. 184A. However, the labels 18401*a* and 18401*b* are relative and may be reversed in other embodiments.

The etch resist 18401*b* is applied proximate the inward end of the each lead, while the etch resist 18401*a* is applied further from the inward end than the etch resist 18401*b*. FIGS. 185 A-185B show a third step in the manufacturing process after an etching process has been performed and the etch resist removed, for one embodiment The lead frame is again shown in top view 18500 and cross section view 18500' through the line 18502, respectively in FIGS. 185 A-185B. As illustrated in FIGS. 185 A-185B, the leads have been etched away except for the portions covered by the etch resist, thus creating "bump" features 18501*a* and 18501*b* on the top and bottom surfaces, respectively, of the etched lead. The bump features are generally protrusions that extend a distance from the corresponding surface. Consistent with the locations of the etch resists 18401*a* and 18401*b* in FIGS. 184A-184B, the bump feature 18501*b* is proximate the inward end of each lead and the bump feature 18501*a* is further from the inward end than the bump feature 18501*b*. An exploded view is provided in FIG. 185 A to reveal greater detail. Phantom lines are used for the bump features 18501*b* to indicate that they are on the far side relative to the viewer.

FIGS. 186A-186B show a fourth step in the manufacturing process, at which the IC is inserted into the package assembly. The lead frame is again shown in top view 18600 and cross section view 18600' through the line 18606 in FIG. 186A for one embodiment. A semiconductor die 18601 is placed centrally into the opening defined by the I/O leads. Interconnections are made from the leads (e.g. shown at 18604) to the I/O terminals 18602 on the die using metal bonding wires 18603 of gold, aluminum, copper or other suitable conductors. The I/O terminal areas to be wire bonded are commonly provided with a finish that is suitable for assuring reliable wire bonding (e.g., gold, silver, palladium, etc.) In some embodiments, bonding wires 18603 may be insulated (e.g. with a polymer). An example is the bonding wire technology developed by Microbonds, Inc., of Markham, Ontario, Canada. Insulated bond wires, when employed, may help to prevent shorting of the bond wires to the die surface or edge.

An alternative approach to interconnection involves the use of a redistribution layer which routes the die I/O terminals to near the edge of the die to reduce the length of the wire bonds. Such an embodiment may have an increased package thickness, but also shorter wire bond length which may improve electrical performance and specifically lead inductance.

The I/O terminals on the semiconductor may optionally be prepared with bumps to facilitate stitch bonding of the wires. Generally, the I/O terminals may be any connection point on the IC die for bonding to the leads. For example, peripheral I/O pads may be used instead of the terminals on the die area as shown in FIG. 186A. Furthermore, the I/O terminals need not be only in the center, as shown in FIG. 186A, but may be spread out over the area of the die, as desired.

The semiconductor die, may, in one embodiment, be thinned to a thickness suitable for meeting product reliability requirements, such as those related to charge leakage for deep trench features. For example, the die may be less than 200 μm and may even be less than 100 μm. In comparison, the lead frame may be 150 μm to 200 μm thick, in one embodiment, and thus the semiconductor die may be thinner than the lead frame in one embodiment. That is, the assembled and stackable low profile semiconductor die package may have a thickness that is not substantially larger than the thickness of the lead frame. For example, the assembled and stackable package may have a thickness that is less that 250 μm, or even less than 200 μm.

The package may be fabricated without the use of a paddle, which would otherwise increase the profile height of the assembled package, as illustrated in the figures.

FIGS. 187A-187B show a fifth step in the manufacturing process for one embodiment, related to the encapsulation of the package assembly such as by a molding process. The lead frame assembly is again shown in top view 18700 and cross section view 18700' through the line 18704 in FIG. 187A. In the illustrated embodiment, an encapsulant such as a resin is used to form over-molded encapsulation 18701. The insulating encapsulant material has been dammed off in the mold so as to prevent the encapsulant from covering the entire length of the leads, while still allowing the encapsulant to flow under the lead to mechanically lock the lead into the encapsulant. That is, the bump features 18501*b* may provide an offset from the bottom of the IC 18601 to the lead surface, so that the encapsulant can surround the lead. Furthermore, in one embodiment, the bump features 18501*b* serve to provide the mechanical lock for the leads. On the other hand, a remaining portion of the leads, including the bump features 18501*a*, are outside of the encapsulant.

As can be seen in FIG. 187B, the bump features 18501*b* may extend from the bottom surface of the leads to approximately a plane that includes the bottom side of the IC (reference numeral 18703). Thus, the bump features 18501*b* provide the offset as mentioned above.

FIG. 187B also shows that the bottom side 18703 of encapsulated semiconductor die is exposed and is without a paddle in an effort to keep the profile of the assembly as low as possible, in this embodiment. Again, it is noted that the bottom side and the top side of the IC are relative. The bottom side 18703 is opposite the top side of the IC, which has the I/O terminals of the IC.

FIG. 188 shows a cross section view of an embodiment of the assembled semiconductor die package structure 18800 including the IC 18601 and a lead 18301 having an encapsulated end 18802*a* proximate to the die edge for wire bond attachment and a distal end 18802*b* which is not covered by encapsulant 18701 and which has a bump feature. The excess lead frame has been trimmed away for the embodiment of FIG. 188. Within the package, the lead is encapsulated on all surfaces for the length of the lead defined by the lead frame etching process previously described, to improve lead capture by the encapsulant, using the bump feature as shown. The structure further includes bond wires 18603. The bump feature on the outer lead frame is optional but may provide a connection site for stacking the packaged ICs. That is, the bump feature may provide a shape suited to limiting the amount of solder required to make interconnection between low profile semiconductor IC packages when they are stacked. The bump may also serve to improve contact of the leads during test and bum in.

FIG. 189 shows an embodiment of a plurality of low profile semiconductor IC packages in a stack 18900. In one embodiment, each of the individual low profile semiconductor IC packages 18902 have been tested and burned in prior to assembly to improve assembly yield. That is, by testing and burning in the individual low profile semiconductor IC packages 18902, test and bum in failures may be sorted out prior to stacking the IC packages and thus may potentially improve yield. The low profile semiconductor IC packages are joined together both mechanically and electrically using a suitable joining material 18901 (e.g., tin alloy solder) while not contributing to the assembly thickness, in some embodiments. For example, assembly may be performed by reflow of solder balls or paste in a heating source such as a convection oven. Alternatively, the devices can also be stack assembled by pulse heating with a laser.

In some embodiments, a package assembly will have a total height that will not exceed limits defined by cooling airflow needs for the next level assembly while at the same time the stack low profile semiconductor IC packages may reach higher counts. For example, in an embodiment in which the ICs are memory chips and the stacked devices are to be included on a DIMM, stacks as high as eight low profile semiconductor IC packages may be formed while still providing a gap between DIMM modules. For example, the eight high stack of semiconductor IC packages may be less than 2.5 mm and may be approximately 2.0 mm in total height or less when assembled. That is, the height of the stack may not be substantially greater than a number of the IC packages multiplied by a height of the IC package. While an 8 high stack is illustrated, any number of IC packages may be stacked in other embodiments. For example, more than 4 IC packages may be stacked, or at least 8 may be stacked.

In one embodiment, a DIMM having stacked IC assemblies as described herein may allow for minimum DIMM connector spacings. The actual minimum spacing depends on a variety of factors, such as the amount of airflow available in a given system design, the amount of heat generated during use, the devices that will be physically located near the DIMMS, the form factor of the system itself, etc. The minimum spacing may be, for example, the width of the connectors themselves (e.g. about 10 mm currently, although it is anticipated that the connector width may be narrower in the future). Such a DIMM may address one or more factors that are prevalent in the electronic system industry. While memory capacity requirements are increasing (e.g. due to the increasing address capabilities of processors, such as the 64 bit processors currently available from many vendors), memory bus speeds are also increasing. To support higher speeds, DIMM connectors are often closely spaced (to minimize wire lengths to the connectors) and also the number of connectors may be limited to limit the electrical loading on the bus. Furthermore, small form factor machines such as rack mounted servers limit the amount of space available for all components. It is difficult to cost effectively provide dense, high capacity DIMMs using monolithic memory ICs, as the size of the IC dramatically increases its cost. A DIMM using lower cost ICs stacked as described herein may provide dense, high capacity DIMMs more cost effectively, in some embodiments.

FIG. 190 shows in cross section a simplified view of one embodiment of a tool 19000 for encapsulating a stack 18900 of low profile semiconductor IC packages. Gaps may form between the low profile semiconductor IC packages, and the encapsulation may help assure that the gap is filled (e.g. with an insulating resin which may be thermally conductive) to allow for more effective thermal transfer of heat through the stack 18900. The encapsulation of the stack 18900 may prevent hot spots and provide for more efficient and uniform heat flow throughout the assembly. Returning to FIG. 190, a mold cavity 19001 receives the stack 18900 and an encapsulant 19005 is injected under pressure through a pipe 19002 and a valve 19003 into the chamber 19001. To improve flow and fill of the gap a vacuum may be applied to the chamber and preclude the creation of voids. Alternatively, pressure sufficient to compress and diffuse any entrapped gasses could be applied.

FIG. 191 shows one embodiment of an assembled and encapsulated structure 19100 comprised of a stack 18900 of the low profile semiconductor IC packages electrically and mechanically joined together using a suitable conductor material and having an over molded encapsulant 19101 to yield a stacked fully encapsulated package assembly suitable for mounting on to the surface of a PCB such as a DIMM module PCB. As can be seen, the solder connections at the bottom of the assembled and encapsulated structure 19100 may be exposed for connection to the DIMM module.

FIG. 192 shows one embodiment of a DIMM module PCB assembly 19200 with a plurality of assembled and encapsulated structures 19201 of low profile IC packages mounted on the PCB.

FIGS. 193A-193B, 194A-194B, and 195 illustrate another embodiment of the packaging techniques described herein. FIGS. 193A-193B are similar to the step shown in FIGS. 184A-184B for the above embodiments. FIGS. 194A-194B are similar to the step shown in FIGS. 185A-185B for the above embodiments. Generally, the embodiment shown in FIGS. 193A-193B, 194A-194B, and 195 may include a third bump feature on the bottom side of the lead, located a similar length from the inward end of the leads as the second bump feature on the top side of the lead. Thus, a nearly continuous connection may be possible using the second and third bump features in a stack, which may permit the use of a conductive film between the ICs to form a stack.

FIGS. 193A-193B show one embodiment of the lead frame in top view 19300 and cross section view 19300' at the line 19302 in FIG. 193A, respectively. At the point shown in FIGS. 193A-193B, an etch resist has been applied on a top surface (etch resist 19301*a*) and on a bottom surface (etch resists 19301*b* and 19301*c*) of the lead frame to prepare it for etching. The etch resists 19301*a* and 19301*b* are similar to the etch resists 18401*a* and 18401*b* in FIGS. 184A-184B, respectively. Additionally, the resist 19301*c* is applied in approximately the same location of the bottom surface of the lead as the resist 19301*a* is applied, with respect to distance from the inward end of the lead.

FIGS. 194A-194B show an embodiment at the step in the manufacturing process after the etching has been performed and the etch resist removed. The lead frame is again shown in top view 19400 and cross section view 19400' through the line 19402, respectively in FIGS. 194A-194B. As illustrated in FIGS. 194A-194B, the leads have been etched away except for the portions covered by the etch resist, thus creating bump features 19401*a*, 19401*b*, and 19401*c*. An exploded view is provided in FIG. 194A to reveal greater detail. Phantom lines are used for the bump features 19401*b* to indicate that they are on the far side relative to the viewer.

The remainder of the packaging process for a single IC may be similar to the above described embodiments. When stacking the ICs, solder may be used as described above. Alternatively, since the bump features 19401*a* and 19401*c* form a nearly continuous connection from top to bottom of the IC, a conductive film may be used to make the connections.

For example, FIG. 195 illustrates an embodiment in which an anisotropic conductive adhesive film 19501 is used to connect between stacked ICs. The film 19501 may provide both thermal and electrical connection between the stacked ICs and may permit the soldering and injection encapsulation steps to be eliminated for this embodiment. Turning now to FIG. 196, a flowchart is shown illustrating one embodiment of a method of manufacturing a stacked IC or DIMM embodiment. The lead frame may be created (block 19602). For example, the lead frame may be part of a lead frame strip and may be stamped into the strip, etched, etc. Etch resist may be applied to the lead frame (block 19604). The etch resist may be applied in one or more locations, in various embodiments. For example, the etch resist may be applied to the bottom surface of the leads proximate to the inward ends of the leads, and optionally to the top surface of the leads further from the inward ends (and still further optionally to the bottom surface further from the inward ends). The lead frame is etched, creating one or more bump features on each lead below the etch resists (block 19606) and the etch resist is removed (block 19608). The IC to be packaged is inserted into the opening between the leads, and bonding wire is used to attach the IC pads to the leads (block 19610). The IC and wires bonds are encapsulated, along with the inward ends of the leads (block 19612) and the excess lead frame (e.g. beyond the optional second and third bump features, in some embodiments) is removed (block 19614). The ICs may then be tested and/or burned in, to eliminate failures prior to stacking (block 19616). The stack may then be created from two or more ICs (block 19618), and the stack may be encapsulated in some embodiments (block 19620). One or more stacked ICs may be attached to a DIMM (block 19622).

In one embodiment, a lead frame for an integrated circuit (IC) comprises a plurality of inward extending leads formed of a conductive metal. The leads have a first surface and a second surface opposite the first surface. Each lead has a first feature on the first surface proximate an inward end of the lead, and the plurality of leads form an opening within the leads into which the IC is insertable. The opening is approximately (e.g. not smaller than) a size of the IC.

In an embodiment, an IC assembly comprises an IC having a top surface comprising a plurality of input/output terminations, a plurality of leads arranged around the IC, a plurality of bond wires, and an encapsulant. Each lead has a first surface and a second surface opposite the first surface, and has a feature protruding from the first surface proximate an inward end of the lead nearest the IC. The feature extends from the first surface to approximately a plane that includes a bottom surface of the IC. Each bond wire connects a respective lead to a respective I/O terminal on the IC. The encapsulant seals the bond wires, the IC, and a first portion of the leads that includes the feature. The feature creates on offset from the bottom of the IC to permit the encapsulant to surround the first portion.

In one embodiment, a method comprises creating a lead frame comprising a conductive metal having a plurality of inwardly projecting leads. An opening formed within the leads is approximately a size of an integrated circuit (IC) to which the leads are to be connected. The method comprises applying an etch resist proximate the inward ends of the leads on a first surface of the leads; etching the lead frame subsequent to applying the etch resist; and removing the etch resist subsequent to etching the lead frame. The etched lead frame comprises leads having a feature protruding from the first surface proximate the inward ends of the leads.

In another embodiment, a dual in-line memory module (DIMM) comprises a plurality of stacked memory assemblies electrically coupled to a DIMM printed circuit board (PCB). Each of the plurality of stacked memory assemblies has a total height that permits a minimum DIMM connector spacing with DIMMs in adjacent connectors. Each of the plurality of stacked memory assemblies comprises a plurality of integrated circuit (IC) assemblies stacked vertically.

Numerous variations and modifications will become apparent to those skilled in the art once the above disclosure is fully appreciated. It is intended that the following claims be interpreted to embrace all such variations and modifications.

Data Synchronization of Physical Drams

Memory circuit speeds remain relatively constant, but the required data transfer speeds and bandwidth of memory systems are increasing, currently doubling every three years.

The result is that more commands must be scheduled, issued and pipelined in a memory system to increase bandwidth. However, command scheduling constraints that exist in the memory systems limit the command issue rates, and consequently, limit the increase in bandwidth.

In general, there are two classes of command scheduling constraints that limit command scheduling and command issue rates in memory systems: inter-device command scheduling constraints, and intra-device command scheduling constraints. These command scheduling constraints and other timing constraints and timing parameters are defined by manufacturers in their memory device data sheets and by standards organizations such as JEDEC.

Examples of inter-device (between devices) command scheduling constraints include rank-to-rank data bus turnaround times, and on-die-termination (ODT) control switching times. The inter-device command scheduling constraints typically arise because the devices share a resource (for example a data bus) in the memory sub-system.

Examples of intra-device (inside devices) command-scheduling constraints include column-to-column delay time (tCCD), row-to-row activation delay time (tRRD), four-bank activation window time (tFAW), and write-to-read turnaround time (tWTR). The intra-device command-scheduling constraints typically arise because parts of the memory device (e.g. column, row, bank, etc.) share a resource inside the memory device.

In implementations involving more than one memory device, some technique must be employed to assemble the various contributions from each memory device into a word or command or protocol as may be processed by the memory controller. Various conventional implementations, in particular designs within the classification of Fully Buffered DIMMs (FBDIMMs, a type of industry standard memory module) are designed to be capable of such assembly. However, there are several problems associated with such an approach. One problem is that the FBDIMM approach introduces significant latency (see description, below). Another problem is that the FBDIMM approach requires a specialized memory controller capable of processing the assembly.

As memory speed increases, the introduction of latency becomes more and more of a detriment to the operation of the memory system. Even modern FBDIMM-type memory systems introduce 10 s of nanoseconds of delay as the packet is assembled. As will be shown in the disclosure to follow, the latency introduced need not be so severe.

Moreover, the implementation of the FBDIMM-type memory devices required corresponding changes in the behavior of the memory controller, and this FBDIMMS are not backward compatible among industry-standard memory system. As will be shown in the disclosure to follow, various embodiments of the present invention may be used with previously existing memory controllers, without modification to their logic or interfacing requirements.

In order to appreciate the extent of the introduction of latency in an FBDIMM-type memory system, one needs to refer to FIG. 197. FIG. 197 shows an FBDIMM-type memory system 19700 wherein multiple DRAMS (D0, D1, . . . D7, D8) are in communication via a daisy-chained interconnect. The buffer 19705 is situated between two memory circuits (e.g. D1 and D2). In the READ path, the buffer 19705 is capable to present to memory DN the data retrieved from DM (M>N). Of course in a conventional FBDIMM-type system, the READ data from each successively higher memory DM must be merged with the data of memory DN, and such function is implemented via pass-through and merging logic 19706. As can be seen, such an operation occurs sequentially at each buffer 19705, and latency is thus cumulatively introduced.

FIG. 198A illustrates major logical components of a computer platform 19800, according to prior art. As shown, the computer platform 19800 includes a system 19820 and an array of memory components 19810 interconnected via a parallel interface bus 19840. As also shown, the system 19820 further includes a memory controller 19825.

FIG. 198B illustrates major logical components of a computer platform 19801, according to one embodiment of the present invention. As shown, the computer platform 19801 includes the system 19820 (e.g., a processing unit) that further includes the memory controller 19825. The computer platform 19801 also includes an array of memory components 19810 interconnected to an interface circuit 19850, which is connected to the system 19820 via the parallel interface bus 19840. In various embodiments, the memory components 19810 may include logical or physical components. In one embodiment, the memory components 19810 may include DRAM devices. In such a case, commands from the memory controller 19825 that are directed to the DRAM devices respect all of the command-scheduling constraints (e.g. tRRD, tCCD, tFAW, tWTR, etc.). In the embodiment of FIG. 198B, none of the memory components 19810 is in direct communication with the memory controller 19825. Instead, all communication to/from the memory controller 19825 and the memory components 19810 is carried out through the interface circuit 19850. In other embodiments, only some of the communication to/from the memory controller 19825 and the memory components 19810 is carried out through the interface circuit 19850.

FIG. 198C illustrates a hierarchical view of the major logical components of the computer platform 19801 shown in FIG. 198B, according to one embodiment of the present invention. FIG. 198C depicts the computer platform 19801 being comprised of wholly separate components, namely the system 19820 (e.g. a motherboard), and the memory components 19810 (e.g. logical or physical memory circuits).

In the embodiment shown, the system 19820 further comprises a memory interface 19821, logic for retrieval and storage of external memory attribute expectations 19822, memory interaction attributes 19823, a data processing engine 19824 (e.g., a CPU), and various mechanisms to facilitate a user interface 19825. In various embodiments, the system 19820 is designed to the specifics of various standards, in particular the standard defining the interfaces to JEDEC-compliant semiconductor memory (e.g DRAM, SDRAM, DDR2, DDR3, etc.). The specific of these standards address physical interconnection and logical capabilities. In different embodiments, the system 19820 may include a system BIOS program capable of interrogating the memory components 19810 (e.g. DIMMs) as a way to retrieve and store memory attributes. Further, various external memory embodiments, including JEDEC-compliant DIMMs, include an EEPROM device known as a serial presence detect (SPD) where the DIMM's memory attributes are stored. It is through the interaction of the BIOS with the SPD and the interaction of the BIOS with the physical memory circuits' physical attributes that the memory attribute expectations and memory interaction attributes become known to the system 19820.

As also shown, the computer platform 19801 includes one or more interface circuits 19850 electrically disposed between the system 19820 and the memory components 19810. The interface circuit 19850 further includes several system-facing interfaces, for example, a system address signal interface 19871, a system control signal interface 19872, a system clock signal interface 19873, and a system data signal interface 19874. Similarly, the interface circuit 19850 includes several memory-facing interfaces, for example, a memory address signal interface 19875, a memory control signal interface 19876, a memory clock signal interface 19877, and a memory data signal interface 19878.

In FIG. 198C, the memory data signal interface 19878 is specifically illustrated as separate, independent interface. This illustration is specifically designed to demonstrate the functional operation of the seamless burst merging capability of the interface circuit 19850, and should not be construed as a limitation on the implementation of the interface circuit. In other embodiments, the memory data signal interface 19878 may be composed of more than one independent interfaces. Furthermore, specific implementations of the interface circuit 19850 may have a memory address signal interface 19875 that is similarly composed of more than one independently operable memory address signal interfaces, and multiple, independent interfaces may exist for each of the signal interfaces included within the interface circuit 19850.

An additional characteristic of the interface circuit 19850 is the presence of emulation and command translation logic 19880, data path logic 19881, and initialization and configuration logic 19882. The emulation and command translation logic 19880 is configured to receive and, optionally, store electrical signals (e.g. logic levels, commands, signals, protocol sequences, communications) from or through the system-facing interfaces, and process those signals. In various embodiments, the emulation and command translation logic 19880 may respond to signals from the system-facing interfaces by responding back to the system 19820 by presenting signals to the system 19820, process those signals with other information previously stored, present signals to the memory components 19810, or perform any of the aforementioned operations in any order.

The emulation and command translation logic 19880 is capable of adopting a personality, and such personality defines the physical memory component attributes. In various embodiments of the emulation and command translation logic 19880, the personality can be set via any combination of bonding options, strapping, programmable strapping, the wiring between the interface circuit 19850 and the memory components 19810, and actual physical attributes (e.g. value of mode register, value of extended mode register) of the physical memory connected to the interface circuit 19850 as determined at some moment when the interface circuit 19850 and memory components 19810 are powered up.

The data path logic 19881 is configured to receive internally generated control and command signals from the emulation and command translation logic 19880, and use the signals to direct the flow of data through the interface circuit 19850. The data path logic 19881 may alter the burst length, burst ordering, data-to-clock phase-relationship, or other attributes of data movement through the interface circuit 19850.

The initialization and configuration logic 19882 is capable of using internally stored initialization and configuration logic to optionally configure all other logic blocks and signal interfaces in the interface circuit 19850. In one embodiment, the emulation and command translation logic 19880 is able to receive configuration request from the system control signal interface 19872, and configure the emulation and command translation logic 19880 to adopt different personalities.

More illustrative information will now be set forth regarding various optional architectures and features of different embodiments with which the foregoing frameworks may or may not be implemented, per the desires of the user. It should be noted that the following information is set forth for illustrative purposes and should not be construed as limiting in any manner. Any of the following features may be optionally incorporated with or without the other features described.

Industry-Standard Operation

In order to discuss specific techniques for inter- and intra-device delays, some discussion of access commands and how they are used is foundational.

Typically, access commands directed to industry-standard memory systems such as DDR2 and DDR3 SDRAM memory systems may be required to respect command-scheduling constraints that limit the available memory bandwidth. Note: the use of DDR2 and DDR3 in this discussion is purely illustrative examples, and is not to be construed as limiting in scope.

In modern DRAM devices, the memory storage cells are arranged into multiple banks, each bank having multiple rows, and each row having multiple columns. The memory storage capacity of the DRAM device is equal to the number of banks times the number of rows per bank times the number of column per row times the number of storage bits per column. In industry-standard DRAM devices (e.g. SDRAM, DDR, DDR2, DDR3, and DDR4 SDRAM, GDDR2, GDDR3 and GDDR4 SGRAM, etc.), the number of banks per device, the number of rows per bank, the number of columns per row, and the column sizes are determined by a standards-setting organization such as JEDEC. For example, the JEDEC standards require that a 1 Gb DDR2 or DDR3 SDRAM device with a four-bit wide data bus have eight banks per device, 8192 rows per bank, 2048 columns per row, and four bits per column. Similarly, a 2 Gb device with a four-bit wide data bus must have eight banks per device, 16384 rows per bank, 2048 columns per row, and four bits per column. A 4 Gb device with four-bit wide data bus must have eight banks per device, 32768 rows per bank, 2048 columns per row, and four bits per column. In the 1 Gb, 2 Gb and 4 Gb devices, the row size is constant, and the number of rows doubles with each doubling of device capacity. Thus, a 2 Gb or a 4 Gb device may be emulated by using multiple 1 Gb and 2 Gb devices, and by directly translating row-activation commands to row-activation commands and column-access commands to column-access commands. This emulation is possible because the 1 Gb, 2 Gb, and 4 Gb devices all have the same row size.

The JEDEC standards require that an 8 Gb device with a four-bit wide data bus interface must have eight banks per device, 32768 rows per bank, 4096 columns per row, and four bits per column—thus doubling the row size of the 4 Gb device. Consequently, an 8 Gb device cannot necessarily be emulated by using multiple 1 Gb, 2 Gb or 4 Gb devices and simply translating row-activation commands to row-activation commands and column-access commands to column-access commands.

Now, with an understanding of how access commands are used, presented as follows are various additional optional techniques that may optionally be employed in different embodiments to address various possible issues.

FIG. 199A illustrates a timing diagram for multiple memory devices (e.g., SDRAM devices) in a low data rate memory system, according to prior art. FIG. 199A illustrates that multiple SDRAM devices in a low data rate memory system can share the data bus without needing idle cycles between data bursts. That is, in a low data rate system, the inter-device delays involved are small relative to a clock cycle. Therefore, multiple devices may share the same bus and even though there may be some timing uncertainty when one device stops being the bus master and another device becomes the bus master, the data cycle is not delayed or corrupted. This scheme using time division access to the bus has been shown to work for time multiplexed bus masters in a low data rate memory systems—without the requirement to include idle cycles to switch between the different bus masters.

As the speed of the clock increases, the inter- and intra-device delays comprise successively more and more of a clock cycle (as a ratio). At some point, the inter- and intra-device delays are sufficiently large (relative to a clock cycle) that the multiple devices on a shared bus must be managed. In particular, and as shown in FIG. 199B, as the speed of the clock increases, the inter- and intra-device delays comprise successively more and more of a clock cycle (as a ratio). Consequently, a one cycle delay is needed between the end of a read data burst of a first device on a shared device and the beginning of a read data burst of a second device on the same bus. FIG. 199B illustrates that, at the clock rate shown, multiple memory devices (e.g., DDR SDRAM, DDR2 SDRAM, DDR3 SDRAM devices) sharing the data bus must necessarily incur minimally a one cycle penalty when switching from one memory device driving the data bus to another memory device driving the data bus.

FIG. 199C illustrates a timing diagram for multiple memory devices in a high data rate memory system, according to prior art. FIG. 199C shows command cycles, timing constraints 19910 and 19920, and idle cycles of memory. As the clock rate further increases, the inter- and intra-device delay may become as long as one or more clock cycles. In such a case, switching between a first memory device and a second memory device would introduce one or more idle cycles 19930. Embodiments of the invention herein might be advantageously applied to reduce or eliminate idle time 19930 between the data transfers 19928 and 19929.

Continuing the discussion of FIG. 199C, the timing diagram shows a limitation preventing full bandwidth utilization in a DDR3 SDRAM memory system. For example, in an embodiment involving DDR3 SDRAM memory systems, any two row-access commands directed to a single DRAM device may not necessarily be scheduled closer than a period of time defined by the timing parameter of tRRD. As another example, at most four row-access commands may be scheduled within a period of time defined by the timing parameter of tFAW to a single DRAM device. Moreover, consecutive column-read access commands and consecutive column-write access commands cannot necessarily be scheduled to a given DRAM device any closer than tCCD, where tCCD equals four cycles (eight half-cycles of data) in DDR3 DRAM devices. This situation is shown in the left portion of the timing diagram of FIG. 199C at 19905. Row-access or row-activation commands are shown as ACT in the figures. Column-access commands are shown as READ or WRITE in the figures. Thus, for example, in memory systems that require a data access in a data burst of four half-cycles as shown in FIG. 199C, the tCCD constraint prevents column accesses from being scheduled consecutively. FIG. 3C shows that the constraints 19910 and 19920 imposed on the DRAM commands sent to a given device restrict the command rate, resulting in idle cycles or bubbles 19930 on the data bus and reducing the bandwidth. Again, embodiments of the invention herein might be advantageously applied to reduce or eliminate idle time 19930 between the data transfers 19928 and 19929.

As illustrated in FIGS. 199A-199C, idle-cycle-less data bus switching was possible with slower speed DRAM memory systems such as SDRAM memory systems, but not possible with higher speed DRAM memory systems such as DDR SDRAM, DDR2 SDRAM, DDR3 SDRAM devices due to the fact that in any memory system where multiple memory devices share the same data bus, the skew and jitter characteristics of address, clock, and data signals introduce timing uncertainties into the access protocol of the memory system. In the case when the memory controller wishes to stop accessing one memory device to switch to accessing a different device, the differences in address, clock and data signal skew and jitter characteristics of the two difference memory devices reduce the amount of time that the memory controller can use to reliably capture data. In the case of the slow-speed SDRAM memory system, the SDRAM memory system is designed to operate at speeds no higher than 200 MHz, and data bus cycle times are longer than 5 nanoseconds (ns). Consequently, timing uncertainties introduced by inter-device skew and jitter characteristics may be tolerated as long as they are sufficiently smaller than the cycle time of the memory system—for example, 1 ns. However, in the case of higher speed memory systems, where data bus cycles times are comparable in duration to, or shorter than, one-nanosecond, a one-nanosecond uncertainty in skew or jitter between signal timing from different devices means that memory controllers can no longer reliably capture data from different devices without accounting for the inter-device skew and jitter characteristics.

As illustrated in FIG. 199B, DDR SDRAM, DDR2 and DDR3 SDRAM memory systems use the DQS signal to provide a source-synchronous timing reference between the DRAM devices and the memory controller. The use of the DQS signal provides accurate timing control at the cost of idle cycles that must be incurred when a first bus master (DRAM device) stops driving the DQS signal, and a second bus master (DRAM device) starts to drive the DQS signal for at least one cycle before the second bus master places the data burst on the shared data bus. The placement of multiple DRAM devices on the same shared data bus is a desirable configuration from the perspective of enabling a higher capacity memory system and providing a higher degree of parallelism to the memory controller. However, the required use of the DQS signal significantly lowers the sustainable bandwidth of the memory system.

The advantage of the infrastructure-compatible burst merging interface circuit 19850 illustrated in FIGS. 198B and 198C and described in greater detail below is that it can provide the higher capacity, higher parallelism that the memory controller desires while retaining the use of the DQS signal in an infrastructure-compatible system to provide the accurate timing reference for data transmission that is critical for modern memory systems, without the cost of the idle cycles required for the multiple bus masters (DRAM devices) to switch from one DRAM device to another.

Elimination of Idle Data-Bus Cycles Using an Interface Circuit

FIG. 200A illustrates a data flow diagram through the data signal interfaces 19878, Data Path Logic 19881 and System Data Signal Interface 19874 of FIG. 198C, showing how data bursts returned by multiple memory devices in response to multiple, independent read commands to different memory devices connected respectively to Data Path A, synchronized by Data Strobe A, Data Path B, synchronized by Data Strobe B, and Data Path C, synchronized by Data Strobe C are combined into a larger contiguous burst, according to one embodiment of the present invention. In particular, data burst B (B0, B1, B2, B3) 200A20 is slightly overlapping with data burst A (A0, A1, A2, A3) 200A10. Also, data burst C 200A30 does not overlap with either the data burst A 20010, nor the data burst B 200A20. As described in greater detail in FIGS. 200C and 200D, various logic components of the interface circuit 19850 illustrated in FIG. 198C are configured to re-time overlapping or non-overlapping bursts to obtain contiguous burst of data 200A40. In various embodiments, the logic required to implement the ordering and concatenation of overlapping or non-overlapping bursts may be implemented using registers, multiplexors, and combinational logic. As shown in FIG. 200A, the assembled, contiguous burst of data 200A40 is indeed contiguous and properly ordered.

FIG. 200A shows that the data returned by the memory devices can have different phase relationships relative to the clock signal of the interface circuit 19850. FIG. 200D shows how the interface circuit 19850 may use the knowledge of the independent clock-to-data phase relationships to delay each data burst to the interface circuit 19850 to the same clock domain, and re-drive the data bursts to the system interface as one single, contiguous, burst.

FIG. 200B illustrates a waveform corresponding to FIG. 200A showing how the three time separated bursts from three different memory devices are combined into a larger contiguous burst, according to one embodiment of the present invention. FIG. 200B shows that, as viewed from the perspective of the interface circuit 19850, the data burst A0-A1-A2-A3, arriving from one of the memory components 19810 to memory data signal interface A as a response to command (Cmd) A issued by the memory controller 19825, can have a data-to-clock relationship that is different from data burst B0-B1-B2 -B3, arriving at memory signal interface B, and a data burst C0-C1-C2-C3 can have yet a third clock-to-data timing relationship with respect to the clock signal of the interface circuit 19850. FIG. 200B shows that once the respective data bursts are re-synchronized to the clocking domain of the interface circuit 19850, the different data bursts can be driven out of the system data interface Z as a contiguous data burst.

FIG. 200C illustrates a flow diagram of method steps showing how the interface circuit 19850 can optionally make use of a training or clock-to-data phase calibration sequence to independently track the clock-to-data phase relationship between the memory components 19810 and the interface circuit 19850, according to one embodiment of the present invention. In implementations where the clock-to-data phase relationships are static, the training or calibration sequence is not needed to set the respective delays in the memory data signal interfaces. While the method steps are described with relation to the computer platform 19801 illustrated in FIGS. 198B and 198C, any system performing the method steps, in any order, is within the scope of the present invention.

The training or calibration sequence is typically performed after the initialization and configuration logic 19882 receives either an interface circuit initialization or calibration request. The goal of the training or calibration sequence is to establish the clock-to-data phase relationship between the data from a given memory device among the memory components 19810 and a given memory data signal interface 19878. The method begins in step 20002, where the initialization and configuration logic 19882 selects one of the memory data signal interfaces 19878. As shown in FIG. 200C, memory data signal interface A may be selected. Then, the initialization and configuration logic 19882 may, optionally, issue one or more commands through the memory control signal interface 19876 and optionally, memory address signal interface 19875, to one or more of the memory components 19810 connected to memory data signal interface A. The commands issued through the memory controller signal interface 19876 and optionally, memory address signal interface 19875, will have the effect of getting the memory components 19810 to receive or return previously received data in a predictable pattern, sequence, and timing so that the interface circuit 19850 can determine the clock-to-data phase relationships between the memory device and the specific memory data signal interface. In specific DRAM memory systems such as DDR2 and DDR3 SDRAM memory systems, multiple clocking relationships must all be tracked, including clock-to-data and clock-to-DQS. For the purposes of this application, the clock-to-data phase relationship is taken to encompass all clocking relationships on a specific memory data interface, including and not limited to clock-to-data and clock-to-DQS.

In step 20004, the initialization and configuration logic 19882 performs training to determine clock-to-data phase relationship between the memory data interface A and data from memory components 19810 connected to the memory data interface A. In step 20006, the initialization and configuration logic 19882 directs the memory data interface A to set the respective delay adjustments so that clock-to-data phase variances of each of the memory components 19810 connected to the memory data interface A can be eliminated. In step 20008, the initialization and configuration logic 19882 determines whether all memory data signal interfaces 19878 within the interface circuit 19850 have been calibrated. If so, the method ends in step 20010 with the interface circuit 19850 entering normal operation regime. If, however, the initialization and configuration logic 19882 determines that not all memory data signal interfaces 19878 have been calibrated, then in step 20012, the initialization and configuration logic 19882 selects a memory data signal interface that has not yet been calibrated. The method then proceeds to step 20002, described above.

The flow diagram of FIG. 200C shows that the memory data signal interfaces 19878 are trained sequentially, and after memory data interface A has been trained, memory data interface B is similarly trained, and respective delays set for data interface B. The process is then repeated until all of the memory data signal interfaces 19878 have been trained and respective delays are set. In other embodiments, the respective memory data signal interfaces 19878 may be trained in parallel. After the calibration sequence is complete, control returns to the normal flow diagram as illustrated in FIG. 200D.

FIG. 200D illustrates a flow diagram of method steps showing the operations of the interface circuit 19850 in response to the various commands, according to one embodiment of the present invention. While the method steps are described with relation to the computer platform 19801 illustrated in FIGS. 198B and 198C, any system performing the method steps, in any order, is within the scope of the present invention.

The method begins in step 20020, where the interface circuit 19850 enters normal operation regime. In step 20022, the system control signal interface 19872 determines whether a new command has been received from the memory controller 19825. If so, then, in step 20024, the emulation and command translation logic 19880 translates the address and issues the command to one or more memory components 19810 through the memory address signal interface 19875 and the memory control signal interface 19876. Otherwise, the system control signal interface 19872 waits for the new command (i.e., the method returns to step 20022, described above).

In the general case, the emulation and command translation logic 19880 may perform a series of complex actions to handle different commands. However, the description of all commands are not vital to the enablement of the seamless burst merging functionality of the interface circuit 19850, and the flow diagram in FIG. 200D describes only those commands that are vital to the enablement of the seamless burst merging functionality. Specifically, the READ command, the WRITE command and the CALIBRATION command are important commands for the seamless burst merging functionality.

In step 20026, the emulation and command translation logic 19880 determines whether the new command is a READ command. If so, then the method proceeds to step 20028, where the emulation and command translation logic 19880 receives data from the memory component 19810 via the memory data signal interface 19878. In step 20030, the emulation and command translation logic 19880 directs the data path logic 19881 to select the memory data signal interface 19878 that corresponds to one of the memory components 19810 that the READ command was issued to. In step 20032, the emulation and command translation logic 19880 aligns the data received from the memory component 19810 to match the clock-to-data phase with the interface circuit 19850. In step 20034, the emulation and command translation logic 19880 directs the data path logic 19881 to move the data from the selected memory data signal interface 19878 to the system data signal interface 19874 and re-drives the data out of the system data signal interface 19874. The method then returns to step 20022, described above.

If, however, in step 20026, the emulation and command translation logic determines that the new command is not a READ command, the method then proceeds to step 20036, where the emulation and command translation logic determines whether the new command is a WRITE command. If so, then, in step 20038, the emulation and command translation logic 19880 directs the data path logic 19881 to receive data from the memory controller 19825 via the system data signal interface 19874. In step 20040, the emulation and command translation logic 19880 selects the memory data signal interface 19878 that corresponds to the memory component 19810 that is the target of the WRITE commands and directs the data path logic 19881 to move the data from the system data signal interface 19874 to the selected memory data signal interface 19878. In step 20042, the selected memory data signal interface 19878 aligns the data from system data signal interface 19874 to match the clock-to-data phase relationship of the data with the target memory component 19810. In step 20044, the memory data signal interface 19878 re-drives the data out to the memory component 19810. The method then returns to step 20022, described above.

If, however, in step 20036, the emulation and command translation logic determines that the new command is not a WRITE command, the method then proceeds to step 20046, where the emulation and command translation logic determines whether the new command is a CALIBRATION command. If so, then the method ends at step 20048, where the emulation and command translation logic 19880 issues a calibration request to the initialization and configuration logic 19882. The calibration sequence has been described in FIG. 200C.

The flow diagram in FIG. 200D illustrates the functionality of the burst merging interface circuit 19850 for individual commands. As an example, FIG. 200A illustrates the functionality of the burst merging interface circuit for the case of three consecutive read commands. FIG. 200A shows that data bursts A0, A1, A2 and A3 may be received by Data Path A, data bursts B0, B1, B2 and B3 may be received by Data Path B, and data bursts C0, C1, C2 and C3 may be received by Data Path C, wherein the respective data bursts may all have different clock-to-data phase relationships and in fact part of the data bursts may overlap in time. However, through the mechanism illustrated in the flow diagram contained in FIG. 200D, data bursts from Data Paths A, B, and C are all phase aligned to the clock signal of the interface circuit 19850 before they are driven out of the system data signal interface 19874 and appear as a single contiguous data burst with no idle cycles necessary between the bursts. FIG. 200B shows that once the different data bursts from different memory circuits are time aligned to the same clock signal used by the interface circuit 19850, the memory controller 19825 can issue commands with minimum spacing—constrained only by the full utilization of the data bus—and the seamless burst merging functionality occur as a natural by-product of the clock-to-data phase alignment of data from the individual memory components 19810 connected via parallel data paths to interface circuit 19850.

Figure 201A:
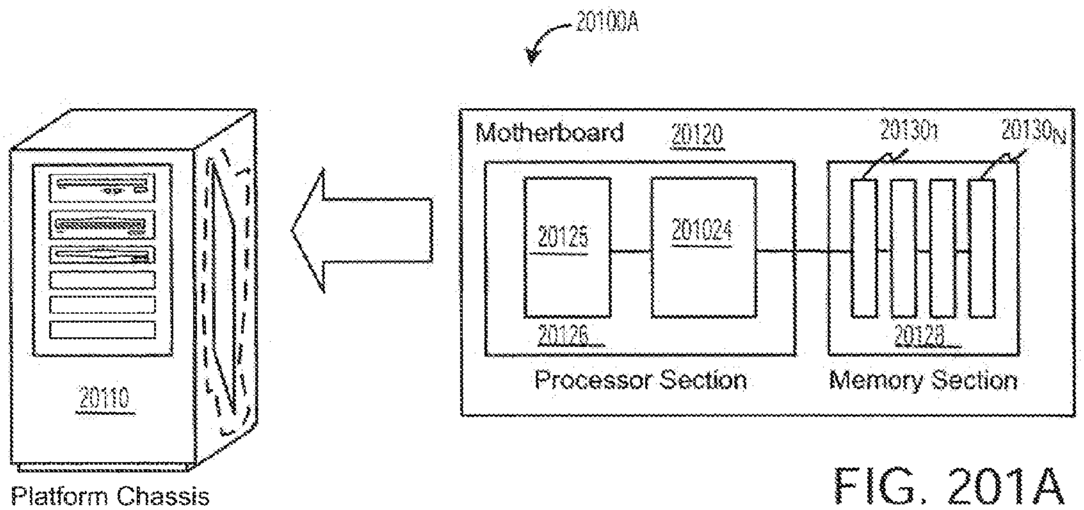

FIG. 201A illustrates a computer platform 20100A that includes a platform chassis 20110, and at least one processing element that consists of or contains one or more boards, including at least one motherboard 20120. Of course the platform 20100 as shown might comprise a single case and a single power supply and a single motherboard. However, it might also be implemented in other combinations where a single enclosure hosts a plurality of power supplies and a plurality of motherboards or blades.

The motherboard 20120 in turn might be organized into several partitions, including one or more processor sections 20126 consisting of one or more processors 20125 and one or more memory controllers 20124, and one or more memory sections 20128. Of course, as is known in the art, the notion of any of the aforementioned sections is purely a logical partitioning, and the physical devices corresponding to any logical function or group of logical functions might be implemented fully within a single logical boundary, or one or more physical devices for implementing a particular logical function might span one or more logical partitions. For example, the function of the memory controller 20124 might be implemented in one or more of the physical devices associated with the processor section 20126, or it might be implemented in one or more of the physical devices associated with the memory section 20128.

Figure 201B:
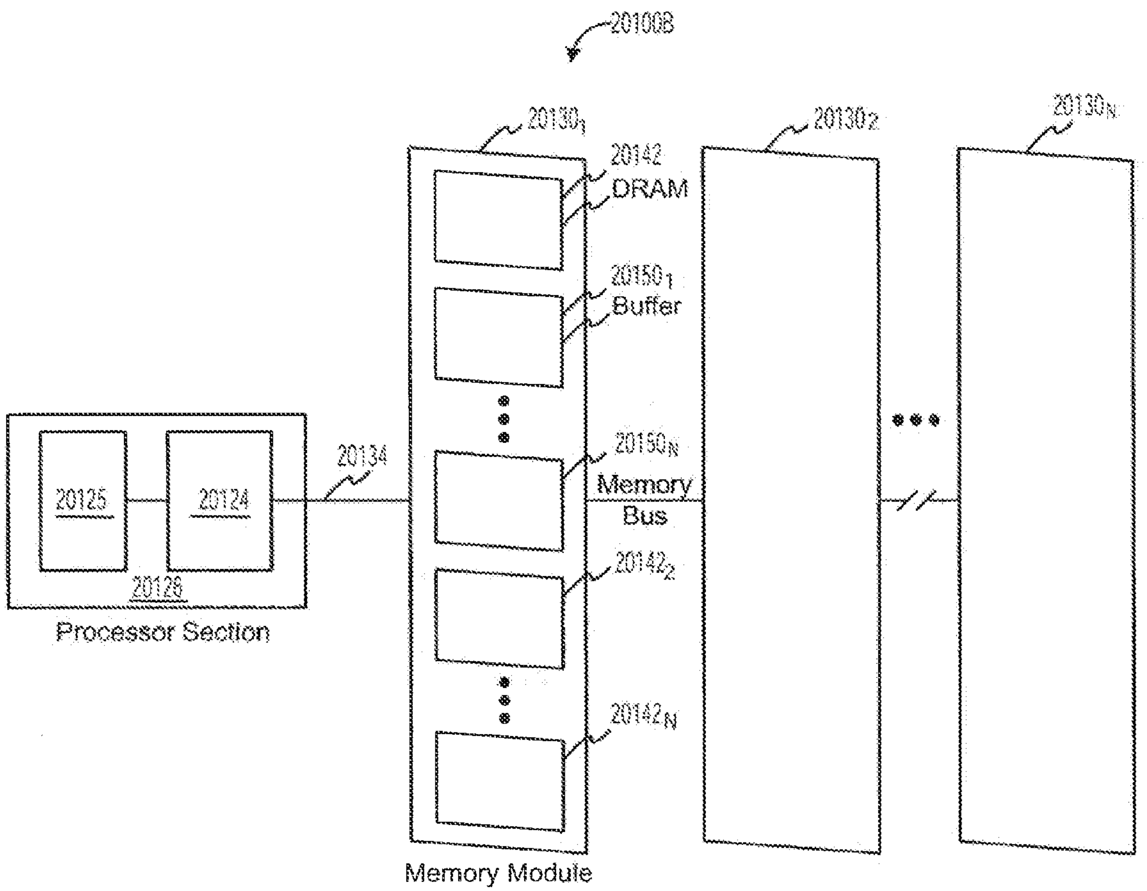
Figure 201C:
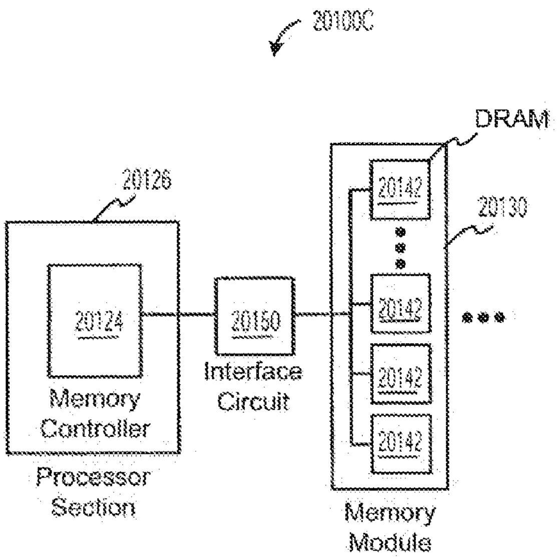
Figure 201D:
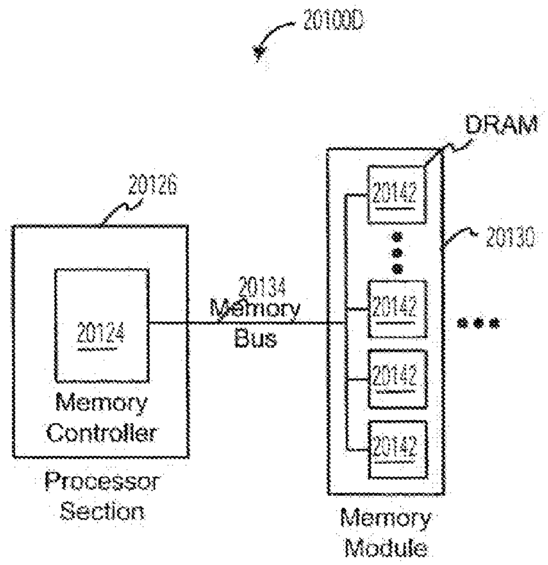
Figure 201E:
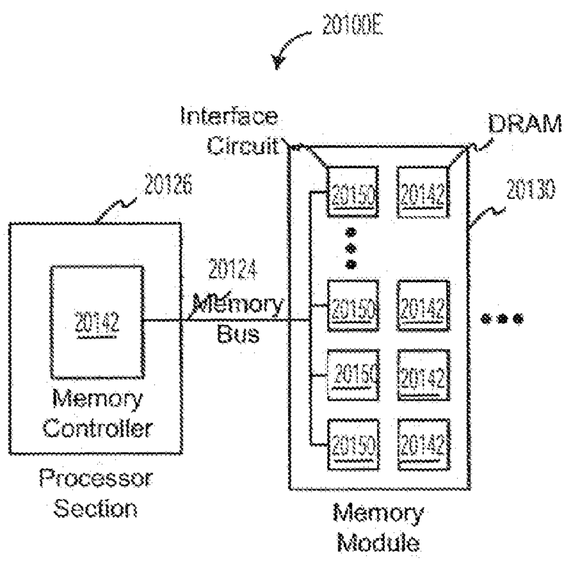

FIG. 201B illustrates one exemplary embodiment of a memory section, such as, for example, the memory section 20128, in communication with a processor section 20126. In particular, FIG. 201B depicts embodiments of the invention as is possible in the context of the various physical partitions on structure 20120. As shown, one or more memory modules 20130 1-20130 N each contain one or more interface circuits 20150 1-20150 N and one or more DRAMs 20142 1-20142 N positioned on (or within) a memory module 20130 1.

It must be emphasized that although the memory is labeled variously in the figures (e.g. memory, memory components, DRAM, etc), the memory may take any form including, but not limited to, DRAM, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory, flash memory, and/or any other type of volatile or non-volatile memory.

Figure 201F:
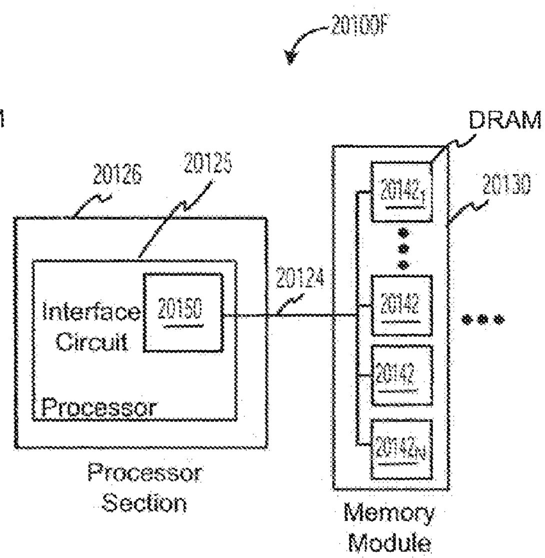

Many other partition boundaries are possible and contemplated, including positioning one or more interface circuits 20150 between a processor section 20126 and a memory module 20130 (see FIG. 201C), or implementing the function of the one or more interface circuits 20150 within the memory controller 20124 (see FIG. 201D), or positioning one or more interface circuits 20150 in a one-to-one relationship with the DRAMs 20142 1-20142 N and a memory module 20130 (see 201E), or implementing the one or more interface circuits 20150 within a processor section 20126 or even within a processor 20125 (see FIG. 201F). Furthermore, the system 19820 illustrated in FIGS. 198B and 198C is analogous to the computer platform 20100 and 20110 illustrated in FIGS. 201A-201F, the memory controller 19825 illustrated in FIGS. 198B and 198C is analogous to the memory controller 20124 illustrated in FIGS. 201A-201F, the interface circuit 19850 illustrated in FIGS. 198B and 198C is analogous to the interface circuits 20150 illustrated in FIGS. 201A-201F, and the memory components 19810 illustrated in FIGS. 198B and 198C are analogous to the DRAMs 20142 illustrated in FIGS. 201A-201F. Therefore, all discussions of FIGS. 198B, 198C, and 200A-200D apply with equal force to the systems illustrated in FIGS. 201A-201F.

One advantage of the disclosed interface circuit is that the idle cycles required to switch from one memory device to another memory device may be eliminated while still maintaining accurate timing reference for data transmission. As a result, memory system bandwidth may be increased, relative to the prior art approaches, without changes to the system interface or commands.

While the foregoing is directed to embodiments of the present invention, other and further embodiments of the invention may be devised without departing from the basic scope thereof.

Partial Width Memory System

FIG. 202 illustrates some of the major components of a memory subsystem 20200, according to prior art. As shown, the memory subsystem 20200 includes a memory controller 20240 and a single-rank memory module 20210 interconnected via a memory bus that includes a data bus 20260 and an address and control bus 20270. As shown, the memory module 20210 is composed of a rank of ×8 memory circuits (e.g. DRAMs) 20220A-I and an interface circuit 20230 that performs the address and control register function. When the memory controller 20240 performs, say, a read from the single rank of memory circuits 20220A-I on memory module 20210, all the nine memory circuits 20220A-I respond in parallel to the read.

FIG. 203 illustrates some of the major components of a memory subsystem 20300, according to prior art. As shown, the memory subsystem 20300 includes a memory controller 20340 and a single-rank memory module 20310 interconnected via a memory bus that includes a data bus 20360 and an address and control bus 20370. As shown, the memory module 20310 is composed of a rank of ×4 memory circuits 20320A-R and an interface circuit 20330 that performs the address and control register function. When the memory controller 20340 performs, say, a read from the single rank of memory circuits 20320A-R on memory module 20310, all the eighteen memory circuits 20320A-R respond in parallel to the read. It should be noted that the memory circuits 20320A-R may be transposed on the module 20310 in many ways. For example, half the memory circuits may be on a first side of the module 20310 while the other half may be on a second side of the module.

FIG. 204 illustrates some of the major components of a memory subsystem 20400, according to prior art. As shown, the memory subsystem 20400 includes a memory controller 20440 and a dual-rank memory module 20410 interconnected via a memory bus that includes a data bus 20460. As shown, the memory module 20410 is composed of a first rank of ×8 memory devices 20420A-I, a second rank of ×8 memory devices 20420J-R, an interface circuit 20430 that performs the address and control register function, and a non-volatile memory circuit 20434 (e.g. EEPROM) that includes information about the configuration and capabilities of memory module 20410. For ease of illustration, the address and control bus interconnecting the memory controller 20440 and the interface circuit 20430 as well as the address and control bus interconnecting the interface circuit 20430 and the memory circuits 20420A-R are not shown. It should be noted that the memory circuits may be transposed on the memory module in many different ways. For example, the first rank of memory circuits 20420A-I may be placed on one side of the module while the second rank of memory circuits 20420J-R may be placed on the other side of the module. Alternately, some subset of the memory circuits of both the ranks may be placed on one side of the memory module while the remaining memory circuits of the two ranks may be on the other side of the memory module. As shown, the two ranks of memory devices on the memory module 20410 share the data bus 20460. To illustrate, memory circuit 20420A corresponds to data bits [7:0] of the first rank while memory circuit 20420J corresponds to data bits [7:0] of the second rank. As a result, the data pins of memory circuits 20420A and 20420J are connected to the signal lines corresponding to data bits [7:0] of the data bus 20460. In other words, the first and second rank of memory devices are said to have a shared or 'dotted' data bus. A dual-rank memory module composed of ×4 memory circuits would look similar to memory module 20410 except that each rank would have eighteen ×4 memory circuits.

FIG. 205 illustrates a four channel (i.e. four memory bus) memory subsystem 20500, according to prior art. As shown, the memory subsystem 20500 includes a memory controller 20510 and four memory channels 20520, 20530, 20540, and 20550. Furthermore, as illustrated, each memory channel supports up to two memory modules. For example, memory channel 20520 supports memory modules 20522 and 20524. Similarly, memory channel 20530 supports memory modules 20532 and 20534, memory channel 20540 supports memory modules 20542 and 20544, and memory channel 20550 supports memory modules 20552 and 20554. The memory modules can be single-rank, dual-rank, or quad-rank modules. Furthermore, the memory modules on each channel share a common memory bus. Therefore, the memory controller 20510 inserts idle cycles on the bus when switching from accessing one rank on a given channel to accessing a different rank on the same channel. For example, the memory controller 20510 inserts one or more idle cycles on memory bus 20520 when switching from accessing a first rank (not shown) on memory module 20522 to accessing a second rank (not shown) on memory module 20522. The idle bus cycle(s) or bus turnaround time needed when switching from accessing a first rank on a DIMM to accessing a second rank on the same DIMM is commonly referred to as the intra-DIMM rank-rank turnaround time. Furthermore, the memory controller 20510 inserts one or more idle bus cycles on memory bus 20520 when switching from accessing a rank (of memory circuits) on memory module 20522 to accessing a rank on memory module 20524. The idle bus cycle(s) or bus turnaround time needed when switching from accessing a rank on a first DIMM of a memory channel to accessing a rank on a second DIMM of the same memory channel is commonly referred to as the inter-DIMM rank-rank turnaround time. The intra-DIMM rank-rank turnaround time and the inter-DIMM rank-rank turnaround time may be the same or may be different. As can be seen from FIG. 205, these turnaround times are needed because all the ranks on a given memory channel share a common memory bus. These turnaround times have an appreciable impact on the maximum sustained bandwidth of the memory subsystem 20500.

Typical memory controllers support modules with ×4 memory circuits and modules with ×8 memory circuits. As described previously, Chipkill requires eighteen memory circuits to be operated in parallel. Since a memory module with ×4 memory circuits has eighteen memory circuits per rank, the memory channels 20520, 20530, 20540, and 20550 may be operated independently when memory modules with ×4 memory circuits are used in memory subsystem 20500. This mode of operation is commonly referred to as independent channel mode. However, memory modules with ×8 memory circuits have only nine memory circuits per rank. As a result, when such memory modules are used in memory subsystem 20500, two memory channels are typically operated in parallel to provide Chipkill capability. To illustrate, say that all memory modules in memory subsystem 20500 are modules with ×8 memory circuits. Since eighteen memory circuits must respond in parallel to a memory read or memory write to provide Chipkill capability, the memory controller 20510 may issue a same read command to a first rank on memory module 20522 and to a first rank on memory module 20542. This ensures that eighteen memory circuits (nine on module

20522 and nine on module 20542) respond in parallel to the memory read. Similarly, the memory controller 20510 may issue a same write command to a first rank on module 20522 and a first rank on module 20542. This method of operating two channels in parallel is commonly referred to as lockstep or ganged channel mode. One drawback of the lockstep mode is that in modern memory subsystems, the amount of data returned by the two memory modules in response to a read command may be greater than the amount of data needed by the memory controller. Similarly, the amount of data required by the two memory modules in association with a write command may be greater than the amount of data provided by the memory controller. For example, in a DDR3 memory subsystem, the minimum amount of data that will be returned by the target memory modules in the two channels operating in lockstep mode in response to a read command is 128 bytes (64 bytes from each channel). However, the memory controller typically only requires 64 bytes of data to be returned in response to a read command. In order to match the data requirements of the memory controller, modern memory circuits (e.g. DDR3 SDRAMs) have a burst chop capability that allows the memory circuits to connect to the memory bus for only half of the time when responding to a read or write command and disconnect from the memory bus during the other half. During the time the memory circuits are disconnected from the memory bus, they are unavailable for use by the memory controller. Instead, the memory controller may switch to accessing another rank on the same memory bus. FIG. 206 illustrates an example timing diagram 20600 of a modern memory circuit (e.g. DDR3 SDRAM) operating in normal mode and in burst chop mode. As shown, a rank of memory circuits receives a read command from the memory controller in clock cycle T0. In the normal mode of operation, the memory circuits respond by driving eight bits of data on each data line during clock cycles Tn through Tn+3. This mode is also referred to as BL8 mode (burst length of 8). However, in the burst chop mode, the memory circuits receive a read command from the memory controller in clock cycle T0 and respond by driving only four bits of data on each data line during clock cycles Tn and Tn+1. The memory circuits disconnect from the memory bus during clock cycles Tn+2 and Tn+3. This mode is referred to as BL4 or BC4 (burst length of 4 or burst chop of 4) mode. The earliest time the same memory circuits can re-connect to the memory bus for a following read or write operation is clock cycle Tn+4.

FIG. 207 illustrates some of the major components of a memory subsystem 20700, according to one embodiment of the present invention. As shown, the memory subsystem 20700 includes a memory controller 20750 and a memory module 20710 interconnected via a memory bus that includes a data bus 20760 and an address and control bus 20770. As shown, the memory module 20710 is composed of thirty six ×8 memory circuits 20720A-R and 20730A-R, one or more interface circuits 20740, an interface circuit 20752 that performs the address and control register function, and a non-volatile memory circuit 20754 (e.g. EEPROM) that includes information about the configuration and capabilities of memory module 20710. For the purpose of illustration, eighteen interface circuits 20740 are shown, each of which has an 8-bit wide data bus 20780 that connects to the corresponding two memory circuits and a 4-bit wide data bus 20790 that connects to the data bus 20760 of the memory bus. It should be noted that the functions of all the interface circuits 20740 and optionally, that of the interface circuit 20752, may be implemented in a single integrated circuit or in multiple integrated circuits. It should also be noted that the memory circuits 20720A-R and 20730A-R may be transposed in many different ways on the memory module. For example, the memory circuits 20720A-R may all be on one side of the memory module whereas the memory circuits 20730A-R may all be on the other side of the module. Alternately, some subset of the memory circuits 20720A-R and some subset of the memory circuits 20730A-R may be on one side of the memory module while the remaining memory circuits are on the other side of the module. In yet another implementation, two memory circuits that have a common data bus to the corresponding interface circuit (e.g. memory circuit 20720A and memory circuit 20730A) may be in a dual-die package (DDP) and thus, share a common package.

Memory module 20710 may be configured as a memory module with four ranks of ×8 memory circuits (i.e. quad-rank memory module with ×8 memory circuits), as a memory module with two ranks of ×8 memory circuits (i.e. dual-rank memory module with ×8 memory circuits), as a memory module with two ranks of ×4 memory circuits (i.e. dual-rank memory module with ×4 memory circuits), or as a memory module with one rank of ×4 memory circuits (i.e. single-rank memory module with ×4 memory circuits).

FIG. 207 illustrates memory module 20710 configured as a dual-rank memory module with ×4 memory circuits. In other words, the thirty six ×8 memory circuits are configured into a first rank of eighteen memory circuits 20720A-R and a second rank of eighteen memory circuits 20730A-R. It can be seen from the figure that the interface circuits 20740 collectively have a 72-bit wide data interface 20790 to the memory controller 20750 and a 144-bit wide data interface 20780 to the ranks of memory circuits on the memory module 20710. When the memory controller 20750 issues a BL8 access, say a read, to the first rank of memory circuits (i.e. memory circuits 20720A-R), the interface circuits 20740 performs a BL4 read access to memory circuits of that rank. This ensures that memory circuits 20720A-R release the shared data bus 20780 between the interface circuits 20740 and the ranks after two clock cycles (instead of driving the shared data bus for four clock cycles for a BL8 access).

FIG. 208 shows an example timing diagram 20800 of a read to the first rank of memory circuits 20720A-R followed by a read to the second rank of memory circuits 20730A-R when memory module 20710 is configured as a dual-rank module with ×4 memory circuits, according to an embodiment of this invention. The memory controller 20750 issues a BL8 read command (not shown) to the first rank of memory circuits 20720A-R. This is converted to a BL4 read command 20810 by one or more of the interface circuits 20740 and 20752 and sent to memory circuits 20720A-R. Each of the memory circuits 20720A-R returns the requested data 20830 as four bytes in two clock cycles on data bus 20780. This data is received by interface circuit 20740 and re-transmitted to the memory controller 20750 as eight nibbles (i.e. as BL8 data on the 4-bit wide bus 20790) of data 20850. In other words, each of the memory circuits 20720A-R outputs four bytes of data 20830 to interface circuit 20740 which, in turn, sends the data as eight nibbles 20850 to the memory controller. As shown in FIG. 208, the memory circuits 20720A-R connect to the data bus 20780 for two clock cycles and then disconnect from the data bus 20780. This gives memory circuits 20730A-R sufficient time to connect to data bus 20780 and be ready to respond to a read command exactly four clock cycles after a read command was issued to memory circuits 20720A-R. Thus, when memory module 20710 is configured as a dual-rank module with ×4 memory circuits (i.e. when a ×4 memory circuit is emulated using a ×8 memory circuit), memory subsystem 20700 may operate with a 0-cycle (zero cycle) intra-DIMM rank-rank turnaround time for reads. In other words, the memory controller does not need to ensure idle bus cycles on data bus 20760 while performing successive and continuous or contiguous read operations to the different ranks of memory circuits on memory module 20710. The read command to memory circuits 20730A-R, the data from each of the memory circuits 20730A-R, and the corresponding data re-transmitted by interface circuit 20740 to the memory controller 20750 are labeled 20820, 20840, and 20860 respectively in FIG. 208.

FIG. 209 shows an example timing diagram 20900 of a write to the first rank of memory circuits 20720A-R followed by a write to the second rank of memory circuits 20730A-R when memory module 20710 is configured as a dual-rank module with ×4 memory circuits, according to an embodiment of this invention. The memory controller 20750 issues a BL8 write command (not shown) to the first rank of memory circuits 20720A-R. This is converted to a BL4 write command 20910 by one or more of the interface circuits 20740 and 20752 and sent to memory circuits 20720A-R. Interface circuit 20740 receives write data 20930 from the memory controller 20750 as eight nibbles (i.e. as BL8 data on the 4-bit wide data bus 20790). Interface circuit 20740 then sends the write data to memory circuits 20720A-R as four bytes 20950 (i.e. as BL4 data on the 8-bit wide data bus 20780). As shown in the figure, the memory circuits 20720A-R connect to the data bus 20780 for two clock cycles and then disconnect from the data bus 20780. This gives memory circuits 20730A-R sufficient time to connect to data bus 20780 and be ready to accept a write command exactly four clock cycles after a write command was issued to memory circuits 20720A-R. Thus, when memory module 20710 is configured as a dual-rank module with ×4 memory circuits (i.e. when a ×4 memory circuit is emulated using a ×8 memory circuit), memory subsystem 20700 may operate with a 0-cycle intra-DIMM rank-rank turnaround time for writes. In other words, the memory controller does not need to insert idle bus cycles on data bus 20760 while performing successive and continuous or contiguous write operations to the different ranks of memory circuits on memory module 20710. The write command to memory circuits 20730A-R, the data received by interface circuit 20740 from memory controller 20750, and the corresponding data re-transmitted by interface circuit 20740 to memory circuits 20730A-R are labeled 20920, 20940, and 20960 respectively in FIG. 209.

Memory module 20710 that is configured as a dual-rank memory module with ×4 memory circuits as described above provides higher reliability (by supporting ChipKill) and higher performance (by supporting 0-cycle intra-DIMM rank-rank turnaround times).

Memory module 20710 may also be configured as a single-rank memory module with ×4 memory circuits. In this configuration, two memory circuits that have a common data bus to the corresponding interface circuits (e.g. 20720A and 20730A) are configured by one or more of the interface circuits 20740 and 20752 to emulate a single ×4 memory circuit with twice the capacity of each of the memory circuits 20720A-R and 20730A-R. For example, if each of the memory circuits 20720A-R and 20730A-R is a 1 Gb, ×8 DRAM, then memory module 20710 is configured as a single-rank 4 GB memory module with 2 Gb×4 memory circuits (i.e. memory circuits 20720A and 20730A emulate a single 2 Gb×4 DRAM). This configuration provides higher reliability (by supporting ChipKill).

Memory module 20710 may also be configured as quad-rank memory module with ×8 memory circuits. In this configuration, memory circuits 20720A, 20720C, 20720E, 20720G, 207201, 20720K, 20720M, 207200, and 20720Q may be configured as a first rank of 8 memory circuits; memory circuits 20720B, 20720D, 20720F, 20720H, 20720J, 20720L, 20720N, 20720P, and 20720R may be configured as a second rank of ×8 memory circuits; memory circuits 20730A, 20730C, 20730E, 20730G, 207301, 20730K, 20730M, 207300, and 20730Q may be configured as a third rank of ×8 memory circuits; and memory circuits 20730B, 20730D, 20730F, 20730H, 20730J, 20730L, 20730N, 20730P, and 20730R may be configured as fourth rank of ×8 memory circuits. This configuration requires the functions of interface circuits 20740 and optionally that of 20752 to be implemented in nine or fewer integrated circuits. In other words, each interface circuit 20740 must have at least two 8-bit wide data buses 20780 that connect to the corresponding memory circuits of all four ranks (e.g. 20720A, 20720B, 20730A, and 20730B) and at least an 8-bit wide data bus 20790 that connects to the data bus 20760 of the memory bus. This is a lower power configuration since only nine memory circuits respond in parallel to a command from the memory controller. In this configuration, interface circuit 20740 has two separate data buses 20780, each of which connects to corresponding memory circuits of two ranks. In other words, memory circuits of a first and third rank (i.e. first set of ranks) share one common data bus to the corresponding interface circuit while memory circuits of a second and fourth rank (i.e. second set of ranks) share another common data bus to the corresponding interface circuit. Interface circuit 20740 may be designed such that when memory module 20710 is configured as a quad-rank module with ×8 memory circuits, memory system 20700 may operate with 0-cycle rank-rank turnaround times for reads or writes to different sets of ranks but operate with a non-zero-cycle rank-rank turnaround times for reads or writes to ranks of the same set. Alternately, interface circuit may be designed such that when memory module 20710 is configured as a quad-rank module with ×8 memory circuits, memory system 20700 operates with non-zero-cycle rank-rank turnaround times for reads or writes to any of the ranks of memory module 20710.

Memory module 20710 may also be configured as a dual-rank memory module with ×8 memory circuits. This configuration requires the functions of interface circuits 20740 and optionally that of 20752 to be implemented in nine or fewer integrated circuits. In other words, each interface circuit 20740 must have at least two 8-bit wide data buses 20780 that connect to the corresponding memory circuits of all four ranks (e.g. 20720A, 20720B, 20730A, and 20730B) and at least an 8-bit wide data bus 20790 that connects to the data bus 20760 of the memory bus. In this configuration, two memory circuits that have separate data buses to the corresponding interface circuit (e.g. 20720A and 20720B) are configured by one or more of the interface circuits 20740 and 20752 to emulate a single ×8 memory circuit with twice the capacity of each of the memory circuits 20720A-R and 20730A-R. For example, if each of the memory circuits 20720A-R and 20730A-R is a 1 Gb, ×8 DRAM, then memory module 20710 may be configured as a dual-rank 4 GB memory module with 2 Gb×8 memory circuits (i.e. memory circuits 20720A and 20720B emulate a single 2 Gb×8 DRAM). This configuration is a lower power configuration since only nine memory circuits respond in parallel to a command from the memory controller.

FIG. 210 illustrates a four channel memory subsystem 21000, according to another embodiment of the present invention. As shown, the memory subsystem 21000 includes a memory controller 21010 and four memory channels 21020, 21030, 21040, and 21050. Furthermore, as illustrated, each memory channel has one interface circuit and supports up to four memory modules. For example, memory channel 21020 has one interface circuit 21022 and supports up to four memory modules 21024A, 21024B, 21026A, and 21026B. Similarly, memory channel 21030 has one interface circuit 21032 and supports up to four memory modules 21034A, 21034B, 21036A, and 21036B; memory channel 21040 has one interface circuit 21042 and supports up to four memory modules 21044A, 21044B, 21046A, and 21046B; and memory channel 21050 has one interface circuit 21052 and supports up to four memory modules 21054A, 21054B, 21056A, and 21056B. It should be noted that the function performed by each of the interface circuits 21022, 21032, 21042, and 21052 may be implemented in one or more integrated circuits.

Interface circuit 21022 has two separate memory buses 21028A and 21028B, each of which connects to two memory modules. Similarly, interface circuit 21032 has two separate memory buses 21038A and 21038B, interface circuit 21042 has two separate memory buses 21048A and 21048B, and interface circuit 21052 has two separate memory buses 21058A and 21058B. The memory modules in memory subsystem 21000 may use either ×4 memory circuits or ×8 memory circuits. As an option, the memory subsystem 21000 including the memory controller 21010 and the interface circuits 21022, 21032, 21042, and 21052 may be implemented in the context of the architecture and environment of FIGS. 207-209. Of course, the memory subsystem 21000 including the memory controller 21010 and the interface circuits 21022, 21032, 21042, and 21052 may be used in any desired environment. It should also be noted that the aforementioned definitions may apply during the present description.

If the memory modules in memory subsystem 21000 use ×4 memory circuits, then interface circuit 21022 may be configured to provide the memory controller with the ability to switch between a rank on memory bus 21028A and a rank on memory bus 21028B without needing any idle bus cycles on memory bus 21020. However, one or more idle bus cycles are required on memory bus 21020 when switching between a first rank on memory bus 21028A and a second rank on memory bus 21028A because these ranks share a common bus. The same is true for ranks on memory bus 21028B. Interface circuits 21032, 21042, and 21052 (and thus, memory buses 21030, 21040, and 21050 respectively) may be configured similarly.

If the memory modules in memory subsystem 21000 use ×8 memory circuits, then interface circuit 21022 may be configured to emulate a rank of ×4 memory circuits using two ranks of ×8 memory circuits (one rank on memory bus 21028A and one rank on memory bus 21028B). This configuration provides the memory controller with the ability to switch between any of the ranks of memory circuits on memory buses 21028A and 21028B without any idle bus cycles on memory bus 21020. Alternately, the interface circuit 21022 may be configured to not do any emulation but instead present the ranks of ×8 memory circuits on the memory modules as ranks of ×8 memory circuits to the memory controller. In this configuration, the memory controller may switch between a rank on memory bus 21028A and a rank on memory bus 21028B without needing any idle bus cycles on memory bus 21020 but require one or more idle bus cycles when switching between two ranks on memory bus 21028A or between two ranks on memory bus 21028B. Interface circuits 21032, 21042, and 21052 (and thus, memory buses 21030, 21040, and 21050 respectively) may be configured similarly.

FIG. 211 illustrates some of the major components of a memory subsystem 21100, according to yet another embodiment of the present invention. As shown, the memory subsystem 21100 includes a memory controller 21150 and a memory module 21110 interconnected via a memory bus that includes a data bus 21160 and an address and control bus 21170. As shown, the memory module 21110 is composed of eighteen ×4 memory circuits 21120A-1 and 21130A-I, one or more interface circuits 21140, an interface circuit 21152 that performs the address and control register function, and a non-volatile memory circuit 21154 (e.g. EEPROM) that includes information about the configuration and capabilities of memory module 21110. For the purpose of illustration, nine interface circuits 21140 are shown, each of which has a 4-bit wide data bus 21180A that connects to a first memory circuit, a 4-bit wide data bus 21180B that connects to a second memory circuit, and an 8-bit wide data bus 21190 that connects to the data bus 21160 of the memory bus. It should be noted that the functions of all the interface circuits 21140 and optionally, that of the interface circuit 21152, may be implemented in a single integrated circuit or in multiple integrated circuits. It should also be noted that memory circuits 21120A-1 and 21130A-I may be transposed in many different ways on the memory module. For example, the memory circuits 21120A-I may all be on one side of the memory module whereas the memory circuits 21130A-I may all be on the other side of the module. Alternately, some subset of the memory circuits 21120A-I and some subset of the memory circuits 21130A-I may be on one side of the memory module while the remaining memory circuits are on the other side of the module. In yet another implementation, the two memory circuits that connect to the same interface circuit (e.g. memory circuit 21120A and memory circuit 21130A) may be in a dual-die package (DDP) and thus, share a common package. As an option, the memory subsystem 21100 including the memory controller 21150 and interface circuits 21140 and 21152 may be implemented in the context of the architecture and environment of FIGS. 207-210. Of course, however, the memory subsystem 21100 including the memory controller 21150 and interface circuits 21140 and 21152 may be used in any desired environment. It should also be noted that the aforementioned definitions may apply during the present description.

Memory module 21110 may be configured as a memory module with one rank of ×4 memory circuits (i.e. single-rank memory module with ×4 memory circuits), as a memory module with two ranks of ×8 memory circuits (i.e. a dual-rank memory module with ×8 memory circuits), or as a memory module with a single rank of ×8 memory circuits (i.e. a single-rank memory module with ×8 memory circuits).

FIG. 211 illustrates memory module 21110 configured as a dual-rank memory module with ×8 memory circuits. In other words, the eighteen ×4 memory circuits are configured into a first rank of memory circuits 21120A-I and a second rank of memory circuits 21130A-I. It can be seen from the figure that, in this configuration, the interface circuits 21140 collectively have a 72-bit wide data interface 21190 to the memory controller 21150 and two 36-bit wide data interfaces, 21180A and 21180B, to the two ranks of memory circuits on the memory module 21110. Since the two ranks of memory circuits have independent data buses that connect them to the interface circuits 21140, the memory controller may operate them in a parallel or overlapped manner, preferably when BL4 accesses are used to read from and write to the memory circuits. That is, the memory controller 21150 may issue BL4 accesses (reads or writes) alternately to the first and second ranks of memory circuits without inserting or causing any idle bus cycles on the data bus 21160. The interface circuits 21140, and optionally 21152, issue corresponding BL8 accesses to the two ranks of memory circuits in an overlapped manner.

FIG. 212 shows an example timing diagram 21200 of BL4 reads to the first rank of memory circuits 21120A-I alternating with BL4 reads to the second rank of memory circuits 21130A-I when memory module 21110 is configured as a dual-rank module with ×8 memory circuits, according to an embodiment of this invention. The memory controller 21150 issues a BL4 read command (not shown) to the first rank of memory circuits. This is converted to a BL8 read command 21210 by one or more of the interface circuits 21140 and 21152 and sent to the first rank of memory circuits 21120A-I. Each of the memory circuits 21120A-I returns the requested data 21212 as eight nibbles in four clock cycles on data bus 21180A. This data is received by interface circuit 21140 and re-transmitted to the memory controller 21150 as four bytes (i.e. as BL4 data on the 8-bit wide bus 21190) of data 21214. In other words, each of the memory circuits 21120A-I outputs eight nibbles of data 21212 to interface circuit 21140 which, in turn, sends the data as four bytes 21214 to the memory controller. Since the second rank of memory circuits 21130A-I are independently connected to the interface circuits 21140 by means of data buses 21180B, the memory controller may issue a BL4 read command (not shown) to the second rank of memory circuits exactly 2 clock cycles after issuing the BL4 read command to the first rank of memory circuits. The BL4 read command to the second rank is converted to a BL8 read command 21220 by one or more of the interface circuits 21140 and 21152 and sent to the second rank of memory circuits 21130A-I. Each of the memory circuits 21130A-I returns the requested data 21222 as eight nibbles in four clock cycles on data bus 21180B. This data is received by interface circuit 21140 and re-transmitted to the memory controller 21150 as four bytes of data 21224. As shown in this figure, there is no idle bus cycle on data bus 21190 (and hence, on data bus 21160) between read data 21214 from the first rank of memory circuits and read data 21224 from the second rank of memory circuits. Subsequent BL4 read commands may be issued in an alternating manner to the two ranks of memory circuits without the memory controller 21150 inserting or causing any idle bus cycles on data bus 21190 (and hence, on data bus 21160). Thus, when memory module 21110 is configured as dual-rank module with ×8 memory circuits (i.e. when a ×8 memory circuit is emulated using a ×4 memory circuit), memory subsystem 21100 may operate with a 0-cycle (zero cycle) intra-DIMM rank-rank turnaround time for BL4 reads. In other words, the memory controller does not need to ensure idle bus cycles on data bus 21160 while performing alternating and continuous or contiguous BL4 read operations to the different ranks of memory circuits on memory module 21110. It should be noted that idle bus cycles will be needed between successive and continuous or contiguous BL4 reads to the same rank of memory circuits in this configuration.

FIG. 213 shows an example timing diagram 21300 of BL4 writes to the first rank of memory circuits 21120A-I alternating with BL4 writes to the second rank of memory circuits 21130A-I when memory module 21110 is configured as a dual-rank module with ×8 memory circuits, according to an embodiment of this invention. The memory controller 21150 issues a BL4 write command (not shown) to the first rank of memory circuits. This is converted to a BL8 write command 21310 by one or more of the interface circuits 21140 and 21152 and sent to the first rank of memory circuits 21120A-I. Interface circuit 21140 receives write data 21312 from the memory controller 21150 as four bytes (i.e. as BL4 data on the 8-bit wide data bus 21190). Interface circuit 21140 then sends the write data to memory circuits 21120A-I as eight nibbles 21314 (i.e. as BL8 data on the 4-bit wide data bus 21180A). Since the second rank of memory circuits 21130A-I are independently connected to interface circuits 21140 by means of data buses 21180B, the memory controller may issue a BL4 write command (not shown) to the second rank of memory circuits exactly 2 clock cycles after issuing the BL4 write command to the first rank of memory circuits. The BL4 write command to the second rank is converted to a BL8 write command 21320 by one or more of the interface circuits 21140 and 21152 and send to the second rank of memory circuits 21130A-I. Interface circuit 21140 receives write data 21322 from the memory controller 21150 as four bytes (i.e. as BL4 data on the 8-bit wide data bus 21190) and sends the write data to memory circuits 21130A-I as eight nibbles 21324 (i.e. as BL8 data on the 4-bit wide data bus 21180B). As shown in this figure, there is no need for the memory controller to insert one or more idle bus cycles between write data 21312 to the first rank of memory circuits and write data 21322 to the second rank of memory circuits. Subsequent BL4 write commands to the two ranks of memory circuits may be issued in an alternating manner without any idle bus cycles on data bus 21160 (and hence, on data bus 21190). Thus, when memory module 21110 is configured as dual-rank module with ×8 memory circuits (i.e. when a ×8 memory circuit is emulated using a ×4 memory circuit), memory subsystem 21100 may operate with a 0-cycle (zero cycle) intra-DIMM rank-rank turnaround time for BL4 writes. In other words, the memory controller does not need to ensure idle bus cycles on data bus 21160 (and hence, on data bus 21190) while performing alternating and continuous or contiguous BL4 write operations to the different ranks of memory circuits on memory module 21110. It should be noted that idle bus cycles may be needed between successive and continuous or contiguous BL4 writes to the same rank of memory circuits in this configuration.

Memory module 21110 that is configured as a dual-rank memory module with ×8 memory circuits as described above provides higher performance (by supporting 0-cycle intra-DIMM rank-rank turnaround times) without significant increase in power (since nine memory circuits respond to each command from the memory controller).

Memory module 21110 may also be configured as a single-rank memory module with ×4 memory circuits. In this configuration, all the memory circuits 21120A-1 and 21130A-I are made to respond in parallel to each command from the memory controller. This configuration provides higher reliability (by supporting ChipKill).

Memory module 21110 may also be configured as a single-rank memory module with ×8 memory circuits. In this configuration, two memory circuits that have separate data buses to the corresponding interface circuit (e.g. 21120A and 21130A) are configured by one or more of the interface circuits 21140 and 21152 to emulate a single ×8 memory circuit with twice the capacity of each of the memory circuits 21120A-1 and 21130A-I. For example, if each of the memory circuits 21120A-1 and 21130A-I is a 1 Gb, ×4 DRAM, then memory module 21110 may be configured as a single-rank 2 GB memory module composed of 2 Gb×8 memory circuits (i.e. memory circuits 21120A and 21130B emulate a single 2 Gb×8 DRAM). This configuration is a lower power configuration. It should be noted that this configuration preferably requires BL4 accesses by the memory controller.

FIG. 214 illustrates a four channel memory subsystem 21400, according to still yet another embodiment of the present invention. As shown, the memory subsystem 21400 includes a memory controller 21410 and four memory channels 21420, 21430, 21440, and 21450. Furthermore, as illustrated, each memory channel has one interface circuit and supports up to two memory modules. For example, memory channel 21420 has interface circuit 21422 and supports up to two memory modules 21424 and 21426. Similarly, memory channel 21430 has interface circuit 21432 and supports up to two memory modules 21434 and 21436; memory channel 21440 has interface circuit 21442 and supports up to two memory modules 21444 and 21446; and memory channel 21450 has one interface circuit 21452 and supports up to two memory modules 21454 and 21456. It should be noted that the function performed by each of the interface circuits 21422, 21432, 21442, and 21452 may be implemented in one or more integrated circuits.

Interface circuit 21422 has two separate memory buses 21428A and 21428B, each of which connects to a memory module. Similarly, interface circuit 21432 has two separate memory buses 21438A and 21438B, interface circuit 21442 has two separate memory buses 21448A and 21448B, and interface circuit 21452 has two separate memory buses 21458A and 21458B. The memory modules may use either ×4 memory circuits or ×8 memory circuits. As an option, the memory subsystem 21400 including the memory controller 21410 and the interface circuits 21422, 21432, 21442, and 21452 may be implemented in the context of the architecture and environment of FIGS. 207-213. Of course, the memory subsystem 21400 including the memory controller 21410 and the interface circuits 21422, 21432, 21442, and 21452 may be used in any desired environment. It should also be noted that the aforementioned definitions may apply during the present description.

If the memory modules in memory subsystem 21400 are single-rank or dual-rank or quad-rank modules composed of ×8 memory circuits, then interface circuit 21422 may be configured, for example, to provide the memory controller with the ability to alternate between a rank on memory bus 21428A and a rank on memory bus 21428B without inserting any idle bus cycles on memory bus 21420 when the memory controller issues BL4 commands. Interface circuits 21432, 21442, and 21452 (and thus, memory buses 21430, 21440, and 21450 respectively) may be configured in a similar manner.

If the memory modules in memory subsystem 21400 are single-rank modules composed of ×4 memory circuits, then interface circuit 21422 may be configured to emulate two ranks of ×8 memory circuits using a single rank of ×4 memory circuits. This configuration provides the memory controller with the ability to alternate between any of the ranks of memory circuits on memory buses 21428A and 21428B without any idle bus cycles on memory bus 21420 when the memory controller issues BL4 commands. Interface circuits 21432, 21442, and 21452 (and thus, memory buses 21430, 21440, and 21450 respectively) may be configured in a similar manner.

More illustrative information will now be set forth regarding various optional architectures and features of different embodiments with which the foregoing frameworks may or may not be implemented, per the desires of the user. It should be noted that the following information is set forth for illustrative purposes and should not be construed as limiting in any manner. Any of the following features may be optionally incorporated with or without the other features described.

As shown in FIG. 205 and FIG. 206, for a BL8 read or write access, a ×4 memory circuit belonging to a first rank of memory circuits (say on memory module 20522) would connect to the memory bus for four clock cycles and respond to the read or write access. The memory controller must ensure one or more idle bus cycles before performing a read or write access to a ×4 memory circuit of a second rank of memory circuits (say on memory module 20524). The idle bus cycle(s) provide sufficient time for the ×4 memory circuit of the first rank to disconnect from the bus 20520 and for the ×4 memory circuit of the second rank to connect to the bus 20520. For example, a ×4 memory circuit of a first rank may receive a BL8 read command from the memory controller during clock cycle T0, and the memory circuit may transmit the requested data during clock cycles Tn, Tn+1, Tn+2, and Tn+3, where n is the read column access latency (i.e. read CAS latency) of the memory circuit. The earliest time a ×4 memory circuit of a second rank may receive a BL8 read command from the memory controller is clock cycle T5. In response to this command, the ×4 memory circuit of the second rank will transmit the requested data during clock cycles Tn+5, Tn+6, Tn+7, and Tn+8. Clock cycle Tn+4 is an idle data bus cycle during which the ×4 memory circuit of the first rank (say, on module 20522) disconnects from the memory bus 20520 and the ×4 memory circuit of the second rank (say, on module 20524) connects to the memory bus 20520. As noted before, this need for idle bus cycles arises when memory circuits belonging to different ranks share a common data bus 20520.

In various embodiments of the present invention as illustrated in FIGS. 207-210 and 215, an interface circuit may be configured to emulate a ×4 memory circuit using a ×8 memory circuit. For example, interface circuit 20740 may emulate a ×4 memory circuit using a ×8 memory circuit (say, memory circuit 20720A). A ×8 memory circuit 20720A needs to connect to the memory bus 20780 for only two clock cycles in order to respond to a BL8 read or write access to a ×4 memory circuit. Thus, a successive BL8 read or write access to a ×4 memory circuit of a different rank may be scheduled to a ×8 memory circuit of a second rank (say, memory circuit 20730A) four clock cycles after the read or write access to a memory circuit 20720A of a first rank. For example, in response to a BL8 read command to a ×4 memory circuit of one rank from the memory controller 20750, one or more of the interface circuits 20740 and 20752 may issue a BL4 read command to a ×8 memory circuit 20720A of a first rank in clock cycle T0. The memory circuit 20720A may transmit the requested data during clock cycles Tn and Tn+1, where n is the read CAS latency of the memory circuit. Then, the ×8 memory circuit 20720A of the first rank will disconnect from the memory bus 20780 during clock cycles Tn+2 and Tn+3. The interface circuit 20740 may capture the data from the ×8 memory circuit 20720A of the first rank and re-transmit it to the memory controller 20750 on data bus 20790 during clock cycles Tn+m, Tn+1+m, Tn+2+m, and Tn+3+m, where m is the delay or latency introduced by the interface circuit 20740. The memory controller 20750 may then schedule a BL8 read access to a ×4 memory circuit of a different rank in such a manner that one or more of the interface circuits 20740 and 20752 issue a BL4 read command to a ×8 memory circuit 20730A of a second rank during clock cycle T4. The ×8 memory circuit 20730A of the second rank may connect to the memory bus 20780 during clock cycle Tn+3 and optionally Tn+2, and transmit the requested data to the interface circuit 20740 during clock cycles Tn+4 and Tn+5. The interface circuit 20740 may capture the data from the ×8 memory circuit 20730A of the second rank and re-transmit it to the memory controller 20750 during clock cycles Tn+4+m, Tn+5+m, Tn+6+m, and Tn+7+m. Thus, a memory subsystem 20700 or 21000 may have the capability of switching from a first rank of memory circuits to a second rank of memory circuits without requiring idle bus cycles when using an interface circuit of the present invention and configuring it to emulate a ×4 memory circuit using a ×8 memory circuit.

As shown in FIG. 205 and FIG. 206, for a BL4 read or write access, a ×4 or ×8 memory circuit belonging to a first rank of memory circuits (say on memory module 20522) would connect to the memory bus for two clock cycles and respond to the read or write access. The memory controller inserts one or more idle bus cycles before performing a read or write access to a ×4 or ×8 memory circuit of a second rank of memory circuits (say on memory module 20524). The idle bus cycle(s) provide sufficient time for the memory circuit of the first rank to disconnect from the bus 20520 and for the memory circuit of the second rank to connect to the bus 20520. For example, a memory circuit of a first rank may receive a BL4 read command from the memory controller during clock cycle T0, and the memory circuit may transmit the requested data during clock cycles Tn and Tn+1, where n is the read column access latency (i.e. read CAS latency) of the memory circuit. The earliest time a memory circuit of a second rank may receive a BL4 read command from the memory controller is clock cycle T3. In response to this command, the memory circuit of the second rank will transmit the requested data during clock cycles Tn+3 and Tn+4. Clock cycle Tn+2 is an idle data bus cycle during which the memory circuit of the first rank (say, on module 20522) disconnects from the memory bus 20520 and the memory circuit of the second rank (say, on module 20524) connects to the memory bus 20520. As noted before, this need for idle bus cycles arises when memory circuits belonging to different ranks share a common data bus 20520.

In various embodiments of the present invention as illustrated in FIGS. 211-215, an interface circuit may be configured to emulate a ×8 memory circuit using a ×4 memory circuit. For example, interface circuit 21140 emulates two ×8 memory circuits using two ×4 memory circuits (say, memory circuits 21120A and 21130A) for BL4 accesses to the ×8 memory circuits. The interface circuit connects to each ×4 memory circuit by means of an independent 4-bit wide data bus, while presenting an 8-bit wide data bus to the memory controller. Since the memory controller issues only BL4 accesses, alternating BL4 read or write access to the memory circuits of two different ranks may be scheduled without any idle bus cycles on the data bus connecting the memory controller to the interface circuit. For example, in response to a BL4 read command to a ×8 memory circuit of one rank from the memory controller 21150, one or more of the interface circuits 21140 and 21152 may issue a BL8 read command to a ×4 memory circuit 21120A of a first rank in clock cycle T0. The memory circuit 21120A may transmit the requested data on data bus 21180A during clock cycles Tn, Tn+1, Tn+2, and Tn+3, where n is the read CAS latency of the memory circuit. The interface circuit 21140 may capture the data from the ×4 memory circuit 21120A of the first rank and re-transmit it to the memory controller 21150 on data bus 21190 during clock cycles Tn+m and Tn+1+m, where m is the delay or latency introduced by the interface circuit 21140. The memory controller 21150 may then schedule a BL4 read access to a ×8 memory circuit of a different rank in such a manner that one or more of the interface circuits 21140 and 21152 issue a BL8 read command to a ×4 memory circuit 21130A of a second rank during clock cycle T2. The ×4 memory circuit 21130A of the second rank may transmit the requested data on data bus 21180B to the interface circuit 21140 during clock cycles Tn+2, Tn+3, Tn+4, and Tn+5. The interface circuit 21140 may capture the data from the ×4 memory circuit 21130A of the second rank and re-transmit it to the memory controller 20750 during clock cycles Tn+2+m and Tn+3+m. Thus, a memory subsystem 21100 or 21400 may have the capability of alternating BL 4 accesses between a first rank of memory circuits and a second rank of memory circuits without requiring idle bus cycles when using an interface circuit of the present invention and configuring it to emulate a ×8 memory circuit using a ×4 memory circuit.

In various memory subsystems (e.g. 20400, 20700, 21000, 21100, 21400, etc.), the memory controller (e.g. 20440, 20750, 21010, 21150, 21410, etc.) may read the contents of a non-volatile memory circuit (e.g. 20434, 20754, 21154, etc.), typically an EEPROM, that contains information about the configuration and capabilities of memory module (e.g. 20410, 20710, 21024A, 21024B, 21110, 21424, 21426, etc.). The memory controller may then configure itself to interoperate with the memory module(s). For example, memory controller 20400 may read the contents of the non-volatile memory circuit 20434 that contains information about the configuration and capabilities of memory module 20410. The memory controller 20400 may then configure itself to interoperate with memory module 20410. Additionally, the memory controller 20400 may send configuration commands to the memory circuits 20420A-J and then, start normal operation. The configuration commands sent to the memory circuits typically set the speed of operation and the latencies of the memory circuits, among other things. The actual organization of the memory module may not be changed by the memory controller in prior art memory subsystems (e.g. 20200, 20300, and 20400). For example, if the memory circuits 20420A-J are 1 Gb×4 DDR3 SDRAMs, certain aspects of the memory module (e.g. number of memory circuits per rank, number of ranks, number of rows per memory circuit, number of columns per memory circuit, width of each memory circuit, rank-rank turnaround times) are all fixed parameters and cannot be changed by the memory controller 20440 or by any other interface circuit (e.g. 20430) on the memory module.

In another embodiment of the present invention, a memory module and/or a memory subsystem (e.g. 20700, 21000, 21100, 21400, etc.) may be constructed such that the user has the ability to change certain aspects (e.g. number of memory circuits per rank, number of ranks, number of rows per memory circuit, number of columns per memory circuit, width of each memory circuit, rank-rank turnaround times) of the memory module. For example, the user may select between higher memory reliability and lower memory power. To illustrate, at boot time, memory controller 20750 may read the contents of a non-volatile memory circuit 20754 (e.g. EEPROM) that contains information about the configuration and capabilities of memory module 20710. The memory controller may then change the configuration and capabilities of memory module 20710 based on user input or user action. The re-configuration of memory module 20710 may be done in many ways. For example, memory controller 20750 may send special re-configuration commands to one or more of the interface circuits 20740 and 20752. Alternately, memory controller 20750 may overwrite the contents of non-volatile memory circuit 20754 to reflect the desired configuration of memory module 20710 and then direct one or more of the interface circuits 20740 and 20752, to read the contents of non-volatile memory circuit 20754 and re-configure themselves. As an example, the default mode of operation of memory module 20710 may be a module with ×4 memory circuits. In other words, interface circuit 20740 uses ×8 memory circuits to emulate ×4 memory circuits. As noted previously, this enables Chipkill and thus provides higher memory reliability. However, the user may desire lower memory power instead. So, at boot time, memory controller 20750 may check a software file or setting that reflects the user's preferences and re-configure memory module 20710 to operate as a module with ×8 memory circuits. In this case, certain other configuration parameters or aspects pertaining to memory module 20710 may also change. For example, when there are thirty six ×8 memory circuits on memory module 20710, and when the module is operated as a module with ×8 memory circuits, the number of ranks on the module may change from two to four.

In yet another embodiment of the present invention, one or more of the interface circuits (e.g. 20740, 20752, 21022, 21140, 21152, 21422, etc.) may have the capability to also emulate higher capacity memory circuits using a plurality of lower capacity memory circuits. The higher capacity memory circuit may be emulated to have a different organization than that of the plurality of lower capacity memory circuits, wherein the organization may include a number of banks, a number of rows, a number of columns, or a number of bits per column. Specifically, the emulated memory circuit may have the same or different number of banks than that associated with the plurality of memory circuits; same or different number of rows than that associated with the plurality of memory circuits; same or different number of columns than that associated with the plurality of memory circuits; same or different number of bits per column than that associated with the plurality of memory circuits; or any combination thereof. For example, one or more of the interface circuits 20740 and 20752 may emulate a higher capacity memory circuits by combining the two memory circuits. To illustrate, say that all the memory circuits on memory module 20710 are 1 Gb×8 DRAMs. As shown in FIG. 207, the module 20710 may be operated as a dual-rank 4 GB DIMM composed of 1 Gb×4 DRAMs. That is, the interface circuits 20740 and 20752 emulate a 1 Gb×4 DRAM that has a different number of bits per column than the plurality of 1 Gb×8 DRAMs on the module. However, one or more of the interface circuits 20740 and 20752 may be configured such that memory module 20710 now emulates a single-rank 4 GB DIMM composed of 2 Gb×4 DRAMs to memory controller 20750. In other words, one or more of the interface circuits 20740 and 20752 may combine memory circuits 20720A and 20730A and emulate a 2 Gb×4 DRAM. The 2 Gb×4 DRAM may be emulated to have twice the number of rows but the same number of columns as the plurality of 1 Gb×8 DRAMs on the module. Alternately, the 2 Gb×4 DRAM may be emulated to have the same number of rows but twice the number of columns as the plurality of 1 Gb×8 DRAMs on the module. In another implementation, the 2 Gb×4 DRAM may be emulated to have twice the number of banks but the same number of rows and columns as the plurality of 1 Gb×8 DRAMs on the module. In yet another implementation, the 2 Gb×4 DRAM may be emulated to have four times the number of banks as the plurality of 1 Gb×8 DRAMs but have half the number of rows or half the number of columns as the 1 Gb×8 DRAMs. Of course, the 2 Gb DRAM may be emulated as having any other combination of number of banks, number of rows, number of columns, and number of bits per column.

Figure 215A:
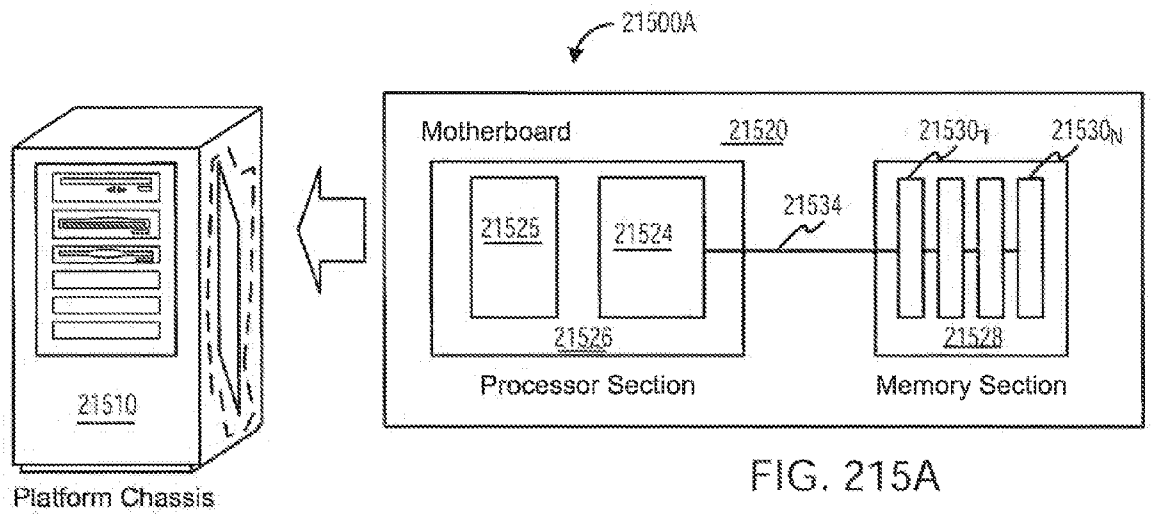

FIG. 215A illustrates a computer platform (i.e., a computer system) 21500A that includes a platform chassis 21510, and at least one processing element that consists of or contains one or more boards, including at least one motherboard 21520. Of course the platform 21500A as shown might comprise a single case and a single power supply and a single motherboard. However, it might also be implemented in other combinations where a single enclosure hosts a plurality of power supplies and a plurality of motherboards or blades.

The motherboard 21520 in turn might be organized into several partitions, including one or more processor sections 21526 consisting of one or more processors 21525 and one or more memory controllers 21524, and one or more memory sections 21528. Of course, as is known in the art, the notion of any of the aforementioned sections is purely a logical partitioning, and the physical devices corresponding to any logical function or group of logical functions might be implemented fully within a single logical boundary, or one or more physical devices for implementing a particular logical function might span one or more logical partitions. For example, the function of the memory controller 21524 might be implemented in one or more of the physical devices associated with the processor section 21526, or it might be implemented in one or more of the physical devices associated with the memory section 21528.

Figure 215B:
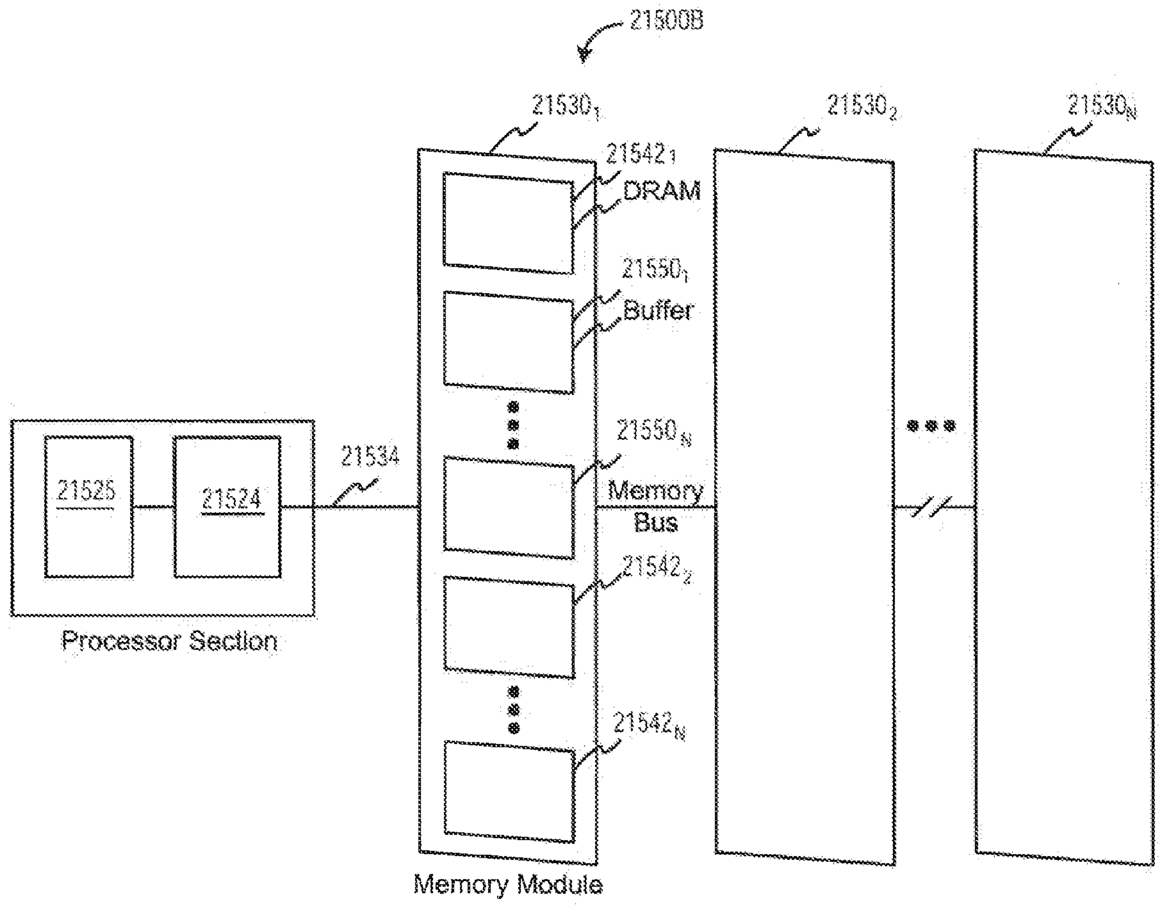
Figure 215C:
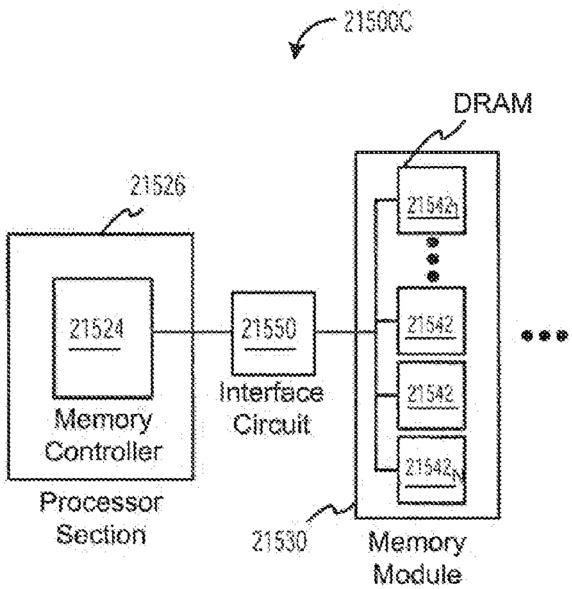
Figure 215D:
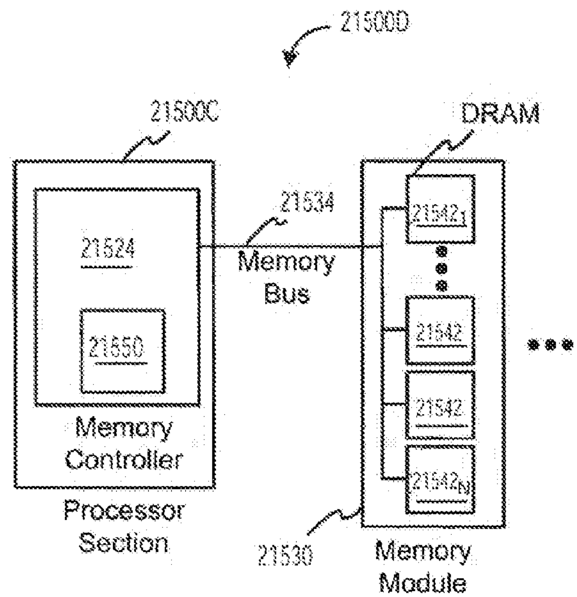
Figure 215E:
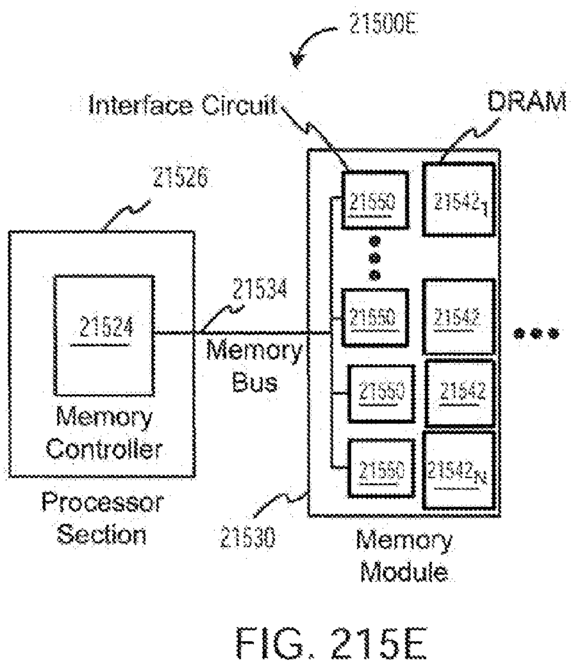

FIG. 215B illustrates one exemplary embodiment of a memory section, such as, for example, the memory section 21528, in communication with a processor section 21526 over one or more busses, possibly including bus 21534. In particular, FIG. 215B depicts embodiments of the invention as is possible in the context of the various physical partitions on structure 21520. As shown, one or more memory modules 21530 1, 21530 2-21530 N each contain one or more interface circuits 21550 1-21550 N and one or more DRAMs 21542 1, 21542 2-21542 N positioned on (or within) a memory module 21530 1.

It must be emphasized that although the memory is labeled variously in the figures (e.g. memory, memory components, DRAM, etc), the memory may take any form including, but not limited to, DRAM, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory, flash memory, and/or any other type of volatile or non-volatile memory.

Figure 215F:
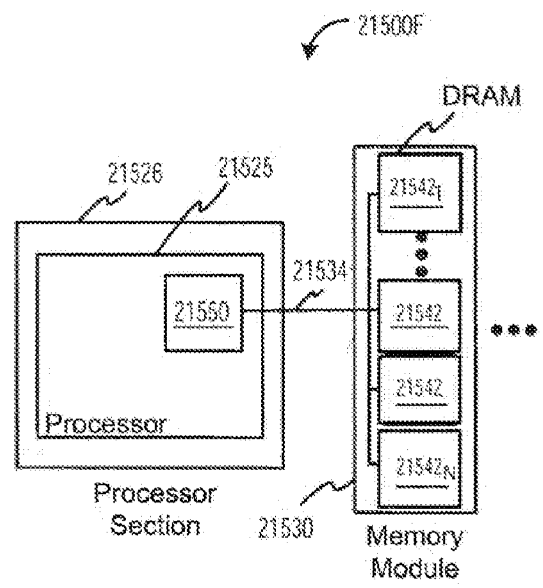

Many other partition boundaries are possible and contemplated, including, without limitation, positioning one or more interface circuits 21550 between a processor section 21526 and a memory module 21530 (see FIG. 215C), or implementing the function of the one or more interface circuits 21550 within the memory controller 21524 (see FIG. 215D), or positioning one or more interface circuits 21550 in a one-to-one relationship with the DRAMs 21542 1-21542 N and a memory module 21530 (see 215E), or implementing the one or more interface circuits 21550 within a processor section 21526 or even within a processor 21525 (see FIG. 215F).

Furthermore, the systems illustrated in FIGS. 207—13 are analogous to the computer platform 21500A and 21510 illustrated in FIGS. 215A-215F. Therefore, all discussions of FIGS. 207—13 apply with equal force to the systems illustrated in FIGS. 215A-14F.

While the foregoing is directed to embodiments of the present invention, other and further embodiments of the invention may be devised without departing from the basic scope thereof.

What is claimed is:

1. A sub-system, comprising:

a first number of physical memory circuits including a first physical memory circuit and a second physical memory circuit, wherein each of the first number of physical memory circuits is limited by a device command scheduling constraint; and an interface circuit electrically coupling to each one of the first number of physical memory circuits via a respective distinct bus of multiple buses including a first bus connected to the first physical memory circuit and a distinct second bus connected to the second physical memory circuit, the interface circuit configured to:

interface the first number of physical memory circuits to emulate a different, second number of virtual memory circuits, wherein the second number of virtual memory circuits includes a first virtual memory circuit emulated using at least the first physical memory circuit and the second physical memory circuit;

present the different, second number of virtual memory circuits to a memory controller, wherein the first virtual memory circuit appears to the memory controller as free from the device command scheduling constraint of the first physical memory circuit and the second physical memory circuit;

receive, from the memory controller, a row-activation command and multiple column-access commands directed to the first virtual memory circuit;

determine, based on the row activation command and the multiple column-access commands, a first physical row-activation command and a first physical column-access command directed to the first physical memory circuit and a second physical row-activation command and a second physical column-access command directed to the second physical memory circuit; and issue, using the first bus and the second bus, the first physical row-activation command and the first physical column-access command to the first physical memory circuit and the second physical row activation command and the second physical column access command to the second physical memory circuit, wherein timings for the issued first and second physical row-activation commands and the issued first and second physical column-access commands satisfy the device command scheduling constraint.

2. The sub-system of claim 1, wherein the one or more device command scheduling constraints include inter-device command scheduling constraints.

3. The sub-system of claim 2, wherein the inter-device command scheduling constraints include at least one of a rank-to-rank data bus turnaround time or an on-die termination (ODT) control switching time.

4. The sub-system of claim 1, wherein the one or more device command scheduling constraints include intra-device command scheduling constraints.

5. The sub-system of claim 4, wherein the intra-device command scheduling constraints include at least one of a column-to-column delay time (tCCD), a row-to-row activation delay time (tRRD), a four-bank activation window time (tFAW), or a write-to-read turn-around time (tWTR).

6. The sub-system of claim 1, wherein the interface circuit includes a circuit that is positioned on a dual in-line memory module (DIMM).

7. The sub-system of claim 1, wherein the interface circuit is electrically coupled to the memory controller via a separate bus.

8. The sub-system of claim 1, wherein the first number of physical memory circuits are arranged in a stack, and the interface circuit is integrated within the stack.

9. An apparatus, comprising:

an interface circuit electrically coupling to each one of first number of physical memory circuits via a respective distinct bus of multiple buses including a first bus connected to a first physical memory circuit of the physical memory circuits and a distinct second bus connected to a second physical memory circuit of the physical memory circuits, the interface circuit configured to:

interface the first number of physical memory circuits to emulate a different, second number of virtual memory circuits, wherein the second number of virtual memory circuits includes a first virtual memory circuit emulated using at least the first physical memory circuit and the second physical memory circuit;

present the different, second number of virtual memory circuits to a memory controller, wherein the first virtual memory circuit appears to the memory controller as free from a device command scheduling constraint of the first physical memory circuit and the second physical memory circuit;

receive, from the memory controller, a row-activation command and multiple column-access commands directed to the first virtual memory circuit;

determine, based on the row activation command and the multiple column-access commands, a first physical row-activation command and a first physical column-access command directed to the first physical memory circuit and a second physical row-activation command and a second physical column-access command directed to the second physical memory circuit; and issue, using the first bus and the second bus, the first physical row-activation command and the first physical column-access command to the first physical memory circuit and the second physical row activation command and the second physical column access command to the second physical memory circuit, wherein timings for the issued first and second physical row-activation commands and the issued first and second physical column-access commands satisfy the device command scheduling constraint.

10. The apparatus of claim 9, wherein the one or more device command scheduling constraints include inter-device command scheduling constraints.

11. The apparatus of claim 10, wherein the inter-device command scheduling constraints include at least one of a rank-to-rank data bus turnaround time or an on-die termination (ODT) control switching time.

12. The apparatus of claim 9, wherein the one or more device command scheduling constraints include intra-device command scheduling constraints.

13. The apparatus of claim 12, wherein the intra-device command scheduling constraints include at least one of a column-to-column delay time (tCCD), a row-to-row activation delay time (tRRD), a four-bank activation window time (tFAW), or a write-to-read turn-around time (tWTR).

14. The apparatus of claim 9, wherein the interface circuit is electrically coupled to the memory controller via a separate data bus.

15. The apparatus of claim 9, wherein the first number of physical memory circuits are arranged in a stack, and the interface circuit is integrated within the stack.

16. An method, comprising:

interfacing, by an interface circuit, a first number of physical memory circuits to emulate a different, second number of virtual memory circuits, wherein the second number of virtual memory circuits includes a first virtual memory circuit emulated using at least a first physical memory circuit and a second physical memory circuit of the first number of physical memory circuits;

presenting, by the interface circuit and to a memory controller, the different, second number of virtual memory circuits, wherein the first virtual memory circuit appears to the memory controller as free from a device command scheduling constraint of the first physical memory circuit and the second physical memory circuit;

receiving, by the interface circuit and from the memory controller, a row-activation command and multiple column-access commands directed to the first virtual memory circuit;

determining, by the interface circuit and based on the row activation command and the multiple column-access commands, a first physical row-activation command and a first physical column-access command directed to the first physical memory circuit and a second physical row-activation command and a second physical column-access command directed to the second physical memory circuit; and issuing, using at least a first bus connected to the first physical memory circuit and a second bus connected to the second physical memory circuit, the first physical row-activation command and the first physical column-access command to the first physical memory circuit and the second physical row activation command and the second physical column access command to the second physical memory circuit, wherein timings for the issued first and second physical row-activation commands and the issued first and second physical column-access commands satisfy the device command scheduling constraint.

17. The method of claim 16, wherein the one or more device command scheduling constraints include inter-device command scheduling constraints.

18. The method of claim 17, wherein the inter-device command scheduling constraints include at least one of a rank-to-rank data bus turnaround time or an on die termination (ODT) control switching time.

19. The method of claim 16, wherein the one or more device command scheduling constraints include intra device command scheduling constraints.

20. The method of claim 19, wherein the intra-device command scheduling constraints include at least one of a column-to-column delay time (tCCD), a row-to-row activation delay time (tRRD), a four-bank activation window time (tFAW), or a write-to-read turn-around time (tWTR).

* * * * *